US008456856B2

(12) United States Patent
Lin et al.

(10) Patent No.: US 8,456,856 B2
(45) Date of Patent: Jun. 4, 2013

(54) INTEGRATED CIRCUIT CHIP USING TOP POST-PASSIVATION TECHNOLOGY AND BOTTOM STRUCTURE TECHNOLOGY

(75) Inventors: Mou-Shiung Lin, Hsin-Chu (TW); Jin-Yuan Lee, Hsin-Chu (TW); Hsin-Jung Lo, Taipei County (TW); Ping-Jung Yang, Hsinchu (TW); Te-Sheng Liu, Hsinchu County (TW)

(73) Assignee: Megica Corporation, Hsinchu (TW)

( * ) Notice: Subject to any disclaimer, the term of this patent is extended or adjusted under 35 U.S.C. 154(b) by 289 days.

(21) Appl. No.: 12/722,483

(22) Filed: Mar. 11, 2010

(65) Prior Publication Data

US 2010/0246152 A1 Sep. 30, 2010

Related U.S. Application Data

(60) Provisional application No. 61/164,473, filed on Mar. 30, 2009.

(51) Int. Cl.
*H05K 7/00* (2006.01)
*H01L 23/02* (2006.01)

(52) U.S. Cl.
USPC ............ 361/783; 361/760; 257/686; 257/777

(58) Field of Classification Search
None
See application file for complete search history.

(56) References Cited

U.S. PATENT DOCUMENTS 6,424,034 B1 7/2002 Ahn et al.
6,495,442 B1 12/2002 Lin et al.
6,507,115 B1 * 1/2003 Hofstee et al. ................ 257/777
6,594,153 B1 * 7/2003 Zu et al. ........................ 361/792
6,649,509 B1 11/2003 Lin et al.
7,061,088 B2 * 6/2006 Karnezos ...................... 257/686
7,209,366 B2 * 4/2007 Prokofiev et al. ............. 361/803
7,224,075 B2 * 5/2007 Manepalli et al. ............ 257/783
7,410,884 B2 8/2008 Ramanathan
7,494,847 B2 * 2/2009 Karnezos et al. ............. 438/109
7,518,881 B2 * 4/2009 Cornelius ..................... 361/760
7,705,447 B2 * 4/2010 Ganesan et al. .............. 257/713
7,880,310 B2 * 2/2011 Mathew ........................ 257/777
8,102,663 B2 * 1/2012 Cunningham et al. ........ 361/760
2002/0074637 A1 6/2002 McFarland
2005/0046002 A1 3/2005 Lee et al.
2005/0117296 A1 6/2005 Wu et al.

(Continued)

FOREIGN PATENT DOCUMENTS

KR 20090032234 4/2009
WO WO2006011477 2/2006

OTHER PUBLICATIONS

Chiang, C., Ph.D; "TSV-EDS Challenges & Solutions"; Synopsys, Inc.; Sep. 10, 2008; pp. 1-22.

(Continued)

*Primary Examiner* — Boris Chervinsky
(74) *Attorney, Agent, or Firm* — Seyfarth Shaw LLP

(57) ABSTRACT

Integrated circuit chips and chip packages are disclosed that include an over-passivation scheme at a top of the integrated circuit chip and a bottom scheme at a bottom of the integrated circuit chip using a top post-passivation technology and a bottom structure technology. The integrated circuit chips can be connected to an external circuit or structure, such as ball-grid-array (BGA) substrate, printed circuit board, semiconductor chip, metal substrate, glass substrate or ceramic substrate, through the over-passivation scheme or the bottom scheme. Related fabrication techniques are described.

20 Claims, 239 Drawing Sheets

U.S. PATENT DOCUMENTS

2006/0050454 A1 3/2006 Koudate et al.
2008/0284037 A1 11/2008 Andry et al.
2010/0327419 A1* 12/2010 Muthukumar et al. ....... 257/686
2011/0147911 A1* 6/2011 Kohl et al. .................... 257/686

OTHER PUBLICATIONS

De Moor, P., et al.; "Recent Advances in 3D Integrations at IMEC"; Mater. Res. Soc. Symp. Proc.; vol. 970; 2007; pp. 1-10.
Deptuch, G. et al.; "3D-IC Technology for Future Detectors"; Fermilab; Feb. 17, 2009; pp. 1-32.
Ehrmann, O.; "Future Directions in Hybridization of Pixel Detectors"; Fraunhofer Institut for Reliability and Microintegration IZM; Sep. 9-12, 2002; pp. 1-38.
Ehrmann, O.; "Wafer Level System Integration"; Fraunhofer Institut for Reliability and Microintegration IZM; pp. 1-42.
Fukushima, T. et al.; "New Three-Dimensional Integration Technology Using Self-Assembly Technique"; downloaded Feb. 28, 2010; IEEE Xplore; pp. 1-4.
Gruber, P. et al.; "3D Packaging Micro Bumping"; IBM T.J. Watson Research Center; Jul. 16, 2008; pp. 1-21.
Gupta, S. et al.; "Techniques for Producing 3D ICs with High-Density Interconnect", Tezzaron Semiconductor Corporation; pp. 1-5.
Ishino, M. et al.; "Latest ASET Activities for System-Integration R&D in Japan"; ASET; Sep. 2001; pp. 1-26.
Iwasaki, T. et al.; Development of 30 Micron Pitch Bump Interconnections for COC-FCBGA; 2006; IEEE; pp. 1216-1222.
Kawano, M. et al.; "A 3D Packaging Technology for 4 Gbit Stacked DRAM With 3 Gbps Data Transfer"; NEC Electronics; downloaded Jul. 8, 2010 from IEEE Xplore; pp. 1-4.
Koyanagi, M. et al.; "Neuromorphic Vision Chip Fabricated Using Three-Dimensional Integration Technology"; IEEE International Solid-State Circuits Conference; 2001; pp. 1-3.
Koyanagi, M. et al.; "Three-Dimension Integration Technology Based on Wafer Bonding With Vertical Buried Interconnections"; downloaded Mar. 8, 2010; IEEE Xplore; pp. 2799-2808.
Kurino H., et al.; "Intelligent Image Sensor Chip With Three Dimensional Structure"; downloaded Jul. 8, 2010 from IEEE Xplore (IEDM 99); pp. 879-882.
Kurino, H. et al.; "Three-Dimensional Integration Technology for Real Time Micro-Vision System"; downloaded Dec. 17, 2009; IEEE Xplore; pp. 203-212.
Lee, K.W. et al.; Three-Dimensional Shared Memory Fabricated Using Wafer Stacking Technology; Dept. of Machine Intelligence and System Engineering; Tohoku University; downloaded Jul. 8, 2010 from IEEE Xplore; pp. 165-168.
Mitsuhashi, T. et al.; "Development of 3D-Packaging Process Technology for Stacked Memory Chips"; Mater. Res. Soc. Symp. vol. 970; 2007; pp. 1-8.
Ohdomari, I.; "Prospect for Future Applications of Si Nano-Technology"; Ambient SoC Symp.; pp. 1-56.
Ono, T., et al.; "Three-Dimensional Processor System Fabricated by Wafer Stacking Technology"; Dept. of Machine Intelligence and System Engineering; Tohoku University; 2002 Cool Chips V (Apr. 19, 2002) pp. 1-9.
Prismark Partners LLC; "3D Packaging: PoP, TSS/TSV, Face to Face Bonding"; Sep. 9, 2009; pp. 1-128.
Reif, R. et al. Fabrication Technologies for Three-Dimensional Integrated Circuites; downloaded Jul. 20, 2010; IEEE Xplore; pp. 1-5.
Sony, "Sony Leads the Industry in Mass Producing Devices that Achieve the Same Performance as Embedded DRAM LSIs in the Low-Cost SiP Process"; pp. 1-4.
Swinnen, B. et al; "Introduction to IMEC's Research Programs on 3D-Technology 3D-WLP/3D-SIC"; imec; 2007; pp. 1-72.
Yarema R.; "3D Technology Issues and On-Going Developments at FNAL"; ILC Vertec Workshop; Apr. 23, 2008; Mennagio, Italy; pp. 1-47.
Yarema, R.; "Development of 3D Integrated Circuits for HEP"; 12th LHC Electronics Workshop; Sep. 25-29, 2006; Valencia, Spain; pp. 1-51.
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, a. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369-373.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Symposium on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 773-776.
Jenei, S. et al. "High Q Inductor Add-on Module in Thick Cu/SiLK™ single damascene,"Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar-BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polymide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

International Search Report and Written Opinion for International Application No. PCT/US2010/027056 by the PCT International Searching Authority dated May 10, 2010.

* cited by examiner

INTEGRATED CIRCUIT CHIP USING TOP POST-PASSIVATION TECHNOLOGY AND BOTTOM STRUCTURE TECHNOLOGY

This application claims priority to U.S. provisional application No. 61/164,473, filed on Mar. 30, 2009, which is herein incorporated by reference in its entirety.

BACKGROUND OF THE DISCLOSURE

1. Field of the Disclosure

The disclosure relates to integrated circuit chips and chip packages, and more particularly, to integrated circuit chips and packages that utilize differing interconnection schemes for different sides of the circuit chips and packages.

2. Brief Description of the Related Art

Semiconductor chips can be found in many electronic devices, and today many electronic devices are required to run at high speed and/or low power consumption conditions. In traditional semiconductor fabrication, a chip can use wire-bonding wires or solder balls bonded with pads, exposed by openings in a passivation layer of the chip, of the chip to connect with a ball grid array (BGA) substrate. Modern electronic systems, modules, and/or circuit boards typically contain many different types of chips, such central processing units (CPUs), digital signal processors (DSPs), analog chips, dynamic random access memory (DRAM) chips, static random access memory (SRAM) chips, flash memory chips, and the like.

Each chip is typically fabricated using different types and/or different generations of IC manufacturing process technologies. For example, in some notebook personal computers, a CPU chip might be fabricated using a 65 nm IC process technology with a power supply voltage of 1.2V, an analog chip might be fabricated using an older 0.25 micron (250 nm) IC process technology with a power supply voltage of 3.3V, and a DRAM chip might be fabricated using a 90 nm IC process technology at 1.5V, and a flash memory chip might be fabricated using a 0.18 micron (180 nm) IC process technology with power supply voltage at 2.5V.

Each different type of chip can require a different voltage requirement for its supplied power. For example, a given DRAM chip might require an on-chip voltage converter to convert 3.3V to 1.5V while a flash memory chip might at the same time require an on-chip voltage converter to convert 3.3V to 2.5V. With a variety of supply voltages in a single system, voltage regulation and conversion can be problematic, complicated, and costly.

Interconnection schemes include the metal connections that connect an IC to other circuit or system components. Such interconnection schemes have become of relative importance and have, with the further miniaturization of the IC, an increasingly negative impact on the circuit performance, including for chip voltage and regulation. For example, the parasitic capacitance and resistance of the metal interconnections increase with smaller scale, which degrades the chip performance significantly. Of significant concern in this respect is the voltage drop along the power and ground buses and the RC delay of the critical signal paths. Attempts to reduce the resistance by using wider metal lines result in higher capacitance of these wires.

To solve this problem, one approach has been to develop low resistance metal (such as copper) for the wires while low dielectric materials are used in between signal lines. Current practice is to create metal interconnection networks under a layer of passivation, this approach however limits the interconnect network to fine line interconnects and the therewith associated high parasitic capacitance and high line resistivity. The latter two parameters, because of their relatively high values, degrade device performance, an effect which becomes even more severe for higher frequency applications and for long interconnect lines that are, for instance, used for clock distribution lines. Also, fine line interconnect metal cannot carry high values of current that is typically needed for ground busses and for power busses.

SUMMARY OF THE DISCLOSURE

The present disclosure is directed to integrated circuit chips and chip packages that utilize over-passivation and bottom interconnection schemes (or, "technologies") for the respective major sides of the chip or chip packages.

An aspect of the present disclosure is directed to chips or chip packages including one interconnection scheme at one side of a chip or chip package and/or another interconnection scheme at another side of a chip or chip package, e.g., an over-passivation scheme at a top of a chip and a bottom scheme at a bottom of the same chip. The integrated circuit chips can be connected to an external circuit or structure, such as ball-grid-array (BGA) substrate, printed circuit board, semiconductor chip, metal substrate, glass substrate or ceramic substrate, through the over-passivation scheme or the bottom scheme.

Another aspect of the present disclosure is directed to on-chip voltage-regulating and/or converting devices and circuits.

Exemplary embodiments of the present disclosure provide chips having an over-passivation scheme at a passivation layer of the chip and a bottom scheme at a backside of a semiconductor substrate of the chip. Exemplary embodiments can include post-passivation schemes for either side of a chip or chip package, e.g., a top of a chip or bottom (backside) of a chip.

Exemplary embodiments of the present disclosure can provide on-chip voltage-regulating and/or converting devices or circuits that can send electrical power to multiple devices or circuit units (e.g., sub circuits or circuitry portions) requiring different voltage characteristics.

Furthermore, exemplary embodiments can supply voltage or power to one or more devices or circuit units with little loss due to parasitic effects.

Further embodiments can provide for the delivery of electrical power to one or more devices or circuit units through a passivation layer and by way of a coarse conductor deposited over the passivation layer.

Embodiments can further provide an over-passivation metal interconnection that can distribute signals, power, and/or ground output from at least one internal circuit or internal device to at least one other internal circuit or device. Exemplary embodiment can provide for such without connection to ESD, driver, or receiver circuitry.

Embodiments can further provide an over-passivation metal interconnection that can distribute signals, power, and/or ground output from at least one internal circuit or internal device to at least one other internal circuit or device and/or to external (outside of chip) circuitry, including other chips and chip packages according to the present disclosure.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments.

Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

Figure 1A:
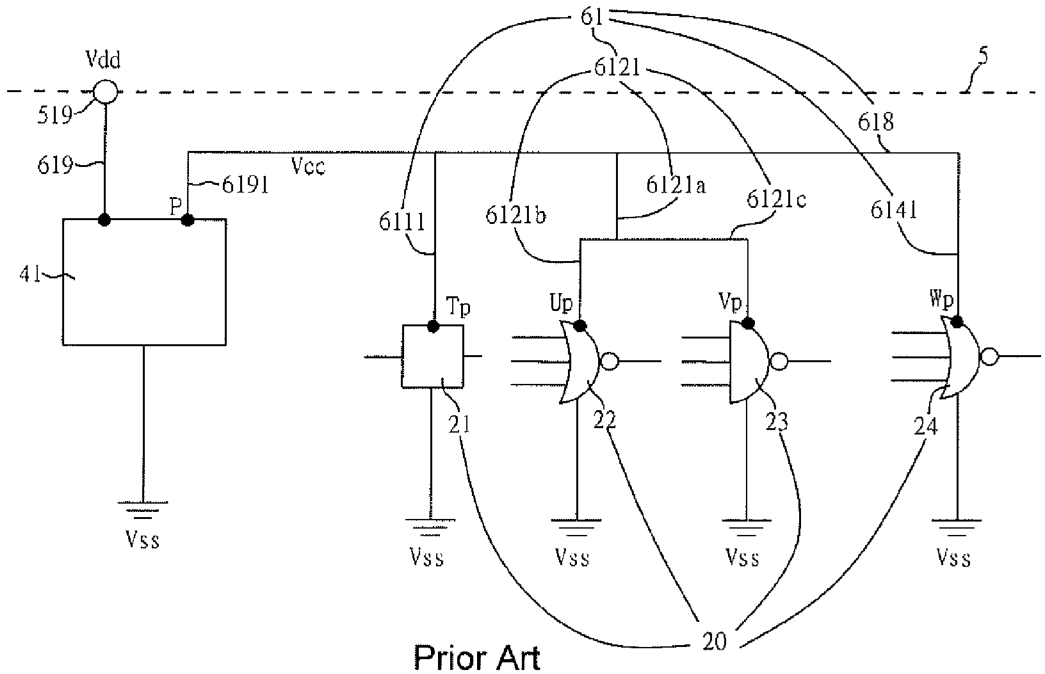

FIG. 1A is a schematic representation of a prior art voltage regulator or converter circuit connected to multiple internal circuits through a fine-line metallization.

Figure 1B:
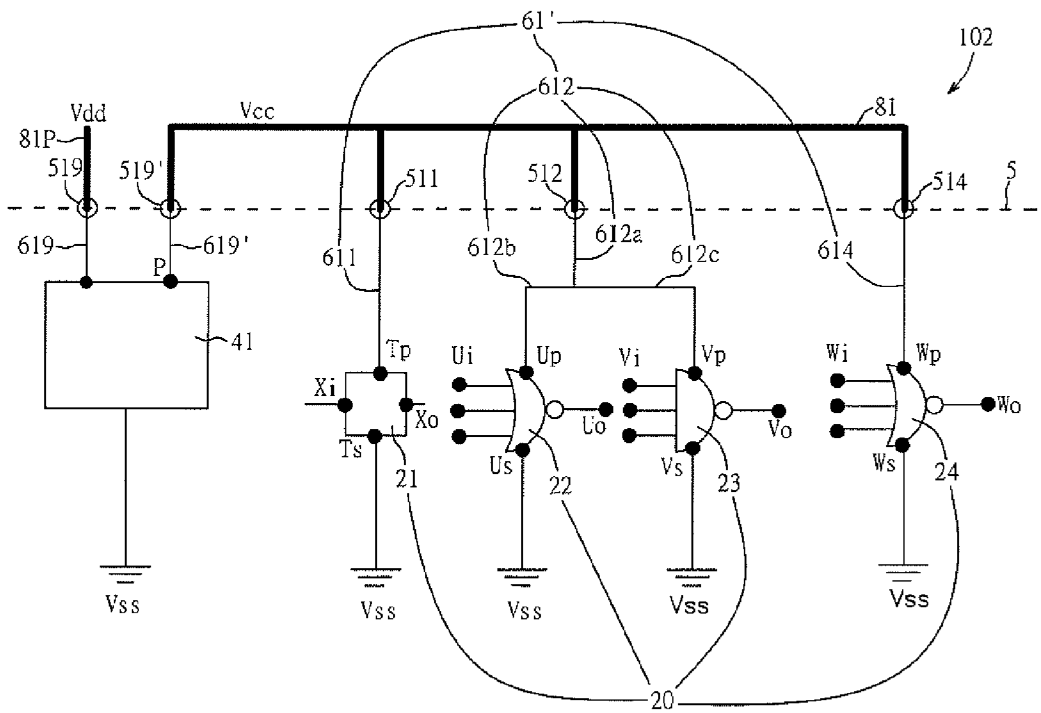

FIG. 1B is a schematic representation of a voltage regulator or converter circuit connected to multiple internal circuits through an over-passivation power bus (metal line, trace, or plane), according to an embodiment.

Figure 1C:
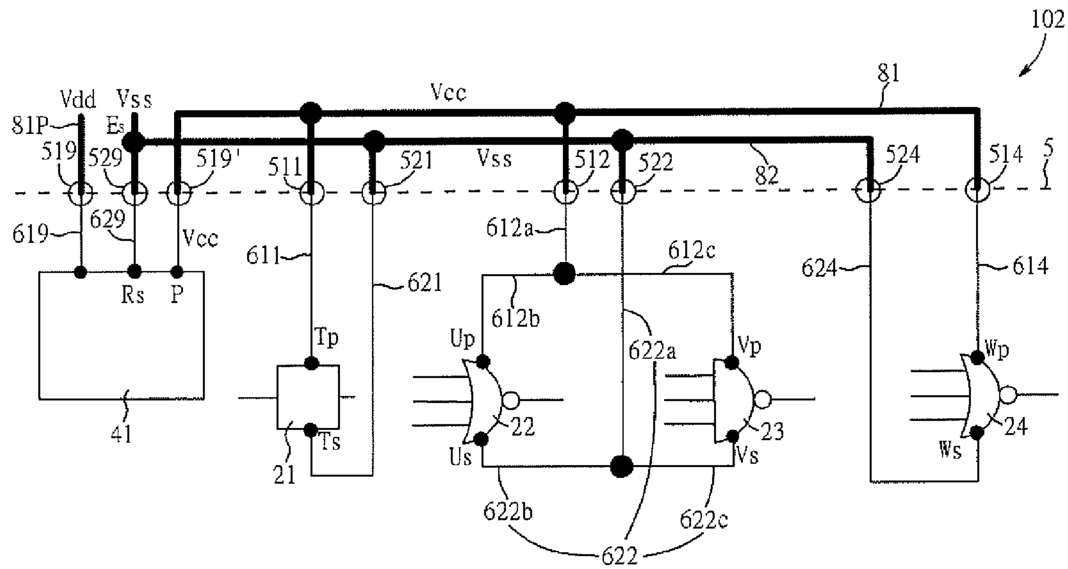
Figure 1D:
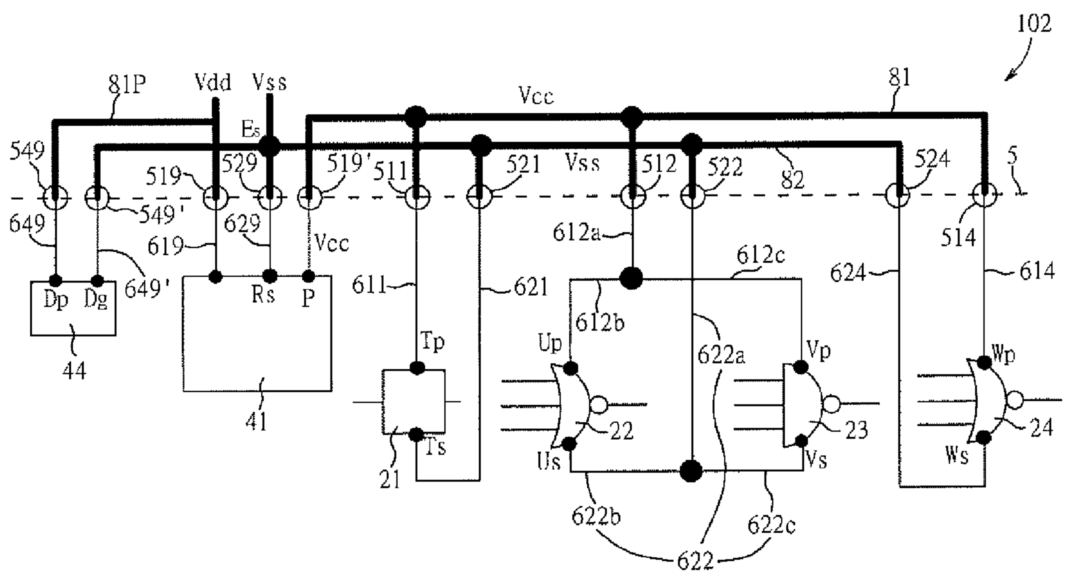

FIGS. 1C and 1D are schematic representation of a voltage regulator or a voltage converter connected to multiple internal circuits through over-passivation power and ground buses (metal lines, traces, or planes), according to an embodiment.

Figure 2A:
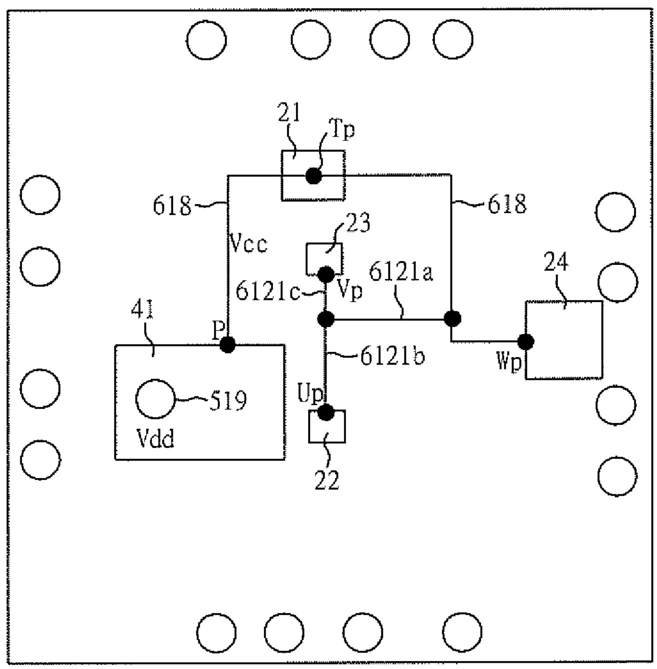

FIG. 2A is a top view layout of a prior art voltage regulator or converter circuit connected to multiple internal circuits through a fine-line metallization.

Figure 2B:
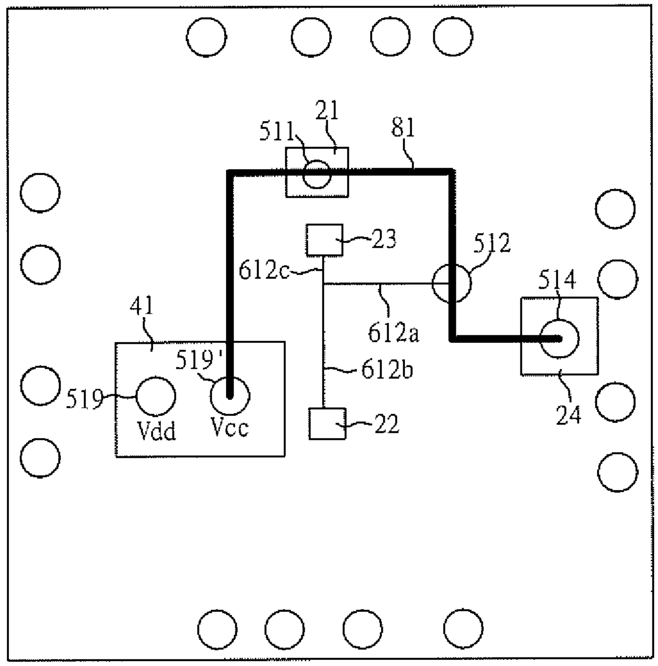

FIG. 2B is a top view layout of a voltage regulator or converter circuit connected to multiple internal circuits through an over-passivation power bus (metal line, trace or plane), according to an embodiment.

Figure 2C:
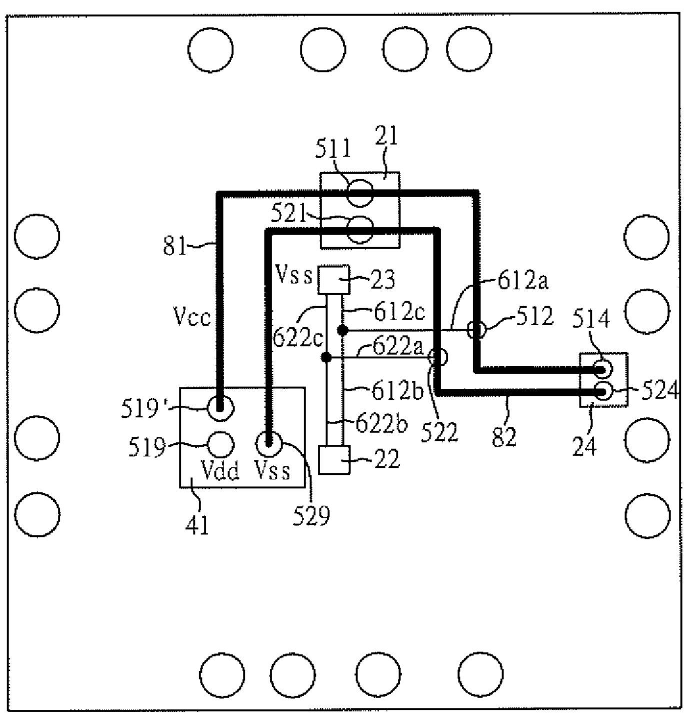

FIG. 2C is a top view layout of a voltage regulator or converter circuit connected to multiple internal circuits through over-passivation power and ground buses (metal lines, traces or planes), according to an embodiment.

Figure 3A:
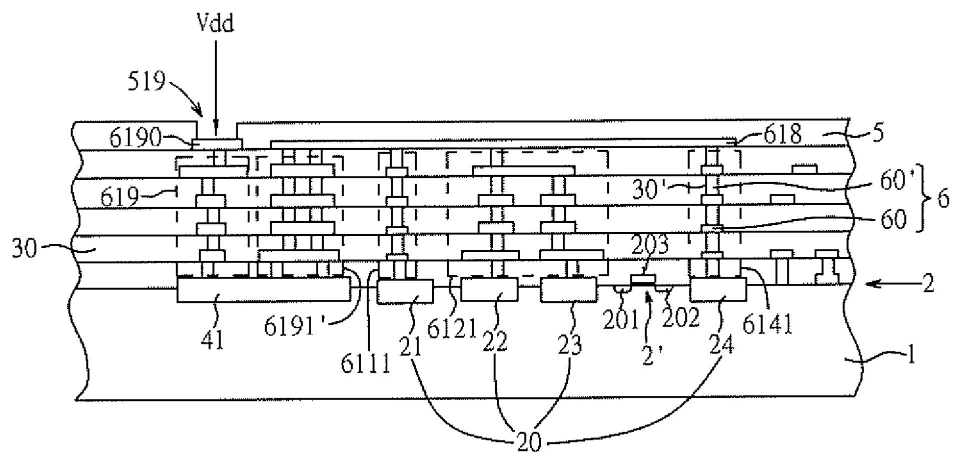

FIG. 3A is a cross-sectional representation of a prior art voltage regulator or converter circuit connected to multiple internal circuits through a fine-line metallization.

Figure 3B:
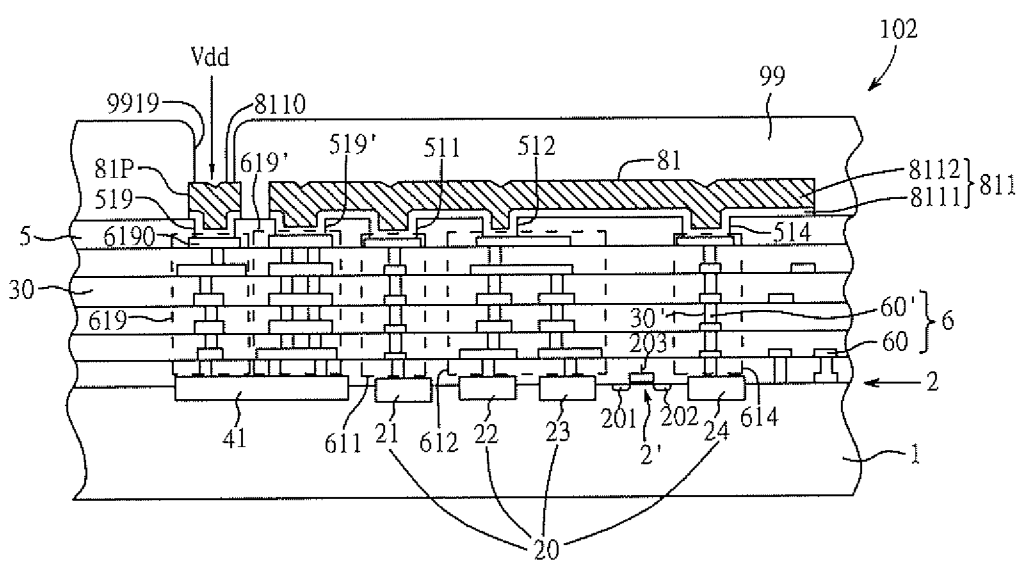

FIG. 3B is a cross-sectional representation of a voltage regulator or converter circuit connected to multiple internal circuits through an over-passivation power bus (metal line, trace or bus), according to an embodiment.

Figure 3C:
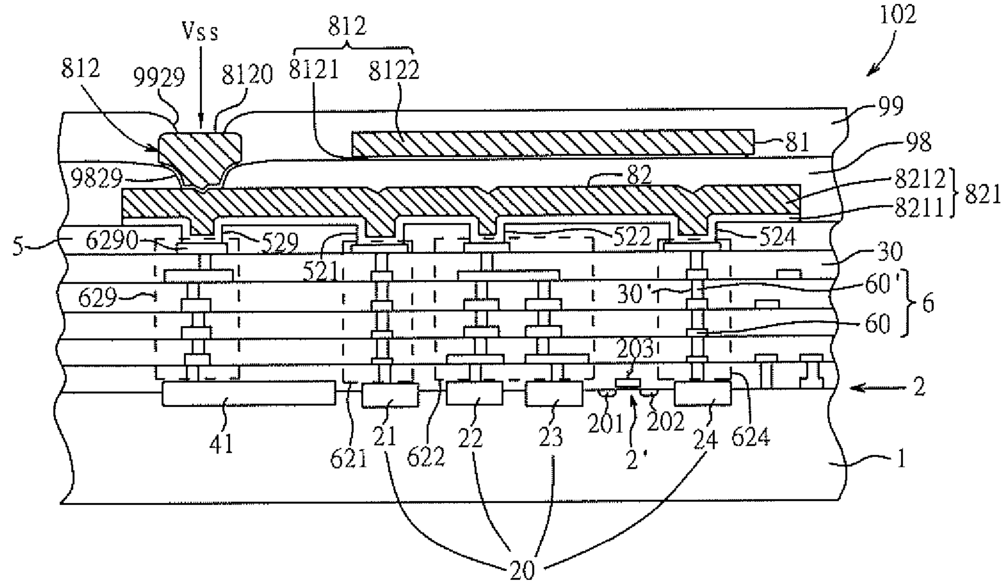

FIG. 3C is a cross-sectional representation of a voltage regulator or converter circuit connected to multiple internal circuits through over-passivation power and ground buses (metal lines, traces or planes in two patterned circuit metal layers), according to an embodiment.

Figure 3D:
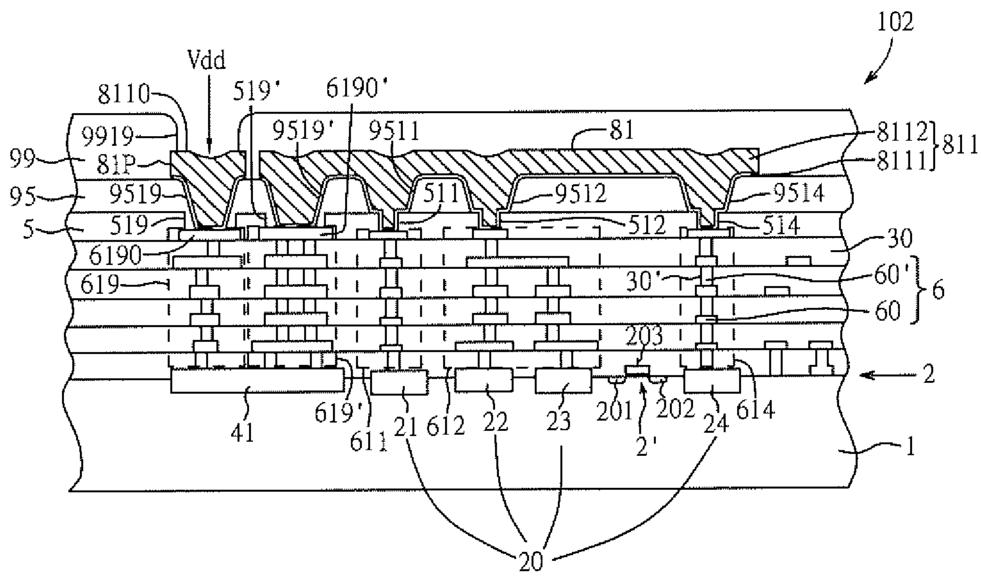

FIG. 3D is a cross-sectional representation of a voltage regulator or converter circuit connected to multiple internal circuits through an over-passivation power bus (metal line, trace or bus), according to an embodiment. This figure is similar to FIG. 3B except that an additional polymer layer is provided between the bottom-most over-passivation metal layer and the passivation layer.

Figure 4:
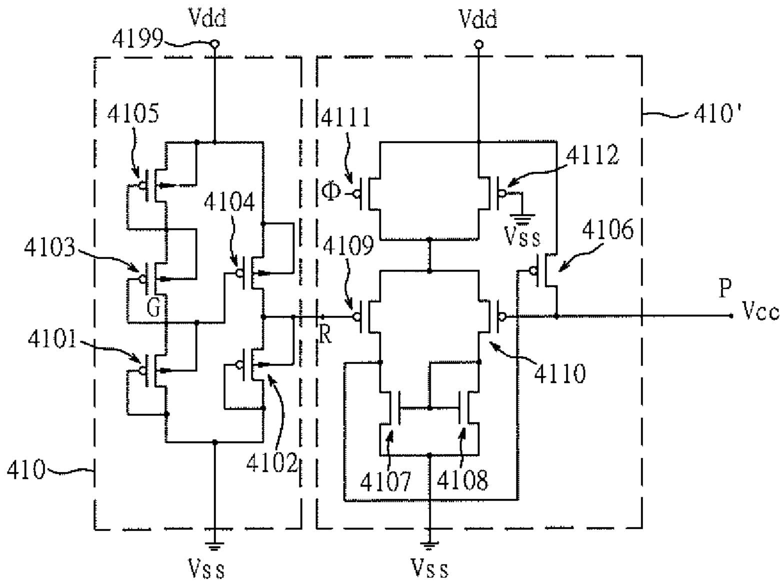

FIG. 4 is a schematic representation of an example of a CMOS voltage converter circuit, according to an embodiment.

Figure 5A:
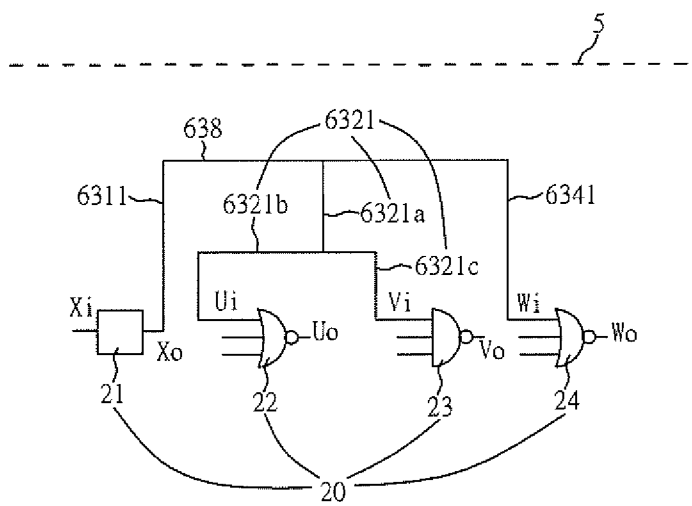

FIG. 5A is a schematic representation of multiple internal circuits connected through a fine-line metallization structure under a passivation layer, according to an embodiment.

Figure 5B:
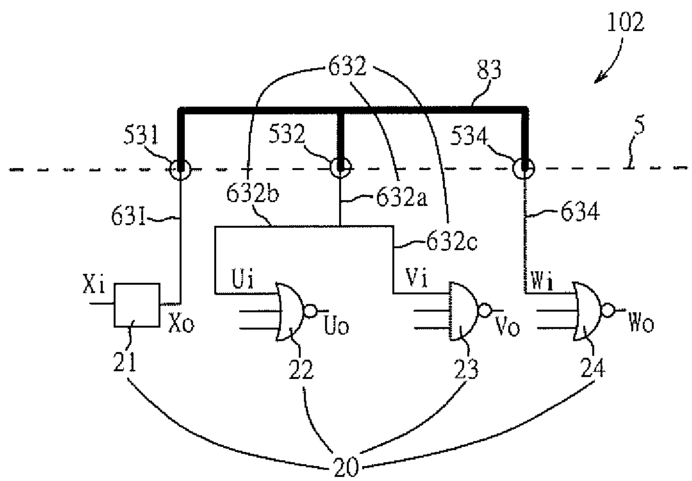

FIG. 5B is a schematic representation of multiple internal circuits connected through a thick and wide metal layer over a passivation layer to transmit a signal, according to an embodiment.

Figure 5C:
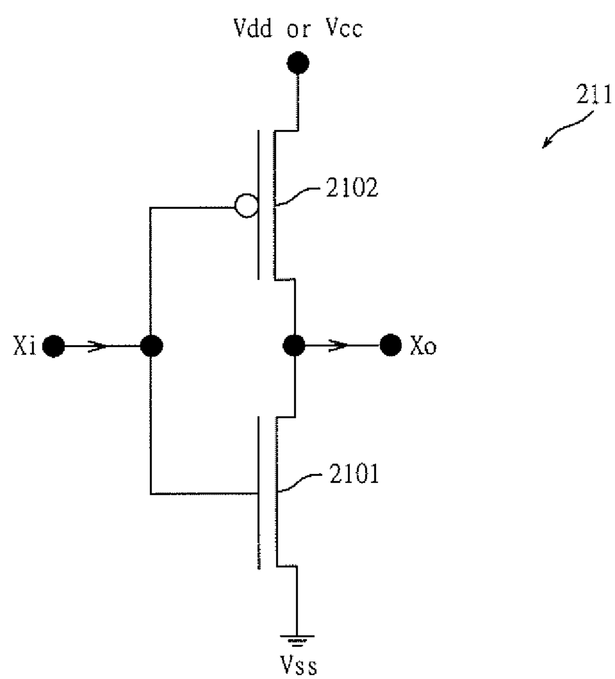

FIG. 5C shows a circuit diagram of an inverter, which can be applied to the internal circuit 21 shown in FIG. 5B, according to an embodiment.

Figure 5D:
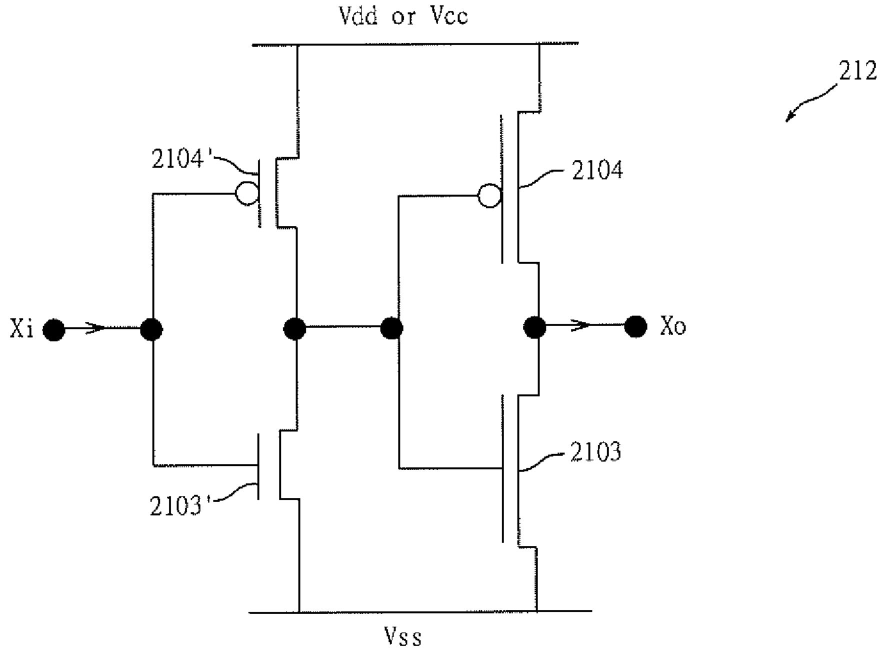

FIG. 5D shows a circuit diagram of an internal driver, which can be applied to the internal circuit 21 shown in FIG. 5B, according to an embodiment.

Figure 5E:
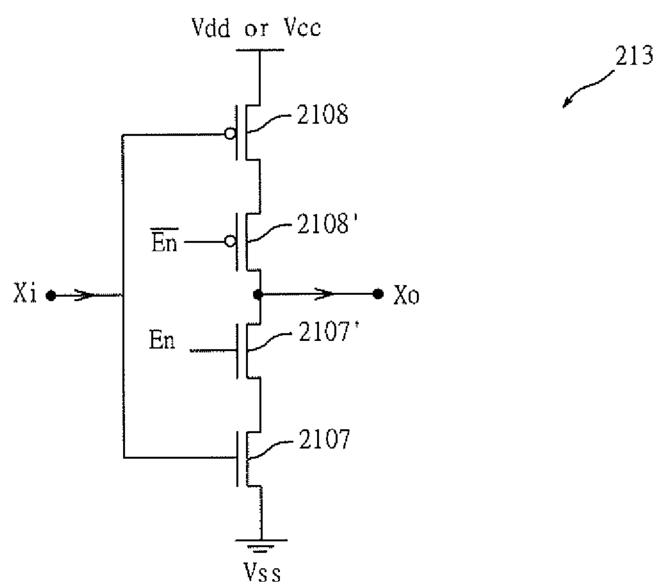

FIG. 5E shows a circuit diagram of a tri-state buffer, which can be applied to the internal circuit 21 shown in FIG. 5B, according to an embodiment.

Figure 5F:
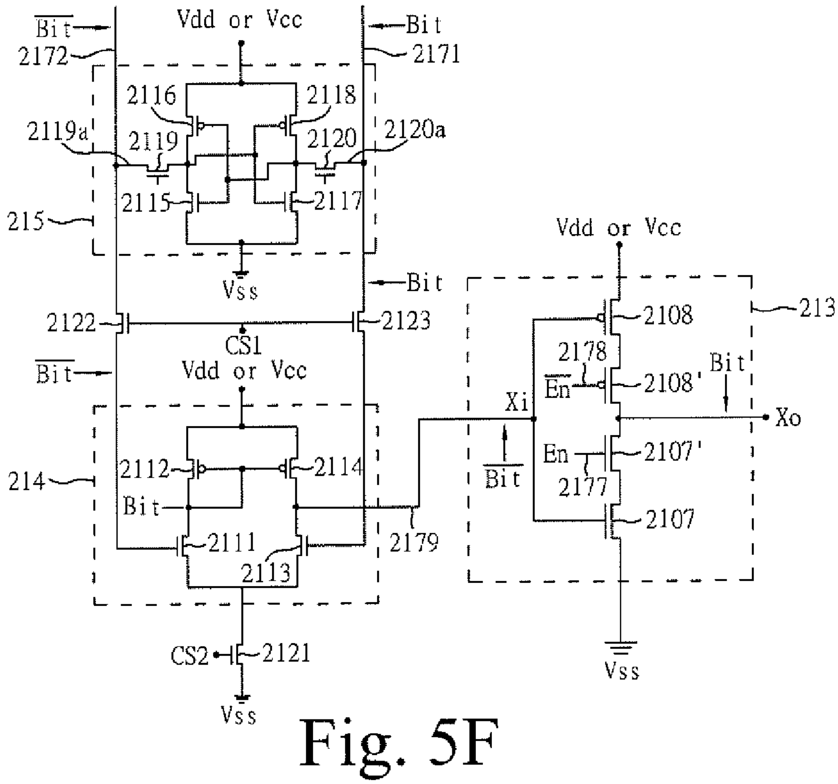

FIG. 5F shows a circuit diagram of a tri-state buffer, which can be applied to the internal circuit 21 shown in FIG. 5B, connected to a sense amplifier connected to a memory cell, according to an embodiment.

Figure 5G:
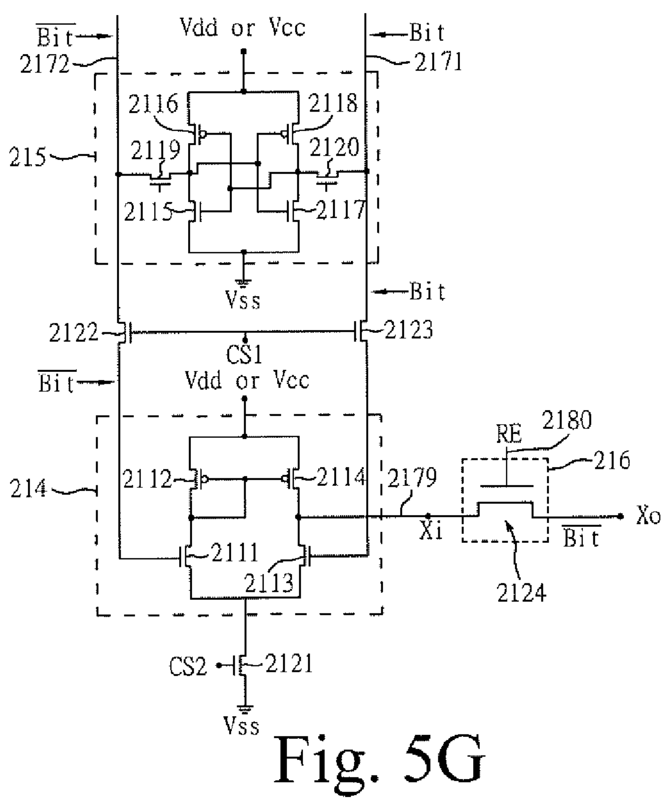

FIG. 5G shows a circuit diagram of a gate switch, which can be applied to the internal circuit 21 shown in FIG. 5B, connected to a sense amplifier connected to a memory cell, according to an embodiment.

Figure 5H:
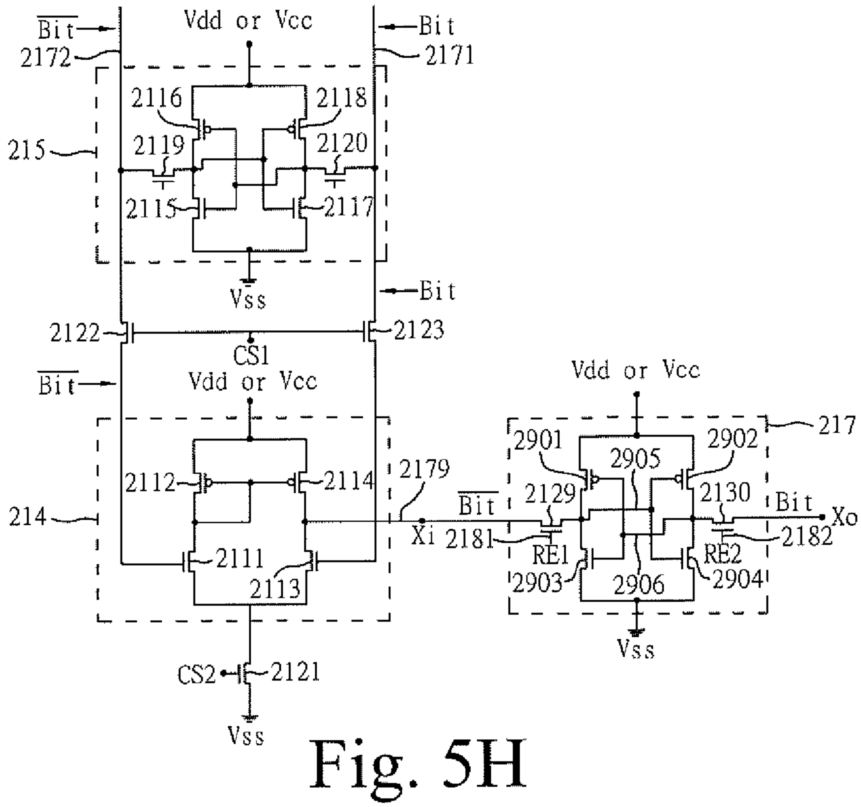

FIG. 5H shows a circuit diagram of a latch circuit, which can be applied to the internal circuit 21 shown in FIG. 5B, connected to a sense amplifier connected to a memory cell, according to an embodiment.

Figure 5I:
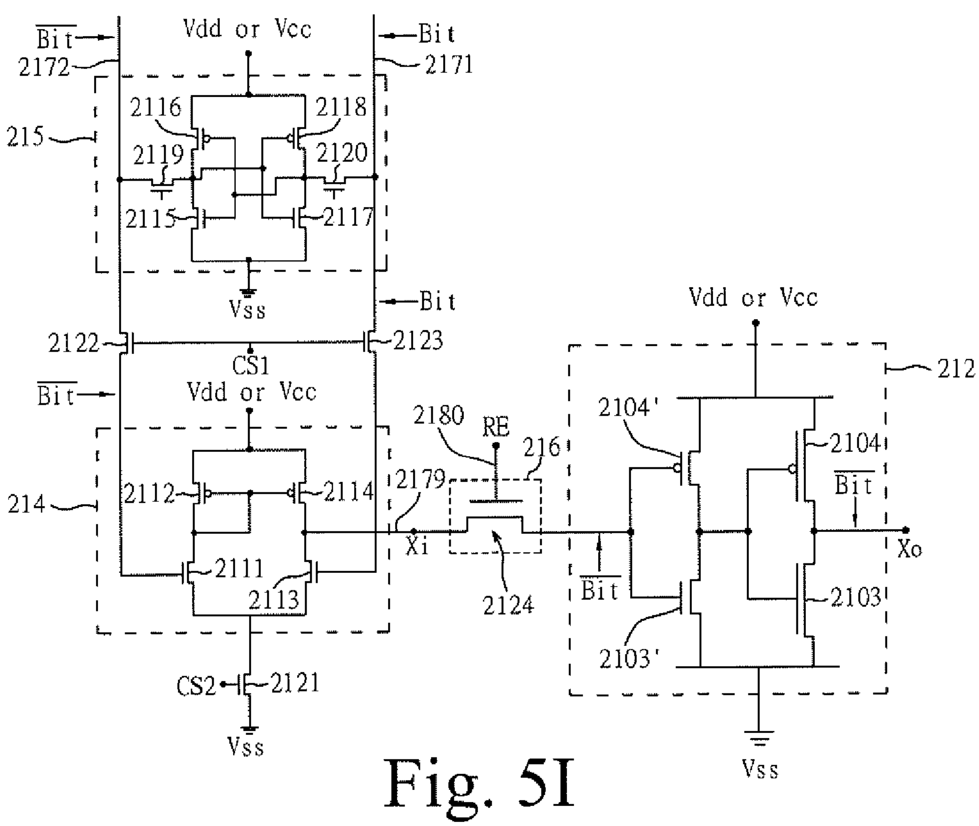

FIG. 5I shows a circuit diagram of a gate switch and internal driver, which can be applied to the internal circuit 21 shown in FIG. 5B, connected to a sense amplifier connected to a memory cell, according to an embodiment.

Figure 5J:
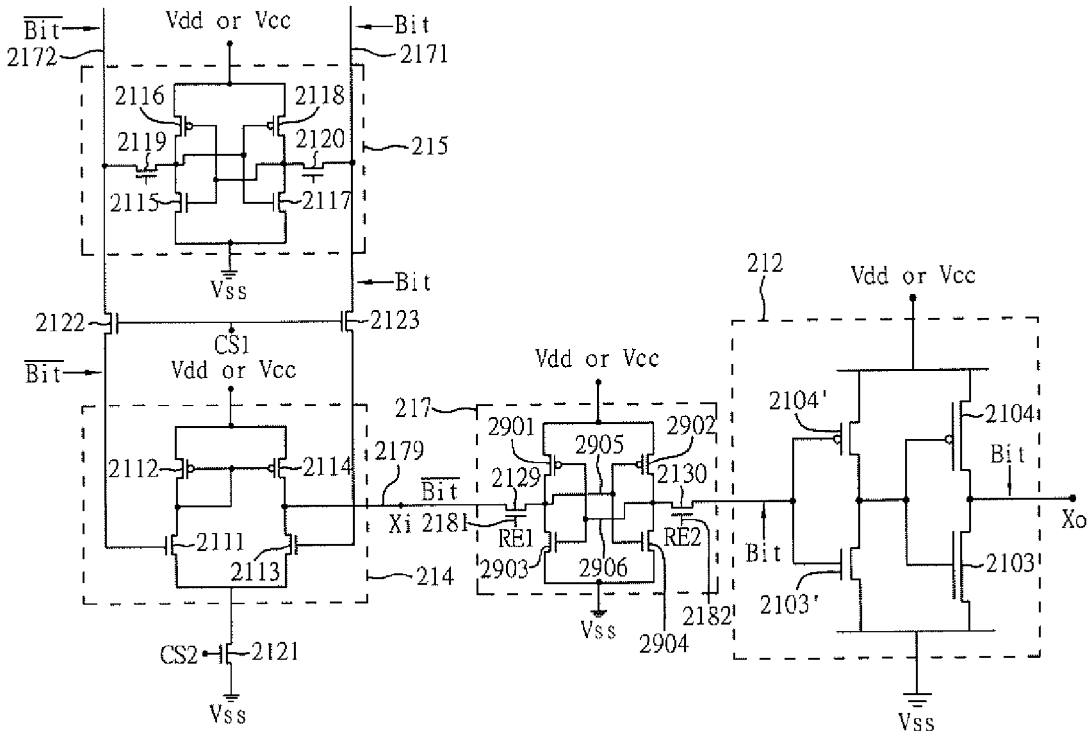

FIG. 5J shows a circuit diagram of a latch circuit and internal driver, which can be applied to the internal circuit 21 shown in FIG. 5B, connected to a sense amplifier connected to a memory cell, according to an embodiment.

Figure 5K:
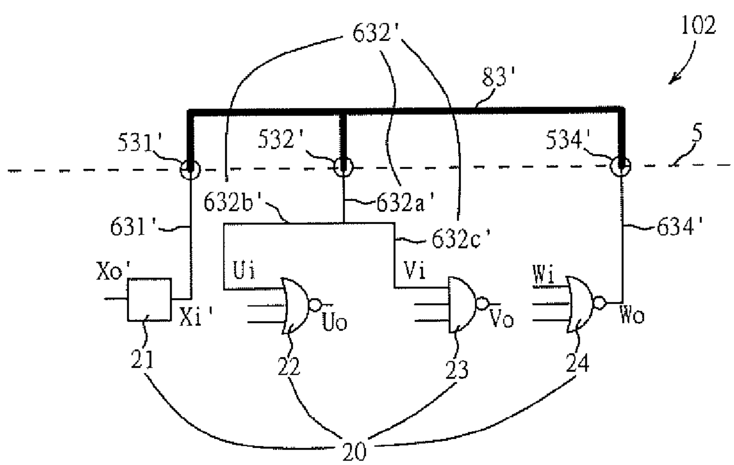

FIG. 5K is a schematic representation of multiple internal circuits connected through a thick and wide metal layer over a passivation layer to transmit a signal, according to an embodiment.

Figure 5L:
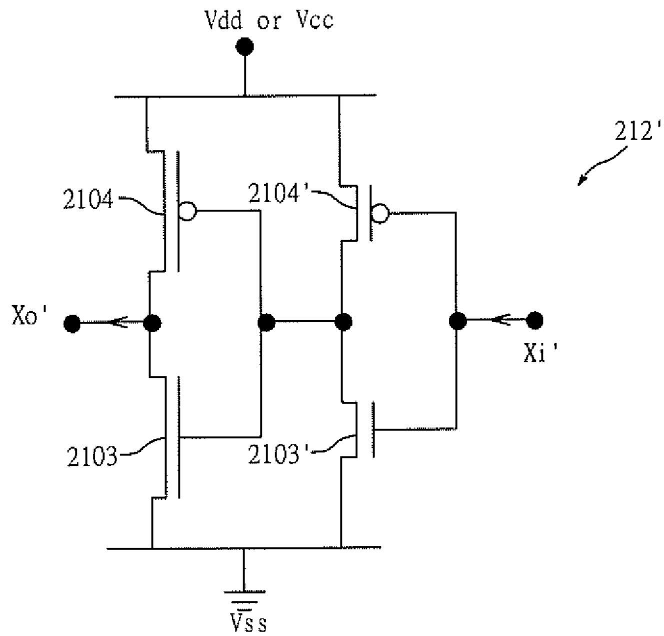

FIG. 5L shows a circuit diagram of an internal receiver, which can be applied to the internal circuit 21 shown in FIG. 5K, according to an embodiment.

Figure 5M:
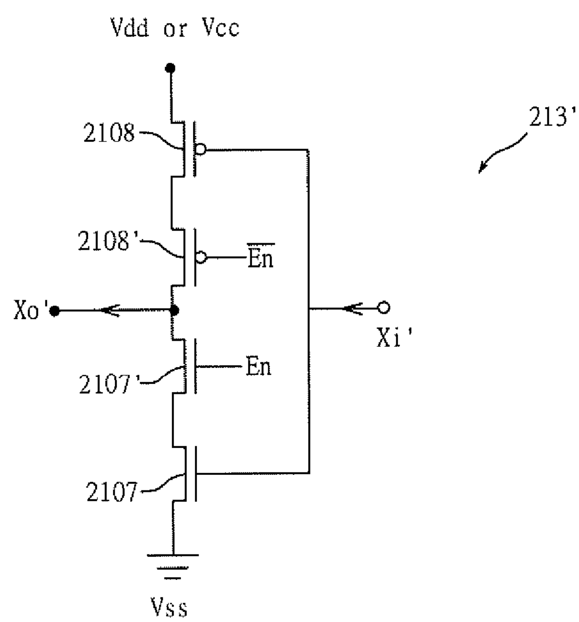

FIG. 5M shows a circuit diagram of a tri-state buffer, which can be applied to the internal circuit 21 shown in FIG. 5K, according to an embodiment.

Figure 5N:
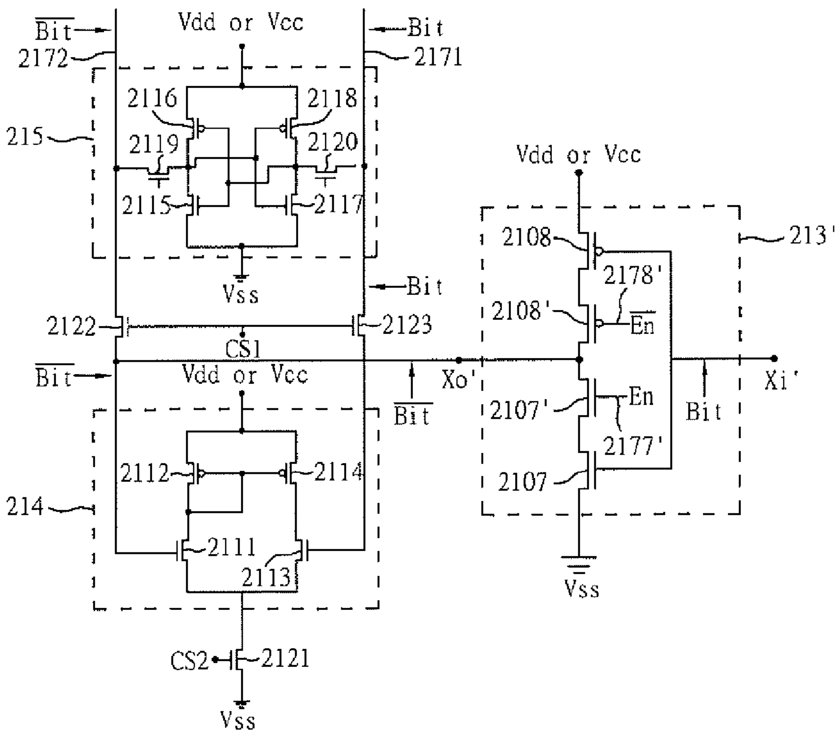

FIG. 5N shows a circuit diagram of a tri-state buffer, which can be applied to the internal circuit 21 shown in FIG. 5K, connected to a sense amplifier connected to a memory cell, according to an embodiment.

Figure 5O:
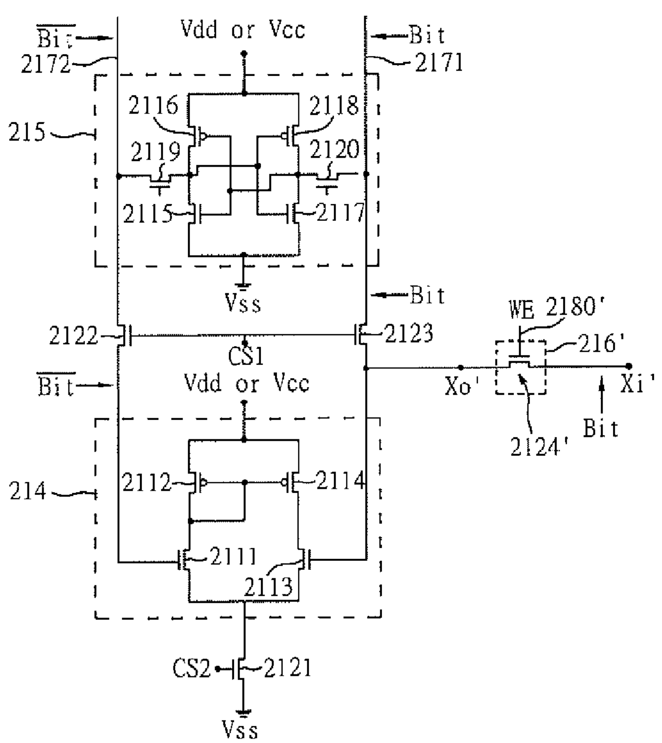

FIG. 5O shows a circuit diagram of a gate switch, which can be applied to the internal circuit 21 shown in FIG. 5K, connected to a sense amplifier connected to a memory cell, according to an embodiment.

Figure 5P:
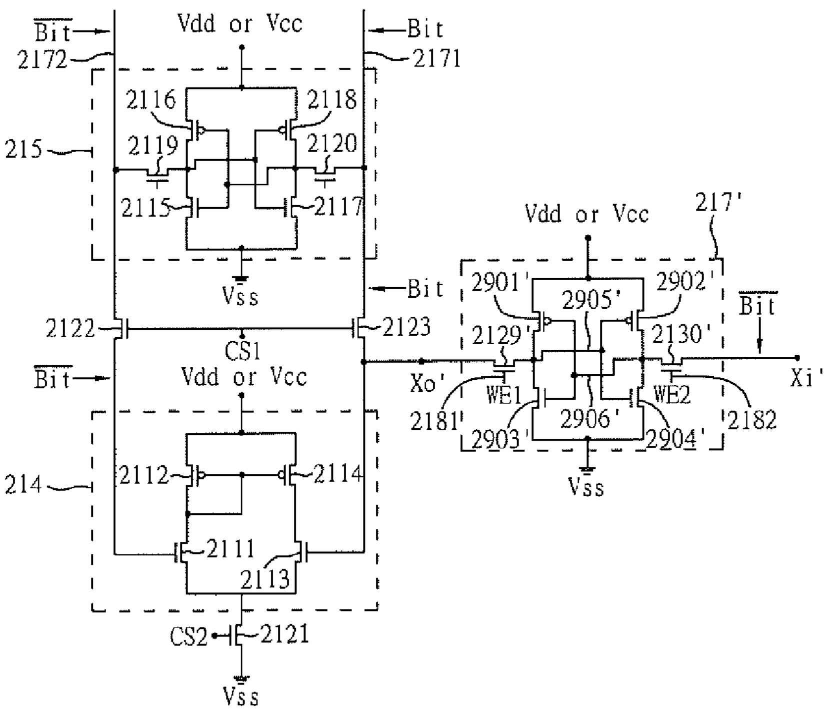

FIG. 5P shows a circuit diagram of a latch circuit, which can be applied to the internal circuit 21 shown in FIG. 5K, connected to a sense amplifier connected to a memory cell, according to an embodiment.

Figure 5Q:
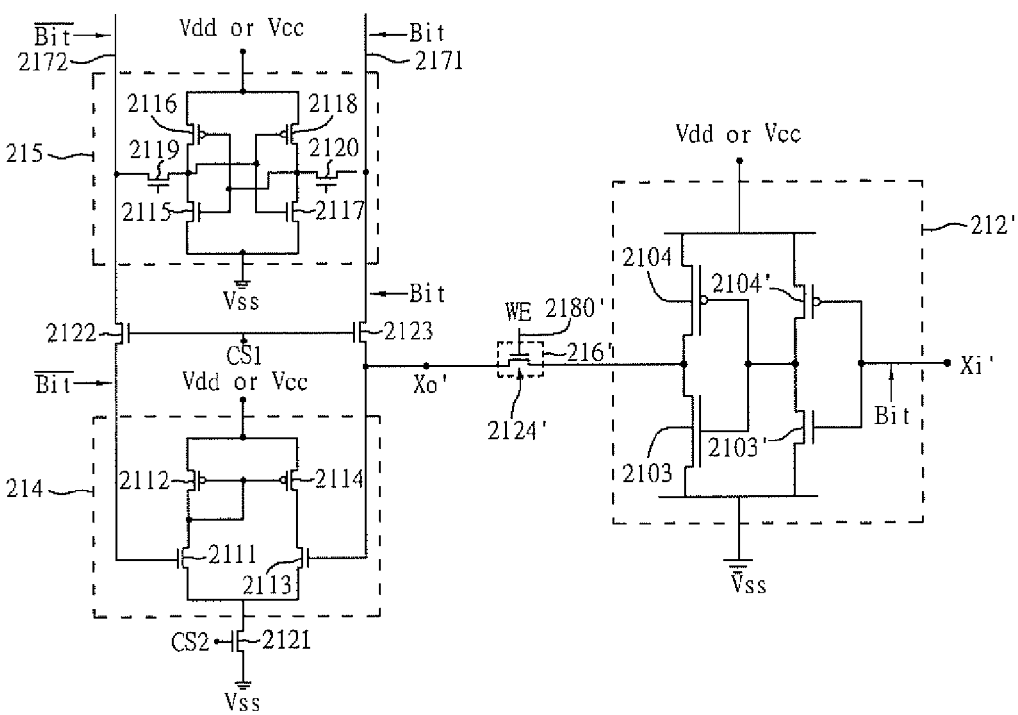

FIG. 5Q shows a circuit diagram of a gate switch and internal receiver, which can be applied to the internal circuit 21 shown in FIG. 5K, connected to a sense amplifier connected to a memory cell, according to an embodiment.

Figure 5R:
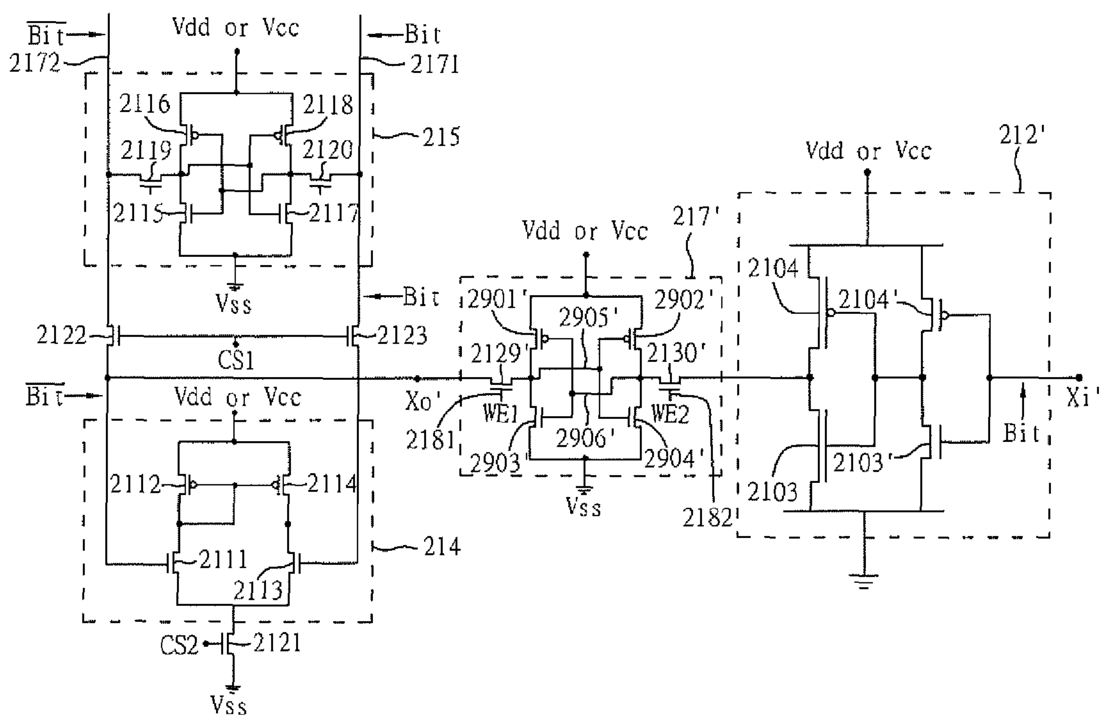

FIG. 5R shows a circuit diagram of a latch circuit and internal receiver, which can be applied to the internal circuit 21 shown in FIG. 5K, connected to a sense amplifier connected to a memory cell, according to an embodiment.

Figure 5S:
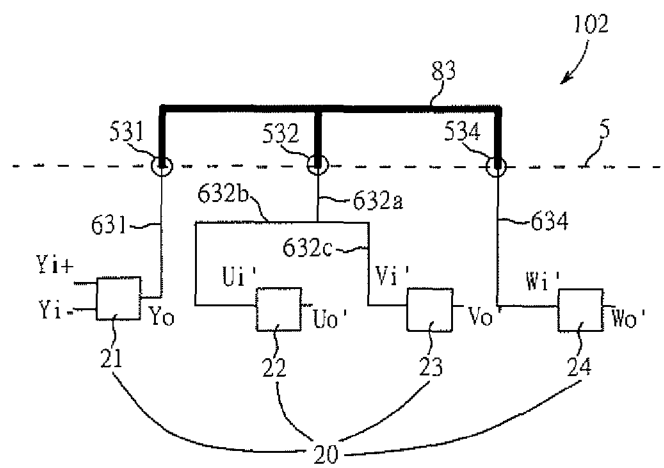

FIG. 5S is a schematic representation of multiple internal circuits connected through a thick and wide metal layer over a passivation layer to transmit an analog signal, according to an embodiment.

Figure 5T:
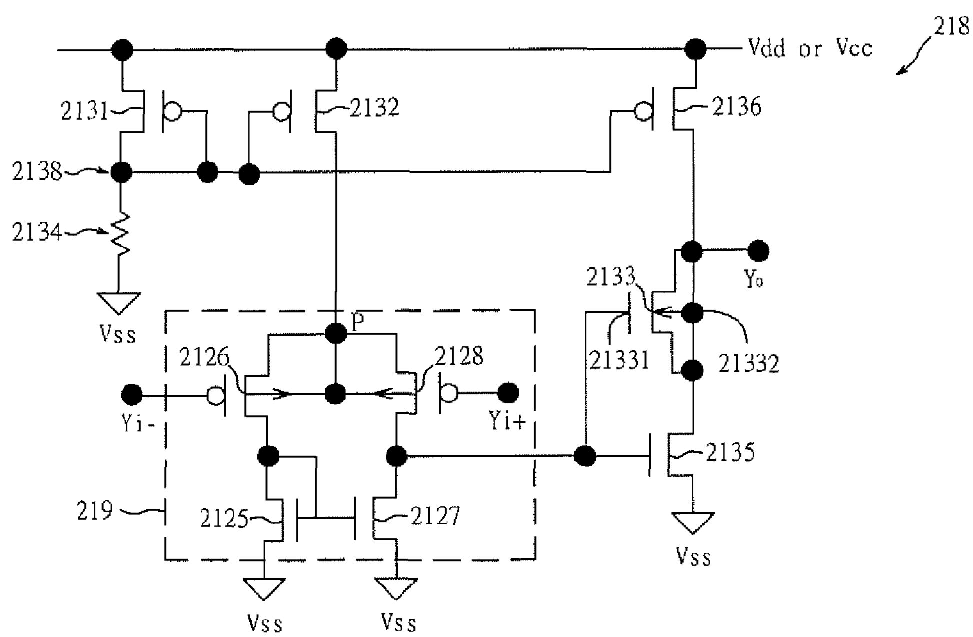

FIG. 5T shows a circuit diagram of a differential amplifier, which can be applied to the internal circuit 21 shown in FIG. 5S, according to an embodiment.

FIGS. 5U-5Z show a schematic representation of a memory chip with an address bus and a data bus over a passivation layer, according to an embodiment.

Figure 6A:
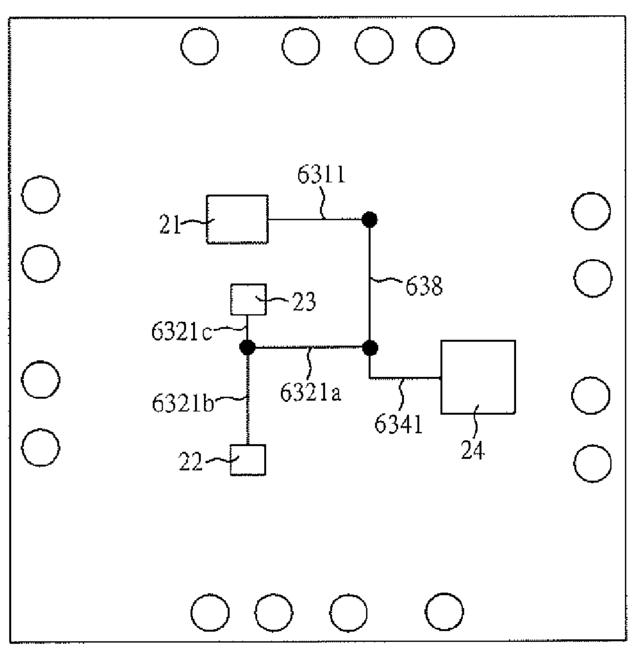

FIG. 6A is a top view layout of a distribution of signals from an internal circuit to other internal circuits, according to an embodiment.

Figure 6B:
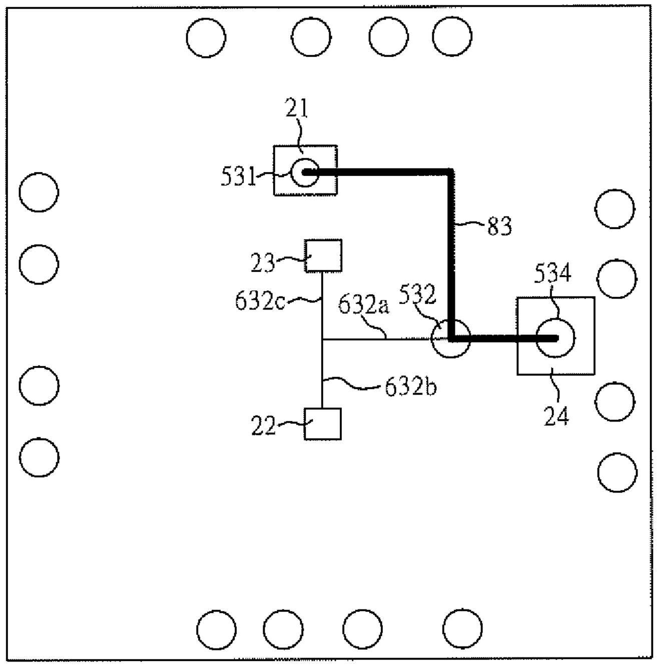

FIG. 6B is a top view layout of signal distribution, and an internal circuit sends signals to other internal circuits through an over-passivation interconnection scheme, requiring no solder bump and no off-chip circuits, according to an embodiment.

Figure 7A:
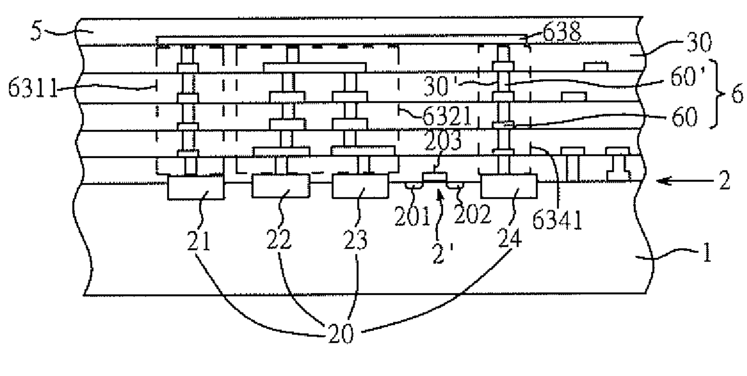

FIG. 7A is a cross-sectional representation of a distribution of signals from an internal circuit to other internal circuits, according to an embodiment.

Figure 7B:
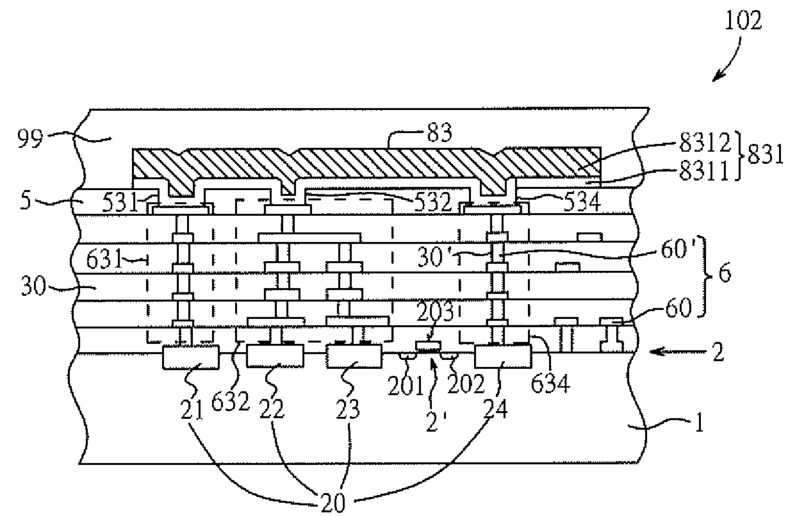

FIG. 7B is a cross-sectional representation of signal distribution, and an internal circuit sends signals to other internal circuits through an over-passivation interconnection scheme, requiring no solder bump and no off-chip circuits, according to an embodiment.

Figure 7C:
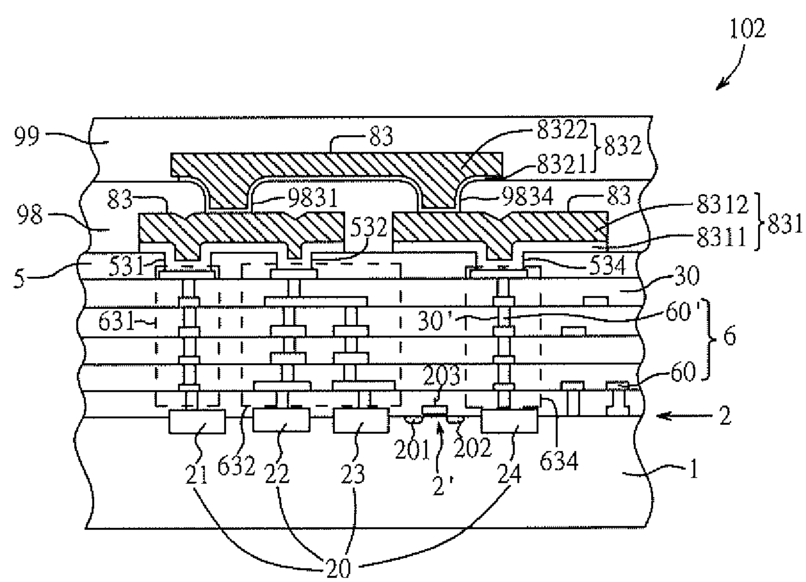

FIG. 7C is a cross-sectional representation of signal distribution, and an internal circuit sends signals to other internal circuits through an over-passivation scheme, requiring no solder bump and no off-chip circuits, according to an embodiment. Two over-passivation scheme includes two metal layers.

Figure 7D:
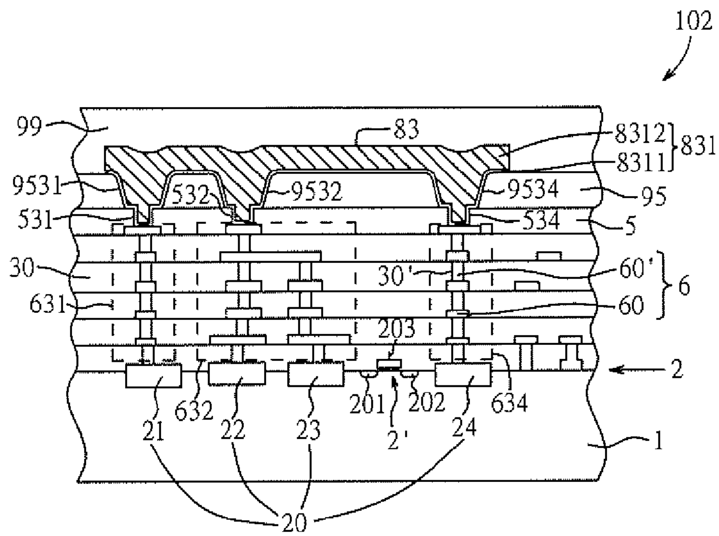

FIG. 7D is a cross-sectional representation of signal distribution, and an internal circuit sends signals to other internal circuits through an over-passivation interconnection scheme, according to an embodiment. This figure is similar to FIG. 7B except that an additional polymer layer is provided between the passivation layer and the bottom-most over-passivation metal layer.

Figure 8A:
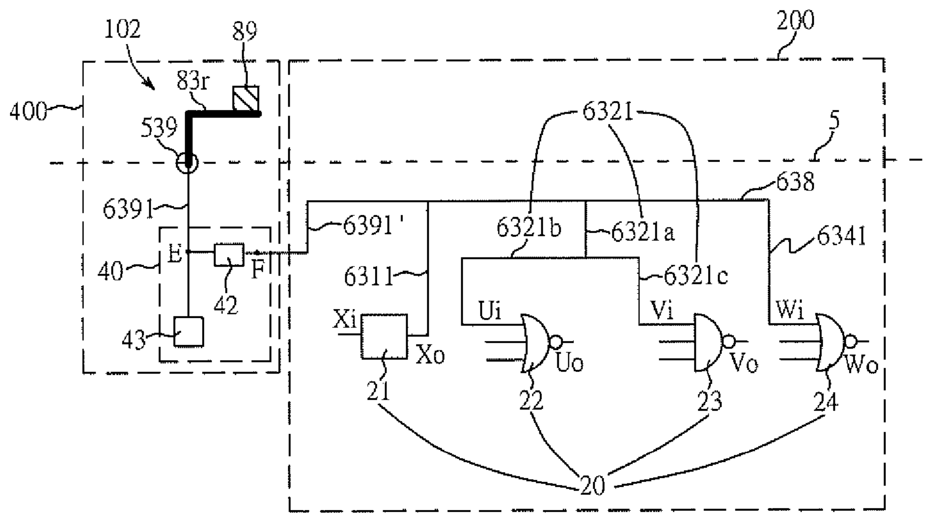

FIG. 8A is a schematic representation of a distribution of signals from internal circuits to the external circuits through off-chip circuits using fine-line scheme, according to an embodiment.

FIGS. 8B, 8D, 8E and 8F are schematic representations of a signal generated in the internal circuits propagated to an external circuit through over-passivation metals and fine-line metals, and through off-chip circuits, according to an embodiment.

Figure 8B:
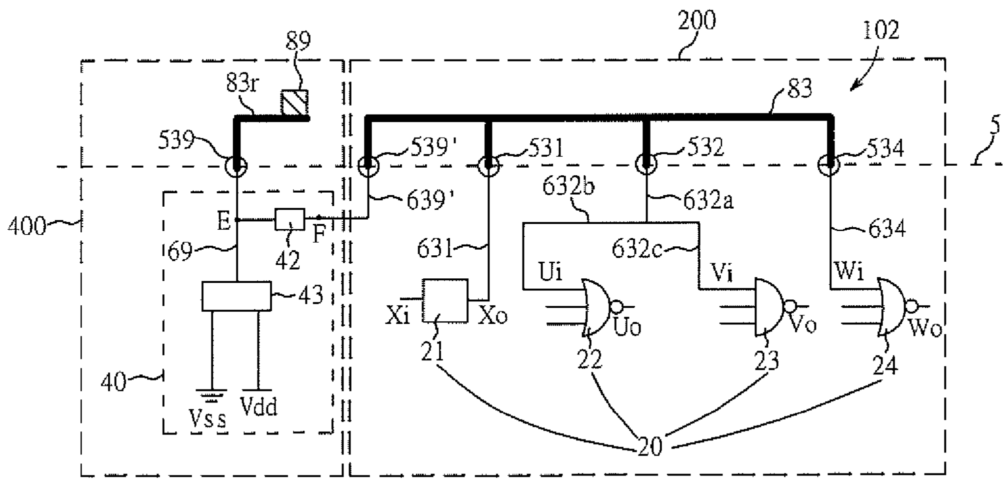
Figure 8C:
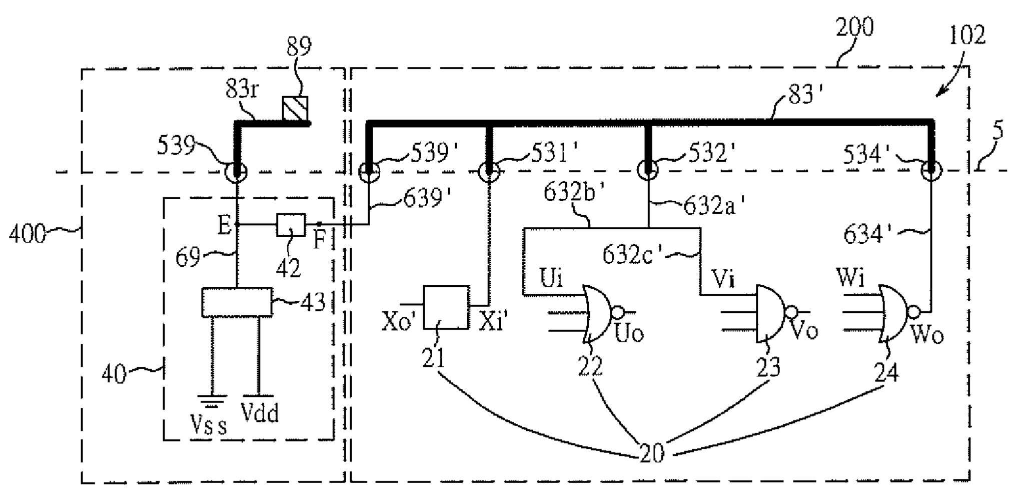

FIG. 8C is a schematic representation of a signal transmitted from an external circuit to an internal circuit through over-passivation metals and fine-line metals, and through off-chip circuits, according to an embodiment.

Figure 9A:
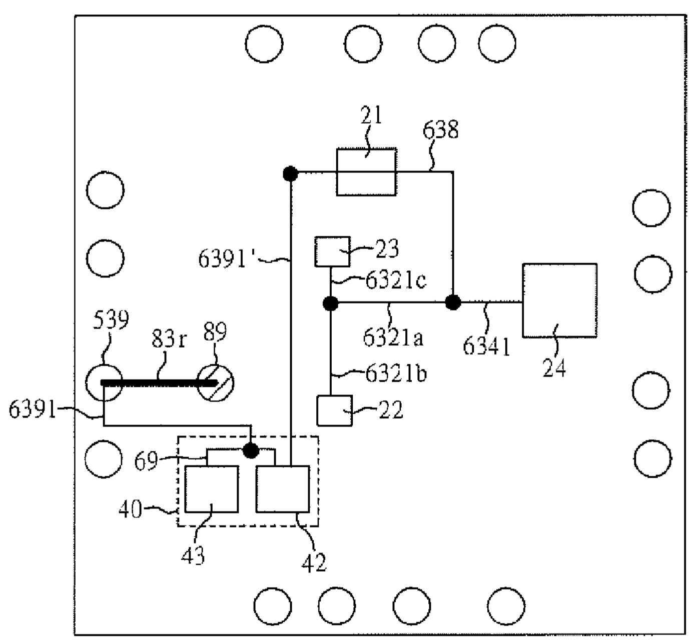

FIG. 9A is a top view layout of a distribution of signals from internal circuits to the external circuits through off-chip circuits using a fine-line scheme, according to an embodiment.

Figure 9B:
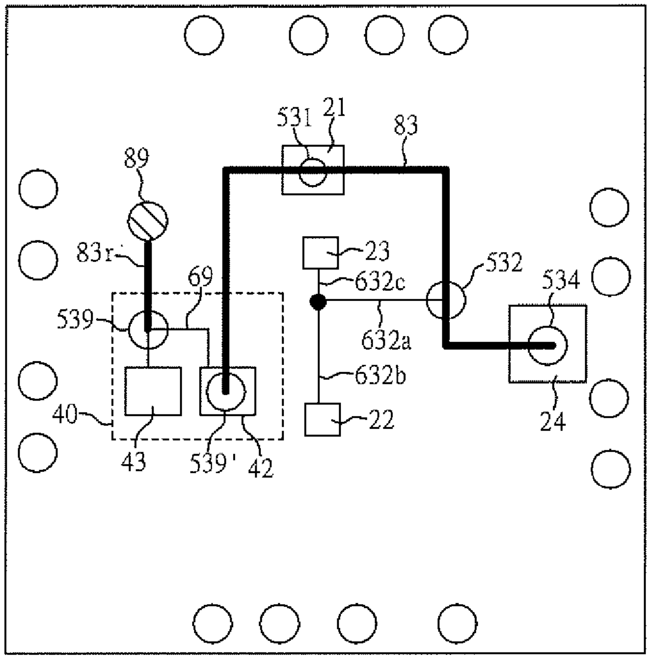

FIG. 9B is a top view layout of multiple internal circuits connected to an off-chip circuit through a thick and wide metal trace, bus or plane over a passivation layer, according to an embodiment.

Figure 9C:
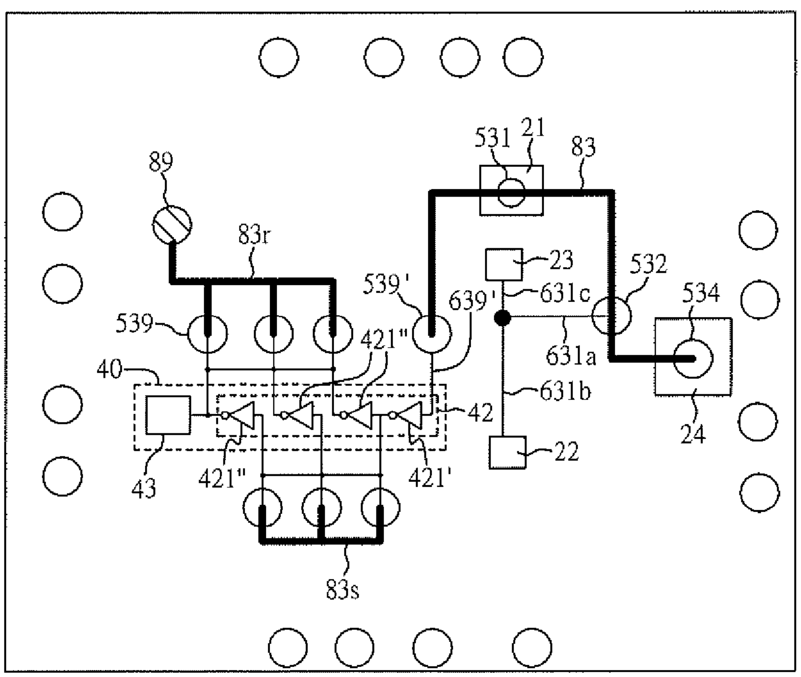

FIG. 9C is a top view layout of multiple internal circuits connected to an off-chip circuit through a thick and wide metal trace, bus or plane over a passivation layer, and the off-chip circuit includes two-stage cascade off-chip driver 421, according to an embodiment.

Figure 9D:
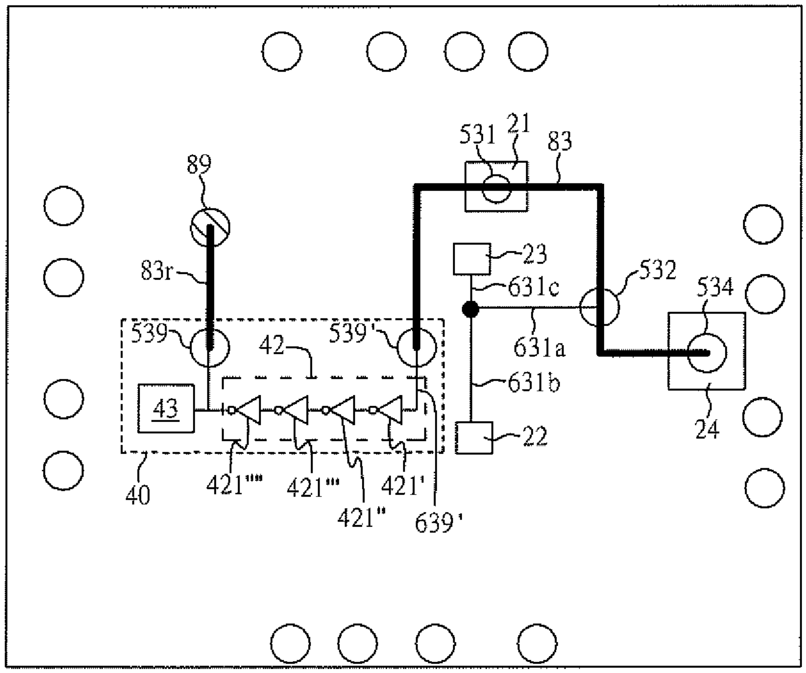

FIG. 9D is a top view layout of multiple internal circuits connected to an off-chip circuit through a thick and wide metal trace, bus or plane over a passivation layer, and the off-chip circuit includes four-stage cascade off-chip driver 42, according to an embodiment.

Figure 10A:
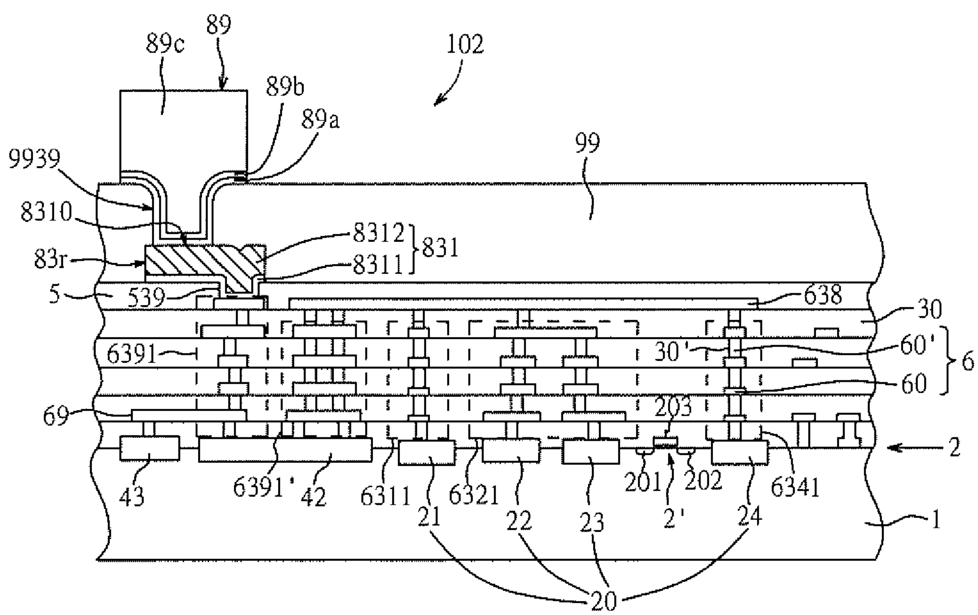

FIG. 10A is a cross-sectional representation of a distribution of signals from internal circuits to the external circuits through off-chip circuits using fine-line scheme, according to an embodiment.

FIGS. 10B-10E and 10G-10I are cross-sectional representations of multiple internal circuits connected to an off-chip circuit through a thick and wide metal trace, bus or plane over a passivation layer, according to an embodiment.

Figure 10B:
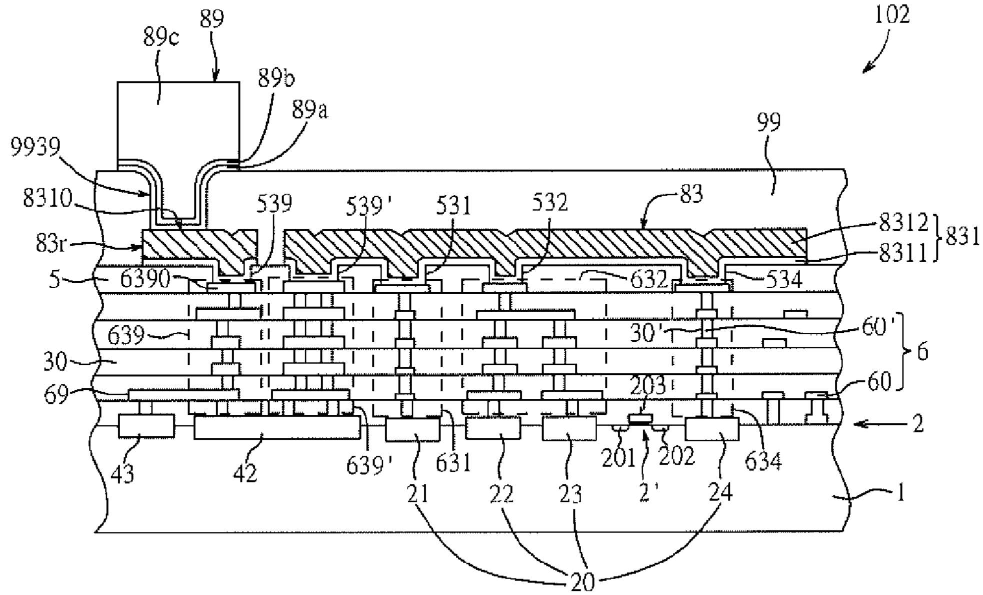
Figure 10C:
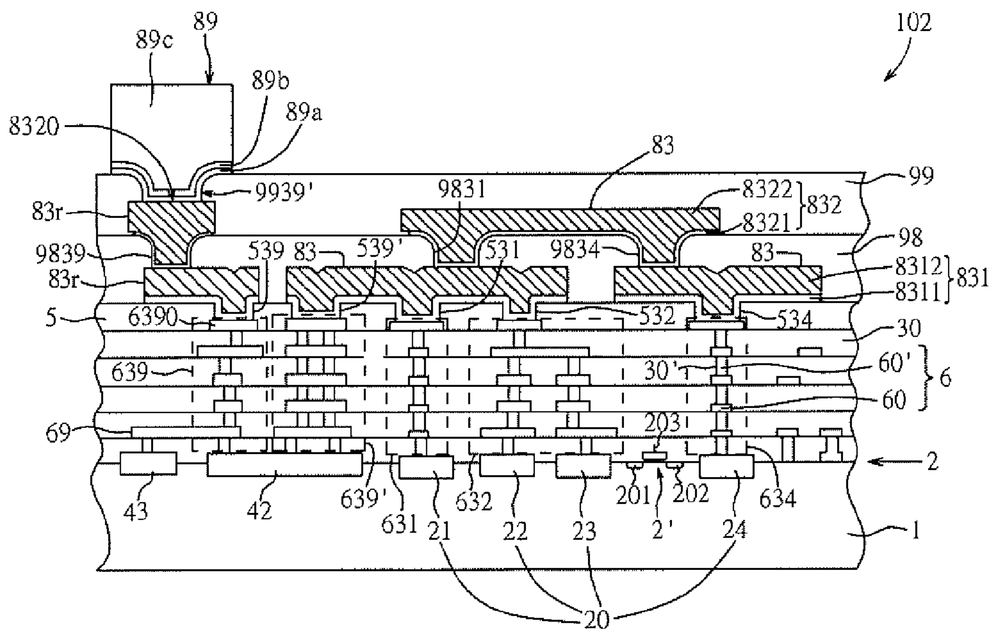
Figure 10D:
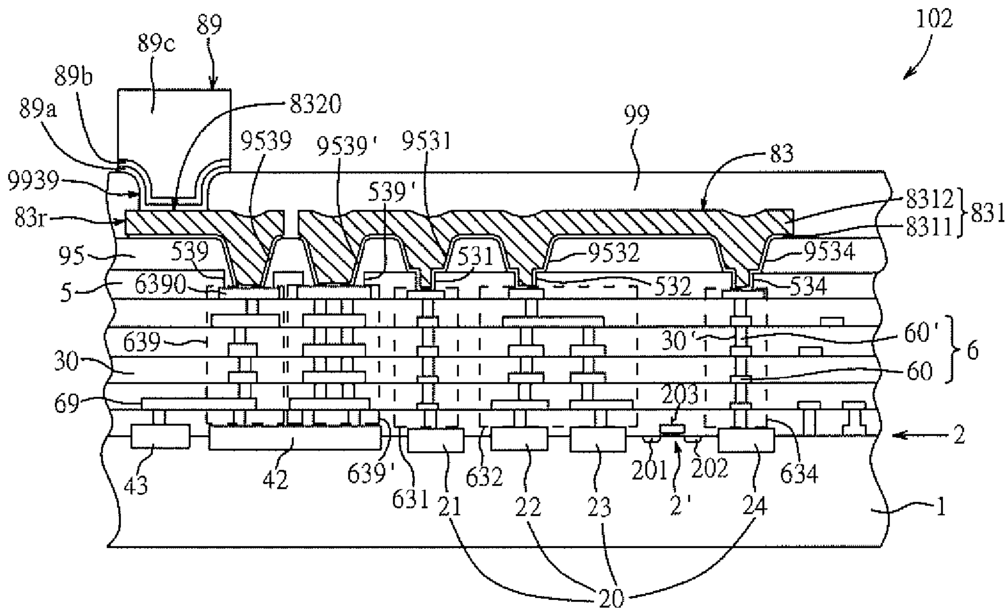
Figure 10E:
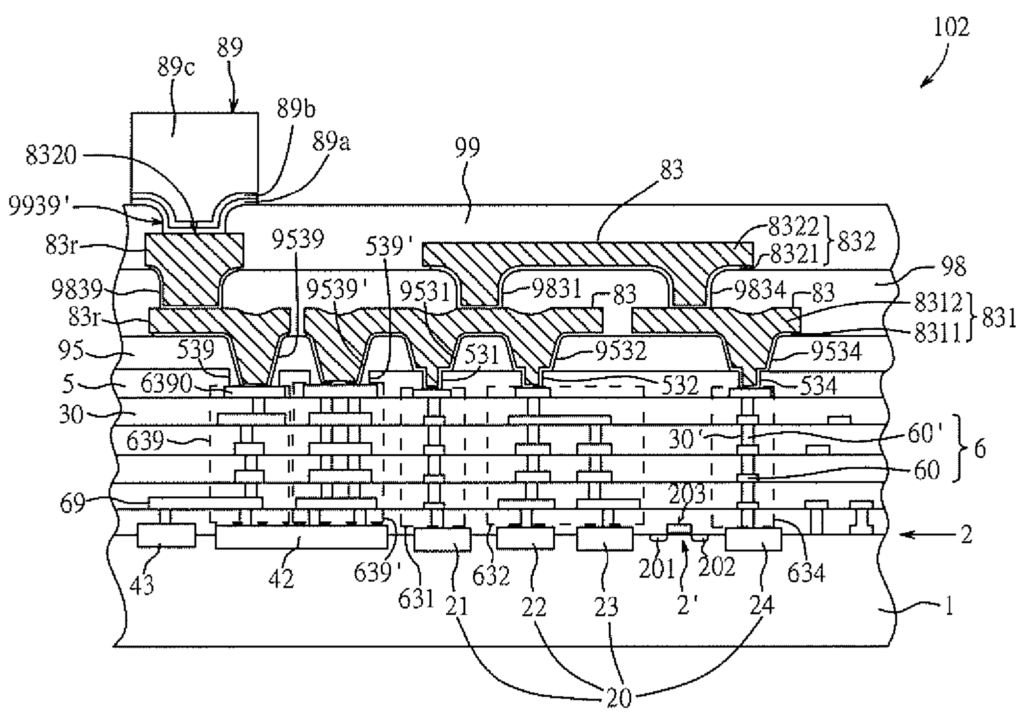
Figure 10F:
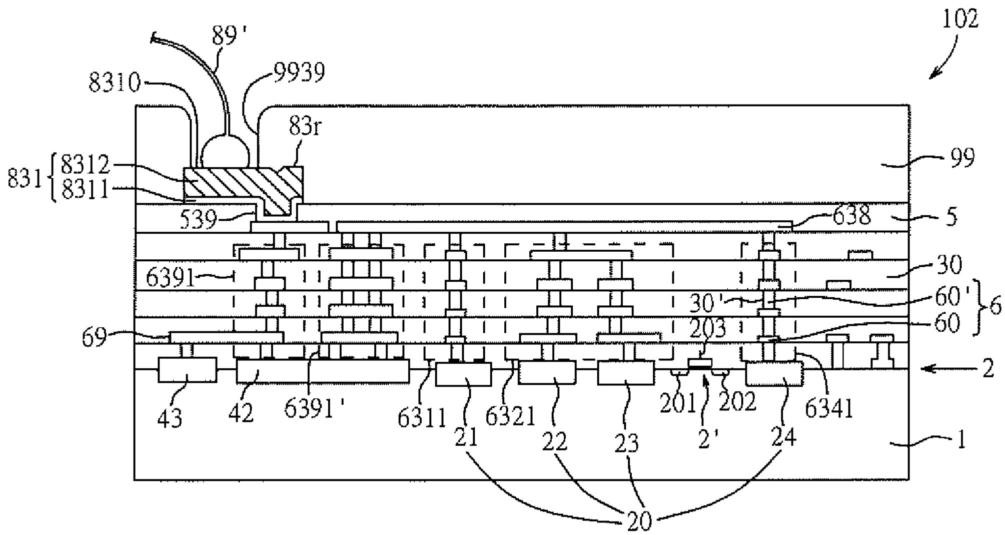

FIG. 10F is a cross-sectional representation of multiple internal circuits connected to an off-chip circuit through a metal trace, bus or plane under a passivation layer, with a wire wirebonded to a relocated pad on a passivation layer, according to an embodiment.

Figure 11A:
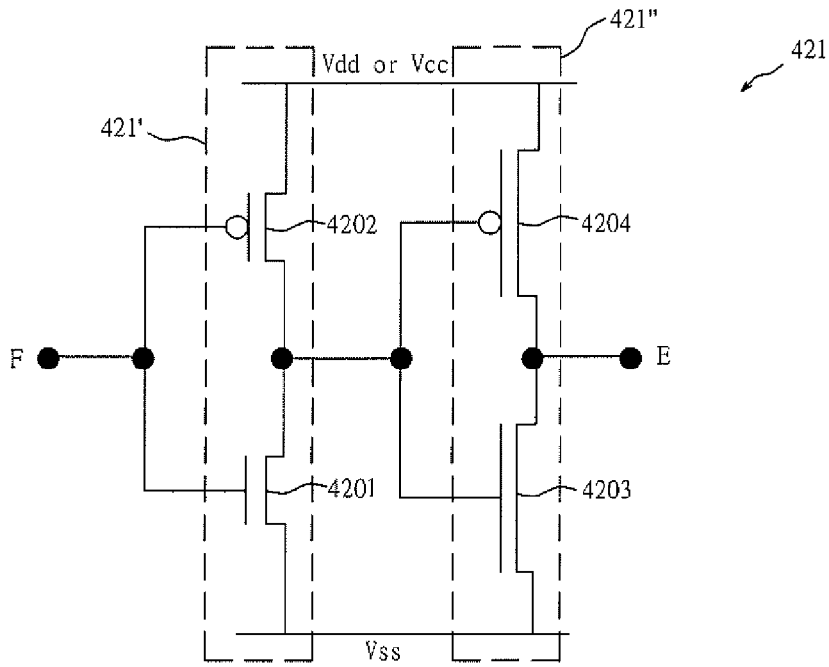

FIG. 11A is a schematic representation of an example of an off-chip driver circuit, which can be applied to the off-chip buffer 42 shown in FIG. 8B, according to an embodiment.

Figure 11B:
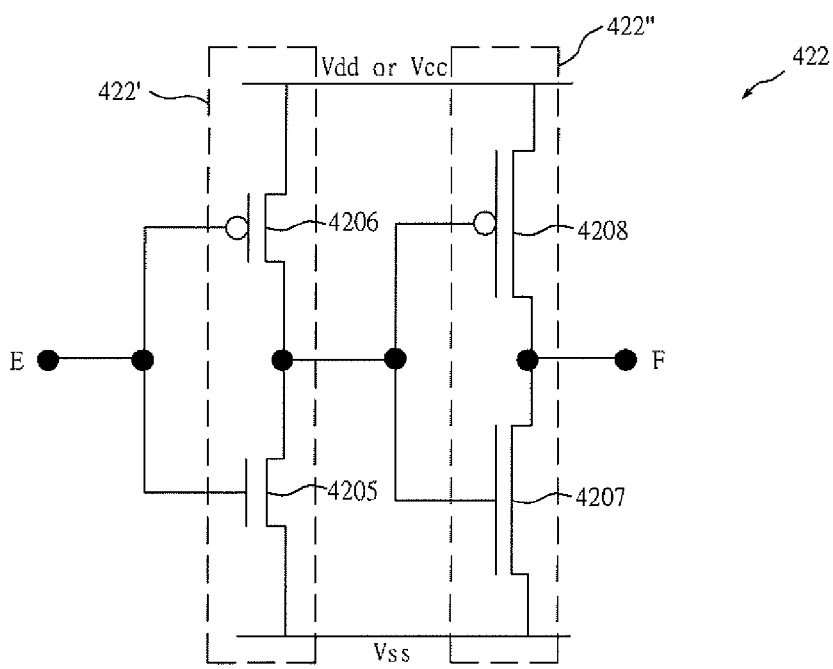

FIG. 11B is a schematic representation of an example of an off-chip receiver circuit, which can be applied to the off-chip buffer 42 shown in FIG. 8C, according to an embodiment.

Figure 11C:
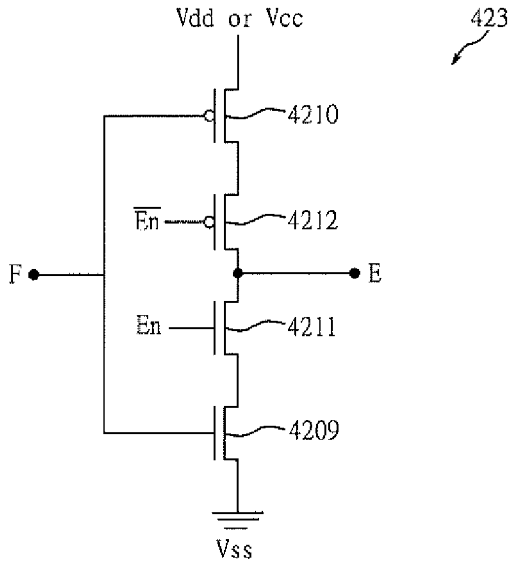

FIG. 11C is a schematic representation of an example of an off-chip tri-state buffer, which can be applied to the off-chip buffer 42 shown in FIG. 8B, according to an embodiment.

Figure 8D:
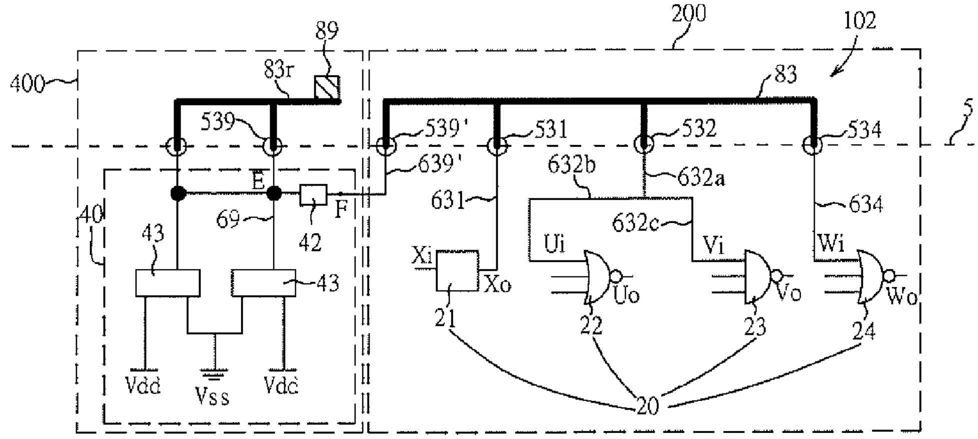
Figure 8E:
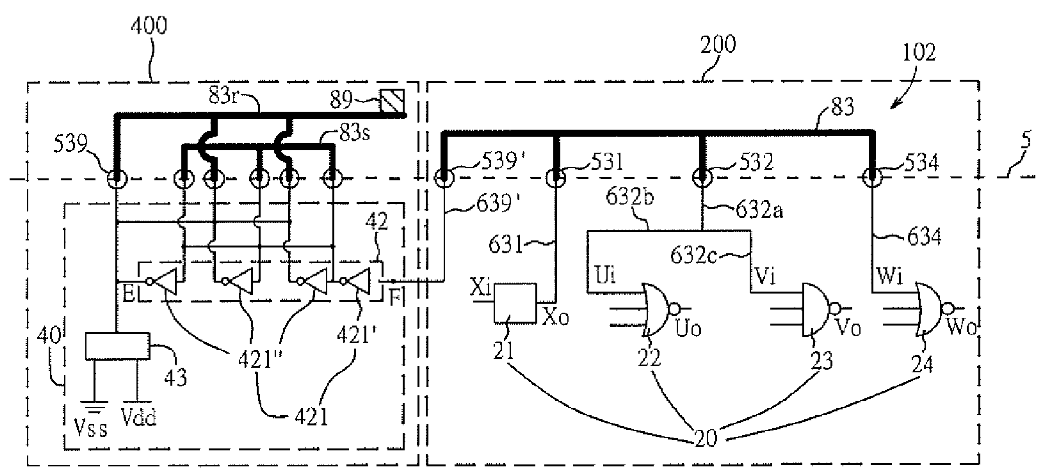
Figure 11D:
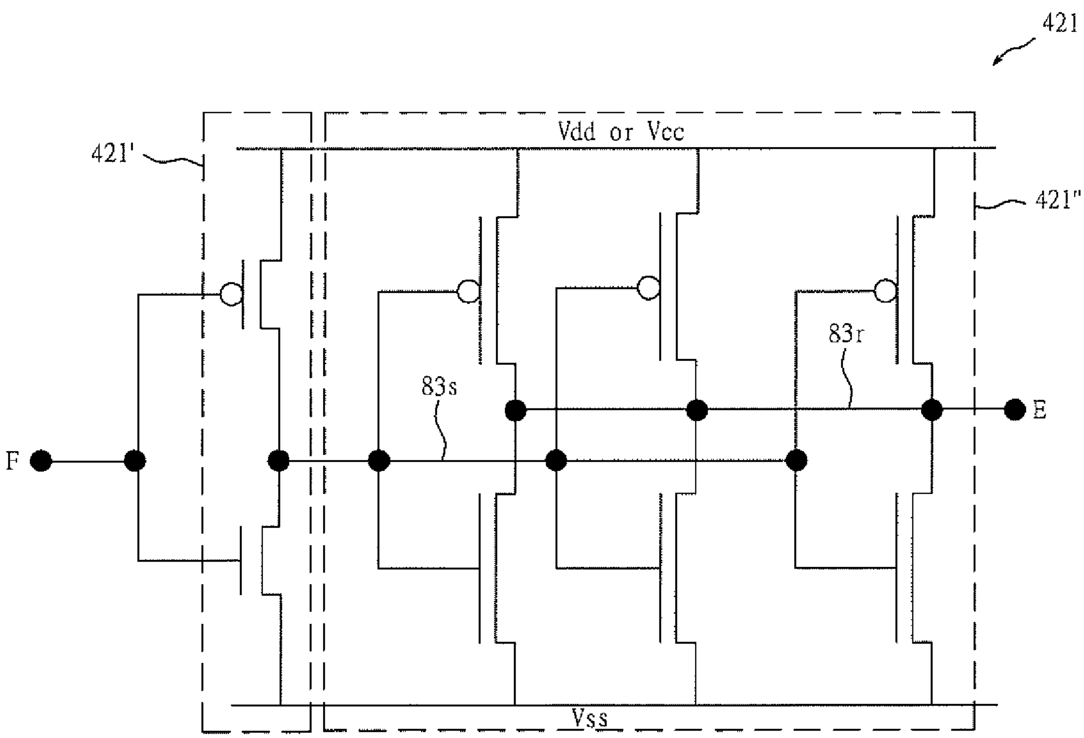

FIG. 11D is a schematic representation of an example of an off-chip driver circuit, which can be applied to the off-chip buffer 42 shown in FIG. 8E, according to an embodiment.

Figure 11E:
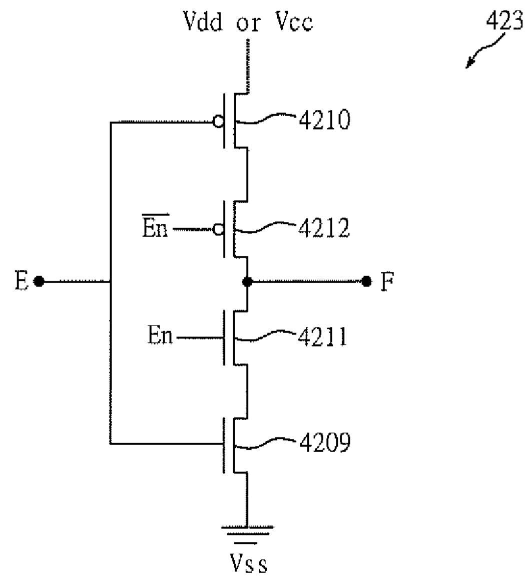

FIG. 11E is a schematic representation of an example of an off-chip tri-state buffer, which can be applied to the off-chip buffer 42 shown in FIG. 8C, according to an embodiment.

Figure 11F:
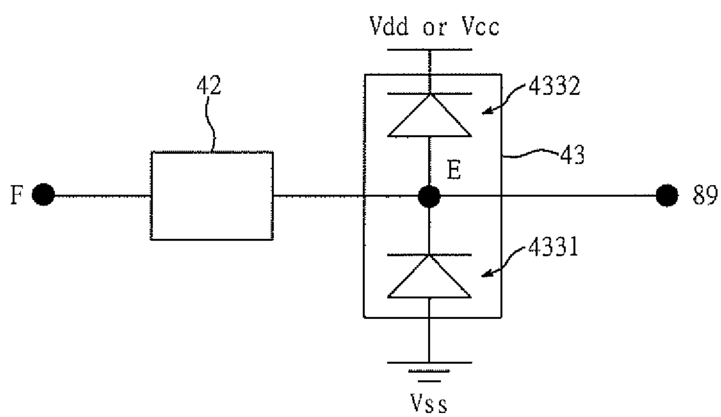

FIG. 11F is a schematic representation of an example of an ESD connection, which can be applied to the off-chip ESD circuit 43 shown in FIGS. 8B, 8C, 8E and 8F, according to an embodiment.

Figure 8F:
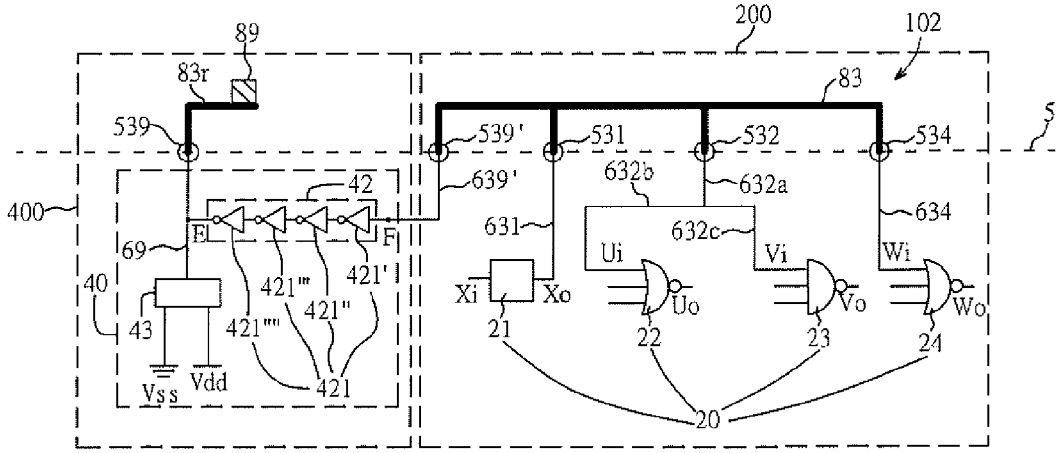
Figure 11G:
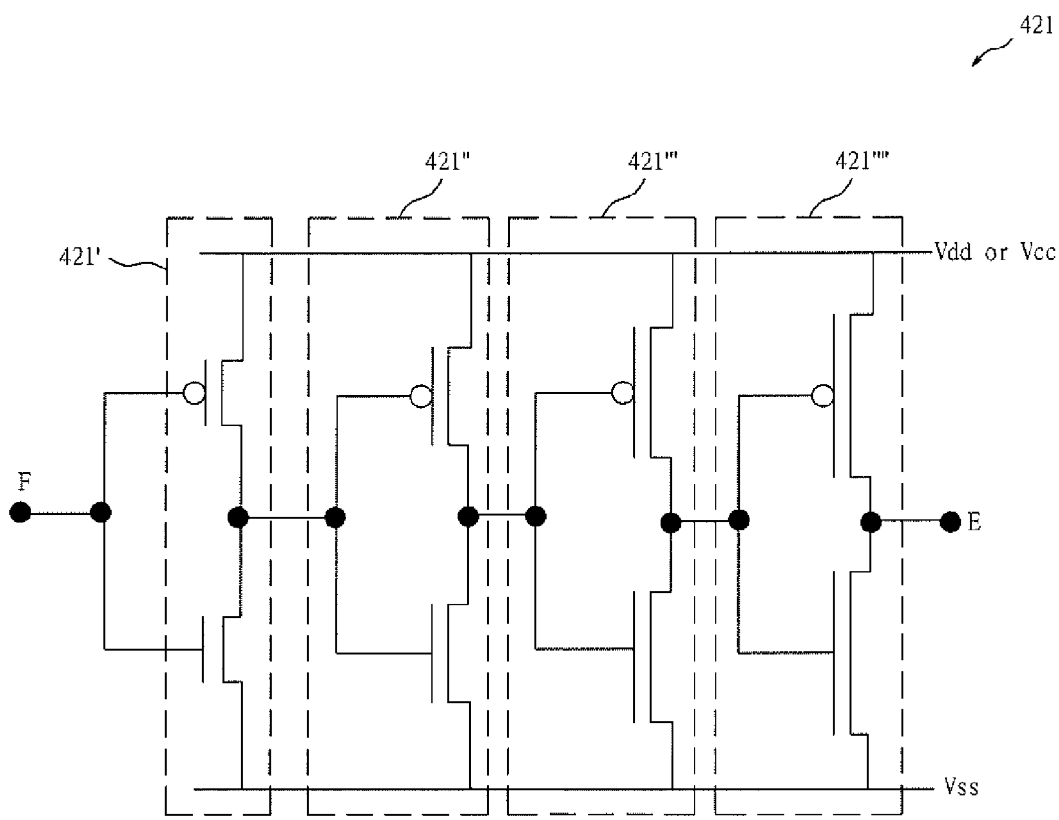

FIG. 11G is a schematic representation of an example of a four-stage cascade off-chip driver circuit, which can be applied to the off-chip buffer 42 shown in FIG. 8F, according to an embodiment.

Figure 11H:
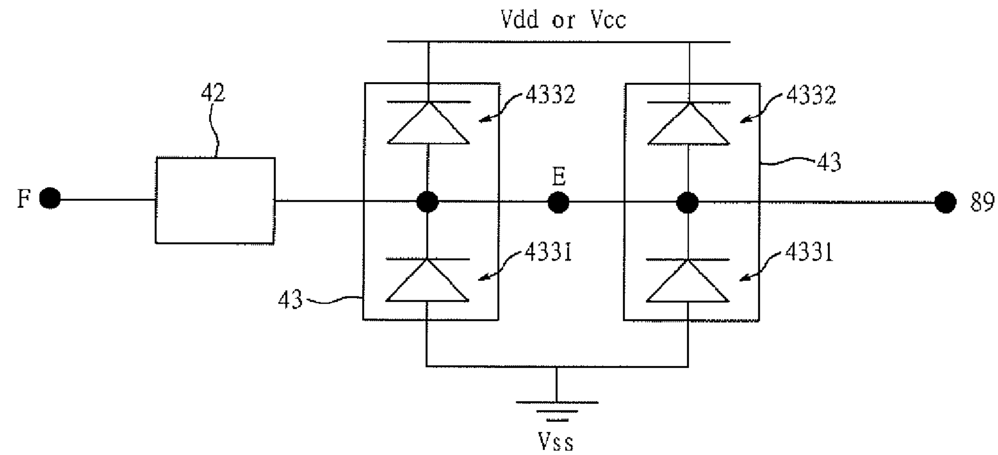

FIG. 11H is a schematic representation of an example of two ESD connections, which can be applied to the off-chip ESD circuit 43 shown in FIG. 8D, according to an embodiment.

Figure 12A:
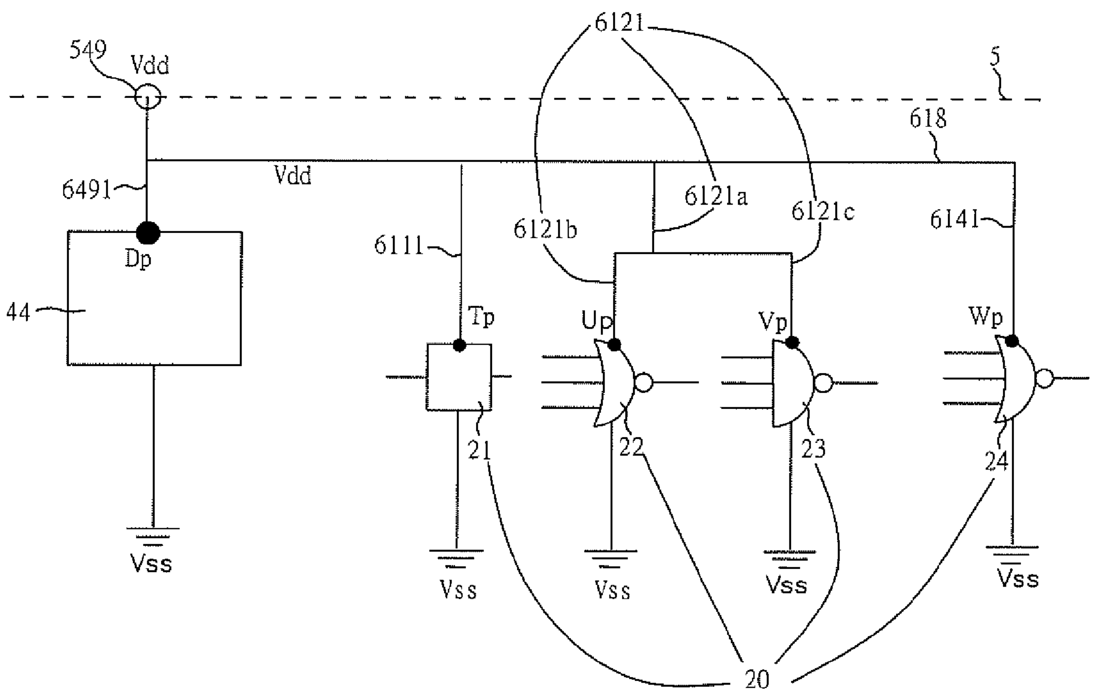

FIG. 12A is a schematic representation of a distribution of external power supply to internal circuits, according to an embodiment.

Figure 12B:
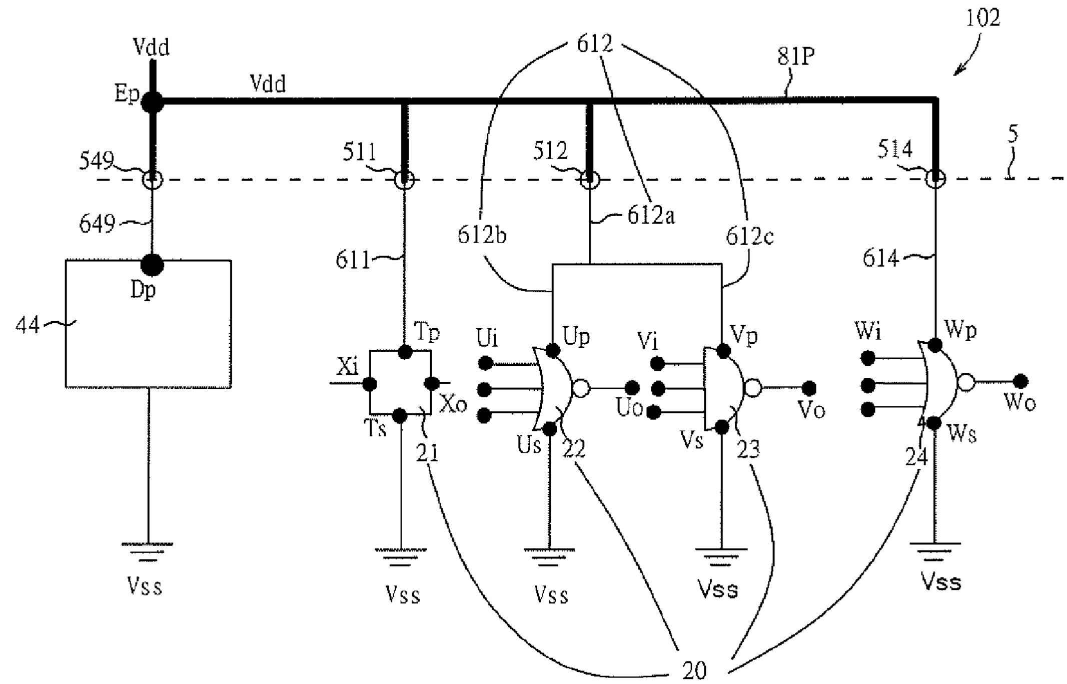

FIG. 12B is a schematic representation of distribution of external power supply to internal circuits through over-passivation metals, according to an embodiment. An ESD protection circuit is connected to the over-passivation metals.

Figure 12C:
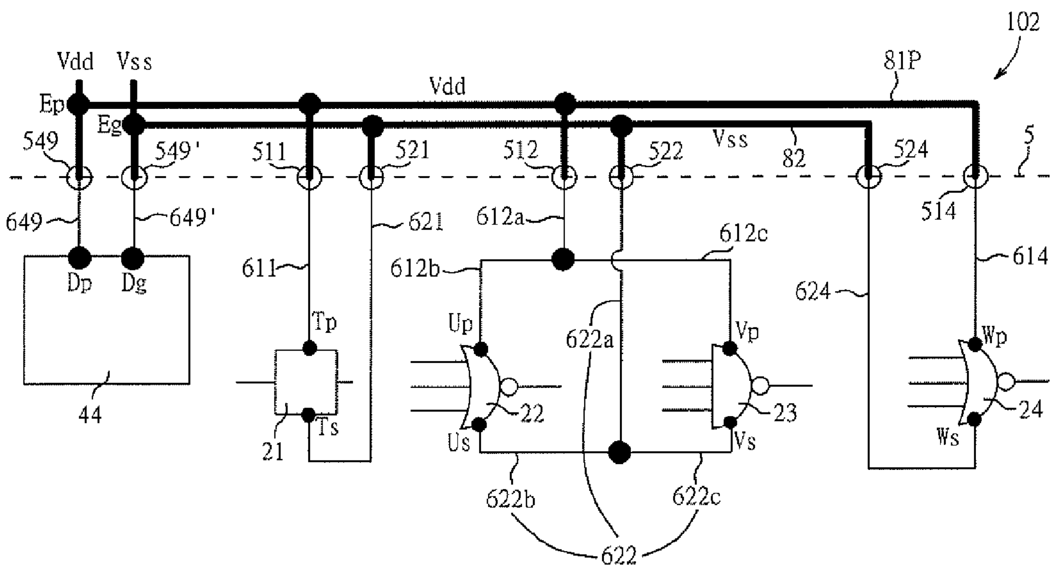

FIG. 12C is a schematic representation of distribution of external power supply and external ground to internal circuits through over-passivation metals, according to an embodiment. Both power and ground nodes of internal circuits are connected to the over-passivation metals. An ESD circuit is connected to the over-passivation metals.

Figure 12D:
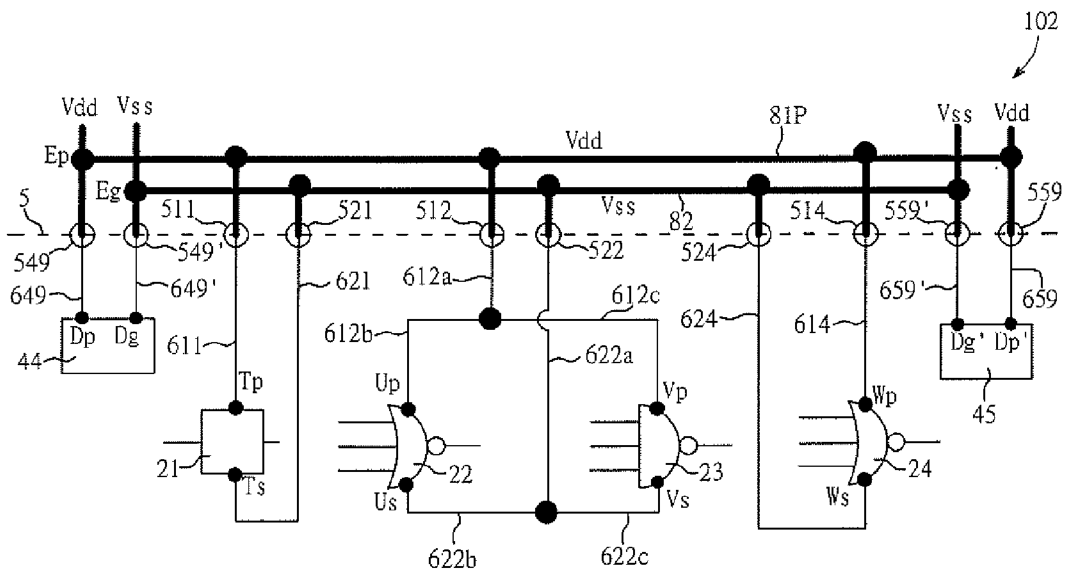

FIG. 12D is a schematic representation of distribution of external power supply and external ground to internal circuits through over-passivation metals, according to an embodiment. More than one ESD circuits are connected to the over-passivation metals.

Figure 12E:
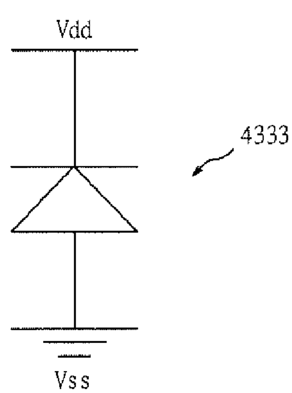

FIG. 12E is a schematic representation of an example of an ESD circuit, which can be applied to the ESD circuit 44 or 45 shown in FIGS. 12B-12D, according to an embodiment.

Figure 13A:
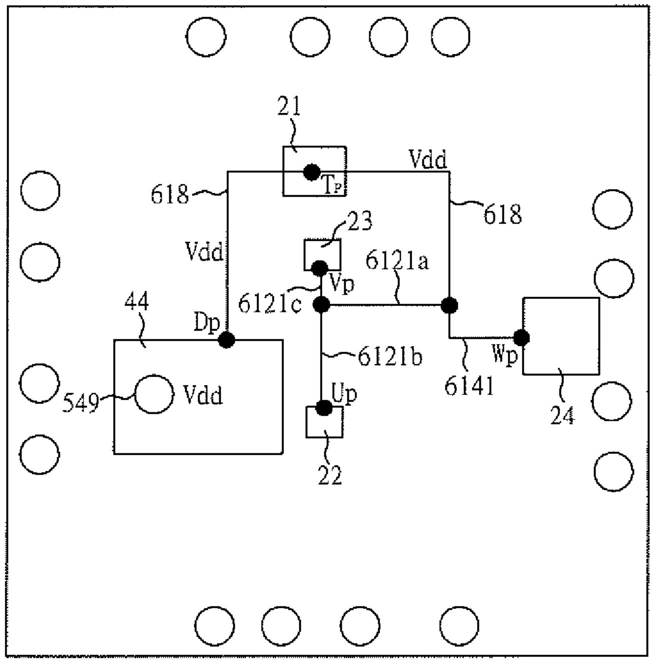

FIG. 13A is a top view layout of a distribution of external power supply to internal circuits, according to an embodiment.

Figure 13B:
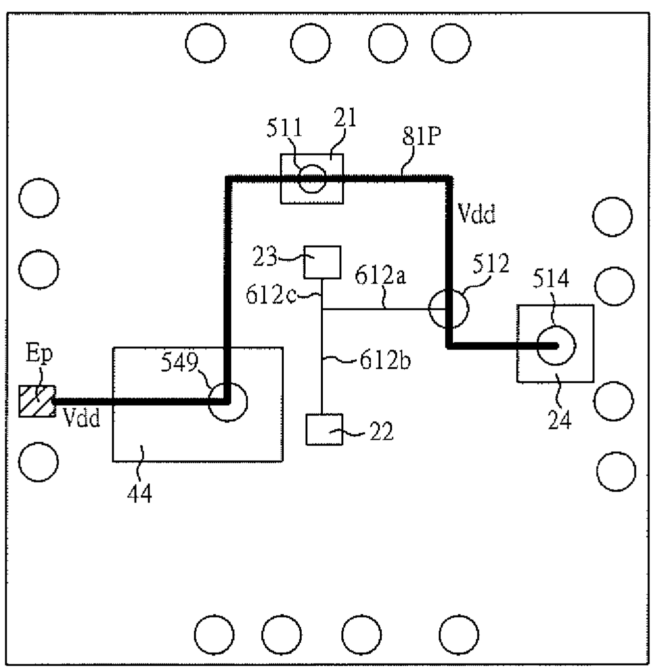

FIG. 13B is a top view layout of distribution of external power supply to internal circuits through over-passivation metals, according to an embodiment. An ESD protection circuit is connected to the over-passivation metals.

Figure 13C:
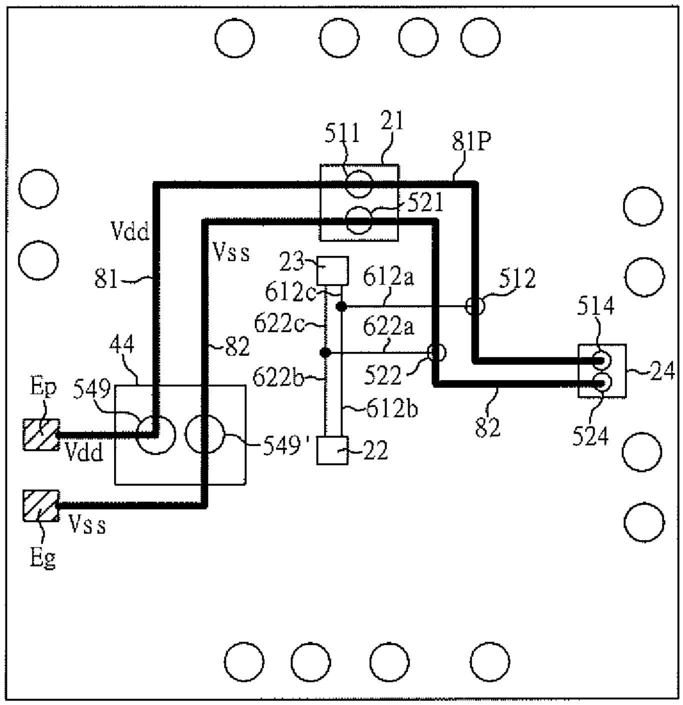

FIG. 13C is a top view layout of distribution of external power supply and external ground to internal circuits through over-passivation, according to an embodiment. Both power and ground nodes of internal circuits are connected to the over-passivation metals. An ESD protection circuit is connected to the over-passivation power and ground traces, buses or planes.

Figure 14A:
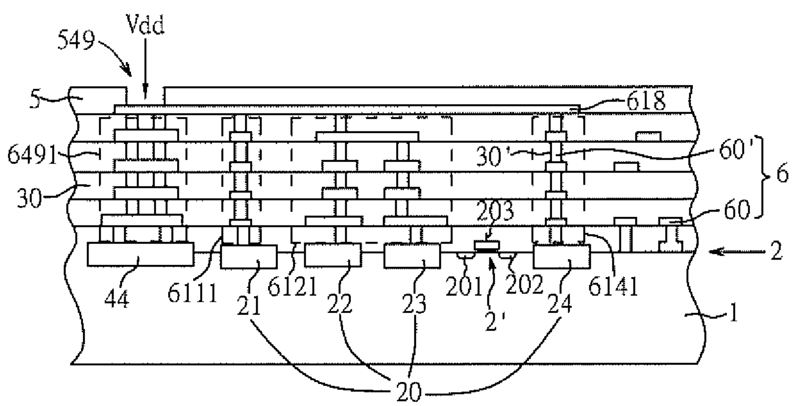

FIG. 14A is a cross-sectional representation of a distribution of external power supply to internal circuits, according to an embodiment.

Figure 14B:
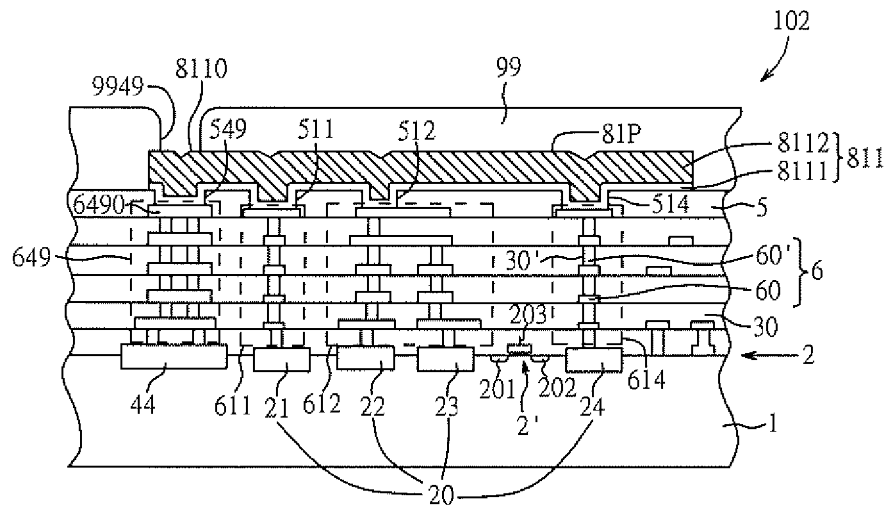

FIG. 14B is a cross-sectional representation of distribution of external power supply to internal circuits through over-passivation metals, according to an embodiment. An ESD protection circuit is connected to the over-passivation metals.

Figure 14C:
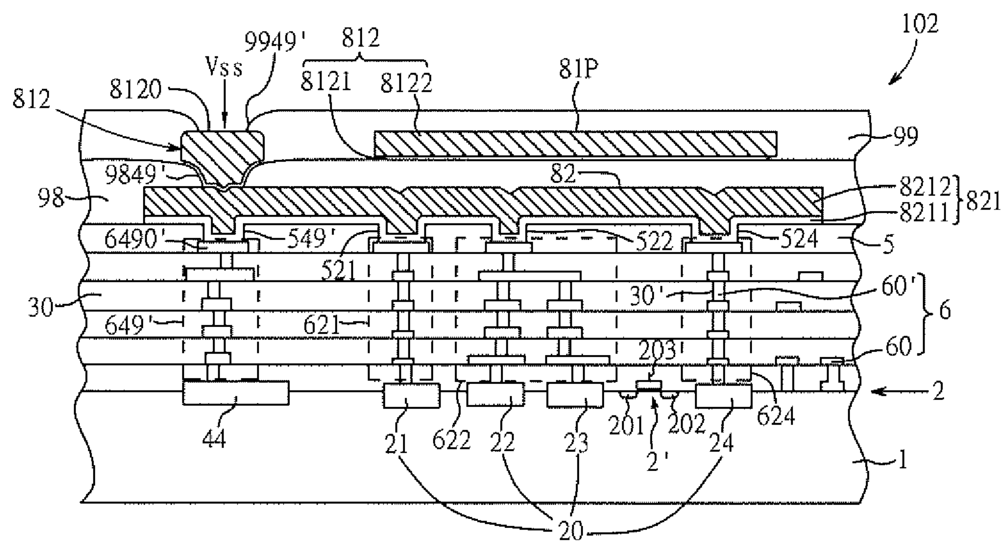

FIG. 14C is a cross-sectional representation of distribution of external power supply and external ground to internal circuits through over-passivation metals, according to an embodiment. Both power and ground nodes of internal circuits are connected to the over-passivation metals. The power lines, traces or planes are in the second over-passivation metal layer, while the ground lines, traces or planes are in the first over-passivation metal layer under the second over-passivation metal layer. An ESD protection circuit is connected to the over-passivation metals.

Figure 14D:
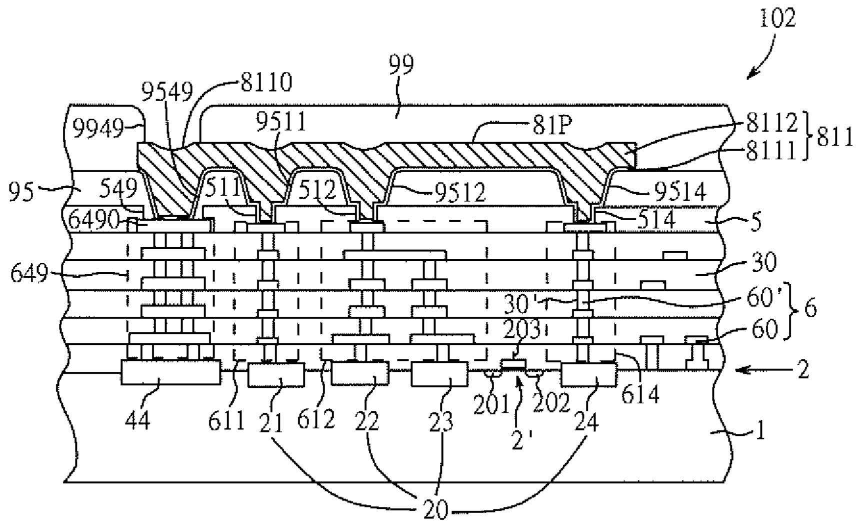

FIG. 14D is a cross-sectional representation of distribution of external power supply to internal circuits through over-passivation metals, according to an embodiment. An ESD protection circuit is connected to the over-passivation metals. This figure is similar to FIG. 14B except that an additional polymer layer is formed between the bottom-most over-passivation metal layer and the passivation layer.

Figure 15A:
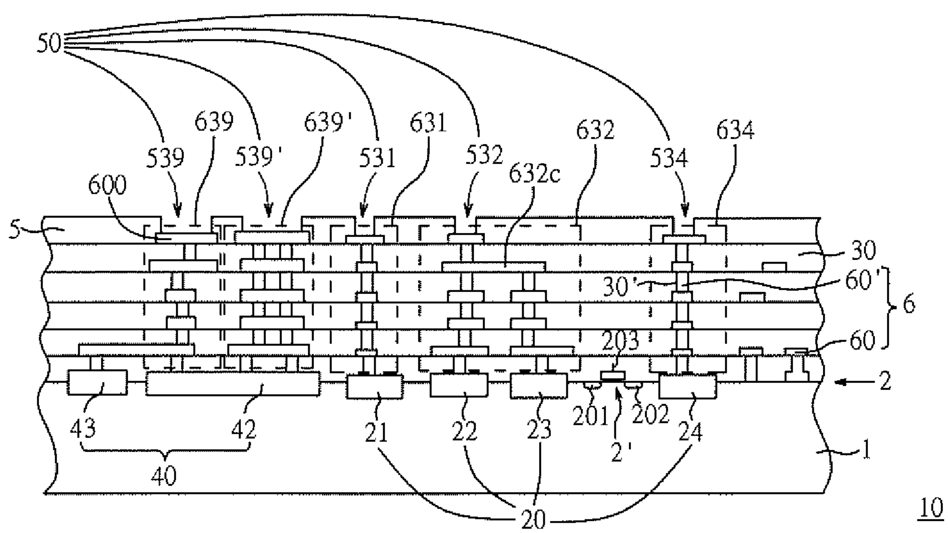
Figure 15B:
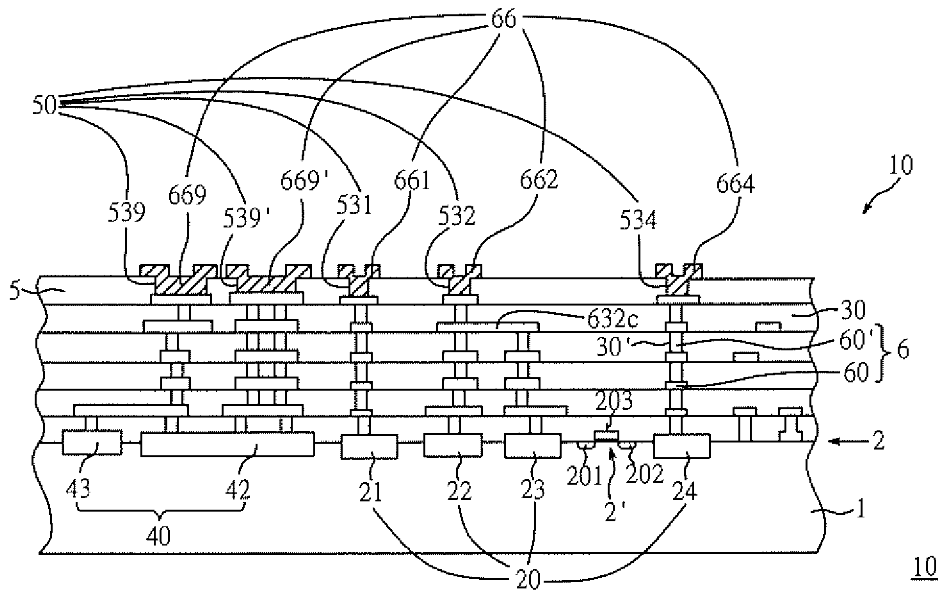

FIG. 15A and FIG. 15B are depictions of starting materials, according to an embodiment. The starting materials are wafers. An over-passivation scheme of present disclosure is to be built over the wafer. FIG. 15B differs from FIG. 15A in having an optional metal cap over a metal pad or trace exposed by an opening in the passivation layer.

FIG. 15C to FIG. 15L show process steps of forming an over-passivation scheme with two metal layers, with each metal layer being formed by an embossing process, according to an embodiment.

Figure 15C:
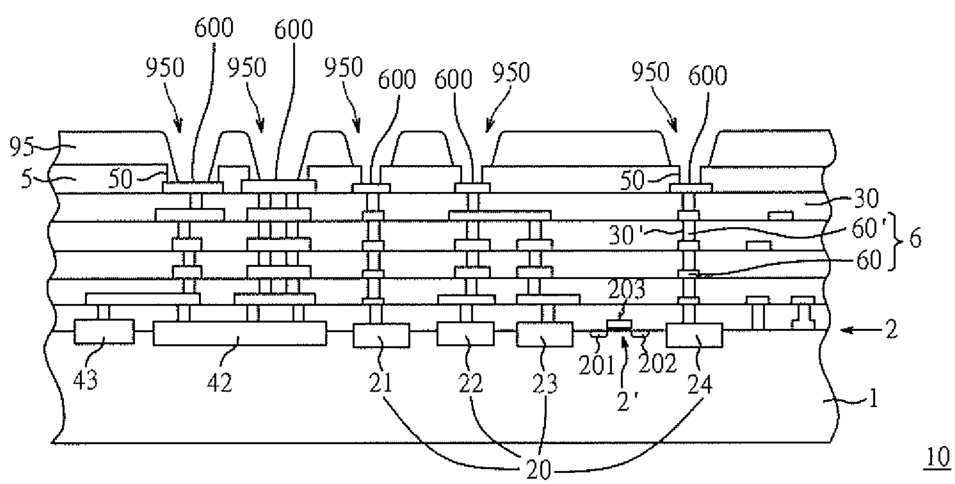
Figure 15D:
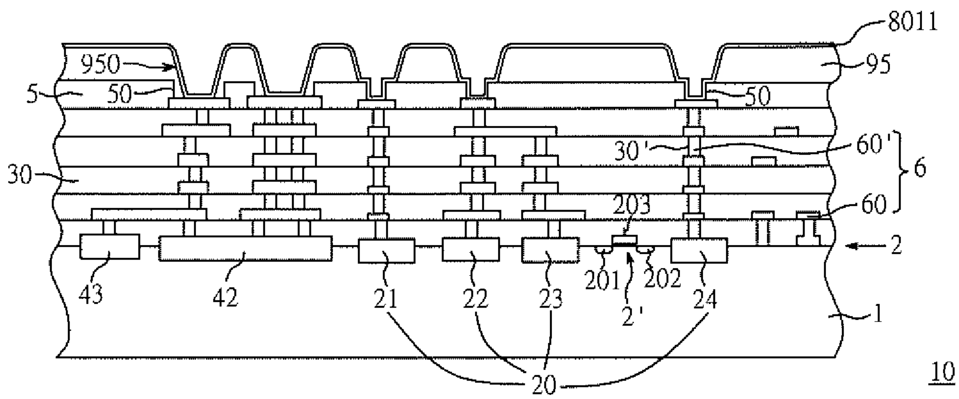
Figure 15E:
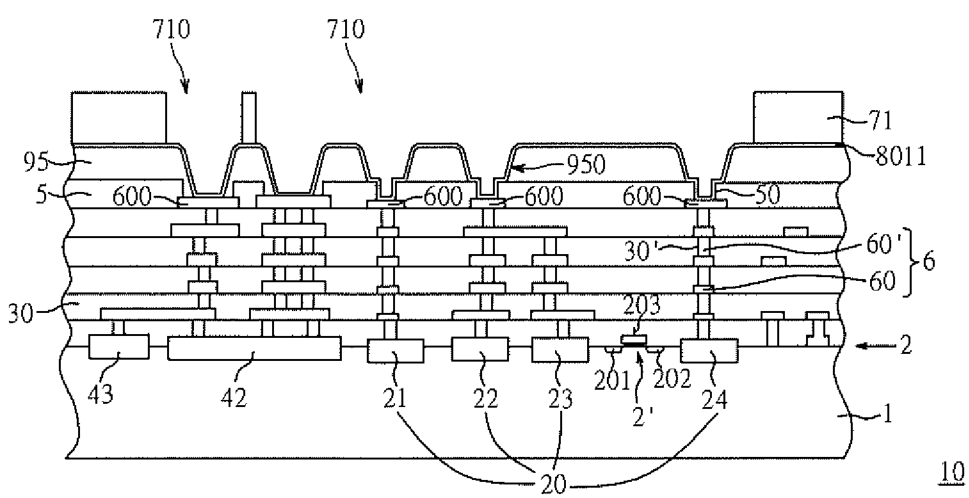
Figure 15F:
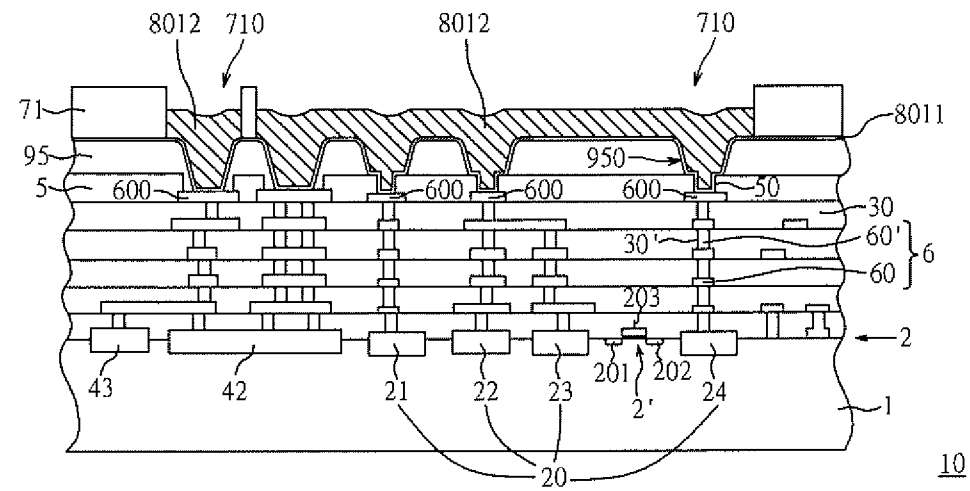
Figure 15G:
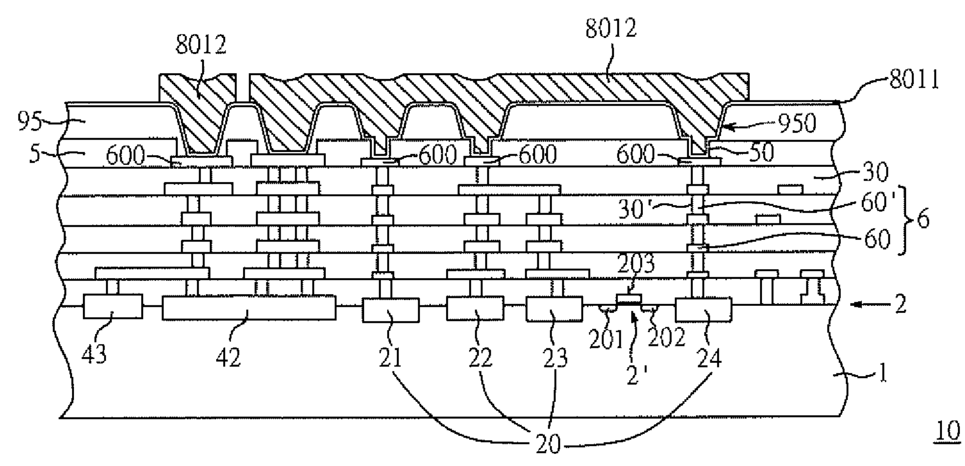
Figure 15H:
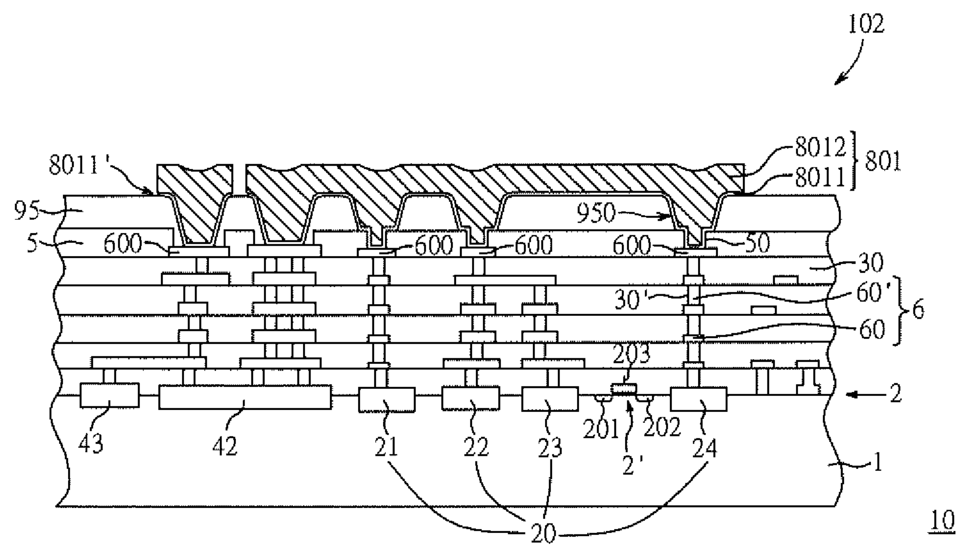
Figure 15I:
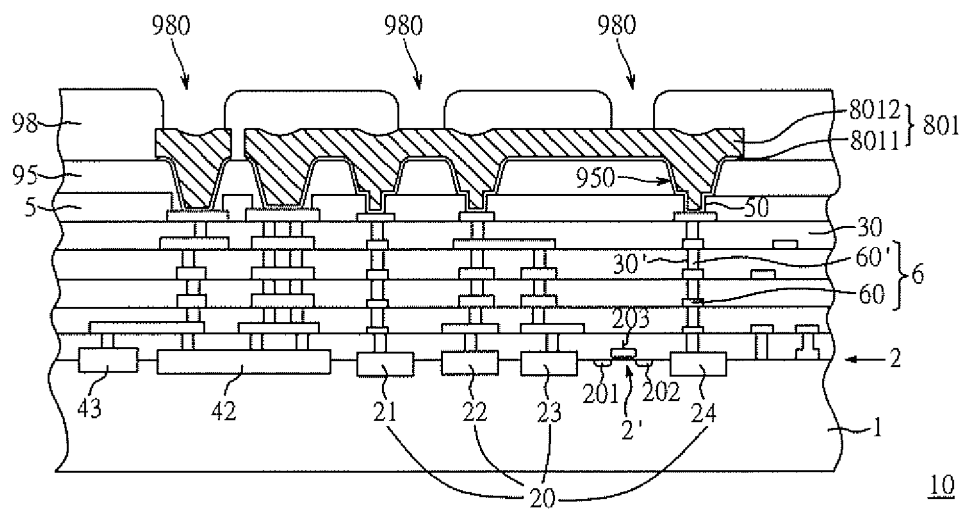
Figure 15J:
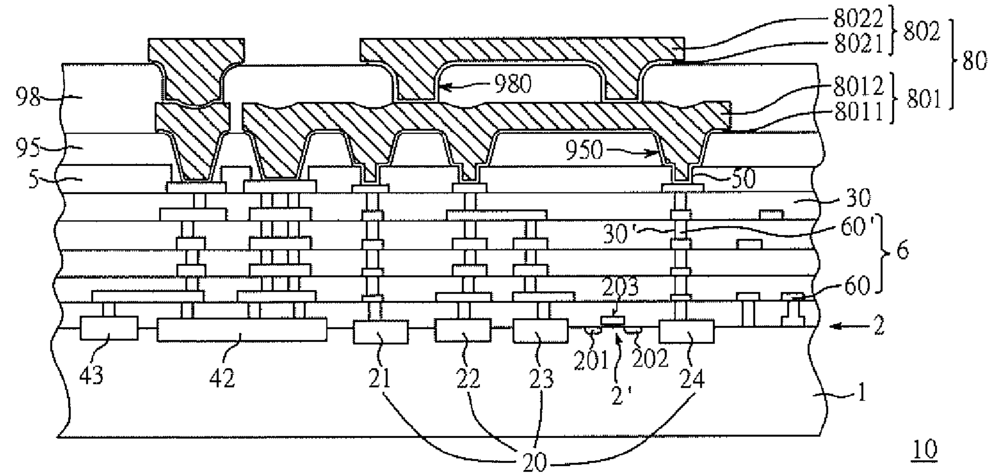
Figure 15K:
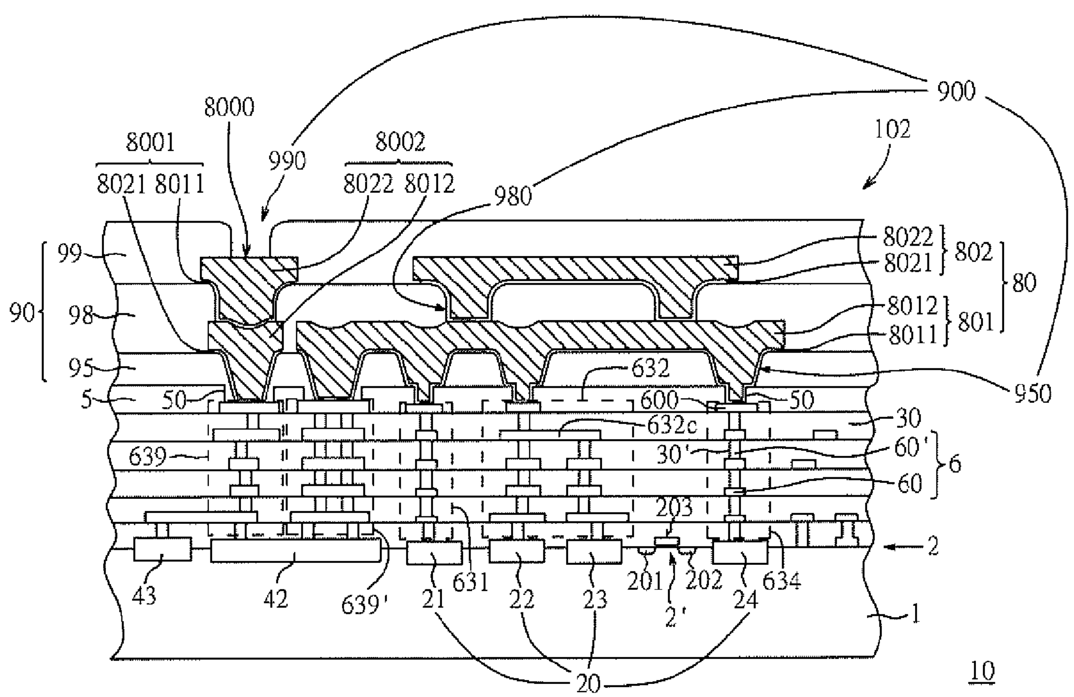
Figure 15L:
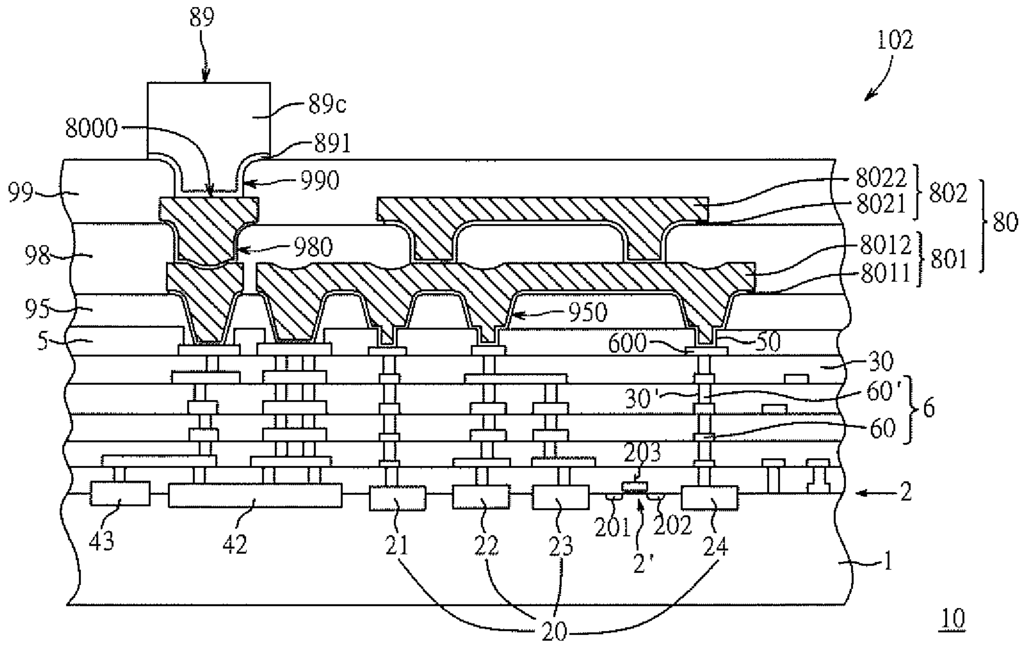
Figure 15M:
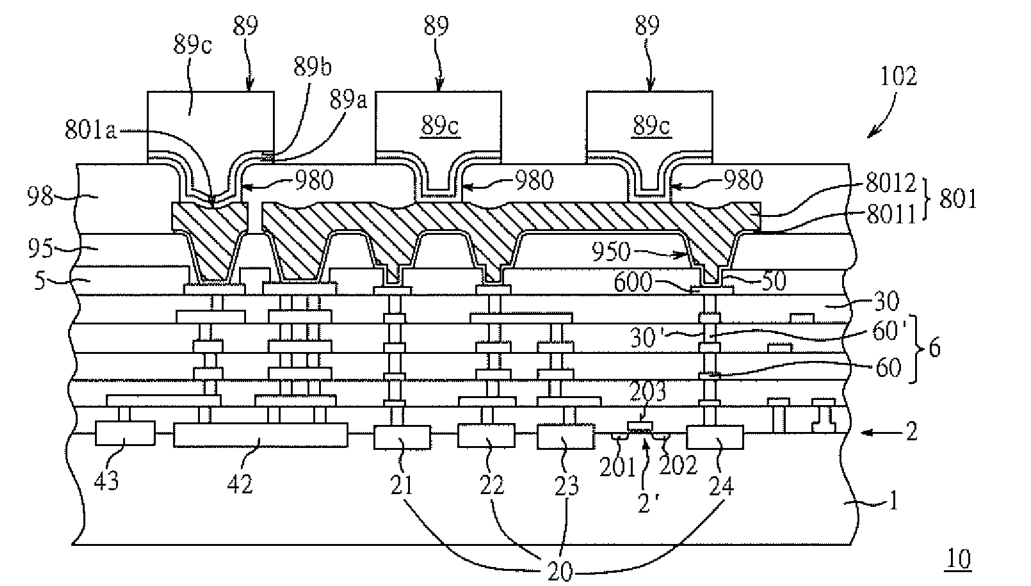

FIG. 15M is a cross-sectional view showing a process of forming a semiconductor wafer including an over-passivation scheme at a passivation layer of the semiconductor wafer, according to an embodiment.

FIG. 16A to FIG. 16M show process steps of forming an over-passivation scheme with two metal layers, in which the first over-passivation metal layer is formed by a double-embossing process, while the second over-passivation metal layer is formed by a single-embossing (an embossing) process, according to an embodiment.

FIG. 17A to FIG. 17J show process steps of forming an over-passivation scheme with three metal layers, according to an embodiment. The first and second over-passivation metal layers are formed by a suitable process or processes, e.g., by a double-embossing process, while the third (top-most) over-passivation metal layer is formed by a suitable process or processes, e.g., by a single-embossing (an embossing) process.

FIG. 18A to FIG. 18I show process steps of forming an over-passivation scheme with three metal layers, according to an embodiment. The first and third over-passivation metal layers are formed by a suitable process or processes, e.g., by a single-embossing (an embossing) process, while the second over-passivation metal layer is formed by a suitable process or processes, e.g., by a double-embossing process.

FIG. 19A to FIG. 19I show process steps of forming an over-passivation scheme with two metal layers, according to an embodiment. The first over-passivation metal layer is formed by a suitable process or processes, e.g., by a double-embossing process, while the second (top-most) over-passivation metal layer is formed by a suitable process or processes, e.g., by a single-embossing (an embossing) process.

Figure 20:
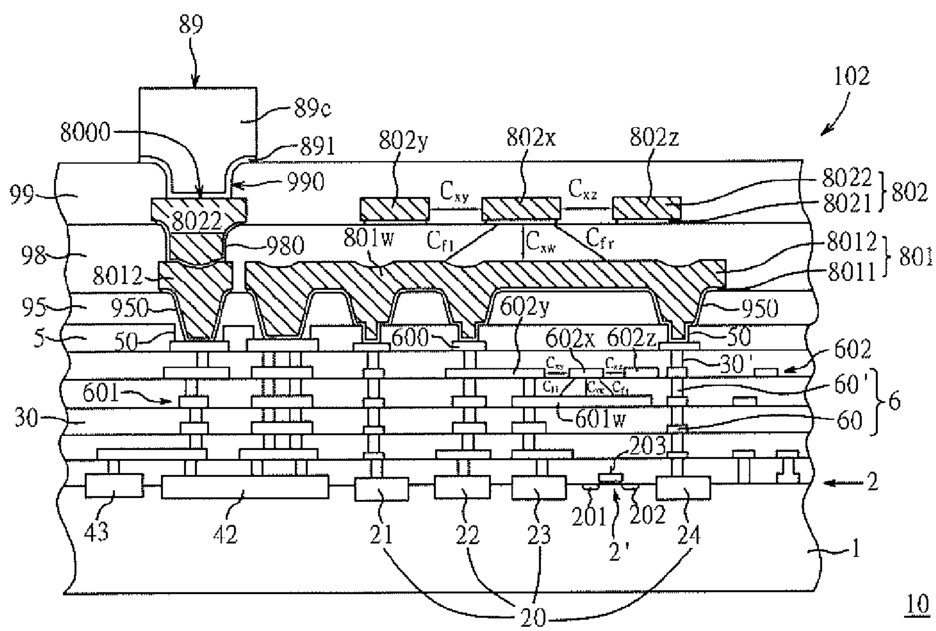

FIG. 20 illustrates models for calculating capacitance per unit length for metal lines or traces in the over-passivation scheme and the fine-line scheme, according to an embodiment.

Figure 21:
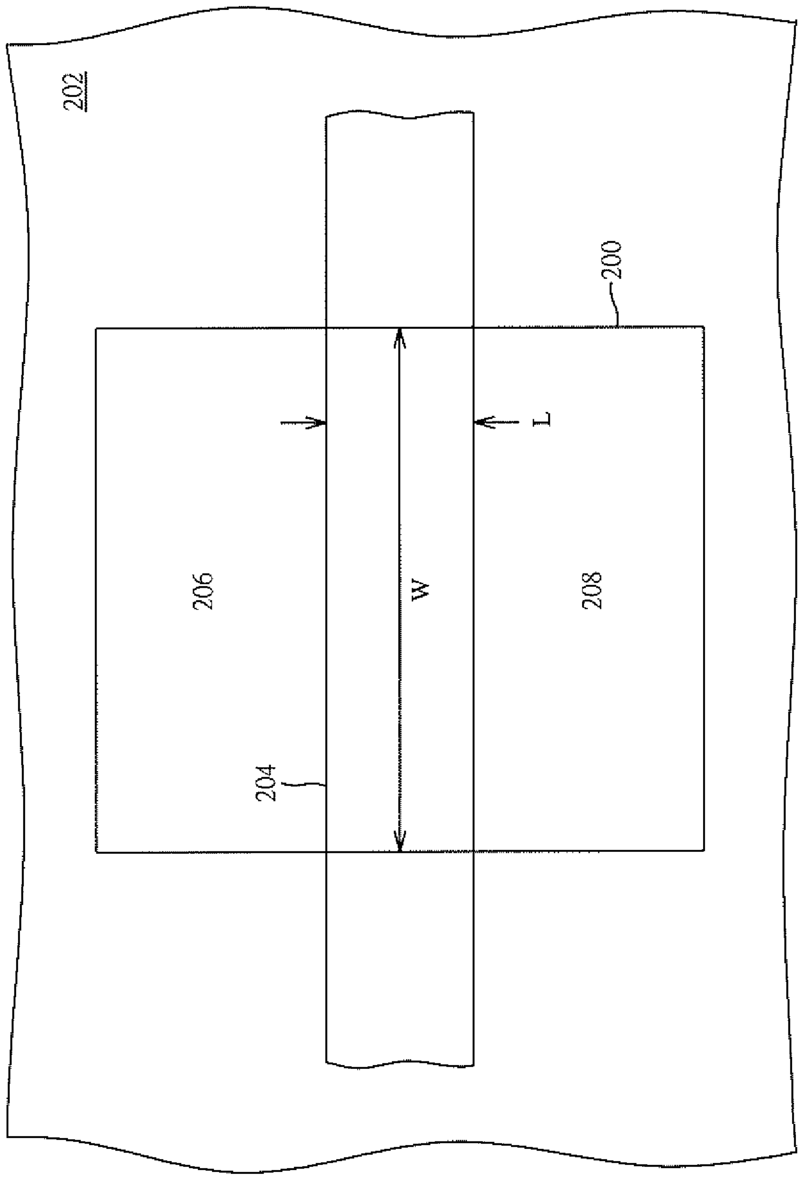
Figure 22:
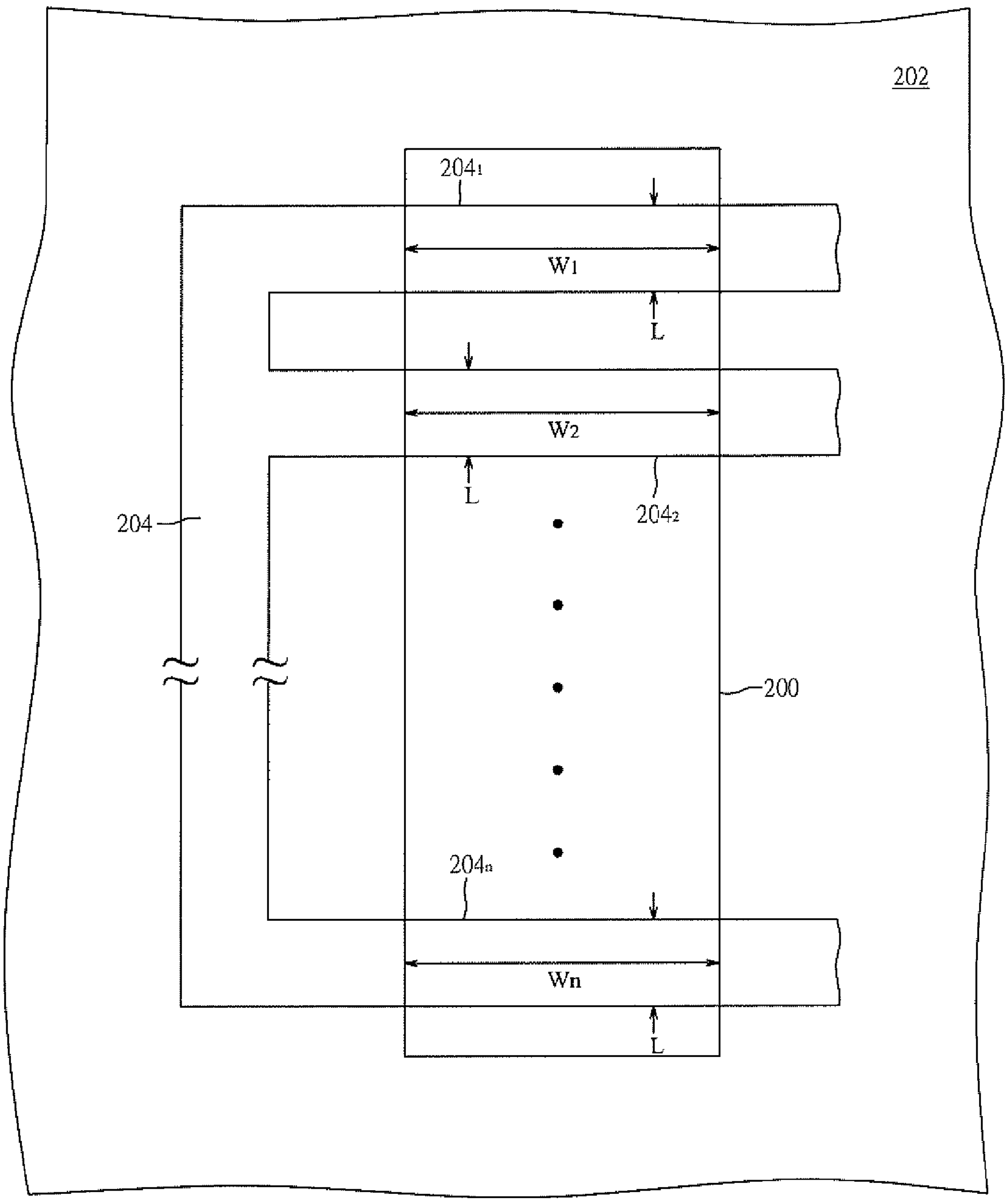

FIGS. 21 and 22 show top views of a MOS transistor that can be a PMOS transistor or an NMOS transistor, according to an embodiment.

FIGS. 23A-23M show cross-sectional views for packaging a DRAM chip, according to an embodiment.

Figure 23A:
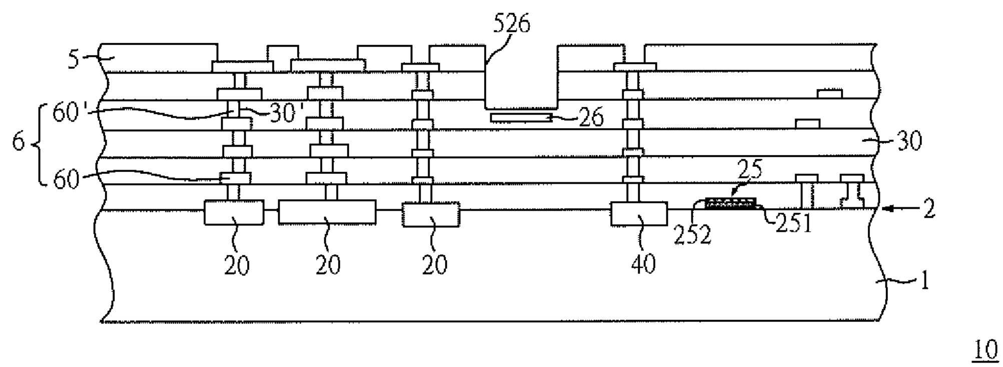
Figure 23B:
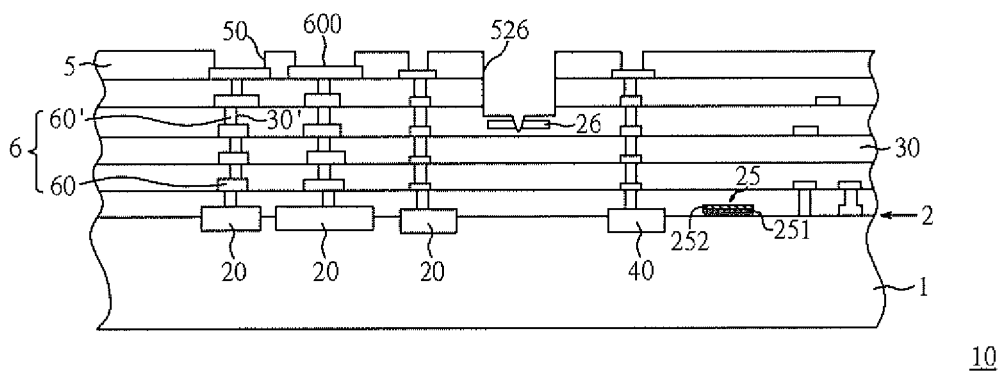
Figure 23C:
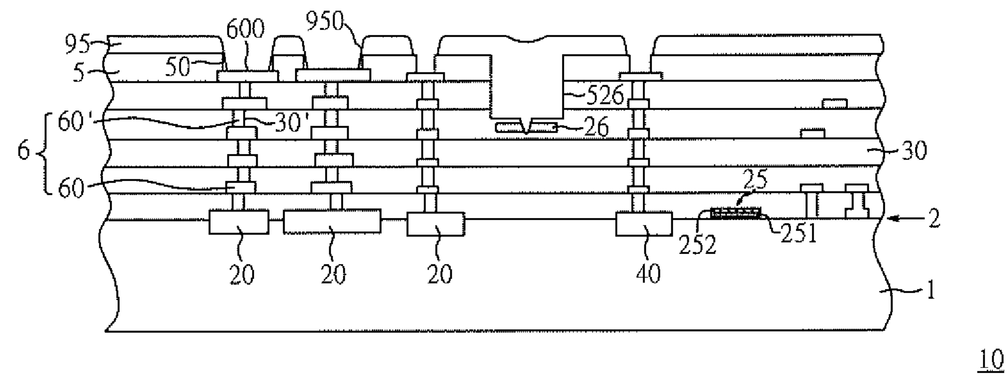
Figure 23D:
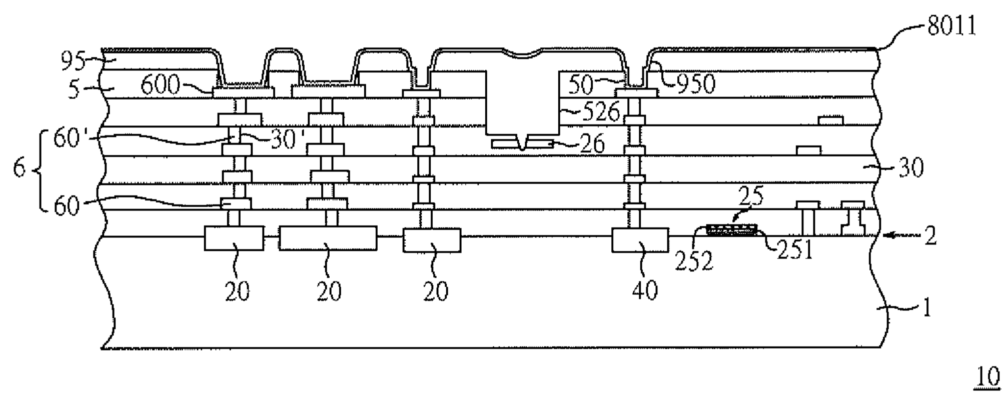
Figure 23E:
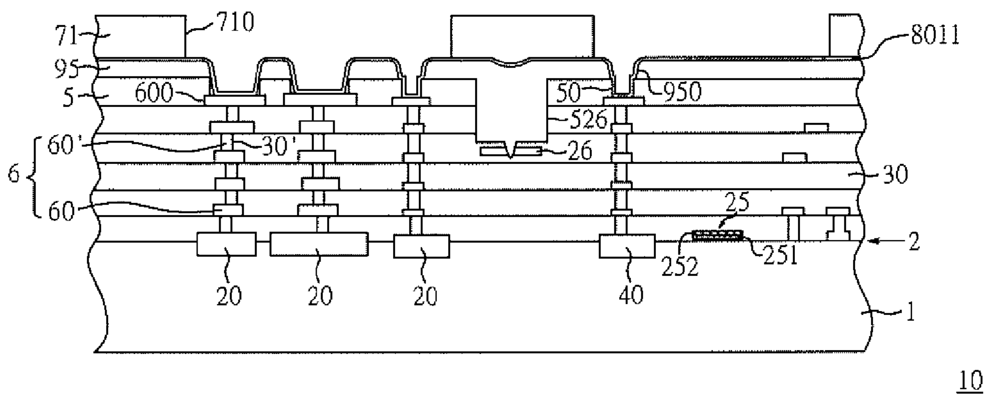
Figure 23F:
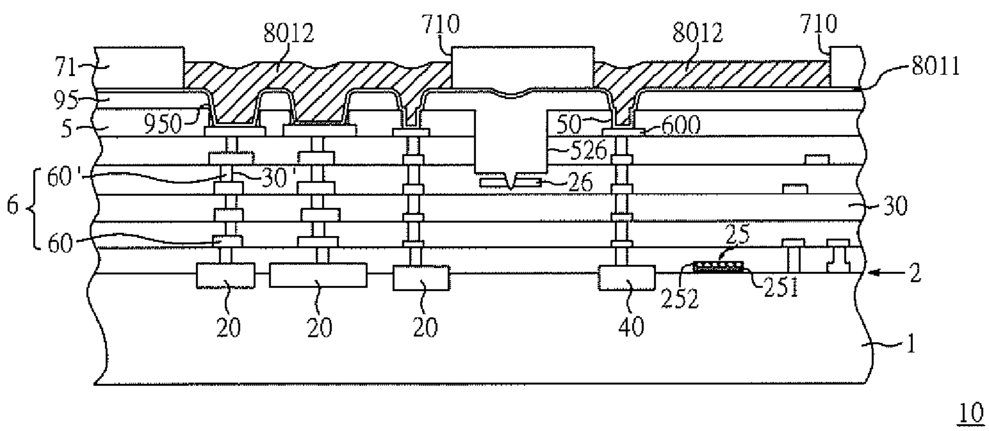
Figure 23G:
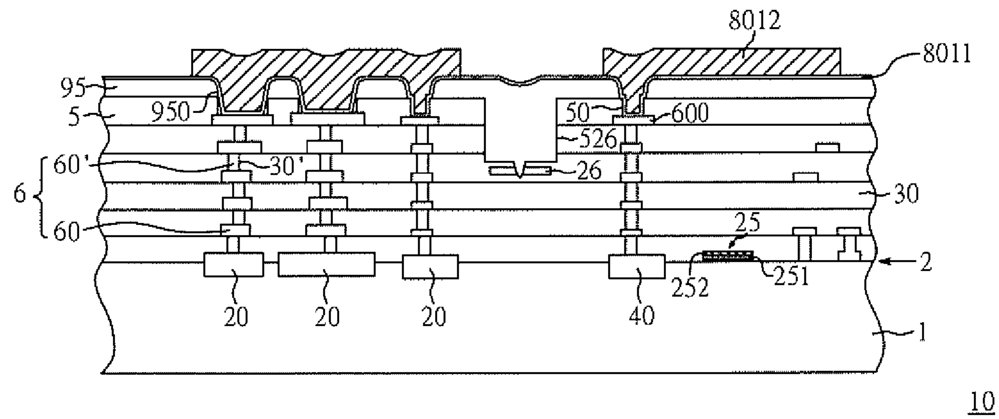
Figure 23H:
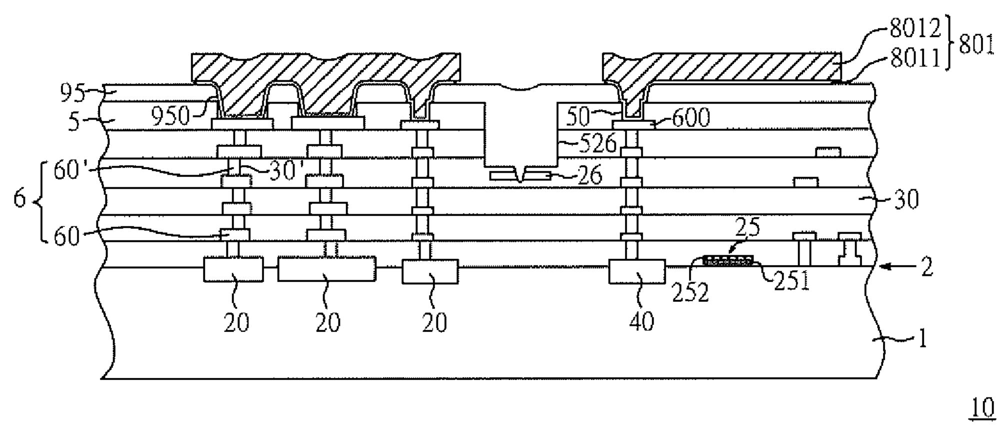
Figure 23I:
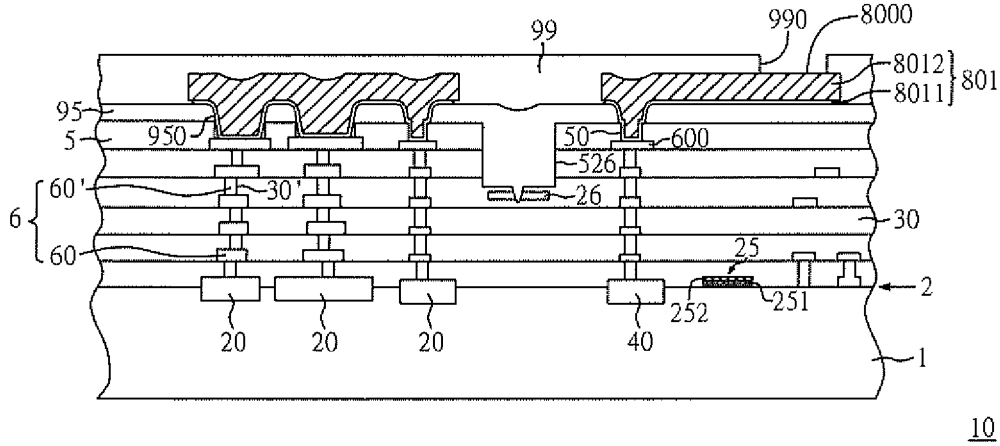
Figure 23J:
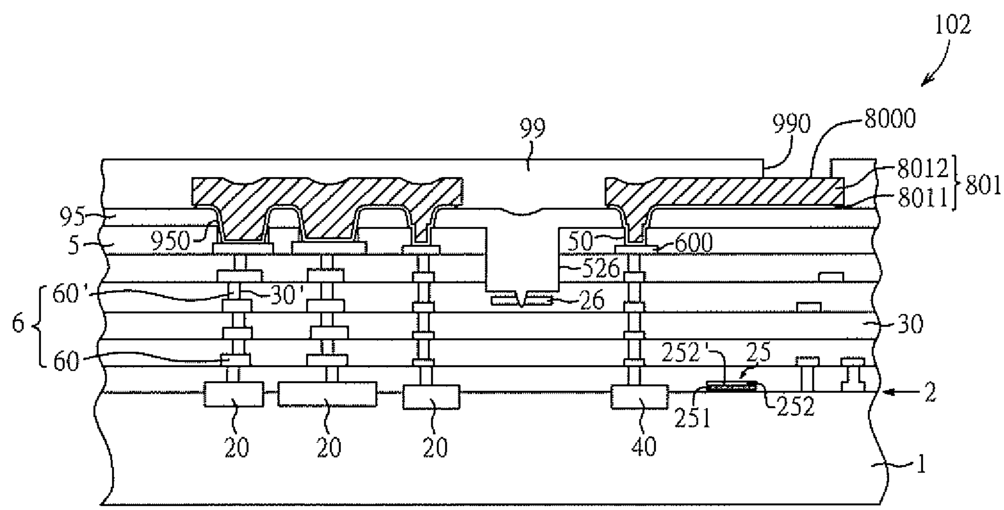
Figure 23K:
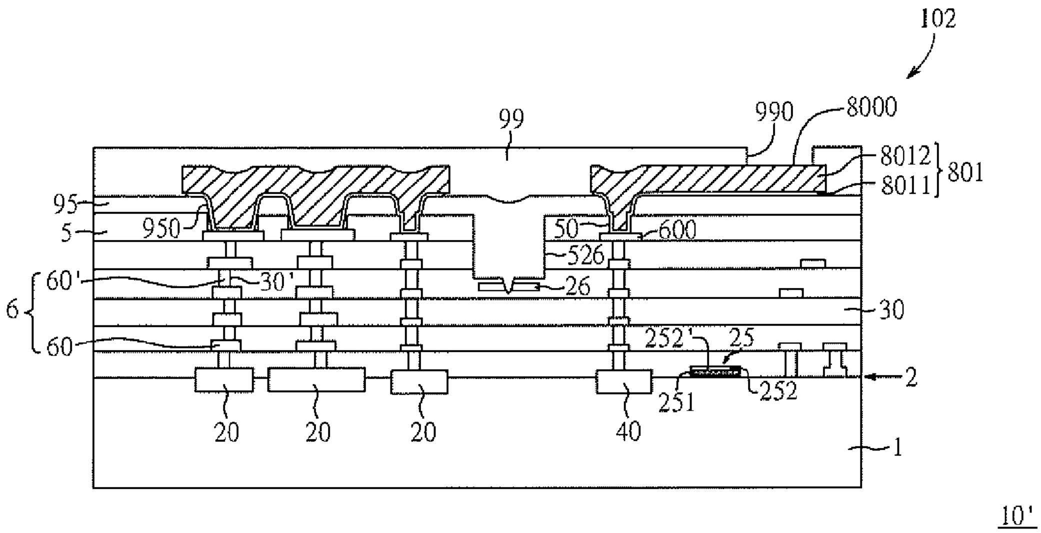
Figure 23L:
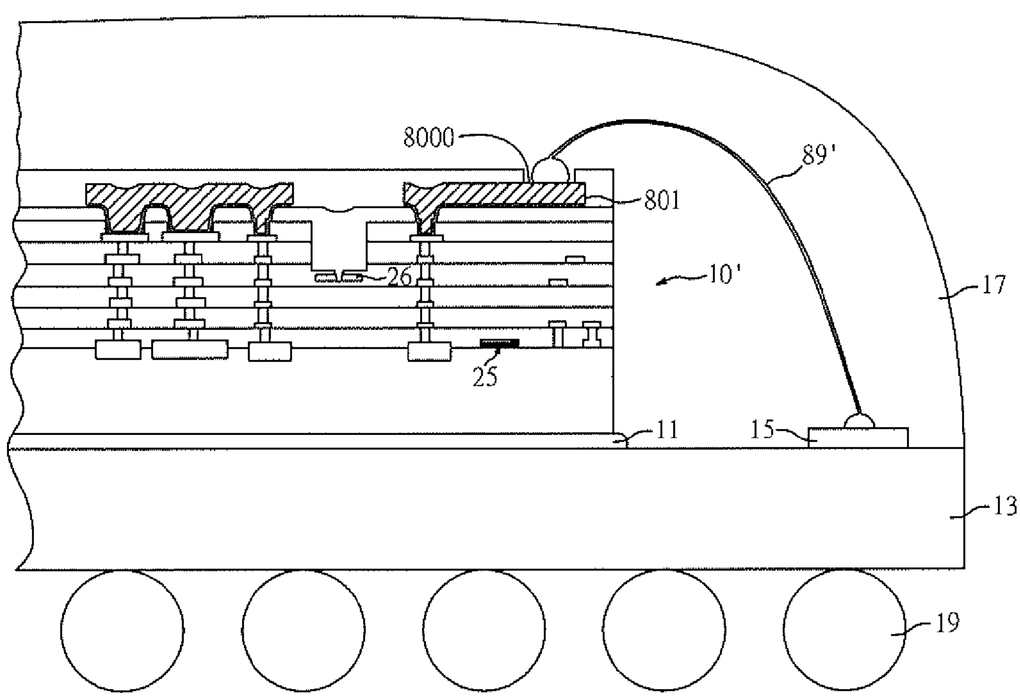
Figure 23M:
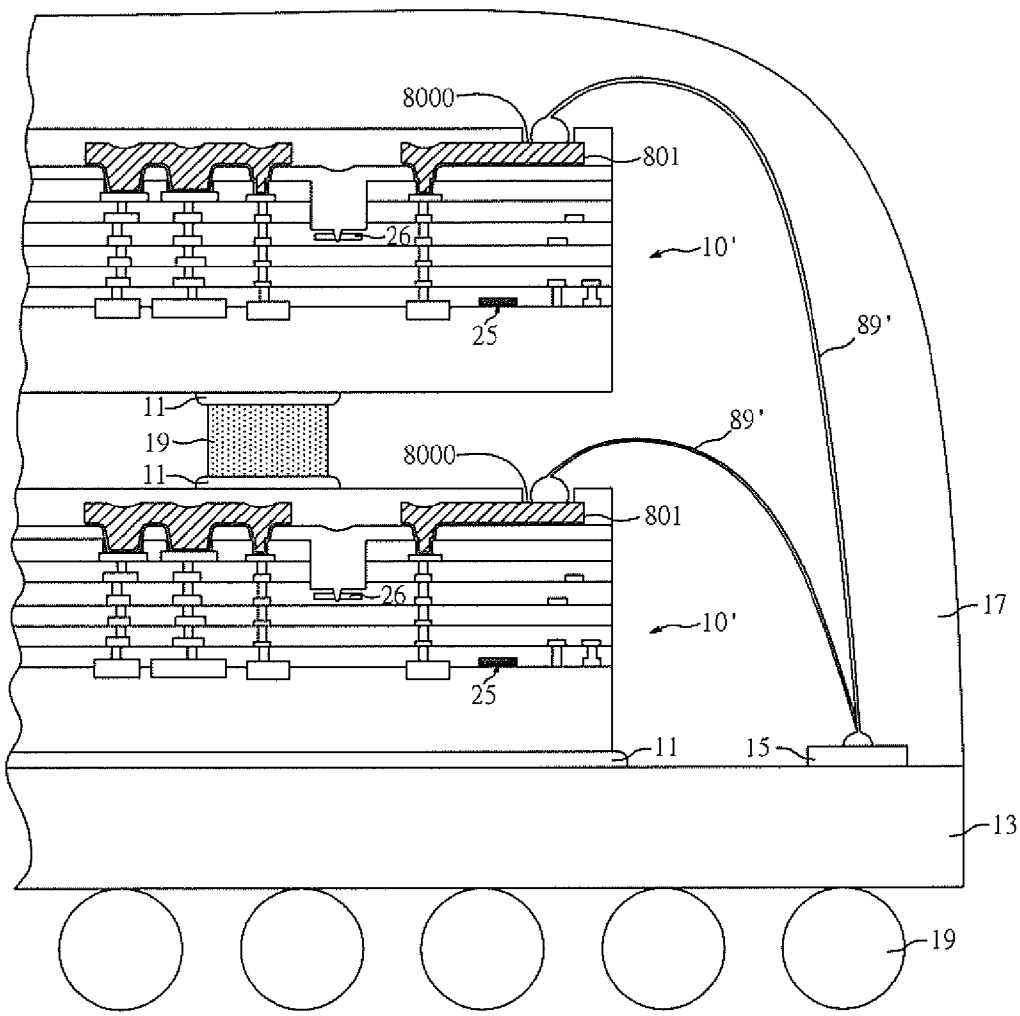
Figure 23N:
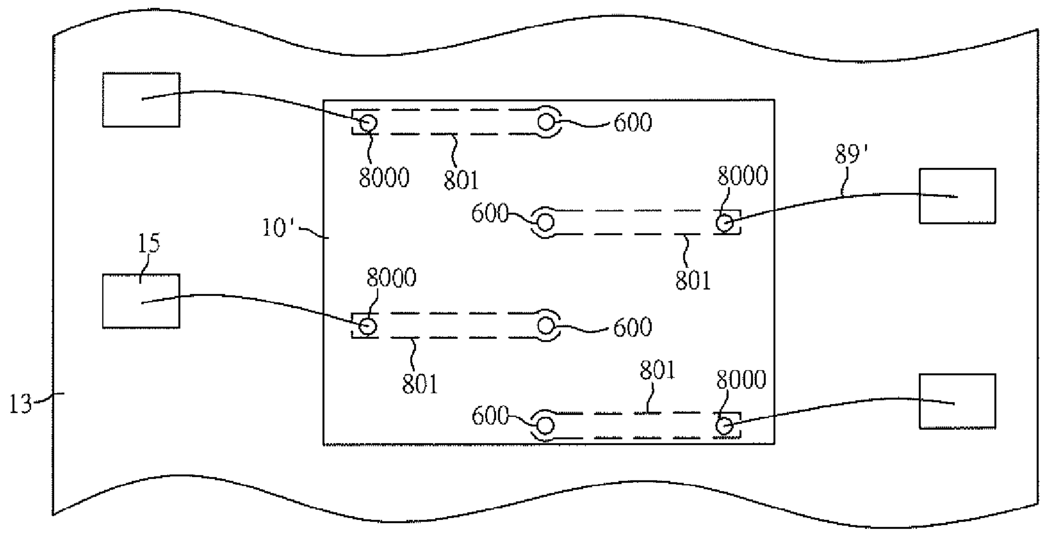

FIG. 23N shows a top view of a chip package for a DRAM chip, according to an embodiment.

Figure 24A:
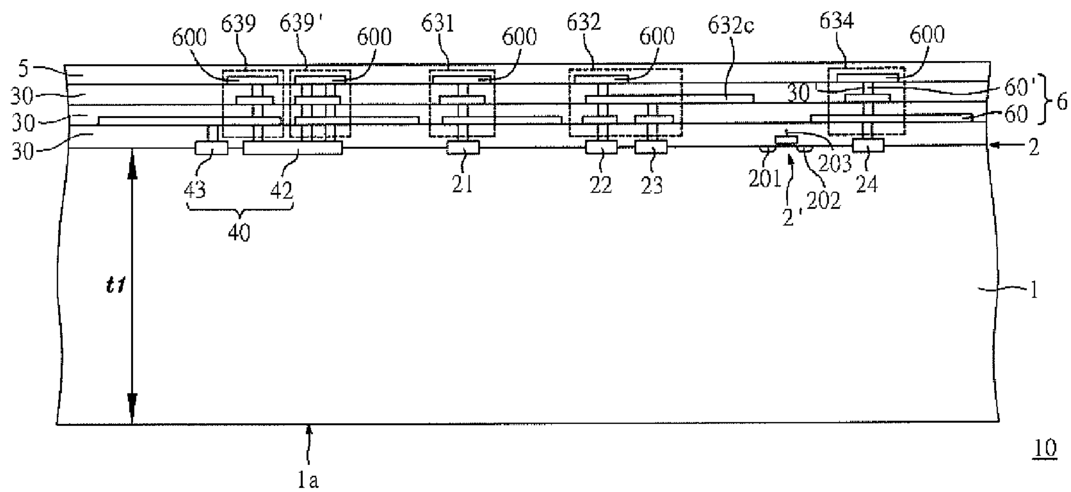

FIG. 24A shows a cross-sectional view of a semiconductor wafer, according to an embodiment.

Figure 24B:
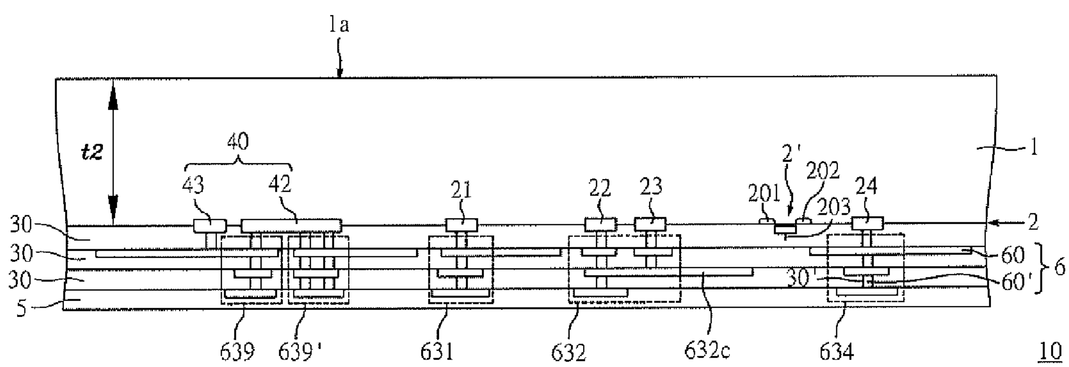

FIG. 24B is a cross-sectional view showing a process of thinning a silicon substrate of the semiconductor wafer shown in FIG. 24A, according to an embodiment.

Figure 24C:
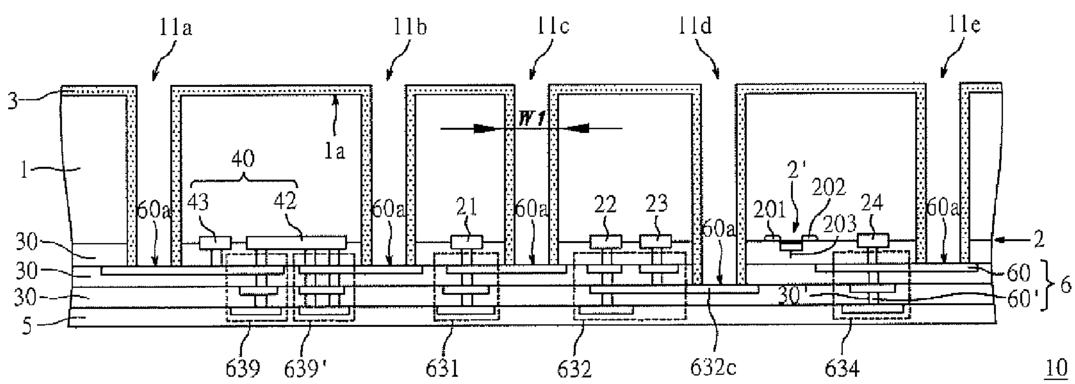

FIG. 24C is a cross-sectional view of the semiconductor wafer, shown in FIG. 24B, including through-silicon vias in the silicon substrate of the semiconductor wafer and including an insulating layer on sidewalls of the through-silicon vias and on a backside of the silicon substrate, according to an embodiment.

FIGS. 24D-24H are cross-sectional views showing a process of forming through-silicon vias in the silicon substrate of the semiconductor wafer shown in FIG. 24B and forming an insulating layer on sidewalls of the through-silicon vias and on a backside of the silicon substrate, according to an embodiment.

FIGS. 24I-24N are cross-sectional views showing another process of forming through-silicon vias in the silicon substrate of the semiconductor wafer shown in FIG. 24B and forming an insulating layer on sidewalls of the through-silicon vias and on a backside of the silicon substrate, according to an embodiment.

FIGS. 25A-25L are cross-sectional views showing a process for forming a bottom scheme of a bottom structure technology at a backside of the semiconductor wafer shown in FIG. 24C, according to an embodiment.

FIGS. 25M-25T are cross-sectional views of semiconductor wafers, according to an embodiment.

Figure 25A:
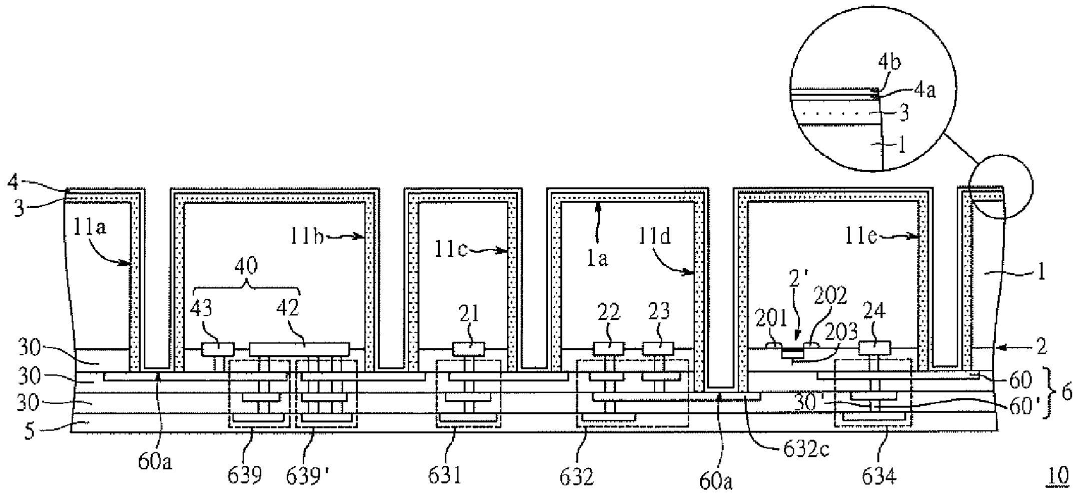
Figure 25B:
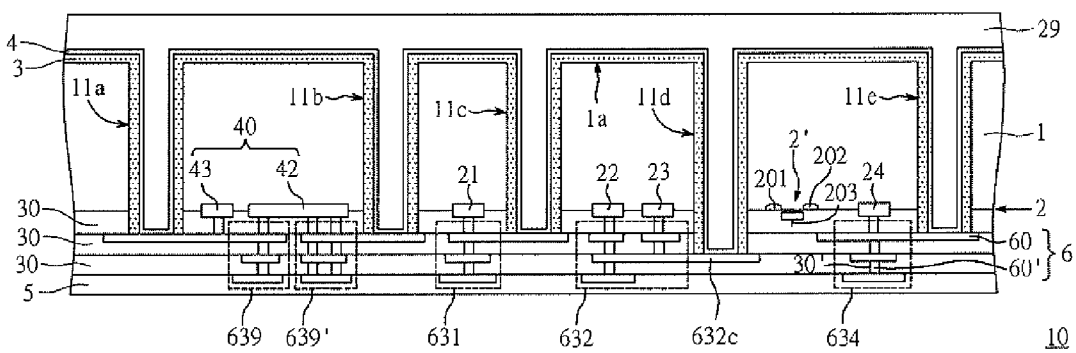
Figure 25C:
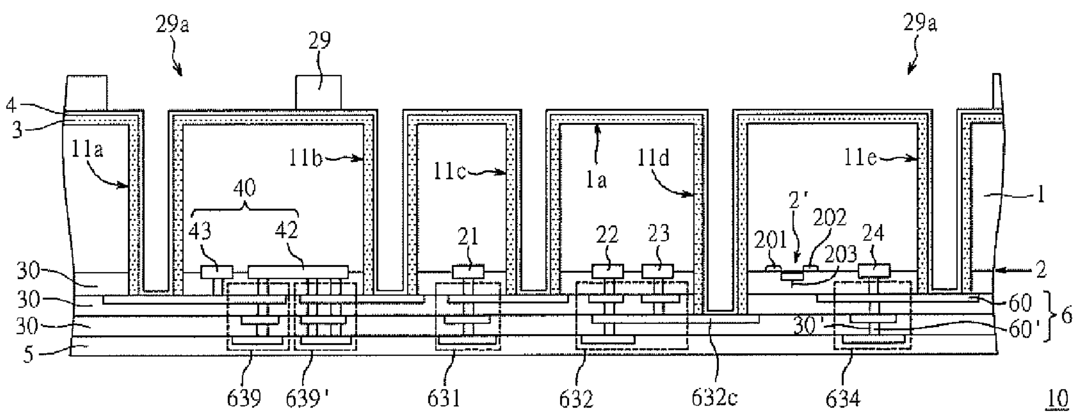
Figure 25D:
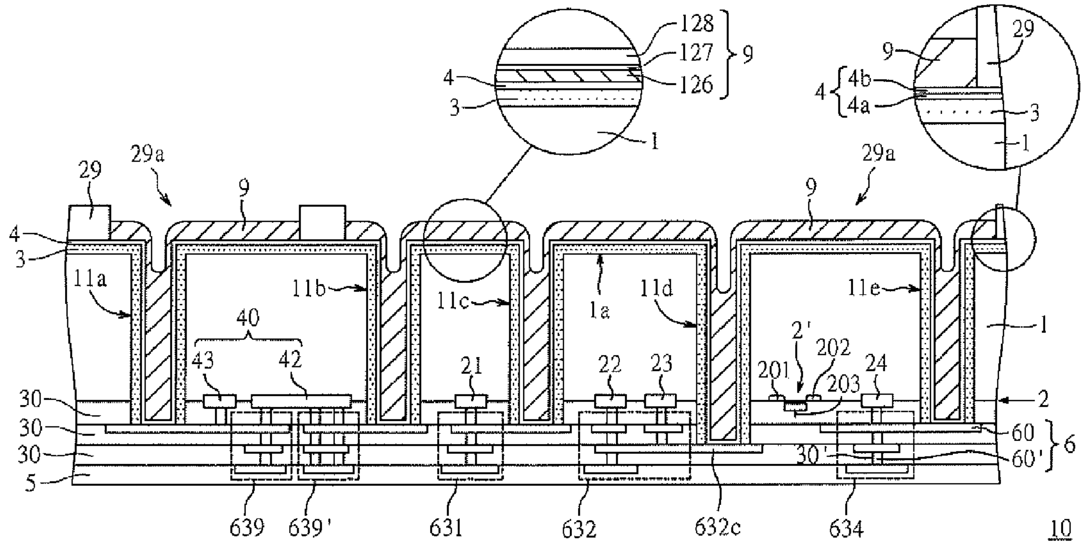
Figure 25E:
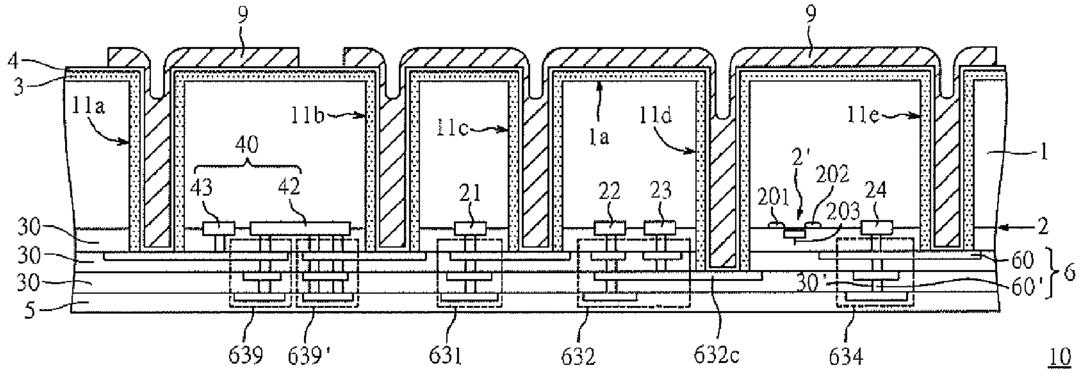
Figure 25F:
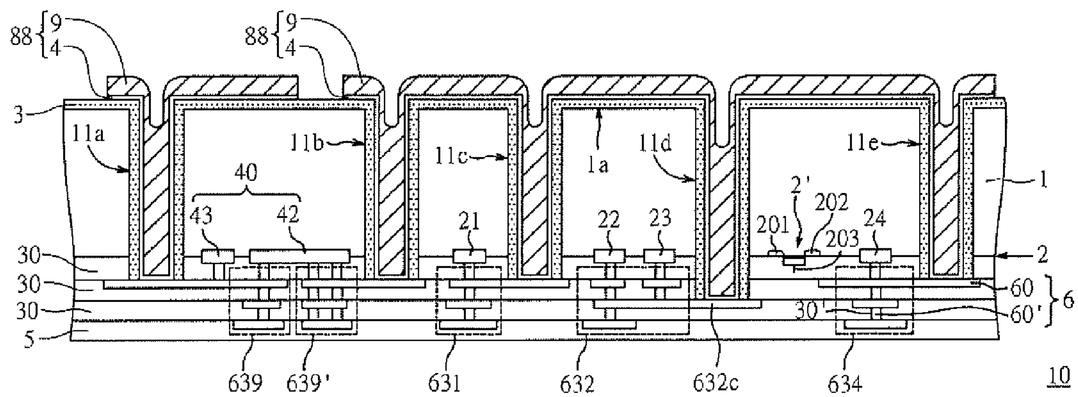
Figure 25G:
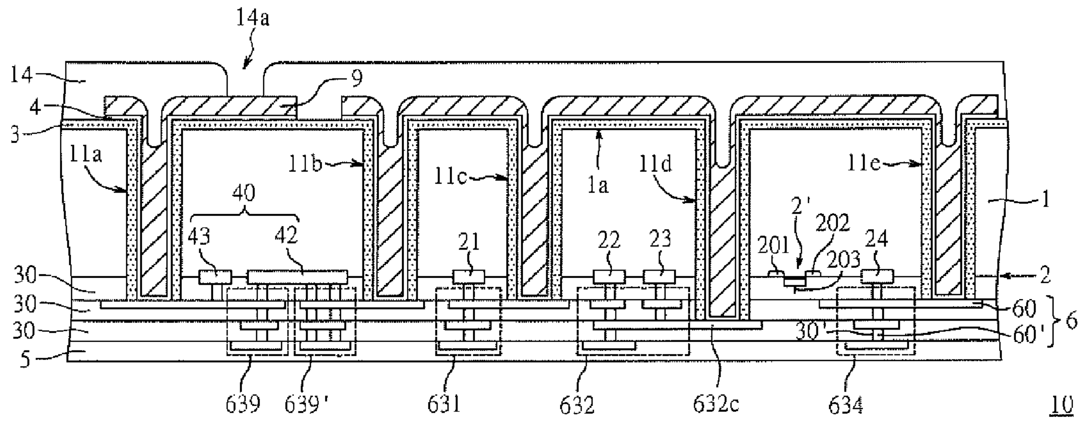
Figure 25H:
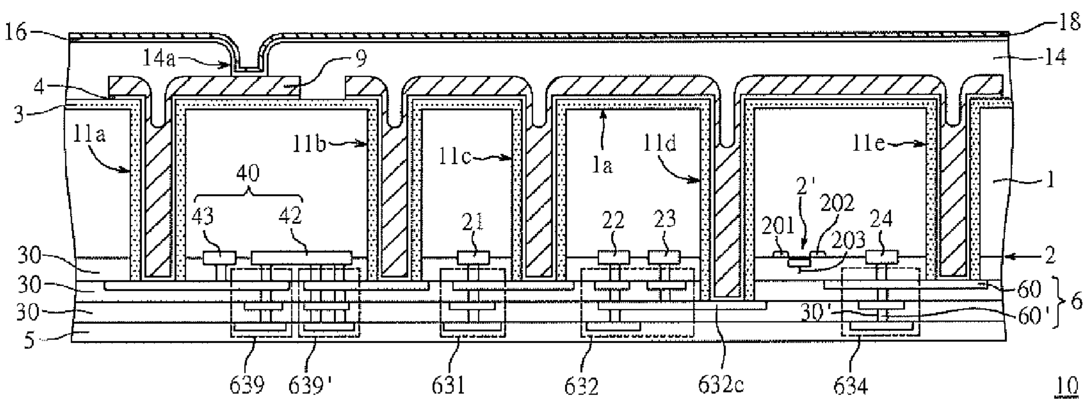
Figure 25I:
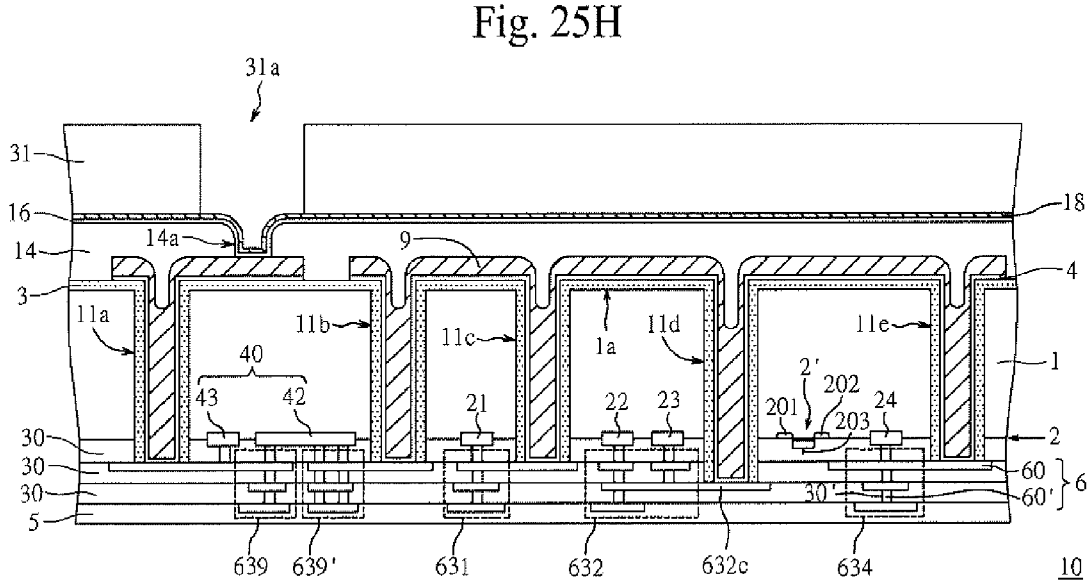
Figure 25J:
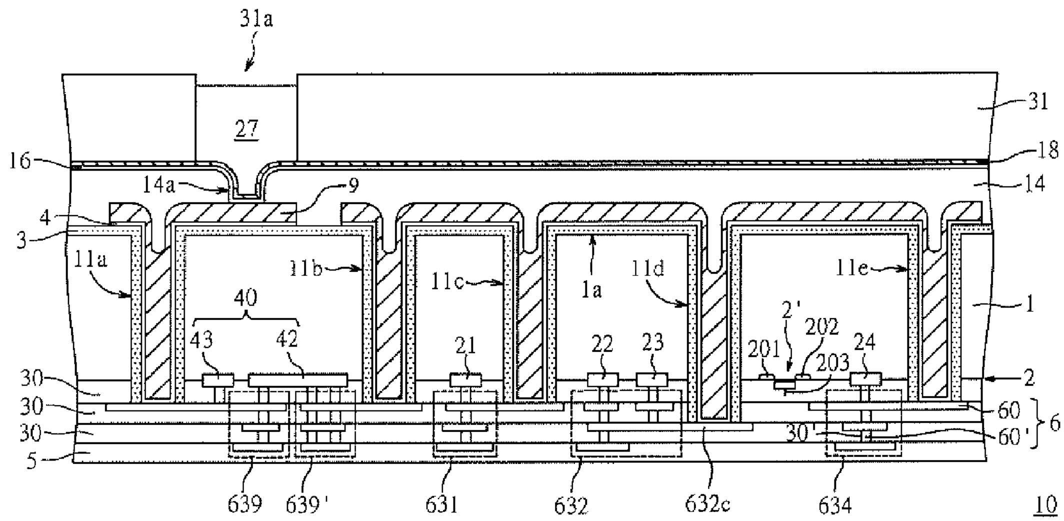
Figure 25K:
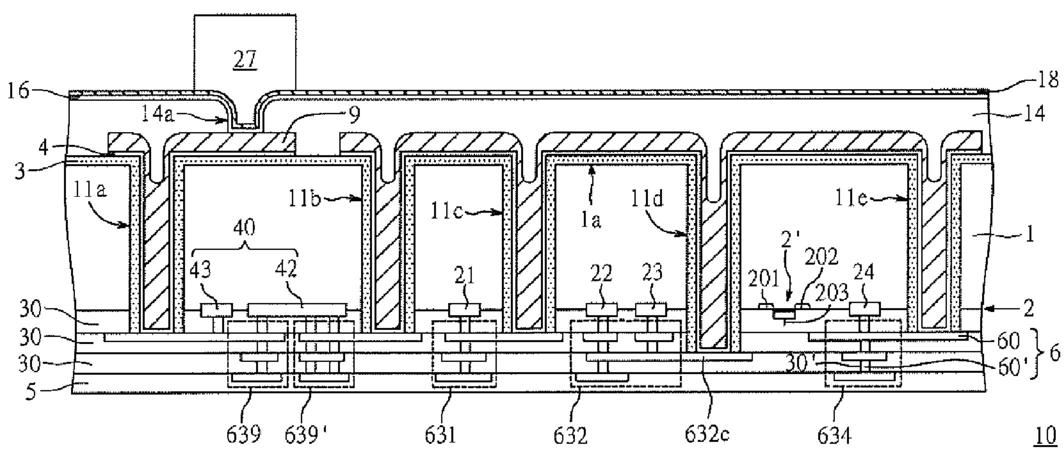
Figure 25L:
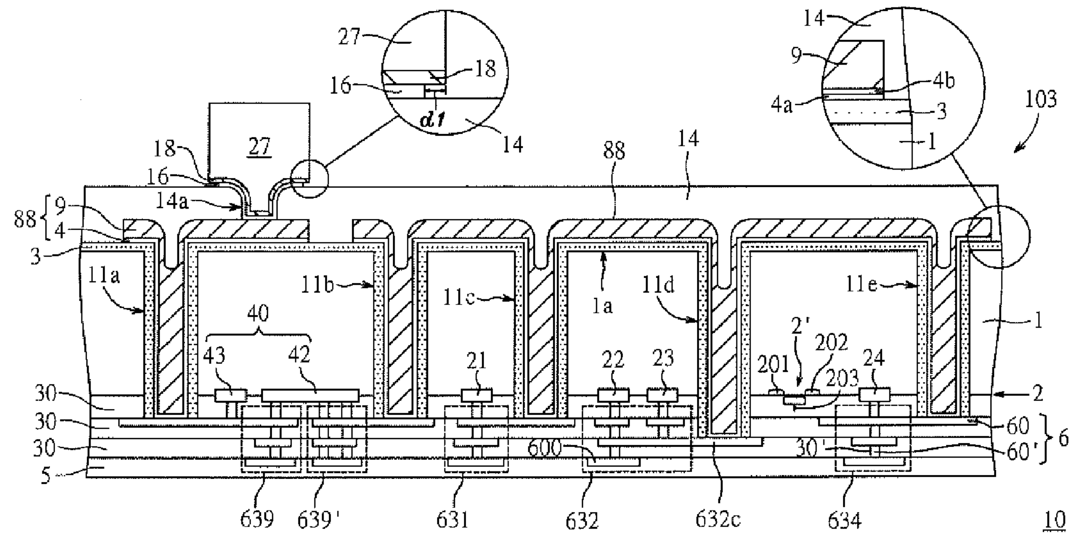
Figure 25M:
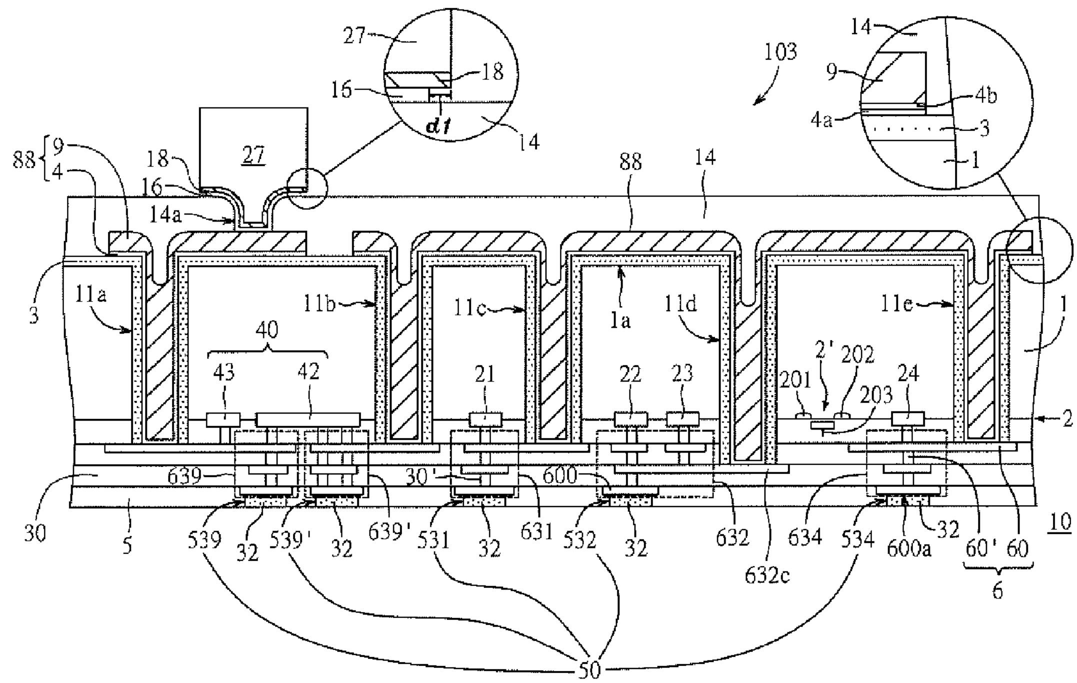
Figure 25N:
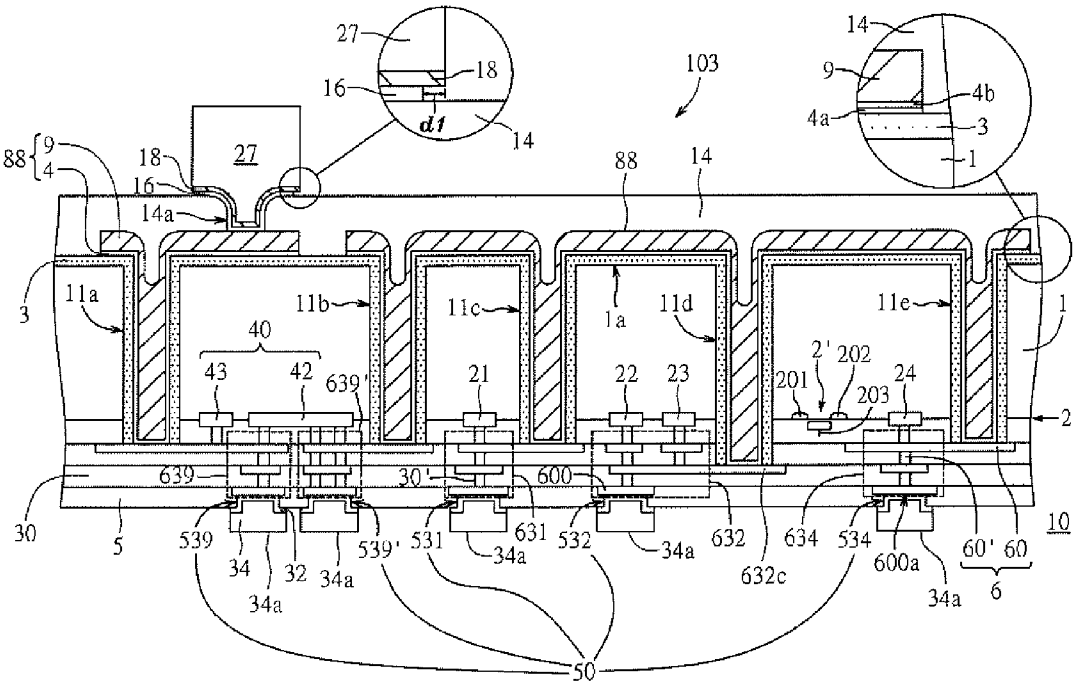
Figure 25O:
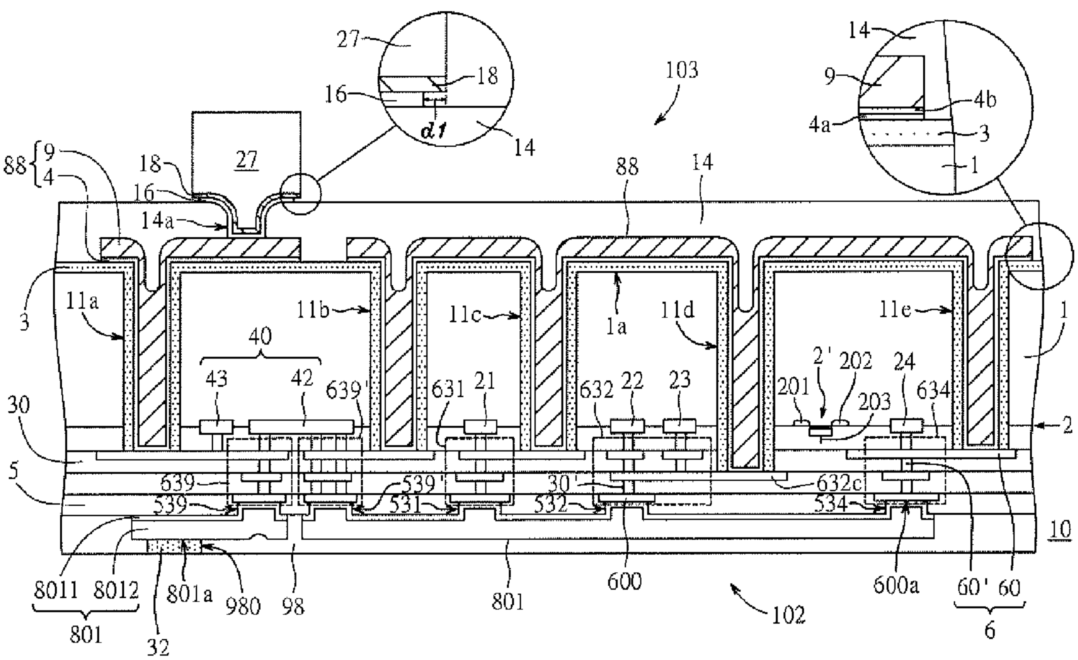
Figure 25P:
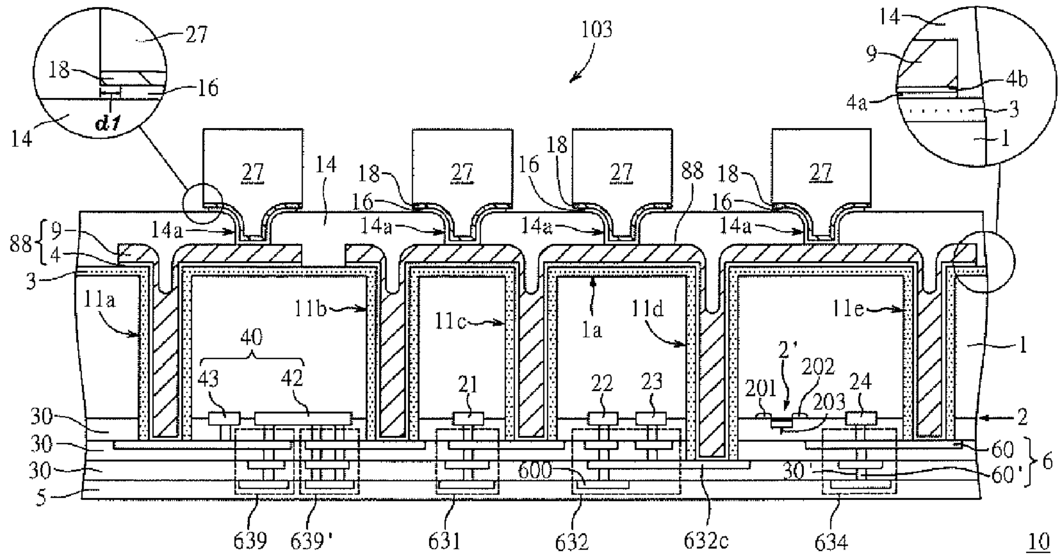
Figure 25Q:
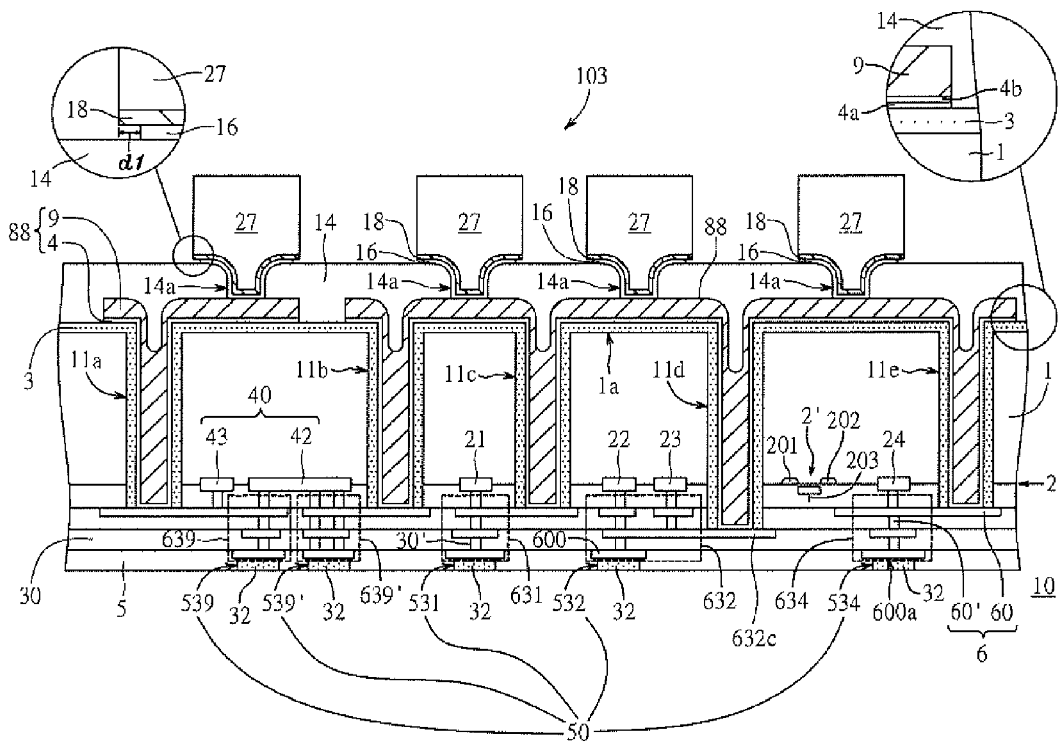
Figure 25R:
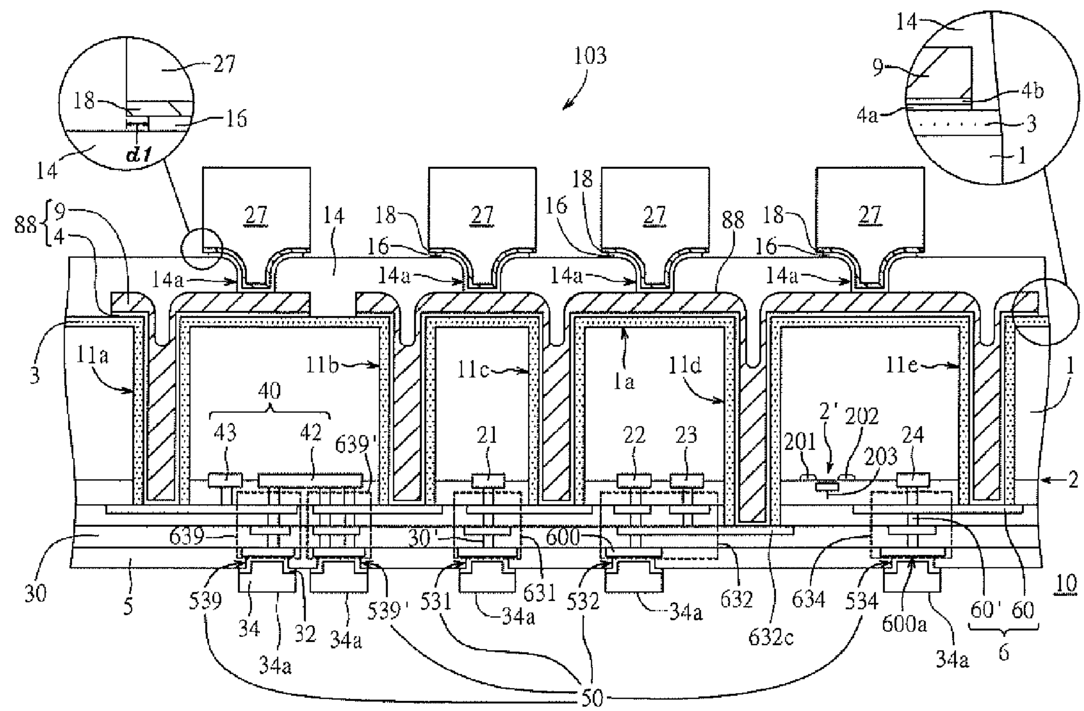
Figure 25S:
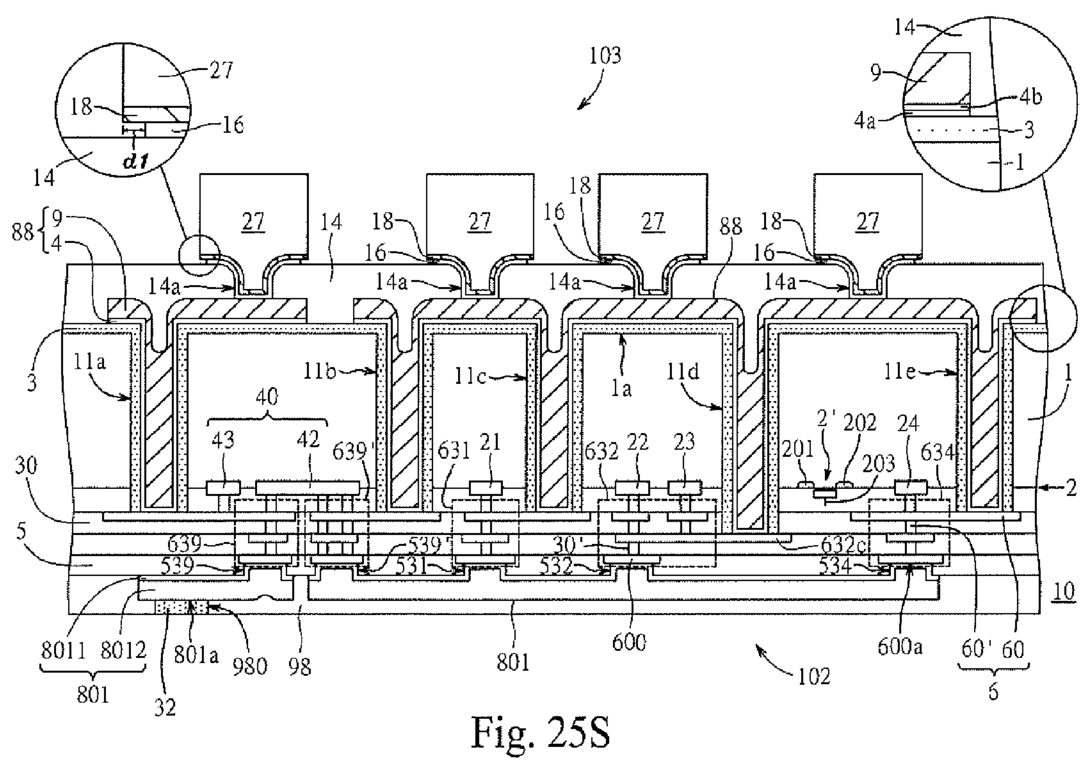
Figure 25T:
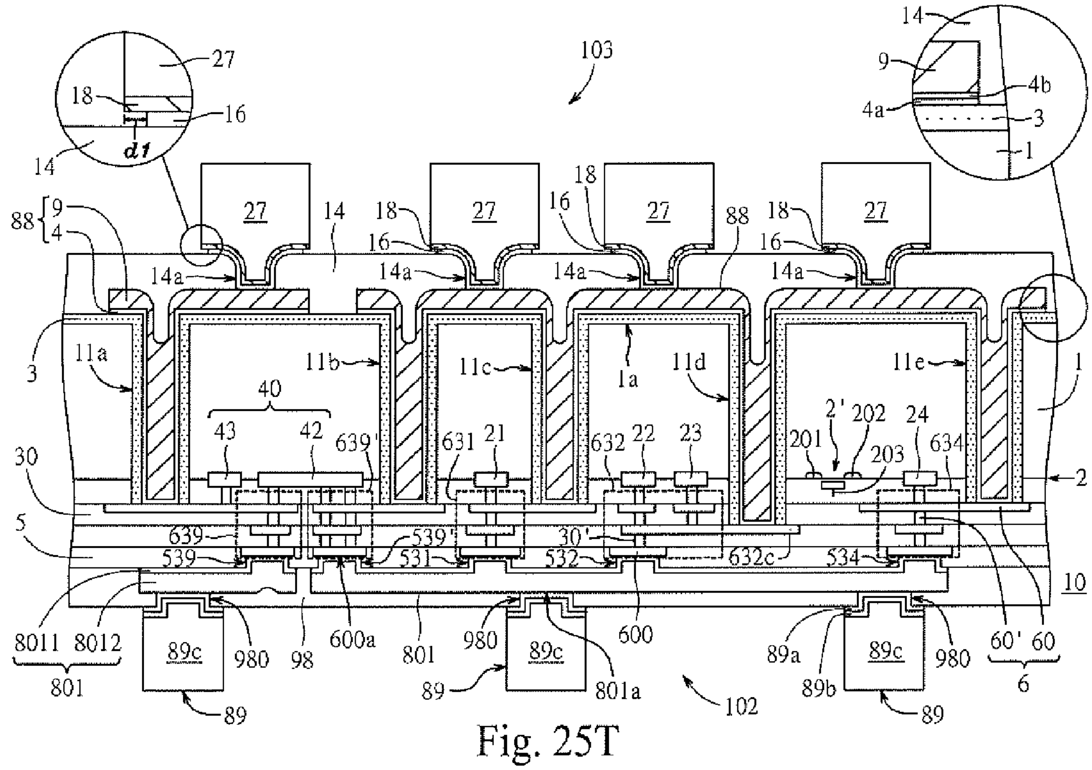
Figure 25U:
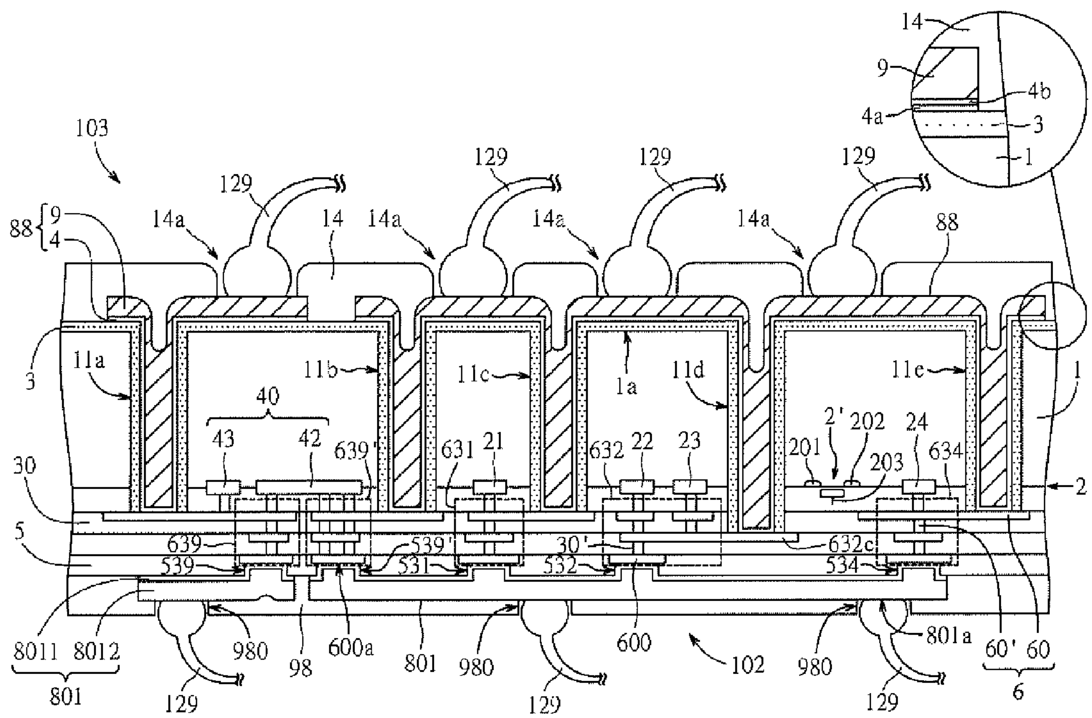
Figure 25V:
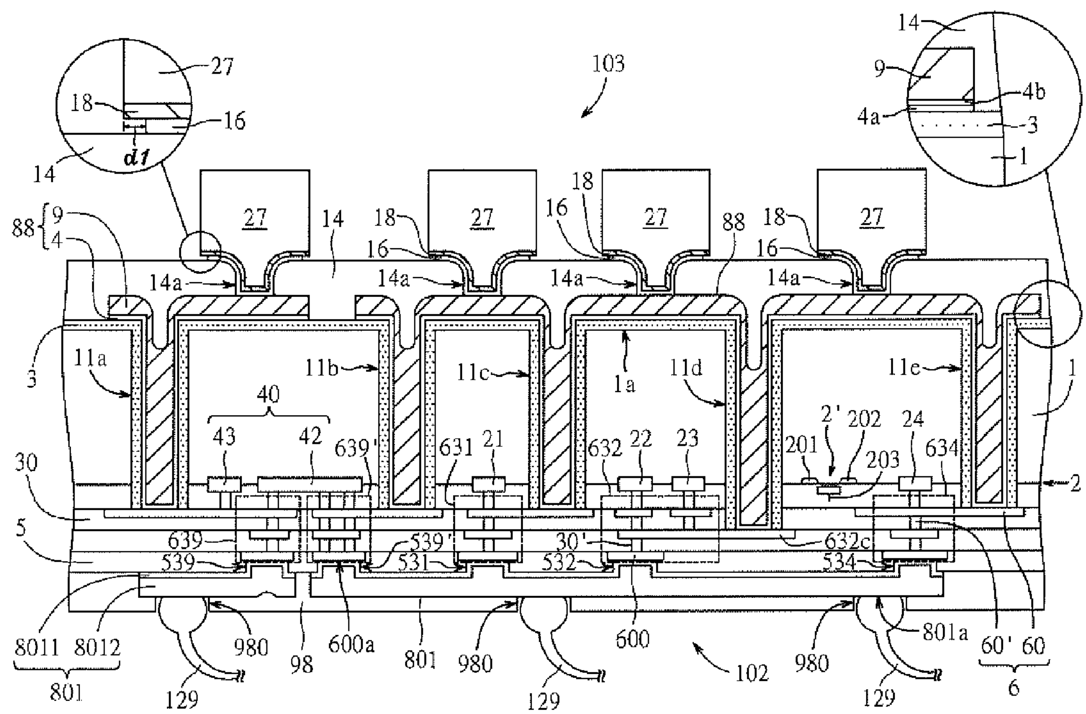
Figure 25W:
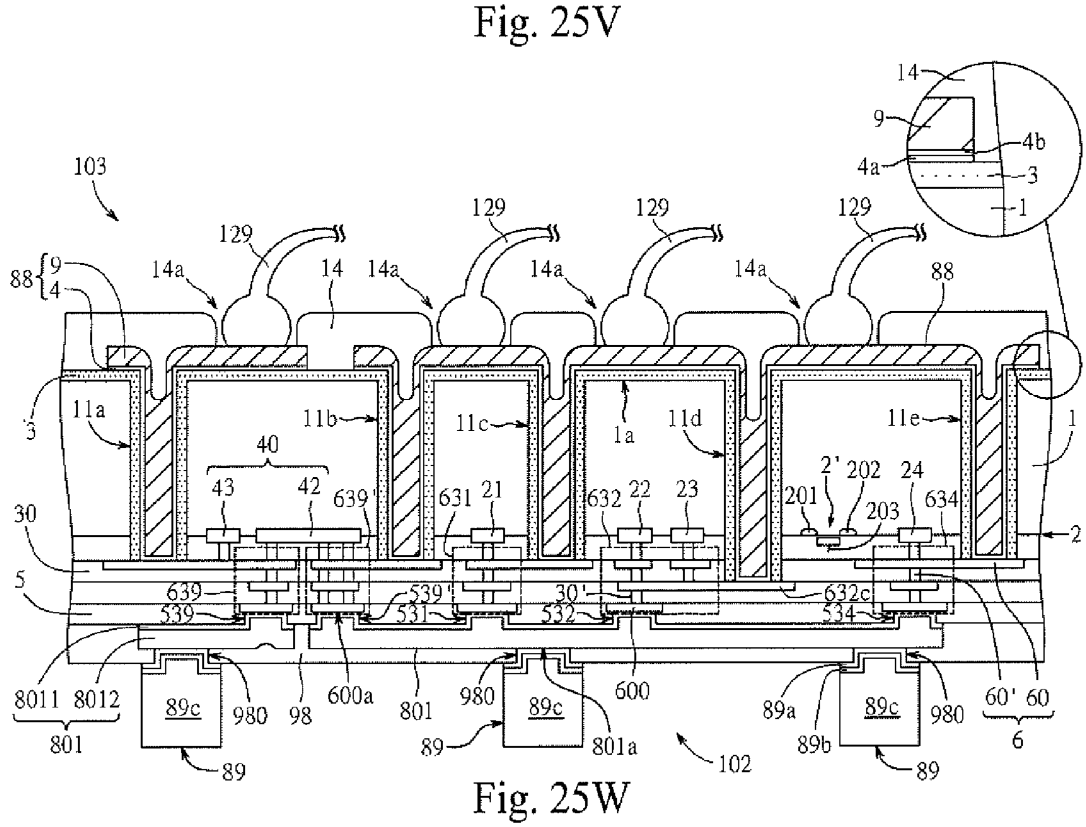

FIGS. 25U, 25V and 25W are cross-sectional views of packages, according to an embodiment.

FIGS. 26A-26G are cross-sectional views showing a process for forming a bottom scheme of a bottom structure technology at a backside of the semiconductor wafer shown in FIG. 24C, according to an embodiment.

FIGS. 26H-26K are cross-sectional views of semiconductor wafers, according to an embodiment.

Figure 27A:
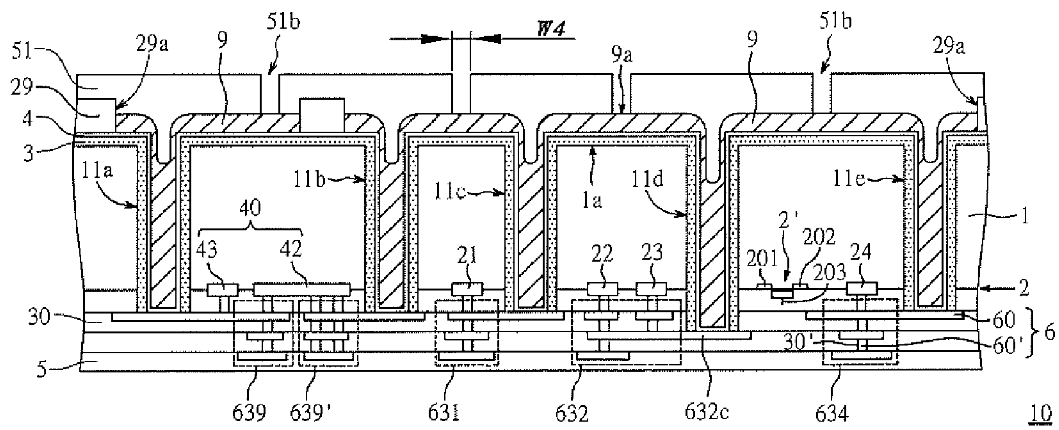
Figure 27B:
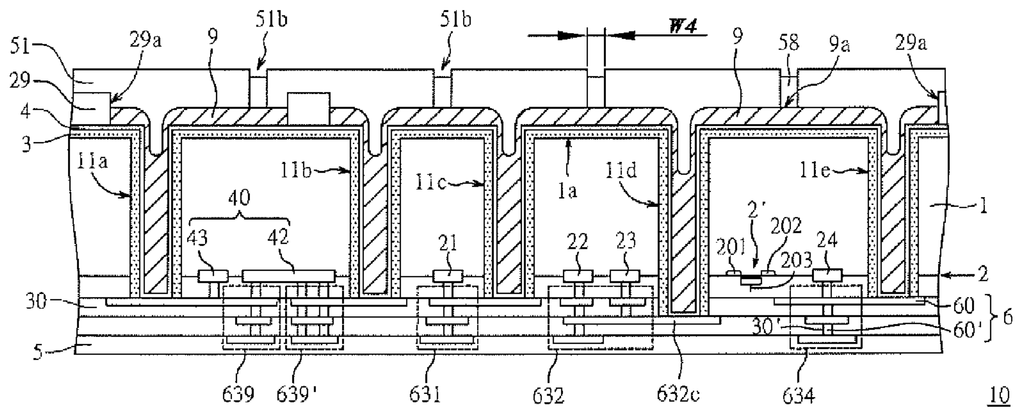
Figure 27C:
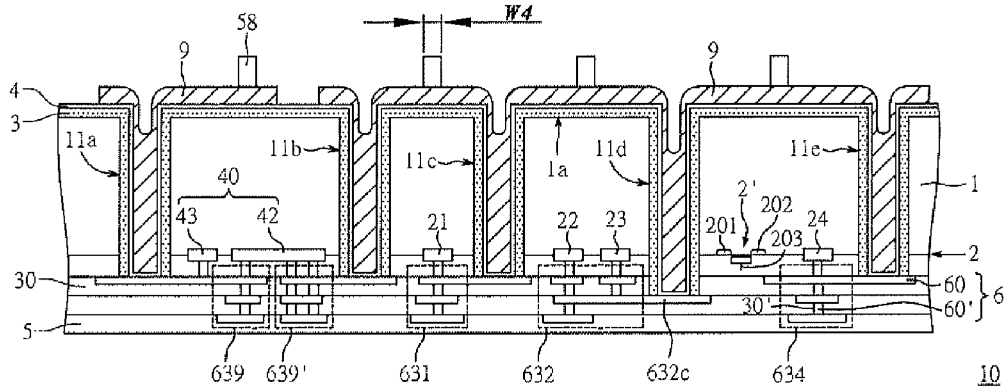
Figure 27D:
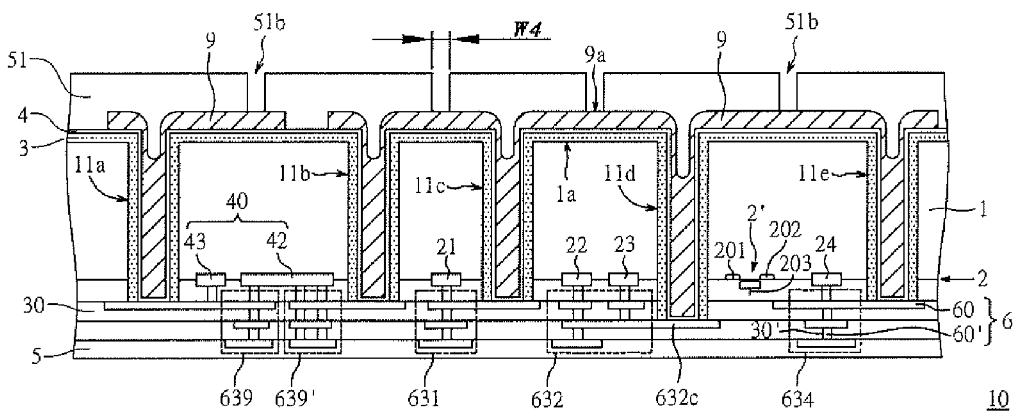
Figure 27E:
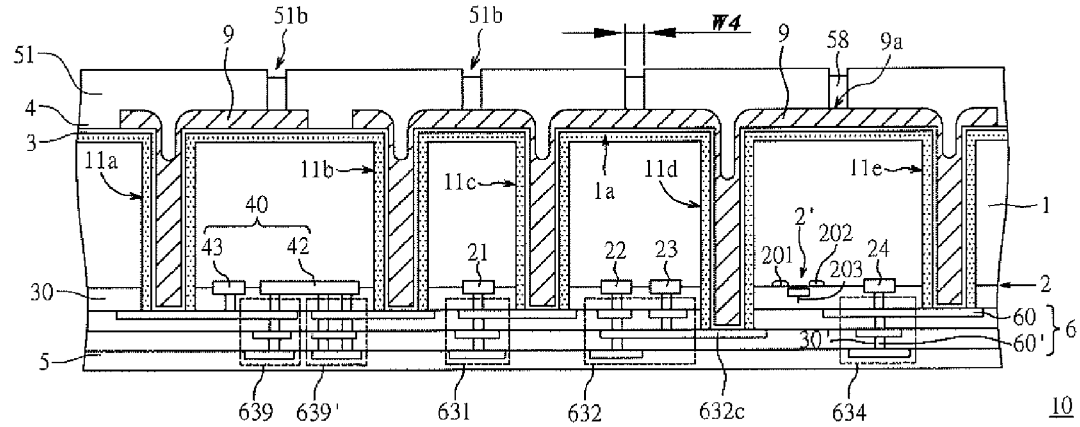
Figure 27F:
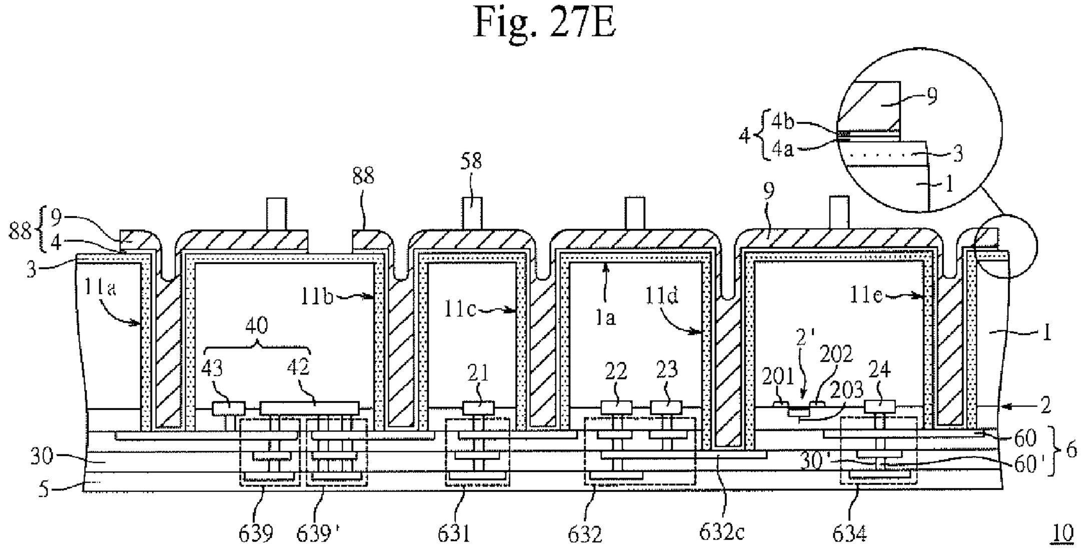
Figure 27G:
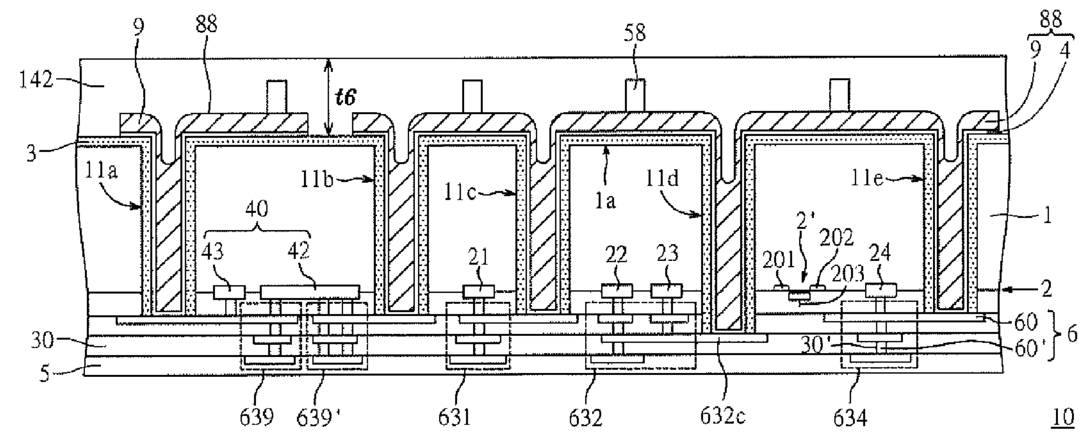
Figure 27H:
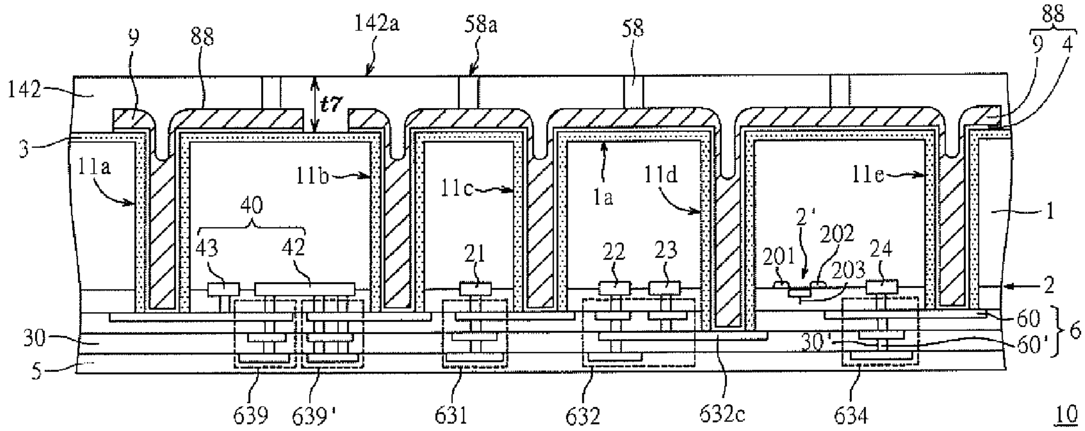
Figure 27I:
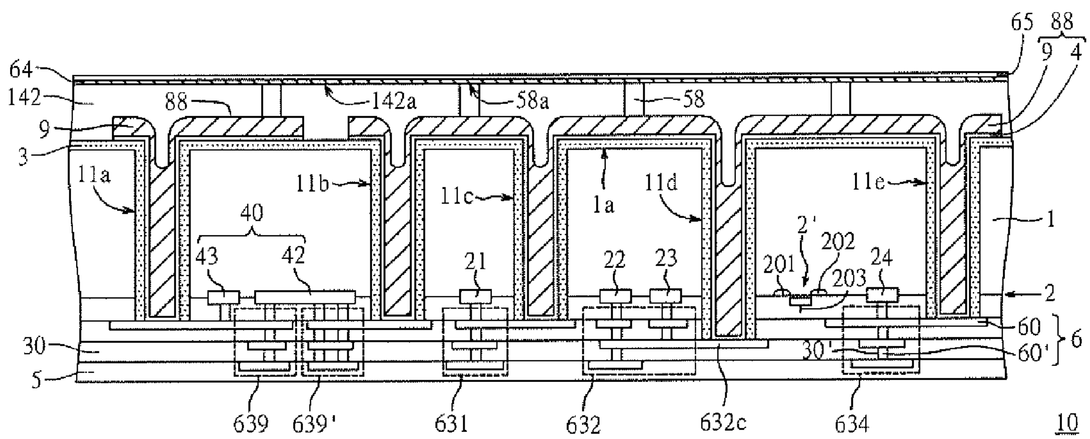
Figure 27J:
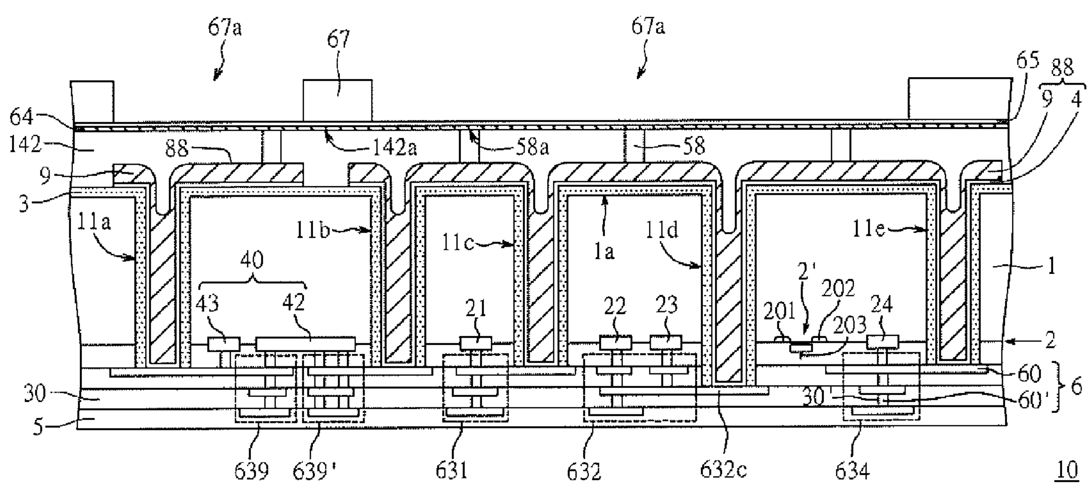
Figure 27K:
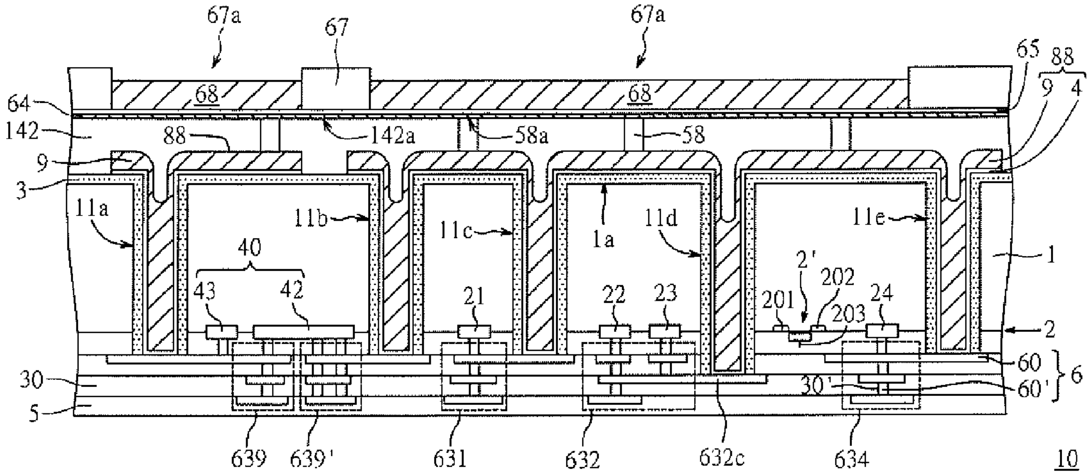
Figure 27L:
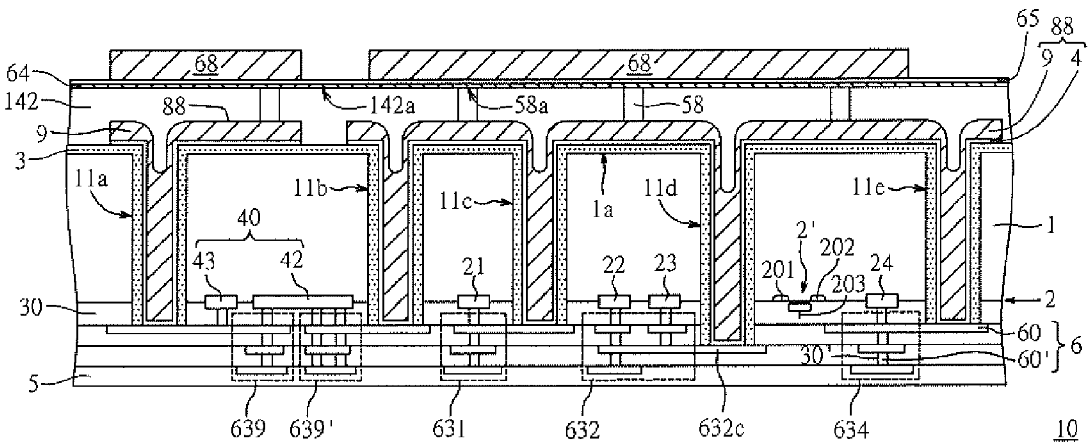
Figure 27M:
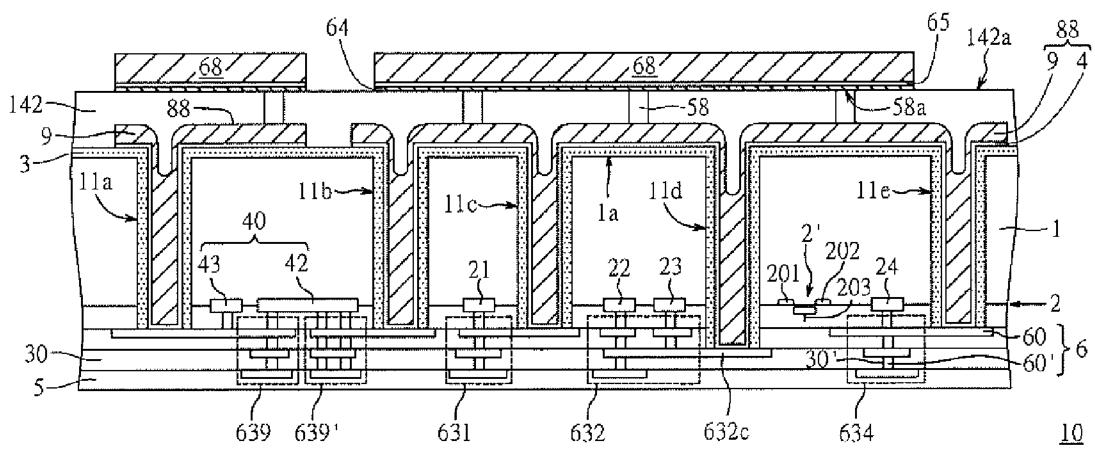
Figure 27N:
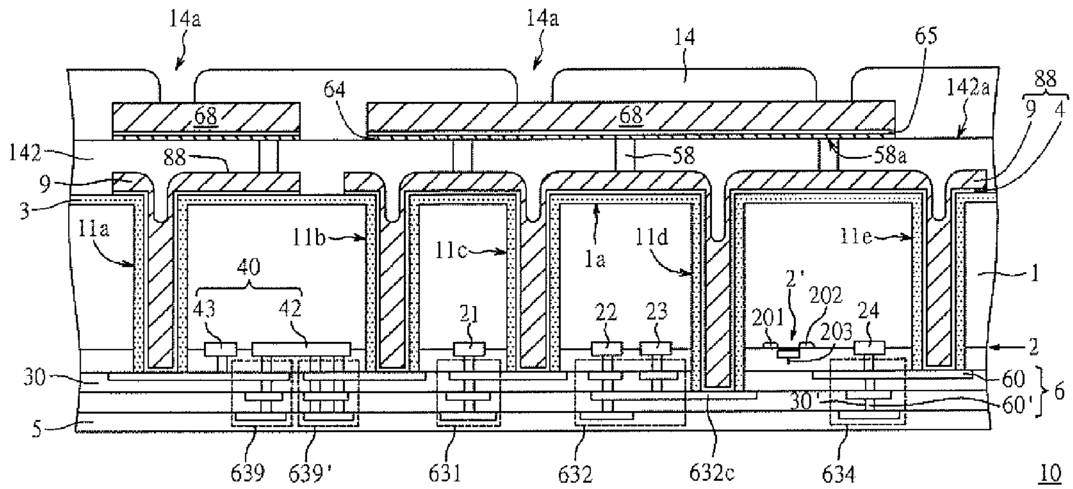
Figure 27O:
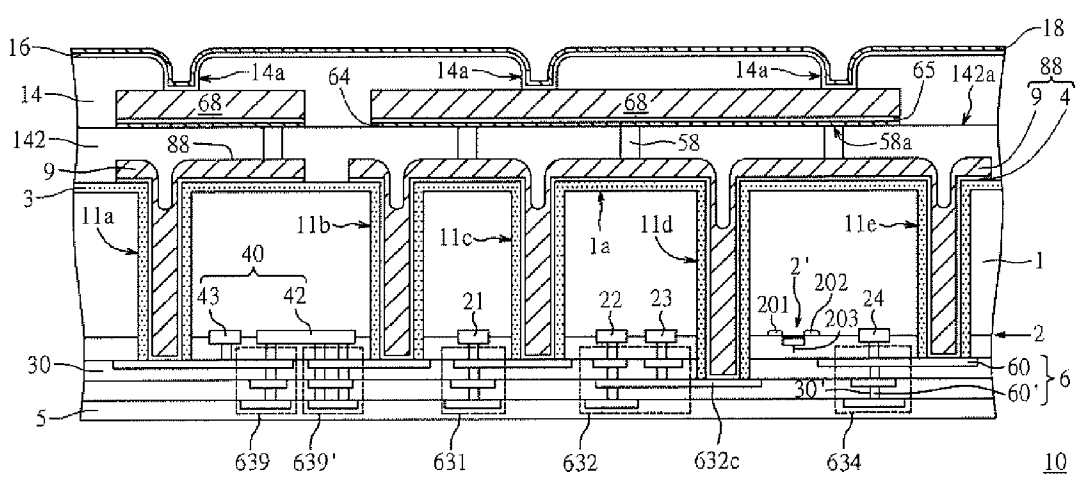
Figure 27P:
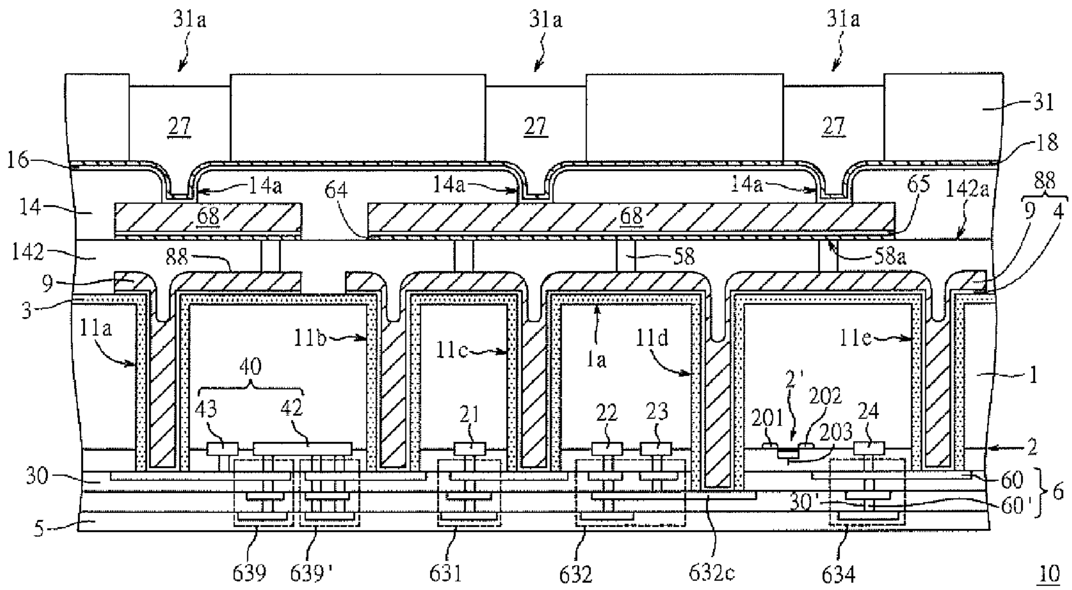
Figure 27Q:
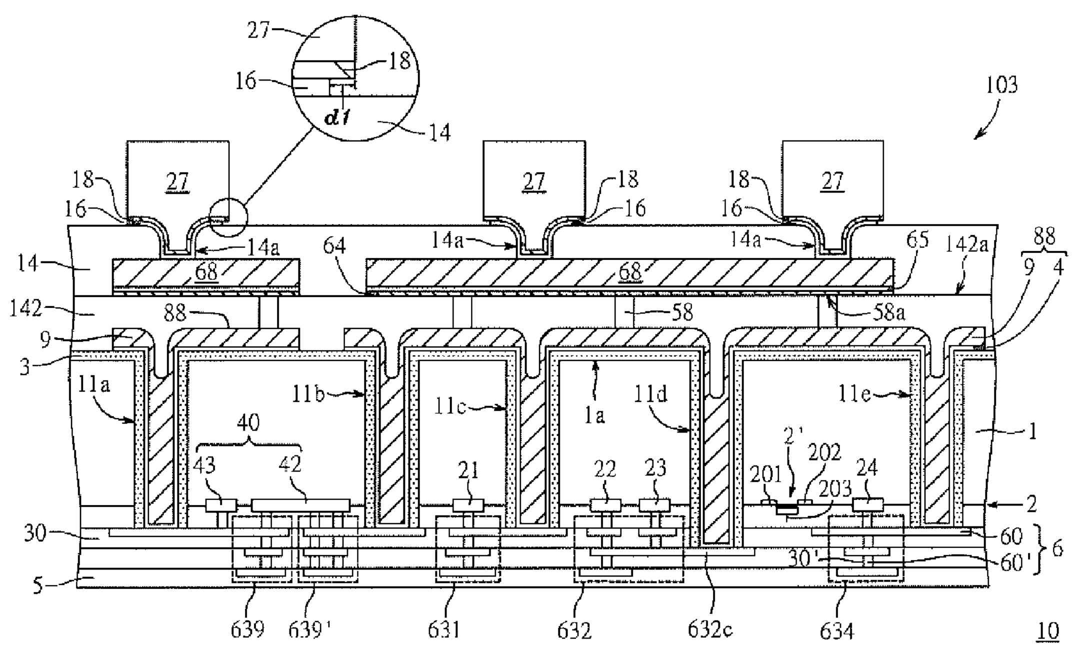

FIGS. 27A-27Q are cross-sectional views showing a process for forming a bottom scheme of a bottom structure technology at a backside of the semiconductor wafer shown in FIG. 24C, according to an embodiment.

Figure 27R:
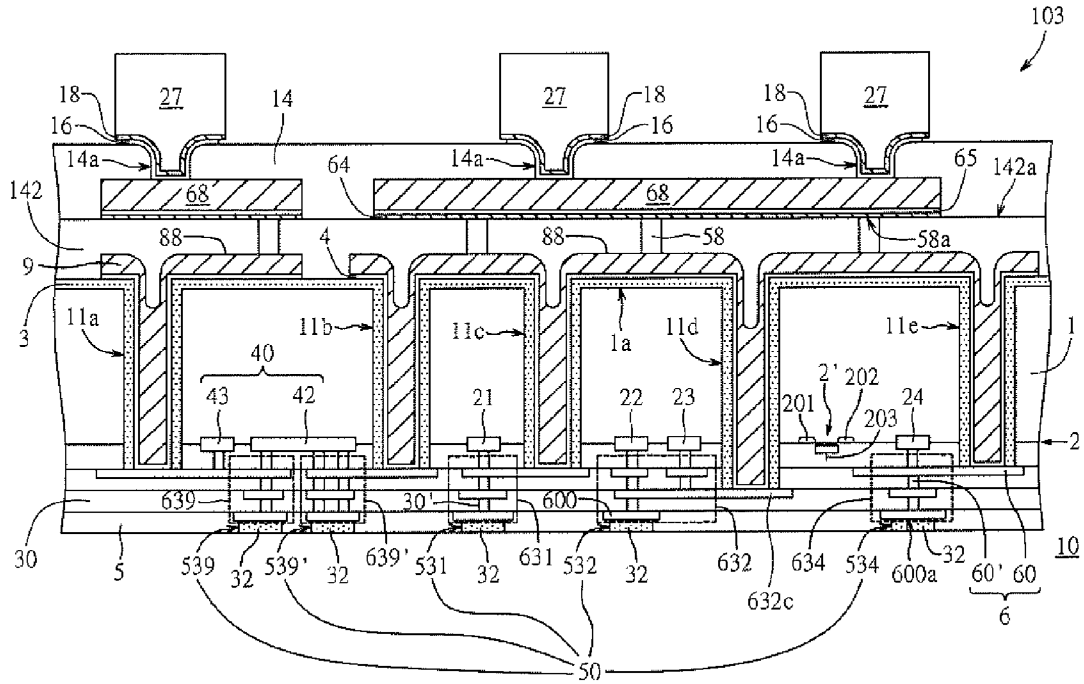
Figure 27S:
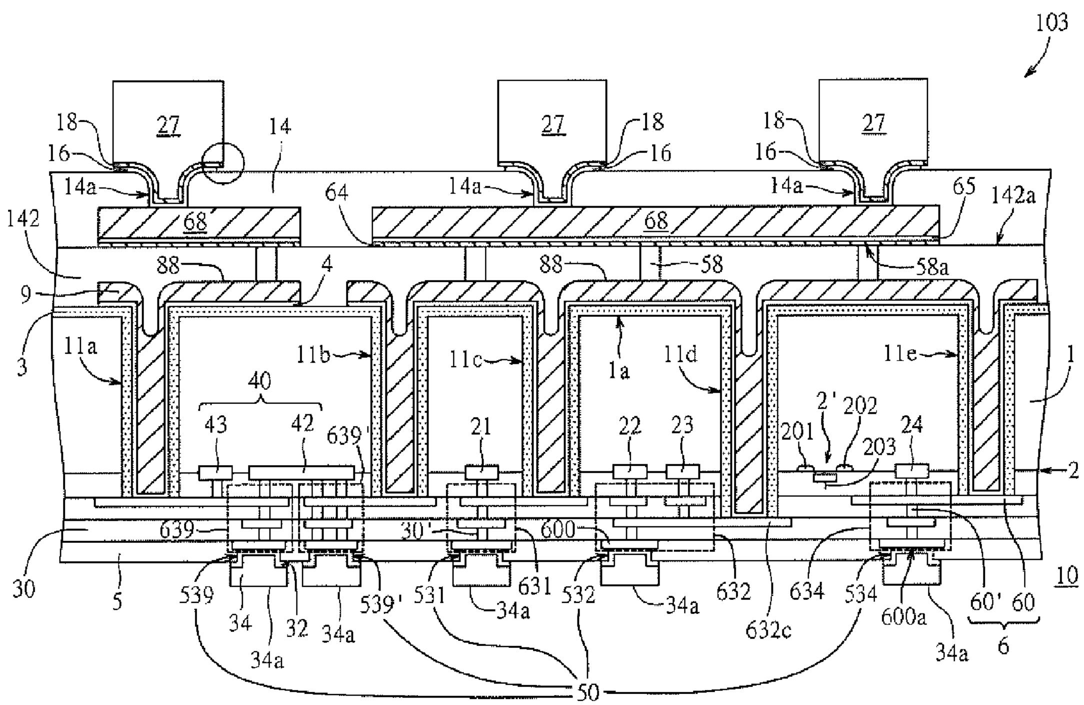
Figure 27T:
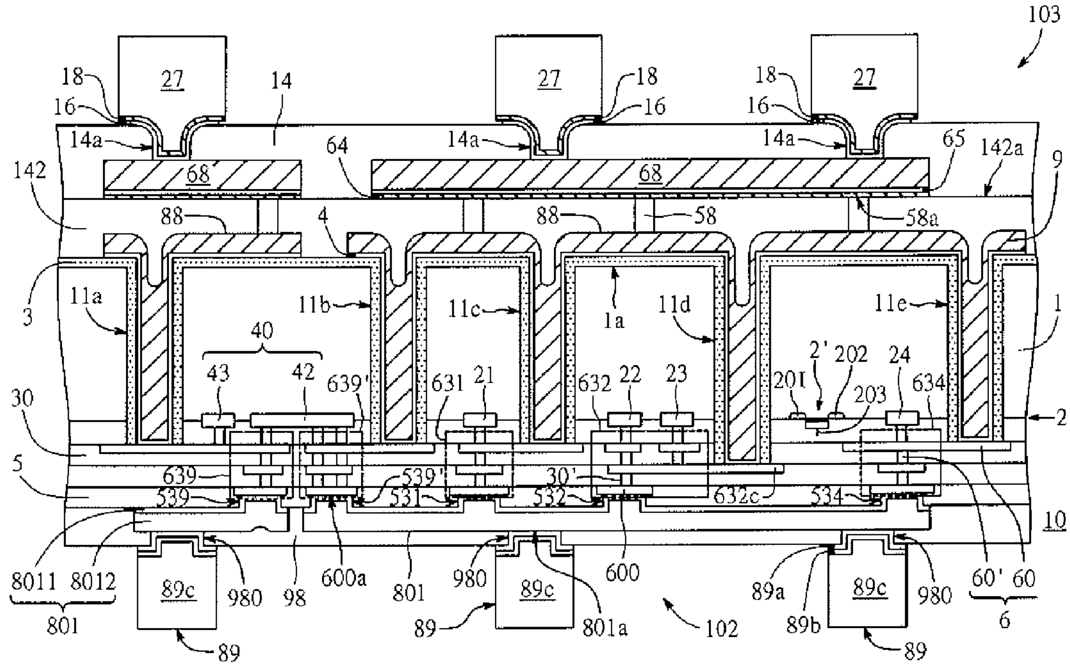

FIGS. 27R-27T are cross-sectional views of semiconductor wafers, according to an embodiment.

FIGS. 28A-28F are cross-sectional views showing a process for forming a bottom scheme of a bottom structure technology at a backside of the semiconductor wafer shown in FIG. 24C, according to an embodiment.

Figure 28A:
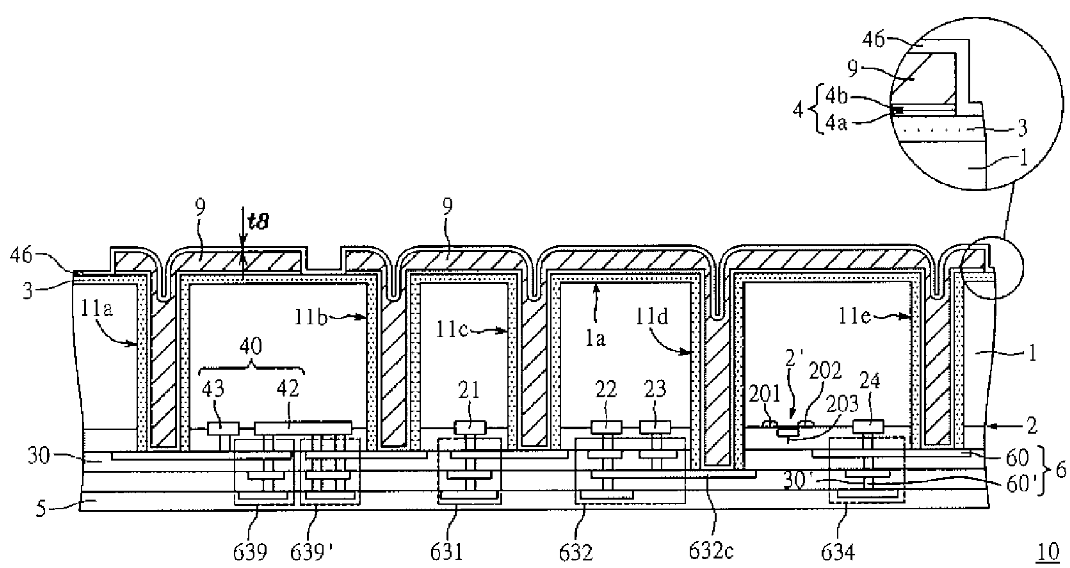
Figure 28B:
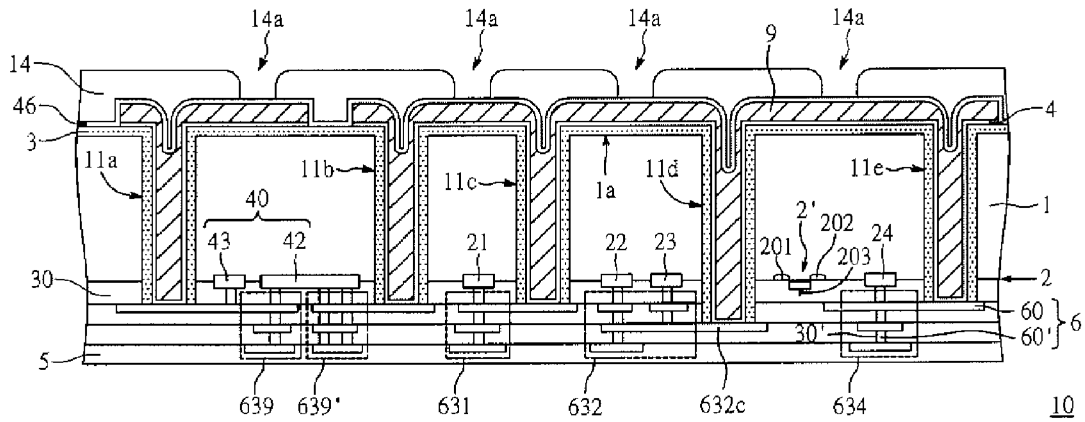
Figure 28C:
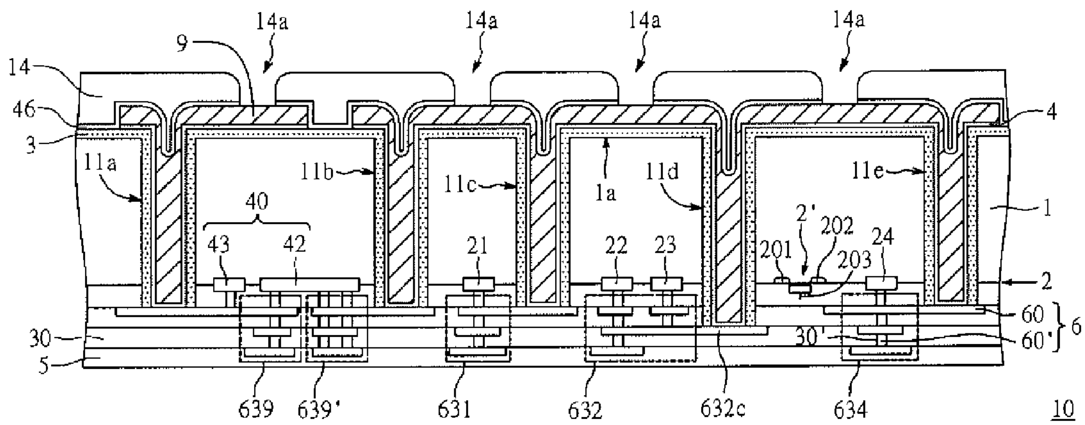
Figure 28D:
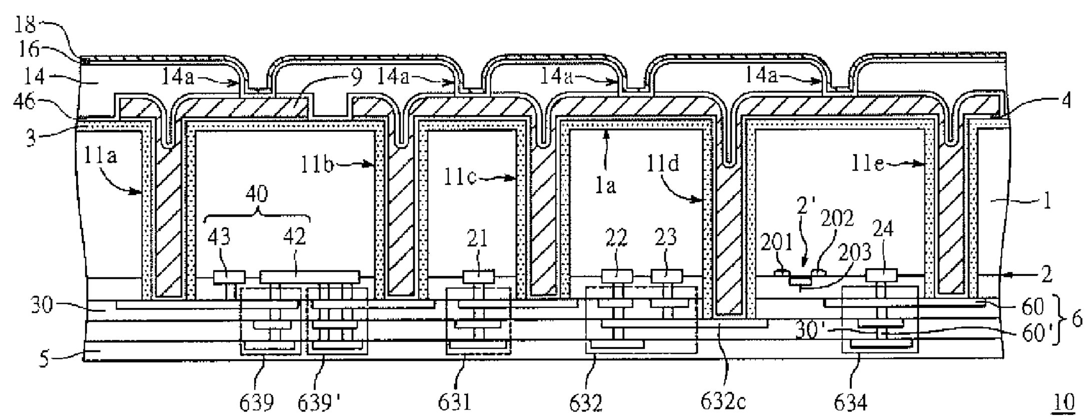
Figure 28E:
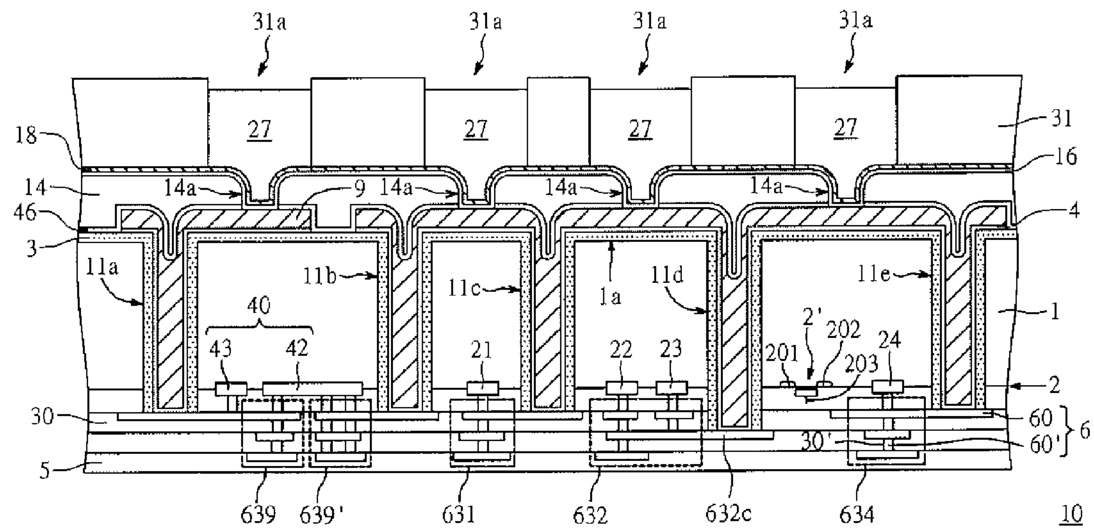
Figure 28F:
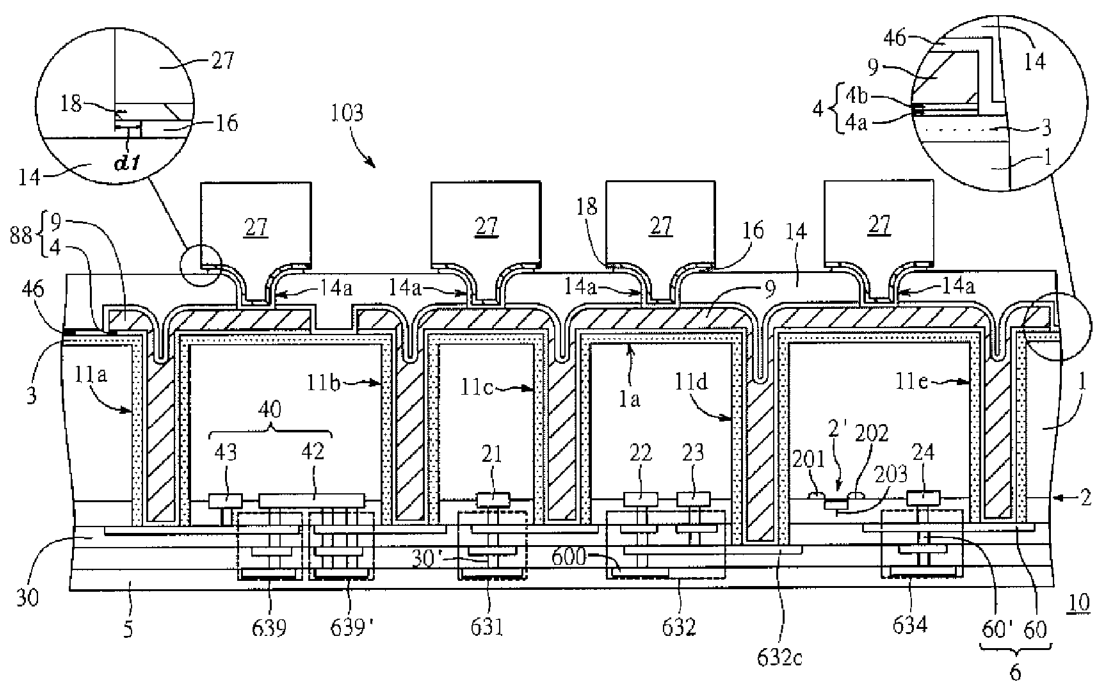
Figure 28G:
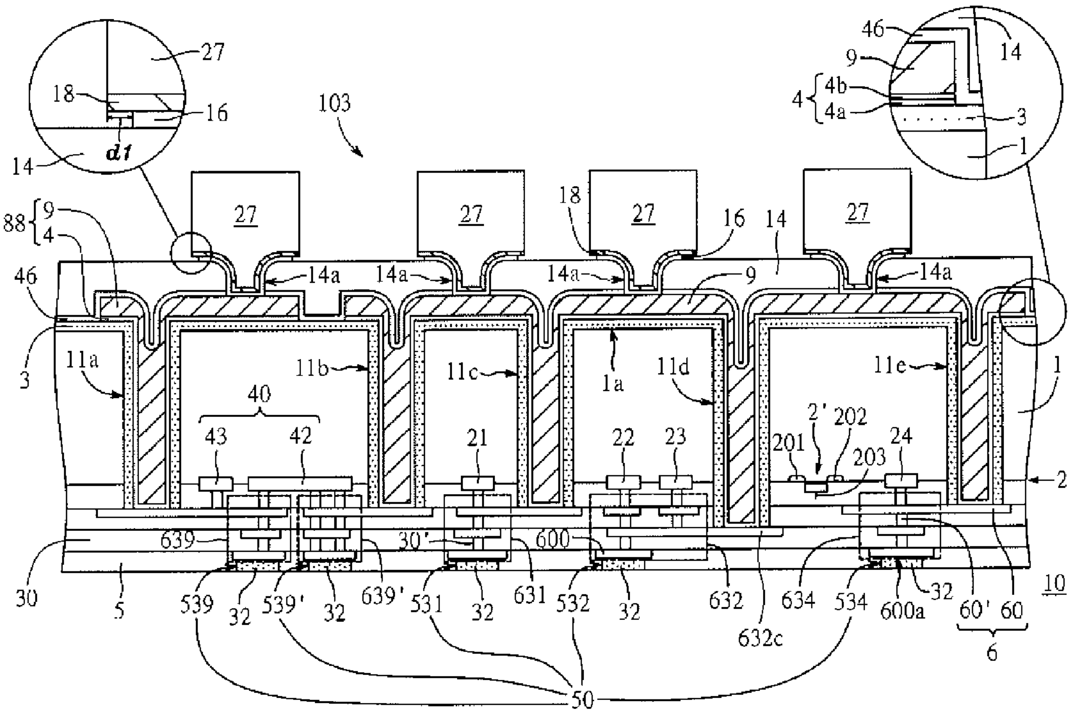
Figure 28H:
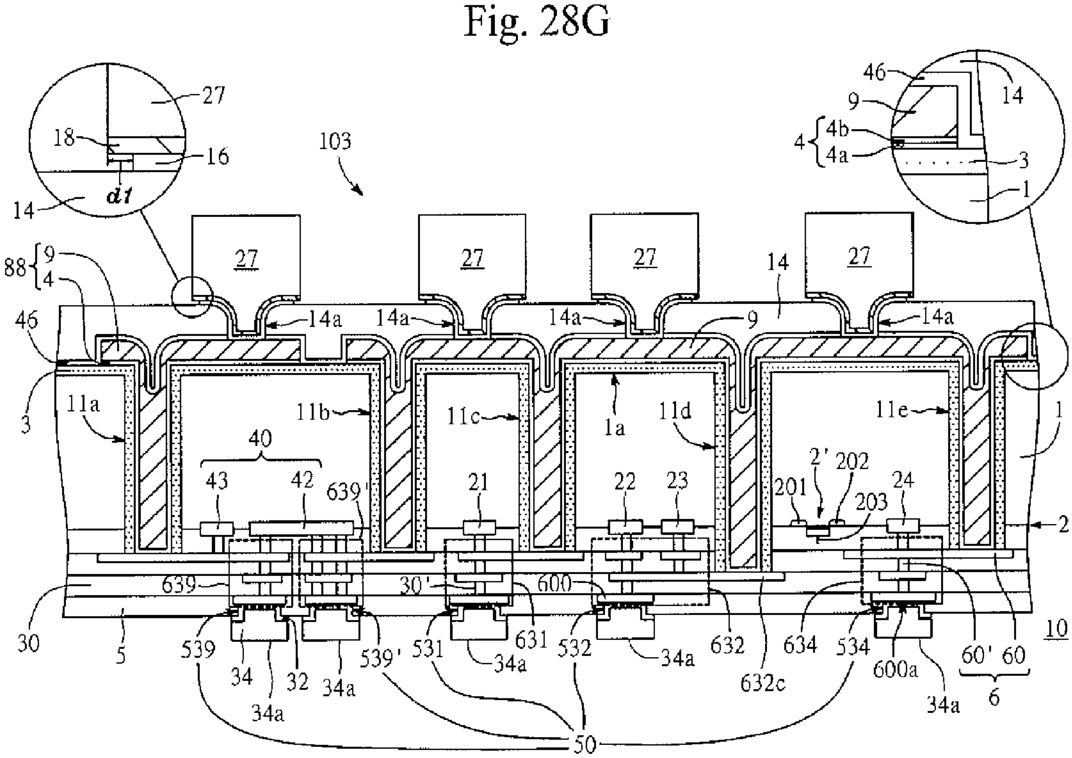
Figure 28I:
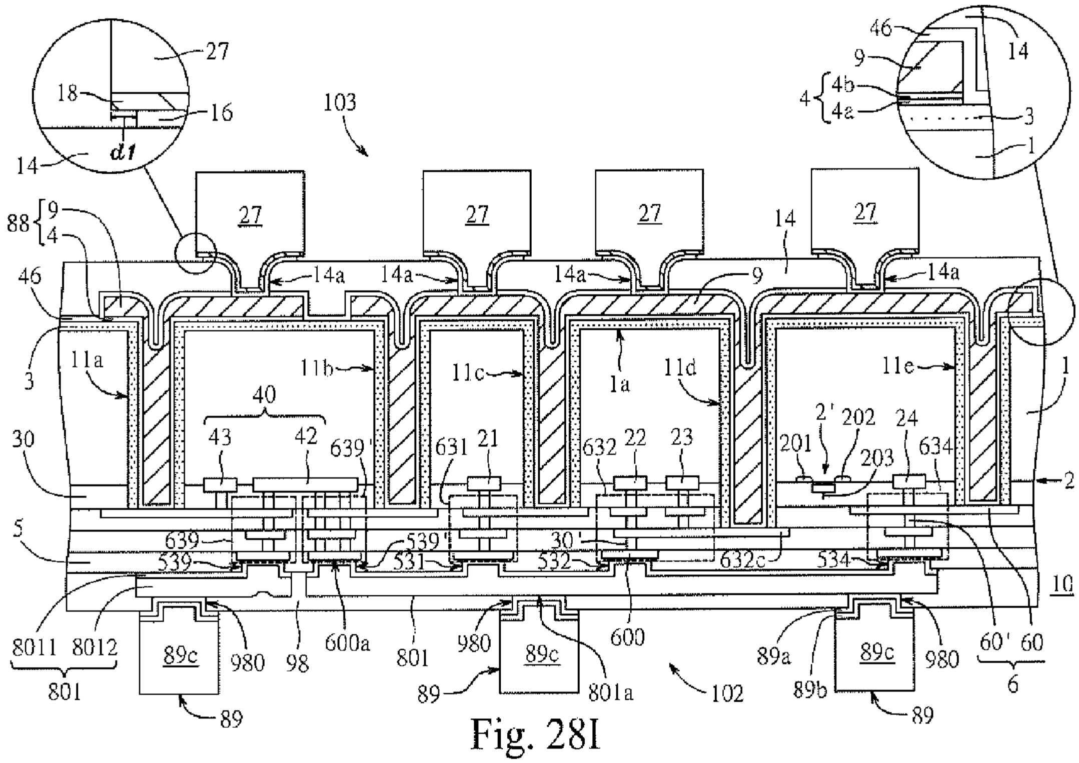

FIGS. 28G-28I are cross-sectional views of semiconductor wafers, according to an embodiment.

Figure 28J:
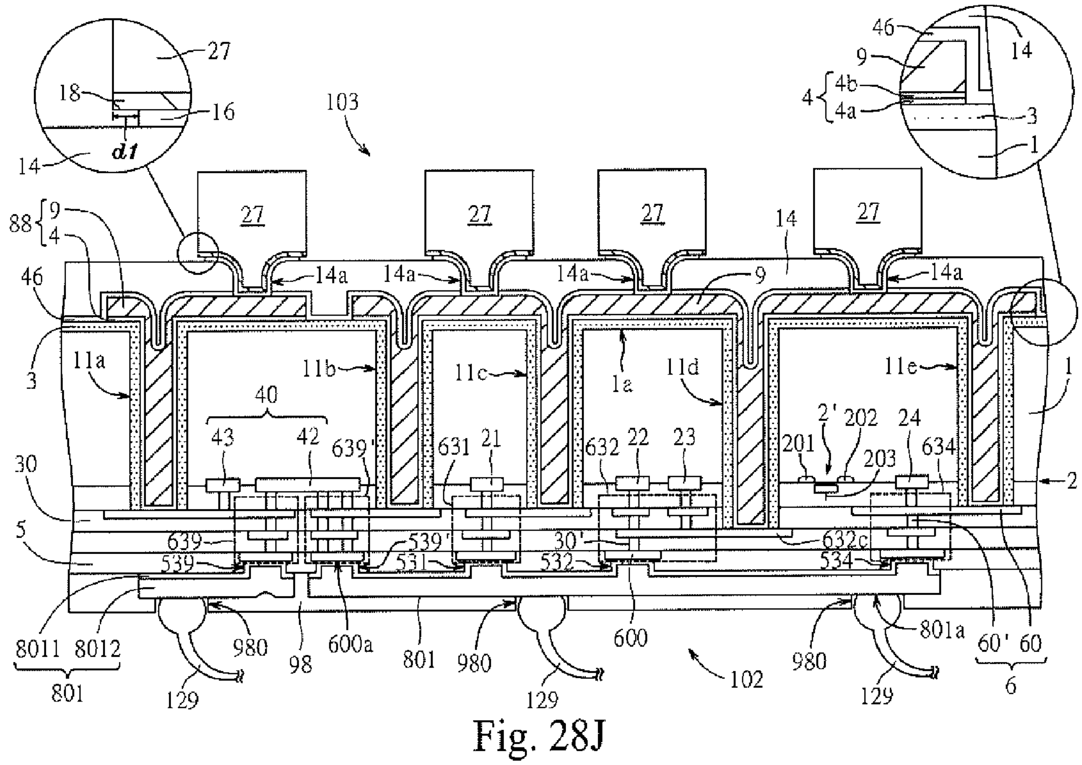

FIG. 28J is a cross-sectional view of a chip package, according to an embodiment.

Figure 29A:
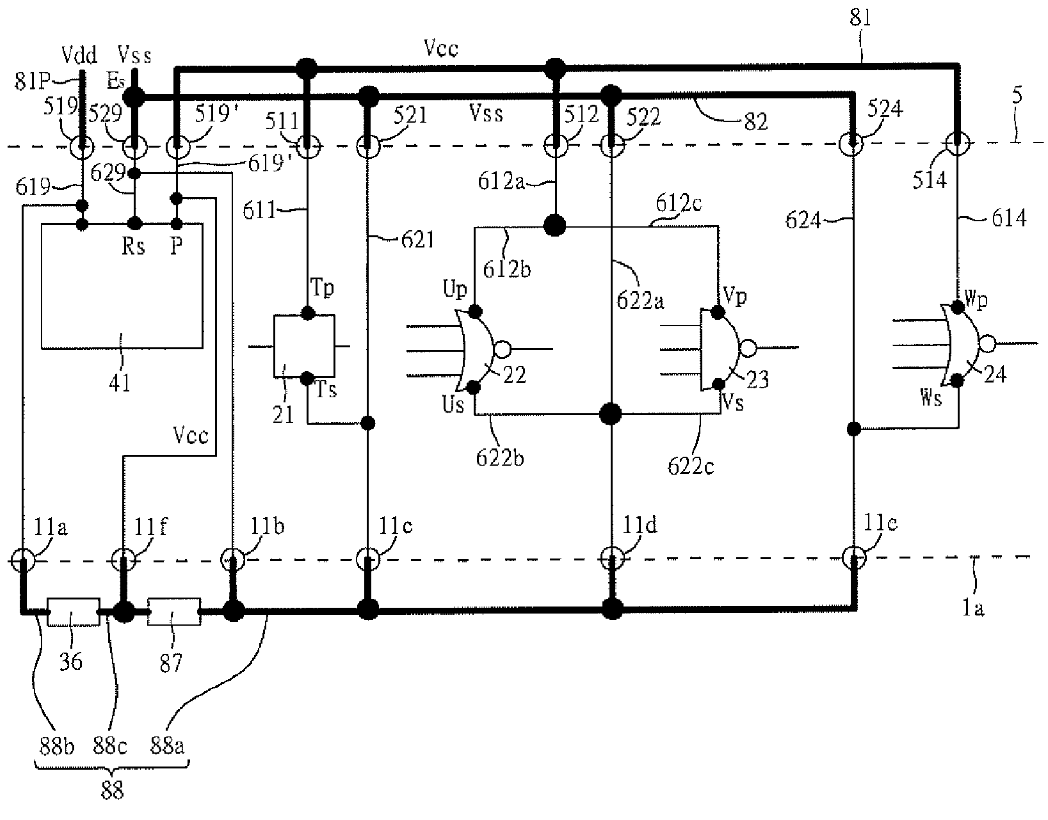
Figure 29B:
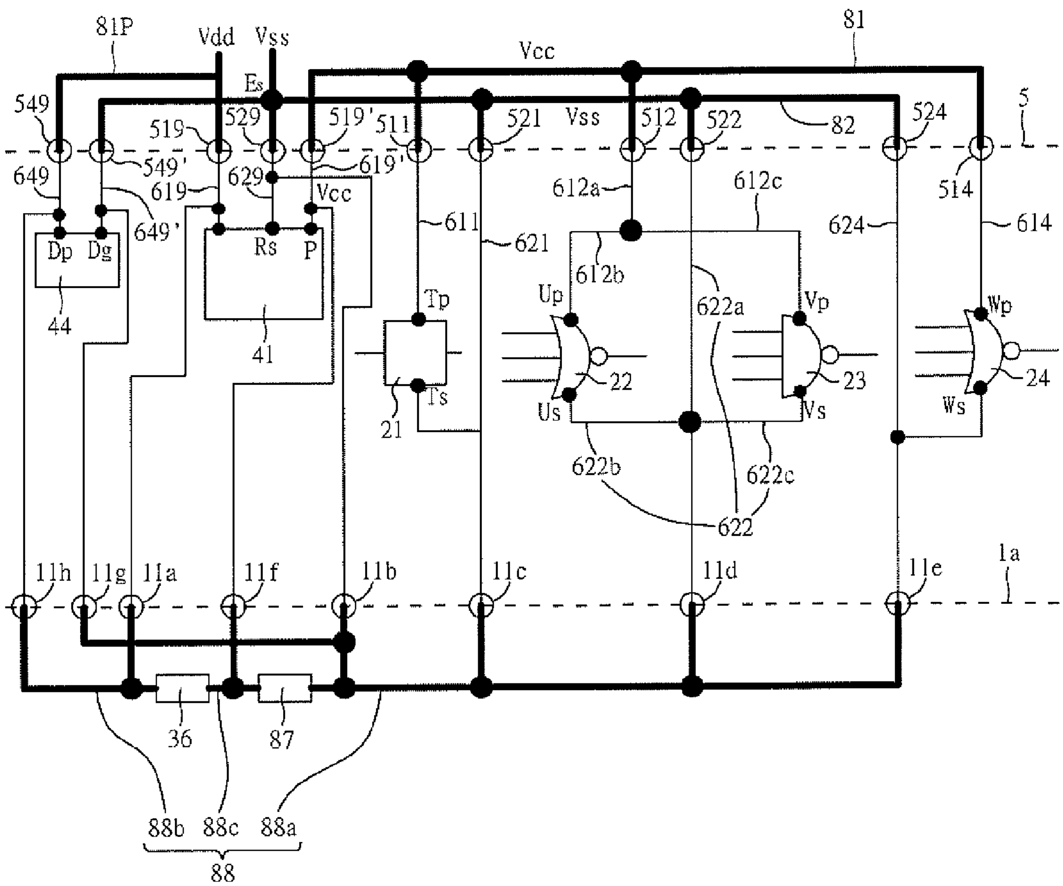
Figure 29C:
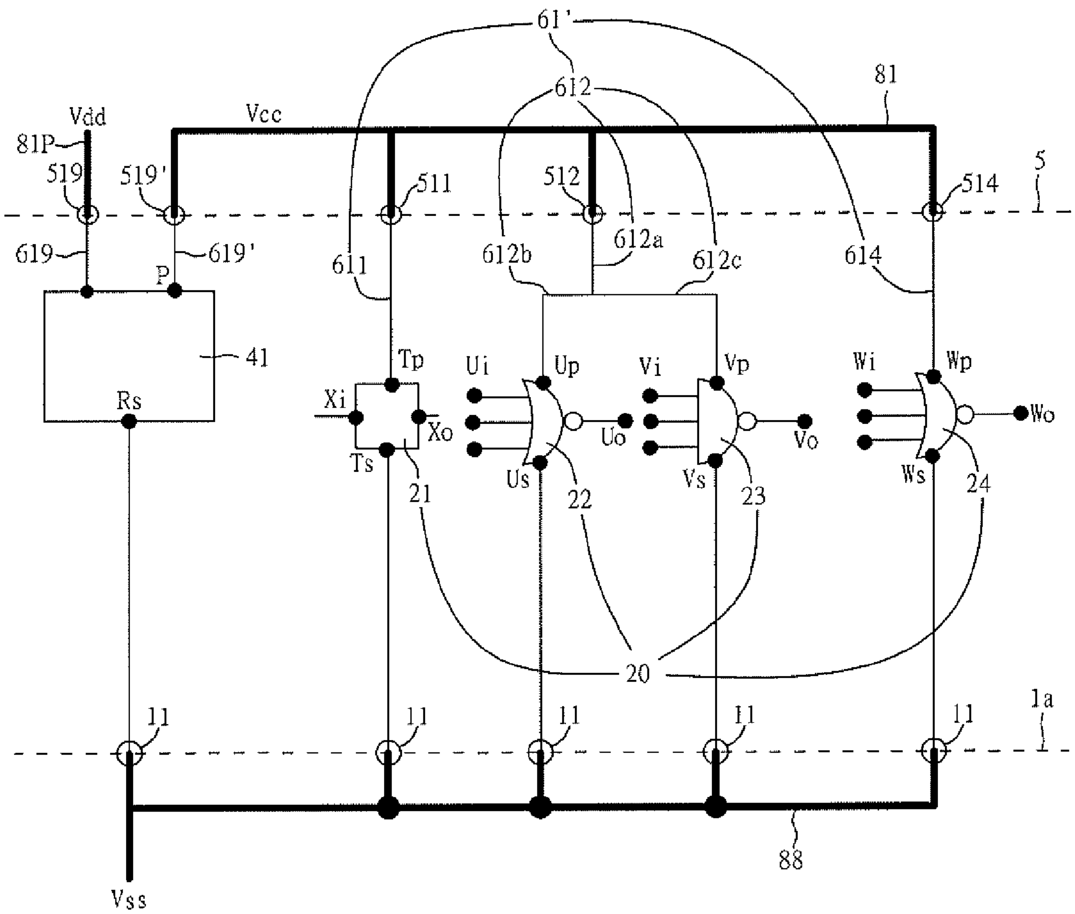
Figure 29D:
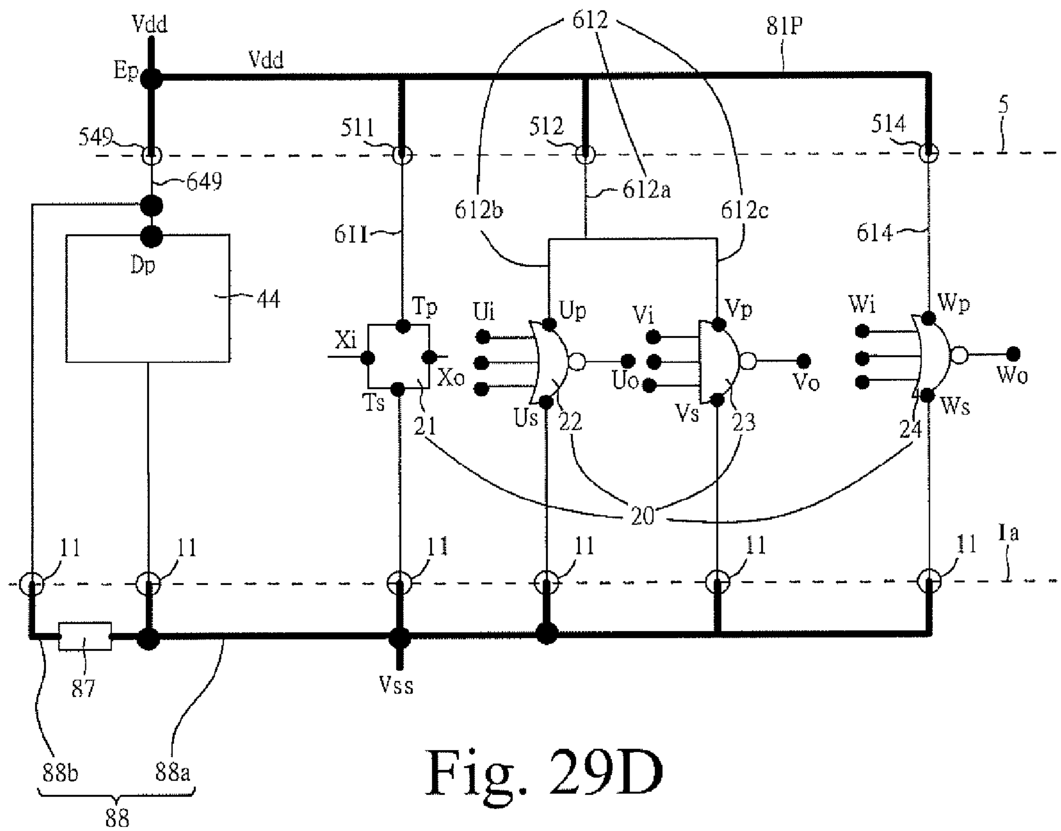
Figure 29E:
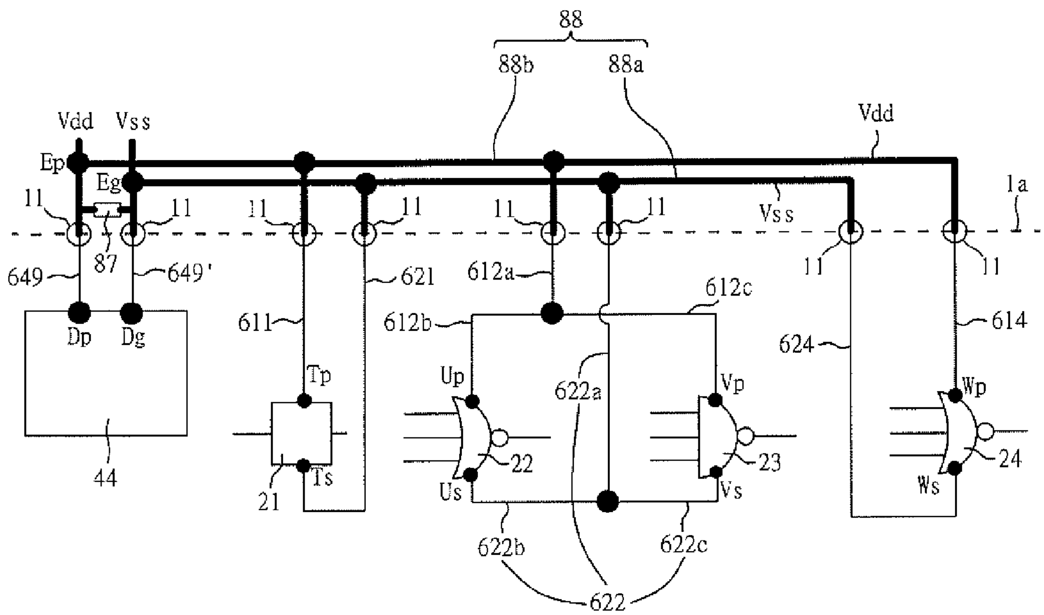
Figure 29F:
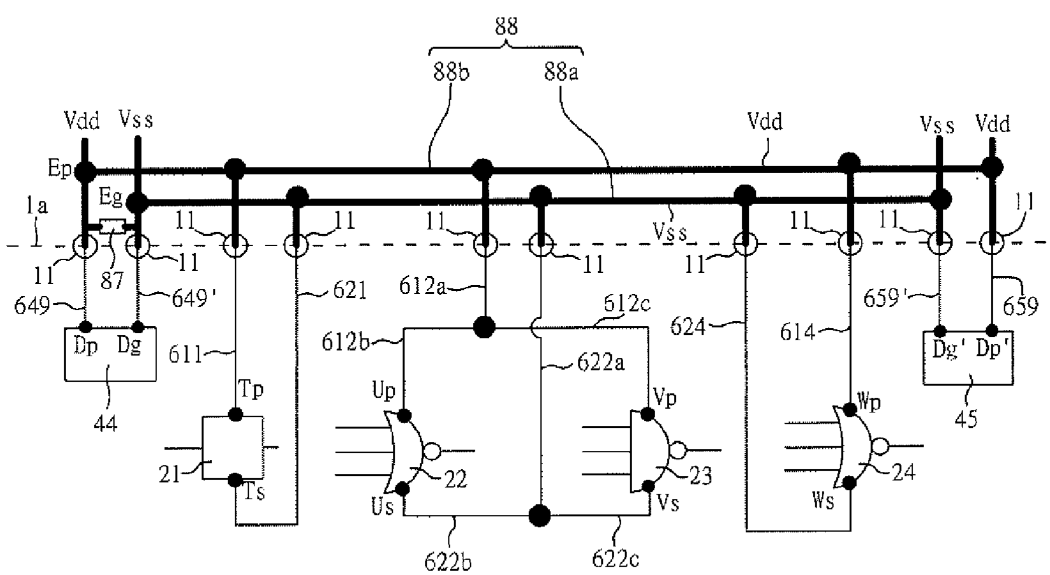
Figure 29G:
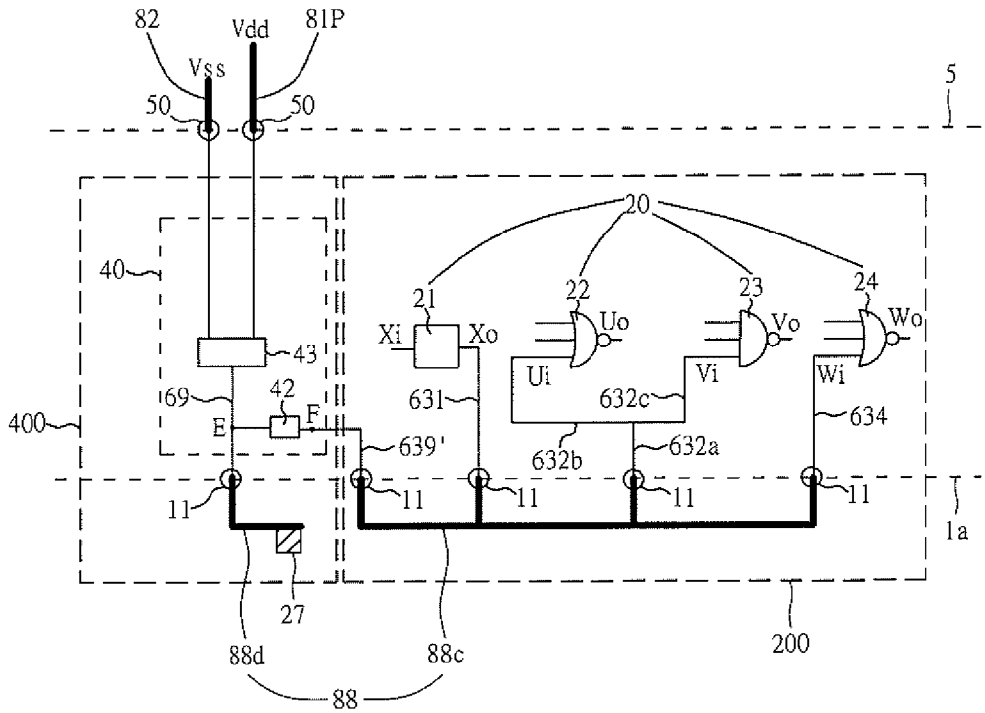
Figure 29H:
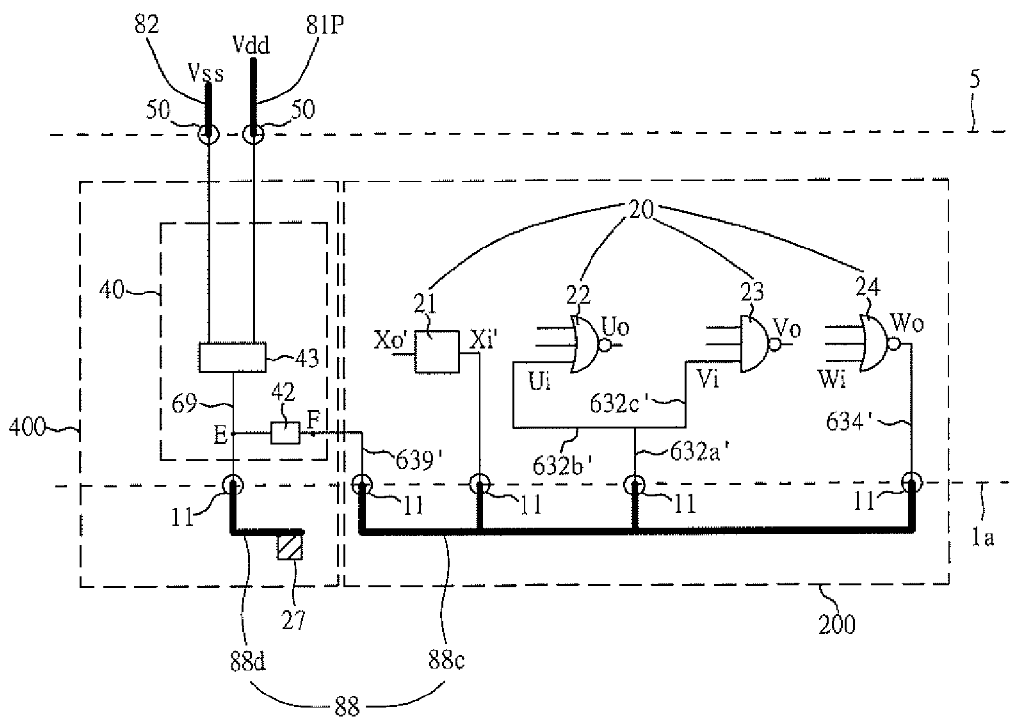
Figure 29I:
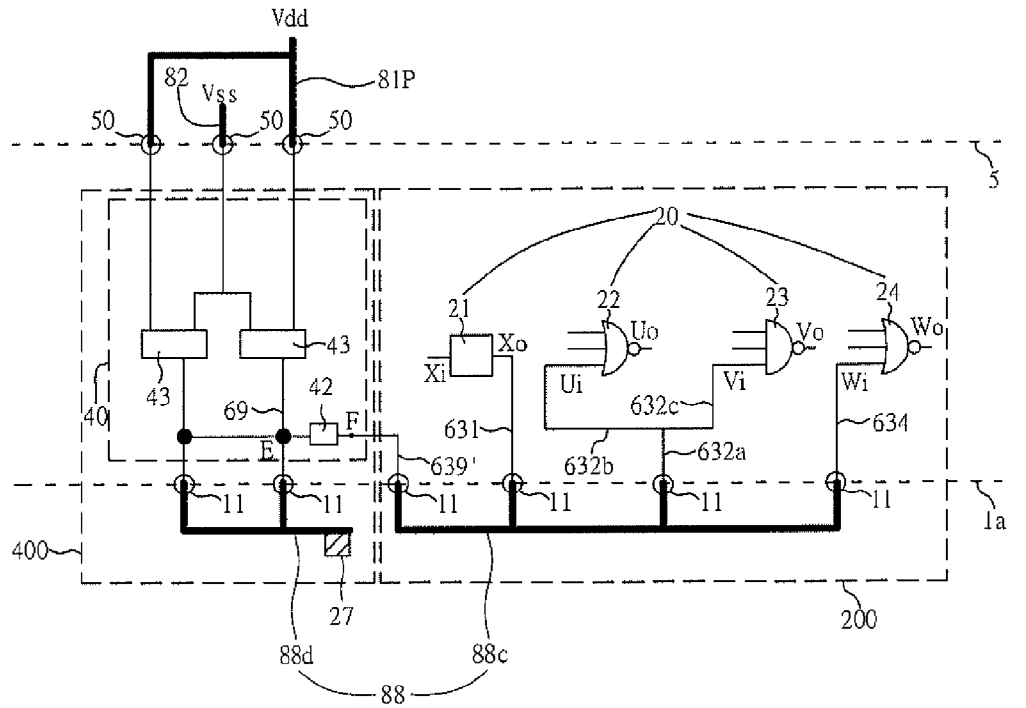
Figure 29J:
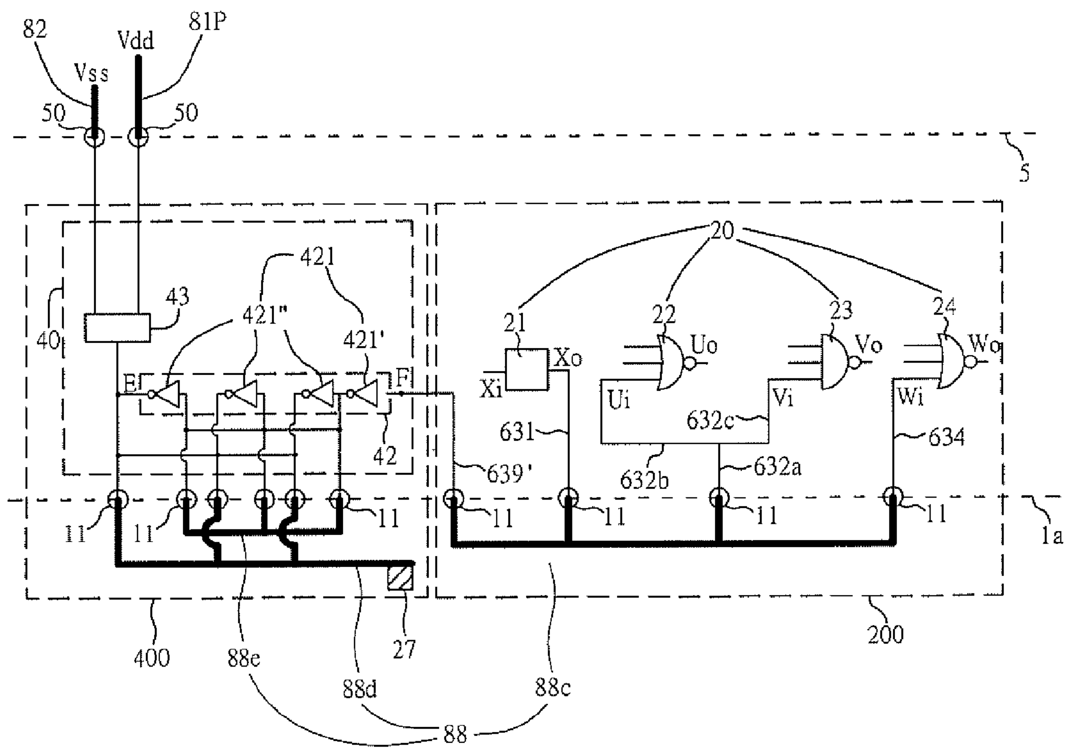
Figure 29K:
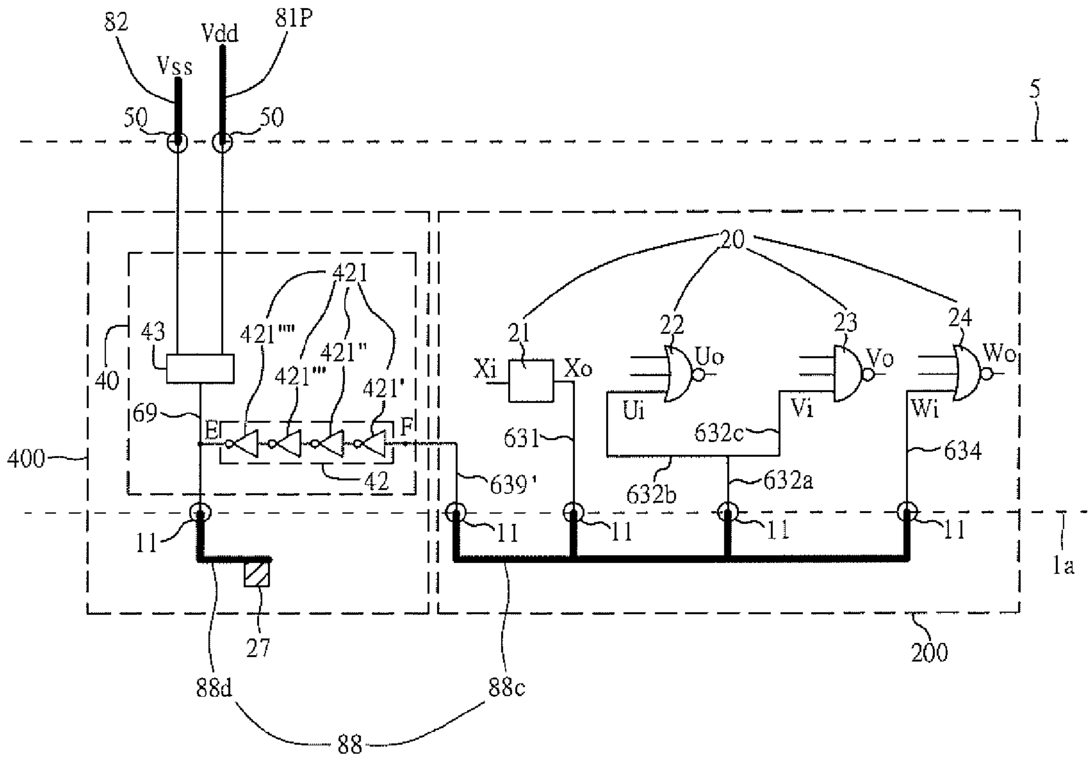
Figure 29L:
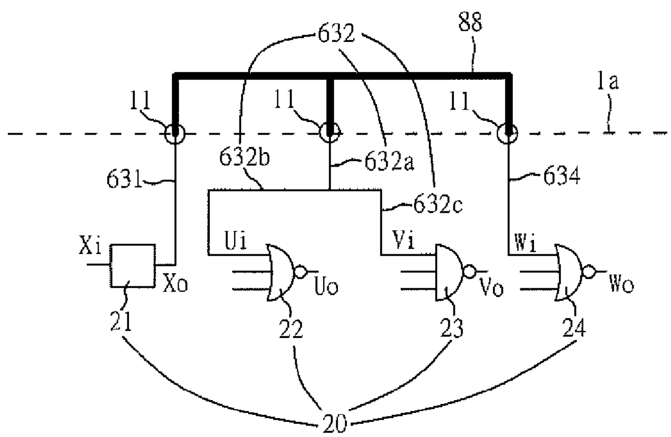
Figure 29M:
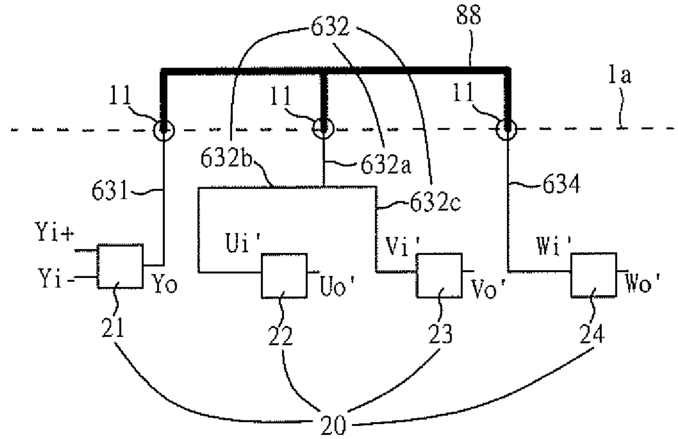
Figure 29N:
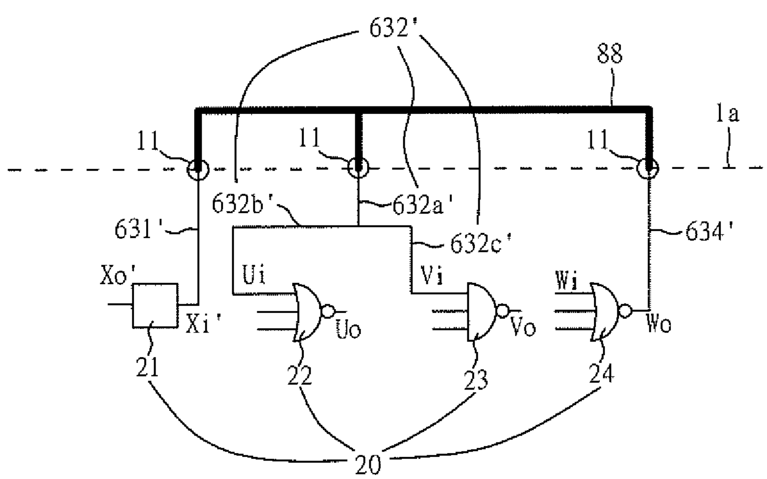
Figure 29O:
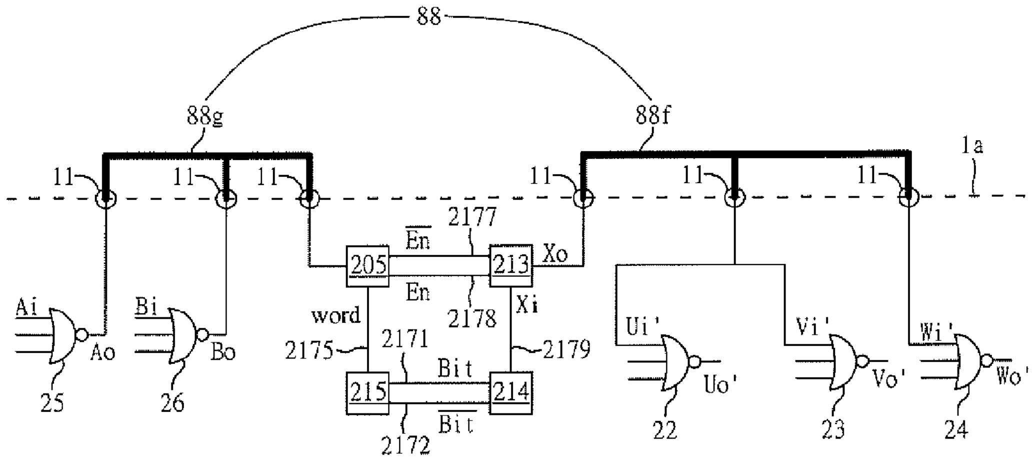
Figure 29P:
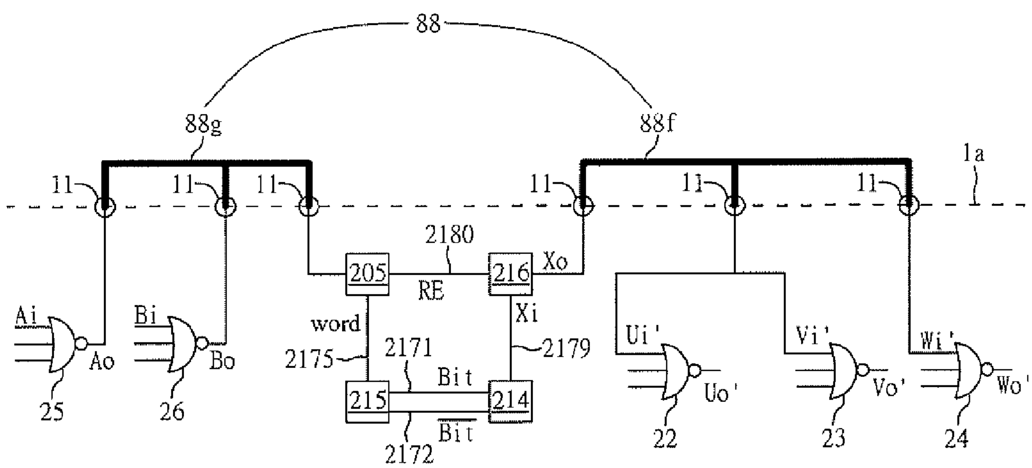
Figure 29Q:
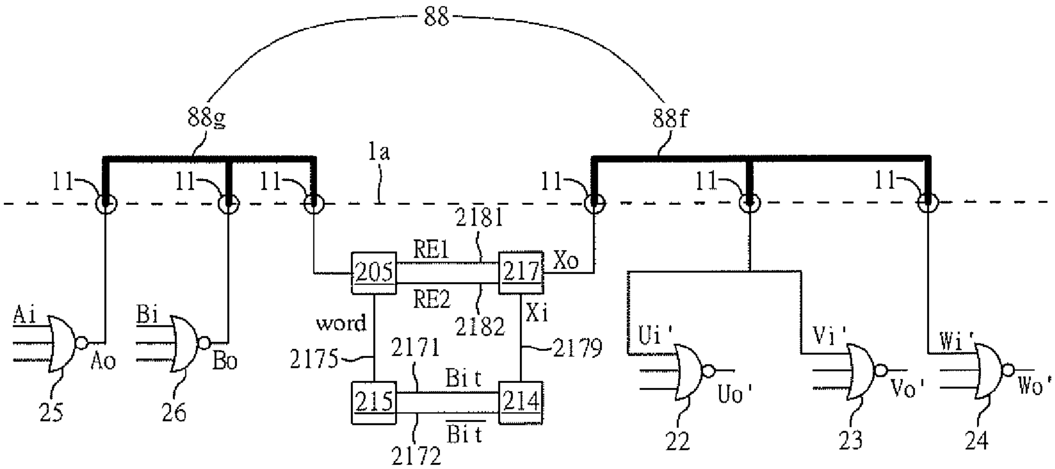
Figure 29R:
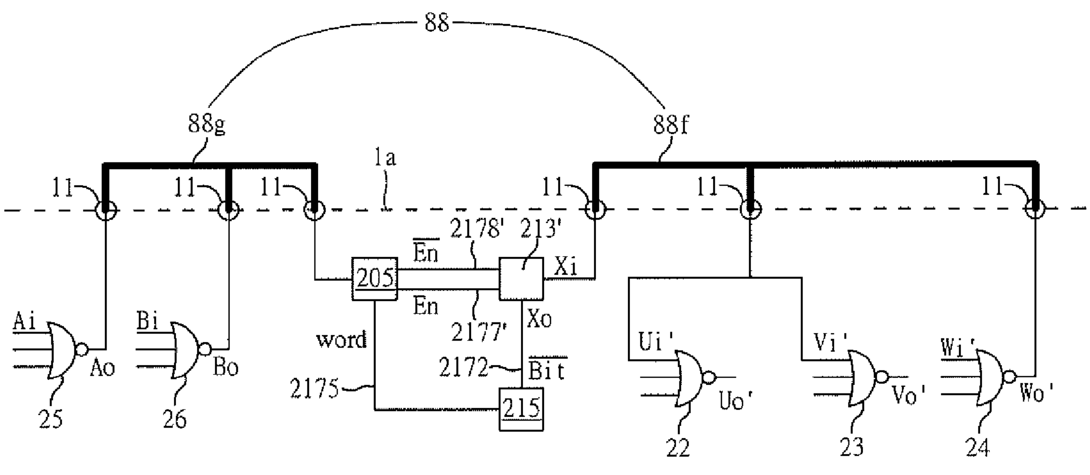
Figure 29S:
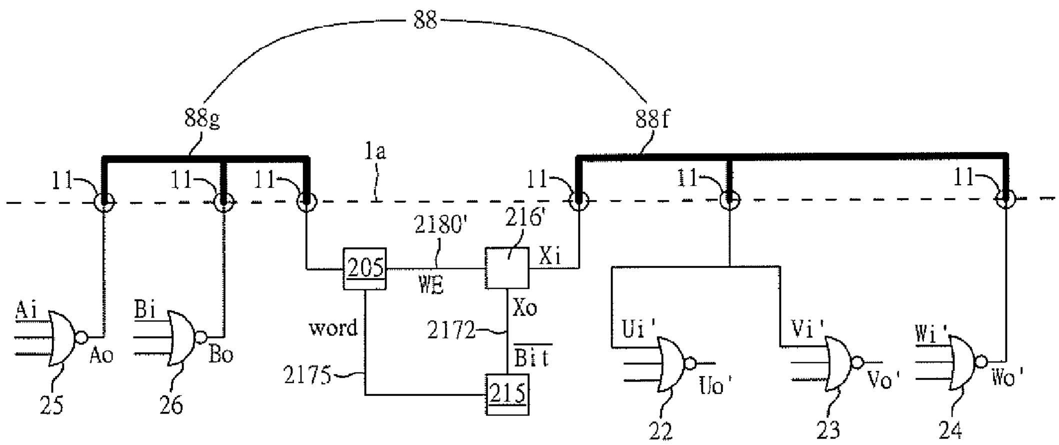
Figure 29T:
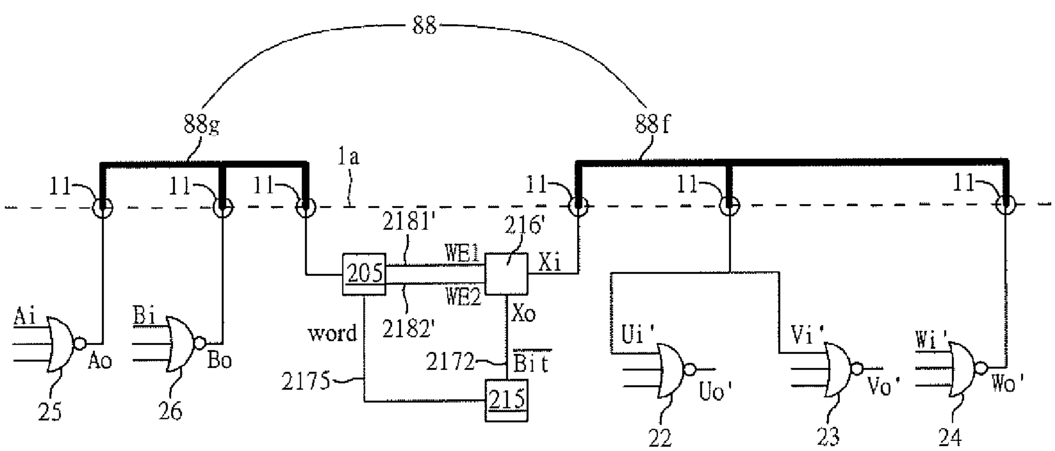

FIGS. 29A-29T show simplified circuit diagrams of semiconductor chips, according to an embodiment.

FIGS. 30A-30I are cross-sectional views showing a process for forming a bottom scheme of a bottom structure technology at a backside of a semiconductor wafer, according to an embodiment.

Figure 30A:
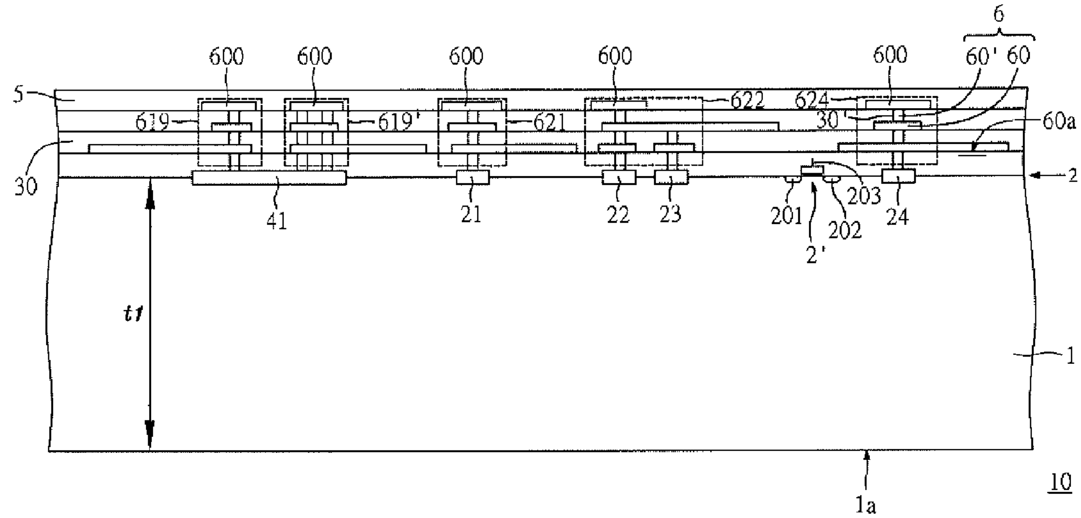
Figure 30B:
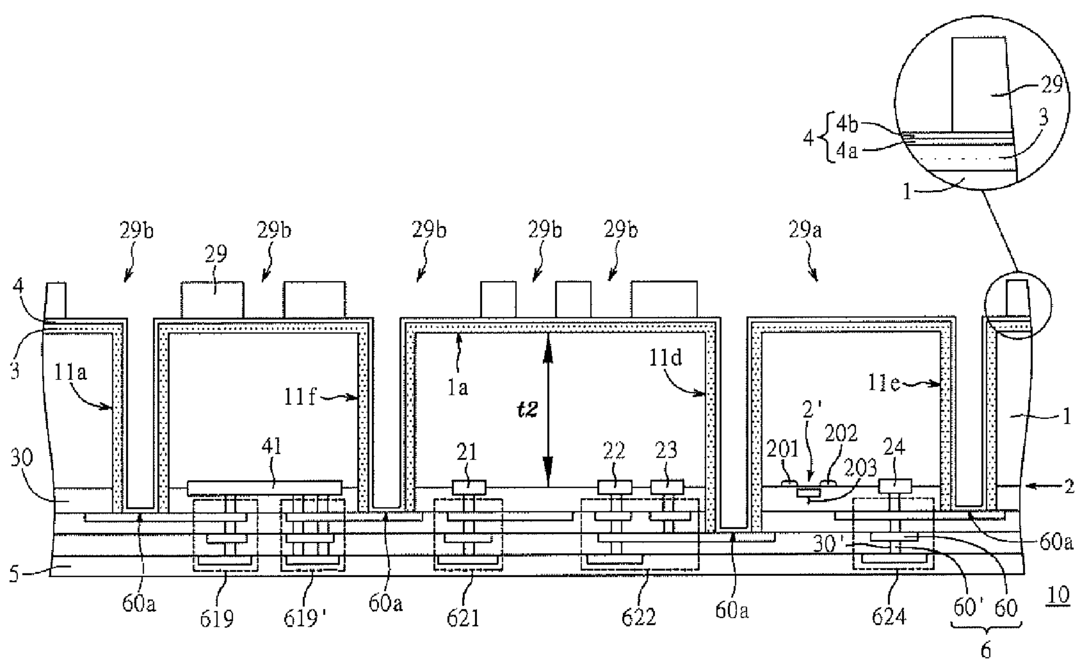
Figure 30C:
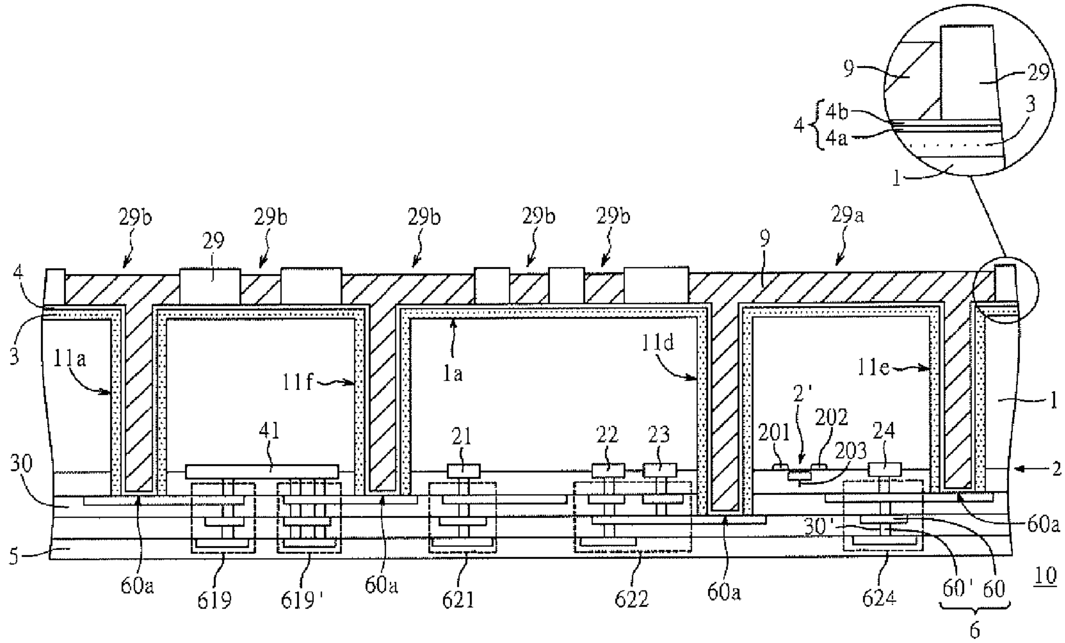
Figure 30D:
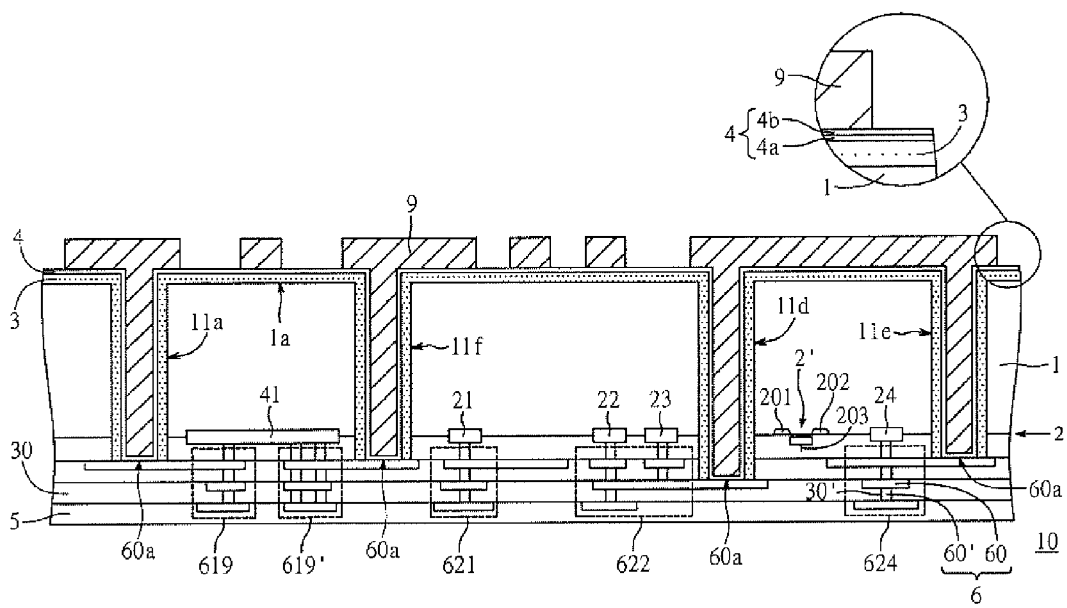
Figure 30E:
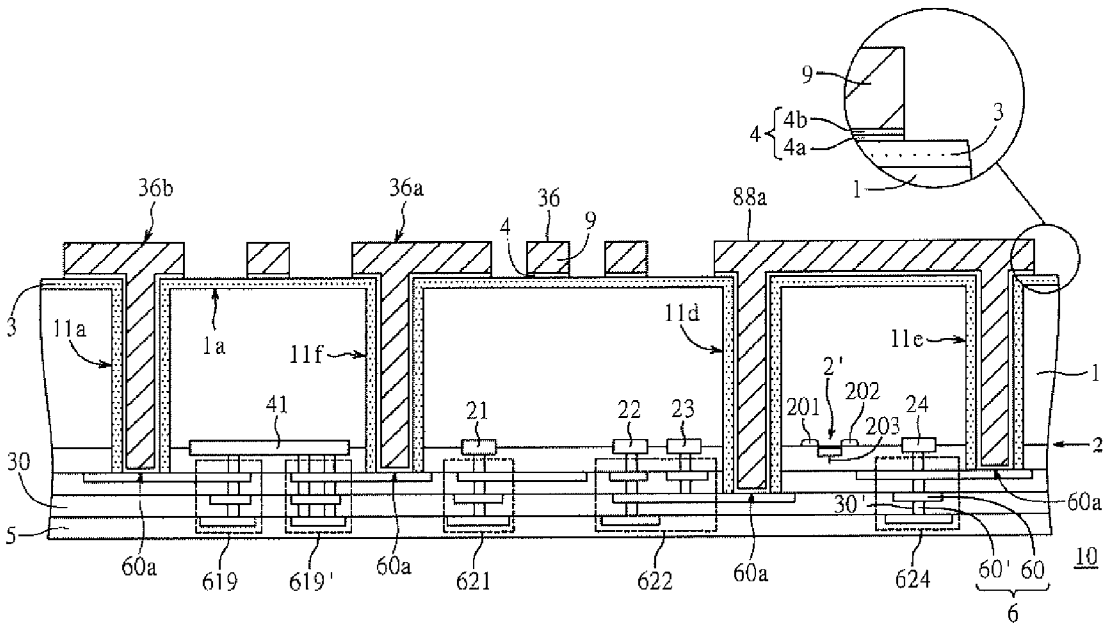
Figure 30F:
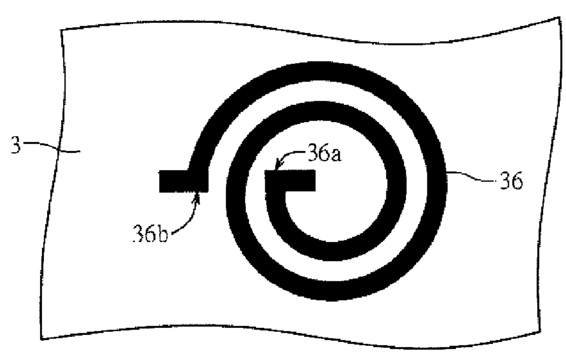
Figure 30G:
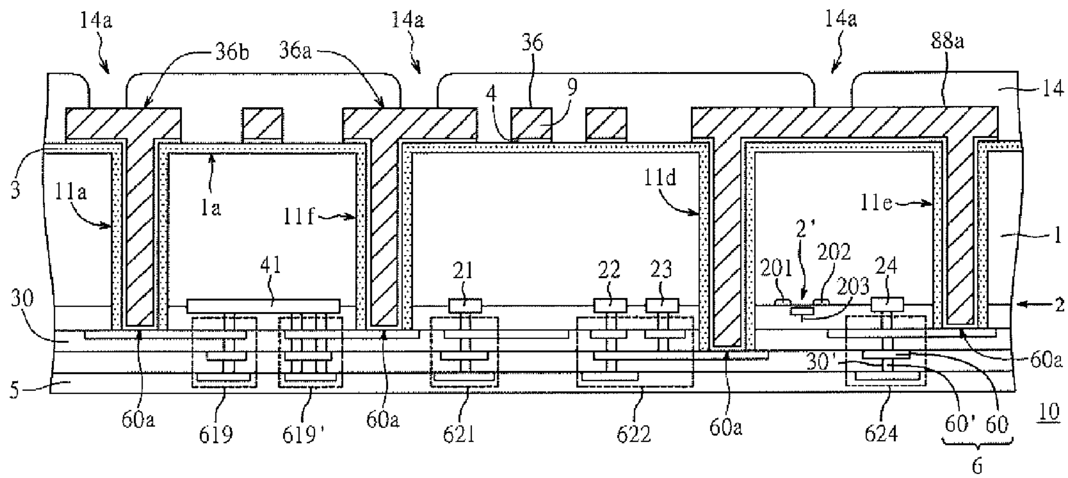
Figure 30H:
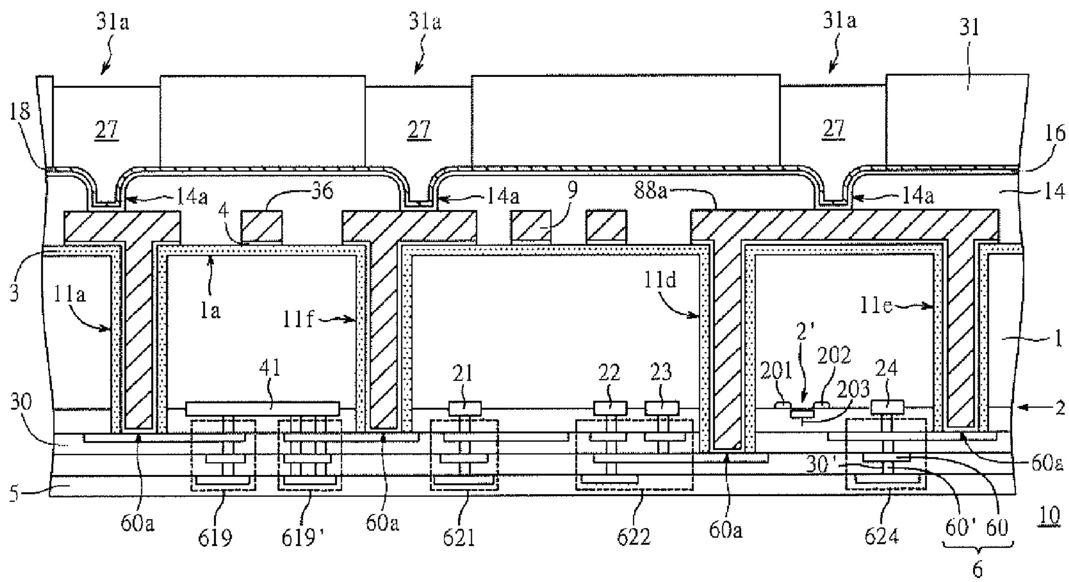
Figure 30I:
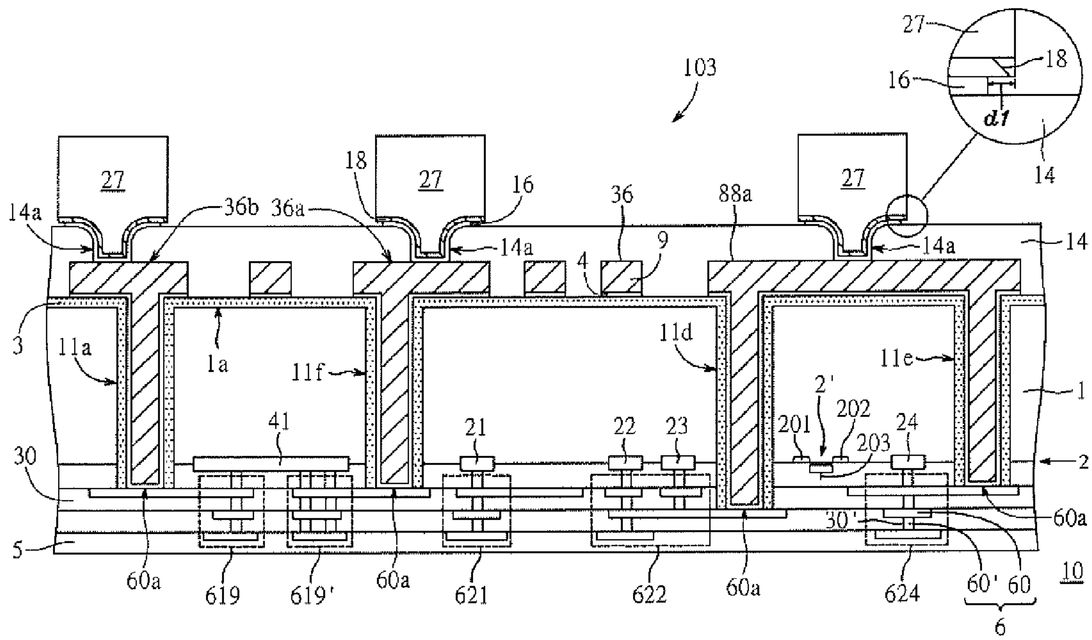
Figure 30J:
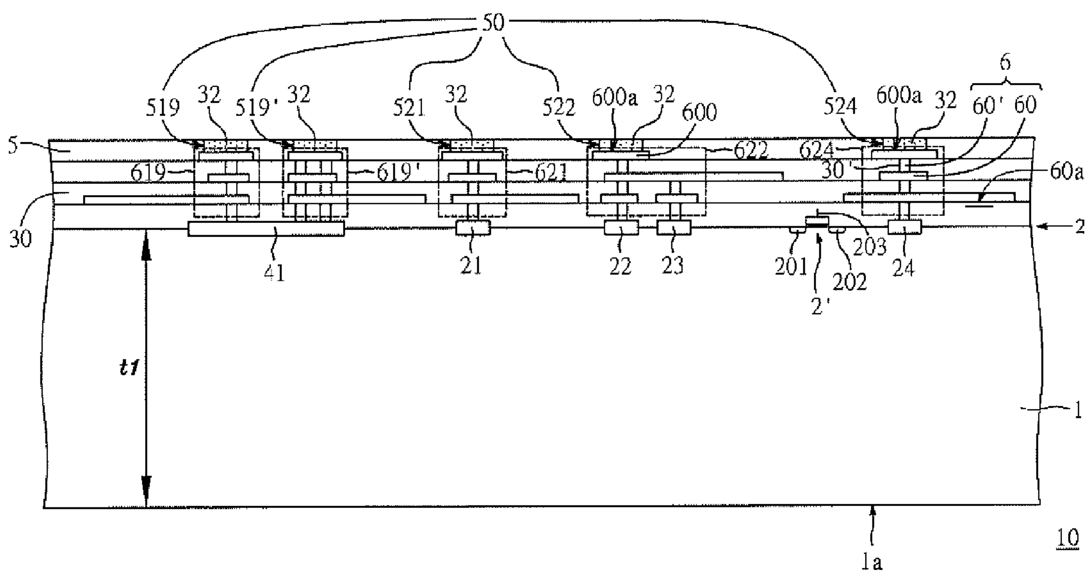
Figure 30K:
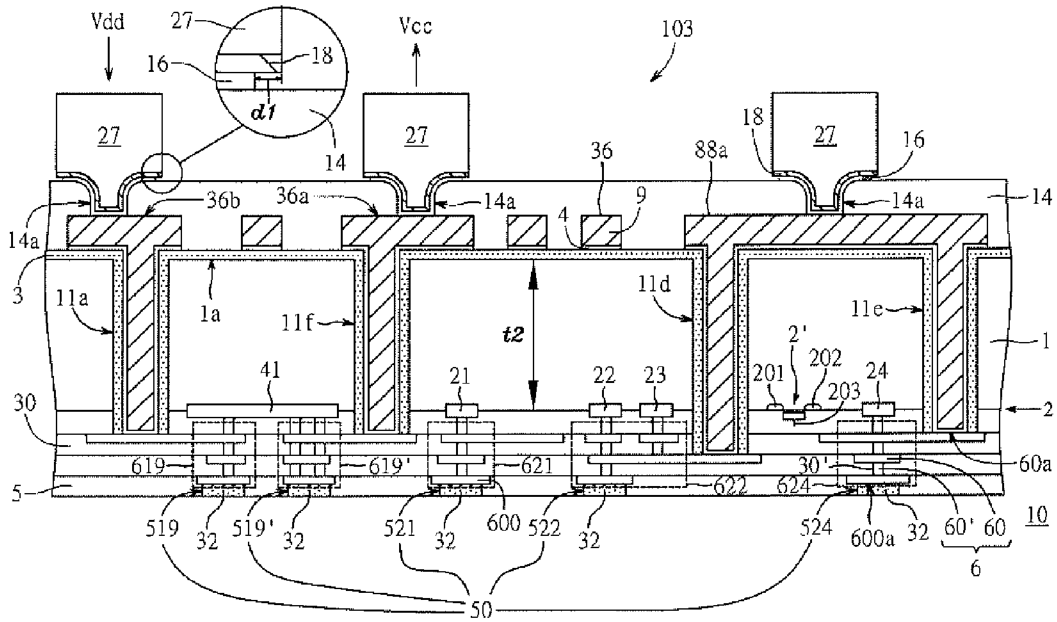
Figure 30L:
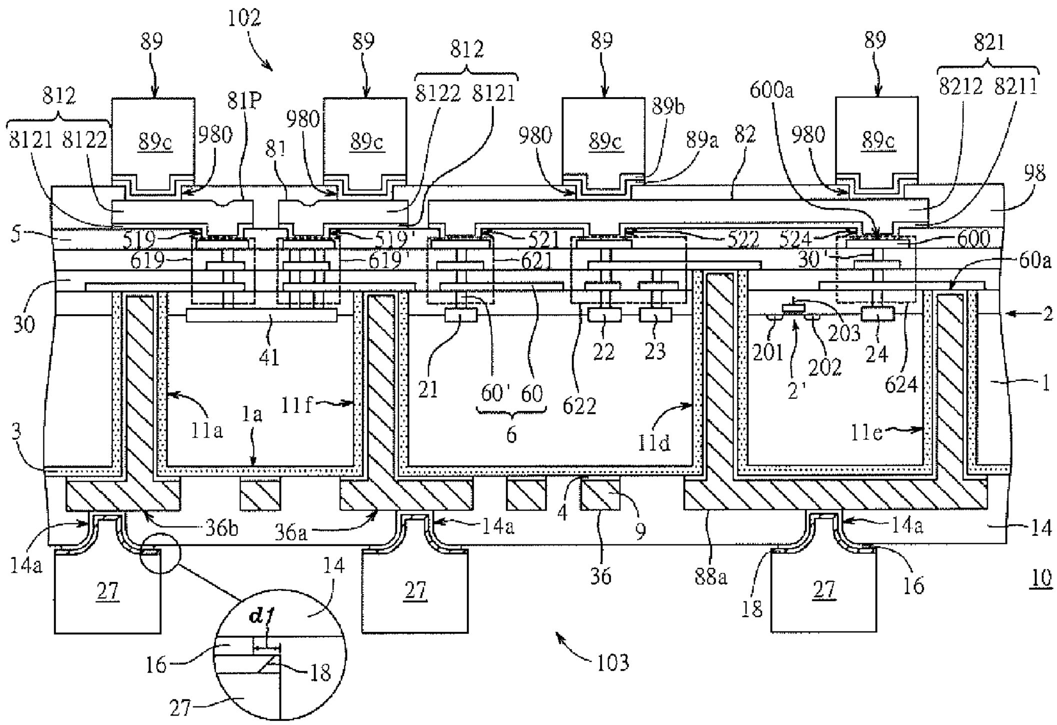

FIGS. 30J, 30K and 30L are cross-sectional views showing a process for forming a semiconductor wafer including an over-passivation scheme at a passivation layer of the semiconductor wafer and a bottom scheme at a backside of the semiconductor wafer, according to an embodiment.

Figure 30M:
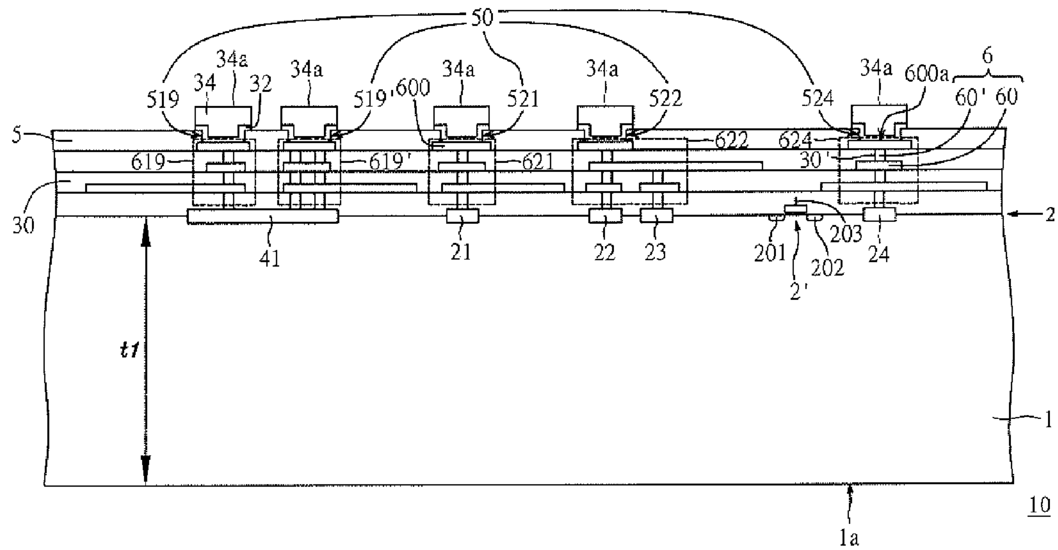
Figure 30N:
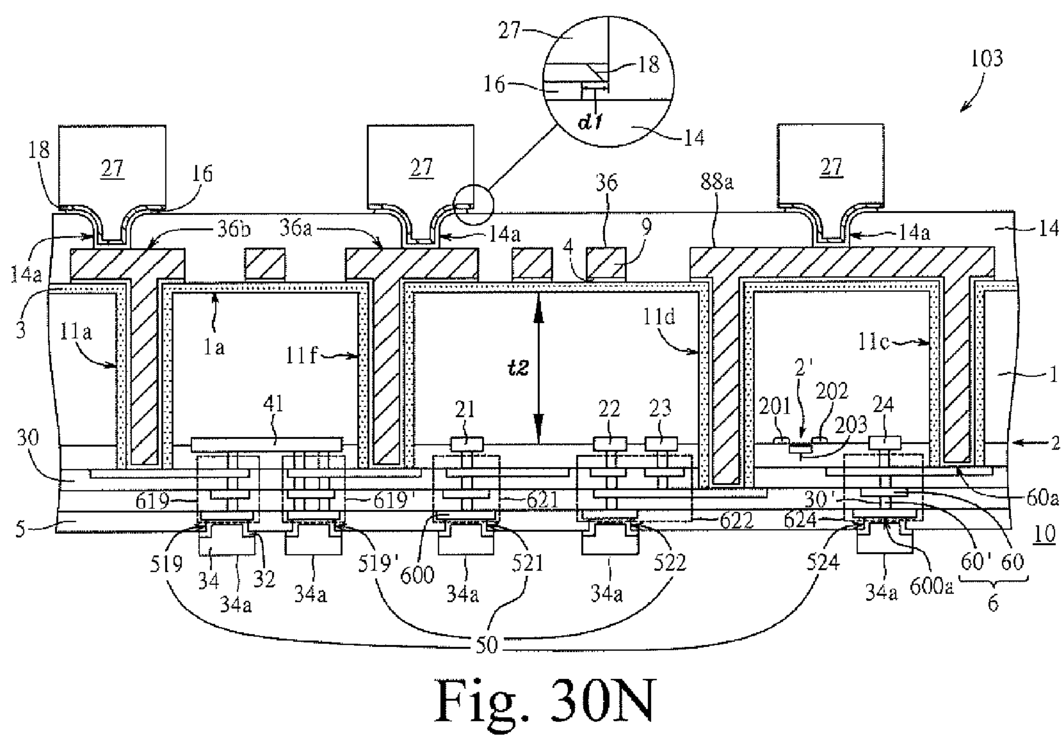

FIGS. 30M and 30N are cross-sectional views showing a process for forming a semiconductor wafer including metal pads, bumps or traces at an active side of a silicon substrate of the semiconductor wafer and including a bottom scheme at a backside of the silicon side, according to an embodiment.

FIGS. 31A-31G are cross-sectional views showing a process for forming a bottom scheme of a bottom structure technology at a backside of a semiconductor wafer, according to an embodiment.

Figure 31A:
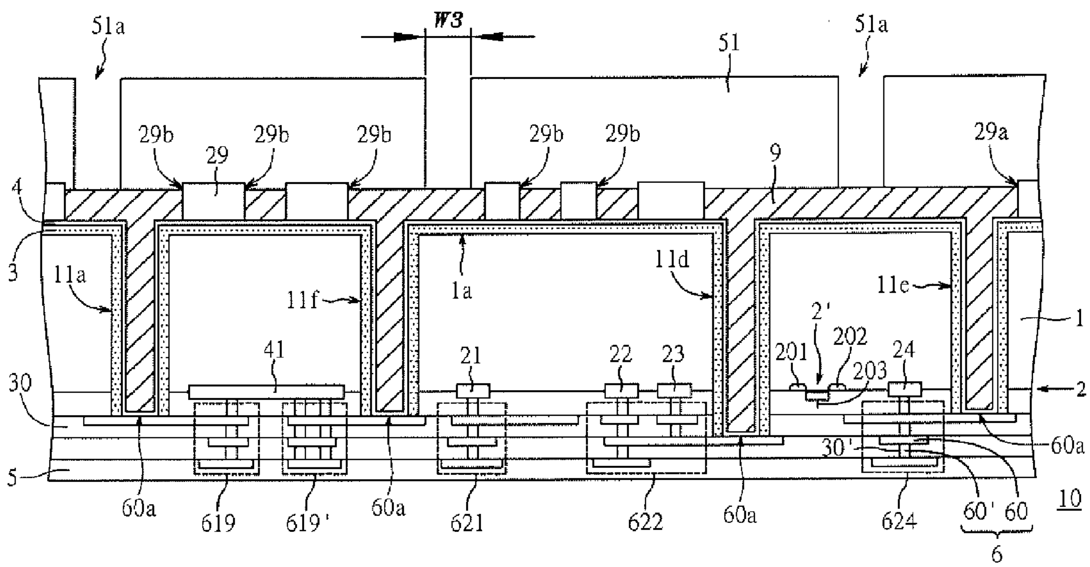
Figure 31B:
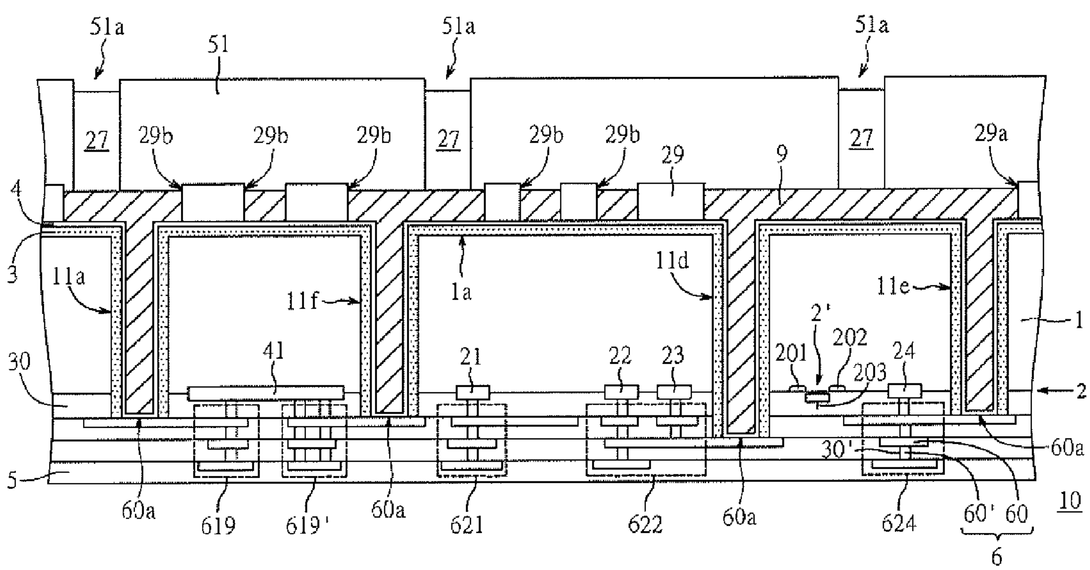
Figure 31C:
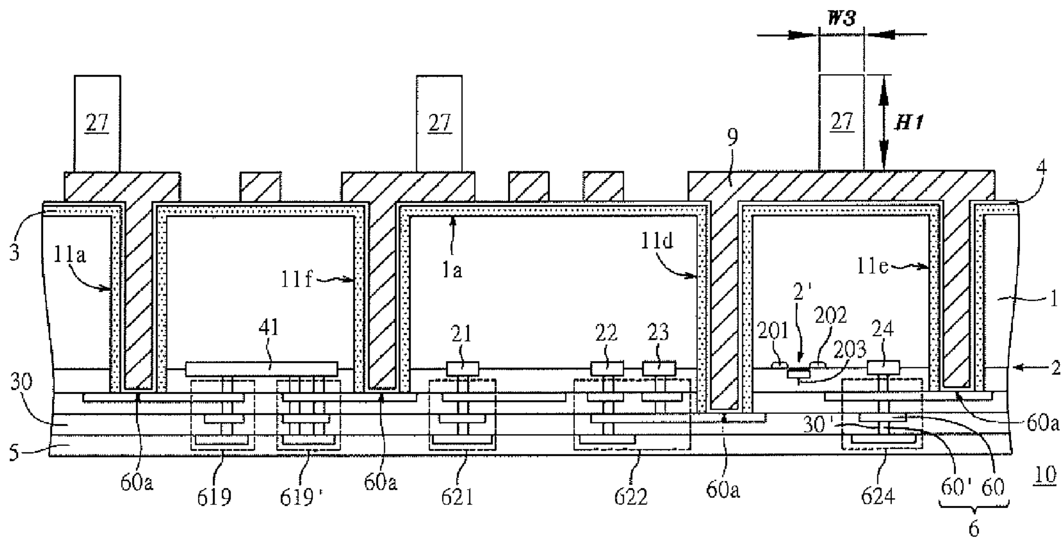
Figure 31D:
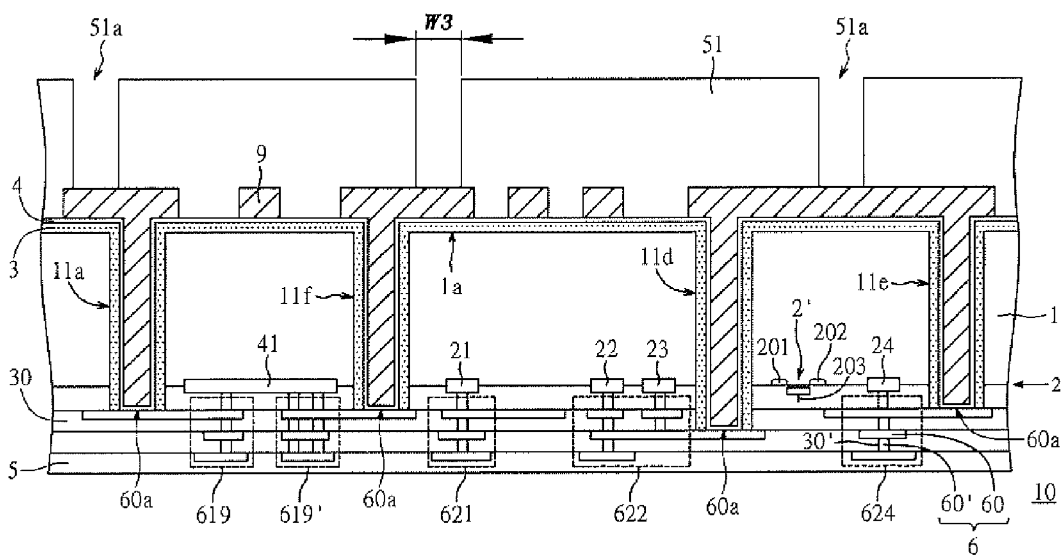
Figure 31E:
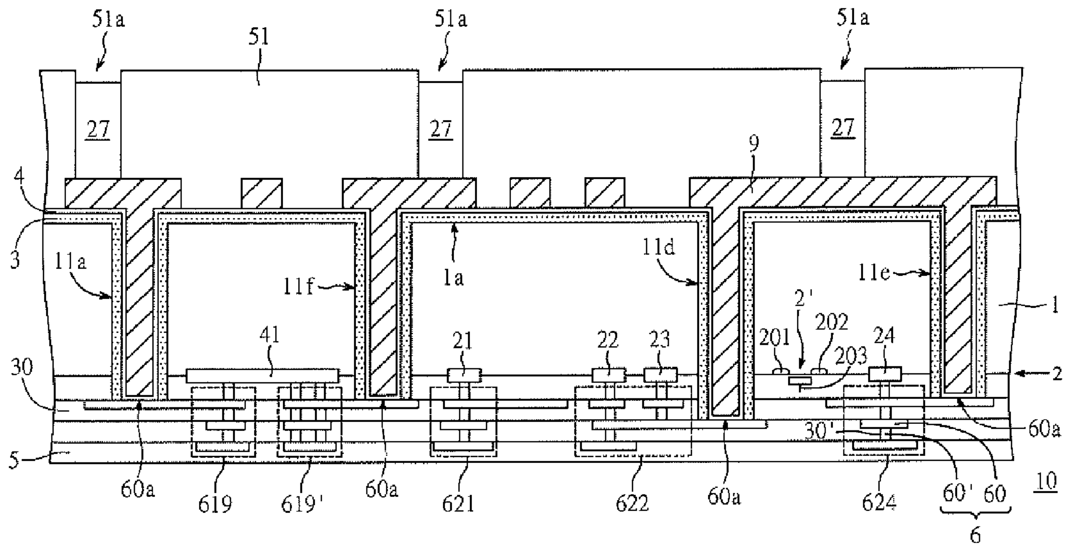
Figure 31F:
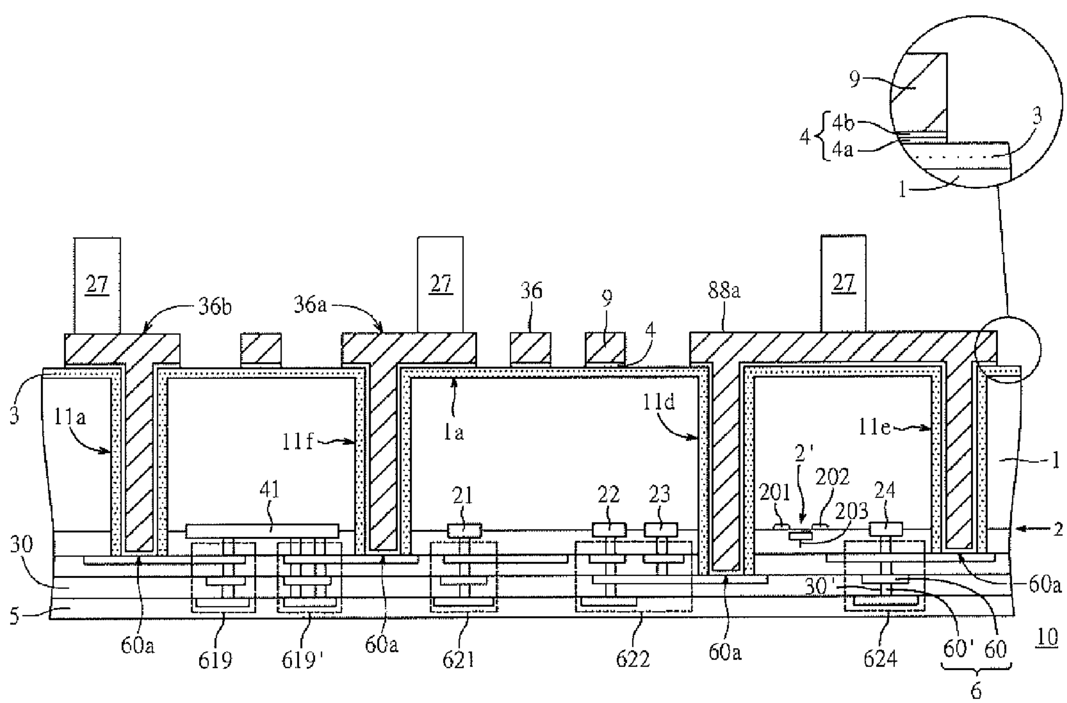
Figure 31G:
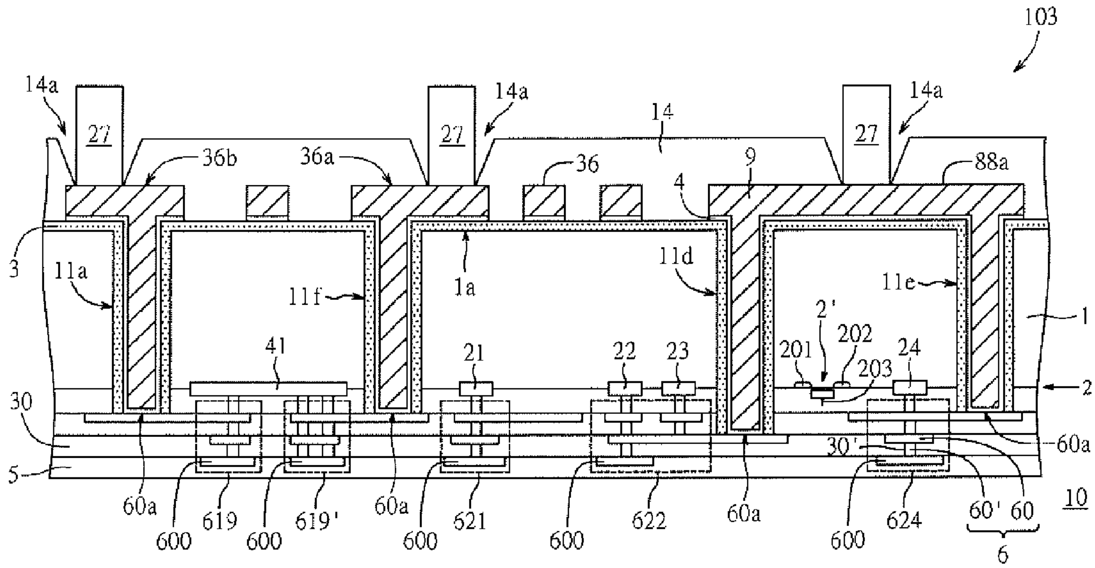
Figure 31H:
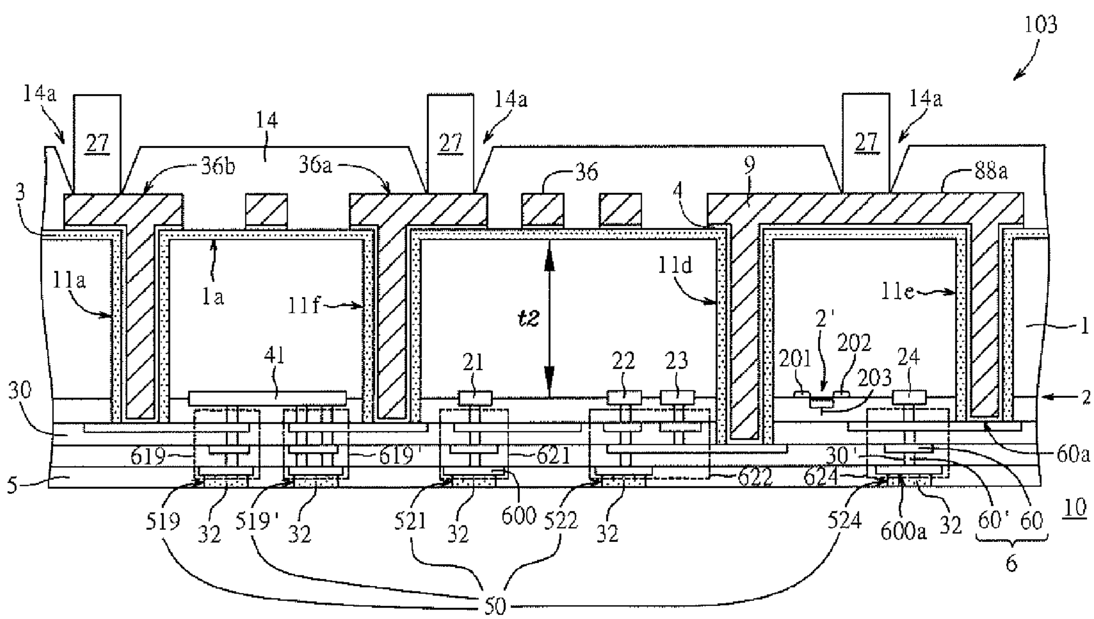
Figure 31I:
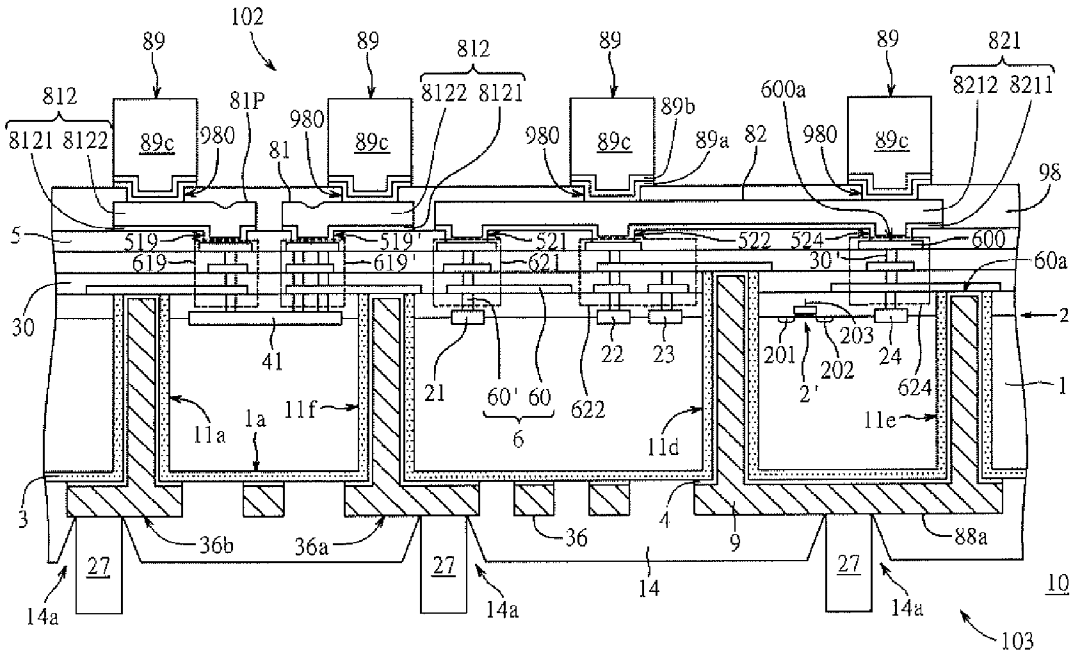

FIGS. 31H and 31I are cross sectional views showing a process for forming a semiconductor wafer including an over-passivation scheme at a passivation layer of the semiconductor wafer and a bottom scheme at a backside of the semiconductor wafer, according to an embodiment.

Figure 31J:
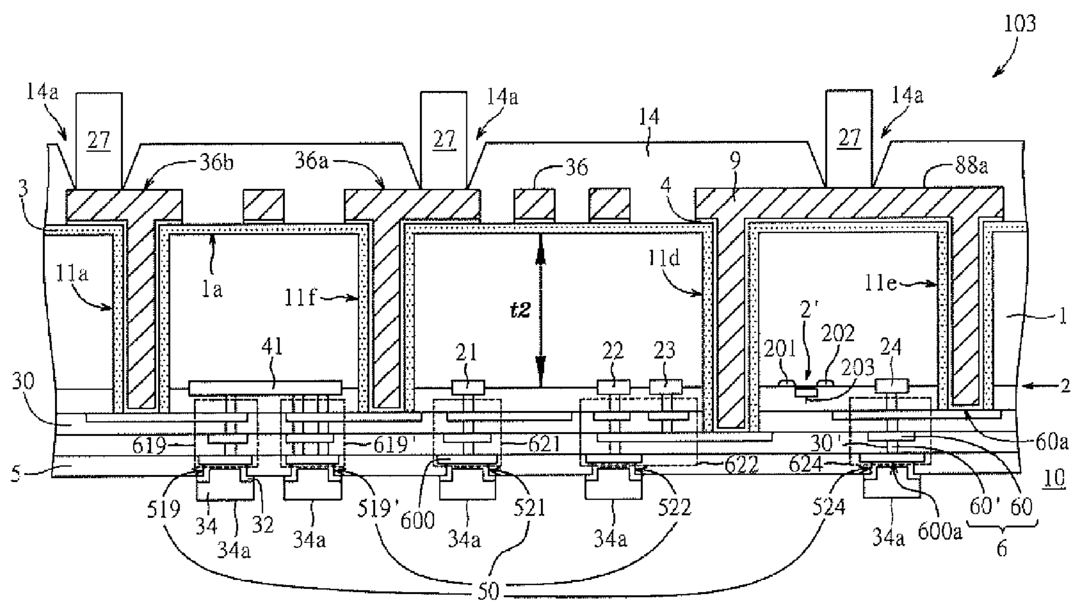

FIG. 31J is a cross sectional view showing a process for forming a semiconductor wafer including metal pads, bumps or traces at an active side of a silicon substrate of the semiconductor wafer and including a bottom scheme at a backside of the silicon side, according to an embodiment.

Figure 32A:
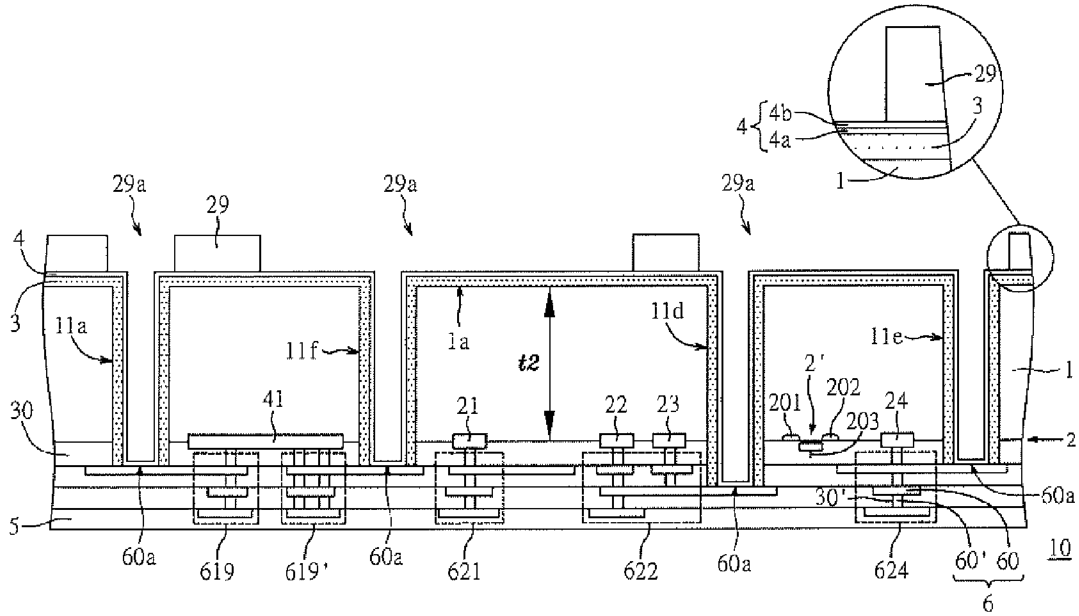
Figure 32B:
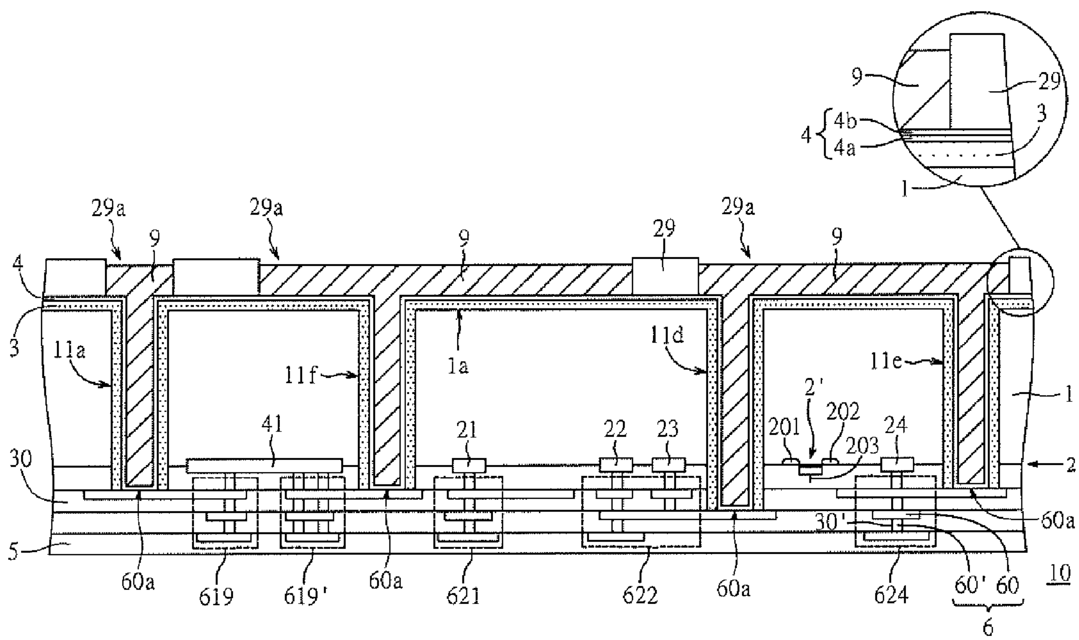
Figure 32C:
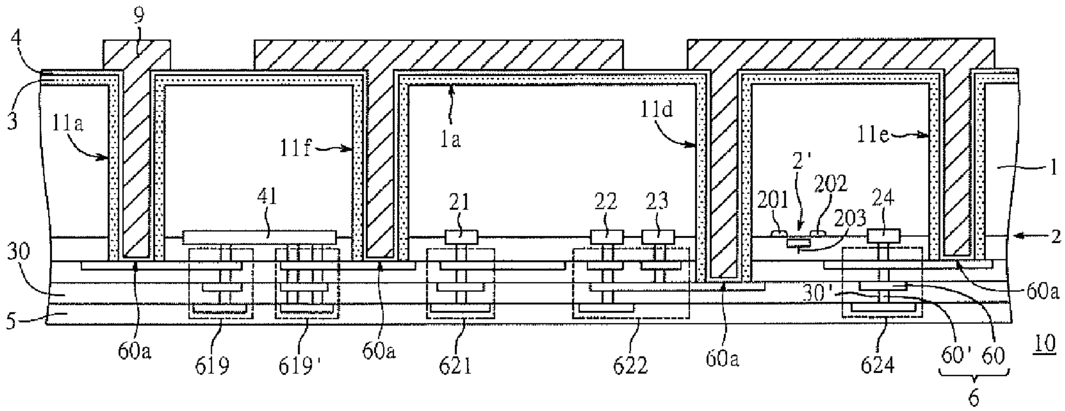
Figure 32D:
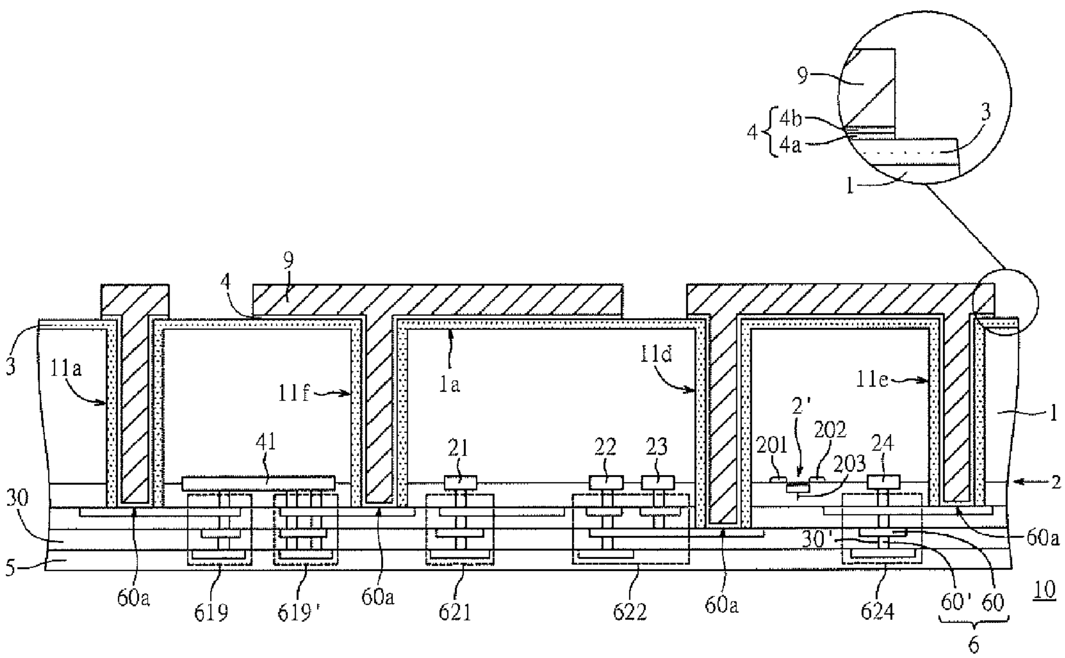
Figure 32E:
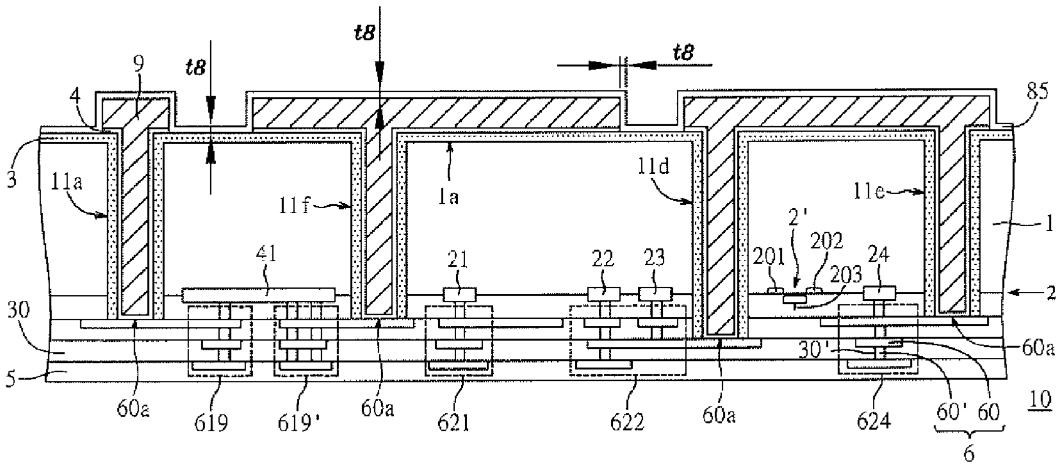
Figure 32F:
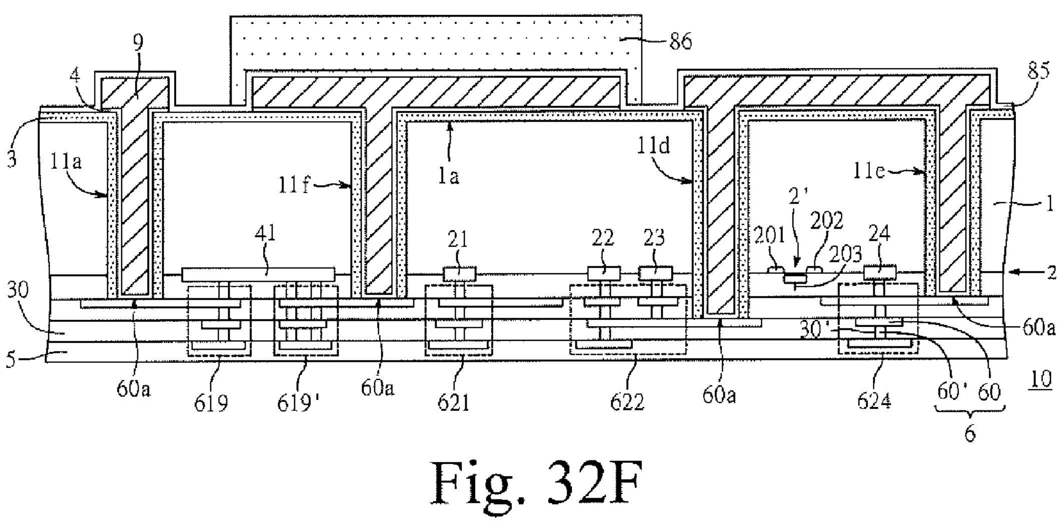
Figure 32G:
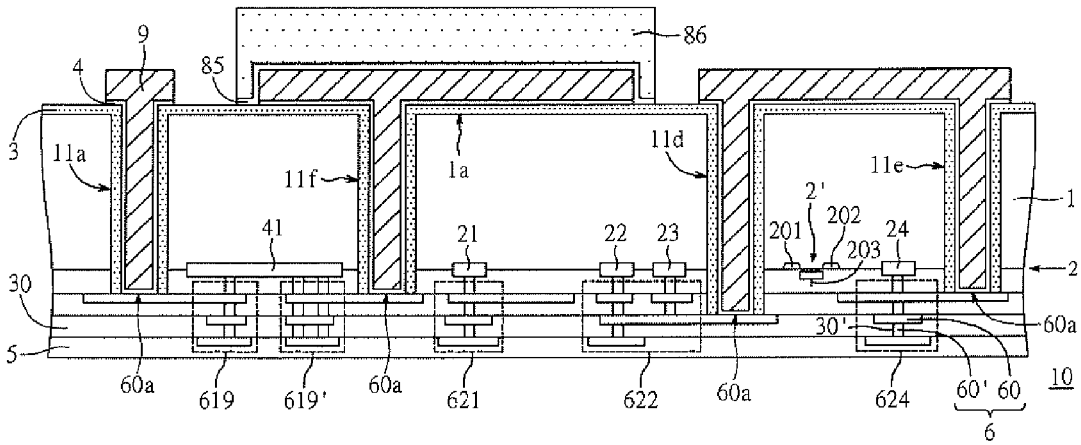
Figure 32H:
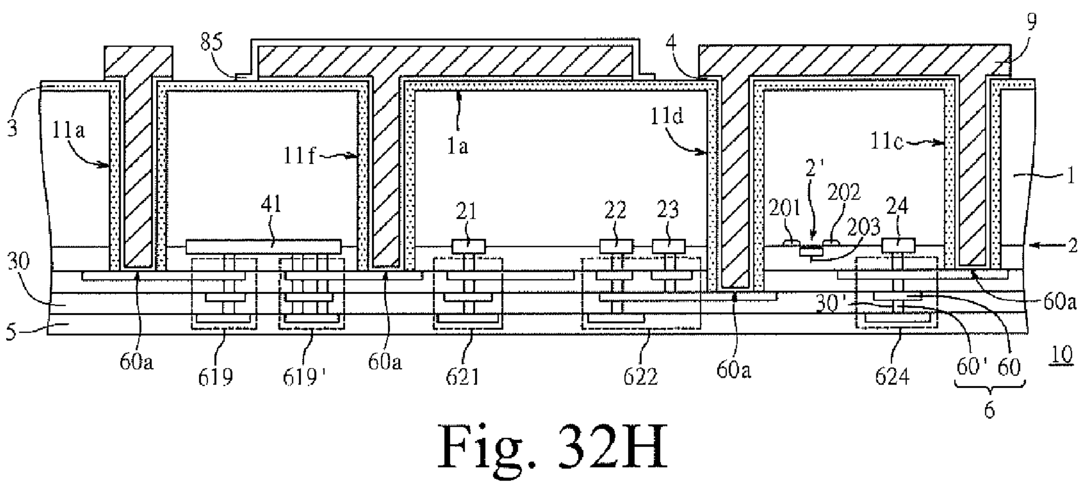
Figure 32I:
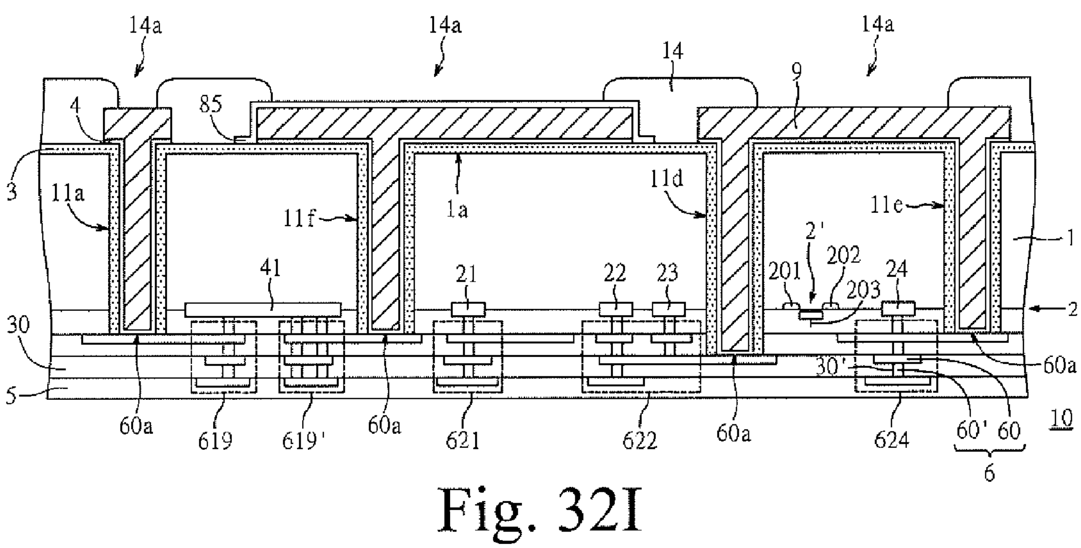
Figure 32J:
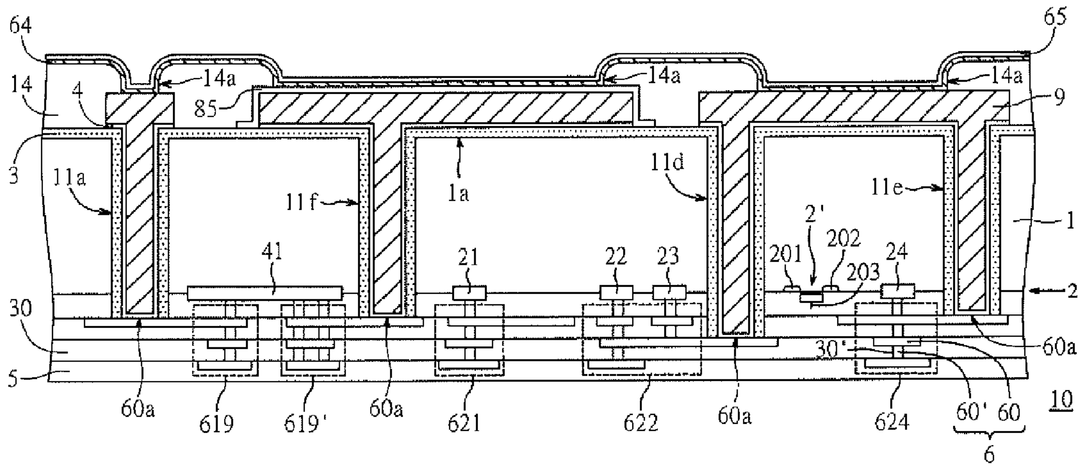
Figure 32K:
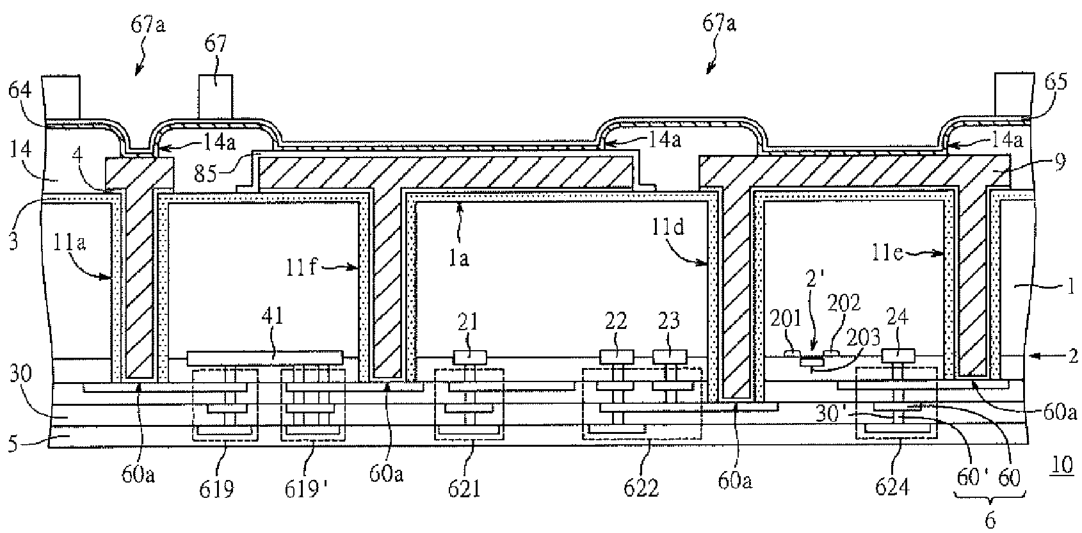
Figure 32L:
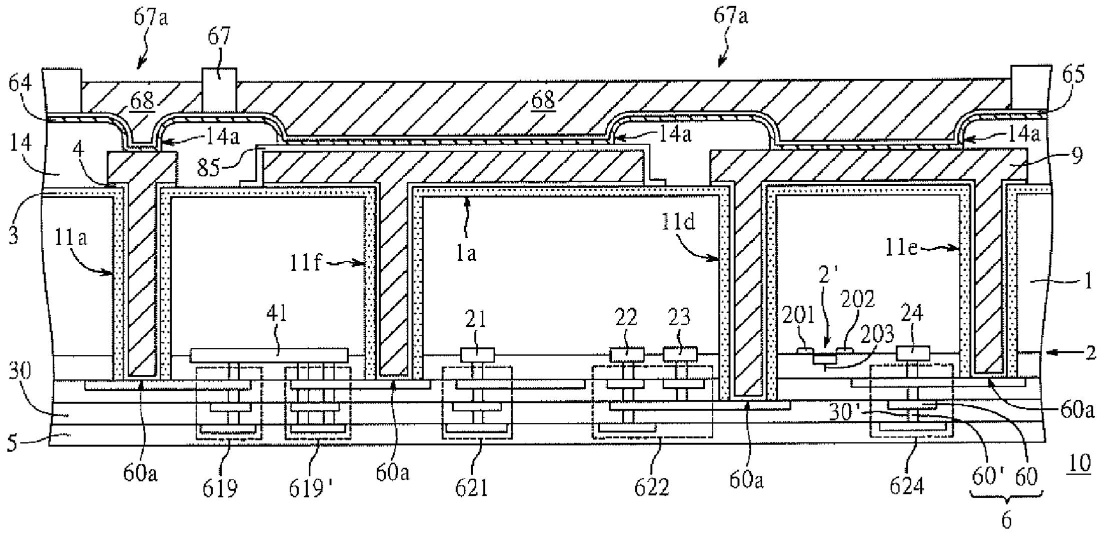
Figure 32M:
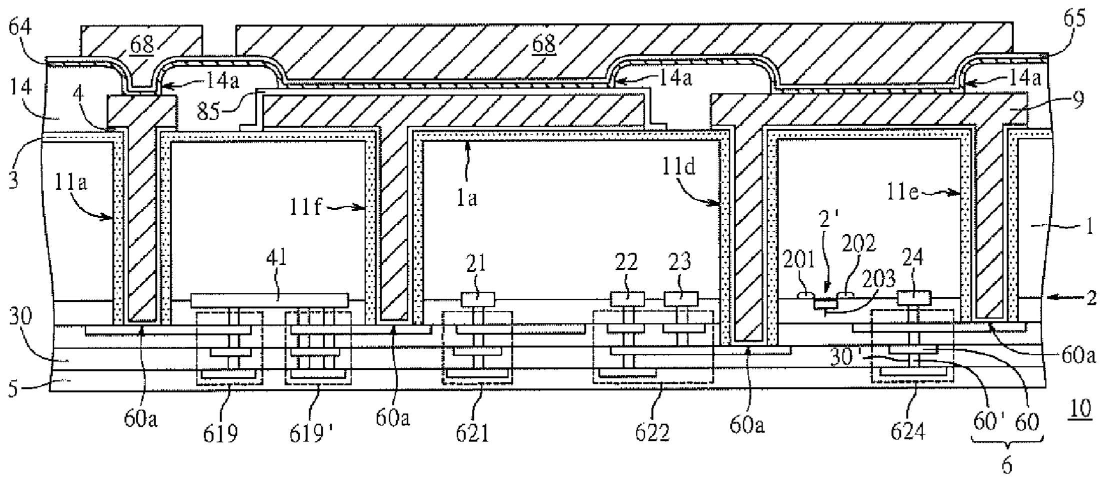
Figure 32N:
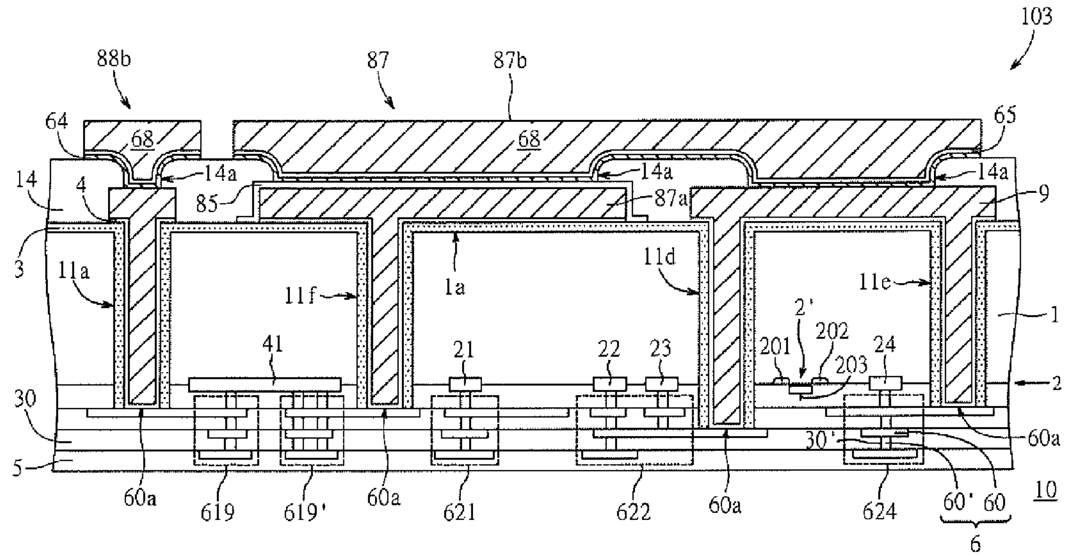
Figure 32O:
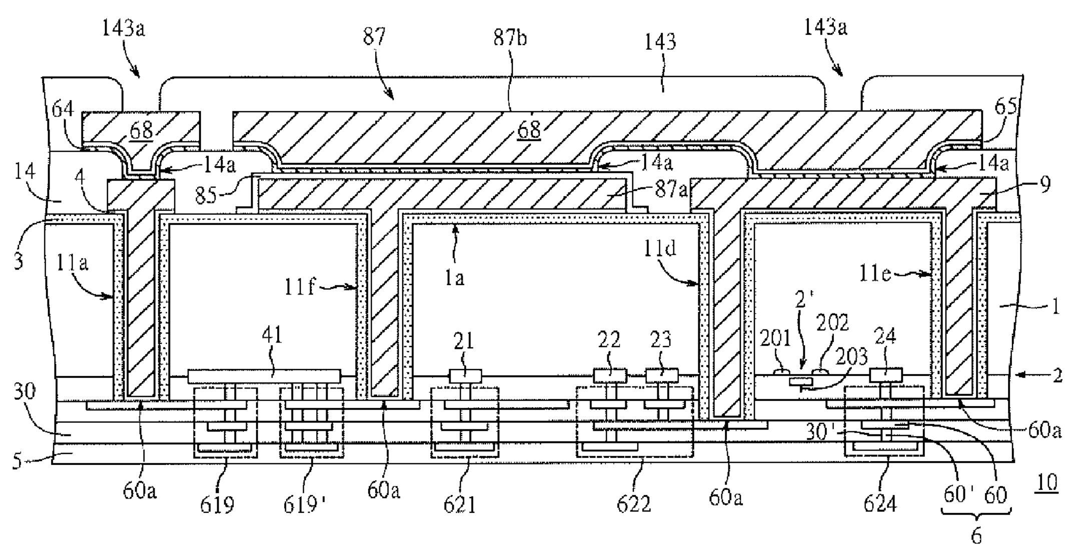
Figure 32P:
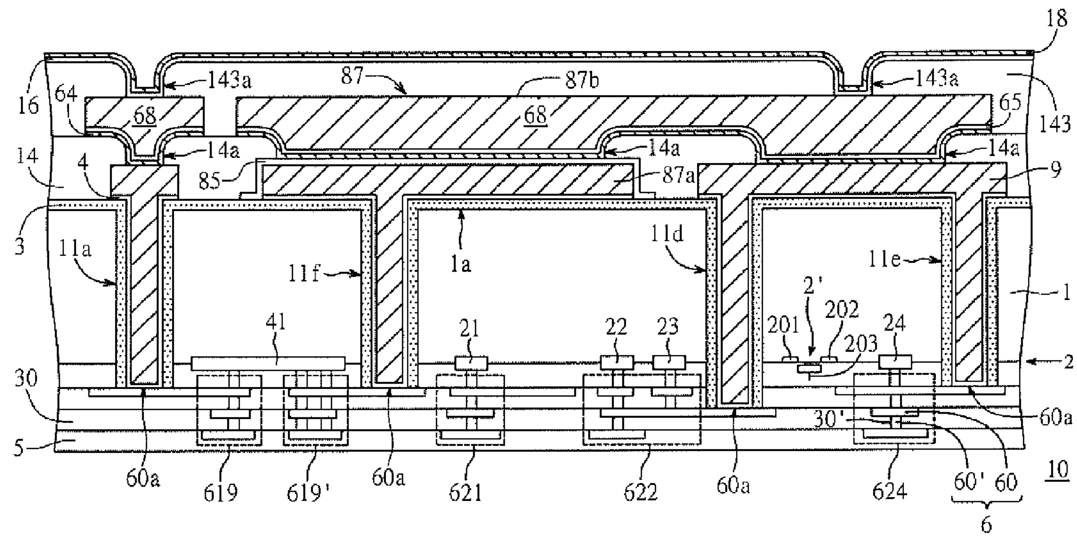
Figure 32Q:
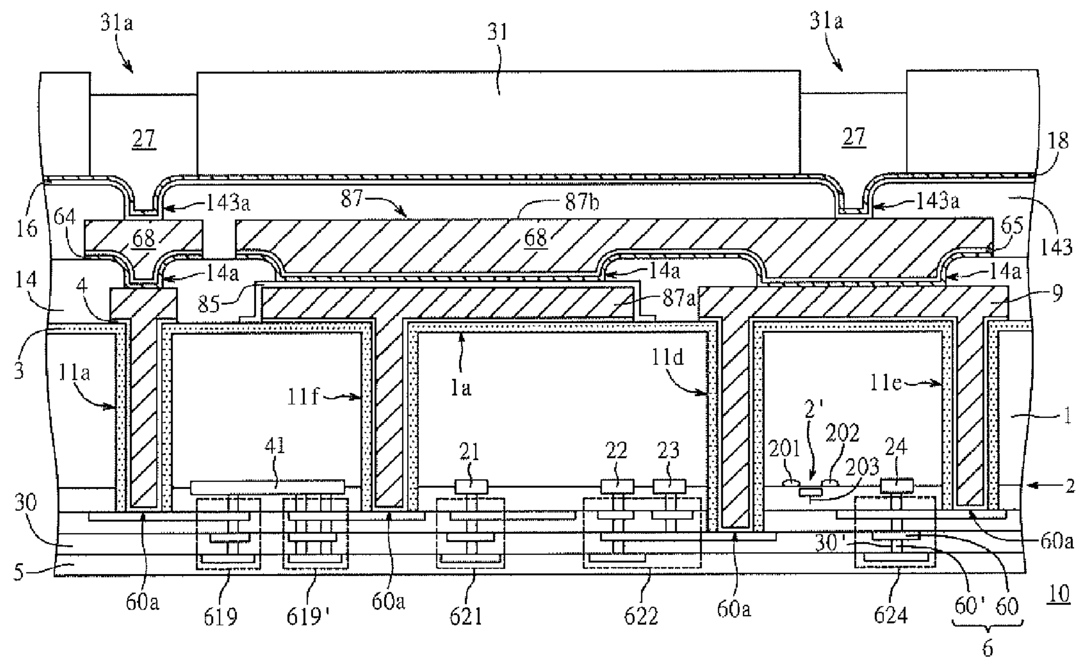
Figure 32R:
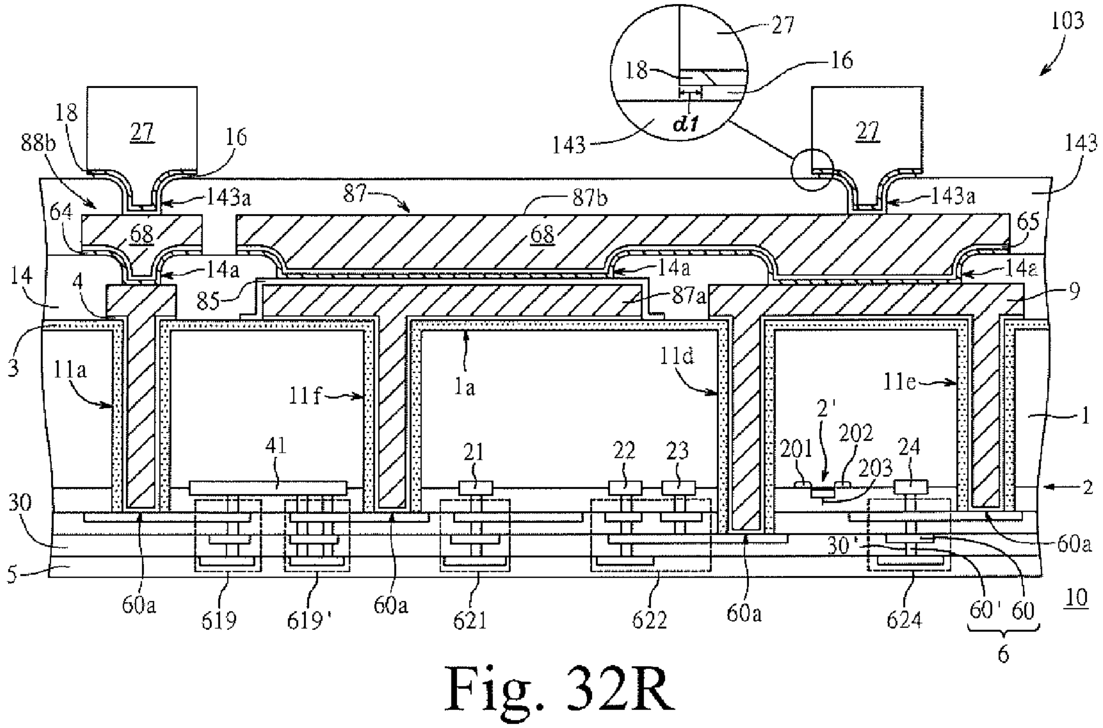

FIGS. 32A-32R are cross-sectional views showing a process for forming a bottom scheme of a bottom structure technology at a backside of a semiconductor wafer, according to an embodiment.

Figure 32S:
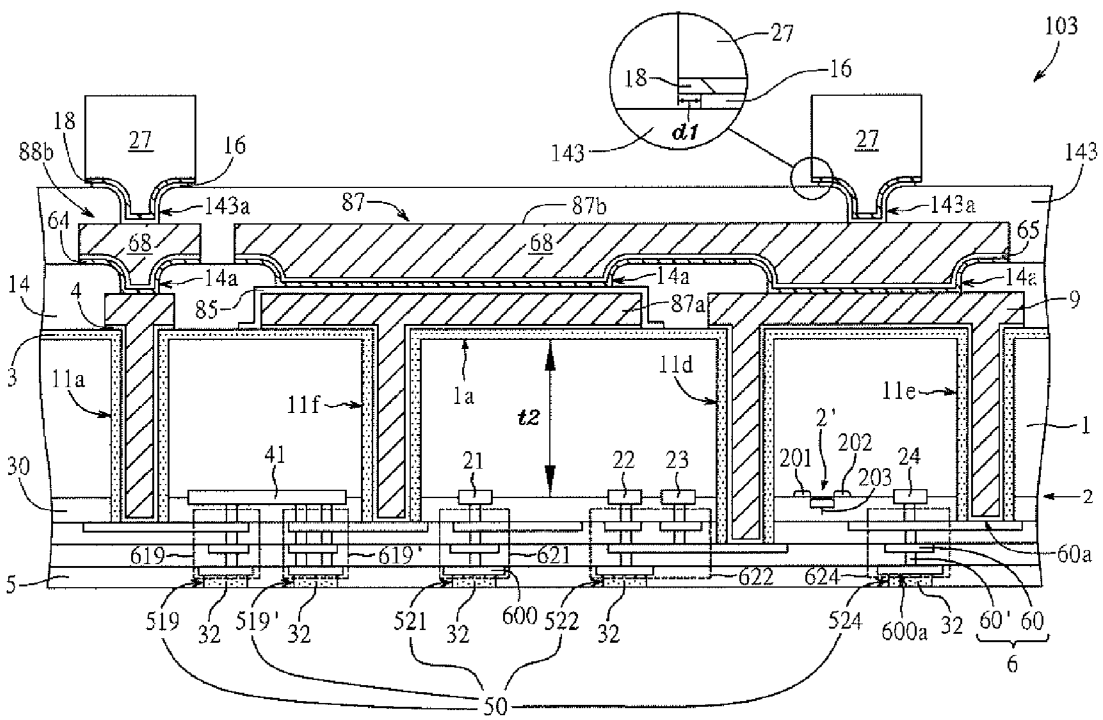
Figure 32T:
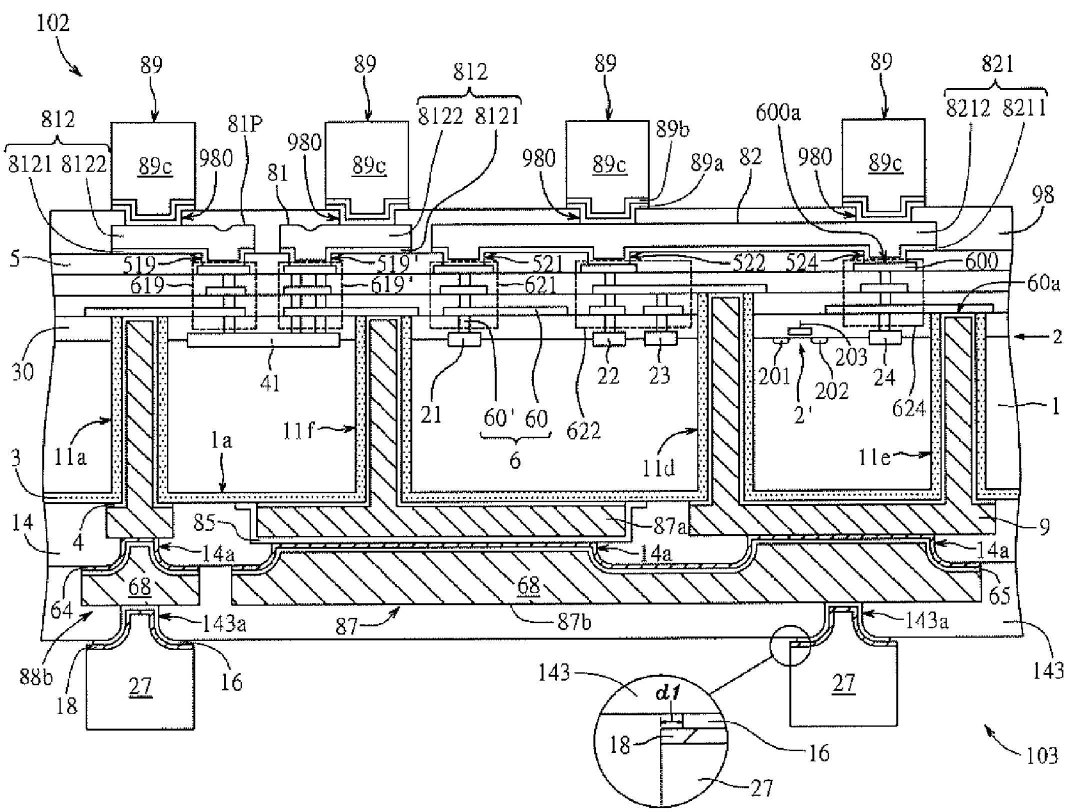

FIGS. 32S and 32T are cross sectional views showing a process for forming a semiconductor wafer including metal pads, bumps or traces at an active side of a silicon substrate of the semiconductor wafer and including a bottom scheme at a backside of the silicon side, according to an embodiment.

Figure 32U:
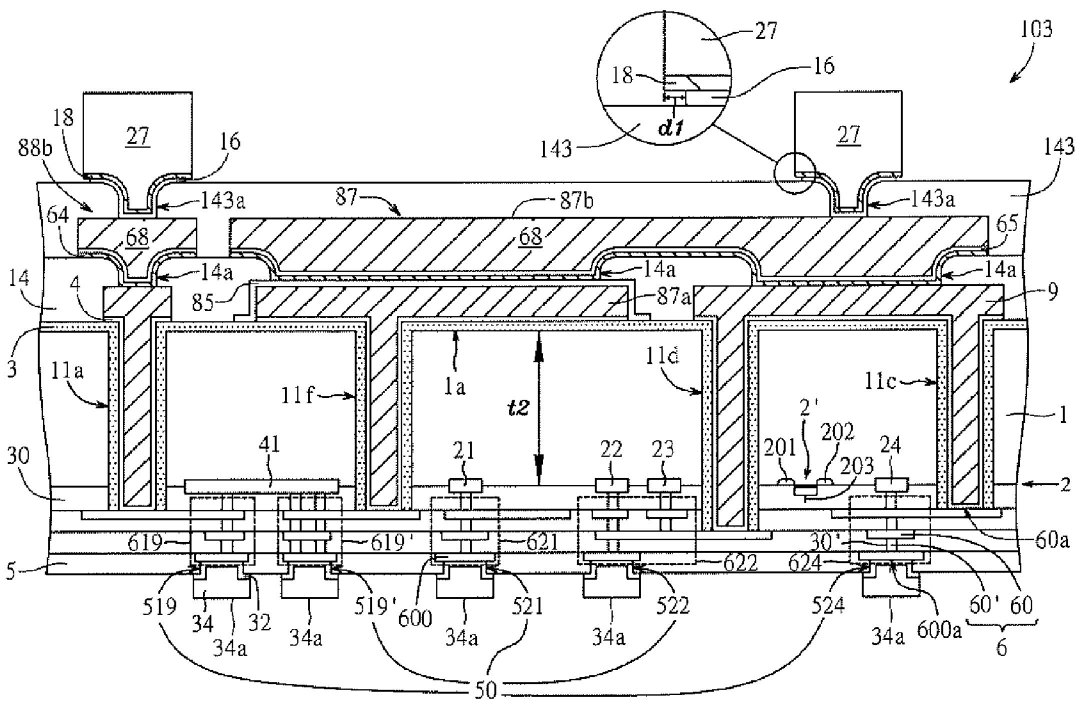

FIG. 32U is a cross sectional view showing a process for forming a semiconductor wafer, according to an embodiment.

FIGS. 33A-33K are cross-sectional views showing a process for forming a bottom scheme of a bottom structure technology at a backside of a semiconductor wafer, according to an embodiment.

Figure 33A:
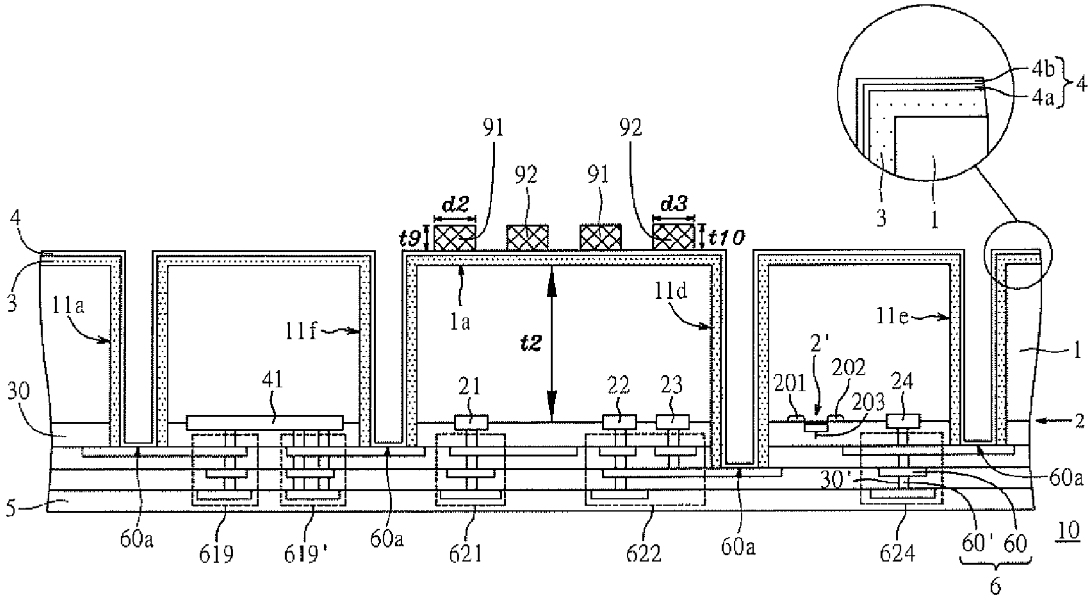
Figure 33B:
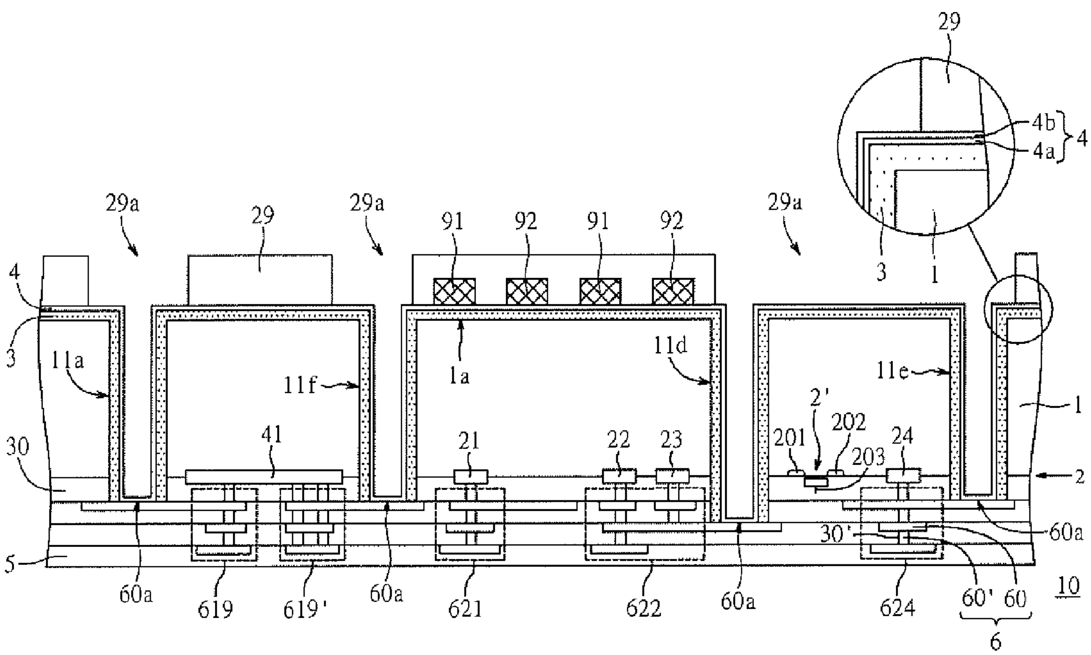
Figure 33C:
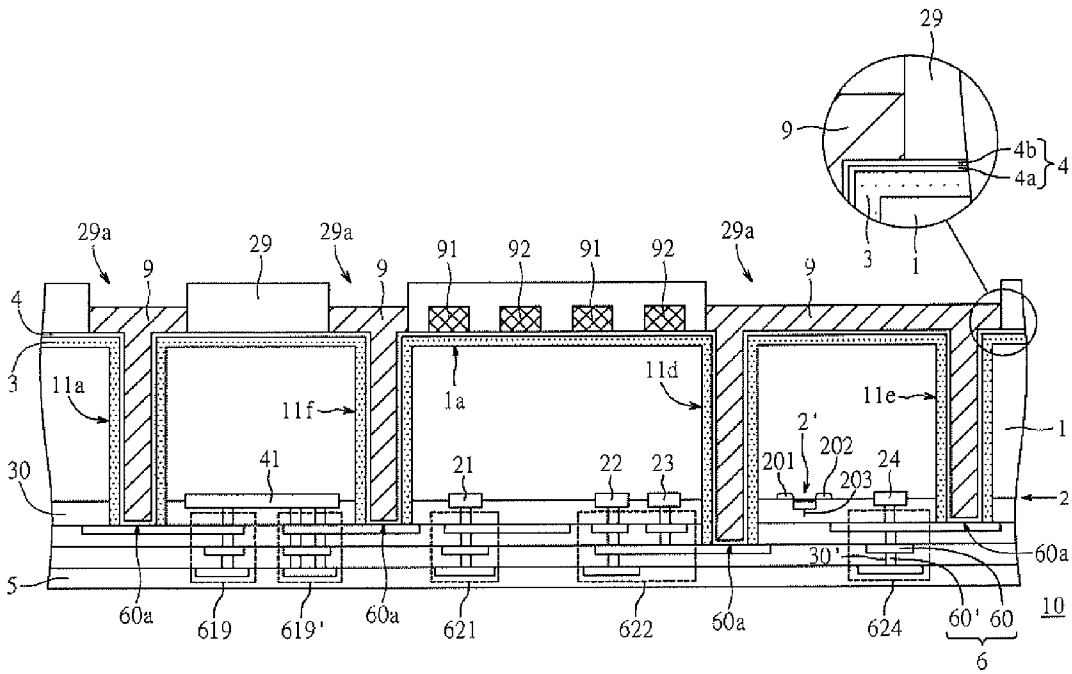
Figure 33D:
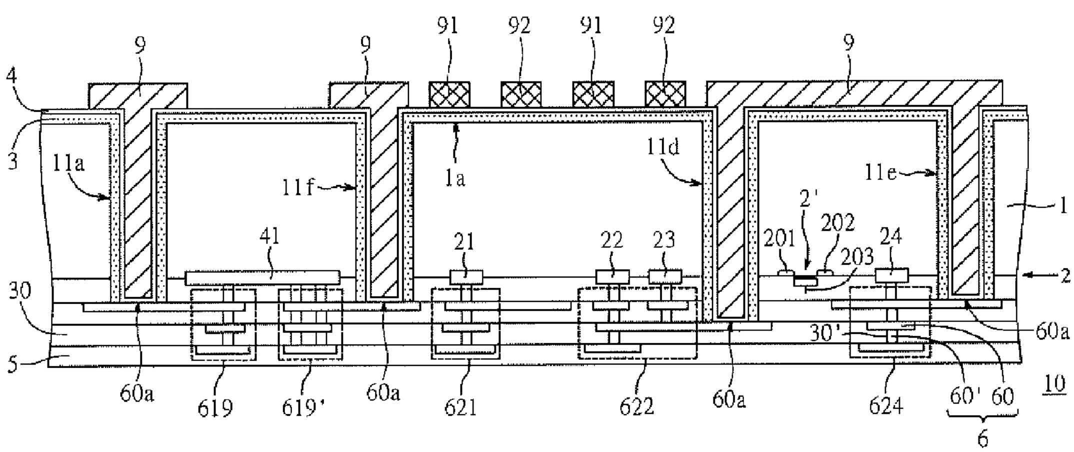
Figure 33E:
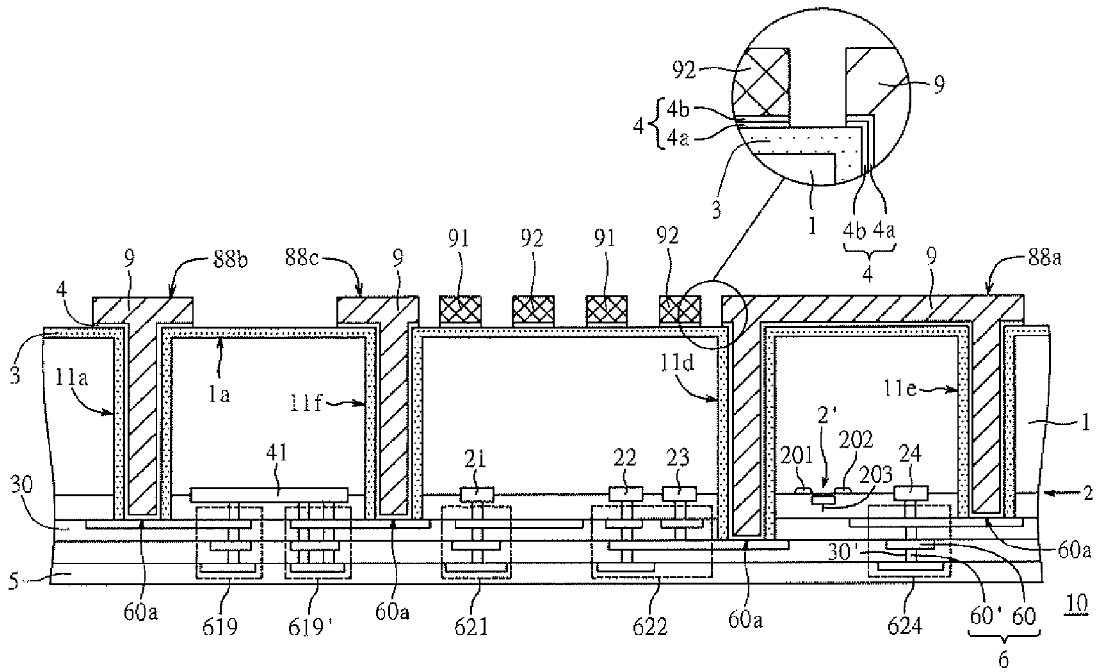
Figure 33F:
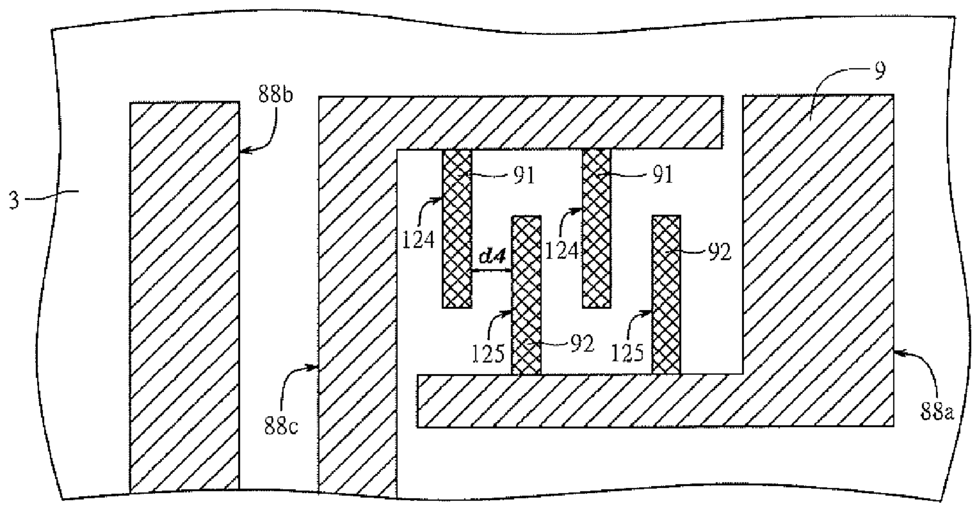
Figure 33G:
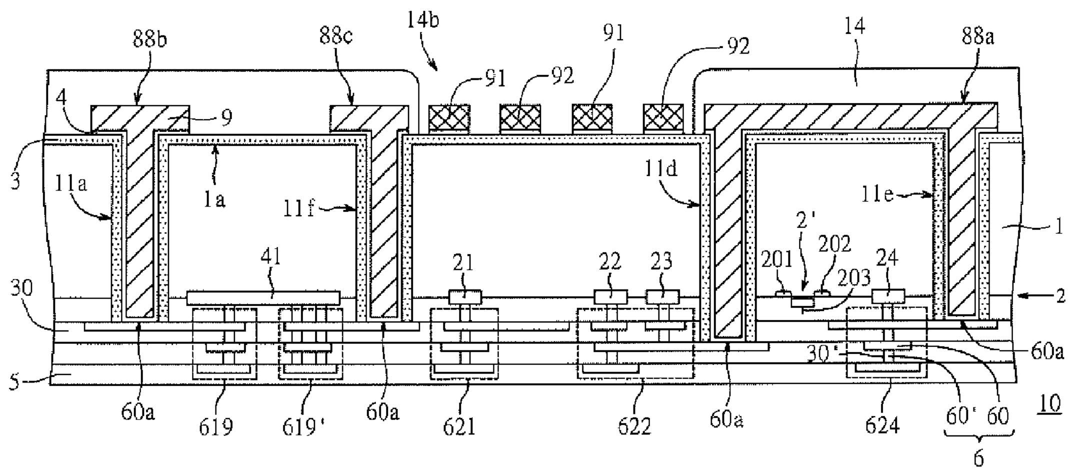
Figure 33H:
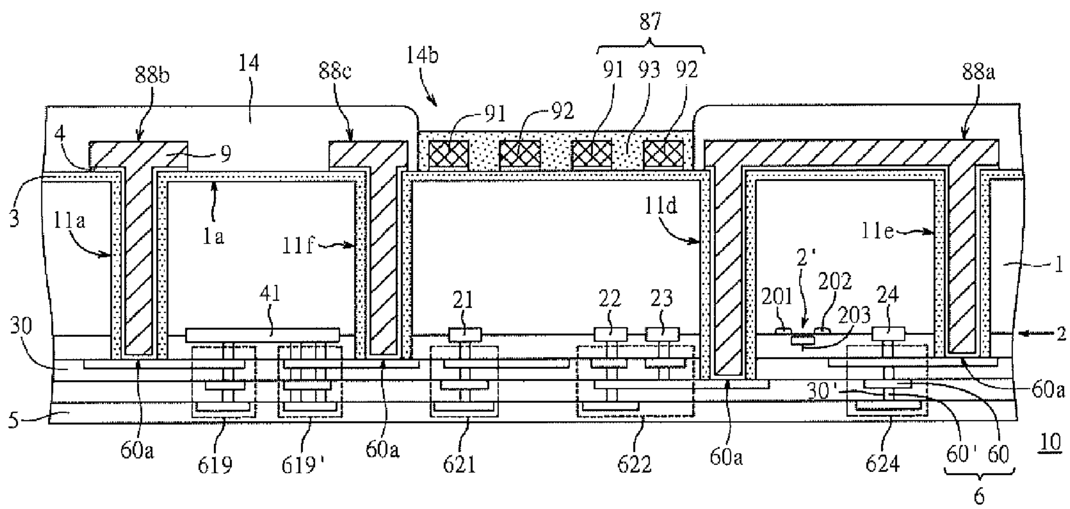
Figure 33I:
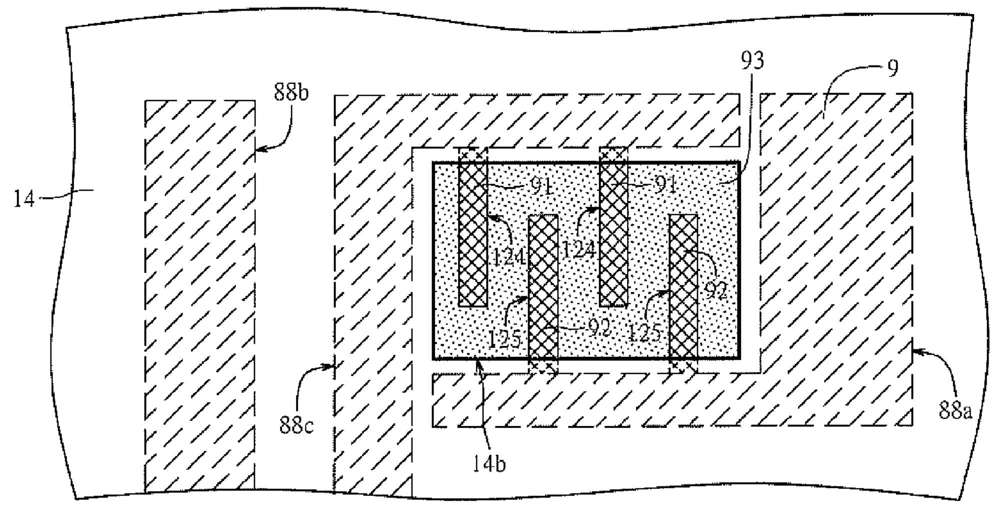
Figure 33J:
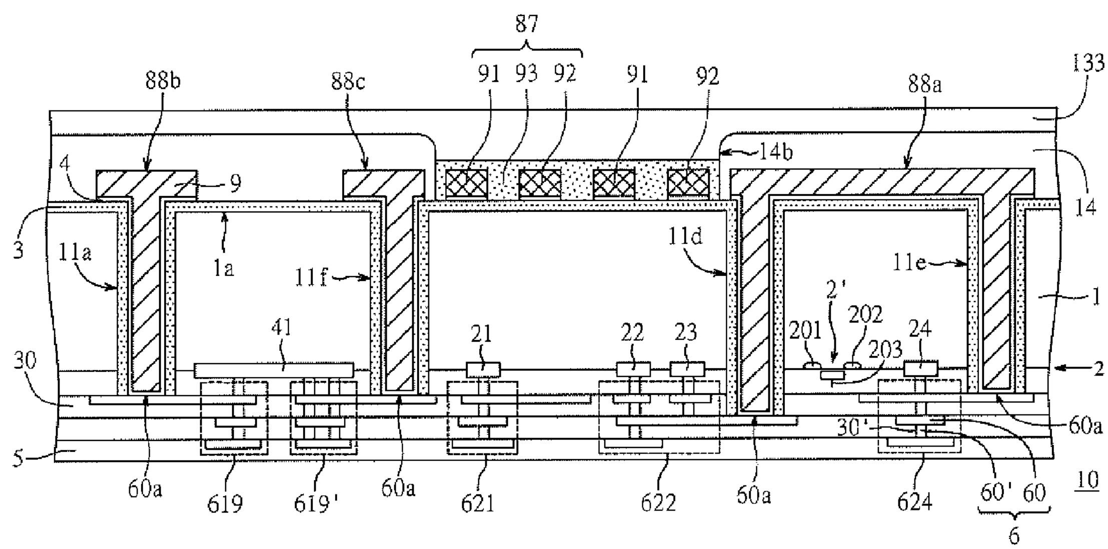
Figure 33K:
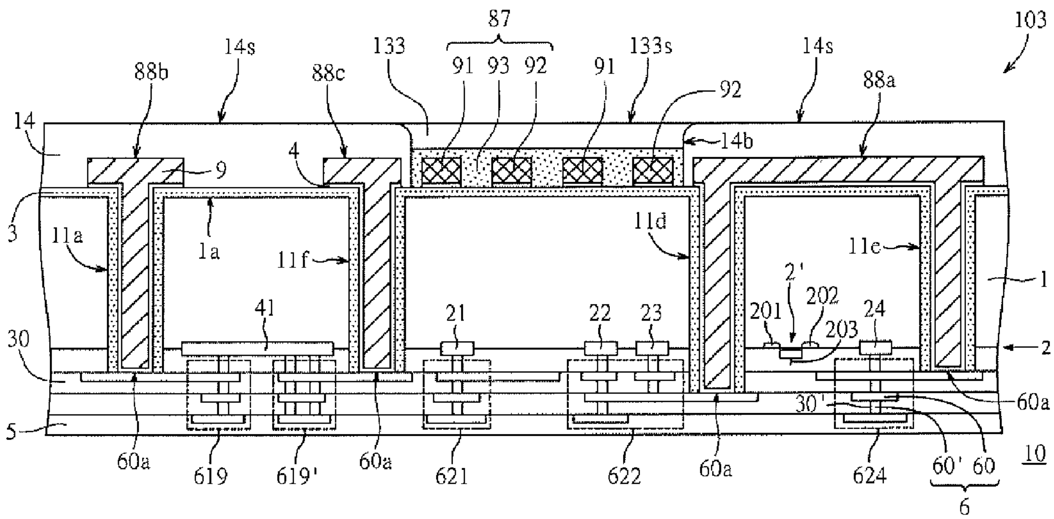
Figure 33L:
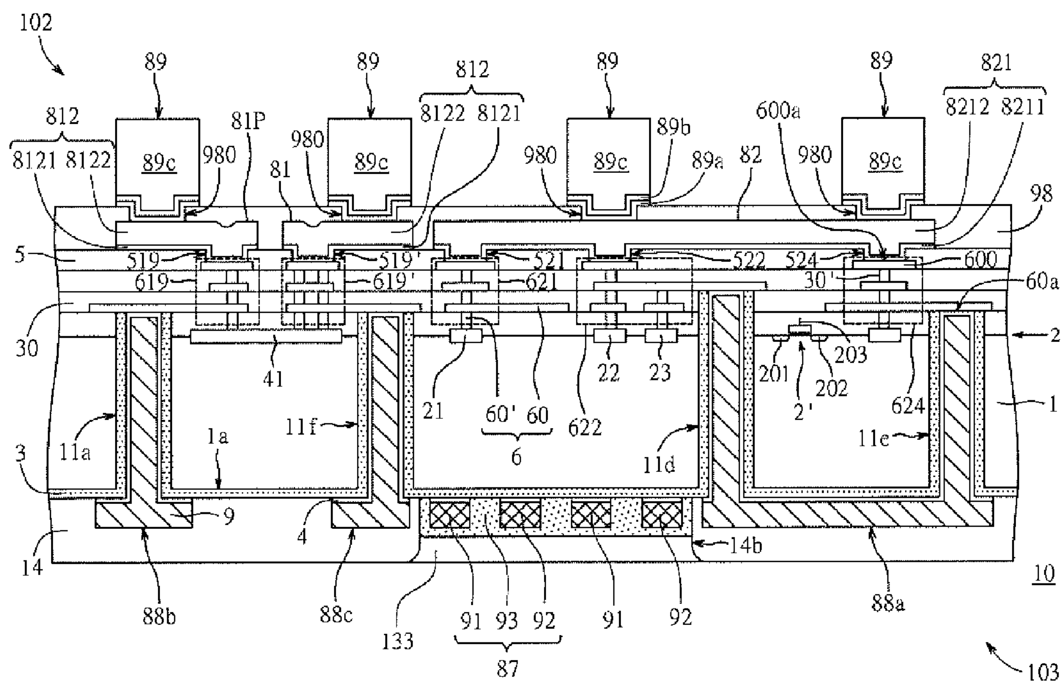

FIG. 33L is a cross sectional view showing the semiconductor wafer illustrated in FIG. 33K with an over-passivation scheme at an active side of a silicon substrate of the semiconductor wafer, according to an embodiment.

Figure 33M:
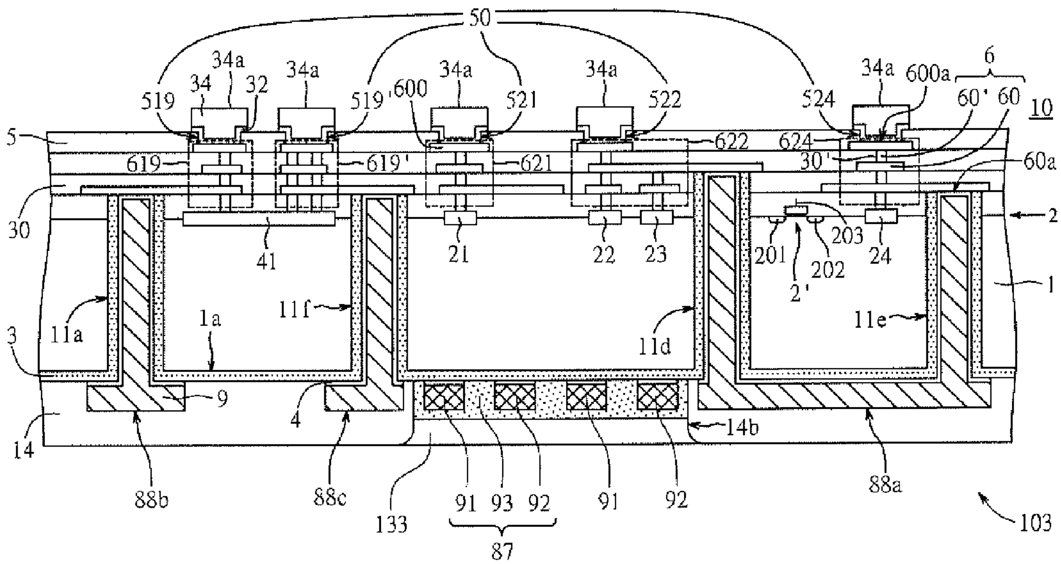

FIG. 33M is a cross sectional view showing the semiconductor wafer illustrated in FIG. 33K with metal pads, bumps or traces at an active side of a silicon substrate of the semiconductor wafer, according to an embodiment.

FIGS. 33N-33S are cross-sectional views showing a process for forming a bottom scheme of a bottom structure technology at a backside of a semiconductor wafer, according to an embodiment.

Figure 33N:
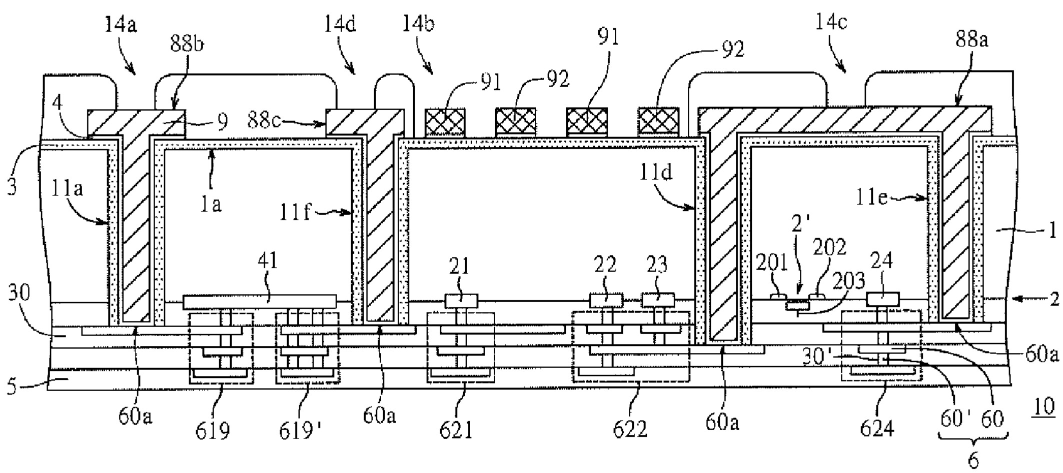
Figure 33O:
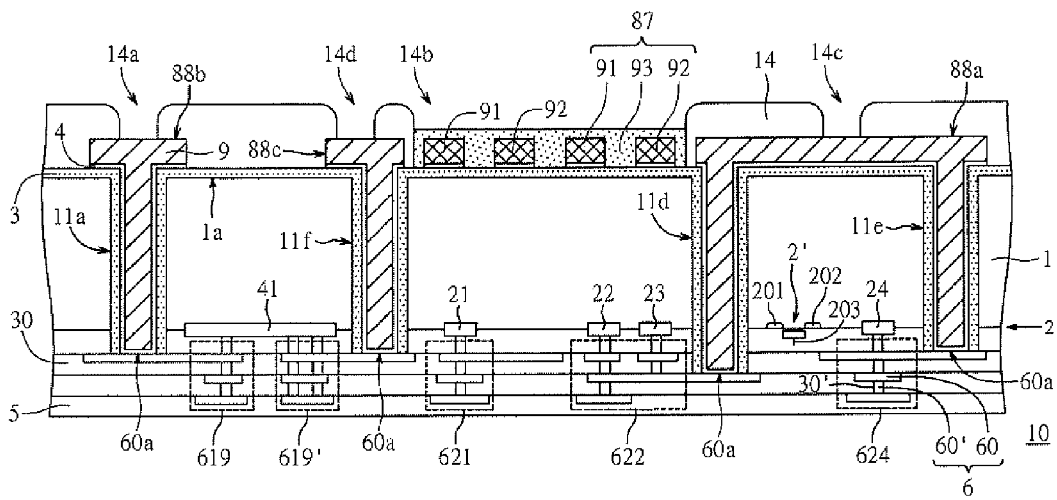
Figure 33P:
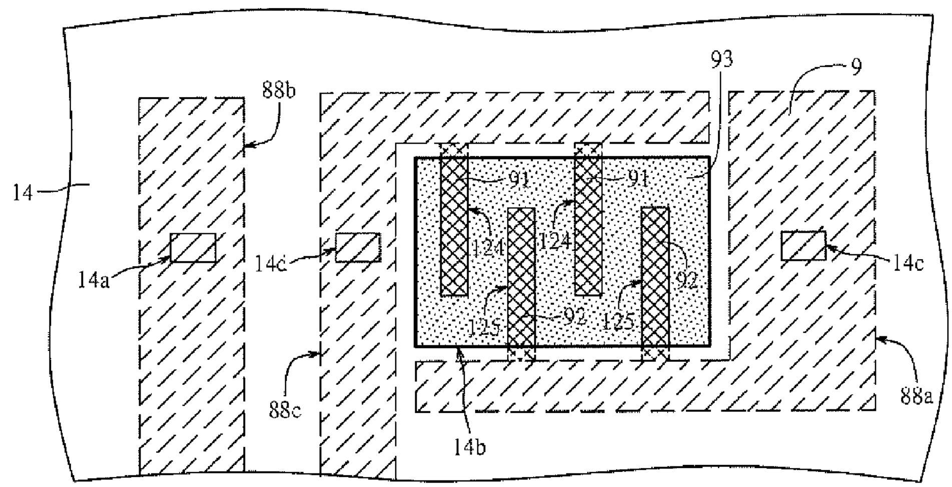
Figure 33Q:
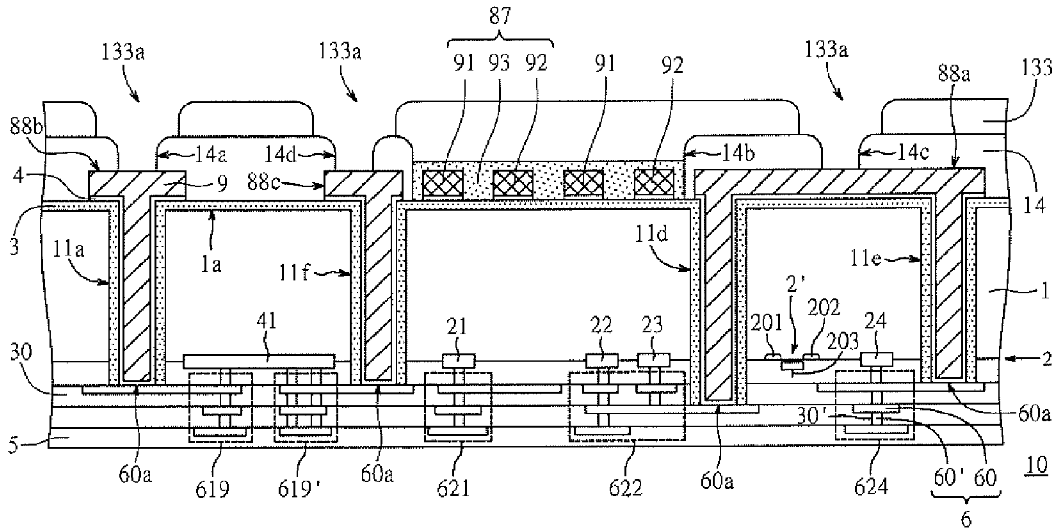
Figure 33R:
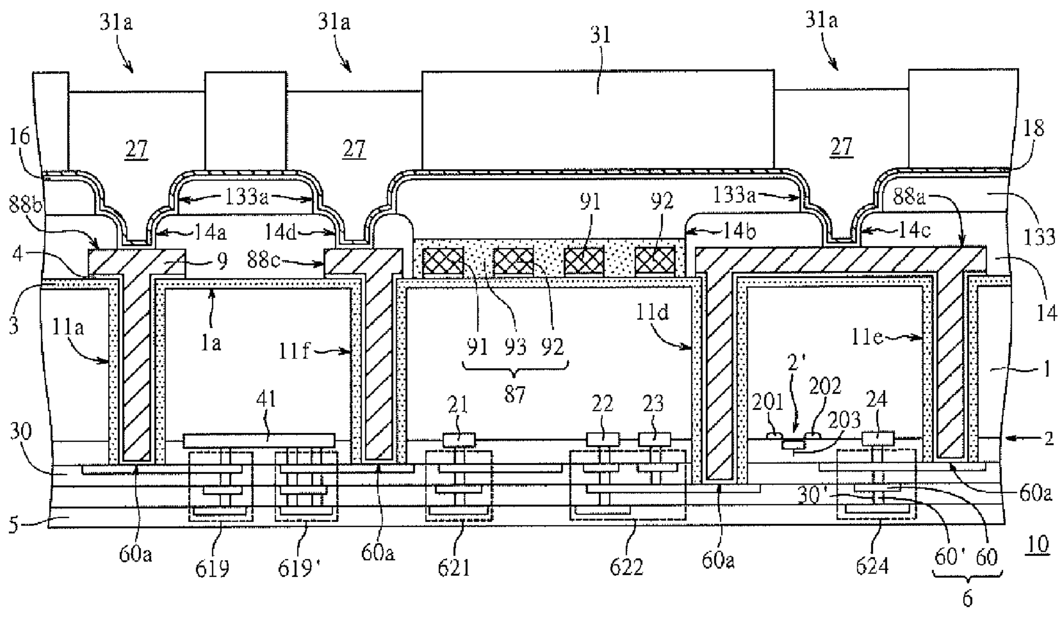
Figure 33S:
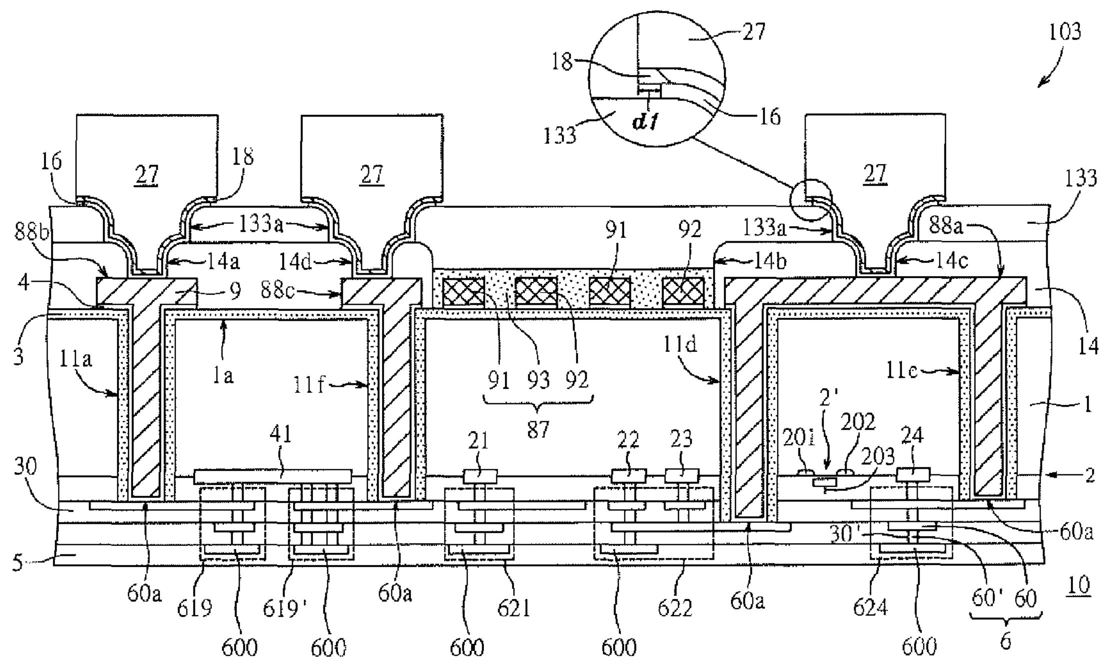
Figure 33T:
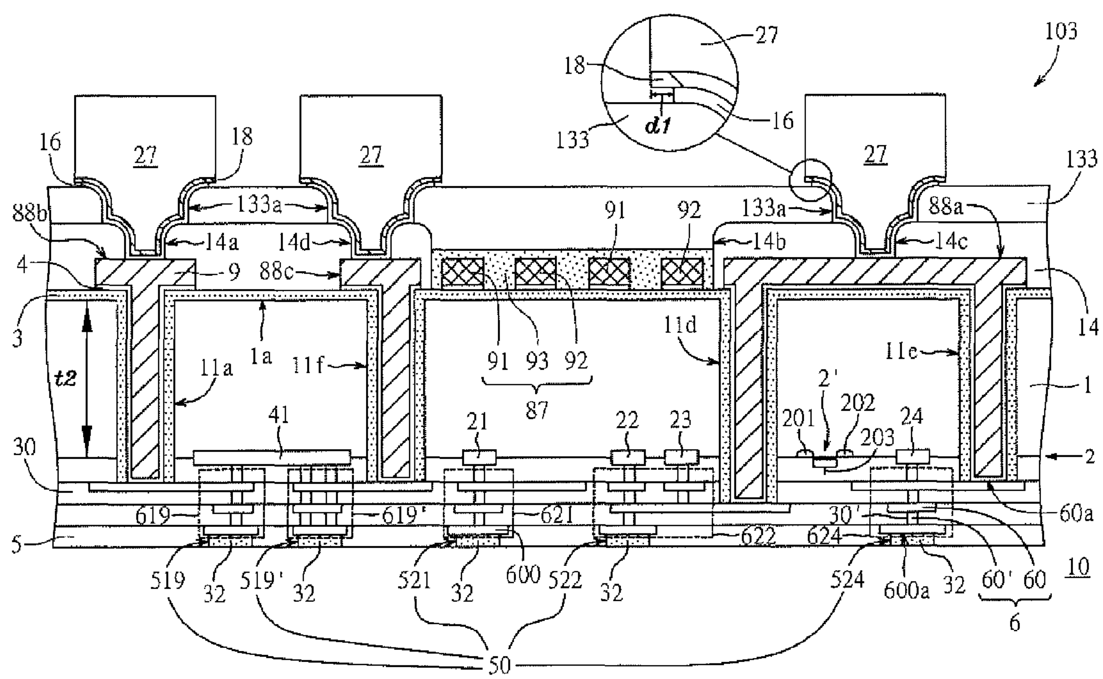
Figure 33U:
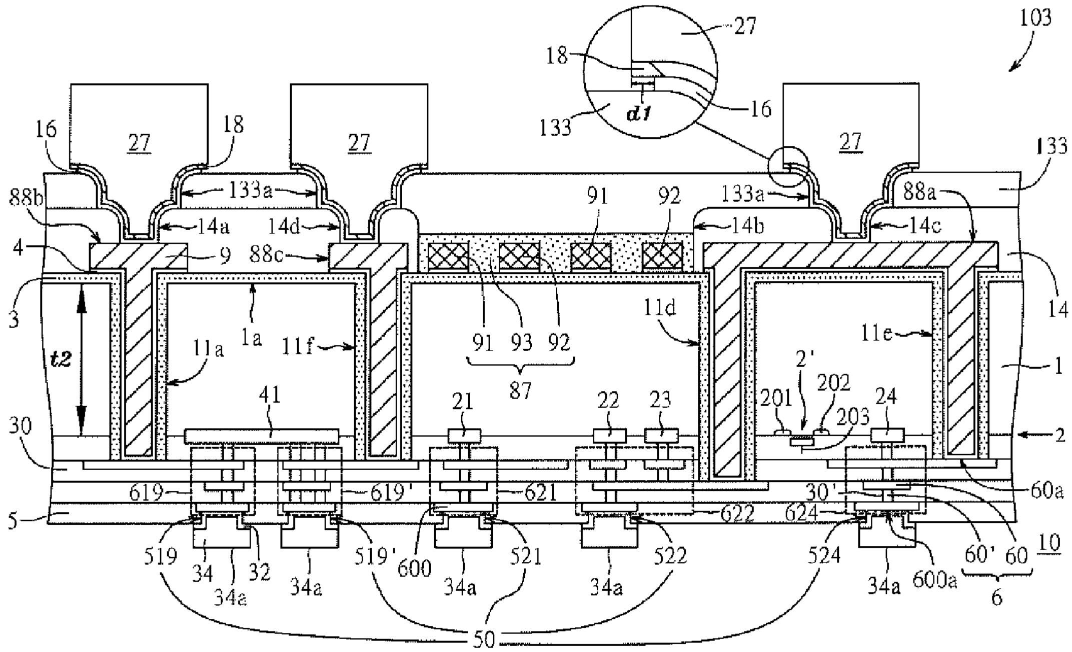

FIGS. 33T and 33U are cross sectional views of semiconductor wafers, according to an embodiment.

Figure 33V:
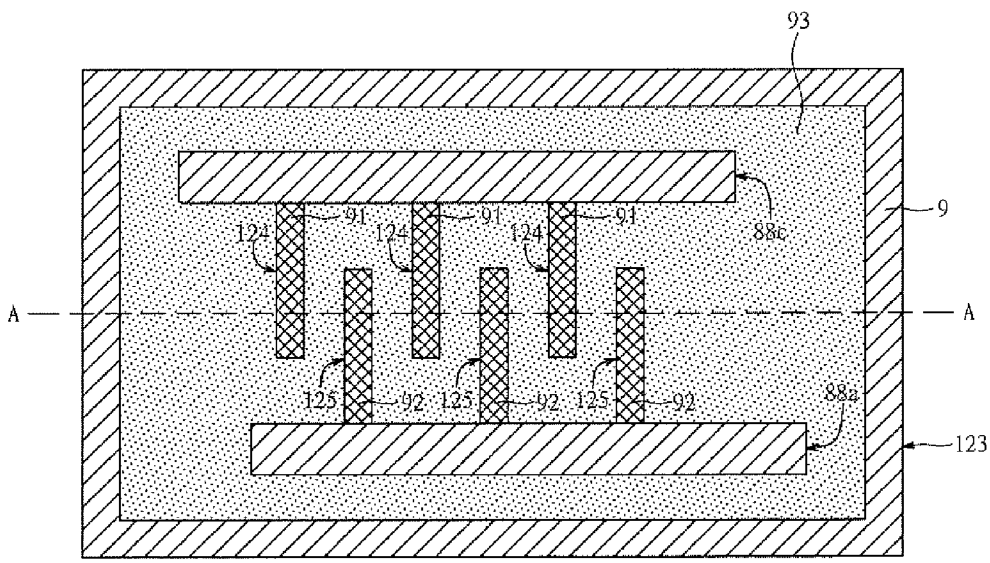

FIG. 33V shows a top view of a capacitor of a semiconductor wafer, according to an embodiment.

Figure 33W:
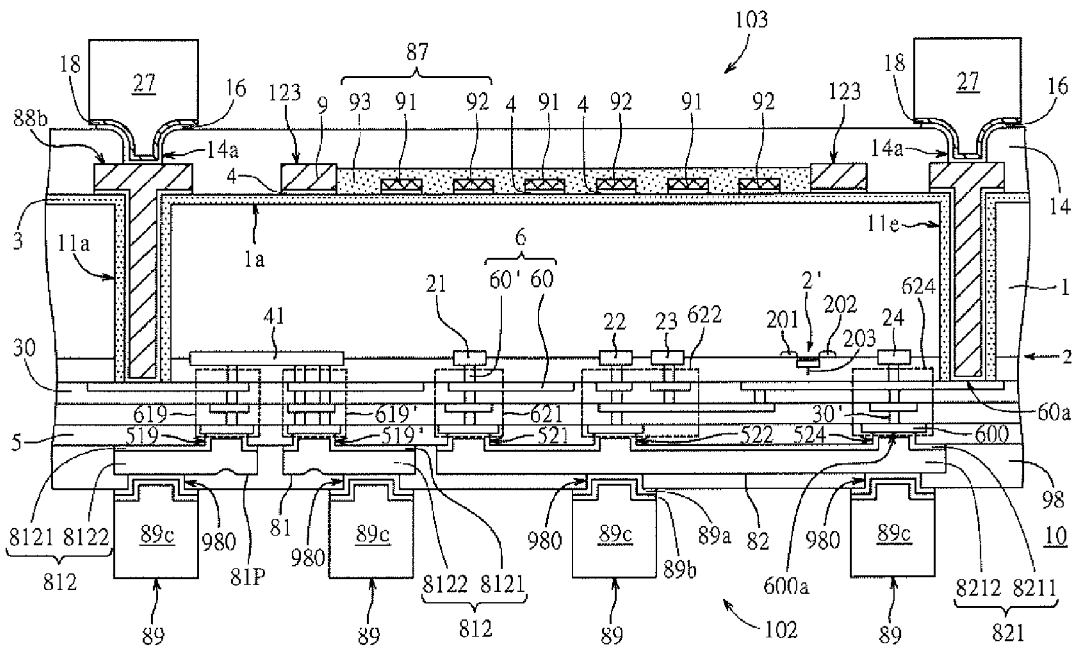

FIG. 33W shows a cross sectional view cut along the dot line A-A in FIG. 33V, according to an embodiment.

Figure 33X:
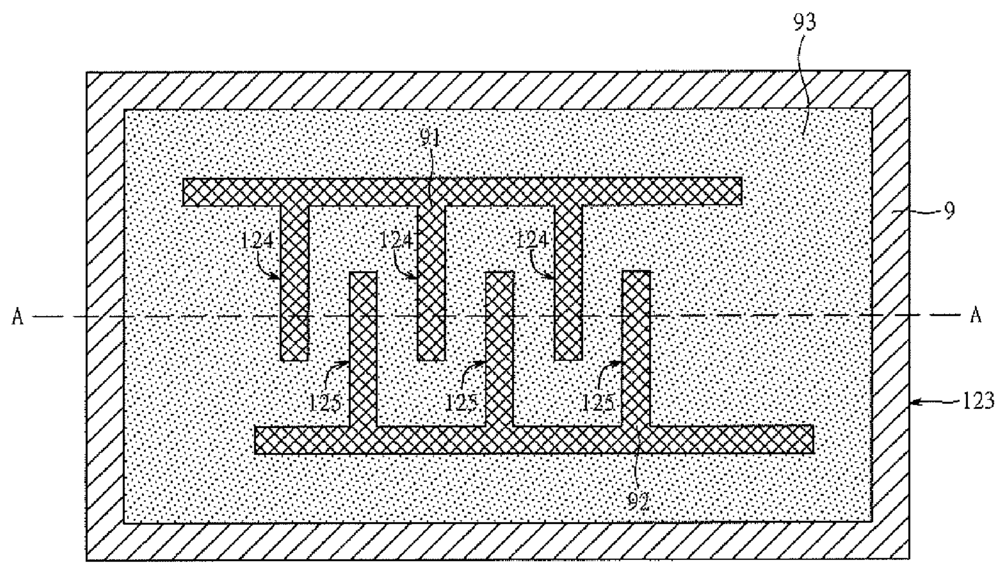

FIG. 33X shows a top view of a capacitor of a semiconductor wafer, according to an embodiment.

Figure 33Y:
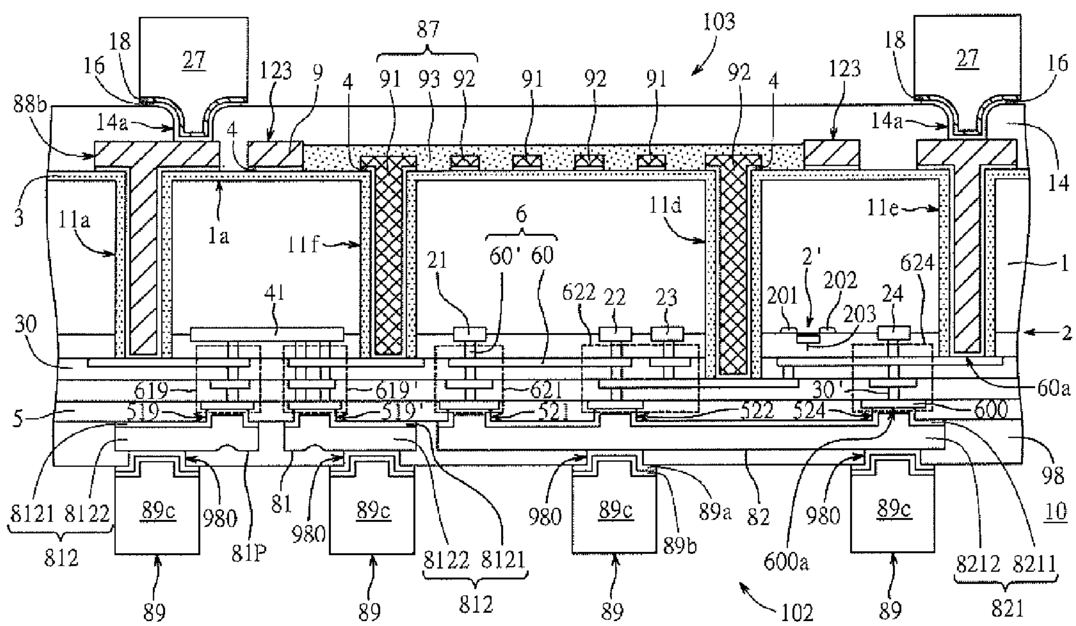

FIG. 33Y shows a cross sectional view cut along the dot line A-A in FIG. 33X, according to an embodiment.

FIGS. 34A-34G are cross sectional views showing a process of forming a super capacitor, a patterned circuit layer, metal bumps or pillars and two polymer layers at passivation layer of a semiconductor wafer, according to an embodiment.

FIGS. 35A-35D are cross sectional views showing a process of forming a semiconductor wafer including an over-passivation scheme at a passivation layer of the semiconductor wafer and including a bottom scheme, a discrete inductor and a discrete capacitor at a backside of the semiconductor wafer, according to an embodiment.

FIGS. 36A-36D are cross sectional views of chip-package modules, according to an embodiment.

FIGS. 37A-37D and 38A-38D are cross sectional views of modules, according to an embodiment.

FIGS. 39A, 39H, 39I and 39J are circuit diagrams each showing interface circuits of a cache memory chip and a chip, according to an embodiment.

Figure 39A:
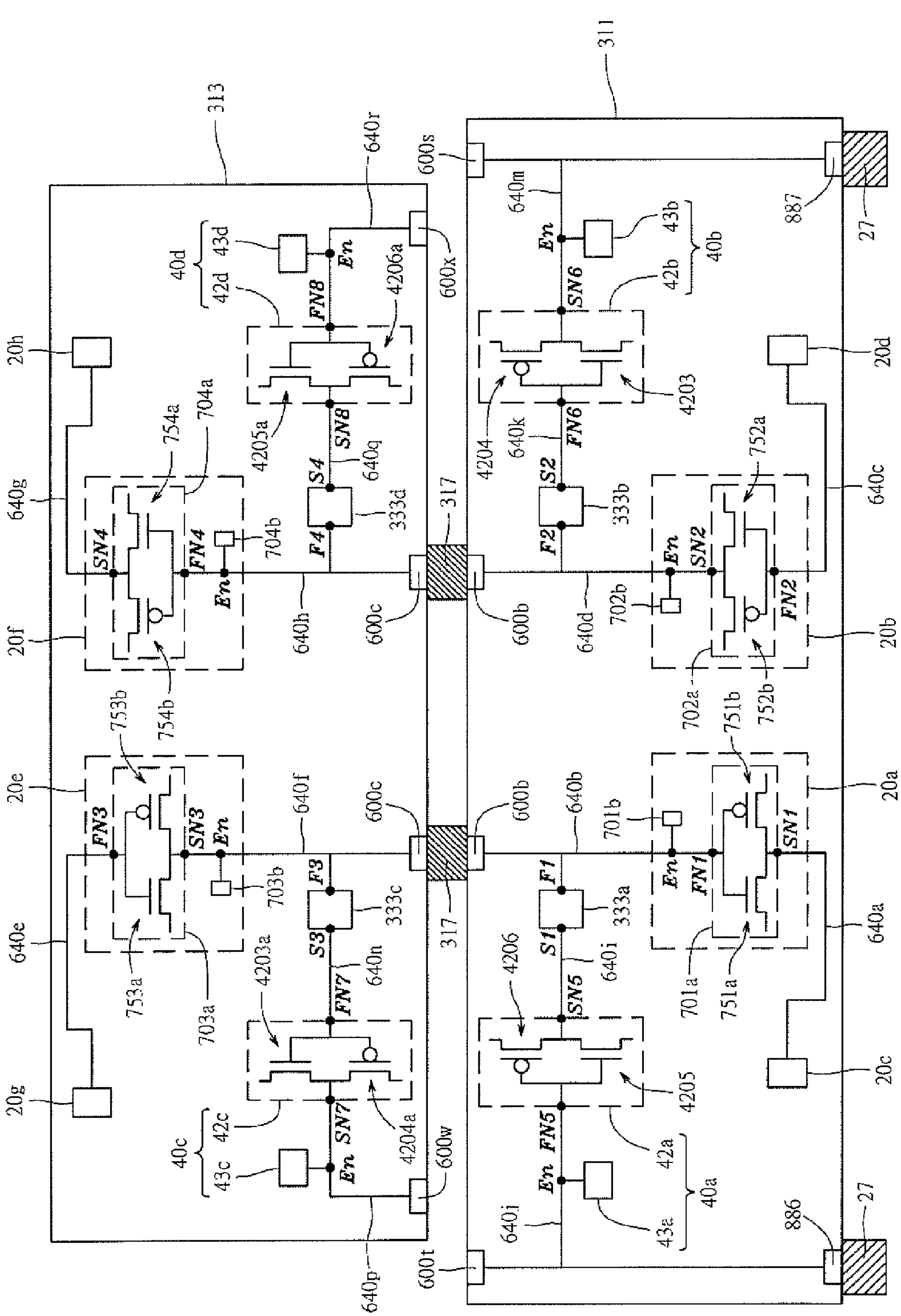
Figure 39B:
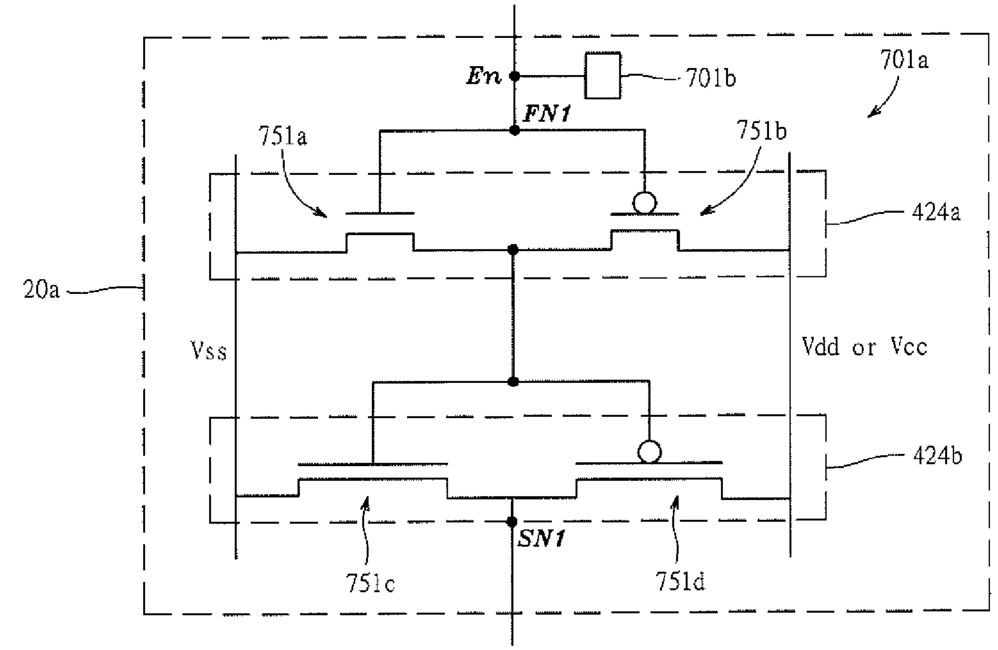
Figure 39C:
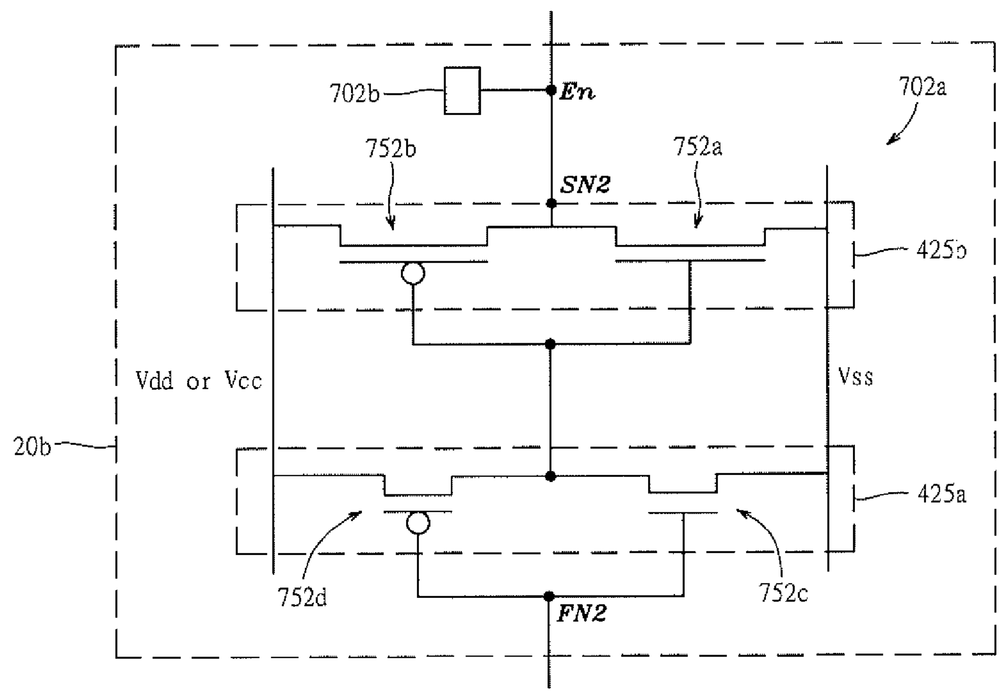

FIGS. 39B and 39C show circuit diagrams of inter-chip circuits in a cache memory chip, according to an embodiment.

Figure 39D:
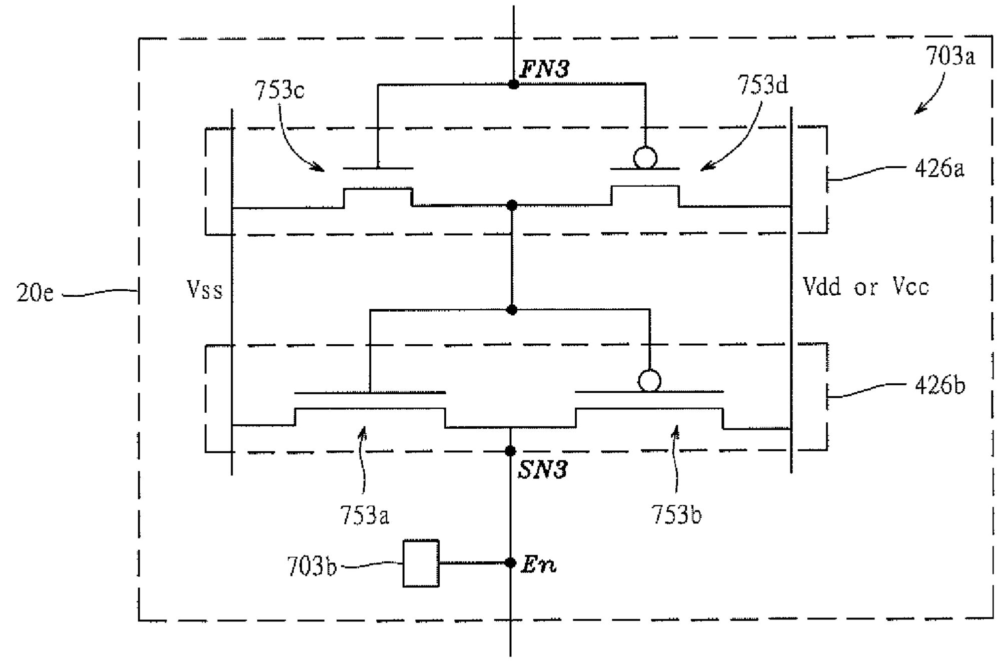
Figure 39E:
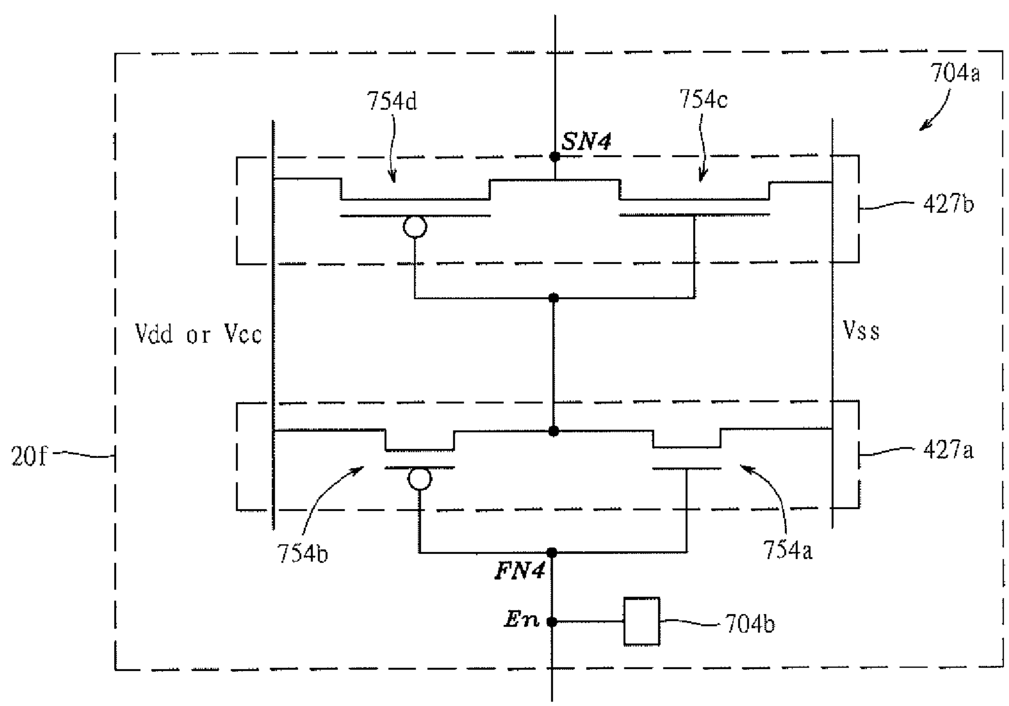

FIGS. 39D and 39E show circuit diagrams of inter-chip circuits in a chip, according to an embodiment.

Figure 39F:
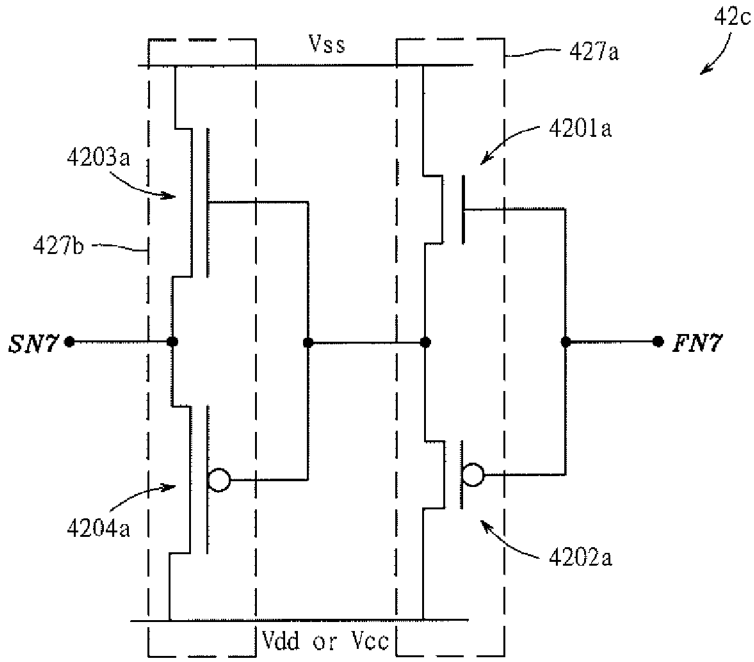
Figure 39G:
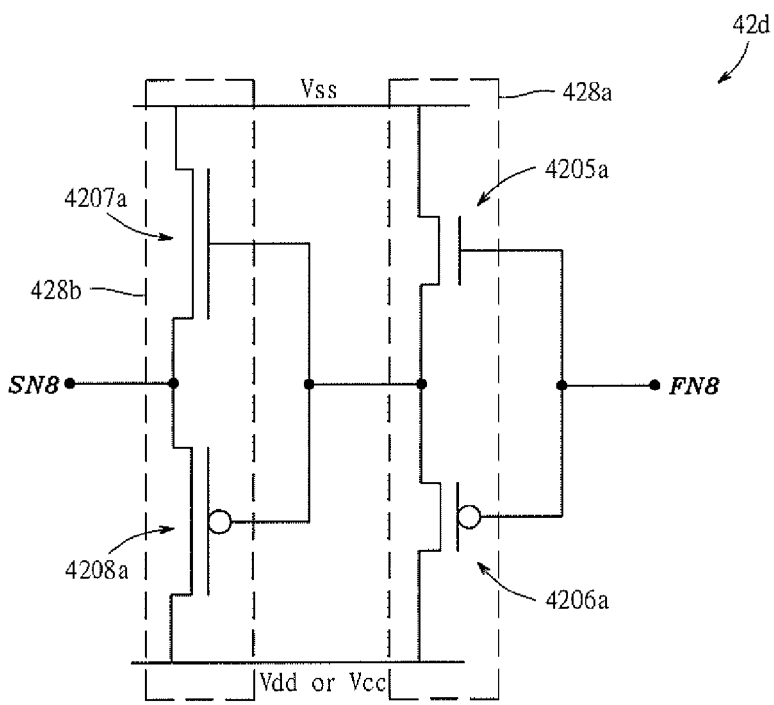

FIGS. 39F and 39G show circuit diagrams of off-chip buffers in a chip, according to an embodiment.

FIGS. 40A-40F show how to calculate an active area of an ESD unit of a chip and define a size of an ESD circuit composed of one or more the ESD units, according to an embodiment.

Figure 41:
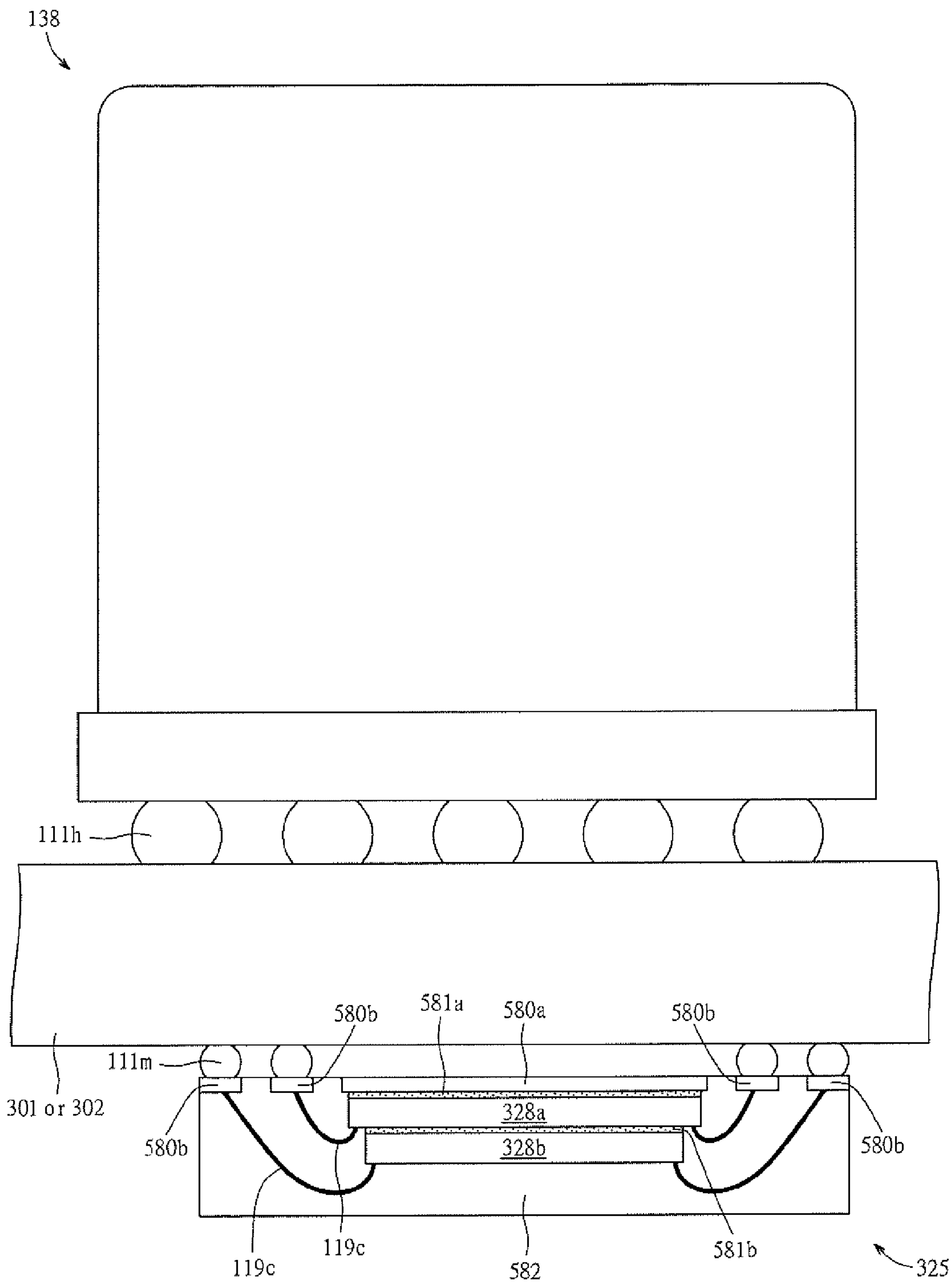

FIG. 41 shows a cross sectional view of a module including a substrate, a radio frequency (RF) module, and a wirebonded stacked memory BGA package, according to an embodiment.

Figure 42A:
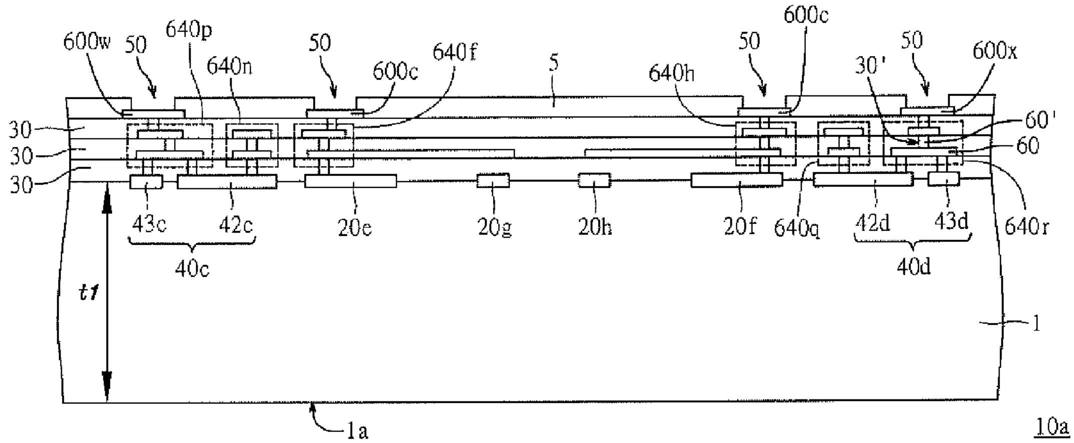
Figure 42B:
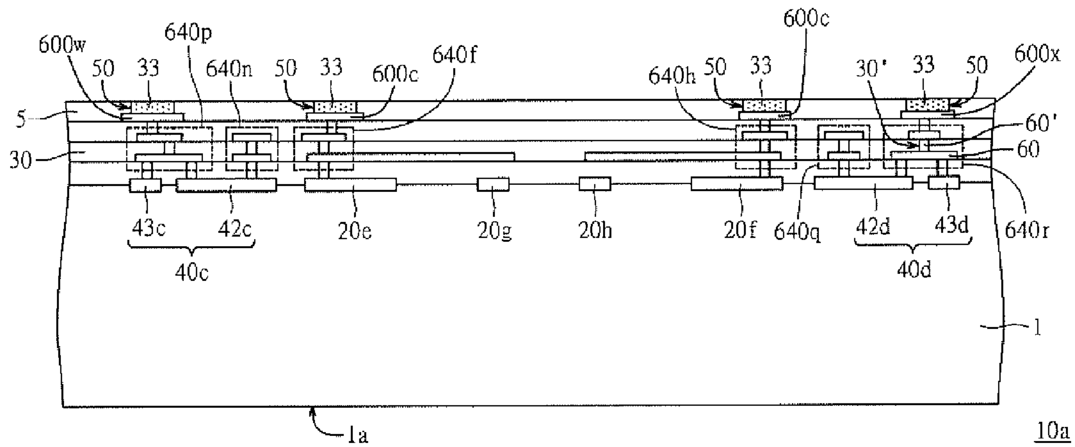
Figure 42C:
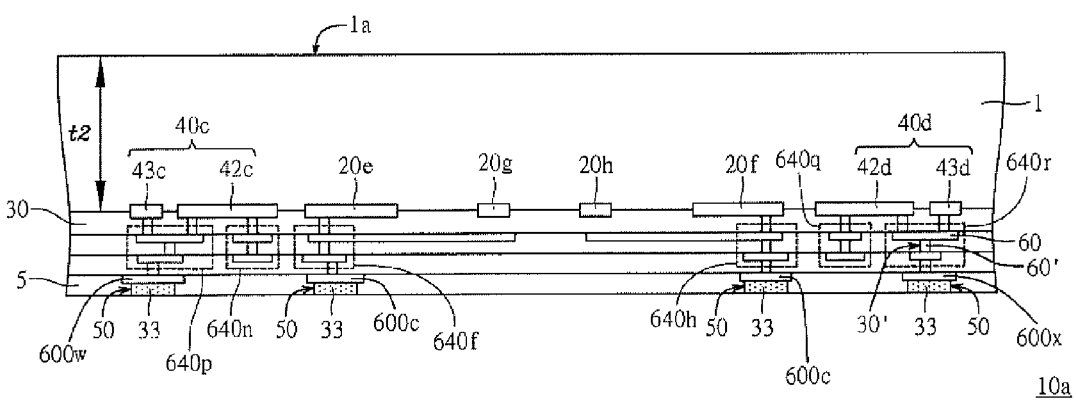
Figure 42D:
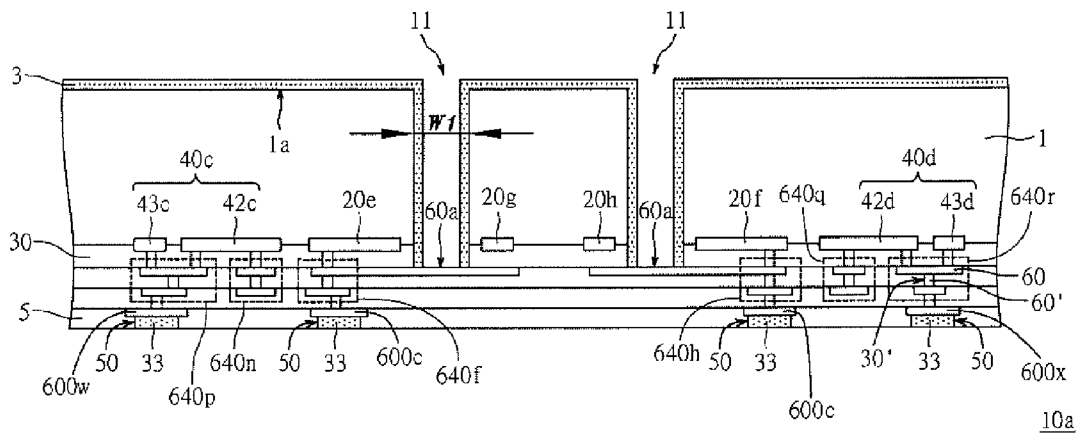
Figure 42E:
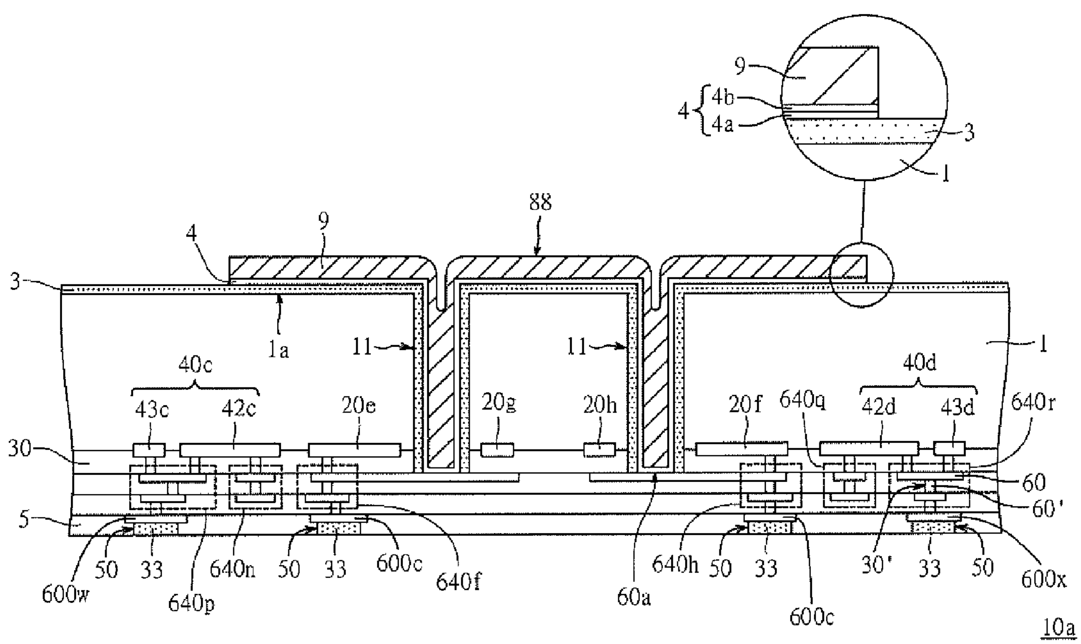
Figure 42F:
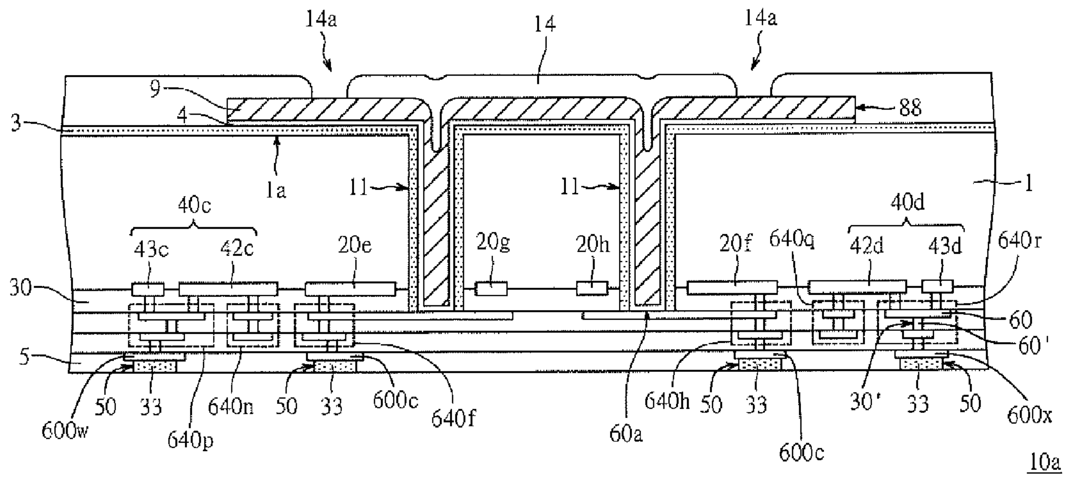
Figure 42G:
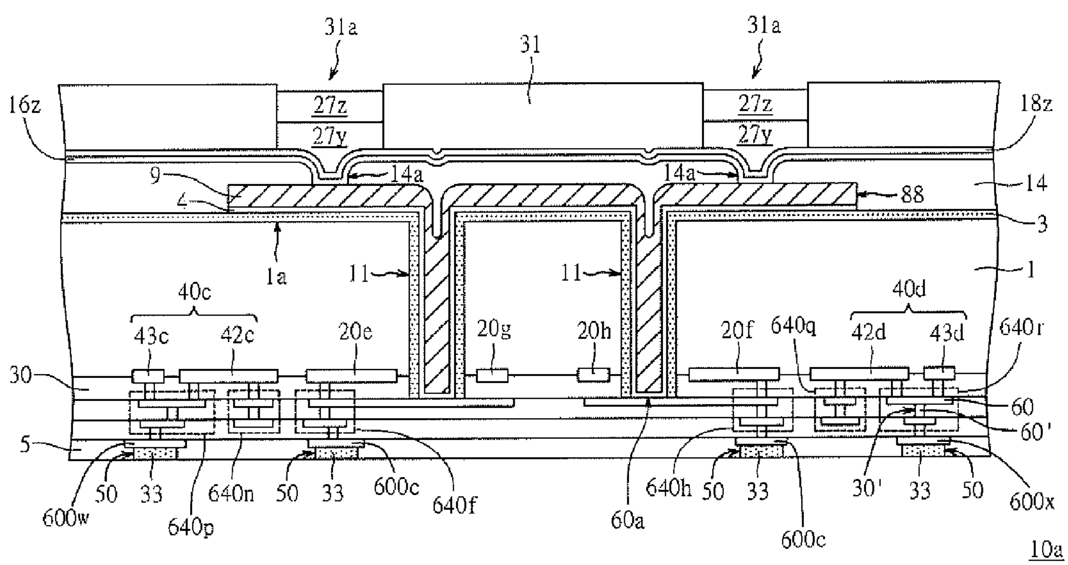
Figure 42H:
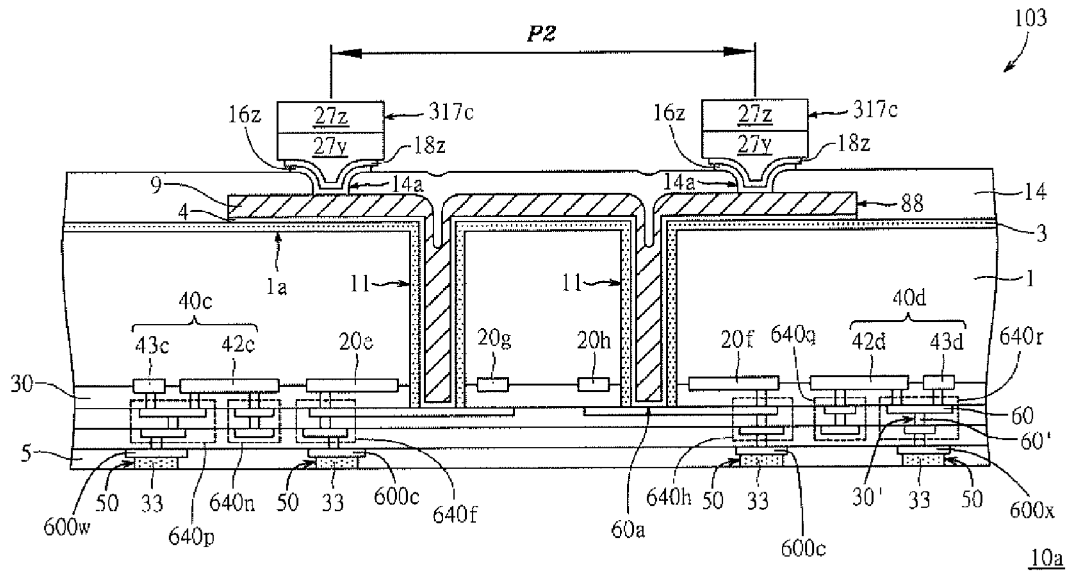
Figure 42I:
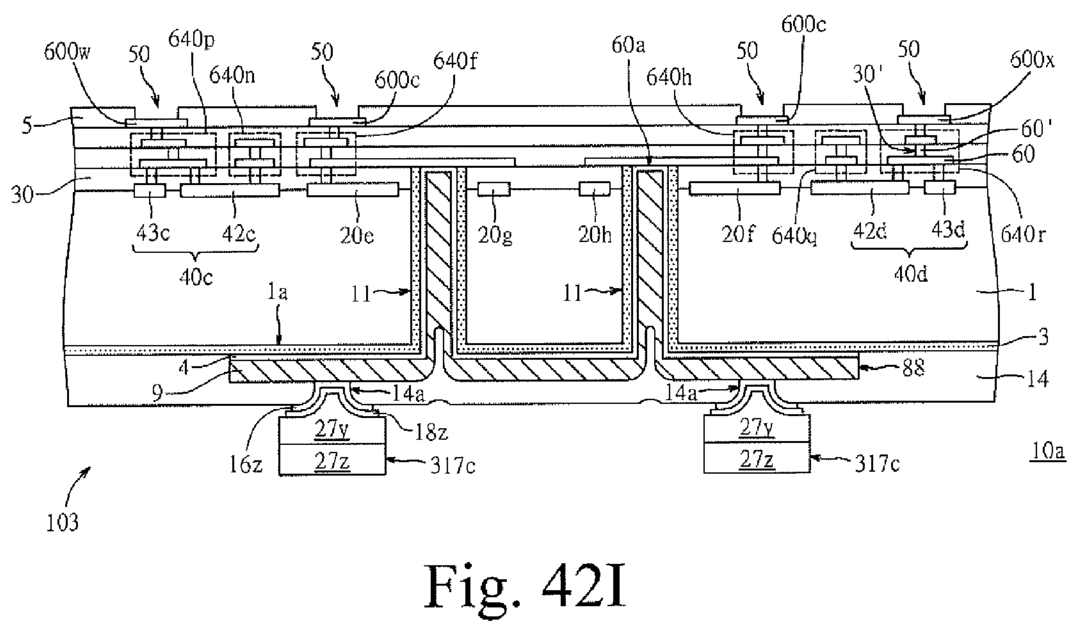
Figure 42J:
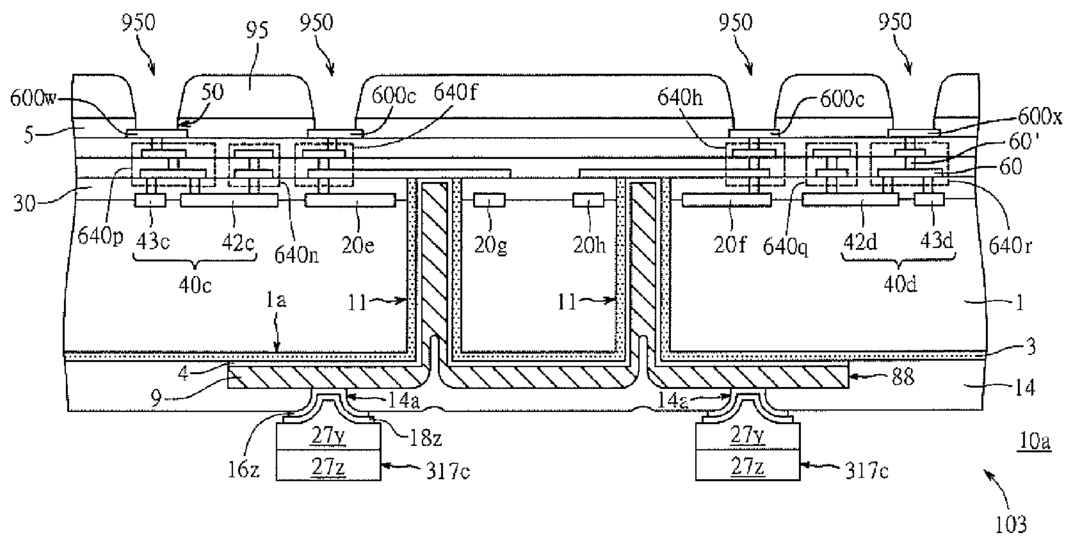
Figure 42K:
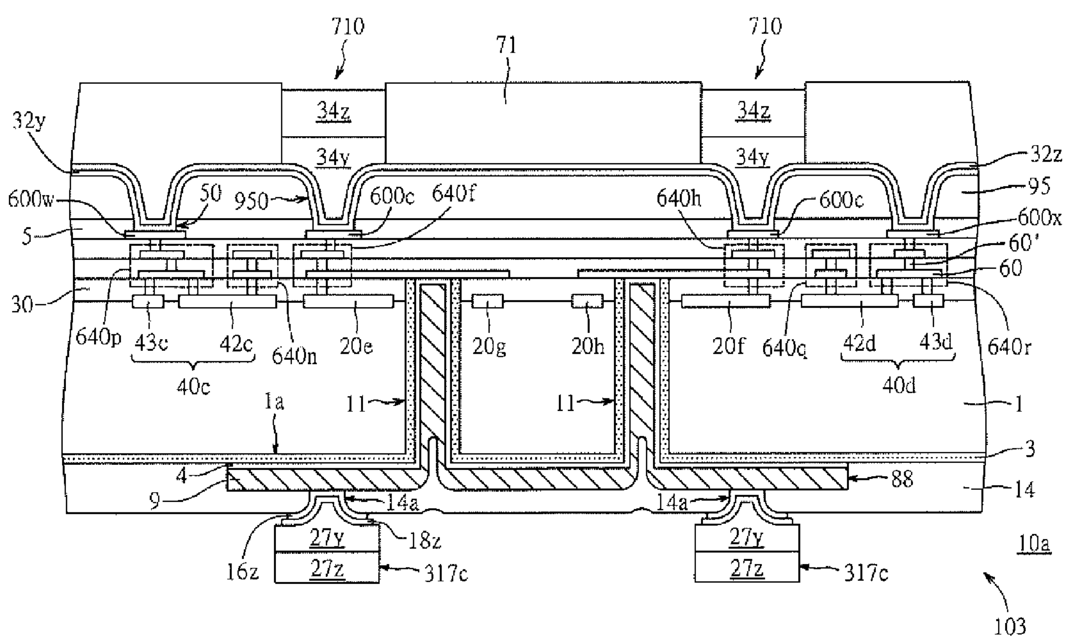
Figure 42L:
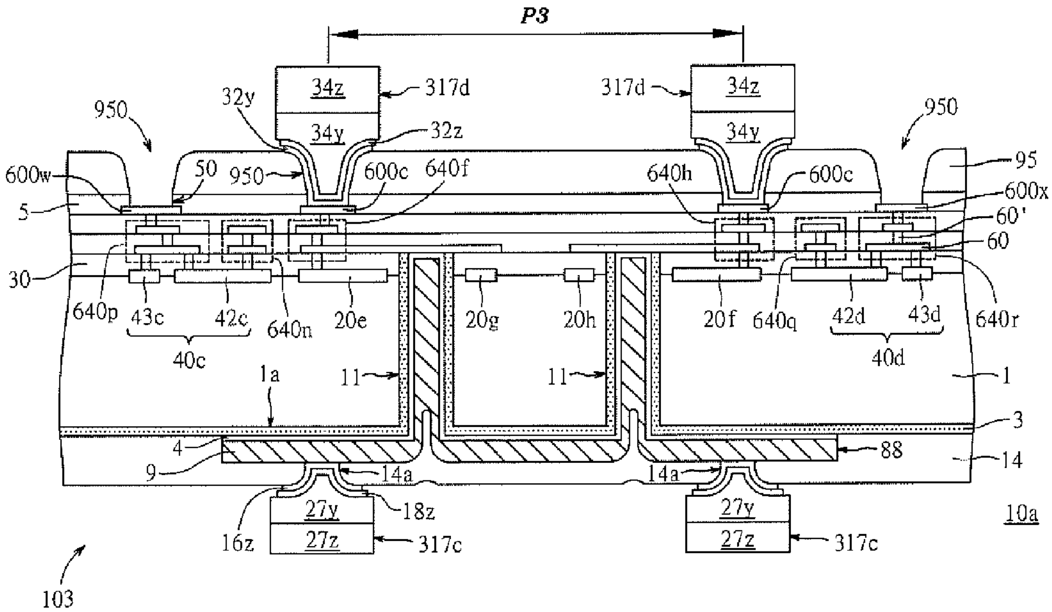
Figure 42M:
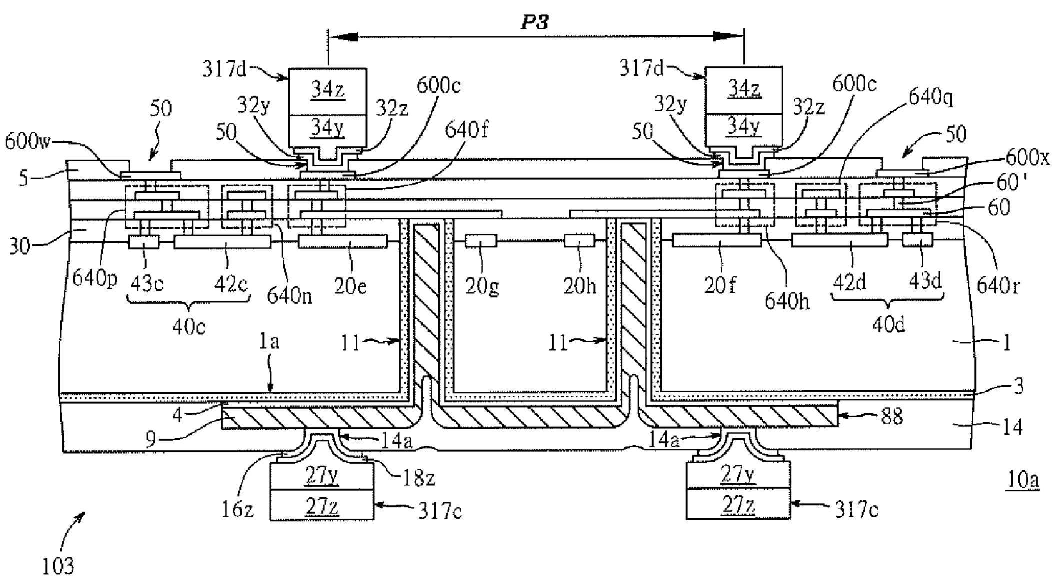
Figure 42N:
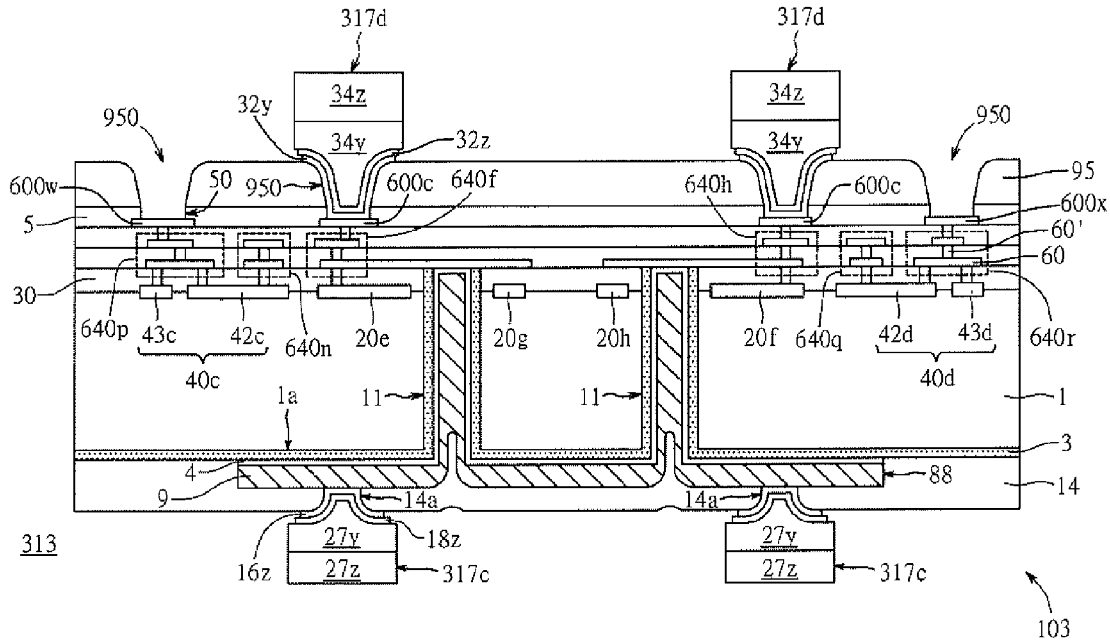
Figure 42O:
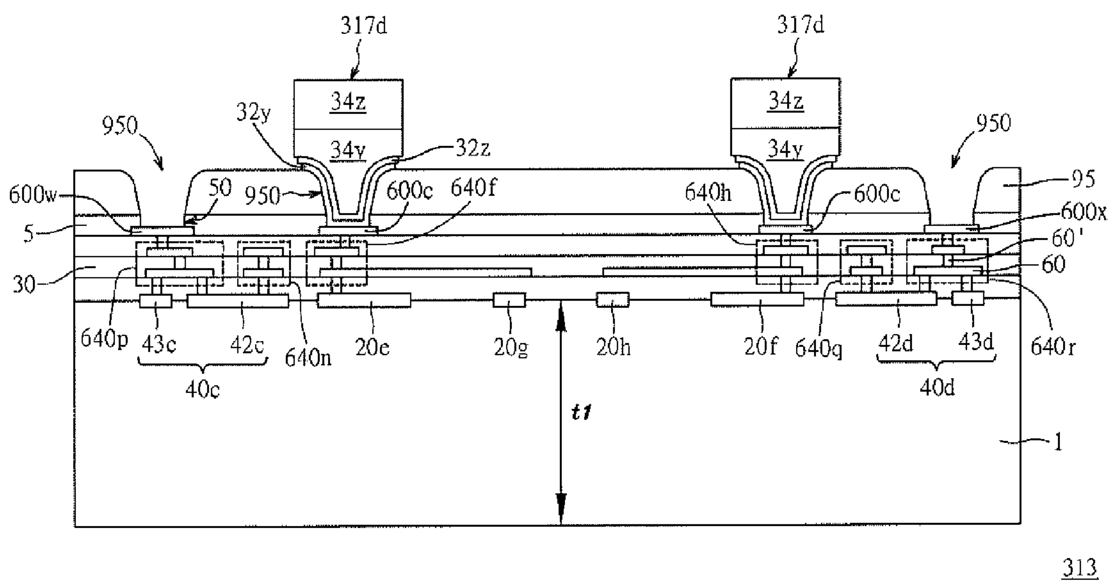

FIGS. 42A-42O are cross-sectional views showing a process for forming a chip, according to an embodiment.

FIGS. 43A-43E are cross-sectional views showing a process for forming a semiconductor wafer finalized to be cut into a plurality of a cache memory chip, according to an embodiment.

Figure 43A:
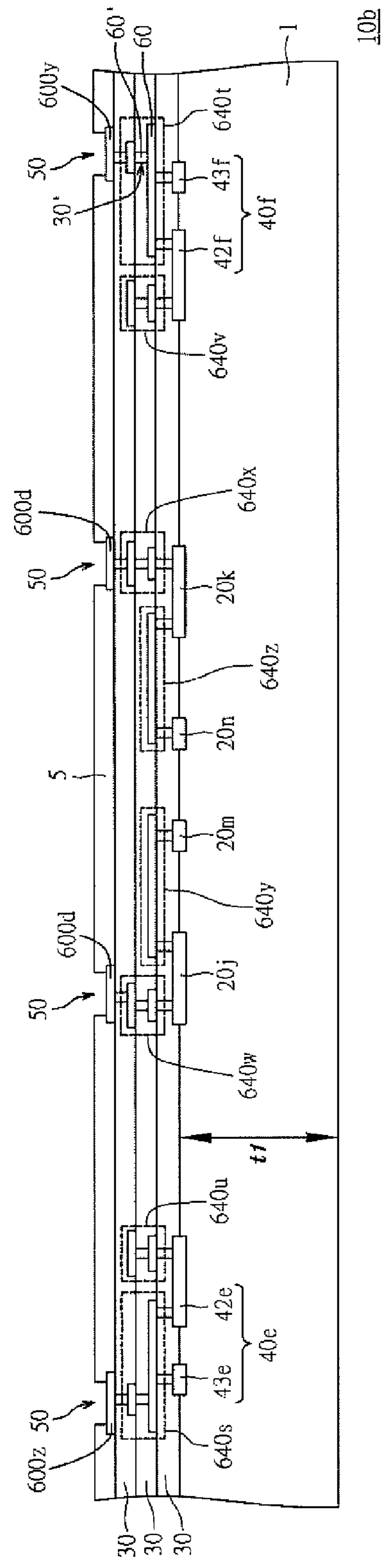
Figure 43B:
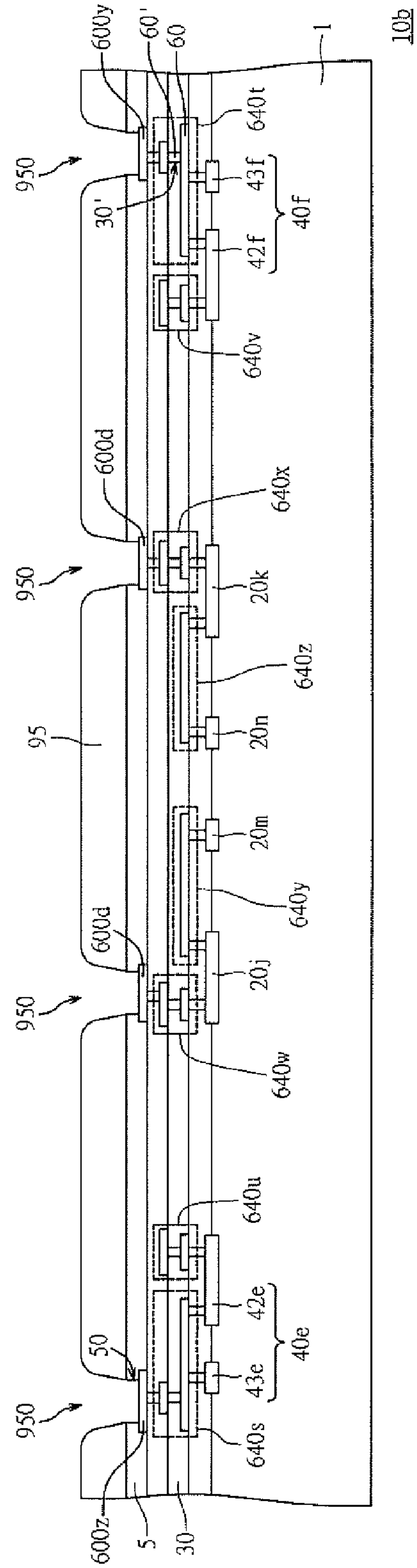
Figure 43C:
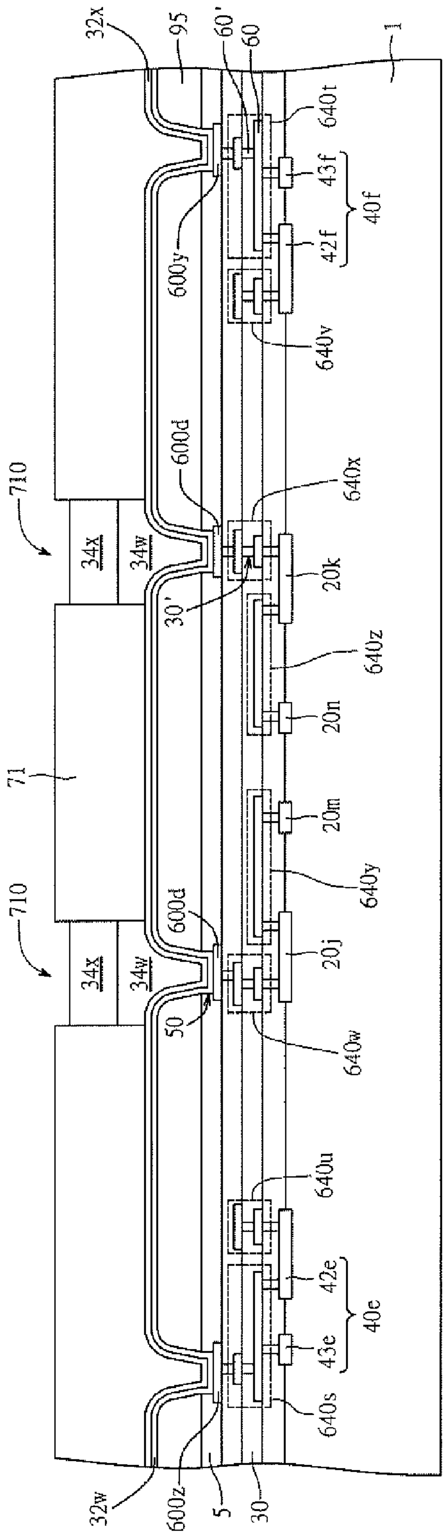
Figure 43D:
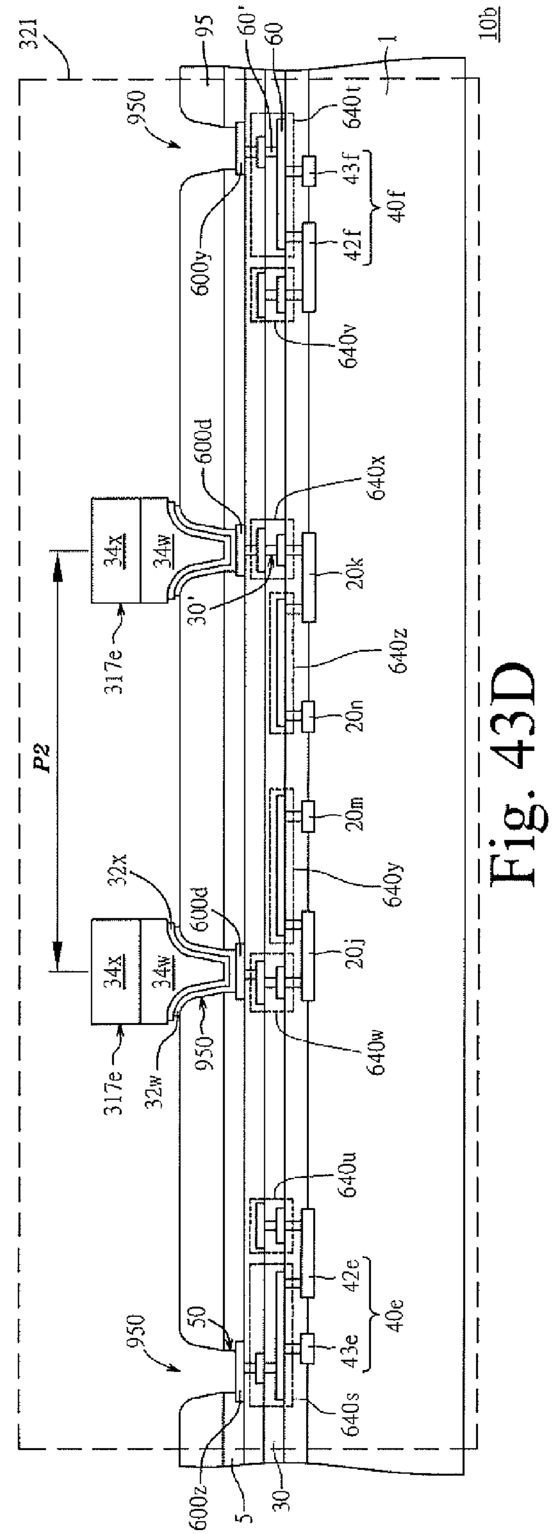
Figure 44A:
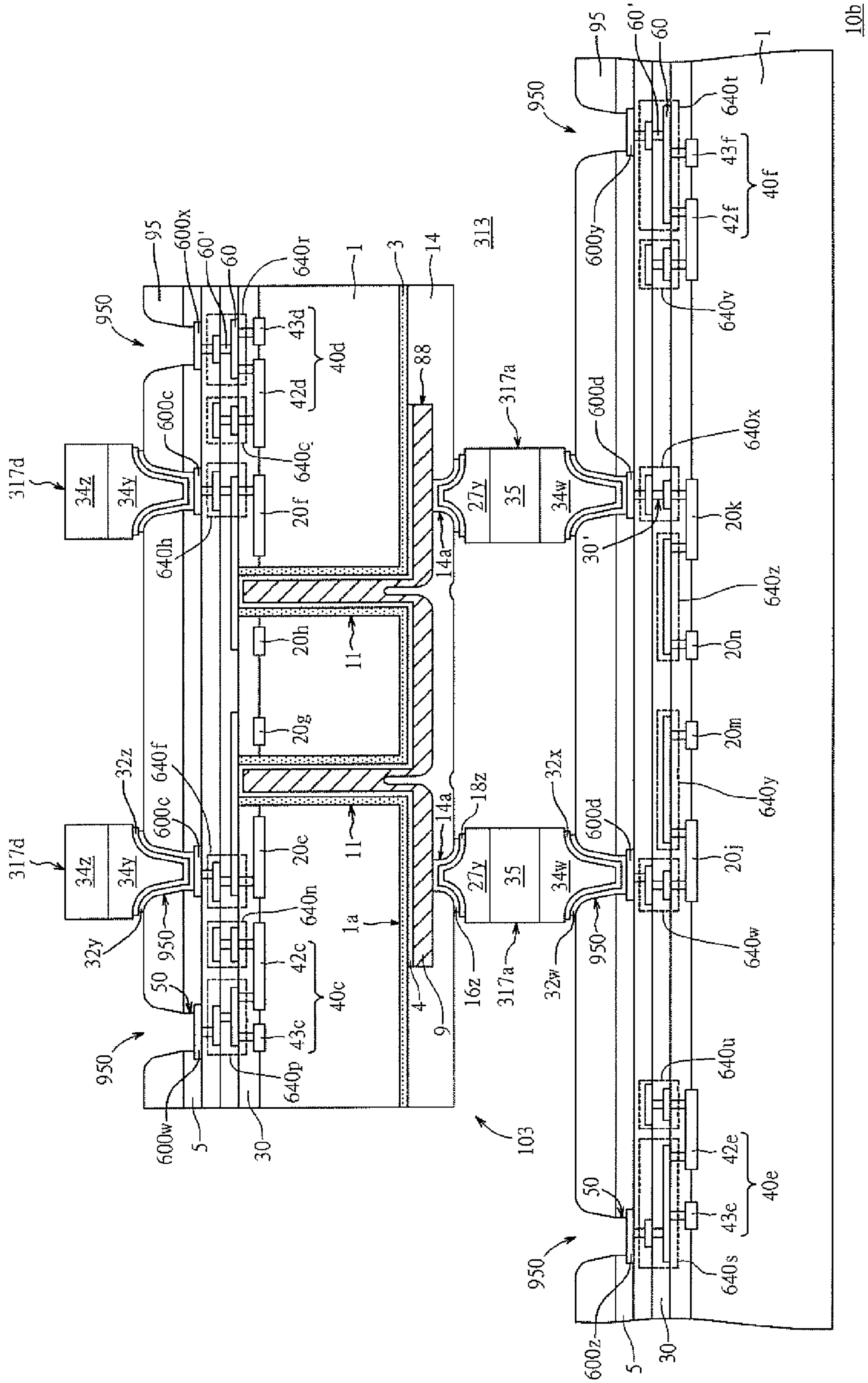
Figure 44B:
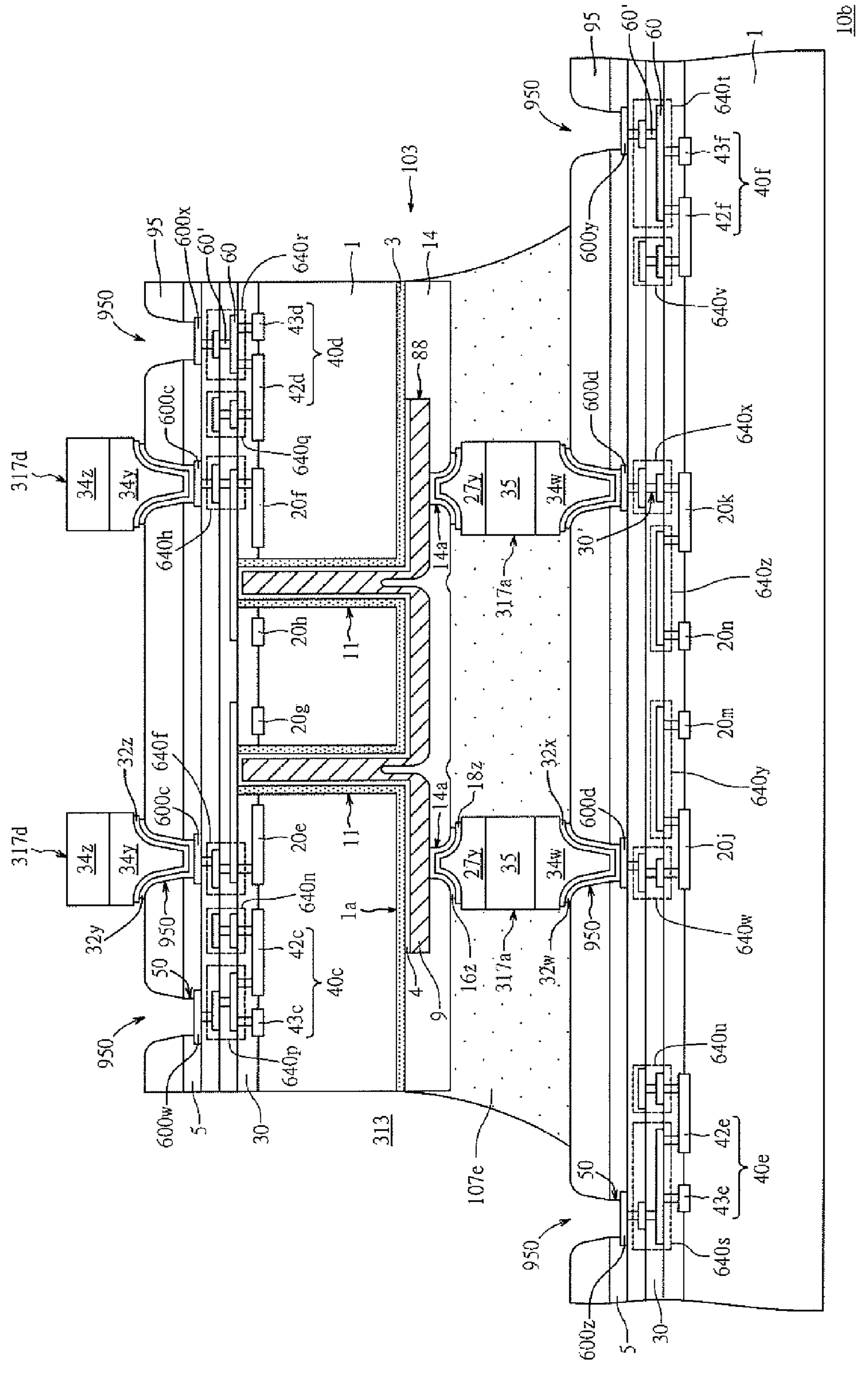
Figure 44C:
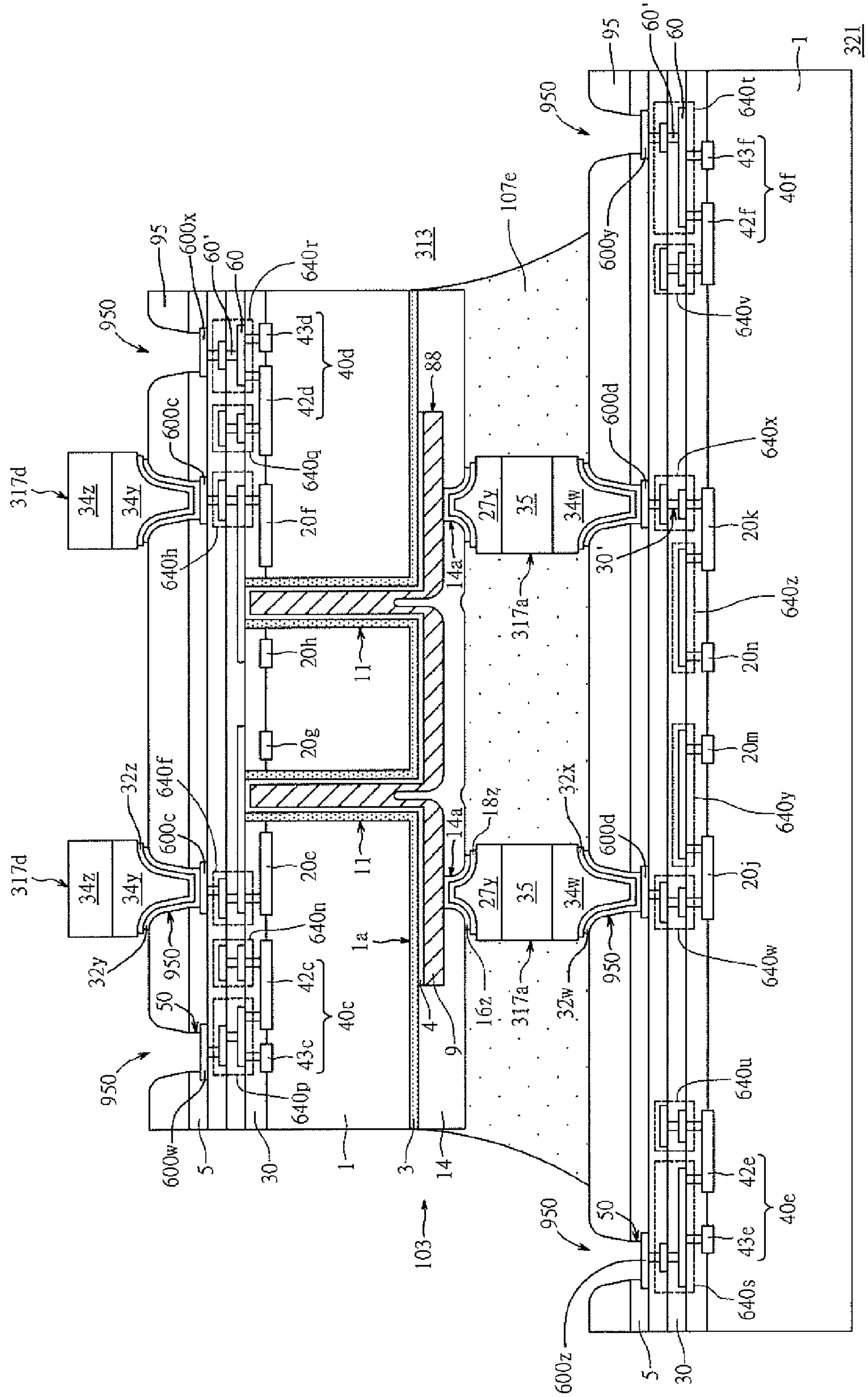

FIGS. 44A-44C are cross-sectional views showing a process for bonding the chip shown in FIG. 42N with the semiconductor wafer shown in FIG. 43D, according to an embodiment.

Figure 45A:
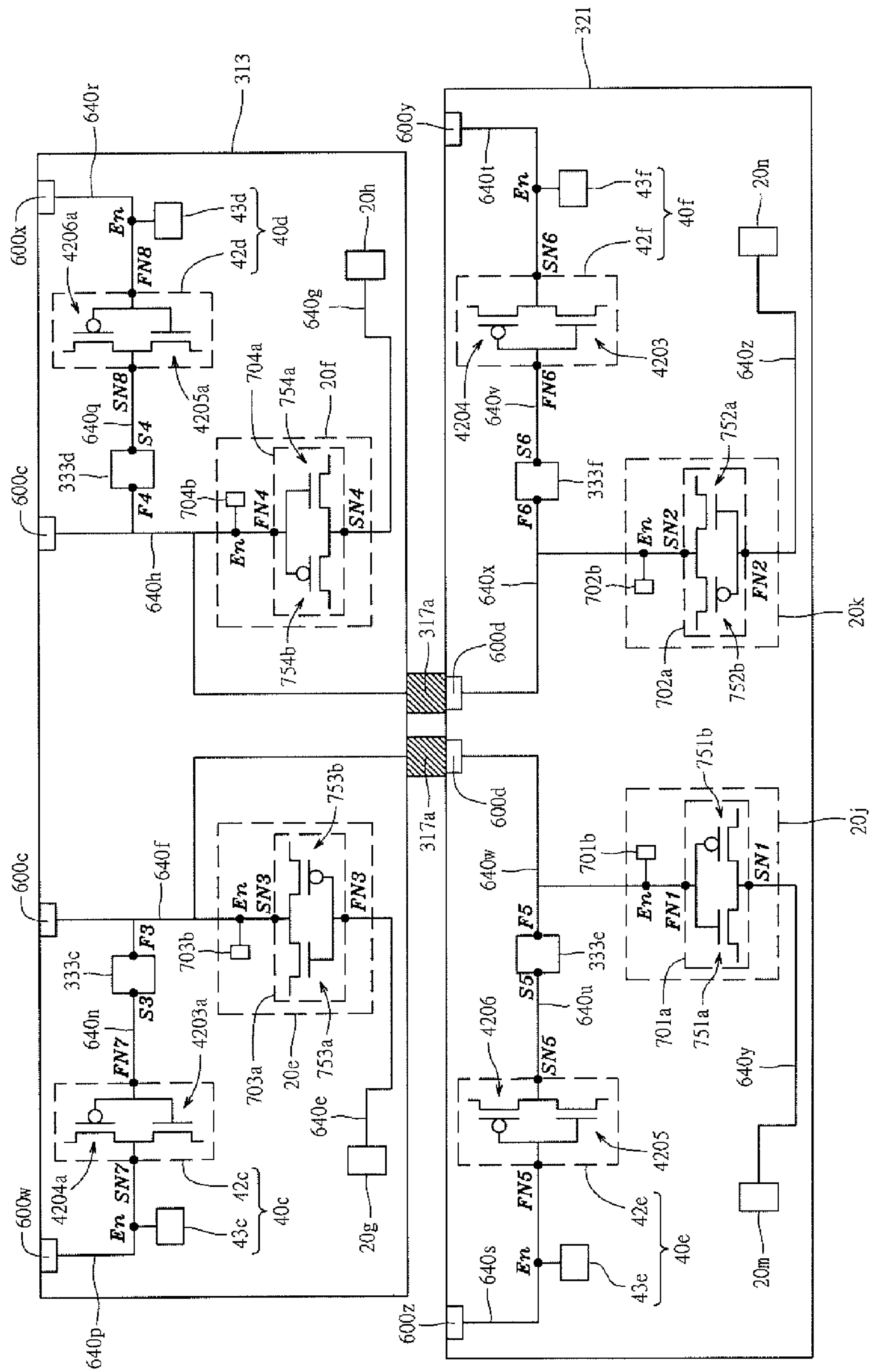
Figure 45B:
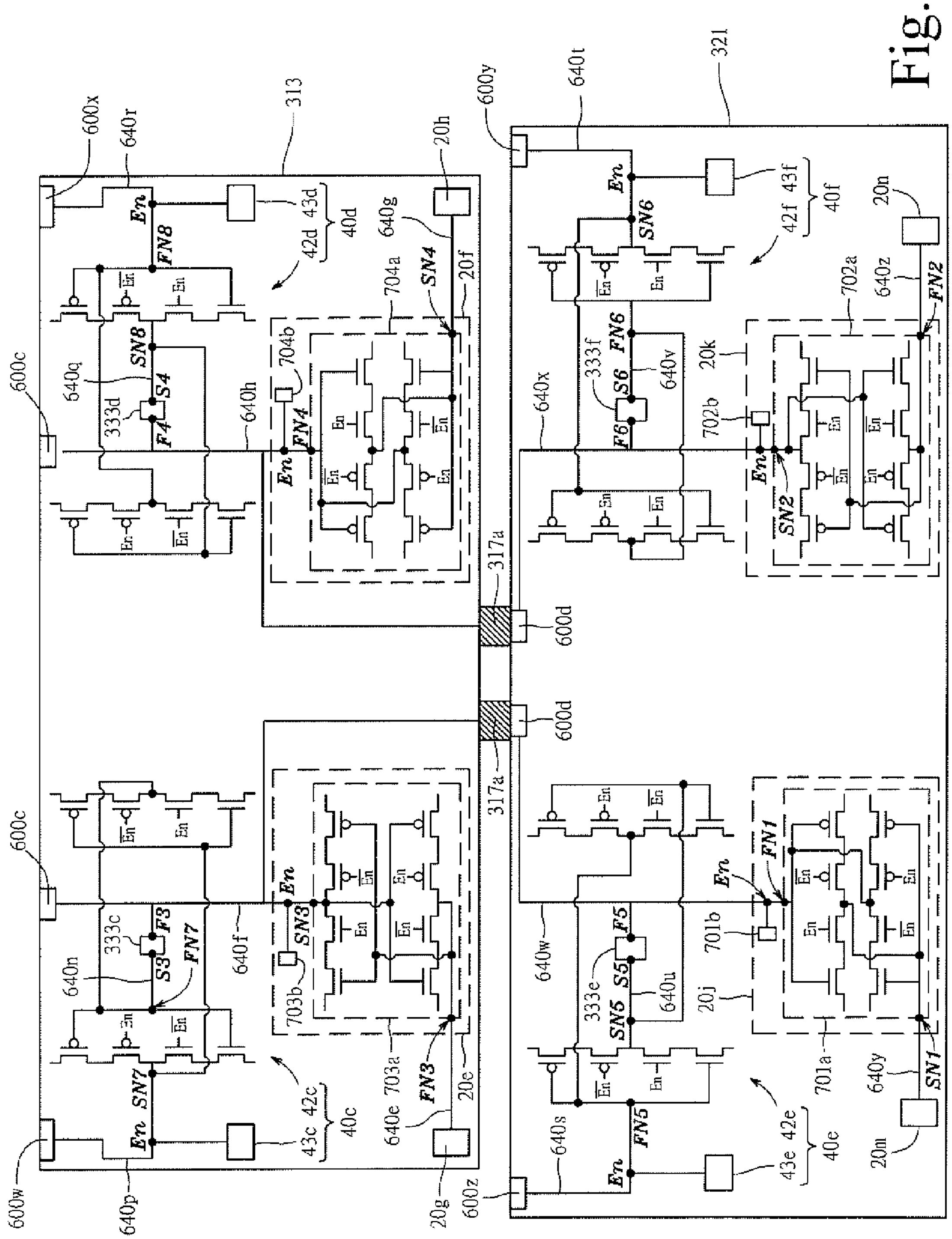

FIGS. 45A and 45B are circuit diagrams each showing interface circuits of a cache memory chip and a chip, according to an embodiment.

Figure 46A:
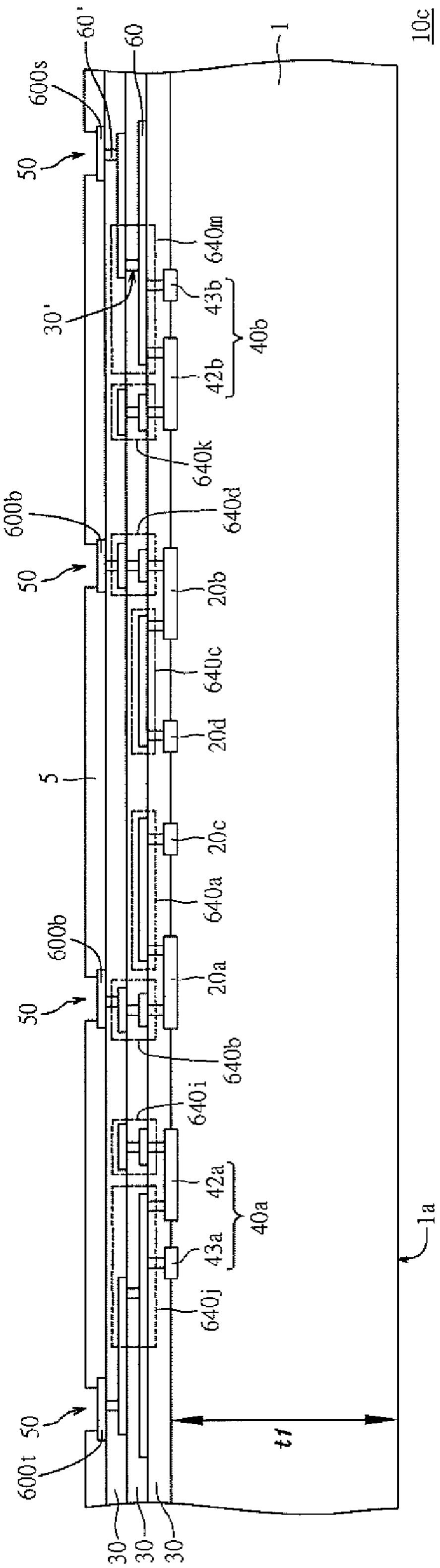
Figure 46B:
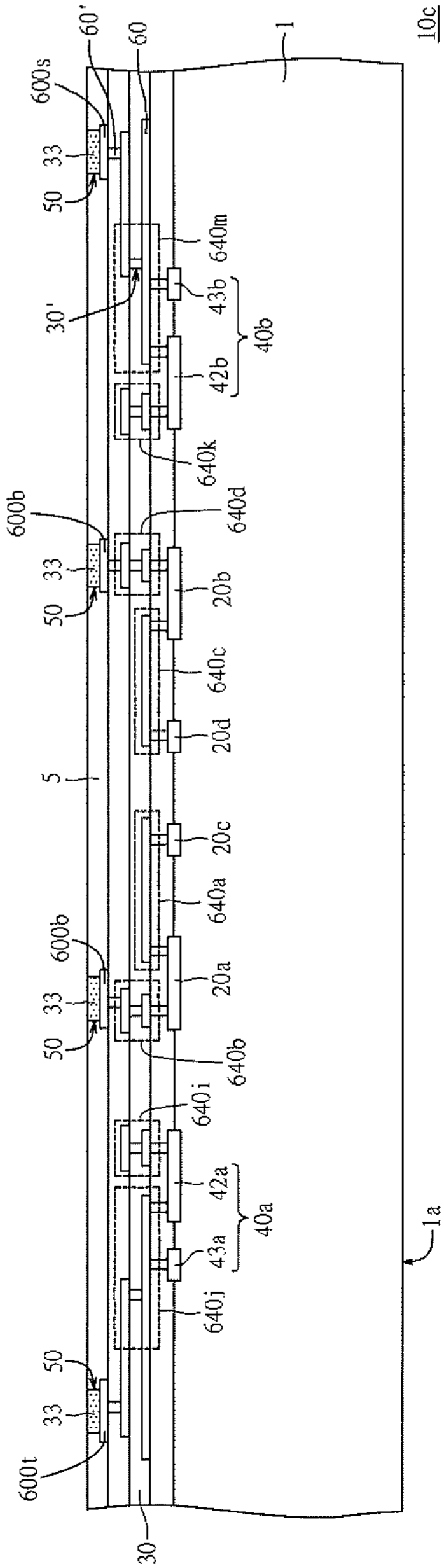
Figure 46C:
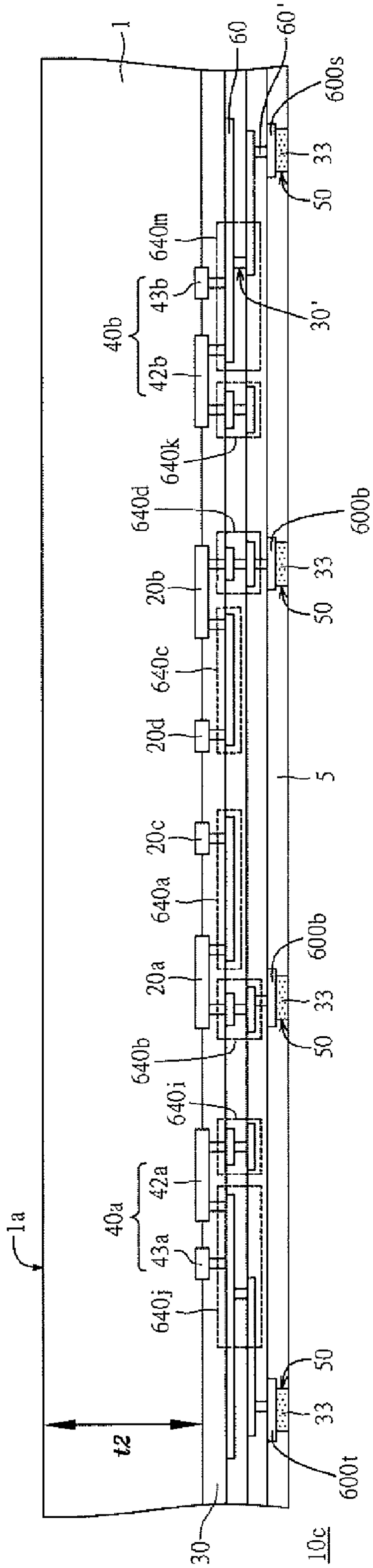
Figure 46D:
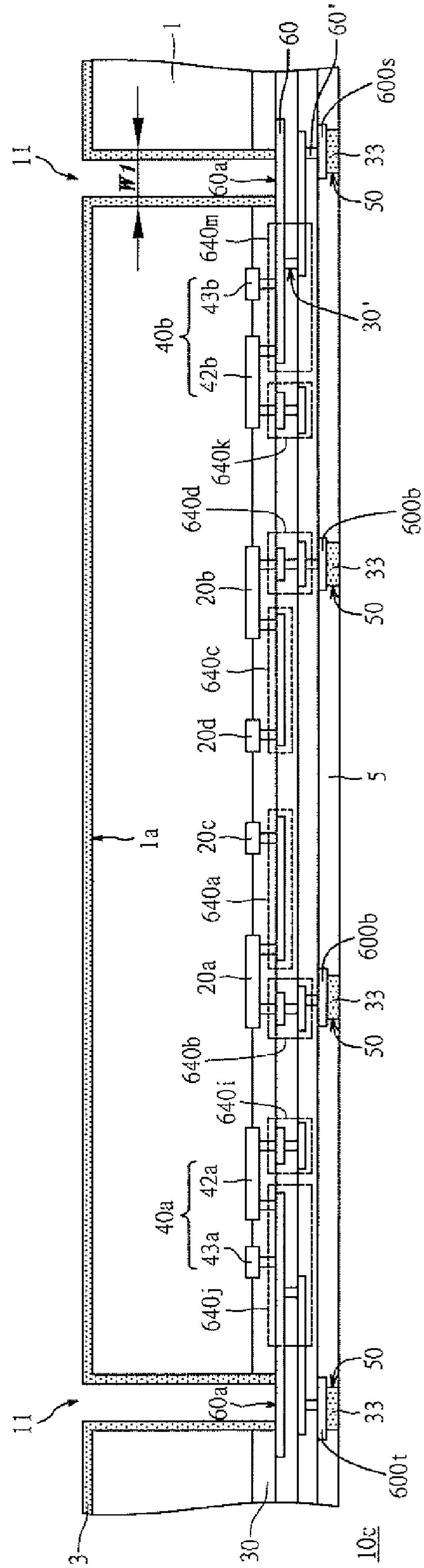
Figure 46E:
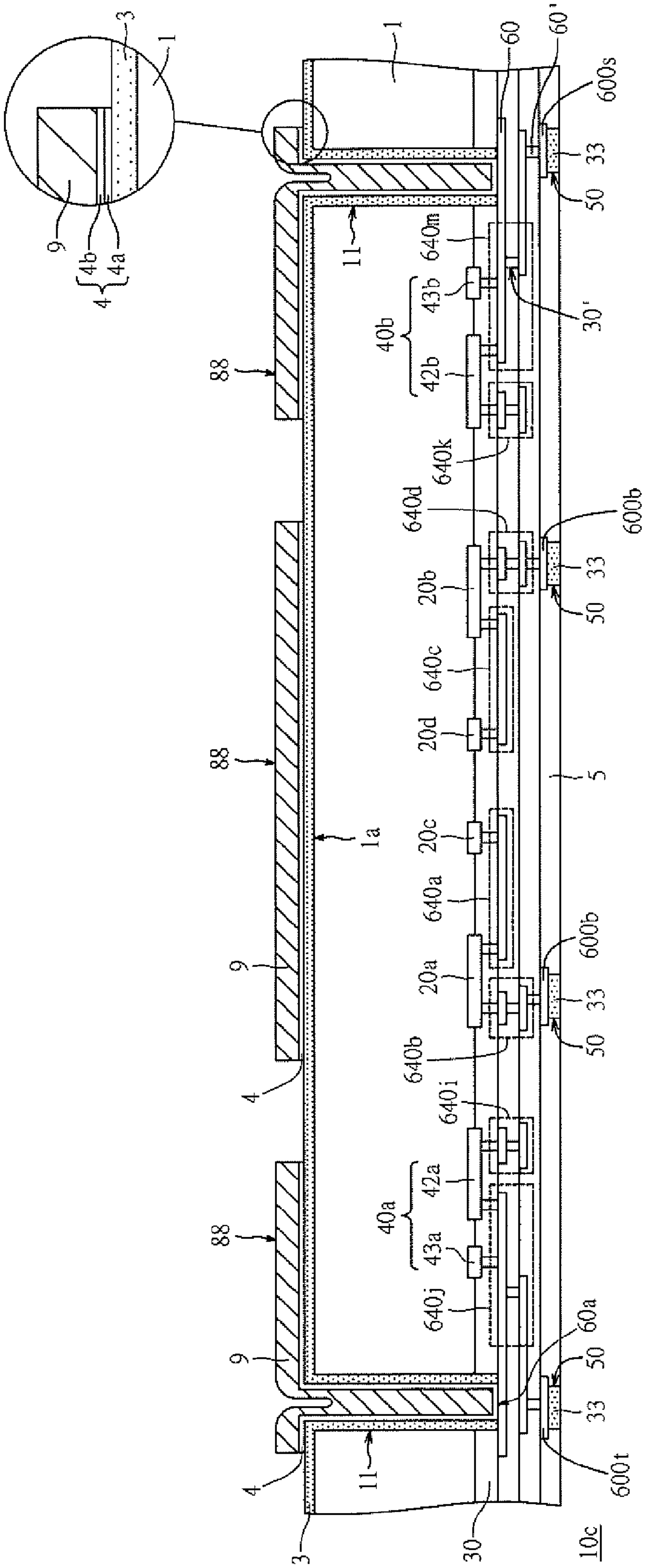
Figure 46F:
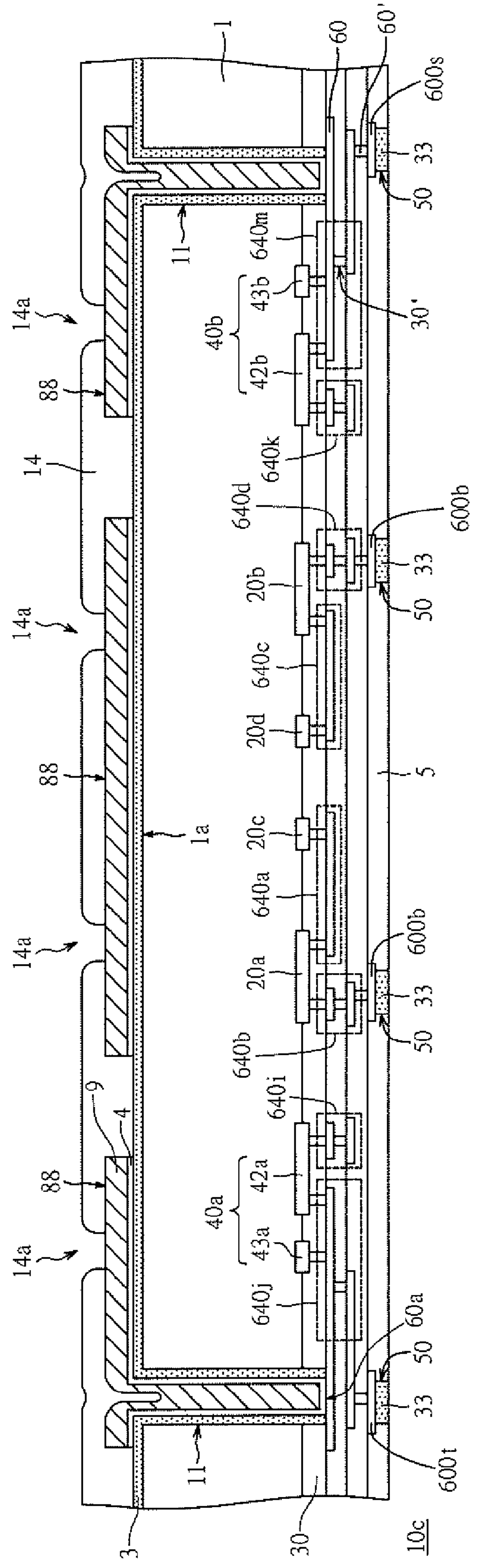
Figure 46G:
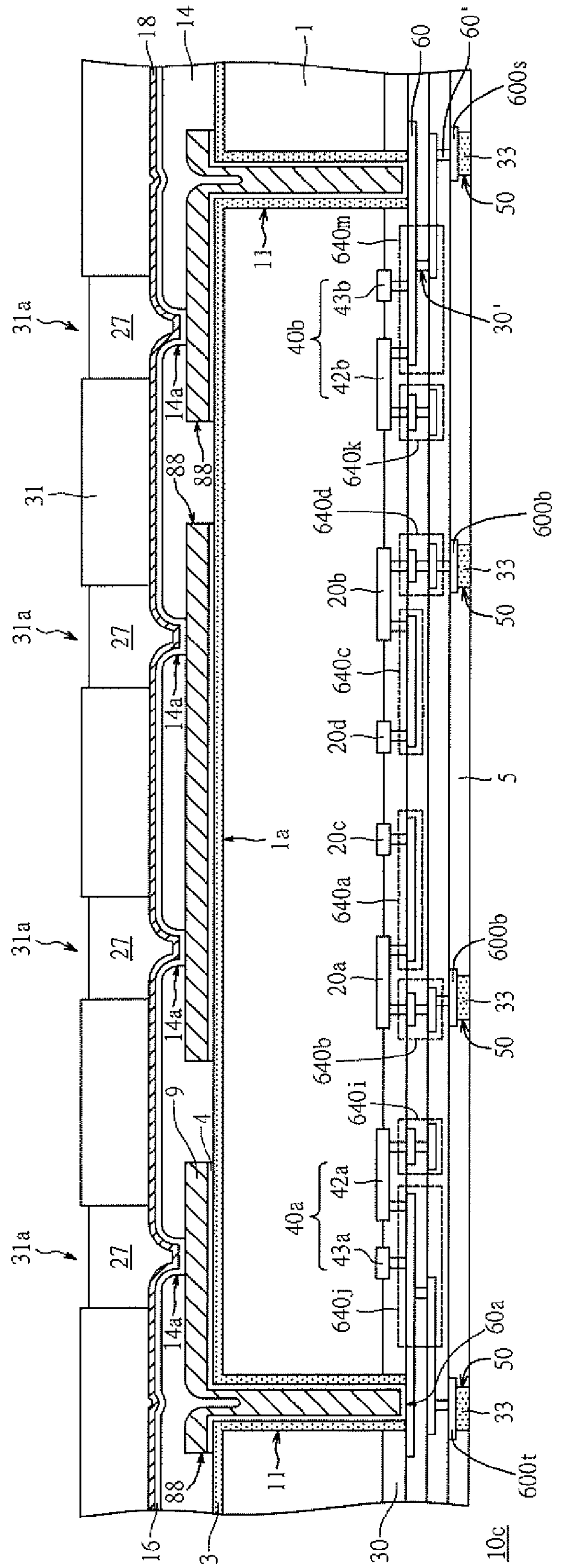
Figure 46H:
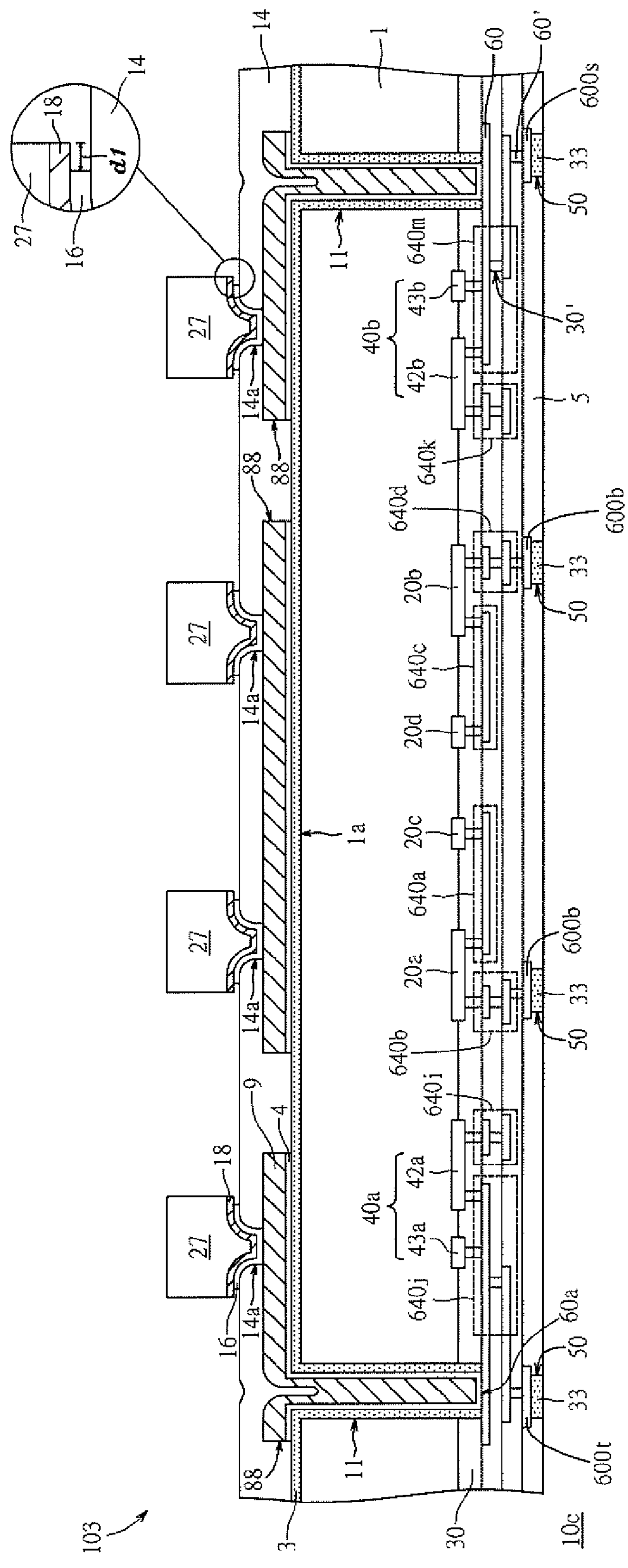
Figure 46I:
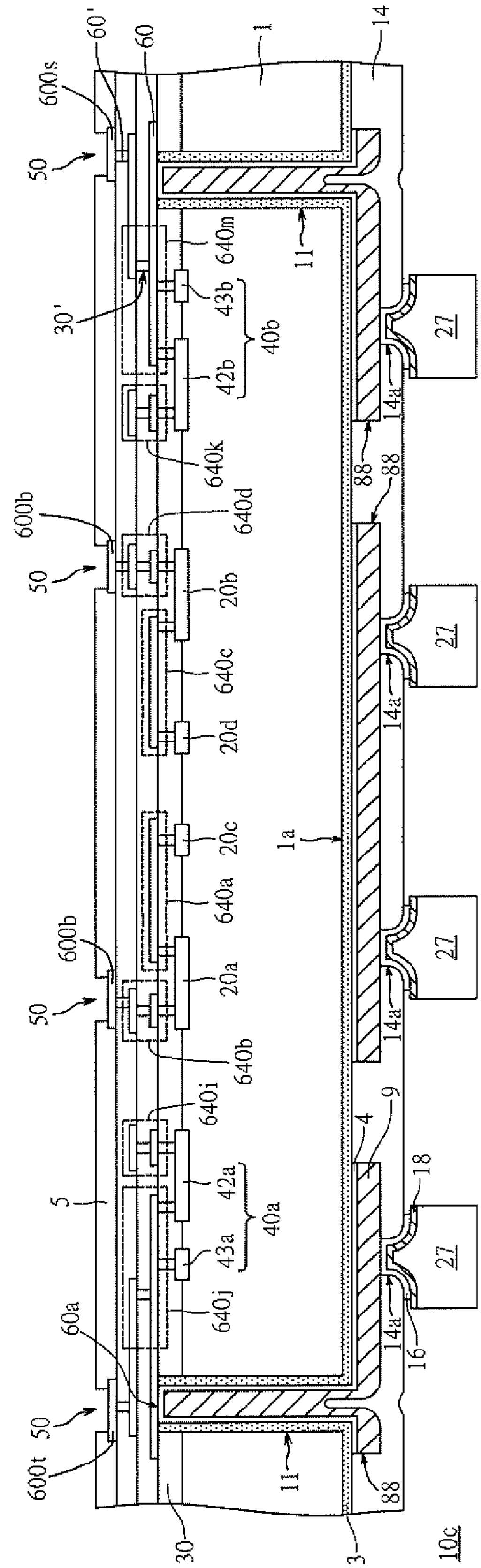
Figure 46J:
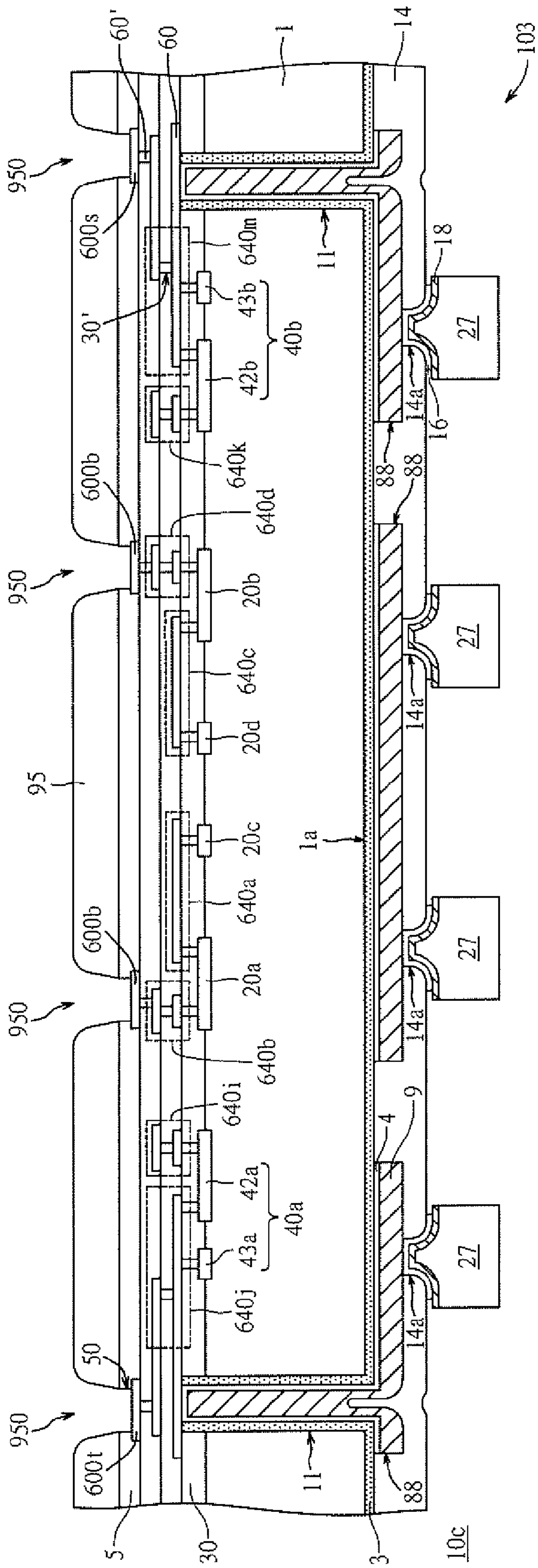
Figure 46K:
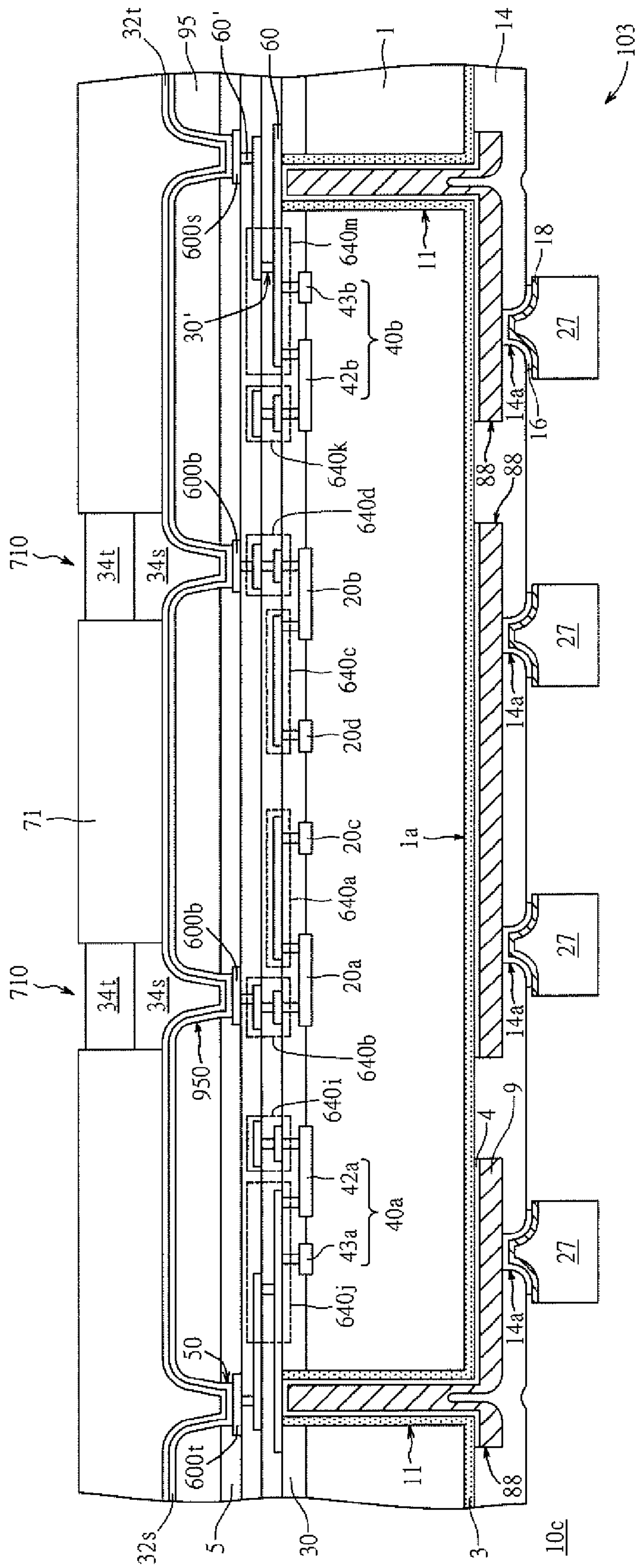
Figure 46L:
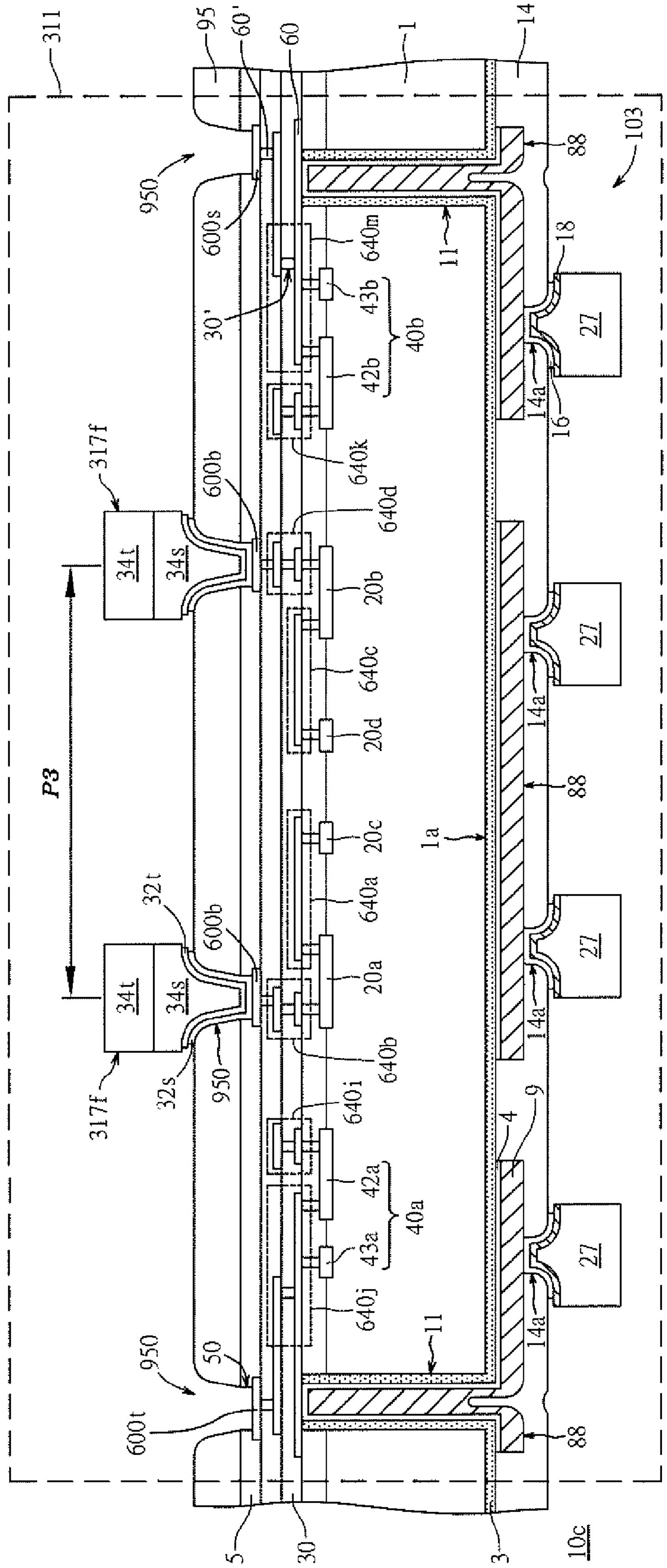
Figure 46M:
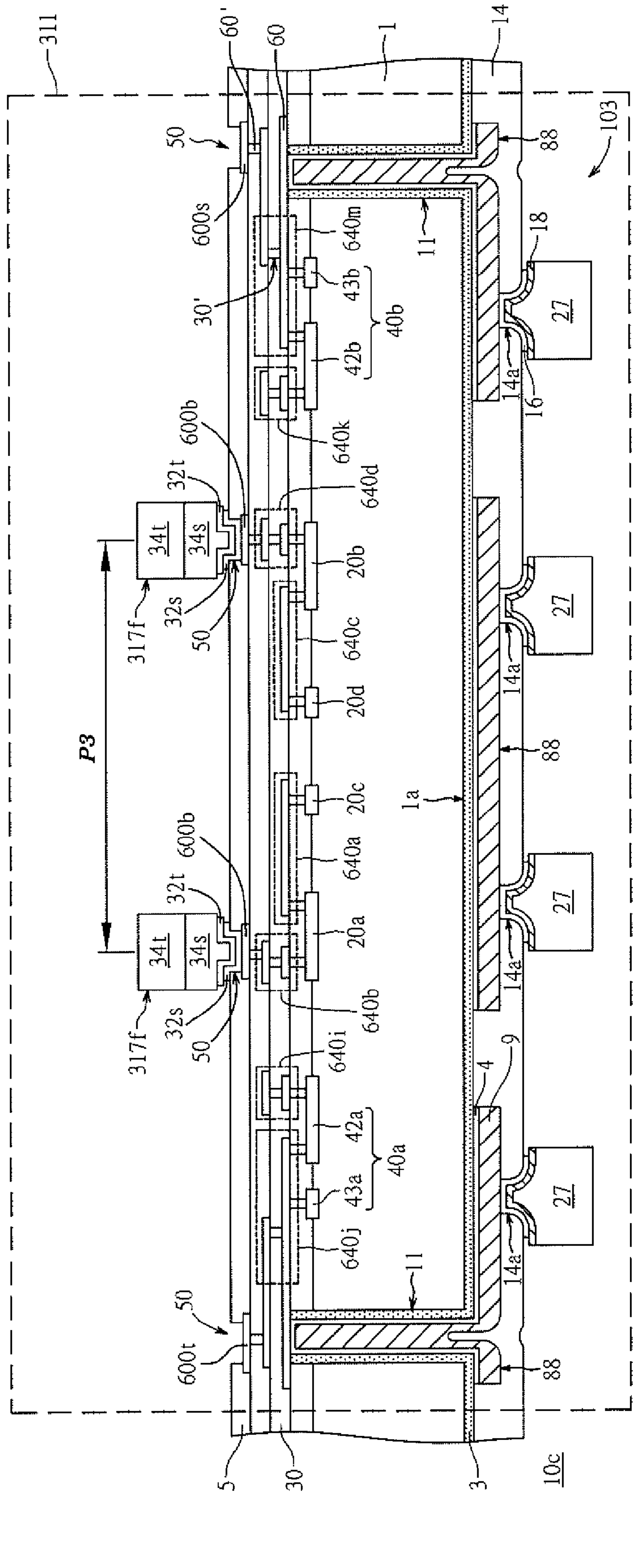
Figure 46N:
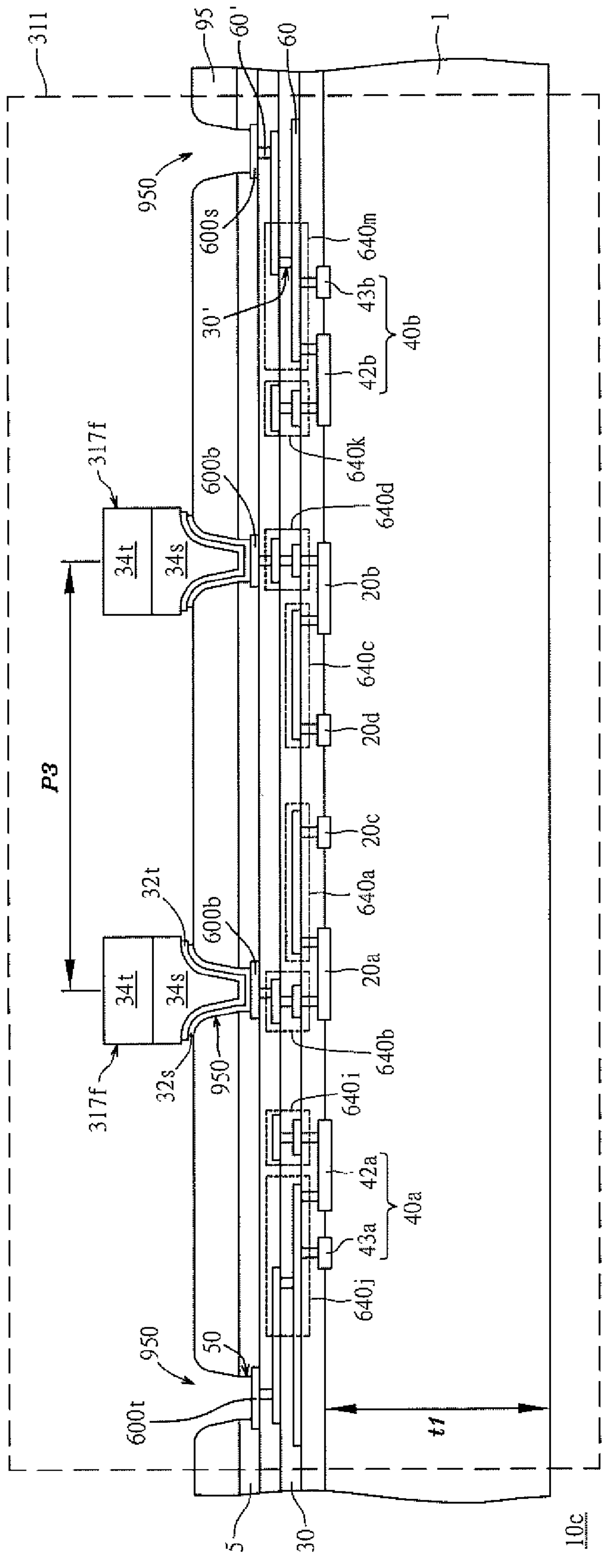

FIGS. 46A-46N are cross-sectional views showing a process for forming a semiconductor wafer finalized to be cut into a plurality of a cache memory chip, according to an embodiment.

Figure 47A:
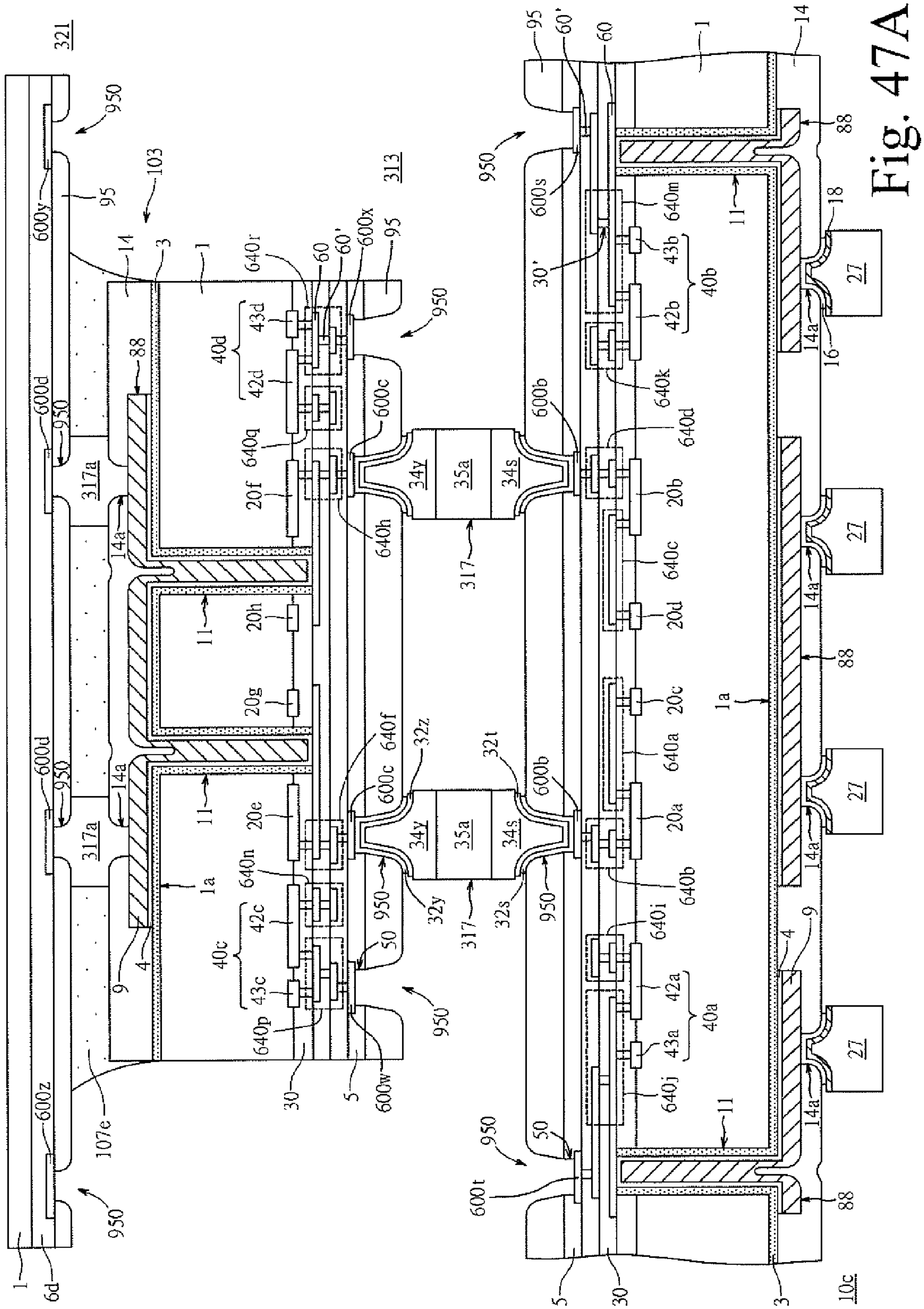
Figure 47B:
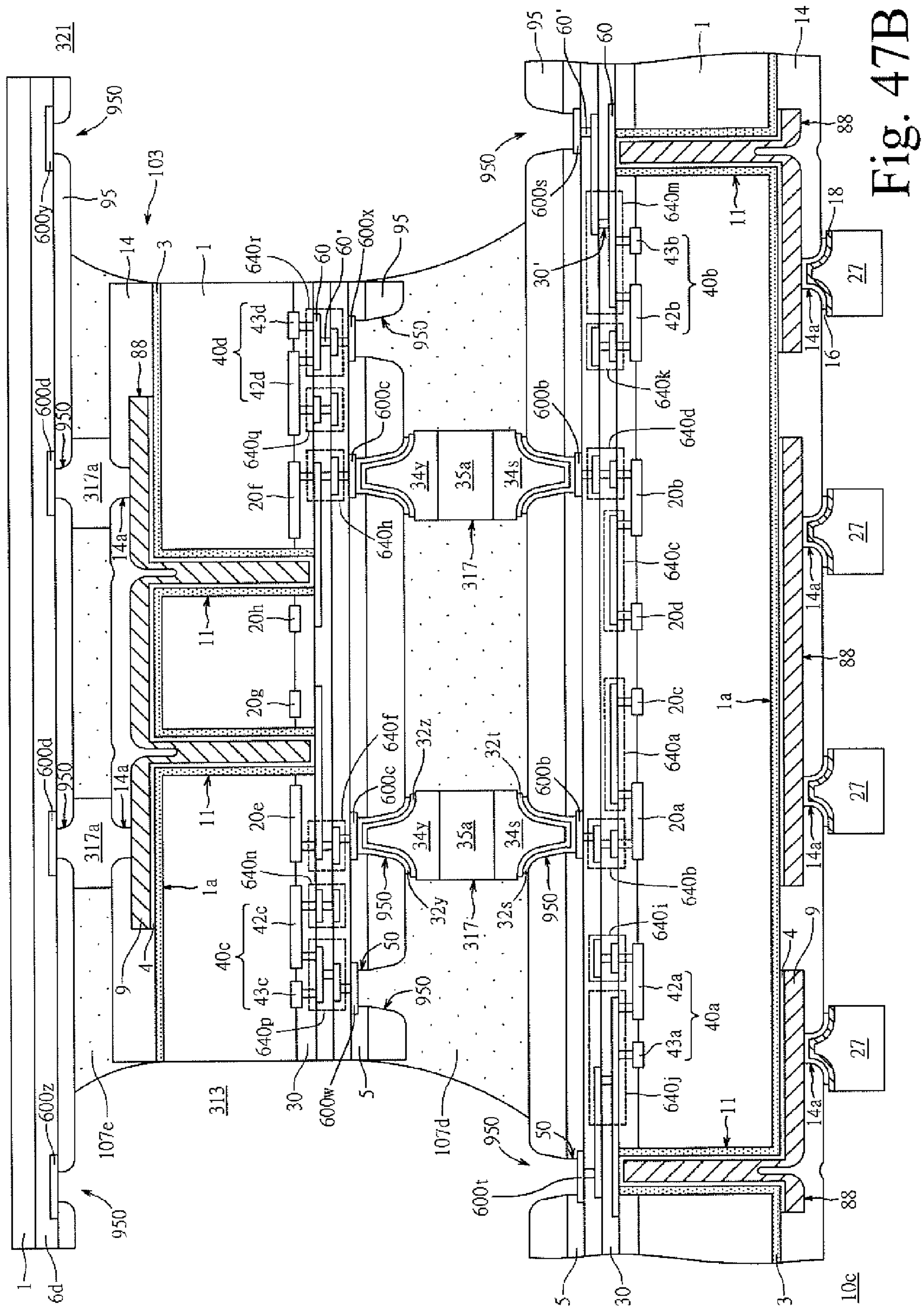
Figure 47C:
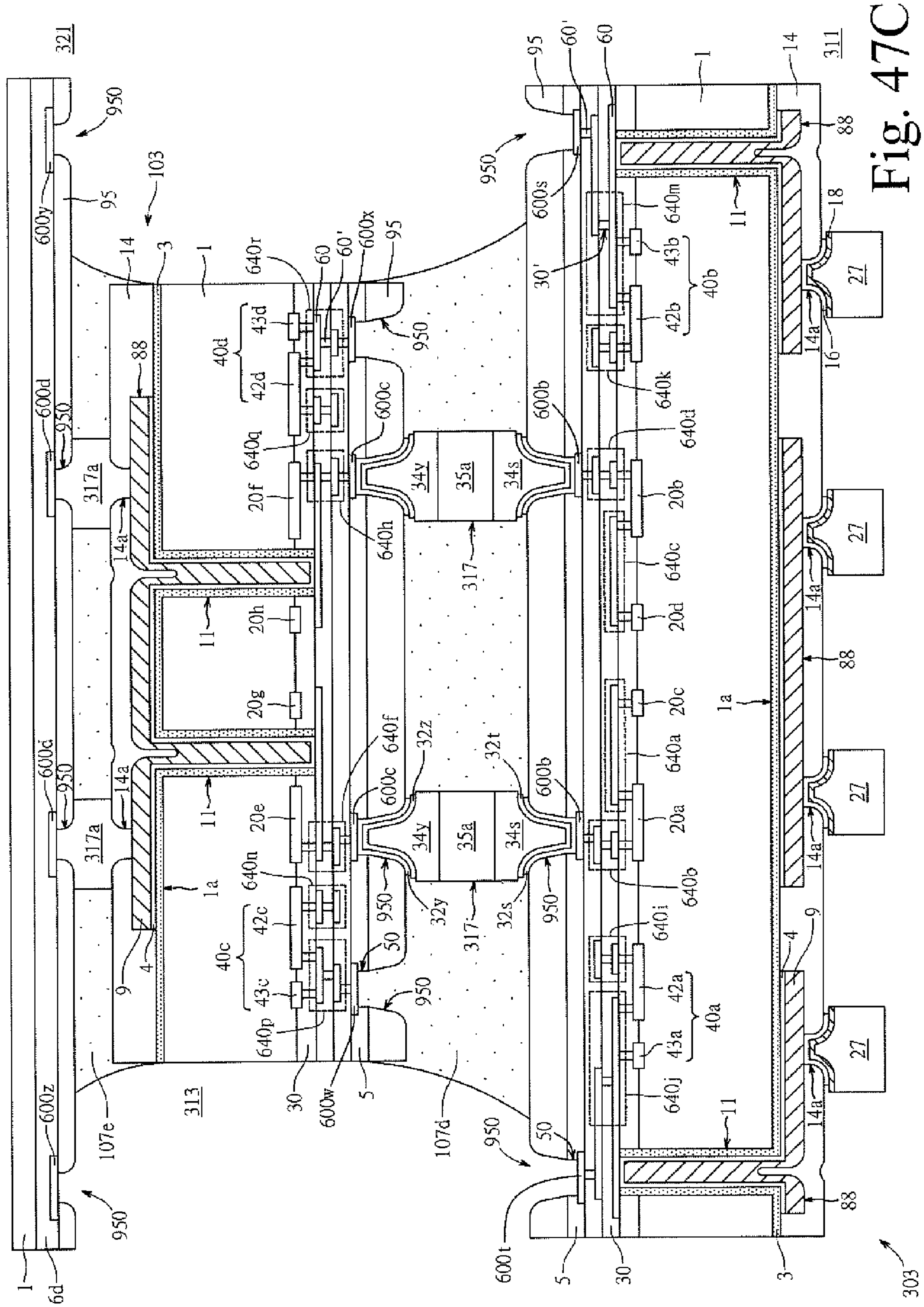

FIGS. 47A-47C are cross-sectional views showing a process for forming a processor unit, according to an embodiment.

Figure 47D:
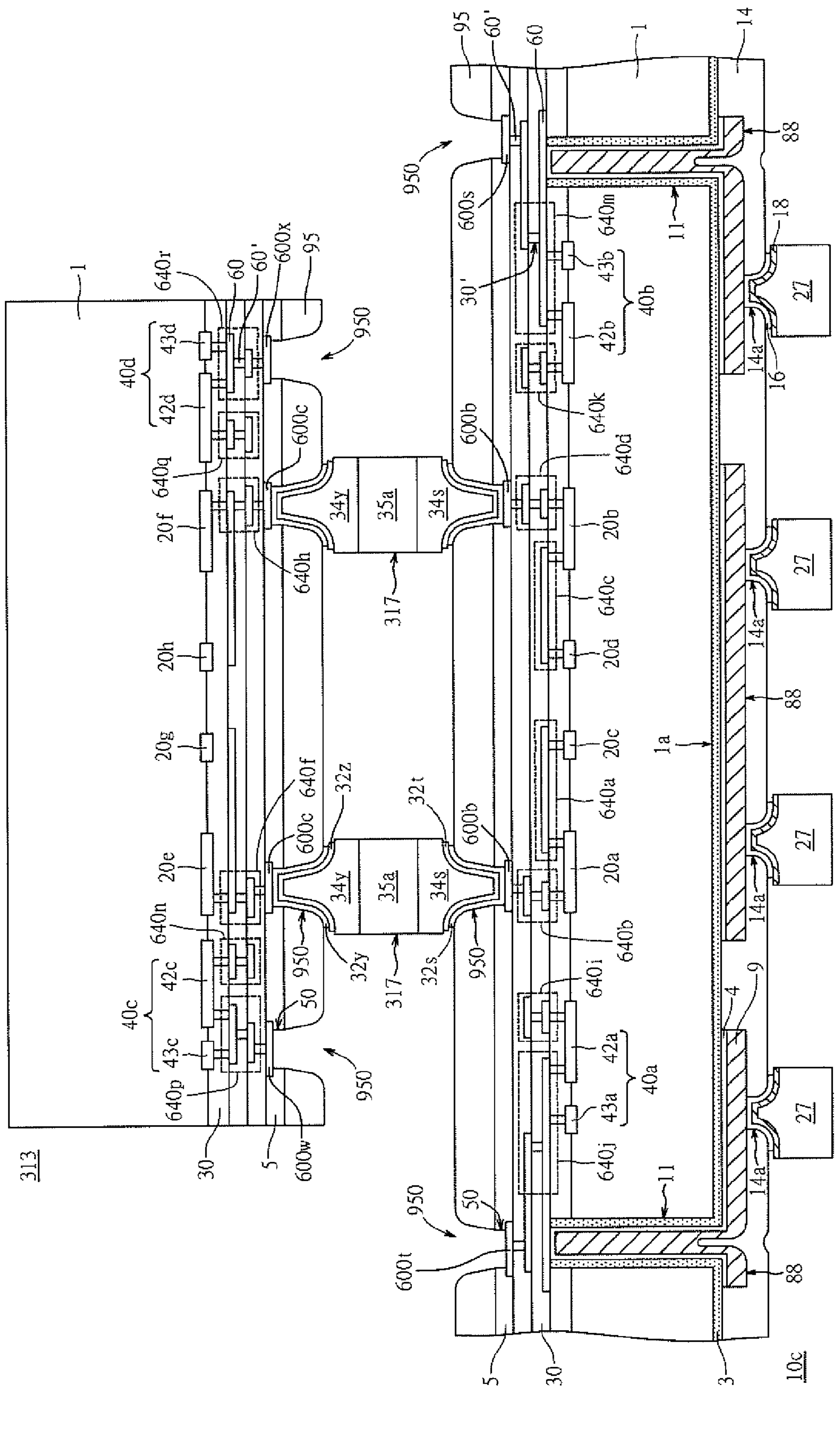
Figure 47E:
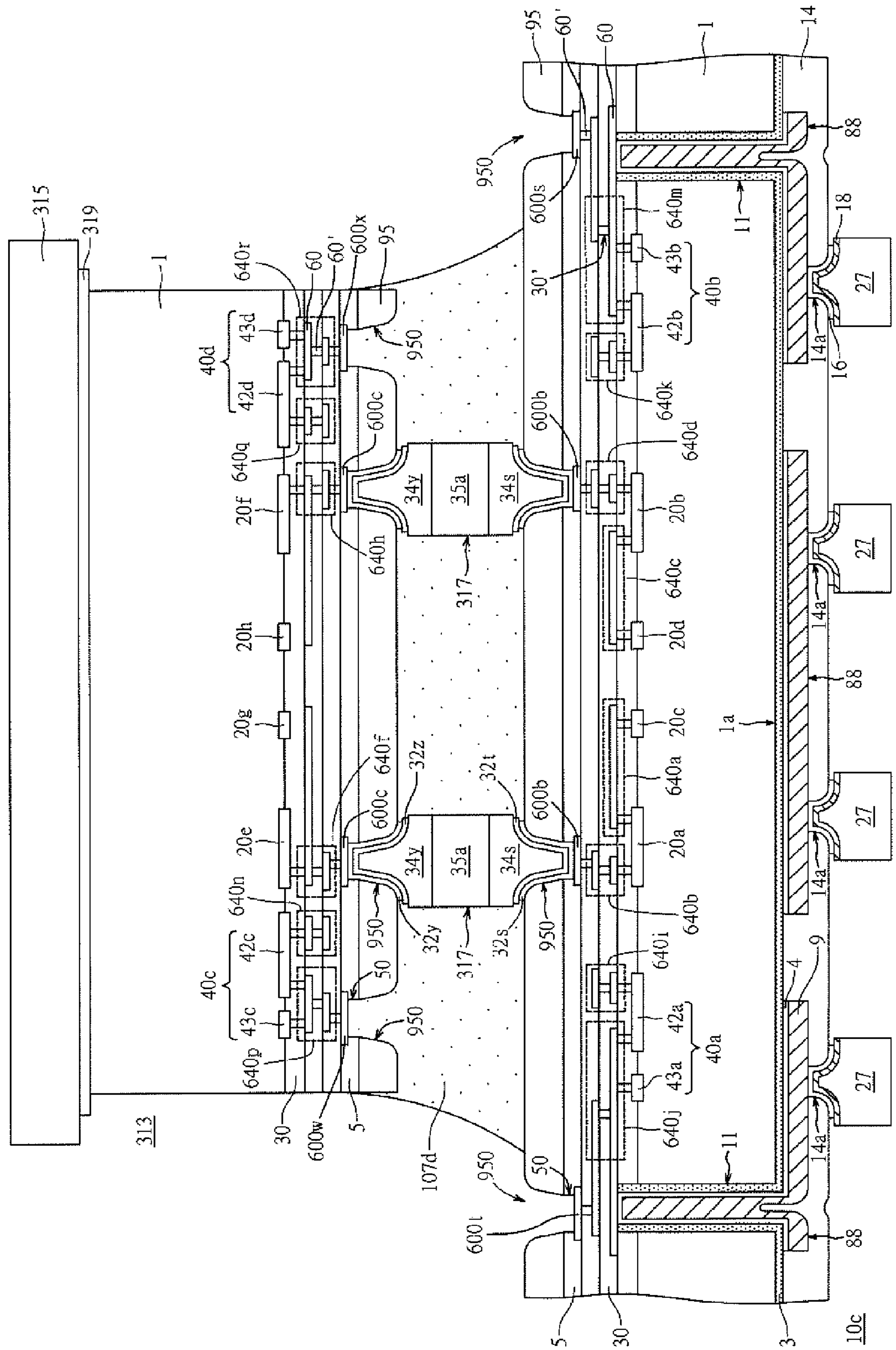
Figure 47F:
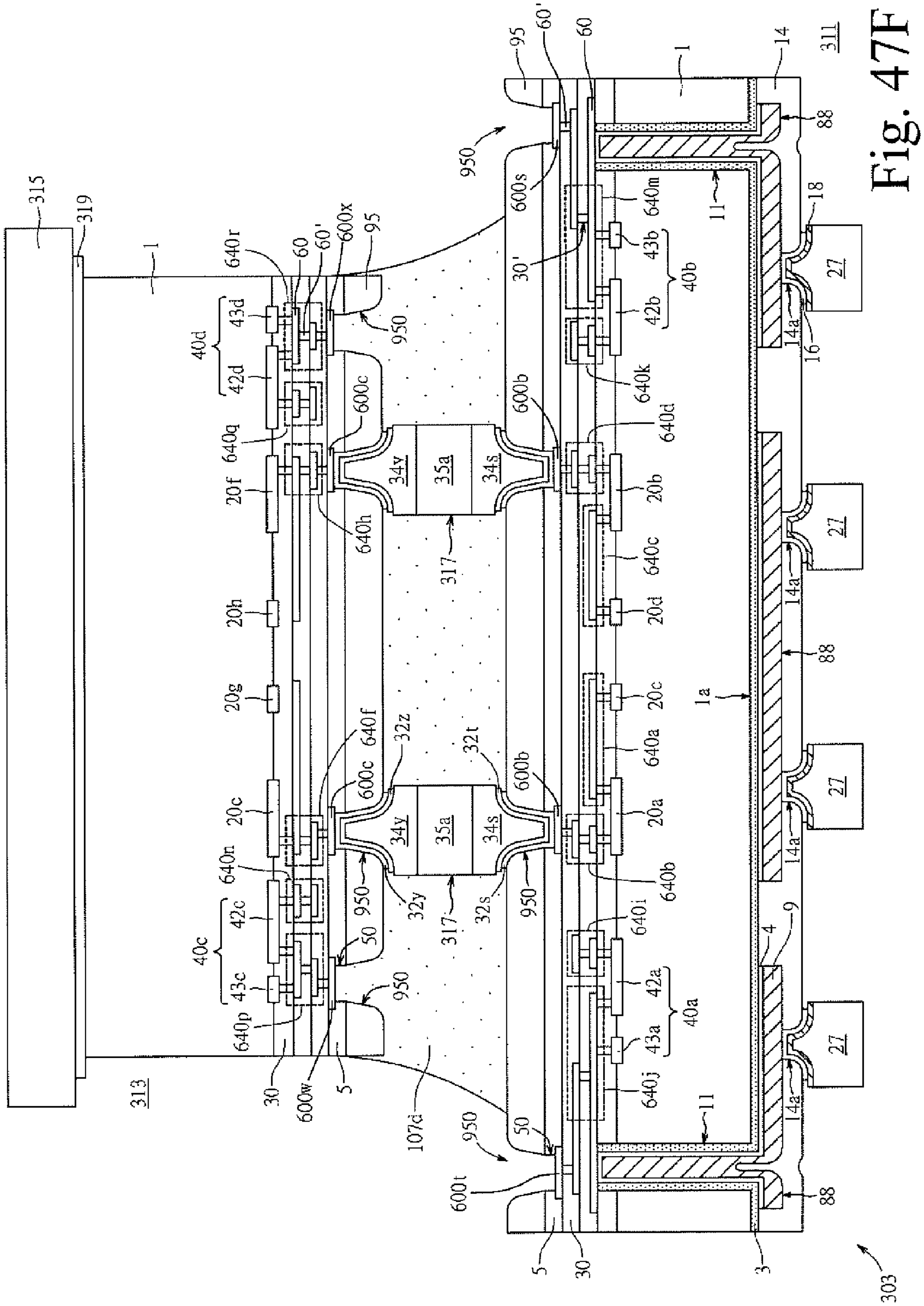

FIGS. 47D-47F are cross-sectional views showing a process for forming a processor unit, according to an embodiment.

Figure 47G:
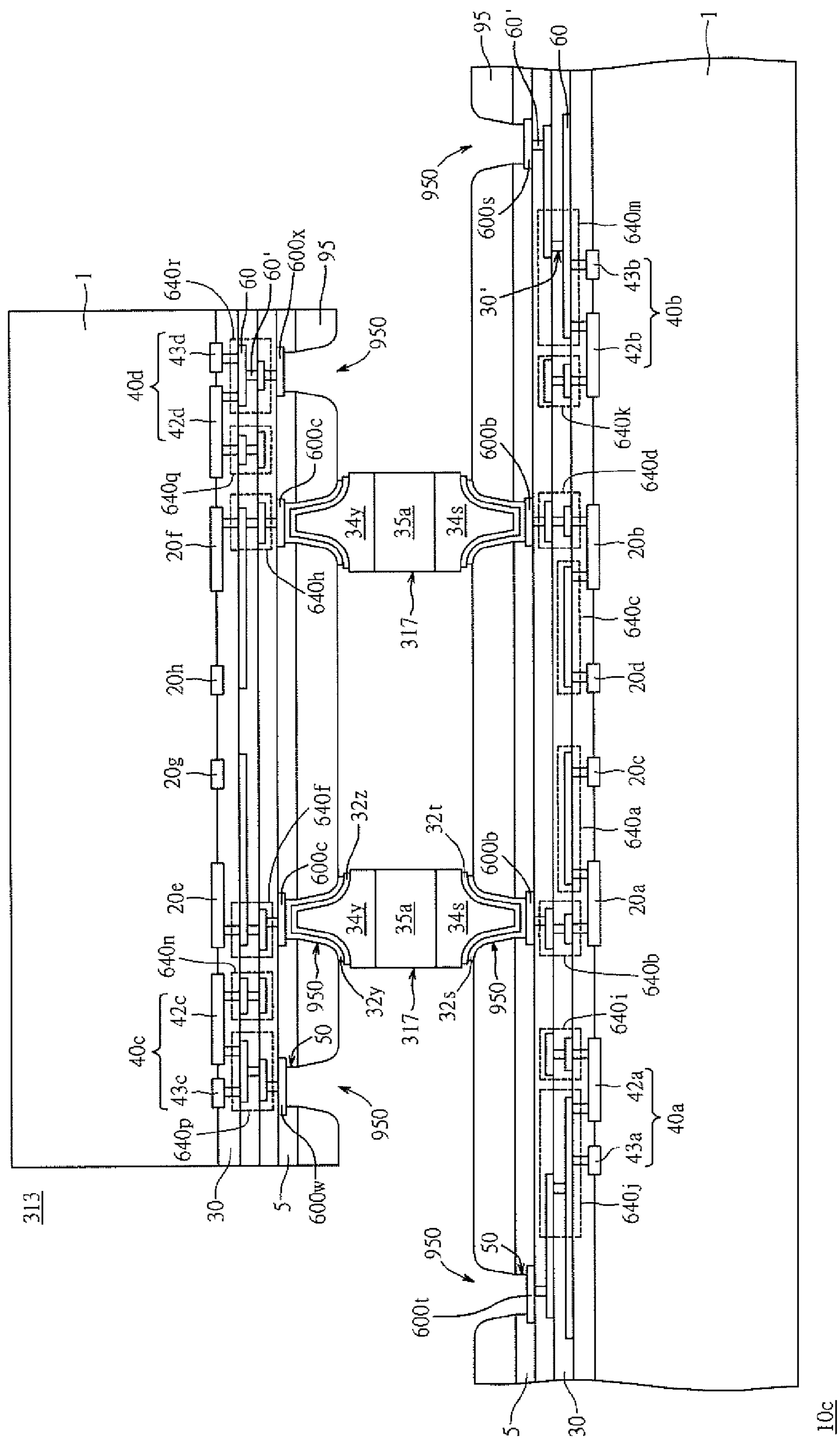
Figure 47H:
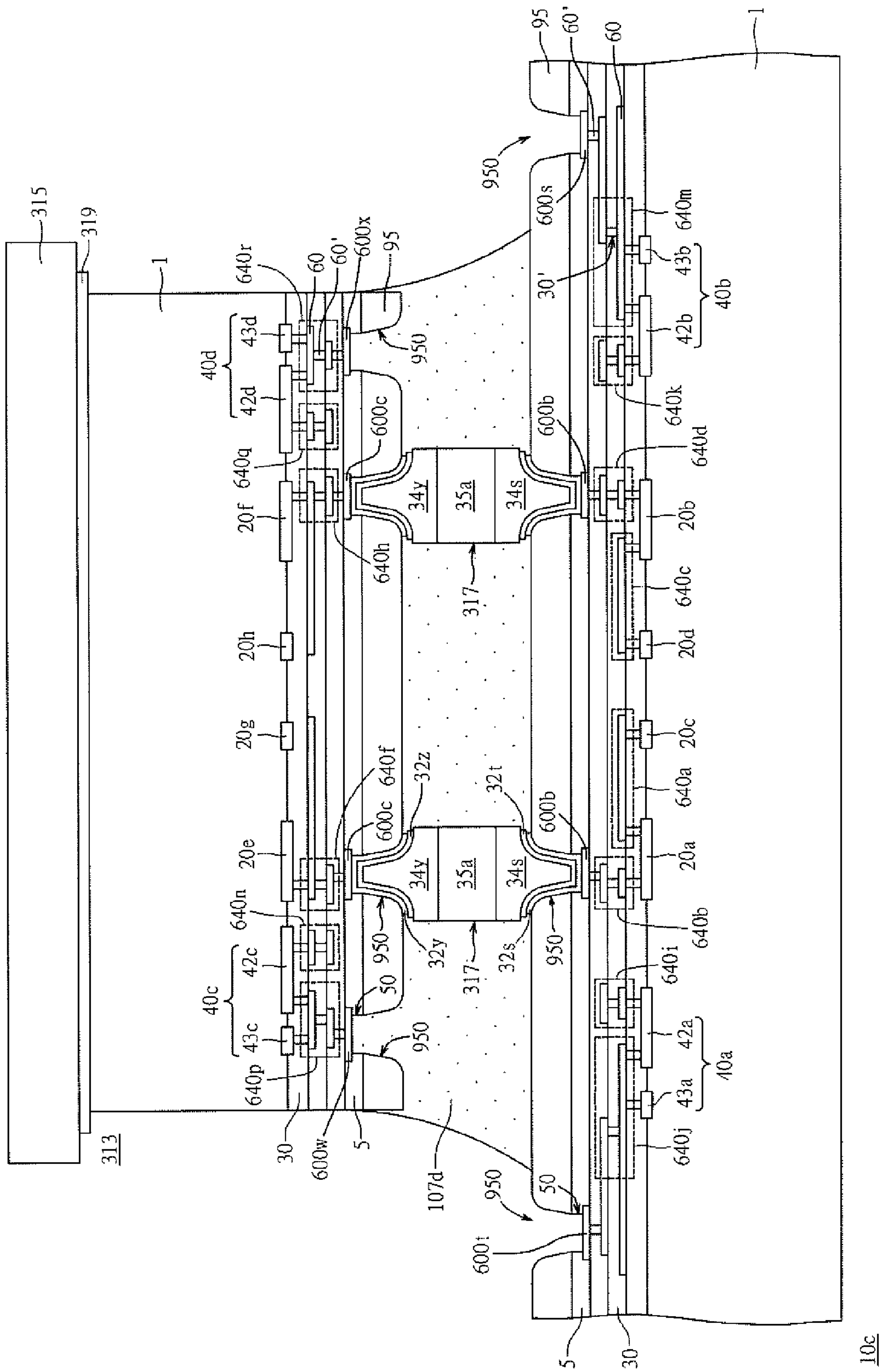
Figure 47I:
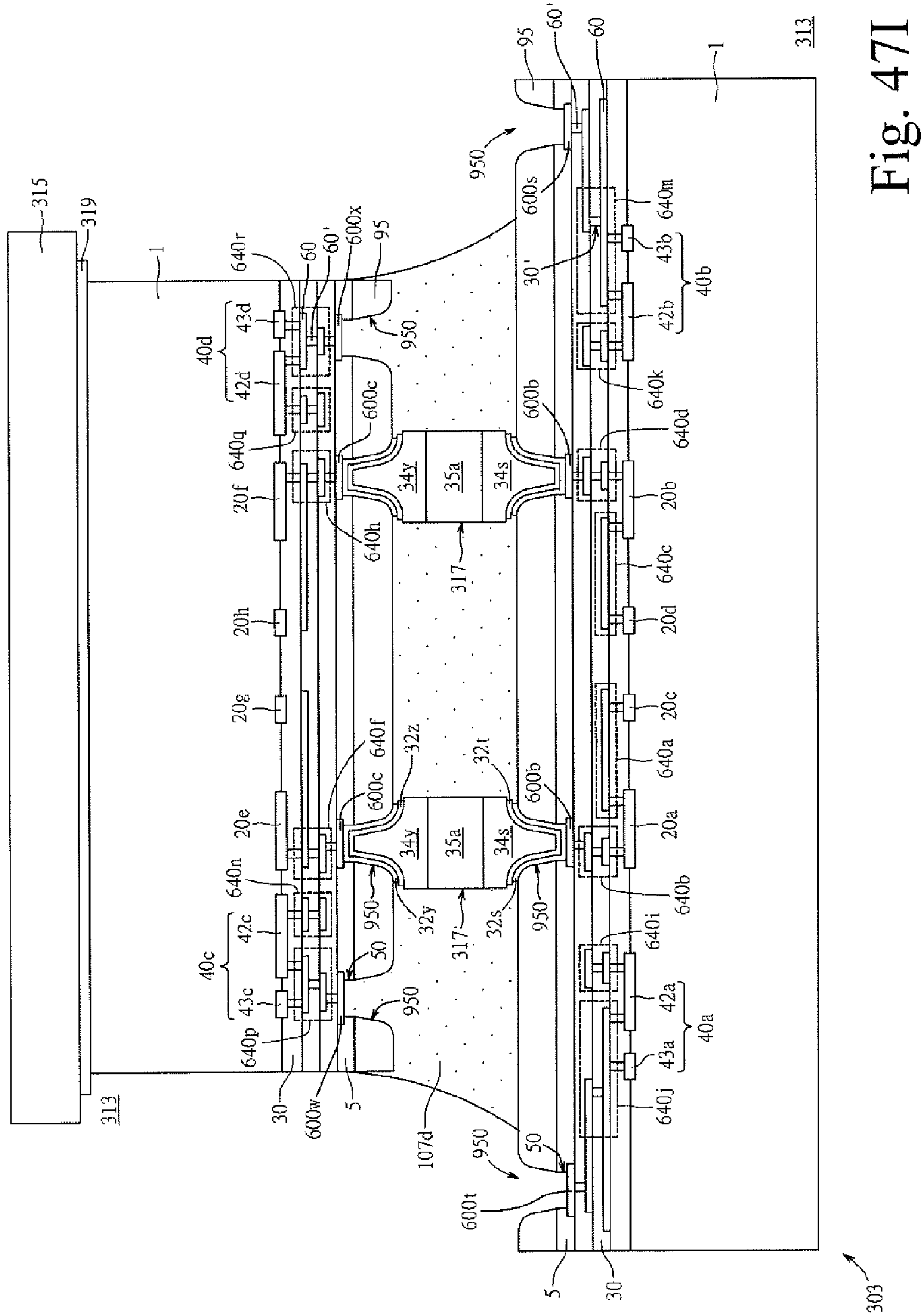

FIGS. 47G-47I are cross-sectional views showing a process for forming a processor unit, according to an embodiment.

Figure 47J:
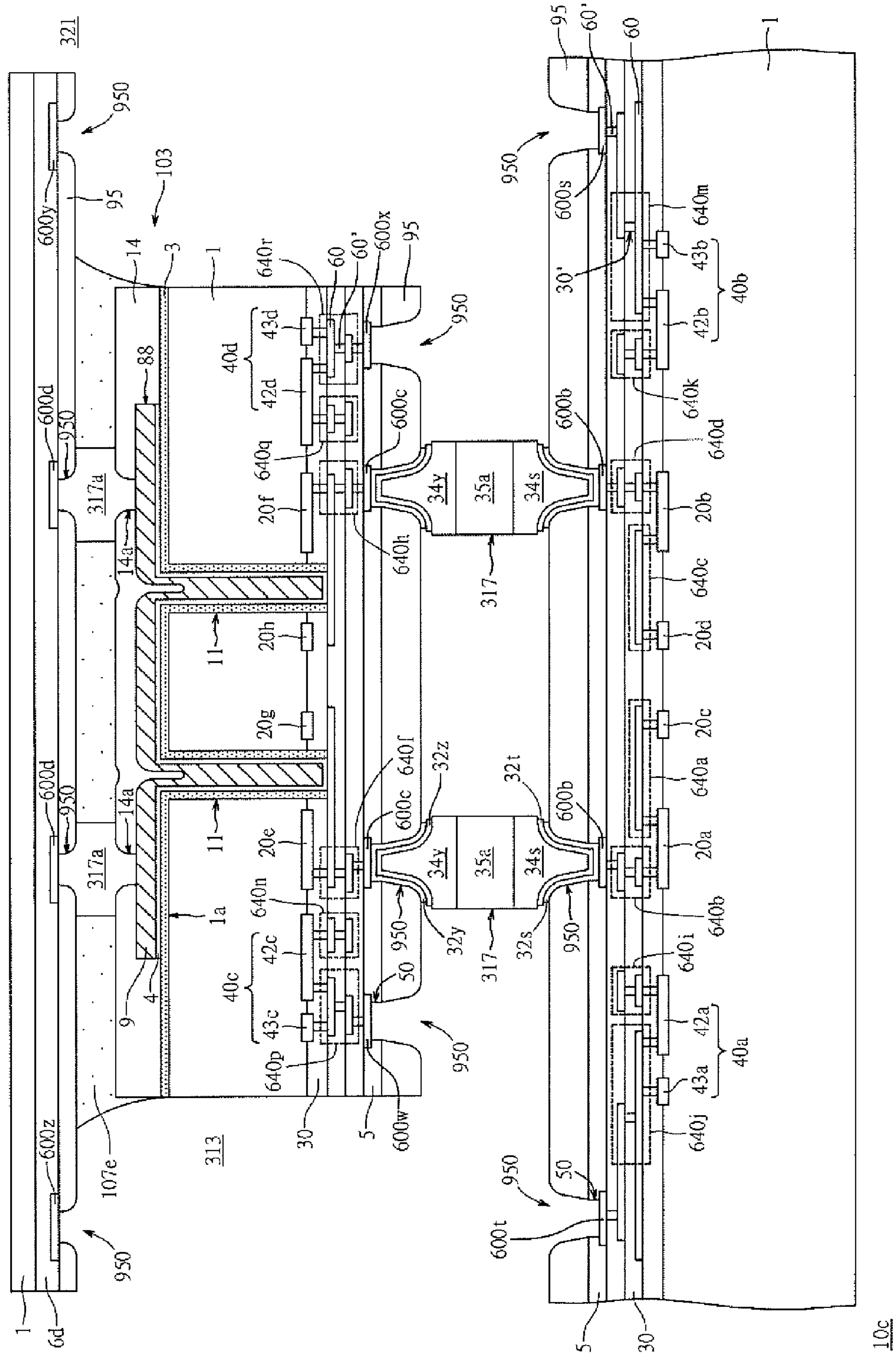
Figure 47K:
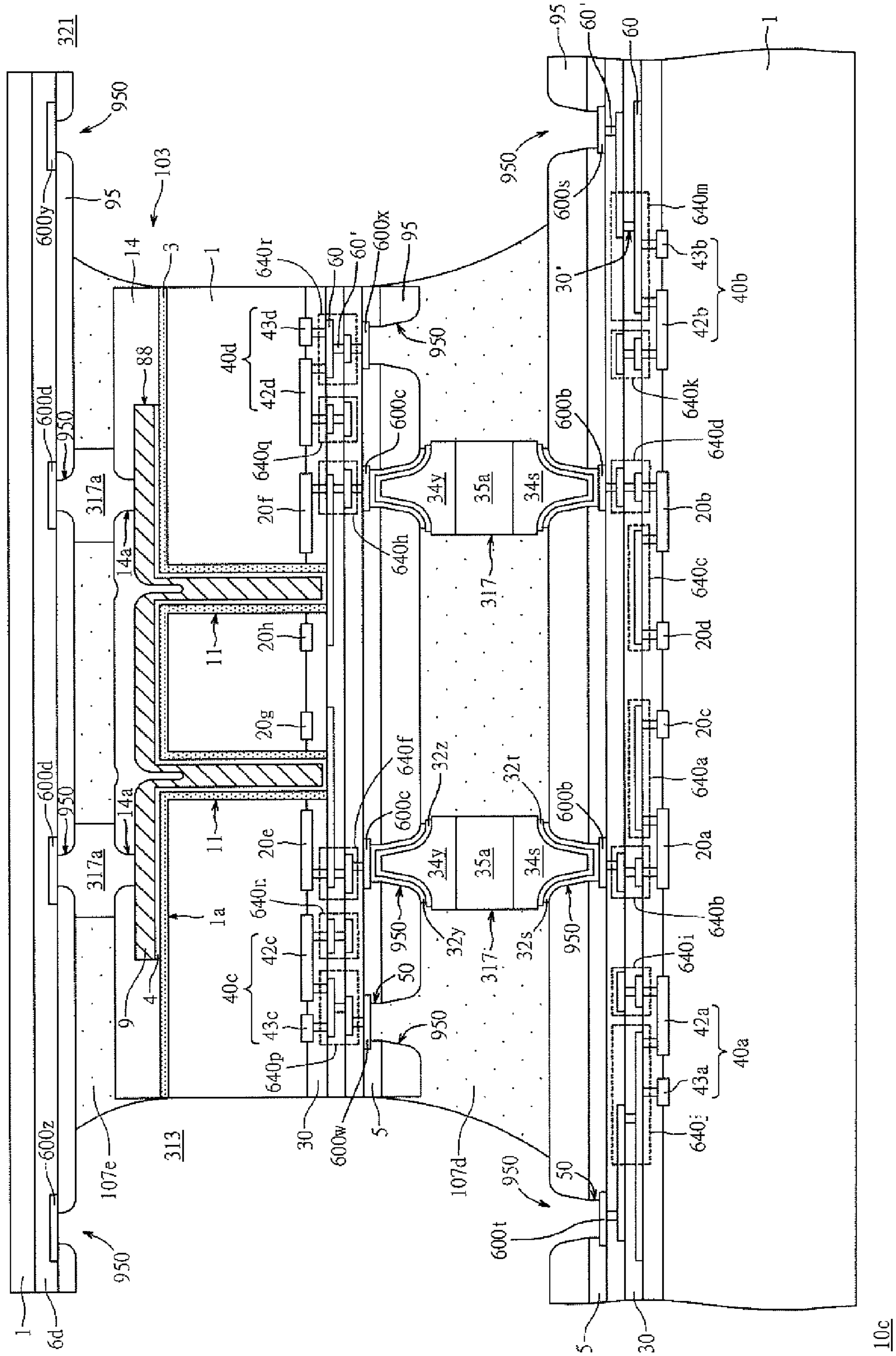
Figure 47L:
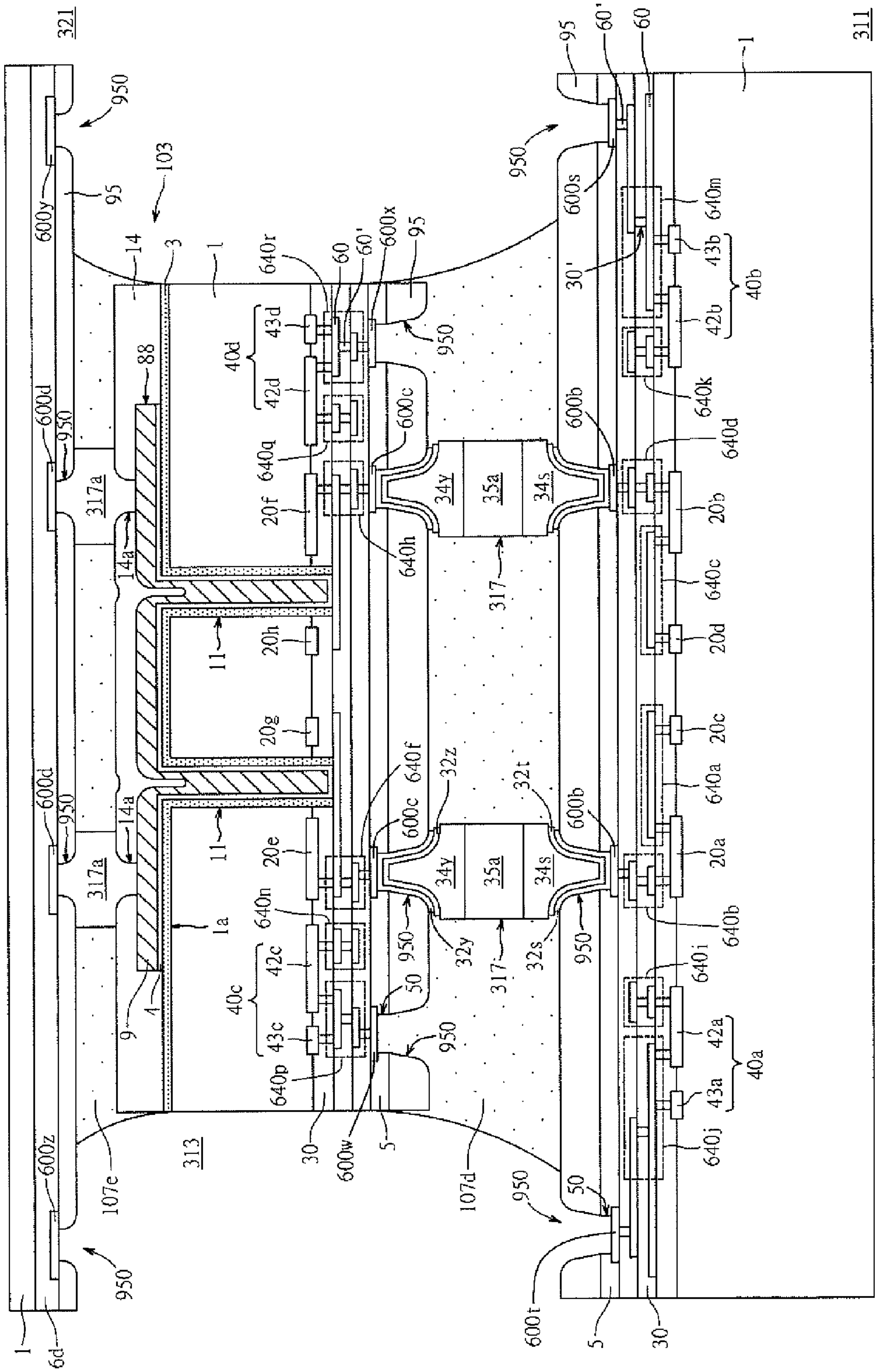

FIGS. 47J-47L are cross-sectional views showing a process for forming a processor unit, according to an embodiment.

Figure 48A:
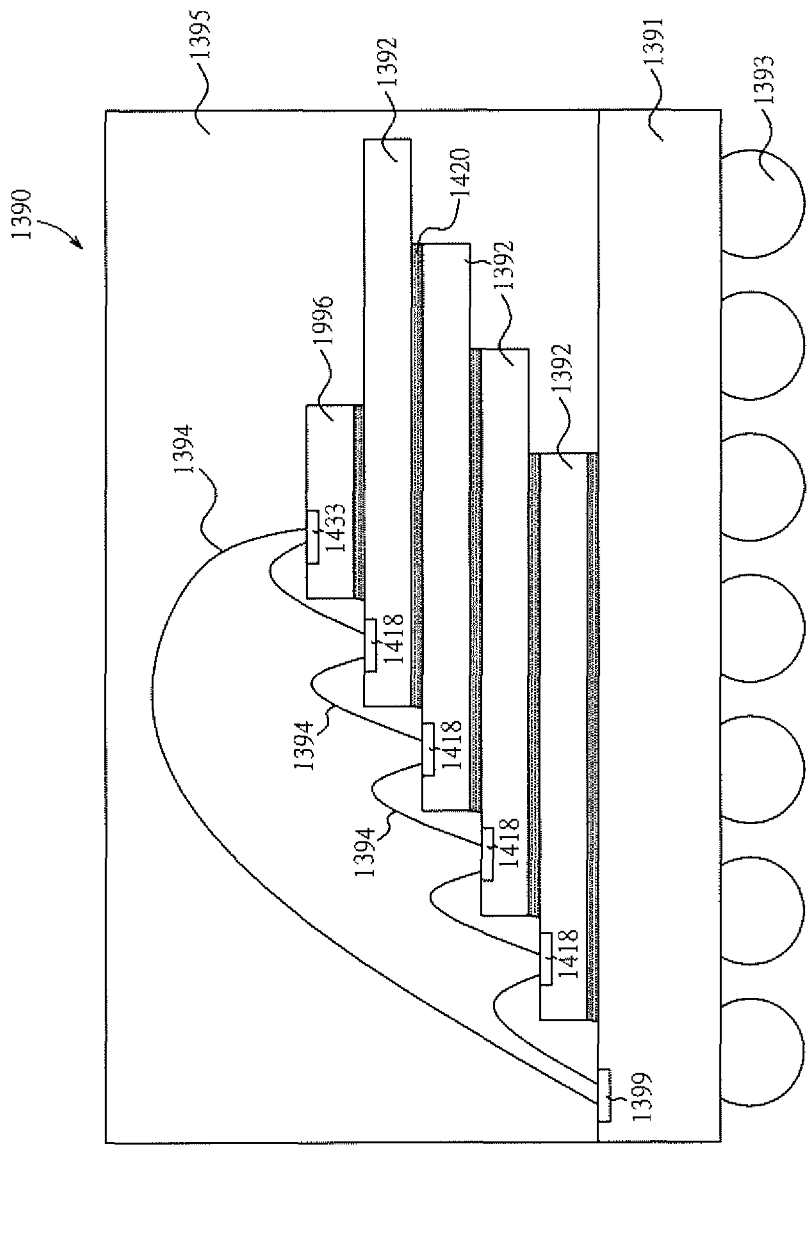

FIG. 48A shows another stacked DRAM BGA package 1390, according to an embodiment.

Figure 48B:
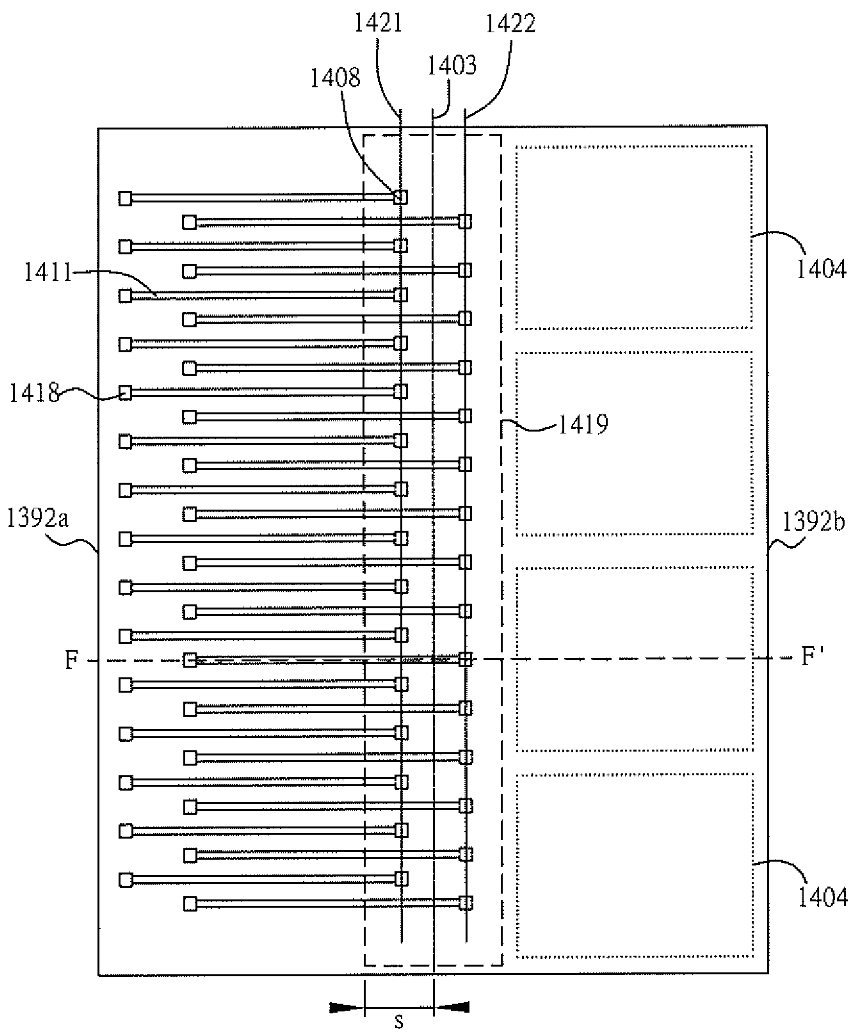

FIG. 48B shows a top view of a DRAM chip 1392 assembled in the stacked DRAM BGA package 1390 shown in FIG. 48A, according to an embodiment.

Figure 48C:
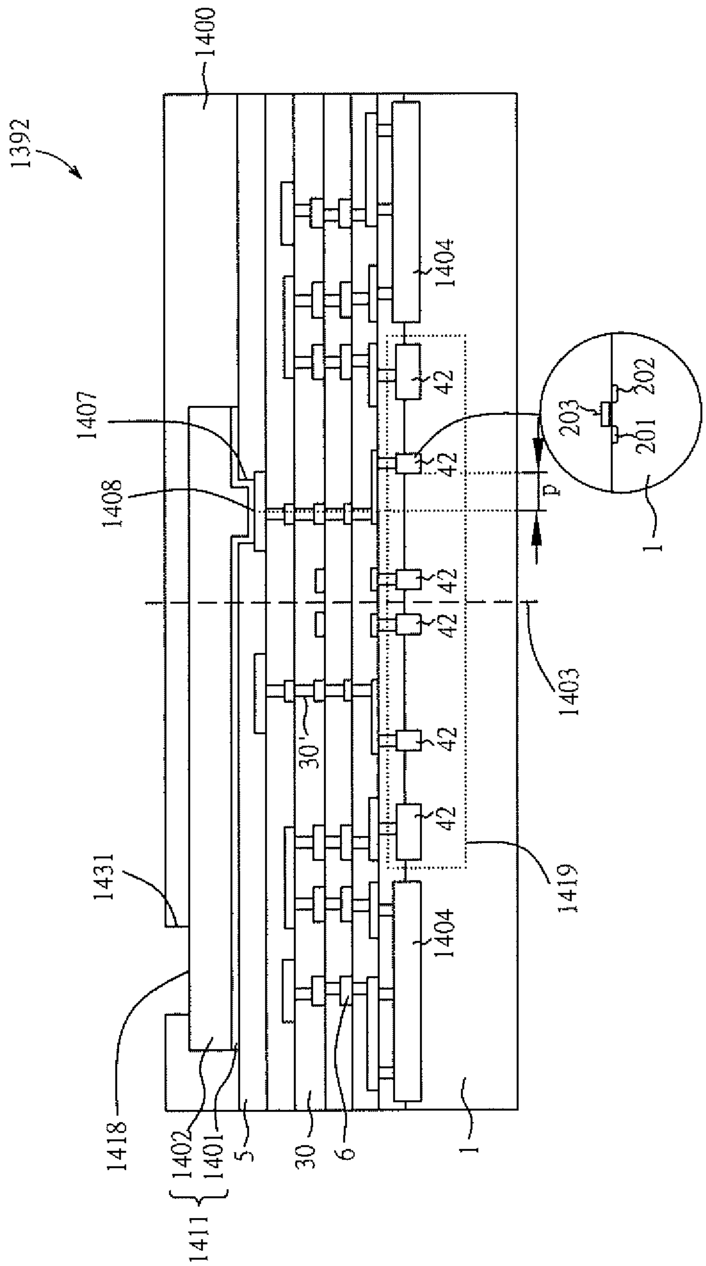
Figure 48D:
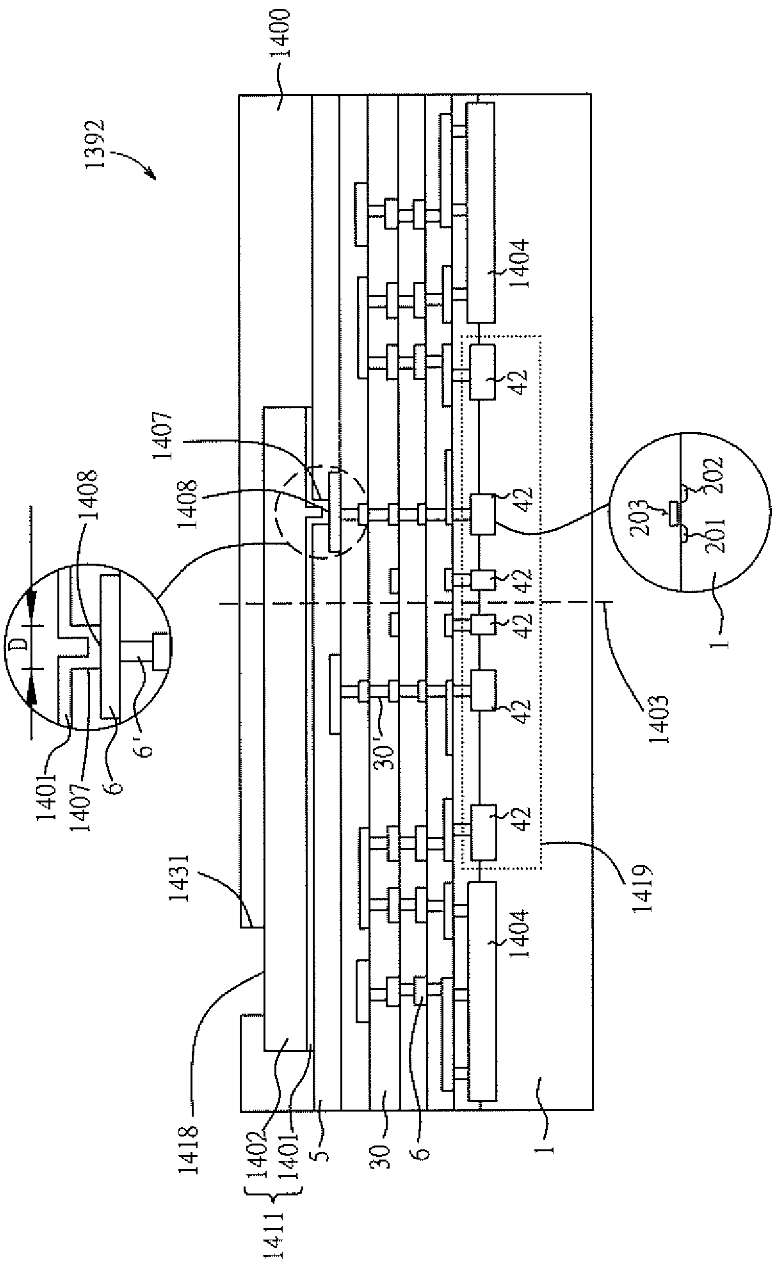

FIGS. 48C and 48D show cross-sectional views of various types of a DRAM chip 1392 assembled in the stacked DRAM BGA package 1390 shown in FIG. 48A along a cut line of F-F' of FIG. 48B, and the redistribution circuit layer 1411 is made mainly of sputtered aluminum, according to an embodiment.

Figure 48E:
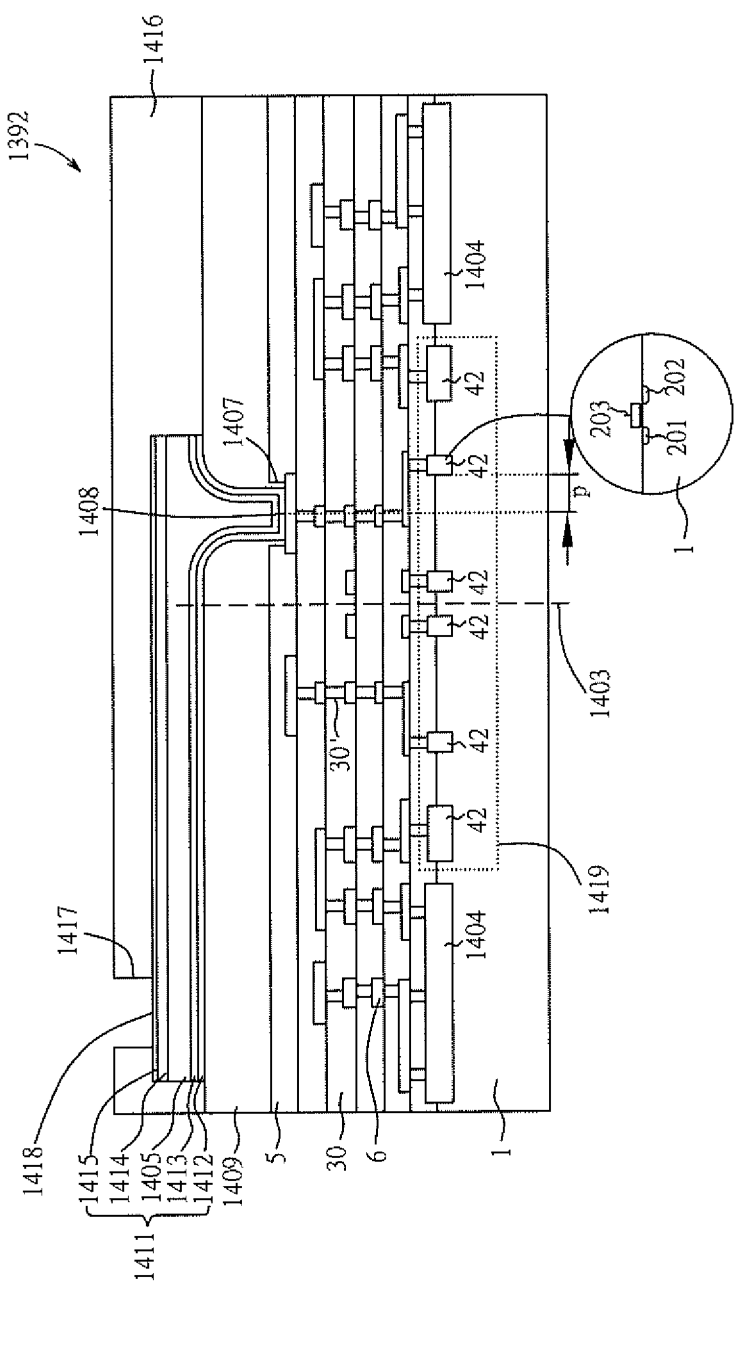
Figure 48F:
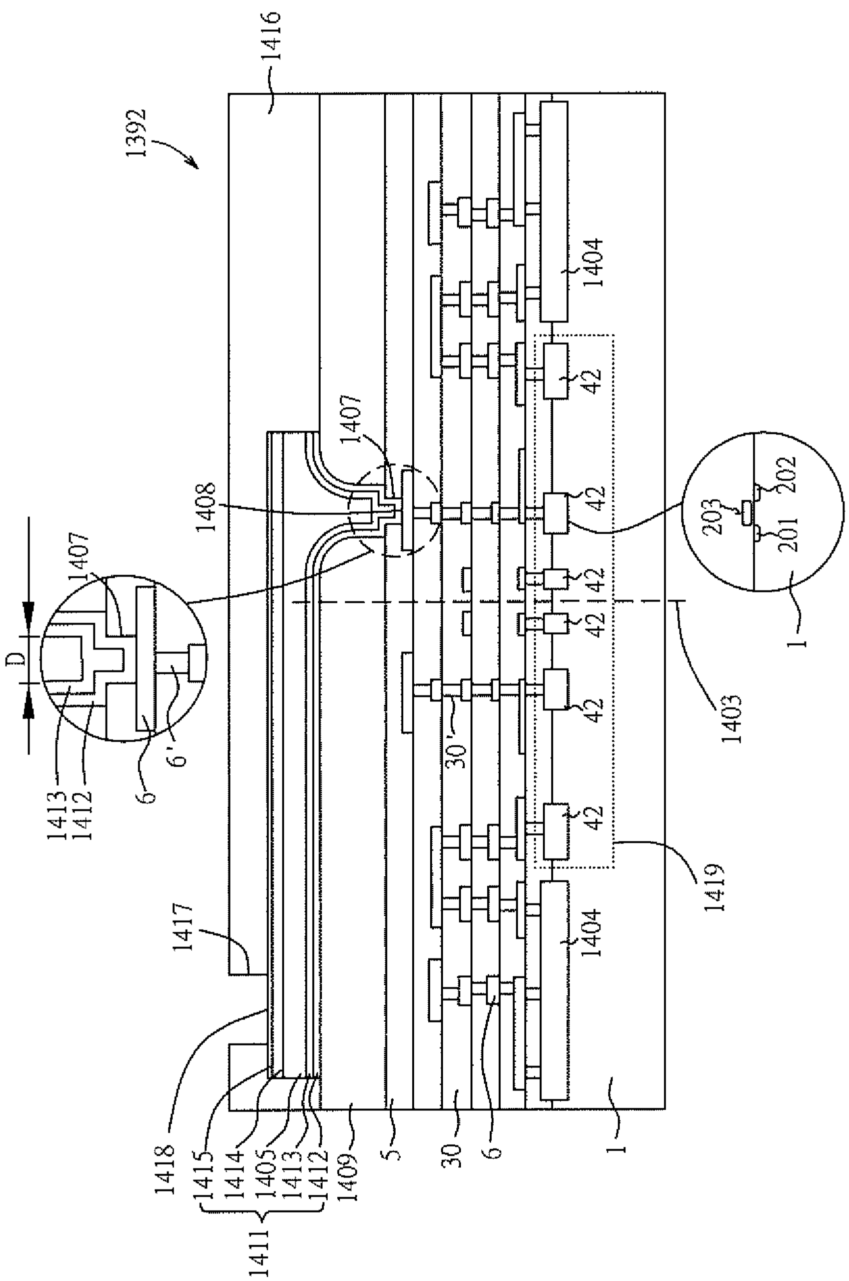

FIGS. 48E and 48F shows cross-sectional views of various types of a DRAM chip 1392 assembled in the stacked DRAM BGA package 1390 shown in FIG. 48A along a cut line of F-F' of FIG. 48B, and the redistribution circuit layer 1411 is made mainly of electroplated copper or gold, according to an embodiment.

Figure 48G:
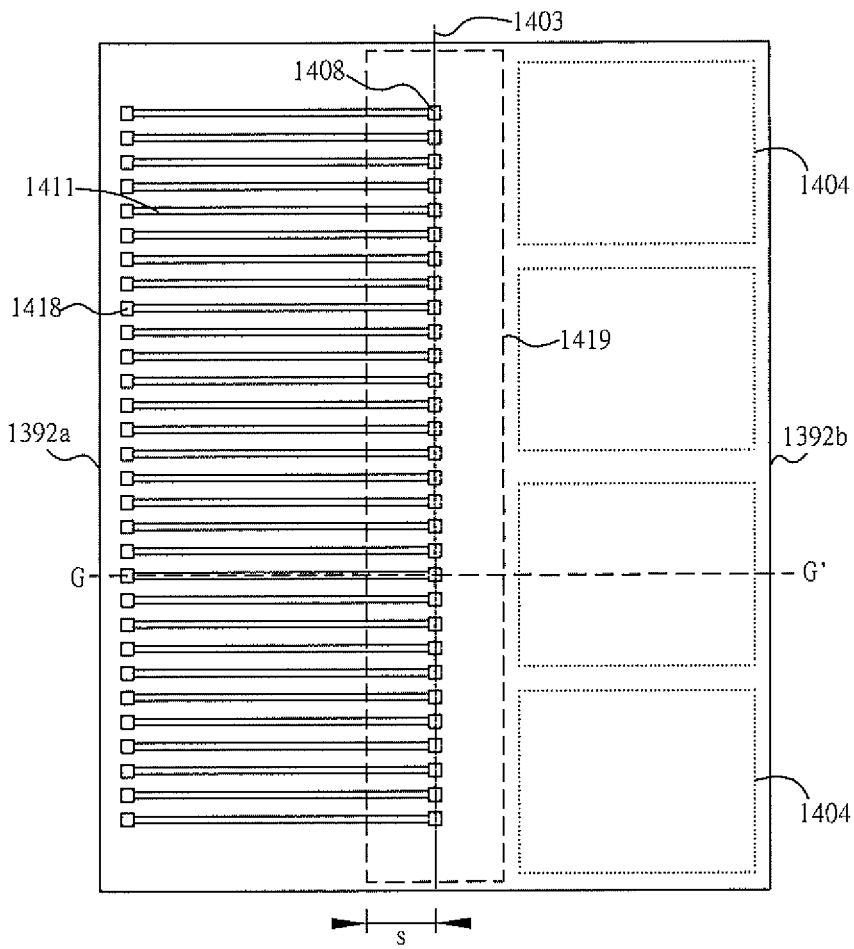

FIG. 48G shows a top view of a DRAM chip 1392 assembled in the stacked DRAM BGA package 1390 shown in FIG. 48A, according to an embodiment.

Figure 48H:
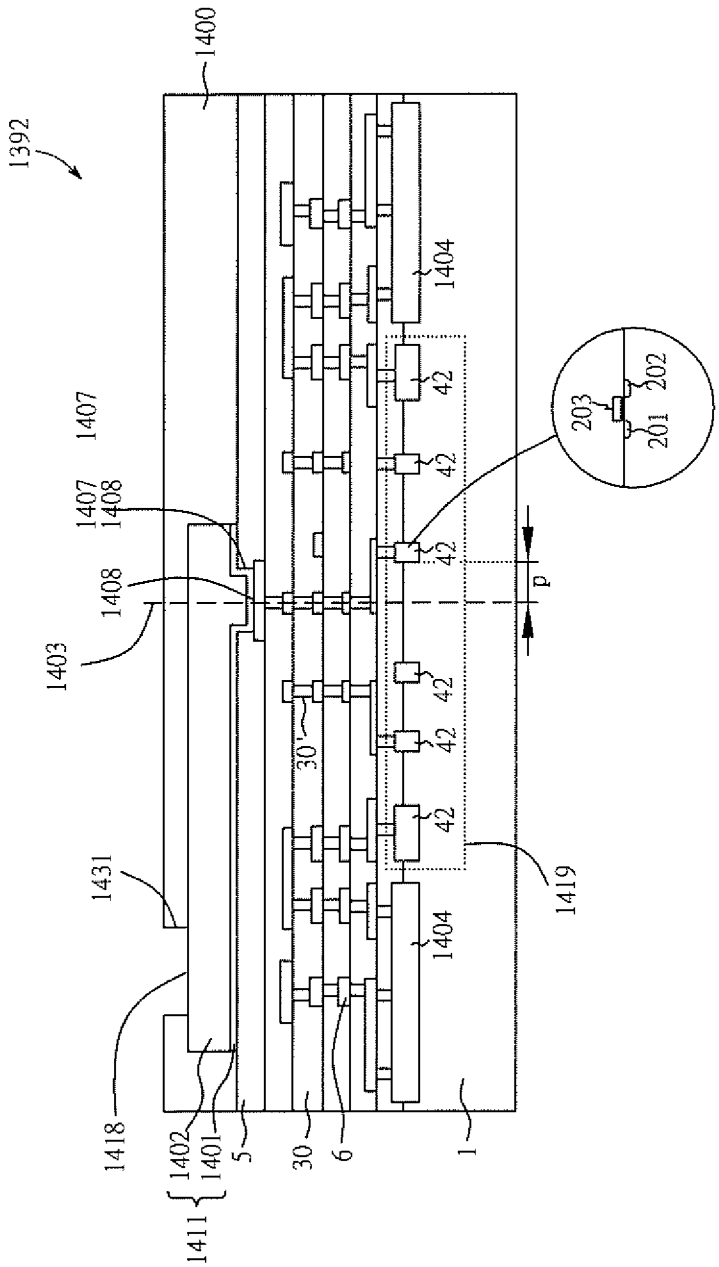
Figure 48I:
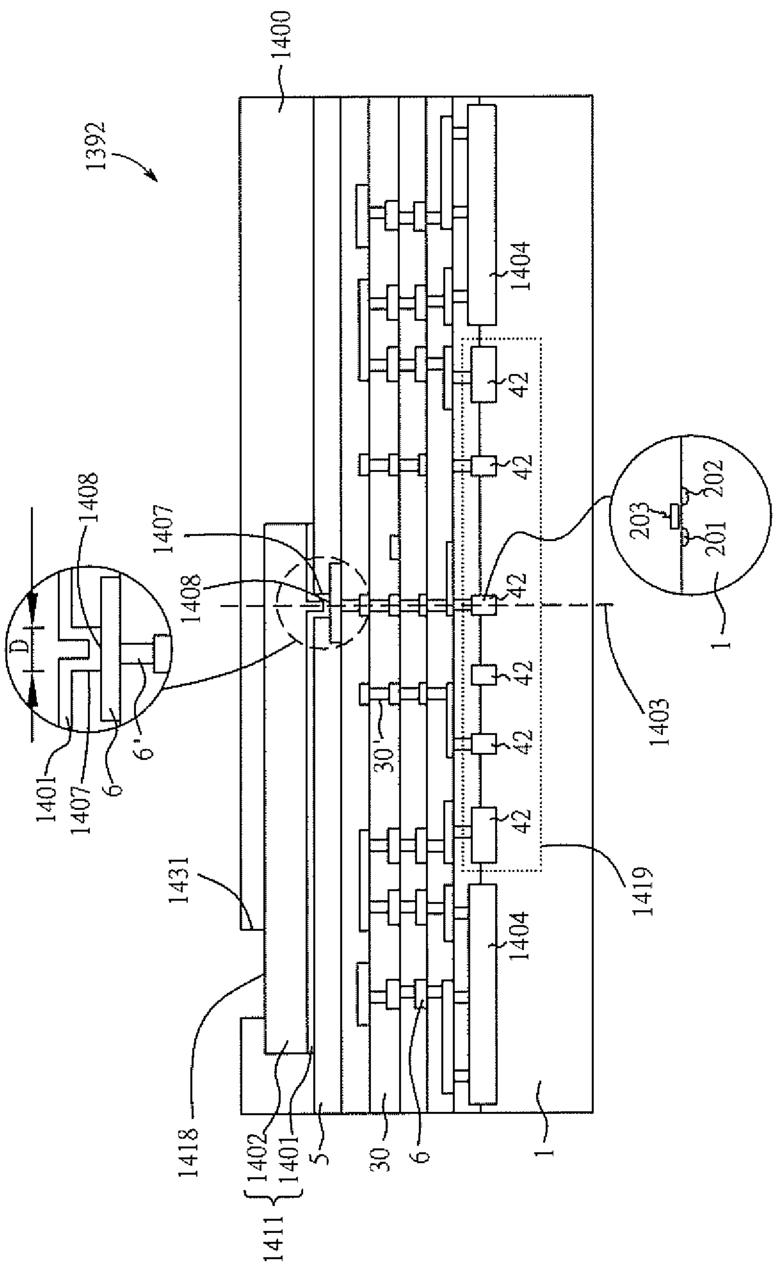

FIGS. 48H and 48I show cross-sectional views of various types of a DRAM chip 1392 placed, assembled, or incorporated in the stacked DRAM BGA package 1390 shown in FIG. 48A along a cut line of G-G' of FIG. 48G, and the redistribution circuit layer 1411 is made mainly of sputtered aluminum, according to an embodiment.

Figure 48J:
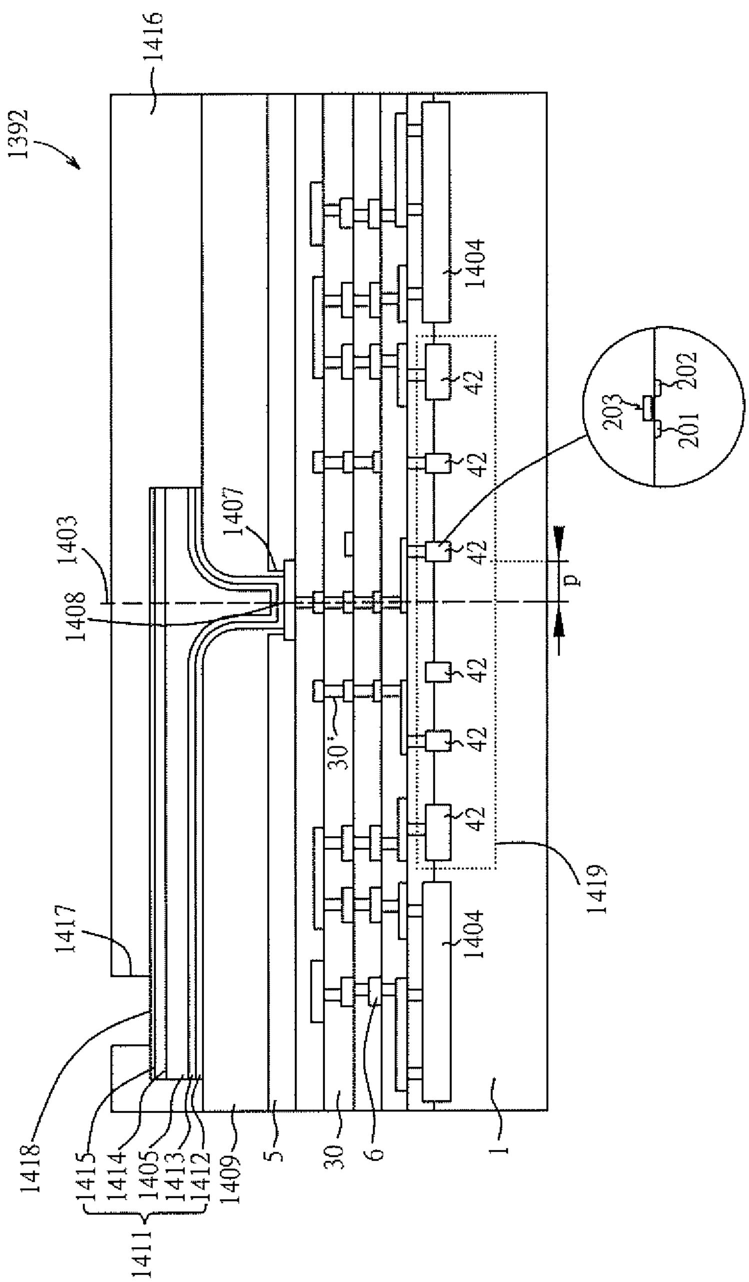
Figure 48K:
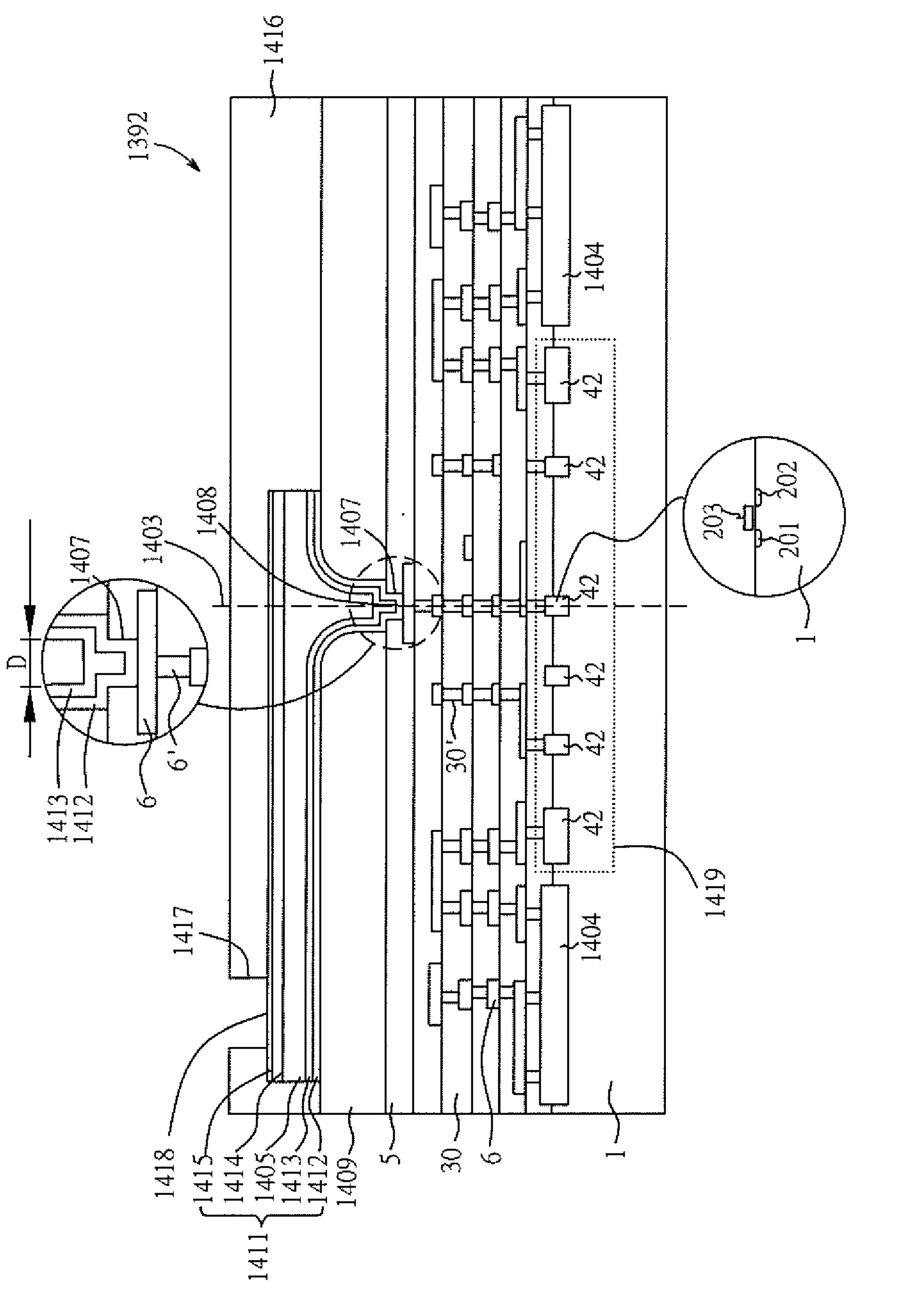

FIGS. 48J and 48K shows cross-sectional views of various types of a DRAM chip 1392 assembled in the stacked DRAM BGA package 1390 shown in FIG. 48A along a cut line of G-G' of FIG. 48G, and the redistribution circuit layer 1411 is made mainly of electroplated copper or gold, according to an embodiment.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DISCLOSURE

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

The present disclosure provides for integrated circuit chips and chip packages that utilize over-passivation and bottom interconnection schemes (or, "technologies") for the respective major sides of the chip or chip packages.

An aspect of the present disclosure is directed to chips or chip packages including one interconnection scheme at one side of a chip or chip package and/or another interconnection scheme at another at another side of a chip or chip package, e.g., an over-passivation scheme at a top of a chip and a bottom scheme at a bottom of the same chip.

Another aspect of the present disclosure is directed to on-chip voltage-regulating and/or converting devices and circuits. Such on-chip voltage regulators and converters can provide a constant voltage source for semiconductor devices located at different locations on an IC chip through on-chip power/ground buses. The voltage can be provided with minimized/reduced parasitic loss, minimized/reduced energy consumption, and/or minimized/reduced ripple effect.

FIGS. 1A, 2A, and 3A show a circuit diagram, a top view and a cross-sectional view, respectively, of a prior art chip structure useful for discussing embodiments of the present disclosure. The voltage regulator or converter circuit 41 receives an external power voltage Vdd, outputs a power voltage Vcc, and delivers the power Vcc to the internal circuits 20, including 21, 22, 23 and 24, using IC fine-line metal traces 6191 and 61 under a passivation layer 5. The IC fine-line metal traces 61 include segments of 618, 6111, 6121*a*, 6121*b*, 6121*c* and 6141. The fine-line metal traces 6191 and 61 are under the passivation layer 5.

Exemplary embodiments of the present disclosure are described below.

FIRST EMBODIMENT

Over-Passivation Power/Ground Buses with a Voltage Regulator-Converter

FIGS. 1B, 1C, 2B, 2C, 3B, 3C, and 3D illustrate a first exemplary embodiment of the present disclosure. FIGS. 1B and 1C show a simplified circuit diagram where metal traces 81 and/or 82 over a passivation layer 5 connect a voltage regulator or converter circuit 41 and internal circuits 21, 22, 23 and 24 to distribute a power voltage or a ground reference voltage, and a dotted line 5 indicates a passivation layer, coarse traces indicate traces of an over-passivation scheme 102 formed over the passivation layer 5, and fine traces indicate traces formed under the passivation layer 5. FIGS. 2B and 2C show top views of semiconductor chips realizing the circuitry shown in FIGS. 1B and 1C, respectively, and coarse traces mean the traces of the over-passivation scheme 102 formed over the passivation layer 5, and fine traces mean the traces formed under the passivation layer 5. FIGS. 3B and 3C show cross-sectional views of semiconductor chips realizing the circuitry shown in FIGS. 1B and 1C, respectively. FIGS. 2B and 2C show top views of the semiconductor chips shown in FIGS. 3B and 3C, respectively. The over-passivation scheme 102 shown in FIG. 3B includes a polymer layer 99 and two metal traces 81 and 81P provided by a patterned circuit layer 811, and an opening 9919 in the polymer layer 99 is over a contact point 8110 of the metal trace 81P and exposes it. The over-passivation scheme 102 shown in FIG. 3C includes a metal traces 81 provided by a patterned circuit layer 812, a metal trace 82 provided by a patterned circuit layer 821, and two polymer layers 98 and 99, and an opening 9929 in the polymer layer 99 is over a contact point 8120 of the patterned circuit layer 812 and exposes it. The over-passivation scheme 102 shown in FIG. 3D includes two polymer layers 95 and 99 and two metal traces 81 and 81P provided by the patterned circuit layer 811, and multiple openings 9519, 9519', 9511, 9512 and 9514 are in the polymer layer 95, and an opening 9919 in the polymer layer 99 is over a contact point 8110 of the metal trace 81P and exposes it.

For embodiments of the present disclosure, an on-chip voltage regulator or converter circuit 41 is configured to send electrical power to several internal devices 21, 22, 23 and 24 (or circuits), and the voltage regulator or converter circuit 41 and the internal devices 21, 22, 23 and 24 are formed in and/or on a silicon substrate 1 within a same IC chip. Through openings 511, 512 and 514 in a passivation layer 5, and by way of a coarse metal conductor 81 deposited over the passivation layer, electrical power output from the voltage regulator or converter circuit 41 is delivered to several devices or circuit units 21, 22, 23 and 24 with little loss or parasitic effects. The advantage of this design is that, affiliated with the regulated power source and with the coarse metal conductor, the voltage to the next level at the load of internal circuits can be controlled at a voltage level with high precision. When the reference number of 41 is a voltage regulator, the output voltage Vcc of the voltage regulator 41 is within +10% and −10% of the desired voltage level, and exemplary within +5% and −5% of the desired voltage level, insensitive to voltage surge or large fluctuation at the input node connected with an external power supply Vdd input from the power metal trace 81P. Alternatively, the voltage regulator 41 may have an output node at a voltage level of Vcc output from the voltage regulator 41 and an input node at a voltage level of Vdd supplied from an external circuit, and a ratio of a difference of the voltage level of Vdd minus the voltage level of Vcc to the voltage level of Vdd is less than 10%. Hence, circuit performance can be improved. The voltage regulator 41 may have an output of between 1 volt and 10 volts, and exemplary between 1 volt and 5 volts.

In some applications, if the chip requires a voltage level Vcc different from the voltage level Vdd of the external power supply, a voltage converter may be installed in the chip. The reference number of 41 may indicate the voltage converter. The on-chip voltage converter 41, in addition to the voltage regulating circuit, is desirable in this case to convert the voltage level Vdd of the external power supply to the voltage level Vcc required in the chip. The converter may output a voltage level Vcc higher than the voltage Vdd at the input node. Alternatively, the converter may output a voltage level Vcc lower than the voltage Vdd at the input node. The voltage converter may have an output of between 1 volt and 10 volts, and exemplary between 1 volt and 5 volts. When the voltage level of Vcc ranges from 0.6 volts to 3 volts, the voltage level of Vdd ranges from 3 volts to 5 volts. When the voltage level of Vcc ranges from 0.6 volts to 2 volts, the voltage level of Vdd ranges from 2 volts to 3 volts. For example, when the voltage level of Vcc is 2.5 volts, the voltage level of Vdd is 3.3 volts. When the voltage level of Vcc is 1.8 volts, the voltage level of Vdd is 3.3 volts. When the voltage level of Vcc is 1.8 volts, the voltage level of Vdd is 2.5 volts. When the voltage level of Vcc is 3.3 volts, the voltage level of Vdd is 5 volts.

FIG. 1B shows circuit schematics of exemplary embodiments of the present disclosure. As shown, the voltage regulator or converter circuit 41 receives a voltage Vdd from an external power supply, and outputs a voltage Vcc for the internal circuits 20, including 21, 22 23, and 24. The output voltage Vcc at node P is distributed to the power nodes Tp, Up, Vp and Wp of the internal circuits 21, 22, 23 and 24, respectively, first up through a passivation opening 519' in the passivation layer 5, then through a thick metal trace 81 over the passivation layer 5, then down through the passivation openings 511, 512, and 514 in the passivation layer 5, and then through the fine-line metal traces 61' to the internal circuits 20: particularly through the segment 611 of the fine-line metal traces 61' to the internal circuit 611; particularly through the segments 612*a* and 612*b* of the fine-line metal traces 61' to the internal circuit 22; particularly through the segments 612*a* and 612*c* of the fine-line metal traces 61' to the internal circuit 23; and through the segment 614 of the fine-line metal traces 61' to the internal circuit 24.

Each of the internal circuits 20, including 21, 22, 23 and 24, includes at least a PMOS transistor having a source connected to the fine-line metal traces 61', for example. Each of the internal circuits 20, including 21, 22, 23 and 24, may include a NMOS transistor having a ratio of a physical channel width thereof to a physical channel length ranging from, e.g., about 0.1 and 20, ranging from, e.g., about 0.1 and 10 or preferably ranging from, e.g., about 0.2 and 2. Alternatively, each of the internal circuits 20, including 21, 22, 23 and 24, may include a PMOS transistor having a ratio of a physical channel width thereof to a physical channel length ranging from, e.g., about 0.2 and 40, ranging from, e.g., about 0.2 and 40 or preferably ranging from, e.g., about 0.4 and 4.

The chip structure in FIG. 1B can utilize a coarse metal conductor 81 as a carrier of the power/ground lines, traces, or planes. In this case, the voltage drop and noise is much reduced since the coarse metal conductor 81 has lower resistance and capacitance than the fine-line metal traces.

The internal circuits, or internal circuit units 20, shown in all of the embodiments, include two NOR gates 22 and 24, one NAND gate 23, and one internal circuit 21, for example. The internal circuits 20, 21, 22, 23, and 24 can be any type of IC circuits, such as NOR gate, NAND gate, AND gate, OR gate, operational amplifier, adder, multiplexer, diplexer, multiplier, A/D converter, D/A converter, CMOS transistor, bipolar CMOS transistor or bipolar circuit. The NOR gate 22 or 24 or NAND gate 23 has three input nodes Ui, Wi or Vi, one output node Uo, Wo or Vo, one Vcc node Up, Wp or Vp, and one Vss node Us, Ws or Vs. The internal circuit 21 has one input node Xi, one output node Xo, one Vcc node Tp and one Vss node Ts. Each of the internal circuits or internal circuit units 20, including 21, 22, 23, and 24, usually has signal nodes, power nodes, and ground nodes.

FIGS. 2B and 3B provide the top view and cross-sectional view, respectively, of the circuit diagram shown in FIG. 1B. It is noted that, in FIG. 3B, the fine-line metal structures 611, 612, 614, 619 and 619' can be composed of stacked fine-line metal pads 60 and via plugs 60' filled in the vias 30'. The upper vias 30' are substantially aligned with the lower ones; the upper fine-line metal pads 60 are substantially aligned with the lower ones; the upper via plugs 60 are substantially aligned with the lower ones. Referring to FIGS. 1B, 2B and 3B, the fine-line metal traces or plane 612 includes multiple portions 612*a*, 612*b* and 612*c*, and is used for the local power distribution.

The thick metal traces or plane 81 over the passivation layer 5 is used for global power distribution and connects the fine-line metal traces or plane 619', 611, 612 and 614. The thick metal trace or plane 81 over the passivation layer 5, shown in FIGS. 1B and 2B, may be composed of only one patterned circuit layer 811, as shown in FIG. 3B, or multiple patterned circuit layers, not shown. The patterned circuit layer 811, such as a power plane, bus, trace or line, to distribute a power voltage Vcc is realized from the concept of the coarse trace 81 shown in FIGS. 1B and 2B. When the thick metal traces or plane 81 over the passivation layer 5, shown in FIG. 2, is composed of multiple patterned circuit layers, a polymer layer, such as polyimide (PI), benzocyclobutene (BCB), parylene, epoxy-based material, photoepoxy SU-8, elastomer or silicone, may be between the neighboring patterned circuit layers, separating the patterned circuit layers. A polymer layer 99, such as polyimide (PI), benzocyclobutene (BCB), parylene, epoxy-based material, photoepoxy SU-8, elastomer or silicone, may be on the topmost one of the patterned circuit layers, separated by the above mentioned polymer layers, over the passivation layer, not shown, or on the only one patterned circuit layer 811, as shown in FIGS. 3B and 3D. Alternatively, A polymer layer 95, such as polyimide (PI), benzocyclobutene (BCB), parylene, epoxy-based material, photoepoxy SU-8, elastomer or silicone, may be between the passivation layer and the bottommost one of the patterned circuit layers, separated by the above mentioned polymer layers, not shown, or between the passivation layer 5 and the only one patterned circuit layer 811, as shown in FIG. 3D. The polymer layer 95 may have a thickness larger than 2 micrometers, such as between 2 and 30 micrometers. Multiple openings 9519, 9519', 9511, 9512 and 9514 in the polymer layer 95 are substantially aligned with the openings 519, 519', 511, 512 and 514 in the passivation layer 5, respectively. The openings 9519, 9519', 9511, 9512 and 9514 in the polymer layer 95 expose the pads (including 6190 and 6190') exposed by the openings 519, 519', 511, 512 and 514 in the passivation layer 5, respectively.

Some openings 9519 and 9519' in the polymer layer 95 have lower portions having widths or transverse dimensions smaller than those of the openings 519 and 519' in the passivation layer 5 aligned with the openings 9519 and 9519', respectively. The polymer layer 95 covers a portion of the pads 6190 and 6190' exposed by the openings 519 and 519' in the passivation layer 5. The shape of the openings 519 and 519' from a top perspective view may be round, square, rectangular or polygon. If the openings 519 and 519' are round, the openings 519 and 519' may have a diameter of between 0.1 and 200 microns, between 1 and 100 microns, or, preferably, between 0.5 and 30 microns. If the openings 519 and 519' are square, the openings 519 and 519' may have a width of between 0.1 and 200 microns, between 1 and 100 microns, or, preferably, between 0.1 and 30 microns. If the openings 519 and 519' are rectangular, the openings 519 and 519' may have a width of between 0.1 and 200 microns, between 1 and 100 microns, or, preferably, between 0.1 and 30 microns, and a length of between 1 micron and 1 centimeter. If the openings 519 and 519' are polygon having more than five sides, the openings 519 and 519' have a largest diagonal length of between 0.1 and 200 microns, between 0.5 and 100 microns, or, preferably, between 0.1 and 30 microns. Alternatively, the openings 519 and 519' have a largest transverse dimension of between 0.1 and 200 microns, between 1 and 100 microns, or, preferably, between 0.1 and 30 microns. In a case, the openings 519 and 519' have a width of between 30 and 100 microns, with the lower portion of the openings 9519 and 9519' in the polymer layer 95 having a width of between 20 and 100 microns.

Some openings 9511, 9512 and 9514 in the polymer layer 95 have lower portions having widths or transverse dimensions larger than those of the openings 511, 512 and 514 in the passivation layer 5 aligned with the openings 9511, 9512 and 9514, respectively. The openings 9511, 9512 and 9514 in the polymer layer 95 further expose the passivation layer 5 close to the openings 511, 512 and 514. The shape of the openings 511, 512 and 514 from a top perspective view may be round, square, rectangular or polygon. If the openings 511, 512 and 514 are round, the openings 511, 512 and 514 may have a diameter of between 0.1 and 200 microns, between 1 and 100 microns, or, preferably, between 0.5 and 30 microns. If the openings 511, 512 and 514 are square, the openings 511, 512 and 514 may have a width of between 0.1 and 200 microns, between 1 and 100 microns, or, preferably, between 0.1 and 30 microns. If the openings 511, 512 and 514 are rectangular, the openings 511, 512 and 514 may have a width of between 0.1 and 200 microns, between 1 and 100 microns, or, preferably, between 0.1 and 30 microns, and a length of between 1 micron and 1 centimeter. If the openings 511, 512 and 514 are polygon having more than five sides, the openings 511, 512 and 514 have a largest diagonal length of between 0.1 and 200 microns, between 1 and 100 microns, or, preferably, between 0.1 and 30 microns. Alternatively, the openings 511, 512 and 514 have a largest transverse dimension of between 0.1 and 200 microns, between 1 and 100 microns, or, preferably, between 0.1 and 30 microns. In a case, the openings 511, 512 and 514 have a width of between 5 and 30 microns, with the lower portion of the openings 9511, 9512 and 9514 in the polymer layer 95 having a width of between 20 and 100 microns.

The previous description concerning the openings 519, 519', 511, 512 and 514 in the passivation layer 5 and the openings 9519, 9519', 9511, 9512 and 9514 in the polymer layer 95 can be applied to the embodiments shown in 15A-15L, 16A-16M, 17A-17J, 18A-18I and 19A-19I.

One of the patterned circuit layers, such as 811 shown in FIGS. 3B and 3D, composing the thick metal trace or plane 81 over the passivation layer 5 may include an adhesion/barrier/seed layer 8111, and a bulk conduction metal layer 8112. The methods to form the patterned circuit layer 811 and the specification thereof may follow the methods to form the patterned circuit layer 801, 802 or 803 and the specification thereof shown in FIGS. 15A-15M, 16A-16M, 17A-17J, 18A-18I and 19A-19I.

In FIGS. 1B, 2B and 3B, an external power supplies a voltage level Vdd at a metal pad 8110 connected to a metal pad 6190 of a topmost one of fine-line circuit metal layers 619 under the passivation layer 5 through an opening 519 in the passivation layer 5, and inputs to the voltage regulator or converter circuit 41. The voltage regulator or converter circuit 41 outputs a power voltage to supply the internal circuits 21, 22, 23 and 24 through the fine-line circuit metal layers 619', thick patterned trace or plane 811 and fine-line circuit metal layers 611, 612 and 614. The fine-line circuit layers 619, 619', 611, 612 and 614 are separated by thin-film insulating layers 30, such as silicon oxide.

Though FIG. 3B shows only one patterned circuit layer 81 for distributing a regulated or converted power voltage of Vcc, multiple patterned circuit layers with one or more polymer layers deposited there between can be formed over the passivation layer 5 and used to distribute a regulated or converted power voltage of Vcc. Metal traces or planes in different patterned circuit layers are connected through the openings in the polymer layer there between.

FIGS. 1A, 2A and 3A reveal the external power supply at a voltage level Vdd inputs the voltage regulator or converter circuit 41 through the pad 6190 exposed by the opening 519 in the passivation layer 5 and through the fine-line circuit layers 619 (including stacked fine-line metal pads and vias). The output power at voltage level Vcc outputs from the voltage regulator or converter circuit 41 is distributed to supply the voltage of Vcc to the internal circuits 21, 22, 23 and 24 only through IC fine line interconnection 61 including segments 6191', 618, 6111, 6121 and 6141.

In FIGS. 1B, 2B, 3B and 3D, the ground voltage is denoted as Vss without detailing the circuit schematics, layout and structure for distributing the ground voltage. FIGS. 1C, 2C and 3C describe the circuit schematics, top view and cross-sectional view, respectively, showing the thick metal traces or planes 81 and 82 over the passivation layer 5 for distributing both of the power supply voltage of Vcc and the ground reference voltage of Vss. The structure 82 of distributing the ground reference voltage of Vss is similar to the above mentioned structure 81 of distributing the power supply voltage of Vcc, except that a common ground voltage Vss is provided for the voltage regulator or converter circuit 41 and the internal circuits 21, 22, 23 and 24 through the thick metal trace or plane 82. That means the external ground node Es may be connected to the ground node Rs of the voltage regulator or converter circuit 41 and to the internal ground node Ts, Us, Vs, Ws of the internal circuits 21, 22, 23 and 24: In FIGS. 1C, 2C and 3C, the point Es connected to a ground source of an external circuitry at a voltage level Vss is connected to (1) the ground node Rs of the voltage regulator or converter circuit 41 through an opening 529 in the passivation layer 5, and (2) the ground nodes Ts, Us, Vs and Ws of the internal circuits 21, 22, 23 and 24 through the thick metal lines, buses or traces 82 over the passivation layer 5, the openings, 521, 522 and 524 in the passivation layer 5, and fine-line metal structures 621, 622 (including 622*a*, 622*b* and 622*c*) and 624.

FIG. 3C shows two patterned circuit layers 812 and 821 over the passivation layer 5, used for distributing a power voltage Vcc and a ground reference voltage Vss, respectively. The bottom one 821 of the patterned circuit layers 812 and 821, such as a ground plane, bus, trace or line, to distribute a ground reference voltage Vss is realized from the concept of the coarse trace 82 shown in FIGS. 1C and 2C. The top one 812 of the patterned circuit layers 812 and 821, such as a power plane, bus, trace or line, to distribute a power voltage Vcc is realized from the concept of the coarse trace 81 shown in FIGS. 1C and 2C. A polymer layer 98, such as polyimide, benzocyclobutene (BCB), parylene, epoxy-based material, photoepoxy SU-8, elastomer or silicone, having a thickness of between 2 and 30 microns, separates the patterned circuit layers 821 and 812. Another polymer layer 99, such as polyimide, benzocyclobutene (BCB), parylene, epoxy-based material, photoepoxy SU-8, elastomer or silicone, having a thickness of between 2 and 30 microns, covers the top patterned circuit layer 812. Alternatively, another polymer layer, such as benzocyclobutene (BCB), polyimide, parylene, epoxy-based material, photoepoxy SU-8, elastomer or silicone, having a thickness of between 2 and 30 microns, may be provided between the bottom-most patterned circuit layer 821 and the passivation layer 5, described as the polymer layer 95 shown in FIG. 3D. In FIGS. 1C, 2C and 3C, the ground plane, trace or line 82 over the passivation layer 5, used to distribute a ground reference voltage of Vss, is connected to the ground nodes Ts, Us, Vs and Ws of the internal circuits 21, 22, 23 and 24 and the ground node Rs of the voltage regulator or converter circuit 41 through the openings 521, 522, 524 and 529 in the passivation layer 5 and the fine-line metal structures 621, 622, 624 and 629, respectively. The power plane, trace or line 81 or 812 used to distribute a power voltage of Vcc is connected to the power nodes Tp, Up, Vp and Wp (not shown) of the internal circuits 21, 22, 23 and 24 and to the output nodes P of the voltage regulator or converter circuit 41 through the openings (not shown) in the polymer layer 98 and in the passivation layer 5 and through the fine-line metal structures 611, 612, 614 and 619', respectively, as illustrated in FIG. 3B.

In FIG. 3B, there is only one patterned circuit layer 811, including a portion serving as the previously described thick and wide metal trace 81P, power bus or plane delivering a power voltage input from an external circuit, over the passivation layer 5, and another portion serving as the previously described thick and wide metal trace 81, power bus or plane delivering a power voltage output from the voltage regulator or converter circuit 41, over the passivation layer 5. The patterned circuit layer 811 may contain an adhesion/barrier layer, a seed layer on the adhesion/barrier layer, and an electroplated metal layer 8112 on the seed layer, the adhesion/barrier layer and the seed layer composing the bottom layer 8111.

Referring to FIG. 3B, regards to the process for forming the patterned circuit layer 811, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6490, principally made of aluminum or copper, exposed by multiple openings 549, 511, 512 and 514 in the passivation layer 5. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8112 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8112 is removed using a wet-etching process or using a dry-etching process. Thereafter, the adhesion/barrier layer not under the metal layer 8112 is removed using a wet-etching process or using a dry-etching process.

After the patterned circuit layer 811 is formed, a polymer layer 99 can be formed by a suitable process or processes, e.g., by spin-on coating a negative photosensitive polyimide layer, such as ester type, on the patterned circuit layer 811 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9949 may be formed in the polymer layer 99, exposing a contact pad 8110 of the patterned circuit layer 811.

Referring to FIG. 3B, for forming a metal bump over the contact pad 8110, an adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9919. Thereafter, the seed layer may be formed by a suitable process or processes, e.g., by sputtering a copper layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball for a flip-chip assembly. The metal bump can be connected to a printed circuit board, ceramic substrate or another semiconductor chip.

Referring to FIG. 3B, for forming another kind of metal bump over the contact pad 8110, an adhesion/barrier layer may be formed by a suitable process or processes, e.g., by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9919. Thereafter, the seed layer may be formed by a suitable process or processes, e.g., by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 3B, a nickel layer having a thickness between 0.05 and 2 micrometers can be electroless plated on the contact pad 8110 exposed by the opening 9919, and a gold layer, platinum layer, palladium layer or ruthenium layer having a thickness between 0.05 and 2 micrometers can be electroless plated on the electroless plated nickel layer in the opening 9919 in the polymer layer 99. Thereafter, a gold wire can be bonded onto the electroless plated gold layer in the opening 9919 in the polymer layer 99 using a wirebonding process.

Alternatively, referring to FIG. 3B, a gold wire can be bonded onto a gold layer, platinum layer, palladium layer or ruthenium layer of the patterned circuit layer 811, exposed by the openings 9919 in the polymer layer 99 using a wirebonding process.

Referring to FIG. 3D, before the patterned circuit layer 811 is formed, a polymer layer 95 can be optionally formed by a suitable process or processes, e.g., by spin-on coating a negative photosensitive polyimide layer, such as ester type, on the nitride layer of the passivation layer 5 and on the contact pads 6490, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9519, 9519', 9511, 9512 and 9514 may be formed in the polymer layer 95, exposing multiple contact pads 6190 exposed by the openings 519, 519', 511, 512 and 514 in the passivation layer 5. After the polymer layer 95 is formed, the patterned circuit layer 811 can be formed on the polymer layer 95 and on the contact pads 6190 exposed by the openings 519, 519', 511, 512 and 514. The adhesion/barrier layer of any previously described material may be sputtered on the polymer layer 95 and on the contact pads 6190 exposed by the openings 9519, 9511, 9512 and 9514 in the polymer layer 95.

One of the patterned circuit layers 812 and 821 shown in FIG. 3C, composing the thick metal traces or planes 81 and 82 over the passivation layer 5 may include an adhesion/barrier/seed layer 8111, and a bulk conduction metal layer 8112. The methods to form the patterned circuit layers 812 and 821 and the specification thereof may be based on the methods to form the patterned circuit layer 801, 802 or 803 and the specification thereof shown in FIGS. 15A-15L, 16A-16M, 17A-17J, 18A-18I and 19A-19I.

In FIG. 3C, the thick and wide metal trace, bus or plane 82, used to deliver a ground voltage, may have a lower patterned circuit layer under an upper patterned circuit layer of the thick and wide metal trace, bus or plane 81, used to deliver a power voltage Vcc output from the voltage regulator or converter circuit 41. Alternatively, the thick and wide metal trace, bus or plane 82, used to deliver a ground voltage, may have an upper patterned circuit layer over a lower patterned circuit layer of the thick and wide metal trace, bus or plane 81, used to deliver a power voltage Vcc output from the voltage regulator or converter circuit 41. A polymer layer having a thickness between 2 and 30 micrometers may be between the upper and lower patterned circuit layers. Each of the lower and upper patterned circuit layers may have an electroplated copper layer having a thickness between 2 and 30 micrometers.

Referring to FIG. 3C, there may be multiple patterned circuit layers 821 and 812, including the previously described ground bus or plane 82 and the previously described power bus or plane 81, used to deliver a power voltage output from the voltage regulator or converter circuit 41, over the ground bus or plane 82, over the passivation layer 5. The process for forming the patterned circuit layer 821 on the passivation layer 5 and on the contact pads 6290 exposed by the openings 529, 521, 522 and 524 can be referred to as the process for forming the patterned circuit layer 811 shown in FIG. 3B on the passivation layer 5 and on the contact pads 6190 exposed by the openings 519, 511, 512 and 514. The patterned circuit layer 821 may contain an adhesion/barrier layer, a seed layer on the adhesion/barrier layer, and an electroplated metal layer 8212 on the seed layer, the adhesion/barrier layer and the seed layer composing the bottom layer 8211. The patterned circuit layer 812 may contain an adhesion/barrier layer, a seed layer on the adhesion/barrier layer, and an electroplated metal layer 8122 on the seed layer, the adhesion/barrier layer and the seed layer composing the bottom layer 8121.

Referring to FIG. 3C, after the patterned circuit layer 821 is formed, a polymer layer 98 can be formed by a suitable process or processes, e.g., by spin-on coating a negative photosensitive polyimide layer, such as ester type, on the patterned circuit layer 821 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9829 may be formed in the polymer layer 98, exposing a contact pad of the patterned circuit layer 821.

Referring to FIG. 3C, regards to the process for forming the patterned circuit layer 812, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pad of the patterned circuit layer 821 exposed by the opening 9829 in the polymer layer 98. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8122 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8122 is removed using a wet-etching process or using a dry-etching process. Thereafter, the adhesion/barrier layer not under the metal layer 8122 is removed using a wet-etching process or using a dry-etching process.

After the patterned circuit layer 812 is formed, a polymer layer 99 can be formed by a suitable process or processes, e.g., by spin-on coating a negative photosensitive polyimide layer, such as ester type, on the patterned circuit layer 812 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9929 may be formed in the polymer layer 99, exposing a contact pad 8120 of the patterned circuit layer 812.

Referring to FIG. 3C, for forming a metal bump over the contact pad 8120, an adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9929. Thereafter, the seed layer may be formed by a suitable process or processes, e.g., by sputtering a copper layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball. The metal bump can be connected to a printed circuit board, ceramic substrate or another semiconductor chip.

Referring to FIG. 3C, for forming another kind of metal bump over the contact pad 8120, an adhesion/barrier layer may be formed by a suitable process or processes, e.g., by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9929. Thereafter, the seed layer may be formed by a suitable process or processes, e.g., by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 3C, a nickel layer having a thickness between 0.05 and 2 micrometers can be electroless plated on the contact pad 8120 exposed by the opening 9929 in layer polymer layer 99, and a gold layer, platinum layer, palladium layer or ruthenium layer having a thickness between 0.05 and 2 micrometers can be electroless plated on the electroless plated nickel layer in the opening 9929 in the polymer layer 99. Thereafter, a gold wire can be bonded onto the electroless plated gold layer in the opening 9929 in the polymer layer 99 using a wirebonding process.

Alternatively, referring to FIG. 3C, a gold wire can be bonded onto a gold layer, platinum layer, palladium layer or ruthenium layer of the patterned circuit layer 812, exposed by the openings 9929 in the polymer layer 99 using a wirebonding process.

Alternatively, before the patterned circuit layer 821 is formed, a polymer layer can be optionally formed by a suitable process or processes, e.g., by spin-on coating a negative photosensitive polyimide layer, such as ester type, on the nitride layer of the passivation layer 5 and on the contact pads 6290, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings may be formed in the polymer layer, exposing multiple contact pads 6290 exposed by the openings 529, 521, 522 and 524 in the passivation layer 5. After the polymer layer is formed, the patterned circuit layer 821 can be formed on the polymer layer and on the contact pads 6290 exposed by the openings 529, 521, 522 and 524. The adhesion/barrier layer of any previously described material may be sputtered on the polymer layer and on the contact pads 6290 exposed by the openings in the polymer layer.

In some applications, some metal lines, traces or planes used to transmit a digital signal or analog signal can be provided on the polymer layer 98 and at the same level as the power traces, buses or planes 812. Alternatively, some metal lines, traces or planes used to transmit a digital signal or analog signal can be provided on the passivation layer 5 and at the same level as the ground traces, buses or planes 82. There are more other structures formed over the passivation layer 5, described as below: (1) in the first application for high performance circuits or high precision analog circuits, another patterned circuit layer, such as signal planes, buses, traces or lines, used to transmit a digital signal or an analog signal (not shown) may be added between the power lines, buses or planes 812 and the ground lines, buses or planes 821. Polymer layers, such as polyimide, benzocyclobutene (BCB), parylene, epoxy-based material, photoepoxy SU-8, elastomer or silicone, (not shown) over and under the signal planes, buses, traces or lines are provided to separate the signal planes, buses, traces or lines from the power traces, buses or planes 812 and to separate the signal planes, buses, traces or lines from the ground traces, buses or planes 821, respectively; (2) in the second application of the high current or the high precision circuit, another patterned circuit layer, such as ground planes, buses, traces or lines, (not shown) used to distribute a ground reference voltage may be added over the power traces, buses or planes 812. The power traces, buses or planes 812 are sandwiched by the ground traces, buses or planes 821 under the power traces, buses or planes 812 and the newly-added ground traces, buses or planes over the power traces, buses or planes 812, therefore, forming a Vss/Vcc/Vss structure (the stack is from the bottom to the top) over the passivation layer 5. A polymer layer, such as polyimide, benzocyclobutene (BCB), parylene, epoxy-based material, photoepoxy SU-8, elastomer or silicone, having a thickness of between 2 and 30 microns, is provided between the newly-added ground planes, buses, traces or lines and the power traces, buses or planes 812. A cap polymer layer, such as polyimide, benzocyclobutene (BCB), parylene, epoxy-based material, photoepoxy SU-8, elastomer or silicone, having a thickness of between 2 and 30 microns, covers the newly-added ground planes, buses, traces or lines; (3) in the third application of the high current or the high precision circuit, if required, based on the second application of the Vss/Vcc/Vss structure, another patterned circuit layer, such as power planes, buses, traces or lines, (not shown) used to distribute a power voltage can be further formed over the top ground planes, buses, traces or lines (not shown) over the power traces, buses or planes 812, creating a Vss/Vcc/Vss/Vcc structure, (the stack is from the bottom to the top) over the passivation layer 5. A polymer layer, such as polyimide, benzocyclobutene (BCB), parylene, epoxy-based material, photoepoxy SU-8, elastomer or silicone, having a thickness of between 2 and 30 microns, is provided between the newly-added power planes, buses, traces or lines and the top ground traces, buses or planes 81. A cap polymer layer, such as polyimide, benzocyclobutene (BCB), parylene, epoxy-based material, photoepoxy SU-8, elastomer or silicone, having a thickness of between 2 and 30 microns, covers the newly-added power planes, buses, traces or lines. The previously described structures provide a robust power supply for high current circuits, high precision analog circuits, high speed circuits, low power circuits, power management circuits, and high performance circuits.

FIG. 4 shows a circuit design for the voltage regulator or converter circuit 41 in FIGS. 1B, 1C, 2B, 2C, 3B, 3C and 3D. This circuit design is for a voltage regulator or converter circuit 41 usually used in the modern DRAM design as described in "Semiconductor Memories: A handbook of Design, Manufacture and Application" Second Edition, By B. Prince, published by John Wiley & Sons, 1991. The voltage regulator or converter circuit 41 shown in FIG. 4 provides both voltage regulating function and voltage converting function. The external voltage Vdd can be converted to an output voltage Vcc varying at a desired voltage level Vcc0, and the ratio of the difference of between Vcc and Vcc0 to Vcc0 is less than 10%, and preferably less than 5%. As discussed in the section of "description of related arts", more modern IC chips require on-chip voltage converters to convert the external (system, board, module, or card level) power supply voltage to a voltage level required by the chip. Moreover, some chips, such as a DRAM chip, even require dual or even triple voltage levels on the same chip: for example, 3.3 V for peripheral control circuits, while 1.5 V for the memory cells in the cell array area.

The voltage regulator or converter circuit 41 in FIG. 4 includes two circuit blocks: a voltage reference generator 410 and a current mirror circuit 410'. The voltage reference generator 410 generates a reference voltage $V_R$ at the node R, insensitive to the voltage fluctuation of the external power supply voltage Vdd at node 4199. Vdd is also the input supply voltage of the reference voltage generator 410. The voltage reference generator 410 includes two paths of voltage divider. One path includes three p-channel MOS transistors, 4101, 4103 and 4105 connected in series, and the other path includes two p-channel MOS transistors 4102 and 4104 connected in series. With the drain of the MOS transistor 4103 coupled to the gate of the MOS transistor 4104, the output reference voltage $V_R$ is regulated. When Vdd is fluctuated with a rise, the voltage level at node G will rise, resulting in a weaker turn-on of the MOS transistor 4104. When the MOS transistor 4104 is turned-on weaker, $V_R$ drops or rises with a smaller extent. Similarly, $V_R$ rises or drops with a smaller extent, when Vdd is fluctuated with a drop. This explains the voltage regulation behavior of the voltage reference generator 410. The output of the voltage reference generator 410 is used as a reference voltage of the current mirror circuit 410'. The current mirror circuit 410' provides a power supply with voltage at a desired constant level and with large current capability for an IC chip. The current mirror circuit 410' also eliminates possible huge power consumption or waste by avoiding a direct high current path from Vdd to Vss in the paths of voltage dividers. With the drain of the p-channel MOS transistor 4109 coupled to the gate of the output p-channel MOS transistor 4106, and with the output voltage node P coupled to the gate of the reference-voltage-mirror p-channel MOS transistor 4110, the output voltage Vcc is regulated, and accordingly the output voltage level Vcc can be designed at a desired level. The conductance transistor 4112 is a small p-channel MOS transistor with a gate connected to Vss, hence the transistor 4112 is always turned on. The conductance transistor 4111 is a large p-channel MOS, and its gate is controlled by a signal $\phi$. The transistor 4111 is turned on when the internal circuits or internal circuit units are in an active cycle, resulting in a fast response of the current path provided by the p-channel MOS transistor 4109 and n-channel MOS transistor 4107, and of the current path provided by the p-channel MOS transistor 4110 and n-channel MOS transistor 4108. The turn-on of the transistor 4111 minimizes the output supply Vcc bounce caused by a large transient current demanded by the internal circuits, such as 21, 22, 23 and 24, shown in FIGS. 1B, 1C, 2B, 2C, 3B, 3C and 3D. When the internal circuits or internal circuit units are in idle cycle, the transistor 4111 is turned off to save power consumption.

SECOND EMBODIMENT

Over-passivation Interconnection for Internal Circuits

The coarse traces over the passivation layer 5 described in the first embodiment can be alternatively used as an interconnection of IC internal circuits to transmit a signal from an internal circuit to another one or other ones. In this application, the coarse metal conductor over a passivation layer is used to transmit a signal or data from an output node Xo of an internal circuit 21 to input nodes Ui, Vi and Wi of other internal circuits 22, 23 and 24, as shown in FIG. 5B. When designed as a bundle of metal lines or metal traces that connects a set of similar nodes for inputting or outputting data signals, bit signals or address signals, for example, between two internal functional circuits separated in a longer distance (for example, in the distance of 1 mm or more 500 microns), such as the 8-, 16-, 32-, 64-, 128-, 256-, 512-, or 1024-bits of data (or address) connection between a processor unit and a memory unit on the same chip, the lines or traces are often referred to as buses, such as word buses or bit buses used in a memory. For these applications, the disclosure provides a thick metal trace, bus or plane 83 over a passivation layer 5, far away from underlying MOS devices, to connect multiple internal circuits 21, 22, 23 and 24, as shown in FIG. 5B, and accordingly allows the electrical signal to pass over MOS devices without perturbing the underlying MOS devices and without significant degradation of signal integrity. It is noted that the thick metal trace, bus or plane 83 over the passivation layer 5 connects the nodes of the internal circuits 21, 22, 23 and 24 not through any off-chip input/output circuit connected with an external circuit, and is not connected up to an external circuit. As the previously described thick metal trace, bus or plane 83 over the passivation layer 5 may induce only very low parasitic capacitance, the signal passing through the thick metal trace, bus or plane 83 will not be dramatically degraded. It makes this disclosure very suitable for high-speed, low power, high current or low voltage applications. In most cases of this disclosure, no additional amplifier, driver/receiver or repeater is required to help sustain the integrity of the signal passing through the thick metal trace, bus or plane 83. In some cases of this disclosure, an internal driver, internal receiver, internal tri-state buffer, or repeater, including MOS transistors with a smaller size as compared to those of the off-chip circuits connected with an external circuit, is required to transmit a signal passing through a long path, such as the thick metal trace, bus or plane 83 having a length of larger than 500 microns or larger than 1000 microns.

FIGS. 5B, 6B, and 7B show a second exemplary embodiment of the disclosure. FIG. 5B shows a simplified circuit diagram where a metal trace, bus or plane 83 over the passivation layer 5 connects multiple internal circuits 21, 22, 23 and 24 to transmit a signal from an output node Xo of an internal circuit 21 to input nodes Ui, Vi and Wi of the internal circuits 22, 23 and 24. FIG. 6B shows a top view of the semiconductor chip realizing the circuitry shown in FIG. 5B. FIG. 7B shows a cross-sectional view of the semiconductor chips realizing the circuitry shown in FIG. 5B. FIG. 6B shows a top view of the semiconductor chip shown in FIG. 7B, and the patterned circuit layer 831, such as signal plane, bus, trace or line, to transmit a signal from the internal circuit 21 to the internal circuits 22, 23 and 24 is realized from the concept of the coarse trace 83 shown in FIGS. 5B and 6B. The coarse trace 83 shown in FIGS. 5B and 6B indicates a trace of an over-passivation scheme 102 formed over the passivation layer 5, and the fine traces 631, 632 (including 632*a*, 632*b* and 632*c*) and 634 shown in FIG. 5B and the fine traces 632*a*, 632*b* and 632*c* shown in FIG. 6B indicate traces formed under the passivation layer 5.

As shown in FIGS. 5B, 6B and 7B, the internal circuit 21 includes an input node Xi to receive a signal and an output node Xo to output an electrical signal to the internal circuits 22, 23 and 24. The internal circuit 21 can be a logic gate, such as inverter, NOR gate, NAND gate, OR gate, AND gate, or an internal buffer (an inverter, an internal driver, or an internal tri-state buffer, shown in FIGS. 5C, 5D, and 5E, respectively). Through the coarse metal scheme 83 over the passivation layer 5, the input nodes Ui, Vi and Wi of the internal logic circuits 22, 23 and 24 (two NOR gates 22 and 24, and one NAND gate 23) are able to receive data or signal sent from the internal circuit 21. The voltage level at input nodes Ui, Vi and Wi are between Vdd and $V_{ss}$ with very minimal degradation and noise in that the interconnecting metal trace or bus 83 over the passivation layer 5 has low resistance and create low capacitance. It is noted that in this design the thick metal trace or bus 83 is not connected to off-chip circuits connected to an external circuit, such as ESD circuit, off-chip driver, off-chip receiver, or off-chip tri-state buffer circuit, resulting in speed improvement and power consumption reduction.

FIGS. 5A, 6A and 7A illustrate the connection between the internal circuits 21, 22, 23 and 24. The technique illustrated in FIGS. 5A, 6A and 7A relies on the fine-line metal traces 6311, 6321, 6341 and 638 under the passivation layer 5 to pass data output from the internal circuit 21 to the internal circuits 22, 23 and 24, without relying on any patterned circuit layer over the passivation layer 5.

FIGS. 5B and 6B reveal that the coarse metal scheme 83 is built over the passivation layer 5 of the IC chip, and is connected to the internal circuits 21, 22, 23 and 24. FIGS. 5A, 6A and 7A show that the internal circuit 21 is connected to a NOR gate 22 through segments 6311, 638, 6321*a* and 6321*b* of the fine-line metal structures under the passivation layer 5, to a NAND gate 23 through segments 6311, 638, 6321*a* and 6321*c* of the fine-line metal structures under the passivation layer 5, and to another NOR gate 24 through segments 6311, 638 and 6341 of the fine-line metal structures under the passivation layer 5. In the present disclosure, the second segment 638 of the fine-line metal structure is replaced by a coarse metal conductor 83 over the passivation layer 5, as shown in FIGS. 5B and 6B. A signal output from an output node (usually the drain of a MOS transistor in the internal circuit 21) of the internal circuit 21 may pass through a segment 631 of the fine-line metal structure under the passivation layer 5, then through an opening 531 in the passivation layer 5, then through the interconnection scheme 83 over the passivation layer 5, then through an opening 534 in the passivation layer 5, then through a segment 634 of the fine-line metal structure under the passivation layer 5, and then to an input node (usually the gate of an MOS transistor in the NOR gate 24) of the NOR gate 24. A signal output from an output node (usually the drain of an MOS transistor in the internal circuit 21) of the internal circuit 21 may pass through a segment 631 of the fine-line metal structure under the passivation layer 5, then through the opening 531 in the passivation layer 5, then through the interconnection scheme 83 over the passivation layer 5, then through an opening 532 in the passivation layer 5, then through a segment 632*a* and a segment 632*b* or 632*c* of the fine-line metal interconnection scheme under the passivation layer 5, and then to the input nodes (usually the gates of MOS transistors in the NOR gate 22 and the NAND gate 23, respectively) of a NOR gate 22 and a NAND gate 23.

Alternatively, when the internal circuit 21 is a NOR gate, the internal circuits 22, 23 and 24 may be NOR gates, OR gates, NAND gate or AND gates. When the internal circuit 21 is an OR gate, the internal circuits 22, 23 and 24 may be NOR gates, OR gates, NAND gate or AND gates. When the internal circuit 21 is a NAND gate, the internal circuits 22, 23 and 24 may be NOR gates, OR gates, NAND gate or AND gates. When the internal circuit 21 is a AND gate, the internal circuits 22, 23 and 24 may be NOR gates, OR gates, NAND gate or AND gates. When a NMOS transistor in the internal circuit 21 having a drain as the output node Xo of the internal circuit 21 has a ratio of a physical channel width thereof to a physical channel length thereof ranging from, e.g., about 0.1 to 20, ranging from, e.g., about 0.1 to 10, or preferably ranging from, e.g., about 0.2 to 2, a NMOS transistor in the internal circuit 22, 23 or 24 having a gate as the input node Ui, Vi and Wi of the internal circuit 22, 23 or 24 has a ratio of a physical channel width thereof to a physical channel length thereof ranging from, e.g., about 0.1 to 20, ranging from, e.g., about 0.1 to 10 or preferably ranging from, e.g., about 0.2 to 2. When a NMOS transistor in the internal circuit 21 having a drain as the output node Xo of the internal circuit 21 has a ratio of a physical channel width thereof to a physical channel length thereof ranging from, e.g., about 0.1 to 20, ranging from, e.g., about 0.1 to 10, or preferably ranging from, e.g., about 0.2 to 2, a PMOS transistor in the internal circuit 22, 23 or 24 having a gate as the input node Ui, Vi and Wi of the internal circuit 22, 23 or 24 has a ratio of a physical channel width thereof to a physical channel length thereof ranging from, e.g., about 0.2 to 40, ranging from, e.g., about 0.2 to 20, or preferably ranging from, e.g., about 0.4 to 4. When a PMOS transistor in the internal circuit 21 having a drain as the output node Xo of the internal circuit 21 has a ratio of a physical channel width thereof to a physical channel length thereof ranging from, e.g., about 0.2 to 40, ranging from, e.g., about 0.2 to 20, or preferably ranging from, e.g., about 0.4 to 4, a NMOS transistor in the internal circuit 22, 23 or 24 having a gate as the input node Ui, Vi and Wi of the internal circuit 22, 23 or 24 has a ratio of a physical channel width thereof to a physical channel length thereof ranging from, e.g., about 0.1 to 20, ranging from, e.g., about 0.1 to 10, or preferably ranging from, e.g., about 0.2 to 2. When a PMOS transistor in the internal circuit 21 having a drain as the output node Xo of the internal circuit 21 has a ratio of a physical channel width thereof to a physical channel length thereof ranging from, e.g., about 0.2 to 40, ranging from, e.g., about 0.2 to 20, or preferably ranging from, e.g., about 0.4 to 4, a PMOS transistor in the internal circuit 22, 23 or 24 having a gate as the input node Ui, Vi and Wi of the internal circuit 22, 23 or 24 has a ratio of a physical channel width thereof to a physical channel length thereof ranging from, e.g., about 0.2 to 40, ranging from, e.g., about 0.2 to 20, or preferably ranging from, e.g., about 0.4 to 4. In the previously described case, a signal output from the output node Xo of the internal circuit 21 may pass through the thick metal plane, bus, trace or line 83 to the internal circuits 22, 23 and 24, with a current, passing through the thick metal plane, bus, trace or line 83, ranging from, e.g., about 50 microamperes to 2 milliamperes, and preferably ranging from, e.g., about 100 microamperes to 1 milliampere. The fine line metal structures 634, 632 and 631 shown in 7B, 7C and 7D may be formed with multiple circuit layers 60 and multiple stacked plugs 60', upper plugs 60' being aligned with bottom plugs 60'. When the circuit layers 60 are formed with electroplated copper, the stacked plugs 60' may be formed with electroplated copper. When the circuit layers 60 are formed with sputtered aluminum, the stacked plugs 60' may be formed with chemical vapor deposited tungsten. There are multiple insulating layers 30 under the passivation layer 5, and each one is positioned between the neighboring two of the circuit layers 60. The insulating layers 30 made of one or more inorganic materials may include a layer of silicon oxide with a thickness of between 0.01 and 2 micrometers, may include a layer of fluorine doped silicate glass (FSG) with a thickness of between 0.01 and 2 micrometers, or may include a layer with a lower dielectric constant, such as between 1.5 and 3.5, having a thickness of between 0.01 and 2 micrometers, such as black diamond film or a material containing hydrogen, carbon, oxygen and silicon.

The thick metal trace or plane 83 over the passivation layer 5, shown in FIGS. 5B and 6B, may be composed of only one patterned circuit layer 831, as shown in FIG. 7B, or multiple patterned circuit layers 831 and 832, as shown in FIG. 7C. In FIG. 7B, the patterned circuit layer 831, such as a signal plane, bus, trace or line, to transmit a signal is realized from the concept of the coarse trace 83 shown in FIGS. 5B and 6B. In FIG. 7C, the patterned circuit layers 831 and 832, such as signal planes, buses, traces or lines, to transmit a signal is realized from the concept of the coarse trace 83 shown in FIGS. 5B and 6B. When the thick metal traces or plane 83 over the passivation layer 5, shown in FIGS. 5B and 6B, is composed of multiple patterned circuit layers 831 and 832, as shown in FIG. 7C, a polymer layer 98, such as polyimide (PI), benzocyclobutene (BCB), parylene, photoepoxy SU-8, epoxy-based material, elastomer or silicone, may be between the neighboring patterned circuit layers 831 and 832, separating the patterned circuit layers 831 and 832. The polymer layer 98 may have a thickness between 2 and 30 micrometers. A polymer layer 99, such as polyimide (PI), benzocyclobutene (BCB), parylene, epoxy-based material, photoepoxy SU-8, elastomer or silicone, may be on the topmost one 832 of the patterned circuit layers 831 and 832, separated by the above mentioned polymer layers 98, over the passivation layer 5, as shown in FIG. 7C, or on the only one patterned circuit layer 831, as shown in FIGS. 7B and 7D. The polymer layer 99 may have a thickness between 2 and 30 micrometers. It is noted that no opening in the polymer layer 99 exposes the patterned circuit layer 831 or 832, and the patterned circuit layer 831 or 832 has no pad connected up to an external circuit, as shown in FIGS. 7B, 7C and 7D. Alternatively, a polymer layer 95, such as polyimide (PI), benzocyclobutene (BCB), parylene, epoxy-based material, photoepoxy SU-8, elastomer or silicone, may be between the passivation layer 5 and the bottommost one 831 of the patterned circuit layers 831 and 832, separated by the above mentioned polymer layers 98, for the structure shown in FIG. 7C, or between the passivation layer 5 and the only one patterned circuit layer 831, as shown in FIG. 7D. The polymer layer 95 may have a thickness between 2 and 30 micrometers. Multiple openings 9519, 9519', 9511, 9512 and 9514 in the polymer layer 95 are substantially aligned with the openings 519, 519', 511, 512 and 514 in the passivation layer 5, respectively. The openings 9531, 9532 and 9534 in the polymer layer 95 expose the pads exposed by the openings 531, 532 and 534 in the passivation layer 5, respectively.

The openings 9531, 9532 and 9534 in the polymer layer 95 have lower portions having widths or transverse dimensions larger than those of the openings 531, 532 and 534 in the passivation layer 5 aligned with the openings 9531, 9532 and 9534, respectively. The openings 9531, 9532 and 9534 in the polymer layer 95 further expose the passivation layer 5 close to the openings 531, 532 and 534. The shape of the openings 531, 532 and 534 from a top perspective view may be round, square, rectangular or polygon. If the openings 531, 532 and 534 are round, the openings 531, 532 and 534 may have a diameter of between 0.1 and 200 microns, between 1 and 100 microns, or, preferably, between 0.1 and 30 microns. If the openings 531, 532 and 534 are square, the openings 531, 532 and 534 may have a width of between 0.1 and 200 microns, between 1 and 100 microns, or, preferably, between 0.1 and 30 microns. If the openings 531, 532 and 534 are rectangular, the openings 531, 532 and 534 may have a width of between 0.1 and 200 microns, between 1 and 100 microns, or, preferably, between 0.1 and 30 microns, and a length of between 1 micron and 1 centimeter. If the openings 531, 532 and 534 are polygon having more than five sides, the openings 531, 532 and 534 have a largest diagonal length of between 0.1 and 200 microns, between 1 and 100 microns, or, preferably, between 0.1 and 30 microns. Alternatively, the openings 531, 532 and 534 have a largest transverse dimension of between 0.1 and 200 microns, between 1 and 100 microns, or, preferably, between 0.1 and 30 microns. In a case, the openings 531, 532 and 534 have a width of between 0.1 and 30 microns, with the lower portion of the openings 9531, 9532 and 9514 in the polymer layer 95 having a width of between 20 and 100 microns.

Each of the patterned circuit layers 831 and 832 composing the thick metal trace or plane 83 over the passivation layer 5, shown in FIGS. 7B, 7C and 7D, may include an adhesion/barrier/seed layer 8311, 8311*a*, 8311*b* or 8321 and a bulk conduction metal layer 8112, 8312*a*, 8312*b* or 8322. The methods to form the patterned circuit layer 831 or 832 and the specification thereof may follow the methods to form the patterned circuit layer 801, 802 or 803 and the specification thereof shown in FIGS. 15A-15L, 16A-16M, 17A-17J, 18A-18I and 19A-19I.

In FIGS. 7B and 7D, there is only one patterned circuit layer 831, including a portion serving as the previously described thick and wide metal trace 83 over the passivation layer 5. The patterned circuit layer 831 may contain an adhesion/barrier layer, a seed layer on the adhesion/barrier layer, and an electroplated metal layer 8312 on the seed layer, the adhesion/barrier layer and the seed layer composing the bottom layer 8311.

Referring to FIG. 7B, regards to the process for forming the patterned circuit layer 831, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6390, principally made of aluminum or copper, exposed by multiple openings 531, 532 and 534 in the passivation layer 5. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8312 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8312 is removed using a wet-etching process or using a dry-etching process. Thereafter, the adhesion/barrier layer not under the metal layer 8312 is removed using a wet-etching process or using a dry-etching process.

After the patterned circuit layer 831 is formed, a polymer layer 99 can be formed by a suitable process or processes, e.g., by spin-on coating a negative photosensitive polyimide layer, such as ester type, on the patterned circuit layer 831 and on the nitride layer of the passivation layer 5 and then curing the spin-on coated polyimide layer at the temperature between 265 and 285° C. for a time between 30 and 240 minutes in a nitrogen or oxygen-free ambient. No opening is formed in the polymer layer 99 to expose the thick and wide metal trace 83.

Referring to FIG. 7D, before the patterned circuit layer 831 is formed, a polymer layer 95 can be optionally formed by a suitable process or processes, e.g., by spin-on coating a negative photosensitive polyimide layer, such as ester type, on the nitride layer of the passivation layer 5 and on the contact pads exposed by the openings 531, 532 and 534 in the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9531, 9532 and 9534 may be formed in the polymer layer 95, exposing multiple contact pads exposed by the openings 531, 532 and 533 in the passivation layer 5. After the polymer layer 95 is formed, the patterned circuit layer 831 can be formed on the polymer layer 95 and on the contact pads exposed by the openings 531, 532 and 533. The adhesion/barrier layer of any previously described material may be sputtered on the polymer layer 95 and on the contact pads exposed by the openings 9531, 9532 and 9534 in the polymer layer 95.

Alternatively, referring to FIG. 7C, there may be multiple patterned circuit layers 831 and 832, including a portion serving as the previously described thick and wide metal trace 83, over the passivation layer 5. The process for forming the patterned circuit layer 831 shown in FIG. 7C can be referred to as the process for forming the patterned circuit layer 831 shown in FIG. 10B. The patterned circuit layer 832 may contain an adhesion/barrier layer, a seed layer on the adhesion/barrier layer, and an electroplated metal layer 8322 on the seed layer, the adhesion/barrier layer and the seed layer composing the bottom layer 8321.

Referring to FIG. 7C, after the patterned circuit layer 831 is formed, a polymer layer 98 can be formed by a suitable process or processes, e.g., by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9831 and 9834 may be formed in the polymer layer 98, exposing multiple contact pads of the patterned circuit layer 831.

Referring to FIG. 7C, regards to the process for forming the patterned circuit layer 832, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pads of the patterned circuit layer 831 exposed by multiple openings 9831 and 9834 in the polymer layer 98. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8322 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8322 is removed using a wet-etching process or using a dry-etching process. Thereafter, the adhesion/barrier layer not under the metal layer 8322 is removed using a wet-etching process or using a dry-etching process.

After the patterned circuit layer 832 is formed, a polymer layer 99 can be formed by a suitable process or processes, e.g., by spin-on coating a negative photosensitive polyimide layer, such as ester type, on the patterned circuit layer 832 and on the polymer layer 98, and then curing the spin-on coated polyimide layer at the temperature between 265 and 285° C. for a time between 30 and 240 minutes in a nitrogen or oxygen-free ambient.

Alternatively, referring to FIG. 7C, before the patterned circuit layer 831 is formed, a polymer layer 95 as mentioned in FIG. 7D can be optionally formed by a suitable process or processes, e.g., by spin-on coating a negative photosensitive polyimide layer, such as ester type, on the nitride layer of the passivation layer 5 and on the contact pads exposed by the openings 531, 532 and 534 in the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9531, 9532 and 9534 may be formed in the polymer layer 95 as mentioned in FIG. 7D, exposing multiple contact pads exposed by the openings 531, 532 and 533 in the passivation layer 5. After the polymer layer 95 is formed, the patterned circuit layer 831 can be formed on the polymer layer 95 and on the contact pads exposed by the openings 531, 532 and 533. The adhesion/barrier layer of any previously described material may be sputtered on the polymer layer 95 and on the contact pads exposed by the openings 9531, 9532 and 9534 in the polymer layer 95.

FIG. 7C is similar to FIG. 7B except the thick metal planes, buses or traces 83 are composed of two patterned circuit layers 831 and 832; the bottom one is composed of segments 831*a* and 831*b*. A polymer layer 98 separates the patterned circuit layer 831 from the patterned circuit layer 832. In FIG. 7C, the thick metal plane, trace or bus 831 in FIG. 7B is replaced by the thick metal plane, trace or bus 831*a*, 831*b* and 832. Referring to FIG. 7C, a signal output from the output node (usually the drain of an MOS transistor in the internal circuit 21) of the internal circuit 21 passes through the fine-line metal buses or traces 631 under the passivation layer 5, then through the opening 531 in the passivation layer 5, then through the metal trace or bus 831*b* over the passivation layer 5, (1) in a first path, then up through an opening 9831 in the polymer layer 98, then through the metal bus or trace 832 on the polymer layer 98, then down through an opening 9834 in the polymer layer 98, then through the metal trace or bus 831*a* over the passivation layer 831*a*, then through an opening 534 in the passivation layer 5, then through the fine-line metal structure 634 under the passivation layer 5, and to the input node (usually the gate of an MOS transistor in the NOR gate 24) of the NOR gate 24; (2) in a second path, then down through an opening 532 in the passivation layer 5, then through the fine-line metal interconnection scheme 632 under the passivation layer 5, and then to the input nodes (usually the gates of MOS transistors in the NOR gate 24 and the NAND gate 23, respectively) of the NOR gate 22 and the NAND gate 23.

Referring to 5B, 6B, 7B, 7C and 7D, the metal trace or bus 83 over the passivation layer 5 can be connected to an off-chip I/O circuit connected to an external circuit, and accordingly the thick metal trace or bus 83 has no significant voltage drop or signal degradation. The over-passivation scheme 102 shown in FIG. 7B includes the polymer layer 99 and the metal trace 83 provided by the patterned circuit layer 831. The over-passivation scheme 102 shown in FIG. 7C includes two polymer layers 98 and 99 and the metal trace 83 provided by the patterned circuit layers 831 and 832, and the openings 9831 and 9834 in the polymer layer 98 are over the patterned circuit layers 831. The over-passivation scheme 102 shown in FIG. 7D includes two polymer layers 95 and 99 and the metal trace 83 provided by the patterned circuit layer 831, and the openings 9531, 9532 and 9534 are in the polymer layer 95.

Now refer to FIGS. 5C-5E showing internal buffer circuits applied to the internal circuit 21. The internal circuit 21 shown in FIGS. 5B, 6B, 7B, 7C and 7D may be an internal inverter shown in FIG. 5C. In a first application, the size of the n-channel MOS 2101 and p-channel MOS 2102 can be designed in a size often employed in the internal circuits 22, 23 and 24. The size of an MOS transistor is defined as a ratio of a physical channel width thereof to a physical channel length thereof. The n-channel MOS transistor 2101 may have a ratio of a physical channel width thereof to a physical channel length thereof ranging from, e.g., about 0.1 to 20, ranging from, e.g., about 0.1 to 10, or preferably ranging from, e.g., about 0.2 to 2. The p-channel MOS transistor 2102 may have a ratio of a physical channel width thereof to a physical channel length thereof ranging from, e.g., about 0.2 to 40, ranging from, e.g., about 0.2 to 20, or preferably ranging from, e.g., about 0.4 to 4. In the first application, a current passing through the thick metal trace 83 over the passivation layer 5 and outputting from the node Xo of the internal circuit 21 may be in a range of between 50 μA and 2 mA, and preferably of between 100 μA and 1 mA. In a second application, a larger drive current is required for the output of the inverter 211, for example, when a heavy load is demanded by the load internal circuits 22, 23 and 24, or when the internal circuits 22, 23 and 24 are located far away from the internal circuit 21, requiring interconnection metal lines or traces connecting the internal circuit 21 and the internal circuits 22, 23 and 24 in a distance of larger than 1 mm or of larger than 3 mm, for example. In the second application, the current output from the inverter 211 is higher than that output from the regular internal circuit, and is, for example, at 1 mA or 5 mA, or in a range of between 500 μA and 10 mA, and preferably of between 700 μA and 2 mA. Hence, in the second application, the n-channel MOS transistor 2101 may have a ratio of a physical channel width thereof to a physical channel length thereof ranging from, e.g., about 1.5 to 30, and preferably ranging from, e.g., about 2.5 to 10. The p-channel MOS transistor 2102 may have a ratio of a physical channel width thereof to a physical channel length thereof ranging from, e.g., about 3 to 60, and preferably ranging from, e.g., about 5 to 20.

When the inverter 211 shown in FIG. 5C is applied to the internal circuit 21 as shown in FIGS. 5B, 6B, 7B, 7C and 7D, the drains of the n-channel MOS transistor 2101 and p-channel MOS transistor 2102, serving as the output node Xo of the internal circuit 21, are connected to the thick metal traces or buses 83, 831 or 832 over the passivation layer 5 as shown in FIGS. 5B, 6B, 7B, 7C and 7D. The gates of the n-channel MOS transistor 2101 and p-channel MOS transistor 2102 serve as the input node Xi of the internal circuit 21.

Referring to FIG. 5C, the previously described power plane, bus or trace 81, 811 or 812, as shown in FIGS. 1B, 1C, 2B, 2C, 3B, 3C and 3D, over the passivation layer 5 may connect the node P of the voltage regulator or converter circuit 41 and the source of the p-channel MOS device 2102. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The previously described ground plane, bus or trace 82 or 821, as shown in FIGS. 1C, 2C and 3C, over the passivation layer 5 may connect the node Rs of the voltage regulator or converter circuit 41 and the source of the n-channel MOS device 2101. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

FIGS. 5D and 5E show an internal driver 212 and internal tri-state output buffer 213, respectively. When the internal driver 212 shown in FIG. 5D is applied to the internal circuit 21 as shown in FIGS. 5B, 6B, 7B, 7C and 7D, the drains of a n-channel MOS transistor 2103 and p-channel MOS transistor 2104, serving as the output node Xo of the internal circuit 21, are connected to the thick metal traces or buses 83, 831 or 832 over the passivation layer 5. The gates of a n-channel MOS transistor 2103' and p-channel MOS transistor 2104' serve as the input node Xi of the internal circuit 21. The drains of the n-channel MOS transistor 2103' and p-channel MOS transistor 2104' are connected to the gates of the n-channel MOS transistor 2103 and p-channel MOS transistor 2104.

When the internal tri-state output buffer 213 shown in FIG. 5E is applied to the internal circuit 21 as shown in FIGS. 5B, 6B, 7B, 7C and 7D, the drains of a n-channel MOS transistor 2107' and p-channel MOS transistor 2108' with a switch function controlled by an Enable signal transmitted to the gate of the n-channel MOS transistor 2107' and Enable(bar) signal transmitted to the gate of the p-channel MOS transistor 2108', serving as the output node Xo of the internal circuit 21, are connected to the thick metal traces or buses 83, 831 or 832 over the passivation layer 5 as shown in FIGS. 5B, 6B, 7B, 7C and 7D. The gates of a n-channel MOS transistor 2107 and p-channel MOS transistor 2108 serve as the input node Xi of the internal circuit 21. The drains of a n-channel MOS transistor 2107 and p-channel MOS transistor 2108 are connected to the sources of the n-channel MOS transistor 2107' and p-channel MOS transistor 2108', respectively.

The internal driver 212 or internal tri-state output buffer 213, used to drive a signal through the post-passivation metal traces 83 and to the internal circuits 22, 23 and 24, as shown in FIG. 5D or 5E, is similar to the off-chip driver or off-chip tri-state output buffer used to drive an external circuitry, to be discussed in the following FIG. 11A or 11D, respectively, except that (1) the output node Xo of the internal driver 212 or internal tri-state output buffer 213 is not connected to an external circuit; (2) the largest one of p-MOS transistors in the internal driver 212 or internal tri-state output buffer 213 has a ratio of a physical channel width thereof to a physical channel length thereof smaller than that of the largest one of p-MOS transistors in the off-chip driver or off-chip tri-state output buffer connected to an external circuit. The internal tri-state output buffer 213 provides drive capability and switch capability, and is particularly useful to transmit a data signal or an address signal in a memory chip through the thick metal lines or traces 83 over the passivation layer 5 acting as data or address buses.

In FIG. 5B, a relatively large drive current may be required at the output node Xo of the internal circuit 21 when a heavy load is demanded by the internal circuits 22, 23 and 24, or when the internal circuits 22, 23 and 24 are far away from the internal circuit 21 in a distance of larger than 1 mm or of larger than 3 mm. To provide a relatively large drive current, the internal circuit 21 can be designed as an internal driver 212 shown in FIG. 5D or an internal tri-state output buffer 213 shown in FIG. 5E.

In FIGS. 5D and 5E, the n-channel MOS transistors 2103, 2107 and 2107' may have a ratio of a physical channel width thereof to a physical channel length thereof ranging from, e.g., about 1.5 to 30, and preferably ranging from, e.g., about 2.5 to 10. The p-channel MOS transistors 2104, 2108 and 2108' may have a ratio of a physical channel width thereof to a physical channel length thereof ranging from, e.g., about 3 to 60, and preferably ranging from, e.g., about 5 to 20. In FIG. 5D, the n-channel MOS transistor 2103' may have a ratio of a physical channel width thereof to a physical channel length thereof ranging from, e.g., about 0.1 to 20, ranging from, e.g., about 0.1 to 10, or preferably ranging from, e.g., about 0.2 to 2, and the p-channel MOS transistor 2104' may have a ratio of a physical channel width thereof to a physical channel length thereof ranging from, e.g., about 0.2 to 40, ranging from, e.g., about 0.2 to 20, or preferably ranging from, e.g., about 0.4 to 4. Referring to FIGS. 5B, 5D and 5E, the internal driver 212 or internal tri-state buffer 213 may drive a signal output from the output node Xo thereof through the thick metal trace or bus 83 over the passivation layer 5 to the input nodes Ui, Vi and Wi of the internal circuits 22, 23 and 24 but not to an external circuit. A current passing through the thick metal trace or line 83 over the passivation layer 5 and outputting from the node Xo of the internal circuit 21, provided by the internal driver 212 or internal tri-state buffer 213, may be between 500 μA and 10 mA, and preferably between 700 μA and 2 mA.

Referring to FIG. 5D, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the sources of the p-channel MOS devices 2104 and 2104'. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the sources of the n-channel MOS devices 2103 and 2103'. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Referring to FIG. 5E, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the source of the p-channel MOS device 2108. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the source of the n-channel MOS device 2107. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Alternatively, when a NMOS transistor in the internal circuit 21 having a drain as the output node Xo of the internal circuit 21 has a ratio of a physical channel width to a physical channel length ranging from, e.g., about 1.5 to 30, and preferably ranging from, e.g., about 2.5 to 10, a NMOS transistor in the internal circuit 22, 23 or 24 having a gate as the input node Ui, Vi and Wi of the internal circuit 22, 23 or 24 has a ratio of physical channel width to physical channel length ranging from, e.g., about 0.1 to 20, ranging from, e.g., about 0.1 to 10, or preferably ranging from, e.g., about 0.2 to 2. When a NMOS transistor in the internal circuit 21 having a drain as the output node Xo of the internal circuit 21 has a ratio of a physical channel width to a physical channel length ranging from, e.g., about 1.5 to 30, and preferably ranging from, e.g., about 2.5 to 10, a PMOS transistor in the internal circuit 22, 23 or 24 having a gate as the input node Ui, Vi and Wi of the internal circuit 22, 23 or 24 has a ratio of a physical channel width to a physical channel length ranging from, e.g., about 0.2 to 40, ranging from, e.g., about 0.2 to 20, or preferably ranging from, e.g., about 0.4 to 4. When a PMOS transistor in the internal circuit 21 having a drain as the output node Xo of the internal circuit 21 has a ratio of a physical channel width to a physical channel length ranging from, e.g., about 3 to 60, and preferably ranging from, e.g., about 5 to 20, a NMOS transistor in the internal circuit 22, 23 or 24 having a gate as the input node Ui, Vi and Wi of the internal circuit 22, 23 or 24 has a ratio of a physical channel width to a physical channel length ranging from, e.g., about 0.1 to 20, ranging from, e.g., about 0.1 to 10, or preferably ranging from, e.g., about 0.2 to 2. When a PMOS transistor in the internal circuit 21 having a drain as the output node Xo of the internal circuit 21 has a ratio of a physical channel width to a physical channel length ranging from, e.g., about 3 to 60, and preferably ranging from, e.g., about 5 to 20, a PMOS transistor in the internal circuit 22, 23 or 24 having a gate as the input node Ui, Vi and Wi of the internal circuit 22, 23 or 24 has a ratio of a physical channel width to a physical channel length ranging from, e.g., about 0.2 to 40, ranging from, e.g., about 0.2 to 20, or preferably ranging from, e.g., about 0.4 to 4. In the previously described case, a signal output from the output node Xo of the internal circuit 21 may pass through the thick metal plane, bus, trace or line 83 to the internal circuits 22, 23 and 24, with a current, passing through the thick metal plane, bus, trace or line 83, ranging from, e.g., about 500 microamperes to 10 milliamperes, and preferably ranging from, e.g., about 700 microamperes to 2 milliamperes.

The concept shown in FIG. 5B can be applied to a memory chip, as illustrated in FIGS. 5F-5J.

Referring to FIG. 5F, the previously described tri-state output buffer 213 is employed to be the internal circuit 21 shown in FIGS. 5B, 6B, 7B, 7C and 7D and has an input node Xi connected to an output node of an amplifier 214 and an output node Xo connected to the internal circuits 22, 23 and 24, such as logic gates, through the above mentioned thick metal plane, bus or trace 83, 831 or 832 over the passivation layer 5, as shown in FIGS. 5B, 6B, 7B, 7C and 7D, and the internal circuits 22, 23 and 24 may alternatively be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The semiconductor chip may include a memory array including multiple memory cells connected to word lines, bit lines and bit (bar) lines. Each pair of bit line, such as 2171, and bit (bar) line, such as 2172, is connected to one of the amplifiers, such as 214, through the channel of the n-channel MOS transistors 2123 and 2122 controlled by CS1 node. When the n-channel MOS transistors 2122 and 2123 are turned off in an inactive cycle, the noise on the bit line 2171 or on the bit (bar) line 2172 can not be transmitted to the sense amplifier 214 nor has a negative impact on the sense amplifier 214.

In this case, the memory cell 215 is a static random access memory (SRAM) cell. Alternatively, the memory cell 215 may be a dynamic random access memory (DRAM) cell, an erasable programmable read only memory (EPROM) cell, an electronic erasable programmable read only memory (EEPROM) cell, a flash memory cell, a read only memory (ROM) cell, or a magnetic random access memory (MRAM) cell, which is connected to one or more logic gates 22, 23 and 24 through a thick metal traces 83, 831 or 832 over the passivation layer 5, as shown in FIGS. 5B, 6B, 7B, 7C and 7D. A sense amplifier 214, tri-state buffer 213, pass gate 216, latch memory 217 or internal driver 212, as shown in FIGS. 5F-5J, may be optionally set on the path between any kind of memory cell 215 and the thick metal traces 83, 831 or 832 over the passivation layer 5.

In case of SDRAM cell acting as the memory cell 215, a plurality of the memory cell 215 may be arranged in an array. A plurality of bit line 2171 and bit (bar) line 2172 arranged in parallel are connected to the sources or drains of NMOS transistors 2120 and 2119 of the memory cells 215 arranged in a column, respectively. A plurality of word line arranged in parallel and in vertical to the bit line 2171 and bit (bar) line 2172 is connected to the gate of NMOS transistors 2120 and 2119 of the memory cells 215 arranged in a row. The memory cell 215 further includes two PMOS transistors 2116 and 2118 and two NMOS transistors 2115 and 2117, and the gates of the PMOS transistor 2116 and the NMOS transistor 2115 and the drains of the PMOS transistor 2118 and the NMOS transistor 2117 are connected to the bit line 2171 through the channel of the NMOS transistor 2120, and the gates of the PMOS transistor 2118 and the NMOS transistor 2117 and the drains of the PMOS transistor 2116 and the NMOS transistor 2115 are connected to the bit (bar) line 2172 through the channel of the NMOS transistor 2119.

The sense amplifier 214, such as differential amplifier, can be coupled to multiple memory cells 215 arranged in a column through the bit line 2171 and the bit (bar) line 2172. The sense amplifier 214 includes two PMOS transistors 2112 and 2114 and two NMOS transistors 2111 and 2113, and the gates of the PMOS transistors 2112 and 2114 are connected to the drains of the NMOS transistor 2111 and the PMOS transistor 2112, and the drains of the PMOS transistor 2114 and the NMOS transistor 2113 serving as an output node of the sense amplifier 214 are connected to the gates of the PMOS transistor 2108 and the NMOS transistor 2107 in the previously described tri-state buffer 213. The gate of the NMOS transistor 2113 is connected to the bit line 2171. The gate of the NMOS transistor 2111 is connected to the bit (bar) line 2172. The description and specification of the tri-state buffer 213 may be referred to the above illustration shown in FIG. 5E.

Referring to FIG. 5F, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the source of the PMOS transistor 2108 of the tri-state output buffer 213 through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the source of the NMOS transistor 2107 of the tri-state output buffer 213 through the previously described ground plane, bus or trace 82 or 821, as shown in FIGS. 1C, 2C and 3C, over the passivation layer 5. The differential sense amplifier 214 is isolated from Vss by a transistor 2121, and controlled by a column selection signal (CS2) to save power consumption. The transistor 2121 is turned off when the memory cell 215 is not read. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

When the memory cell 215 is in a "READ" operation with the NMOS transistors 2120 and 2119 being turned on, the state latched in the memory cell 215, such as bit data and bit (bar) data, may be output to the bit line 2171 and bit (bar) line 2172 through the channels of the NMOS transistors 2120 and 2119, respectively. The bit data and bit (bar) data may be transmitted to the sense amplifier 214 through the bit line 2171 and bit (bar) line 2172, respectively, to initially amplify the bit data and the bit (bar) data, leading the bit data and the bit (bar) data to have a desirable waveform or voltage level. The initially amplified bit data or bit (bar) data output from the amplifier 214 may be transmitted to a tri-state output buffer 213 to further amplify the initially amplified bit data or bit (bar) data, but FIG. 5F only show the initially amplified bit (bar) data output from the amplifier 214 is transmitted to the input node Xi of the tri-state output buffer 213. Further amplified bit (bar) data or bit data output from a tri-state buffer can be transmitted to the internal circuits 22, 23 and 24 through the thick metal planes or buses 83, 831 or 832, as shown in FIGS. 5B, 6B, 7B, 7C and 7D, but FIG. 5F only show the further amplified bit data is output from the tri-state output buffer 213.

The bit line 2171 and bit (bar) line 2172 may be provided by fine-line metal layers, made of sputtered aluminum or damascene copper, only under the passivation layer 5. Alternatively, the bit line 2171 and bit (bar) line 2172 may be provided by the interconnecting structure over the passivation layer 5 and under the passivation layer 5, and the portion under the passivation layer 5 may include sputtered aluminum layer or damascene copper layer having a thickness of between 0.01 and 2 microns, and the portion over the passivation layer 5 may include electroplated copper or electroplated gold having a thickness of between 2 and 20 microns.

In this case, the thick metal buses or traces 83, 831 or 832 shown in FIGS. 5B, 6B, 7B, 7C and 7D may be called as bit buses to transmit further amplified bit data or bit (bar) data with 4 bits width, 8 bits width, 16 bits width, 32 bits width, 64 bits width, 128 bits width, 256 bits width, 512 bits width, 1024 bits width, 2048 bits width or 4096 bits width, output from the tri-state buffers 213. Accordingly, 4, 8, 16, 32, 64, 128, 256, 512, 1024, 2048 or 4098 bit buses arranged in parallel and over the passivation layer 5, may connect the output nodes Xo of multiple internal circuits 21, the tri-state buffers 213 in this case, to multiple internal circuits 22, 23 and 24, such as NOR gates, NAND gates, AND gates, OR gates, operational amplifiers, adders, multiplexers, diplexers, multipliers, A/D converters, D/A converters, CMOS transistors, bipolar CMOS transistors or bipolar circuits.

Figure 5U:
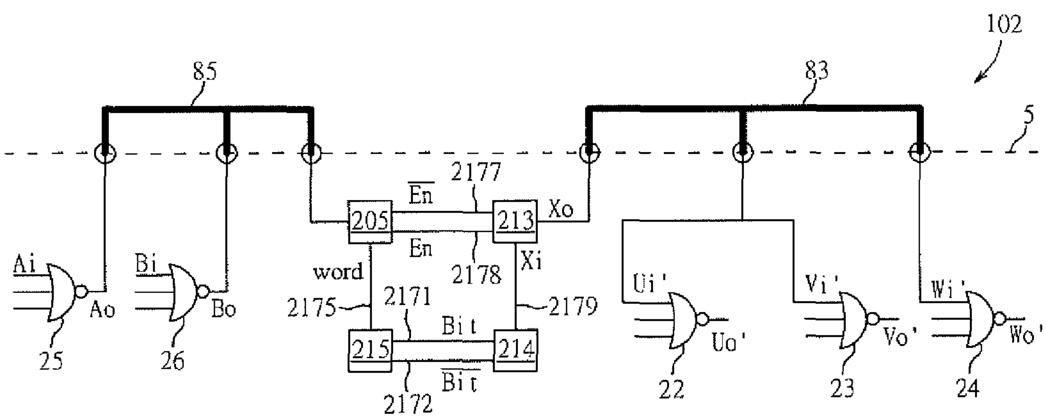

Alternatively, multiple address buses 85 connecting an address decoder 205 and the outputs of multiple internal circuits 25 and 26 can be formed over the passivation layer 5, as shown in FIG. 5U, to transmit an address data from one of the internal circuits 25 and 26 to the address decoder 205 during a "READ" operation, and the internal circuits 25 and 26 may be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The address decoder 205 is connected to multiple word lines coupled with multiple memory cells in a memory array. Referring to FIGS. 5F and 5U, one of the word lines 2175 is connected to the gates of the NMOS transistors 2120 and 2119 of the memory cell 115, transmitting a signal from the address decoder 205 to the memory cell to control whether the logic level of bit data saved in the trace connecting the drains of the PMOS transistor 2118 and NMOS transistor 2117 and the gates of the PMOS transistor 2116 and NMOS transistor 2115 and the logic level of bit (bar) data saved in the trace connecting the drains of the PMOS transistor 2116 and NMOS transistor 2115 and the gates of the PMOS transistor 2118 and NMOS transistor 2117 are transmitted to the bit line 2171 and the bit (bar) line 2172 through the channels of the NMOS transistors 2120 and 2119, respectively. The sense amplifier 214 receives the bit data and bit (bar) data and initially amplifies the bit (bar) data. The initially amplified the bit (bar) data output from the sense amplifier 214 may be transmitted to the gates of the PMOS transistor 2108 and NMOS transistor 2107 of the tri-state buffer 213 through the trace 2179 under the passivation layer 5. Two traces 2177 and 2178 connect the address decoder 205 and the tri-state buffer 213, transmitting an ENABLE signal and an ENABLE (bar) signal from the address decoder 205 to the tri-state buffer 213 to control whether the previously described further amplified bit signal is output from the tri-state buffer 213 to the data bus 83 over the passivation layer 5.

Other embodiments as described below can be alternatively attained. Same reference numbers in this patent application indicate same or similar elements.

Figure 5V:
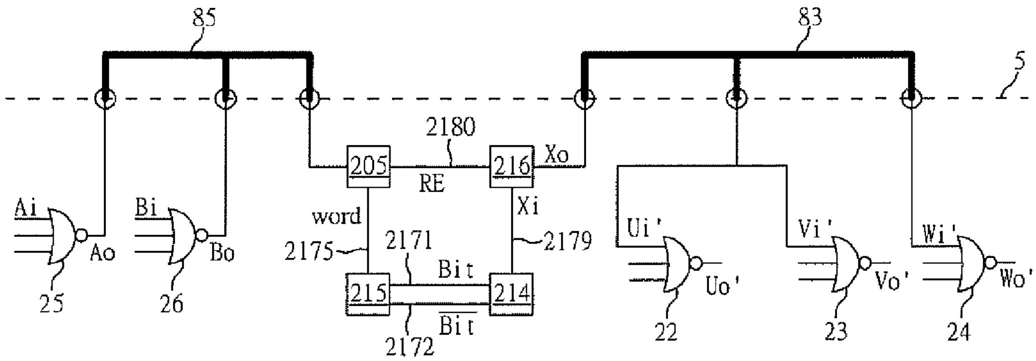

Referring to FIGS. 5B, 6B, 7B, 7C and 7D, the internal circuit 21 may be a pass gate 216 as shown in FIG. 5G. The pass gate 216 may include an NMOS transistor 2124 having a gate connected to an address decoder 205 through a trace 2180 under the passivation layer 5, as shown in FIG. 5V. In a "READ" operation, the address decoder 205 receives an address data through multiple address buses 85 over the passivation layer 5. The address decoder 205 output a READ ENABLE data to the gate of the NMOS transistor 2124 through the trace 2180 to control whether the NMOS transistor 2124 is turned on or off. When the NMOS transistor 2124 of the pass gate 216 is turned on, the initially amplified bit (bar) data output from the sense amplifier 214 can be transmitted to the data bus 83, 831 or 832 over the passivation layer 5 through the channel of the NMOS transistor 2124.

Figure 5W:
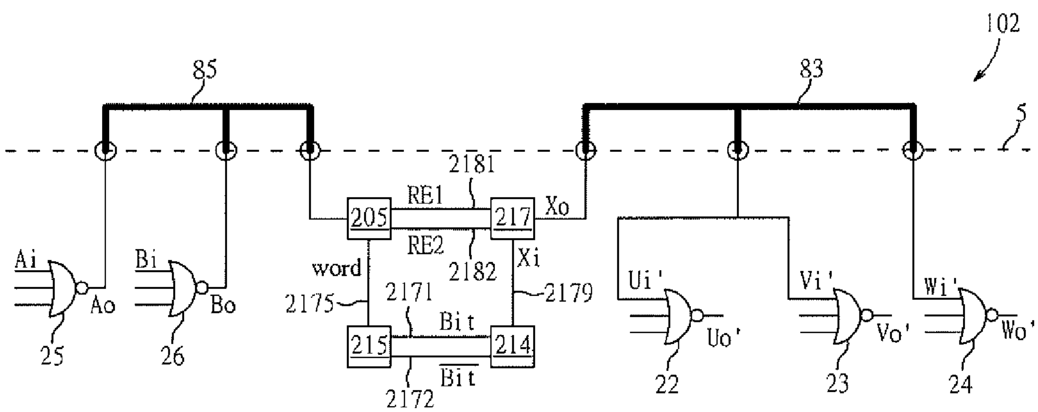

Referring to FIGS. 5B, 6B, 7B, 7C and 7D, the internal circuit 21 may be a latch circuit 217 as shown in FIG. 5H. The latch circuit 217 may temporally store the data output from the sense amplifier 214. The latch circuit 217 includes two PMOS transistors 2901 and 2902 and two NMOS transistors 2903 and 2904. A trace 2905 connects the gates of the PMOS transistor 2902 and NMOS transistor 2904 and the drains of the PMOS transistor 2901 and NMOS transistor 2903. A trace 2906 connects the gates of the PMOS transistor 2901 and NMOS transistor 2903 and the drains of the PMOS transistor 2902 and NMOS transistor 2904. The latch circuit 217 may further include two NMOS transistors 2129 and 2130 having the gates connected to an address decoder 205 through metal traces 2181 and 2182 under the passivation layer 5, as shown in FIG. 5W. In a "READ" operation, the address decoder 205 receives an address data through multiple address buses 85 over the passivation layer 5. The address decoder 205 output READ ENABLE data (RE1 and RE2) to the gates of the NMOS transistors 2129 and 2130 through the traces 2181 and 2182 to control whether the NMOS transistors 2129 and 2130 are turned on or off, respectively. When the NMOS transistor 2129 is turned on, the initially amplified bit (bar) data output from the sense amplifier 214 can be transmitted to the trace 2905 through the channel of the NMOS transistor 2129. The trace 2905 latches the bit (bar) data and the trace 2906 latches the bit data. When the NMOS transistor 2130 is turned on, the bit data output from the trace 2906 of the latch circuit 217 can be transmitted to the data bus 83, 831 or 832 through the channel of the NMOS transistor 2130.

Referring to FIG. 5H, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the sources of the PMOS transistors 2901 and 2902 of the latch circuit 217 through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the sources of the NMOS transistors 2903 and 2904 of the latch circuit 217 through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

However, the pass gate 216 in FIG. 5G or the latch circuit 217 in FIG. 5H does not provide large drive capability. To drive heavy load of the logic circuits 22, 23 and 24, or to transmit bit (bar) data output from the pass circuit 216 or bit data output from the latch circuit 217 to the logic circuits 22, 23 and 24 in a long distance, the internal circuit 21 may include the previously described internal driver 212 connected to the output node of the pass gate 216, as shown in FIG. 5I, or connected to the output node of the latch circuit 217, as shown in FIG. 5J, to amplify bit (bar) data output from the pass gate 216 or bit data output from the latch circuit 217. Referring to FIG. 5I, the amplified bit (bar) data output from the internal driver 212 may be transmitted to the internal circuits 22, 23 and 24 through the data bus 83, 831 or 832 over the passivation layer 5, as shown in FIGS. 5B, 6B, 7B, 7C and 7D. Referring to FIG. 5J, the amplified bit data output from the internal driver 212 may be transmitted to the internal circuits 22, 23 and 24 through the data bus 83, 831 or 832 over the passivation layer 5, as shown in FIGS. 5B, 6B, 7B, 7C and 7D.

Referring to FIG. 5I, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the sources of the PMOS transistors 2104' and 2104 of the internal driver 212 through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the sources of the NMOS transistors 2103' and 2103 of the driver circuit 212 through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Referring to FIG. 5J, the node P of the voltage regulator or converter circuit 41 can be connected to the sources of the PMOS transistors 2116 and 2118 of the memory cell 215, the sources of the PMOS transistors 2112 and 2114 of the sense amplifier 214, the sources of the PMOS transistors 2901 and 2902 of the latch circuit 217 and the sources of the PMOS transistors 2104' and 2104 of the internal driver 212 through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214, the sources of the NMOS transistors 2903 and 2904 of the latch circuit 217 and the sources of the NMOS transistors 2103' and 2103 of the internal driver 212 through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Alternatively, referring to FIG. 5K, the output node Wo of the internal circuit 24 is connected to the input nodes Xi, Ui and Vi of the internal circuits 21, 22 and 23 through the thick metal plane, bus, trace or line 83' over the passivation layer 5. The internal circuit 24, such as NOR gate, may send a signal or data from the output node Wo thereof to the input node Xi' of the internal circuit 21, such as a receiver 212' shown in FIG. 5L, a tri-state input buffer 213' shown in FIG. 5M or other internal circuits, through a fine-line metal structure 634' under the passivation layer 5, then through an opening 534' in the passivation layer 5, then through the thick metal plane, line or trace 83' over the passivation layer 5, then through another opening 531' in the passivation layer 5, and then through a fine-line metal structure 631' under the passivation layer 5. Besides, a signal or data output from the output node Wo of the internal circuit 24 may be also transmitted to the input node Ui of the internal circuit 22, such as NOR gate, through the fine-line metal structure 634' under the passivation layer 5, then through the opening 534' in the passivation layer 5, then through the thick metal plane, line or trace 83' over the passivation layer 5, then through another opening 532' in the passivation layer 5, then through the fine-line metal structures 632_a_' and 632_b_' under the passivation layer 5. Besides, a signal or data output from the output node Wo of the NOR gate 24 may be also transmitted to the input node Vi of the internal circuit 23, such as NAND gate, through the fine-line metal structure 634' under the passivation layer 5, then through the opening 534' in the passivation layer 5, then through the thick metal plane, line or trace 83' over the passivation layer 5, then through another opening 532' in the passivation layer 5, then through the fine-line metal structures 632_a_' and 632_c_' under the passivation layer 5.

The fine-line metal structures 634', 632' and 631' can be formed with stacked metal plugs, having a similar structure of the fine line metal structures 634, 632 and 631, respectively, as shown in 7B, 7C and 7D. The internal circuits 21, 22 and 23 may receive a signal output from the output node Wo of the internal circuit 24 at the input node Xi', Ui and Vi thereof, and may output a signal from the output node Xo', Uo and Vo thereof to other internal circuits through metal traces under the passivation layer 5.

The structure over the passivation layer 5 shown in FIGS. 7B-7D, providing the previously described thick metal trace, line or plane 83, can also be applied to forming the thick metal trace, line or plane 83' illustrated in FIG. 5K. All combinations for the polymer layers 99, 98 and 95 and the circuit metal layers 831 and 832 illustrated in FIGS. 7B-7D can be applied to the combinations for one or more polymer layers and one or more circuit metal layers over the passivation layer 5, illustrated in FIG. 5K.

In a case, the internal circuit 21 may be an internal receiver 212' as shown in FIG. 5L, or an internal input tri-state buffer 213' as shown in FIG. 5M. Referring to FIGS. 5K and 5L, the internal receiver 212' may receive a signal passing through the thick metal trace or bus 83 over the passivation layer 5 and then may output an amplified signal from the output node Xo' thereof to other internal circuits but not to an external circuit through a metal trace under the passivation layer 5. Referring to FIGS. 5K and 5M, the internal input tri-state buffer 213' may receive a signal passing through the thick metal trace or bus 83 over the passivation layer 5 and then may output an amplified signal from the output node Xo' thereof to other internal circuits but not to an external circuit through a metal trace under the passivation layer 5.

The internal receiver 212' in FIG. 5L has a similar circuit design to the internal driver 212 in FIG. 5D. In FIGS. 5D and 5L, same reference numbers indicate same elements with same characteristics. The internal input tri-state buffer 213' in FIG. 5M has a similar circuit design to the internal output tri-state buffer 213 in FIG. 5E. In FIGS. 5E and 5M, same reference numbers indicate same elements with same characteristics.

The output node Xo' of the internal receiver 212' or internal tri-state input buffer 213' is not connected to an external circuit but connected to an internal circuit under the passivation layer 5. The internal tri-state input buffer 213' provides amplifying capability and switch capability, and is particularly useful to amplify a data signal or an address signal having passed through the thick metal lines or traces 83' over the passivation layer 5 acting as data or address buses.

In FIG. 5K, a relatively large output current is required at the output node Xo' of the internal circuit 21 when a heavy load is demanded by an internal circuit connected to the output node Xo' of the internal circuit 21, or when the internal circuit 24 is far away from the internal circuit 21 in a distance of larger than 1 mm or of larger than 3 mm. To provide a relatively large output current, the internal circuit 21 can be designed as an internal receiver 212' shown in FIG. 5L or an internal tri-state input buffer 213' shown in FIG. 5M.

Referring to FIG. 5K, a signal output from the internal circuit 24 can be transmitted to an n-channel MOS transistor of the internal circuit 21, and the n-channel MOS transistor may have a ratio of a physical channel width thereof to a physical channel length thereof ranging from, e.g., about 0.1 to 20, ranging from, e.g., about 0.1 to 10, or preferably ranging from, e.g., about 0.2 to 2. Alternatively, a signal output from the internal circuit 24 can be transmitted to a p-channel MOS transistor of the internal circuit 21, and the p-channel MOS transistor 2102 may have a ratio of a physical channel width thereof to a physical channel length thereof ranging from, e.g., about 0.2 to 40, ranging from, e.g., about 0.2 to 20, or preferably ranging from, e.g., about 0.4 to 4. In this application, the current level output from the internal circuit 24 and transmitted through the thick metal trace 83' over the passivation layer 5 is, for example, in a range of between 50 μA and 2 mA, and preferably of between 100 μA and 1 mA.

In FIGS. 5L and 5M, the n-channel MOS transistors 2103, 2107 and 2107' may have a ratio of a physical channel width thereof to a physical channel length thereof ranging from, e.g., about 1.5 to 30, and preferably ranging from, e.g., about 2.5 to 10. The p-channel MOS transistors 2104, 2108 and 2108' may have a ratio of a physical channel width thereof to a physical channel length thereof ranging from, e.g., about 3 to 60, and preferably ranging from, e.g., about 5 to 20. In FIG. 5L, the n-channel MOS transistor 2103' may have a ratio of a physical channel width thereof to a physical channel length thereof ranging from, e.g., about 0.1 to 20, ranging from, e.g., about 0.1 to 10, or preferably ranging from, e.g., about 0.2 to 2, and the p-channel MOS transistor 2104' may have a ratio of a physical channel width thereof to a physical channel length thereof ranging from, e.g., about 0.2 to 40, ranging from, e.g., about 0.2 to 20, or preferably ranging from, e.g., about 0.4 to 4. Referring to FIGS. 5K, 5L and 5M, the internal receiver 212 or internal tri-state input buffer 213 may receive a signal output from the output node Wo of the internal circuit 24 and transmitted through the thick metal trace or bus 83' over the passivation layer 5 but not to an external circuit. A current passing through the thick metal trace or line 83' over the passivation layer 5 and inputting the node Xi' of the internal circuit 21, provided by the internal driver 212 or internal tri-state buffer 213, may be between 500 μA and 10 mA, and preferably between 700 μA and 2 mA.

The concept shown in FIG. 5K can be applied to a memory chip, as illustrated in FIGS. 5N-5R. The memory chip includes memory cells 215 and sense amplifiers 214 that can be referred to those illustrated in FIG. 5F. In FIGS. 5F and 5N-5R, same reference numbers indicate same elements.

Referring to FIG. 5N, the previously described tri-state input buffer 213' is employed to be the internal circuit 21 shown in FIG. 5K and has an output node Xo' connected to the bit (bar) line 2172 and an input node Xi' connected to the internal circuits 22, 23 and 24, such as logic gates, through the above mentioned thick metal plane, bus or trace 83' over the passivation layer 5, and the internal circuit 24 may alternatively be NOR gate, NAND gate, AND gate, OR gate, operational amplifier, adder, multiplexer, diplexer, multiplier, A/D converter, D/A converter, CMOS transistor, bipolar CMOS transistor or bipolar circuit.

In this case, the memory cell 215 is a static random access memory (SRAM) cell. Alternatively, the memory cell 215 may be a dynamic random access memory (DRAM) cell, an erasable programmable read only memory (EPROM) cell, an electronic erasable programmable read only memory (EEPROM) cell, a flash memory cell, a read only memory (ROM) cell, or a magnetic random access memory (MRAM) cell, which is connected to the output node Wo of the logic gate 24 through a thick metal traces 83' over the passivation layer 5. A tri-state input buffer 213', pass gate 216', latch memory 217' or internal receiver 212', as shown in FIGS. 5N-5R, may be optionally set on the path between any kind of the exampled memory cell 215 and the thick metal traces 83' over the passivation layer 5.

Referring to FIG. 5N, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the source of the PMOS transistor 2108 of the tri-state input buffer 213' through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the source of the NMOS transistor 2107 of the tri-state input buffer 213' through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Referring to FIG. 5N, when the memory cell 215 is in a "WRITE" operation, a bit signal can be transmitted to the input node Xi' of the tri-state input buffer 213', that is, the gates of the PMOS transistors 2108 and the NMOS transistor 2107, through the thick metal line, trace or plane 83' over the passivation layer 5, from the output node Wo of the internal circuit 24. An amplified bit (bar) signal having a desirable waveform or voltage level can be output from the output node Xo' of the tri-state input buffer 213', that is, the source of the PMOS transistor 2108' or the source of the NMOS transistor 2107', to the bit (bar) line 2172. With the NMOS transistors 2122 and 2119 being turned on, the bit (bar) signal on the bit (bar) line can be saved on the trace connecting the gates of the PMOS transistor 2118 and NMOS transistor 2117 and the sources of the PMOS transistor 2116 and NMOS transistor 2115, and the bit signal can be saved on the trace connecting the gates of the PMOS transistor 2116 and NMOS transistor 2115 and the sources of the PMOS transistor 2118 and NMOS transistor 2117.

In this case, the thick metal buses or traces 83' may be called as bit buses to transmit to-be-written bit data or bit (bar) data with 4 bits width, 8 bits width, 16 bits width, 32 bits width, 64 bits width, 128 bits width, 256 bits width, 512 bits width, 1024 bits width, 2048 bits width or 4096 bits width, output from the tri-state buffers 213. Accordingly, 4, 8, 16, 32, 64, 128, 256, 512, 1024, 2048 or 4098 bit buses arranged in parallel and over the passivation layer 5, may connect the input nodes Xi' of multiple internal circuits 21, the tri-state input buffers 213' in this case, to multiple output nodes of multiple internal circuits 24, such as NOR gates, NAND gates, AND gates, OR gates, operational amplifiers, adders, multiplexers, diplexers, multipliers, A/D converters, D/A converters, CMOS transistors, bipolar CMOS transistors or bipolar circuits.

Figure 5X:
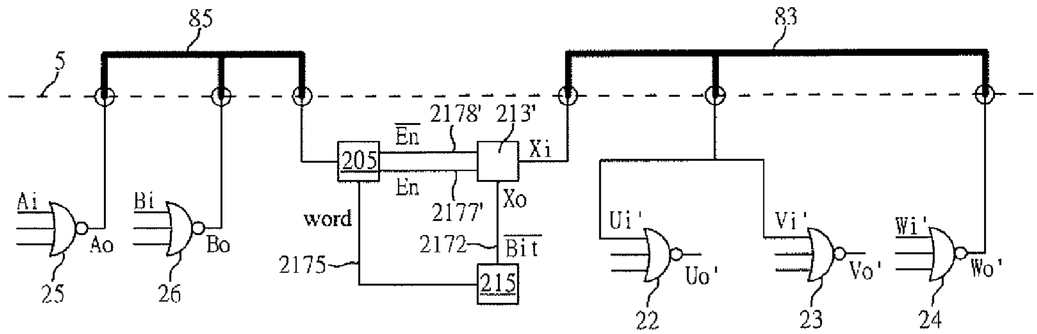

Alternatively, multiple address buses 85 connecting an address decoder 205 and the outputs of multiple internal circuits 25 and 26 can be formed over the passivation layer 5, as shown in FIG. 5X, to transmit an address data from one of the internal circuits 25 and 26 to the address decoder 205 during a "WRITE" operation, and the internal circuits 25 and 26 may be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The address decoder 205 is connected to multiple word lines coupled with multiple memory cells in a memory array. Referring to FIGS. 5N and 5X, one of the word lines 2175 is connected to the gates of the NMOS transistors 2120 and 2119 of the memory cell 115, transmitting a signal from the address decoder 205 to the memory cell to control whether the logic level of bit data on the bit line 2171 is saved in the trace connecting the drains of the PMOS transistor 2118 and NMOS transistor 2117 and the gates of the PMOS transistor 2116 and NMOS transistor 2115 through the channel of the NMOS transistor 2120 and whether the logic level of bit (bar) data on the bit (bar) line 2172 is saved in the trace connecting the drains of the PMOS transistor 2116 and NMOS transistor 2115 and the gates of the PMOS transistor 2118 and NMOS transistor 2117 are transmitted to the bit line 2171 and the bit (bar) line 2172 through the channel of the NMOS transistor 2119. Two traces 2177' and 2178' connect the address decoder 205 and the tri-state input buffer 213', transmitting an ENABLE signal and an ENABLE (bar) signal from the address decoder 205 to the tri-state input buffer 213' to control whether the amplified bit (bar) signal is output from the tri-state input buffer 213' to the bit (bar) line 2172.

Other embodiments as described below can be alternatively attained. Same reference numbers in this patent application indicate same or similar elements.

Figure 5Y:
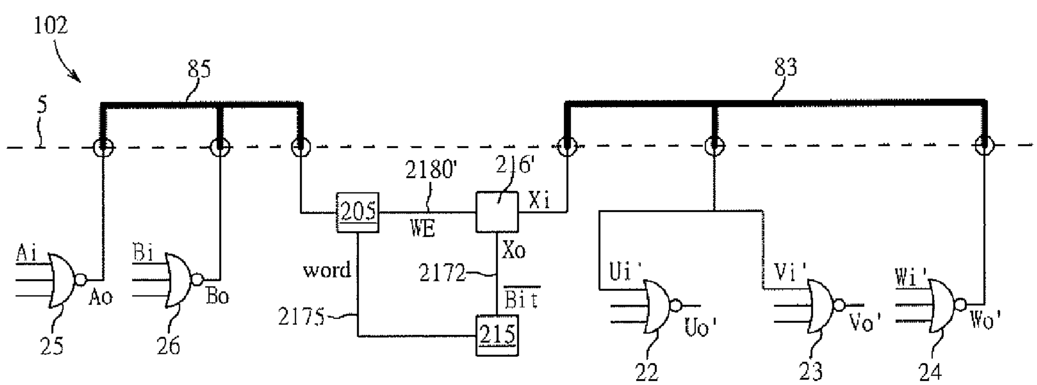

Referring to FIG. 5K, the internal circuit 21 may be a pass gate 216' as shown in FIG. 5O. The pass gate 216' may include an NMOS transistor 2124' having a gate connected to an address decoder 205 through a trace 2180' under the passivation layer 5, as shown in FIG. 5Y. In a "WRITE" operation, the address decoder 205 receives an address data through multiple address buses 85 over the passivation layer 5. The address decoder 205 output a WRITE ENABLE data to the gate of the NMOS transistor 2124' through the trace 2180' to control whether the NMOS transistor 2124' is turned on or off. When the NMOS transistor 2124' of the pass gate 216' is turned on, the bit data transmitted through the thick metal line, trace or plane 83' can be output from the pass gate 216' to the bit line 2171 through the channel of the NMOS transistor 2124'.

Figure 5Z:
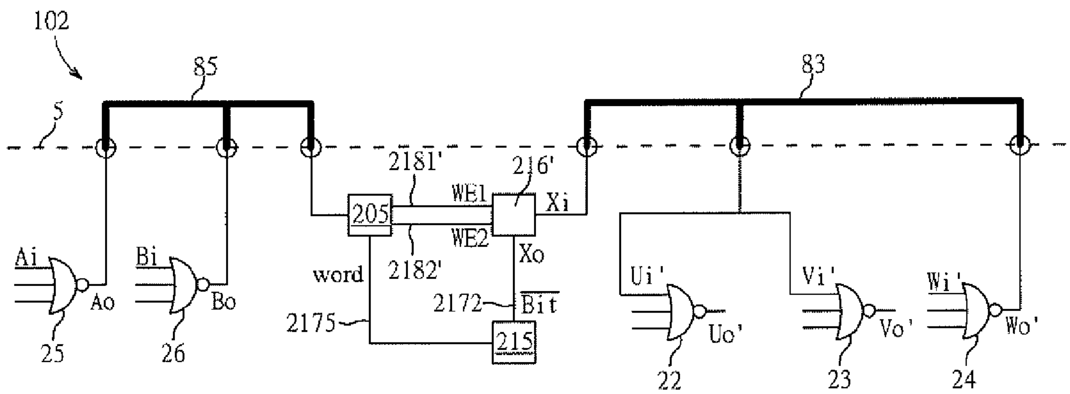

Referring to FIG. 5K, the internal circuit 21 may be a latch circuit 217' as shown in FIG. 5P. The latch circuit 217' may temporally store the data transmitted through the thick metal line, trace or plane 83'. The latch circuit 217' includes two PMOS transistors 2901' and 2902' and two NMOS transistors 2903' and 2904'. A trace 2905' connects the gates of the PMOS transistor 2902' and NMOS transistor 2904' and the drains of the PMOS transistor 2901' and NMOS transistor 2903'. A trace 2906' connects the gates of the PMOS transistor 2901' and NMOS transistor 2903' and the drains of the PMOS transistor 2902' and NMOS transistor 2904'. The latch circuit 217' may further include two NMOS transistors 2129' and 2130' having the gates connected to an address decoder 205 through metal traces 2181' and 2182' under the passivation layer 5, as shown in FIG. 5Z. In a "WRITE" operation, the address decoder 205 receives an address data output from the output nodes Ao or Bo of the internal circuit 25 or 26 through multiple address buses 85 over the passivation layer 5. The address decoder 205 output WRITE ENABLE data (WE1 and WE2) to the gates of the NMOS transistors 2129' and 2130' through the traces 2181' and 2182' to control whether the NMOS transistors 2129' and 2130' are turned on or off, respectively. When the NMOS transistor 2130' is turned on, the bit (bar) data output from the internal circuit 24 through the thick metal line, trace or plane 83', data bus, over the passivation layer 5 can be latched in the trace 2906' through the channel of NMOS transistor 2130', and the bit data is latched in the trace 2905'. When the NMOS transistor 2129' is turned on, the bit data latched in the trace 2905' can be output to the bit line 2171 through the channel of the NMOS transistor 2129'.

Referring to FIG. 5P, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the sources of the PMOS transistors 2901' and 2902' of the latch circuit 217 through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the sources of the NMOS transistors 2903' and 2904' of the latch circuit 217 through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

However, the pass gate 216' in FIG. 5O or the latch circuit 217' in FIG. 5P may not provide the enough sensitivity to detect a weak voltage variation at the input node of the pass gate 216' or the latch circuit 217' in a "WRITE" operation. To amplify the voltage level of a signal transmitted through the thick metal line, trace or plane 83' in a long distance and output from the logic circuit 24, the internal circuit 21 may include the previously described internal receiver 212' connected to the input node of the pass gate 216', as shown in FIG. 5Q, or connected to the input node of the latch circuit 217', as shown in FIG. 5R, to amplify bit data inputting to the pass gate 216' or to the latch circuit 217'. Referring to FIGS. 5Q and 5R, the input node of the internal receiver 212' is connected to the output node Wo of the internal circuit 24 through the thick metal line, trace or plane 83' as shown in FIG. 5K.

Referring to FIG. 5Q, the node P of the voltage regulator or converter circuit 41 can be connected to the sources of the PMOS transistors 2116 and 2118 of the memory cell 215, the sources of the PMOS transistors 2112 and 2114 of the sense amplifier 214 and the sources of the PMOS transistors 2104' and 2104 of the internal receiver 212' through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214 and the sources of the NMOS transistors 2103' and 2103 of the receiver circuit 212' through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Referring to FIG. 5R, the node P of the voltage regulator or converter circuit 41 can be connected to the sources of the PMOS transistors 2116 and 2118 of the memory cell 215, the sources of the PMOS transistors 2112 and 2114 of the sense amplifier 214, the sources of the PMOS transistors 2901' and 2902' of the latch circuit 217' and the sources of the PMOS transistors 2104' and 2104 of the internal receiver 212' through the previously described power plane, bus or trace 81, 811 or 812, as shown in FIGS. 1B, 1C, 2B, 2C, 3B, 3C and 3D, over the passivation layer 5. The previously described power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described power plane, bus or trace 81. The node Rs of the voltage regulator or converter circuit 41 can be connected to the sources of the NMOS transistors 2115 and 2117 of the memory cell 215, the sources of the NMOS transistors 2111 and 2113 of the sense amplifier 214, the sources of the NMOS transistors 2903' and 2904' of the latch circuit 217' and the sources of the NMOS transistors 2103' and 2103 of the internal receiver 212' through the previously described ground plane, bus or trace 82 or 821, as shown in FIGS. 1C, 2C and 3C, over the passivation layer 5. The previously described ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the previously described ground plane, bus or trace 82.

Referring to FIG. 5S, another important application of the thick metal line, trace or plane 83 over the passivation layer 5 may be used to transport a precise analog signal. The thick metal line, trace or plane 83 has low resistance and capacitance per unit length characteristics and accordingly offers a low signal distortion of analog signals. FIG. 5S shows a circuit design with an over-passivation metal bus, trace or line 83 connecting multiple analog circuits 21, 22, 23 and 24. The design is similar to FIG. 5B except that the internal circuits 21, 22, 23 and 24 are analog circuits, or mixed-mode circuits including an analog circuit and a digital circuit. The thick metal bus, trace or line 83 over the passivation layer 5 connects the analog circuits 21, 22, 23 and 24. An analog signal output from the output node Yo of the analog circuit 21 can be transmitted to the input node Ui' of the internal circuit 22 through the fine-line metal structure 631 under the passivation layer 5, then through the thick metal bus, trace or plane 83 over the passivation layer 5, and then through the fine-line metal structures **632*a* and 632*b* under the passivation layer 5. An analog signal output from the output node Yo of the analog circuit 21 can be transmitted to the input node Vi' of the internal circuit 23 through the fine-line metal structure 631 under the passivation layer 5, then through the thick metal bus, trace or plane 83 over the passivation layer 5, and then through the fine-line metal structures 632***a* and 632*c* under the passivation layer 5. An analog signal output from the output node Yo of the analog circuit 21 can be transmitted to the input node Wi' of the internal circuit 24 through the fine-line metal structure 631 under the passivation layer 5, then through the thick metal bus, trace or plane 83 over the passivation layer 5, and then through the fine-line metal structure 634 under the passivation layer 5.

The analog circuits 21, 22, 23 and 24 can be an operational amplifier, amplifier, pre-amplifier, a power amplifier, an analog to digital (A/D) converter, a digital to analog (D/A) converter, a pulse reshaping circuit, a switched capacitor filter, a RC filter, or other kind of analog circuits. FIG. 5T shows a case where the internal circuit 21 in FIG. 5S is an operational amplifier 218 with an output node Yo connected to the metal interconnection lines or traces 83 over the passivation layer 5. The operational amplifier 218 is designed based on a CMOS technology, referring to "CMOS Digital Circuit Technology" by M. Shoji, published by Prentice-Hall, Inc, New Jersey in 1987. Differential analog signals can be input into two input nodes Yi+ and Yi− of a differential circuit 219 provided in the operational amplifier 218 and with two n-MOS transistors 2125 and 2127 and two p-MOS transistors 2126 and 2128, and the input nodes Yi+ and Yi− are connected to the gates of the p-MOS transistors 2128 and 2126, respectively. The sources of the p-MOS transistors 2126 and 2128 are connected to a drain of a p-MOS transistor 2132 that is controlled by a voltage at the node 2138 determined by resistance of a resistor 2134. The output of the differential circuit 219 at the drains of the n-channel MOS transistor 2127 and the p-channel MOS transistor 2128 is connected to a gate of an n-channel MOS transistor 2135 and to a top electrode 21331 of the capacitor 2133. An output node Yo is at a bottom electrode 21332 of the capacitor 2133, at the drain of the n-channel MOS transistor 2135, and at a drain of the p-channel MOS transistor 2136. The p-MOS transistor 2136 is controlled by a voltage at the node 2138 determined by resistance of a resistor 2134. Accordingly, the voltage at the output node Yo is controlled by what degree the n-MOS transistor 2135 is turned on and by the output of the differential circuit 219. The capacitor 2133 are often used for an analog circuit, and are usually formed by a suitable process or processes, e.g., by a MOS capacitor (using the poly gate and the silicon substrate as two electrodes of the capacitor 2133), or a poly-to-poly capacitor (using a first poly silicon and a second poly silicon as two electrodes of the capacitor 2133). The capacitor 2133 may have a function to reduce a noise input from the input nodes Yi+ and Yi−. The resistor 2134 is also often used for an analog circuit, and is usually provided by an impurity-doped diffusion area with doping density of $10^{15}$-$10^{17}/cm^3$, such as n well or p well, or of $10^{19}$-$10^{21}/cm^3$, such as $N^+$ diffusion or $P^+$ diffusion, in the silicon substrate, and/or an impurity-doped poly silicon. The circuit shown in FIG. 5T can output a voltage Yo proportionally amplifying the differential value of the input voltages Yi+ and Yi−.

The thick metal bus, trace or plane 83 and 83' illustrated in FIGS. 5B-5Z can be realized by forming the circuit metal layers 831 and/or 832 and the polymer layers 95, 98 and/or 99 shown in FIGS. 7B-7D, or by forming the circuit metal layers 801 and/or 802 and the polymer layers 95, 97, 98 and/or 99 shown in FIGS. 15A-21K.

In FIGS. 5B, 5K, 5S, 7B, 7C and 7D, the thick metal trace, bus or plane 83 over the passivation layer 5 can be used to transport signals input to or output from the internal circuits 21, 22, 23 or 24. In FIGS. 5K, 5S, 5U and 5V-5Z, a dotted line 5 indicates the passivation layer, coarse traces indicate traces of the over-passivation scheme 102 formed over the passivation layer 5, and fine traces indicate traces formed under the passivation layer 5.

THIRD EMBODIMENT

Complete Architecture

Schemes or technology for forming coarse metal conductors, according to the present disclosure, can provide other advantages for IC chip. For example, the metal trace, bus or plane 83 or 83' over the passivation layer 5 may include gold, copper, silver, palladium, rhodium, platinum, ruthenium, nickel, aluminum or solder; various kinds of contacting structures, such as solder bumps, solder pads, solder balls, gold bumps, gold pads, Pd pads, aluminum pads or wire bonding pads, can be formed on the metal trace, bus or plane 83 to connect the IC chip to an external circuit easily. An IC chip may be connected to and communicated with an external circuit. When a signal is transmitted to external circuits or components, some off-chip circuitry is required to (1) drive the large current load of external circuits, parasitics or components, (2) detect noisy signals from the external circuits or components, and (3) prevent the internal circuits from being damaged by the surge electrical stimulus from external circuits or components.

FIGS. 8B, 9B and 10B depict a schematic architecture according to a third exemplary embodiment of the present disclosure. FIG. 8B shows a circuit diagram according to the third exemplary embodiment of the present disclosure. FIG. 9B shows a top view realizing the circuit diagram of FIG. 8B. FIG. 10B shows a cross-sectional view realizing the circuit diagram of FIG. 8B.

Referring to FIGS. 8B, 9B and 10B, an off-chip buffer 42 is connected to the output node Xo of the internal circuit 21 and to the input nodes Ui, Vi and Wi of the internal circuits 22, 23 and 24 through the metal trace, bus or plane 83. A metal bump 89 for being connected to an external circuit, such as printed circuit board, ball-grid-array (BGA) substrate, flexible substrate, semiconductor chip, metal substrate, glass substrate or ceramic substrate, may be formed on a contact point 8310 of the redistributed metal trace 83*r*. The contact point 8310 can be connected to the original pad 6390 exposed by an opening 539 in the passivation layer 5 through the redistributed metal trace 83*r*, and the position of the contact point 8310 from a top perspective view is different from that of the original pad 6390. The original pad 6390 is connected to the off-chip buffer 42 and to the off-chip ESD circuit 43. A signal may be transmitted from the internal circuit 21 to an external circuit through the thick metal bus, trace or plane 83, then through the off-chip buffer 42, and then through the thick metal bus, trace or plane 83*r*; a signal may be transmitted from an external circuit to the internal circuits 22, 23 and/or 24 through the thick metal traces, buses or plane 83*r*, through the off-chip buffer 42 and then through the thick metal bus, trace or plane 83; a signal may be transmitted from the internal circuit 21 to the internal circuits 22, 23 and/or 24 through the thick metal bus, trace or plane 83. The total length of the metal trace 83 over the passivation layer 5, connecting the off-chip buffer 42 to the internal circuit 24, can be between 250 micrometers and 2.5 millimeters, preferably between 500 and 1 millimeter, and preferably between 1000 and 8000 micrometers.

The shape of the openings 531, 532, 534 and 539' from a top perspective view may be round, square, rectangular or polygon. If the openings 531, 532, 534 and 539' are round, the openings 531, 532 and 534 may have a diameter of between 0.1 and 200 microns, between 1 and 100 microns, or, preferably, between 0.1 and 30 microns. If the openings 531, 532 and 534 are square, the openings 531, 532 and 534 may have a width of between 0.1 and 200 microns, between 1 and 100 microns, or, preferably, between 0.1 and 30 microns. If the openings 531, 532 and 534 are rectangular, the openings 531, 532 and 534 may have a width of between 0.1 and 200 microns, between 1 and 100 microns, or, preferably, between 0.1 and 30 microns, and a length of between 1 micron and 1 centimeter. If the openings 531, 532 and 534 are polygon having more than five sides, the openings 531, 532 and 534 have a largest diagonal length of between 0.1 and 200 microns, between 1 and 100 microns, or, preferably, between 0.1 and 30 microns. Alternatively, the openings 531, 532 and 534 have a largest transverse dimension of between 0.1 and 200 microns, between 1 and 100 microns, or, preferably, between 0.1 and 30 microns. In a case, the openings 531, 532 and 534 have a width of between 0.1 and 30 microns, with the lower portion of the openings 9531, 9532 and 9514 in the polymer layer 95 having a width of between 20 and 100 microns.

Alternatively, referring to FIG. 8C, the element 42 may be an off-chip receiver. The off-chip receiver 42 is connected to the input nodes of the internal circuits 21, 22, 23 and 24 through the thick metal bus, trace or plane 83.

Alternatively, referring to FIG. 8G, the element 42 may be an off-chip driver. The off-chip driver 42 is connected only to the output nodes of the internal circuits 21, 22, 23 and 24 through the thick metal bus, trace or plane 83.

FIGS. 8B and 8C show a simplified circuit diagram where a thick metal trace 83 over a passivation layer 5 connects an off-chip buffer 42, such as external driver or external receiver, and internal circuits 21, 22, 23 and 24. FIG. 9B shows a top view of a semiconductor chip realizing the circuitry shown in FIGS. 8B and 8C, and coarse traces 83 and 83*r* shown in FIG. 9B mean the traces formed over the passivation layer 5, and fine traces 69, 632*a*, 632*b* and 632*c* shown in FIG. 9B mean the traces formed under the passivation layer 5. FIG. 10B shows a cross-sectional view of a semiconductor chip realizing the circuitry shown in FIGS. 8B and 8C. FIG. 9B shows a top view of the semiconductor chip shown in FIG. 10B. FIGS. 8B, 9B, 10B, 10C, 10D and 10E show the circuitry architecture of the disclosure using the two hierarchies of the fine-line IC metal structures 639, 639', 631, 632, 634 and 69 under the passivation layer 5 and the coarse metal traces 83, 831, 832 and 83*r* over the passivation layer 5, with the consideration of whole chip design of the internal and external circuit connection.

Referring to FIGS. 8B, 9B and 10B, the internal circuit 21 may output a signal to other internal circuits 22, 23 and 24 through the thick metal bus, trace or plane 83 over the passivation layer 5, as described in FIGS. 5B-5J and 5S-5T, and, besides, the internal circuit 21 may output a signal to an external circuit through, in sequence, the fine-line metal trace 631 under the passivation layer 5, the thick metal trace 83 over the passivation layer 5, the fine-line metal trace 639' under the passivation layer 5, the off-chip buffer 42, such as external driver, the fine-line metal trace 69 under the passivation layer 5, the redistributed trace 83*r* over the passivation layer 5 and the metal bump 89 on the redistributed trace 83*r*.

Referring to FIGS. 8C, 9B and 10B, a signal output from the internal circuit 24 may be transmitted to the internal circuit 21 through the thick metal bus, trace or plane 83' over the passivation layer 5, as described in FIGS. 5K-5R, and, besides, a signal output from an external circuit may be transmitted to the internal circuit 21 through the metal bump 89, the redistributed trace 83*r*, the fine-line metal trace 69 under the passivation layer 5, the off-chip buffer 42, such as external receiver, the fine-line metal trace 639' under the passivation layer 5, the thick metal bus, trace or plane 83' over the passivation layer 5 and the fine-line metal trace 631' under the passivation layer 5. A signal output from the internal circuit 24 may be transmitted to the internal circuit 22 through the thick metal bus, trace or plane 83' over the passivation layer 5, as described in FIGS. 5K-5R, and, besides, a signal output from an external circuit may be transmitted to the internal circuit 22 through the metal bump 89, the redistributed trace 83*r*, the fine-line metal trace 69 under the passivation layer 5, the off-chip buffer 42, such as external receiver, the fine-line metal trace 639' under the passivation layer 5, the thick metal bus, trace or plane 83' over the passivation layer 5, the fine-line metal trace 632*a*' and 632*b*'under the passivation layer 5. A signal output from the internal circuit 24 may be transmitted to the internal circuit 23 through the thick metal bus, trace or plane 83' over the passivation layer 5, as described in FIGS. 5K-5R, and, besides, a signal output from an external circuit may be transmitted to the internal circuit 23 through the metal bump 89, the redistributed trace 83*r*, the fine-line metal trace 69 under the passivation layer 5, the off-chip buffer 42, such as external receiver, the fine-line metal trace 639' under the passivation layer 5, the thick metal bus, trace or plane 83' over the passivation layer 5, the fine-line metal trace 632*a*' and 632*c*'under the passivation layer 5.

In this embodiment, referring to FIGS. 8B and 8C, a signal transmitted through the thick metal bus, trace or plane 83 or 83' over the passivation layer 5 in the internal scheme 200 can be transmitted to or from the external circuit (not shown) through an off-chip circuit 40 including an off-chip buffer 42, such as external driver or receiver, and an off-chip ESD (electro static discharge) circuit 43. The off-chip ESD circuit 43 is connected in parallel with the off-chip buffer 42 through the trace 69 under the passivation layer 5. The redistributed metal trace 83*r* can be used for redistribution of the IC fine-line metal (I/O) pads 6390 in FIG. 10B, relocated to a different location, for example an over-passivation metal pads 8310 in FIG. 10B, resulting in readily being connected to an external circuit, such as another semiconductor chip, ball-grid-array (BGA) substrate or ceramic substrate through the metal bump 89 or through a wirebonded wire bonded onto the pad 8310, to a flexible substrate through the metal bump 89 preferably including a gold layer having a thickness between 7 and 25 micrometers using a gold-to-gold bonding technology or using a gold-to-tin bonding technology, or to a glass substrate through the metal bump 89 preferably including a gold layer having a thickness between 7 and 25 micrometers via an anisotropic conductive film (ACF) or anisotropic conductive paste ACP. The redistributed metal line, trace or plane 83*r* can be formed during forming the over-passivation interconnection scheme 83.

Referring to FIG. 11F, the off-chip circuitry 40, in FIGS. 8B and 8C, for being connected to the external circuitry may include an off-chip ESD circuit 43, composed of two diodes 4331 and 4332, and an off-chip buffer 42.

In a first aspect, the off-chip buffer 42 may be an off-chip driver 421, as shown in FIG. 11A, in application to the circuit architecture shown in FIG. 8B, having an input node F connected to the internal circuits 20 through the thick and wide circuit trace 83, and an output node E connected, in parallel with the off-chip ESD circuit 43, to the metal bump 89. FIG. 11A shows an example of a two-stage cascade off-chip driver 421, CMOS cascade driver. The cascade driver may include several stages of inverters. The off-chip driver 421 may include two inverters 421' and 421'', and the inverter 421' is composed of an NMOS device 4201 and a PMOS device 4202, and the inverter 421" is composed of an NMOS device 4203 and a PMOS device 4204. The gates of the PMOS device 4202 and the NMOS device 4201 serve as the input node F, and the drains of the PMOS device 4204 and the NMOS device 4203 serve as the output node E. The drains of the PMOS device 4202 and the NMOS device 4201 are connected to the gates of the PMOS device 4204 and the NMOS device 4203.

Referring to FIG. 11A, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the sources of the PMOS devices 4202 and 4204. The previously described power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the sources of the NMOS devices 4201 and 4203. The previously described ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the previously described ground plane, bus or trace 82.

The first stage 421' of the off-chip driver in FIG. 11A is an inverter with the NMOS device 4201 having a ratio of a physical channel width thereof to a physical channel length thereof larger than those of all NMOS devices in the internal circuits 20 connected to the input node F of the off-chip driver 421, and with the PMOS device 4202 having a ratio of a physical channel width thereof to a physical channel length thereof larger than those of all PMOS devices in the internal circuits 20 connected to the input node F of the off-chip driver 421. The NMOS transistor 4203 may have a ratio of a physical channel width thereof to a physical channel length thereof ranging from, e.g., about 20 to 20,000, and preferably ranging from, e.g., about 30 to 300. The PMOS transistor 4204 may have a ratio of a physical channel width thereof to a physical channel length thereof ranging from, e.g., about 40 to 40,000, and preferably ranging from, e.g., about 60 to 600. The output current of an off-chip driver 421 is proportional to the number of stages and the size (W/L, MOS transistor's channel width to length ratio, more precisely, the MOS effective channel width to effective channel length ratio) of transistors used in each stage of the off-chip driver. The off-chip driver 421 may output a driving current of between 5 mA and 5 A and, preferably, between 10 mA and 100 mA.

Provided that the off-chip driver 421 shown in FIG. 11A is applied to the circuit architecture shown in FIG. 8B for a power management chip, the NMOS transistor 4203 of the off-chip driver 421 may have a ratio of a physical channel width thereof to a physical channel length thereof ranging from, e.g., about 2,000 to 200,000, and preferably ranging from, e.g., about 2,000 to 20,000. The PMOS transistor 4204 may have a ratio of a physical channel width thereof to a physical channel length thereof ranging from, e.g., about 4,000 to 400,000, and preferably ranging from, e.g., about 4,000 to 40,000. The off-chip driver 421 may output a driving current of between 500 mA and 50 A and, preferably, between 500 mA and 5 A.

In a second aspect, the off-chip buffer 42 may be an off-chip receiver 422, as shown in FIG. 11B, in application to the circuit architecture shown in FIG. 8C, having an output node F connected to the internal circuits 21, 22 and 23 through the thick and wide circuit trace 83, and an input node E connected, in parallel with the off-chip ESD circuit 43, to the metal bump 89. FIG. 11B shows an example of a two-stage cascade off-chip receiver 422, CMOS cascade receiver. The off-chip receiver 422 may receive a signal from an external circuitry through the metal bump 89 and output an amplified signal to the internal circuits 21, 22 and 23 through the thick and wide trace or bus 83'. The first stage 422', close to the external circuitry, of the off-chip receiver 422 is an inverter having an NMOS device 4205 and a PMOS device 4206 with a size designed to detect a noisy external signal. The first stage receives a noisy signal at point E from the external circuits or components, such as signal from another chip. The second stage 422" of the off-chip receiver 422 is also an inverter except that it is formed by a suitable process or processes, e.g., by a larger size of NMOS device 4207 and PMOS device 4208. The second stage of the inverter is used to restore the integrity of the noisy external signal for the internal circuit. The gates of the PMOS device 4205 and the NMOS device 4206 serve as the input node E, and the drains of the PMOS device 4208 and the NMOS device 4207 serve as the output node F. The drains of the PMOS device 4206 and the NMOS device 4205 are connected to the gates of the PMOS device 4208 and the NMOS device 4207.

Referring to FIG. 11B, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the sources of the PMOS devices 4206 and 4208. The previously described power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the sources of the NMOS devices 4205 and 4207. The previously described ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the previously described ground plane, bus or trace 82.

The first stage 422' of the off-chip receiver in FIG. 11B is an inverter with the NMOS device 4205 having a ratio of a physical channel width thereof to a physical channel length thereof larger than those of all NMOS devices in the internal circuits 20 connected to the output node F of the off-chip receiver 422, and with the PMOS device 4206 having a ratio of a physical channel width thereof to a physical channel length thereof larger than those of all PMOS devices in the internal circuits 20 connected to the output node F of the off-chip receiver 422. The NMOS transistor 4207 may have a ratio of a physical channel width thereof to a physical channel length thereof ranging from, e.g., about 10 to 20,000, and preferably ranging from, e.g., about 10 to 300. The PMOS transistor 4208 may have a ratio of a physical channel width thereof to a physical channel length thereof ranging from, e.g., about 20 to 40,000, and preferably ranging from, e.g., about 20 to 600. The off-chip receiver 422 may output a driving current of between 2 mA and 5 A and, preferably, between 3 mA and 100 mA.

Provided that the off-chip receiver 422 shown in FIG. 11B is applied to the circuit architecture shown in FIG. 8C for a power management chip, the NMOS transistor 4207 of the off-chip receiver 422 may have a ratio of a physical channel width thereof to a physical channel length thereof ranging from, e.g., about 10 to 20,000, and preferably ranging from, e.g., about 10 to 300. The PMOS transistor 4208 may have a ratio of a physical channel width thereof to a physical channel length thereof ranging from, e.g., about 20 to 40,000, and preferably ranging from, e.g., about 20 to 600. The off-chip receiver 422 may output a driving current of between 150 mA and 50 A and, preferably, between 150 mA and 5 A.

In a third aspect, the off-chip buffer 42 may be a tri-state buffer 423, as shown in FIG. 11C, in application to the circuit architecture shown in FIG. 8B, having an input node F connected to the internal circuits 20 through the thick and wide circuit trace 83, and an output node E, in parallel with the off-chip ESD circuit 43, connected to the metal bump 89. FIG. 11C shows an example of an off-chip tri-state buffer 423; as an off-chip driver, a common design in IC chips to allow multiple logic gates to drive the same output, such as a bus. The tri-state buffer 423, serving as an off-chip driver, may include two PMOS devices 4210 and 4212 and two NMOS devices 4209 and 4211. The gates of the PMOS device 4210 and the NMOS device 4209 serve as the input node F, and the drains of the PMOS device 4212 and the NMOS device 4211 serve as the output node E. The drain of the PMOS device 4210 is connected to the source of the PMOS device 4212. The drain of the NMOS device 4209 is connected to the source of the NMOS device 4211. The tri-state buffer 423 may have a switch function controlled by an Enable signal transmitted to the gate of the NMOS device 4211 and an Enable(bar) signal transmitted to the gate of the PMOS device 4212. The off-chip tri-state buffer in FIG. 11C can be viewed as a gated inverter. When the enabling signal En is high (En is low), the off-chip tri-state buffer outputs a signal to an external circuit. When the signal En is set at low ($\overline{En}$ is high), no signal will be output to an external circuit. The off-chip tri-state buffer 423 is set to drive the external data bus.

Referring to FIG. 11C, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the source of the PMOS device 4210. The previously described power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the source of the NMOS device 4209. The previously described ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the previously described ground plane, bus or trace 82.

The NMOS transistors 4209 and 4211 may have a ratio of a physical channel width thereof to a physical channel length thereof ranging from, e.g., about 20 to 20,000, and preferably ranging from, e.g., about 30 to 300. The PMOS transistors 4210 and 4212 may have a ratio of a physical channel width thereof to a physical channel length thereof ranging from, e.g., about 40 to 40,000, and preferably ranging from, e.g., about 60 to 600. The tri-state buffer 423 may output a driving current of between 5 mA and 5 A and, preferably, between 10 mA and 100 mA.

Provided that the tri-state buffer 423 shown in FIG. 11A is applied to the circuit architecture shown in FIG. 8B for a power management chip, the NMOS transistors 4209 and 4211 of the tri-state buffer 423 may have a ratio of a physical channel width thereof to a physical channel length thereof ranging from, e.g., about 2,000 to 200,000, and preferably ranging from, e.g., about 2,000 to 20,000. The PMOS transistors 4210 and 4212 may have a ratio of a physical channel width thereof to a physical channel length thereof ranging from, e.g., about 4,000 to 400,000, and preferably ranging from, e.g., about 4,000 to 40,000. The tri-state buffer 423 may output a driving current of between 500 mA and 50 A and, preferably, between 500 mA and 5 A.

In a fourth aspect, the off-chip buffer 42 may be a tri-state buffer 423, as shown in FIG. 11E, in application to the circuit architecture shown in FIG. 8C, having an output node F connected to the internal circuits 21, 22 and 23 through the thick and wide circuit trace 83', and an input node E, in parallel with the off-chip ESD circuit 43, connected to the metal bump 89. FIG. 11E shows an example of an off-chip tri-state buffer 423, as an off-chip receiver. The tri-state buffer 423, serving as an off-chip receiver, may include two PMOS devices 4210 and 4212 and two NMOS devices 4209 and 4211. The gates of the PMOS device 4210 and the NMOS device 4209 serve as the input node E, and the drains of the PMOS device 4212 and the NMOS device 4211 serve as the output node F. The drain of the PMOS device 4210 is connected to the source of the PMOS device 4212. The drain of the NMOS device 4209 is connected to the source of the NMOS device 4211. The tri-state buffer 423 may have a switch function controlled by an Enable signal transmitted to the gate of the NMOS device 4211 and an Enable (bar) signal transmitted to the gate of the PMOS device 4212. When the enabling signal En is high ($\overline{En}$ is low), the off-chip tri-state buffer outputs a signal to the internal circuits 20. When the signal En is set at low ($\overline{En}$ is high), no signal will be output to the internal circuits 20.

Referring to FIG. 11E, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 and the source of the PMOS device 4210. The previously described power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41 and the source of the NMOS device 4209. The previously described ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the previously described ground plane, bus or trace 82.

The NMOS transistors 4209 and 4211 may have a ratio of a physical channel width thereof to a physical channel length thereof ranging from, e.g., about 20 to 20,000, and preferably ranging from, e.g., about 30 to 300. The PMOS transistors 4210 and 4212 may have a ratio of a physical channel width thereof to a physical channel length thereof ranging from, e.g., about 40 to 40,000, and preferably ranging from, e.g., about 60 to 600. The tri-state buffer 423 may output a driving current of between 5 mA and 5 A and, preferably, between 10 mA and 100 mA.

Provided that the tri-state buffer 423 shown in FIG. 11E is applied to the circuit architecture shown in FIG. 8C for a power management chip, the NMOS transistors 4209 and 4211 of the tri-state buffer 423 may have a ratio of a physical channel width thereof to a physical channel length thereof ranging from, e.g., about 2,000 to 200,000, and preferably ranging from, e.g., about 2,000 to 20,000. The PMOS transistors 4210 and 4212 may have a ratio of a physical channel width thereof to a physical channel length thereof ranging from, e.g., about 4,000 to 400,000, and preferably ranging from, e.g., about 4,000 to 40,000. The tri-state buffer 423 may output a driving current of between 500 mA and 50 A and, preferably, between 500 mA and 5 A.

There may be various off-chip input and output buffers. The above examples are for the CMOS level signals. If the external signal is a transistor-transistor logic (TTL) level, a CMOS/TTL buffer is required. If the external signal is an emitter coupled logic (ECL) level, a CMOS/ECL interface buffer is required. One or more stages of inverters can be added between the internal circuits 20 and the off-chip tri-state buffer 423 serving as an off-chip driver as shown in FIG. 11C or as an off-chip receiver as shown in FIG. 11E.

In a fifth aspect, the off-chip buffer 42 may be an off-chip driver 421 composed of a first level of inverter 421' and a second level of inverters 421", as shown in FIG. 11D, in application to the circuit architecture shown in FIG. 8B, and the first level of inverter 421' is connected in series to the second level of inverters 421", and the second level of inverters 421" are connected in parallel with one another to the first level of inverter 421'. FIG. 8E shows a circuit diagram with the off-driver 421 of FIG. 11D applied to the circuit architecture shown in FIG. 8C. FIG. 9C shows a top perspective view realizing the circuit diagram of FIG. 8E. FIG. 10H shows a chip structure realizing the circuit diagram of FIG. 8E. The off-chip driver 421 has an input node F connected to the internal circuits 20 through the thick and wide circuit trace 83, and an output node E connected, in parallel with the off-chip ESD circuit 43, to the metal bump 89. The gates of the PMOS device and the NMOS device in the first level of inverter 421' serve as the input node F, and the drains of the PMOS devices and the NMOS devices in the second level of inverters 421" serve as the output node E. The drains of the PMOS device and the NMOS device in the first level of inverter 421' are connected to the gates of the PMOS devices and the NMOS devices in the second level of inverters 421" through a thick and wide metal trace or bus **83*s* over the passivation layer 5. The drains of the PMOS devices and the NMOS devices in the second level of inverters 421" are connected to the metal bump 89 through a thick and wide metal trace or bus 83*r* over the passivation layer 5. A patterned circuit layer 831 formed on the polymer layer 95, such as polyimide, having a thickness of between 2 and 30 micrometers may be composed of the thick and wide metal traces or buses 83*r*, 83*s* and 83, that is, the thick and wide metal traces or buses 83*r*, 83*s* and 83 may be formed at the same time, as shown in FIG. 10**H.

Alternatively, multiple patterned circuit layers and multiple polymer layers may be formed over the passivation layer 5, one of the polymer layers is between neighboring two of the patterned circuit layers. The thick and wide metal traces or buses **83*s* may be formed in the lower one of the patterned circuit layers, and the thick and wide metal traces or buses 83*s* may be formed in the upper one of the patterned circuit layers and over the thick and wide metal traces or buses 83*s*. The thick and wide metal traces or buses 83** may have a portion in the lower one of the patterned circuit layers and another portion in the upper one of the patterned circuit layers.

Referring to FIG. 11D, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 to the source of the PMOS device in the first level of inverter 421' and to the sources of the PMOS devices in the second level of inverter 421". The previously described power plane, bus or trace 81, 811 or 812 may contain a patterned circuit layer over the patterned circuit layer 831 of the thick and wide signal trace, bus or plane 83 as shown in FIG. 10H. Alternatively, the thick and wide signal trace, bus or plane 83 as shown in FIG. 10H may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41, the source of the NMOS device in the first level of inverter 421', and the sources of the NMOS devices in the second level of inverters 421". The previously described ground plane, bus or trace 82 or 821 may contain a patterned circuit layer over the patterned circuit layer 831 of the thick and wide signal trace, bus or plane 83 as shown in FIG. 10H. Alternatively, the thick and wide signal trace, bus or plane 83 as shown in FIG. 10H may contain a patterned circuit layer over that of the previously described ground plane, bus or trace 82.

Each of the NMOS transistors in the second level of inverters 421" may have a ratio of a physical channel width thereof to a physical channel length thereof ranging from, e.g., about 20 to 20,000, and preferably ranging from, e.g., about 30 to 300, larger than that of NMOS transistor in the first level inverter 421' by between 1.5 times and 5 times, and preferably by natural exponential times. Each of the PMOS transistors in the second level of inverters 421" may have a ratio of a physical channel width thereof to a physical channel length thereof ranging from, e.g., about 40 to 40,000, and preferably ranging from, e.g., about 60 to 600, larger than that of PMOS transistor in the first level inverter 421' by between 1.5 times and 5 times, and preferably by natural exponential times. The off-chip driver 421 may output a driving current of between 5 mA and 5 A and, preferably, between 10 mA and 100 mA to an external circuit through the metal bump 89.

Provided that the off-chip driver 421 shown in FIG. 11D is applied to the circuit architecture shown in FIG. 8B for a power management chip, each of the NMOS transistors in the second level of inverters 421" may have a ratio of a physical channel width thereof to a physical channel length thereof ranging from, e.g., about 2,000 to 200,000, and preferably ranging from, e.g., about 2,000 to 20,000. Each of the PMOS transistors in the second level of inverters 421" may have a ratio of a physical channel width thereof to a physical channel length thereof ranging from, e.g., about 4,000 to 400,000, and preferably ranging from, e.g., about 4,000 to 40,000. The off-chip driver 421 may output a driving current of between 500 mA and 50 A and, preferably, between 500 mA and 5 A to an external circuit through the metal bump 89.

In a sixth aspect, the off-chip buffer 42 may be an off-chip driver 421 composed of a first level of inverter 421', a second level of inverters 421", a third level of inverter 421''' and a fourth level of inverter 421''', as shown in FIG. 11G, in application to the circuit architecture shown in FIG. 8B, and the first level of inverter 421' is connected in series to the second level of inverters 421", the second level of inverter 421" is connected in series to the third level of inverters 421''', and the third level of inverter 421' is connected in series to the fourth level of inverters 421"". FIG. 8F shows a circuit diagram with the off-driver 421 of FIG. 11G applied to the circuit architecture shown in FIG. 8C: FIG. 9D shows a top perspective view realizing the circuit diagram of FIG. 8F. FIG. 10I shows a chip structure realizing the circuit diagram of FIG. 8F. The off-chip driver 421 has an input node F connected to the internal circuits 20 through the thick and wide circuit trace 83, and an output node E connected, in parallel with the off-chip ESD circuit 43, to the metal bump 89. The gates of the PMOS device and the NMOS device in the first level of inverter 421' serve as the input node F, and the drains of the PMOS device and the NMOS device in the fourth level of inverter 421"" serve as the output node E. The drains of the PMOS device and the NMOS device in the first level of inverter 421' are connected to the gates of the PMOS device and the NMOS device in the second level of inverter 421" through a fine-line metal trace or bus under the passivation layer 5. The drains of the PMOS device and the NMOS device in the second level of inverter 421" are connected to the gates of the PMOS device and the NMOS device in the third level of inverter 421''' through a fine-line metal trace or bus under the passivation layer 5. The drains of the PMOS device and the NMOS device in the third level of inverter 421''' are connected to the gates of the PMOS device and the NMOS device in the fourth level of inverter 421"" through a fine-line metal trace or bus under the passivation layer 5. The drains of the PMOS device and the NMOS device in the fourth level of inverters 421"" are connected to the metal bump 89 through the thick and wide metal trace or bus **83*r* over the passivation layer 5. A patterned circuit layer 831 formed on the polymer layer 95, such as polyimide, having a thickness of between 2 and 30 micrometers may be composed of the thick and wide metal traces or buses 83*r* and 83, that is, the thick and wide metal traces or buses 83*r* and 83 may be formed at the same time, as shown in FIG. 10**I.

Referring to FIG. 11G, the previously described power plane, bus or trace 81, 811 or 812, as shown in FIGS. 1B, 1C, 2B, 2C, 3B, 3C and 3D, over the passivation layer 5 can connect the node P of the voltage regulator or converter circuit 41 to the source of the PMOS device in the first level of inverter 421', to the source of the PMOS device in the second level of inverter 421", to the source of the PMOS device in the third level of inverter 421''' and to the source of the PMOS device in the fourth level of inverter 421"". The previously described power plane, bus or trace 81, 811 or 812 may contain a patterned circuit layer over the patterned circuit layer 831 of the thick and wide signal trace, bus or plane 83 as shown in FIG. 10I. Alternatively, the thick and wide signal trace, bus or plane 83 as shown in FIG. 10I may contain a patterned circuit layer over that of the previously described power plane, bus or trace 81. The previously described ground plane, bus or trace 82 or 821, as shown in FIGS. 1C, 2C and 3C, over the passivation layer 5 can connect the node Rs of the voltage regulator or converter circuit 41, the source of the NMOS device in the first level of inverter 421', the source of the NMOS device in the second level of inverter 421", the source of the NMOS device in the third level of inverter 421''', and the source of the NMOS device in the fourth level of inverter 421"". The previously described ground plane, bus or trace 82 or 821 may contain a patterned circuit layer over the patterned circuit layer 831 of the thick and wide signal trace, bus or plane 83 as shown in FIG. 10I. Alternatively, the thick and wide signal trace, bus or plane 83 as shown in FIG. 10I may contain a patterned circuit layer over that of the previously described ground plane, bus or trace 82.

The NMOS transistor in the fourth level of inverter 421"" may have a ratio of a physical channel width thereof to a physical channel length thereof larger than that of the NMOS transistor in the third level of inverter 421''' by between 1.5 and 5 times, and preferably by natural exponential times, that is larger than that of the NMOS transistor in the second level of inverter 421" by between 1.5 and 5 times, and preferably by natural exponential times, that is larger than that of the NMOS transistor in the first level of inverter 421' by between 1.5 and 5 times, and preferably by natural exponential times. The PMOS transistor in the fourth level of inverter 421"" may have a ratio of a physical channel width thereof to a physical channel length thereof larger than that of the PMOS transistor in the third level of inverter 421''' by between 1.5 and 5 times, and preferably by natural exponential times, that is larger than that of the PMOS transistor in the second level of inverter 421" by between 1.5 and 5 times, and preferably by natural exponential times, that is larger than that of the PMOS transistor in the first level of inverter 421' by between 1.5 and 5 times, and preferably by natural exponential times. The off-chip driver 421 may output a driving current of between 5 mA and 5 A and, preferably, between 10 mA and 100 mA to an external circuit through the metal bump 89.

The NMOS transistor in the fourth level of inverter 421"" may have a ratio of a physical channel width thereof to a physical channel length thereof ranging from, e.g., about 20 to 20,000, and preferably ranging from, e.g., about 30 to 300. The PMOS transistor in the fourth level of inverter 421"" may have a ratio of a physical channel width thereof to a physical channel length thereof ranging from, e.g., about 40 to 40,000, and preferably ranging from, e.g., about 60 to 600. The NMOS transistor in the third level of inverter 421''' may have a ratio of a physical channel width thereof to a physical channel length thereof ranging from, e.g., about 7 to 7,000, and preferably ranging from, e.g., about 10 to 100. The PMOS transistor in the third level of inverter 421''' may have a ratio of a physical channel width thereof to a physical channel length thereof ranging from, e.g., about 13 to 13,000, and preferably ranging from, e.g., about 20 to 200. The NMOS transistor in the second level of inverter 421" may have a ratio of a physical channel width thereof to a physical channel length thereof ranging from, e.g., about 2 to 2,000, and preferably ranging from, e.g., about 3 to 30. The PMOS transistor in the second level of inverter 421" may have a ratio of a physical channel width thereof to a physical channel length thereof ranging from, e.g., about 4 to 4,000, and preferably ranging from, e.g., about 6 to 70.

Provided that the off-chip driver 421 shown in FIG. 11D is applied to the circuit architecture shown in FIG. 8B for a power management chip, the NMOS transistor in the fourth level of inverter 421"" may have a ratio of a physical channel width thereof to a physical channel length thereof ranging from, e.g., about 2,000 to 200,000, and preferably ranging from, e.g., about 2,000 to 20,000. The PMOS transistor in the fourth level of inverter 421"" may have a ratio of a physical channel width thereof to a physical channel length thereof ranging from, e.g., about 4,000 to 400,000, and preferably ranging from, e.g., about 4,000 to 40,000. The NMOS transistor in the third level of inverter 421''' may have a ratio of a physical channel width thereof to a physical channel length thereof ranging from, e.g., about 700 to 70,000, and preferably ranging from, e.g., about 700 to 7,000. The PMOS transistor in the third level of inverter 421''' may have a ratio of a physical channel width thereof to a physical channel length thereof ranging from, e.g., about 1,300 to 130,000, and preferably ranging from, e.g., about 1,300 to 13,000. The NMOS transistor in the second level of inverter 421" may have a ratio of a physical channel width thereof to a physical channel length thereof ranging from, e.g., about 230 to 23,000, and preferably ranging from, e.g., about 230 to 2,300. The PMOS transistor in the second level of inverter 421" may have a ratio of a physical channel width thereof to a physical channel length thereof ranging from, e.g., about 400 to 40,000, and preferably ranging from, e.g., about 400 to 4,000. The off-chip driver 421 may output a driving current of between 500 mA and 50 A and, preferably, between 500 mA and 5 A to an external circuit through the metal bump 89.

Referring to FIGS. 8B, 8C, 8E and 8F, the off-chip buffer 42 is connected, in parallel with the off-chip ESD circuit 43, to the metal bump 89. The detail of the off-chip ESD circuit 43 may be referred to as FIG. 11F. The off-chip ESD circuit 43 is composed of two reverse-biased diodes 4331 and 4332, and the node E is connected to the anode of the diode 4332, to the cathode of the diode 4331, to the off-chip buffer 42, such as off-chip driver 421 of FIG. 11A, 11D or 11G, off-chip receiver 422 of FIG. 11B, or tri-state buffer 423 of FIG. 11C or 11E, and to the metal bump 89. The diode 4331 is reverse-biased between an external voltage and the ground voltage Vss, and the diode 4332 is reverse-biased between the external voltage and the power voltage Vdd or Vcc.

Referring to FIG. 11F, an external power voltage Vdd can be provided to the cathode of the diode 4332 through a power bus or plane over the passivation layer 5. The previously described ground plane, bus or trace 82 or 821, as shown in FIGS. 1C, 2C and 3C, over the passivation layer 5 can connect the node Rs of the voltage regulator or converter circuit 41 and the cathode of the diode 4331.

Accordingly, the voltage at the node E can be clamped between the power voltage Vdd input from an external circuit and the ground voltage Vss or between the power voltage Vdd and the ground voltage Vss. When the voltage at the node E suddenly exceeds the power voltage Vdd, a current will discharge from the node E to the external circuit through the diode 4332. When the voltage at the node E dramatically drop under the ground voltage Vss, a current will flow from the external circuit to the node E through the diode 4331.

Alternatively, the node E in the circuit diagrams in FIGS. 8B, 8C, 8E and 8F can be protected by multiple off-chip ESD circuits 43, which can be referred to as FIG. 11H. For example, referring to FIG. 8D, the node E connecting the off-chip driver 42 to the metal bump 89 may be protected by multiple off-chip ESD circuits 43. Each of the off-chip ESD circuits 43 is composed of two reverse-biased diodes 4331 and 4332, and the node E is connected to the anodes of the diodes 4332, to the cathodes of the diodes 4331, to the off-chip buffer 42, such as off-chip driver 421 of FIG. 11A, 11D or 11G, off-chip receiver 422 of FIG. 11B, or tri-state buffer 423 of FIG. 11C or 11E, and to the metal bump 89. The diodes 4331 are reverse-biased between an external voltage and the ground voltage Vss, and the diodes 4332 are reverse-biased between the external voltage and the power voltage Vdd or Vcc.

Referring to FIG. 11H, an external power voltage Vdd can be provided to the cathodes of the diodes 4332 through a power bus or plane over the passivation layer 5. The previously described ground plane, bus or trace 82 or 821, as shown in FIGS. 1C, 2C and 3C, over the passivation layer 5 can connect the node Rs of the voltage regulator or converter circuit 41 and the cathodes of the diodes 4331.

Accordingly, the voltage at the node E can be clamped between the power voltage Vdd input from an external circuit and the ground voltage Vss. When the voltage at the node E suddenly exceeds the power voltage Vdd, a current will discharge from the node E to the external circuit through the diodes 4332. When the voltage at the node E dramatically drop under the ground voltage Vss, a current will flow from the external circuit to the node E through the diodes 4331.

In FIGS. 10B, 10D, 10G, 10H and 10I, there is only one patterned circuit layer 831, including a portion serving as the previously described thick and wide metal trace 83 and another portion serving as the previously described thick and wide metal trace 83*r*, over the passivation layer 5. The patterned circuit layer 831 may contain an adhesion/barrier layer, a seed layer on the adhesion/barrier layer, and an electroplated metal layer 8312 on the seed layer, the adhesion/barrier layer and the seed layer composing the bottom layer 8311.

Referring to FIG. 10B, regards to the process for forming the patterned circuit layer 831, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6390, principally made of aluminum or copper, exposed by multiple openings 539, 539', 531, 532 and 534 in the passivation layer 5. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8312 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8312 is removed using a wet-etching process or using a dry-etching process. Thereafter, the adhesion/barrier layer not under the metal layer 8312 is removed using a wet-etching process or using a dry-etching process.

After the patterned circuit layer 831 is formed, a polymer layer 99 can be formed by a suitable process or processes, e.g., by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9939 may be formed in the polymer layer 99, exposing the contact point 8310 of the patterned circuit layer 831.

The process of forming the metal bump 89 on the polymer layer 99 and on the contact point 8310 exposed by the opening 9939 as shown in FIGS. 10B and 10D can be referred to as the process of forming the metal bumps 89 on the polymer layer 98 and on the regions 801*a* exposed by the openings 980 as illustrated in FIG. 15M. The specification of the metal bump 89 as shown in FIGS. 10B and 10D can be referred to as the specification of the metal bumps 89 as illustrated in FIG. 15M.

The metal bump 89 can be used to be connected to a printed circuit board, a ceramic substrate, another semiconductor chip, a flexible substrate by a tape-automated bonding (TAB) process, or a glass substrate via anisotropic conductive film or paste (ACF or ACP).

Alternatively, referring to FIG. 10B, a nickel layer having a thickness between 0.05 and 2 micrometers can be electroless plated on the contact point 8310 exposed by the opening 9939, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire or a copper wire can be bonded onto the electroless plated gold layer in the opening 9939 in the polymer layer 99 using a wirebonding process.

Alternatively, referring to FIG. 10B, a gold wire or a copper wire can be bonded onto a gold layer, platinum layer, palladium layer or ruthenium layer of the patterned circuit layer 831, exposed by the openings 9939 in the polymer layer 99 using a wirebonding process.

Alternatively, referring to FIG. 10C, there may be multiple patterned circuit layers 831 and 832, including a portion serving as the previously described thick and wide metal trace 83 and another portion serving as the previously described thick and wide metal trace 83*r*, over the passivation layer 5. The process for forming the patterned circuit layer 831 shown in FIG. 10C can be referred to as the process for forming the patterned circuit layer 831 shown in FIG. 10B. The patterned circuit layer 832 may contain an adhesion/barrier layer, a seed layer on the adhesion/barrier layer, and an electroplated metal layer 8322 on the seed layer, the adhesion/barrier layer and the seed layer composing the bottom layer 8321.

Referring to FIG. 10C, after the patterned circuit layer 831 is formed, a polymer layer 98 can be formed by a suitable process or processes, e.g., by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9831, 9834 and 9839 may be formed in the polymer layer 98, exposing multiple contact pads of the patterned circuit layer 831.

Referring to FIG. 10C, regards to the process for forming the patterned circuit layer 832, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pads of the patterned circuit layer 831 exposed by multiple openings 9839, 9831 and 9834 in the polymer layer 98. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8322 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8322 is removed using a wet-etching process or using a dry-etching process. Thereafter, the adhesion/barrier layer not under the metal layer 8322 is removed using a wet-etching process or using a dry-etching process.

After the patterned circuit layer 832 is formed, a polymer layer 99 can be formed by a suitable process or processes, e.g., by spin-on coating a negative photosensitive polyimide layer, such as ester type, on the patterned circuit layer 832 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9939' may be formed in the polymer layer 99, exposing a contact point 8320 of the patterned circuit layer 832.

The process of forming the metal bump 89 on the polymer layer 99 and on the contact point 8320 exposed by the opening 9939' as shown in FIGS. 10C and 10E can be referred to as the process of forming the metal bumps 89 on the polymer layer 98 and on the regions 801$a$ exposed by the openings 980 as illustrated in FIG. 15M. The specification of the metal bump 89 as shown in FIGS. 10C and 10E can be referred to as the specification of the metal bumps 89 as illustrated in FIG. 15M.

The metal bump 89 shown in FIGS. 10C and 10E can be used to be connected to a printed circuit board, a ceramic substrate, another semiconductor chip, a flexible substrate by a tape-automated bonding (TAB) process, or a glass substrate via anisotropic conductive film or paste (ACF or ACP).

Alternatively, referring to FIG. 10C, a nickel layer having a thickness between 0.05 and 2 micrometers can be electroless plated on the contact point 8320 exposed by the opening 9939' in layer polymer layer 99, and a gold layer, platinum layer, palladium layer or ruthenium layer having a thickness between 0.05 and 2 micrometers can be electroless plated on the electroless plated nickel layer in the opening 9939' in the polymer layer 99. Thereafter, a gold wire or a copper wire can be bonded onto the electroless plated gold layer in the opening 9939' in the polymer layer 99 using a wirebonding process.

Alternatively, referring to FIG. 10C, a gold wire or a copper wire can be bonded onto a gold layer, platinum layer, palladium layer or ruthenium layer of the patterned circuit layer 832, exposed by the openings 9939' in the polymer layer 99 using a wirebonding process.

Referring to FIGS. 10D and 10E, before the patterned circuit layer 831 is formed, a polymer layer 95 can be optionally formed by a suitable process or processes, e.g., by spin-on coating a negative photosensitive polyimide layer, such as ester type, on the nitride layer of the passivation layer 5 and on the contact pads 6390, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9539, 9539', 9531, 9532 and 9534 may be formed in the polymer layer 95, exposing multiple contact pads 6390 exposed by the openings 539, 539', 531, 532 and 533 in the passivation layer 5. After the polymer layer 95 is formed, the patterned circuit layer 831 can be formed on the polymer layer 95 and on the contact pads 6390 exposed by the openings 539, 539', 531, 532 and 533. The adhesion/barrier layer of any previously described material may be sputtered on the polymer layer 95 and on the contact pads 6390 exposed by the openings 9539, 9539', 9531, 9532 and 9534 in the polymer layer 95.

Alternatively, referring to FIG. 10F, the off-chip buffer 42, such as off-chip driver of FIG. 11A, 11D or 11E, off-chip receiver of FIG. 11B or tri-state buffer of FIG. 11C or 11E, can be connected to the internal circuits 20 through the fine-line metal trace 638 under the passivation layer 5 but not through any trace or bus over the passivation layer 5. There may be only one patterned circuit layer 831 including a portion serving as the previously described thick and wide metal trace 83$r$, over the passivation layer 5. The position of the contact point 8310 of the previously described thick and wide metal trace 83$r$ for being wirebonded thereto from a top perspective view is different from that of the contact pad exposed by the opening 539 in the passivation layer 5. The process for forming the patterned circuit layer 831 can be referred to as that for forming the patterned circuit layer 831 shown in FIG. 10B. The process for forming the polymer layer 99 can be referred to as that for forming the polymer layer 99 shown in FIG. 10B.

Referring to FIG. 10F, a gold wire pr a copper wire can be bonded onto a gold layer, platinum layer, palladium layer or ruthenium layer of the patterned circuit layer 831, exposed by the openings 9939 in the polymer layer 99 using a wirebonding process.

As an alternate, referring to FIG. 10F, a nickel layer having a thickness between 0.05 and 2 micrometers can be electroless plated on the contact point 8310 exposed by the opening 9939 in the polymer layer 99, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire or a copper wire can be bonded onto the electroless plated gold layer in the opening 9939 in the polymer layer 99 using a wirebonding process.

Figure 10G:
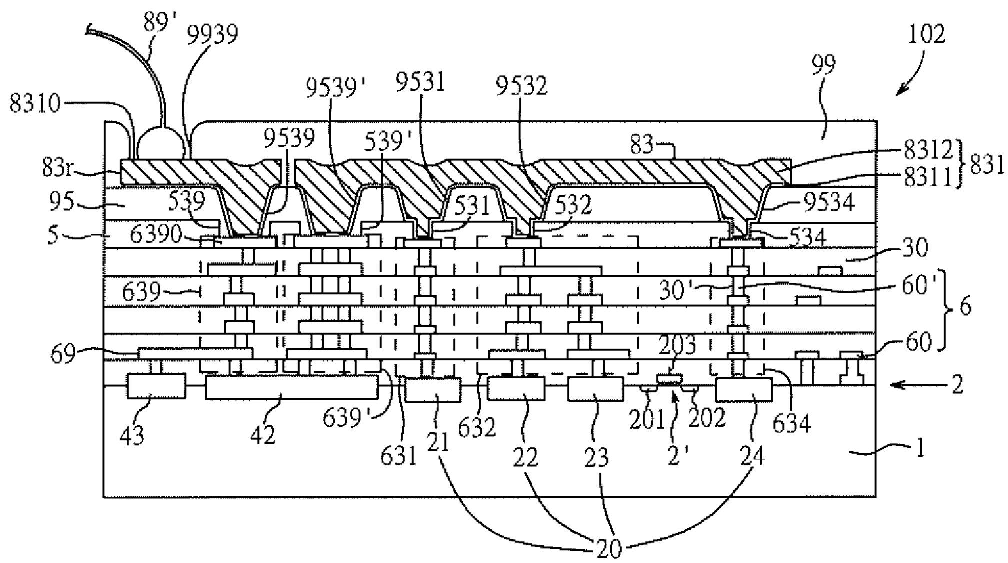
Figure 10H:
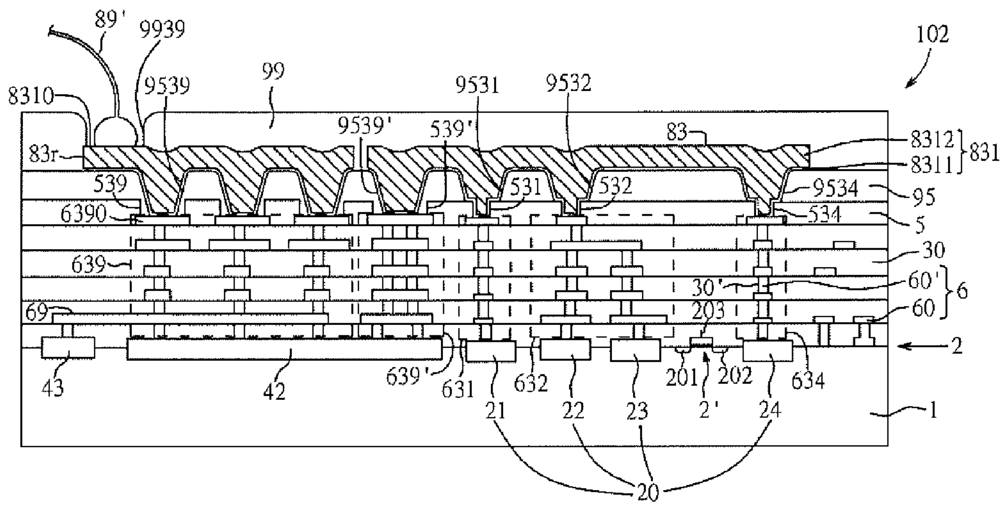
Figure 10I:
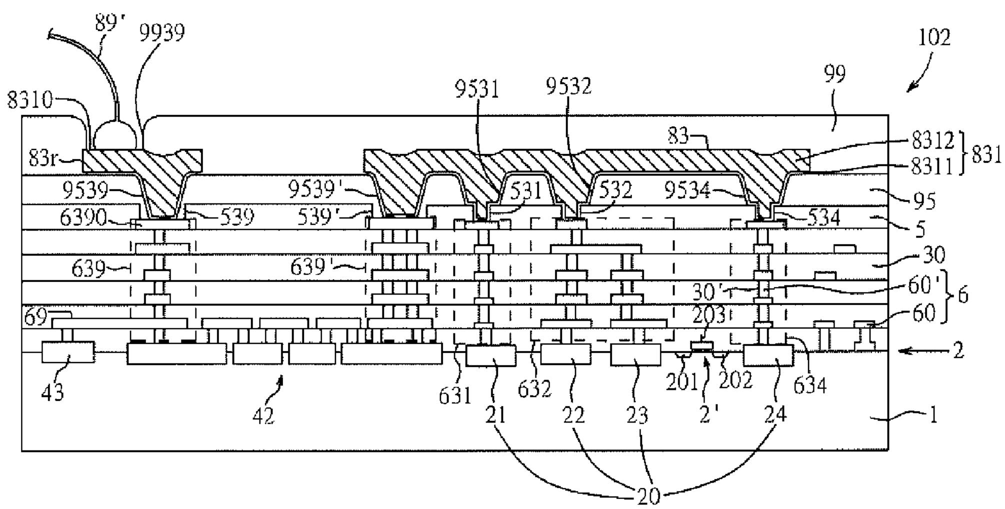

Referring to FIGS. 10G-10I, a gold wire or a copper wire can be bonded onto a gold layer, platinum layer, palladium layer or ruthenium layer of the patterned circuit layer 831, exposed by the openings 9939 in the polymer layer 99 using a wirebonding process.

As an alternate, referring to FIGS. 10G-10I, a nickel layer having a thickness between 0.05 and 2 micrometers can be electroless plated on the contact point 8310 exposed by the opening 9939 in the polymer layer 99, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire can be bonded onto the electroless plated gold layer in the opening 9939 in the polymer layer 99 using a wirebonding process.

The circuitry shown in FIGS. 8B-8F, 9B-9B and 10B-10I can be used in a flash memory chip, in a DRAM memory chip or in a SRAM memory chip. The I/O pad relocation using the redistribution layer 83$r$ is particularly useful for the stacked packaging with flash, DRAM or SRAM memory chips. The I/O pads of a DRAM chip are usually designed roughly along the centerline of the chip, and cannot be used for stacked packages. The redistribution layer 83$r$ relocates the center pad to the peripheral of the chip for the wirebonding in the stacked package. FIGS. 10F and 10G show specific examples, with a wire bonded on the contact point 8310 connected to the original pad 6390 exposed by the opening 539 in the passivation layer 5 via the thick and wide metal trace of bus 83$r$. In FIGS. 8B, 9B, 10B-10G, in an application to a memory chip, an SRAM cell, or a flash memory cell, or a DRAM cell is connected to the input node Xi of the internal circuit 21, such as sense amplifier, internal tri-state buffer 213 of FIG. 5F, pass circuit 216 of FIG. 5G, latch circuit 217 of FIG. 5H, circuit of pass circuit 216 and internal driver 212 shown in FIG. 5I, or circuit of latch circuit 217 and internal driver 212 shown in FIG. 5J. The various detailed internal circuit 21 and methods connecting a memory cell to the internal circuit 21 can be referred to as shown in FIGS. 5F-5J. Referring to FIGS. 8B, 8D-8F, 9B-9D and 10B-10I, an SRAM cell, or a flash cell or a DRAM cell is connected to external circuit (1) through sense amplifier 214 of FIGS. 5F-5J; (2) through an internal tri-state buffer 213 of FIG. 5F, a pass circuit 216 of FIG. 5G, a latch circuit 217 of FIG. 5H, a circuit of a pass circuit 216 and an internal driver 212 as shown in FIG. 5I, or a circuit of a latch circuit 217 and an internal driver 212 as shown in FIG. 5J; (3) through a first fine-line structure formed by a suitable process or processes, e.g., by stacked vias and metals 631; (4) up through a first passivation opening 531; (5) for 10G, also through a first polymer opening 9531; (6) through a fine-line metal 638 under the passivation layer 5 for FIG. 10F; while through an over-passivation metal lines, traces or planes 83 in one or more metal layers over the passivation layer 5 for FIG. 10G; (7) for FIG. 10G, down through a second polymer opening 9539'; (8) through a second passivation opening 539'; (9) through a fine-line metal structure formed by a suitable process or processes, e.g., by stacked vias and metal pads 639', connected to the input of an off-chip buffer 42, (10) through the output of the off-chip buffer 42 connected to an off-chip ESD circuit 43, and to a stacked fine-line metal vias and metal pads 639, (11) through an passivation opening 539, (12) for 10G, also through a third polymer opening 9539; and (13) through an over-passivation redistribution metal lines or traces or planes **83*r*, (14) through over-passivation metal pad 8310 exposed by a polymer opening 9939; (15) through a bonding wire 89' on the contact point 8310 or a metal bump 89**.

Note that as in FIG. 10G, there may be a polymer layer under or over the redistribution metal layer **83*r*. The redistribution metal lines, traces or planes 83*r* can be formed by a suitable process or processes, e.g., by a (electroplated or electroless plated) gold layer with thickness within a range between 1.5 μm and 30 μm, exemplary 2 μm and 10 μm; or by a (electroplated) copper layer with thickness within a range between 2 μm and 100 μm, exemplary 3 μm and 20 μm, a Ni cap layer (thickness between 0.5 μm and 5 μm) on the copper layer and an assembly metal layer of Au or Pd, or Ru (thickness between 0.05 μm and 5 μm) on the Ni cap layer. A wirebonding is performed on the surface of the gold, palladium, platinum or ruthenium layer of the over-passivation metal pad 8310**.

Referring to FIGS. 8B-8F, 9B-9D, 10B-10E and 10G-10I, the shape of the openings 531, 532, 534 and 539' in the passivation layer 5 from a top perspective view may be round, square, rectangular or polygon. If the openings 531, 532, 534, 539 and 539' are round, the openings 531, 532, 534, 539 and 539' may have a diameter of between 0.1 and 200 microns, between 1 and 100 microns, or, preferably, between 0.1 and 30 microns. If the openings 531, 532, 534, 539 and 539' are square, the openings 531, 532, 534, 539 and 539' may have a width of between 0.1 and 200 microns, between 1 and 100 microns, or, preferably, between 0.1 and 30 microns. If the openings 531, 532, 534, 539 and 539' are rectangular, the openings 531, 532, 534, 539 and 539' may have a width of between 0.1 and 200 microns, between 1 and 100 microns, or, preferably, between 0.1 and 30 microns, and a length of between 1 micron and 1 centimeter. If the openings 531, 532, 534, 539 and 539' are polygon having more than five sides, the openings 531, 532, 534, 539 and 539' have a largest diagonal length of between 0.1 and 200 microns, between 1 and 100 microns, or, preferably, between 0.1 and 30 microns. Alternatively, the openings 531, 532, 534, 539 and 539' have a largest transverse dimension of between 0.1 and 200 microns, between 1 and 100 microns, or, preferably, between 0.1 and 30 microns. In a case shown in FIGS. 10C-10E, 10G, 10H and 10I, the openings 531, 532, 534, 539 and 539' have a width of between 0.1 and 30 microns, with the lower portion of the openings 9531, 9532, 9534, 9539 and 9539' in the polymer layer 95 having a width of between 20 and 100 microns. The openings 9531, 9532 and 9534 in the polymer layer 95 have lower portions having widths or transverse dimensions larger than those of the openings 531, 532 and 534 in the passivation layer 5 aligned with the openings 9531, 9532 and 9534, respectively. The openings 9531, 9532 and 9534 in the polymer layer 95 further expose the passivation layer 5 close to the openings 531, 532 and 534. The polymer layer 95 covers the peripheral region of the contact pad exposed by the openings 539 and 539' in the passivation layer 5, but the openings 9539 and 9539' in the polymer layer 95 exposes the center region of the contact pad exposed by the openings 539 and 539' in the passivation layer 5. The widths or transverse dimensions of the openings 539 and 539' in the passivation layer 5 are larger than those of the openings 9539 and 9539', respectively.

In FIGS. 8A-8F, a dotted line 5 indicates the passivation layer, coarse traces indicate traces of an over-passivation scheme 102 formed over the passivation layer 5, and fine traces indicate traces formed under the passivation layer 5. In FIGS. 9A-9D, coarse traces indicate the traces of the over-passivation scheme 102 formed over the passivation layer 5, and fine traces indicate the traces formed under the passivation layer 5. The over-passivation scheme 102 shown in FIG. 10A includes the polymer layer 99, the metal trace **83*r* provided by the patterned circuit layer 831, and the metal bump 89, and the opening 9939 in polymer layer 99 is over the contact point 8310 of the metal trace 83*r*, and the metal bump 89 is in the opening 9939, on the contact point 8310 and on the polymer layer 99. The over-passivation scheme 102 shown in FIG. 10B includes the polymer layer 99, the metal traces 83 and 83*r* provided by the patterned circuit layer 831, and the metal bump 89, and the opening 9939 in polymer layer 99 is over the contact point 8310 of the metal trace 83*r*, and the metal bump 89 is in the opening 9939, on the contact point 8310 and on the polymer layer 99. The over-passivation scheme 102 shown in FIG. 10C includes the polymer layers 98 and 99, the metal traces 83 and 83*r* provided by the patterned circuit layers 831 and 832, and the metal bump 89, and the opening 9939' in polymer layer 99 is over the contact point 8320 of the metal trace 83*r*, and the metal bump 89 is in the opening 9939', on the contact point 8320 and on the polymer layer 99. The over-passivation scheme 102 shown in FIG. 10D includes the polymer layers 95 and 99, the metal traces 83 and 83*r* provided by the patterned circuit layer 831, and the metal bump 89, and the openings 9539, 9539', 9531, 9532 and 9534 are in the polymer layer 95, and the opening 9939 in polymer layer 99 is over the contact point 8320 of the metal trace 83*r*, and the metal bump 89 is in the opening 9939, on the contact point 8320 and on the polymer layer 99. The over-passivation scheme 102 shown in FIG. 10E includes the polymer layers 95, 98 and 99, the metal traces 83 and 83*r* provided by the patterned circuit layers 831 and 832, and the metal bump 89, and the openings 9539, 9539', 9531, 9532 and 9534 are in the polymer layer 95, and the openings 9831, 9834 and 9839 in the polymer layer 98 are over the patterned circuit layer 831, and the opening 9939' in polymer layer 99 is over the contact point 8320 of the metal trace 83*r*, and the metal bump 89 is in the opening 9939', on the contact point 8320 and on the polymer layer 99. The over-passivation scheme 102 shown in FIG. 10F includes the polymer layer 99 and the metal trace 83*r* provided by the patterned circuit layer 831, and the opening 9939 in the polymer layer 99 is over the contact point 8310 of the metal trace 83*r* and exposes it. The over-passivation scheme 102 shown in FIGS. 10G-10I includes the polymer layers 95 and 99 and the metal traces 83 and 83*r* provided by the patterned circuit layer 831, and the openings 9539, 9539', 9531, 9532 and 9534 are in the polymer layer 95, and the opening 9939 in the polymer layer 99 is over the contact point 8310 of the metal trace 83*r*** and exposes it.

FOURTH EMBODIMENT

Power/Ground Buses Design Architecture

In the first embodiment of present disclosure described previously, an external power supply Vdd is provided to the voltage regulator or converter circuit 41, and the voltage regulator or converter circuit 41 outputs a power supply Vcc to the internal circuits 20. Alternatively, the external power supply Vdd can be input from an external circuit to the internal circuits 20, including 21, 22, 23 and 24, with an ESD protection circuit 44 required to prevent the voltage or current surge from damaging the internal circuits 20. The ESD circuit 44 is connected in parallel with the internal circuits 21, 22, 23 and 24. In the first embodiment in FIGS. 1B, 1C, 2B, 2C, 3B, 3C and 3D, an ESD circuit can be also added and connected in parallel with the voltage regulator or converter circuit 41, and with the internal circuits 21, 22, 23 and 24. For example, the circuit shown in FIG. 1D contains the circuit of FIG. 1C in addition with an ESD circuit 44. The ESD circuit 44 includes a power node Dp connected to a thick and wide power bus or plane 81P, delivering an external power voltage Vdd, and a ground node Dg connected to a thick and wide ground bus or plane 82. The thick and wide power bus or plane 81P connects the power node Dp of the ESD circuit 44 and the power node of the voltage regulator or converter circuit 41. The thick and wide ground bus or plane 82 connects the ground node Dg of the ESD circuit 44 and the ground node Rs of the voltage regulator or converter circuit 41. The ESD circuit 44 in the circuitry of FIG. 1D may be a reverse biased diode 4333, as shown in FIG. 12E, having an anode connected to the thick and wide ground bus or plane 82 and a cathode connected to the thick and wide power bus or plane 81P. An element in FIG. 1D can be referred to as the element in FIG. 1C indicated by a reference number identical to the element in FIG. 1D.

FIG. 12B shows a circuit diagram including a thick and wide power bus or plane 81P over the passivation layer 5, connecting an ESD circuit 44 and internal circuits 20. FIG. 13B shows a top view realizing the circuit diagram of FIG. 12B, and the bold lines shown in FIG. 13B means a thick and wide metal trace or bus over a passivation layer, and the fine lines shown in FIG. 13B means a fine metal trace under a passivation layer. FIG. 14B shows a cross-sectional view realizing the circuit diagram of FIG. 12B. In FIG. 12B, an external power supply voltage Vdd is input at a node Ep and distributed to the Vdd nodes, power nodes, Tp, Up, Vp and Wp of the internal circuits 21, 22, 23 and 24 through a thick and wide power bus or plane 81P over the passivation layer 5, through passivation openings 511, 512 and 514, and through power fine-line metal traces 611, 612 and 614 under the passivation layer 5. A power node Dp of an ESD circuit 44 is connected to a thick and wide metal trace, bus or plane 81P, power bus, through a fine-line metal trace or bus 649, and through an opening 549 in the passivation layer 5. The thick and wide power bus 81P can be connected to the power nodes Tp, Up, Vp and Wp of the internal circuits 21, 22, 23 and 24 that may include a NOR gate, NAND gate, AND gate, OR gate, operational amplifier, adder, multiplexer, diplexer, multiplier, A/D converter, D/A converter, CMOS device, bi-polar CMOS device, bipolar circuit, SRAM cell, DRAM cell, non-volatile memory cell, flash memory cell, EPROM cell, ROM cell, magnetic RAM (MRAM) or sense amplifier. The above mentioned power bus 81P shown in FIG. 12B, over the passivation layer 5, can be connected to the power nodes of the internal circuits 20 or other circuits in the previously described four embodiments provided with access to a power voltage Vdd. The ESD circuit 44 in the circuitry of FIG. 12B may be a reverse biased diode 4333, as shown in FIG. 12E, having an anode connected to ground and a cathode connected to the thick and wide power bus or plane 81P.

In FIG. 14B, there is only one patterned circuit layer 811, including a portion serving as the previously described thick and wide metal trace 81P, power bus or plane, over the passivation layer 5. The patterned circuit layer 811 may contain an adhesion/barrier layer, a seed layer on the adhesion/barrier layer, and an electroplated metal layer 8112 on the seed layer, the adhesion/barrier layer and the seed layer composing the bottom layer 8111.

Referring to FIG. 14B, regards to the process for forming the patterned circuit layer 811, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6490, principally made of aluminum or copper, exposed by multiple openings 549, 511, 512 and 514 in the passivation layer 5. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8112 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8112 is removed using a wet-etching process or using a dry-etching process. Thereafter, the adhesion/barrier layer not under the metal layer 8112 is removed using a wet-etching process or using a dry-etching process.

After the patterned circuit layer 811 is formed, a polymer layer 99 can be formed by a suitable process or processes, e.g., by spin-on coating a negative photosensitive polyimide layer, such as ester type, on the patterned circuit layer 811 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9949 may be formed in the polymer layer 99, exposing a contact pad 8110 of the patterned circuit layer 811.

Referring to FIG. 14B, for forming a metal bump over the contact pad 8110, an adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9949. Thereafter, the seed layer may be formed by a suitable process or processes, e.g., by sputtering a copper layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball for a flip-chip assembly. The metal bump can be connected to a printed circuit board, ceramic substrate or another semiconductor chip.

Referring to FIG. 14B, for forming another kind of metal bump over the contact pad 8110, an adhesion/barrier layer may be formed by a suitable process or processes, e.g., by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9949. Thereafter, the seed layer may be formed by a suitable process or processes, e.g., by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 14B, a nickel layer having a thickness between 0.05 and 2 micrometers can be electroless plated on the contact pad 8110 exposed by the opening 9949, and a gold layer, platinum layer, palladium layer or ruthenium layer having a thickness between 0.05 and 2 micrometers can be electroless plated on the electroless plated nickel layer in the opening 9949 in the polymer layer 99. Thereafter, a gold wire can be bonded onto the electroless plated gold layer in the opening 9949 in the polymer layer 99 using a wirebonding process.

Alternatively, referring to FIG. 14B, a gold wire can be bonded onto a gold layer, platinum layer, palladium layer or ruthenium layer of the patterned circuit layer 811, exposed by the openings 9949 in the polymer layer 99 using a wirebonding process.

Referring to FIG. 14D, before the patterned circuit layer 811 is formed, a polymer layer 95 can be optionally formed by a suitable process or processes, e.g., by spin-on coating a negative photosensitive polyimide layer, such as ester type, on the nitride layer of the passivation layer 5 and on the contact pads 6490, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings 9549, 9511, 9512 and 9514 may be formed in the polymer layer 95, exposing multiple contact pads 6490 exposed by the openings 549, 511, 512 and 514 in the passivation layer 5. After the polymer layer 95 is formed, the patterned circuit layer 811 can be formed on the polymer layer 95 and on the contact pads 6490 exposed by the openings 549, 511, 512 and 514. The adhesion/barrier layer of any previously described material may be sputtered on the polymer layer 95 and on the contact pads 6490 exposed by the openings 9549, 9511, 9512 and 9514 in the polymer layer 95.

FIG. 12C shows, in addition to the power Vdd connection in FIG. 12B, a ground Vss connection. FIG. 13C shows a top view realizing the circuit diagram of FIG. 12C, and the bold lines shown in FIG. 13C means a thick and wide metal trace or bus over a passivation layer, and the fine lines shown in FIG. 13C means a fine metal trace under a passivation layer. FIG. 14C shows a cross-sectional view realizing the circuit diagram of FIG. 12C. In FIG. 12C, the external ground Vss is input at a node Eg and provided to the Vss nodes Ts, Us, Vs and Ws of the internal circuits 21, 22, 23 and 24 through a thick and wide metal trace, bus or plane 82, ground bus or plane, over the passivation layer 5, through openings 521, 522 and 524 in the passivation layer 5, and through fine-line metal traces 621, 622 and 624 under the passivation layer 5. The thick and wide ground bus or plane 82 is connected to a Vss node Dg of the ESD circuit 44 through an opening 549' in the passivation layer 5 and through a fine-line ground metal bus 649' under the passivation layer 5. The above mentioned power bus 81P shown in FIG. 12C, over the passivation layer 5, can be connected to the power nodes of the internal circuits 20 or other circuits in the previously described four embodiments provided with access to a power voltage Vdd. The above mentioned ground bus 82 shown in FIG. 12C, over the passivation layer 5, can be connected to the ground nodes of the internal circuits 20 or other circuits in the previously described four embodiments provided with access to a ground voltage Vss. The ESD circuit 44 in the circuitry of FIG. 12C may be a reverse biased diode 4333, as shown in FIG. 12E, having an anode connected to the thick and wide ground bus or plane 82 and a cathode connected to the thick and wide power bus or plane 81P.

Referring to FIG. 14C, there may be multiple patterned circuit layers 821 and 812, including the previously described ground bus or plane 82 and the previously described power bus or plane 81P over the ground bus or plane 82, over the passivation layer 5. The process for forming the patterned circuit layer 821 on the passivation layer 5 and on the contact pads 6490' exposed by the openings 549', 521, 522 and 524 can be referred to as the process for forming the patterned circuit layer 811 shown in FIG. 14B on the passivation layer 5 and on the contact pads 6490 exposed by the openings 549, 511, 512 and 514. The patterned circuit layer 821 may contain an adhesion/barrier layer, a seed layer on the adhesion/barrier layer, and an electroplated metal layer 8212 on the seed layer, the adhesion/barrier layer and the seed layer composing the bottom layer 8211. The patterned circuit layer 812 may contain an adhesion/barrier layer, a seed layer on the adhesion/barrier layer, and an electroplated metal layer 8122 on the seed layer, the adhesion/barrier layer and the seed layer composing the bottom layer 8121.

Referring to FIG. 14C, after the patterned circuit layer 821 is formed, a polymer layer 98 can be formed by a suitable process or processes, e.g., by spin-on coating a negative photosensitive polyimide layer, such as ester type, on the patterned circuit layer 821 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9849' may be formed in the polymer layer 98, exposing a contact pad of the patterned circuit layer 821.

Referring to FIG. 14C, regards to the process for forming the patterned circuit layer 812, the adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pad of the patterned circuit layer 821 exposed by the opening 9849' in the polymer layer 98. Thereafter, the seed layer may be formed by a suitable process or processes, e.g., by sputtering a copper layer having a thickness between 200 and 3000 angstroms on the adhesion/barrier layer of any previously described material or by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal layer 8122 may be formed by a suitable process or processes, e.g., by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8122 is removed using a wet-etching process or using a dry-etching process. Thereafter, the adhesion/barrier layer not under the metal layer 8122 is removed using a wet-etching process or using a dry-etching process.

After the patterned circuit layer 812 is formed, a polymer layer 99 can be formed by a suitable process or processes, e.g., by spin-on coating a negative photosensitive polyimide layer, such as ester type, on the patterned circuit layer 812 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, an opening 9949' may be formed in the polymer layer 99, exposing a contact pad 8120 of the patterned circuit layer 812.

Referring to FIG. 14C, for forming a metal bump over the contact pad 8120, an adhesion/barrier layer may be formed by a suitable process or processes, e.g., by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9949'. Thereafter, the seed layer may be formed by a suitable process or processes, e.g., by sputtering a copper layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball. The metal bump can be connected to a printed circuit board, ceramic substrate or another semiconductor chip.

Referring to FIG. 14C, for forming another kind of metal bump over the contact pad 8120, an adhesion/barrier layer may be formed by a suitable process or processes, e.g., by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9949'. Thereafter, the seed layer may be formed by a suitable process or processes, e.g., by sputtering a gold layer having a thickness between 200 and 3000 angstroms on the adhesion/barrier layer of any previously described material. Thereafter, a photoresist layer may be formed on the seed layer, multiple openings in the photoresist layer exposing the seed layer. Thereafter, the metal bump may be formed by a suitable process or processes, e.g., by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 14C, a nickel layer having a thickness between 0.05 and 2 micrometers can be electroless plated on the contact pad 8120 exposed by the opening 9949' in layer polymer layer 99, and a gold layer, platinum layer, palladium layer or ruthenium layer having a thickness between 0.05 and 2 micrometers can be electroless plated on the electroless plated nickel layer in the opening 9949' in the polymer layer 99. Thereafter, a gold wire can be bonded onto the electroless plated gold layer in the opening 9949' in the polymer layer 99 using a wirebonding process.

Alternatively, referring to FIG. 14C, a gold wire can be bonded onto a gold layer, platinum layer, palladium layer or ruthenium layer of the patterned circuit layer 812, exposed by the openings 9949' in the polymer layer 99 using a wirebonding process.

Alternatively, before the patterned circuit layer 821 is formed, a polymer layer can be optionally formed by a suitable process or processes, e.g., by spin-on coating a negative photosensitive polyimide layer, such as ester type, on the nitride layer of the passivation layer 5 and on the contact pads 6490', exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Accordingly, multiple openings may be formed in the polymer layer, exposing multiple contact pads 6490' exposed by the openings 549', 521, 522 and 524 in the passivation layer 5. After the polymer layer is formed, the patterned circuit layer 821 can be formed on the polymer layer and on the contact pads 6490' exposed by the openings 549', 521, 522 and 524. The adhesion/barrier layer of any previously described material may be sputtered on the polymer layer and on the contact pads 6490' exposed by the openings in the polymer layer.

Alternatively, the previously described power bus or plane 81P and the previously described ground bus or plane 82 can be connected to two ESD circuits 44 and 45, as shown in FIG. 12D. The previously described power bus or plane 81P may connect the power nodes Tp, Up, Vp and Wp of the internal circuits 21, 22, 23 and 24 and the power nodes Dp and Dp' of the ESD circuits 44 and 45. The previously described ground bus or plane 82 may connect the ground nodes Ts, Us, Vs and Ws of the internal circuits 21, 22, 23 and 24 and the ground nodes Dg and Dg' of the ESD circuits 44 and 45. The above mentioned power bus 81P shown in FIG. 12D, over the passivation layer 5, can be connected to the power nodes of the internal circuits 20 or other circuits in the previously described four embodiments provided with access to a power voltage Vdd. The above mentioned ground bus 82 shown in FIG. 12D, over the passivation layer 5, can be connected to the ground nodes of the internal circuits 20 or other circuits in the previously described four embodiments provided with access to a ground voltage Vss. Each of the ESD circuit 44 and 45 in the circuitry of FIG. 12D may be a reverse biased diode 4333, as shown in FIG. 12E, having an anode connected to the thick and wide ground bus or plane 82 and a cathode connected to the thick and wide power bus or plane 81P.

Referring to FIGS. 12B-12D, 13B, 13C and 14B-14D, the shape of the openings 511, 512, 514, 521, 522, 524, 549 and 549' in the passivation layer 5 from a top perspective view may be round, square, rectangular or polygon. If the openings 511, 512, 514, 521, 522, 524, 549 and 549' are round, the openings 511, 512, 514, 521, 522, 524, 549 and 549' may have a diameter of between 0.1 and 200 microns, between 1 and 100 microns, or, preferably, between 0.1 and 30 microns. If the openings 511, 512, 514, 521, 522, 524, 549 and 549' are square, the openings 511, 512, 514, 521, 522, 524, 549 and 549' may have a width of between 0.1 and 200 microns, between 1 and 100 microns, or, preferably, between 0.1 and 30 microns. If the openings 511, 512, 514, 521, 522, 524, 549 and 549' are rectangular, the openings 511, 512, 514, 521, 522, 524, 549 and 549' may have a width of between 0.1 and 200 microns, between 1 and 100 microns, or, preferably, between 0.1 and 30 microns, and a length of between 1 micron and 1 centimeter. If the openings 511, 512, 514, 521, 522, 524, 549 and 549' are polygon having more than five sides, the openings 511, 512, 514, 521, 522, 524, 549 and 549' have a largest diagonal length of between 0.1 and 200 microns, between 1 and 100 microns, or, preferably, between 0.1 and 30 microns. Alternatively, the openings 511, 512, 514, 521, 522, 524, 549 and 549' have a largest transverse dimension of between 0.1 and 200 microns, between 1 and 100 microns, or, preferably, between 0.1 and 30 microns. In a case shown in FIG. 14D, the openings 511, 512, 514 and 549 have a width of between 0.1 and 30 microns, with the lower portion of the openings 9511, 9512, 9514 and 9549 in the polymer layer 95 having a width of between 20 and 100 microns. The openings 9511, 9512 and 9514 in the polymer layer 95 have lower portions having widths or transverse dimensions larger than those of the openings 511, 512 and 514 in the passivation layer 5 aligned with the openings 9511, 9512 and 9514, respectively. The openings 9511, 9512 and 9514 in the polymer layer 95 further expose the passivation layer 5 close to the openings 511, 512 and 514. The polymer layer 95 covers the peripheral region of the contact pad exposed by the opening 549 in the passivation layer 5, but the opening 9549 in the polymer layer 95 exposes the center region of the contact pad exposed by the openings 549 in the passivation layer 5. The width or transverse dimension of the opening 549 in the passivation layer 5 is larger than that of the opening 9549.

In FIGS. 12B-12D, a dotted line 5 indicates the passivation layer, coarse traces indicate traces of an over-passivation scheme 102 formed over the passivation layer 5, and fine traces indicate traces formed under the passivation layer 5. In FIGS. 13B and 13C, coarse traces indicate the traces of the over-passivation scheme 102 formed over the passivation layer 5, and fine traces indicate the traces formed under the passivation layer 5. The over-passivation scheme 102 shown in FIG. 14B includes the polymer layer 99 and the metal trace 81P provided by the patterned circuit layer 811, and the opening 9949 in the polymer layer 99 is over the contact point 8110 of the metal trace 81P and exposes it. The over-passivation scheme 102 shown in FIG. 14C includes the polymer layers 98 and 99, the metal trace 81P provided by the patterned circuit layer 812, and the metal trace 82 provided by the patterned circuit layer 821, and the opening 9849' in the polymer layer 98 is over the metal trace 82, and the opening 9949' in the polymer layer 99 is over the contact point 8120 of the patterned circuit layer 812 and exposes it. The over-passivation scheme 102 shown in FIG. 14D includes the polymer layers 95 and 99 and the metal trace 81P provided by the patterned circuit layer 811, and the openings 9549, 9511, 9512 and 9514 are in the polymer layer 95, and the opening 9949 in the polymer layer 99 is over the contact point 8110 of the metal trace 81P and exposes it.

Formation of an Over-Passivation Scheme

A main characteristics of the over-passivation schemes in exemplary embodiments of this disclosure are thick metal layers each having a thickness larger than 1 micrometer, such as between 2 and 200 micrometers, and preferably between 2 and 30 micrometers, and thick dielectric layers each having a thickness larger than 2 micrometers, such as between 2 and 300 micrometers, and preferably between 2 and 30 micrometers.

FIGS. 15C-15H show an embossing process to fabricate a patterned circuit layer 801 over the passivation layer 5 and on the polymer layer 95, which can be applied to all embodiments in this disclosure. FIGS. 15I-15J show an embossing process to fabricate a patterned circuit layer 802 on the patterned circuit layer 801 and on the polymer layer 98, which can be applied to all embodiments in this disclosure. FIGS. 15C-15G and FIGS. 16A-16K show a double embossing process to fabricate one or more patterned circuit layers 801 and 802 over the passivation layer 5, which can be applied to all embodiments in this disclosure. A polymer layer 95 may be provided under the patterned circuit layer 801 and over the passivation layer 5. A polymer layer 98 may provided between the patterned circuit layers 801 and 802 and over the passivation layer 5. A polymer layer 19 may be provided over the patterned circuit layer 802 and over the passivation layer 5. FIGS. 15A-15M and FIGS. 16A-16M are based on the structure of FIG. 10E in the third embodiment, and are used as examples to illustrate methods for forming the over-passivation scheme for all embodiments in this disclosure. In other words, the methods described and the specification specified in the following paragraphs can be applied to all metal traces, buses or planes 81, 81P, 82, 83, 83' and 85 and all metal layers 811, 821, 831, 812 and 832 in this disclosure.

FIG. 15A shows a starting material for the over-passivation process. The over-passivation process starts on a wafer 10 finalized to be cut into chips after the over-passivation scheme of the top post-passivation technology is formed on the wafer 10.

The semiconductor wafer 10 includes elements, as follows:

Reference number of 1 indicates a substrate, usually a silicon substrate, having a thickness between 600 and 1000 micrometers, between 50 micrometers and 1 millimeter or between 75 and 250 micrometers. The silicon substrate can be an intrinsic, a p-type, or an n-type silicon substrate. For a high performance chip, a SiGe or Silicon-On-Insulator (SOI) substrate can be used. A SiGe substrate includes an epitaxial layer on the surface of a silicon substrate. An SOI substrate includes an insulating layer (exemplary silicon oxide) on a silicon substrate, and a Si or SiGe epitaxial layer formed over the insulating layer.

Reference number of 2 indicates a device layer, usually a semiconductor device, in and/or on the substrate 1. The semiconductor device includes an MOS transistor 2', either an n-MOS or a p-MOS transistor. The MOS transistor includes a gate (usually a poly-silicon, a tungsten poylcide, a tungsten silicide, titanium silicide, cobalt silicide, or a salicide gate), a source, and a drain. Other devices are bipolar transistors, DMOS (Diffused MOS), LDMOS (Lateral Diffused MOS), CCD (Charged-Coupled Device), CMOS sensors, photo-sensitive diodes, resistors (formed by the polysilicon layer or the diffusion area in the silicon substrate). The devices form various circuits, such as CMOS circuits, NMOS circuits, PMOS circuits, BiCMOS circuits, CMOS sensor circuits, DMOS power circuits, or LDMOS circuits. The layer includes the internal circuits 20 (including 21, 22, 23 and 24) in all embodiments; the voltage regulator or converter circuit 41 in the first embodiment; the off-chip circuit 40 (including 42 and 43) in the third embodiment, and the ESD circuit 44 in the fourth embodiment.

Reference number of 6 indicates a fine-line scheme, including fine-line metal layers 60 and fine-line via plugs 60' in vias 30' of fine-line dielectric layers 30. The fine-line scheme 6 includes fine-line metal traces in all embodiments of this disclosure: (1) 611, 612, 614, 619, 619', 621, 622, 624 and 629 of the first embodiment; (2) 631, 632 and 634 of the second embodiment; (3) 631, 632, 634, 639, 639', 6391, 6391', 6311, 6321 and 6341 of the third embodiment; (4) 611, 612, 614, 649, 621, 622, 624 and 649' of the fourth embodiment. The fine-line metal layers 60 can be aluminum or copper layers, or more specifically, sputtered aluminum layers or damascene copper layers. The fine-line metal layers 60 can be (1) all fine-line metal layers are aluminum layers, (2) all fine-line metal layers are copper layers, (3) the bottom layers are aluminum layers and the top layers are copper layer, or (4) the bottom layers are copper layers and the top layers are aluminum layers. The fine-line metal layers 60 may have a thickness between 0.05 and 2 micrometers, and preferably between 0.2 and 1 micrometers, with horizontal design rules (the width) of lines or traces smaller than 1 micrometer, such as between 0.05 and 0.95 micrometers, or larger than 20 nanometers, such as between 20 nanometers and 15 micrometers, and preferably between 20 nanometers and 2 micrometers. The aluminum layer is usually formed by a suitable process or processes, e.g., by a physical vapor deposition (PVD) method, such as the sputtering method, and then patterned by depositing a photoresist layer with thickness between 0.1 and 4 micrometers, and preferably 0.3 and 2 micrometers, followed by a wet or dry etching, exemplary dry plasma etch (usually containing fluorine plasma). As an option, an adhesion/barrier (Ti, TiW, TiN or a composite layer of above metals) may be added under the aluminum layer, and/or an anti-reflection layer (TiN) may be also added over the aluminum layer. The vias 30' are optionally filled with blanketed CVD tungsten deposition, followed by a chemical mechanical polishing (CMP) of the tungsten metal layer to form via plugs 60'. The copper layer is usually formed by a suitable process or processes, e.g., by a damascene process including an electroplating process as follows: (1) depositing a copper diffusion barrier layer (such as oxynitride or nitride layer of thickness between 0.05 and 0.25 μm); (2) depositing a dielectric layer 30 of a thickness between 0.1 and 2.5 μm, exemplary between 0.3 and 1.5 μm by PECVD, spin-on coating, and/or High-Density Plasma (HDP) CVD methods; (3) patterning the dielectric layer 30 by depositing a photoresist layer with a thickness between 0.1 and 4 μm, and preferably between 0.3 and 2 μm, then exposing and developing the photoresist layer to form openings and/or trenches, and then stripping the photoresist layer; (4) depositing an adhesion/barrier layer and an electroplating seed layer by sputtering and/or CVD methods. The adhesion/barrier layer includes Ta, TaN, TiN, Ti or TiW or a composite layer formed by a suitable process or processes, e.g., by above materials. The electroplating seed layer, formed on the adhesion/barrier layer, is usually a copper layer formed by a suitable process or processes, e.g., by sputtering Cu or CVD copper or a CVD Cu followed by a sputtering Cu; (5) electroplating a copper layer over the electroplating seed layer to a thickness smaller than 1 micrometer, such as between 0.05 and 1 micrometers, and preferably between 0.2 and 1 micrometers; (6) removing the electroplated copper layer, the electroplating seed layer and the adhesion/barrier layer not in the openings or trenches of the dielectric layer 30 by polishing (exemplary chemical mechanical polishing, CMP) the wafer until the dielectric layer underlying the adhesion/barrier layer exposed. Only the metals in the openings or trenches remain after CMP; and the remained metals are used as metal conductors (lines, traces and/or planes) or via plugs 60' connecting two adjacent metal layers 60. As another alternative, a double-damascene process is used to form metal via plugs and metal traces, lines, or planes simultaneously with one electroplating process, one CMP process. Two photolithography processes, and two dielectric depositing processes are applied in the double-damascene process. The double-damascene process adds more process steps of deposing and patterning another layer of dielectrics between step (3) of patterning a dielectric layer and step (4) of depositing the metal layer in the above single damascene process. The dielectric layer 30 is formed by a suitable process or processes, e.g., by CVD (Chemical Vapor Deposition), PECVD (Plasma-Enhanced CVD), High-Density-Plasma (HDP) CVD, or a spin-on method. The materials of dielectric layers 30 include layers of silicon oxide, silicon nitride, silicon oxynitride, PECVD TEOS, Spin-On Glass (SOG, silicate-based or siloxane-based), Fluorinated Silicate Glass (FSG), or a low-K dielectric material such as Black Diamond (generated by machines of Applied Materials, Inc.), or ULK CORAL (generated by machines of Novellus Inc.), or SiLK (of IBM Corp.) low k dielectrics. The PECVD silicon oxide or PECVD TEOS or HDP oxide has a dielectric constant K between 3.5 and 4.5; the PECVD FSG or HDP FSG has a K value between 3.0 and 3.5, and the low K dielectric material has a K value between 1.5 and 3.0. The low K dielectric material, such as Black Diamond, is porous, and includes hydrogen and carbon in addition to silicon and oxygen, the formula is $H_wC_xSi_yO_z$. The fine-line dielectric layers 30 usually include inorganic materials. The dielectric layers 30 may have a thickness between 0.05 and 2 micrometers. The vias 30' in the dielectric layer 30 is formed by a suitable process or processes, e.g., by wet and/or dry etching with photoresist patterning, exemplary dry etching. The dry etch species include fluorine plasma.

Reference number of 5 indicates a passivation layer. The passivation layer 5 plays a very important role in this disclosure. The passivation layer 5 is an insulating, protective layer that prevents mechanical and chemical damage during assembly and packaging. In addition to preventing mechanical scratch, it prevents the penetration of mobile ions, such as sodium, and transition metal, such as gold or copper, into the underlying IC devices. It also protects the underlying devices and interconnection (metals and dielectrics) from moisture penetration or other containments. The passivation layer 5 can be formed by a suitable process or processes, e.g., by a chemical vapor deposition (CVD) method, and typically has a thickness larger than 0.2 micrometers, such as between 0.3 and 1.5 micrometers or between 0.4 and 0.8 micrometers.

The passivation layer 5 can be composed of one or more inorganic layers. For example, the passivation layer 5 can be a composite layer of an oxide layer, such as silicon-oxide layer or silicon-oxycarbide (SiOC) layer, having a thickness smaller than 1.5 micrometers, such as between 0.1 and 1 micrometers, and preferably between 0.3 and 0.7 micrometers, and a nitride layer, such as silicon-nitride layer, silicon-oxynitride layer or silicon-carbon-nitride (SiCN) layer, having a thickness smaller than 1.5 micrometers, such as between 0.25 and 1.2 micrometers, and preferably between 0.35 and 1 micrometers, on the oxide layer. Alternatively, the passivation layer 5 can be a single layer of silicon nitride, silicon oxynitride or silicon carbon nitride (SiCN) having a thickness smaller than 1.5 micrometers, such as between 0.2 and 1.5 micrometers, and preferably between 0.3 and 1 micrometers. In a exemplary case, the passivation layer 5 includes a topmost inorganic layer of the semiconductor wafer 10, and the topmost inorganic layer of the semiconductor wafer 10 can be a silicon-nitride layer having a thickness larger than 0.2 micrometers, such as between 0.2 and 1.5 micrometers, or a silicon-oxide layer having a thickness larger than 0.2 micrometers, such as between 0.2 and 1.5 micrometers. Alternatively, the passivation layer 5 can be a composite layer of an oxynitride layer with a thickness smaller than 1 micrometer, such as between 0.05 and 0.35 micrometers, and preferably between 0.1 and 0.2 micrometers, a first oxide layer with a thickness smaller than 1.2 micrometers, such as between 0.2 and 1.2 micrometers, and preferably between 0.3 and 0.6 micrometers, on the oxynitride layer, a nitride layer, such as silicon-nitride layer, with a thickness smaller than 1.2 micrometers, such as between 0.2 and 1.2 micrometers, and preferably between 0.3 and 0.5 micrometers, on the first oxide layer, and a second oxide layer with a thickness smaller than 1.2 micrometers, such as between 0.2 and 1.2 micrometers, and preferably between 0.3 and 0.6 micrometers, on the nitride layer. The first and second oxide layers can be PECVD silicon oxide, PETEOS oxide or high-density plasma (HDP) oxide.

The above description and specification for the substrate 1, the device layer 2, the fine-line metal scheme 6, the dielectric layers 30 and the passivation layer 5 can be applied to all embodiments in this disclosure.

Openings 50 are formed in the passivation layer 5 by an etching process, such as a wet etching process or a dry etching process. The specification of the openings 50 and the process of forming the same can be applied to openings 511, 512, 514, 519, 519', 521, 522, 524, 529, 531, 532, 534, 534', 531', 532', 539, 539', 549, 549', 559 and 559' in this disclosure. The width of the opening 50 can be larger than 0.1 micrometers, such as between 0.1 and 200 micrometers, between 1 and 100 micrometers, between 0.5 and 30 micrometers or between 5 and 30 micrometers. The shape of the opening 50 from a top view may be a circle, and the diameter of the circle-shaped opening 50 may be larger than 0.1 micrometers, such as between 0.1 and 30 micrometers or between 30 and 200 micrometers. Alternatively, the shape of the opening 50 from a top view may be a square, and the width of the square-shaped opening 50 may be larger than 0.1 micrometers, such as between 0.1 and 30 micrometers or between 30 and 200 micrometers. Alternatively, the shape of the opening 50 from a top view may be a polygon, such as hexagon or octagon, and the polygon-shaped opening 50 may have a width larger than 0.1 micrometers, such as between 0.1 and 30 micrometers or between 30 and 200 micrometers. Alternatively, the shape of the opening 50 from a top view may be a rectangle, and the rectangle-shaped opening 50 may have a shorter width larger than 0.1 micrometers, such as between 0.1 and 30 micrometers or between 30 and 200 micrometers. The width of the openings 531, 532, 534, 531', 532', 534', 511, 512 and 514 in the passivation layer 5 for the internal circuits 20 (including 21, 22, 23 and 24) may be larger than 0.1 micrometers, such as between 0.1 and 100 micrometers, and preferably between 0.1 and 30 micrometers. The openings 519, 519' and 529 for the voltage regulator or converter circuit 41, the openings 539 and 539' for the off-chip buffer 42 and the off-chip ESD circuit 43, and the openings 549, 549', 559 and 559' for the ESD circuit 44 may have a width larger than those of the openings 531, 532, 534, 511, 512 and 514, in a range between 1 and 150 micrometers, and preferably between 5 and 100 micrometers. Alternatively, the openings 519, 519' and 529 for the voltage regulator or converter circuit 41, the openings 539 and 539' for the off-chip buffer 42 and the off-chip ESD circuit 43, and the openings 549, 549', 559 and 559' for the ESD circuit 44 may have a width larger than those of the openings 531, 532 and 534, in a range between 0.1 and 30 micrometers. The openings 50 in the passivation layer 5 are over multiple regions of multiple metal pads or traces 600 of the fine-line metal layers 60 and expose them, and the regions of the metal pads or traces 600 are at bottoms of the openings 50. The metal pads or traces 600 may include aluminum or electroplated copper.

The wafer 10 can be fabricated using different generations of IC process technologies, such as 1 μm, 0.8 μm, 0.6 μm, 0.5 μm, 0.35 μm, 0.25 μM, 0.18 μm, 0.25 μm, 0.13 μm, 90 nm, 65 nm, 45 nm, 35 nm or 25 nm technologies, defined by the gate length or effective channel length of the MOS transistors 2'. The wafer 10 can be processed using photolithography process. The photolithography process can include coating, exposing and developing the photoresist. The photoresist used to process the wafer 10 has a thickness between 0.1 and 4 micrometers. A stepper or a scanner, e.g., a 5× stepper or scanner) can be used to expose the photoresist. The 5× means that the dimension on a photo mask (usual made of quartz) is reduced on the wafer when light beam is projected from the photo mask onto the wafer, and the dimension of a feature on the photo mask is 5 times of the dimension on the wafer. The scanner is used in advanced generations of IC process technologies, and is usually with 4× dimension reduction to improve the resolution. The wavelength of the light beam used in the stepper or the scanner can be 436 nm (g-line), 365 nm (i-line), 248 nm (Deep Ultraviolet, DUV), 193 nm (DUV), or 157 nm (DUV), or 13.5 nm (Extreme UV, EUV). The high-index immersion photolithography is also used to achieve fine-line features in the wafer 10.

The wafer 10 is preferably processed in a clean room with Class 10 or better, for example Class 1. A Class 10 clean room allows maximum number of particles per cubic foot: 1 larger than 1 μm, 10 larger than 0.5 μm, 30 larger than 0.3 μm, 75 larger than 0.2 μm, 350 larger than 0.1 μm, while a Class 1 clean room allows maximum number of particles per cubic foot: 1 larger than 0.5 μm, 3 larger than 0.3 μm, 7 larger than 0.2 μm, 35 larger than 0.1 μm.

When copper is used as the fine-line metal layers 60, and exposed by the openings 50 in the passivation layer 5, a metal cap 66, including 661, 662, 664, 669 and 669', is preferably used to protect the exposed copper pad or trace from corrosion as shown in FIG. 15B. The metal cap 66 having a thickness between 0.4 and 3 micrometers includes an aluminum-containing layer (such as aluminum layer, aluminum-copper alloy layer or Al—Si—Cu alloy layer), a gold layer, a Ti layer, a TiW layer, a Ta layer, a TaN layer, or a Ni layer. If the metal cap 66 is an aluminum-containing layer (such as aluminum layer, aluminum-copper alloy layer or Al—Si—Cu alloy layer), a barrier layer having a thickness between 0.01 and 0.7 micrometers is formed between the aluminum cap 66 and the copper pad or trace, and the barrier layer includes Ti, TiW, TiN, Ta, TaN, Cr or Ni. For example, a barrier layer having a thickness between 0.01 and 0.7 micrometers can be formed on the copper pad or trace exposed by the opening 50, and an aluminum-containing layer having a thickness between 0.4 and 3 micrometers is formed on the barrier layer, and the barrier layer may be made of titanium, a titanium-tungsten alloy, titanium nitride, tantalum, tantalum nitride, chromium or alloy of refractory metal, and the aluminum-containing layer may be an aluminum layer, an aluminum-copper alloy layer or an Al—Si—Cu alloy layer. The wafer or chip with metal caps 66 can be used as options in all embodiments in this disclosure.

FIGS. 15C-15K show process steps of fabricating an over-passivation scheme 102 over the wafer 10 shown in FIG. 15A or FIG. 15B. The process steps shown in FIGS. 15C-15K are used to form the structure shown in FIG. 10E, for example, with two layers of over-passivation metals, and with complete design architecture for interconnecting the internal circuits 20 and off-chip circuits 40. This example shows two over-passivation metal layers, while one metal layer, three metal layers, four metal layers or more metal layers over the passivation layer 5 can be formed using the same or similar methods, and the same or similar specification described in FIGS. 15C-15K. In other words, the following description and specification apply to all embodiments in this disclosure.

Referring to FIG. 15K, the over-passivation scheme 102 can be formed over the wafer 10 described in FIG. 15A or FIG. 15B. The over-passivation scheme 102 includes over-passivation metals 80 and over-passivation polymers or insulators 90. The over-passivation metals 80 include one, two, three, four or more metal layers. In the example of including two metal layers, the over-passivation metals 80 include a first metal layer 801 and a second metal layer 802. The specification of the metal layer 801 and the process of forming the same can be applied to the metal layers 811, 821 and 831 in the disclosure, and the specification of the metal layer 802 and the process of forming the same can be applied to the metal layers 812 and 832 in the disclosure.

The metals used in the over-passivation metal layers 80 are mainly copper, gold, silver, palladium, rhodium, platinum, ruthenium, and nickel. The metal line, trace, or plane in the over-passivation metal scheme 80 usually includes composite layers of metals in a stack. The cross-section in FIG. 15K shows two composite layers 8001 and 8002 in each of the over-passivation metal layers 80, which can be applied to as the two composite layers 8111 and 8112 of the patterned circuit layer 811, respectively, as the two composite layers 8211 and 8212 of the patterned circuit layer 821, respectively, as the two composite layers 8121 and 8122 of the patterned circuit layer 812, respectively, as the two composite layers 8311 and 8312 of the patterned circuit layer 831, respectively, and as the two composite layers 8321 and 8322 of the patterned circuit layer 832, respectively.

The bottom layer of each over-passivation metal layers 80 is an adhesion/barrier/seed layer 8001 (including 8011 and 8021), including an adhesion/barrier layer (not shown) and a seed layer (not shown) on the adhesion/barrier layer. The specification of the adhesion/barrier/seed layers 8001 (including 8011 and 8021) and the process of forming the same can be applied to the adhesion/barrier/seed layers 8111, 8121, 8211, 8311 and 8321. The top layer of each over-passivation metal layers 80 is a bulk metal layer 8002, including 8012 and 8022. The specification of the bulk metal layers 8002 (including 8012 and 8022) and the process of forming the same can be applied to the bulk metal layers 8112, 8122, 8212, 8312 and 8322.

The material of the adhesion/barrier layer at the bottom of the adhesion/barrier/seed layer 8001 can be Ti (titanium), W, Co, Ni, TiN (titanium nitride), TiW (titanium-tungsten alloy), V, Cr (chromium), Cu, CrCu, Ta (tantalum), TaN (tantalum nitride), or alloy or composite layer of above materials. The adhesion/barrier layer can be formed by a suitable process or processes, e.g., by electroplating, electroless plating, chemical vapor deposition (CVD), or PVD (such as sputtering or evaporation), exemplary deposited by PVD (physical vapor deposition) such as metal sputtering process. The thickness of the adhesion/barrier layer is smaller than 1 micrometer, such as between 0.02 and 0.8 micrometers, and preferably between 0.05 and 0.5 micrometers.

For example, the adhesion/barrier layer at the bottom of the adhesion/barrier/seed layer 8011 may be formed by a suitable process or processes, e.g., by sputtering a titanium layer with a thickness between 0.02 and 0.8 micrometers, and preferably between 0.05 and 0.5 micrometers, on the polymer layer 95 and on the pads, principally made of aluminum, exposed by openings 950 in the polymer layer 95. Alternatively, the adhesion/barrier layer at the bottom of the adhesion/barrier/seed layer 8011 may be formed by a suitable process or processes, e.g., by sputtering a titanium-tungsten-alloy layer with a thickness of between 0.02 and 0.8 μm, and preferably of between 0.05 and 0.5 μm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by a suitable process or processes, e.g., by sputtering a titanium-nitride layer with a thickness of between 0.02 and 0.8 μm, and preferably of between 0.05 and 0.5 μm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by a suitable process or processes, e.g., by sputtering a chromium layer with a thickness of between 0.02 and 0.8 μm, and preferably of between 0.05 and 0.5 μm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by a suitable process or processes, e.g., by sputtering a tantalum-nitride layer with a thickness of between 0.02 and 0.8 μm, and preferably of between 0.05 and 0.5 μm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by a suitable process or processes, e.g., by sputtering a tantalum layer with a thickness of between 0.02 and 0.8 μm, and preferably of between 0.05 and 0.5 μm, on the polymer layer 95 and on the pads, principally made of aluminum, exposed by the openings 950 in the polymer layer 95.

For example, the adhesion/barrier layer at the bottom of the adhesion/barrier/seed layer 8011 may be formed by a suitable process or processes, e.g., by sputtering a titanium layer with a thickness of between 0.02 and 0.8 μm, and preferably of between 0.05 and 0.5 μm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by a suitable process or processes, e.g., by sputtering a titanium-tungsten-alloy layer with a thickness of between 0.02 and 0.8 μm, and preferably of between 0.05 and 0.5 μm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by a suitable process or processes, e.g., by sputtering a titanium-nitride layer with a thickness of between 0.02 and 0.8 μm, and preferably of between 0.05 and 0.5 μm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by a suitable process or processes, e.g., by sputtering a chromium layer with a thickness of between 0.02 and 0.8 μm, and preferably of between 0.05 and 0.5 μm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by a suitable process or processes, e.g., by sputtering a tantalum-nitride layer with a thickness of between 0.02 and 0.8 μm, and preferably of between 0.05 and 0.5 μm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by a suitable process or processes, e.g., by sputtering a tantalum layer with a thickness of between 0.02 and 0.8 μm, and preferably of between 0.05 and 0.5 μm, on the polymer layer 95 and on the pads, principally made of copper, exposed by the openings 950 in the polymer layer 95.

For example, the adhesion/barrier layer at the bottom of the adhesion/barrier/seed layer 8011 may be formed by a suitable process or processes, e.g., by sputtering a titanium layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by a suitable process or processes, e.g., by sputtering a titanium-tungsten-alloy layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads. Alternatively, the adhesion/barrier layer at the bottom of the adhesion/barrier/seed layer 8011 may be formed by a suitable process or processes, e.g., by sputtering a titanium-nitride layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by a suitable process or processes, e.g., by sputtering a chromium layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads. Alternatively, the adhesion/barrier layer at the bottom of the adhesion/barrier/seed layer 8011 may be formed by a suitable process or processes, e.g., by sputtering a tantalum-nitride layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by a suitable process or processes, e.g., by sputtering a tantalum layer with a thickness of between 0.02 and 0.8 μm, and preferably of between 0.05 and 0.5 μm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads.

For example, the adhesion/barrier layer at the bottom of the adhesion/barrier/seed layer 8021 may be formed by a suitable process or processes, e.g., by sputtering a titanium layer with a thickness of between 0.02 and 0.8 μm, and preferably of between 0.05 and 0.5 μm, on a polymer layer 98 and on a gold layer of the conduction bulk layer 8012 exposed by openings 980 in the polymer layer 98. Alternatively, the adhesion/barrier layer at the bottom of the adhesion/barrier/seed layer 8021 may be formed by a suitable process or processes, e.g., by sputtering a titanium-tungsten-alloy layer with a thickness of between 0.02 and 0.8 μm, and preferably of between 0.05 and 0.5 μm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a titanium-nitride layer with a thickness of between 0.02 and 0.8 μm, and preferably of between 0.05 and 0.5 μm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a chromium layer with a thickness of between 0.02 and 0.8 μm, and preferably of between 0.05 and 0.5 μm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a tantalum-nitride layer with a thickness of between 0.02 and 0.8 μm, and preferably of between 0.05 and 0.5 μm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a tantalum layer with a thickness of between 0.02 and 0.8 μm, and preferably of between 0.05 and 0.5 μm, on the polymer layer 98 and on the gold layer of the conduction bulk layer 8012 exposed by the openings 980 in the polymer layer 98.

For example, the adhesion/barrier layer at the bottom of the adhesion/barrier/seed layer 8021 may be formed by a suitable process or processes, e.g., by sputtering a titanium layer with a thickness of between 0.02 and 0.8 μm, and preferably of between 0.05 and 0.5 μm, on a polymer layer 98 and on a copper layer of the conduction bulk layer 8012 exposed by multiple openings 980 in the polymer layer 98. Alternatively, the adhesion/barrier layer at the bottom of the adhesion/barrier/seed layer 8021 may be formed by a suitable process or processes, e.g., by sputtering a titanium-tungsten-alloy layer with a thickness of between 0.02 and 0.8 μm, and preferably of between 0.05 and 0.5 μm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a titanium-nitride layer with a thickness of between 0.02 and 0.8 μm, and preferably of between 0.05 and 0.5 μm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a chromium layer with a thickness of between 0.02 and 0.8 μm, and preferably of between 0.05 and 0.5 μm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a tantalum-nitride layer with a thickness of between 0.02 and 0.8 μm, and preferably of between 0.05 and 0.5 μm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by a suitable process or processes, e.g., by sputtering a tantalum layer with a thickness of between 0.02 and 0.0.8 μm, and preferably of between 0.05 and 0.5 μm, on the polymer layer 98 and on the copper layer of the conduction bulk layer 8012 exposed by the openings 980 in the polymer layer 98.

The seed layer at the top of the adhesion/barrier/seed layer 8001, for the subsequent electroplating process, usually formed by a suitable process or processes, e.g., by electroplating, electroless, CVD, or PVD (such as sputtering), exemplary deposited by PVD such as metal sputtering process. The material used for the seed layer, usually made of the same metal material as the conduction bulk metal formed in the subsequent electroplating process, can be Au, Cu, Ag, Ni, Pd, Rh, Pt or Ru. The material of the seed layer varies with the material of the electroplated metal layer formed on the seed layer. When a gold layer is to be electroplated on the seed layer, gold is a preferable material to the seed layer. When a copper layer is to be electroplated on the seed layer, copper is a preferable material to the seed layer. The thickness of the electroplating seed layer is between 0.05 and 1.2 μm, exemplary between 0.05 and 0.8 μm.

For example, when the adhesion/barrier layer at the bottom of the adhesion/barrier/seed layer 8001 is formed by a suitable process or processes, e.g., by sputtering a titanium layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.2 μm, and preferably of between 0.05 and 0.8 μm, on the titanium layer. When the adhesion/barrier layer at the bottom of the adhesion/barrier/seed layer 8001 is formed by a suitable process or processes, e.g., by sputtering a titanium-tungsten-alloy layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.2 μm, and preferably of between 0.05 and 0.8 μm, on the titanium-tungsten-alloy layer. When the adhesion/barrier layer at the bottom of the adhesion/barrier/seed layer 8001 is formed by a suitable process or processes, e.g., by sputtering a titanium-nitride layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.2 μm, and preferably of between 0.05 and 0.8 μm, on the titanium-nitride layer. When the adhesion/barrier layer at the bottom of the adhesion/barrier/seed layer 8001 is formed by a suitable process or processes, e.g., by sputtering a chromium layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.2 μm, and preferably of between 0.05 and 0.8 μm, on the chromium layer. When the adhesion/barrier layer at the bottom of the adhesion/barrier/seed layer 8001 is formed by a suitable process or processes, e.g., by sputtering a tantalum-nitride layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.4 μm, and preferably of between 0.05 and 0.8 μm, on the tantalum-nitride layer. When the adhesion/barrier layer at the bottom of the adhesion/barrier/seed layer 8001 is formed by a suitable process or processes, e.g., by sputtering a tantalum layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a gold layer with a thickness of between 0.05 and 1.2 μm, and preferably of between 0.05 and 0.8 μm, on the tantalum layer.

For example, when the adhesion/barrier layer at the bottom of the adhesion/barrier/seed layer 8001 is formed by a suitable process or processes, e.g., by sputtering a titanium layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.8 μm, on the titanium layer. When the adhesion/barrier layer at the bottom of the adhesion/barrier/seed layer 8001 is formed by a suitable process or processes, e.g., by sputtering a titanium-tungsten-alloy layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.8 μm, on the titanium-tungsten-alloy layer. When the adhesion/barrier layer at the bottom of the adhesion/barrier/seed layer 8001 is formed by a suitable process or processes, e.g., by sputtering a titanium-nitride layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.8 μm, on the titanium-nitride layer. When the adhesion/barrier layer at the bottom of the adhesion/barrier/seed layer 8001 is formed by a suitable process or processes, e.g., by sputtering a chromium layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.8 μm, on the chromium layer. When the adhesion/barrier layer at the bottom of the adhesion/barrier/seed layer 8001 is formed by a suitable process or processes, e.g., by sputtering a tantalum-nitride layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.4 μm, on the tantalum-nitride layer. When the adhesion/barrier layer at the bottom of the adhesion/barrier/seed layer 8001 is formed by a suitable process or processes, e.g., by sputtering a tantalum layer with a thickness of between 0.02 and 0.8 μm, and preferably of between 0.05 and 0.5 μm, the seed layer at the top of the adhesion/barrier/seed layer 8001 can be formed by a suitable process or processes, e.g., by sputtering a copper layer with a thickness of between 0.05 and 1.2 μm, and preferably of between 0.05 and 0.8 μm, on the tantalum layer.

The conduction bulk layer 8002 is formed for the low resistance conduction, usually formed by a suitable process or processes, e.g., by electroplating, with a thickness between 2 and 100 μm, exemplary between 3 and 20 μm. The metal material of the conduction bulk layer 8002, formed by a suitable process or processes, e.g., by a process including an electroplating process or an electroless plating process, includes Au, Cu, Ag, Ni, Pd, Rh, Pt or Ru.

For example, the conduction bulk layer 8002 may be formed by a suitable process or processes, e.g., by electroplating a gold layer with a thickness of between 2 and 100 μm, and preferably of between 3 and 20 μm, on the seed layer, made of gold, at the top of the adhesion/barrier/seed layer 8001. Alternatively, the conduction bulk layer 8002 may be formed by a suitable process or processes, e.g., by electroplating a copper layer with a thickness of between 2 and 100 μm, and preferably of between 3 and 20 μm, on the seed layer, made of copper, at the top of the adhesion/barrier/seed layer 8001. Alternatively, the conduction bulk layer 8002 may be formed by a suitable process or processes, e.g., by electroplating a copper layer with a thickness of between 1.5 and 90 μm, and preferably of between 2.5 and 10 μm, on the seed layer, made of copper, at the top of the adhesion/barrier/seed layer 8001, and then electroplating a gold layer with a thickness of between 0.5 and 10 μm on the copper layer, and the thickness of the copper layer and the gold layer is between 2 and 100 μm, and preferably of between 3 and 20 μm. Alternatively, the conduction bulk layer 8002 may be formed by a suitable process or processes, e.g., by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 30.8 μm, on the copper layer, and then electroplating a gold layer with a thickness of between 0.03 and 0.5 μm, and preferably of between 0.05 and 0.1 μm, on the nickel layer. Alternatively, the conduction bulk layer 8002 may be formed by a suitable process or processes, e.g., by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 30.8 μm, on the copper layer, and then electroless plating a gold layer with a thickness of between 0.03 and 0.5 μm, and preferably of between 0.05 and 0.1 μm, on the nickel layer. Alternatively, the conduction bulk layer 8002 may be formed by a suitable process or processes, e.g., by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroplating a palladium layer with a thickness of between 0.03 and 0.5 μm, and preferably of between 0.05 and 0.1 μm, on the nickel layer. Alternatively, the conduction bulk layer 8002 may be formed by a suitable process or processes, e.g., by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroless plating a palladium layer with a thickness of between 0.03 and 0.5 μm, and preferably of between 0.05 and 0.1 μm, on the nickel layer.

As an option, a cap/barrier metal layer (not shown) for protection or diffusion barrier purpose is added. The cap/barrier layer can be formed by a suitable process or processes, e.g., by electroplating, electroless plating, CVD or PVD sputtered metal, exemplary deposited by electroplating. The thickness of the cap/barrier layer is of a range between 0.05 and 50.8 μm, exemplary 0.5 and 3 μm. The cap/barrier layer can be a Ni, Co or V layer. As another option, an assembly-contact layer (not shown) over the conduction bulk metal layer 8002 and the cap/barrier layer (not shown) for assembly or packaging purpose, especially for the top-most metal layer of the over-passivation metals 80 (in one or more metal layers with polymer dielectric between two adjacent metal layers).

Openings 990 (including 9919 and 9929 in the first embodiment, 9939 and 9939' in the third embodiment, 9949 and 9949' in the fourth embodiment) in the topmost polymer layer 99 expose the contact points 8000 (including the contact points 8110 and 8120 in the first embodiment, the contact points 8310 and 8320 in the third embodiment, and the contact points 8110 and 8120 in the fourth embodiment) of the topmost over-passivation metal layer. The assembly-contact metal layer is wirebondable and/or solder wettable used for wirebonding, gold connection, solder ball mounting, and/or solder connection. The assembly-contact metal layer can be Au, Ag, Pt, Pd, Rh or Ru. Joining to the assembly-contact metal layer exposed by the polymer openings 900 can be a bonding wire, a solder ball (solder ball mounting), a metal ball (metal ball mounting), a metal bumps on the other substrate or chip, a gold bump on the other substrate or chip, a metal post on the other substrate or chip, a copper post on the other substrate or chip.

The over-passivation metal lines, traces or planes can be, as some examples, one of the following stacks, from bottom to top: (1) TiW/sputtered seed Au/electroplated Au, (2) Ti/sputtered seed Au/electroplated Au, (3) Ta/sputtered seed Au/electroplated Au, (4) Cr/sputtered seed Cu/electroplated Cu, (5) TiW/sputtered seed Cu/electroplated Cu, (6) Ta/sputtered seed Cu/electroplated Cu, (7) Ti/sputtered seed Cu/electroplated Cu, (8) Cr, TiW, Ti or Ta/sputtered seed Cu/electroplated Cu/electroplated Ni, (9) Cr, TiW, Ti or Ta/sputtered seed Cu/electroplated Cu/electroplated Ni/electroplated Au, Ag, Pt, Pd, Rh or Ru, (10) Cr, TiW, Ti or Ta/sputtered seed Cu/electroplated Cu/electroplated Ni/electroless Au, Ag, Pt, Pd, Rh or Ru. Each of over-passivation metal layers 80 has thickness between 2 and 150 μm, exemplary between 3 and 20 μm, with horizontal design rules (the width) of over-passivation metal lines or traces between 1 and 200 μm, exemplary 2 and 50 μm. An over-passivation metal plane is also exemplary, particularly for power, or ground plane, with a width larger than 200 μm. The minimum space between two adjacent metal lines, traces and/or planes is between 1 and 500 μm, exemplary 2 and 150 μm.

In some application of this disclosure, the metal lines, traces or planes can only include sputtered aluminum with thickness between 2 and 6 μm, exemplary between 3 and 5 μm, with an optional adhesion/barrier layer (including Ti, TiW, TiN, Ta or TaN layer) under the aluminum layer.

Referring to FIG. 15L, as an option, a contact structure 89 can be formed on the contact point 8000, exposed by the opening 990, of the over-passivation metal scheme 80. The contact structure 89 can be a metal bump, a solder bump, a solder ball, a gold bump, a copper bump, a metal pad, a solder pad, a gold pad, a metal post, a solder post, a gold post or a copper post. The contact structure 89 may include metal layers 891 and 89*c*. The metal layer 891 under the metal layer 89*c* includes Au, Ti, TiW, TiN, Cr, Cu, CrCu, Ta, TaN, Ni, NiV, V or Co layer, or composite layers of the above materials. The exemplary stacks of the contact structure 89 (including metal layers 891 and 89*c*), from the bottom to the top are (1) Ti/Au pad (Au layer thickness 1-10 μm), (2) TiW/Au pad (Au layer thickness 1-10 μm), (3) Ni/Au pad (Ni layer thickness 0.5-10 μm, Au layer thickness 0.2-10 μm), (4) Ti/Au bump (Au layer thickness 7-40 μm), (5) TiW/Au bump (Au layer thickness 7-40 μm), (6) Ni/Au bump (Ni layer thickness 0.5-10 μm, Au layer thickness 7-40 μm), (7) Ti, TiW or Cr/Cu/Ni/Au pad, (copper layer thickness 0.1-10 μm, Au layer thickness 0.2-10 μm), (8) Ti, TiW, Cr, CrCu or NiV/Cu/Ni/Au bump, (copper layer thickness 0.1-10 μm, Au layer thickness 7-40 μm), (9) Ti, TiW, Cr, CrCu or NiV/Cu/Ni/solder pad, (copper layer thickness 0.1-10 μm, solder layer thickness 0.2-30 μm), (10) Ti, TiW, Cr, CrCu or NiV/Cu/Ni/solder bump or solder ball, (copper layer thickness 0.1-10 μm, solder layer thickness 10-500 μm), (11) Ti, TiW, Cr, CrCu or NiV/Cu post, (copper layer thickness 10-300 μm), (11) Ti, TiW, Cr, CrCu or NiV/Cu post/Ni, (copper layer thickness 10-300 μm), (12) Ti, TiW, Cr, CrCu or NiV/Cu post/Ni/Solder (copper layer thickness 10-300 μm, solder layer thickness 1-20 μm), (13) Ti, TiW, Cr, CrCu or NiV/Cu post/Ni/Solder (copper layer thickness 10-300 μm, solder layer thickness 20-100 μm). The assembly methods can be wirebonding, TAB bonding, chip-on-glass (COG), chip-on-board (COB), flip chip on BGA substrate, chip-on-film (COF), chip-on-chip stack interconnection, chip-on-Si-substrate stack interconnection and etc.

For example, the contact structure 89 may be formed by a suitable process or processes, e.g., by sputtering a titanium-containing layer, such as titanium layer or titanium-tungsten-alloy layer, with a thickness between 0.02 and 0.8 μm, and preferably between 0.05 and 0.5 μm, on the polymer layer 99 and on the contact point 8000 of copper, nickel or gold exposed by the opening 990, then sputtering a seed layer, made of gold, with a thickness between 0.05 and 1.2 μm, and preferably between 0.05 and 0.8 μm, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a gold layer with a thickness between 1 and 10 μm on the seed layer exposed by the opening in the photoresist layer, then removing the developed photoresist layer using an organic solution with amide, then removing the residual polymeric material or other contaminants from the seed layer and from the gold layer with an $O_2$ plasma or a plasma containing fluorine of below 200 PPM and oxygen, then removing the seed layer not under the gold layer with a dry etching method or a wet etching method, and then removing the titanium-containing layer not under the gold layer with a dry etching method or a wet etching method. As to the wet etching method, the seed layer of gold can be etched with an iodine-containing solution, such as solution containing potassium iodide. When the titanium-containing layer is titanium layer, the titanium layer can be wet etched with a solution containing hydrogen fluoride. When the titanium-containing layer is titanium-tungsten-alloy layer, the titanium-tungsten-alloy layer can be wet etched with a solution containing hydrogen peroxide. As to the dry etching method, the seed layer of gold can be removed with an ion milling process or with an Ar sputtering etching process, and the titanium-containing layer can be etched with a chlorine-containing plasma etching process or with an RIE process. Accordingly, the metal layer 891 can be formed of the titanium-containing layer and the seed layer, made of gold, on the titanium-containing layer, and the metal layer 89*c* can be formed of gold that is on the seed layer of the metal layer 891.

For example, the contact structure 89 may be formed by a suitable process or processes, e.g., by sputtering a titanium-containing layer, such as titanium layer or titanium-tungsten-alloy layer, with a thickness of between 0.02 and 0.8 μm, and preferably of between 0.05 and 0.5 μm, on the polymer layer 99 and on the contact point 8000 of copper, nickel or gold exposed by the opening 990, then sputtering a seed layer, made of copper, with a thickness of between 0.05 and 1.2 μm, and preferably of between 0.05 and 0.8 μm, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a copper layer with a thickness of between 1 and 10 μm, and preferably of between 1 and 50.8 μm, on the seed layer exposed by the opening in the photoresist layer, then electroplating a nickel layer with a thickness of between 0.5 and 5 μm, and preferably of between 0.5 and 1 μm, on the copper layer in the opening, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the titanium-containing layer not under the copper layer with a dry etching method or a wet etching method, and then reflowing the tin-containing layer. As to the wet etching method, the seed layer of copper can be etched with a solution containing $NH_4OH$. When the titanium-containing layer is titanium layer, the titanium layer can be wet etched with a solution containing hydrogen fluoride. When the titanium-containing layer is titanium-tungsten-alloy layer, the titanium-tungsten-alloy layer can be wet etched with a solution containing hydrogen peroxide. As to the dry etching method, the seed layer of copper can be removed with an Ar sputtering etching process, and the titanium-containing layer can be etched with a chlorine-containing plasma etching process or with an RIE process. Accordingly, the metal layer 891 can be formed of the titanium-containing layer and the seed layer, made of copper, on the titanium-containing layer, and the metal layer 89*c* can be formed of the copper layer on the seed layer, the nickel layer on the copper layer, and the tin-containing layer on the nickel layer.

For example, the contact structure 89 may be formed by a suitable process or processes, e.g., by sputtering a chromium layer with a thickness of between 0.02 and 0.8 μm, and preferably of between 0.05 and 0.5 μm, on the polymer layer 99 and on the contact point 8000 of copper, nickel or gold exposed by the opening 990, then sputtering a seed layer, made of copper, with a thickness of between 0.05 and 1.2 μm, and preferably of between 0.05 and 0.8 μm, on the chromium layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a copper layer with a thickness of between 1 and 10 μm, and preferably of between 1 and 5 μm, on the seed layer exposed by the opening in the photoresist layer, then electroplating a nickel layer with a thickness of between 0.5 and 50.8 μm, and preferably of between 0.5 and 1 μm, on the copper layer in the opening, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the chromium layer not under the copper layer with a dry etching method or a wet etching method, and then reflowing the tin-containing layer. As to the wet etching method, the seed layer of copper can be etched with a solution containing $NH_4OH$, and the chromium layer can be etched with a solution containing potassium ferricyanide. As to the dry etching method, the seed layer of copper can be removed with an Ar sputtering etching process. Accordingly, the metal layer 891 can be formed of the chromium layer and the seed layer, made of copper, on the chromium layer, and the metal layer 89*c* can be formed of the copper layer on the seed layer, the nickel layer on the copper layer, and the tin-containing layer on the nickel layer.

For example, the contact structure 89 may be formed by a suitable process or processes, e.g., by sputtering a tantalum-containing layer, such as tantalum layer or tantalum-nitride layer, with a thickness of between 0.02 and 0.8 μm, and preferably of between 0.05 and 0.5 μm, on the polymer layer 99 and on the contact point 8000 of copper, nickel or gold exposed by the opening 990, then sputtering a seed layer, made of copper, with a thickness of between 0.05 and 1.2 μm, and preferably of between 0.05 and 0.4 μm, on the tantalum-containing layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a copper layer with a thickness of between 1 and 10 μm, and preferably of between 1 and 5 μm, on the seed layer exposed by the opening in the photoresist layer, then electroplating a nickel layer with a thickness of between 0.5 and 5 μm, and preferably of between 0.5 and 1 μm, on the copper layer in the opening, then electroplating a tin-containing layer, such as a tin-lead alloy, a tin-silver alloy or a tin-silver-copper alloy, with a thickness between 50 and 150 micrometers, and preferably between 80 and 130 micrometers, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the tantalum-containing layer not under the copper layer with a dry etching method or a wet etching method, and then reflowing the tin-containing layer. As to the wet etching method, the seed layer of copper can be etched with a solution containing $NH_4OH$. As to the dry etching method, the seed layer of copper can be removed with an Ar sputtering etching process. Accordingly, the metal layer 891 can be formed of the tantalum-containing layer and the seed layer, made of copper, on the tantalum-containing layer, and the metal layer 89*c* can be formed of the copper layer on the seed layer, the nickel layer on the copper layer, and the tin-containing layer on the nickel layer.

For example, the contact structure 89 may be formed by a suitable process or processes, e.g., by sputtering a titanium-containing layer, such as titanium layer or titanium-tungsten-alloy layer, with a thickness between 0.02 and 0.8 micrometers, and preferably between 0.05 and 0.5 micrometers, on the polymer layer 99 and on the contact point 8000 of copper, nickel or gold exposed by the opening 990, then sputtering a seed layer, made of copper, with a thickness between 0.05 and 1.2 micrometers, and preferably between 0.05 and 0.8 micrometers, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the titanium-containing layer not under the copper layer with a dry etching method or a wet etching method, and then reflowing the tin-containing layer. As to the wet etching method, the seed layer of copper can be etched with a solution containing $NH_4OH$. When the titanium-containing layer is titanium layer, the titanium layer can be wet etched with a solution containing hydrogen fluoride. When the titanium-containing layer is titanium-tungsten-alloy layer, the titanium-tungsten-alloy layer can be etched with a solution containing hydrogen peroxide. As to the dry etching method, the seed layer of copper can be removed with an Ar sputtering etching process, and the titanium-containing layer can be etched with a chlorine-containing plasma etching process or with an RIE process. Accordingly, the metal layer 891 can be formed of the titanium-containing layer and the seed layer, made of copper, on the titanium-containing layer, and the metal layer 89*c* can be formed of the nickel layer on the seed layer and the tin-containing layer on the nickel layer.

For example, the contact structure 89 may be formed by a suitable process or processes, e.g., by sputtering a chromium layer with a thickness of between 0.02 and 0.8 μm, and preferably of between 0.05 and 0.5 μm, on the polymer layer 99 and on contact point 8000 of copper, nickel or gold exposed by the opening 990, then sputtering a seed layer, made of copper, with a thickness of between 0.05 and 1.2 μm, and preferably of between 0.05 and 0.8 μm, on the chromium layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the chromium layer not under the copper layer with a dry etching method or a wet etching method, and then reflowing the tin-containing layer. As to the wet etching method, the seed layer of copper can be etched with a solution containing $NH_4OH$, and the chromium layer can be etched with a solution containing potassium ferricyanide. As to the dry etching method, the seed layer of copper can be removed with an Ar sputtering etching process. Accordingly, the metal layer 891 can be formed of the chromium layer and the seed layer, made of copper, on the chromium layer, and the metal layer 89*c* can be formed of the nickel layer on the seed layer and the tin-containing layer on the nickel layer.

For example, the contact structure 89 may be formed by a suitable process or processes, e.g., by sputtering a tantalum-containing layer, such as tantalum layer or tantalum-nitride layer, with a thickness of between 0.02 and 0.8 μm, and preferably of between 0.05 and 0.5 μm, on the polymer layer 99 and on the contact point 8000 of copper, nickel or gold exposed by the opening 990, then sputtering a seed layer, made of copper, with a thickness of between 0.05 and 1.2 μm, and preferably of between 0.05 and 0.8 μm, on the tantalum-containing layer, then spin-on coating a photoresist layer, such as positive-type photoresist layer, on the seed layer, then exposing the photoresist layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the contact point 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the tantalum-containing layer not under the copper layer with a dry etching method or a wet etching method, and then reflowing the tin-containing layer. As to the wet etching method, the seed layer of copper can be etched with a solution containing $NH_4OH$. As to the dry etching method, the seed layer of copper can be removed with an Ar sputtering etching process. Accordingly, the metal layer 891 can be formed of the tantalum-containing layer and the seed layer, made of copper, on the tantalum-containing layer, and the metal layer 89*c* can be formed of the nickel layer on the seed layer and the tin-containing layer on the nickel layer.

There is another important feature of the over-passivation scheme 8: using polymer material as the dielectric or insulating layer 90, over, under or between the over-passivation metal layers 80. Referring to FIG. 15K, use of polymer layers 90 (including 95, 98 and 99 in all embodiments of this disclosure) provides the possibility of fabricating thicker than 2 μm dielectric layer. The thickness of the polymer layer 90 can be between 2 and 100 μm, and preferably of between 3 and 30 μm. The polymer layers 90 used in the over-passivation scheme 102 can be polyimide (PI), benzocyclobutene (BCB), elastomer (such as silicone), parylene, epoxy-based material (such as photoepoxy SU-8 supplied by Sotec Microsystems, Renens, Switzerland). A solder mask material used in the printing circuit board industry can be used as the cap layer 99 (the topmost polymer layer over all the over-passivation metal layers 80). A photosensitive polyimide can be used as the polymer layers 90 (including 95, 98 and 99 in all embodiments of this disclosure). Furthermore, the polymer layers 90 (including 95, 98 and 99 in all embodiments of this disclosure) can be a non-ionic polyimide, such as an ether-based polyimide, PIMEL™, supplied by Asahi Chemical, Japan. Copper does not diffuse or penetrate through the non-ionic polyimide, therefore, it is allowed to have a direct contact between copper and polyimide. With the non-ionic polyimide, spacing between copper lines or traces or planes in the over-passivation metal scheme 80 can be as close as 1 μm, i.e. the spacing between two metal traces or planes can be larger 1 μm. Furthermore, no protection cap, such as nickel layer, over the copper layer is required for copper lines, traces or planes.

Referring to FIG. 15K now, openings 900 in the polymer layers 90 are formed for interconnection between different over-passivation metal layers 80, or for connection to the underlying fine-line metal layers 60, or for connection to an external circuits. The polymer openings 900 (including 950, 980 and 990) includes (1) 9919, 9929, 9829, 9519, 9519', 9511, 9512 and 9514 in the first embodiment; (2) 9831, 9834, 9531, 9532 and 9534 in the second embodiment; (3) 9939, 9939', 9839, 9831, 9834, 9539, 9539', 9531, 9532 and 9534 in the third embodiment; and (4) 9949, 9949', 9849', 9511, 9512, 9514 and 9549 in the fourth embodiment. The material of the polymer layers 90 can be a photo-sensitive or non-photo-sensitive. For the photo-sensitive polymer layers 90, the polymer openings 900 are defined and patterned by light exposure and developing. While for the non-photo-sensitive polymer layer 90, the openings 900 are defined by first coating a photoresist layer over the polymer layer, exposing and developing the photoresist to create openings in the photoresist, wet or dry etching the polymer layer exposed by the photoresist openings, creating openings 900 in the polymer layer 90, and then stripping the photoresist. The width of the polymer openings 900 is between 2 and 1,000 μm, exemplary between 5 and 200 μm. In some designs, the polymer layer 90 may be removed in a large with dimension larger than 1,000

μm. The openings 900 are designed in circles, corner-rounded squares, rectangles, or polygons.

The polymer layer 95 is between the passivation layer 5 and the bottom-most over-passivation metal layer 801. Through openings 950 in the polymer layer 95, the signal, power (Vdd or Vcc) and/or ground (Vss) passes between the fine-line metal scheme 6 and the over-passivation metal scheme 80. The process for forming the openings 950 in the polymer layer 95 can be applied to the process for (1) forming the openings 9519, 9519', 9511, 9512 and 9514 in FIG. 3D in the polymer layer 95; (2) forming the openings 9531, 9532 and 9534 in FIG. 7D in the polymer layer 95; (3) forming the openings 9539, 9539', 9531, 9532 and 9534 in FIGS. 10D, 10E, 10G, 10H and 10I in the polymer layer 95; or (4) forming the opening 9549, 9511, 9512 and 9514 in FIG. 14D in the polymer layer 95. The width of the polymer openings 9531, 9532, 9534, 9511, 9512 and 9514, aligned with the passivation openings 531, 532, 534, 511, 512 and 514, respectively, for the internal circuits 20 (including 21, 22, 23 and 24) is between 1 and 300 μm, exemplary between 3 and 100 μm. The width of the openings 9519 and 9519', aligned with the openings 519 and 519', respectively, for the voltage regulator or converter circuit 41, the width of the openings 9539 and 9539', aligned with the openings 539 and 539', respectively, for the off-chip circuit 40 (including 42 and 43), or the width of the opening 9549, aligned with the opening 549, respectively, for the ESD circuit 44 may be larger than those of the openings 9531, 9532, 9534, 9511, 9512 and 9514, in a range between 5 and 1,000 micrometers, exemplary 10 and 200 micrometers. Note that two types of stacked vias of a polymer opening 950 over a passivation opening 50. In a first type of stacked vias, the polymer openings, for example the opening 9531 shown in FIG. 10E, has a width larger than that of the underlying passivation opening 531 shown in FIG. 10E. The opening 9531 exposes a top surface of the passivation layer 5 adjacent to the contact pad 6390 exposed by the opening 531, in addition to exposing the contact pad 6390. In this case, a smaller passivation opening 531 can be formed; hence a smaller contact pad of the top-most fine-line metal layer 60 can be formed. This type of stacked vias allows higher routing density of the top-most fine-line metal layer 60. In a second type of stacked vias, the polymer openings, for example the opening 9539 shown in FIG. 10E, is smaller than the underlying passivation opening 539 shown in FIG. 10E. The polymer layer 95 covers a peripheral region of the contact pad 6390 exposed by the opening 539 and the passivation layer 5, an opening 9531 in the polymer layer 95 exposing a center region of the contact pad 6390 exposed by the opening 539. In this type, the polymer layer 95 covers the sidewall of the passivation openings. The sidewall of the polymer openings provides a gentle, better slope than the slope of the passivation opening sidewall, and resulting in a better step coverage for the subsequent metal sputtering for the adhesion/barrier/seed layer 8011. A better adhesion/barrier metal step coverage is important for the reliability of the chip, since it prevent the inter-metallic compound (IMC) from happening.

The openings 980 in the polymer layer 98 are between two over-passivation metal layers 801 and 802. The process for forming the openings 980 in the polymer layer 98 can be applied to the process for (1) forming the opening 9829 in FIG. 3C in the polymer layer 98; (2) forming the openings 9831 and 9834 in FIG. 7C in the polymer layer 98; (3) forming the openings 9831, 9834 and 9839 in FIGS. 10C and 10E in the polymer layer 98; or (4) forming the opening 9849' in FIG. 14C in the polymer layer 98. The width of the polymer openings 9831 and 9834 for the internal circuits 20 (including 21, 22, 23 and 24) is between 1 and 300 μm, exemplary between 3 and 100 μm. The width of the polymer opening 9829 for the voltage regulator or converter circuit 41, the width of the polymer opening 9839 for the off-chip circuit 40 (including 42 and 43), or the width of the polymer opening 9849' for the ESD circuit 44 may be larger than those of the openings 9831 and 9834, in a range between 5 and 1,000 μm, exemplary 10 and 200 μm.

The opening 990 in the cap polymer layer 99 exposes the contact point 8000 of the top-most metal layer 802 for connecting to the external circuits or for the probe contacting in chip testing. The process for forming the openings 990 in the polymer layer 99 can be applied to the process for (1) forming the opening 9919 in FIGS. 3B and 3D in the polymer layer 99; (2) forming the opening 9929 in FIG. 3C in the polymer layer 99; (3) forming the opening 9939 in FIGS. 10B, 10D, 10F, 10G, 10H and 10I in the polymer layer 99; (4) forming the opening 9939' in FIGS. 10C and 10E in the polymer layer 99; (5) forming the opening 9949 in FIGS. 14B and 14D in the polymer layer 99; or (6) forming the opening 9949' in FIG. 14C in the polymer layer 99. There are no openings in the cap polymer layer 99 for the internal circuits 20 (including 21, 22, 23 and 24) being connected to an external circuit. The width of the polymer openings 9919 and 9929 for the voltage regulator or converter circuit 41, the width of the polymer openings 9939 and 9939' for the off-chip circuit 40 (including 42 and 43), or the width of the polymer openings 9949 and 9949' for the ESD circuit 44, can be in a range between 5 and 1,000 μm, exemplary 10 and 200 μm.

The signal, power or ground stimuli in the over-passivation metal layers 80 of the over-passivation scheme 102 is delivered to the internal circuits 20, the voltage regulator or converter circuit 41, the off-chip circuits 40 or the ESD circuits 44 through the fine-line scheme 6. The fine-line metals 631, 632, 634, 639 and 639' shown in FIG. 15A can be composed of stacked via plugs 60', and preferably, the upper one may be directly over the lower one. Alternative, the fine-line metal 632 may include a local fine-line metal layer 632*c* shown in FIG. 15A, and as well as in all embodiments of this disclosure.

The photolithography used to fabricate the over-passivation scheme 102 is significantly different from that of convention IC process. Similarly, the over-passivation photolithography process includes coating, exposing and developing the photoresist. Two types of photoresist are used to form the over-passivation scheme 8: (1) liquid photoresist, formed by a suitable process or processes, e.g., by one or multiple spin-on coating, or printing. The liquid photoresist has a thickness between 3 and 60 μm, exemplary between 5 and 40 μm; (2) dry-film photoresist, formed by a suitable process or processes, e.g., by a laminating method. The dry-film photoresist has a thickness between 30 and 300 μm, exemplary between 50 and 150 μm. The photoresist can be positive-type or negative-type, exemplary positive-type thick photoresist for better resolution. If the polymer is photo-sensitive, the same photolithography process for the photoresist can be applied to pattern the polymer. An aligner or 1× stepper exposes the photoresist. The 1× means that the dimension on a photo mask (usual made of quartz or glass) is reduced on the wafer when light beam is projected from the photo mask onto the wafer, and the dimension of a feature on the photo mask is the same of the dimension on the wafer. The wavelength of the light beam used in the aligner or 1× stepper can be a 436 nm (g-line), 397 nm (h-line), 365 nm (i-line), g/h-line (combination of g-line and h-line), or g/h/i-line (combination of g-line, h-line and i-line). The g/h-line or g/h/i-line 1× stepper (or 1× aligner) provides strong light intensity for thick photoresist or thick photo-sensitive polymer exposure.

Sine the passivation layer 5 protects underlying MOS transistors and fine-line scheme 6 from the penetration of moisture, sodium or other mobile ions, gold, copper or other transition metals, the over-passivation scheme 102 on the wafer can be processed in a clean room with Class 10 or less stringent environment, for example Class 100. A Class 100 clean room allows maximum number of particles per cubic foot: 1 larger than 5 μm, 10 larger than 1 μm, 100 larger than 0.5 μm, 300 larger than 0.3 μm, 750 larger than 0.2 μm, 3500 larger than 0.1 μm.

The device layer 2 includes the internal circuits 20 (including 21, 22, 23 and 24) in all embodiments, the voltage regulator or converter circuit 41 in the first embodiment, the off-chip circuits 40 (including 42 and 43) in the third embodiment, and the ESD circuit 44 in the fourth embodiment.

An internal circuit or an internal circuit unit 20, including 21, 22, 23 and 24, in all embodiments of this disclosure, is defined as a circuit whose signal nodes are not connected to the external (outside the chip) circuits. If a signal of an internal circuit or internal circuit unit 20 needs to connect to an external circuit, it must go through an off-chip circuit first, for example, ESD circuits, off-chip drivers or off-chip receivers and/or other off-chip I/O circuits, before connecting to the external circuit. In other definition, the internal circuits or the internal circuit units 20 do not include off-chip circuits. The internal circuits or internal circuit units 20, including 21, 22, 23 and 24, in this disclosure may, in addition to a NOR gate and a NAND gate, be an inverter, an AND gate, an OR gate, an SRAM cell, a DRAM cell, a non-volatile memory cell, a flash memory cell, an EPROM cell, a ROM cell, a magnetic RAM (MRAM) cell, a sense amplifier, an operational amplifier, an adder, a multiplexer, a diplexer, a multiplier, an A/D converter, a D/A converter, or other CMOS, BiCMOS, and/or bipolar circuit, analog circuit, a CMOS sensor cell, or a photo-sensitive diode.

Moreover, an internal circuit or an internal circuit unit 20 can be defined by its peak input or output current, or it can be defined as its MOS transistor size, as discussed in the third embodiment. The off-chip circuits 40, including the off-chip buffer 42 and the off-chip ESD circuit 43, can also be defined by its peak input or output current, or defined as its MOS transistor size, also as discussed in the third embodiment. The definition of the internal circuit 20 and the off-chip circuit 40 apply to all other embodiments in this disclosure.

In a case, a gate of a MOS device may be connected to another gate of another MOS device through the above mentioned thick and wide metal trace, bus or plane 81, 81P, 82, 83, 83' or 85 over the passivation layer 5. In another case, a gate of a MOS device may be connected to a source of another MOS device through the above mentioned thick and wide metal trace, bus or plane 81, 81P, 82, 83, 83' or 85 over the passivation layer 5. In another case, a gate of a MOS device may be connected to a drain of another MOS device through the above mentioned thick and wide metal trace, bus or plane 81, 81P, 82, 83, 83' or 85 over the passivation layer 5. In another case, a source of a MOS device may be connected to another source of another MOS device through the above mentioned thick and wide metal trace, bus or plane 81, 81P, 82, 83, 83' or 85 over the passivation layer 5. In another case, a source of a MOS device may be connected to a drain of another MOS device through the above mentioned thick and wide metal trace, bus or plane 81, 81P, 82, 83, 83' or 85 over the passivation layer 5. In another case, a drain of a MOS device may be connected to another drain of another MOS device through the above mentioned thick and wide metal trace, bus or plane 81, 81P, 82, 83, 83' or 85 over the passivation layer 5.

In following paragraphs, the dimension of features and electrical characteristics are described and compared between metal lines or metal traces 80, 60 in the over-passivation scheme 102 and in the fine-line scheme 6 for exemplary embodiments in this disclosure:

(1). Thickness of metal lines, metal traces: Each of the over-passivation metal layers 80 has thickness between 2 and 150 μm, exemplary between 3 and 20 μm, while each of the fin-line metal layers 60 has thickness between 0.05 and 2 μm, exemplary between 0.2 and 1 μm. For an IC chip designed with embodiments in this disclosure, the thickness of an over-passivation metal line or metal trace is thicker than the thickness of any fine-line metal lines or metal traces, with the thickness ratio in a range between 2 and 250, exemplary between 4 and 20.

(2). Thickness of dielectric layers: Each of the over-passivation dielectric (usually an organic material, such as polymer) layers 90 has thickness between 2 and 150 μm, exemplary between 3 and 30 μm, while each of the fine-line dielectric (usually inorganic material, such as oxide or nitride) layers 30 has thickness between 0.05 and 20.8 μm, exemplary between 0.2 and 1 μm. For an IC chip designed with embodiments in this disclosure, the thickness of an over-passivation dielectric layer 90 (separated by two neighboring metal layers) is thicker than the thickness of any fine-line dielectric layer 30 (separated by two neighboring metal layers), with the thickness ratio in a range between 2 and 250, exemplary between 4 and 20.

(3). Sheet resistance and resistance of metal lines or metal traces: Sheet resistance of a metal line or metal trace is computed by dividing metal resistivity by metal thickness. The sheet resistance of a copper (5 μm thick) over-passivation metal line or trace is about 4 milli-ohms per square, while for a gold (4 μm thick) over-passivation metal line or trace is about 5.5 milli-ohms per square. The sheet resistance of an over-passivation metal line, or trace, or plane is in a range between 0.1 and 10 milli-ohms per square, exemplary between 1 and 7 milli-ohms per square. The sheet resistance of a sputtered aluminum (0.8 μm thick) fine-line metal line or trace is about 35 milli-ohms per square, while for a damascene copper (0.9 μm thick) fine-line metal line or trace is about 20 milli-ohms per square. The sheet resistance of a fine-line metal line, or trace, or plane is in a range between 10 and 400 milli-ohms per square, exemplary between 15 and 100 milli-ohms per square. The resistance per unit length of a metal line or trace is calculated by dividing the sheet resistance by its width. The horizontal design rules (the width) of over-passivation metal lines or traces between 1 and 200 μm, exemplary 2 and 50 μm, while the horizontal design rules (the width) of lines or traces between 20 nano-meter and 15 μm, exemplary 20 nano-meter and 2 μm. The resistance per mm of an over-passivation metal line or trace is between 2 milli-ohms per mm length and 5 ohms per mm length, exemplary between 50 milli-ohms per mm length and 2.5 ohms per mm length. The resistance per mm of a fine-line metal line or trace is between 1 ohm per mm length and 3,000 ohms per mm length, exemplary between 500 milli-ohms per mm length and 500 ohms per mm length. For an IC chip designed with embodiments in this disclosure, the resistance per unit length of an over-passivation metal line or metal trace is smaller than that of any fine-line metal lines or metal traces, with the ratio of resistance per unit length (fine-line to over-passivation) in a range between 3 and 250, exemplary between 10 and 30.

(4). Capacitance per unit length of metal lines or metal traces: Capacitance per unit length is related to dielectric types, thickness, and metal line width, spacing, and thickness, and the surrounding metals in horizontal and vertical directions. The dielectric constant of polyimide is about 3.3; the dielectric constant of BCB is about 2.5. FIG. 20 shows an example of a typical over-passivation metal line or trace 802$x$ with two neighboring metal lines or traces 802$y$ and 802$z$ on both sides on the same metal layer 802, and a metal line or trace 801$w$ on a metal layer 801 under the metal layer 802, separating by a polymer layer 98. Similarly, FIG. 20 shows an example of a typical fine-line metal line or trace 602$x$ with two neighboring metal lines or traces 602$y$ and 602$z$ on both sides on the same metal layer 602, and a metal line or trace 601$w$ on a metal layer 601 under the metal layer 602, separating by a dielectric layer 30. The typical capacitance per unit length of the typical metal lines or traces 802$x$, 602$x$ include three components: 1) plate capacitance, Cxw (pF/mm) which is a function of the metal width to dielectric thickness aspect ratio, 2) coupling capacitance, Ccx (=Cxy+Cxz), which is a function of the metal thickness to line spacing aspect ratio, and 3) fringing capacitance, Cfx (=Cfl+Cfr), which is a function of metal thickness, spacing, and dielectric thickness. The capacitance per mm of an over-passivation metal line or trace is between 0.1 pF (pico Farads) per mm length and 2 pF per mm length, exemplary between 0.3 pF per mm length and 1.5 pF per mm length. The capacitance per mm of a fine-line metal line or trace is between 0.2 pF per mm length and 4 pF per mm length, exemplary between 0.4 pF per mm length and 2 pF per mm length. For an IC chip designed with embodiments in this disclosure, the capacitance per unit length of an over-passivation metal line or metal trace is smaller than that of any fine-line metal lines or metal traces, with the ratio of capacitance per unit length (fine-line to over-passivation) in a range between 1.5 and 20, exemplary between 2 and 10. An over-passivation scheme 102 shown in FIG. 20 includes the polymer layers 95, 98 and 99, the patterned circuit layers 801 and 802, and the metal bump 89, and the openings 950 in the polymer layer 95 are over the regions of the metal pads or traces 600 exposed by the openings 50 in the passivation layer 5, and the opening 980 in the polymer layer 98 is over the patterned circuit layer 801, and the opening 990 in the polymer layer 99 is over the contact point 8000 of the patterned circuit layer 802, and the metal bump 89 is in the opening 990, on the contact point 8000 and on the polymer layer 99.

(5). RC constant of metal lines or metal traces: The signal propagation time on a metal line or metal trace is computed by the RC delay. Based on the description of previous two paragraphs (3) and (4), the RC delay in an over-passivation metal line or trace is in a range between 0.003 and 10 ps (pico second) per mm length, exemplary between 0.25 and 2 ps (pico second) per mm length; while the RC delay in a fine-line metal line or trace is in a range between 10 and 2,000 ps (pico second) per mm length, exemplary between 40 and 500 ps (pico second) per mm length. For an IC chip designed with embodiments in this disclosure, the RC propagation time per unit length of an over-passivation metal line or metal trace is smaller than that of any fine-line metal lines or metal traces, with the ratio of RC propagation delay time per unit length (fine-line to over-passivation) in a range between 5 and 500, exemplary between 10 and 30.

FIGS. 15C-15K show the process steps to form the over-passivation scheme 102 on the wafer 10 shown in FIG. 15A or FIG. 15B. Each of the over-passivation metal layers 80 is formed by a suitable process or processes, e.g., by an embossing process (as contrast to the damascene copper process under the passivation layer 5).

Referring to FIG. 15C, a polymer layer 95 can be formed on the passivation layer 5 of the wafer 10. If the polymer layer 95 is in liquid form, it can be deposited by spin-on coating or printing. If the polymer layer 95 is a dry film, the dry film is formed by a suitable process or processes, e.g., by a laminating method. For a photo-sensitive polymer, the polymer layer 95 is exposed by light of an aligner or a 1× stepper through a photo mask. Multiple openings 950 in the polymer layer 95 are over the regions of the metal pads or traces 600 exposed by the openings 50 and expose them. If the polymer is non-photo-sensitive, a photolithography process using a photoresist is required to pattern the openings 950. A hard mask (such as a silicon oxide layer, not shown), with a slow differentiating etch rate during the polymer opening etch, may optionally be deposited on the polymer layer 95 before coating the photoresist. As an alternative, the patterned polymer layer 95 (that is a polymer layer with openings 950) can also be formed by a suitable process or processes, e.g., by screening printing methods using a metal screen with patterned holes. No exposure and developing are required in the screen-printing method. If the polymer layer 95 is a dry film, as another alternative, holes can be formed in a sheet of dry film before laminated on the wafer. No exposure and developing are required in this alternative.

For example, the polymer layer 95 can be formed by a suitable process or processes, e.g., by spin-on coating a negative-type photosensitive polyimide layer, containing ester-type precursor, having a thickness between 6 and 50 micrometers on the passivation layer 5 and on the metal pads or traces 600 exposed by the openings 50 in the passivation layer 5, then baking the spin-on coated polyimide layer, then exposing the baked polyimide layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings in the exposed polyimide layer exposing the metal pads re traces 600, then curing or heating the developed polyimide layer at a peak temperature of between 290 and 400° C. for a time of between 20 and 150 minutes in a nitrogen ambient or in an oxygen-free ambient, the cured polyimide layer having a thickness between 3 and 25 micrometers, and then removing the residual polymeric material or other contaminants from the upper surfaces of the metal pads or traces 600 exposed by the openings in the polyimide layer with an $O_2$ plasma or a plasma containing fluorine of below 200 PPM and oxygen, such that the polymer layer 95 can be patterned with the openings 950 in the polymer layer 95 exposing the metal pads or traces 600. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

The polymer layer 95 between the bottom-most patterned metal layer 801 and the passivation layer 5 planarizes the surface of the passivation layer 5, and decouples the over-passivation metal scheme 80 from the underlying fine-line metal scheme 6, resulting in high electrical performance. In some applications, the polymer layer 95 may be omitted to for cost saving. Note that openings 950 are aligned with the passivation openings 50. Note also that the polymer openings 950 can be either larger or smaller than the passivation openings 50. As an alternative, regards to the wafer 10 in FIG. 15A, there are no openings in the passivation layer 5, next the polymer layer 95 is spin coated on the passivation layer 5, followed by forming the openings 950 in the polymer layer 95 exposing the passivation layer 5, and then forming the openings 50 in the passivation layer 5 under the openings 950, exposing the contact pads of the fine-line metal scheme 6. In this option, the polymer openings 950 are about the same size as the openings 50 in the passivation layer 5.

FIGS. 15D-15H show an embossing process to form the patterned metal layer 801. Referring to FIG. 15D, after forming the polymer layer 95 illustrated in FIG. 15C, an adhesion/barrier/seed layer 8011 is formed on the polymer layer 95 and on the regions of the metal pads or traces 600 exposed by the openings 950 in the polymer layer 95 by using a physical vapor deposition (PVD) process, such as sputtering process or evaporation process. The adhesion/barrier/seed layer 8011 includes an adhesion/barrier layer on the polymer layer 95 and on the regions of the metal pads or traces 600 exposed by the openings 950, and a seed layer on the adhesion/barrier layer. The material of the adhesion/barrier layer may include titanium, a titanium-tungsten alloy, titanium nitride, chromium, tantalum, tantalum nitride or a composite of the previously described materials, and the material of the seed layer may include copper, nickel, aluminum, gold, silver, platinum or palladium.

For example, when the adhesion/barrier layer of the adhesion/barrier/seed layer 8011 is formed by a suitable process or processes, e.g., by sputtering a titanium-containing layer, such as a single layer of titanium-tungsten alloy, titanium or titanium nitride, having a thickness smaller than 1 micrometer, such as between 0.005 and 0.8 micrometers, and preferably between 0.02 and 0.8 micrometers, on the polymer layer 95 and on the regions of the metal pads or traces 600 exposed by the openings 950, the seed layer of the adhesion/barrier/seed layer 8011 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.7 micrometers, and preferably between 0.05 and 0.2 micrometers, on the titanium-containing layer.

Alternatively, when the adhesion/barrier layer of the adhesion/barrier/seed layer 8011 is formed by a suitable process or processes, e.g., by sputtering a tantalum-containing layer, such as a single layer of tantalum or tantalum nitride, having a thickness smaller than 1 micrometer, such as between 0.005 and 0.8 micrometers, and preferably between 0.02 and 0.8 micrometers, on the polymer layer 95 and on the regions of the metal pads or traces 600 exposed by the openings 950, the seed layer of the adhesion/barrier/seed layer 8011 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.7 micrometers, and preferably between 0.05 and 0.2 micrometers, on the tantalum-containing layer.

Alternatively, when the adhesion/barrier layer of the adhesion/barrier/seed layer 8011 is formed by a suitable process or processes, e.g., by sputtering a chromium-containing layer, such as a single layer of chromium layer, having a thickness smaller than 1 micrometer, such as between 0.005 and 0.8 micrometers, and preferably between 0.02 and 0.8 micrometers, on the polymer layer 95 and on the regions of the metal pads or traces 600 exposed by the openings 950, the seed layer of the adhesion/barrier/seed layer 8011 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.7 micrometers, and preferably between 0.05 and 0.2 micrometers, on the chromium-containing layer.

Referring to FIG. 15E, after forming the adhesion/barrier/seed layer 8011 illustrated in FIG. 15D, a photoresist layer 71 is formed on the seed layer of the adhesion/barrier/seed layer 8011, and multiple openings 710 in the photoresist layer 71 expose the seed layer of the adhesion/barrier/seed layer 8011. The openings 710 defined the metal lines, traces or planes to be formed in the subsequent process, and contacts in the polymer openings 950 and the passivation openings 50. The contacts are over and connected to the exposed fine-line metal pads or traces 600.

For example, the photoresist layer 71 can be formed by a suitable process or processes, e.g., by spin-on coating a positive-type photosensitive polymer layer on the seed layer of the adhesion/barrier/seed layer 8011, then exposing the photosensitive polymer layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer with an $O_2$ plasma or a plasma containing fluorine of below 200 PPM and oxygen, such that the photoresist layer 71 can be patterned with the openings 710 exposing the seed layer of the adhesion/barrier/seed layer 8011.

Referring to FIG. 15F, a bulk metal layer 8012 can be formed on the seed layer, exposed by the openings 710 in the photoresist layer 71, of the adhesion/barrier/seed layer 8011 and in the openings 710 by a process including an electroplating process and/or an electroless plating process. The bulk metal layer 8012 may have a thickness larger than 2 micrometers, such as between 2 and 100 micrometers, and preferably between 3 and 20 micrometers, and larger than that of the adhesion/barrier/seed layer 8011 and that of each of the fine-line metal layers 60, respectively. The bulk metal layer 8012 may have a width larger than 1 micrometer, such as between 5 and 150 micrometers, and preferably between 5 and 50 micrometers, and larger than that of each of the fine-line metal layers 60.

The bulk metal layer 8012 having a thickness larger than 2 micrometers, such as between 2 and 200 micrometers, between 2 and 50 micrometers or between 2 and 30 micrometers, may be a single layer of gold, copper, silver, aluminum, palladium, platinum, rhodium, ruthenium, rhenium or nickel, or a composite layer made of the previously described metals.

For example, the bulk metal layer 8012 can be composed of a single metal layer formed by a suitable process or processes, e.g., by electroplating a gold layer, to a thickness larger than 2 micrometers, such as between 2 and 50 micrometers, and preferably between 2 and 30 micrometers, in the openings 710 and on the seed layer, preferably the previously described gold layer, of the adhesion/barrier/seed layer 8011 exposed by the openings 710.

Alternatively, the bulk metal layer 8012 can be composed of a single metal layer formed by a suitable process or processes, e.g., by electroplating a copper layer, to a thickness larger than 2 micrometers, such as between 2 and 200 micrometers, and preferably between 2 and 30 micrometers, in the openings 710 and on the seed layer, preferably the previously described copper layer, of the adhesion/barrier/seed layer 8011 exposed by the openings 710.

Alternatively, the bulk metal layer 8012 can be composed of a single metal layer formed by a suitable process or processes, e.g., by electroplating a nickel layer, to a thickness larger than 2 micrometers, such as between 2 and 100 micrometers, and preferably between 2 and 30 micrometers, in the openings 710 and on the seed layer, preferably the previously described copper or nickel layer, of the adhesion/barrier/seed layer 8011 exposed by the openings 710.

Alternatively, the bulk metal layer 8012 can be composed of double metal layers formed by a suitable process or processes, e.g., by electroplating a copper layer, to a thickness larger than 2 micrometers, such as between 2 and 30 micrometers, and preferably between 3 and 15 micrometers, in the openings 710 and on the seed layer, preferably the previously described copper layer, of the adhesion/barrier/seed layer 8011 exposed by the openings 710, and then electroplating or electroless plating a gold layer, to a thickness larger than 0.5 micrometers, such as between 0.05 and 10 micrometers, and preferably between 0.5 and 1 micrometers, in the openings 710 and on the electroplated copper layer in the openings 710.

Alternatively, the bulk metal layer 8012 can be composed of triple metal layers formed by a suitable process or processes, e.g., by electroplating a copper layer, to a thickness larger than 2 micrometers, such as between 2 and 30 micrometers, and preferably between 3 and 15 micrometers, in the openings 710 and on the seed layer, preferably the previously described copper layer, of the adhesion/barrier/seed layer 8011 exposed by the openings 710, then electroplating or electroless plating a nickel layer, to a thickness larger than 0.5 micrometers, such as between 0.5 and 5 micrometers, and preferably between 1 and 3 micrometers, in the openings 710 and on the electroplated copper layer in the openings 710, and then electroplating or electroless plating a gold layer, a palladium layer or a platinum layer, to a thickness larger than 0.03 micrometers, such as between 0.03 and 0.5 micrometers, and preferably between 0.05 and 0.1 micrometers, in the openings 710 and on the electroplated or electroless plated nickel layer in the openings 710.

A cap/barrier layer (not shown) can be optionally formed by a suitable process or processes, e.g., by electroplating or electroless plating over the bulk metal layer 8012. An assembly/contact layer (not shown) can also be further formed, as an option also, over the bulk metal layer 8012 and the cap/barrier layer by electroplating or electroless plating. The assembly/contact layer can be a gold layer, a palladium layer or a ruthenium layer with a thickness between 0.01 and 5 micrometers.

Next, referring to FIG. 15G, the photoresist layer 71 is removed using an inorganic solution or using an organic solution with amide. However, some residuals from the photoresist layer 71 could remain on the bulk metal layer 8012 and on the seed layer of the adhesion/barrier/seed layer 8011. Thereafter, the residuals can be removed from the bulk metal layer 8012 and from the seed layer of the adhesion/barrier/seed layer 8011 with a plasma, such as $O_2$ plasma or plasma containing fluorine of below 200 PPM and oxygen.

Referring to FIG. 15H, the adhesion/barrier/seed layer 8011 not under the bulk metal layer 8012 is then removed by self-aligned wet and/or dry etching. In the case of wet etching to remove the bottom metal layer 8011 not under the bulk metal layer 8012, an undercut 8011' with a sidewall of the bottom metal layer 8011 recessed from a sidewall of the bulk metal layer 8012 is formed. No undercut 8011' exists when an anisotropies dry etching is used to remove the bottom metal layer 8011 not under the bulk metal layer 8012.

For example, when the seed layer of the adhesion/barrier/seed layer 8011 is a gold layer, it can be etched with an iodine-containing solution, such as solution containing potassium iodide, with an ion milling process or with an Ar sputtering etching process. Alternatively, when the seed layer of the adhesion/barrier/seed layer 8011 is a copper layer, it can be etched with a solution containing $NH_4OH$ or with an Ar sputtering etching process.

For example, when the adhesion/barrier layer of the adhesion/barrier/seed layer 8011 is a titanium-tungsten-alloy layer, it can be etched with a solution containing hydrogen peroxide, with a chlorine-containing plasma etching process or with an RIE process. Alternatively, when the adhesion/barrier layer of the adhesion/barrier/seed layer 8011 is a titanium layer, it can be etched with a solution containing hydrogen fluoride, with a chlorine-containing plasma etching process or with an RIE process. Alternatively, when the adhesion/barrier layer of the adhesion/barrier/seed layer 8011 is a chromium layer, it can be etched with a solution containing potassium ferricyanide.

Accordingly, the patterned circuit layer 801 composed of the metal layers 8011 and 8012 can be formed on the polymer layer 95 and on the regions of the metal pads or traces 600 exposed by the openings 950, and can be connected to the fine-line metal layers 60 through the openings 50 and 950. Alternatively, the polymer layer 95 can be omitted, that is, the adhesion/barrier layer of the adhesion/barrier/seed layer 8011 can be formed on the passivation layer 5 and on the regions of the metal pads or traces 600 exposed by the openings 50 in the passivation layer 5. After the step illustrated in FIG. 15H, the semiconductor wafer 10 can be optionally cut into a plurality of individual semiconductor chip by a die-sawing process.

An over-passivation scheme 102 shown in FIG. 15H includes the polymer layer 95 and the patterned circuit layer 801, and the openings 950 in the polymer layer 95 are over the regions of the metal pads or traces 600 exposed by the openings 50 in the passivation layer 5.

FIGS. 15I and 15J show a process of forming the additional polymer layer 98 and patterned circuit layer 802 using the above mentioned process illustrated in FIGS. 15C-15H. First, after the step illustrated in FIG. 15H, the polymer layer 98 is formed on the polymer layer 95 and on the bulk metal layer 8012 of the patterned circuit layer 801, and multiple openings 980 in the polymer layer 98 are over multiple regions of the bulk metal layer 8012 of the patterned circuit layer 801 and expose them. Next, an adhesion/barrier layer of an adhesion/barrier/seed layer 8021 is formed on the polymer layer 98 and on the regions of the bulk metal layer 8012 exposed by the openings 980. Next, a seed layer of the adhesion/barrier/seed layer 8021 can be formed on the adhesion/barrier layer of the adhesion/barrier/seed layer 8021. Next, a photoresist layer is formed on the seed layer of the adhesion/barrier/seed layer 8021, and multiple openings in the photoresist layer expose the seed layer of the adhesion/barrier/seed layer 8021. Next, a bulk metal layer 8022 is formed on the seed layer of the adhesion/barrier/seed layer 8021 exposed by the openings in the photoresist layer. Next, the photoresist layer is removed using an inorganic solution or using an organic solution with amide. Next, the adhesion/barrier/seed layer 8021 not under the bulk metal layer 8022 is removed. The specification of the polymer layer 98, the adhesion/barrier/seed layer 8021 and the bulk metal layer 8022 as shown in FIGS. 15I-15L can be referred to as the specification of the polymer layer 95, the adhesion/barrier/seed layer 8011 and the bulk metal layer 8012, respectively, as illustrated in FIGS. 15C-15H. The process of forming the polymer layer 98 as shown in FIGS. 15I-15J can be referred to as the process of forming the polymer layer 95 as illustrated in FIGS. 15C-15H. The process of forming the adhesion/barrier/seed layer 8021 as shown in FIGS. 15I-15J can be referred to as the process of forming the adhesion/barrier/seed layer 8011 as illustrated in FIGS. 15C-15H. The process of forming the bulk metal layer 8022 as shown in FIGS. 15I-15J can be referred to as the process of forming the bulk metal layer 8012 as illustrated in FIGS. 15C-15H. The process illustrated in FIGS. 15I and 15J can be repeated for forming one ore more polymer layer and one or more patterned circuit layer over the patterned circuit layer 802 and over the polymer layer 98.

Referring to FIG. 15K, after removing the adhesion/barrier/seed layer 8021 not under the bulk metal layer 8022 as illustrated in FIG. 15J, a polymer layer 99 can be formed on the bulk metal layer 8022 of the patterned circuit layer 802 and on the polymer layer 98 not covered by the patterned circuit layer 802. Multiple openings 990 (only one of them shown) in the polymer layer 99 can be over multiple contact points 8000 (only one of them shown) of the bulk metal layer 8022 of the patterned circuit layer 802 and expose the contact points 8000. In some applications, for example, in the gold over-passivation metal system used for the topmost patterned circuit layer 802, the polymer layer 99 may optionally be omitted. An over-passivation scheme 102 shown in FIG. 15K includes the polymer layers 95, 98 and 99, and the patterned circuit layers 801 and 802, and the openings 950 in the polymer layer 95 are over the regions of the metal pads or traces 600 exposed by the openings 50 in the passivation layer 5, and the openings 980 in the polymer layer 98 are over the patterned circuit layer 801, and the opening 990 in the polymer layer 99 is over the contact point 8000 of the patterned circuit layer 802 and exposes it.

After forming the over-passivation scheme 102 of the top post-passivation technology shown in FIG. 15K, the semiconductor wafer 10 can be cut into a plurality of individual semiconductor chip by a die-sawing process. The contact points 8000 of the semiconductor chip cut from the semiconductor wafer 10 can be used for connecting to an external circuit by (1) wires (such as gold wires, aluminum wires or copper wires) of a wirebonding process; (2) bumps (such as gold bumps, copper bumps, solder bumps, nickel bumps or other metal bumps) on the other substrates (such as silicon chips, silicon substrates, ceramic substrates, organic substrates, BGA substrates, flexible substrates, flexible tapes or glass substrates). The bumps on the substrates have a height larger than 1 micrometer, such as between 1 and 30 micrometers, and preferably between 5 and 20 micrometers; (3) posts (such as gold posts, copper posts, solder posts, nickel posts or other metal posts) on the other substrates (such as silicon chips, silicon substrates, ceramic substrates, organic substrates, BGA substrates, flexible substrates, flexible tapes or glass substrates). The posts on the substrates have a height larger than 10 micrometers, such as between 10 and 200 micrometers, and preferably between 30 and 120 micrometers; (4) bumps (such as gold bumps, copper bumps, solder bumps, nickel bumps or other metal bumps) on the terminals of metal leads of a lead-frames or a flexible tape. The bumps on the metal leads have a height larger than 1 micrometer, such as between 1 and 30 micrometers, and preferably between 5 and 20 micrometers.

Alternatively, referring to FIG. 15L, after forming the structure shown in FIG. 15K, the contact structure 89 can be formed over the contact point 8000 for connection to an external circuit, such as ball-grid-array (BGA) substrate, printed circuit board, semiconductor chip, metal substrate, glass substrate or ceramic substrate. The contact structure 89 can be (1) solder pad (with a thickness between 0.1 and 30 micrometers, and preferably between 1 and 10 micrometers) or solder bump (with a height larger than 8 micrometers, such as between 10 and 200 micrometers, and preferably between 30 and 120 micrometers) formed by a suitable process or processes, e.g., by electroplating, or screen printing. A solder reflow process is required to form a ball-shaped solder ball. Solder pad or bump 89 may include high lead solder (PbSn, with Pb composition larger than 85% weight percentage), eutectic solder (PbSn, with ~37% Pb weight percentage, and ~63% Sn weight percentage), lead-free solder including SnAg or SnCuAg, bismuth or indium; (2) gold pads (with a thickness between 0.1 and 10 micrometers, and preferably between 1 and 5 micrometers) or gold bumps (with a height larger than 5 micrometers, such as between 5 and 40 micrometers, and preferably between 10 and 20 micrometers) formed by a suitable process or processes, e.g., by electroplating; (3) metal balls formed by a suitable process or processes, e.g., by ball mounting. The metal ball can be a solder ball, a copper ball with surface coating of a Ni layer, or a copper ball with surface coating of a Ni layer and a solder layer, or a copper ball with surface coating of a Ni layer and a gold layer. A diameter of the metal ball is between 10 and 500 micrometers, and preferably between 50 and 300 micrometers. A metal ball can be mounted directly on the contact point 8000 exposed by the polymer opening 990, or on the metal layer 891. The metal layer 891 formed for the metal ball mounting may include a composite layer of Ti/Ni, Ti/Cu/Ni, TiW/Ni, TiW/Cu/Ni, Ti/Ni/Au, Ti/Cu/Ni/Au, TiW/Ni/Au, TiW/Cu/Ni/Au, Ti/Cu/Ni/Pd, TiW/Cu/Ni/Pd, Cr/CrCu, NiV/Cu, NiV/Cu, NiV/Au, Ni/Au, Ni/Pd, all layers are from bottom to top. After the metal ball mounting, a solder reflow process is usually required. After forming the contact structure 89, the wafer 10 can be cut into a plurality of individual semiconductor chip by a die-sawing process for packaging or assembly to connect to external circuits. The assembly methods can be wirebonding (to pads on external organic, ceramic, glass, or silicon substrates, or to leads of a leadframe or a flexible tape), TAB bonding, tape-chip-carrier packaging (TCP), chip-on-glass (COG), chip-on-board (COB), chip-on-film (COF), flip chip on a BGA substrate, chip-on-flex, chip-on-chip stack interconnection or chip-on-Si-substrate stack interconnection.

An over-passivation scheme 102 shown in FIG. 15L includes the polymer layers 95, 98 and 99, the patterned circuit layers 801 and 802, and the contact structure 89, and the openings 950 in the polymer layer 95 are over the regions of the metal pads or traces 600 exposed by the openings 50 in the passivation layer 5, and the openings 980 in the polymer layer 98 are over the patterned circuit layer 801, and the opening 990 in the polymer layer 99 is over the contact point 8000 of the patterned circuit layer 802, and the contact structure 89 is in the opening 990, on the contact point 8000 and on the polymer layer 99.

FIG. 15M is a cross-sectional view showing a semiconductor wafer, which can be formed by a suitable process or processes, e.g., by the following steps. First, after the steps illustrated in FIGS. 15A and 15C-15H, the polymer layer 98 is formed on the polymer layer 95 and on the bulk metal layer 8012 of the patterned circuit layer 801, and multiple openings 980 in the polymer layer 98 are over multiple regions 801*a* of the topmost layer of gold, copper, silver, aluminum, palladium, platinum, rhodium, ruthenium, rhenium or nickel of the previously described various the bulk metal layer 8012 and expose them. Next, a metal layer 89*a* can be formed on the polymer layer 98 and on the regions 801*a* of the topmost layer of gold, copper, silver, aluminum, palladium, platinum, rhodium, ruthenium, rhenium or nickel of the previously described various the bulk metal layer 8012 exposed by the openings 980. Next, a metal layer 89*b* can be formed on the metal layer 89*a*. The material of the metal layer 89*a* may include titanium, a titanium-tungsten alloy, titanium nitride, chromium, tantalum, tantalum nitride or a composite of the previously described materials, and the material of the metal layer 89*b* may include copper, nickel, aluminum, gold, silver, platinum or palladium. The metal layers 89*a* and 89*b* may be formed by a suitable process or processes, e.g., by a physical vapor deposition (PVD) process, such as sputtering process or evaporation process. The metal layer 89*a* may have a thickness smaller than 1 micrometer, such as between 0.02 and 0.5 micrometers, and preferably between 0.1 and 0.2 micrometers, and the metal layer 89*b* may have a thickness smaller than 1 micrometer, such as between 0.05 and 0.5 micrometers, and preferably between 0.08 and 0.15 micrometers.

For example, when the metal layer 89*a* is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 98 and on the regions 801*a* of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the metal layer 89*a* is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 98 and on the regions 801*a* of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the metal layer 89*a* is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 98 and on the regions 801*a* of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

After forming the metal layer 89*b*, a photoresist layer can be formed on the metal layer 89*b*, and multiple openings in the photoresist layer are over the regions 801*a* of the topmost layer of gold, copper, silver, aluminum, palladium, platinum, rhodium, ruthenium, rhenium or nickel of the previously described various the bulk metal layer 8012 exposed by the openings 980 and expose the metal layer 89*b*. Next, a metal layer 89*c* can be formed on the metal layer 89*b* exposed by the openings in the photoresist layer by a process including an electroplating process. The metal layer 89*c* may have a thickness larger than 3 micrometer, such as between 3 and 200 micrometers, and preferably between 5 and 100 micrometers, and larger than that of the metal layer 89*b*, that of the metal layer 89*a* and that of each of the fine-line metal layers 60, respectively. The metal layer 89*c* may have a width larger than 1 micrometer, such as between 5 and 200 micrometers, and preferably between 5 and 50 micrometers, and larger than that of each of the fine-line metal layers 60. The metal layer 89*c* may include copper, gold, nickel, aluminum, silver, platinum, solder or a composite of the previously described materials.

For example, the metal layer 89*c* can be composed of a single metal layer formed by a suitable process or processes, e.g., by electroplating a copper layer, to a thickness larger than 3 micrometers, such as between 10 and 150 micrometers, and preferably between 20 and 100 micrometers, on the metal layer 89*b*, preferably the previously described copper layer 89*b*, exposed by the openings in the photoresist layer.

Alternatively, the metal layer 89*c* can be composed of a single metal layer formed by a suitable process or processes, e.g., by electroplating a gold layer, to a thickness larger than 3 micrometers, such as between 5 and 150 micrometers, and preferably between 10 and 100 micrometers, on the metal layer 89*b*, preferably the previously described gold layer 89*b*, exposed by the openings in the photoresist layer.

Alternatively, the metal layer 89*c* can be composed of a single metal layer formed by a suitable process or processes, e.g., by electroplating a nickel layer, to a thickness larger than 3 micrometers, such as between 5 and 150 micrometers, and preferably between 10 and 100 micrometers, on the metal layer 89*b*, preferably the previously described copper layer or nickel layer 89*b*, exposed by the openings in the photoresist layer.

Alternatively, the metal layer 89*c* can be composed of a single metal layer formed by a suitable process or processes, e.g., by electroplating a solder layer, such as a bismuth-containing layer, an indium-containing layer or a tin-containing layer of a tin-lead alloy, a tin-silver alloy or a tin-silver-copper alloy, to a thickness larger than 5 micrometers, such as between 5 and 200 micrometers, and preferably between 10 and 150 micrometers, on the metal layer 89*b*, preferably the previously described copper layer or nickel layer 89*b*, exposed by the openings in the photoresist layer.

Alternatively, the metal layer 89*c* can be composed of triple metal layers formed by a suitable process or processes, e.g., by electroplating a copper layer, to a thickness larger than 1 micrometer, such as between 3 and 150 micrometers, and preferably between 5 and 100 micrometers, on the metal layer 89*b*, preferably the previously described copper layer 89*b*, exposed by the openings in the photoresist layer, next electroplating or electroless plating a nickel layer, to a thickness larger than 1 micrometer, such as between 1 and 15 micrometers, and preferably between 2 and 10 micrometers, on the electroplated copper layer in the openings in the photoresist layer, and then electroplating or electroless plating a gold layer or a palladium layer, to a thickness larger than 0.005 micrometers, such as between 0.005 and 10 micrometers, and preferably between 0.05 and 1 micrometers, on the electroplated or electroless plated nickel layer in the openings in the photoresist layer.

Alternatively, the metal layer 89*c* can be composed of triple metal layers formed by a suitable process or processes, e.g., by electroplating a copper layer, to a thickness larger than 1 micrometer, such as between 5 and 150 micrometers, and preferably between 10 and 100 micrometers, on the metal layer 89*b*, preferably the previously described copper layer 89*b*, exposed by the openings in the photoresist layer, next electroplating or electroless plating a nickel layer, to a thickness larger than 1 micrometer, such as between 1 and 15 micrometers, and preferably between 2 and 10 micrometers, on the electroplated copper layer in the openings in the photoresist layer, and then electroplating or electroless plating a solder layer, such as a bismuth-containing layer, an indium-containing layer or a tin-containing layer of a tin-lead alloy, a tin-silver alloy or a tin-silver-copper alloy, to a thickness larger than 1 micrometer, such as between 5 and 100 micrometers, and preferably between 10 and 50 micrometers, on the electroplated or electroless plated nickel layer in the openings in the photoresist layer.

After forming the metal layer 89*c*, the photoresist layer is removed using an inorganic solution or using an organic solution with amide. Next, the metal layer 89*b* not under the metal layer 89*c* is removed by an etching process, and then the metal layer 89*a* not under the metal layer 89*c* is removed by an etching process. The process of removing the metal layer 89*b* not under the metal layer 89*c* as shown in FIG. 15M can be referred to as the process of removing the seed layer of the adhesion/barrier/seed layer 8011 not under the bulk metal layer 8012 as illustrated in FIG. 15H. The process of removing the metal layer 89*a* not under the metal layer 89*c* as shown in FIG. 15M can be referred to as the process of etching the adhesion/barrier layer of the adhesion/barrier/seed layer 8011 not under the bulk metal layer 8012 as illustrated in FIG. 15H.

Accordingly, the metal bumps 89 provided by the metal layers 89*a*, 89*b* and 89*c* can be formed on the polymer layer 98 and on the regions 801*a* of the topmost layer of gold, copper, silver, aluminum, palladium, platinum, rhodium, ruthenium, rhenium or nickel of the previously described various the bulk metal layer 8012 exposed by the openings 980. The metal layer 89*c* of the metal bumps 89 can be used to be connected to an external circuit, such as ball-grid-array (BGA) substrate, printed circuit board, semiconductor chip, metal substrate, glass substrate or ceramic substrate, by bonding the metal layer 89*c* with the external circuit. After removing the metal layer 89*a* not under the metal layer 89*c*, the semiconductor wafer 10 can be cut into a plurality of individual semiconductor chip by a die-sawing process.

An over-passivation scheme 102 shown in FIG. 15M includes the polymer layers 95 and 98, the patterned circuit layer 801 and the metal bumps 89, and the openings 950 in the polymer layer 95 are over the regions of the metal pads or traces 600 exposed by the openings 50 in the passivation layer 5, and the openings 980 in the polymer layer 98 are over the contact points 801*a* of the patterned circuit layer 801, and the metal bumps 89 are in the openings 980, on the contact points 801*a* and on the polymer layer 98.

The emboss process shown in FIGS. 15C to 15K describes a metal layer is formed by a suitable process or processes, e.g., by only one photoresist patterning process for electroplating a metal layer in an opening in the only one photoresist layer. This type of process is a single-emboss process that means the process includes one and only one photolithography process before removing the adhesion/barrier/seed layer not under the electroplated metal layer. A double-emboss process can be implemented to form a metal trace and a via plug on the metal trace by electroplating metal layers with different patterns using only one adhesion/barrier/seed layer, while performing two photolithography processes, before removing the adhesion/barrier/seed layer not under an electroplated metal layer. The first photolithography process is performed for defining the pattern of the metal trace, while the second photolithography process is performed for defining the pattern of the via plug. FIGS. 15C-15G and FIGS. 16A-16D show a double-embossing process to form an over-passivation scheme over the wafer 10 shown in FIG. 15A or FIG. 15B. The double-embossing process has front steps same as the steps shown in FIGS. 15C-15G. The steps of FIGS. 16A-16D follow the steps of FIGS. 15C-15G for a double embossing process. In FIG. 15G, the photoresist layer 71 is stripped, leaving the adhesion/barrier/seed layer 8011 not under the bulk metal layer 8012 exposed to the ambient. FIGS. 16A-16M show an example to form an over-passivation scheme for all embodiments in this disclosure by using a double-embossing process to form the metal layer 801 and the via plugs 898, using a single embossing to form the metal layer 802, and using a single embossing to form the metal bump 89.

Figure 16A:
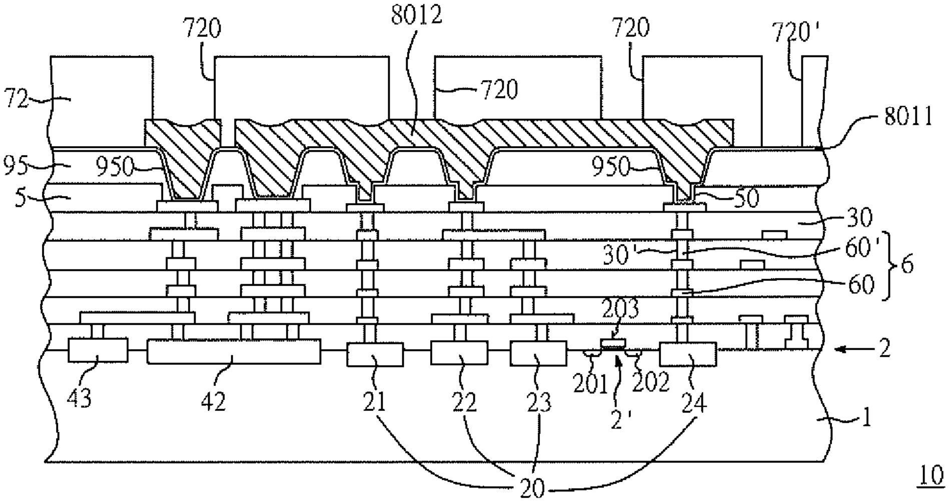

Referring to FIG. 16A, a first photolithography and electroplating process is performed to form the first metal layer 801, which can be referred to as the step illustrated in FIGS. 15D-15G, and then a second photoresist layer 72 is deposited and patterned on the seed layer of the adhesion/barrier/seed layer 8011 and on the bulk metal layer 8012. It is noted that openings 720 in the photoresist layer 72 expose the bulk metal layer 8012; openings 720' in the photoresist layer 72 expose the seed layer of the adhesion/barrier/seed layer 8011.

For example, the photoresist layer 72 can be formed by a suitable process or processes, e.g., by spin-on coating a positive-type photosensitive polymer layer on the seed layer of the adhesion/barrier/seed layer 8011 and on the electroplated bulk metal layer 8012, then exposing the photosensitive polymer layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer and form the bulk metal layer 8012 with an $O_2$ plasma or a plasma containing fluorine of below 200 PPM and oxygen, such that the photoresist layer 72 can be patterned with the openings 720 and 720' exposing the bulk metal layer 8012 and the seed layer of the adhesion/barrier/seed layer 8011, respectively.

Figure 16B:
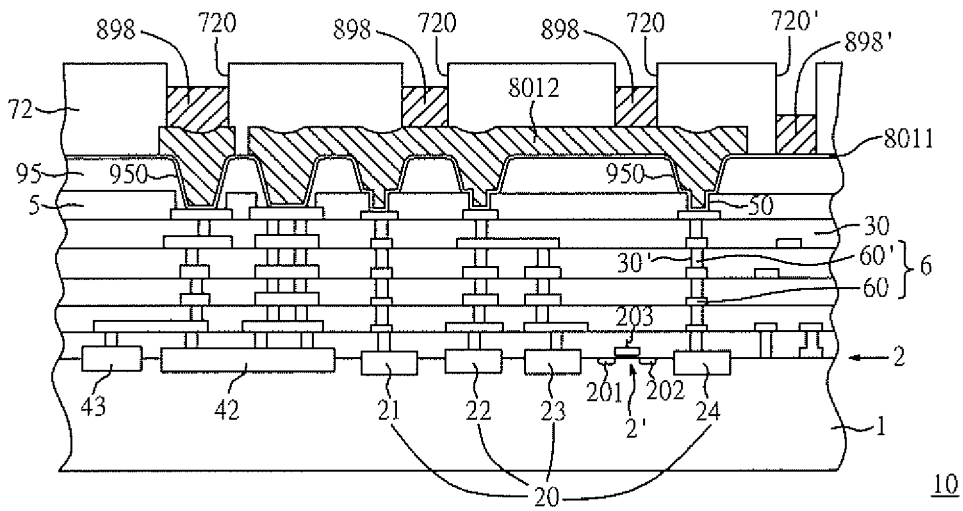

Referring to FIG. 16B, since the seed layer of the adhesion/barrier/seed layer 8011 is not removed, a second electroplating process can be performed to form via plugs 898. Note that a metal piece 898' on the seed layer of the adhesion/barrier/seed layer 8011 is also formed at a horizontal level lower than via plugs 898. The metal piece 898' can be used for packaging purposes. The metal piece 898' may be thinner or thicker than the bulk metal layer 8012. It can be used for higher density interconnection (in case of thinner) or used for lower resistance interconnection (in case of thicker).

The material of the via plug 898 and metal piece 898' may be gold or copper. For example, the via plug 898 and metal piece 898' may be formed by a suitable process or processes, e.g., by electroplating a gold layer with a thickness of between 1 and 100 μm, and preferably of between 2 and 30 μm, on the gold layer, exposed by the openings 720, of the bulk metal layer 8012, and on the seed layer, made of gold, of the adhesion/barrier/seed layer 8011 exposed by the openings 720'. Alternatively, the via plug 898 and metal piece 898' may be formed by a suitable process or processes, e.g., by electroplating a copper layer with a thickness of between 1 and 100 μm, and preferably of between 2 and 30 μm, on the copper layer, exposed by the openings 720, of the bulk metal layer 8012, and on the seed layer, made of copper, of the adhesion/barrier/seed layer 8011 exposed by the openings 720'.

Figure 16C:
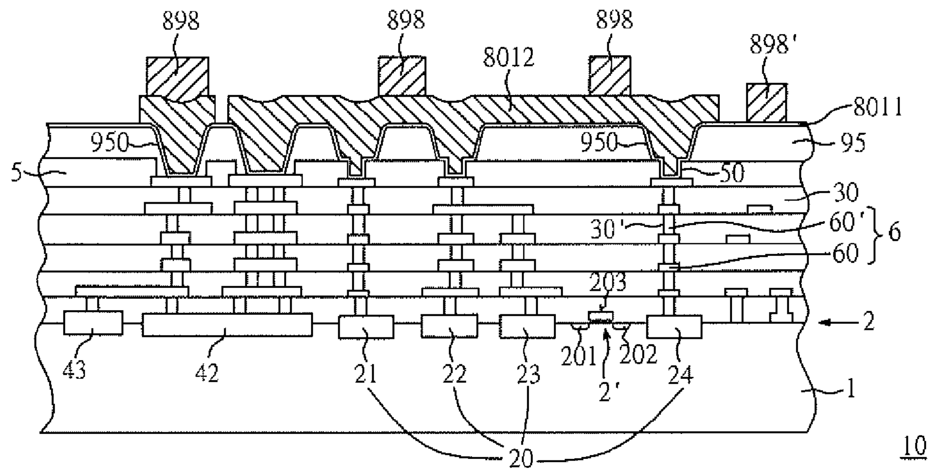

Referring to FIG. 16C, the second photoresist 72 is then removed using an organic solution with amide, exposing the via plugs 898, the bulk metal layer 8012 not under the via plugs 898, the seed layer of the adhesion/barrier/seed layer 8011 not under the bulk metal layer 8012, and the metal piece 898'. However, some residuals from the photoresist layer 72 could remain on the bulk metal layer 8012 and on the seed layer of the adhesion/barrier/seed layer 8011. Thereafter, the residuals can be removed from the seed layer of the adhesion/barrier/seed layer 8011 and from the bulk metal layer 8012 with a plasma, such as $O_2$ plasma or plasma containing fluorine of below 200 PPM and oxygen.

Figure 16D:
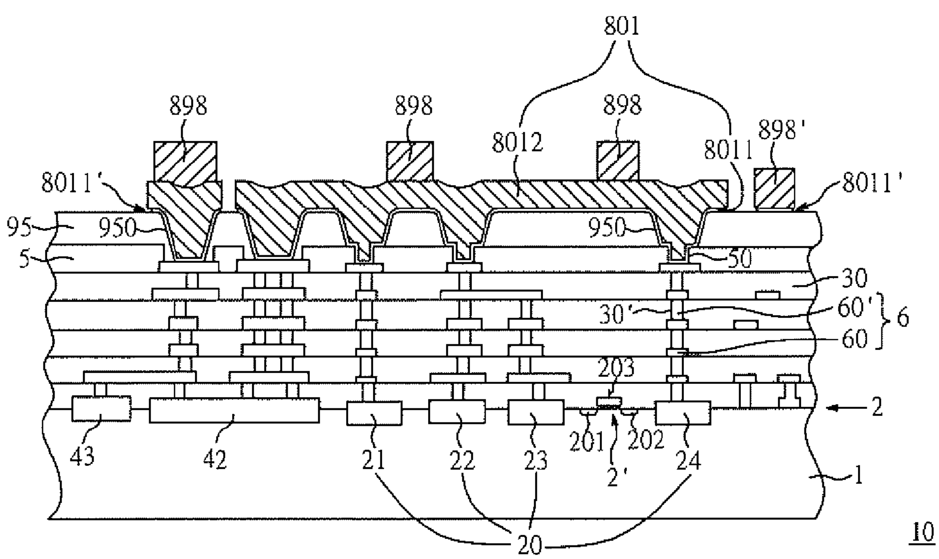

Referring to FIG. 16D, the adhesion/barrier/seed layer 8011 not under the bulk metal layer 8012 and not under the metal piece 898' is removed by wet and/or dry etching. In the case of wet etching to remove the bottom metal layer 8011 not under the electroplated metal layer 8012 and not under the electroplated metal layer 898, an undercut 8011' with a sidewall of the bottom metal layer 8011 recessed from a sidewall of the electroplated metal layer 8012 and with a sidewall of the bottom metal layer 8011 recessed from a sidewall of the electroplated metal layer 898' is formed. No undercut 8011' exists when an anisotropies dry etching is used to remove the bottom metal layer 8011 not under the electroplated metal layer 8012 and not under the electroplated metal layer 898'.

For example, when the seed layer of the adhesion/barrier/seed layer 8011 is a gold layer, it can be etched with an iodine-containing solution, such as solution containing potassium iodide, with an ion milling process or with an Ar sputtering etching process. Alternatively, when the seed layer of the adhesion/barrier/seed layer 8011 is a copper layer, it can be etched with a solution containing $NH_4OH$ or with an Ar sputtering etching process.

For example, when the adhesion/barrier layer of the adhesion/barrier/seed layer 8011 is a titanium-tungsten-alloy layer, it can be etched with a solution containing hydrogen peroxide, with a chlorine-containing plasma etching process or with an RIE process. Alternatively, when the adhesion/barrier layer of the adhesion/barrier/seed layer 8011 is a titanium layer, it can be etched with a solution containing hydrogen fluoride, with a chlorine-containing plasma etching process or with an RIE process. Alternatively, when the adhesion/barrier layer of the adhesion/barrier/seed layer 8011 is a chromium layer, it can be etched with a solution containing potassium ferricyanide.

Figure 16E:
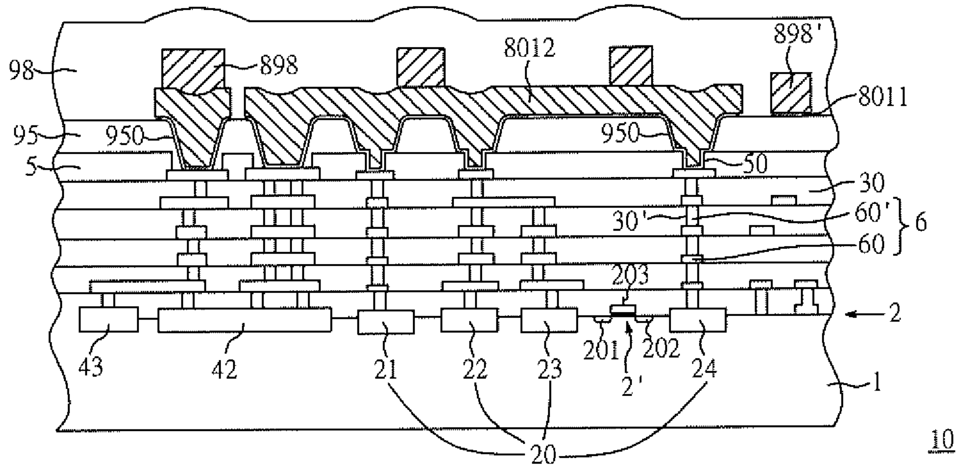

Referring to FIG. 16E, a second polymer layer 98 is deposited on the via plugs 898, on the metal pieces 898', on the metal layer 801 and on the exposed first polymer layer 95. The second polymer layer 98 can be formed by a suitable process or processes, e.g., by a spin-on coating process, a lamination process or a screen-printing process.

For example, the polymer layer 98 can be formed by a suitable process or processes, e.g., by spin-on coating a negative-type photosensitive polyimide layer, containing ester-type precursor, having a thickness of between 6 and 50 μm on the via plugs 898, on the metal pieces 898', on the bulk metal layer 8012 and on the exposed polymer layer 95, then baking the spin-on coated polyimide layer, and then curing or heating the baked polyimide layer at a peak temperature of between 290 and 400° C. for a time of between 20 and 150 minutes in a nitrogen ambient or in an oxygen-free ambient, the cured polyimide layer having a thickness of between 3 and 25 μm. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 16F:
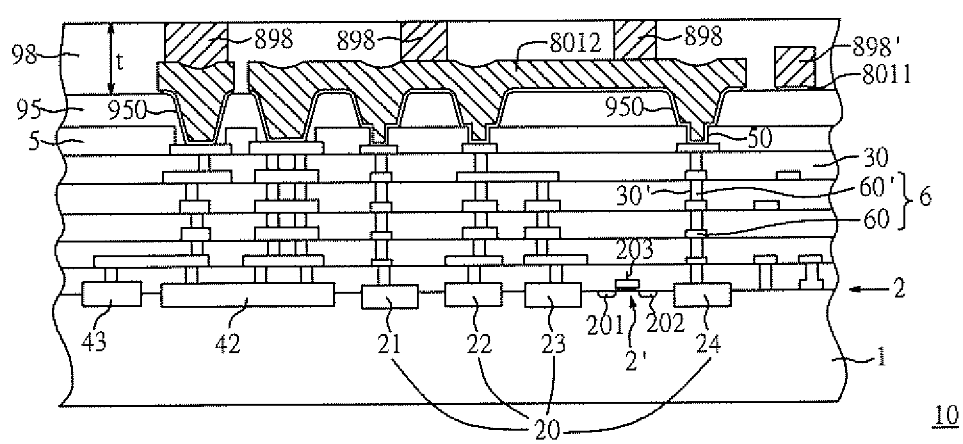
Figure 16G:
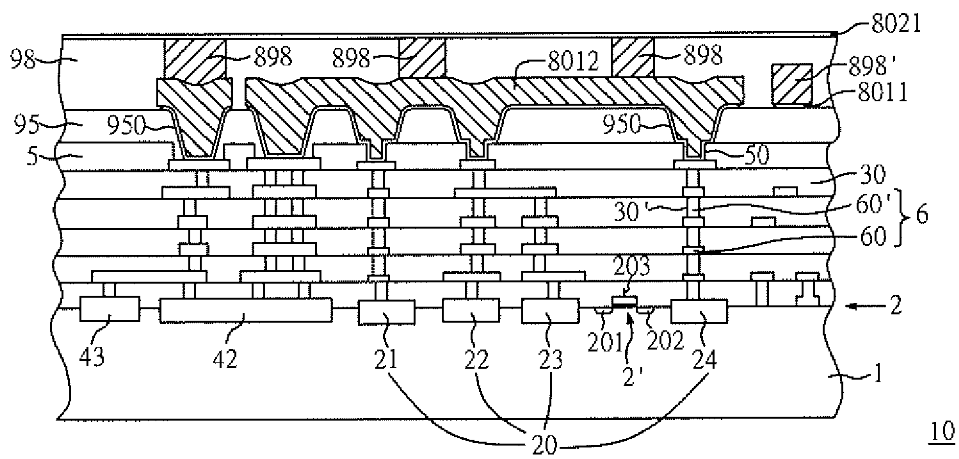
Figure 16H:
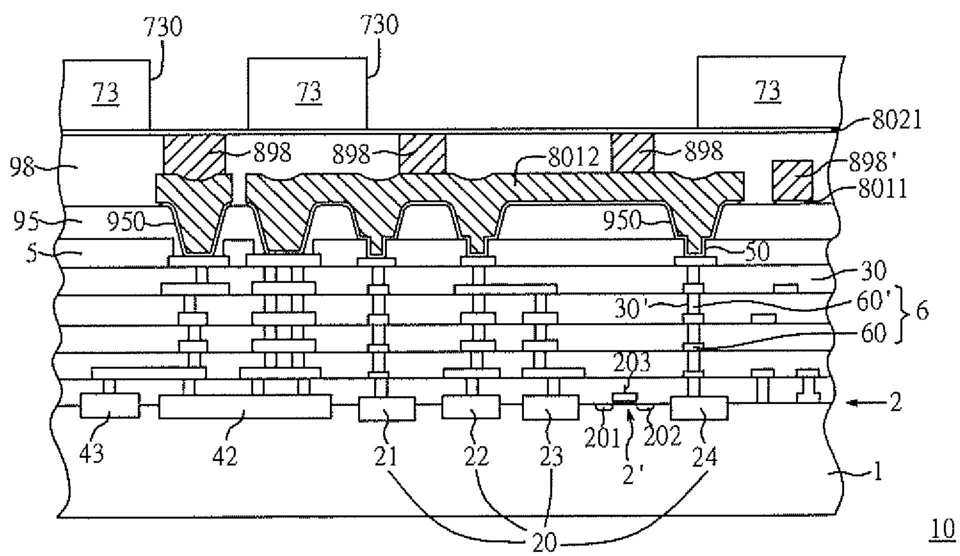

Referring to FIG. 16F, a polishing or mechanical polishing process, and preferably a chemical-mechanical polishing (CMP) process, is used to planarize the surface of the second polymer layer 98, exposing the via plugs 898. The polymer layer 98, after being planarized, may have a thickness t between 5 and 50 micrometers.

FIGS. 16G-16K show process steps to form a second over-passivation metal layer 802 using a single-embossing process same as described in FIGS. 15D-15H, that is, an adhesion/barrier/seed layer 8021 is formed, exemplary by sputtering, on the second polymer layer 98 and on the exposed via plugs 898, followed by forming a photoresist layer 73 on the adhesion/barrier/seed layer 8021, openings 730 in the photoresist layer 73 exposing the seed layer of the adhesion/barrier/seed layer 8021, followed by forming a bulk conduction metal layer 8022 on the seed layer exposed by the openings 730, followed by removing the photoresist layer 73, followed by removing the adhesion/barrier/seed layer 8021 not under the bulk conduction metal layer 8022. The specification of the adhesion/barrier/seed layer 8021 and the bulk conduction metal layer 8022 shown in FIGS. 16G-16K can be referred to as the specification of the adhesion/barrier/seed layer 8011 and the bulk metal layer 8012 illustrated in FIGS. 15D-15K, respectively. The process of forming the adhesion/barrier/seed layer 8021 shown in FIGS. 16G-16K can be referred to as the process of forming the adhesion/barrier/seed layer 8011 illustrated in FIGS. 15D-15K. The process of forming the bulk conduction metal layer 8022 shown in FIGS. 16G-16K can be referred to as the process of forming the bulk metal layer 8012 illustrated in FIGS. 15D-15K.

Figure 16I:
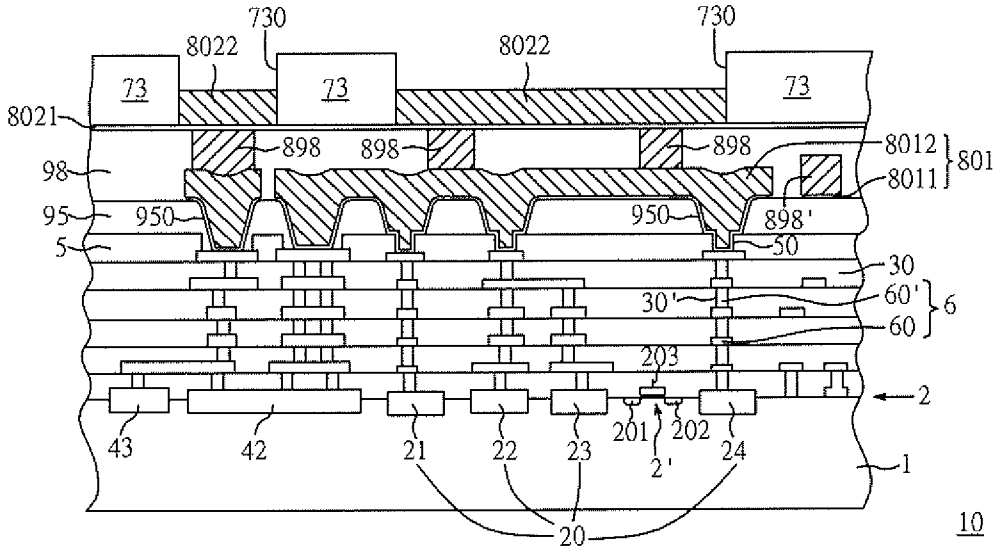
Figure 16J:
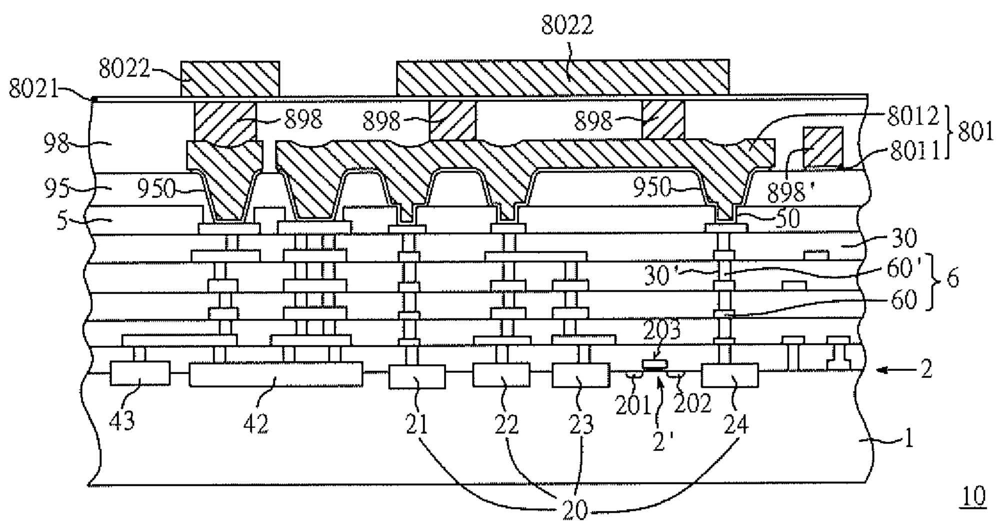
Figure 16K:
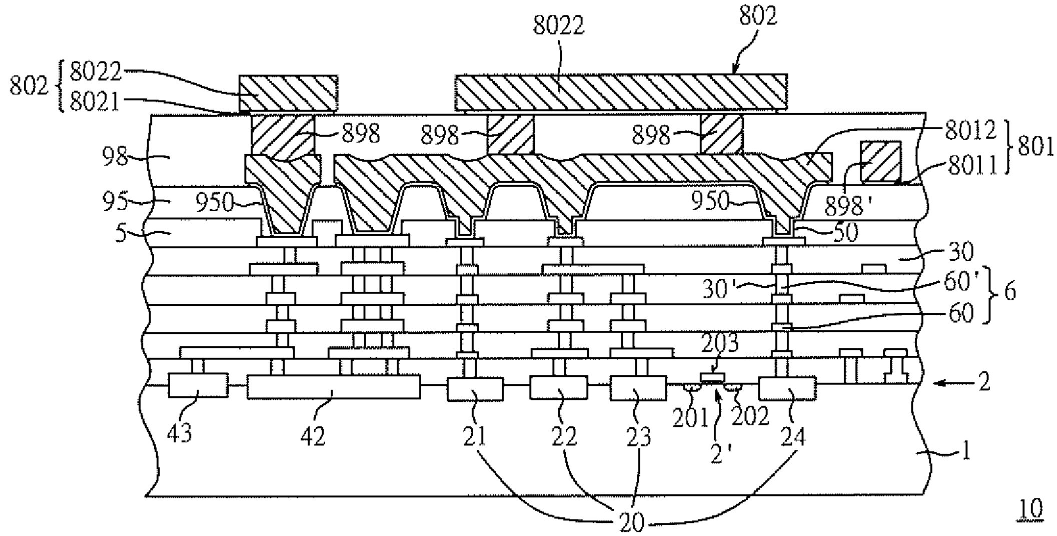
Figure 16L:
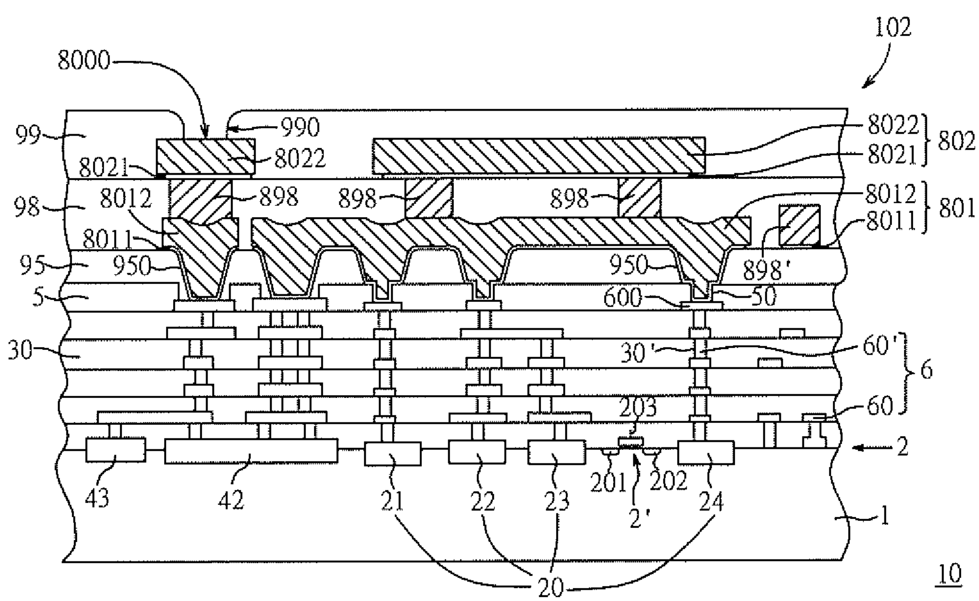

Referring to FIG. 16L, a polymer layer 99 is then formed and patterned to complete a two-metal-layer over-passivation scheme. An over-passivation scheme 102 shown in FIG. 16L includes the polymer layers 95, 98 and 99, the patterned circuit layers 801 and 802, the via plugs 898, and the metal piece 898', and the openings 950 in the polymer layer 95 are over the regions of the metal pads or traces 600 exposed by the openings 50 in the passivation layer 5, and the opening 990 in the polymer layer 99 is over the contact point 8000 of the patterned circuit layer 802 and exposes it. After the step illustrated in FIG. 16L, the semiconductor wafer 10 can be optionally cut into a plurality of individual semiconductor chip by a die-sawing process.

Figure 16M:
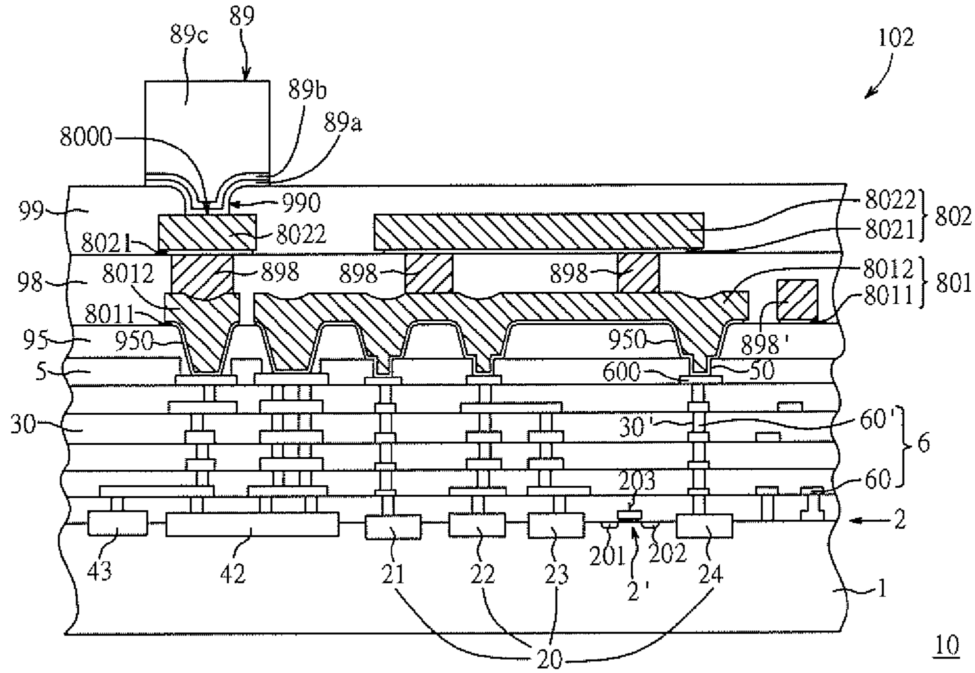

Alternatively, referring to FIG. 16M, after the step illustrated in FIG. 16L, the contact structure 89 illustrated in FIG. 15L or FIG. 15M can be formed on the exposed contact point 8000 for assembly and/or packaging purposes. The specification of the contact structure 89 shown in FIG. 16M can be referred to as the specification of the contact structure 89 illustrated in FIG. 15L or FIG. 15M. The process of forming the contact structure 89 as shown in FIG. 16M can be referred to as the process of forming the contact structure 89 illustrated in FIG. 15L or FIG. 15M. As an alternative, the double-emboss process steps in FIGS. 15D-15G and 16A-16D for forming the first metal layer 801 and the first via plug 898 can be repeated to form additional metal layer (not shown) on the polymer layer 98 and on the via plugs 898, and to form additional via plug (not shown) on the additional metal layer. In this alternative, the additional via plug can be joined with a wirebonded wire using a wirebonding process, with a solder bump using a ball-mounting process or with a flexible substrate using a TAB process. The description and specification in FIGS. 16A-16M can be applied to forming the thick and wide power metal trace, bus or plane 81 over the passivation layer 5 in the disclosure, to forming the thick and wide ground metal trace, bus or plane 82 over the passivation layer 5 in the disclosure, to forming the thick and wide power metal trace, bus or plane 81P over the passivation layer 5 in the disclosure, and to forming the thick and wide signal metal trace, bus or plane 83, 83' or 85 over the passivation layer 5 in the disclosure.

After forming the over-passivation scheme of the top post-passivation technology shown in FIG. 16M, the semiconductor wafer 10 can be cut into a plurality of individual semiconductor chip by a die-sawing process. An over-passivation scheme 102 shown in FIG. 16M includes the polymer layers 95, 98 and 99, the patterned circuit layers 801 and 802, the via plugs 898, the metal piece 898', and the metal bump 89, and the openings 950 in the polymer layer 95 are over the regions of the metal pads or traces 600 exposed by the openings 50 in the passivation layer 5, and the opening 990 in the polymer layer 99 is over the contact point 8000 of the patterned circuit layer 802, and the metal bump 89 is in the opening 990, on the contact point 8000 and on the polymer layer 99.

Figure 17A:
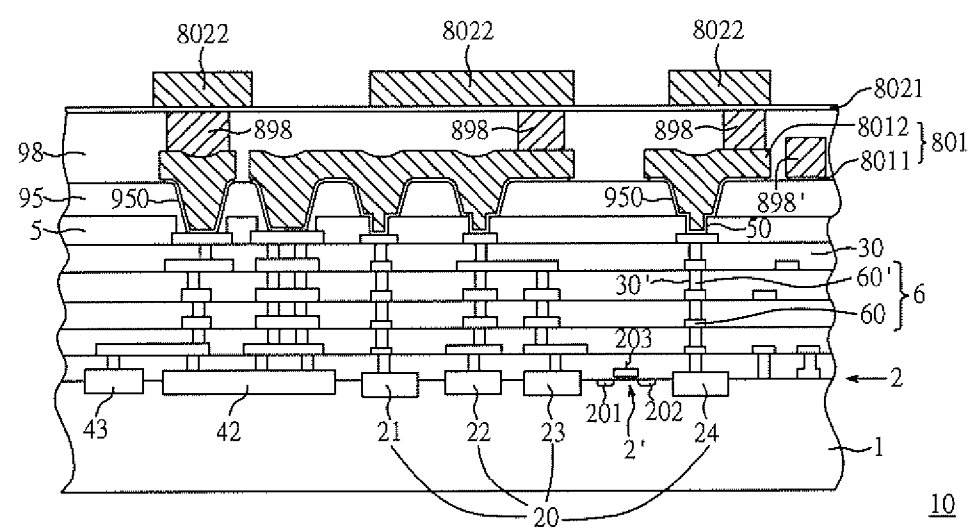

FIGS. 17A to 17J show process steps to form an over-passivation scheme 102 with three metal layers 801, 802 and 803. Metal layers 801 and 802 are formed by a suitable process or processes, e.g., by a double-emboss process, while the metal layer 803 is formed by a suitable process or processes, e.g., by a single-emboss process. A first double-embossing process is used to form the first metal layer 801 and the first via plug 898 as described in FIGS. 15D-15G and 16A-16D. A first inter-metal polymer layer 98 is formed and planarized to expose the first via plugs 898, shown in process steps of FIGS. 16E-16F. FIG. 17A is at the same step as FIG. 16J when the first metal layer 801, the first via plugs 898 and the metal piece 898' are formed by a suitable process or processes, e.g., by a double-emboss metal process, and the inter-metal dielectric polymer layer 98 is formed with the first via plugs 898 being exposed. The design of the first metal layer 801 and the first via plugs 898 in FIG. 17A is slightly different from that in FIG. 16J to accommodate an additional metal layer. The process for forming the bottom metal layer 8021 in FIG. 17A can be referred to as the process for forming the bottom metal layer 8011 in FIG. 15D or the bottom metal layer 8021 in FIG. 16G; the process for forming the metal layer 8022 in FIG. 17A can be referred to as the process for forming the metal layer 8012 in FIG. 15E or the metal layer 8022 in FIGS. 16H-16J. The specification of the adhesion/barrier/seed layer 8021 and the bulk conduction metal layer 8022 shown in FIGS. 17A-17J can be referred to as the specification of the adhesion/barrier/seed layer 8011 and the bulk metal layer 8012, respectively, illustrated in FIGS. 15D-15K.

Figure 17B:
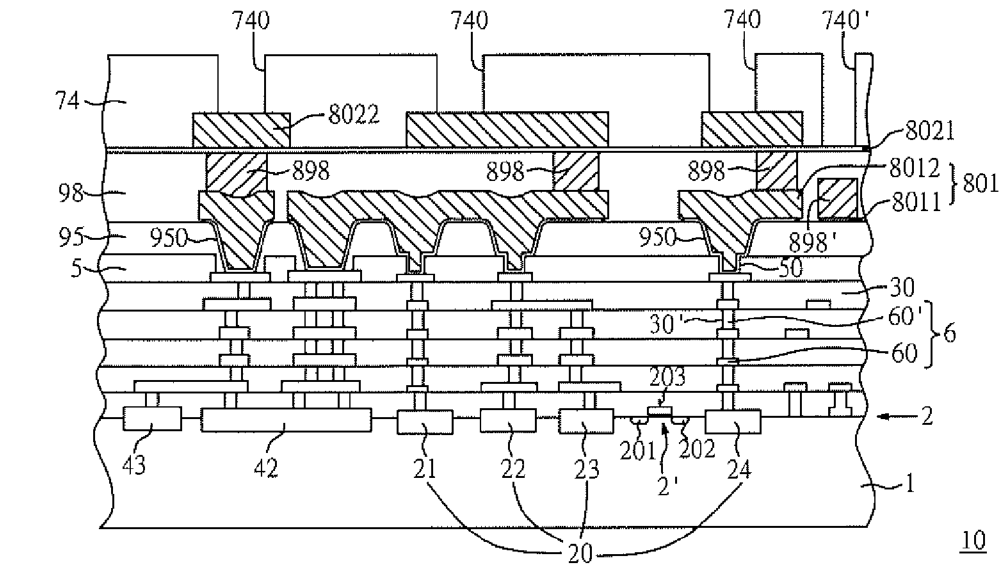

Referring to FIG. 17B now, a second photoresist layer 74 is then deposited and patterned to form openings 740 over the bulk conduction metal layer 8022 and/or to optionally form openings 740' directly on the seed layer of the second adhesion/barrier/seed layer 8021.

For example, the photoresist layer 74 can be formed by a suitable process or processes, e.g., by spin-on coating a positive-type photosensitive polymer layer on the seed layer of the adhesion/barrier/seed layer 8021 and on the bulk conduction metal layer 8022, then exposing the photosensitive polymer layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer and form the bulk conduction metal layer 8022 with an $O_2$ plasma or a plasma containing fluorine of below 200 PPM and oxygen, such that the photoresist layer 74 can be patterned with the openings 740 and 740' exposing the bulk conduction metal layer 8022 and the seed layer of the adhesion/barrier/seed layer 8021, respectively.

Figure 17C:
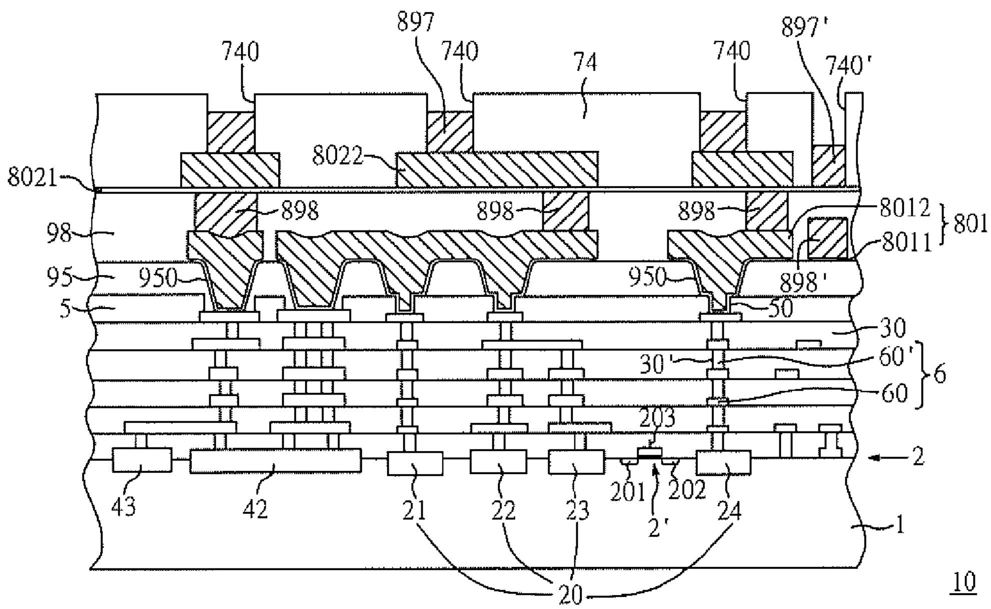

Referring to FIG. 17C, a second via plug layer is electroplated in the photoresist openings 740 and 740' to form the second via plugs 897 and the second metal piece 897'. The second metal piece 897' can be used as described for the first metal piece 989'. The material of the via plug 897 and metal piece 897' may be gold or copper. For example, the via plug 897 and metal piece 897' may be formed by a suitable process or processes, e.g., by electroplating a gold layer with a thickness of between 1 and 100 μm, and preferably of between 2 and 30 μm, on the gold layer, exposed by the openings 740, of the bulk conduction metal layer 8022, and on the seed layer, made of gold, of the adhesion/barrier/seed layer 8021 exposed by the openings 740'. Alternatively, the via plug 897 and metal piece 897' may be formed by a suitable process or processes, e.g., by electroplating a copper layer with a thickness of between 1 and 100 μm, and preferably of between 2 and 30 μm, on the copper layer, exposed by the openings 740, of the bulk conduction metal layer 8022, and on the seed layer, made of copper, of the adhesion/barrier/seed layer 8021 exposed by the openings 740'.

Figure 17D:
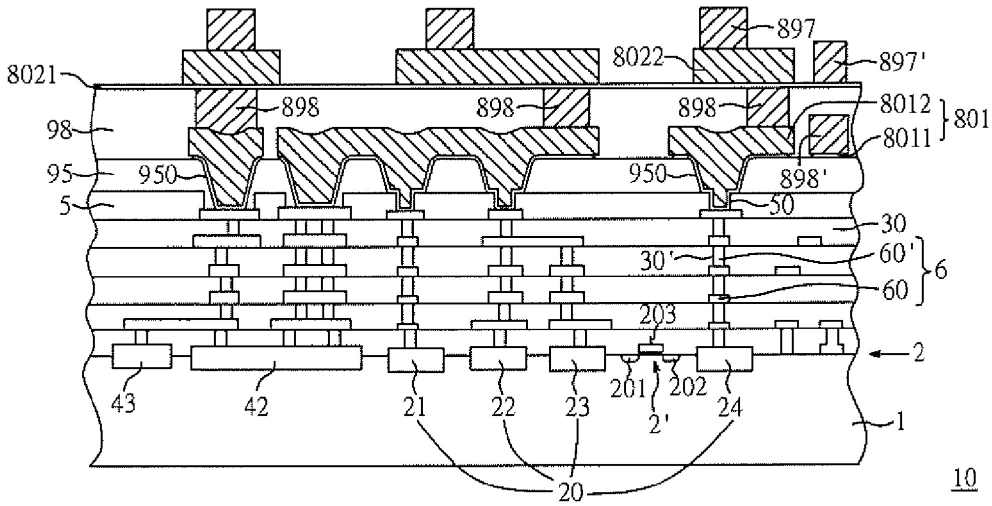

Referring to FIG. 17D, the second photoresist layer 74 is then stripped using an organic solution with amide. However, some residuals from the photoresist layer 74 could remain on the bulk conduction metal layer 8022 and on the seed layer of the adhesion/barrier/seed layer 8021. Thereafter, the residuals can be removed from the bulk conduction metal layer 8022 and from the seed layer with a plasma, such as $O_2$ plasma or plasma containing fluorine of below 200 PPM and oxygen.

Alternatively, after the bulk conduction metal layer 8022 is formed on the seed layer of the adhesion/barrier/seed layer 8021 exposed by the openings 730 illustrated in FIG. 16I, without removing the photoresist layer 73, the photoresist layer 74 shown in FIG. 17B can be formed on the photoresist layer 73 and on the bulk conduction metal layer 8022. The openings 740 in the photoresist layer 74 expose the bulk conduction metal layer 8022, respectively, for defining the pattern of the via plugs 897. The process for forming the via plugs 897 can be referred to as the above disclosure. Finally, the photoresist layers 73 and 74 are removed using an organic solution with amide. However, some residuals from the photoresist layers 73 and 74 could remain on the bulk conduction metal layer 8022, on the via plugs 897 and on the seed layer of the adhesion/barrier/seed layer 8021. Thereafter, the residuals can be removed from the seed layer of the adhesion/barrier/seed layer 8021, from the via plugs 897 and from, the bulk conduction metal layer 8022 with a plasma, such as $O_2$ plasma or plasma containing fluorine of below 200 PPM and oxygen. Next, the adhesion/barrier/seed layer 8021 not under the bulk conduction metal layer 8022 can be removed, as mentioned in the above description.

Figure 17E:
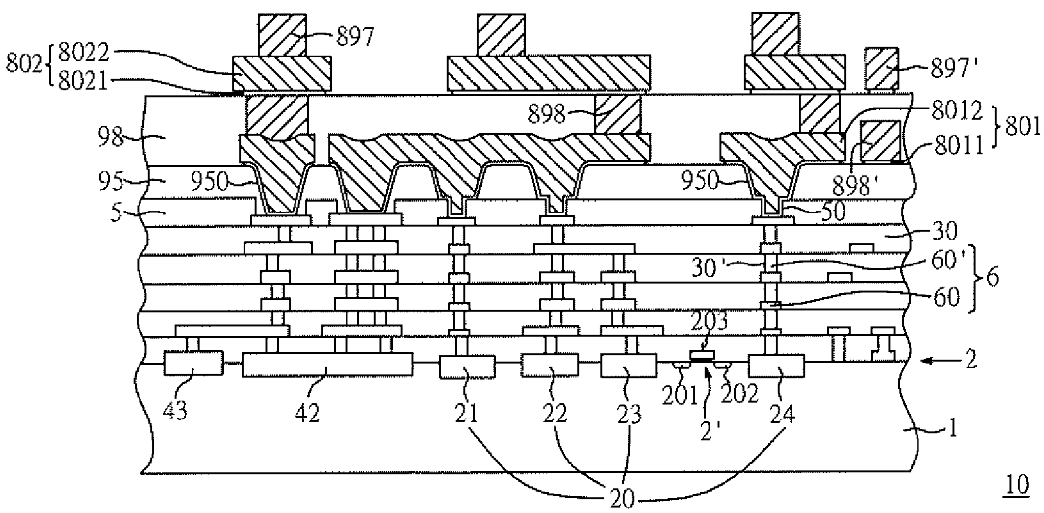

Referring to FIG. 17E, the second adhesion/barrier/seed layer 8021 not under the second bulk conduction metal layer 8022 and not under the second metal piece 987' is removed. The process of removing the second adhesion/barrier/seed layer 8021 not under the second bulk conduction metal layer 8022 and not under the second metal piece 897', as shown in FIG. 17E, can be referred to as the process of removing the first adhesion/barrier/seed layer 8011 not under the first bulk metal layer 8012 and not under the metal piece 898', as illustrated in FIG. 16D.

Figure 17F:
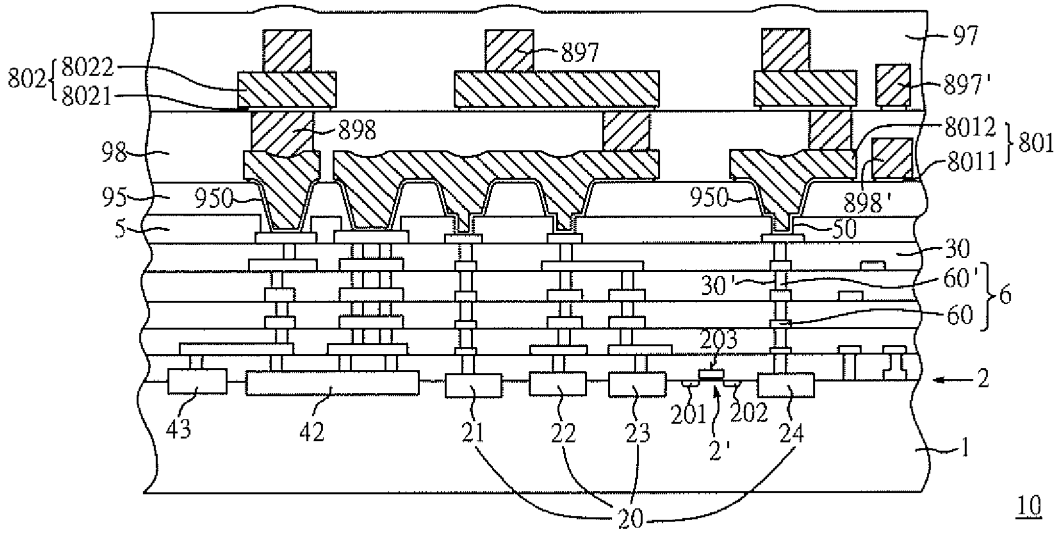
Figure 17G:
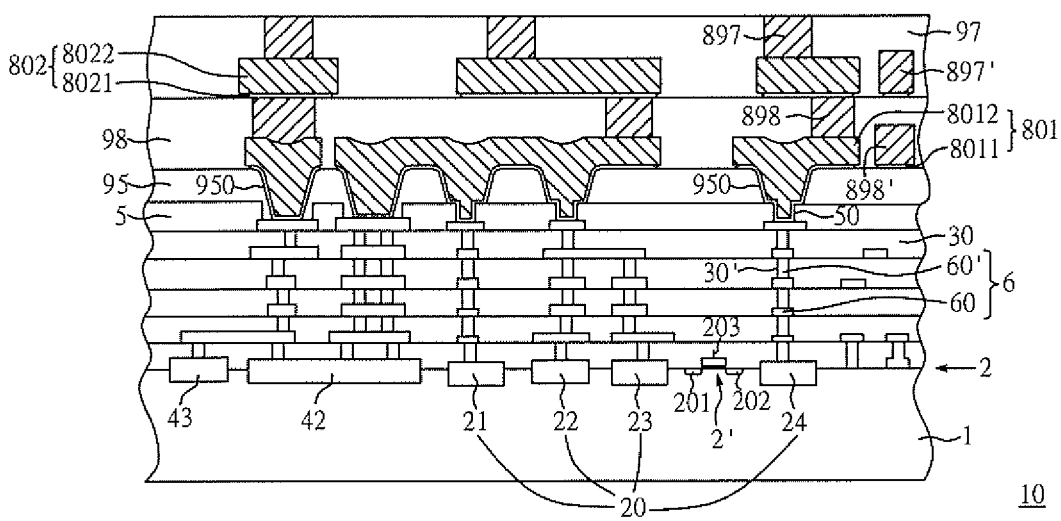

Referring to FIGS. 17F-17G, a second inter-metal dielectric polymer layer 97 is then deposited and planarized to expose the second via plugs 897. The material of the polymer layer 97 may be polyimide (PI), benzocyclobutane (BCB), polyurethane, epoxy resin, a parylene-based polymer, a solder-mask material, an elastomer, silicone or a porous dielectric material. The process for forming the polymer layer 97 in FIG. 17F can be as referred to as the process for forming the polymer layer 98 in FIG. 16E; the process for planarizing the polymer layer 97 in FIG. 17G can be as referred to as the process for planarizing the polymer layer 98 in FIG. 16F.

For example, the polymer layer 97 can be formed by a suitable process or processes, e.g., by spin-on coating a negative-type photosensitive polyimide layer, containing ester-type precursor, having a thickness of between 10 and 120 μm on the exposed bulk conduction metal layer 8022, on the via plugs 897, on the metal piece 897' and on the exposed polymer layer 98, then baking the spin-on coated polyimide layer, then curing or heating the baked polyimide layer at a peak temperature of between 290 and 400° C. for a time of between 20 and 150 minutes in a nitrogen ambient or in an oxygen-free ambient, the cured polyimide layer having a thickness of between 5 and 60 μm, and then polishing or mechanical polishing, exemplary chemical-mechanical polishing, an upper surface of the polymer layer 97 to uncover the via plugs 897 and to planarize the upper surface thereof. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 17H:
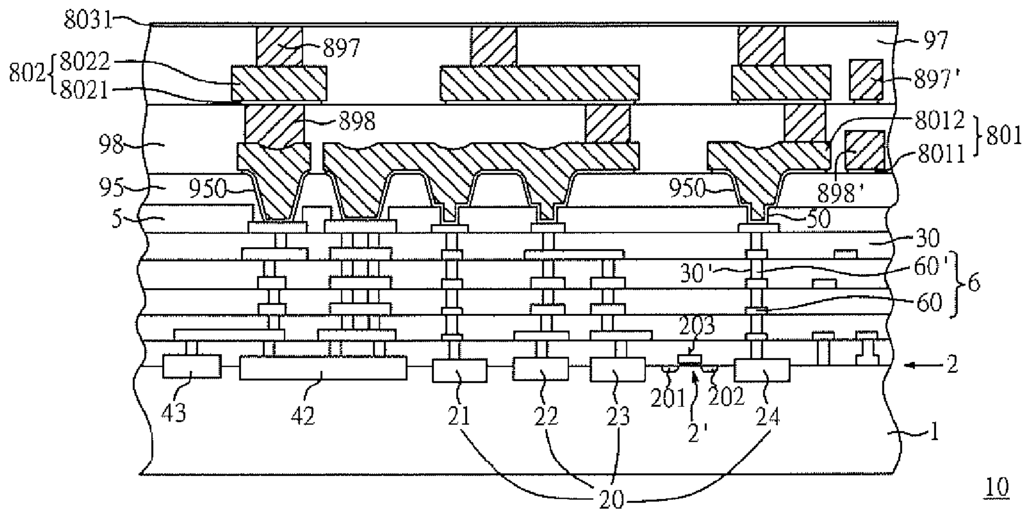
Figure 17I:
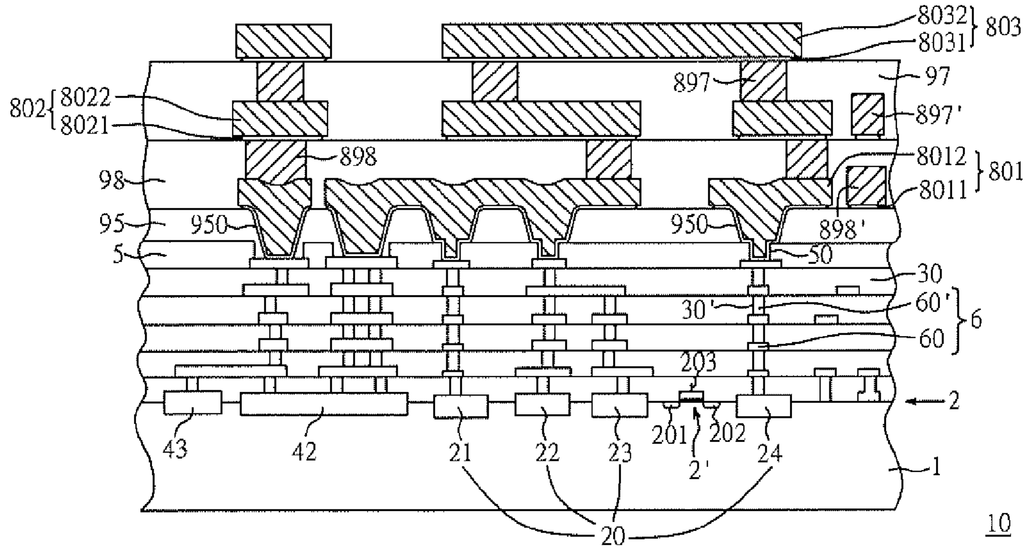

FIGS. 17H and 17I show a single-embossing process is used to form a third metal layer 803 by first depositing an adhesion/barrier/seed layer 8031, depositing and patterning a photoresist layer, electroplating a bulk conduction metal layer 8032, stripping the photoresist layer and self-aligned etch the adhesion/barrier/seed layer 8031. The specification of the adhesion/barrier/seed layer 8031 and the bulk conduction metal layer 8032 shown in FIGS. 17H-17I can be referred to as the specification of the adhesion/barrier/seed layer 8011 and the bulk metal layer 8012, respectively, illustrated in FIGS. 15D-15H. The process of forming the adhesion/barrier/seed layer 8031 shown in FIGS. 17H-17I can be referred to as the process of forming the adhesion/barrier/seed layer 8011 illustrated in FIGS. 15D-15H. The process of forming the bulk conduction metal layer 8032 shown in FIGS. 17H-17I can be referred to as the process of forming the bulk metal layer 8012 illustrated in FIGS. 15D-15H.

Figure 17J:
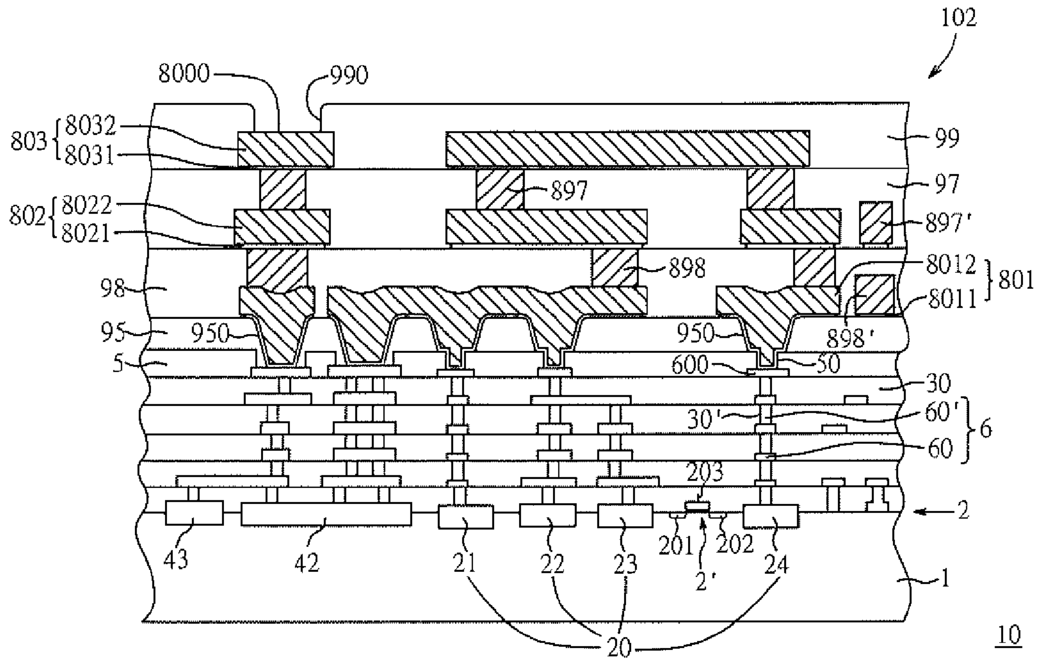

FIG. 17J shows a completed structure by forming a polymer layer 99 on the exposed polymer layer 97 and on the third metal layer 803, and an opening 990 in the polymer layer 99 exposes a contact point 8000 for interconnection to an external circuit. The polymer layer 99 may be formed by a suitable process or processes, e.g., by a spin-on coating process, a lamination process or a screen-printing process. The polymer layer 99 may include polyimide (PI), benzocyclobutane (BCB), polyurethane, epoxy resin, a parylene-based polymer, a solder-mask material, an elastomer, silicone or a porous dielectric material.

For example, the polymer layer 99 can be formed by a suitable process or processes, e.g., by spin-on coating a negative-type photosensitive polyimide layer, containing ester-type precursor, having a thickness of between 6 and 50 μm on the exposed polymer layer 97 and on the bulk conduction metal layer 8032, then baking the spin-on coated polyimide layer, then exposing the baked polyimide layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form a polyimide opening in the exposed polyimide layer exposing the contact point 8000, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the contact point 8000 exposed by the polyimide opening with an $O_2$ plasma or a plasma containing fluorine of below 200 PPM and oxygen, such that the polymer layer 99 can be patterned with an opening 990 in the polymer layer 99 exposing the contact point 8000. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

The contact point 8000 can be used to be connected to an external circuit via a wirebonding process, a solder bonding process or a tape-automated-bonding (TAB) process, and the external circuit may be another semiconductor chip, a flexible substrate including a polymer layer (such as polyimide) having a thickness between 30 and 200 micrometers and not including any polymer layer with glass fiber, a glass substrate, a ceramic substrate including a ceramic material as insulating layers between circuit layers, a silicon substrate, an organic substrate, a printed circuit board (PCB) or a ball grid array (BGA) substrate.

After forming the over-passivation scheme of the top post-passivation technology shown in FIG. 17J, the semiconductor wafer 10 can be cut into a plurality of individual semiconductor chip by a die-sawing process. An over-passivation scheme 102 shown in FIG. 17J includes the polymer layers 95, 97, 98 and 99, the patterned circuit layers 801, 802 and 803, the via plugs 897 and 898, and the metal pieces 897' and 898', and the openings 950 in the polymer layer 95 are over the regions of the metal pads or traces 600 exposed by the openings 50 in the passivation layer 5, and the opening 990 in the polymer layer 99 is over the contact point 8000 of the patterned circuit layer 803 and exposes it.

FIGS. 18A to 18I show another alternative of process steps to form an over-passivation scheme with three metal layers 801, 802 and 803. Metal layers 801 and 803 are formed by a suitable process or processes, e.g., by a single-emboss process, while the metal layer 802 is formed by a suitable process or processes, e.g., by a double-emboss process.

Figure 18A:
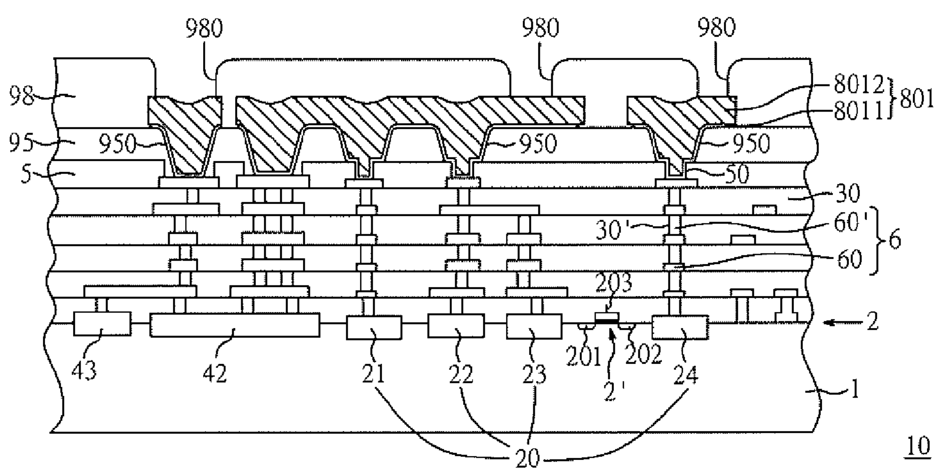

Referring to FIG. 18A, a first single-embossing process is used to form the first metal layer 801 as described in FIGS. 15D-15H. Next, a first inter-metal polymer layer 98 is deposited and patterned with openings 980 to expose the first metal layer 801, as shown in process step of FIG. 15I. FIG. 18A is at the same process step as FIG. 15I when the first metal layer 801 and the first inter-metal dielectric polymer layer 98 are formed by a suitable process or processes, e.g., by a single-emboss metal process, and the inter-metal dielectric polymer layer 98 is deposited and patterned with openings 980 exposing the first metal layer 801. The design of the first metal layer 801 and the first inter-metal polymer openings 980 in FIG. 18A is slightly different from that in FIG. 15I to accommodate an additional metal layer. The process steps in FIGS. 18B-18G show a double-embossing process to form a second metal layer 802 and via plugs 897. The specification of the polymer layer 95, the metal layer 801 and the polymer layer 98 shown in FIGS. 18A-18I can be referred to as the specification of the polymer layer 95, the metal layer 801 and the polymer layer 98, respectively, illustrated in FIGS. 15C-15K. The process of forming the polymer layer 95 shown in FIG. 18A can be referred to as the polymer layer 95 illustrated in FIGS. 15C-15K. The process of forming the metal layer 801 shown in FIG. 18A can be referred to as the metal layer 801 illustrated in FIGS. 15C-15K. The process of forming the polymer layer 98 shown in FIG. 18A can be referred to as the polymer layer 98 illustrated in FIGS. 15C-15K.

Figure 18B:
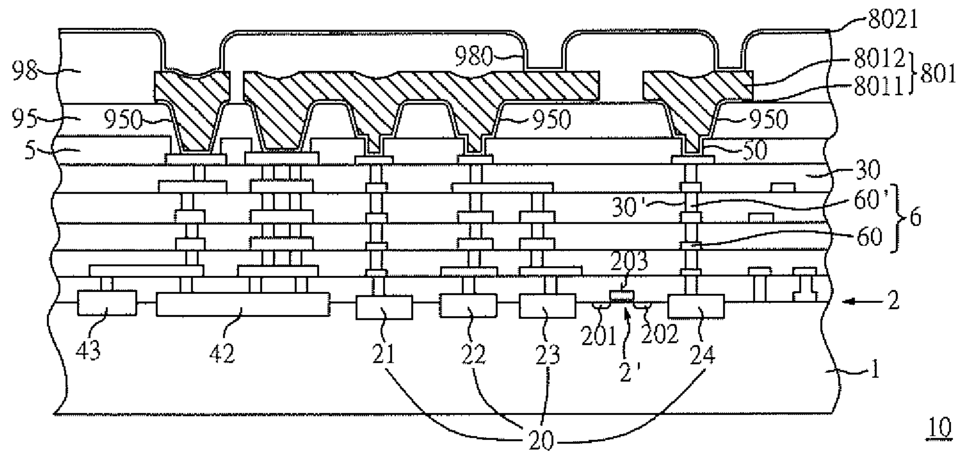

Referring to FIG. 18B, a second adhesion/barrier/seed layer 8021 is deposited on the polymer layer 98 and on the first metal layer 801 exposed by the openings 980. The specification of the second adhesion/barrier/seed layer 8021 shown in FIGS. 18B-18I can be referred to as the specification of the second adhesion/barrier/seed layer 8021 illustrated in FIGS. 15J-15K. The process of forming the second adhesion/barrier/seed layer 8021 shown in FIG. 18B can be referred to as the process of forming the second adhesion/barrier/seed layer 8021 illustrated in FIGS. 15J-15K.

Figure 18C:
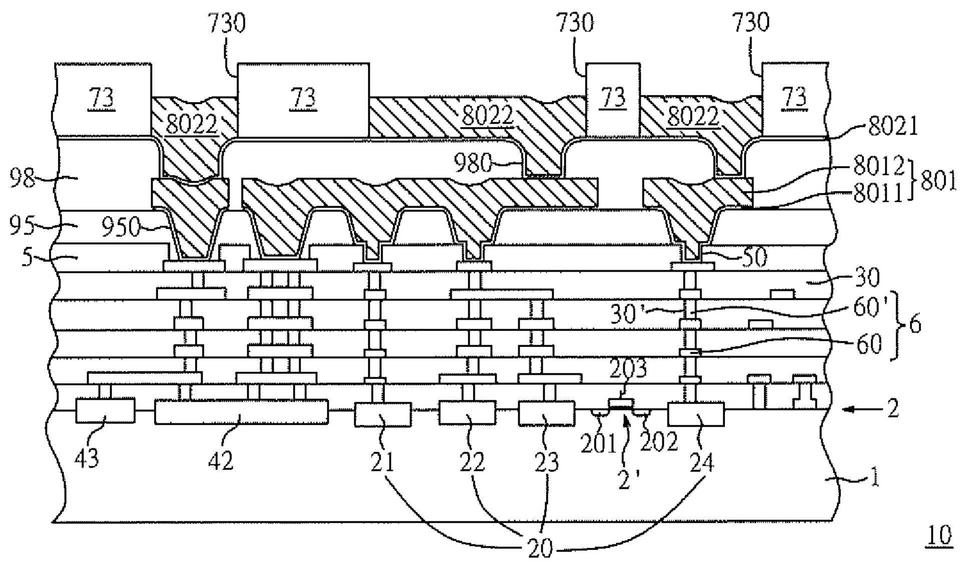

Referring to FIG. 18C, a photoresist layer 73, such as positive-type photoresist layer, is deposited on the seed layer of the second adhesion/barrier/seed layer 8021. Next, the photoresist layer 73 is patterned with exposure and development processes to form openings 730 in the photoresist layer 73 exposing the seed layer of the second adhesion/barrier/seed layer 8021. A 1× stepper or 1× contact aligner can be used to expose the photoresist layer 73 during the process of exposure.

For example, the photoresist layer 73 can be formed by a suitable process or processes, e.g., by spin-on coating a positive-type photosensitive polymer layer on the seed layer of the second adhesion/barrier/seed layer 8021, then exposing the photosensitive polymer layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer with an $O_2$ plasma or a plasma containing fluorine of below 200 PPM and oxygen, such that the photoresist layer 73 can be patterned with openings 730 in the photoresist layer 73 exposing the seed layer.

Next, a bulk conduction layer 8022 can be electroplated and/or electroless plated over the seed layer exposed by the openings 730. The bulk conduction layer 8022 may be a single layer of gold, copper, silver, palladium, platinum, rhodium, ruthenium, rhenium or nickel, or a composite layer made of the previously described metals. The specification of the bulk conduction metal layer 8022 shown in FIGS. 18C-18I can be referred to as the specification of the bulk metal layer 8012 illustrated in FIGS. 15F-15K. The process of forming the bulk conduction metal layer 8022 shown in FIGS. 18C-18I can be referred to as the process of forming the bulk metal layer 8012 illustrated in FIGS. 15F-15K.

Figure 18D:
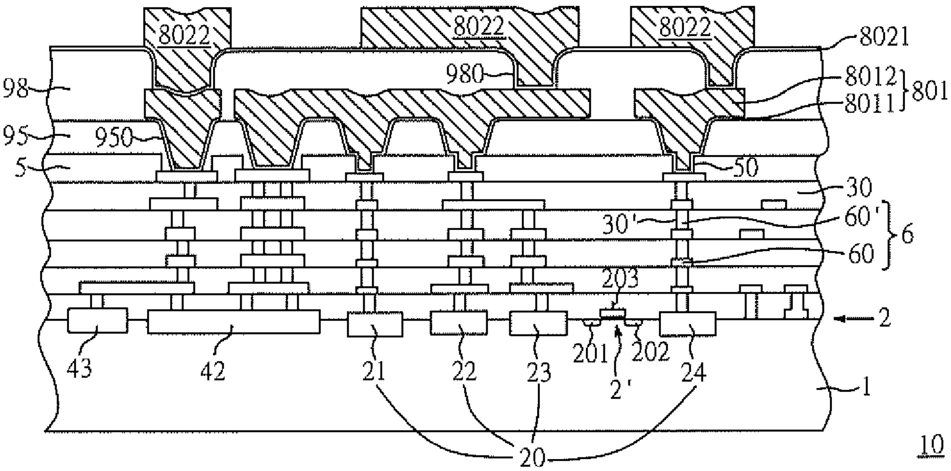

Referring to FIG. 18D, the photoresist layer 73 is then stripped using an organic solution with amide. However, some residuals from the photoresist layer 73 could remain on the bulk conduction metal layer 8022 and on the seed layer of the adhesion/barrier/seed layer 8021. Thereafter, the residuals can be removed from the seed layer of the adhesion/barrier/seed layer 8021 and from the bulk conduction metal layer 8022 with a plasma, such as $O_2$ plasma or plasma containing fluorine of below 200 PPM and oxygen.

Figure 18E:
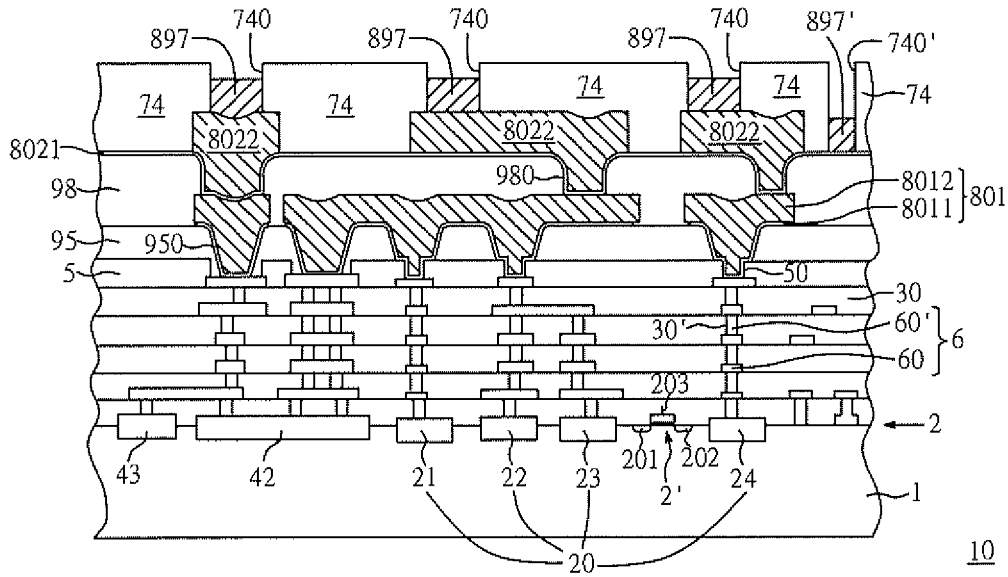

Referring to FIG. 18E, a photoresist layer 74 is then deposited and patterned to form openings 740 over the second bulk conduction metal layer 8022 and/or to optionally form openings 740' directly on the seed layer of the second adhesion/barrier/seed layer 8021. For example, the photoresist layer 74 can be formed by a suitable process or processes, e.g., by spin-on coating a positive-type photosensitive polymer layer on the seed layer of the adhesion/barrier/seed layer 8021 and on the bulk conduction metal layer 8022, then exposing the photosensitive polymer layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer and form the bulk conduction metal layer 8022 with an $O_2$ plasma or a plasma containing fluorine of below 200 PPM and oxygen, such that the photoresist layer 74 can be patterned with the openings 740 and 740' exposing the bulk conduction metal layer 8022 and the seed layer of the adhesion/barrier/seed layer 8021, respectively.

Next, a via plug layer is electroplated in the photoresist openings 740 and 740' to form via plugs 897 and metal piece 897'. The metal piece 897' can be used as described for the metal piece 898' in FIG. 16D.

The material of the via plug 897 and metal piece 897' may be gold or copper. For example, the via plug 897 and metal piece 897' may be formed by a suitable process or processes, e.g., by electroplating a gold layer with a thickness of between 1 and 100 μm, and preferably of between 2 and 30 μm, on the gold layer, exposed by the openings 740, of the bulk conduction metal layer 8022, and on the seed layer, made of gold, of the adhesion/barrier/seed layer 8021 exposed by the openings 740'. Alternatively, the via plug 897 and metal piece 897' may be formed by a suitable process or processes, e.g., by electroplating a copper layer with a thickness of between 1 and 100 μm, and preferably of between 2 and 30 μm, on the copper layer, exposed by the openings 740, of the bulk conduction metal layer 8022, and on the seed layer, made of copper, of the adhesion/barrier/seed layer 8021 exposed by the openings 740'.

Figure 18F:
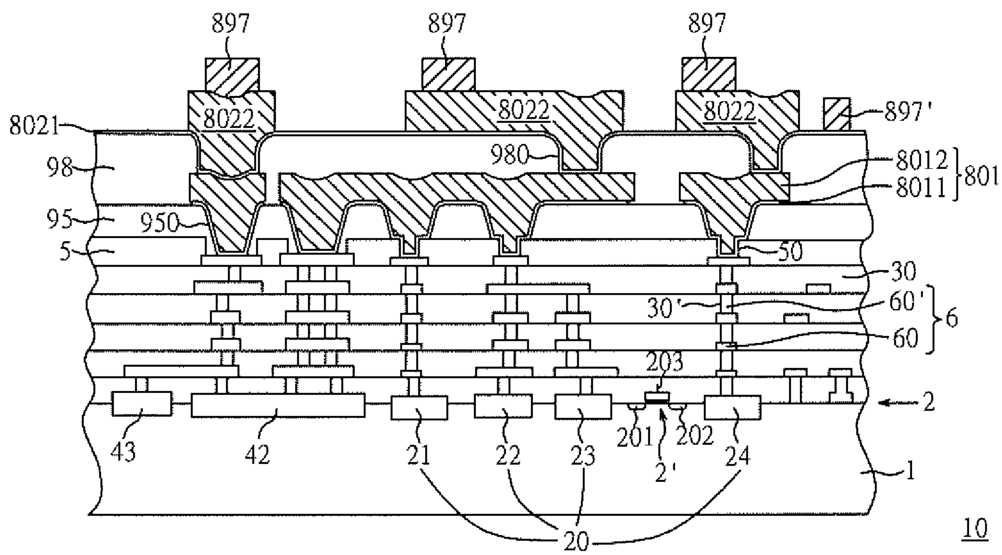

Referring to FIG. 18F, the photoresist layer 74 is then stripped using an organic solution with amide. However, some residuals from the photoresist layer 74 could remain on the exposed bulk conduction metal layer 8022, on the via plugs 897, on the metal piece 897' and on the seed layer of the adhesion/barrier/seed layer 8021. Thereafter, the residuals can be removed from the seed layer, from the via plugs 897, from the metal piece 897' and from the bulk conduction metal layer 8022 with a plasma, such as $O_2$ plasma or plasma containing fluorine of below 200 PPM and oxygen.

Alternatively, after the bulk conduction metal layer 8022 is formed on the seed layer of the adhesion/barrier/seed layer 8021 exposed by the openings 730 illustrated in FIG. 18C, without removing the photoresist layer 73, the photoresist layer 74 shown in FIG. 18E can be formed on the photoresist layer 73 and on the bulk conduction metal layer 8022. The openings 740 in the photoresist layer 74 expose the bulk conduction metal layer 8022, respectively, for defining the pattern of the via plugs 897. The process for forming the via plugs 897 can be referred to as the above disclosure. Finally, the photoresist layers 73 and 74 are removed using an organic solution with amide. However, some residuals from the photoresist layers 73 and 74 could remain on the bulk conduction metal layer 8022, on the via plugs 897 and on the seed layer of the adhesion/barrier/seed layer 8021. Thereafter, the residuals can be removed from the seed layer of the adhesion/barrier/seed layer 8021, from the via plugs 897 and from the bulk conduction metal layer 8022 with a plasma, such as $O_2$ plasma or plasma containing fluorine of below 200 PPM and oxygen. Next, the adhesion/barrier/seed layer 8021 not under the bulk conduction metal layer 8022 can be removed, as mentioned in the above description.

Figure 18G:
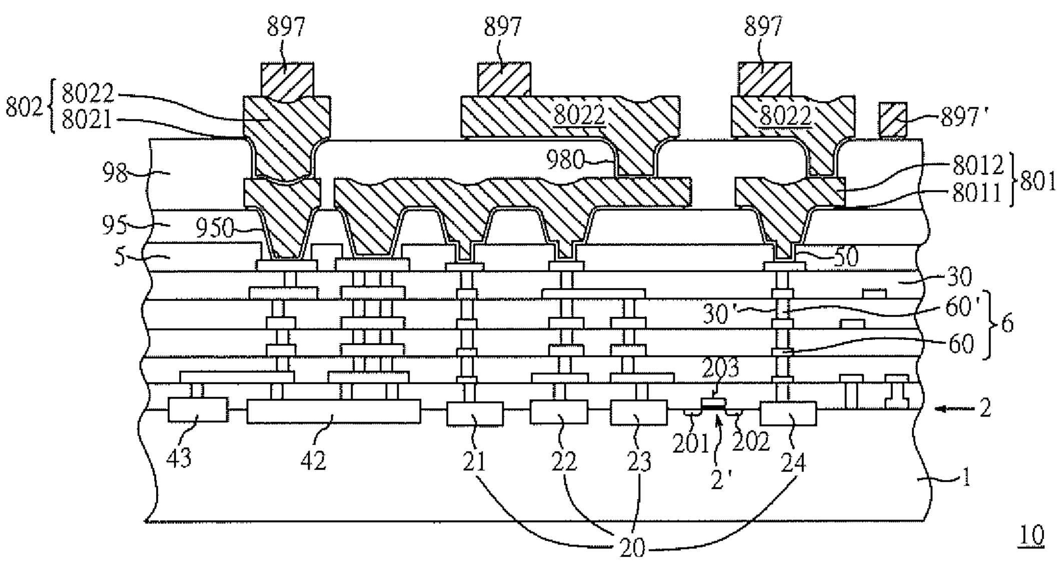

Referring to FIG. 18G, the adhesion/barrier/seed layer 8021 not under the bulk conduction metal layer 8022 and not under the metal piece 897' can be removed. The process of removing the adhesion/barrier/seed layer 8021 not under the bulk conduction metal layer 8022 and not under the second metal piece 897', as shown in FIG. 18G, can be referred to as the process of removing the adhesion/barrier/seed layer 8011 not under the bulk metal layer 8012 and not under the metal piece 898', as illustrated in FIG. 16D.

Figure 18H:
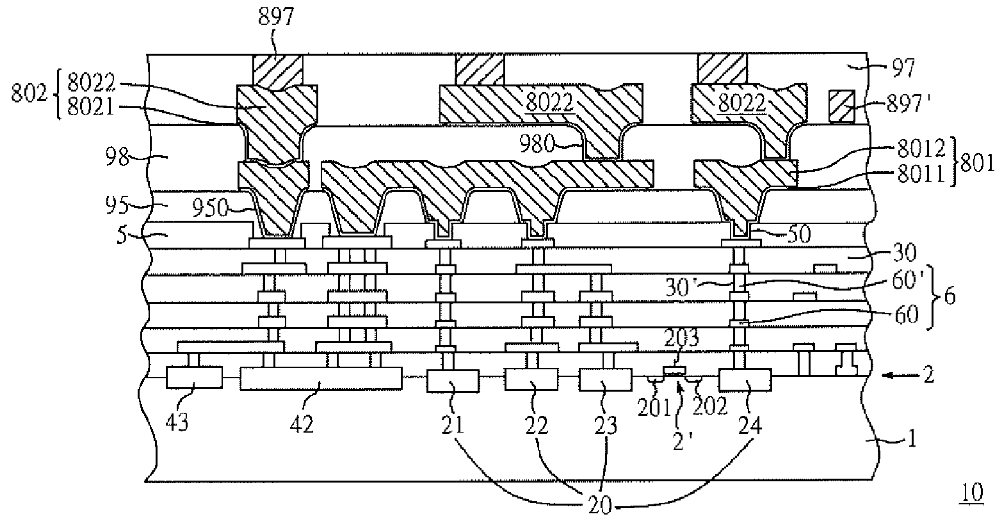

Referring to FIG. 18H, a second inter-metal dielectric polymer layer 97 is then deposited and planarized to expose the second via plugs 897. The material of the polymer layer 97 may be polyimide (PI), benzocyclobutane (BCB), polyurethane, epoxy resin, a parylene-based polymer, a solder-mask material, an elastomer, silicone or a porous dielectric material.

For example, the polymer layer 97 can be formed by a suitable process or processes, e.g., by spin-on coating a negative-type photosensitive polyimide layer, containing ester-type precursor, having a thickness of between 10 and 120 μm on the exposed bulk conduction metal layer 8022, on the via plugs 897, on the metal piece 897' and on the exposed polymer layer 98, then baking the spin-on coated polyimide layer, then curing or heating the baked polyimide layer at a peak temperature of between 290 and 400° C. for a time of between 20 and 150 minutes in a nitrogen ambient or in an oxygen-free ambient, the cured polyimide layer having a thickness of between 5 and 60 μm, and then polishing or mechanical polishing, exemplary chemical-mechanical polishing, an upper surface of the polymer layer 97 to uncover the via plugs 897 and to planarize the upper surface thereof. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 18I:
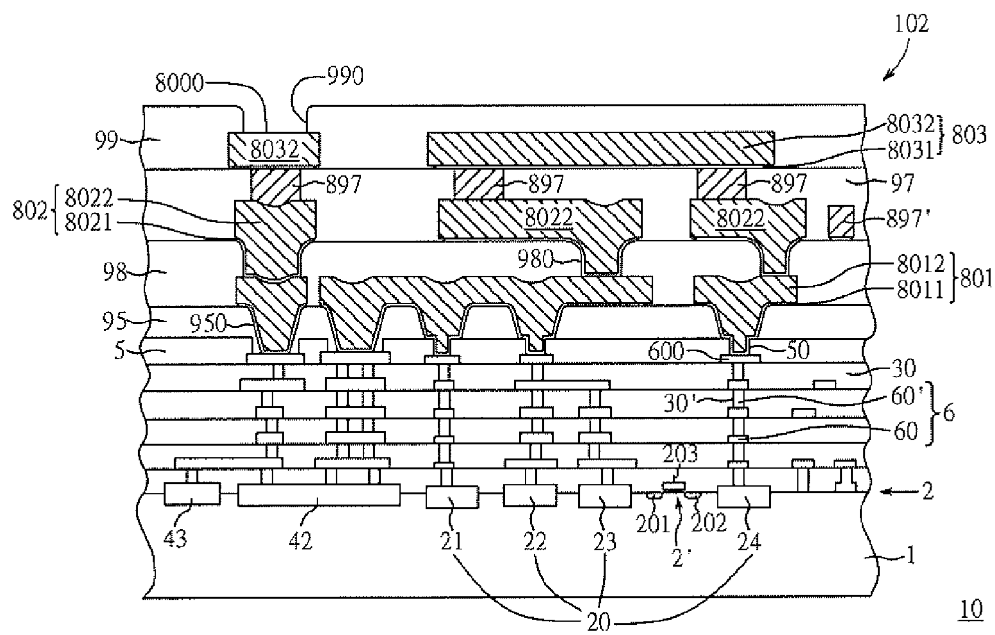

FIG. 18I shows a completed structure by first forming the third metal layer 803 is formed by a suitable process or processes, e.g., by a single-embossing process as described in FIGS. 17H-17I. Next, a polymer layer 99 is spin coated on the patterned circuit layer 803, and an opening 990 is formed in the polymer layer 99 to expose a contact point 8000 for interconnection to an external circuit. The specification of the adhesion/barrier/seed layer 8031 and the bulk conduction metal layer 8032 shown in FIG. 18I can be referred to as the specification of the adhesion/barrier/seed layer 8011 and the bulk metal layer 8012, respectively, illustrated in FIGS. 15D-15H. The process of forming the adhesion/barrier/seed layer 8031 shown in FIG. 18I can be referred to as the process of forming the adhesion/barrier/seed layer 8011 illustrated in FIGS. 15D-15H. The process of forming the bulk conduction metal layer 8032 shown in FIG. 18I can be referred to as the process of forming the bulk metal layer 8012 illustrated in FIGS. 15D-15H. The specification of the polymer layer 99 shown in FIG. 18I can be referred to as the specification of the polymer layer 99 illustrated in FIG. 17J. The process of forming the polymer layer 99 shown in FIG. 18I can be referred to as the process of forming the polymer layer 99 and the opening 990 illustrated in FIG. 17J.

The contact point 8000 can be used to be connected to an external circuit via a wirebonding process, a solder bonding process or a tape-automated-bonding (TAB) process, and the external circuit may be another semiconductor chip, a flexible substrate including a polymer layer (such as polyimide) having a thickness of between 30 and 200 micrometers and not including any polymer layer with glass fiber, a glass substrate, a ceramic substrate including a ceramic material as insulating layers between circuit layers, a silicon substrate, an organic substrate, a printed circuit board (PCB) or a ball grid array (BGA) substrate.

After forming the over-passivation scheme of the top post-passivation technology shown in FIG. 18I, the semiconductor wafer 10 can be cut into a plurality of individual semiconductor chip by a die-sawing process. An over-passivation scheme 102 shown in FIG. 18I includes the polymer layers 95, 97, 98 and 99, the patterned circuit layers 801, 802 and 803, the via plugs 897, and the metal piece 897', and the openings 950 in the polymer layer 95 are over the regions of the metal pads or traces 600 exposed by the openings 50 in the passivation layer 5, and the openings 980 in the polymer layer 98 are over the patterned circuit layer 801, and the opening 990 in the polymer layer 99 is over the contact point 8000 of the patterned circuit layer 803 and exposes it.

FIGS. 19A to 19H show another alternative of process steps to form an over-passivation scheme with two metal layers 801 and 802. The metal layer 801 is formed by a suitable process or processes, e.g., by a double-emboss process, while the metal layer 802 is formed by a suitable process or processes, e.g., by a single-emboss process.

Figure 19A:
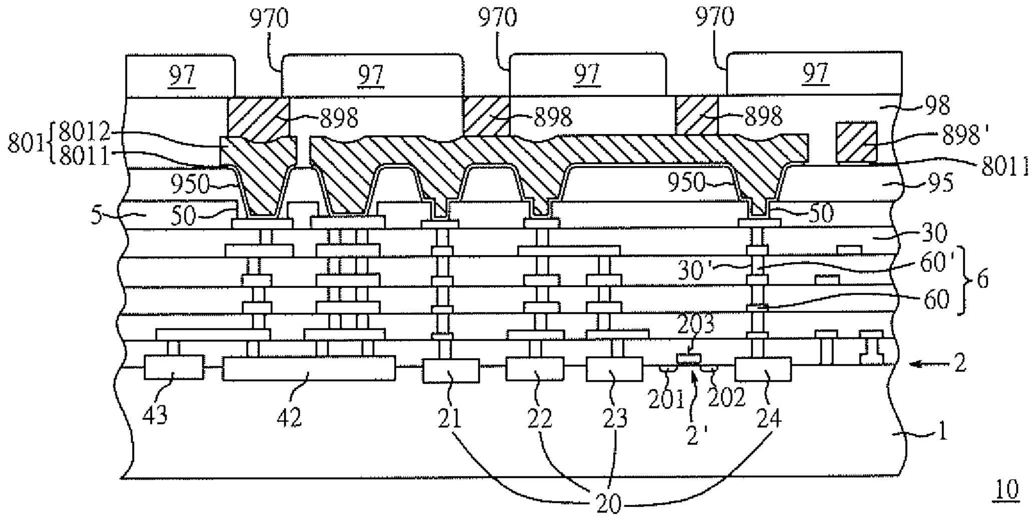

Referring to FIG. 19A, after the process steps of FIGS. 15C-15G and 16A-16F for forming the polymer layer 95, the openings 950, the metal layer 801, the via plugs 898, the metal pieces 898' and the polymer layer 98 are completed, a polymer layer 97 can be formed on the polymer layer 98, multiple openings 970 in the polymer layer 97 exposing the via plugs 898. The material of the polymer layer 97 may be polyimide (PI), benzocyclobutane (BCB), polyurethane, epoxy resin, a parylene-based polymer, a solder-mask material, an elastomer, silicone or a porous dielectric material.

For example, the polymer layer 97 can be formed by a suitable process or processes, e.g., by spin-on coating a negative-type photosensitive polyimide layer, containing ester-type precursor, having a thickness of between 6 and 50 μm on the polymer layer 98 and on the exposed via plugs 898, then baking the spin-on coated polyimide layer, then exposing the baked polyimide layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form polyimide openings in the exposed polyimide layer exposing the exposed via plugs 898, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the via plugs 898 exposed by the polyimide openings with an $O_2$ plasma or a plasma containing fluorine of below 200 PPM and oxygen, such that the polymer layer 97 can be patterned with openings 970 exposing the via plugs 898. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

Figure 19B:
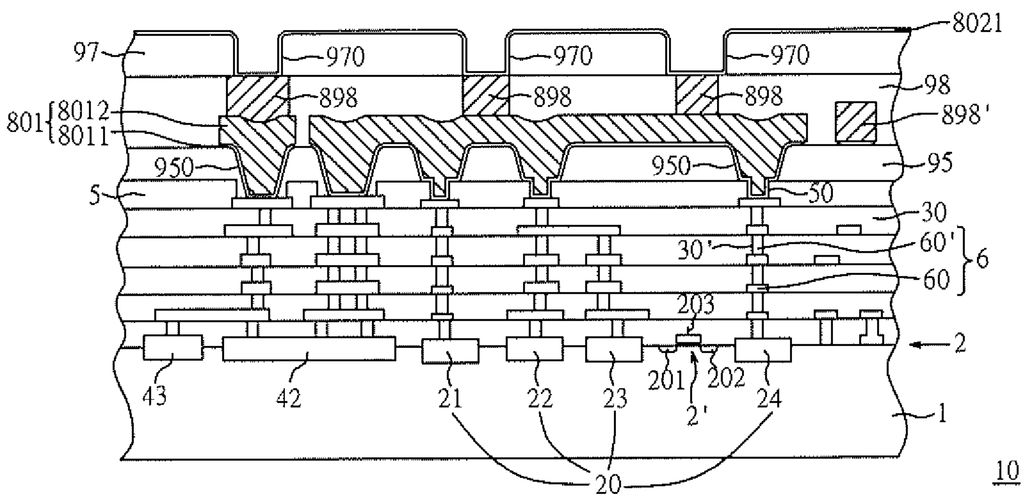

Referring to FIG. 19B, an adhesion/barrier/seed layer 8021 is deposited, exemplary by sputtering, on the polymer layer 97 and on the via plugs 898 exposed by the openings 970. Alternatively, the adhesion/barrier/seed layer 8021 can be formed by a suitable process or processes, e.g., by a process including a vapor deposition method, an evaporation method, a CVD method, an electroless plating method or a PVD method. The specification of the adhesion/barrier/seed layer 8021 shown in FIGS. 19B-19I can be referred to as the specification of the adhesion/barrier/seed layer 8011 illustrated in FIGS. 15D-15K. The process of forming the adhesion/barrier/seed layer 8021 shown in FIG. 19B can be referred to as the process of forming the adhesion/barrier/seed layer 8011 illustrated in FIGS. 15D-15K.

Figure 19C:
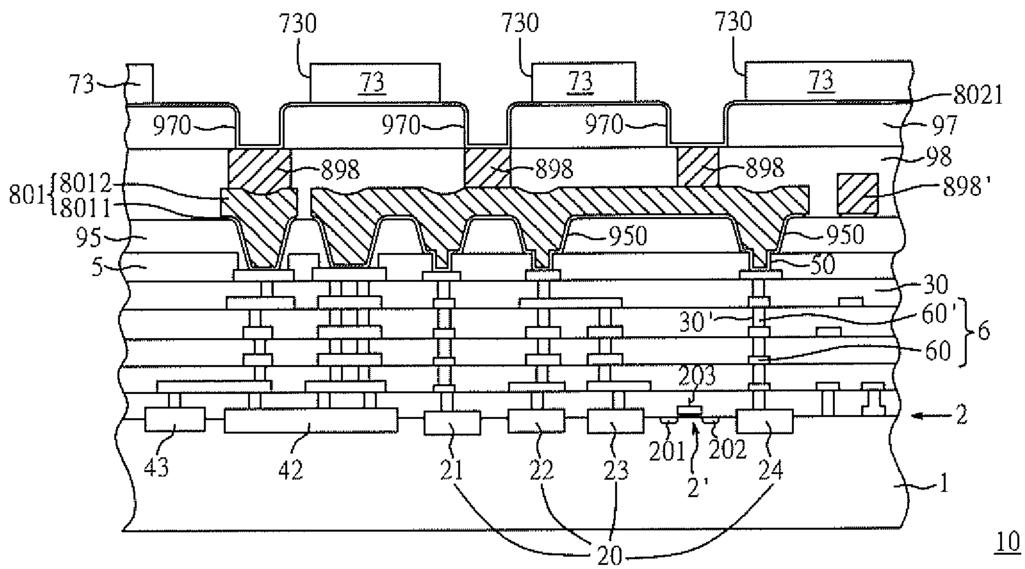

Referring to FIG. 19C, a photoresist layer 73, such as positive-type photoresist layer, is formed on the adhesion/barrier/seed layer 8021. Next, the photoresist layer 73 is patterned with exposure and development processes to form openings 730 in the photoresist layer 73 exposing the adhesion/barrier/seed layer 8021. A 1× stepper or 1× contact aligner can be used to expose the photoresist layer 730 during the process of exposure. The process of forming the photoresist layer 73 and the openings 730 in the photoresist layer 73 shown in FIG. 19C can be referred to as the process of forming the photoresist layer 73 and the openings 730 in the photoresist layer 73 illustrated in FIG. 18C.

Figure 19D:
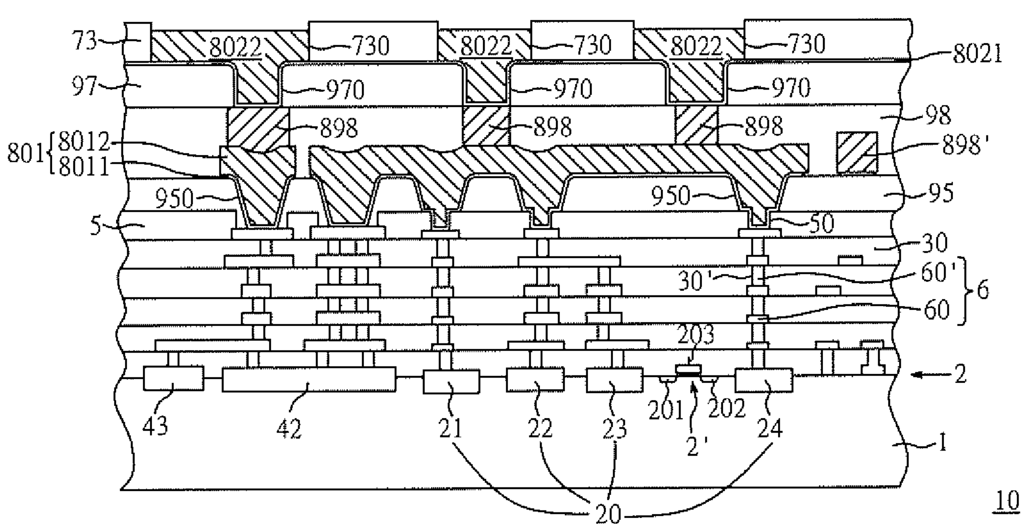

Referring to FIG. 19D, a bulk conduction metal layer 8022 can be electroplated and/or electroless plated over the adhesion/barrier/seed layer 8021 exposed by the openings 730. The bulk conduction layer 8022 may be a single layer of gold, copper, silver, palladium, platinum, rhodium, ruthenium, rhenium or nickel, or a composite layer made of the previously described metals. The specification of the bulk conduction metal layer 8022 shown in FIGS. 19D-19I can be referred to as the specification of the bulk metal layer 8012 illustrated in FIGS. 15F-15K. The process of forming the bulk conduction metal layer 8022 shown in FIG. 19D can be referred to as the process of forming the bulk metal layer 8012 illustrated in FIGS. 15F-15K.

Figure 19E:
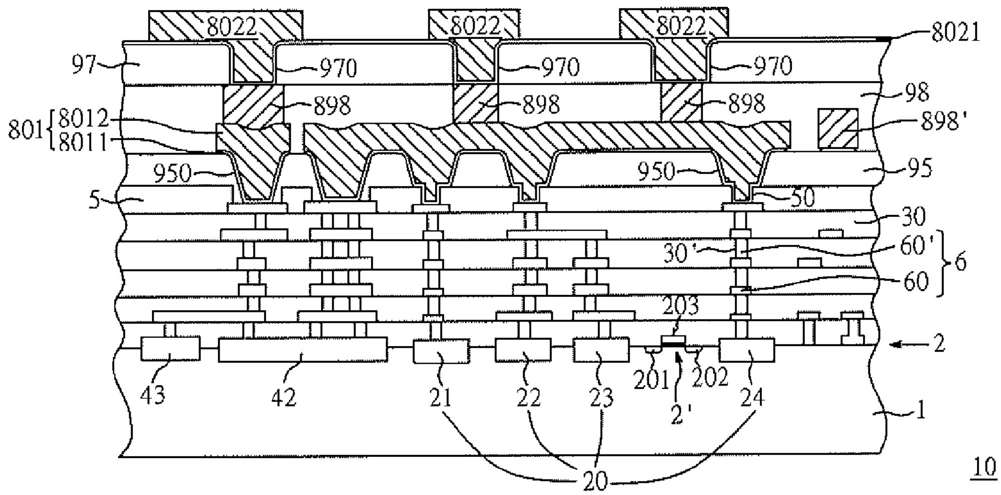

Referring to FIG. 19E, after the bulk conduction metal layer 8022 is formed, most of the photoresist layer 73 can be removed using an organic solution with amide. However, some residuals from the photoresist layer 73 could remain on the bulk conduction metal layer 8022 and on the seed layer of the adhesion/barrier/seed layer 8021. Thereafter, the residuals can be removed from the bulk conduction metal layer 8022 and from the seed layer with a plasma, such as $O_2$ plasma or plasma containing fluorine of below 200 PPM and oxygen.

Figure 19F:
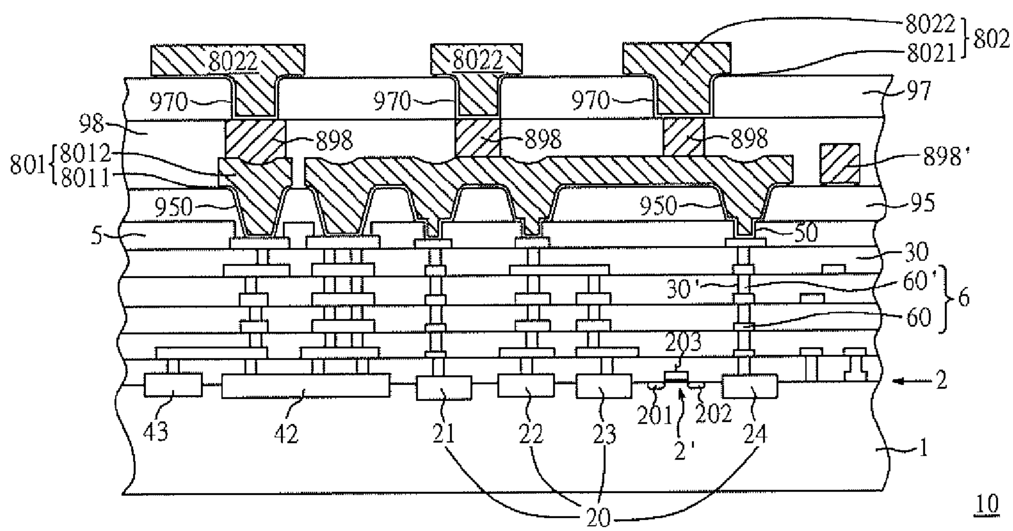

Referring to FIG. 19F, the adhesion/barrier/seed layer 8021 not under the bulk conduction metal layer 8022 is removed with a dry etching method or a wet etching method. As to the wet etching method, when the seed layer of the adhesion/barrier/seed layer 8021 is a gold layer, it can be etched with an iodine-containing solution, such as solution containing potassium iodide; when the seed layer of the adhesion/barrier/seed layer 8021 is a copper layer, it can be etched with a solution containing $NH_4OH$; when the adhesion/barrier layer of the adhesion/barrier/seed layer 8021 is a titanium-tungsten-alloy layer, it can be etched with a solution containing hydrogen peroxide; when the adhesion/barrier layer of the adhesion/barrier/seed layer 8021 is a titanium layer, it can be etched with a solution containing hydrogen fluoride; when the adhesion/barrier layer of the adhesion/barrier/seed layer 8021 is a chromium layer, it can be etched with a solution containing potassium ferricyanide. As to the dry etching method, when the seed layer of the adhesion/barrier/seed layer 8021 is a gold layer, it can be removed with an ion milling process or with an Ar sputtering etching process; when the adhesion/barrier layer of the adhesion/barrier/seed layer 8021 is a titanium layer or a titanium-tungsten-alloy layer, it can be etched with a chlorine-containing plasma etching process or with an RIE process. Generally, the dry etching method to etch the adhesion/barrier/seed layer 8021 not under the bulk conduction metal layer 8022 may include a chemical plasma etching process, a sputtering etching process, such as argon sputter process, or a chemical vapor etching process.

Accordingly, a second metal layer 802 can be formed on the polymer layer 97 and on the via plugs 898 exposed by the openings 970, and the second metal layer 802 is formed with the adhesion/barrier/seed layer 8021 and the bulk conduction metal layer 8022 on the adhesion/barrier/seed layer 8021.

Figure 19G:
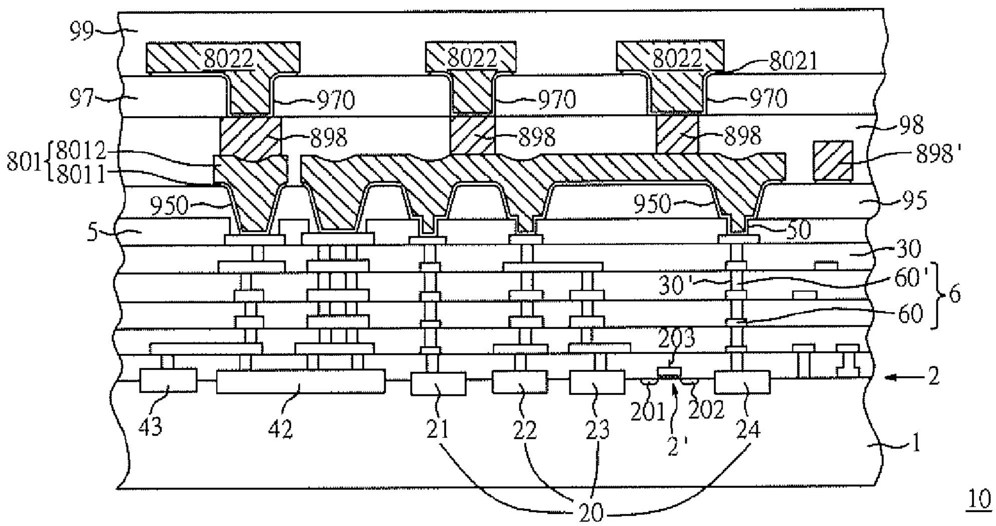
Figure 19H:
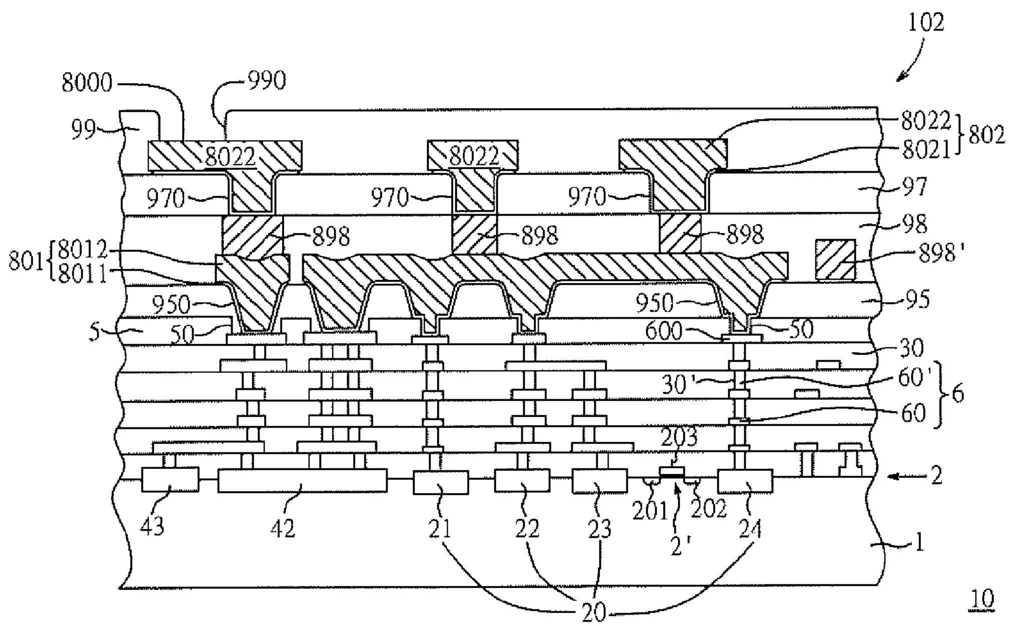
Figure 19I:
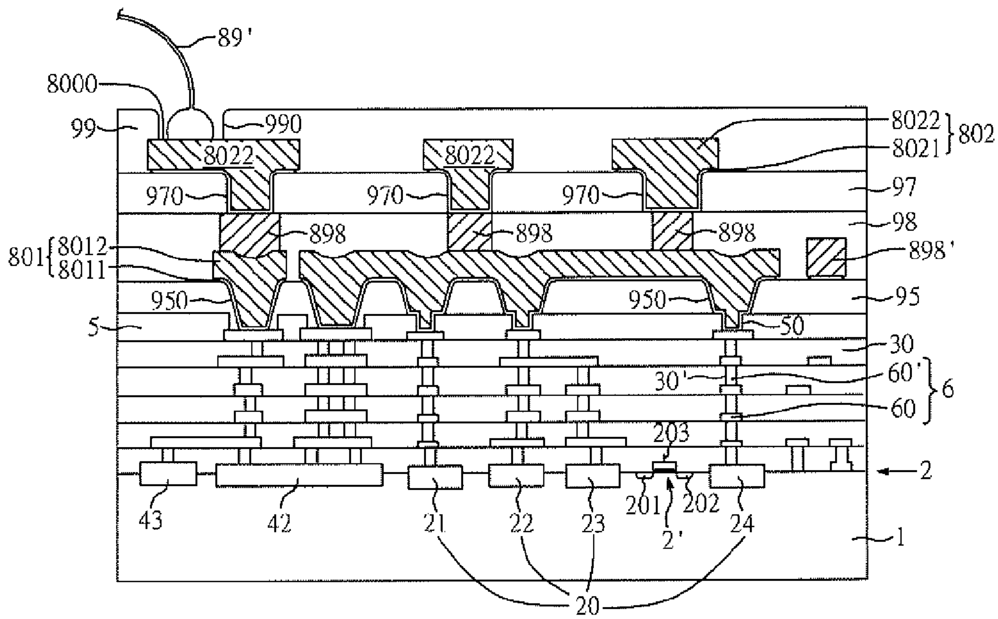

Referring to FIG. 19G, a polymer layer 99 is formed on the exposed polymer layer 97 and on the bulk metal layer 8022 via a spin-on coating process. Referring to FIG. 19H, the polymer layer 99 is patterned with exposure and development processes to form an opening 990 in the polymer layer 99 exposing the contact point 8000. Alternatively, the polymer layer 99 may be formed by a suitable process or processes, e.g., by a lamination process or a screen-printing process. The polymer layer 99 may include polyimide (PI), benzocyclobutane (BCB), polyurethane, epoxy resin, a parylene-based polymer, a solder-mask material, an elastomer, silicone or a porous dielectric material.

For example, the polymer layer 99 can be formed by a suitable process or processes, e.g., by spin-on coating a negative-type photosensitive polyimide layer, containing ester-type precursor, having a thickness of between 6 and 50 μm on the exposed polymer layer 97 and on the bulk conduction metal layer 8022, then baking the spin-on coated polyimide layer, then exposing the baked polyimide layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form an polyimide opening in the exposed polyimide layer exposing the contact point 8000, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the contact point 8000 exposed by the polyimide opening with an $O_2$ plasma or a plasma containing fluorine of below 200 PPM and oxygen, such that the polymer layer 99 can be patterned with an opening 990 in the polymer layer 99 exposing the contact point 8000. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

After forming the over-passivation scheme of the top post-passivation technology shown in FIG. 19H, the semiconductor wafer 10 can be cut into a plurality of individual semiconductor chip by a die-sawing process. The method of connecting the contact point 8000 in FIG. 19H to an external circuit can be referred to as the method of connecting the contact point 8000 in FIG. 15K to an external circuit. The external circuit may be another semiconductor chip, a flexible substrate including a polymer layer (such as polyimide) having a thickness between 30 and 200 μm and not including any polymer layer with glass fiber, a glass substrate, a ceramic substrate including a ceramic material as insulating layers between circuit layers, a silicon substrate, an organic substrate, a printed circuit board (PCB) or a ball grid array (BGA) substrate. For example, referring to FIG. 19I, via a wirebonding process, a wire 89', such as gold wire, copper wire or aluminum wire, can be bonded to the contact point 8000 of the semiconductor chip cut from the wafer 10.

Alternatively, the contact structure 89 illustrated in FIG. 15L or FIG. 15M can be formed on the contact point 8000 exposed by the opening 990. After the contact structure 89 is formed on the contact point 8000 of the wafer 10 shown in FIG. 19H, the wafer 10 can be diced into a plurality of individual semiconductor chip. An over-passivation scheme 102 shown in FIG. 19H includes the polymer layers 95, 97, 98 and 99, the patterned circuit layers 801 and 802, the via plugs 898, and the metal piece 898', and the openings 950 in the polymer layer 95 are over the regions of the metal pads or traces 600 exposed by the openings 50 in the passivation layer 5, and the openings 970 in the polymer layer 97 are over the via plugs 898, and the opening 990 in the polymer layer 99 is over the contact point 8000 of the patterned circuit layer 802 and exposes it.

FIGS. 21 and 22 show top views of a MOS transistor that can be a PMOS transistor or an NMOS transistor. Referring to FIG. 21, a transistor includes an active region 200, diffusion region, in or over the silicon substrate 1, a field oxide region 202 on the silicon substrate 1 and around the active region 200, a gate 204 on the field oxide region 202 and across the active region 200, and a gate oxide (not shown) between the active region 200 and the gate 204. The active region 200 can be defined as a source 206 at a side of the gate 204, and a drain 208 at the other side of the gate 204. The material of the gate 204 may be poly silicon, metal silicide or composite layer of above materials, and the metal silicide may be NiSi, CoS, $TiSi_2$ or WSi. Alternatively, the material of the gate 204 may be a metal, such as W, WN, TiN, Ta, TaN, Mo, or alloy or composite layer of above materials. The material of the gate oxide may be silicon oxide or high k oxide, such as Hf containing oxide. The Hf containing oxide may be $HfO_2$, HfSiON or HfSiO. The previously described physical channel width and physical channel length in the disclosure can be defined in FIG. 21. The reference mark of W is defined as the physical channel width of the transistor, the length of the gate 204 crossing over the diffusion region 200; the reference mark of L is defined as the physical channel length of the transistor, the width of the gate 204 over the diffusion region 200.

Referring to FIG. 22, alternatively, a transistor may include a gate 204 with multiple portions 204$_1$-204$_n$ over one or more diffusion regions 200. The reference marks of $W_1$-$W_n$ are defined as the physical channel width of each portion 204$_1$-204$_n$ of the gate 204, the length of each portion 204$_1$-204$_n$ of the gate 204 crossing over the diffusion region 200; the reference mark of L is defined as the physical channel length of one of the portions 204$_1$-204$_n$ of the gate 204, the width of one of the portions 204$_1$-204$_n$ of the gate 204 over the diffusion region 200. In this case, the physical channel width W of the transistor is the summation of the physical channel widths $W_1$-$W_n$ of each portions 204$_1$-204$_n$ of the gate 204, and the physical channel length L of the transistor is the physical channel length L of one of the portions 204$_1$-204$_n$ of the gate 204.

FIGS. 23A-23M show cross-sectional views for packaging a DRAM chip using the previously described process, and the elements, shown in FIGS. 23A-23M, indicated by same reference numbers as those indicating the previously described elements can be referred to as the above description about them. Referring to FIG. 23A, a DRAM wafer 10 includes multiple memory cells (not shown), multiple off-chip circuits and multiple internal circuits 20 in or on the silicon substrate 1. The DRAM wafer 10 may include an electrical fuse 25 and a laser fuse 26 over the silicon substrate 1, and the electrical fuse 25 and laser fuse 26 are connected to fine-line metal layers 30 over the silicon substrate 1. The electrical fuse 25 is composed of a polysilicon layer 251 having a thickness between 200 and 2,000 angstroms and a metal-silicide layer 252 having a thickness between 1,000 and 3,000 angstroms on the polysilicon layer 251. The metal-silicide layer 252 may contain titanium, cobalt, nickel or tungsten. The electrical fuse 25 in an unblown condition may have a sheet resistance of between 1 and 15 ohms/square. There may be an oxide-containing insulating layer having a dielectric constant of less than 3 on and/or under the electrical fuse 25. The laser fuse 26 may contain copper, aluminum or polysilicon. An opening 526 in the passivation layer 5 is formed over the laser fuse 26 and exposes a silicon-oxide layer over the laser fuse 26.

Next, an electrical testing process in a wafer level can be performed to verify good dies, non-repairable bad dies and repairable bad dies. Next, a step of laser repairing the repairable bad dies can be performed. In the step of laser repairing the repairable bad dies, the laser fuse 26 can be blown by laser light, such that the metal traces connected to both ends of the laser fuse 26 becomes an open circuit, as shown in FIG. 23B. Accordingly, the repairable bad dies possibly turn out to be good dies.

Next, referring to FIG. 23C, a polymer layer 95 can be formed on the passivation layer 5, on the silicon-oxide layer on the laser fuse 26 and on the blown portion of the laser fuse 26, with multiple openings 950 in the polymer layer 95 exposing multiple contact pads 600, such as aluminum pads or copper pads, exposed by multiple openings 50 in the passivation layer 5. The step of forming the polymer layer 95 can be referred to as the step of forming the polymer layer 95 on the passivation layer 5 as shown in FIG. 15C.

Next, referring to FIG. 23D, an adhesion/barrier/seed layer 8011 is formed on the polymer layer 95 and on the contact pads 600, which can be referred to as the step of forming the adhesion/barrier/seed layer 8011 on the polymer layer 95 and on the contact pads 600 as shown in FIG. 15D. Next, referring to FIG. 23E, a photoresist layer 71 is formed on the adhesion/barrier/seed layer 8011, with multiple openings 710 in the photoresist layer 71 exposing a seed layer of the adhesion/barrier/seed layer 8011, which can be referred to as the step of forming the photoresist layer 71 on the adhesion/barrier/seed layer 8011 as shown in FIG. 15E. Next, referring to FIG. 23F, a bulk conduction layer 8012 is formed over the adhesion/barrier/seed layer 8011 exposed by the openings 710 in the photoresist layer 71, which can be referred to as the step of forming the bulk conduction layer 8012 on the adhesion/barrier/seed layer 8011 as shown in FIG. 15F. Next, referring to FIG. 23G, the photoresist layer 71 is removed from the seed layer of the adhesion/barrier/seed layer 8011, which can be referred to as the step of removing the photoresist layer 71 as shown in FIG. 15G. Next, referring to FIG. 23H, the adhesion/barrier/seed layer 8011 not under the bulk conduction layer 8012 is removed, which can be referred to as the step of removing the adhesion/barrier/seed layer 8011 not under the bulk conduction layer 8012 as shown in FIG. 15H. Accordingly, the patterned circuit layer 801 can be formed with the adhesion/barrier/seed layer 8011 and the bulk conduction layer 8012 over the adhesion/barrier/seed layer 8011. The patterned circuit layer 801 may have a left portion connecting multiple of the internal circuits 20, without being connected to an external circuit through an opening in the polymer layer 99, and a right portion, for a relocation objective, readily connecting an off-chip circuit 40 to an external circuit through the opening 990 in the polymer layer 99.

Next, referring to FIG. 23I, a polymer layer 99 can be formed on the patterned circuit layer 801 and on the polymer layer 95, with multiple openings 990 in the polymer layer 99 exposing multiple contact points 8000 of the patterned circuit layer 801. The step of forming the polymer layer 99 on the patterned circuit layer 801 and on the polymer layer 95 can be referred to as the step of forming the polymer layer 99 on the patterned circuit layer 802 and on the polymer layer 98 as shown in FIG. 15K. The patterned circuit layer 801 may have a left portion connecting multiple of the internal circuits 20, without being connected to an external circuit through any opening in the polymer layer 99, and all of the left portion is covered by the polymer layer 99, and a right portion, for a relocation objective, readily connecting an off-chip circuit 40 to an external circuit through the opening 990 in the polymer layer 99.

Next, referring to FIG. 23J, another electrical testing process in a wafer level can be optionally performed to verify good dies, non-repairable bad dies and repairable bad dies. Next, a step of E-fuse repairing the repairable bad dies can be performed. In the step of E-fuse repairing the repairable bad dies, an electric current between 0.05 and 2 amperes passes through the electrical fuse 25 for a time between 50 and 1,800 microseconds, and preferably an electric current between 0.1 and 1 amperes passes through the electrical fuse 25 for a time between 100 and 900 microseconds, leading the electrical fuse 25 to be blown. At this time, the electrical fuse 25 has a portion having an electrical current only pass through the polysilicon layer 251 thereof but not pass through the metal-silicide layer 252 thereof. Accordingly, the repairable bad dies possibly turn out to be good dies. The blown electrical fuse 25 may have a sheet resistance between 100 and 10,000 ohms/square. After the step of E-fuse repairing the repairable bad dies, another electrical testing process in a wafer level can be optionally performed to verify good dies, non-repairable bad dies and repairable bad dies.

Next, the DRAM wafer 10 can be cut into multiple DRAM chips 10' using a mechanical cutting process or using a laser cutting process, as shown in FIG. 23K. The non-repairable bad dies can be discarded without being packaged in the following processes. An over-passivation scheme 102 shown in FIG. 23K includes the patterned circuit layer 801 and the polymer layers 95 and 99, and the openings 950 in the polymer layer 95 are over the regions of the metal pads or traces 600 exposed by the openings 50 in the passivation layer 5, and the opening 990 in the polymer layer 99 is over the contact point 8000 of the patterned circuit layer 801 and exposes it.

Next, referring to FIG. 23L, one of the DRAM chips 10' can be mounted to a printed circuit board (PCB) 13, ball-grid-array (BGA) substrate, via an adhesive material 11, such as silver epoxy. Next, a wire 89', such as gold wire, copper wire or aluminum wire, can be ball bonded on the contact point 8000 exposed by the opening 990 in the polymer layer 99 and wedge bonded on a contact point 15 of the printed circuit board 13. Next, a polymer material, such as epoxy-based material, can be molded over the printed circuit board (PCB) 13, enclosing the wire 89' and the DRAM chip 10'. Next, the printed circuit board (PCB) 13 can be singularized into multiple portions using a mechanical cutting process. Next, multiple solder balls 19 containing bismuth, indium, a tin-lead alloy, a tin-silver alloy or a tin-silver-copper alloy can be ball mounted onto a bottom surface of the singularized printed circuit board (PCB) 13.

Alternatively, multiple DRAM chips 10' can be stacked over the printed circuit board (PCB) 13, as shown in FIG. 23M. A bottom one of the DRAM chips 10' can be first mounted to the printed circuit board (PCB) 13, ball-grid-array (BGA) substrate, via an adhesive material 11, such as silver epoxy. Next, a wire 89', such as gold wire, copper wire or aluminum wire, can be ball bonded on the contact point 8000 of the bottom one of the DRAM chips 10', exposed by the opening 990 in the polymer layer 99 and wedge bonded on a contact point 15 of the printed circuit board 13. Next, a dump bump, such as silicon or copper, can be adhered to a top surface of the bottom one of the DRAM chips 10' via an adhesive material 11, such as silver epoxy. Next, a top one of the DRAM chips 10' can be mounted to the dummy bump 19, via an adhesive material 11, such as silver epoxy. Next, a wire 89', such as gold wire, copper wire or aluminum wire, can be ball bonded on the contact point 8000 of the top one of the DRAM chips 10', exposed by the opening 990 in the polymer layer 99 and wedge bonded on the contact point 15 of the printed circuit board 13. The only one contact pad 15 of the printed circuit board (PCB) 13 can be connected to the two contact points 8000 of the top and bottom chips 10' through the two wirebonded wires 89'.

Referring to FIG. 23N showing a top view of a chip package for the DRAM chip 10' and to FIGS. 23A-23M, original pads 600 exposed by openings in a passivation layer 5 are aligned in a center line of the DRAM chip 10', and relocated pads 8000 connected to the original pads 600 through the patterned circuit layer 801 over the passivation layer 5 are arranged close to the edges of the DRAM chip 10', leading the relocated pads 8000 to be readily wirebonded by the wires 89'.

After one or more DRAM chips 10' are packaged as shown in FIGS. 21L and 21M, an electrical testing process can be performed to initially verify good packages, non-repairable bad packages and repairable bad packages. The initially verified repairable bad packages can be repaired by the previously described E-fuse repairing process. Next, another electrical testing process can be performed to check if the repaired packages are good. Next, the initially verified good packages and the repaired good packages can be burned in. Next, another electrical testing process can be performed to check if the burned-in packages continue good.

Alternatively, other chips, such as flash memory chips, SRAM chips or logic chips, can be packaged as the process for packaging the DRAM chips 10' as shown in FIGS. 23A-23M is performed.

The above description focus on a top post-passivation technology, that is, the over-passivation scheme 102 can be formed over the passivation layer 5 at the active side of the silicon substrate 1. FIGS. 1B-1D, 3B-3D, 5B, 5K, 5S, 5U, 5V-5Z, 7B-7D, 8A-8F, 10A-10I, 12B-12D, 14B-14D, 15H, 15K-15M, 16L, 16M, 17J, 18I, 19H, 20 and 23K show that various types of the over-passivation schemes 102 formed over the passivation layer 5 at the active side of the silicon substrate 1. The below description focus on a bottom structure technology, that is, a bottom scheme 103 can be formed at the backside 1*a* of the thinned silicon substrate 1. The elements having same reference numbers in this specification can be reference to one another.

FIG. 24A shows the silicon substrate 1 and other elements as described above in the semiconductor wafer 10, and the silicon substrate 1 has a thickness t1 between 600 and 1000 micrometers, between 50 micrometers and 1 millimeter or between 75 and 250 micrometers. Alternatively, the silicon substrate 1 can be replaced with other semiconductor substrate, such as silicon-germanium (SiGe) substrate or gallium arsenide (GaAs) substrate.

Referring to FIG. 24B, the semiconductor wafer 10 is flipped over, and then the silicon substrate 1 is thinned to a thickness t2 between 1 and 10 micrometers, between 3 and 50 micrometers or between 10 and 150 micrometers by mechanically grinding or chemically mechanically polishing (CMP) a backside 1*a* of the silicon substrate 1. Alternatively, the previously described step of flipping over the semiconductor wafer 10 can be performed after the previously described step of thinning the silicon substrate 1, to perform the following processes.

Next, referring to FIG. 24C, multiple through-silicon vias (TSV) 11*a*, 11*b*, 11*c*, 11*d* and 11*e* are formed in the thinned silicon substrate 1 and in at least one dielectric layer 30, exposing regions 60*a* of the fine-line metal layers 60 and 632*c*, and an insulating layer 3 is formed on the backside 1*a* of the thinned silicon substrate 1 and on sidewalls of the through-silicon vias 11*a*, 11*b*, 11*c*, 11*d* and 11*e*. The through-silicon vias 11*a*, 11*b*, 11*c*, 11*d* and 11*e* penetrate completely through the thinned silicon substrate 1 and the dielectric layer(s) 30. The through-silicon vias 11*a*, 11*b*, 11*c*, 11*d* and 11*e* may have a diameter or width W1 between 5 and 100 micrometers or between 3 and 50 micrometers, and a depth between 1 and 10 micrometers, between 3 and 50 micrometers or between 10 and 150 micrometers. The insulating layer 3, for example, may include a nitride layer, such as silicon-nitride layer, a polymer layer, such as polyimide layer, benzocyclobutene layer or polybenzoxazole layer, a silicon-oxynitride layer, a silicon-carbon-nitride (SiCN) layer, a silicon-oxycarbide (SiOC) layer or a silicon-oxide layer.

Figure 24D:
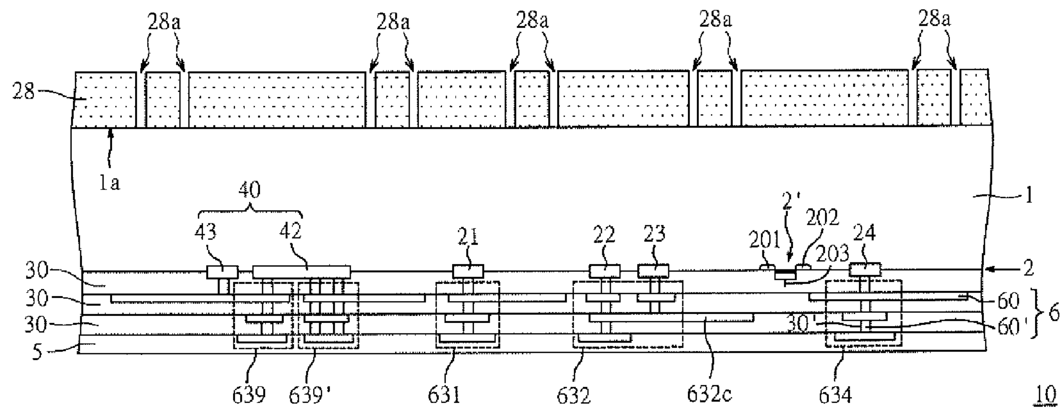
Figure 24E:
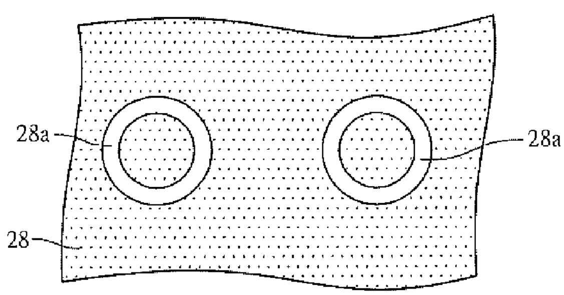
Figure 24F:
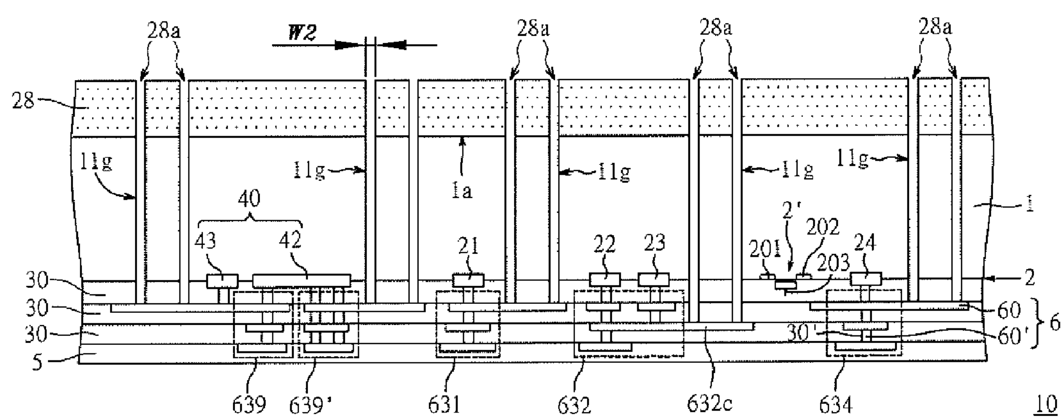
Figure 24G:
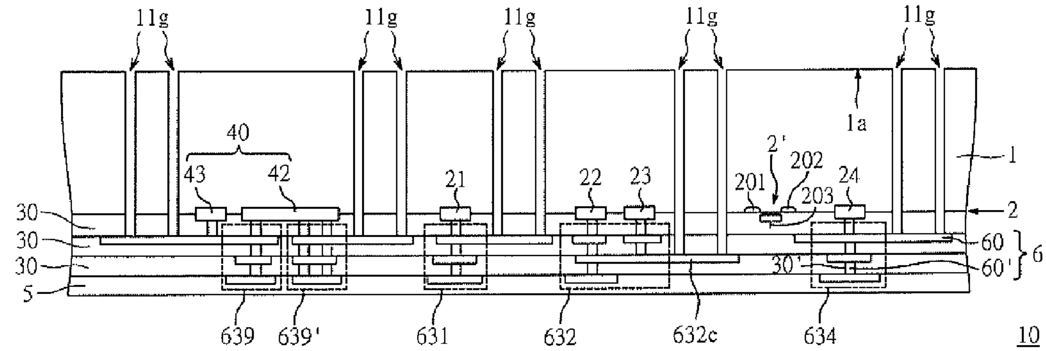
Figure 24H:
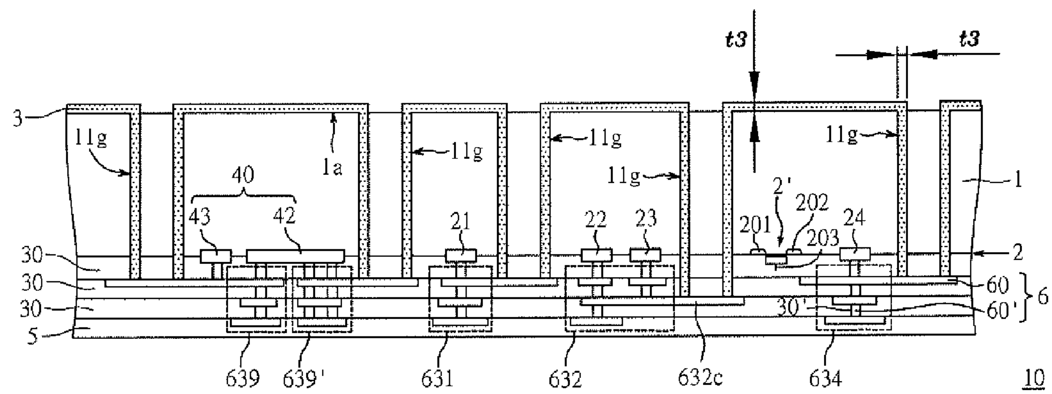

FIGS. 24D-24H are cross-sectional views showing a process of forming the through-silicon vias 11*a*, 11*b*, 11*c*, 11*d* and 11*e* and the insulating layer 3 according to the present disclosure. Referring to FIG. 24D, after the step illustrated in FIG. 24B, a photoresist layer 28 is spin-on coated or laminated on the backside 1*a* of the thinned silicon substrate 1, and multiple ring-shaped openings 28*a* are formed in the photoresist layer 28, exposing the backside 1*a* of the thinned silicon substrate 1, using an exposure process and developing process. FIG. 24E is a schematic top view showing the ring-shaped openings 28*a* in the photoresist layer 28. Next, referring to FIG. 24F, multiple through-silicon ring-shaped openings 11*g* each having a transverse width W2 between 1 and 20 micrometer are formed in the thinned silicon substrate 1 and in at least one dielectric layer 30, penetrating completely through the thinned silicon substrate 1 and the dielectric layer(s) 30, by dry etching the thinned silicon substrate 1 and the dielectric layer(s) 30 under the ring-shaped openings 28*a* in the photoresist layer 28, for example, using anisotropic reactive ion etching. Next, the photoresist layer 28 is removed, as shown in FIG. 24G. Next, referring to FIG. 24H, the insulating layer 3, such as polymer layer, polyimide layer, benzocyclobutene (BCB) layer, polybenzoxazole (PBO) layer, silicon-nitride layer, silicon-oxide layer, silicon-oxynitride layer, silicon-oxycarbide (SiOC) layer or silicon-carbon-nitride (SiCN) layer, having a thickness t3 between 0.5 and 20 micrometers or between 0.01 and 5 micrometers is formed in the through-silicon ring-shaped openings 11*g* and on the backside 1*a* of the thinned silicon substrate 1. Next, multiple portions of the thinned silicon substrate 1 surrounded by the insulating layer 3 in the through-silicon ring-shaped openings 11*g* are removed using a dry etching process, such as fluorine and carbon based anisotropic reactive ion etching, and accordingly the through-silicon vias 11*a*, 11*b*, 11*c*, 11*d* and 11*e* are formed in the thinned silicon substrate 1 and in at least one dielectric layer 30, exposing the regions 60*a* of the fine-line metal layers 60 and 632*c*, as shown in FIG. 24C, and the insulating layer 3 is formed on the backside 1*a* of the thinned silicon substrate 1 and on the sidewalls of the through-silicon vias 11*a*, 11*b*, 11*c*, 11*d* and 11*e*.

Figure 24I:
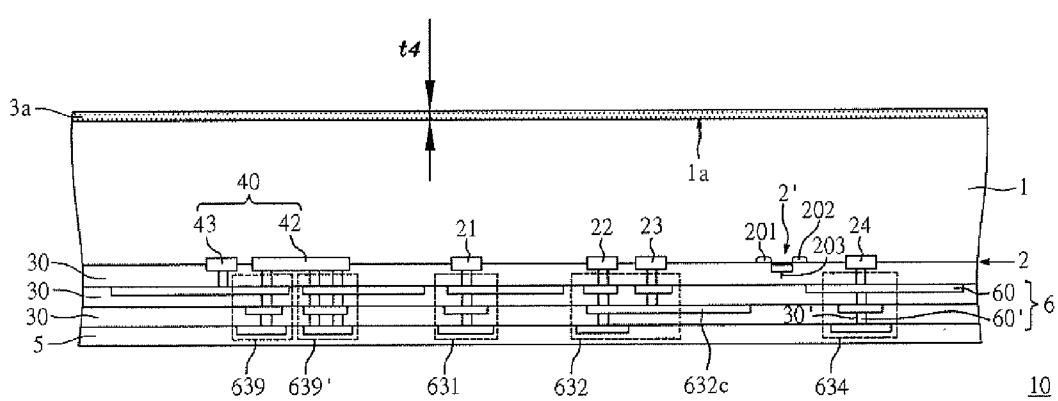

FIGS. 24I-24N are cross-sectional views showing another process of forming the through-silicon vias 11*a*, 11*b*, 11*c*, 11*d* and 11*e* and the insulating layer 3 according to the present disclosure. Referring to FIG. 24I, an etching stop layer 3*a*, such as silicon-nitride layer, silicon-oxide layer or polymer layer, having a thickness t4 between 0.3 and 40 micrometers is formed on the backside 1*a* of the thinned silicon substrate 1. For example, the etching stop layer 3*a* can be formed by a suitable process or processes, e.g., by depositing a silicon-nitride or silicon-carbon-nitride layer having a thickness between 0.2 and 1.2 micrometers on the backside 1*a* of the thinned silicon substrate 1 using a chemical mechanical deposition (CVD) process. Alternatively, the etching stop layer 3*a* can be formed by a suitable process or processes, e.g., by depositing a silicon-oxide or silicon-oxycarbide layer having a thickness between 0.2 and 1.2 micrometers on the backside 1*a* of the thinned silicon substrate 1 using a chemical mechanical deposition (CVD) process, and then depositing a silicon-nitride or silicon-carbon-nitride layer having a thickness between 0.2 and 1.2 micrometers on the silicon-oxide or silicon-oxycarbide layer using a chemical mechanical deposition (CVD) process. Alternatively, the etching stop layer 3*a* can be formed by a suitable process or processes, e.g., by depositing a silicon-nitride layer having a thickness between 0.2 and 1.2 micrometers on the bottom backside 1*a* of the thinned silicon substrate 1 using a chemical mechanical deposition (CVD) process, and then coating a polymer layer having a thickness between 2 and 30 micrometers on the silicon-nitride or silicon-carbon-nitride layer.

Figure 24J:
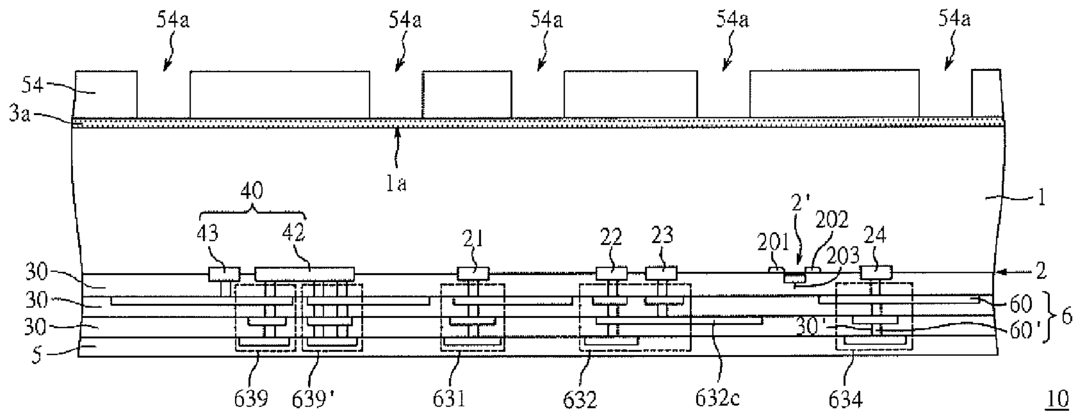
Figure 24K:
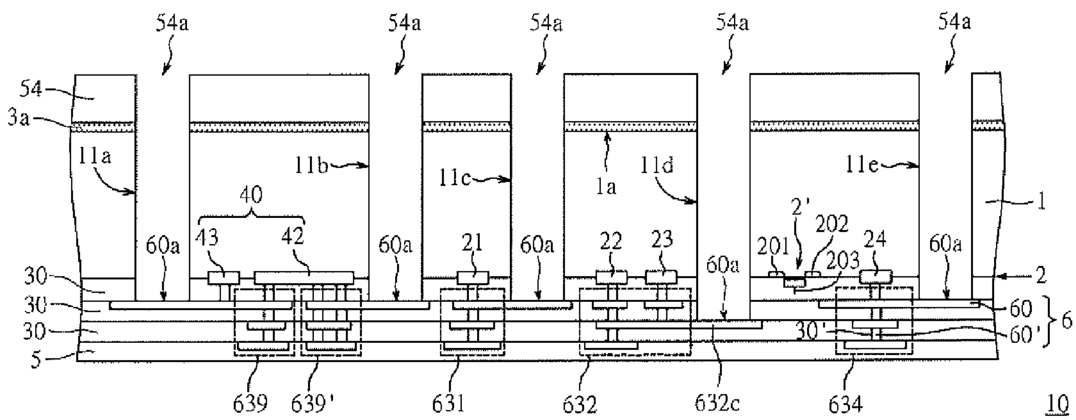
Figure 24L:
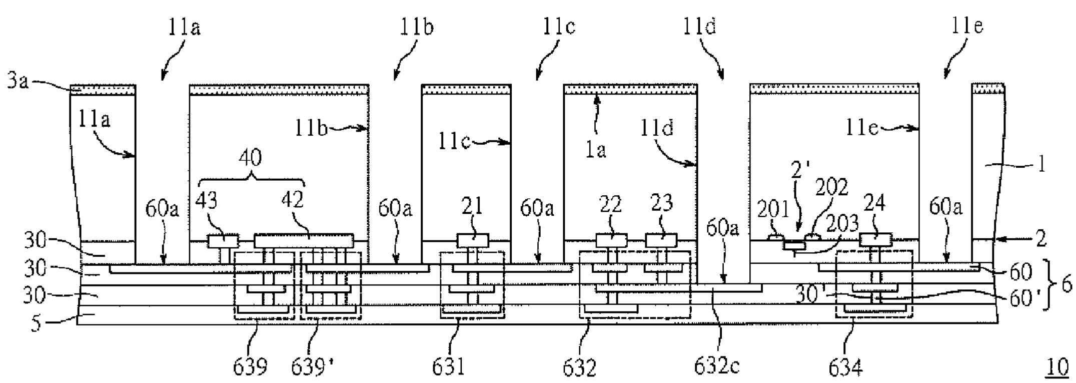
Figure 24M:
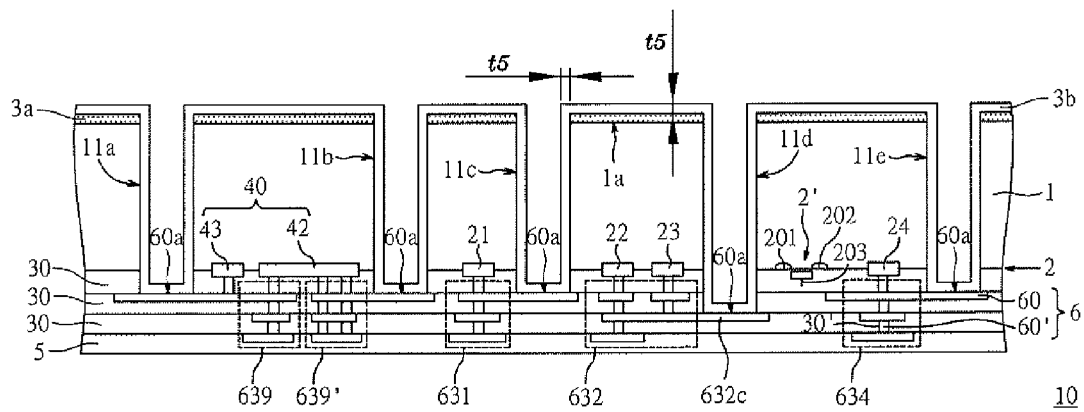
Figure 24N:
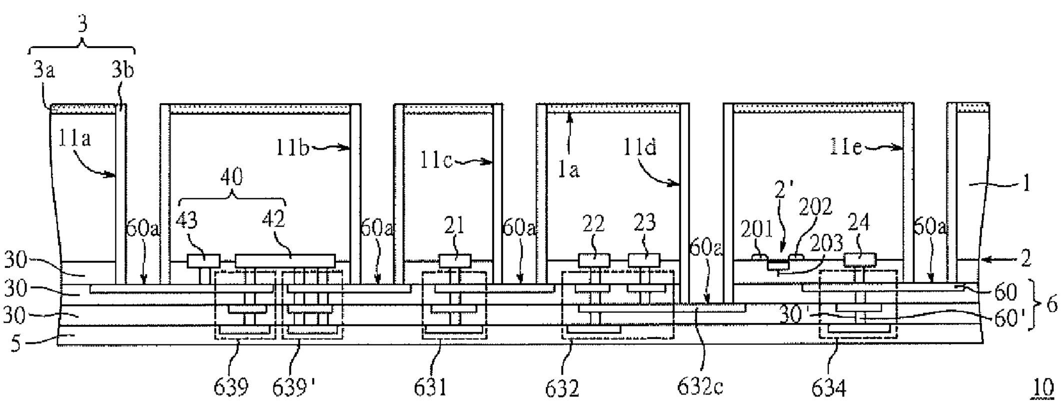

Referring to FIG. 24J, after the step illustrated in FIG. 24I, a photoresist layer 54 is spin-on coated or laminated on the etching stop layer 3*a*, and multiple openings 54*a* are formed in the photoresist layer 54 and expose the etching stop layer 3*a* using an exposure process and developing process. Next, referring to FIG. 24K, the through-silicon vias 11*a*, 11*b*, 11*c*, 11*d* and 11*e* are formed in the thinned silicon substrate 1 and in at least one dielectric layer 30, penetrating completely through the etching stop layer 3*a*, the thinned silicon substrate 1 and the dielectric layer(s) 30 and exposing the regions 60*a* of the fine-line metal layers 60 and 632c, by dry etching the etching stop layer 3a, the thinned silicon substrate 1 and the dielectric layer(s) 30 under the openings 54a in the photoresist layer 54, for example, using fluorine and carbon based anisotropic reactive ion etching. Next, the photoresist layer 28 is removed, as shown in FIG. 24L. Next, referring to FIG. 24M, an insulating layer 3b, such as polymer layer, polyimide layer, benzocyclobutene (BCB) layer, polybenzoxazole (PBO) layer, silicon-nitride layer, silicon-oxide layer, silicon-oxynitride layer, silicon-oxycarbide (SiOC) layer or silicon-carbon-nitride (SiCN) layer, having a thickness t5 between 0.1 and 10 micrometers is formed on the sidewalls of the through-silicon vias 11a, 11b, 11c, 11d and 11e, on the etching stop layer 3a and on the regions 60a of the fine-line metal layers 60 and 632c exposed by the through-silicon vias 11a, 11b, 11c, 11d and 11e. Next, referring to FIG. 24N, the insulating layer 3b formed on the etching stop layer 3a and on the regions 60a of the fine-line metal layers 60 and 632c are removed using a dry etching process, such as anisotropic reactive ion etching. Accordingly, the regions 60a of the fine-line metal layers 60 and 632c are exposed through the through-silicon vias 11a, 11b, 11c, 11d and 11e and the etching stop layer 3a has a top surface uncovered by the insulating layer 3b. The etching stop layer 3a and the insulating layer 3b composes the insulating layer 3.

For easy description, the insulating layer 3 shown in the following process can be referenced by the insulating layer 3 made as illustrated in FIGS. 24D-24H or the insulating layer 3, composed of the etching stop layer 3a and the insulating layer 3b, made as illustrated in FIGS. 24I-24N.

FIGS. 25A-25L are cross-sectional views showing a process for forming a bottom scheme 103 of a bottom structure technology at a backside of a semiconductor wafer according to the present disclosure. Referring to FIG. 25A, after forming the insulating layer 3 and the through-silicon vias 11a, 11b, 11c, 11d and 11e, a metal layer 4 can be formed on the insulating layer 3, on the regions 60a of the fine-line metal layers 60 and 632c exposed by the through-silicon vias 11a, 11b, 11c, 11d and 11e and in the through-silicon vias 11a, 11b, 11c, 11d and 11e. The metal layer 4 can be formed by a suitable process or processes, e.g., by depositing an adhesion/barrier layer 4a on the insulating layer 3, in the through-silicon vias 11a, 11b, 11c, 11d and 11e, and on the regions 60a of the fine-line metal layers 60 and 632c exposed by the through-silicon vias 11a, 11b, 11c, 11d and 11e, and then depositing a seed layer 4b on the adhesion/barrier layer 4a.

The adhesion/barrier layer 4a at the bottom of the metal layer 4 may be formed by a suitable process or processes, e.g., by sputtering or chemical vapor depositing (CVD) a titanium-containing layer, such as titanium-nitride layer, titanium layer or titanium-tungsten-alloy layer, having a thickness smaller than 1 micrometer, such as between 0.005 and 0.8 micrometers, and preferably between 0.05 and 0.5 micrometers, on the insulating layer 3, at the sidewalls of the through-silicon vias 11a, 11b, 11c, 11d and 11e, and on an aluminum layer, an electroplated copper layer, a tantalum-nitride layer, a titanium-nitride layer, a tantalum layer or a titanium layer of the fine-line metal layers 60 and 632c exposed by the through-silicon vias 11a, 11b, 11c, 11d and 11e. Alternatively, the adhesion/barrier layer 4a at the bottom of the metal layer 4 may be formed by a suitable process or processes, e.g., by sputtering or chemical vapor depositing a chromium-containing layer, such as chromium layer, having a thickness smaller than 1 micrometer, such as between 0.005 and 0.8 micrometers, and preferably between 0.05 and 0.5 micrometers, on the insulating layer 3, at the sidewalls of the through-silicon vias 11a, 11b, 11c, 11d and 11e, and on an aluminum layer, an electroplated copper layer, a tantalum-nitride layer, a titanium-nitride layer, a tantalum layer or a titanium layer of the fine-line metal layers 60 and 632c exposed by the through-silicon vias 11a, 11b, 11c, 11d and 11e. Alternatively, the adhesion/barrier layer 4a at the bottom of the metal layer 4 may be formed by a suitable process or processes, e.g., by sputtering or chemical vapor depositing a tantalum-containing layer, such as tantalum layer or tantalum-nitride layer, having a thickness smaller than 1 micrometer, such as between 0.005 and 0.8 micrometers, and preferably between 0.05 and 0.5 micrometers, on the insulating layer 3, at the sidewalls of the through-silicon vias 11a, 11b, 11c, 11d and 11e, and on an aluminum layer, an electroplated copper layer, a tantalum-nitride layer, a titanium-nitride layer, a tantalum layer or a titanium layer of the fine-line metal layers 60 and 632c exposed by the through-silicon vias 11a, 11b, 11c, 11d and 11e.

The seed layer 4b at the top of the metal layer 4 may be formed by a suitable process or processes, e.g., by sputtering or chemical vapor depositing a copper layer, an aluminum layer, a nickel layer or a silver layer with a thickness smaller than 1 micrometer, such as between 0.005 and 1 micrometers, and preferably between 0.05 and 0.5 micrometers, on the adhesion/barrier layer 4a of any previously described material. Alternatively, the seed layer 4b at the top of the metal layer 4 may be formed by a suitable process or processes, e.g., by sputtering or chemical vapor depositing a gold layer with a thickness smaller than 1 micrometer, such as between 0.005 and 0.5 micrometers, and preferably between 0.05 and 0.2 micrometers, on the adhesion/barrier layer 4a of any previously described material.

Referring to FIG. 25B, after forming the metal layer 4, a photoresist layer 29, such as positive-type photoresist layer or negative-type photoresist layer, having a thickness larger than 1.5 micrometers, such as between 5 and 50 micrometers, and preferably between 10 and 25 micrometers, is formed on the seed layer 4b of the metal layer 4 by a spin-on coating process, a lamination process, a screen-printing process or a spraying process. Next, the photoresist layer 29 is patterned with the processes of exposure and development to form multiple openings 29a in the photoresist layer 29 exposing the seed layer 4b of the metal layer 4, as shown in FIG. 25C. A 1× stepper or 1× contact aligner can be used to expose the photoresist layer 29 during the process of exposure.

For example, the photoresist layer 29 can be formed by a suitable process or processes, e.g., by spin-on coating a positive-type photosensitive polymer layer having a thickness between 5 and 30 micrometers, and preferably between 10 and 25 micrometers, on the seed layer 4a of the metal layer 4, then exposing the photosensitive polymer layer using a 1× stepper or a contact aligner with at least two of G-line, H-line and I-line, and G-line has a wavelength ranging from, e.g., about 434 to 438 nm, H-line has a wavelength ranging from, e.g., about 403 to 407 nm, and I-line has a wavelength ranging from, e.g., about 363 to 367 nm, then developing the exposed polymer layer by spraying and puddling a developer on the photoresist layer 29 or by immersing the photoresist layer 29 into a developer, and then cleaning the semiconductor wafer using deionized wafer and drying the semiconductor wafer by spinning the semiconductor wafer. After development, a scum removal process of removing the residual polymeric material or other contaminants from the seed layer 4b of the metal layer 4 may be conducted by using an $O_2$ plasma or a plasma containing fluorine of below 200 PPM and oxygen. By these processes, the photoresist layer 29 can be patterned with the openings 29a exposing the seed layer 4b of the metal layer 4.

Next, referring to FIG. 25D, a bulk metal layer 9 is formed in the openings 29*a* and on the seed layer 4*b* of the metal layer 4 exposed by the openings 29*a* by a process including an electroplating process. The bulk metal layer 9 may have a thickness larger than 1 micrometer, such as between 1 and 50 micrometers, between 2 and 20 micrometers or between 5 and 150 micrometers, and larger than that of the seed layer 4*b*, that of the adhesion/barrier layer 4*a* and that of each of the fine-line metal layers 60, respectively. The bulk metal layer 9 may include copper, gold, nickel, aluminum, silver, platinum, solder or a composite of the previously described materials.

For example, the bulk metal layer 9 can be composed of a single metal layer formed by a suitable process or processes, e.g., by electroplating a copper layer, to a thickness between 1 and 50 micrometers, between 2 and 20 micrometers or between 5 and 150 micrometers, in the openings 29*a* and on the seed layer 4*b*, preferably the previously described copper layer 4*b*, exposed by the openings 29*a* with an electroplating solution containing $CuSO_4$, $Cu(CN)_2$ or $CuHPO_4$.

Alternatively, the bulk metal layer 9 can be composed of a single metal layer formed by a suitable process or processes, e.g., by electroplating an aluminum layer, to a thickness between 1 and 50 micrometers, between 2 and 20 micrometers or between 5 and 150 micrometers, in the openings 29*a* and on the seed layer 4*b*, preferably formed by a suitable process or processes, e.g., by the previously described aluminum layer or copper layer 4*b*, exposed by the openings 29*a*.

Alternatively, the bulk metal layer 9 can be composed of a single metal layer formed by a suitable process or processes, e.g., by electroplating a gold layer, to a thickness between 0.5 and 30 micrometers, between 1 and 10 micrometers or between 5 and 150 micrometers, in the openings 29*a* and on the seed layer 4*b*, preferably the previously described gold layer 4*b*, exposed by the openings 29*a* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further include sodium ion, to be turned into a solution of gold sodium sulfite ($Na_3Au(SO_3)_2$), or may further include ammonium ion, to be turned into a solution of gold ammonium sulfite ($(NH_4)_3[Au(SO_3)_2]$). The operational parameters of electroplating the gold layer are described below:

1. The previously described electroplating solution can be at a temperature of between 30 and 70° C., and preferably between 45 and 65° C., to electroplate the gold layer on the seed layer 4*b* of the metal layer 4 exposed by the openings 29*a*.
2. The previously described electroplating solution can be used to electroplate the gold layer on the seed layer 4*b* of the metal layer 4 exposed by the openings 29*a* through an electric current with a current density at between 1 and 10 $mA/cm^2$, and preferably between 4 and 6 $mA/cm^2$.
3. The previously described electroplating solution may have a pH value of between 6 and 9, and preferably of between 7 and 8.5, to electroplate the gold layer on the seed layer 4*b* of the metal layer 4 exposed by the openings 29*a*.

Alternatively, the bulk metal layer 9 can be composed of double metal layers formed by a suitable process or processes, e.g., by electroplating a copper layer, to a thickness between 1 and 50 micrometers, between 2 and 20 micrometers or between 5 and 150 micrometers, in the openings 29*a* and on the seed layer 4*b*, preferably the previously described copper layer 4*b*, exposed by the openings 29*a* using the previously described electroplating solution for electroplating copper, and then electroplating a nickel layer, a top metal layer of the bulk metal layer 9, to a thickness between 1 and 15 micrometers, and preferably between 2 and 10 micrometers, in the openings 29*a* and on the electroplated copper layer in the openings 29*a* using an electroplating solution containing $NiSO_4$ or Ni sulfamate or $Ni(NH_2SO_3)_2$ or electroless plating a nickel layer, a top metal layer of the bulk metal layer 9, to a thickness between 1 and 15 micrometers, and preferably between 2 and 10 micrometers, in the openings 29*a* and on the electroplated copper layer in the openings 29*a* using an electroless plating solution containing Ni and $NaPO_2H_2$ (Sodium Hypophosphite).

Alternatively, the bulk metal layer 9 can be composed of a single metal layer formed by a suitable process or processes, e.g., by electroplating a nickel layer, to a thickness between 1 and 50 micrometers, between 2 and 20 micrometers or between 5 and 150 micrometers, in the openings 29*a* and on the seed layer 4*b*, preferably formed by a suitable process or processes, e.g., by the previously described copper layer or nickel layer 4*b*, exposed by the openings 29*a* using the previously described electroplating solution for electroplating nickel.

Alternatively, the bulk metal layer 9 can be composed of triple metal layers formed by a suitable process or processes, e.g., by electroplating a copper layer 126, to a thickness between 1 and 50 micrometers, between 2 and 20 micrometers or between 5 and 150 micrometers, in the openings 29*a* and on the seed layer 4*b*, preferably the previously described copper layer 4*b*, exposed by the openings 29*a* using the previously described electroplating solution for electroplating copper, next electroplating or electroless plating a nickel layer 127, to a thickness between 1 and 15 micrometers, and preferably between 2 and 10 micrometers, in the openings 29*a* and on the electroplated copper layer in the openings 29*a* using the previously described electroplating solution for electroplating or electroless plating nickel, and then electroplating a gold layer 128, a top metal layer of the bulk metal layer 9, to a thickness between 0.005 and 1 micrometers, and preferably between 0.05 and 0.1 micrometers, in the openings 29*a* and on the electroplated or electroless plated nickel layer in the openings 29*a* using the previously described electroplating solution for electroplating gold, or electroless plating a gold layer 128, to a thickness between 0.005 and 1 micrometers, and preferably between 0.05 and 0.1 micrometers, in the openings 29*a* and on the electroplated or electroless plated nickel layer in the openings 29*a* using an electroless plating solution containing gold salt, such as $AuNaSO_3$ or AuCN and a reduction agent, such as benzoic or phenyl.

Alternatively, the bulk metal layer 9 can be composed of triple metal layers formed by a suitable process or processes, e.g., by electroplating a copper layer 126, to a thickness between 1 and 50 micrometers, between 2 and 20 micrometers or between 5 and 150 micrometers, in the openings 29*a* and on the seed layer 4*b*, preferably the previously described copper layer 4*b*, exposed by the openings 29*a* using the previously described electroplating solution for electroplating copper, next electroplating or electroless plating a nickel layer 127, to a thickness between 1 and 15 micrometers, and preferably between 2 and 10 micrometers, in the openings 29*a* and on the electroplated copper layer in the openings 29*a* using the previously described electroplating solution for electroplating or electroless plating nickel, and then electroplating a palladium layer 128, a top metal layer of the bulk metal layer 9, to a thickness between 0.005 and 5 micrometers, and preferably between 0.05 and 1 micrometers, in the openings 29*a* and on the electroplated or electroless plated nickel layer in the openings 29*a* using an electroplating solution containing palladium and ammonia, or electroless plating a palladium layer 128, a top metal layer of the bulk metal layer 9, to a thickness between 0.005 and 1 micrometers, and preferably between 0.05 and 0.1 micrometers, in the openings 29*a* and on the electroplated or electroless plated nickel layer in the openings 29*a* using an electroless plating solution containing palladium, ammonia and a reduction agent, such as hydrozine.

Alternatively, the bulk metal layer 9 can be composed of four metal layers formed by a suitable process or processes, e.g., by electroplating a copper layer, to a thickness between 1 and 50 micrometers, between 2 and 20 micrometers or between 5 and 150 micrometers, in the openings 29*a* and on the seed layer 4*b*, preferably the previously described copper layer 4*b*, exposed by the openings 29*a* using the previously described electroplating solution for electroplating copper, next electroplating or electroless plating a nickel layer, to a thickness between 1 and 15 micrometers, and preferably between 2 and 10 micrometers, in the openings 29*a* and on the electroplated copper layer in the openings 29*a* using the previously described electroplating solution for electroplating or electroless plating nickel, next electroplating or electroless plating a palladium layer, to a thickness between 0.005 and 5 micrometers, and preferably between 0.05 and 1 micrometers, in the openings 29*a* and on the electroplated or electroless plated nickel layer in the openings 29*a* using the previously described electroplating solution for electroplating or electroless plating palladium, and then electroplating or electroless plating a gold layer, a top metal layer of the bulk metal layer 9, to a thickness between 0.005 and 1 micrometers, and preferably between 0.05 and 0.1 micrometers, in the openings 29*a* and on the electroplated or electroless plated palladium layer in the openings 29*a* using the previously described electroplating solution for electroplating or electroless plating gold.

Referring to FIG. 25E, after forming the bulk metal layer 9, the photoresist layer 29 is removed using an inorganic solution or using an organic solution with amide. Some residuals from the photoresist layer 29 could remain on the metal layer 4 not under the bulk metal layer 9. Thereafter, the residuals can be removed from the metal layer 4 with a plasma, such as an $O_2$ plasma or a plasma containing fluorine of below 200 PPM and oxygen.

Next, referring to FIG. 25F, the metal layer 4 not under the bulk metal layer 9 is removed by etching the seed layer 4*b* not under the bulk metal layer 9, and then etching the adhesion/barrier layer 4*a* not under the bulk metal layer 9.

In a case, the seed layer 4*b* and the adhesion/barrier layer 4*a* not under the bulk metal layer 9 can be subsequently removed by a dry etching method. As to the dry etching method, both the seed layer 4*b* and the adhesion/barrier layer 4*a* not under the bulk metal layer 9 can be subsequently removed by an Ar sputtering etching process; alternatively, both the seed layer 4*b* and the adhesion/barrier layer 4*a* not under the bulk metal layer 9 can be subsequently removed by a reactive ion etching (RIE) process; alternatively, the seed layer 4*b* not under the bulk metal layer 9 can be removed by an Ar sputtering etching process, and the adhesion/barrier layer 4*a* not under the bulk metal layer 9 can be removed by a reactive ion etching (RIE) process.

In another case, the seed layer 4*b* and the adhesion/barrier layer 4*a* not under the bulk metal layer 9 can be subsequently removed by a wet etching method. As to the wet etching method, when the seed layer 4*b* is a copper layer, it can be etched with a solution containing $NH_4OH$ or with a solution containing $H_2SO_4$; when the seed layer 4*b* is a gold layer, it can be etched with an iodine-containing solution, such as a solution containing potassium iodide; when the adhesion/barrier layer 4*a* is a titanium-tungsten-alloy layer, it can be etched with a solution containing hydrogen peroxide or with a solution containing $NH_4OH$ and hydrogen peroxide; when the adhesion/barrier layer 4*a* is a titanium layer, it can be etched with a solution containing hydrogen fluoride or with a solution containing $NH_4OH$ and hydrogen peroxide; when the adhesion/barrier layer 4*a* is a chromium layer, it can be etched with a solution containing potassium ferricyanide.

In another case, the seed layer 4*b*, such as copper, not under the bulk metal layer 9 can be removed by a solution containing $NH_4OH$ or a solution containing $H_2SO_4$, and the adhesion/barrier layer 210 not under the bulk metal layer 9 can be removed by a reactive ion etching (RIE) process or an Ar sputtering etching process.

In another case, the seed layer 4*b*, such as gold, not under the bulk metal layer 9 can be etched with an iodine-containing solution, such as a solution containing potassium iodide, and the adhesion/barrier layer 4*a* not under the bulk metal layer 9 can be removed by a reactive ion etching (RIE) process or an Ar sputtering etching process.

After etching the adhesion/barrier layer 4*a* not under the bulk metal layer 9, multiple interconnecting structures 88 provided by the metal layers 4 and 9 can be formed in the through-silicon vias 11*a*, 11*b*, 11*c*, 11*d* and 11*e*, on the insulating layer 3 and at the backside 1*a* of the thinned silicon substrate 1, and sidewalls of the bulk metal layer 9 are not covered by the metal layer 4.

Referring to FIG. 25G, after the step illustrated in FIG. 25F, a polymer layer 14 can be formed on the topmost layer of copper, gold, aluminum, nickel or palladium of the previously described various bulk metal layer 9 and on the insulating layer 3 using a process including a spin-on coating process, a lamination process, a screen-printing process or a spraying process and including a curing process, and an opening 14*a* in the polymer layer 14 is over a region of the topmost layer of copper, gold, aluminum, nickel or palladium of the previously described various bulk metal layer 9 and exposes it. The polymer layer 14 has a thickness larger than 2 micrometers, such as between 3 and 25 micrometers, and preferably between 5 and 15 micrometers. The material of the polymer layer 14 may include benzocyclobutane (BCB), polyimide (PI), polybenzoxazole (PBO) or epoxy resin.

In a case, the polymer layer 14 can be formed by a suitable process or processes, e.g., by spin-on coating a negative-type photosensitive polyimide layer having a thickness between 6 and 50 micrometers on the insulating layer 3 and on the topmost layer of copper, gold, aluminum, nickel or palladium of the previously described various bulk metal layer 9, then baking the spin-on coated polyimide layer, then exposing the baked polyimide layer using a 1× stepper or 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form an opening exposing the bulk metal layer 9, then curing or heating the developed polyimide layer at a temperature between 180 and 400° C., between 180 and 250° C., between 250 and 290° C., between 290 and 400° C. or between 200 and 390° C. for a time between 20 and 150 minutes in a nitrogen ambient or in an oxygen-free ambient, the cured polyimide layer having a thickness between 3 and 25 micrometers, and then removing the residual polymeric material or other contaminants from the exposed bulk metal layer 9 with an $O_2$ plasma or a plasma containing fluorine of below 200 PPM and oxygen. By the way, the polymer layer 14 can be formed on the insulating layer 3 and on the topmost layer of copper, gold, aluminum, nickel or palladium of the previously described various bulk metal layer 9, and the opening 14*a* formed in the polymer layer 14 exposes the region of the topmost layer of copper, gold, aluminum, nickel or palladium of the previously described various bulk metal layer 9.

In another case, the polymer layer 14 can be formed by a suitable process or processes, e.g., by spin-on coating a positive-type photosensitive polybenzoxazole layer having a thickness between 3 and 25 micrometers on the insulating layer 3 and on the topmost layer of copper, gold, aluminum, nickel or palladium of the previously described various bulk metal layer 9, then baking the spin-on coated polybenzoxazole layer, then exposing the baked polybenzoxazole layer using a 1× stepper or a 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form an opening exposing the bulk metal layer 9, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness between 3 and 25 μm, and then removing the residual polymeric material or other contaminants from the exposed bulk metal layer 9 with an $O_2$ plasma or a plasma containing fluorine of below 200 PPM and oxygen. By the way, the polymer layer 14 can be formed on the insulating layer 3 and on the topmost layer of copper, gold, aluminum, nickel or palladium of the previously described various bulk metal layer 9, and the opening 14*a* formed in the polymer layer 14 exposes the region of the topmost layer of copper, gold, aluminum, nickel or palladium of the previously described various bulk metal layer 9.

Next, referring to FIG. 25H, an adhesion/barrier layer 16 having a thickness smaller than 1 micrometer, such as between 0.02 and 0.5 micrometers, and preferably between 0.1 and 0.2 micrometers, can be formed on the polymer layer 14 and on the region of the topmost layer of copper, gold, aluminum, nickel or palladium of the previously described various bulk metal layer 9 exposed by the opening 14*a* by using a physical vapor deposition (PVD) process, such as sputtering process or evaporation process, and then a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The material of the adhesion/barrier layer 16 may include titanium, a titanium-tungsten alloy, titanium nitride, chromium, tantalum, tantalum nitride or a composite of the previously described materials, and the material of the seed layer 18 may include copper, nickel, aluminum, gold, silver, platinum or palladium.

For example, when the adhesion/barrier layer 16 is formed by a suitable process or processes, e.g., by sputtering a titanium-containing layer, such as a single layer of titanium-tungsten alloy, titanium or titanium nitride, having a thickness smaller than 1 micrometer, such as between 0.005 and 0.8 micrometers, and preferably between 0.05 and 0.5 micrometers, on the polymer layer 14 and on the region of the topmost layer of copper, gold, aluminum, nickel or palladium of the previously described various bulk metal layer 9 exposed by the opening 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the titanium-containing layer.

Alternatively, when the adhesion/barrier layer 16 is formed by a suitable process or processes, e.g., by sputtering a composite layer including a titanium layer having a thickness between 0.01 and 0.15 micrometers on the polymer layer 14 and on the region of the topmost layer of copper, gold, aluminum, nickel or palladium of the previously described various bulk metal layer 9 exposed by the opening 14*a* and a titanium-tungsten-alloy layer having a thickness between 0.1 and 0.35 micrometers on the titanium layer, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the titanium-tungsten-alloy layer.

Alternatively, when the adhesion/barrier layer 16 is formed by a suitable process or processes, e.g., by sputtering a tantalum-containing layer, such as a single layer of tantalum or tantalum nitride, having a thickness smaller than 1 micrometer, such as between 0.005 and 0.8 micrometers, and preferably between 0.05 and 0.5 micrometers, on the polymer layer 14 and on the region of the topmost layer of copper, gold, aluminum, nickel or palladium of the previously described various bulk metal layer 9 exposed by the opening 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the tantalum-containing layer.

Alternatively, when the adhesion/barrier layer 16 is formed by a suitable process or processes, e.g., by sputtering a chromium-containing layer, such as a single layer of chromium layer, having a thickness smaller than 1 micrometer, such as between 0.005 and 0.8 micrometers, and preferably between 0.05 and 0.5 micrometers, on the polymer layer 14 and on the region of the topmost layer of copper, gold, aluminum, nickel or palladium of the previously described various bulk metal layer 9 exposed by the opening 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the chromium-containing layer.

Referring to FIG. 25I, after forming the seed layer 18, a photoresist layer 31, such as positive-type photoresist layer or negative-type photoresist layer, having a thickness larger than 5 micrometers, such as between 10 and 150 micrometers, and preferably between 15 and 50 micrometers, is formed on the seed layer 18 of any previously described material by a spin-on coating process, a lamination process, a screen-printing process or a spraying process. Next, the photoresist layer 31 is patterned with the processes of exposure and development to form an opening 31*a* in the photoresist layer 31 exposing the seed layer 18 of any previously described material. A 1× stepper or 1× contact aligner can be used to expose the photoresist layer 31 during the process of exposure.

For example, the photoresist layer 31 can be formed by a suitable process or processes, e.g., by spin-on coating a positive-type photosensitive polymer layer having a thickness larger than 5 micrometers, such as between 10 and 150 micrometers, and preferably between 15 and 50 micrometers, on the seed layer 18 of any previously described material, then exposing the photosensitive polymer layer using a 1× stepper or a contact aligner with at least two of G-line, H-line and I-line, and G-line has a wavelength ranging from, e.g., about 434 to 438 nm, H-line has a wavelength ranging from, e.g., about 403 to 407 nm, and I-line has a wavelength ranging from, e.g., about 363 to 367 nm, then developing the exposed polymer layer by spraying and puddling a developer on the photoresist layer 31 or by immersing the photoresist layer 31 into a developer, and then cleaning the semiconductor wafer using deionized wafer and drying the semiconductor wafer by spinning the semiconductor wafer. After development, a scum removal process of removing the residual polymeric material or other contaminants from the seed layer 18 may be conducted by using an $O_2$ plasma or a plasma containing fluorine of below 200 PPM and oxygen. By these processes, the photoresist layer 31 can be patterned with the opening 31*a* exposing the seed layer 18.

Referring to FIG. 25J, after the step illustrated in FIG. 25I, a metal bump or pillar 27 can be formed on the seed layer 18 of any previously described material exposed by the opening 31*a* and in the opening 31*a*. The metal bump or pillar 27 may have a thickness larger than 5 micrometers, such as between 5 and 150 micrometers, and preferably between 10 and 100 micrometers, and larger than that of the seed layer 18, that of the adhesion/barrier layer 16 and that of each of the fine-line metal layers 60, respectively. The metal bump or pillar 27 may have a width larger than 1 micrometer, such as between 5 and 150 micrometers, and preferably between 5 and 50 micrometers, and larger than that of each of the fine-line metal layers 60. The material of the metal bump or pillar 27 may include copper, gold, nickel, aluminum, silver, solder, platinum or a composite of the previously described materials. The metal bump or pillar 27 can be used to be bonded with an external circuit, such as ball-grid-array (BGA) substrate, printed circuit board, semiconductor chip, metal substrate, glass substrate or ceramic substrate.

For example, the metal bump or pillar 27 can be composed of a single metal layer formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9.

Alternatively, the metal bump or pillar 27 can be composed of a single metal layer formed by a suitable process or processes, e.g., by electroplating a gold layer, to a thickness between 5 and 30 micrometers, and preferably between 10 and 25 micrometers, in the opening 31*a* and on the seed layer 18, preferably the previously described gold layer 18, exposed by the opening 31*a* using the previously described electroplating solution for electroplating gold of the bulk metal layer 9.

Alternatively, the metal bump or pillar 27 can be composed of a single metal layer formed by a suitable process or processes, e.g., by electroplating a nickel layer, to a thickness between 5 and 100 micrometers, and preferably between 10 and 50 micrometers, in the opening 31*a* and on the seed layer 18, preferably the previously described copper layer or nickel layer 18, exposed by the opening 31*a* using the previously described electroplating solution for electroplating nickel of the bulk metal layer 9.

Alternatively, the metal bump or pillar 27 can be composed of double metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, and then electroplating or electroless plating a gold layer, to a thickness between 0.005 and 10 micrometers, and preferably between 0.05 and 1 micrometers, in the opening 31*a* and on the electroplated copper layer in the opening 31*a* using the previously described electroplating or electroless plating solution for electroplating or electroless plating gold of the bulk metal layer 9.

Alternatively, the metal bump or pillar 27 can be composed of triple metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, next electroplating or electroless plating a nickel layer, to a thickness between 1 and 15 micrometers, and preferably between 2 and 10 micrometers, in the opening 31*a* and on the electroplated copper layer in the opening 31*a* using the previously described electroplating or electroless plating solution for electroplating or electroless plating nickel Of the bulk metal layer 9, and then electroplating or electroless plating a gold layer, to a thickness between 0.005 and 1 micrometers, and preferably between 0.05 and 0.1 micrometers, in the opening 31*a* and on the electroplated or electroless plated nickel layer in the opening 31*a* using the previously described electroplating or electroless plating solution for electroplating or electroless plating gold of the bulk metal layer 9.

Alternatively, the metal bump or pillar 27 can be composed of triple metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, next electroplating or electroless plating a nickel layer, to a thickness between 1 and 15 micrometers, and preferably between 2 and 10 micrometers, in the opening 31*a* and on the electroplated copper layer in the opening 31*a* using the previously described electroplating or electroless plating solution for electroplating or electroless plating nickel of the bulk metal layer 9, and then electroplating or electroless plating a palladium layer, to a thickness between 0.005 and 1 micrometers, and preferably between 0.05 and 0.1 micrometers, in the opening 31*a* and on the electroplated or electroless plated nickel layer in the opening 31*a* using the previously described electroplating or electroless plating solution for electroplating or electroless plating palladium of the bulk metal layer 9.

Alternatively, the metal bump or pillar 27 can be composed of four metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, next electroplating or electroless plating a nickel layer, to a thickness between 1 and 15 micrometers, and preferably between 2 and 10 micrometers, in the opening 31*a* and on the electroplated copper layer in the opening 31*a* using the previously described electroplating or electroless plating solution for electroplating or electroless plating nickel of the bulk metal layer 9, next electroplating or electroless plating a palladium layer, to a thickness between 0.005 and 1 micrometers, and preferably between 0.05 and 0.1 micrometers, in the opening 31*a* and on the electroplated or electroless plated nickel layer in the opening 31*a* using the previously described electroplating or electroless plating solution for electroplating or electroless plating palladium of the bulk metal layer 9, and then electroplating or electroless plating a gold layer, to a thickness between 0.005 and 1 micrometers, and preferably between 0.05 and 0.1 micrometers, in the opening 31*a* and on the electroplated or electroless plated palladium layer in the opening 31*a* using the previously described electroplating or electroless plating solution for electroplating or electroless plating gold of the bulk metal layer 9.

Alternatively, the metal bump or pillar 27 can be composed of double metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometer, in the opening 31*a* and on the electroplated copper layer in the opening 31*a*.

Alternatively, the metal bump or pillar 27 can be composed of double metal layers formed by a suitable process or processes, e.g., by electroplating a nickel layer, to a thickness between 5 and 150 micrometers, and preferably between 10 and 60 micrometers, in the opening 31*a* and on the seed layer 18, preferably the previously described copper layer or nickel layer 18, exposed by the opening 31*a* using the previously described electroplating solution for electroplating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometer, in the opening 31*a* and on the electroplated nickel layer in the opening 31*a*.

Alternatively, the metal bump or pillar 27 can be composed of triple metal layers formed by a suitable process or processes, e.g., by electroplating a copper layer, to a thickness between 10 and 150 micrometers, and preferably between 20 and 100 micrometers, in the opening 31*a* and on the seed layer 18, preferably the previously described copper layer 18, exposed by the opening 31*a* using the previously described electroplating solution for electroplating copper of the bulk metal layer 9, next electroplating or electroless plating a nickel layer, to a thickness between 1 and 15 micrometers, and preferably between 2 and 10 micrometers, in the opening 31*a* and on the electroplated copper layer in the opening 31*a* using the previously described electroplating or electroless plating solution for electroplating or electroless plating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometers, in the opening 31*a* and on the electroplated or electroless plated nickel layer in the opening 31*a*.

Alternatively, the metal bump or pillar 27 can be composed of triple metal layers formed by a suitable process or processes, e.g., by electroplating a copper layer, to a thickness between 1 and 10 micrometers, and preferably between 3 and 8 micrometers, in the opening 31*a* and on the seed layer 18, preferably the previously described copper layer 18, exposed by the opening 31*a* using the previously described electroplating solution for electroplating copper of the bulk metal layer 9, next electroplating or electroless plating a nickel layer, to a thickness between 1 and 15 micrometers, and preferably between 2 and 10 micrometers, in the opening 31*a* and on the electroplated copper layer in the opening 31*a* using the previously described electroplating or electroless plating solution for electroplating or electroless plating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 30 and 250 micrometers, and preferably between 50 and 150 micrometers, in the opening 31*a* and on the electroplated or electroless plated nickel layer in the opening 31*a*.

Next, referring to FIG. 25K, the photoresist layer 31 is removed using an inorganic solution or using an organic solution with amide. Some residuals from the photoresist layer 31 could remain on the seed layer 18 not under the metal bump or pillar 27. Thereafter, the residuals can be removed from the seed layer 18 with a plasma, such as an $O_2$ plasma or a plasma containing fluorine of below 200 PPM and oxygen. Next, referring to FIG. 25L, the seed layer 18 not under the metal bump or pillar 27 is removed, and then the adhesion/barrier layer 16 not under the metal bump or pillar 27 is removed.

In a case, the seed layer 18 and the adhesion/barrier layer 16 not under the metal bump or pillar 27 can be subsequently removed by a dry etching method. As to the dry etching method, both the seed layer 18 and the adhesion/barrier layer 16 not under the metal bump or pillar 27 can be subsequently removed by an Ar sputtering etching process; alternatively, both the seed layer 18 and the adhesion/barrier layer 16 not under the metal bump or pillar 27 can be subsequently removed by a reactive ion etching (RIE) process; alternatively, the seed layer 18 not under the metal bump or pillar 27 can be removed by an Ar sputtering etching process, and the adhesion/barrier layer 16 not under the metal bump or pillar 27 can be removed by a reactive ion etching (RIE) process.

In another case, the seed layer 18 and the adhesion/barrier layer 16 not under the metal bump or pillar 27 can be subsequently removed by a wet etching method. As to the wet etching method, when the seed layer 18 is a copper layer, it can be etched with a solution containing $NH_4OH$ or with a solution containing $H_2SO_4$; when the seed layer 18 is a gold layer, it can be etched with an iodine-containing solution, such as a solution containing potassium iodide; when the adhesion/barrier layer 16 is a titanium-tungsten-alloy layer, it can be etched with a solution containing hydrogen peroxide or with a solution containing $NH_4OH$ and hydrogen peroxide; when the adhesion/barrier layer 16 is a titanium layer, it can be etched with a solution containing hydrogen fluoride or with a solution containing $NH_4OH$ and hydrogen peroxide; when the adhesion/barrier layer 16 is a chromium layer, it can be etched with a solution containing potassium ferricyanide.

In another case, the seed layer 18, such as copper, not under the metal bump or pillar 27 can be removed by a solution containing $NH_4OH$ or a solution containing $H_2SO_4$, and the adhesion/barrier layer 16 not under the metal bump or pillar 27 can be removed by a reactive ion etching (RIE) process or an Ar sputtering etching process.

In another case, the seed layer 18, such as gold, not under the metal bump or pillar 27 can be etched with an iodine-containing solution, such as a solution containing potassium iodide, and the adhesion/barrier layer 16 not under the metal bump or pillar 27 can be removed by a reactive ion etching (RIE) process or an Ar sputtering etching process.

In case the adhesion/barrier layer 16 not under the metal bump or pillar 27 is removed using a wet etching process, an undercut is formed under the metal bump or pillar 27 overhanging the adhesion/barrier layer 16. The adhesion/barrier layer 16 under the metal bump or pillar 27 has a first sidewall recessed from a second sidewall of the metal bump or pillar 27, and a distance d1 between the first sidewall and the second sidewall is between 0.3 and 2 micrometers.

Accordingly, as shown in FIG. 25L, a bottom scheme 103 at the backside 1*a* of the thinned silicon substrate 1 is formed with the insulating layer 3, the interconnecting structures 88 provided by the metal layers 4 and 9, the polymer layer 14, the metal layers 16 and 18, and the metal bump or pillar 27, and the opening 14*a* in the polymer layer 14 is over the interconnecting structure 88. After the step illustrated in FIG. 25L, the semiconductor wafer 10 can be cut into a plurality of individual semiconductor chip by a die-sawing process.

Alternatively, after the step illustrated in FIG. 25L, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 24B, 24C and 25A-25L. After the steps illustrated in FIGS. 24B, 24C and 25A-25L, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, the semiconductor chip can be connected to an external circuit, such as ball-grid-array (BGA) substrate, printed circuit board, semiconductor chip, metal substrate, glass substrate or ceramic substrate, through the metal bump or pillar 27 of the bottom scheme 103. The semiconductor chip includes the bottom scheme 103, and the bottom scheme 103 includes the insulating layer 3 on the backside 1*a* of the thinned silicon substrate 1 and in the through-silicon vias 11*a*, 11*b*, 11*c*, 11*d* and 11*e*, the interconnecting structures 88 at the backside 1*a* of the thinned silicon substrate 1, in the through-silicon vias 11*a*, 11*b*, 11*c*, 11*d* and 11*e* and on the insulating layer 3, the polymer layer 14 at the backside 1*a* of the thinned silicon substrate 1, on the interconnecting structures 88 and on the insulating layer 3, the metal bump or pillar 27 at the backside 1*a* of the thinned silicon substrate 1, on the interconnecting structure 88 and on the polymer layer 14, the adhesion/barrier layer 16 between the bulk metal layer 9 and the metal bump or pillar 27, and the seed layer 18 between the adhesion/barrier layer 16 and the metal bump or pillar 27. The interconnecting structures 88 connects the off-chip buffer 42 to the internal circuits 21, 22, 23 and 24, connects the off-chip buffer 42 to the metal bump or pillar 27, and connects the internal circuits 21, 22, 23 and 24 to the metal bumps or pillars 27. The off-chip ESD (electro static discharge) circuit 43 is connected to the off-chip buffer 42 through the fine-line metal trace 639, and to the interconnecting structure 88 through the fine-line metal trace 639.

FIG. 25M is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a flux 32 can be formed in the openings 531, 532, 534, 539 and 539' and on the regions 600*a* of the metal traces or pads 600 exposed by the openings 531, 532, 534, 539 and 539'. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the structure including the interconnecting structures 88, the polymer layer 14 and the metal bump or pillar 27 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25L. Accordingly, a bottom scheme 103 same as the bottom scheme 103 shown in FIG. 25L can be formed at the backside 1*a* of the thinned silicon substrate 1.

After forming the structure shown in FIG. 25M, the flux 32 is removed. Next, with the following steps being illustrated with reverse figures for simple explanation, each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bump or pillar 27 of the bottom scheme 103, and/or to a second external circuit, such as ball-grid-array (BGA) substrate, printed circuit board, semiconductor chip, metal substrate, glass substrate or ceramic substrate, through one of the over-passivation schemes 102 illustrated in FIGS. 15H, 15K-15M, 16L, 16M, 17J, 18I, 19H and 20.

FIG. 25N is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, multiple metal pads, bumps or traces 34*a* composed of two metal layers 32 and 34 can be formed on the passivation layer 5 and on the regions 600*a* of the metal traces or pads 600 exposed by the openings 531, 532, 534, 539 and 539'. The metal layer 32 is formed on the passivation layer 5 and on the regions 600*a* of the metal traces or pads 600 exposed by the openings 531, 532, 534, 539 and 539, and the metal layer 34 is formed on the metal layer 32, and the metal layer 34 is not covered by the metal layer 32.

The metal pad, bump or trace 34*a* has a thickness larger than 1 micrometer, such as between 1 and 20 micrometers or between 5 and 60 micrometers, and a width larger than that of the metal trace or pad 600 and larger than 3 micrometers, such as between 5 and 60 micrometers, and the metal trace or pad 600 may have a width smaller than 1 micrometer, such as between 0.05 and 0.95 micrometers. The metal pads, bumps or traces 34*a* can be used to be connected to a first external circuit, such as ball-grid-array (BGA) substrate, printed circuit board, semiconductor chip, metal substrate, glass substrate or ceramic substrate, by bonding the metal pads, bumps or traces 34*a* to the first external circuit or by wirebonding gold wires or copper wires to the metal pads, bumps or traces 34*a* and to the first external circuit.

For example, the metal pads, bumps or traces 34*a* can be formed by a suitable process or processes, e.g., by a process including sputtering an adhesion/barrier layer 32, such as titanium layer, titanium-tungsten-alloy layer, titanium-nitride layer, tantalum layer or tantalum-nitride layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 531, 532, 534, 539 and 539', next sputtering an aluminum-containing layer 34, such as aluminum layer or aluminum-copper-alloy layer, having a thickness between 0.5 and 10 micrometers, and preferably between 1 and 5 micrometers, on the adhesion/barrier layer 32, next forming a patterned photoresist layer on the aluminum-containing layer 34, next etching the aluminum-containing layer 34 not under the patterned photoresist layer, next etching the adhesion/barrier layer 32 not under the patterned photoresist layer, and then removing the patterned photoresist layer. Accordingly, the metal pads, bumps or traces 34*a* provided by the adhesion/barrier layer 32 and the aluminum-containing layer 34 can be formed on the passivation layer 5 and on the regions 600*a* of the metal traces or pads 600 exposed by the openings 531, 532, 534, 539 and 539'. The aluminum-containing layer 34 of the metal pad, bump or trace 34*a* can be used to be connected to the first external circuit by wirebonding a gold wire or a copper wire to the aluminum-containing layer 34 and to the first external circuit or by bonding aluminum-containing layer 34 with a gold layer or a tin-alloy layer of the first external circuit.

Alternatively, the metal pads, bumps or traces 34*a* can be formed by a suitable process or processes, e.g., by a process including sputtering an adhesion/barrier layer 32, such as titanium layer, titanium-tungsten-alloy layer, titanium-nitride layer, tantalum layer or tantalum-nitride layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 531, 532, 534, 539 and 539', next sputtering a seed layer of gold (not shown) having a thickness smaller than 1 micrometer, such as between 0.005 and 0.8 micrometers, and preferably between 0.05 and 0.5 micrometers, on the adhesion/barrier layer 32, next forming a patterned photoresist layer on the seed layer of gold, and multiple openings in the patterned photoresist layer expose multiple regions of the seed layer of gold, next electroplating a gold layer 34 having a thickness larger than 1 micrometer, such as between 1 and 25 micrometers, and preferably between 2 and 10 micrometers, on the regions of the seed layer of gold exposed by the openings in the patterned photoresist layer, next removing the photoresist layer, next etching the seed layer of gold not under the gold layer 34, and then etching the adhesion/barrier layer 32 not under the gold layer 34. Accordingly, the metal pads, bumps or traces 34*a* provided by the adhesion/barrier layer 32, the seed layer of gold and the gold layer 34 can be formed on the passivation layer 5 and on the regions 600*a* of the metal traces or pads 600 exposed by the openings 531, 532, 534, 539 and 539'. The gold layer 34 of the metal pad, bump or trace 34*a* can be used to be connected to the first external circuit by wirebonding a gold wire or a copper wire to the gold layer 34 and to the first external circuit or by bonding the gold layer 34 with a gold layer or a tin-alloy layer of the first external circuit.

Alternatively, the metal pads, bumps or traces 34*a* can be formed by a suitable process or processes, e.g., by a process including electroless plating a nickel layer 32 with a thickness between 1 and 10 micrometers, and preferably between 2 and 8 micrometers, on the passivation layer 5 and on the regions 600*a* of the metal traces or pads 600 exposed by the openings 531, 532, 534, 539 and 539', and then electroless plating the metal layer 34, such as gold layer or palladium layer, with a thickness between 200 angstroms and 2 micrometers, and preferably between 500 angstroms and 5,000 angstroms, on the nickel layer 32. Accordingly, the metal pads, bumps or traces 34*a* provided by the nickel layer 32 and the metal layer 34 can be formed on the passivation layer 5 and on the regions 600*a* of the metal traces or pads 600 exposed by the openings 531, 532, 534, 539 and 539'. The metal layer 34 of the metal pad, bump or trace 34*a* can be used to be connected to the first external circuit by wirebonding a gold wire or a copper wire to the metal layer 34 and to the first external circuit or by bonding the metal layer 34 with a gold layer or a tin-alloy layer of the first external circuit.

Alternatively, the metal pads, bumps or traces 34*a* can be formed by a suitable process or processes, e.g., by a process including sputtering an adhesion/barrier layer 32, such as titanium layer, titanium-tungsten-alloy layer, titanium-nitride layer, chromium layer, tantalum layer or tantalum-nitride layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 531, 532, 534, 539 and 539', next sputtering a seed layer of copper (not shown) having a thickness smaller than 1 micrometer, such as between 0.005 and 0.8 micrometers, and preferably between 0.05 and 0.5 micrometers, on the adhesion/barrier layer 32, next forming a patterned photoresist layer on the seed layer of copper, and multiple openings in the patterned photoresist layer expose multiple regions of the seed layer of copper, next electroplating a copper layer 34 having a thickness larger than 1 micrometer, such as between 1 and 100 micrometers, and preferably between 5 and 60 micrometers, on the regions of the seed layer of copper exposed by the openings in the patterned photoresist layer, next removing the photoresist layer, next etching the seed layer of copper not under the copper layer 34, and then etching the adhesion/barrier layer 32 not under the copper layer 34. Accordingly, the metal pads, bumps or traces 34*a* provided by the adhesion/barrier layer 32, the seed layer of copper and the copper layer 34 can be formed on the passivation layer 5 and on the regions 600*a* of the metal traces or pads 600 exposed by the openings 531, 532, 534, 539 and 539'. The copper layer 34 of the metal pad, bump or trace 34*a* can be used to be connected to the first external circuit by wirebonding a gold wire or a copper wire to the copper layer 34 and to the first external circuit or by bonding the copper layer 34 with a gold layer or a tin-alloy layer of the first external circuit.

Alternatively, the metal pads, bumps or traces 34*a* can be formed by a suitable process or processes, e.g., by a process including sputtering an adhesion/barrier layer 32, such as titanium layer, titanium-tungsten-alloy layer, titanium-nitride layer, chromium layer, tantalum layer or tantalum-nitride layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 531, 532, 534, 539 and 539', next sputtering a seed layer of copper (not shown) having a thickness smaller than 1 micrometer, such as between 0.005 and 0.8 micrometers, and preferably between 0.05 and 0.5 micrometers, on the adhesion/barrier layer 32, next forming a patterned photoresist layer on the seed layer of copper, and multiple openings in the patterned photoresist layer expose multiple regions of the seed layer of copper, next electroplating a copper layer 34 having a thickness larger than 1 micrometer, such as between 1 and 100 micrometers, and preferably between 5 and 60 micrometers, on the regions of the seed layer of copper exposed by the openings in the patterned photoresist layer, next electroplating or electroless plating a nickel layer (not shown) having a thickness between 0.5 and 8 micrometers, and preferably between 1 and 5 micrometers, on the copper layer 34 in the openings in the patterned photoresist layer, next electroplating or electroless plating a gold layer (not shown) having a thickness between 0.1 and 10 micrometers, and preferably between 0.5 and 5 micrometers, on the electroplated or electroless plated nickel layer in the openings in the patterned photoresist layer, next removing the photoresist layer, next etching the seed layer of copper not under the copper layer 34, and then etching the adhesion/barrier layer 32 not under the copper layer 34. Accordingly, the metal pads, bumps or traces 34*a* provided by the adhesion/barrier layer 32, the seed layer of copper, the copper layer 34, the electroplated or electroless plated nickel layer and the electroplated or electroless plated gold layer can be formed on the passivation layer 5 and on the regions 600*a* of the metal traces or pads 600 exposed by the openings 531, 532, 534, 539 and 539'. The electroplated or electroless plated gold layer of the metal pad, bump or trace 34*a* can be used to be connected to the first external circuit by wirebonding a gold wire or a copper wire to the electroplated or electroless plated gold layer and to the first external circuit or by bonding the electroplated or electroless plated gold layer with a gold layer or a tin-alloy layer of the first external circuit.

Alternatively, the metal pads, bumps or traces 34*a* can be formed by a suitable process or processes, e.g., by a process including sputtering an adhesion/barrier layer 32, such as titanium layer, titanium-tungsten-alloy layer, titanium-nitride layer, chromium layer, tantalum layer or tantalum-nitride layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 531, 532, 534, 539 and 539', next sputtering a seed layer of copper (not shown) having a thickness smaller than 1 micrometer, such as between 0.005 and 0.8 micrometers, and preferably between 0.05 and 0.5 micrometers, on the adhesion/barrier layer 32, next forming a patterned photoresist layer on the seed layer of copper, and multiple openings in the patterned photoresist layer expose multiple regions of the seed layer of copper, next electroplating a copper layer 34 having a thickness larger than 1 micrometer, such as between 1 and 100 micrometers, and preferably between 5 and 60 micrometers, on the regions of the seed layer of copper exposed by the openings in the patterned photoresist layer, next electroplating or electroless plating a nickel layer (not shown) having a thickness between 0.5 and 8 micrometers, and preferably between 1 and 5 micrometers, on the copper layer 34 in the openings in the patterned photoresist layer, next electroplating a tin-containing layer (not shown), such as a tin-lead-alloy layer, a tin-silver-alloy layer or a tin-silver-copper-alloy layer, having a thickness between 1 and 150 micrometers, and preferably between 5 and 60 micrometers, on the electroplated or electroless plated nickel layer in the openings in the patterned photoresist layer, next removing the photoresist layer, next etching the seed layer of copper not under the copper layer 34, and then etching the adhesion/barrier layer 32 not under the copper layer 34. Accordingly, the metal pads, bumps or traces 34*a* provided by the adhesion/barrier layer 32, the seed layer of copper, the copper layer 34, the electroplated or electroless plated nickel layer and the electroplated tin-containing layer can be formed on the passivation layer 5 and on the regions 600*a* of the metal traces or pads 600 exposed by the openings 531, 532, 534, 539 and 539'. The electroplated tin-containing layer of the metal pad, bump or trace 34*a* can be used to be connected to the first external circuit by bonding the electroplated tin-containing layer with a gold layer or a tin-alloy layer of the first external circuit.

After forming the metal pads, bumps or traces 34*a*, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, which can be referred to as the steps illustrated in FIGS. 25A-25F. Next, the polymer layer 14, the adhesion/barrier layer 16, the seed layer 18 and the metal bump or pillar 27 can be formed at the backside 1*a* of the thinned silicon substrate 1, which can be referred to as the steps illustrated in FIGS. 25G-25L. Accordingly, a bottom scheme 103 same as the bottom scheme 103 shown in FIG. 25L can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 531, 532, 534, 539 and 539' can be performed after forming the metal bump or pillar 27.

After forming the structure shown in FIG. 25N, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to the first external circuit through the metal pads, bumps or traces 34*a*, and to a second external circuit, such as printed circuit board, ball-grid-array (BGA) substrate, semiconductor chip, metal substrate, glass substrate or ceramic substrate, through the metal bump or pillar 27 of the bottom scheme 103.

FIG. 25O is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the patterned circuit layer 801 composed of the adhesion/barrier/seed layer 8011 and the metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, the polymer layer 98 is formed on the metal layer 8012 of the patterned circuit layer 801 and on the passivation layer 5, and the opening 980 in the polymer layer 98 is over a contact point 801*a* of the metal layer 8012 of the patterned circuit layer 801 and exposes it, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux 32 is formed in the opening 980 and on the contact point 801*a* of the metal layer 8012 exposed by the opening 980. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, which can be referred to as the steps illustrated in FIGS. 25A-25F. Next, the polymer layer 14, the adhesion/barrier layer 16, the seed layer 18 and the metal bump or pillar 27 can be formed at the backside 1*a* of the thinned silicon substrate 1, which can be referred to as the steps illustrated in FIGS. 25G-25L. Accordingly, a bottom scheme 103 same as the bottom scheme 103 shown in FIG. 25L can be formed at the backside 1*a* of the thinned silicon substrate 1. Alternatively, the steps of forming the patterned circuit layer 801, the polymer layer 98 and the flux 32 can be performed after the steps illustrated in FIGS. 24B, 24C and 25A-25L.

After forming the structure shown in FIG. 25O, the flux 32 is removed. Thereafter, using a die-sawing process, the semiconductor wafer 10 can be cut into a plurality of individual semiconductor chip. The semiconductor chip cut from the semiconductor wafer 10 can be connected to a first external circuit, such as ball-grid-array (BGA) substrate, printed circuit board, semiconductor chip, metal substrate, glass substrate or ceramic substrate, by wirebonding a gold wire or a copper wire to the contact point 801*a* of gold, copper or aluminum of the patterned circuit layer 801 of the over-passivation scheme 102 and to the first external circuit or by solder bonding the contact point 801*a* of the patterned circuit layer 801 of the over-passivation scheme 102 with a gold layer or a tin-alloy layer of the first external circuit, and to a second external circuit, such as printed circuit board, ball-grid-array (BGA) substrate, semiconductor chip, metal substrate, glass substrate or ceramic substrate, through the metal bump or pillar 27 of the bottom scheme 103.

FIG. 25P is a cross-sectional view showing a semiconductor wafer, which can be formed by a suitable process or processes, e.g., by the following steps. After the steps illustrated in FIGS. 24B, 24C and 25A-25F are performed; the polymer layer 14 is formed on the bulk metal layer 9 and on the insulating layer 3, and multiple openings 14*a* in the polymer layer 14 are over multiple regions of the bulk metal layer 9 and expose them, which can be referred to as the step illustrated in FIG. 25G. Next, the adhesion/barrier layer 16 is formed on the polymer layer 14 and on the regions of the bulk metal layer 9 exposed by the openings 14*a*, and then the seed layer 18 is formed on the adhesion/barrier layer 16, which can be referred to as the step illustrated in FIG. 25H. Next, the photoresist layer 31 is formed on the seed layer 18, and multiple openings 31*a* in the photoresist layer 31 expose the seed layer 18, which can be referred to as the step illustrated in FIG. 25I. Next, multiple metal bumps or pillars 27 are formed in the openings 31*a* and on the seed layer 18 exposed by the openings 31*a*, which can be referred to as the step illustrated in FIG. 25J. Next, the photoresist layer 31 is removed, which can be referred to as the step illustrated in FIG. 25K. Next, the seed layer 18 not under the metal bumps or pillars 27 is removed, and then the adhesion/barrier layer 16 not under the metal bumps or pillars 27 is removed, which can be referred to as the step illustrated in FIG. 25L. Accordingly, the interconnecting structures 88 provided by the metal layers 4 and 9 can be formed in the through-silicon vias 11*a*, 11*b*, 11*c*, 11*d* and 11*e* and at the backside 1*a* of the thinned silicon substrate 1, and the metal bumps or pillars 27 can be formed over the interconnecting structures 88 and at the backside 1*a* of the thinned silicon substrate 1. The interconnecting structures 88 can connect the off-chip buffer 42 to the internal circuits 21, 22, 23 and 24, and can connect the metal bumps or pillars 27 to the off-chip buffer 42 and to the internal circuits 21, 22, 23 and 24. A bottom scheme 103, shown in FIG. 25P, at the backside 1*a* of the thinned silicon substrate 1 is formed with the insulating layer 3, the interconnecting structures 88 provided by the metal layers 4 and 9, the polymer layer 14, the metal layers 16 and 18, and the metal bumps or pillars 27, and the openings 14*a* in the polymer layer 14 are over the interconnecting structures 88. After forming the structure shown in FIG. 25P, the semiconductor wafer 10 can be cut into a plurality of individual semiconductor chip by a die-sawing process.

Alternatively, after forming the structure shown in FIG. 25P, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 24B, 24C and 25A-25L. After the steps illustrated in FIGS. 24B, 24C and 25A-25L, the steps illustrated in FIG. 25P is performed. Thereafter, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, the semiconductor chip can be connected to an external circuit, such as ball-grid-array (BGA) substrate, printed circuit board, semiconductor chip, metal substrate, glass substrate or ceramic substrate, through the metal bumps or pillars 27 of the bottom scheme 103, and the metal bumps or pillars 27 of the bottom scheme 103 of the semiconductor chip can be connected to the internal circuits 21, 22, 23 and 24 and the off-chip buffer 42 through the interconnecting structures 88 of the bottom scheme 103.

FIG. 25Q is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a flux 32 can be formed in the openings 531, 532, 534, 539 and 539' and on the regions 600*a* of the metal traces or pads 600 exposed by the openings 531, 532, 534, 539 and 539'. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14 and the metal bumps or pillars 27 can be formed at the backside 1*a* of the thinned silicon substrate 1, which can be referred to as the steps illustrated in FIG. 25P. Accordingly, a bottom scheme 103 same as the bottom scheme 103 shown in FIG. 25P can be formed at the backside 1*a* of the thinned silicon substrate 1.

After forming the structure shown in FIG. 25Q, the flux 32 is removed. Next, with the following steps being illustrated with reverse figures for simple explanation, each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bumps or pillars 27 of the bottom scheme 103, and/or to a second external circuit, such as ball-grid-array (BGA) substrate, printed circuit board, semiconductor chip, metal substrate, glass substrate or ceramic substrate, through one of the over-passivation schemes 102 illustrated in FIGS. 15H, 15K-15M, 16L, 16M, 17J, 18I, 19H and 20. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

FIG. 25R is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the metal pads, bumps or traces 34*a* can be formed on the passivation layer 5 and on the regions 600*a* of the metal traces or pads 600 exposed by the openings 531, 532, 534, 539 and 539', which can be referred to as the process illustrated in FIG. 25N. The specification of the metal pads, bumps or traces 34*a* shown in FIG. 25R can be referred to as the specification of the metal pads, bumps or traces 34*a* as illustrated in FIG. 25N. After forming the metal pads, bumps or traces 34*a*, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14 and the metal bumps or pillars 27 can be formed at the backside 1*a* of the thinned silicon substrate 1, which can be referred to as the steps illustrated in FIG. 25P. Accordingly, a bottom scheme 103 same as the bottom scheme 103 shown in FIG. 25P can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 531, 532, 534, 539 and 539' can be performed after forming the metal bumps or pillars 27.

After forming the structure shown in FIG. 25R, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, through the metal pads, bumps or traces 34*a*, and to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

FIG. 25S is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and an opening 980 in the polymer layer 98 is over a contact point 801*a* of the metal layer 8012 of the patterned circuit layer 801 and exposes it, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux 32 is formed in the opening 980 and on the contact point 801*a* of the metal layer 8012 exposed by the opening 980. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14 and the metal bumps or pillars 27 can be formed at the backside 1*a* of the thinned silicon substrate 1, which can be referred to as the steps illustrated in FIG. 25P. Accordingly, a bottom scheme 103 same as the bottom scheme 103 shown in FIG. 25P can be formed at the backside 1*a* of the thinned silicon substrate 1. Alternatively, the steps of forming the patterned circuit layer 801 and the polymer layer 98 can be performed after forming the metal bumps or pillars 27.

After forming the structure shown in FIG. 25S, the flux 32 can be removed. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, by wirebonding a gold wire or a copper wire to the contact point 801*a* of gold, copper or aluminum of the patterned circuit layer 801 of the over-passivation scheme 102 and to the first external circuit or by solder bonding the contact point 801*a* of the patterned circuit layer 801 of the over-passivation scheme 102 with a gold layer or a tin-alloy layer of the first external circuit, and can be connected to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

FIG. 25T is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15M. Next, multiple metal bumps 89 provided by the metal layers 89*a*, 89*b* and 89*c* can be formed on the polymer layer 98 and on the contact points 801*a* of the metal layer 8012 exposed by the openings 980, which can be referred to as the process illustrated in FIG. 15M. Accordingly, an over-passivation scheme 102 can be formed with the patterned circuit layer 801, the polymer layer 98 and the metal bumps 89, at the active side of the thinned silicon substrate 1. After forming the metal bumps 89, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14 and the metal bumps or pillars 27 can be formed at the backside 1*a* of the thinned silicon substrate 1, which can be referred to as the steps illustrated in FIG. 25P. Accordingly, a bottom scheme 103 same as the bottom scheme 103 shown in FIG. 25P can be formed at the backside 1*a* of the thinned silicon substrate 1. Alternatively, the steps of forming the patterned circuit layer 801, the polymer layer 98, the metal layer 89*a* and the metal bumps 89 can be performed after forming the metal bumps or pillars 27.

After forming the structure shown in FIG. 25T, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, ball-grid-array (BGA) substrate, semiconductor chip, metal substrate, glass substrate or ceramic substrate, through the metal bumps 89 of the over-passivation scheme 102, and to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24. The patterned circuit layer 801 connects the off-chip buffer 42 to the internal circuits 21, 22, 23 and 24, and connects the metal bumps 89 to the off-chip buffer 42, to the off-chip ESD circuit 43 and to the internal circuits 21, 22, 23 and 24.

FIG. 25U is a cross-sectional view showing a package, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux can be formed in the openings 980 and on the contact points 801*a* of the metal layer 8012 exposed by the openings 980.

After forming the flux, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the polymer layer 14 can be formed on the bulk metal layer 9 of the interconnecting structures 88 and on the insulating layer 3, and multiple openings 14*a* in the polymer layer 14 are over multiple regions of the bulk metal layer 9 and expose them, which can be referred to as the step illustrated in FIG. 25G. Accordingly, a bottom scheme 103 at the backside 1*a* of the thinned silicon substrate 1 can be formed with the insulating layer 3, the interconnecting structures 88 provided by the metal layers 4 and 9, and the polymer layer 14, and the openings 14*a* in the polymer layer 14 are over the interconnecting structures 88. Next, the flux is removed to expose the contact points 801*a* of the metal layer 8012 exposed by the openings 980.

Alternatively, the step illustrated in FIG. 24B can be performed before the steps of forming the patterned circuit layer 801 and the polymer layer 98. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the structure including the interconnecting structures 88, the polymer layer 14 and the openings 14*a* in the polymer layer 14 can be formed at the backside 1*a* of the thinned silicon substrate 1, which can be referred to as the steps illustrated in FIGS. 25A-25G. Next, the flux can be formed in the openings 14*a* and on the regions of the bulk metal layer 9 exposed by the openings 14*a*. Next, the patterned circuit layer 801, the polymer layer 98 and the openings 980 in the polymer layer 98 can be formed at the active side of the thinned silicon substrate 1, which can be referred to as the steps illustrated in FIGS. 15D-15I. Next, the flux is removed to expose the contact points 801*a* of the metal layer 8012 exposed by the openings 980.

After removing the flux, the semiconductor wafer 10 can be cut into a plurality of individual semiconductor chip by a die-sawing process. Thereafter, using a wire-bonding process, multiple wirebonded wires 129, such as wirebonded gold wires or wirebonded copper wires, can be bonded onto the schemes 102 and 103 of the semiconductor chip cut from the semiconductor wafer 10. For example, the wirebonded wires 129 can be wirebonded gold wires ball bonded with the regions of gold, copper, aluminum or palladium of the bulk metal layer 9 exposed by the openings 14*a* and with the regions 801*a* of gold, copper, aluminum or palladium of the metal layer 8012 exposed by the openings 980. Alternatively, the wirebonded wires 129 can be wirebonded copper wires ball bonded with the regions of gold, copper, aluminum or palladium of the bulk metal layer 9 exposed by the openings 14*a* and with the regions 801*a* of gold, copper, aluminum or palladium of the metal layer 8012 exposed by the openings 980.

FIG. 25V is a cross-sectional view showing a package, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the patterned circuit layer 801 composed of the adhesion/barrier/seed layer 8011 and the metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, the polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux can be formed in the openings 980 and on the contact points 801*a* of the metal layer 8012 exposed by the openings 980.

After forming the flux, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14 and the metal bumps or pillars 27 can be formed at the backside 1*a* of the thinned silicon substrate 1, which can be referred to as the steps illustrated in FIG. 25P. Accordingly, a bottom scheme 103 same as the bottom scheme 103 shown in FIG. 25P can be formed at the backside 1*a* of the thinned silicon substrate 1. Next, the flux is removed to expose the contact points 801*a* of the metal layer 8012 exposed by the openings 980.

After removing the flux, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, ball-grid-array (BGA) substrate, semiconductor chip, metal substrate, glass substrate or ceramic substrate, by wirebonding multiple wires 129, such as gold wires or copper wires, to the regions 801*a* of the metal layer 8012 of the over-passivation scheme 102 and to the first external circuit, and can be connected to a second external circuit, such as printed circuit board, ball-grid-array (BGA) substrate, semiconductor chip, metal substrate, glass substrate or ceramic substrate, by bonding the metal bumps or pillars 27 of the bottom scheme 103 with the second external circuit.

For example, using a wire-bonding process, the wirebonded wires 129 can be wirebonded gold wires ball bonded with the regions 801*a* of gold, copper, aluminum or palladium of the metal layer 8012 exposed by the openings 980. Alternatively, using a wire-bonding process, the wirebonded wires 129 can be wirebonded copper wires ball bonded with the regions 801*a* of gold, copper, aluminum or palladium of the metal layer 8012 exposed by the openings 980.

Alternatively, the step illustrated in FIG. 24B can be performed before the steps of forming the patterned circuit layer 801 and the polymer layer 98. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the structure including the polymer layer 14, the openings 14*a* and the metal bumps or pillars 27 can be formed at the backside 1*a* of the thinned silicon substrate 1, which can be referred to as the steps illustrated in FIG. 25P. Next, the patterned circuit layer 801, the polymer layer 98 and the openings 980 in the polymer layer 98 can be formed at the active side of the thinned silicon substrate 1, which can be referred to as the steps illustrated in FIGS. 15D-15I. Next, the semiconductor wafer 10 can be cut into a plurality of individual semiconductor chip by a die-sawing process. Thereafter, using a wire-bonding process, the wirebonded wires 129, such as wirebonded gold wires or wirebonded copper wires, can be bonded onto the regions 801*a* of the metal layer 8012 exposed by the openings 980 of the semiconductor chip.

FIG. 25W is a cross-sectional view showing a package, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the patterned circuit layer 801 composed of the adhesion/barrier/seed layer 8011 and the metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, the polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15M. Next, multiple metal bumps 89 provided by the metal layers 89*a*, 89*b* and 89*c* can be formed on the polymer layer 98 and on the contact points 801*a* of the metal layer 8012 exposed by the openings 980, which can be referred to as the step illustrated in FIG. 15M. Accordingly, an over-passivation scheme 102 can be formed with the patterned circuit layer 801, the polymer layer 98 and the metal bumps 89, at the active side of the thinned silicon substrate 1.

After forming the metal bumps 89, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the polymer layer 14 can be formed on the bulk metal layer 9 of the interconnecting structures 88 and on the insulating layer 3, and multiple openings 14*a* in the polymer layer 14 are over multiple regions of the bulk metal layer 9 and expose them, which can be referred to as the step illustrated in FIG. 25G. Accordingly, a bottom scheme 103 at the backside 1*a* of the thinned silicon substrate 1 is formed with the insulating layer 3, the interconnecting structures 88 provided by the metal layers 4 and 9, and the polymer layer 14, and the openings 14*a* in the polymer layer 14 are over the interconnecting structures 88. After forming the bottom scheme 103, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package; the semiconductor chip can be connected to a first external circuit, such as printed circuit board, ball-grid-array (BGA) substrate, semiconductor chip, metal substrate, glass substrate or ceramic substrate, by bonding the metal bumps 89 of the over-passivation scheme 102 with the first external circuit, and can be connected to a second external circuit, such as printed circuit board, ball-grid-array (BGA) substrate, semiconductor chip, metal substrate, glass substrate or ceramic substrate, by wirebonding multiple wires 129, such as gold wires or copper wires, to the bulk metal layer 9 of the bottom scheme 103 and to the second external circuit.

For example, using a wire-bonding process, the wirebonded wires 129 can be wirebonded gold wires ball bonded with the regions of gold, copper, aluminum or palladium of the bulk metal layer 9 exposed by the openings 14*a*. Alternatively, using a wire-bonding process, the wirebonded wires 129 can be wirebonded copper wires ball bonded with the regions of gold, copper, aluminum or palladium of the bulk metal layer 9 exposed by the openings 14*a*.

Alternatively, the step illustrated in FIG. 24B can be performed before the steps of forming the patterned circuit layer 801, the polymer layer 98 and the metal bumps 89. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the polymer layer 14 and the openings 14*a* in the polymer layer 14 can be formed at the backside 1*a* of the thinned silicon substrate 1, which can be referred to as the step illustrated in FIG. 25G Next, a flux can be formed in the openings 14*a* and on the regions of the bulk metal layer 9 exposed by the openings 14*a*. Next, the structure including the patterned circuit layer 801, the polymer layer 98 and the metal bumps 89 can be formed at the active side of the thinned silicon substrate 1, which can be referred to as the steps illustrated in FIGS. 15D-15H and 15M. Next, the flux is removed. Thereafter, the semiconductor wafer 10 can be cut into a plurality of individual semiconductor chip by a die-sawing process. After the die-sawing process, using a wire-bonding process, the wirebonded wires 129, such as wirebonded gold wires or wirebonded copper wires, can be bonded onto the regions of the bulk metal layer 9 exposed by the openings 14*a* in the polymer layer 14 of the semiconductor chip.

Figure 26A:
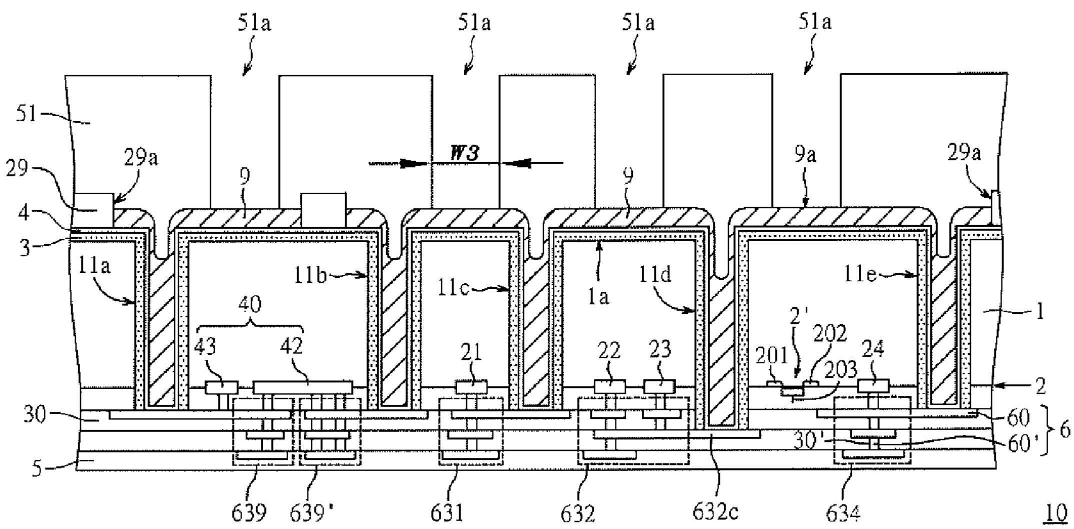

FIGS. 26A-26G are cross-sectional views showing a process for forming a bottom scheme 103 of a bottom structure technology at a backside of a semiconductor wafer according to the present disclosure. Referring to FIG. 26A, after the steps illustrated in FIGS. 24B, 24C and 25A-25D, a photoresist layer 51, such as positive-type photoresist layer or negative-type photoresist layer, having a thickness between 1 and 200 micrometers, and preferably between 2 and 150 micrometers, can be formed on the photoresist layer 29 and on the topmost layer of copper, gold, aluminum, nickel or palladium of the previously described various bulk metal layer 9 by a spin-on coating process, a screen-printing process, a lamination process or a spraying process. Next, the photoresist layer 51 is patterned with the processes of exposure and development to form multiple openings 51*a* in the photoresist layer 51 exposing multiple regions 9*a* of the topmost layer of copper, gold, aluminum, nickel or palladium of the previously described various bulk metal layer 9. For example, a 1× stepper or 1× contact aligner can be used to expose the photoresist layer 51 during the process of exposure. Each of the openings 51*a* has a desired width W3, e.g., larger than 5 micrometers, such as between 10 and 30 micrometers, between 20 and 50 micrometers or between 50 and 150 micrometers.

For example, the photoresist layer 51 can be formed by a suitable process or processes, e.g., by spin-on coating a positive-type photosensitive polymer layer having a thickness between 1 and 200 micrometers, and preferably between 2 and 150 micrometers, on the topmost layer of copper, gold, aluminum, nickel or palladium of the previously described various bulk metal layer 9 and on the photoresist layer 29, then exposing the photosensitive polymer layer using a 1× stepper or a contact aligner with at least two of G-line, H-line and I-line, and G-line has a wavelength ranging from, e.g., about 434 to 438 nm, H-line has a wavelength ranging from, e.g., about 403 to 407 nm, and I-line has a wavelength ranging from, e.g., about 363 to 367 nm, then developing the exposed polymer layer by spraying and puddling a developer on the semiconductor wafer 10 or by immersing the semiconductor wafer 10 into a developer, and then cleaning the semiconductor wafer 10 using deionized wafer and drying the semiconductor wafer 10 by spinning the semiconductor wafer 10. After development, a scum removal process of removing the residual polymeric material or other contaminants from the bulk metal layer 9 may be conducted by using an $O_2$ plasma or a plasma containing fluorine of below 200 PPM and oxygen. By these processes, the photoresist layer 51 can be patterned with the openings 51*a* exposing the regions 9*a* of the topmost layer of copper, gold, aluminum, nickel or palladium of the previously described various bulk metal layer 9.

Figure 26B:
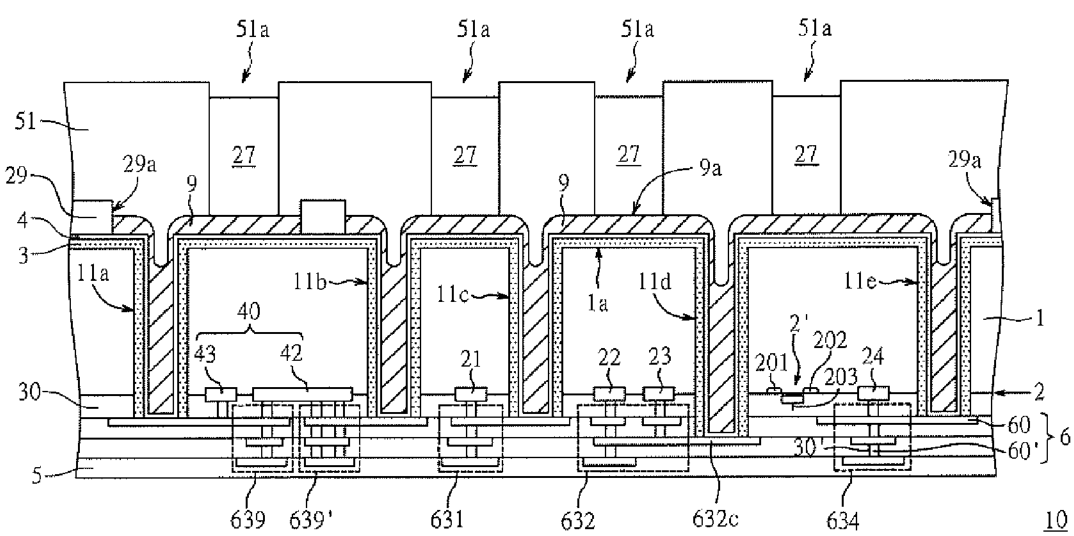

Referring to FIG. 26B, after the step illustrated in FIG. 26A, multiple metal bumps or pillars 27 having a thickness larger than 1 micrometer can be formed in the openings 51*a* and on the regions 9*a* of the topmost layer of copper, gold, aluminum, nickel or palladium of the previously described various bulk metal layer 9 exposed by the openings 51*a*. The material of the metal bumps or pillars 27 may include gold, nickel, tin, solder, palladium, copper, aluminum or a composite of the previously described materials.

For example, the metal bumps or pillars 27 can be composed of a single metal layer formed by a suitable process or processes, e.g., by electroplating a copper layer, to a thickness between 10 and 150 micrometers, and preferably between 20 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9.

Alternatively, the metal bumps or pillars 27 can be composed of a single metal layer formed by a suitable process or processes, e.g., by electroplating a gold layer, to a thickness between 1 and 30 micrometers, and preferably between 1 and 25 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating gold of the bulk metal layer 9.

Alternatively, the metal bumps or pillars 27 can be composed of a single metal layer formed by a suitable process or processes, e.g., by electroplating a palladium layer, to a thickness between 1 and 30 micrometers, and preferably between 1 and 25 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating palladium of the bulk metal layer 9.

Alternatively, the metal bumps or pillars 27 can be composed of a single metal layer formed by a suitable process or processes, e.g., by electroplating a nickel layer, to a thickness between 1 and 100 micrometers, and preferably between 5 and 60 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating nickel of the bulk metal layer 9.

Alternatively, the metal bumps or pillars 27 can be composed of double metal layers formed by a suitable process or processes, e.g., by electroplating a copper layer, to a thickness between 10 and 150 micrometers, and preferably between 20 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, and then electroplating or electroless plating a gold layer, to a thickness between 0.005 and 10 micrometers, and preferably between 0.05 and 1 micrometer, in the openings 51*a* and on the electroplated copper layer in the openings 51*a* using the previously described electroplating or electroless plating solution for electroplating or electroless plating gold of the bulk metal layer 9.

Alternatively, the metal bumps or pillars 27 can be composed of double metal layers formed by a suitable process or processes, e.g., by electroplating a copper layer, to a thickness between 10 and 150 micrometers, and preferably between 20 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, and then electroplating or electroless plating a palladium layer, to a thickness between 0.005 and 10 micrometers, and preferably between 0.05 and 1 micrometer, in the openings 51*a* and on the electroplated copper layer in the openings 51*a* using the previously described electroplating or electroless plating solution for electroplating or electroless plating palladium of the bulk metal layer 9.

Alternatively, the metal bumps or pillars 27 can be composed of double metal layers formed by a suitable process or processes, e.g., by electroplating or electroless plating a nickel layer, to a thickness between 1 and 15 micrometers, and preferably between 2 and 10 micrometers, in the openings 51*a* and on the regions 9*a* of the topmost layer of copper, gold, aluminum, nickel or palladium of the previously described various bulk metal layer 9 exposed by the openings 51*a* using the previously described electroplating or electroless plating solution for electroplating or electroless plating nickel of the bulk metal layer 9, and then electroplating or electroless plating a gold layer, to a thickness between 0.005 and 10 micrometers, and preferably between 0.05 and 1 micrometer, in the openings 51*a* and on the electroplated or electroless plated nickel layer in the openings 51*a* using the previously described electroplating or electroless plating solution for electroplating or electroless plating gold of the bulk metal layer 9.

Alternatively, the metal bumps or pillars 27 can be composed of double metal layers formed by a suitable process or processes, e.g., by electroplating or electroless plating a nickel layer, to a thickness between 1 and 15 micrometers, and preferably between 2 and 10 micrometers, in the openings 51*a* and on the regions 9*a* of the topmost layer of copper, gold, aluminum, nickel or palladium of the previously described various bulk metal layer 9 exposed by the openings 51*a* using the previously described electroplating or electroless plating solution for electroplating or electroless plating nickel of the bulk metal layer 9, and then electroplating or electroless plating a palladium layer, to a thickness between 0.005 and 10 micrometers, and preferably between 0.05 and 1 micrometer, in the openings 51*a* and on the electroplated or electroless plated nickel layer in the openings 51*a* using the previously described electroplating or electroless plating solution for electroplating or electroless plating palladium of the bulk metal layer 9.

Alternatively, the metal bumps or pillars 27 can be composed of triple metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, next electroplating or electroless plating a nickel layer, to a thickness between 1 and 15 micrometers, and preferably between 2 and 10 micrometers, in the openings 51*a* and on the electroplated copper layer in the openings 51*a* using the previously described electroplating or electroless plating solution for electroplating or electroless plating nickel of the bulk metal layer 9, and then electroplating or electroless plating a gold layer, to a thickness between 0.005 and 1 micrometers, and preferably between 0.05 and 0.1 micrometers, in the openings 51*a* and on the electroplated or electroless plated nickel layer in the openings 51*a* using the previously described electroplating or electroless plating solution for electroplating or electroless plating gold of the bulk metal layer 9.

Alternatively, the metal bumps or pillars 27 can be composed of triple metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, next electroplating or electroless plating a nickel layer, to a thickness between 1 and 15 micrometers, and preferably between 2 and 10 micrometers, in the openings 51*a* and on the electroplated copper layer in the openings 51*a* using the previously described electroplating or electroless plating solution for electroplating or electroless plating nickel of the bulk metal layer 9, and then electroplating or electroless plating a palladium layer, to a thickness between 0.005 and 1 micrometers, and preferably between 0.05 and 0.1 micrometers, in the openings 51*a* and on the electroplated or electroless plated nickel layer in the openings 51*a* using the previously described electroplating or electroless plating solution for electroplating or electroless plating palladium of the bulk metal layer 9.

Alternatively, the metal bumps or pillars 27 can be composed of four metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, next electroplating or electroless plating a nickel layer, to a thickness between 1 and 15 micrometers, and preferably between 2 and 10 micrometers, in the openings 51*a* and on the electroplated copper layer in the openings 51*a* using the previously described electroplating or electroless plating solution for electroplating or electroless plating nickel of the bulk metal layer 9, next electroplating or electroless plating a palladium layer, to a thickness between 0.005 and 1 micrometers, and preferably between 0.05 and 0.1 micrometers, in the openings 51*a* and on the electroplated or electroless plated nickel layer in the openings 51*a* using the previously described electroplating or electroless plating solution for electroplating or electroless plating palladium of the bulk metal layer 9, and then electroplating or electroless plating a gold layer, to a thickness between 0.005 and 1 micrometers, and preferably between 0.05 and 0.1 micrometers, in the openings 51*a* and on the electroplated or electroless plated palladium layer in the openings 51*a* using the previously described electroplating or electroless plating solution for electroplating or electroless plating gold of the bulk metal layer 9.

Alternatively, the metal bumps or pillars 27 can be composed of double metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 250 micrometers, and preferably between 10 and 100 micrometer, in the openings 51*a* and on the electroplated copper layer in the openings 51*a*.

Alternatively, the metal bumps or pillars 27 can be composed of double metal layers formed by a suitable process or processes, e.g., by electroplating a nickel layer, to a thickness between 5 and 150 micrometers, and preferably between 10 and 60 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 250 micrometers, and preferably between 10 and 100 micrometer, in the openings 51*a* and on the electroplated nickel layer in the openings 51*a*.

Alternatively, the metal bumps or pillars 27 can be composed of triple metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, next electroplating or electroless plating a nickel layer, to a thickness between 1 and 15 micrometers, and preferably between 2 and 10 micrometers, in the openings 51*a* and on the electroplated copper layer in the openings 51*a* using the previously described electroplating or electroless plating solution for electroplating or electroless plating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometers, in the openings 51*a* and on the electroplated or electroless plated nickel layer in the openings 51*a*.

Alternatively, the metal bumps or pillars 27 can be composed of triple metal layers formed by a suitable process or processes, e.g., by electroplating a copper layer, to a thickness between 1 and 10 micrometers, and preferably between 3 and 8 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, next electroplating or electroless plating a nickel layer, to a thickness between 1 and 15 micrometers, and preferably between 2 and 10 micrometers, in the openings 51*a* and on the electroplated copper layer in the openings 51*a* using the previously described electroplating or electroless plating solution for electroplating or electroless plating nickel of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 30 and 250 micrometers, and preferably between 50 and 150 micrometers, in the openings 51*a* and on the electroplated or electroless plated nickel layer in the openings 51*a*.

Alternatively, the metal bumps or pillars 27 can be composed of double metal layers formed by a suitable process or processes, e.g., by electroplating a copper layer, to a thickness between 5 and 150 micrometers, and preferably between 10 and 100 micrometers, in the openings 51*a* and on the regions 9*a* of the topmost layer of copper, gold, aluminum, nickel or palladium of the previously described various bulk metal layer 9 exposed by the openings 51*a* using the previously described electroplating solution for electroplating copper of the bulk metal layer 9, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometers, in the openings 51*a* and on the electroplated copper layer in the openings 51*a*.

Figure 26C:
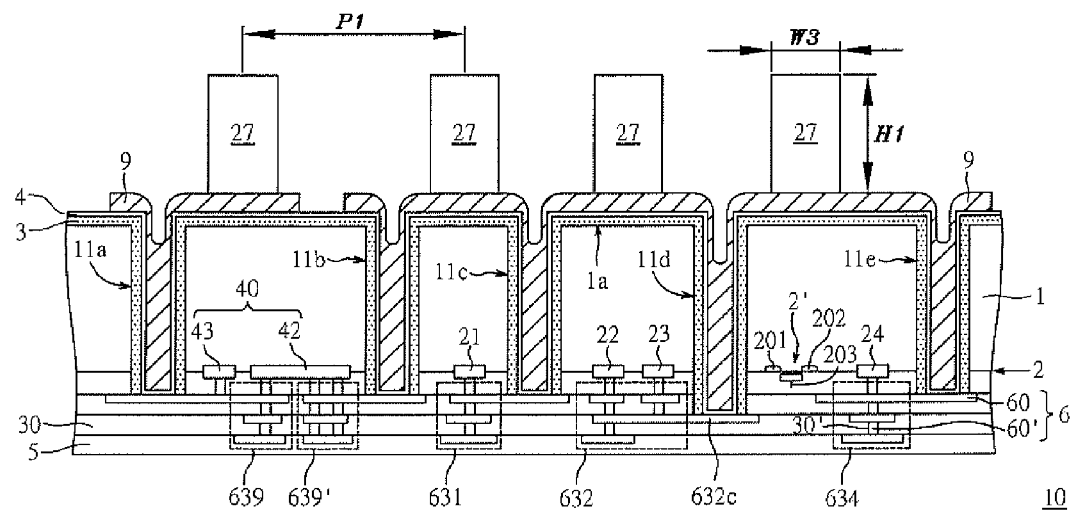

Referring to FIG. 26C, after forming the metal bumps or pillars 27, the photoresist layers 29 and 51 are removed using an inorganic solution or using an organic solution with amide. Some residuals from the photoresist layers 29 and 51 could remain on the seed layer 4*b* of the metal layer 4, on the bulk metal layer 9 and on the metal bumps or pillars 27. Thereafter, the residuals can be removed from the seed layer 4*b*, from the bulk metal layer 9 and from the metal bumps or pillars 27 with a plasma, such as an $O_2$ plasma or a plasma containing fluorine of below 200 PPM and oxygen.

Accordingly, the metal bumps or pillars 27 can be formed on the bulk metal layer 9 after the photoresist layers 29 and 51 are removed. Each of the metal bumps or pillars 27 has a width W3 larger than 5 micrometers, such as between 10 and 30 micrometers, between 20 and 50 micrometers or between 50 and 150 micrometers, and larger than that of each of the fine-line metal layers 60, and has a height H1 larger than 1 micrometer, such as between 1 and 300 micrometers, between 5 and 250 micrometers, between 10 and 100 micrometers or between 5 and 50 micrometers. A pitch P1 between neighboring two metal bumps or pillars 27 can be between 10 and 50 micrometers or between 50 and 200 micrometers. The metal bumps or pillars 27 can be used to be bonded with an external circuit, such as semiconductor chip, printed circuit board, ball-grid-array (BGA) substrate, flexible substrate, metal substrate, glass substrate or ceramic substrate.

Figure 26D:
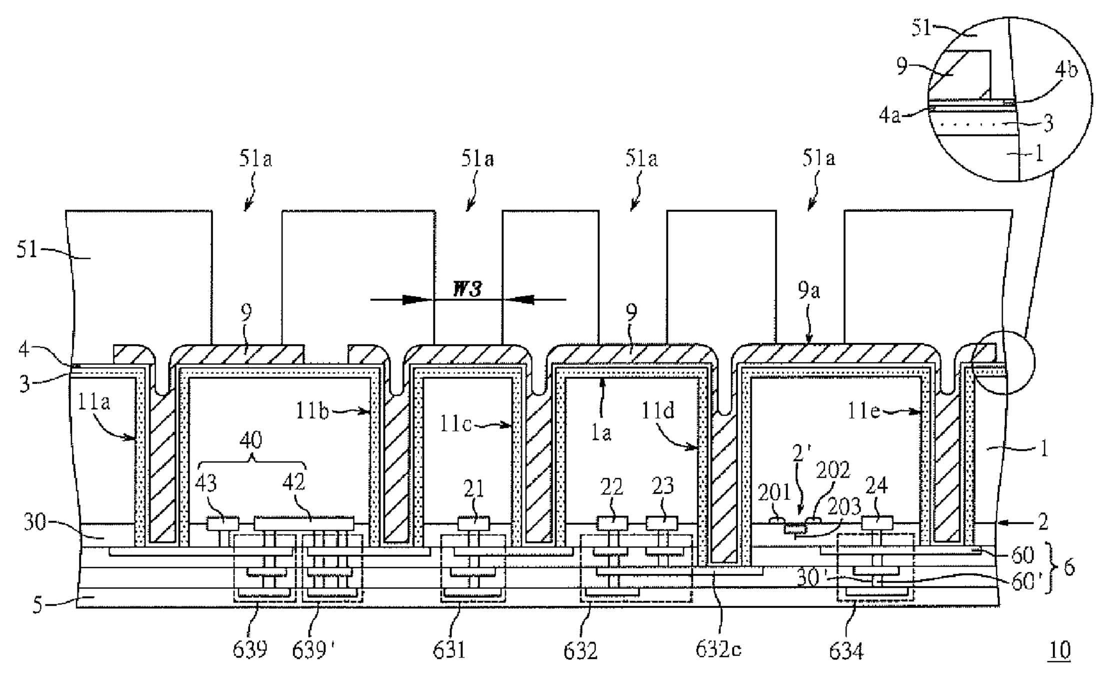

Alternatively, another process for forming the metal bumps or pillars 27 on the bulk metal layer 9 can be performed by the following steps. Referring to FIG. 26D, after the steps illustrated in FIGS. 24B, 24C and 25A-25D, the photoresist layer 29 can be removed using an inorganic solution or using an organic solution with amide. After removing the photoresist layer 29, the photoresist layer 51 illustrated in FIG. 26A can be formed on the topmost layer of copper, gold, aluminum, nickel or palladium of the previously described various bulk metal layer 9 and on the seed layer 4*b* of the metal layer 4 by a spin-on coating process, a lamination process, a screen-printing process or a spraying process. Next, the photoresist layer 51 is patterned with the processes of exposure and development to form the openings 51*a* in the photoresist layer 51 exposing the regions 9*a* of the topmost layer of copper, gold, aluminum, nickel or palladium of the previously described various bulk metal layer 9. Each of the openings 51*a* has a width W3 larger than 5 micrometers, such as between 10 and 30 micrometers, between 20 and 50 micrometers or between 50 and 150 micrometers. The process of forming the photoresist layer 51 and the openings 51*a* in the photoresist layer 51 as shown in FIG. 26D can be referred to as the process of forming the photoresist layer 51 and the openings 51*a* in the photoresist layer 51 as illustrated in FIG. 26A.

Figure 26E:
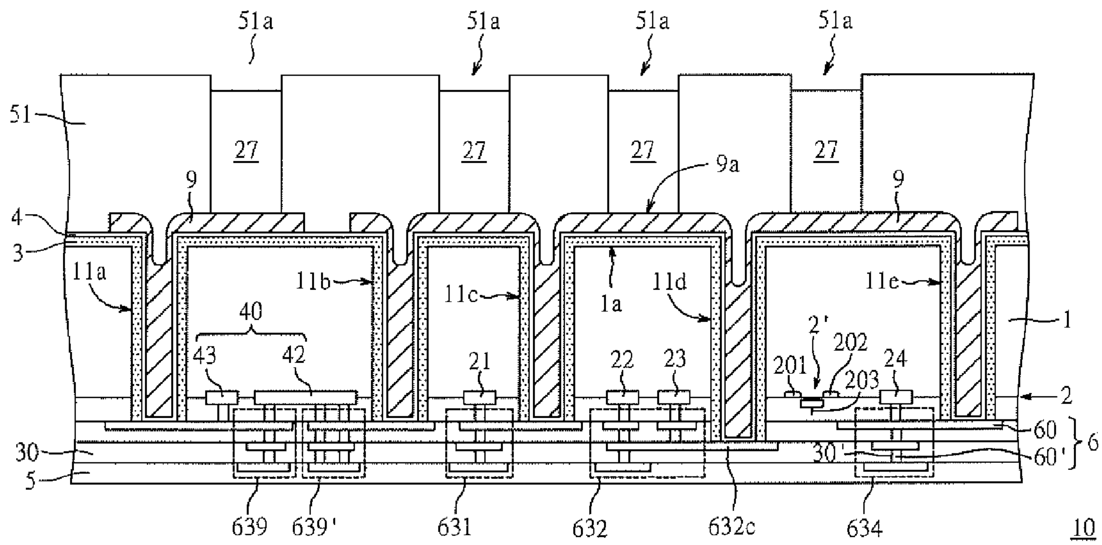

Referring to FIG. 26E, after the step illustrated in FIG. 26D, the metal bumps or pillars 27 illustrated in FIG. 26B are formed in the openings 51*a* and on the regions 9*a* of the topmost layer of copper, gold, aluminum, nickel or palladium of the previously described various bulk metal layer 9 exposed by the openings 51*a*, which can be referred to as the step illustrated in FIG. 26B. The specification of the metal bumps or pillars 27 shown in FIG. 26E can be referred to as the specification of the metal bumps or pillars 27 illustrated in FIG. 26B. After forming the metal bumps or pillars 27 as illustrated in FIG. 26E, the photoresist layer 51 is removed using an inorganic solution or using an organic solution with amide. Accordingly, the metal bumps or pillars 27 can be formed on the bulk metal layer 9 after removing the photoresist layer 51.

Figure 26F:
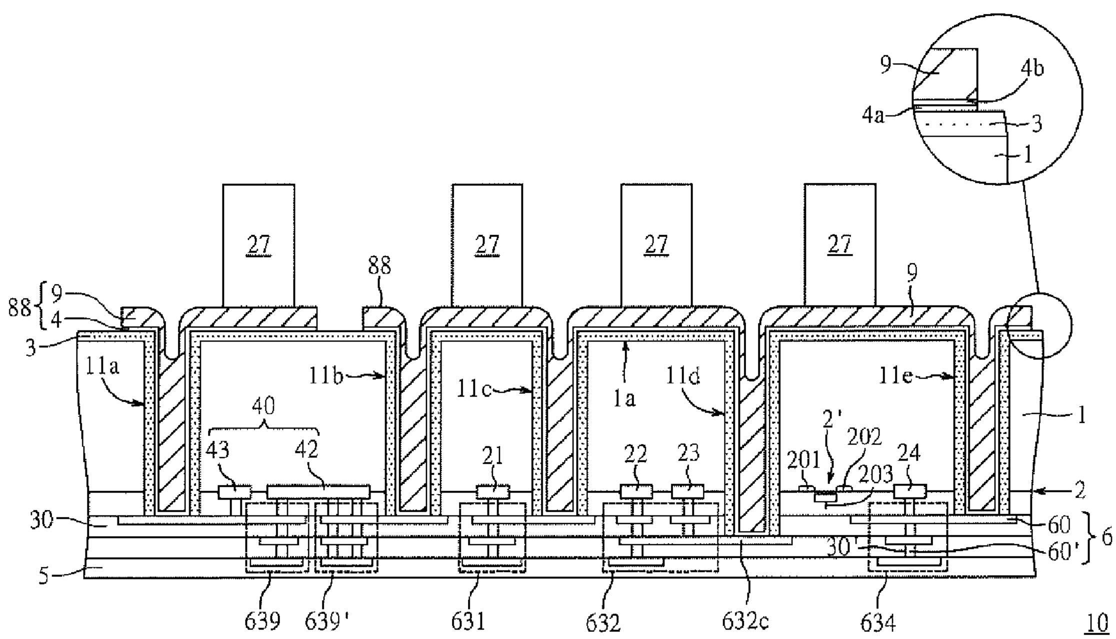

Referring to FIG. 26F, after forming the metal bumps or pillars 27 on the bulk metal layer 9, the metal layer 4 not under the bulk metal layer 9 is removed by etching the seed layer 4*b* not under the bulk metal layer 9, and then etching the adhesion/barrier layer 4*a* not under the bulk metal layer 9. The process of removing the seed layer 4*b* not under the bulk metal layer 9 and the adhesion/barrier layer 4*a* not under the bulk metal layer 9 as shown in FIG. 26F can be referred to as the process of removing the seed layer 4*b* not under the bulk metal layer 9 and the adhesion/barrier layer 4*a* not under the bulk metal layer 9 as illustrated in FIG. 25F.

Accordingly, the interconnecting structures 88 provided by the metal layer 4 and the bulk metal layer 9 can be formed in the through-silicon vias 11*a*, 11*b*, 11*c*, 11*d* and 11*e*, on the insulating layer 3 and at the backside 1*a* of the thinned silicon substrate 1, and sidewalls of the bulk metal layer 9 are not covered by the adhesion/barrier layer 4*a* and the seed layer 4*b* of the metal layer 4. The interconnecting structures 88 connects the off-chip buffer 42 to the internal circuits 21, 22, 23 and 24, connects the off-chip buffer 42 to the metal bump or pillar 27, and connects the internal circuits 21, 22, 23 and 24 to the metal bumps or pillars 27. The off-chip ESD circuit 43 is connected to the off-chip buffer 42 through the fine-line metal trace 639, and to the metal bump or pillar 27 through the interconnecting structure 88.

Figure 26G:
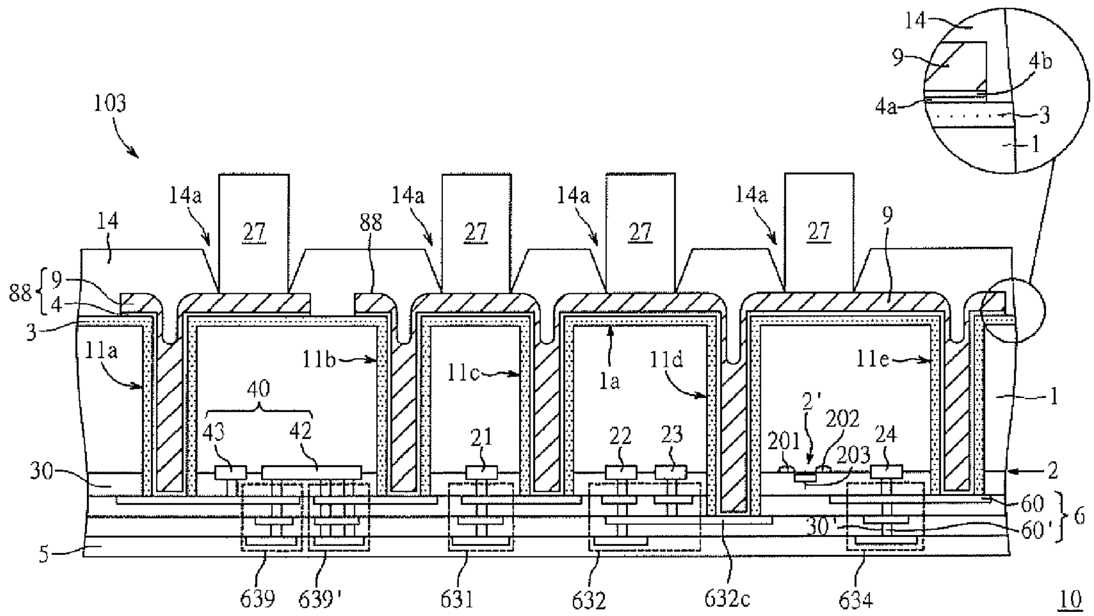

Next, referring to FIG. 26G, a polymer layer 14 is formed on the topmost layer of copper, gold, aluminum, nickel or palladium of the previously described various bulk metal layer 9 of the interconnecting structures 88, on the insulating layer 3 and at the backside 1*a* of the thinned silicon substrate 1, and multiple openings 14*a* are formed in the polymer layer 14 to uncover the top surfaces and the sidewalls of the metal bumps or pillars 27. Accordingly, a bottom scheme 103 at the backside 1*a* of the thinned silicon substrate 1 is formed with the insulating layer 3, the interconnecting structures 88 provided by the metal layers 4 and 9, the metal bumps or pillars 27, and the polymer layer 14, and the openings 14*a* in the polymer layer 14 are over the interconnecting structures 88. After the step illustrated in FIG. 26G, the semiconductor wafer 10 can be cut into a plurality of individual semiconductor chip by a die-sawing process.

Alternatively, after the step illustrated in FIG. 26G, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 24B, 24C, 25A-25D and 26A-26G. After the steps illustrated in FIGS. 24B, 24C, 25A-25D and 26A-26G, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, the semiconductor chip can be connected to an external circuit, such as ball-grid-array (BGA) substrate, printed circuit board, semiconductor chip, metal substrate, glass substrate or ceramic substrate, through the metal bumps or pillars 27 of the bottom scheme 103. The semiconductor chip includes the bottom scheme 103, and the bottom scheme 103 includes the insulating layer 3 on the backside 1*a* of the thinned silicon substrate 1 and in the through-silicon vias 11*a*, 11*b*, 11*c*, 11*d* and 11*e*, the interconnecting structures 88 at the backside 1*a* of the thinned silicon substrate 1, in the through-silicon vias 11*a*, 11*b*, 11*c*, 11*d* and 11*e* and on the insulating layer 3, the polymer layer 14 at the backside 1*a* of the thinned silicon substrate 1, on the interconnecting structures 88 and on the insulating layer 3, and the metal bumps or pillars 27 at the backside 1*a* of the thinned silicon substrate 1 and on the interconnecting structures 88.

Figure 26H:
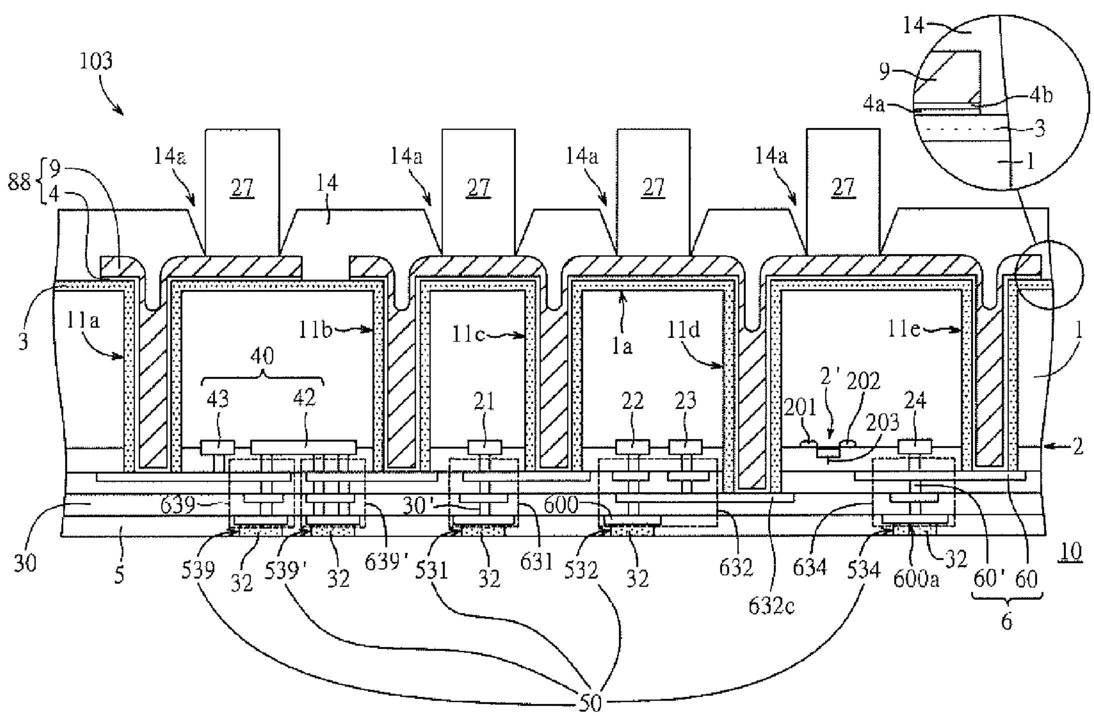

FIG. 26H is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a flux 32 can be formed in the openings 531, 532, 534, 539 and 539' and on the regions 600*a* of the metal traces or pads 600 exposed by the openings 531, 532, 534, 539 and 539'. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the metal bumps or pillars 27 can be formed on the interconnecting structures 88, which can be referred to as the steps illustrated in FIGS. 25A-25D and 26A-26F. Next, the polymer layer 14 is formed on the interconnecting structures 88, on the insulating layer 3 and at the backside 1*a* of the thinned silicon substrate 1, and the openings 14*a* are formed in the polymer layer 14 to uncover the top surfaces and the sidewalls of the metal bumps or pillars 27. Accordingly, a bottom scheme 103 same as the bottom scheme 103 shown in FIG. 26G can be formed at the backside 1*a* of the thinned silicon substrate 1.

After forming the structure shown in FIG. 26H, the flux 32 is removed. Next, with the following steps being illustrated with reverse figures for simple explanation, each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bumps or pillars 27 of the bottom scheme 103, and/or to a second external circuit, such as ball-grid-array (BGA) substrate, printed circuit board, semiconductor chip, metal substrate, glass substrate or ceramic substrate, through one of the over-passivation schemes 102 illustrated in FIGS. 15H, 15K-15M, 16L, 16M, 17J, 18I, 19H and 20. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

Figure 26I:
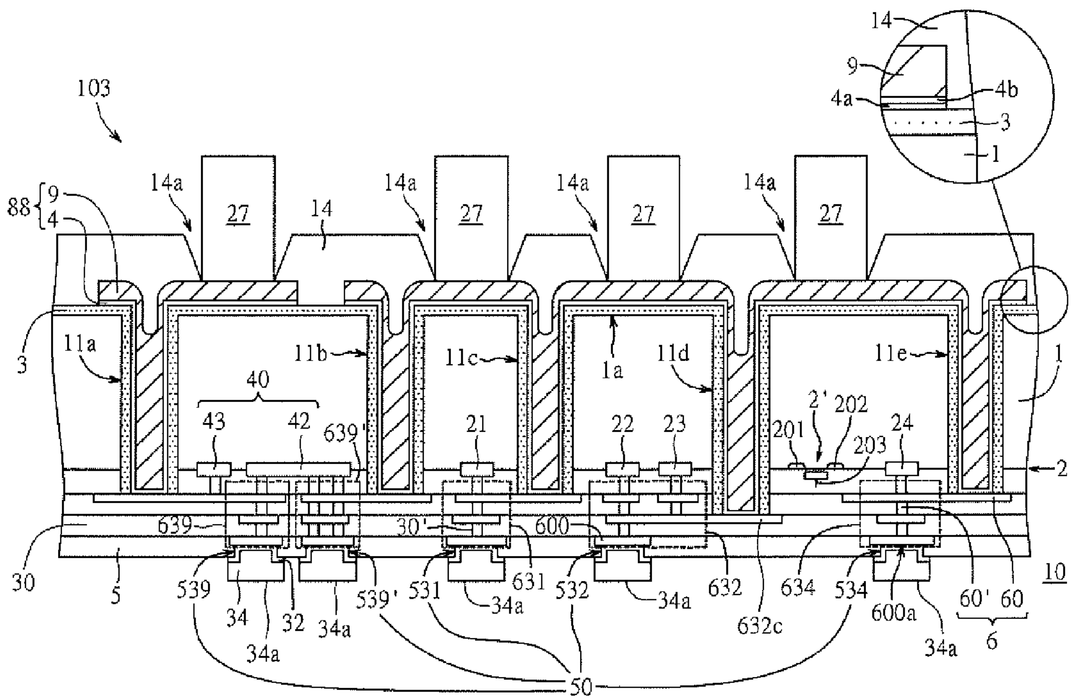

FIG. 26I is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the metal pads, bumps or traces 34*a* can be formed on the passivation layer 5 and on the regions 600*a* of the metal traces or pads 600 exposed by the openings 531, 532, 534, 539 and 539', which can be referred to as the process illustrated in FIG. 25N. The specification of the metal pads, bumps or traces 34*a* shown in FIG. 26I can be referred to as the specification of the metal pads, bumps or traces 34*a* as illustrated in FIG. 25N. After forming the metal pads, bumps or traces 34*a*, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the metal bumps or pillars 27 can be formed on the interconnecting structures 88, which can be referred to as the steps illustrated in FIGS. 25A-25D and 26A-26F. Next, the polymer layer 14 is formed on the interconnecting structures 88, on the insulating layer 3 and at the backside 1*a* of the thinned silicon substrate 1, and the openings 14*a* are formed in the polymer layer 14 to uncover the top surfaces and the sidewalls of the metal bumps or pillars 27. Accordingly, a bottom scheme 103 same as the bottom scheme 103 shown in FIG. 26G can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 531, 532, 534, 539 and 539' can be performed after forming the polymer layer 14.

After forming the structure shown in FIG. 26I, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, through the metal pads, bumps or traces 34*a*, and to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

Figure 26J:
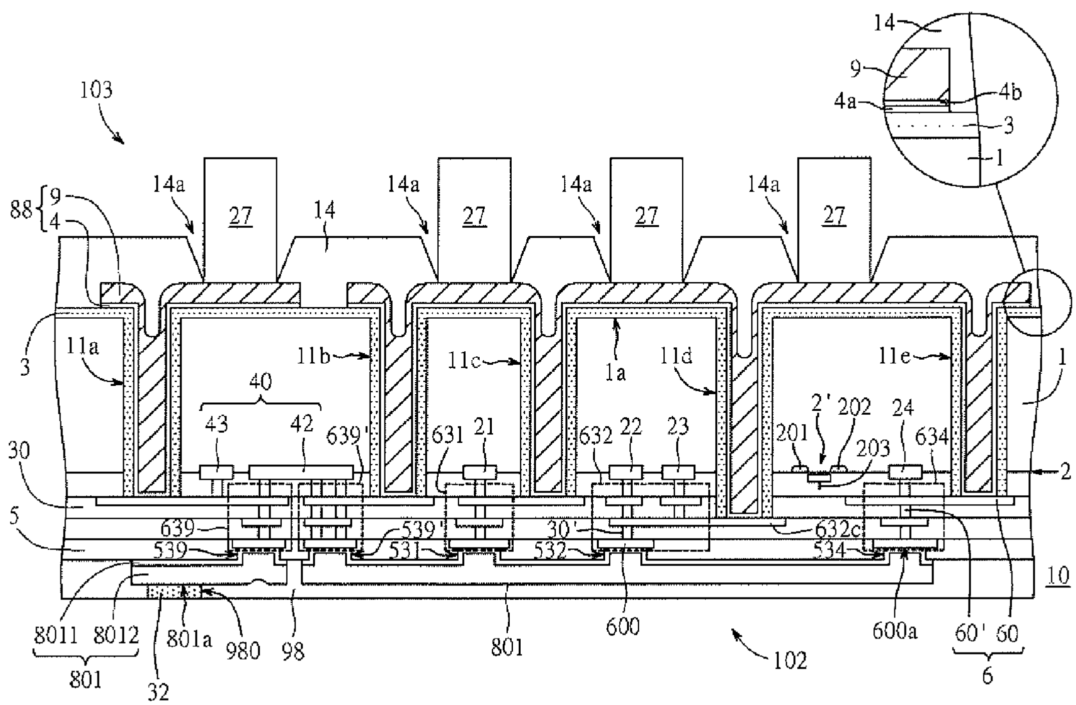

FIG. 26J is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and an opening 980 in the polymer layer 98 is over a contact point 801*a* of the metal layer 8012 of the patterned circuit layer 801 and exposes it, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux 32 is formed in the opening 980 and on the contact point 801*a* of the metal layer 8012 exposed by the opening 980. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the metal bumps or pillars 27 can be formed on the interconnecting structures 88, which can be referred to as the steps illustrated in FIGS. 25A-25D and 26A-26F. Next, the polymer layer 14 is formed on the interconnecting structures 88, on the insulating layer 3 and at the backside 1*a* of the thinned silicon substrate 1, and the openings 14*a* are formed in the polymer layer 14 to uncover the top surfaces and the sidewalls of the metal bumps or pillars 27. Accordingly, a bottom scheme 103 same as the bottom scheme 103 shown in FIG. 26G can be formed at the backside 1*a* of the thinned silicon substrate 1. Alternatively, the steps of forming the patterned circuit layer 801 and the polymer layer 98 can be performed after forming the polymer layer 14.

After forming the structure shown in FIG. 26J, the flux 32 is removed. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, by wirebonding a gold wire or a copper wire to the contact point 801*a* of gold, copper or aluminum of the patterned circuit layer 801 and to the first external circuit or by solder bonding the contact point 801*a* of the patterned circuit layer 801 with a gold layer or a tin-alloy layer of the first external circuit, and can be connected to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

Figure 26K:
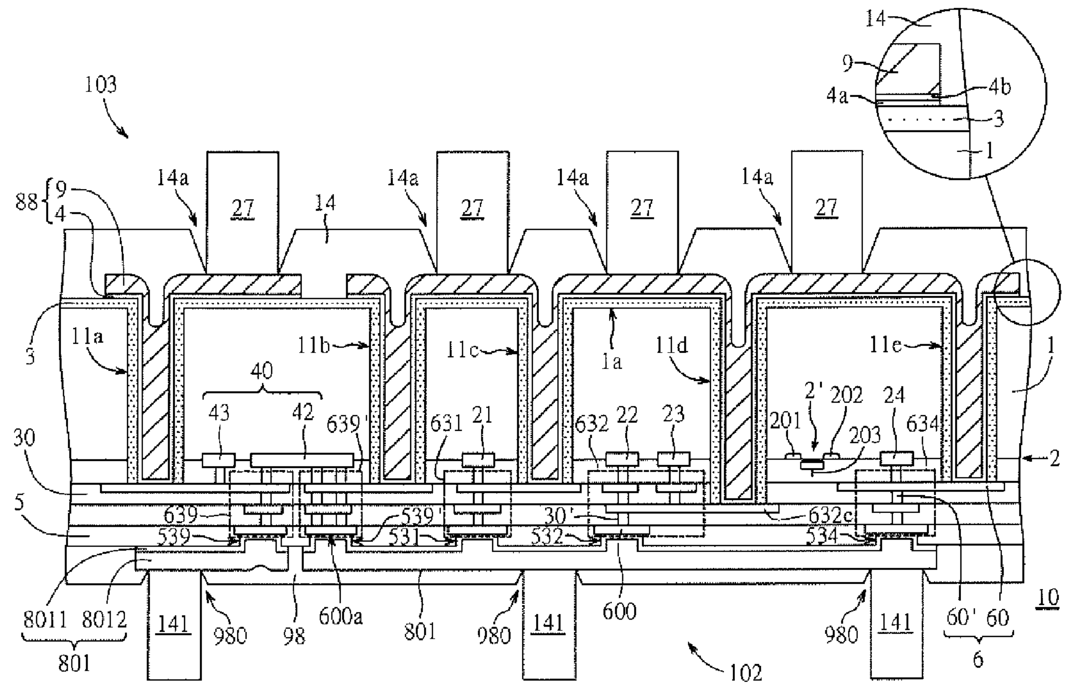

FIG. 26K is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', and multiple metal bumps or pillars 141 can be formed on multiple regions of gold, copper, nickel, aluminum or palladium of the metal layer 8012 of the patterned circuit layer 801. The adhesion/barrier/seed layer 8011 is formed on the passivation layer 5 and on the regions 600*a* of the metal traces or pads 600 exposed by the openings 531, 532, 534, 539 and 539', and the metal layer 8012 is formed on the adhesion/barrier/seed layer 8011. After forming the metal bumps or pillars 141, a polymer layer 98 can be formed on the metal layer 8012 of the patterned circuit layer 801 and on the passivation layer 5, and multiple openings 980 are formed in the polymer layer 98 to uncover top surfaces and sidewalls of the metal bumps or pillars 141. Accordingly, an over-passivation scheme 102 can be formed with the patterned circuit layer 801, the metal bumps or pillars 141 and the polymer layer 98, at the active side of the thinned silicon substrate 1. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the metal bumps or pillars 27 can be formed on the interconnecting structures 88, which can be referred to as the steps illustrated in FIGS. 25A-25D and 26A-26F. Next, the polymer layer 14 is formed on the interconnecting structures 88, on the insulating layer 3 and at the backside 1*a* of the thinned silicon substrate 1, and the openings 14*a* are formed in the polymer layer 14 to uncover the top surfaces and the sidewalls of the metal bumps or pillars 27. Accordingly, a bottom scheme 103 same as the bottom scheme 103 shown in FIG. 26G can be formed at the backside 1*a* of the thinned silicon substrate 1. Alternatively, the steps of forming the patterned circuit layer 801, the metal bumps or pillars 141 and the polymer layer 98 can be performed after forming the polymer layer 14.

The metal bumps or pillars 141 have a width larger than 3 micrometers, such as between 5 and 100 micrometers, and a height grater than 1 micrometer, such as between 5 and 150 micrometers or between 10 and 100 micrometers. The material of the metal bumps or pillars 141 may include gold, copper, nickel, aluminum, palladium, solder or a composite of the previously described materials. The metal bumps or pillars 141 can be used to be bonded with an external circuit, such as printed circuit board, flexible substrate, ball-grid-array (BGA) substrate, semiconductor chip, metal substrate, glass substrate or ceramic substrate.

The metal bumps or pillars 141, for example, can be composed of a single metal layer formed by a suitable process or processes, e.g., by electroplating a copper layer, to a thickness between 5 and 100 micrometers, between 10 and 150 micrometers or between 20 and 100 micrometers, on the regions of gold, copper, nickel, aluminum or palladium of the metal layer 8012.

Alternatively, the metal bumps or pillars 141 can be composed of a single metal layer formed by a suitable process or processes, e.g., by electroplating a gold layer, to a thickness between 1 and 30 micrometers, between 10 and 25 micrometers or between 3 and 50 micrometers, on the regions of gold, copper, nickel, aluminum or palladium of the metal layer 8012.

Alternatively, the metal bumps or pillars 141 can be composed of a single metal layer formed by a suitable process or processes, e.g., by electroplating a palladium layer, to a thickness between 1 and 30 micrometers, between 10 and 25 micrometers or between 3 and 50 micrometers, on the regions of gold, copper, nickel, aluminum or palladium of the metal layer 8012.

Alternatively, the metal bumps or pillars 141 can be composed of a single metal layer formed by a suitable process or processes, e.g., by electroplating a nickel layer, to a thickness between 5 and 100 micrometers, and preferably between 10 and 60 micrometers, on the regions of gold, copper, nickel, aluminum or palladium of the metal layer 8012.

Alternatively, the metal bumps or pillars 141 can be composed of double metal layers formed by a suitable process or processes, e.g., by electroplating a copper layer, to a thickness between 5 and 100 micrometers, between 10 and 150 micrometers or between 20 and 100 micrometers, on the regions of gold, copper, nickel, aluminum or palladium of the metal layer 8012, and then electroplating or electroless plating a gold layer or a palladium layer, to a thickness between 0.005 and 10 micrometers, and preferably between 0.05 and 1 micrometers, on the electroplated copper layer.

Alternatively, the metal bumps or pillars 141 can be composed of double metal layers formed by a suitable process or processes, e.g., by electroplating or electroless plating a nickel layer, to a thickness between 1 and 15 micrometers, and preferably between 2 and 10 micrometers, on the regions of gold, copper, nickel, aluminum or palladium of the metal layer 8012, and then electroplating or electroless plating a gold layer or a palladium layer, to a thickness between 0.005 and 10 micrometers, and preferably between 0.05 and 1 micrometers, on the electroplated or electroless plated nickel layer.

Alternatively, the metal bumps or pillars 141 can be composed of triple metal layers formed by a suitable process or processes, e.g., by electroplating a copper layer, to a thickness between 5 and 150 micrometers, and preferably between 10 and 100 micrometers, on the regions of gold, copper, nickel, aluminum or palladium of the metal layer 8012, next electroplating or electroless plating a nickel layer, to a thickness between 1 and 15 micrometers, and preferably between 2 and 10 micrometers, on the electroplated copper layer, and then electroplating or electroless plating a gold layer or a palladium layer, to a thickness between 0.005 and 1 micrometers, and preferably between 0.05 and 0.1 micrometers, on the electroplated or electroless plated nickel layer.

Alternatively, the metal bumps or pillars 141 can be composed of four metal layers formed by a suitable process or processes, e.g., by electroplating a copper layer, to a thickness between 5 and 150 micrometers, and preferably between 10 and 100 micrometers, on the regions of gold, copper, nickel, aluminum or palladium of the metal layer 8012, next electroplating or electroless plating a nickel layer, to a thickness between 1 and 15 micrometers, and preferably between 2 and 10 micrometers, on the electroplated copper layer, next electroplating or electroless plating a palladium layer, to a thickness between 0.005 and 1 micrometers, and preferably between 0.05 and 0.1 micrometers, on the electroplated or electroless plated nickel layer, and then electroplating or electroless plating a gold layer, to a thickness between 0.005 and 1 micrometers, and preferably between 0.05 and 0.1 micrometers, on the electroplated or electroless plated palladium layer.

Alternatively, the metal bumps or pillars 141 can be composed of double metal layers formed by a suitable process or processes, e.g., by electroplating a copper layer, to a thickness between 5 and 150 micrometers, and preferably between 10 and 100 micrometers, on the regions of gold, copper, nickel, aluminum or palladium of the metal layer 8012, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometer, on the electroplated copper layer.

Alternatively, the metal bumps or pillars 141 can be composed of double metal layers formed by a suitable process or processes, e.g., by electroplating a nickel layer, to a thickness between 5 and 150 micrometers, and preferably between 10 and 100 micrometers, on the regions of gold, copper, nickel, aluminum or palladium of the metal layer 8012, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 250 micrometers, and preferably between 10 and 100 micrometer, on the electroplated nickel layer.

Alternatively, the metal bumps or pillars 141 can be composed of triple metal layers formed by a suitable process or processes, e.g., by electroplating a copper layer, to a thickness between 5 and 150 micrometers, and preferably between 10 and 100 micrometers, on the regions of gold, copper, nickel, aluminum or palladium of the metal layer 8012, next electroplating or electroless plating a nickel layer, to a thickness between 1 and 15 micrometers, and preferably between 2 and 10 micrometers, on the electroplated copper layer, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometers, on the electroplated or electroless plated nickel layer.

Alternatively, the metal bumps or pillars 141 can be composed of triple metal layers formed by a suitable process or processes, e.g., by electroplating a copper layer, to a thickness between 1 and 10 micrometers, and preferably between 3 and 8 micrometers, on the regions of gold, copper, nickel, aluminum or palladium of the metal layer 8012, next electroplating or electroless plating a nickel layer, to a thickness between 1 and 15 micrometers, and preferably between 2 and 10 micrometers, on the electroplated copper layer, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 30 and 250 micrometers, and preferably between 50 and 150 micrometers, on the electroplated or electroless plated nickel layer.

Alternatively, the metal bumps or pillars 141 can be composed of double metal layers formed by a suitable process or processes, e.g., by electroplating a copper layer, to a thickness between 5 and 150 micrometers, and preferably between 10 and 100 micrometers, on the regions of gold, copper, nickel, aluminum or palladium of the metal layer 8012, and then electroplating or electroless plating a solder layer, such as a bismuth-containing layer, an indium-containing layer or a tin-containing layer of a tin-lead alloy, a tin-silver alloy or a tin-silver-copper alloy, to a thickness between 5 and 100 micrometers, and preferably between 10 and 50 micrometers, on the electroplated copper layer.

After forming the structure shown in FIG. 26K, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bumps or pillars 141 of the over-passivation scheme 102, and can be connected to a second external circuit, such as ball-grid-array (BGA) substrate, printed circuit board, semiconductor chip, metal substrate, glass substrate or ceramic substrate, through the metal bumps or pillars 27 of the bottom scheme 103. The patterned circuit layer 801 composed of the metal layers 8011 and 8012 at the active side of the thinned silicon substrate 1 connects the off-chip buffer 42 to the internal circuits 21, 22, 23 and 24, and connects the off-chip buffer 42 and the internal circuits 21, 22, 23 and 24 to the first external circuit through the metal bumps or pillars 141. The interconnecting structures 88 provided by the metal layers 4 and 9 at the backside 1*a* of the thinned silicon substrate 1 connect the off-chip buffer 42 to the internal circuits 21, 22, 23 and 24, and connect the off-chip buffer 42 and the internal circuits 21, 22, 23 and 24 to the second external circuit through the metal bumps or pillars 27. The off-chip ESD circuit 43 can be connected to the patterned circuit layer 801 through the fine-line metal trace 639, and to the interconnecting structure 88 through the fine-line metal trace 639.

FIGS. 27A-27Q are cross-sectional views showing a process for forming a bottom scheme 103 of a bottom structure technology at a backside of a semiconductor wafer according to the present disclosure. Referring to FIG. 27A, after the steps illustrated in FIGS. 24B, 24C and 25A-25D, a photoresist layer 51, such as positive-type photoresist layer or negative-type photoresist layer, having a thickness larger than 1 micrometer, such as between 1 and 120 micrometers, and preferably between 5 and 50 micrometers, can be formed on the photoresist layer 29 and on the topmost layer of copper, gold, aluminum, nickel or palladium of the previously described various bulk metal layer 9 by a spin-on coating process, a lamination process, a screen-printing process or a spraying process. Next, the photoresist layer 51 is patterned with the processes of exposure and development to form multiple openings 51*b* in the photoresist layer 51 exposing multiple regions 9*a* of the topmost layer of copper, gold, aluminum, nickel or palladium of the previously described various bulk metal layer 9. A 1× stepper or 1× contact aligner can be used to expose the photoresist layer 51 during the process of exposure. Each of the openings 51*b* has a width W4 between 3 and 10 micrometers or between 10 and 30 micrometers. The process of forming the photoresist layer 51 and the openings 51*b* in the photoresist layer 51 as shown in FIG. 27A can be referred to as the process of forming the photoresist layer 51 and the openings 51*a* in the photoresist layer 51 as illustrated in FIG. 26A.

Next, referring to FIG. 27B, multiple via plugs 58 can be formed in the openings 51*b* and on the regions 9*a* of the topmost layer of copper, gold, aluminum, nickel or palladium of the previously described various bulk metal layer 9 exposed by the openings 51*b*. The material of the via plugs 58 may include gold, nickel, tin, palladium, silver, aluminum, copper or a composite of the previously described materials.

For example, the via plugs 58 can be composed of a single metal layer formed by a suitable process or processes, e.g., by electroplating a copper layer, to a thickness between 1 and 100 micrometers, and preferably between 2 and 30 micrometers, in the openings 51*b* and on the regions 9*a* of the topmost layer of copper, gold, aluminum, nickel or palladium of the previously described various bulk metal layer 9 exposed by the openings 51*b* using the previously described electroplating solution for electroplating copper of the bulk metal layer 9.

Alternatively, the via plugs 58 can be composed of a single metal layer formed by a suitable process or processes, e.g., by electroplating or electroless plating a gold layer, to a thickness between 1 and 100 micrometers, and preferably between 2 and 30 micrometers, in the openings 51*b* and on the regions 9*a* of the topmost layer of copper; gold, aluminum, nickel or palladium of the previously described various bulk metal layer 9 exposed by the openings 51*b* using the previously described electroplating or electroless plating solution for electroplating or electroless plating gold of the bulk metal layer 9.

Alternatively, the via plugs 58 can be composed of a single metal layer formed by a suitable process or processes, e.g., by electroplating or electroless plating a palladium layer, to a thickness between 1 and 100 micrometers, and preferably between 2 and 30 micrometers, in the openings 51*b* and on the regions 9*a* of the topmost layer of copper, gold, aluminum, nickel or palladium of the previously described various bulk metal layer 9 exposed by the openings 51*b* using the previously described electroplating or electroless plating solution for electroplating or electroless plating palladium of the bulk metal layer 9.

Alternatively, the via plugs 58 can be composed of a single metal layer formed by a suitable process or processes, e.g., by electroplating or electroless plating a nickel layer, to a thickness between 1 and 100 micrometers, and preferably between 2 and 30 micrometers, in the openings 51*b* and on the regions 9*a* of the topmost layer of copper, gold, aluminum, nickel or palladium of the previously described various bulk metal layer 9 exposed by the openings 51*b* using the previously described electroplating or electroless plating solution for electroplating or electroless plating nickel of the bulk metal layer 9.

Alternatively, the via plugs 58 can be composed of double metal layers formed by a suitable process or processes, e.g., by electroplating a copper layer, to a thickness between 1 and 100 micrometers, and preferably between 2 and 30 micrometers, in the openings 51*b* and on the regions 9*a* of the topmost layer of copper, gold, aluminum, nickel or palladium of the previously described various bulk metal layer 9 exposed by the openings 51*b* using the previously described electroplating solution for electroplating copper of the bulk metal layer 9, and then electroplating or electroless plating a gold layer or a palladium layer, to a thickness between 0.005 and 10 micrometers, and preferably between 0.05 and 1 micrometer, in the openings 51*b* and on the electroplated copper layer in the openings 51*b*.

Alternatively, the via plugs 58 can be composed of double metal layers formed by a suitable process or processes, e.g., by electroplating or electroless plating a nickel layer, to a thickness between 1 and 15 micrometers, and preferably between 2 and 10 micrometers, in the openings 51*b* and on the regions 9*a* of the topmost layer of copper, gold, aluminum, nickel or palladium of the previously described various bulk metal layer 9 exposed by the openings 51*b* using the previously described electroplating or electroless plating solution for electroplating or electroless plating nickel of the bulk metal layer 9, and then electroplating or electroless plating a gold layer or a palladium layer, to a thickness between 0.005 and 10 micrometers, and preferably between 0.05 and 1 micrometer, in the openings 51*b* and on the electroplated or electroless plated nickel layer in the openings 51*b*.

Referring to FIG. 27C, after forming the via plugs 58, the photoresist layers 29 and 51 are removed using an inorganic solution or using an organic solution with amide. Some residuals from the photoresist layers 29 and 51 could remain on the bulk metal layer 9 and on the via plugs 58. Thereafter, the residuals can be removed from the bulk metal layer 9 and from the via plugs 58 with a plasma, such as an $O_2$ plasma or a plasma containing fluorine of below 200 PPM and oxygen. Accordingly, the via plugs 58 can be formed on the bulk metal layer 9 after the photoresist layers 29 and 51 are removed. Each of the via plugs 58 has a width W4 between 3 and 10 micrometers or between 10 and 30 micrometers, and a height between 1 and 100 micrometers, and preferably between 2 and 30 micrometers.

Alternatively, another process for forming the via plugs 58 on the bulk metal layer 9 can be performed by the following steps. Referring to FIG. 27D, after the steps illustrated in FIGS. 24B, 24C and 25A-25D, the photoresist layer 29 can be removed using an inorganic solution or using an organic solution with amide. After the photoresist layer 29 is removed, the previously described photoresist layer 51 having a thickness between 1 and 120 micrometers, and preferably between 5 and 50 micrometers, can be formed on the seed layer 4*b* of the metal layer 4 and on the topmost layer of copper, gold, aluminum, nickel or palladium of the previously described various bulk metal layer 9 by a spin-on coating process, a lamination process, a screen-printing process or a spraying process. Next, the photoresist layer 51 is patterned with the processes of exposure and development to form the openings 51*b* in the photoresist layer 51 exposing the regions 9*a* of the topmost layer of copper, gold, aluminum, nickel or palladium of the previously described various bulk metal layer 9. The process of forming the photoresist layer 51 and the openings 51*b* in the photoresist layer 51 as shown in FIG. 27D can be referred to as the process of forming the photoresist layer 51 and the openings 51*a* in the photoresist layer 51 as illustrated in FIG. 26A.

Referring to FIG. 27E, after the step illustrated in FIG. 27D, the via plugs 58 illustrated in FIG. 27B are formed in the openings 51*b* and on the regions 9*a* of the topmost layer of copper, gold, aluminum, nickel or palladium of the previously described various bulk metal layer 9 exposed by the openings 51*b*. The process of forming the via plugs 58 in the openings 51*b* and on the regions 9*a* of the topmost layer of copper, gold, aluminum, nickel or palladium of the previously described various bulk metal layer 9 as shown in FIG. 27E can be referred to as the process of forming the via plugs 58 in the openings 51*b* and on the regions 9*a* of the topmost layer of copper, gold, aluminum, nickel or palladium of the previously described various bulk metal layer 9 exposed by the openings 51*b* as illustrated in FIG. 27B. The specification of the via plugs 58 shown in FIG. 27E can be referred to as the specification of the via plugs 58 illustrated in FIG. 27B. After forming the via plugs 58, the photoresist layer 51 is removed using an inorganic solution or using an organic solution with amide. Accordingly, the via plugs 58 can be formed on the bulk metal layer 9 after the photoresist layer 51 is removed.

Referring to FIG. 27F, after forming the via plugs 58 on the bulk metal layer 9, the metal layer 4 not under the bulk metal layer 9 is removed with an etching method. The process of removing the metal layer 4 not under the bulk metal layer 9 shown in FIG. 27F can be referred to as the process of removing the metal layer 4 not under the bulk metal layer 9 as illustrated in FIG. 25F. Accordingly, multiple interconnecting structures 88 provided by the metal layer 4 and the bulk metal layer 9 can be formed in the thinned silicon substrate 1 and at the backside 1*a* of the thinned silicon substrate 1, and sidewalls of the bulk metal layer 9 are not covered by the metal layer 4. The interconnecting structures 88 can connect the off-chip buffer 42 to the internal circuits 21, 22, 23 and 24 and connect the off-chip buffer 42 to the via plug 58.

Next, referring to FIG. 27G, a polymer layer 142 can be formed on the insulating layer 3, on the via plugs 58 and on the bulk metal layer 9, enclosing the via plugs 58 and the bulk metal layer 9, by a spin-on coating process, a lamination process or a screen-printing process. The polymer layer 142 has a thickness t6 between 10 and 200 micrometers, and preferably between 15 and 50 micrometers. The material of the polymer layer 142 may include benzocyclobutane (BCB), polyimide (PI), polybenzoxazole (PBO) or epoxy resin.

For example, the polymer layer 142 can be formed by a suitable process or processes, e.g., by spin-on coating a negative-type photosensitive polyimide layer, containing ester-type precursor, having a thickness between 20 and 400 micrometers, and preferably between 30 and 100 micrometers on the insulating layer 3, on the via plugs 58 and on the bulk metal layer 9, then baking the spin-on coated polyimide layer, and then curing or heating the baked polyimide layer at a temperature between 180 and 400° C., between 180 and 250° C., between 250 and 290° C., between 290 and 400° C. or between 200 and 390° C. for a time between 20 and 150 minutes in a nitrogen ambient or in an oxygen-free ambient, the cured polyimide layer having a thickness between 10 and 200 micrometers, and preferably between 15 and 50 micrometers. By the way, the polymer layer 142 can be formed on the insulating layer 3, on the via plugs 58 and on the bulk metal layer 9, and encloses the via plugs 58 and the bulk metal layer 9.

Referring to FIG. 27H, after forming the polymer layer 142, a polishing or mechanical polishing process, and preferably a chemical-mechanical polishing (CMP) process, is used to planarize the surface of the polymer layer 142, exposing the via plugs 58. The polymer layer 142, after being planarized, may have a thickness t7 between 7 and 80 micrometers, and preferably between 10 and 30 micrometers. The top surfaces 58*a* of the via plugs 58 can be substantially coplanar with the top surface 142*a* of the polymer layer 142.

Next, referring to FIG. 27I, an adhesion/barrier layer 64 having a thickness smaller than 1 micrometer, such as between 0.02 and 0.5 micrometers, and preferably between 0.1 and 0.2 micrometers, can be formed on the top surface 142*a* of the polymer layer 142 and on the top surfaces 58*a* of the via plugs 58 by a physical vapor deposition (PVD) process, such as sputtering process or evaporation process, and then a seed layer 65 having a thickness smaller than 1 micrometer, such as between 0.05 and 0.5 micrometers, and preferably between 0.08 and 0.15 micrometers, can be formed on the adhesion/barrier layer 64 by a physical vapor deposition (PVD) process, such as sputtering process or evaporation process. The material of the adhesion/barrier layer 64 may include titanium, a titanium-tungsten alloy, titanium nitride, chromium, tantalum, tantalum nitride or a composite of the previously described materials, and the material of the seed layer 65 may include copper, nickel, aluminum, gold, silver, platinum or palladium.

For example, when the adhesion/barrier layer 64 is formed by a suitable process or processes, e.g., by sputtering a titanium-containing layer, such as a single layer of titanium-tungsten alloy; titanium or titanium nitride, having a thickness smaller than 1 micrometer, such as between 0.02 and 0.5 micrometers, and preferably between 0.1 and 0.2 micrometers, on the top surface 142*a* of the polymer layer 142 and on the top surfaces 58*a* of the via plugs 58, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the adhesion/barrier layer 64 is formed by a suitable process or processes, e.g., by sputtering a composite layer including a titanium layer having a thickness between 0.01 and 0.15 micrometers on the top surface 142*a* of the polymer layer 142 and on the top surfaces 58*a* of the via plugs 58 and a titanium-tungsten-alloy layer having a thickness between 0.1 and 0.35 micrometers on the titanium layer, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-tungsten-alloy layer.

Alternatively, when the adhesion/barrier layer 64 is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the top surface 142*a* of the polymer layer 142 and on the top surfaces 58*a* of the via plugs 58, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the adhesion/barrier layer 64 is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the top surface 142*a* of the polymer layer 142 and on the top surfaces 58*a* of the via plugs 58, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

Referring to FIG. 27J, after forming the seed layer 65, a photoresist layer 67, such as positive-type photoresist layer or negative-type photoresist layer, having a thickness larger than 1 micrometer, such as between 5 and 50 micrometers, and preferably between 10 and 25 micrometers, is formed on the seed layer 65 of any previously described material by a spin-on coating process, a lamination process, a screen-printing process or a spraying process. Next, the photoresist layer 67 is patterned with the processes of exposure and development to form multiple openings 67*a* in the photoresist layer 67 exposing the seed layer 65 of any previously described material. A 1× stepper or 1× contact aligner can be used to expose the photoresist layer 67 during the process of exposure.

For example, the photoresist layer 67 can be formed by a suitable process or processes, e.g., by spin-on coating a positive-type photosensitive polymer layer having a thickness between 5 and 50 micrometers, and preferably between 10 and 25 micrometers, on the seed layer 65, then exposing the photosensitive polymer layer using a 1× stepper or a contact aligner with at least two of G-line, H-line and I-line, and G-line has a wavelength ranging from, e.g., about 434 to 438 nm, H-line has a wavelength ranging from, e.g., about 403 to 407 nm, and I-line has a wavelength ranging from, e.g., about 363 to 367 nm, then developing the exposed polymer layer by spraying and puddling a developer on the semiconductor wafer 10 or by immersing the semiconductor wafer 10 into a developer, and then cleaning the semiconductor wafer 10 using deionized wafer and drying the semiconductor wafer 10 by spinning the semiconductor wafer 10. After development, a scum removal process of removing the residual polymeric material or other contaminants from the seed layer 65 may be conducted by using an $O_2$ plasma or a plasma containing fluorine of below 200 PPM and oxygen. By these processes, the photoresist layer 67 can be patterned with the openings 67*a* exposing the seed layer 65.

Next, referring to FIG. 27K, a metal layer 68 having a thickness larger than 1 micrometer, such as between 1 and 50 micrometers, and preferably between 2 and 20 micrometers, can be electroplated in the openings 67*a* and on the seed layer 65 of any previously described material exposed by the openings 67*a*. The metal layer 68 may be a single layer of gold, copper, silver, palladium, platinum, rhodium, ruthenium, rhenium or nickel, or a composite layer made of the previously described metals.

For example, the metal layer 68 can be composed of a single metal layer formed by a suitable process or processes, e.g., by electroplating a gold layer, to a thickness between 1 and 50 micrometers, and preferably between 2 and 20 micrometers, in the openings 67*a* and on the seed layer 65, preferably the previously described gold layer 65, exposed by the openings 67*a* using the previously described electroplating solution for electroplating gold of the bulk metal layer 9.

Alternatively, the metal layer 68 can be composed of a single metal layer formed by a suitable process or processes, e.g., by electroplating a copper layer, to a thickness between 1 and 50 micrometers, and preferably between 2 and 20 micrometers, in the openings 67*a* and on the seed layer 65, preferably the previously described copper layer 65, exposed by the openings 67*a* using the previously described electroplating solution for electroplating copper of the bulk metal layer 9.

Alternatively, the metal layer 68 can be composed of a single metal layer formed by a suitable process or processes, e.g., by electroplating a palladium layer, to a thickness between 1 and 50 micrometers, and preferably between 2 and 20 micrometers, in the openings 67*a* and on the seed layer 65, preferably the previously described palladium layer 65, exposed by the openings 67*a* using the previously described electroplating solution for electroplating palladium of the bulk metal layer 9.

Alternatively, the metal layer 68 can be composed of a single metal layer formed by a suitable process or processes, e.g., by electroplating a nickel layer, to a thickness between 1 and 50 micrometers, and preferably between 2 and 20 micrometers, in the openings 67*a* and on the seed layer 65, preferably the previously described copper layer or nickel layer 65, exposed by the openings 67*a* using the previously described electroplating solution for electroplating nickel of the bulk metal layer 9.

Alternatively, the metal layer 68 can be composed of double metal layers formed by a suitable process or processes, e.g., by electroplating a copper layer, to a thickness between 1 and 50 micrometers, and preferably between 2 and 15 micrometers, in the openings 67*a* and on the seed layer 65, preferably the previously described copper layer 65, exposed by the openings 67*a* using the previously described electroplating solution for electroplating copper of the bulk metal layer 9, and then electroplating or electroless plating a gold layer, to a thickness between 0.005 and 10 micrometers, and preferably between 0.05 and 1 micrometers, in the openings 67*a* and on the electroplated copper layer in the openings 67*a* using the previously described electroplating or electroless plating solution for electroplating or electroless plating gold of the bulk metal layer 9.

Alternatively, the metal layer 68 can be composed of double metal layers formed by a suitable process or processes, e.g., by electroplating a copper layer, to a thickness between 1 and 50 micrometers, and preferably between 2 and 15 micrometers, in the openings 67*a* and on the seed layer 65, preferably the previously described copper layer 65, exposed by the openings 67*a* using the previously described electroplating solution for electroplating copper of the bulk metal layer 9, and then electroplating or electroless plating a palladium layer, to a thickness between 0.005 and 10 micrometers, and preferably between 0.05 and 1 micrometers, in the openings 67*a* and on the electroplated copper layer in the openings 67*a* using the previously described electroplating or electroless plating solution for electroplating or electroless plating palladium of the bulk metal layer 9.

Alternatively, the metal layer 68 can be composed of double metal layers formed by a suitable process or processes, e.g., by electroplating a copper layer, to a thickness between 1 and 50 micrometers, and preferably between 2 and 15 micrometers, on the seed layer 65, preferably the previously described copper layer 65, exposed by the openings 67*a* using the previously described electroplating solution for electroplating copper of the bulk metal layer 9, and then electroplating or electroless plating a nickel layer, to a thickness between 1 and 15 micrometers, and preferably between 2 and 5 micrometers, in the openings 67*a* and on the electroplated copper layer in the openings 67*a* using the previously described electroplating or electroless plating solution for electroplating or electroless plating nickel of the bulk metal layer 9.

Alternatively, the metal layer 68 can be composed of double metal layers formed by a suitable process or processes, e.g., by electroplating a nickel layer, to a thickness between 1 and 50 micrometers, and preferably between 2 and 15 micrometers, in the openings 67*a* and on the seed layer 65, preferably the previously described copper layer or nickel layer 65, exposed by the openings 67*a* using the previously described electroplating solution for electroplating nickel of the bulk metal layer 9, and then electroplating or electroless plating a gold layer or a palladium layer, to a thickness between 0.005 and 10 micrometers, and preferably between 0.05 and 1 micrometers, in the openings 67*a* and on the electroplated nickel layer in the openings 67*a*.

Alternatively, the metal layer 68 can be composed of triple metal layers formed by a suitable process or processes, e.g., by electroplating a copper layer, to a thickness between 1 and 50 micrometers, and preferably between 2 and 15 micrometers, on the seed layer 65, preferably the previously described copper layer 65, exposed by the openings 67*a* using the previously described electroplating solution for electroplating copper of the bulk metal layer 9, next electroplating or electroless plating a nickel layer, to a thickness between 1 and 15 micrometers, and preferably between 2 and 5 micrometers, in the openings 67*a* and on the electroplated copper layer in the openings 67*a* using the previously described electroplating or electroless plating solution for electroplating or electroless plating nickel of the bulk metal layer 9, and then electroplating or electroless plating a gold layer, to a thickness between 0.005 and 1 micrometers, and preferably between 0.05 and 0.1 micrometers, in the openings 67*a* and on the electroplated or electroless plated nickel layer in the openings 67*a* using the previously described electroplating or electroless plating solution for electroplating or electroless plating gold of the bulk metal layer 9.

Alternatively, the metal layer 68 can be composed of triple metal layers formed by a suitable process or processes, e.g., by electroplating a copper layer, to a thickness between 1 and 50 micrometers, and preferably between 2 and 15 micrometers, on the seed layer 65, preferably the previously described copper layer 65, exposed by the openings 67*a* using the previously described electroplating solution for electroplating copper of the bulk metal layer 9, next electroplating or electroless plating a nickel layer, to a thickness between 1 and 15 micrometers, and preferably between 2 and 5 micrometers, in the openings 67*a* and on the electroplated copper layer in the openings 67*a* using the previously described electroplating or electroless plating solution for electroplating or electroless plating nickel of the bulk metal layer 9, and then electroplating or electroless plating a palladium layer, to a thickness between 0.005 and 1 micrometers, and preferably between 0.05 and 0.1 micrometers, in the openings 67*a* and on the electroplated or electroless plated nickel layer in the openings 67*a* using the previously described electroplating or electroless plating solution for electroplating or electroless plating palladium of the bulk metal layer 9.

Referring to FIG. 27L, after forming the metal layer 68, the photoresist layer 67 can be removed using an inorganic solution or using an organic solution with amide. Some residuals from the photoresist layer 67 could remain on the metal layer 68 and on the seed layer 65 not under the metal layer 68. Thereafter, the residuals can be removed from the metal layer 68 and from the seed layer 65 with a plasma, such as an $O_2$ plasma or a plasma containing fluorine of below 200 PPM and oxygen.

Next, referring to FIG. 27M, the seed layer 65 and the adhesion/barrier layer 64 not under the metal layer 68 are subsequently removed with an etching method. In a case, the seed layer 65 and the adhesion/barrier layer 65 not under the metal layer 68 can be subsequently removed by a dry etching method. As to the dry etching method, both the seed layer 65 and the adhesion/barrier layer 64 not under the metal layer 68 can be subsequently removed by an Ar sputtering etching process; alternatively, both the seed layer 65 and the adhesion/barrier layer 64 not under the metal layer 68 can be subsequently removed by a reactive ion etching (RIE) process; alternatively, the seed layer 65 not under the metal layer 68 can be removed by an Ar sputtering etching process, and then the adhesion/barrier layer 64 not under the metal layer 68 can be removed by a reactive ion etching (RIE) process. In another case, the seed layer 65 and the adhesion/barrier layer 64 not under the metal layer 68 can be subsequently removed by a wet etching method. As to the wet etching method, when the seed layer 65 is a copper layer, it can be etched with a solution containing $NH_4OH$ or with a solution containing $H_2SO_4$; when the adhesion/barrier layer 64 is a titanium-tungsten-alloy layer, it can be etched with a solution containing hydrogen peroxide or with a solution containing $NH_4OH$ and hydrogen peroxide; when the adhesion/barrier layer 64 is a titanium layer, it can be etched with a solution containing hydrogen fluoride or with a solution containing $NH_4OH$ and hydrogen peroxide; when the adhesion/barrier layer 64 is a chromium layer, it can be etched with a solution containing potassium ferricyanide. In another case, the seed layer 65, such as copper, not under the metal layer 68 can be removed by a solution containing $NH_4OH$ or a solution containing $H_2SO_4$, and then the adhesion/barrier layer 64 not under the metal layer 68 can be removed by a reactive ion etching (RIE) process. In another case, the seed layer 65, such as copper, not under the metal layer 68 can be removed by a solution containing $NH_4OH$ or a solution containing $H_2SO_4$, and, then the adhesion/barrier layer 64 not under the metal layer 68 can be removed by an Ar sputtering etching process.

Next, referring to FIG. 27N, a polymer layer 14 can be formed on the top surface 142*a* of the polymer layer 142 and on the topmost layer of gold, copper, nickel or palladium of the previously described various metal layer 68 by a process including a spin-on coating process, a lamination process, a screen-printing process or a spraying process and including a curing process, and multiple openings 14*a* in the polymer layer 14 are over multiple regions of the topmost layer of gold, copper, nickel or palladium of the previously described various metal layer 68 and expose them. The polymer layer 14 has a thickness larger than 2 micrometers, such as between 3 and 50 micrometers, and preferably between 5 and 25 micrometers. The material of the polymer layer 14 may include benzocyclobutane (BCB), polyimide (PI), polybenzoxazole (PBO) or epoxy resin.

In a case, the polymer layer 14 can be formed by a suitable process or processes, e.g., by spin-on coating a negative-type photosensitive polyimide layer having a thickness between 6 and 100 micrometers on the top surface 142*a* of the polymer layer 142 and on the topmost layer of gold, copper, nickel or palladium of the previously described various metal layer 68, then baking the spin-on coated polyimide layer, then exposing the baked polyimide layer using a 1× stepper or a 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the metal layer 68, then curing or heating the developed polyimide layer at a temperature between 180 and 400° C., between 180 and 250° C., between 250 and 290° C., between 290 and 400° C. or between 200 and 390° C. for a time between 20 and 150 minutes in a nitrogen ambient or in an oxygen-free ambient, the cured polyimide layer having a thickness between 3 and 50 micrometers, and then removing the residual polymeric material or other contaminants from the metal layer 68 exposed by the openings 14*a* with an $O_2$ plasma or a plasma containing fluorine of below 200 PPM and oxygen. By the way, the polymer layer 14 can be formed on the top surface 142*a* of the polymer layer 142 and on the topmost layer of gold, copper, nickel or palladium of the previously described various metal layer 68, and the openings 14*a* formed in the polymer layer 14 expose the regions of the topmost layer of gold, copper, nickel or palladium of the previously described various metal layer 68.

In another case, the polymer layer 14 can be formed by a suitable process or processes, e.g., by spin-on coating a positive-type photosensitive polybenzoxazole layer having a thickness between 3 and 50 micrometers on the top surface 142*a* of the polymer layer 142 and on the topmost layer of gold, copper, nickel or palladium of the previously described various metal layer 68, then baking the spin-on coated polybenzoxazole layer, then exposing the baked polybenzoxazole layer using a 1× stepper or a 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to multiple openings exposing the metal layer 68, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness between 3 and 50 micrometers, and then removing the residual polymeric material or other contaminants from the metal layer 68 exposed by the openings 14*a* with an $O_2$ plasma or a plasma containing fluorine of below 200 PPM and oxygen. By the way, the polymer layer 14 can be formed on the top surface 142*a* of the polymer layer 142 and on the topmost layer of gold, copper, nickel or palladium of the previously described various metal layer 68, and the openings 14*a* formed in the polymer layer 14 expose the regions of the topmost layer of gold, copper, nickel or palladium of the previously described various metal layer 68.

Next, referring to FIG. 27O, an adhesion/barrier layer 16 having a thickness smaller than 1 micrometer, such as between 0.02 and 0.5 micrometers, and preferably between 0.1 and 0.2 micrometers, can be formed on the polymer layer 14 and on the regions of the topmost layer of gold, copper, nickel or palladium of the previously described various metal layer 68 exposed by the openings 14*a* by using a physical vapor deposition (PVD) process, such as sputtering process or evaporation process, and then a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The material of the adhesion/barrier layer 16 may include titanium, a titanium-tungsten alloy, titanium nitride, chromium, tantalum, tantalum nitride or a composite of the previously described materials, and the material of the seed layer 18 may include copper, nickel, aluminum, gold, silver, platinum or palladium.

For example, when the adhesion/barrier layer 16 is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 14 and on the regions of the topmost layer of gold, copper, nickel or palladium of the previously described various metal layer 68 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the adhesion/barrier layer 16 is formed by a suitable process or processes, e.g., by sputtering a composite layer including a titanium layer having a thickness between 0.01 and 0.15 micrometers on the polymer layer 14 and on the regions of the topmost layer of gold, copper, nickel or palladium of the previously described various metal layer 68 exposed by the openings 14*a* and a titanium-tungsten-alloy layer having a thickness between 0.1 and 0.35 micrometers on the titanium layer, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-tungsten-alloy layer.

Alternatively, when the adhesion/barrier layer 16 is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 14 and on the regions of the topmost layer of gold, copper, nickel or palladium of the previously described various metal layer 68 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the adhesion/barrier layer 16 is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 14 and on the regions of the topmost layer of gold, copper, nickel or palladium of the previously described various metal layer 68 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

Referring to FIG. 27P, after the step illustrated in FIG. 27O, a photoresist layer 31 can be formed on the seed layer 18 of any previously described material, and multiple openings 31*a* in the photoresist layer 31 expose the seed layer 18 of any previously described material, which can be referred to as the step illustrated in FIG. 25I. Next, multiple metal bumps or pillars 27 can be formed on the seed layer 18 of any previously described material exposed by the openings 31*a* and in the openings 31*a*. The process of forming the metal bumps or pillars 27 on the seed layer 18 of any previously described material exposed by the openings 31*a* and in the openings 31*a* as shown in FIG. 27P can be referred to as the process of forming the metal bump or pillar 27 on the seed layer 18 of any previously described material exposed by the opening 31*a* and in the opening 31*a* as illustrated in FIG. 25J. The specification of the metal bumps or pillars 27 shown in FIG. 27P can be referred to as the specification of the metal bump or pillar 27 as illustrated in FIG. 25J.

Next, referring to FIG. 27Q, the photoresist layer 31 is removed, which can be referred to as the step illustrated in FIG. 25K. Next, the seed layer 18 not under the metal bumps or pillars 27 is removed, and then the adhesion/barrier layer 16 not under the metal bumps or pillars 27 is removed, which can be referred to as the step illustrated in FIG. 25L. Accordingly, a bottom scheme 103 at the backside 1*a* of the thinned silicon substrate 1 is formed with the insulating layer 3, the interconnecting structures 88 provided by the metal layers 4 and 9, the via plugs 58, the polymer layers 14 and 142, the metal layers 16, 18, 64, 65 and 68, and the metal bumps or pillars 27, and the openings 14*a* in the polymer layer 14 are over the metal layer 68. After the step illustrated in FIG. 27Q, the semiconductor wafer 10 can be cut into a plurality of individual semiconductor chip by a die-sawing process.

Alternatively, after the step illustrated in FIG. 27Q, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 24B, 24C, 25A-25D and 27A-27Q. After the steps illustrated in FIGS. 24B, 24C, 25A-25D and 27A-27Q, the semiconductor wafer 10 can be cut into a plurality of individual semiconductor chip by a die-sawing process.

After the die-awing process, the semiconductor chip cut from the semiconductor wafer 10 can be packaged for a chip package. In the chip package, the semiconductor chip can be connected to an external circuit, such as ball-grid-array (BGA) substrate, printed circuit board, semiconductor chip, metal substrate, glass substrate or ceramic substrate, through the metal bumps or pillars 27 of the bottom scheme 103. The metal bumps or pillars 27 of the semiconductor chip can be connected to the off-chip buffer 42, the off-chip ESD circuit 43 and the internal circuits 21, 22, 23 and 24 through the metal layer 68, the via plugs 58 and the bulk metal layer 9. Multiple interconnecting structures provided by the metal layer 4, the bulk metal layer 9, the via plugs 58, the adhesion/barrier layer 64, the seed layer 65 and the metal layer 68 can be formed at the backside 1*a* of the thinned silicon substrate 1 of the semiconductor chip, and the interconnecting structures can connect the off-chip buffer 42 to the internal circuits 21, 22, 23 and 24 and can connect the off-chip buffer 42 and the internal circuits 21, 22, 23 and 24 to the external circuit through the metal bumps or pillars 27.

FIG. 27R is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a flux 32 can be formed in the openings 531, 532, 534, 539 and 539' and on the regions 600*a* of the metal traces or pads 600 exposed by the openings 531, 532, 534, 539 and 539'. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the via plugs 58 can be formed on the interconnecting structures 88 and at the backside 1*a* of the thinned silicon substrate 1, which can be referred to as the steps illustrated in FIGS. 25A-25D and 27A-27F. Next, the polymer layers 142 and 14, the adhesion/barrier layers 16 and 64, the seed layers 18 and 65, the metal layer 68 and the metal bumps or pillars 27 can be formed at the backside 1*a* of the thinned silicon substrate 1, which can be referred to as the steps illustrated in FIGS. 27G-27Q. Accordingly, a bottom scheme 103 same as the bottom scheme 103 shown in FIG. 27Q can be formed at the backside 1*a* of the thinned silicon substrate 1.

After forming the structure shown in FIG. 27R, the flux 32 is removed. Next, with the following steps being illustrated with reverse figures for simple explanation, each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bumps or pillars 27 of the bottom scheme 103, and/or to a second external circuit, such as ball-grid-array (BGA) substrate, printed circuit board, semiconductor chip, metal substrate, glass substrate or ceramic substrate, through one of the over-passivation schemes 102 illustrated in FIGS. 15H, 15K-15M, 16L, 16M, 17J, 18I, 19H and 20.

FIG. 27S is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the metal pads, bumps or traces 34*a* can be formed on the passivation layer 5 and on the regions 600*a* of the metal traces or pads 600 exposed by the openings 531, 532, 534, 539 and 539', which can be referred to as the process illustrated in FIG. 25N. The specification of the metal pads, bumps or traces 34*a* shown in FIG. 27S can be referred to as the specification of the metal pads, bumps or traces 34*a* as illustrated in FIG. 25N. After forming the metal pads, bumps or traces 34*a*, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the via plugs 58 can be formed on the interconnecting structures 88 and at the backside 1*a* of the thinned silicon substrate 1, which can be referred to as the steps illustrated in FIGS. 25A-25D and 27A-27F. Next, the polymer layers 142 and 14, the adhesion/barrier layers 16 and 64, the seed layers 18 and 65, the metal layer 68 and the metal bumps or pillars 27 can be formed at the backside 1*a* of the thinned silicon substrate 1, which can be referred to as the steps illustrated in FIGS. 27G-27Q. Accordingly, a bottom scheme 103 same as the bottom scheme 103 shown in FIG. 27Q can be formed at the backside 1*a* of the thinned silicon substrate 1. Alternatively, the step of forming the metal pads, bumps or traces 34*a* on the regions 600*a* of the metal traces or pads 600 exposed by the openings 531, 532, 534, 539 and 539' can be performed after forming the metal bumps or pillars 27.

After forming the structure shown in FIG. 27S, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, through the metal pads, bumps or traces 34*a*, and to a second external circuit, such as printed circuit board, ball-grid-array (BGA) substrate, semiconductor chip, metal substrate, glass substrate or ceramic substrate, through the metal bumps or pillars 27 of the bottom scheme 103.

FIG. 27T is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15M. Next, multiple metal bumps 89 provided by the metal layers 89*a*, 89*b* and 89*c* can be formed on the polymer layer 98 and on the contact points 801*a* of the metal layer 8012 exposed by the openings 980, which can be referred to as the process illustrated in FIG. 15M. Accordingly, an over-passivation scheme 102 can be formed with the patterned circuit layer 801, the polymer layer 98 and the metal bumps 89, at the active side of the thinned silicon substrate 1. After forming the metal bumps 89, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e*, on the insulating layer 3 and at the backside 1*a* of the thinned silicon substrate 1, and the via plugs 58 can be formed on the interconnecting structures 88 and at the backside 1*a* of the thinned silicon substrate 1, which can be referred to as the steps illustrated in FIGS. 25A-25D and 27A-27F. Next, the polymer layers 142 and 14, the adhesion/barrier layers 16 and 64, the seed layers 18 and 65, the metal layer 68 and the metal bumps or pillars 27 can be formed at the backside 1*a* of the thinned silicon substrate 1, which can be referred to as the steps illustrated in FIGS. 27G-27Q. Accordingly, a bottom scheme 103 same as the bottom scheme 103 shown in FIG. 27Q can be formed at the backside 1*a* of the thinned silicon substrate 1. Alternatively, the steps of forming the patterned circuit layer 801, the polymer layer 98, the metal layer 89*a* and the metal bumps 89 can be performed after forming the metal bumps or pillars 27.

After forming the structure shown in FIG. 27T, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, ball-grid-array (BGA) substrate, semiconductor chip, metal substrate, glass substrate or ceramic substrate, through the metal bumps 89 of the over-passivation scheme 102, and to a second external circuit, such as printed circuit board, ball-grid-array (BGA) substrate, semiconductor chip, metal substrate, glass substrate or ceramic substrate, through the metal bumps or pillars 27 of the bottom scheme 103.

FIGS. 28A-28F are cross-sectional views showing a process for forming a bottom scheme 103 of a bottom structure technology at a backside of a semiconductor wafer according to the present disclosure. Referring to FIG. 28A, after the steps illustrated in FIGS. 24B, 24C and 25A-25F, an insulating layer 46 having a thickness t8 larger than 0.1 micrometers, such as between 0.2 and 1.5 micrometers, and preferably between 0.3 and 1 micrometers, can be formed on the insulating layer 3 and on the topmost layer of copper, gold, aluminum, nickel or palladium of the previously described various bulk metal layer 9 by using a chemical vapor deposition (CVD) process. The insulating layer 46 can be a single layer of silicon oxide, silicon oxynitride or silicon nitride (such as $Si_3N_4$), a composite layer made of previously described materials.

For example, the insulating layer 46 can be an inorganic layer, such as silicon-oxide layer, silicon-oxynitride layer or silicon-nitride layer, having a thickness larger than 0.2 micrometers, such as between 0.2 and 1.5 micrometers, and preferably between 0.3 and 1 micrometers, on the insulating layer 3 and on the topmost layer of copper, gold, aluminum, nickel or palladium of the previously described various bulk metal layer 9. Alternatively, the insulating layer 46 can be an insulating nitride layer, such as silicon-nitride layer or silicon-oxynitride layer, having a thickness larger than 0.2 micrometers, such as between 0.2 and 1.5 micrometers, and preferably between 0.3 and 1 micrometers, on the insulating layer 3 and on the topmost layer of copper, gold, aluminum, nickel or palladium of the previously described various bulk metal layer 9. Alternatively, the insulating layer 46 can be an oxide layer, such as silicon-oxide layer or silicon-oxynitride layer, having a thickness larger than 0.2 micrometers, such as between 0.2 and 1.5 micrometers, and preferably between 0.3 and 1 micrometers, on the insulating layer 3 and on the topmost layer of copper, gold, aluminum, nickel or palladium of the previously described various bulk metal layer 9. Alternatively, the insulating layer 46 can be composed of double layers including an insulating nitride layer, such as silicon-nitride layer or silicon-oxynitride layer, having a thickness larger than 0.2 micrometers, such as between 0.2 and 1.5 micrometers, and preferably between 0.3 and 1 micrometers, on the insulating layer 3 and on the topmost layer of copper, gold, aluminum, nickel or palladium of the previously described various bulk metal layer 9, and an oxide layer, such as silicon-oxide layer or silicon-oxynitride layer, having a thickness larger than 0.2 micrometers, such as between 0.2 and 1.5 micrometers, and preferably between 0.3 and 1 micrometers, on the insulating nitride layer.

Referring to FIG. 28B, after forming the insulating layer 46, a polymer layer 14 can be formed on the insulating layer 46 using a process including a spin-on coating process, a lamination process, a screen-printing process or a spraying process, and multiple openings 14*a* in the polymer layer 14 expose multiple regions of the insulating layer 46 over the bulk metal layer 9. The polymer layer 14 has a thickness between 3 and 50 micrometers, and preferably between 5 and 25 micrometers, and the polymer layer 14 can be a single layer of benzocyclobutane (BCB), polyimide (PI), polybenzoxazole (PBO) or epoxy resin. The process of forming the polymer layer 14 and the openings 14*a* in the polymer layer 14 as shown in FIG. 28B can be referred to as the process of forming the polymer layer 14 and the opening 14*a* in the polymer layer 14 as illustrated in FIG. 25G.

Referring to FIG. 28C, after the step illustrated in FIG. 28B, the regions of the insulating layer 46 exposed by the openings 14*a* can be removed with a dry etching method, such as an enhanced plasma etching method. Accordingly, the openings 14*a* in the polymer layer 14 are over multiple regions of the topmost layer of copper, gold, aluminum, nickel or palladium of the previously described various bulk metal layer 9 and expose them.

Next, referring to FIG. 28D, an adhesion/barrier layer 16 having a thickness smaller than 1 micrometer, such as between 0.02 and 0.5 micrometers, and preferably between 0.1 and 0.2 micrometers, can be formed on the polymer layer 14 and on the regions of the topmost layer of copper, gold, aluminum, nickel or palladium of the previously described various bulk metal layer 9 exposed by the openings 14*a* by using a physical vapor deposition (PVD) process, such as sputtering process or evaporation process, and then a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The material of the adhesion/barrier layer 16 may include titanium, a titanium-tungsten alloy, titanium nitride, chromium, tantalum or tantalum nitride, and the material of the seed layer 18 may include copper, nickel, aluminum, gold, silver, platinum or palladium.

For example, when the adhesion/barrier layer 16 is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 14 and on the regions of the topmost layer of copper, gold, aluminum, nickel or palladium of the previously described various bulk metal layer 9 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the adhesion/barrier layer 16 is formed by a suitable process or processes, e.g., by sputtering a composite layer including a titanium layer having a thickness between 0.01 and 0.15 micrometers on the polymer layer 14 and on the regions of the topmost layer of copper, gold, aluminum, nickel or palladium of the previously described various bulk metal layer 9 exposed by the openings 14*a* and a titanium-tungsten-alloy layer having a thickness between 0.1 and 0.35 micrometers on the titanium layer, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-tungsten-alloy layer.

Alternatively, when the adhesion/barrier layer 16 is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 14 and on the regions of the topmost layer of copper, gold, aluminum, nickel or palladium of the previously described various bulk metal layer 9 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the adhesion/barrier layer 16 is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 14 and on the regions of the topmost layer of copper, gold, aluminum, nickel or palladium of the previously described various bulk metal layer 9 exposed by the openings 14*a*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

Referring to FIG. 28E, after the step illustrated in FIG. 28D, a photoresist layer 31 can be formed on the seed layer 18, and multiple openings 31*a* in the photoresist layer 31 expose the seed layer 18, which can be referred to as the step illustrated in FIG. 25I. Next, multiple metal bumps or pillars 27 can be formed on the seed layer 18 of any previously described material exposed by the openings 31*a* and in the openings 31*a*. The process of forming the metal bumps or pillars 27 on the seed layer 18 of any previously described material exposed by the openings 31*a* and in the openings 31*a* as shown in FIG. 28E can be referred to as the process of forming the metal bump or pillar 27 on the seed layer 18 of any previously described material exposed by the opening 31*a* and in the opening 31*a* as illustrated in FIG. 25J. The specification of the metal bumps or pillars 27 shown in FIG. 28E can be referred to as the specification of the metal bump or pillar 27 as illustrated in FIG. 25J.

Next, referring to FIG. 28F, the photoresist layer 31 is removed, which can be referred to as the step illustrated in FIG. 25K. Next, the seed layer 18 not under the metal bumps or pillars 27 is removed, and then the adhesion/barrier layer 16 not under the metal bumps or pillars 27 is removed, which can be referred to as the step illustrated in FIG. 25L. Accordingly, a bottom scheme 103 at the backside 1*a* of the thinned silicon substrate 1 is formed with the insulating layer 3, the interconnecting structures 88 provided by the metal layers 4 and 9, the insulating layer 46, the polymer layer 14, the metal layers 16 and 18, and the metal bumps or pillars 27, and the openings 14*a* in the polymer layer 14 are over the interconnecting structures 88. After the step illustrated in FIG. 28F, the semiconductor wafer 10 can be cut into a plurality of individual semiconductor chip by a die-sawing process.

Alternatively, after the step illustrated in FIG. 28F, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 24B, 24C, 25A-25F and 28A-28F. After the steps illustrated in FIGS. 24B, 24C, 25A-25F and 28A-28F, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, the semiconductor chip can be connected to an external circuit, such as ball-grid-array (BGA) substrate, printed circuit board, semiconductor chip, metal substrate, glass substrate or ceramic substrate, through the metal bumps or pillars 27 of the bottom scheme 103. The interconnecting structures 88 provided by the metal layers 4 and 9 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24. The off-chip ESD circuit 43 is connected to the off-chip buffer 42 through the fine-line metal trace 639.

FIG. 28G is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a flux 32 can be formed in the openings 531, 532, 534, 539 and 539' and on the regions 600*a* of the metal traces or pads 600 exposed by the openings 531, 532, 534, 539 and 539'. Next, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the insulating layer 46, the polymer layer 14, the adhesion/barrier layer 16, the seed layer 18 and the metal bumps or pillars 27 can be formed at the backside 1*a* of the thinned silicon substrate 1, which can be referred to as the steps illustrated in FIGS. 28A-28F. Accordingly, a bottom scheme 103 same as the bottom scheme 103 shown in FIG. 28F can be formed at the backside 1*a* of the thinned silicon substrate 1.

After forming the structure shown in FIG. 28G, the flux 32 is removed. Next, with the following steps being illustrated with reverse figures for simple explanation, each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as ball-grid-array (BGA) substrate, printed circuit board, semiconductor chip, metal substrate, glass substrate or ceramic substrate, through the metal bumps or pillars 27 of the bottom scheme 103, and/or to a second external circuit, such as ball-grid-array (BGA) substrate, printed circuit board, semiconductor chip, metal substrate, glass substrate or ceramic substrate, through one of the over-passivation schemes 102 illustrated in FIGS. 15H, 15K-15M, 16L, 16M, 17J, 18I, 19H and 20. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

FIG. 28H is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, the metal pads, bumps or traces 34*a* can be formed on the passivation layer 5 and on the regions 600*a* of the metal traces or pads 600 exposed by the openings 531, 532, 534, 539 and 539', which can be referred to as the process illustrated in FIG. 25N. The specification of the metal pads, bumps or traces 34*a* shown in FIG. 28H can be referred to as the specification of the metal pads, bumps or traces 34*a* as illustrated in FIG. 25N. After forming the metal pads, bumps or traces 34*a*, the step illustrated in FIG. 24B can be performed. Next, the through silicon vias 11*a*, 11*b*, 11*c*, 11*d*, and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the insulating layer 46, the polymer layer 14, the adhesion/barrier layer 16, the seed layer 18 and the metal bumps or pillars 27 can be formed at the backside 1*a* of the thinned silicon substrate 1, which can be referred to as the steps illustrated in FIGS. 28A-28F. Accordingly, a bottom scheme 103 same as the bottom scheme 103 shown in FIG. 28F can be formed at the backside 1*a* of the thinned silicon substrate 1. Alternatively, the step of forming the metal pads, bumps or traces 34*a* on the regions 600*a* of the metal traces or pads 600 exposed by the openings 531, 532, 534, 539 and 539' can be performed after forming the metal bumps or pillars 27.

After forming the structure shown in FIG. 28H, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, semiconductor chip, ball-grid-array (BGA) substrate, metal substrate, glass substrate or ceramic substrate, through the metal pads, bumps or traces 34*a*, and to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24.

FIG. 28I is a cross-sectional view showing a semiconductor wafer, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15M. Next, multiple metal bumps 89 provided by the metal layers 89*a*, 89*b* and 89*c* can be formed on the polymer layer 98 and on the contact points 801*a* of the metal layer 8012 exposed by the openings 980, which can be referred to as the process illustrated in FIG. 15M. Accordingly, an over-passivation scheme 102 can be formed with the patterned circuit layer 801, the polymer layer 98 and the metal bumps 89, at the active side of the thinned silicon substrate 1. After forming the metal bumps 89, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the insulating layer 46, the polymer layer 14, the adhesion/barrier layer 16, the seed layer 18 and the metal bumps or pillars 27 can be formed at the backside 1*a* of the thinned silicon substrate 1, which can be referred to as the steps illustrated in FIGS. 28A-28F. Accordingly, a bottom scheme 103 same as the bottom scheme 103 shown in FIG. 28F can be formed at the backside 1*a* of the thinned silicon substrate 1. Alternatively, the steps of forming the patterned circuit layer 801, the polymer layer 98, the metal layer 89*a* and the metal bumps 89 can be performed after forming the metal bumps or pillars 27.

After forming the structure shown in FIG. 28I, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, ball-grid-array (BGA) substrate, semiconductor chip, metal substrate, glass substrate or ceramic substrate, through the metal bumps 89 of the over-passivation scheme 102, and to a second external circuit, such as printed circuit board, ball-grid-array (BGA) substrate, semiconductor chip, metal substrate, glass substrate or ceramic substrate, through the metal bumps or pillars 27 of the bottom scheme 103. The interconnecting structures 88 connect the off-chip buffer 42 to the internal circuits 21, 22, 23 and 24, and connect the metal bumps or pillars 27 to the off-chip buffer 42, to the off-chip ESD circuit 43 and to the internal circuits 21, 22, 23 and 24. The patterned circuit layer 801 connects the off-chip buffer 42 to the internal circuits 21, 22, 23 and 24, and connects the metal bumps 89 to the off-chip buffer 42, to the off-chip ESD circuit 43 and to the internal circuits 21, 22, 23 and 24.

FIG. 28J is a cross-sectional view showing a package, which can be formed by a suitable process or processes, e.g., by the following steps. First, the semiconductor wafer 10 illustrated in FIG. 24A includes multiple openings 531, 532, 534, 539 and 539' in the passivation layer 5 to expose multiple regions 600*a* of the metal traces or pads 600. The openings 531, 532, 534, 539 and 539' are over the regions 600*a* of the metal traces or pads 600, and the regions 600*a* of the metal traces or pads 600 are at bottoms of the openings 531, 532, 534, 539 and 539'. Next, a patterned circuit layer 801 composed of an adhesion/barrier/seed layer 8011 and a metal layer 8012 can be formed on the passivation layer 5 and on the regions 600*a* of the metal traces or pads 600 exposed by the openings 531, 532, 534, 539 and 539', which can be referred to as the steps illustrated in FIGS. 15D-15H. Next, a polymer layer 98 is formed on the metal layer 8012 of the patterned circuit layer 801 and on the passivation layer 5, and multiple openings 980 in the polymer layer 98 are over multiple contact points 801*a* of the metal layer 8012 of the patterned circuit layer 801 and expose them, which can be referred to as the process illustrated in FIG. 15I. Accordingly, an over-passivation scheme 102 can be formed with the patterned circuit layer 801 and the polymer layer 98, at the active side of the thinned silicon substrate 1. Next, a flux can be formed in the openings 980 and on the contact points 801*a* of the metal layer 8012 exposed by the openings 980.

After forming the flux, the step illustrated in FIG. 24B can be performed. Next, the through silicon vias 11*a*, 11*b*, 11*c*, 11*d* and 11*e* can be formed in the thinned silicon substrate 1, and the insulating layer 3 can be formed on the backside 1*a* of the thinned silicon substrate 1 and on the sidewalls of the through silicon vias 11*a*, 11*b*, 11*c*, 11*d* and 11*e*, which can be referred to as the steps illustrated in FIGS. 24C-24H or FIGS. 24I-24N. Next, the interconnecting structures 88 can be formed in the through silicon vias 11*a*, 11*b*, 11*c*, 11*d* and 11*e* and at the backside 1*a* of the thinned silicon substrate 1, which can be referred to as the steps illustrated in FIGS. 25A-25F. Next, the insulating layer 46, the polymer layer 14, the adhesion/barrier layer 16, the seed layer 18 and the metal bumps or pillars 27 can be formed at the backside 1*a* of the thinned silicon substrate 1, which can be referred to as the steps illustrated in FIGS. 28A-28F. Accordingly, a bottom scheme 103 same as the bottom scheme 103 shown in FIG. 28F can be formed at the backside 1*a* of the thinned silicon substrate 1. Next, the flux is removed to expose the contact points 801*a* of the metal layer 8012 exposed by the openings 980.

After removing the flux, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, the semiconductor chip can be connected to a first external circuit, such as printed circuit board, ball-grid-array (BGA) substrate, semiconductor chip, metal substrate, glass substrate or ceramic substrate, by wirebonding multiple wires 129, such as gold wires or copper wires, to the regions 801*a* of the metal layer 8012 of the over-passivation scheme 102 and to the first external circuit, and can be connected to a second external circuit, such as printed circuit board, ball-grid-array (BGA) substrate, semiconductor chip, metal substrate, glass substrate or ceramic substrate, by bonding the metal bumps or pillars 27 of the bottom scheme 103 with the second external circuit. For example, the wirebonded wires 129 can be wirebonded gold wires ball bonded with the regions 801*a* of gold, copper, aluminum or palladium of the metal layer 8012 exposed by the openings 980. Alternatively, the wirebonded wires 129 can be wirebonded copper wires ball bonded with the regions 801*a* of gold, copper, aluminum or palladium of the metal layer 8012 exposed by the openings 980.

FIGS. 29A-29T show simplified circuit diagrams of semiconductor chips where two dotted lines indicate a passivation layer 5 of the semiconductor chip and a backside 1*a* of a thinned silicon substrate 1 of the semiconductor chip, coarse traces indicate metal structures formed over the passivation layer 5 and formed under the backside 1*a*, and fine traces indicate metal traces between the passivation layer 5 and the silicon substrate 1.

FIG. 29A derives from FIG. 1C. The semiconductor chip includes power interconnects 81 and 81P, such as power buses, power traces or power lines, over the passivation layer 5, a ground interconnect 82, such as ground bus, ground trace or ground line, over the passivation layer 5, a voltage regulator or converter circuit 41 between the passivation layer 5 and the backside 1*a* of the thinned silicon substrate 1, multiple internal circuits 21, 22, 23 and 24 between the passivation layer 5 and the backside 1*a* of the thinned silicon substrate 1, multiple fine-line metal traces 611, 612*a*, 612*b*, 612*c*, 614, 619, 619', 621, 622*a*, 622*b*, 622*c*, 624 and 629 between the passivation layer 5 and the backside 1*a* of the thinned silicon substrate 1, multiple openings 511, 512, 514, 519, 519' 521, 522, 524 and 529 in the passivation layer 5, multiple through-silicon vias 11*a*, 11*b*, 11*c*, 11*d*, 11*e* and 11*f* in the thinned silicon substrate 1, multiple interconnecting structures 88 at the backside 1*a* of the thinned silicon substrate 1, an inductor 36 at the backside 1*a* of the thinned silicon substrate 1, and a capacitor 87 at the backside 1*a* of the thinned silicon substrate 1. For improving the function of a regulator regulating the power voltage Vcc in the semiconductor chip, the inductor 36 and capacitor 87 can be provided to be incorporated into the voltage regulator or converter circuit 41. The specification of the interconnecting structures 88 illustrated in FIG. 29A can be referred to as the specification of the interconnecting structures 88 as illustrated in FIGS. 25A-25F. The process of forming the interconnecting structures 88 as shown in FIG. 29A can be referred to as the process of forming the interconnecting structures 88 as illustrated in FIGS. 25A-25F. The process of forming the through-silicon vias 11*a*, 11*b*, 11*c*, 11*d*, 11*e* and 11*f* as shown in FIG. 29A can be referred to as the process of forming the through-silicon vias 11*a*, 11*b*, 11*c*, 11*d* and 11*e* as illustrated in FIGS. 24C-24H or FIGS. 24I-24N.

The power interconnect 81P can connect a power node of the voltage regulator or converter 41 to deliver a power voltage Vdd input from an external circuit, such as ball-grid-array (BGA) substrate, printed circuit board, semiconductor chip, metal substrate, glass substrate or ceramic substrate. The power interconnect 81 can connect the node P of the voltage regulator or converter circuit 41 and the power nodes Tp, Up, Vp and Wp of the internal circuits 21, 22, 23 and 24 to distribute a regulated or converted power voltage Vcc. The ground interconnect 82 can connect the ground node Rs of the voltage regulator or converter circuit 41 and the ground nodes Ts, Us, Vs and Ws of the internal circuits 21, 22, 23 and 24 to distribute a ground reference voltage Vss.

The interconnecting structures 88 at the backside 1*a* of the thinned silicon substrate 1 include a ground interconnect 88*a*, such as ground bus, ground trace or ground line, used to deliver the ground reference voltage Vss, a power interconnect 88*b*, such as power bus, power trace or power line, used to deliver the power voltage Vdd input from the external circuit, and a power interconnect 88*c*, such as power bus, power trace or power line, used to deliver the regulated or converted power voltage Vcc output from the node P of the voltage regulator or converter circuit 41.

The ground interconnect 88*a* can be connected to a terminal of the capacitor 87 formed under the backside 1*a* of the thinned silicon substrate 1, to the ground node Rs of the voltage regulator or converter circuit 41 through the through-silicon via 11*b* and the fine-line metal trace 629, to the ground interconnect 82 through the through-silicon vias 11*b*, 11*c*, 11*d* and 11*e* and the fine-line metal traces 629, 621, 622*a* and 624, and to the ground nodes Ts, Us, Vs and Ws of the internal circuits 21, 22, 23 and 24 through the through-silicon vias 11*c*, 11*d* and 11*e* and the fine-line metal traces 621, 622*b*, 622*c* and 624.

The power interconnect 88*b* can be connected to the power interconnect 81P over the passivation layer 5 through the through-silicon via 11*a* and the fine-line metal trace 619, to the power node of the voltage regulator or converter circuit 41 through the through-silicon via 11*a* and the fine-line metal trace 619, and to a terminal of the inductor 36 formed under the backside 1*a* of the thinned silicon substrate 1.

The power interconnect 88*c* can be connected to the power interconnect 81 through the through-silicon via 11*f* and the fine-line metal trace 619', to the node P of the voltage regulator or converter circuit 41 through the via 11*f* and the fine-line metal trace 619', to another terminal of the inductor 36, and to another terminal of the capacitor 87.

FIG. 29B derives from FIGS. 29A and 1D. Addition to the structure of FIG. 29A, the power interconnect 88*b* can be connected further to the node Dp of the ESD circuit 44 through the through-silicon via 11*h* and through the fine-line metal trace 649, as shown in FIG. 29B. The power interconnect 81P can be connected further to the node Dp of the ESD circuit 44 through the opening 549 in the passivation layer 5 and through the fine-line metal trace 649. The ground interconnect 88*a* can be connected further to the node Dg of the ESD circuit 44 through the through-silicon via 11*g* and through the fine-line metal trace 649'. The ground interconnect 82 can be connected further to the node Dg of the ESD circuit 44 through the opening 549' in the passivation layer 5 and through the fine-line metal trace 649'. The process of forming the through-silicon vias 11*a*, 11*b*, 11*c*, 11*d*, 11*e*, 11*f*, 11*g* and 11*h* as shown in FIG. 29B can be referred to as the process of forming the through-silicon vias 11*a*, 11*b*, 11*c*, 11*d* and 11*e* as illustrated in FIGS. 24C-24H or FIGS. 24I-24N.

FIG. 29C derives from FIG. 1B. An interconnecting structure 88 can be provided at the backside 1*a* of the thinned silicon substrate 1 and in through-silicon vias 11 in the thinned silicon substrate 1. The interconnecting structure 88 is a ground interconnect, such as ground bus, ground trace or ground line, used to deliver a ground voltage Vss and connected to the ground nodes Rs, Ts, Us, Vs and Ws through the through-silicon vias 11. The specification of the interconnecting structure 88 illustrated in FIG. 29C can be referred to as the specification of the interconnecting structures 88 as illustrated in FIGS. 25A-25F. The process of forming the interconnecting structure 88 as shown in FIG. 29C can be referred to as the process of forming the interconnecting structures 88 as illustrated in FIGS. 25A-25F. The process of forming the through-silicon vias 11 as shown in FIG. 29C can be referred to as the process of forming the through-silicon vias 11*a*, 11*b*, 11*c*, 11*d* and 11*e* as illustrated in FIGS. 24C-24H or FIGS. 24I-24N.

FIG. 29D derives from FIG. 12B. Interconnecting structures 88 can be provided at the backside 1*a* of the thinned silicon substrate 1 and in through-silicon vias 11 in the thinned silicon substrate 1. A capacitor 87 can be provided at the backside 1*a* of the thinned silicon substrate 1 using steps illustrated in FIGS. 32A-32N, FIGS. 33A-33K, FIGS. 33N-33U, FIGS. 33V and 33W, FIGS. 33X and 33Y, or FIGS. 35A-35D. The interconnecting structures 88 includes a ground interconnect 88*a*, such as ground bus, ground trace or ground line, and a power interconnect 88*b*, such as power bus, power trace or power line. The ground interconnect 88*a* used to deliver a ground voltage Vss can be connected to a node of the ESD circuit 44, to the ground nodes Ts, Us, Vs and Ws through the through-silicon vias 11, and to a terminal of the capacitor 87. The power interconnect 88*b* used to deliver a power voltage Vdd input from an external circuit, such as ball-grid-array (BGA) substrate, printed circuit board, another semiconductor chip, metal substrate, glass substrate or ceramic substrate, can be connected to the power interconnect 81P over the passivation layer 5 and to the node Dp of the ESD circuit 44 through the through-silicon via 11 and the fine-line metal trace 649. The power interconnect 88*b* also can be connected to another terminal of the capacitor 87. The specification of the interconnecting structures 88 illustrated in FIG. 29D can be referred to as the specification of the interconnecting structures 88 as illustrated in FIGS. 25A-25F. The process of forming the interconnecting structures 88 as shown in FIG. 29D can be referred to as the process of forming the interconnecting structures 88 as illustrated in FIGS. 25A-25F. The process of forming the through-silicon vias 11 as shown in FIG. 29D can be referred to as the process of forming the through-silicon vias 11*a*, 11*b*, 11*c*, 11*d* and 11*e* as illustrated in FIGS. 24C-24H or FIGS. 24I-24N.

Referring to FIG. 29E, interconnecting structures 88 including a ground interconnect 88*a* and a power interconnect 88*b* can be provided at the backside 1*a* of the thinned silicon substrate 1 and in through-silicon vias 11 in the thinned silicon substrate 1. The metal trace, bus or plane 82, shown in FIG. 12C, over the passivation layer 5 can be replaced with the ground interconnect 88*a*, such as ground bus, ground trace or ground line, at the backside 1*a* of the thinned silicon substrate 1, and the power bus 81P, shown in FIG. 12C, over the passivation layer 5 can be replaced with the power interconnect 88*b*, such as power bus, power trace or power line, at the backside 1*a* of the thinned silicon substrate 1. A capacitor 87 can be provided at the backside 1*a* of the thinned silicon substrate 1 using steps illustrated in FIGS. 32A-32N, FIGS. 33A-33K, FIGS. 33N-33U, FIGS. 33V and 33W, FIGS. 33X and 33Y, or FIGS. 35A-35D. The ground interconnect 88*a* used to deliver a ground voltage Vss can be connected to the node Dg of the ESD circuit 44 and to the ground nodes Ts, Us, Vs and Ws through the through-silicon vias 11. The ground interconnect 88*a* also can be connected to a terminal of the capacitor 87. The power interconnect 88*b* used to deliver a power voltage Vdd input from an external circuit, such as ball-grid-array (BGA) substrate, printed circuit board, another semiconductor chip, metal substrate, glass substrate or ceramic substrate, can be connected to the node Dp of the ESD circuit 44 and to the power nodes Tp, Up, Vp and Wp through the through-silicon vias 11. The power interconnect 88*b* also can be connected to another terminal of the capacitor 87. The specification of the interconnecting structures 88 illustrated in FIG. 29E can be referred to as the specification of the interconnecting structures 88 as illustrated in FIGS. 25A-25F. The process of forming the interconnecting structures 88 as shown in FIG. 29E can be referred to as the process of forming the interconnecting structures 88 as illustrated in FIGS. 25A-25F. The process of forming the through-silicon vias 11 as shown in FIG. 29E can be referred to as the process of forming the through-silicon vias 11*a*, 11*b*, 11*c*, 11*d* and 11*e* as illustrated in FIGS. 24C-24H or FIGS. 24I-24N.

Referring to FIG. 29F, interconnecting structures 88 including a ground interconnect 88*a* and a power interconnect 88*b* can be provided at the backside 1*a* of the thinned silicon substrate 1 and in through-silicon vias 11 in the thinned silicon substrate 1. The metal trace, bus or plane 82, shown in FIG. 12D, over the passivation layer 5 can be replaced with the ground interconnect 88*a*, such as ground bus, ground trace or ground line, at the backside 1*a* of the thinned silicon substrate 1, and the power metal trace, bus or plane 81, shown in FIG. 12D, over the passivation layer 5 can be replaced with the power interconnect 88*b*, such as power bus, power trace or power line, at the backside 1*a* of the thinned silicon substrate 1. A capacitor 87 can be provided at the backside 1*a* of the thinned silicon substrate 1 using steps illustrated in FIGS. 32A-32N, FIGS. 33A-33K, FIGS. 33N-33U, FIGS. 33V and 33W, FIGS. 33X and 33Y, or FIGS. 35A-35D. The ground interconnect 88*a* used to deliver a ground voltage Vss can be connected to the nodes Dg and Dg' of the ESD circuits 44 and 45 and to the ground nodes Ts, Us, Vs and Ws through the through-silicon vias 11. The ground interconnect 88*a* also can be connected to a terminal of the capacitor 87. The power interconnect 88*b* used to deliver a power voltage Vdd input from an external circuit, such as ball-grid-array (BGA) substrate, printed circuit board, another semiconductor chip, metal substrate, glass substrate or ceramic substrate, can be connected to the nodes Dp and Dp' of the ESD circuit 44 and 45 and to the power nodes Tp, Up, Vp and Wp through the through-silicon vias 11. The power interconnect 88*b* also can be connected to another terminal of the capacitor 87. The specification of the interconnecting structures 88 illustrated in FIG. 29F can be referred to as the specification of the interconnecting structures 88 as illustrated in FIGS. 25A-25F. The process of forming the interconnecting structures 88 as shown in FIG. 29F can be referred to as the process of forming the interconnecting structures 88 as illustrated in FIGS. 25A-25F. The process of forming the through-silicon vias 11 as shown in FIG. 29F can be referred to as the process of forming the through-silicon vias 11*a*, 11*b*, 11*c*, 11*d* and 11*e* as illustrated in FIGS. 24C-24H or FIGS. 24I-24N.

Referring to FIG. 29G, 29H or 29K, interconnecting structures 88 including two metal interconnects 88*c* and 88*d* can be provided at the backside 1*a* of the thinned silicon substrate 1 and in through-silicon vias 11 in the thinned silicon substrate 1. The metal trace, bus or plane 83, shown in FIG. 8B, 8C or 8F, over the passivation layer 5 can be replaced with the metal interconnect 88*c*, such as metal trace or metal line, at the backside 1*a* of the thinned silicon substrate 1, and the redistributed metal trace 83*r*, shown in FIG. 8B, 8C or 8F, over the passivation layer 5 can be replaced with the metal interconnect 88*d*, such as metal trace or metal line, at the backside 1*a* of the thinned silicon substrate L The previously described metal bump or pillar 27 can be provided on the metal interconnect 88*d*. The previously described power interconnect 81P, such as power bus, power trace or power line, connected to a node of the off-chip ESD circuit 43 through one opening 50 in the passivation layer 5 can be provided over the passivation layer 5 using the previously described top post-passivation technology. The previously described ground interconnect 82, such as ground bus, ground trace or ground line, connected to another node of the off-chip ESD circuit 43 through another one opening 50 in the passivation layer 5 can be provided over the passivation layer 5 using the previously described top post-passivation technology. The specification of the interconnecting structures 88 illustrated in FIG. 29G, 29H or 29K can be referred to as the specification of the interconnecting structures 88 as illustrated in FIGS. 25A-25F, and the process of forming the interconnecting structures 88 as shown in FIG. 29G, 29H or 29K can be referred to as the process of forming the interconnecting structures 88 as illustrated in FIGS. 25A-25E The specification of the metal bump or pillar 27 illustrated in FIG. 29G, 29H or 29K can be referred to as the specification of the metal bump or pillar 27 as illustrated in FIG. 25J, and the process of forming the metal bump or pillar 27 as shown in FIG. 29G, 29H or 29K can be referred to as the process of forming the metal bump or pillar 27 as illustrated in FIGS. 25G-25L. The process of forming the through-silicon vias 11 as shown in FIG. 29G, 29H or 29K can be referred to as the process of forming the through-silicon vias 11*a*, 11*b*, 11*c*, 11*d* and 11*e* as illustrated in FIGS. 24C-24H or FIGS. 24I-24N.

Referring to FIG. 29I, interconnecting structures 88 including two metal interconnects 88*c* and 88*d* can be provided at the backside 1*a* of the thinned silicon substrate 1 and in through-silicon vias 11 in the thinned silicon substrate 1. The metal trace, bus or plane 83, shown in FIG. 8D, over the passivation layer 5 can be replaced with the metal interconnect 88*c*, such as metal trace or metal line, at the backside 1*a* of the thinned silicon substrate 1, and the redistributed metal trace 83*r*, shown in FIG. 8D, over the passivation layer 5 can be replaced with the metal interconnect 88*d*, such as metal trace or metal line, at the backside 1*a* of the thinned silicon substrate 1. The previously described metal bump or pillar 27 can be provided on the metal interconnect 88*d*. The previously described power interconnect 81P, such as power bus, power trace or power line, connected to two nodes of the two off-chip ESD circuits 43 through two openings 50 in the passivation layer 5 can be provided over the passivation layer 5 using the previously described top post-passivation technology. The previously described ground interconnect 82, such as ground bus, ground trace or ground line, connected to another two nodes of the two off-chip ESD circuits 43 through another two openings 50 in the passivation layer 5 can be provided over the passivation layer 5 using the previously described top post-passivation technology. The specification of the interconnecting structures 88 illustrated in FIG. 29I can be referred to as the specification of the interconnecting structures 88 as illustrated in FIGS. 25A-25F, and the process of forming the interconnecting structures 88 as shown in FIG. 29I can be referred to as the process of forming the interconnecting structures 88 as illustrated in FIGS. 25A-25F. The specification of the metal bump or pillar 27 illustrated in FIG. 29I can be referred to as the specification of the metal bump or pillar 27 as illustrated in FIG. 25J, and the process of forming the metal bump or pillar 27 as shown in FIG. 29I can be referred to as the process of forming the metal bump or pillar 27 as illustrated in FIGS. 25G-25L. The process of forming the through-silicon vias 11 as shown in FIG. 29I can be referred to as the process of forming the through-silicon vias 11*a*, 11*b*, 11*c*, 11*d* and 11*e* as illustrated in FIGS. 24C-24H or FIGS. 24I-24N.

Referring to FIG. 29J, interconnecting structures 88 including three metal interconnects 88*c*, 88*d* and 88*e* can be provided at the backside 1*a* of the thinned silicon substrate 1 and in through-silicon vias 11 in the thinned silicon substrate 1. The metal trace, bus or plane 83, shown in FIG. 8E, over the passivation layer 5 can be replaced with the metal interconnect 88*c*, such as metal trace or metal line, at the backside 1*a* of the thinned silicon substrate 1, the redistributed metal trace 83*r*, shown in FIG. 8E, over the passivation layer 5 can be replaced with the metal interconnect 88*d*, such as metal trace or metal line, at the backside 1*a* of the thinned silicon substrate 1, and the metal trace, bus or plane 83*s*, shown in FIG. 8E, over the passivation layer 5 can be replaced with the metal interconnect 88*e*, such as metal trace or metal line, at the backside 1*a* of the thinned silicon substrate 1. The previously described metal bump or pillar 27 can be provided on the metal interconnect 88*d*. The previously described power interconnect 81P, such as power bus, power trace or power line, connected to a node of the off-chip ESD circuit 43 through one opening 50 in the passivation layer 5 can be provided over the passivation layer 5 using the previously described top post-passivation technology. The previously described ground interconnect 82, such as ground bus, ground trace or ground line, connected to another node of the off-chip ESD circuit 43 through another one opening 50 in the passivation layer 5 can be provided over the passivation layer 5 using the previously described top post-passivation technology. The specification of the interconnecting structures 88 illustrated in FIG. 29J can be referred to as the specification of the interconnecting structures 88 as illustrated in FIGS. 25A-25F, and the process of forming the interconnecting structures 88 as shown in FIG. 29J can be referred to as the process of forming the interconnecting structures 88 as illustrated in FIGS. 25A-25F. The specification of the metal bump or pillar 27 illustrated in FIG. 29J can be referred to as the specification of the metal bump or pillar 27 as illustrated in FIG. 25J, and the process of forming the metal bump or pillar 27 as shown in FIG. 29J can be referred to as the process of forming the metal bump or pillar 27 as illustrated in FIGS. 25G-25L. The process of forming the through-silicon vias 11 as shown in FIG. 29J can be referred to as the process of forming the through-silicon vias 11*a*, 11*b*, 11*c*, 11*d* and 11*e* as illustrated in FIGS. 24C-24H or FIGS. 24I-24N.

Referring to FIG. 29L or 29M, an interconnecting structure 88 can be provided at the backside 1*a* of the thinned silicon substrate 1 and in through-silicon vias 11 in the thinned silicon substrate 1. The metal trace, bus or plane 83, shown in FIG. 5B or 5S, over the passivation layer 5 can be replaced with the interconnecting structure 88 at the backside 1*a* of the thinned silicon substrate 1. The interconnecting structure 88, such as metal interconnect, metal trace or metal line, can be connected to the metal interconnects 631, 632 and 634, such as metal buses or metal traces, through the through-silicon vias 11. The specification of the interconnecting structure 88 illustrated in FIG. 29L or 29M can be referred to as the specification of the interconnecting structures 88 as illustrated in FIGS. 25A-25F. The process of forming the interconnecting structure 88 as shown in FIG. 29L or 29M can be referred to as the process of forming the interconnecting structures 88 as illustrated in FIGS. 25A-25F. The process of forming the through-silicon vias 11 as shown in FIG. 29L or 29M can be referred to as the process of forming the through-silicon vias 11*a*, 11*b*, 11*c*, 11*d* and 11*e* as illustrated in FIGS. 24C-24H or FIGS. 24I-24N.

Referring to FIG. 29N, an interconnecting structure 88 can be provided at the backside 1*a* of the thinned silicon substrate 1 and in through-silicon vias 11 in the thinned silicon substrate 1. The metal trace, bus or plane 83', shown in FIG. 5K, over the passivation layer 5 can be replaced with the interconnecting structure 88 at the backside 1*a* of the thinned silicon substrate 1. The interconnecting structure 88, such as metal interconnect, metal trace or metal line, can be connected to the metal interconnects 631', 632' and 634', such as metal buses or metal traces, through the through-silicon vias 11. The specification of the interconnecting structure 88 illustrated in FIG. 29N can be referred to as the specification of the interconnecting structures 88 as illustrated in FIGS. 25A-25F. The process of forming the interconnecting structure 88 as shown in FIG. 29N can be referred to as the process of forming the interconnecting structures 88 as illustrated in FIGS. 25A-25F. The process of forming the through-silicon vias 11 as shown in FIG. 29N can be referred to as the process of forming the through-silicon vias 11*a*, 11*b*, 11*c*, 11*d* and 11*e* as illustrated in FIGS. 24C-24H or FIGS. 24I-24N.

Referring to FIG. 29O, 29P, 29Q, 29R, 29S or 29T, interconnecting structures 88 including two metal interconnects 88*f* and 88*g* can be provided at the backside 1*a* of the thinned silicon substrate 1 and in through-silicon vias 11 in the thinned silicon substrate 1. The metal trace, bus or plane 83, shown in FIG. 5U, 5V, 5W, 5X, 5Y or 5Z, over the passivation layer 5 can be replaced with the metal interconnect 88*f*, such as metal trace or metal line, at the backside 1*a* of the thinned silicon substrate 1, and the address bus 85, shown in FIG. 5U, 5V, 5W, 5X, 5Y or 5Z, over the passivation layer 5 can be replaced with the metal interconnect 88*g*, such as metal trace or metal line, at the backside 1*a* of the thinned silicon substrate 1. The specification of the interconnecting structures 88 illustrated in FIG. 29O, 29P, 29Q, 29R, 29S or 29T can be referred to as the specification of the interconnecting structures 88 as illustrated in FIGS. 25A-25F. The process of forming the interconnecting structures 88 as shown in FIG. 29O, 29P, 29Q, 29R, 29S or 29T can be referred to as the process of forming the interconnecting structures 88 as illustrated in FIGS. 25A-25F. The process of forming the through-silicon vias 11 as shown in FIG. 29O, 29P, 29Q, 29R, 29S or 29T can be referred to as the process of forming the through-silicon vias 11*a*, 11*b*, 11*c*, 11*d* and 11*e* as illustrated in FIGS. 24C-24H or FIGS. 24I-24N.

In the following, a process illustrated in FIGS. 30A-30F is introduced for forming the inductor 36 and the ground trace 88*a* as illustrated in FIGS. 29A and 29B. FIG. 30A is a cross-sectional view showing the silicon substrate 1 and other elements as described above in the semiconductor wafer 10, and the silicon substrate 1 has a thickness t1 between 600 and 1000 micrometers, between 50 micrometers and 1 millimeter or between 75 and 250 micrometers. Alternatively, the silicon substrate 1 can be replaced by other semiconductor substrate, such as silicon-germanium (SiGe) substrate or gallium arsenide (GaAs) substrate.

Referring to FIG. 30B, the silicon substrate 1 of the semiconductor wafer 10 illustrated FIG. 30A is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, multiple through-silicon vias 11*a*, 11*d*, 11*e* and 11*f* can be formed in the thinned silicon substrate 1 and in at least one dielectric layer 30, exposing multiple regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. The through-silicon vias 11*a*, 11*d*, 11*e* and 11*f* penetrate completely through the thinned silicon substrate 1 and the dielectric layer(s) 30. The process of forming the through-silicon via 11*f* in the thinned silicon substrate 1 and in the dielectric layer 30 and forming the insulating layer 3 on the sidewall of the through-silicon via 11*f* as shown in FIG. 30B can be referred to as the process of forming the through-silicon vias 11*a*, 11*b*, 11*c*, 11*d* and 11*e* in the thinned silicon substrate 1 and in the dielectric layer(s) 30 and forming the insulating layer 3 on the sidewalls of the through-silicon vias 11*a*, 11*b*, 11*c*, 11*d* and 11*e* as illustrated in FIGS. 24C-24H or FIGS. 24I-24N. Next, the metal layer 4 composed of the adhesion/barrier layer 4*a* and the seed layer 4*b* can be formed in the through-silicon vias 11*a*, 11*d*, 11*e* and 11*f* and on the insulating layer 3, which can be referred to as the step illustrated in FIG. 25A.

After forming the seed layer 4*b* of the metal layer 4, a photoresist layer 29, such as positive-type photoresist layer or negative-type photoresist layer, having a thickness between 5 and 50 micrometers, and preferably between 10 and 25 micrometers, can be formed on the seed layer 4*b* of the metal layer 4 by a spin-on coating process, a lamination process, a screen-printing process or a spraying process. Next, the photoresist layer 29 is patterned with the processes of exposure and development to form an opening 29*a* and a coil-shaped opening 29*b* in the photoresist layer 29 exposing the seed layer 4*b* of the metal layer 4. A 1× stepper or 1× contact aligner can be used to expose the photoresist layer 29 during the process of exposure. The process of forming the photoresist layer 29 on the seed layer 4*b*, forming the opening 29*a* in the photoresist layer 29 and forming the coil-shaped opening 29*b* in the photoresist layer 29 as shown in FIG. 30B can be referred to as the process of forming the photoresist layer 29 on the seed layer 4*b* and forming the openings 29*a* in the photoresist layer 29 as illustrated in FIGS. 25B-25C.

Next, referring to FIG. 30C, a bulk metal layer 9 can be formed in the openings 29*a* and 29*b* and on the seed layer 4*b* of the metal layer 4 exposed by the openings 29*a* and 29*b* by a process including an electroplating process. The process of forming the bulk metal layer 9 in the openings 29*a* and 29*b* and on the seed layer 4*b* of the metal layer 4 exposed by the openings 29*a* and 29*b* as shown in FIG. 30C can be referred to as the process of forming the bulk metal layer 9 in the openings 29*a* and on the seed layer 4*b* of the metal layer 4 exposed by the openings 29*a* as illustrated in FIG. 25D. The specification of the bulk metal layer 9 shown in FIG. 30C can be referred to as the specification of the bulk metal layer 9 as illustrated in FIG. 25D.

Referring to FIG. 30D, after the step illustrated in FIG. 30C, the photoresist layer 29 is removed using an inorganic solution or using an organic solution with amide. Some residuals from the photoresist layer 29 could remain on the bulk metal layer 9 and on the seed layer 4*b* of the metal layer 4. Thereafter, the residuals can be removed from the bulk metal layer 9 and from the seed layer 4*b* of the metal layer 4 with a plasma, such as an $O_2$ plasma or a plasma containing fluorine of below 200 PPM and oxygen.

Referring to FIG. 30E, after the step illustrated in FIG. 30D, the metal layer 4 not under the bulk metal layer 9 is removed by etching the seed layer 4*b* not under the bulk metal layer 9, and then etching the adhesion/barrier layer 4*a* not under the bulk metal layer 9. The process of removing the seed layer 4*b* not under the bulk metal layer 9 and removing the adhesion/barrier layer 4*a* not under the bulk metal layer 9 as shown in FIG. 30E can be referred to as the process of removing the seed layer 4*b* not under the bulk metal layer 9 and removing the adhesion/barrier layer 4*a* not under the bulk metal layer 9 as illustrated in FIG. 25F.

Accordingly, the coil 36 and the metal interconnect 88*a* are formed on the insulating layer 3 and at the backside 1*a* of the thinned silicon substrate 1. The coil 36 provided by the metal layers 4 and 9 at the backside 1*a* of the thinned silicon substrate 1 has a first contact point 36*a* connected to the node P of the voltage regulator or converter circuit 41 through the bulk metal layer 9 in the through-silicon via 11*f* and through the fine-line metal structure 619', and a second contact point 36*b* connected to the power node of the voltage regulator or converter circuit 41 through the bulk metal layer 9 in the through-silicon via 11*a* and through the fine-line metal structure 619. FIG. 30F shows a top view of the coil 36. The coil 36 can be used for an inductor. The metal interconnect 88*a* can be provided by the metal layers 4 and 9 at the backside 1*a* of the thinned silicon substrate 1, and can connect the internal circuits 22 and 23 to the internal circuit 24. The internal circuits 22 and 23 can be connected to the internal circuit 24 through the metal interconnect 88*a* and the fine-line metal traces 622 and 624.

After the step illustrated in FIG. 30E, using a die-sawing process, the semiconductor wafer 10 can be cut into a plurality of individual semiconductor chip. After the die-sawing process, the semiconductor chip cut from the semiconductor wafer 10 can be packaged for a chip package. In the chip package, for example, there is no metal bump or wirebonded wire formed on the bulk metal layer 9 of the semiconductor chip for connecting the coil 36 or the metal interconnect 88*a* to an external circuit.

Alternatively, in the chip package, there is a wirebonded wire, such as gold wirebonded wire or copper wirebonded wire, bonded on the bulk metal layer 9 of the semiconductor chip for connecting the coil 36 to a first external circuit, such as ball-grid-array (BGA) substrate, printed circuit board, semiconductor chip, metal substrate, glass substrate or ceramic substrate, and there is another wirebonded wire, such as gold wirebonded wire or copper wirebonded wire, bonded on a region of the metal interconnect 88*a* of the semiconductor chip for connecting the metal interconnect 88*a* to the first external circuit or to a second external circuit, such as ball-grid-array (BGA) substrate, printed circuit board, semiconductor chip, metal substrate, glass substrate or ceramic substrate.

Alternatively, in the chip package, there is a first wirebonded wire, such as gold wirebonded wire or copper wirebonded wire, bonded on the bulk metal layer 9 of the semiconductor chip for connecting the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit, and there is a second wirebonded wire, such as gold wirebonded wire or copper wirebonded wire, bonded on the bulk metal layer 9 of the semiconductor chip for connecting the contact point 36*a* of the coil 36 to the first external circuit or a second external circuit, such as ball-grid-array (BGA) substrate, printed circuit board, semiconductor chip, metal substrate, glass substrate or ceramic substrate, to output a regulated or converted power voltage Vcc to the first external circuit or the second external circuit. There is a third wirebonded wire, such as gold wirebonded wire or copper wirebonded wire, bonded on the bulk metal layer 9 of the semiconductor chip for connecting the metal interconnect 88*a* to a ground bus or plane of the first external circuit or the second external circuit.

Alternatively, in the chip package, there is a first metal bump, such as gold bump, copper bump, nickel bump or solder bump, on the bulk metal layer 9 of the semiconductor chip for connecting the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit, and there is a second metal bump, such as gold bump, copper bump, nickel bump or solder bump, on the bulk metal layer 9 of the semiconductor chip for connecting the contact point 36*a* of the coil 36 to the first external circuit or a second external circuit, such as ball-grid-array (BGA) substrate, printed circuit board, semiconductor chip, metal substrate, glass substrate or ceramic substrate, to output a regulated or converted power voltage Vcc to the first external circuit or the second external circuit. There is a third metal bump, such as gold bump, copper bump, nickel bump or solder bump, on the bulk metal layer 9 of the semiconductor chip for connecting the metal interconnect 88*a* to a ground bus or plane of the first external circuit or the second external circuit.

In the following, FIGS. 30G, 30H and 30I show a process for forming multiple metal bumps or pillars 27 over the bulk metal layer 9 of the semiconductor wafer 10 for being used to connect the coil 36 to the first external circuit and/or the second external circuit and connect the metal interconnect 88*a* to the first external circuit or the second external circuit.

Referring to FIG. 30G, after the step illustrated in FIG. 30E, a polymer layer 14 can be formed on the insulating layer 3 and on the topmost layer of copper, gold, aluminum, nickel or palladium of the previously described various bulk metal layer 9, and multiple openings 14*a* in the polymer layer 14 are over multiple regions of the topmost layer of copper, gold, aluminum, nickel or palladium of the previously described various bulk metal layer 9 and expose them, which can be referred to as the step illustrated in FIG. 25G. The polymer layer 14 has a thickness larger than 2 micrometers, such as between 3 and 50 micrometers, and preferably between 5 and 25 micrometers. The material of the polymer layer 14 may include benzocyclobutane (BCB), polyimide (PI), polybenzoxazole (PBO) or epoxy resin.

Next, referring to FIG. 30H, the adhesion/barrier layer 16 can be formed on the polymer layer 14 and on the regions of the topmost layer of copper, gold, aluminum, nickel or palladium of the previously described various bulk metal layer 9 exposed by the openings 14*a*, and then the seed layer 18 can be formed on the adhesion/barrier layer 16, which can be referred to as the step illustrated in FIG. 25H. Next, the photoresist layer 31 can be formed on the seed layer 18, and multiple openings 31*a* in the photoresist layer 31 expose the seed layer 18, which can be referred to as the step illustrated in FIG. 25I. Next, the metal bumps or pillars 27 can be formed on the seed layer 18 of any previously described material exposed by the openings 31*a* and in the openings 31*a*. The process of forming the metal bumps or pillars 27 on the seed layer 18 of any previously described material exposed by the openings 31*a* and in the openings 31*a* as shown in FIG. 30H can be referred to as the process of forming the metal bump or pillar 27 on the seed layer 18 of any previously described material exposed by the opening 31*a* and in the opening 31*a* as illustrated in FIG. 25J. The specification of the metal bumps or pillars 27 shown in FIG. 30H can be referred to as the specification of the metal bump or pillar 27 as illustrated in FIG. 25J.

Next, referring to FIG. 30I, the photoresist layer 31 can be removed, which can be referred to as the step illustrated in FIG. 25K. Next, the seed layer 18 not under the metal bumps or pillars 27 can be removed, and then the adhesion/barrier layer 16 not under the metal bumps or pillars 27 can be removed, which can be referred to as the step illustrated in FIG. 25L. Accordingly, the metal bumps or pillars 27 are formed over the bulk metal layer 9 and connect with the bulk metal layer 9, and a bottom scheme 103 at the backside 1*a* of the thinned silicon substrate 1 is formed with the insulating layer 3, the coil 36, the metal interconnect 88*a*, the metal layers 16 and 18, the metal bumps or pillars 27, and the polymer layer 14, and the openings 14*a* in the polymer layer 14 are over the bulk metal layer 9.

After forming the structure shown in FIG. 30I, the semiconductor wafer 10 can be cut into a plurality of individual semiconductor chip by a die-sawing process. Alternatively, after forming the structure shown in FIG. 30I, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 30B-30E and 30G-30I, after the steps illustrated in FIGS. 30B-30E and 30G-30I, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, for example, a first metal bump or pillar 27 connected to the bulk metal layer 9 of the semiconductor chip may connect the contact point 36*b* of the coil 36 to the power bus or plane of the first external circuit to receive the external power voltage Vdd from the first external circuit. A second metal bump or pillar 27 connected to the bulk metal layer 9 of the semiconductor chip may connect the contact point 36*a* of the coil 36 to the first external circuit or the second external circuit to output the regulated or converted power voltage Vcc to the first external circuit or the second external circuit. A third metal bump or pillar 27 connected to the bulk metal layer 9 of the semiconductor chip may connect the metal interconnect 88*a* to the ground bus or plane of the first external circuit or the second external circuit.

FIGS. 30J, 30K and 30L show a process for forming a semiconductor wafer according to the present disclosure. Referring to FIG. 30J, the semiconductor wafer 10 illustrated in FIG. 30A includes multiple openings 519, 519', 521, 522 and 524 in the passivation layer 5 to expose multiple regions 600*a* of the metal traces or pads 600, and a flux 32 can be formed in the openings 519, 519', 521, 522 and 524 and on the regions 600*a* of the metal traces or pads 600 exposed by the openings 519, 519', 521, 522 and 524. The openings 519, 519', 521, 522 and 524 are over the regions 600*a* of the metal traces or pads 600, and the regions 600*a* of the metal traces or pads 600 are at bottoms of the openings 519, 519', 521, 522 and 524.

Referring to FIG. 30K, after forming the flux 32, the silicon substrate 1 is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the coil 36, the metal interconnect 88*a*, the polymer layer 14 and the metal bumps or pillars 27 can be formed in the through silicon vias 11*a*, 11*d*, 11*e* and 11*f* and at the backside 1*a* of the thinned silicon substrate 1, which can be referred to as the steps illustrated in FIGS. 30B-30E and 30G-30I. Accordingly, a bottom scheme 103 same as the bottom scheme 103 shown in FIG. 30I can be formed at the backside 1*a* of the thinned silicon substrate 1.

Referring to FIG. 30L, after forming the structure shown in FIG. 30K, the flux 32 is removed. Next, using the steps illustrated in FIGS. 15D-15H, multiple patterned circuit layers 812 composed of an adhesion/barrier/seed layer 8121 and a metal layer 8122 can be formed on the passivation layer 5 and on the regions 600*a* of the metal traces or pads 600 exposed by the openings 519 and 519', and a patterned circuit layer 821 composed of an adhesion/barrier/seed layer 8211 and a metal layer 8212 can be formed on the passivation layer 5 and on the regions 600*a* of the metal traces or pads 600 exposed by the openings 521, 522 and 524. Next, a polymer layer 98 is formed on the metal layer 8122 of the patterned circuit layers 812, on the metal layer 8212 of the patterned circuit layer 821 and on the passivation layer 5, and multiple openings 980 in the polymer layer 98 are over multiple contact points of the metal layers 8122 and 8212 and expose them, which can be referred to as the step illustrated in FIG. 15I. Next, multiple metal bumps 89 provided by triple metal layers 89*a*, 89*b* and 89*c* are formed on the polymer layer 98 and on the contact points of the metal layers 8122 and 8212 exposed by the openings 980. Accordingly, an over-passivation scheme 102 is formed with the patterned circuit layers 812 and 821, the polymer layer 98 and the metal bumps 89, at the active side of the thinned silicon substrate 1. Alternatively, each of the over-passivation schemes 102 illustrated in FIGS. 15H, 15K-15M, 16L, 16M, 17J, 18I, 19H and 20 can be formed over the passivation layer 5 at the active side of the thinned silicon substrate 1.

For example, the metal layer 89*a* can be an adhesion/barrier layer that can be a titanium-containing layer, such as titanium layer, titanium-tungsten-alloy layer or titanium-nitride layer, a tantalum-containing layer, such as tantalum layer or tantalum-nitride layer, or a chromium-containing layer, such as chromium layer, having a thickness smaller than 1 micrometer, such as between 0.005 and 0.9 micrometers, and preferably between 0.05 and 0.5 micrometers, on the polymer layer 98 and on the contact points of the metal layers 8122 and 8212 exposed by the openings 980. The metal layer 89*b* can be a copper seed layer having a thickness smaller than 1 micrometer, such as between 0.005 and 0.9 micrometers, and preferably between 0.05 and 0.5 micrometers, on the adhesion/barrier layer 89*a*. The metal layer 89*c* can be an electroplated copper layer having a thickness larger than 3 micrometers, such as between 5 and 150 micrometers, and preferably between 10 and 100 micrometers, on the copper seed layer 89*b* and over the contact points of the metal layers 8122 and 8212 exposed by the openings 980. Sidewalls of the electroplated copper layer 89*c* are not covered by the adhesion/barrier layer 89*a* and the copper seed layer 89*b*.

Alternatively, the metal layer 89*a* can be an adhesion/barrier layer that can be a titanium-containing layer, such as titanium layer, titanium-tungsten-alloy layer or titanium-nitride layer, a tantalum-containing layer, such as tantalum layer or tantalum-nitride layer, or a chromium-containing layer, such as chromium layer, having a thickness smaller than 1 micrometer, such as between 0.005 and 0.9 micrometers, and preferably between 0.05 and 0.5 micrometers, on the polymer layer 98 and on the contact points of the metal layers 8122 and 8212 exposed by the openings 980. The metal layer 89*b* can be a gold seed layer having a thickness smaller than 1 micrometer, such as between 0.005 and 0.9 micrometers, and preferably between 0.05 and 0.5 micrometers, on the adhesion/barrier layer 89*a*. The metal layer 89*c* can be an electroplated gold layer having a thickness larger than 3 micrometers, such as between 5 and 150 micrometers, and preferably between 10 and 100 micrometers, on the gold seed layer 89*b* and over the contact points of the metal layers 8122 and 8212 exposed by the openings 980. Sidewalls of the electroplated gold layer 89*c* are not covered by the adhesion/barrier layer 89*a* and the gold seed layer 89*b*.

Alternatively, the metal layer 89*a* can be an adhesion/barrier layer that can be a titanium-containing layer, such as titanium layer, titanium-tungsten-alloy layer or titanium-nitride layer, a tantalum-containing layer, such as tantalum layer or tantalum-nitride layer, or a chromium-containing layer, such as chromium layer, having a thickness smaller than 1 micrometer, such as between 0.005 and 0.9 micrometers, and preferably between 0.05 and 0.5 micrometers, on the polymer layer 98 and on the contact points of the metal layers 8122 and 8212 exposed by the openings 980. The metal layer 89*b* can be a copper seed layer having a thickness smaller than 1 micrometer, such as between 0.005 and 0.9 micrometers, and preferably between 0.05 and 0.5 micrometers, on the adhesion/barrier layer 89*a*. The metal layer 89*c* can be an electroplated nickel layer having a thickness larger than 3 micrometers, such as between 5 and 150 micrometers, and preferably between 10 and 100 micrometers, on the copper seed layer 89*b* and over the contact points of the metal layers 8122 and 8212 exposed by the openings 980. Sidewalls of the electroplated nickel layer 89*c* are not covered by the adhesion/barrier layer 89*a* and the copper seed layer 89*b*.

Alternatively, the metal layer 89*a* can be an adhesion/barrier layer that can be a titanium-containing layer, such as titanium layer, titanium-tungsten-alloy layer or titanium-nitride layer, a tantalum-containing layer, such as tantalum layer or tantalum-nitride layer, or a chromium-containing layer, such as chromium layer, having a thickness smaller than 1 micrometer, such as between 0.005 and 0.9 micrometers, and preferably between 0.05 and 0.5 micrometers, on the polymer layer 98 and on the contact points of the metal layers 8122 and 8212 exposed by the openings 980. The metal layer 89*b* can be a copper seed layer having a thickness smaller than 1 micrometer, such as between 0.005 and 0.9 micrometers, and preferably between 0.05 and 0.5 micrometers, on the adhesion/barrier layer 89*a*. The metal layer 89*c* can be triple metal layers including an electroplated copper layer having a thickness larger than 3 micrometers, such as between 5 and 150 micrometers, and preferably between 10 and 100 micrometers, on the copper seed layer 89*b* and over the contact points of the metal layers 8122 and 8212 exposed by the openings 980, an electroplated or electroless plated nickel layer having a thickness larger than 1 micrometer, such as between 1 and 15 micrometers, and preferably between 2 and 10 micrometers, on the electroplated copper layer and over the contact points of the metal layers 8122 and 8212 exposed by the openings 980, and an electroplated or electroless plated gold layer having a thickness between 0.005 and 1 micrometers, and preferably between 0.05 and 0.1 micrometers, on the electroplated or electroless plated nickel layer and over the contact points of the metal layers 8122 and 8212 exposed by the openings 980. Sidewalls of the metal layer 89*c* are not covered by the adhesion/barrier layer 89*a* and the copper seed layer 89*b*.

Alternatively, the metal layer 89*a* can be an adhesion/barrier layer that can be a titanium-containing layer, such as titanium layer, titanium-tungsten-alloy layer or titanium-nitride layer, a tantalum-containing layer, such as tantalum layer or tantalum-nitride layer, or a chromium-containing layer, such as chromium layer, having a thickness smaller than 1 micrometer, such as between 0.005 and 0.9 micrometers, and preferably between 0.05 and 0.5 micrometers, on the polymer layer 98 and on the contact points of the metal layers 8122 and 8212 exposed by the openings 980. The metal layer 89*b* can be a copper seed layer having a thickness smaller than 1 micrometer, such as between 0.005 and 0.9 micrometers, and preferably between 0.05 and 0.5 micrometers, on the adhesion/barrier layer 89*a*. The metal layer 89*c* can be triple metal layers including an electroplated copper layer having a thickness larger than 3 micrometers, such as between 5 and 150 micrometers, and preferably between 10 and 100 micrometers, on the copper seed layer 89*b* and over the contact points of the metal layers 8122 and 8212 exposed by the openings 980, an electroplated or electroless plated nickel layer having a thickness larger than 1 micrometer, such as between 1 and 15 micrometers, and preferably between 2 and 10 micrometers, on the electroplated copper layer and over the contact points of the metal layers 8122 and 8212 exposed by the openings 980, and a solder bump that can be a bismuth-containing bump, an indium-containing bump or a tin-containing bump of a tin-lead alloy, a tin-silver alloy or a tin-silver-copper alloy, having a thickness larger than 5 micrometers, such as between 5 and 150 micrometers, and preferably between 10 and 100 micrometers, on the electroplated or electroless plated nickel layer and over the contact points of the metal layers 8122 and 8212 exposed by the openings 980. Sidewalls of the metal layer 89*c* are not covered by the adhesion/barrier layer 89*a* and the copper seed layer 89*b*.

After forming the structure shown in FIG. 30L, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 connected to the bulk metal layer 9 of the semiconductor chip may connect the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit. A second metal bump or pillar 27 connected to the bulk metal layer 9 of the semiconductor chip may connect the contact point 36*a* of the coil 36 to the first external circuit to output a regulated or converted power voltage Vcc to the first external circuit. A third metal bump or pillar 27 connected to the bulk metal layer 9 of the semiconductor chip may connect the metal interconnect 88*a* to a ground bus or plane of the first external circuit. A first metal bump 89 connected the metal trace, bus or plane 81 of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal bumps 89 connected to the ground plane, bus or trace 82 of the semiconductor chip may be connected to a ground bus or plane of the second external circuit.

Alternatively, in the chip package, a first metal bump 89 connected to the metal trace, bus or plane 81P of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal bump 89 connected the metal trace, bus or plane 81 of the semiconductor chip may be connected to the first external circuit to output a regulated or converted power voltage Vcc to the first external circuit. Multiple third metal bumps 89 connected to the ground plane, bus or trace 82 of the semiconductor chip may be connected to a ground bus or plane of the first external circuit. A first metal bump or pillar 27 connected to the bulk metal layer 9 of the semiconductor chip may connect the contact point 36*a* of the coil 36 to a second external circuit, such as semiconductor chip, printed circuit board, ball-grid-array (BGA) substrate, metal substrate, glass substrate or ceramic substrate, to output the regulated or converted power voltage Vcc to the second external circuit. A second metal bump or pillar 27 connected to the bulk metal layer 9 of the semiconductor chip may connect the metal interconnect 88*a* to a ground bus or plane of the second external circuit.

FIGS. 30M and 30N show a process for forming a semiconductor wafer according to the present disclosure. Referring to FIG. 30M, the semiconductor wafer 10 illustrated in FIG. 30A includes multiple openings 519, 519', 521, 522 and 524 in the passivation layer 5 to expose multiple regions 600*a* of the metal traces or pads 600, and multiple metal pads, bumps or traces 34*a* provided by two metal layers 32 and 34 can be formed on the passivation layer 5 and on the regions 600*a* of the metal traces or pads 600 exposed by the openings 519, 519', 521, 522 and 524, which can be referred to as the steps illustrated in FIG. 25N. The openings 519, 519', 521, 522 and 524 are over the regions 600*a* of the metal traces or pads 600, and the regions 600*a* of the metal traces or pads 600 are at bottoms of the openings 519, 519', 521, 522 and 524.

Referring to FIG. 30N, after forming the metal pads, bumps or traces 34*a*, the silicon substrate 1 is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the coil 36, the metal interconnect 88*a*, the polymer layer 14 and the metal bumps or pillars 27 can be formed in the through silicon vias 11*a*, 11*d*, 11*e* and 11*f* and at the backside 1*a* of the thinned silicon substrate 1, which can be referred to as the steps illustrated in FIGS. 30B-30E and 30G-30I. Accordingly, a bottom scheme 103 same as the bottom scheme 103 shown in FIG. 30I can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 519, 519', 521, 522 and 524 can be performed after forming the metal bumps or pillars 27.

After forming the structure shown in FIG. 30N, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 connected to the bulk metal layer 9 of the semiconductor chip may connect the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit. A second metal bump or pillar 27 connected to the bulk metal layer 9 of the semiconductor chip may connect the contact point 36*a* of the coil 36 to the first external circuit to output a regulated or converted power voltage Vcc to the first external circuit. A third metal bump or pillar 27 connected to the bulk metal layer 9 of the semiconductor chip may connect the metal interconnect 88*a* to a ground bus or plane of the first external circuit. A first metal pad, bump or trace 34*a* connected the fine-line metal trace 619' of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal pads, bumps or traces 34_a_ connected to the fine-line metal traces 621, 622 and 624 of the semiconductor chip may be connected to a ground bus or plane of the second external circuit.

Alternatively, in the chip package, a first metal pad, bump or trace 34_a_ connected to the fine-line metal trace 619 of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal pad, bump or trace 34_a_ connected to the fine-line metal trace 619' of the semiconductor chip may be connected to the first external circuit to output a regulated or converted power voltage Vcc to the first external circuit. Multiple third metal pads, bumps or traces 34_a_ connected to the fine-line metal traces 621, 622 and 624 of the semiconductor chip may be connected to a ground bus or plane of the first external circuit. A first metal bump or pillar 27 connected to the bulk metal layer 9 of the semiconductor chip may connect the contact point 36_a_ of the coil 36 to a second external circuit, such as semiconductor chip, printed circuit board, ball-grid-array (BGA) substrate, metal substrate, glass substrate or ceramic substrate, to output the regulated or converted power voltage Vcc to the second external circuit. A second metal bump or pillar 27 connected to the bulk metal layer 9 of the semiconductor chip may connect the metal interconnect 88_a_ to a ground bus or plane of the second external circuit.

In the following, FIGS. 31A-31F show a process for forming multiple metal bumps or pillars 27 on the bulk metal layer 9 of the semiconductor wafer 10 for being used to connect the coil 36 to the first external circuit and/or the second external circuit and connect the metal interconnect 88_a_ to the first external circuit or the second external circuit.

Referring to FIG. 31A, after the steps illustrated in FIGS. 30B and 30C, a photoresist layer 51, such as positive-type photoresist layer or negative-type photoresist layer, having a thickness larger than 1 micrometer, such as between 1 and 200 micrometers, and preferably between 2 and 150 micrometers, can be formed on the photoresist layer 29 and on the topmost layer of copper, gold, aluminum, nickel or palladium of the previously described various bulk metal layer 9 by a spin-on coating process, a lamination process, a screen-printing process or a spraying process. Next, the photoresist layer 51 is patterned with the processes of exposure and development to form multiple openings 51_a_ in the photoresist layer 51 exposing multiple regions of the topmost layer of copper, gold, aluminum, nickel or palladium of the previously described various bulk metal layer 9. A 1× stepper or 1× contact aligner can be used to expose the photoresist layer 51 during the process of exposure. Each of the three openings 51_a_ has a width W3 larger than 5 micrometers, such as between 10 and 30 micrometers, between 20 and 50 micrometers or between 50 and 150 micrometers. The process of forming the photoresist layer 51 and the openings 51_a_ in the photoresist layer 51 as shown in FIG. 31A can be referred to as the process of forming the photoresist layer 51 and the openings 51_a_ in the photoresist layer 51 as illustrated in FIG. 26A.

Referring to FIG. 31B, after the step illustrated in FIG. 31A, the metal bumps or pillars 27 having a thickness larger than 1 micrometer are formed in the openings 51_a_ and on the regions of the topmost layer of copper, gold, aluminum, nickel or palladium of the previously described various bulk metal layer 9 exposed by the openings 51_a_. The material of the three metal bumps or pillars 27 may include gold, nickel, tin, solder, palladium, copper, aluminum or a composite of the previously described materials. The process of forming the metal bumps or pillars 27 in the openings 51_a_ and on the regions of the topmost layer of copper, gold, aluminum, nickel or palladium of the previously described various bulk metal layer 9 exposed by the openings 51_a_ as shown in FIG. 31B can be referred to as the process of forming the metal bumps or pillars 27 in the openings 51_a_ and on the regions 9_a_ of the topmost layer of copper, gold, aluminum, nickel or palladium of the previously described various bulk metal layer 9 exposed by the openings 51_a_ as illustrated in FIG. 26B. The specification of the metal bumps or pillars 27 shown in FIG. 31B can be referred to as the specification of the metal bumps or pillars 27 as illustrated in FIG. 26B.

Referring to FIG. 31C, after forming the metal bumps or pillars 27, the photoresist layers 29 and 51 are removed using an inorganic solution or using an organic solution with amide. Some residuals from the photoresist layers 29 and 51 could remain on the seed layer 4_b_ of the metal layer 4, on the bulk metal layer 9 and on the metal bumps or pillars 27. Thereafter, the residuals can be removed from the seed layer 4_b_ of the metal layer 4, from the bulk metal layer 9 and from the metal bumps or pillars 27 with a plasma, such as an $O_2$ plasma or a plasma containing fluorine of below 200 PPM and oxygen.

Accordingly, the metal bumps or pillars 27 are formed on the bulk metal layer 9 and contact with the bulk metal layer 9 after removing the photoresist layers 29 and 51. Each of the metal bumps or pillars 27 has a width W3 larger than 5 micrometers, such as between 10 and 30 micrometers, between 20 and 50 micrometers or between 50 and 150 micrometers, and larger than that of each of the fine-line metal layers 60, and has a height H1 larger than 1 micrometer, such as between 1 and 300 micrometers, between 5 and 250 micrometers, between 10 and 100 micrometers or between 5 and 50 micrometers.

Alternatively, another process for forming the metal bumps or pillars 27 on the bulk metal layer 9 can be performed by the following steps. Referring to FIG. 31D, after the steps illustrated in FIGS. 30B-30D, the photoresist layer 51 illustrated in FIG. 31A can be formed on the topmost layer of copper, gold, aluminum, nickel or palladium of the previously described various bulk metal layer 9 and on the seed layer 4_b_ of the metal layer 4 by a spin-on coating process, a lamination process, a screen-printing process or a spraying process. Next, the photoresist layer 51 is patterned with the processes of exposure and development to form the openings 51_a_ in the photoresist layer 51 exposing the regions of the topmost layer of copper, gold, aluminum, nickel or palladium of the previously described various bulk metal layer 9. Each of the openings 51_a_ has a width W3 larger than 5 micrometers, such as between 10 and 30 micrometers, between 20 and 50 micrometers or between 50 and 150 micrometers. The process of forming the photoresist layer 51 and the openings 51_a_ in the photoresist layer 51 as shown in FIG. 31D can be referred to as the process of forming the photoresist layer 51 and the openings 51_a_ in the photoresist layer 51 as illustrated in FIG. 26A.

Referring to FIG. 31E, after the step illustrated in FIG. 31D, the metal bumps or pillars 27 having a thickness larger than 1 micrometer are formed in the openings 51_a_ and on the regions of the topmost layer of copper, gold, aluminum, nickel or palladium of the previously described various bulk metal layer 9 exposed by the openings 51_a_. The material of the metal bumps or pillars 27 may include gold, nickel, tin, solder, palladium, copper, aluminum or a composite of the previously described materials. The process of forming the metal bumps or pillars 27 in the openings 51*a* and on the regions of the topmost layer of copper, gold, aluminum, nickel or palladium of the previously described various bulk metal layer 9 exposed by the openings 51*a* as shown in FIG. 31E can be referred to as the process of forming the metal bumps or pillars 27 in the openings 51*a* and on the regions 9*a* of the topmost layer of copper, gold, aluminum, nickel or palladium of the previously described various bulk metal layer 9 exposed by the openings 51*a* as illustrated in FIG. 26B. The specification of the metal bumps or pillars 27 shown in FIG. 31E can be referred to as the specification of the metal bumps or pillars 27 as illustrated in FIG. 26B.

After forming the metal bumps or pillars 27 as illustrated in FIG. 31E, the photoresist layer 51 is removed using an inorganic solution or using an organic solution with amide. Accordingly, the metal bumps or pillars 27 can be formed on the bulk metal layer 9 after removing the photoresist layer 51.

Referring to FIG. 31F, after removing the photoresist layers 29 and 51, the metal layer 4 not under the bulk metal layer 9 is removed by etching the seed layer 4*b* not under the bulk metal layer 9, and then etching the adhesion/barrier layer 4*a* not under the bulk metal layer 9. The process of removing the seed layer 4*b* not under the bulk metal layer 9 and the adhesion/barrier layer 4*a* not under the bulk metal layer 9 as shown in FIG. 31F can be referred to as the process of removing the seed layer 4*b* not under the bulk metal layer 9 and the adhesion/barrier layer 4*a* not under the bulk metal layer 9 as illustrated in FIG. 25F.

Accordingly, the coil 36 and the metal interconnect 88*a* are formed on the insulating layer 3 and at the backside 1*a* of the thinned silicon substrate 1, and the three metal bumps or pillars 27 are directly formed on the bulk metal layer 9. The specification of the coil 36 and the metal interconnect 88*a* shown in FIG. 31F can be referred to as the specification of the coil 36 and the metal interconnect 88*a* as illustrated in FIG. 30E, respectively. FIG. 30F shows a top view of the coil 36 shown in FIG. 31F. The metal bumps or pillars 27 on the bulk metal layer 9 can be used to connect the coil 36 to the first external circuit and/or the second external circuit and connect the metal interconnect 88*a* to the first external circuit or the second external circuit.

Referring to FIG. 31G, after the step illustrated in FIG. 31F, a polymer layer 14 is formed on the topmost layer of copper, gold, aluminum, nickel or palladium of the previously described various bulk metal layer 9, on the insulating layer 3 and at the backside 1*a* of the thinned silicon substrate 1, and multiple openings 14*a* are formed in the polymer layer 14 to uncover top surfaces and sidewalls of the metal bumps or pillars 27. Accordingly, a bottom scheme 103 at the backside 1*a* of the thinned silicon substrate 1 is formed with the insulating layer 3, the coil 36, the metal interconnect 88*a*, the polymer layer 14 and the metal bumps or pillars 27, and the openings 14*a* in the polymer layer 14 are over the bulk metal layer 9. After the step illustrated in FIG. 31G, the semiconductor wafer 10 can be cut into a plurality of individual semiconductor chip by a die-sawing process.

Alternatively, after the step illustrated in FIG. 31G, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 30B, 30C and 31A-31G. After the steps illustrated in FIGS. 30B, 30C and 31A-31G, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, for example, a first metal bump or pillar 27 on the bulk metal layer 9 of the semiconductor chip may connect the contact point 36*b* of the coil 36 to the power bus or plane of the first external circuit to receive the external power voltage Vdd from the first external circuit. A second metal bump or pillar 27 on the bulk metal layer 9 of the semiconductor chip may connect the contact point 36*a* of the coil 36 to the first external circuit or the second external circuit to output the regulated or converted power voltage Vcc to the first external circuit or the second external circuit. A third metal bump or pillar 27 on the bulk metal layer 9 of the semiconductor chip may connect the metal interconnect 88*a* to the ground bus or plane of the first external circuit or the second external circuit.

FIGS. 31H and 31I are cross sectional views showing a process for forming a semiconductor wafer, which can be formed by a suitable process or processes, e.g., by the following steps. Referring to FIG. 31H, the silicon substrate 1 of the semiconductor wafer 10 illustrated in FIG. 30J is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the coil 36, the metal interconnect 88*a*, the polymer layer 14 and the metal bumps or pillars 27 can be formed in the through silicon vias 11*a*, 11*d*, 11*e* and 11*f* and at the backside 1*a* of the thinned silicon substrate 1, which can be referred to as the steps illustrated in FIGS. 30B, 30C and 31A-31G. Accordingly, a bottom scheme 103 same as the bottom scheme 103 shown in FIG. 31G can be formed at the backside 1*a* of the thinned silicon substrate 1.

Referring to FIG. 31I, after forming the structure shown in FIG. 31H, the flux 32 is removed. Next, using the steps illustrated in FIGS. 15D-15H, multiple patterned circuit layers 812 composed of an adhesion/barrier/seed layer 8121 and a metal layer 8122 can be formed on the passivation layer 5 and on the regions 600*a* of the metal traces or pads 600 exposed by the openings 519 and 519', and a patterned circuit layer 821 composed of an adhesion/barrier/seed layer 8211 and a metal layer 8212 can be formed on the passivation layer 5 and on the regions 600*a* of the metal traces or pads 600 exposed by the openings 521, 522 and 524. Next, a polymer layer 98 is formed on the metal layer 8122 of the patterned circuit layers 812, on the metal layer 8212 of the patterned circuit layer 821 and on the passivation layer 5, and multiple openings 980 in the polymer layer 98 are over multiple contact points of the metal layers 8122 and 8212 and expose them, which can be referred to as the step illustrated in FIG. 15I. Next, multiple metal bumps 89 provided by triple metal layers 89*a*, 89*b* and 89*c* are formed on the polymer layer 98 and on the contact points of the metal layers 8122 and 8212 exposed by the openings 980, which can be referred to as the step illustrated in FIG. 30L. The specification of the metal bumps 89 shown in FIG. 31I can be referred to as the specification of the metal bumps 89 as illustrated in FIG. 30L. Accordingly, an over-passivation scheme 102 is formed with the patterned circuit layers 812 and 821, the polymer layer 98 and the metal bumps 89, at the active side of the thinned silicon substrate 1. Alternatively, each of the over-passivation schemes 102 illustrated in FIGS. 15H, 15K-15M, 16L, 16M, 17J, 18I, 19H and 20 can be formed over the passivation layer 5 at the active side of the thinned silicon substrate 1.

After forming the structure shown in FIG. 31I, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 on the bulk metal layer 9 of the semiconductor chip may connect the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit. A second metal bump or pillar 27 on the bulk metal layer 9 of the semiconductor chip may connect the contact point 36*a* of the coil 36 to the first external circuit to output a regulated or converted power voltage Vcc to the first external circuit. A third metal bump or pillar 27 on the bulk metal layer 9 of the semiconductor chip may connect the metal interconnect 88*a* to a ground bus or plane of the first external circuit. A first metal bump 89 connected the metal trace, bus or plane 81 of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal bumps 89 connected to the ground plane, bus or trace 82 of the semiconductor chip may be connected to a ground bus or plane of the second external circuit.

Alternatively, in the chip package, a first metal bump 89 connected to the metal trace, bus or plane 81P of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal bump 89 connected the metal trace, bus or plane 81 of the semiconductor chip may be connected to the first external circuit to output a regulated or converted power voltage Vcc to the first external circuit. Multiple third metal bumps 89 connected to the ground plane, bus or trace 82 of the semiconductor chip may be connected to a ground bus or plane of the first external circuit. A first metal bump or pillar 27 on the bulk metal layer 9 of the semiconductor chip may connect the contact point 36*a* of the coil 36 to a second external circuit, such as semiconductor chip, printed circuit board, ball-grid-array (BGA) substrate, metal substrate, glass substrate or ceramic substrate, to output the regulated or converted power voltage Vcc to the second external circuit. A second metal bump or pillar 27 on the bulk metal layer 9 of the semiconductor chip may connect the metal interconnect 88*a* to a ground bus or plane of the second external circuit.

FIG. 31J is a cross sectional view showing a process for forming a semiconductor wafer, which can be formed by a suitable process or processes, e.g., by the following steps. First, the silicon substrate 1 of the semiconductor wafer 10 illustrated in FIG. 30M is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the coil 36, the metal interconnect 88*a*, the polymer layer 14 and the metal bumps or pillars 27 can be formed in the through silicon vias 11*a*, 11*d*, 11*e* and 11*f* and at the backside 1*a* of the thinned silicon substrate 1, which can be referred to as the steps illustrated in FIGS. 30B, 30C and 31A-31G. Accordingly, a bottom scheme 103 same as the bottom scheme 103 shown in FIG. 31G can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 519, 519', 521, 522 and 524 can be performed after forming the polymer layer 14.

After forming the structure shown in FIG. 31J, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 on the bulk metal layer 9 of the semiconductor chip may connect the contact point 36*b* of the coil 36 to a power bus or plane of a first external circuit, such as ball-grid-array (BGA) substrate, printed circuit board, semiconductor chip, metal substrate, glass substrate or ceramic substrate, to receive an external power voltage Vdd from the first external circuit. A second metal bump or pillar 27 on the bulk metal layer 9 of the semiconductor chip may connect the contact point 36*a* of the coil 36 to the first external circuit to output a regulated or converted power voltage Vcc to the first external circuit. A third metal bump or pillar 27 on the bulk metal layer 9 of the semiconductor chip may connect the metal interconnect 88*a* to a ground bus or plane of the first external circuit. A first metal pad, bump or trace 34*a* connected the fine-line metal trace 619' of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal pads, bumps or traces 34*a* connected to the fine-line metal traces 621, 622 and 624 of the semiconductor chip may be connected to a ground bus or plane of the second external circuit.

Alternatively, in the chip package, a first metal pad, bump or trace 34*a* connected to the fine-line metal trace 619 of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal pad, bump or trace 34*a* connected to the fine-line metal trace 619' of the semiconductor chip may be connected to the first external circuit to output a regulated or converted power voltage Vcc to the first external circuit. Multiple third metal pads, bumps or traces 34*a* connected to the fine-line metal traces 621, 622 and 624 of the semiconductor chip may be connected to a ground bus or plane of the first external circuit. A first metal bump or pillar 27 on the bulk metal layer 9 of the semiconductor chip may connect the contact point 36*a* of the coil 36 to a second external circuit, such as semiconductor chip, printed circuit board, ball-grid-array (BGA) substrate, metal substrate, glass substrate or ceramic substrate, to output the regulated or converted power voltage Vcc to the second external circuit. A second metal bump or pillar 27 on the bulk metal layer 9 of the semiconductor chip may connect the metal interconnect 88*a* to a ground bus or plane of the second external circuit.

In the following, a process illustrated in FIGS. 32A-32N is introduced for forming the capacitor 87 in FIGS. 29A, 29B and 29D. Referring to FIG. 32A, the silicon substrate 1 of the semiconductor wafer 10 illustrated FIG. 30A is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, multiple through-silicon vias 11*a*, 11*d*, 11*e* and 11*f* can be formed in the thinned silicon substrate 1 and in at least one dielectric layer 30, exposing multiple regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. The through-silicon vias 11*a*, 11*d*, 11*e* and 11*f* penetrate completely through the thinned silicon substrate 1 and the dielectric layer(s) 30. The process of forming the through-silicon via 11*f* in the thinned silicon substrate 1 and in the dielectric layer 30 and forming the insulating layer 3 on the sidewall of the through-silicon via 11*f* as shown in FIG. 32A can be referred to as the process of forming the through-silicon vias 11*a*, 11*b*, 11*c*, 11*d* and 11*e* in the thinned silicon substrate 1 and in the dielectric layer(s) 30 and forming the insulating layer 3 on the sidewalls of the through-silicon vias 11*a*, 11*b*, 11*c*, 11*d* and 11*e* as illustrated in FIGS. 24C-24H or FIGS. 24I-24N. Next, the metal layer 4 composed of the adhesion/barrier layer 4*a* and the seed layer 4*b* can be formed in the through-silicon vias 11*a*, 11*d*, 11*e* and 11*f* and on the insulating layer 3, which can be referred to as the step illustrated in FIG. 25A.

After forming the seed layer 4*b* of the metal layer 4, a photoresist layer 29, such as positive-type photoresist layer or negative-type photoresist layer, having a thickness larger than 1.5 micrometers, such as between 5 and 50 micrometers, and preferably between 10 and 25 micrometers, can be formed on the seed layer 4*b* of the metal layer 4 by a spin-on coating process, a lamination process, a screen-printing process or a spraying process. Next, the photoresist layer 29 is patterned with the processes of exposure and development to form multiple openings 29*a* in the photoresist layer 29 exposing the seed layer 4*b* of the metal layer 4. A 1× stepper or 1× contact aligner can be used to expose the photoresist layer 29 during the process of exposure. The process of forming the photoresist layer 29 on the seed layer 4*b* and forming the openings 29*a* in the photoresist layer 29 as shown in FIG. 32A can be referred to as the process of forming the photoresist layer 29 on the seed layer 4*b* and forming the openings 29*a* in the photoresist layer 29 as illustrated in FIGS. 25B-25C.

Next, referring to FIG. 32B, a bulk metal layer 9 can be formed in the openings 29*a* and on the seed layer 4*b* of the metal layer 4 exposed by the openings 29*a* by a process including an electroplating process. The process of forming the bulk metal layer 9 in the openings 29*a* and on the seed layer 4*b* of the metal layer 4 exposed by the openings 29*a* as shown in FIG. 32B can be referred to as the process of forming the bulk metal layer 9 in the openings 29*a* and on the seed layer 4*b* of the metal layer 4 exposed by the openings 29*a* as illustrated in FIG. 25D. The specification of the bulk metal layer 9 shown in FIG. 32B can be referred to as the specification of the bulk metal layer 9 as illustrated in FIG. 25D.

Referring to FIG. 32C, after the step illustrated in FIG. 32B, the photoresist layer 29 is removed using an inorganic solution or using an organic solution with amide. Some residuals from the photoresist layer 29 could remain on the bulk metal layer 9 and on the seed layer 4*b* of the metal layer 4. Thereafter, the residuals can be removed from the bulk metal layer 9 and from the seed layer 4*b* of the metal layer 4 with a plasma, such as an $O_2$ plasma or a plasma containing fluorine of below 200 PPM and oxygen.

Referring to FIG. 32D, after the step illustrated in FIG. 32C, the metal layer 4 not under the bulk metal layer 9 is removed by etching the seed layer 4*b* not under the bulk metal layer 9, and then etching the adhesion/barrier layer 4*a* not under the bulk metal layer 9. The process of removing the seed layer 4*b* not under the bulk metal layer 9 and removing the adhesion/barrier layer 4*a* not under the bulk metal layer 9 as shown in FIG. 32D can be referred to as the process of removing the seed layer 4*b* not under the bulk metal layer 9 and removing the adhesion/barrier layer 4*a* not under the bulk metal layer 9 as illustrated in FIG. 25F.

Next, referring to FIG. 32E, a dielectric layer 85 is formed on the topmost layer of copper, gold, aluminum, nickel or palladium of the previously described various bulk metal layer 9 and on the insulating layer 3 not under the metal layers 4 and 9 by a chemical vapor deposition (CVD) process. The dielectric layer 85 can be a single layer of titanium dioxide ($TiO_2$), tantalum pentoxide ($Ta_2O_5$), silicon nitride ($Si_3N_4$), silicon dioxide ($SiO_2$) or a polymer, or a composite layer made of the previously described materials. The dielectric layer 85 has a thickness t8 larger than 10 angstroms, such as between 10 and 50 angstroms, between 50 and 1,000 angstroms or between 100 and 10,000 angstroms.

Next, referring to FIG. 32F, a photoresist layer 86, such as positive-type photoresist layer or negative-type photoresist layer, is formed on the dielectric layer 85 by a spin-on coating process, a lamination process, a screen-printing process or a spraying process. Next, the photoresist layer 86 is patterned with the processes of exposure and development, and a 1× stepper or 1× contact aligner can be used to expose the photoresist layer 86 during the process of exposure. Next, referring to FIG. 32G, the dielectric layer 85 not under the photoresist layer 86 is removed with a dry etching method, such as enhanced plasma etching method.

Next, referring to FIG. 32H, the photoresist layer 86 is removed using an inorganic solution or using an organic solution with amide. Some residuals from the photoresist layer 86 could remain on the bulk metal layer 9. Thereafter, the residuals can be removed from the bulk metal layer 9 with a plasma, such as an $O_2$ plasma or a plasma containing fluorine of below 200 PPM and oxygen.

Referring to FIG. 32I, after removing the polymer layer 86, a polymer layer 14 is formed on the insulating layer 3, on the dielectric layer 85 and on the topmost layer of copper, gold, aluminum, nickel or palladium of the previously described various bulk metal layer 9 by a process including a spin-on coating process, a lamination process, a screen-printing process or a spraying process and including a curing process, and multiple openings 14*a* in the polymer layer 14 expose the dielectric layer 85 and the bulk metal layer 9. The polymer layer 14 may have a thickness larger than 2 micrometers, such as between 3 and 50 micrometers, and preferably between 5 and 25 micrometers. The material of the polymer layer 14 may include benzocyclobutane (BCB), polyimide (PI), polybenzoxazole (PBO) or epoxy resin. The process of forming the polymer layer 14 and the openings 14*a* in the polymer layer 14 as shown in FIG. 32I can be referred to as the process of forming the polymer layer 14 and the opening 14*a* in the polymer layer 14 as illustrated in FIG. 25G.

Next, referring to FIG. 32J, an adhesion/barrier layer 64 having a thickness smaller than 1 micrometer, such as between 0.02 and 0.5 micrometers, and preferably between 0.1 and 0.2 micrometers, can be formed on the polymer layer 14, on the topmost layer of copper, gold, aluminum, nickel or palladium of the previously described various bulk metal layer 9 exposed by the openings 14*a* and on the dielectric layer 85 exposed by the opening 14*a* by using a physical vapor deposition (PVD) process, such as sputtering process or evaporation process, and then a seed layer 65 having a thickness smaller than 1 micrometer, such as between 0.05 and 0.5 micrometers, and preferably between 0.08 and 0.15 micrometers, can be formed on the adhesion/barrier layer 64 by using a physical vapor deposition (PVD) process, such as sputtering process or evaporation process. The material of the adhesion/barrier layer 64 may include titanium, a titanium-tungsten alloy, titanium nitride, chromium, tantalum, tantalum nitride or a composite of the previously described materials, and the material of the seed layer 65 may include copper, nickel, aluminum, gold, platinum, silver or palladium.

For example, when the adhesion/barrier layer 64 is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 14, on the topmost layer of copper, gold, aluminum, nickel or palladium of the previously described various bulk metal layer 9 exposed by the openings 14*a* and on the dielectric layer 85 exposed by the opening 14*a*, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the adhesion/barrier layer 64 is formed by a suitable process or processes, e.g., by sputtering a composite layer including a titanium layer having a thickness between 0.01 and 0.15 micrometers on the polymer layer 14, on the topmost layer of copper, gold, aluminum, nickel or palladium of the previously described various bulk metal layer 9 exposed by the openings 14*a* and on the dielectric layer 85 exposed by the opening 14*a* and a titanium-tungsten-alloy layer having a thickness between 0.1 and 0.35 micrometers on the titanium layer, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-tungsten-alloy layer.

Alternatively, when the adhesion/barrier layer 64 is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 14, on the topmost layer of copper, gold, aluminum, nickel or palladium of the previously described various bulk metal layer 9 exposed by the openings 14*a* and on the dielectric layer 85 exposed by the opening 14*a*, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the adhesion/barrier layer 64 is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 14, on the topmost layer of copper, gold, aluminum, nickel or palladium of the previously described various bulk metal layer 9 exposed by the openings 14*a* and on the dielectric layer 85 exposed by the opening 14*a*, the seed layer 65 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

Referring to FIG. 32K, after forming the seed layer 65, a photoresist layer 67, such as positive-type photoresist layer or negative-type photoresist layer, having a thickness larger than 1 micrometer, such as between 5 and 50 micrometers, and preferably between 10 and 25 micrometers, is formed on the seed layer 65 of any previously described material by a spin-on coating process, a lamination process, a screen-printing process or a spraying process. Next, the photoresist layer 67 is patterned with the processes of exposure and development to form two openings 67*a* in the photoresist layer 67 exposing the seed layer 65 of any previously described material. The process of forming the photoresist layer 67 and forming the two openings 67*a* in the photoresist layer 67 as shown in FIG. 32K can be referred to as the process of forming the photoresist layer 67 and forming the openings 67*a* in the photoresist layer 67 as illustrated in FIG. 27J.

Next, referring to FIG. 32L, a metal layer 68 having a thickness larger than 1 micrometer, such as between 1 and 50 micrometers, and preferably between 2 and 20 micrometers, can be electroplated in the two openings 67*a* and on the seed layer 65 of any previously described material exposed by the two openings 67*a*. The metal layer 68 may be a single layer of gold, copper, silver, palladium, platinum, rhodium, ruthenium, rhenium or nickel, or a composite layer made of the previously described metals. The process of forming the metal layer 68 as shown in FIG. 32L can be referred to as the process of forming the metal layer 68 as illustrated in FIG. 27K. The specification of the metal layer 68 shown in FIG. 32L can be referred to as the specification of the metal layer 68 as illustrated in FIG. 27K.

Referring to FIG. 32M, after forming the metal layer 68 is formed, the photoresist layer 67 can be removed using an inorganic solution or using an organic solution with amide. Some residuals from the photoresist layer 67 could remain on the metal layer 68 and on the seed layer 65 not under the metal layer 68. Thereafter, the residuals can be removed from the metal layer 68 and from the seed layer 65 with a plasma, such as an $O_2$ plasma or a plasma containing fluorine of below 200 PPM and oxygen.

Next, referring to FIG. 32N, the seed layer 65 and the adhesion/barrier layer 64 not under the metal layer 68 are subsequently removed with an etching method, which can be referred to as the step illustrated in FIG. 27M. Accordingly, the capacitor 87 and the metal interconnect 88*b* can be formed on the insulating layer 3 of the semiconductor wafer 10 and at the backside 1*a* of the thinned silicon substrate 1. The metal interconnect 88*b* at the backside 1*a* of the thinned silicon substrate 1 can be provided by the metal layers 9 and 68 or provided by the metal layer 9. The metal interconnect 88*b* can be connected to the voltage regulator or converter circuit 41 through the bulk metal layer 9 in the through-silicon via 11*a* and through the fine-line metal structure 619, and can be connected to the previously described inductor 36.

The capacitor 87 at the backside 1*a* of the thinned silicon substrate 1 can be composed of a lower plate 87*a*, an upper plate 87*b* over the lower plate 87*a* and the dielectric layer 85 between the lower plate 87*a* and the upper plate 87*b*. The lower plate 87*a* composed of the metal layer 4 and the bulk metal layer 9 can be connected to the voltage regulator or the converter circuit 41 through the bulk metal layer 9 in the through-silicon via 11*f* and through the fine-line metal trace 619'. The upper plate 87*b* composed of the adhesion/barrier layer 64, the seed layer 65 and the metal layer 68 can be connected to the internal circuits 22 and 23 through the bulk metal layer 9 in the through-silicon via 11*d* and through the fine-line metal trace 622 and to the internal circuit 24 through the bulk metal layer 9 in the through-silicon via 11*e* and through the fine-line metal trace 624.

In FIG. 32N, a bottom scheme 103 at the backside 1*a* of the thinned silicon substrate 1 is formed with the insulating layer 3, the capacitor 87, the metal interconnect 88*b*, the polymer layer 14 and the dielectric layer 85, and the openings 14*a* in the polymer layer 14 are over the bulk metal layer 9.

After forming the structure shown in FIG. 32N, using a die-sawing process, the semiconductor wafer 10 can be cut into a plurality of individual semiconductor chip. After the die-sawing process, the semiconductor chip cut from the semiconductor wafer 10 can be packaged for a chip package. In the chip package, for example, there is no metal bump or wirebonded wire formed on the metal layer 68 of the semiconductor chip for connecting the capacitor 87 or the metal interconnect 88*b* to an external circuit.

Alternatively, in the chip package, there is a first wirebonded wire, such as gold wirebonded wire or copper wirebonded wire, bonded on the metal layer 68 of the metal interconnect 88*b* of the semiconductor chip for connecting the metal interconnect 88*b* to a power bus or plane of a first external circuit, such as ball-grid-array (BGA) substrate, printed circuit board, semiconductor chip, metal substrate, glass substrate or ceramic substrate, to receive an external power voltage Vdd from the first external circuit, and there is a second wirebonded wire, such as gold wirebonded wire or copper wirebonded wire, bonded on the metal layer 68 of the semiconductor chip for connecting the capacitor 87 to a ground bus or plane of the first external circuit or to a ground bus or plane of a second external circuit, such as printed circuit board, semiconductor chip, ball-grid-array (BGA) substrate, metal substrate, glass substrate or ceramic substrate.

Alternatively, in the chip package, there is a first metal bump, such as gold bump, copper bump, nickel bump or solder bump, connected to the metal layer 68 of the metal interconnect 88*b* of the semiconductor chip for connecting the metal interconnect 88*b* to a power bus or plane of a first external circuit, such as ball-grid-array (BGA) substrate, printed circuit board, semiconductor chip, metal substrate, glass substrate or ceramic substrate, to receive an external power voltage Vdd from the first external circuit, and there is a second metal bump, such as gold bump, copper bump, nickel bump or solder bump, connected to the metal layer 68 of the semiconductor chip for connecting the capacitor 87 to a ground bus or plane of the first external circuit or to a ground bus or plane of a second external circuit, such as printed circuit board, semiconductor chip, ball-grid-array (BGA) substrate, metal substrate, glass substrate or ceramic substrate.

In the following, FIGS. 32O-32R show a process for forming two metal bumps or pillars 27 over the metal layer 68 of the semiconductor wafer 10 for being used to connect the metal interconnect 88*b* to a first external circuit, such as printed circuit board, semiconductor chip, ball-grid-array (BGA) substrate, metal substrate, glass substrate or ceramic substrate, and connect the capacitor 87 to the first external circuit or to a second external circuit, such as printed circuit board, semiconductor chip, ball-grid-array (BGA) substrate, metal substrate, glass substrate or ceramic substrate.

Referring to FIG. 32O, after the step illustrated in FIG. 32N, a polymer layer 143 can be formed on the polymer layer 14 and on the topmost layer of gold, copper, nickel or palladium of the previously described various metal layer 68 by a process including a spin-on coating process, a lamination process, a screen-printing process or a spraying process and including a curing process, and two openings 143*a* in the polymer layer 143 are over two regions of the topmost layer of gold, copper, nickel or palladium of the previously described various metal layer 68 and expose them. The polymer layer 143 has a thickness larger than 2 micrometers, such as between 3 and 50 micrometers, and preferably between 5 and 25 micrometers. The material of the polymer layer 143 may include benzocyclobutane (BCB), polyimide (PI), polybenzoxazole (PBO) or epoxy resin. The process of forming the polymer layer 143 and the two openings 143*a* in the polymer layer 143 as shown in FIG. 32O can be referred to as the process of forming the polymer layer 14 and the openings 14*a* in the polymer layer 14 as illustrated in FIG. 27N. The specification of the polymer layer 143 shown in FIG. 32O can be referred to as the specification of the polymer layer 14 as illustrated in FIG. 27N.

Next, referring to FIG. 32P, an adhesion/barrier layer 16 having a thickness smaller than 1 micrometer, such as between 0.02 and 0.5 micrometers, and preferably between 0.1 and 0.2 micrometers, can be formed on the polymer layer 143 and on the two regions of the topmost layer of gold, copper, nickel or palladium of the previously described various metal layer 68 exposed by the two openings 143*a* by using a physical vapor deposition (PVD) process, such as sputtering process or evaporation process, and then a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The material of the adhesion/barrier layer 16 may include titanium, a titanium-tungsten alloy, titanium nitride, chromium, tantalum, tantalum nitride or a composite of the previously described materials, and the material of the seed layer 18 may include copper, nickel, aluminum, gold, silver, platinum or palladium. The process of forming the adhesion/barrier layer 16 on the polymer layer 143 and on the two regions of the topmost layer of gold, copper, nickel or palladium of the previously described various metal layer 68 exposed by the two openings 143*a* and forming the seed layer 18 on the adhesion/barrier layer 16 as shown in FIG. 32P can be referred to as the process of forming the adhesion/barrier layer 16 on the polymer layer 14 and on the regions of the topmost layer of gold, copper, nickel or palladium of the previously described various metal layer 68 exposed by the openings 14*a*' and forming the seed layer 18 on the adhesion/barrier layer 16 as illustrated in FIG. 27O. The specification of the adhesion/barrier layer 16 and the seed layer 18 as shown in FIG. 32P can be referred to as the specification of the adhesion/barrier layer 16 and the seed layer 18 as illustrated in FIG. 27O, respectively.

Referring to FIG. 32Q, after the step illustrated in FIG. 32P, a photoresist layer 31 can be formed on the seed layer 18 of any previously described material, and two openings 31*a* in the photoresist layer 31 expose the seed layer 18 of any previously described material, which can be referred to as the step illustrated in FIG. 25I. Next, the two metal bumps or pillars 27 can be formed on the seed layer 18 of any previously described material exposed by the two openings 31*a* and in the two openings 31*a*. The process of forming the two metal bumps or pillars 27 on the seed layer 18 of any previously described material exposed by the two openings 31*a* and in the two openings 31*a* as shown in FIG. 32Q can be referred to as the process of forming the metal bump or pillar 27 on the seed layer 18 of any previously described material exposed by the opening 31*a* and in the opening 31*a* as illustrated in FIG. 25J. The specification of the two metal bumps or pillars 27 shown in FIG. 32Q can be referred to as the specification of the metal bump or pillar 27 as illustrated in FIG. 25J.

Next, referring to FIG. 32R, the photoresist layer 31 is removed, which can be referred to as the step illustrated in FIG. 25K. Next, the seed layer 18 not under the two metal bumps or pillars 27 is removed, and then the adhesion/barrier layer 16 not under the two metal bumps or pillars 27 is removed, which can be referred to as the step illustrated in FIG. 25L. Accordingly, a bottom scheme 103 at the backside 1*a* of the thinned silicon substrate 1 is formed with the insulating layer 3, the capacitor 87, the metal interconnect 88*b*, the polymer layers 14 and 143, the dielectric layer 85, the metal layers 16 and 18, and the metal bumps or pillars 27, and the openings 14*a* in the polymer layer 14 are over the bulk metal layer 9, and the openings 143*a* in the polymer layer 143 are over the bulk metal layer 68. After the step illustrated in FIG. 32R, the semiconductor wafer 10 can be cut into a plurality of individual semiconductor chip by a die-sawing process.

Alternatively, after the step illustrated in FIG. 32R, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 32A-32R. After the steps illustrated in FIGS. 32A-32R, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, for example, a first metal bump or pillar 27 connected to the metal layer 68 of the metal interconnect 88*b* of the semiconductor chip can connect the metal interconnect 88*b* and the previously described inductor 36 to a power bus or plane of the first external circuit to receive an external power voltage Vdd from the external circuit, and a second metal bump or pillar 27 connected to the metal layer 68 of the semiconductor chip can connect the capacitor 87 to a ground bus or plane of the first or second external circuit.

FIGS. 32S and 32T are cross sectional views showing a process for forming a semiconductor wafer, which can be formed by a suitable process or processes, e.g., by the following steps. Referring to FIG. 32S, the silicon substrate 1 of the semiconductor wafer 10 illustrated in FIG. 30J is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the capacitor 87, the metal interconnect 88*b*, the two metal bumps or pillars 27 and the polymer layers 14 and 143 can be formed in the through silicon vias 11*a*, 11*d*, 11*e* and 11*f* and at the backside 1*a* of the thinned silicon substrate 1, which can be referred to as the steps illustrated in FIGS. 32A-32R. Accordingly, a bottom scheme 103 same as the bottom scheme 103 shown in FIG. 32R can be formed at the backside 1*a* of the thinned silicon substrate 1.

Referring to FIG. 32T, after forming the structure shown in FIG. 32S, the flux 32 is removed. Next, using the steps illustrated in FIGS. 15D-15H, multiple patterned circuit layers 812 composed of an adhesion/barrier/seed layer 8121 and a metal layer 8122 can be formed on the passivation layer 5 and on the regions 600*a* of the metal traces or pads 600 exposed by the openings 519 and 519', and a patterned circuit layer 821 composed of an adhesion/barrier/seed layer 8211 and a metal layer 8212 can be formed on the passivation layer 5 and on the regions 600*a* of the metal traces or pads 600 exposed by the openings 521, 522 and 524. Next, a polymer layer 98 is formed on the metal layer 8122 of the patterned circuit layers 812, on the metal layer 8212 of the patterned circuit layer 821 and on the passivation layer 5, and multiple openings 980 in the polymer layer 98 are over multiple contact points of the metal layers 8122 and 8212 and expose them, which can be referred to as the step illustrated in FIG. 15I. Next, multiple metal bumps 89 provided by triple metal layers 89*a*, 89*b* and 89*c* are formed on the polymer layer 98 and on the contact points of the metal layers 8122 and 8212 exposed by the openings 980, which can be referred to as the step illustrated in FIG. 30L. The specification of the metal bumps 89 shown in FIG. 32T can be referred to as the specification of the metal bumps 89 as illustrated in FIG. 30L. Accordingly, an over-passivation scheme 102 is formed with the patterned circuit layers 812 and 821, the polymer layer 98 and the metal bumps 89, at the active side of the thinned silicon substrate 1. Alternatively, each of the over-passivation schemes 102 illustrated in FIGS. 15H, 15K-15M, 16L, 16M, 17J, 18I, 19H and 20 can be formed over the passivation layer 5 at the active side of the thinned silicon substrate 1.

After forming the structure shown in FIG. 32T, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 connected to the metal layer 68 of the metal interconnect 88*b* of the semiconductor chip may connect the metal interconnect 88*b* and the previously described inductor 36 to a power bus or plane of a first external circuit, such as printed circuit board, semiconductor chip, ball-grid-array (BGA) substrate, metal substrate, glass substrate or ceramic substrate, to receive an external power voltage Vdd from the first external circuit, and a second metal bump or pillar 27 connected to the metal layer 68 of the semiconductor chip may connect the capacitor 87 to a ground bus or plane of the first external circuit. A first metal bump 89 connected the metal trace, bus or plane 81 of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal bumps 89 connected to the ground plane, bus or trace 82 of the semiconductor chip may be connected to a ground bus or plane of the second external circuit.

Alternatively, in the chip package, a first metal bump 89 connected to the metal trace, bus or plane 81P of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal bump 89 connected the metal trace, bus or plane 81 of the semiconductor chip may be connected to the first external circuit to output a regulated or converted power voltage Vcc to the first external circuit. Multiple third metal bumps 89 connected to the ground plane, bus or trace 82 of the semiconductor chip may be connected to a ground bus or plane of the first external circuit. A metal bump or pillar 27 connected to the metal layer 68 of the semiconductor chip may connect the capacitor 87 to a ground bus or plane of a second external circuit, such as semiconductor chip, printed circuit board, ball-grid-array (BGA) substrate, metal substrate, glass substrate or ceramic substrate.

FIG. 32U is a cross sectional view showing a process for forming a semiconductor wafer, which can be formed by a suitable process or processes, e.g., by the following steps. First, the silicon substrate 1 of the semiconductor wafer 10 illustrated in FIG. 30M is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the capacitor 87, the metal interconnect 88*b*, the two metal bumps or pillars 27 and the polymer layers 14 and 143 can be formed in the through silicon vias 11*a*, 11*d*, 11*e* and 11*f* and at the backside 1*a* of the thinned silicon substrate 1, which can be referred to as the steps illustrated in FIGS. 32A-32R. Accordingly, a bottom scheme 103 same as the bottom scheme 103 shown in FIG. 32R can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 519, 519', 521, 522 and 524 can be performed after forming the two metal bumps or pillars 27.

After forming the structure shown in FIG. 32U, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 connected to the metal layer 68 of the metal interconnect 88*b* of the semiconductor chip may connect the metal interconnect 88*b* and the previously described inductor 36 to a power bus or plane of a first external circuit, such as printed circuit board, semiconductor chip, ball-grid-array (BGA) substrate, metal substrate, glass substrate or ceramic substrate, to receive an external power voltage Vdd from the first external circuit, and a second metal bump or pillar 27 connected to the metal layer 68 of the semiconductor chip may connect the capacitor 87 to a ground bus or plane of the first external circuit. A first metal pad, bump or trace 34*a* connected the fine-line metal trace 619' of the semiconductor chip may be connected to a second external circuit, such as semiconductor chip, printed circuit board, ball-grid-array (BGA) substrate, metal substrate, glass substrate or ceramic substrate, to output the regulated or converted power voltage Vcc to the second external circuit. Multiple second metal pads, bumps or traces 34*a* connected to the fine-line metal traces 621, 622 and 624 of the semiconductor chip may be connected to a ground bus or plane of the second external circuit.

Alternatively, in the chip package, a first metal pad, bump or trace 34*a* connected to the fine-line metal trace 619 of the semiconductor chip may be connected to a first external circuit, such as semiconductor chip, printed circuit board, ball-grid-array (BGA) substrate, metal substrate, glass substrate or ceramic substrate, to receive an external power voltage Vdd from the first external circuit. A second metal pad, bump or trace 34*a* connected to the fine-line metal trace 619' of the semiconductor chip may be connected to the first external circuit to output a regulated or converted power voltage Vcc to the first external circuit. Multiple third metal pads, bumps or traces 34*a* connected to the fine-line metal traces 621, 622 and 624 of the semiconductor chip may be connected to a ground bus or plane of the first external circuit. A metal bump or pillar 27 connected to the metal layer 68 of the semiconductor chip may connect the capacitor 87 to a ground bus or plane of a second external circuit, such as semiconductor chip, printed circuit board, ball-grid-array (BGA) substrate, metal substrate, glass substrate or ceramic substrate.

In the following, another process illustrate in FIGS. 33A-33Y is introduced for forming the capacitor 87 in FIGS. 29A, 29B and 29D. Referring to FIG. 33A, the silicon substrate 1 of the semiconductor wafer 10 illustrated FIG. 30A is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, multiple through-silicon vias 11*a*, 11*d*, 11*e* and 11*f* can be formed in the thinned silicon substrate 1 and in at least one dielectric layer 30, exposing multiple regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. The through-silicon vias 11*a*, 11*d*, 11*e* and 11*f* penetrate completely through the thinned silicon substrate 1 and the dielectric layer(s) 30. The process of forming the through-silicon via 11*f* in the thinned silicon substrate 1 and in the dielectric layer 30 and forming the insulating layer 3 on the sidewall of the through-silicon via 11*f* as shown in FIG. 33A can be referred to as the process of forming the through-silicon vias 11*a*, 11*b*, 11*c*, 11*d* and 11*e* in the thinned silicon substrate 1 and in the dielectric layer(s) 30 and forming the insulating layer 3 on the sidewalls of the through-silicon vias 11*a*, 11*b*, 11*c*, 11*d* and 11*e* as illustrated in FIGS. 24C-24H or FIGS. 24I-24N. Next, the metal layer 4 composed of the adhesion/barrier layer 4*a* and the seed layer 4*b* can be formed in the through-silicon vias 11*a*, 11*d*, 11*e* and 11*f*, on the insulating layer 3 and at the backside 1*a* of the thinned silicon substrate 1, which can be referred to as the step illustrated in FIG. 25A.

After forming the metal layer 4, an anode 91 and a cathode 92 are formed on the seed layer 4*b* of the metal layer 4. The material of the anode 91 may include polyaniline, active carbon, graphite, polypyrrole, carbon nanotube, a NiCo alloy or $RuO_2$. Alternatively, the anode 91 may be a composite layer including a nickel layer on the seed layer 4*b* of the metal layer 4 and a carbon layer on a top surface and sidewall of the nickel layer. The material of the cathode 92 may include polyaniline, active carbon, graphite, carbon nanotube or polypyrrole. For example, when the anode 91 is a NiCo alloy, the cathode 92 may be active carbon or carbon nanotube. Alternatively, the anode 91 and the cathode 92 can be porous. The anode 91 has a thickness t9 larger than 1 micrometer, such as between 1 and 20 micrometers, and preferably between 2 and 10 micrometers, and has a width d2 larger than 1 micrometer, such as between 1 and 20 micrometers, and preferably between 2 and 10 micrometers. The cathode 92 has a thickness t10 larger than 1 micrometer, such as between 1 and 20 micrometers, and preferably between 2 and 10 micrometers, and has a width d3 larger than 1 micrometer, such as between 1 and 20 micrometers, and preferably between 2 and 10 micrometers.

Referring to FIG. 33B, after forming the anode 91 and the cathode 92, a photoresist layer 29, such as positive-type photoresist layer or negative-type photoresist layer, having a thickness larger than 1.5 micrometers, such as between 5 and 50 micrometers, and preferably between 10 and 25 micrometers, can be formed on the seed layer 4*b* of the metal layer 4, on the anode 91 and on the cathode 92 by a spin-on coating process, a lamination process, a screen-printing process or a spraying process. Next, the photoresist layer 29 is patterned with the processes of exposure and development to form multiple openings 29*a* in the photoresist layer 29 exposing the seed layer 4*b* of the metal layer 4. A 1× stepper or 1× contact aligner can be used to expose the photoresist layer 29 during the process of exposure. The process of forming the photoresist layer 29 on the seed layer 4*b* of the metal layer 4, on the anode 91 and on the cathode 92 and forming the openings 29*a* in the photoresist layer 29 as shown in FIG. 33B can be referred to as the process of forming the photoresist layer 29 on the seed layer 4*b* and forming the openings 29*a* in the photoresist layer 29 as illustrated in FIGS. 25B-25C.

Next, referring to FIG. 33C, a bulk metal layer 9 can be formed in the openings 29*a* and on the seed layer 4*b* of the metal layer 4 exposed by the openings 29*a* by a process including an electroplating process. The process of forming the bulk metal layer 9 in the openings 29*a* and on the seed layer 4*b* of the metal layer 4 exposed by the openings 29*a* as shown in FIG. 33C can be referred to as the process of forming the bulk metal layer 9 in the openings 29*a* and on the seed layer 4*b* of the metal layer 4 exposed by the openings 29*a* as illustrated in FIG. 25D. The specification of the bulk metal layer 9 shown in FIG. 33C can be referred to as the specification of the bulk metal layer 9 as illustrated in FIG. 25D.

Referring to FIG. 33D, after the step illustrated in FIG. 33C, the photoresist layer 29 can be removed using an inorganic solution or using an organic solution with amide. Some residuals from the photoresist layer 29 could remain on the bulk metal layer 9, on the anode 91, on the cathode 92 and on the seed layer 4*b* of the metal layer 4 not under the bulk metal layer 9, the anode 91 and the cathode 92. Thereafter, the residuals can be removed from the bulk metal layer 9, from the anode 91, from the cathode 92 and from the seed layer 4*b* of the metal layer 4 with a plasma, such as an $O_2$ plasma or a plasma containing fluorine of below 200 PPM and oxygen.

Next, referring to FIG. 33E, the metal layer 4 not under the bulk metal layer 9, the anode 91 and the cathode 92 is removed by etching the seed layer 4*b* not under the bulk metal layer 9, the anode 91 and the cathode 92, and then etching the adhesion/barrier layer 4*a* not under the bulk metal layer 9, the anode 91 and the cathode 92. The process of removing the seed layer 4*b* not under the bulk metal layer 9, the anode 91 and the cathode 92 and removing the adhesion/barrier layer 4*a* not under the bulk metal layer 9, the anode 91 and the cathode 92 as shown in FIG. 33E can be referred to as the process of removing the seed layer 4*b* not under the bulk metal layer 9 and removing the adhesion/barrier layer 4*a* not under the bulk metal layer 9 as illustrated in FIG. 25F.

Accordingly, the anode 91 and the cathode 92 are formed over the insulating layer 3 and at the backside 1*a* of the thinned silicon substrate 1, and the previously described metal traces 88*a*, 88*b* and 88*c* provided by the metal layers 4 and 9 are formed on the insulating layer 3 and at the backside 1*a* of the thinned silicon substrate 1. FIG. 33F is a top view of FIG. 33E. Referring to FIGS. 33E and 33F, the cathode 92 has multiple parallel lines 125 extending into gaps between multiple parallel lines 124 of the anode 91. The anode 91 is connected to the node P of the voltage regulator or converter circuit 41 and the previously described inductor 36 through the metal trace 88*c*. The cathode 92 is connected to the ground node Rs of the voltage regulator or converter circuit 41 and the ground nodes Ts, Us, Vs and Ws of the internal circuits 21, 22, 23 and 24 through the metal trace 88*a*. The horizontal space d4 between the neighboring lines 124 and 125 of the cathode 92 and anode 91 can be larger than 0.1 micrometers, such as between 0.1 and 10 micrometers, and preferably between 1 and 5 micrometers.

Referring to FIG. 33G, after the step illustrated in FIG. 33E, a polymer layer 14 can be formed on the insulating layer 3 and on the topmost layer of copper, gold, aluminum, nickel or palladium of the previously described various bulk metal layer 9 by a process including a spin-on coating process, a lamination process, a screen-printing process or a spraying process and including a curing process. An opening 14*b* in the polymer layer 14 exposes the anode 91 and the cathode 92, and the anode 91 and the cathode 92 are on the insulating layer 3 and in the opening 14*b*. The polymer layer 14 may have a thickness larger than 2 micrometers, such as between 3 and 25 micrometers, and preferably between 5 and 15 micrometers. The material of the polymer layer 14 may include benzocyclobutane (BCB), polyimide (PI), polybenzoxazole (PBO) or epoxy resin. The process of forming the polymer layer 14 and the opening 14*b* in the polymer layer 14 as shown in FIG. 33G can be referred to as the process of forming the polymer layer 14 and the opening 14*a* in the polymer layer 14 as illustrated in FIG. 25G.

FIG. 33I is a top view of FIG. 33H. Referring to FIGS. 33H and 33I, a jelly electrolyte 93, containing a polymer and metal ions, such as $Li^+$, $Ni^+$ or $Cu^+$, is formed in the opening 14_b_ in the polymer layer 14, on the insulating layer 3 exposed by the opening 14_b_ and in the gaps between the parallel lines 124 and 125, and covers top surfaces of the anode 91 and the cathode 92. After forming the jelly electrolyte 93, a super capacitor 87 including the anode 91, the cathode 92 and the jelly electrolyte 93 can be formed on the insulating layer 3 and in the opening 14_b_ in the polymer layer 14. The super capacitor 87 at the backside 1_a_ of the thinned silicon substrate 1 has capacitance in the range of between 0.01 and 100 microfarads, and has energy storage capability in the range of between 0.1 and 10 microfarads per square meter ($\mu F/mm^2$). The area of the super capacitor 87, enclosed by the bold line shown in FIG. 33I, is in the range of between 0.1 and 10 square meters. Alternatively, the jelly electrolyte 93 can be replaced by a liquid electrolyte containing a polymer and metal ions, such as $Li^+$, $Ni^+$ or $Cu^+$. The capacitor 87 is reversibly chargeable and dischargeable.

Referring to FIG. 33J, a polymer layer 133 is formed on the polymer layer 14 and covers the jelly electrolyte 93 by a process including a spin-on coating process, a lamination process, a screen-printing process or a spraying process and including a curing process. The polymer layer 133 may have a thickness larger than 2 micrometers, such as between 3 and 25 micrometers, and preferably between 5 and 15 micrometers. The material of the polymer layer 133 may include benzocyclobutane (BCB), polyimide (PI), polybenzoxazole (PBO) or epoxy resin.

Referring to FIG. 33K, a top surface of the polymer layer 133 can be optionally polished by a chemical mechanical polishing (CMP) process or a mechanical polishing process, leading the polymer layer 133 to have a top surface 133_s_ substantially coplanar with a top surface 14_s_ of the polymer layer 14. Accordingly, a bottom scheme 103 is formed at the backside 1_a_ of the thinned silicon substrate 1, and includes the insulating layer 3, the capacitor 87 composed of the anode 91, the cathode 92 and the jelly electrolyte 93, the metal traces 88_a_, 88_b_ and 88_c_, and the polymer layers 14 and 133, and the opening 14_b_ in the polymer layer 14 is over the insulating layer 3.

After the step illustrated in FIG. 33K, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process. After the die-sawing process, the semiconductor chip cut from the semiconductor wafer 10 can be packaged for a chip package.

FIG. 33L is a cross sectional view showing a semiconductor wafer 10 illustrated in FIG. 33K with an over-passivation scheme 102 over the passivation layer 5 at the active side of the thinned silicon substrate 1, which can be formed by a suitable process or processes, e.g., by the following steps. First, multiple openings 519, 519', 521, 522 and 524 are formed in the passivation layer 5 to expose multiple regions 600_a_ of the metal traces or pads 600 after the step illustrated in FIG. 33K. The openings 519, 519', 521, 522 and 524 are over the regions 600_a_, and the regions 600_a_ are at bottoms of the openings 519, 519', 521, 522 and 524. Next, using the steps illustrated in FIGS. 15D-15H, multiple patterned circuit layers 812 composed of an adhesion/barrier/seed layer 8121 and a metal layer 8122 can be formed on the passivation layer 5 and on the regions 600_a_ of the metal traces or pads 600 exposed by the openings 519 and 519', and a patterned circuit layer 821 composed of an adhesion/barrier/seed layer 8211 and a metal layer 8212 can be formed on the passivation layer 5 and on the regions 600_a_ of the metal traces or pads 600 exposed by the openings 521, 522 and 524. Next, a polymer layer 98 is formed on the metal layer 8122 of the patterned circuit layers 812, on the metal layer 8212 of the patterned circuit layer 821 and on the passivation layer 5, and multiple openings 980 in the polymer layer 98 are over multiple contact points of the metal layers 8122 and 8212 and expose them, which can be referred to as the step illustrated in FIG. 15I. Next, multiple metal bumps 89 provided by triple metal layers 89_a_, 89_b_ and 89_c_ are formed on the polymer layer 98 and on the contact points of the metal layers 8122 and 8212 exposed by the openings 980, which can be referred to as the step illustrated in FIG. 30L. The specification of the metal bumps 89 shown in FIG. 33L can be referred to as the specification of the metal bumps 89 as illustrated in FIG. 30L. Accordingly, the over-passivation scheme 102 is formed with the patterned circuit layers 812 and 821, the polymer layer 98 and the metal bumps 89, at the active side of the thinned silicon substrate 1.

After forming the structure shown in FIG. 33L, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, for example, a first metal bump 89 can connect the metal trace, bus or plane 81P of the semiconductor chip to an external circuit, such as printed circuit board, semiconductor chip, ball-grid-array (BGA) substrate, metal substrate, glass substrate or ceramic substrate, to receive an external power voltage Vdd from the external circuit, and can be connected to the metal trace 88_b_ at the backside 1_a_ of the thinned silicon substrate 1 and the voltage regulator or converter circuit 41 through the metal trace, bus or plane 81P at the active side of the thinned silicon substrate 1 and through the fine-line metal trace 619. A second metal bump 89 can connect the metal trace, bus or plane 81 of the semiconductor chip to the external circuit to output a regulated or converted power voltage Vcc to the external circuit, and can be connected to the metal trace 88_c_ at the backside 1_a_ of the thinned silicon substrate 1 and the voltage regulator or converter circuit 41 through the metal trace, bus or plane 81 at the active side of the thinned silicon substrate 1 and through the fine-line metal trace 619'. Multiple third metal bumps 89 can connect the ground plane, bus or trace 82 of the semiconductor chip to a ground bus or plane of the external circuit, and can be connected to the metal trace 88_a_ at the backside 1_a_ of the thinned silicon substrate 1 and the internal circuits 21, 22, 23 and 24 through the ground plane, bus or trace 82 at the active side of the thinned silicon substrate 1.

FIG. 33M is a cross sectional view showing a semiconductor wafer 10 illustrated in FIG. 33K with metal pads, bumps or traces at the active side of the thinned silicon substrate 1, which can be formed by a suitable process or processes, e.g., by the following steps. First, multiple openings 519, 519', 521, 522 and 524 are formed in the passivation layer 5 to expose multiple regions 600_a_ of the metal traces or pads 600 after the step illustrated in FIG. 33K. The openings 519, 519', 521, 522 and 524 are over the regions 600_a_, and the regions 600_a_ are at bottoms of the openings 519, 519', 521, 522 and 524. Next, multiple metal pads, bumps or traces 34_a_ provided by two metal layers 32 and 34 can be formed on the passivation layer 5 and on the regions 600_a_ of the metal traces or pads 600 exposed by the openings 519, 519', 521, 522 and 524. The process of forming the metal pads, bumps or traces 34*a* on the passivation layer 5 and on the regions 600*a* of the metal traces or pads 600 exposed by the openings 519, 519', 521, 522 and 524 as shown in FIG. 33M can be referred to as the process of forming the metal pads, bumps or traces 34*a* on the passivation layer 5 and on the regions 600*a* of the metal traces or pads 600 exposed by the openings 531, 532, 534, 539 and 539' as illustrated in FIG. 25N. The specification of the metal pads, bumps or traces 34*a* shown in FIG. 33M can be referred to as the specification of the metal pads, bumps or traces 34*a* as illustrated in FIG. 25N.

After forming the structure shown in FIG. 33M, the semiconductor wafer 10 can be cut into a plurality of individual semiconductor chip by a die-sawing process. After the die-sawing process, the semiconductor chip cut from the semiconductor wafer 10 can be packaged for a chip package. In the chip package, for example, a first metal pad, bump or trace 34*a* can connect the fine-line metal trace 619 of the semiconductor chip to an external circuit, such as semiconductor chip, printed circuit board, ball-grid-array (BGA) substrate, metal substrate, glass substrate or ceramic substrate, to receive an external power voltage Vdd from the external circuit, and can be connected to the metal trace 88*b* at the backside 1*a* of the thinned silicon substrate 1 and the voltage regulator or converter circuit 41 through the fine-line metal trace 619. A second metal pad, bump or trace 34*a* can connect the fine-line metal trace 619' of the semiconductor chip to the external circuit to output a regulated or converted power voltage Vcc to the external circuit, and can be connected to the metal trace 88*c* at the backside 1*a* of the thinned silicon substrate 1 and the voltage regulator or converter circuit 41 through the fine-line metal trace 619'. Multiple third metal pads, bumps or traces 34*a* can connect the fine-line metal traces 621, 622 and 624 of the semiconductor chip to a ground bus or plane of the external circuit, and can be connected to the metal trace 88*a* at the backside 1*a* of the thinned silicon substrate 1 through the fine-line metal traces 621, 622 and 624.

FIGS. 33N-33S show a process of forming a super capacitor 87 and multiple metal bumps or pillars 27 at the backside 1*a* of the thinned silicon substrate 1 of the semiconductor wafer 10 illustrated in FIG. 33E.

Referring to FIG. 33N, after the step illustrated in FIG. 33E, a polymer layer 14 can be formed on the insulating layer 3 and on the topmost layer of copper, gold, aluminum, nickel or palladium of the previously described various bulk metal layer 9 by a process including a spin-on coating process, a lamination process, a screen-printing process or a spraying process and including a curing process. An opening 14*a* in the polymer layer 14 is over a region of the topmost layer of copper, gold, aluminum, nickel or palladium of the previously described various bulk metal layer 9 of the metal trace 88*b* and exposes it, an opening 14*c* in the polymer layer 14 is over a region of the topmost layer of copper, gold, aluminum, nickel or palladium of the previously described various bulk metal layer 9 of the metal trace 88*a* and exposes it, and an opening 14*d* in the polymer layer 14 is over a region of the topmost layer of copper, gold, aluminum, nickel or palladium of the previously described various bulk metal layer 9 of the metal trace 88*c* and exposes it. An opening 14*b* in the polymer layer 14 exposes the anode 91 and the cathode 92, and the anode 91 and the cathode 92 are in the opening 14*b* and over the insulating layer 3. The polymer layer 14 may have a thickness larger than 2 micrometers, such as between 3 and 25 micrometers, and preferably between 5 and 15 micrometers. The material of the polymer layer 14 may include benzocyclobutane (BCB), polyimide (PI), polybenzoxazole (PBO) or epoxy resin. The process of forming the polymer layer 14 and the openings 14*a*, 14*b*, 14*c* and 14*d* in the polymer layer 14 as shown in FIG. 33N can be referred to as the process of forming the polymer layer 14 and the opening 14*a* in the polymer layer 14 as illustrated in FIG. 25G.

FIG. 33P is a top view of FIG. 33O. Referring to FIGS. 33O and 33P, a jelly electrolyte 93, containing a polymer and metal ions, such as $Li^+$, $Ni^+$ or $Cu^+$, is formed in the opening 14*b* in the polymer layer 14, on the insulating layer 3 exposed by the opening 14*b* and in the gaps between the parallel lines 124 and 125, and covers top surfaces of the anode 91 and the cathode 92. After forming the jelly electrolyte 93, the super capacitor 87 including the anode 91, the cathode 92 and the jelly electrolyte 93 can be formed on the insulating layer 3 and in the opening 14*b* in the polymer layer 14. The super capacitor 87 at the backside 1*a* of the thinned silicon substrate 1 has capacitance in the range of between 0.01 and 100 microfarads, and has energy storage capability in the range of between 0.1 and 10 microfarads per square meter (μ/F/$mm^2$). The area of the super capacitor 87, enclosed by the bold line shown in FIG. 33P, is in the range of between 0.1 and 10 square meters. Alternatively, the jelly electrolyte 93 can be replaced by a liquid electrolyte containing a polymer and metal ions, such as $Li^+$, $Ni^+$ or $Cu^+$. The capacitor 87 is reversibly chargeable and dischargeable.

Next, referring to FIG. 33Q, a polymer layer 133 is formed on the polymer layer 14 and covers the jelly electrolyte 93 by a process including a spin-on coating process, a lamination process, a screen-printing process or a spraying process and including a curing process, and multiple openings 133*a* in the polymer layer 133 are over the regions of the topmost layer of copper, gold, aluminum, nickel or palladium of the previously described various bulk metal layer 9 exposed by the openings 14*a*, 14*c* and 14*d* and expose them. The polymer layer 133 has a thickness larger than 2 micrometers, such as between 3 and 25 micrometers, and preferably between 5 and 15 micrometers. The material of the polymer layer 133 may include benzocyclobutane (BCB), polyimide (PI), polybenzoxazole (PBO) or epoxy resin.

In a case, the polymer layer 133 can be formed by a suitable process or processes, e.g., by spin-on coating a negative-type photosensitive polyimide layer having a thickness between 6 and 50 micrometers on the regions of the topmost layer of copper, gold, aluminum, nickel or palladium of the previously described various bulk metal layer 9 exposed by the openings 14*a*, 14*c* and 14*d*, on the polymer layer 14 and on the jelly electrolyte 93, then baking the spin-on coated polyimide layer, then exposing the baked polyimide layer using a 1× stepper or a 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the regions of the bulk metal layer 9 exposed by the openings 14*a*, 14*c* and 14*d*, then curing or heating the developed polyimide layer at a temperature between 100 and 150° C. for a time between 20 and 150 minutes in a nitrogen ambient or in an oxygen-free ambient, the cured polyimide layer having a thickness between 3 and 25 micrometers, and then removing the residual polymeric material or other contaminants from the bulk metal layer 9 of the metal trace 130 with an $O_2$ plasma or a plasma containing fluorine of below 200 PPM and oxygen. By the way, the polymer layer 133 is formed on the polymer layer 14 and covers the jelly electrolyte 93, and the openings 133*a* formed in the polymer layer 133 expose the regions of the topmost layer of copper, gold, aluminum, nickel or palladium of the previously described various bulk metal layer 9 exposed by the openings 14*a*, 14*c* and 14*d*. Alternatively, the developed polyimide layer can be cured or heated using ultraviolet.

In another case, the polymer layer 133 can be formed by a suitable process or processes, e.g., by spin-on coating a positive-type photosensitive polybenzoxazole layer having a thickness between 3 and 25 micrometers on the regions of the topmost layer of copper, gold, aluminum, nickel or palladium of the previously described various bulk metal layer 9 exposed by the openings 14*a*, 14*c* and 14*d*, on the polymer layer 14 and on the jelly electrolyte 93, then baking the spin-on coated polybenzoxazole layer, then exposing the baked polybenzoxazole layer using a 1× stepper or a 1× contact aligner with at least two of G-line having a wavelength ranging from, e.g., about 434 to 438 nm, H-line having a wavelength ranging from, e.g., about 403 to 407 nm, and I-line having a wavelength ranging from, e.g., about 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form multiple openings exposing the regions of the bulk metal layer 9 exposed by the openings 14*a*, 14*c* and 14*d*, then curing or heating the developed polybenzoxazole layer at a temperature between 100 and 150° C. for a time between 5 and 180 minutes, and preferably between 30 and 120 minutes, in a nitrogen ambient or in an oxygen-free ambient, the cured polybenzoxazole layer having a thickness between 3 and 25 micrometers, and then removing the residual polymeric material or other contaminants from the bulk metal layer 9 of the metal trace 130 with an $O_2$ plasma or a plasma containing fluorine of below 200 PPM and oxygen. By the way, the polymer layer 133 is formed on the polymer layer 14 and covers the jelly electrolyte 93, and the openings 133*a* formed in the polymer layer 133 expose the regions of the topmost layer of copper, gold, aluminum, nickel or palladium of the previously described various bulk metal layer 9 exposed by the openings 14*a*, 14*c* and 14*d*. Alternatively, the developed polybenzoxazole layer can be cured or heated using ultraviolet.

Referring to FIG. 33R, after the step illustrated in FIG. 33Q, an adhesion/barrier layer 16 having a thickness smaller than 1 micrometer, such as between 0.02 and 0.5 micrometers, and preferably between 0.1 and 0.2 micrometers, can be formed on the polymer layer 133, on the polymer layer 14 and on the regions of the bulk metal layer 9 exposed by the openings 14*a*, 14*c* and 14*d* by using a physical vapor deposition (PVD) process, such as sputtering process or evaporation process. Next, a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The material of the adhesion/barrier layer 16 may include titanium, a titanium-tungsten alloy, titanium nitride, chromium, tantalum, tantalum nitride or a composite of the previously described materials, and the material of the seed layer 18 may include copper, nickel, aluminum, gold, silver, platinum or palladium.

For example, when the adhesion/barrier layer 16 is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 133, on the polymer layer 14 and on the regions of the bulk metal layer 9 exposed by the openings 14*a*, 14*c* and 14*d*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the adhesion/barrier layer 16 is formed by a suitable process or processes, e.g., by sputtering a composite layer including a titanium layer having a thickness between 0.01 and 0.15 micrometers on the polymer layer 133, on the polymer layer 14 and on the regions of the bulk metal layer 9 exposed by the openings 14*a*, 14*c* and 14*d* and a titanium-tungsten-alloy layer having a thickness between 0.1 and 0.35 micrometers on the titanium layer, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-tungsten-alloy layer.

Alternatively, when the adhesion/barrier layer 16 is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 133, on the polymer layer 14 and on the regions of the bulk metal layer 9 exposed by the openings 14*a*, 14*c* and 14*d*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the adhesion/barrier layer 16 is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 133, on the polymer layer 14 and on the regions of the bulk metal layer 9 exposed by the openings 14*a*, 14*c* and 14*d*, the seed layer 18 can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

After forming the seed layer 18, a photoresist layer 31 can be formed on the seed layer 18 of any previously described material, and multiple openings 31*a* in the photoresist layer 31 expose the seed layer 18 of any previously described material, which can be referred to as the step illustrated in FIG. 25I. The openings 31*a* are over the regions of the topmost layer of copper, gold, aluminum, nickel or palladium of the previously described various bulk metal layer 9 exposed by the openings 14*a*, 14*c* and 14*d*. Next, the metal bumps or pillars 27 can be formed on the seed layer 18 of any previously described material exposed by the openings 31*a* and in the openings 31*a*. The process of forming the metal bumps or pillars 27 on the seed layer 18 of any previously described material exposed by the openings 31*a* and in the openings 31*a* as shown in FIG. 33R can be referred to as the process of forming the metal bump or pillar 27 on the seed layer 18 of any previously described material exposed by the opening 31*a* and in the opening 31*a* as illustrated in FIG. 25J. The specification of the metal bumps or pillars 27 shown in FIG. 33R can be referred to as the specification of the metal bump or pillar 27 as illustrated in FIG. 25J.

Next, referring to FIG. 33S, the photoresist layer 31 is removed, which can be referred to as the step illustrated in FIG. 25K. Next, the seed layer 18 not under the metal bumps or pillars 27 is removed, and then the adhesion/barrier layer 16 not under the metal bumps or pillars 27 is removed, which can be referred to as the step illustrated in FIG. 25L. Accordingly, a bottom scheme 103 at the backside 1*a* of the thinned silicon substrate 1 is formed with the insulating layer 3, the capacitor 87 composed of the anode 91, the cathode 92 and the jelly electrolyte 93, the metal traces 88*a*, 88*b* and 88*c*, the polymer layers 14 and 133, the metal layers 16 and 18, and the metal bumps or pillars 27, and the openings 14*a*, 14*c* and 14*d* in the polymer layer 14 are over the bulk metal layer 9, the opening 14*b* in the polymer layer 14 is over the insulating layer 3, and the openings 133*a* in the polymer layer 133 are over the bulk metal layer 9. After the step illustrated in FIG. 33S, the semiconductor wafer 10 can be cut into a plurality of individual semiconductor chip by a die-sawing process.

Alternatively, after the step illustrated in FIG. 33S, with the following steps being illustrated with reverse figures for simple explanation, multiple openings 50 are formed in the passivation layer 5 to expose the metal traces or pads 600, and then each of the over-passivation schemes 102 illustrated in FIGS. 15H, 15K-15M, 16L, 16M, 17J, 18I, 19H and 20 can be alternatively formed over the passivation layer 5 at the active side of the thinned silicon substrate 1. Thereafter, the semiconductor wafer 10 can be cut into a plurality of individual semiconductor chip by a die-sawing process.

Alternatively, a process of forming any one of the over-passivation schemes 102 illustrated in FIGS. 15H, 15K-15M, 16L, 16M, 17J, 18I, 19H and 20 over the passivation layer 5 can be performed before the steps illustrated in FIGS. 33A-33E and 33N-33S. After the steps illustrated in FIGS. 33A-33E and 33N-33S, the semiconductor wafer 10 can be cut into a plurality of individual semiconductor chip by a die-sawing process.

After the die-sawing process, the semiconductor chip cut from the semiconductor wafer 10 can be packaged for a chip package. In the chip package, for example, a first metal bump or pillar 27 can connect the metal trace 88*b* and the previously described inductor 36 of the semiconductor chip to an external circuit, such as printed circuit board, semiconductor chip, ball-grid-array (BGA) substrate, metal substrate, glass substrate or ceramic substrate, to receive an external power voltage Vdd from the external circuit, and can be connected to the previously described inductor 36 and the voltage regulator or converter circuit 41 through the metal trace 88*b*. A second metal bump or pillar 27 can connect the metal trace 88*c* of the semiconductor chip to the external circuit to output a regulated or converted power voltage Vcc to the external circuit. The second metal bump or pillar 27 can be connected to the voltage regulator or converter circuit 41 through the metal trace 88*c* and the fine-line metal trace 619', and to the previously described inductor 36 and the anode 91 of the capacitor 87 through the metal trace 88*c*. A third metal bump or pillar 27 can connect the metal trace 88*a*, and the capacitor 87 of the semiconductor chip to a ground bus or plane of the external circuit, and can be connected to the cathode 92 of the capacitor 87 and the internal circuits 21, 22, 23 and 24 through the metal trace 88*a*.

FIG. 33T is a cross sectional view showing a process for forming a semiconductor wafer, which can be formed by a suitable process or processes, e.g., by the following steps. First, the silicon substrate 1 of the semiconductor wafer 10 illustrated in FIG. 30J is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the capacitor 87, the metal interconnect 88*a*, 88*b* and 88*c*, the metal bumps or pillars 27 and the polymer layers 14 and 143 can be formed in the through silicon vias 11*a*, 11*d*, 11*e* and 11*f* and at the backside 1*a* of the thinned silicon substrate 1, which can be referred to as the steps illustrated in FIGS. 33A-33E and 33N-33S. Accordingly, a bottom scheme 103 same as the bottom scheme 103 shown in FIG. 33S can be formed at the backside 1*a* of the thinned silicon substrate 1.

After forming the structure shown in FIG. 33T, the semiconductor wafer 10 can be cut into a plurality of individual semiconductor chip by a die-sawing process. After the die-sawing process, the flux 32 of the semiconductor chip cut from the semiconductor wafer 10 is removed, and then the semiconductor chip is packaged for a chip package. In the chip package, the metal bumps or pillars 27 of the bottom scheme 103 of the semiconductor chip can be connected to a first external circuit, such as printed circuit board, semiconductor chip, ball-grid-array (BGA) substrate, metal substrate, glass substrate or ceramic substrate, and multiple wirebonded wires, such as gold wirebonded wires, aluminum wirebonded wires or copper wirebonded wires, can be boned with the regions 600*a* of copper or aluminum of the metal traces or pads 600 exposed by the openings 519, 519', 521, 522 and 524. The wirebonded wires can connect the regions 600*a* of the metal traces or pads 600 exposed by the openings 519, 519', 521, 522 and 524 to the first external circuit or a second external circuit, such as semiconductor chip, printed circuit board, ball-grid-array (BGA) substrate, metal substrate, glass substrate or ceramic substrate.

In the chip package, for example, a first metal bump or pillar 27 can connect the metal trace 88*b*, the voltage regulator or converter circuit 41 and the previously described inductor 36 of the semiconductor chip to a power bus or plane of a first external circuit, such as printed circuit board, semiconductor chip, ball-grid-array (BGA) substrate, metal substrate, glass substrate or ceramic substrate, to receive an external power voltage Vdd from the first external circuit, and the first metal bump or pillar 27 is connected to the voltage regulator or converter circuit 41 through the metal trace 88*b* and the fine-line metal trace 619. A second metal bump or pillar 27 can connect the metal trace 88*c* of the semiconductor chip to the first external circuit to output a regulated or converted power voltage Vcc to the first external circuit. The second metal bump or pillar 27 can be connected to the voltage regulator or converter circuit 41 through the metal trace 88*c* and the fine-line metal trace 619', and to the previously described inductor 36 and the anode 91 of the capacitor 87 through the metal trace 88*c*. A third metal bump or pillar 27 can connect the metal trace 88*a*, the capacitor 87 and the internal circuits 21, 22, 23 and 24 of the semiconductor chip to a ground bus or plane of the first external circuit, and the third metal bump 27 is connected to the cathode 92 of the capacitor 87 and the internal circuits 21, 22, 23 and 24 through the metal trace 88*a*. A first wirebonded wire, such as gold wirebonded wire, aluminum wirebonded wire or copper wirebonded wire, is boned with the region 600*a* of copper or aluminum of the metal trace or pad 600 exposed by the opening 519', and connects the fine-line metal trace 619' and the voltage regulator or converter circuit 41 of the semiconductor chip to the first external circuit or a second external circuit, such as semiconductor chip, printed circuit board, ball-grid-array (BGA) substrate, metal substrate, glass substrate or ceramic substrate, to output the regulated or converted power voltage Vcc. Multiple second wirebonded wires, such as gold wirebonded wires, aluminum wirebonded wires or copper wirebonded wires, are boned with the regions 600*a* of copper or aluminum of the metal traces or pads 600 exposed by the openings 521, 522 and 524, and connect the fine-line metal traces 621, 622 and 624 and the internal circuits 21, 22, 23 and 24 of the semiconductor chip to a ground bus or plane of the first or second external circuit.

Alternatively, in the chip package, a first wirebonded wire, such as gold wirebonded wire, aluminum wirebonded wire or copper wirebonded wire, is boned with the region 600*a* of copper or aluminum of the metal trace or pad 600 exposed by the opening 519, and connects the fine-line metal trace 619 and the voltage regulator or converter circuit 41 of the semiconductor chip to a first external circuit, such as semiconductor chip, printed circuit board, ball-grid-array (BGA) substrate, metal substrate, glass substrate or ceramic substrate, to receive an external power voltage Vdd from the first external circuit. A second wirebonded wire, such as gold wirebonded wire, aluminum wirebonded wire or copper wirebonded wire, is boned with the region 600*a* of copper or aluminum of the metal trace or pad 600 exposed by the opening 519', and connects the fine-line metal trace 619' and the voltage regulator or converter circuit 41 to the first external circuit to output a regulated or converted power voltage Vcc to the first external circuit. Multiple third wirebonded wires, such as gold wirebonded wires, aluminum wirebonded wires or copper wirebonded wires, are boned with the regions 600*a* of copper or aluminum of the metal traces or pads 600 exposed by the openings 521, 522 and 524, and connect the fine-line metal traces 621, 622 and 624 and the internal circuits 21, 22, 23 and 24 of the semiconductor chip to a ground bus or plane of the first external circuit. A first metal bump or pillar 27 can connect the metal trace 88*a* and the capacitor 87 of the semiconductor chip to a ground bus or plane of a second external circuit, such as semiconductor chip, printed circuit board, ball-grid-array (BGA) substrate, metal substrate, glass substrate or ceramic substrate, and can be connected to the cathode 92 of the capacitor 87 and the internal circuits 21, 22, 23 and 24 through the metal trace 88*a*. A second metal bump or pillar 27 can connect the metal trace 88*c* of the semiconductor chip to the second external circuit to output the regulated or converted power voltage Vcc to the second external circuit. The second metal bump or pillar 27 can be connected to the voltage regulator or converter circuit 41 through the metal trace 88*c* and the fine-line metal trace 619', and to the previously described inductor 36 and the anode 91 of the capacitor 87 through the metal trace 88*c*.

FIG. 33U is a cross sectional view showing a process for forming a semiconductor wafer, which can be formed by a suitable process or processes, e.g., by the following steps. First, the silicon substrate 1 of the semiconductor wafer 10 illustrated in FIG. 30M is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. Next, the structure including the capacitor 87, the metal interconnect 88*a*, 88*b* and 88*c*, the metal bumps or pillars 27 and the polymer layers 14 and 143 can be formed in the through silicon vias 11*a*, 11*d*, 11*e* and 11*f* and at the backside 1*a* of the thinned silicon substrate 1, which can be referred to as the steps illustrated in FIGS. 33A-33E and 33N-33S. Accordingly, a bottom scheme 103 same as the bottom scheme 103 shown in FIG. 33S can be formed at the backside 1*a* of the thinned silicon substrate 1. Alternatively, the step of forming the metal pads, bumps or traces 34*a* on the passivation layer 5 and on the regions 600*a* of the metal traces or pads 600 exposed by the openings 519, 519', 521, 522 and 524 can be performed after forming the metal bumps or pillars 27.

After forming the structure shown in FIG. 33U, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, a first metal bump or pillar 27 can connect the metal trace 88*b* and the previously described inductor 36 of the semiconductor chip to a power bus or plane of a first external circuit, such as printed circuit board, semiconductor chip, ball-grid-array (BGA) substrate, metal substrate, glass substrate or ceramic substrate, to receive an external power voltage Vdd from the first external circuit, and can be connected to the voltage regulator or converter circuit 41 through the metal trace 88*b* and the fine-line metal trace 619. A second metal bump or pillar 27 can connect the metal trace 88*c* of the semiconductor chip to the first external circuit to output a regulated or converted power voltage Vcc to the first external circuit. The second metal bump or pillar 27 can be connected to the voltage regulator or converter circuit 41 through the metal trace 88*c* and the fine-line metal trace 619', and to the previously described inductor 36 and the anode 91 of the capacitor 87 through the metal trace 88*c*. A third metal bump or pillar 27 can connect the metal trace 88*a* and the capacitor 87 of the semiconductor chip to a ground bus or plane of the first external circuit, and can be connected to the cathode 92 of the capacitor 87 and the internal circuits 21, 22, 23 and 24 through the metal trace 88*a*. A first metal pad, bump or trace 34*a* and the fine-line metal trace 619' can connect the voltage regulator or converter circuit 41 of the semiconductor chip to a second external circuit, such as semiconductor chip, printed circuit board, ball-grid-array (BGA) substrate, metal substrate, glass substrate or ceramic substrate, by bonding the first metal pad, bump or trace 34*a* to the second external circuit or by wirebonding a gold wire, an aluminum wire or a copper wire to the first metal pad, bump or trace 34*a* and to the second external circuit, to output the regulated or converted power voltage Vcc to the second external circuit. Multiple second metal pads, bumps or traces 34*a* and the fine-line metal traces 621, 622 and 624 can connect the internal circuits 21, 22, 23 and 24 of the semiconductor chip to a ground bus or plane of the second external circuit by bonding the second metal pads, bumps or traces 34*a* to the ground bus or plane of the second external circuit or by wirebonding multiple gold wires, multiple aluminum wires or multiple copper wires to the second metal pads, bumps or traces 34*a* and to the ground bus or plane of the second external circuit.

Alternatively, in the chip package, a first metal pad, bump or trace 34*a* and the fine-line metal trace 619 can connect the voltage regulator or converter circuit 41 of the semiconductor chip to a first external circuit, such as semiconductor chip, printed circuit board, ball-grid-array (BGA) substrate, metal substrate, glass substrate or ceramic substrate, by bonding the first metal pad, bump or trace 34*a* to the first external circuit or by wirebonding a gold wire, an aluminum wire or a copper wire to the first metal pad, bump or trace 34*a* and to the first external circuit, to receive an external power voltage Vdd from the first external circuit. A second metal pad, bump or trace 34*a* and the fine-line metal trace 619' can connect the voltage regulator or converter circuit 41 of the semiconductor chip to the first external circuit by bonding the second metal pad, bump or trace 34*a* to the first external circuit or by wirebonding a gold wire, an aluminum wire or a copper wire to the second metal pad, bump or trace 34*a* and to the first external circuit, to output a regulated or converted power voltage Vcc to the first external circuit. Multiple third metal pads, bumps or traces 34*a* and the fine-line metal traces 621, 622 and 624 can connect the internal circuits 21, 22, 23 and 24 of the semiconductor chip to a ground bus or plane of the first external circuit by bonding the third metal pads, bumps or traces 34*a* to the ground bus or plane of the first external circuit or by wirebonding multiple gold wires, multiple aluminum wires or multiple copper wires to the third metal pads, bumps or traces 34*a* and to the ground bus or plane of the first external circuit. A first metal bump or pillar 27 can connect the metal trace 88*a* and the capacitor 87 of the semiconductor chip to a ground bus or plane of a second external circuit, such as semiconductor chip, printed circuit board, ball-grid-array (BGA) substrate, metal substrate, glass substrate or ceramic substrate, and can be connected to the cathode 92 of the capacitor 87 and the internal circuits 21, 22, 23 and 24 through the metal trace 88*a*. A second metal bump or pillar 27 can connect the metal trace 88*c* of the semiconductor chip to the second external circuit to output the regulated or converted power voltage Vcc to the second external circuit. The second metal bump or pillar 27 can be connected to the voltage regulator or converter circuit 41 through the metal trace 88*c* and the fine-line metal trace 619', and to the previously described inductor 36 and the anode 91 of the capacitor 87 through the metal trace 88*c*.

FIG. 33V shows a top view of another kind of capacitor 87, and FIG. 33W shows a cross sectional view cut along the dot line A-A in FIG. 33V. Referring to FIGS. 33V and 33W, the capacitor 87 is formed on the insulating layer 3 and at the backside 1*a* of the thinned silicon substrate 1 of the semiconductor wafer 10. A shielding ring 123 provided by the metal layer 4 and the bulk metal layer 9 can be formed on the insulating layer 3 and at the backside 1*a* of the thinned silicon substrate 1 of the semiconductor wafer 10 for containing the jelly electrolyte 93 of the capacitor 87. Alternatively, the shielding ring 123 can be a polymer layer, such as polyimide layer, benzocyclobutane (BCB) layer, polybenzoxazole (PBO) layer or epoxy resin layer, or an inorganic layer, such as silicon-oxide layer, silicon-oxynitride layer or silicon-nitride layer, formed on the insulating layer 3 and at the backside 1*a* of the thinned silicon substrate 1 of the semiconductor wafer 10. The shielding ring 123 has a thickness larger than that of the anode 91 of the capacitor 87 and larger than that of the cathode 92 of the capacitor 87, and has a top surface higher than that of the anode 91 of the capacitor 87 and higher than that of the cathode 92 of the capacitor 87. The' anode 91 and the cathode 92 are in the jelly electrolyte 93 in the shielding ring 123. The polymer layer 14 is formed on the jelly electrolyte 93, on the shielding ring 123, on the bulk metal layer 9 and on the insulating layer 3, and covers the jelly electrolyte 93 and the shielding ring 123.

The anode 91 of the capacitor 87 is connected to the bulk metal layer 9 of the metal trace 88*c*, and the cathode 92 of the capacitor 87 is connected to the bulk metal layer 9 of the metal trace 88*a*. The anode 91 of the capacitor 87 can be connected to the voltage regulator or converter circuit 41 and the previously described inductor 36 through the fine-line metal trace 619' and the metal trace 88*c*. The cathode 92 of the capacitor 87 can be connected to the internal circuit 21 through the fine-line metal trace 621 and the metal trace 88*a*, to the internal circuits 22 and 23 through the fine-line metal trace 622 and the metal trace 88*a*, and to the internal circuit 24 through the fine-line metal traces 622 and 624 and the metal trace 88*a*.

Two metal bumps or pillars 27 can be formed over the bulk metal layer 9 and at the backside 1*a* of the thinned silicon substrate 1. The left one metal bump or pillar 27 can be connected to the voltage regulator or converter circuit 41 through the metal trace 88*b*, through the bulk metal layer 9 in the through-silicon via 11*a* and through the fine-line metal structure 619, and to the previously described inductor 36 through the metal trace 88*b*. The right one metal bump or pillar 27 can be connected to the infernal circuit 21 through the bulk metal layer 9 in the through-silicon via 11*e*, through the fine-line metal traces 621, 622 and 624 and through the metal trace 88*a*, to the internal circuits 22 and 23 through the bulk metal layer 9 in the through-silicon via 11*e* and through the fine-line metal traces 622 and 624, and to the internal circuit 24 through the bulk metal layer 9 in the through-silicon via 11*e* and through the fine-line metal trace 624.

In FIG. 33W, a bottom scheme 103 is formed at the backside 1*a* of the thinned silicon substrate 1, and includes the insulating layer 3, the capacitor 87 composed of the anode 91, the cathode 92 and the jelly electrolyte 93, the metal trace 88*b*, the shielding ring 123, the polymer layer 14, the metal layers 16 and 18, and the metal bumps or pillars 27, and the openings 14*a* in the polymer layer 14 are over the bulk metal layer 9. An over-passivation scheme 102 is formed with the patterned circuit layers 812 and 821, the polymer layer 98 and the metal bumps 89, at the active side of the thinned silicon substrate 1, and the openings 980 in the polymer layer 98 are under the patterned circuit layers 812 and 821.

The specification of the anode 91, the cathode 92 and the jelly electrolyte 93 as shown in FIGS. 33V and 33W can be referred to as the specification of the anode 91, the cathode 92 and the jelly electrolyte 93, respectively, as illustrated in FIGS. 33A-33U. The specification of the metal bumps or pillars 27 shown in FIG. 33W can be referred to as the specification of the metal bumps or pillars 27 as illustrated in FIGS. 25G-25L and 33N-33U. The process for forming the shielding ring 123 for containing the jelly electrolyte 93, shown in FIGS. 33V and 33W, can be referred to as that for forming the metal layer 4 and the bulk metal layer 9 as illustrated in FIGS. 33A-33E. The element in FIGS. 33V and 33W indicated by a same reference number as indicates the element in FIGS. 33A-33U has a same material and spec as the element illustrated in FIGS. 33A-33U.

After forming the structure shown in FIGS. 33V and 33W, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, the left one metal bump or pillar 27 can connect the metal trace 88*b* and the previously described inductor 36 of the semiconductor chip to a power bus or plane of a first external circuit, such as printed circuit board, semiconductor chip, ball-grid-array (BGA) substrate, metal substrate, glass substrate or ceramic substrate, to receive an external power voltage Vdd from the first external circuit. The right one metal bump or pillar 27 can connect the cathode 92 of the capacitor 87 and the metal trace 88*a* of the semiconductor chip to a ground bus or plane of the first external circuit through the fine-line metal traces 622 and 624 and through the bulk metal layer 9 in the through-silicon via 11*e*, and can connect the internal circuits 21, 22, 23 and 24 of the semiconductor chip to the ground bus or plane of the first external circuit through the fine-line metal trace 624 and through the bulk metal layer 9 in the through-silicon via 11*e*. A first metal bump 89 can connect the metal trace, bus or plane 81 of the semiconductor chip to a second external circuit, such as semiconductor chip, printed circuit board, ball-grid-array (BGA) substrate, metal substrate, glass substrate or ceramic substrate, to output a regulated or converted power voltage Vcc to the second external circuit. Multiple second metal bumps 89 can connect the ground plane, bus or trace 82 of the semiconductor chip to a ground bus or plane of the second external circuit.

Alternatively, in the chip package, a first metal bump 89 can connect the metal trace, bus or plane 81P and the voltage regulator or converter circuit 41 of the semiconductor chip to a first external circuit, such as semiconductor chip, printed circuit board, ball-grid-array (BGA) substrate, metal substrate, glass substrate or ceramic substrate, to receive an external power voltage Vdd from the first external circuit. A second metal bump 89 can connect the metal trace, bus or plane 81 and of the semiconductor chip to the first external circuit to output a regulated or converted power voltage Vcc to the first external circuit. Multiple third metal bumps 89 can connect the ground plane, bus or trace 82 of the semiconductor chip to a ground bus or plane of the first external circuit. The right one metal bump or pillar 27 can connect the cathode 92 of the capacitor 87 and the metal trace 88*a* of the semiconductor chip to a ground bus or plane of a second external circuit, such as semiconductor chip, printed circuit board, ball-grid-array (BGA) substrate, metal substrate, glass substrate or ceramic substrate, through the fine-line metal traces 622 and 624 and through the bulk metal layer 9 in the through-silicon via 11*e*, and can connect the internal circuits 21, 22, 23 and 24 of the semiconductor chip to the ground bus or plane of the second external circuit through the fine-line metal trace 624 and through the bulk metal layer 9 in the through-silicon via 11*e*.

FIG. 33X shows a top view of another kind of capacitor 87, and FIG. 33Y shows a cross sectional view cut along the dot line A-A in FIG. 33X. Referring to FIGS. 33X and 33Y, the capacitor 87 is formed on the insulating layer 3 and at the backside 1*a* of the thinned silicon substrate 1 of the semiconductor wafer 10. A shielding ring 123 provided by the metal layer 4 and the bulk metal layer 9 can be formed on the insulating layer 3 and at the backside 1*a* of the thinned silicon substrate 1 of the semiconductor wafer 10 for containing the jelly electrolyte 93 of the capacitor 87. Alternatively, the shielding ring 123 can be a polymer layer, such as polyimide layer, benzocyclobutane (BCB) layer, polybenzoxazole (PBO) layer or epoxy resin layer, or an inorganic layer, such as silicon-oxide layer, silicon-oxynitride layer or silicon-nitride layer, formed on the insulating layer 3 and at the backside 1*a* of the thinned silicon substrate 1 of the semiconductor wafer 10. The shielding ring 123 has a thickness larger than that of the anode 91 of the capacitor 87 and larger than that of the cathode 92 of the capacitor 87, and has a top surface higher than that of the anode 91 of the capacitor 87 and higher than that of the cathode 92 of the capacitor 87. The anode 91 of the capacitor 87 is in the through-silicon via 11*f*, at the backside 1*a* of the thinned silicon substrate 1 and in the jelly electrolyte 93 in the shielding ring 123. The cathode 92 of the capacitor 87 is in the through-silicon via 11*d*, at the backside 1*a* of the thinned silicon substrate 1, and in the jelly electrolyte 93 in the shielding ring 123. The polymer layer 14 is formed on the jelly electrolyte 93, on the shielding ring 123, on the bulk metal layer 9 and on the insulating layer 3, and covers the jelly electrolyte 93 and the shielding ring 123.

The anode 91 of the capacitor 87 can be connected to the voltage regulator or converter circuit 41 and the previously described inductor 36 through the fine-line metal trace 619'. The cathode 92 of the capacitor 87 can be connected to the internal circuit 21 through the fine-line metal trace 621, to the internal circuits 22 and 23 through the fine-line metal trace 622, and to the internal circuit 24 through the fine-line metal traces 622 and 624.

Two metal bumps or pillars 27 are formed over the bulk metal layer 9 and at the backside 1*a* of the thinned silicon substrate 1, and connect the bulk metal layer 9. The left one metal bump or pillar 27 can be connected to the voltage regulator or converter circuit 41 through the metal trace 88*b*, through the bulk metal layer 9 in the through-silicon via 11*a* and through the fine-line metal structure 619, and to the previously described inductor 36 through the metal trace 88*b*. The right one metal bump or pillar 27 can be connected to the internal circuit 21 through the bulk metal layer 9 in the through-silicon via 11*e* and the fine-line metal traces 621, 622 and 624, to the internal circuits 22 and 23 through the bulk metal layer 9 in the through-silicon via 11*e* and the fine-line metal traces 622 and 624, to the internal circuit 24 through the bulk metal layer 9 in the through-silicon via 11*e* and the fine-line metal trace 624, and to the cathode 92 of the capacitor 87 through the bulk metal layer 9 in the through-silicon via 11*e* and the fine-line metal trace 624.

In FIG. 33Y, a bottom scheme 103 is formed at the backside 1*a* of the thinned silicon substrate 1, and includes the insulating layer 3, the capacitor 87 composed of the anode 91, the cathode 92 and the jelly electrolyte 93, the metal trace 88*b*, the shielding ring 123, the polymer layer 14, the metal layers 16 and 18, and the metal bumps or pillars 27, and the openings 14*a* in the polymer layer 14 are over the bulk metal layer 9. An over-passivation scheme 102 is formed with the patterned circuit layers 812 and 821, the polymer layer 98 and the metal bumps 89, at the active side of the thinned silicon substrate 1, and the openings 980 in the polymer layer 98 are under the patterned circuit layers 812 and 821.

The specification of the anode 91, the cathode 92 and the jelly electrolyte 93 as shown in FIGS. 33X and 33Y can be referred to as the specification of the anode 91, the cathode 92 and the jelly electrolyte 93, respectively, as illustrated in FIGS. 33A-33U. The specification of the metal bumps or pillars 27 as shown in FIG. 33Y can be referred to as the specification of the metal bumps or pillars 27 illustrated in FIGS. 25G-25L and 33N-33U. The process for forming the shielding ring 123 for containing the jelly electrolyte 93, shown in FIGS. 33X and 33Y, can be referred to as that for forming the metal layer 4 and the bulk metal layer 9 as illustrated in FIGS. 33A-33E. The element in FIGS. 33X and 33Y indicated by a same reference number as indicates the element in FIGS. 33A-33U has a same material and spec as the element illustrated in FIGS. 33A-33U.

After forming the structure shown in FIGS. 33X and 33Y, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, the left one metal bump or pillar 27 can connect the metal trace 88*b* and the previously described inductor 36 of the semiconductor chip to a power bus or plane of a first external circuit, such as printed circuit board, semiconductor chip, ball-grid-array (BGA) substrate, metal substrate, glass substrate or ceramic substrate, to receive an external power voltage Vdd from the first external circuit. The right one metal bump or pillar 27 can connect the cathode 92 of the capacitor 87 and the internal circuits 21, 22, 23 and 24 of the semiconductor chip to a ground bus or plane of the first external circuit through the bulk metal layer 9 in the through-silicon via 11*e* and through the fine-line metal trace 624. A first metal bump 89 can connect the metal trace, bus or plane 81 of the semiconductor chip to a second external circuit, such as semiconductor chip, printed circuit board, ball-grid-array (BGA) substrate, metal substrate, glass substrate or ceramic substrate, to output a regulated or converted power voltage Vcc to the second external circuit. Multiple second metal bumps 89 can connect the ground plane, bus or trace 82 of the semiconductor chip to a ground bus or plane of the second external circuit.

Alternatively, in the chip package, a first metal bump 89 can connect the metal trace, bus or plane 81P and the voltage regulator or converter circuit 41 of the semiconductor chip to a first external such as semiconductor chip, printed circuit board, ball-grid-array (BGA) substrate, metal substrate, glass substrate or ceramic substrate, to receive an external power voltage Vdd from the first external circuit. A second metal bump 89 can connect the metal trace, bus or plane 81 and of the semiconductor chip to the first external circuit to output a regulated or converted power voltage Vcc to the first external circuit. Multiple third metal bumps 89 can connect the ground plane, bus or trace 82 of the semiconductor chip to a ground bus or plane of the first external circuit. The right one metal bump or pillar 27 can connect the cathode 92 of the capacitor 87 and the internal circuit 24 of the semiconductor chip to a ground bus or plane of a second external circuit, such as semiconductor chip, printed circuit board, ball-grid-array (BGA) substrate, metal substrate, glass substrate or ceramic substrate, through the bulk metal layer 9 in the through-silicon via 11*e* and through the fine-line metal trace 624.

FIGS. 34A-34G show a process of forming a super capacitor 87*a*, a patterned circuit layer 801, multiple metal bumps or pillars 89 and two polymer layers 98 and 99 at the active side of the thinned silicon substrate 1 of the semiconductor wafer 10 illustrated in FIG. 33T.

Figure 34A:
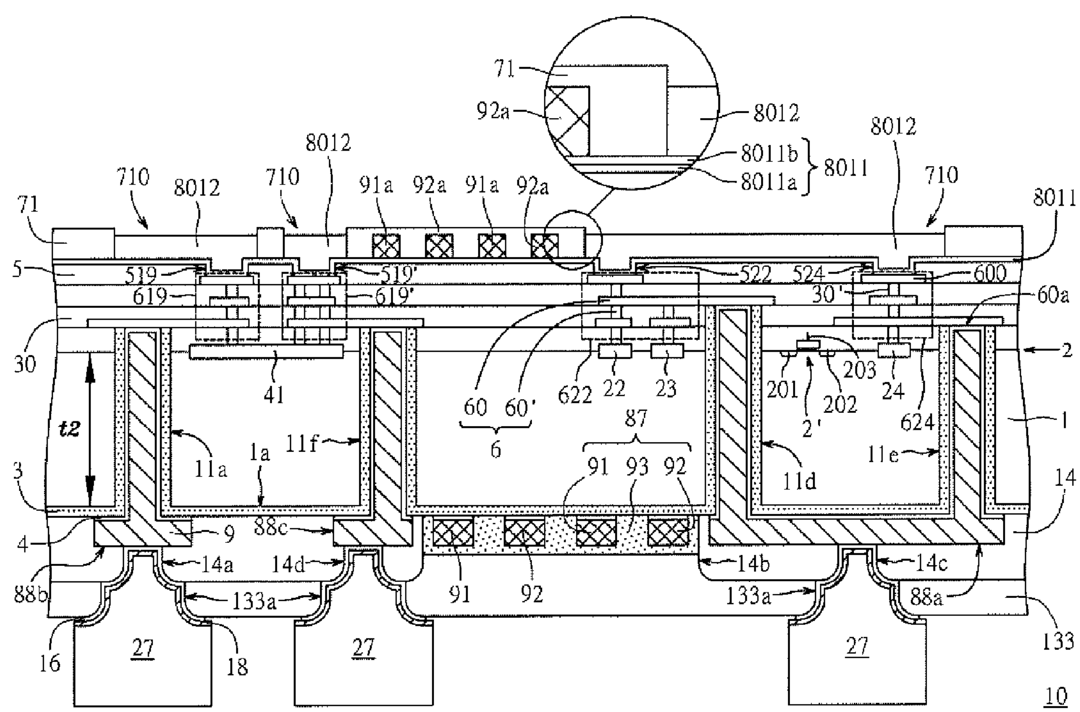

Referring to FIG. 34A, after forming the structure shown in FIG. 33T, the flux 32 is removed. Next, an adhesion/barrier/seed layer 8011 can be formed on the passivation layer 5 and on the regions 600*a* of the metal traces or pads 600 exposed by the openings 519, 519', 521, 522 and 524 in the passivation layer 5. The adhesion/barrier/seed layer 8011 can be formed by a suitable process or processes, e.g., by depositing an adhesion/barrier layer 8011*a* with a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 519, 519', 521, 522 and 524 by using a physical vapor deposition (PVD) process, such as sputtering process or evaporation process, and then depositing a seed layer 8011*b* with a thickness smaller than 1 micrometer, such as between 0.005 and 0.5 micrometers, and preferably between 0.05 and 0.2 micrometers, on the adhesion/barrier layer 8011*a* by using a physical vapor deposition (PVD) process, such as sputtering process or evaporation process. The material of the adhesion/barrier layer 8011*a* may include titanium, a titanium-tungsten alloy, titanium nitride, chromium, tantalum, tantalum nitride or a composite of the previously described materials, and the material of the seed layer 8011*b* may include copper, nickel, aluminum, gold, silver, platinum or palladium.

For example, when the adhesion/barrier layer 8011*a* is formed by a suitable process or processes, e.g., by sputtering a titanium-containing layer, such as a single layer of titanium-tungsten alloy, titanium or titanium nitride, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 519, 519', 521, 522 and 524 in the passivation layer 5, the seed layer 8011*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the titanium-containing layer.

Alternatively, when the adhesion/barrier layer 8011*a* is formed by a suitable process or processes, e.g., by sputtering a composite layer including a titanium layer having a thickness between 0.01 and 0.15 micrometers on the passivation layer 5 and on the regions 600*a* of the metal traces or pads 600 exposed by the openings 519, 519', 521, 522 and 524 and a titanium-tungsten-alloy layer having a thickness between 0.1 and 0.35 micrometers on the titanium layer, the seed layer 8011*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the titanium-tungsten-alloy layer.

Alternatively, when the adhesion/barrier layer 8011*a* is formed by a suitable process or processes, e.g., by sputtering a tantalum-containing layer, such as a single layer of tantalum or tantalum nitride, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 519, 519', 521, 522 and 524 in the passivation layer 5, the seed layer 8011*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the tantalum-containing layer.

Alternatively, when the adhesion/barrier layer 8011*a* is formed by a suitable process or processes, e.g., by sputtering a chromium-containing layer, such as a single layer of chromium layer, having a thickness smaller than 1 micrometer, such as between 0.005 and 0.8 micrometers, and preferably between 0.05 and 0.5 micrometers, on the passivation layer 5 and on the regions 600*a* of the metal traces or pads 600 exposed by the openings 519, 519', 521, 522 and 524 in the passivation layer 5, the seed layer 8011*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.005 and 0.5 micrometers, and preferably between 0.05 and 0.2 micrometers, on the chromium-containing layer.

After forming the adhesion/barrier/seed layer 8011, an anode 91*a* and a cathode 92*a* can be formed on the seed layer 8011*b* of the adhesion/barrier/seed layer 8011. The material of the anode 91*a* may include polyaniline, active carbon, graphite, polypyrrole, carbon nanotube, a NiCo alloy or $RuO_2$. Alternatively, the anode 91*a* may be a composite layer including a nickel layer on the seed layer 8011*b* and a carbon layer on a top surface and sidewall of the nickel layer. The material of the cathode 92*a* may include polyaniline, active carbon, graphite, carbon nanotube or polypyrrole. For example, when the anode 91*a* is a NiCo alloy, the cathode 92*a* may be active carbon or carbon nanotube. Alternatively, the anode 91*a* and the cathode 92*a* can be porous. The anode 91*a* has a thickness larger than 1 micrometer, such as between 1 and 20 micrometers, and preferably between 2 and 10 micrometers, and has a width larger than 1 micrometer, such as between 1 and 20 micrometers, and preferably between 2 and 10 micrometers. The cathode 92*a* has a thickness larger than 1 micrometer, such as between 1 and 20 micrometers, and preferably between 2 and 10 micrometers, and has a width larger than 1 micrometer, such as between 1 and 20 micrometers, and preferably between 2 and 10 micrometers.

After forming the anode 91*a* and the cathode 92*a*, a photoresist layer 71, such as positive-type photoresist layer or negative-type photoresist layer, having a thickness larger than 3 micrometers, such as between 3 and 110 micrometers, and preferably between 5 and 25 micrometers, is formed on the seed layer 8011*b*, on the anode 91*a* and on the cathode 92*a* by a spin-on coating process, a lamination process, a screen-printing process or a spraying process. Next, the photoresist layer 71 is patterned with the processes of exposure and development to form multiple openings 710 in the photoresist layer 71 exposing the seed layer 8011*b*.

Next, a bulk metal layer 8012 can be formed on the seed layer 8011*b*, exposed by the openings 710 in the photoresist layer 71, of the adhesion/barrier/seed layer 8011 and in the openings 710 by a process including an electroplating process and/or an electroless plating process. The bulk metal layer 8012 may have a thickness larger than 2 micrometers, such as between 2 and 100 micrometers, and preferably between 3 and 20 micrometers, and larger than that of the seed layer 8011*b*, that of the adhesion/barrier layer 8011*a* and that of each of the fine-line metal layers 60, respectively. The bulk metal layer 8012 may have a width larger than 1 micrometer, such as between 5 and 150 micrometers, and preferably between 5 and 50 micrometers, and larger than that of each of the fine-line metal layers 60. The material of the bulk metal layer 8012 may include gold, copper, silver, aluminum, palladium, platinum, rhodium, ruthenium, rhenium, nickel or a composite of the previously described materials. The process of forming the bulk metal layer 8012 on the seed layer 8011*b*, exposed by the openings 710 in the photoresist layer 71, of the adhesion/barrier/seed layer 8011 and in the openings 710 as shown in FIG. 34A can be referred to as the process of forming the bulk metal layer 8012 on the seed layer, exposed by the openings 710 in the photoresist layer 71, of the adhesion/barrier/seed layer 8011 and in the openings 710 as illustrated in FIG. 15F. The specification of the bulk metal layer 8012 shown in FIG. 34A can be referred to as the specification of the bulk metal layer 8012 illustrated in FIG. 15F.

Figure 34B:
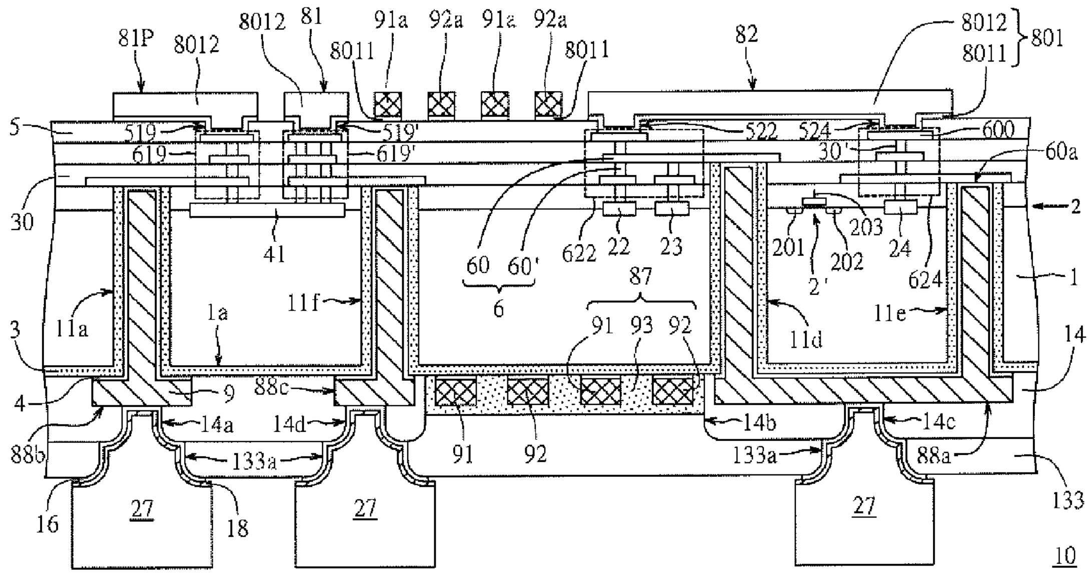

Referring to FIG. 34B, after forming the bulk metal layer 8012, the photoresist layer 71 is removed using an inorganic solution or using an organic solution with amide. Next, the adhesion/barrier/seed layer 8011 not under the bulk metal layer 8012, the anode 91*a* and the cathode 92*a* is removed by etching the seed layer 8011*b* not under the bulk metal layer 8012, the anode 91*a* and the cathode 92*a*, and then etching the adhesion/barrier layer 8011*a* not under the bulk metal layer 8012, the anode 91*a* and the cathode 92*a*. The process of etching the seed layer 8011*b* of the adhesion/barrier/seed layer 8011 not under the bulk metal layer 8012, the anode 91*a* and the cathode 92*a* as shown in FIG. 34B can be referred to as the process of etching the seed layer of the adhesion/barrier/seed layer 8011 not under the bulk metal layer 8012 as illustrated in FIG. 15H. The process of etching the adhesion/barrier layer 8011*a* of the adhesion/barrier/seed layer 8011 not under the bulk metal layer 8012, the anode 91*a* and the cathode 92*a* as shown in FIG. 34B can be referred to as the process of etching the adhesion/barrier layer of the adhesion/barrier/seed layer 8011 not under the bulk metal layer 8012 as illustrated in FIG. 15H.

Accordingly, the anode 91*a* and the cathode 92*a* can be formed over the passivation layer 5 and at the active side of the thinned silicon substrate 1, and the patterned circuit layer 801 composed of the adhesion/barrier/seed layer 8011 and the bulk metal layer 8012 can be formed on the passivation layer 5 and at the active side of the thinned silicon substrate 1. The patterned circuit layer 801 includes multiple metal traces 81, 81P and 82 on the passivation layer 5 and at the active side of the thinned silicon substrate 1, and the metal traces 81, 81P and 82 are provided by the adhesion/barrier/seed layer 8011 and the bulk metal layer 8012. The metal trace 81 can be connected to the voltage regulator or converter circuit 41 through the opening 519' in the passivation layer 5 and through the fine-line metal trace 619', and to multiple power nodes of the internal circuit 21, 22, 23 and 24. The metal trace 81P can be connected to the voltage regulator or converter circuit 41 through the opening 519 in the passivation layer 5 and through the fine-line metal trace 619. The metal trace 82 can be connected to the voltage regulator or converter circuit 41, to a ground node of the internal circuit 21, to a ground node of the internal circuit 22 through the opening 522 in the passivation layer 5 and through the fine-line metal trace 622, to a ground node of the internal circuit 23 through the opening 522 in the passivation layer 5 and through the fine-line metal trace 622, and to a ground node of the internal circuit 24 through the opening 524 in the passivation layer 5 and through the fine-line metal trace 624. The metal traces 81P and 82 can be optionally connected to the previously described ESD protection circuit 44, which can be referred further to as FIG. 29B.

Figure 34C:
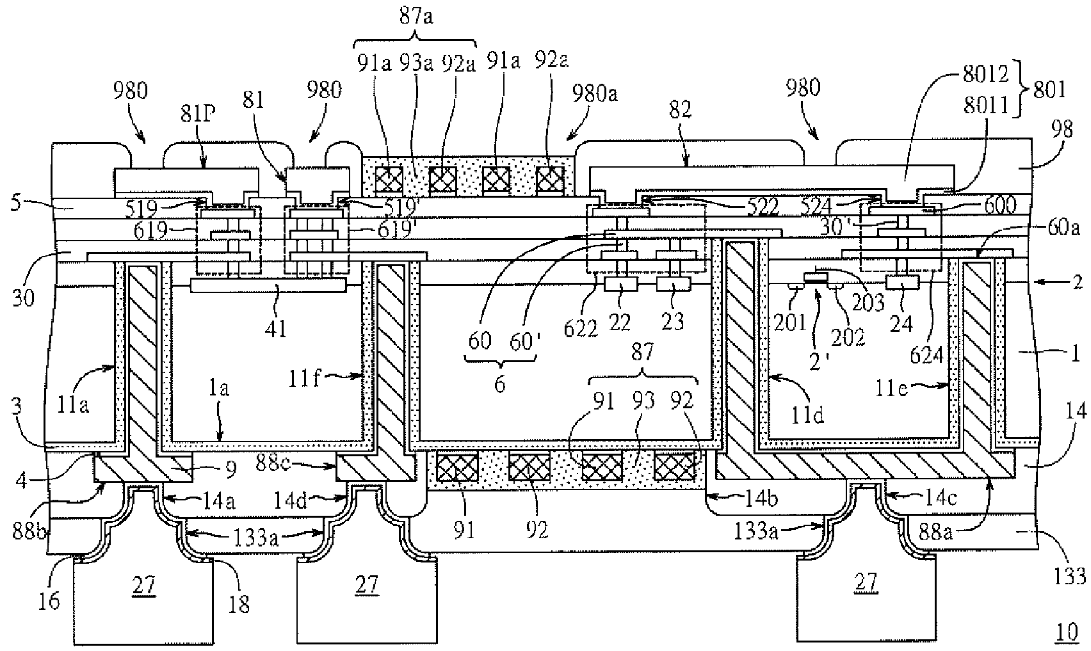

Referring to FIG. 34C, after the step illustrated in FIG. 34B, a polymer layer 98 can be formed on the passivation layer 5 and on the topmost layer of gold, copper, silver, aluminum, palladium, platinum, rhodium, ruthenium, rhenium or nickel of the previously described various the bulk metal layer 8012 by a process including a spin-on coating process, a lamination process, a screen-printing process or a spraying process and including a curing process. Multiple openings 980 in the polymer layer 98 are over multiple regions of the topmost layer of gold, copper, silver, aluminum, palladium, platinum, rhodium, ruthenium, rhenium or nickel of the previously described various the bulk metal layer 8012 and expose them. An opening 980*a* in the polymer layer 98 exposes the anode 91*a* and the cathode 92*a*, and the anode 91*a* and the cathode 92*a* are in the opening 980*a* and over the passivation layer 5. The polymer layer 98 may have a thickness larger than 2 micrometers, such as between 2 and 30 micrometers, and larger than that of each of the fine-line dielectric layers 30. The material of the polymer layer 98 may include benzocyclobutane (BCB), polyimide (PI), polybenzoxazole (PBO) or epoxy resin.

Figure 34D:
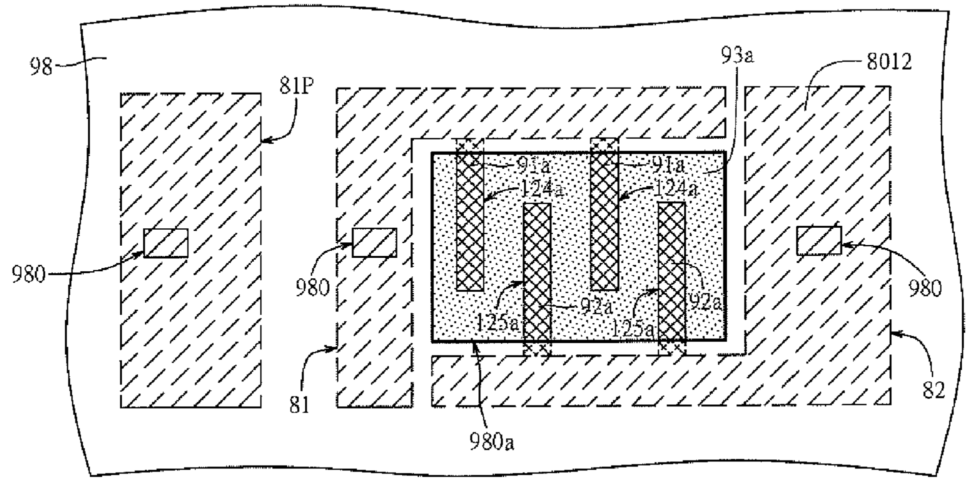

FIG. 34D is a top view of FIG. 34C. Referring to FIGS. 34C and 34D, the cathode 92*a* has multiple parallel lines 125*a* extending into gaps between multiple parallel lines 124*a* of the anode 91*a*. The horizontal space between the neighboring lines 124*a* and 125*a* of the cathode 92*a* and anode 91*a* can be larger than 0.1 micrometers, such as between 0.1 and 10 micrometers, and preferably between 1 and 5 micrometers. The anode 91*a* is connected to the node P of the voltage regulator or converter circuit 41 through the metal trace 81. The cathode 92*a* is connected to the ground node Rs of the voltage regulator or converter circuit 41 and the ground nodes Ts, Us, Vs and Ws of the internal circuits 21, 22, 23 and 24 through the metal trace 82.

After forming the polymer layer 98 and the openings 980 and 980*a* in the polymer layer 98, a jelly electrolyte 93*a*, containing a polymer and metal ions, such as $Li^+$, $Ni^+$ or $Cu^+$, is formed in the opening 980*a* in the polymer layer 98, on the passivation layer 5 exposed by the opening 980*a* and in the gaps between the parallel lines 124*a* and 125*a*, and covers top surfaces of the anode 91*a* and the cathode 92*a*.

After forming the jelly electrolyte 93*a*, the super capacitor 87*a* including the anode 91*a*, the cathode 92*a* and the jelly electrolyte 93*a* can be formed on the passivation layer 5 and in the opening 980*a* in the polymer layer 98. The super capacitor 87*a* at the active side of the thinned silicon substrate 1 has capacitance in the range of between 0.01 and 100 microfarads, and has energy storage capability in the range of between 0.1 and 10 microfarads per square meter ($\mu F/mm^2$). The area of the super capacitor 87*a*, enclosed by the bold line shown in FIG. 34D, is in the range of between 0.1 and 10 square meters. Alternatively, the jelly electrolyte 93*a* can be replaced by a liquid electrolyte containing a polymer and metal ions, such as $Li^+$, $Ni^+$ or $Cu^+$. The capacitor 87*a* is reversibly chargeable and dischargeable. The metal trace 81 can connect the anode 91*a* of the super capacitor 87*a* to the voltage regulator or converter circuit 41 and to the power nodes of the internal circuits 21, 22, 23 and 24, and the metal trace 82 can connect the cathode 92*a* of the super capacitor 87*a* to the voltage regulator or converter circuit 41 and to the ground nodes of the internal circuits 21, 22, 23 and 24.

Figure 34E:
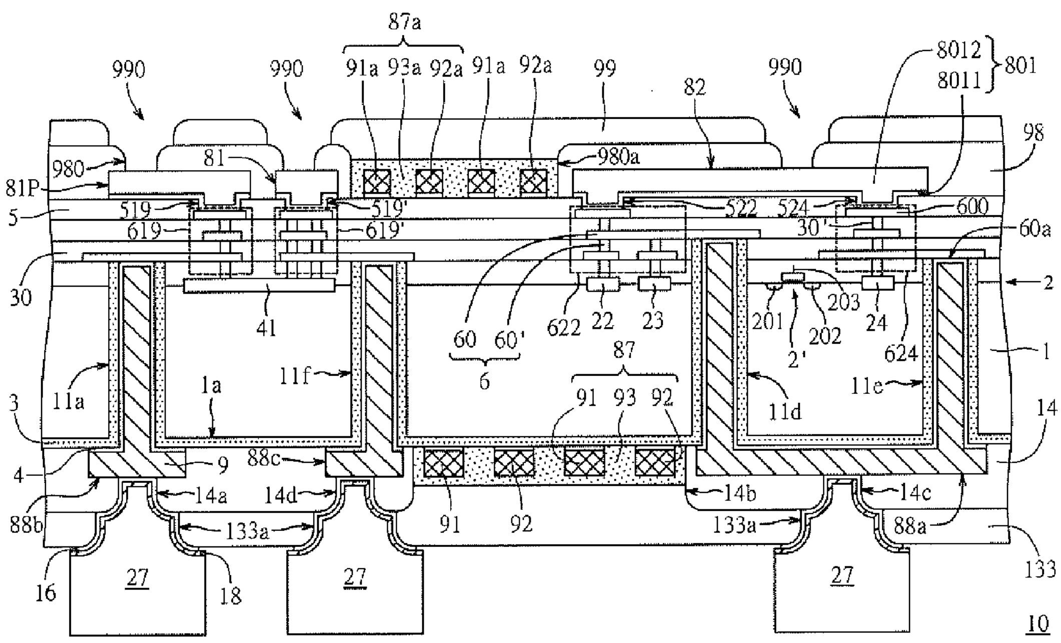

Next, referring to FIG. 34E, a polymer layer 99 is formed on the polymer layer 98 and covers the jelly electrolyte 93*a* of the super capacitor 87*a* by a process including a spin-on coating process, a lamination process, a screen-printing process or a spraying process and including a curing process, and multiple openings 990 in the polymer layer 99 are over the regions of the topmost layer of gold, copper, silver, aluminum, palladium, platinum, rhodium, ruthenium, rhenium or nickel of the previously described various the bulk metal layer 8012 exposed by the openings 980 in the polymer layer 98 and expose them. The polymer layer 990 may have a thickness larger than 2 micrometers, such as between 2 and 30 micrometers, and larger than that of each of the fine-line dielectric layers 30. The material of the polymer layer 99 may include benzocyclobutane (BCB), polyimide (P1), polybenzoxazole (PBO) or epoxy resin.

Figure 34F:
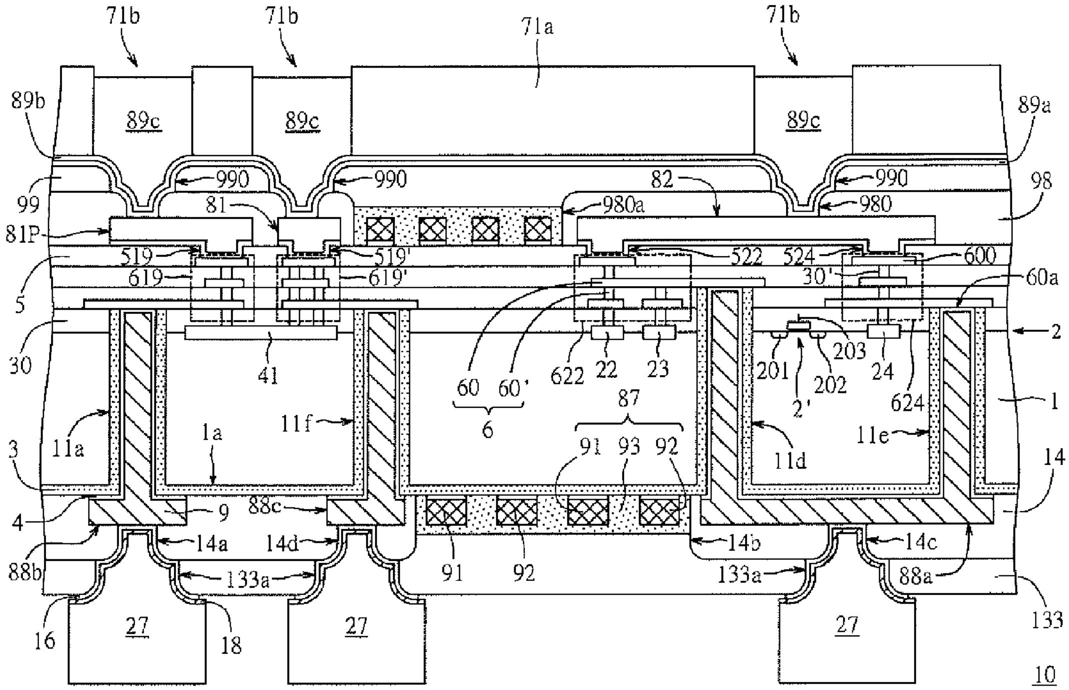

Next, referring to FIG. 34F, a metal layer 89*a* can be formed on the polymer layer 99, on the polymer layer 98 and on the regions of the topmost layer of gold, copper, silver, aluminum, palladium, platinum, rhodium, ruthenium, rhenium or nickel of the previously described various the bulk metal layer 8012 exposed by the openings 980. Next, a metal layer 89*b* can be formed on the metal layer 89*a*. The material of the metal layer 89*a* may include titanium, a titanium-tungsten alloy, titanium nitride, chromium, tantalum, tantalum nitride or a composite of the previously described materials, and the material of the metal layer 89*b* may include copper, nickel, aluminum, gold, silver, platinum or palladium. The metal layers 89*a* and 89*b* may be formed by a suitable process or processes, e.g., by a physical vapor deposition (PVD) process, such as sputtering process or evaporation process. The metal layer 89*a* may have a thickness smaller than 1 micrometer, such as between 0.02 and 0.5 micrometers, and preferably between 0.1 and 0.2 micrometers, and the metal layer 89*b* may have a thickness smaller than 1 micrometer, such as between 0.05 and 0.5 micrometers, and preferably between 0.08 and 0.15 micrometers.

For example, when the metal layer 89*a* is formed by a suitable process or processes, e.g., by sputtering a titanium-containing layer, such as a single layer of titanium-tungsten alloy, titanium or titanium nitride, having a thickness smaller than 1 micrometer, such as between 0.02 and 0.5 micrometers, and preferably between 0.1 and 0.2 micrometers, on the polymer layer 99, on the polymer layer 98 and on the regions of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the titanium-containing layer.

Alternatively, when the metal layer 89*a* is formed by a suitable process or processes, e.g., by sputtering a tantalum-containing layer, such as a single layer of tantalum or tantalum nitride, having a thickness smaller than 1 micrometer, such as between 0.02 and 0.5 micrometers, and preferably between 0.1 and 0.2 micrometers, on the polymer layer 99, on the polymer layer 98 and on the regions of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the tantalum-containing layer.

Alternatively, when the metal layer 89*a* is formed by a suitable process or processes, e.g., by sputtering a chromium-containing layer, such as a single layer of chromium layer, having a thickness smaller than 1 micrometer, such as between 0.02 and 0.5 micrometers, and preferably between 0.1 and 0.2 micrometers, on the polymer layer 99, on the polymer layer 98 and on the regions of the topmost layer of gold, copper, silver, aluminum, palladium, platinum, rhodium, ruthenium, rhenium or nickel of the previously described various the bulk metal layer 8012 exposed by the openings 980, the metal layer 89*b* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 0.05 and 0.5 micrometers, between 0.08 and 0.15 micrometers, between 0.1 and 1 micrometers or between 0.2 and 0.5 micrometers, on the chromium-containing layer.

After forming the metal layer 89*b*, a photoresist layer 71*a* can be formed on the metal layer 89*b*, and multiple openings 71*b* in the photoresist layer 71*a* are over the regions of the topmost layer of gold, copper, silver, aluminum, palladium, platinum, rhodium, ruthenium, rhenium or nickel of the previously described various the bulk metal layer 8012 exposed by the openings 980 and expose the metal layer 89*b*. Next, a metal layer 89*c* can be formed on the metal layer 89*b* exposed by the openings 71*b* and in the openings 71*b* by a process including an electroplating process. The metal layer 89*c* may have a thickness larger than 3 micrometer, such as between 3 and 200 micrometers, and preferably between 5 and 100 micrometers, and larger than that of the metal layer 89*b*, that of the metal layer 89*a* and that of each of the fine-line metal layers 60, respectively. The metal layer 89*c* may have a width larger than 1 micrometer, such as between 5 and 200 micrometers, and preferably between 5 and 50 micrometers, and larger than that of each of the fine-line metal layers 60. The metal layer 89*c* may include copper, gold, nickel, aluminum, silver, platinum, solder or a composite of the previously described materials.

For example, the metal layer 89*c* can be composed of a single metal layer formed by a suitable process or processes, e.g., by electroplating a copper layer, to a thickness larger than 3 micrometers, such as between 10 and 150 micrometers, and preferably between 20 and 100 micrometers, in the openings 71*b* and on the metal layer 89*b*, preferably the previously described copper layer 89*b*, exposed by the openings 71*b*.

Alternatively, the metal layer 89*c* can be composed of a single metal layer formed by a suitable process or processes, e.g., by electroplating a gold layer, to a thickness larger than 3 micrometers, such as between 5 and 150 micrometers, and preferably between 10 and 100 micrometers, in the openings 71*b* and on the metal layer 89*b*, preferably the previously described gold layer 89*b*, exposed by the openings 71*b*.

Alternatively, the metal layer 89*c* can be composed of a single metal layer formed by a suitable process or processes, e.g., by electroplating a nickel layer, to a thickness larger than 3 micrometers, such as between 5 and 150 micrometers, and preferably between 10 and 100 micrometers, in the openings 71*b* and on the metal layer 89*b*, preferably the previously described copper layer or nickel layer 89*b*, exposed by the openings 71*b*.

Alternatively, the metal layer 89*c* can be composed of a single metal layer formed by a suitable process or processes, e.g., by electroplating a solder layer, such as a bismuth-containing layer, an indium-containing layer or a tin-containing layer of a tin-lead alloy, a tin-silver alloy or a tin-silver-copper alloy, to a thickness larger than 5 micrometers, such as between 5 and 200 micrometers, and preferably between 10 and 150 micrometers, in the openings 71*b* and on the metal layer 89*b*, preferably the previously described copper layer or nickel layer 89*b*, exposed by the openings 71*b*.

Alternatively, the metal layer 89*c* can be composed of triple metal layers formed by a suitable process or processes, e.g., by electroplating a copper layer, to a thickness larger than 1 micrometer, such as between 3 and 150 micrometers, and preferably between 5 and 100 micrometers, in the openings 71*b* and on the metal layer 89*b*, preferably the previously described copper layer 89*b*, exposed by the openings 71*b*, next electroplating or electroless plating a nickel layer, to a thickness larger than 1 micrometer, such as between 1 and 15 micrometers, and preferably between 2 and 10 micrometers, in the openings 71*b* and on the electroplated copper layer in the openings 71*b*, and then electroplating or electroless plating a gold layer or a palladium layer, to a thickness larger than 0.005 micrometers, such as between 0.005 and 10 micrometers, and preferably between 0.05 and 1 micrometers, in the openings 71*b* and on the electroplated or electroless plated nickel layer in the openings 71*b*.

Alternatively, the metal layer 89*c* can be composed of triple metal layers formed by a suitable process or processes, e.g., by electroplating a copper layer, to a thickness larger than 1 micrometer, such as between 5 and 150 micrometers, and preferably between 10 and 100 micrometers, in the openings 71*b* and on the metal layer 89*b*, preferably the previously described copper layer 89*b*, exposed by the openings 71*b*, next electroplating or electroless plating a nickel layer, to a thickness larger than 1 micrometer, such as between 1 and 15 micrometers, and preferably between 2 and 10 micrometers, in the openings 71*b* and on the electroplated copper layer in the openings 71*b*, and then electroplating or electroless plating a solder layer, such as a bismuth-containing layer, an indium-containing layer or a tin-containing layer of a tin-lead alloy, a tin-silver alloy or a tin-silver-copper alloy, to a thickness larger than 1 micrometer, such as between 5 and 100 micrometers, and preferably between 10 and 50 micrometers, in the openings 71*b* and on the electroplated or electroless plated nickel layer in the openings 71*b*.

Figure 34G:
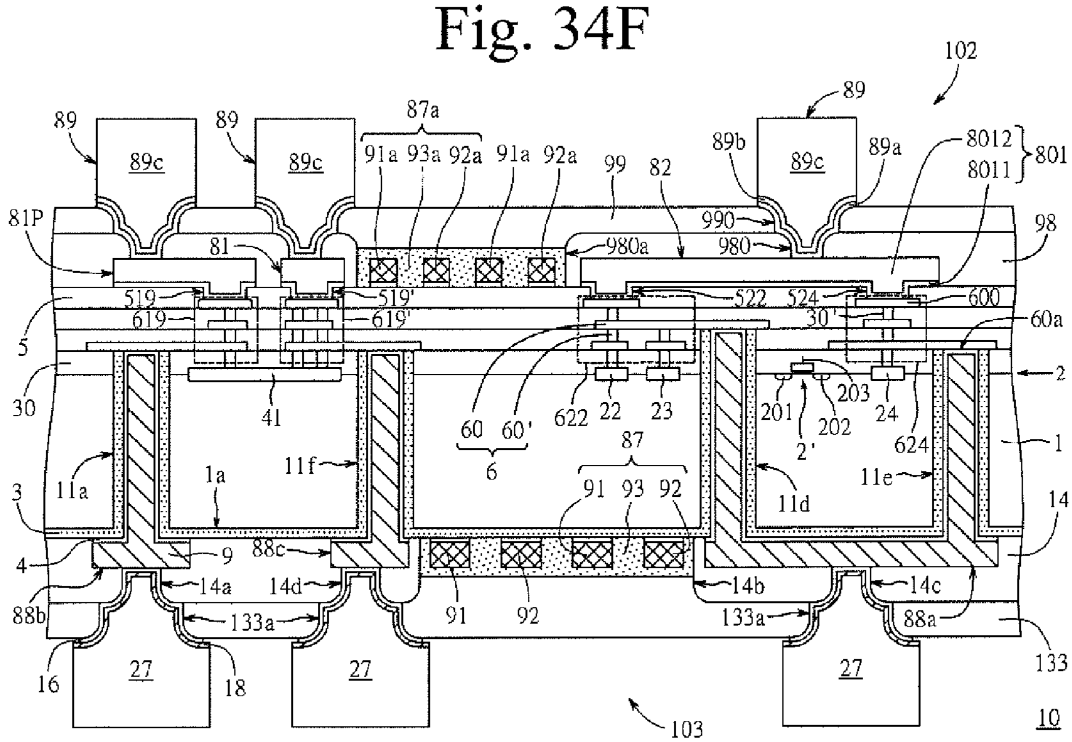

Referring to FIG. 34G, after forming the metal layer 89*c* as illustrated in FIG. 34F, the photoresist layer 71*a* is removed using an inorganic solution or using an organic solution with amide. Next, the metal layer 89*b* not under the metal layer 89*c* is removed by an etching process, and then the metal layer 89*a* not under the metal layer 89*c* is removed by an etching process. The process of removing the metal layer 89*b* not under the metal layer 89*c* as shown in FIG. 34G can be referred to as the process of removing the seed layer of the adhesion/barrier/seed layer 8011 not under the bulk metal layer 8012 as illustrated in FIG. 15H. The process of removing the metal layer 89*a* not under the metal layer 89*c* as shown in FIG. 34G can be referred to as the process of etching the adhesion/barrier layer of the adhesion/barrier/seed layer 8011 not under the bulk metal layer 8012 as illustrated in FIG. 15H.

Accordingly, the metal bumps or pillars 89 provided by the metal layers 89*a*, 89*b* and 89*c* can be formed on the polymer layers 98 and 99 and on the regions of the topmost layer of gold, copper, silver, aluminum, palladium, platinum, rhodium, ruthenium, rhenium or nickel of the previously described various the bulk metal layer 8012 exposed by the openings 980. The metal layer 89*c* of the metal bumps or pillars 89 can be used to be connected to an external circuit, such as ball-grid-array (BGA) substrate, printed circuit board, semiconductor chip, metal substrate, glass substrate or ceramic substrate, by bonding the metal layer 89*c* with the external circuit.

In FIG. 34G, a bottom scheme 103 is formed at the backside 1*a* of the thinned silicon substrate 1, and includes the insulating layer 3, the capacitor 87 composed of the anode 91, the cathode 92 and the jelly electrolyte 93, the metal traces 88*a*, 88*b* and 88*c*, and the polymer layers 14 and 133, and the openings 14*a*, 14*c* and 14*d* in the polymer layer 14 are under the bulk metal layer 9, the opening 14*b* in the polymer layer 14 is under the insulating layer 3, and the openings 133*a* in the polymer layer 133 are under the bulk metal layer 9. An over-passivation scheme 102 is formed with the metal traces 81, 81P and 82 provided by the patterned circuit layer 801, the capacitor 87*a* composed of the anode 91*a*, the cathode 92*a* and the jelly electrolyte 93*a*, the polymer layers 98 and 99, and the metal bumps 89, at the active side of the thinned silicon substrate 1, and the openings 980 in the polymer layer 98 are over the patterned circuit layer 801, the opening 980*a* in the polymer layer is over the passivation layer 5, and the openings 990 in the polymer layer 99 are over the patterned circuit layer 801.

After the step illustrated in FIG. 34G, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, for example, one of the metal bumps or pillars 27 can connect the metal trace 88*b* of the semiconductor chip to a first external circuit, such as printed circuit board, semiconductor chip, ball-grid-array (BGA) substrate, metal substrate, glass substrate or ceramic substrate, to receive an external power voltage Vdd from the first external circuit, and can be connected to the voltage regulator or converter circuit 41 through the metal trace 88*b*, through the bulk metal layer 9 in the through-silicon via 11*a* and through the fine-line metal trace 619. Another one of the metal bumps or pillars 27 can connect the metal trace 88*c* of the semiconductor chip to the first external circuit to output a regulated or converted power voltage Vcc to the first external circuit, and can be connected to the voltage regulator or converter circuit 41 through the metal trace 88*c* and the fine-line metal trace 619' and to the anode 91 of the capacitor 87 through the metal trace 88*c*. The other one of the metal bumps or pillars 27 can connect the metal trace 88*a* and the capacitor 87 of the semiconductor chip to a ground bus or plane of the first external circuit, and can be connected to the cathode 92 of the capacitor 87 and the ground nodes Ts, Us, Vs and Ws of the internal circuits 21, 22, 23 and 24 through the metal trace 88*a*. One of the metal bumps or pillars 89 can connect the metal trace 81 of the semiconductor chip to a second external circuit, such as printed circuit board, semiconductor chip, ball-grid-array (BGA) substrate, metal substrate, glass substrate or ceramic substrate, to output the regulated or converted power voltage Vcc to the second external circuit, and can be connected to the voltage regulator or converter circuit 41 through the metal trace 81 and the fine-line metal trace 619' and to the anode 91*a* of the capacitor 87*a* and the power node Tp, Up, Vp and Wp of the internal circuits 21, 22, 23 and 24 through the metal trace 81. The other one of the metal bumps or pillars 89 can connect the ground plane, bus or trace 82 of the semiconductor chip to a ground bus or plane of the second external circuit, and can be connected to the cathode 92*a* of the capacitor 87*a* and the ground nodes Ts, Us, Vs and Ws of the internal circuits 21, 22, 23 and 24 through the metal trace 82.

Alternatively, in the chip package, one of the metal bumps or pillars 89 can connect the metal trace 81P of the semiconductor chip to a first external circuit, such as semiconductor chip, printed circuit board, ball-grid-array (BGA) substrate, metal substrate, glass substrate or ceramic substrate, to receive an external power voltage Vdd from the first external circuit, and can be connected to the voltage regulator or converter circuit 41 through the metal trace 81P and the fine-line metal trace 619. Another one of the metal bumps or pillars 89 can connect the metal trace 81 of the semiconductor chip to the first external circuit to output a regulated or converted power voltage Vcc to the first external circuit, and can be connected to the voltage regulator or converter circuit 41 through the metal trace 81 and the fine-line metal trace 619' and to the anode 91*a* of the capacitor 87*a* and the power node Tp, Up, Vp and Wp of the internal circuits 21, 22, 23 and 24 through the metal trace 81. The other one of the metal bumps or pillars 89 can connect the ground plane, bus or trace 82 of the semiconductor chip to a ground bus or plane of the first external circuit, and can be connected to the cathode 92*a* of the capacitor 87*a* and the ground nodes Ts, Us, Vs and Ws of the internal circuits 21, 22, 23 and 24 through the metal trace 82. One of the metal bumps or pillars 27 can connect the metal trace 88*a* and the capacitor 87 of the semiconductor chip to a ground bus or plane of a second external circuit, such as semiconductor chip, printed circuit board, ball-grid-array (BGA) substrate, metal substrate, glass substrate or ceramic substrate, and can be connected to the cathode 92 of the capacitor 87 and the ground nodes Ts, Us, Vs and Ws of the internal circuits 21, 22, 23 and 24 through the metal trace 88*a*. The other one of the metal bumps or pillars 27 can connect the metal trace 88*c* of the semiconductor chip to the second external circuit to output the regulated or converted power voltage Vcc to the second external circuit, and can be connected to the voltage regulator or converter circuit 41 through the metal trace 88*c* and the fine-line metal trace 619' and to the anode 91 of the capacitor 87 through the metal trace 88*c*.

However, the previously described inductor 36 and the previously described capacitor 87 can be discrete devices. In the following, a process shown in FIGS. 35A-35D is introduced for connecting a discrete inductor 36 and a discrete capacitor 87 to a semiconductor wafer 10. The discrete inductor 36 can be used for the inductor 36 shown in FIGS. 29A and 29B, and the discrete capacitor 87 can be used for the capacitor 87 shown in FIGS. 29A, 29B and 29D.

Figure 35A:
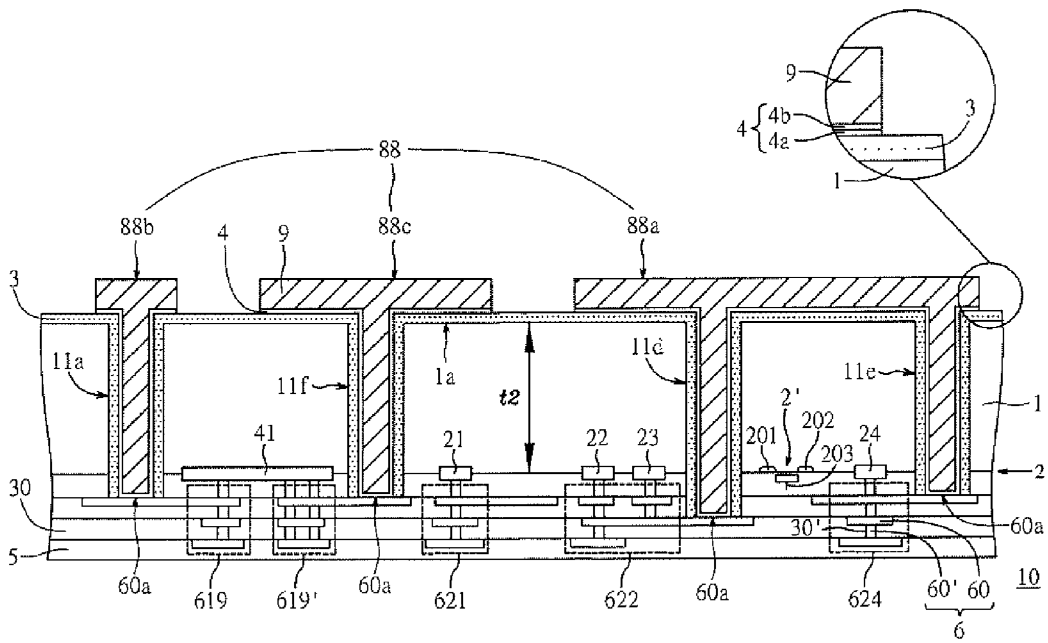

Referring to FIG. 35A, the silicon substrate 1 of the semiconductor wafer 10 illustrated in FIG. 30A is thinned to a thickness t2 between 1 and 10 micrometers, between 3 and 50 micrometers or between 10 and 150 micrometers by mechanically grinding or chemically mechanically polishing (CMP) the backside 1*a* of the silicon substrate 1. Next, the through-silicon vias 11*a*, 11*d*, 11*e* and 11*f* can be formed in the thinned silicon substrate 1 and in at least one dielectric layer 30, exposing the regions 60*a* of the fine-line metal layers 60, and then the insulating layer 3 can be formed on the backside 1*a* of the thinned silicon substrate 1 and on sidewalls of the through-silicon vias 11*a*, 11*d*, 11*e* and 11*f*, which can be referred to as the steps illustrated in FIGS. 24C-24H or FIGS. 24I-24N. The through-silicon vias 11*a*, 11*d*, 11*e* and 11*f* penetrate completely through the thinned silicon substrate 1 and the dielectric layer(s) 30. Next, the interconnecting structures 88 provided by the metal layers 4 and 9 can be formed in the through-silicon vias 11*a*, 11*d*, 11*e* and 11*f*, on the insulating layer 3 and at the backside 1*a* of the thinned silicon substrate 1, which can be referred to as the steps illustrated in FIGS. 25A-25F. The interconnecting structures 88 include multiple metal traces 88*a*, 88*b* and 88*c*.

Figure 35B:
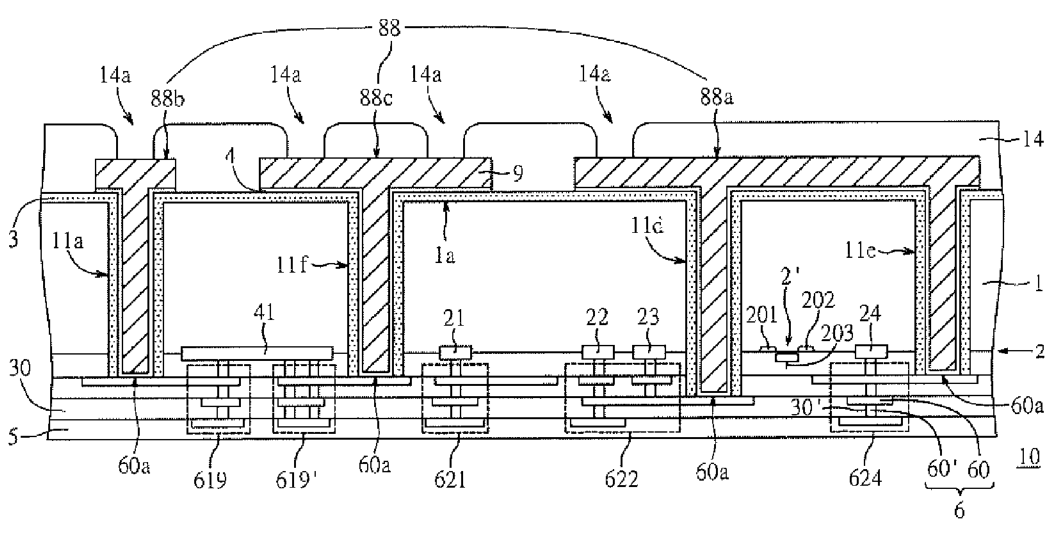

Referring to FIG. 35B, after the step illustrated in FIG. 35A, a polymer layer 14 is formed on the insulating layer 3 and on the topmost layer of copper, gold, aluminum, nickel or palladium of the previously described various bulk metal layer 9 by a process including a spin-on coating process, a lamination process, a screen-printing process or a spraying process and including a curing process, and multiple openings 14*a* in the polymer layer 14 are over multiple regions of the topmost layer of copper, gold, aluminum, nickel or palladium of the previously described various bulk metal layer 9 and expose them. The polymer layer 14 may have a thickness larger than 3 micrometers, such as between 3 and 50 micrometers, and preferably between 5 and 25 micrometers. The material of the polymer layer 14 may include benzocyclobutane (BCB), polyimide (PI), polybenzoxazole (PBO) or epoxy resin. The process of forming the polymer layer 14 and the openings 14*a* in the polymer layer 14 as shown in FIG. 35B can be referred to as the process of forming the polymer layer 14 and the opening 14*a* in the polymer layer 14 as illustrated in FIG. 25G.

Figure 35C:
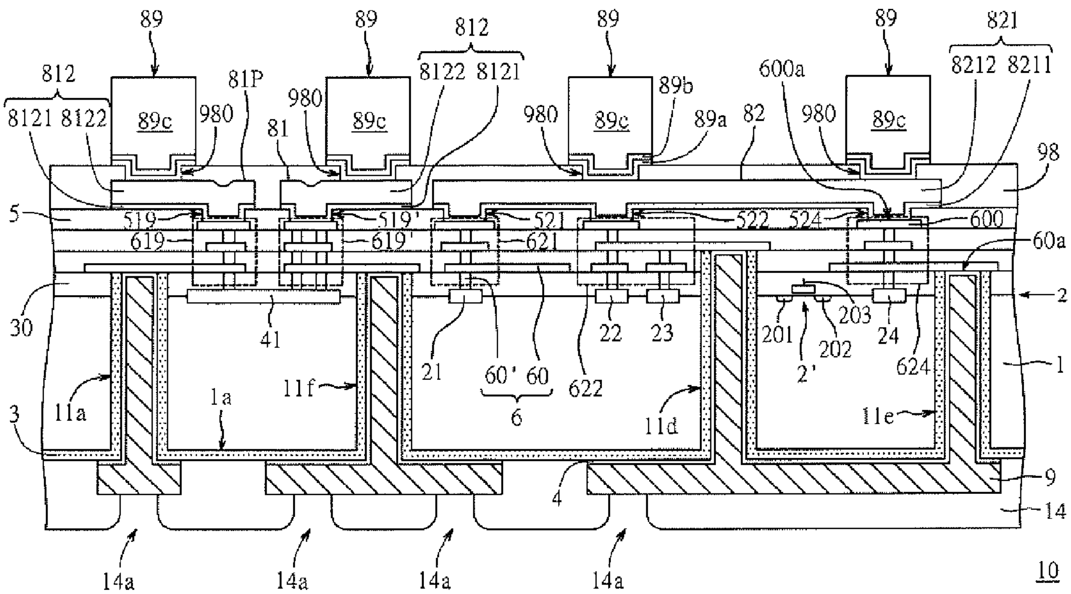

Referring to FIG. 35C, after the step illustrated in FIG. 35B, using the steps illustrated in FIGS. 15D-15H, multiple patterned circuit layers 812 composed of an adhesion/barrier/seed layer 8121 and a metal layer 8122 can be formed on the passivation layer 5 and on the regions 600*a* of the metal traces or pads 600 exposed by the openings 519 and 519', and a patterned circuit layer 821 composed of an adhesion/barrier/seed layer 8211 and a metal layer 8212 can be formed on the passivation layer 5 and on the regions 600*a* of the metal traces or pads 600 exposed by the openings 521, 522 and 524. Next, a polymer layer 98 is formed on the metal layer 8122 of the patterned circuit layers 812, on the metal layer 8212 of the patterned circuit layer 821 and on the passivation layer 5, and multiple openings 980 in the polymer layer 98 are over multiple contact points of the metal layers 8122 and 8212 and expose them, which can be referred to as the step illustrated in FIG. 15I. Next, multiple metal bumps 89 provided by triple metal layers 89*a*, 89*b* and 89*c* are formed on the polymer layer 98 and on the contact points of the metal layers 8122 and 8212 exposed by the openings 980, which can be referred to as the step illustrated in FIG. 30L. Alternatively, the steps of forming the patterned circuit layers 812 and 821, the polymer layer 98 and the metal bumps 89 can be performed before the steps illustrated in FIGS. 35A and 35B. The specification of the metal bumps 89 shown in FIG. 35C can be referred to as the specification of the metal bumps 89 as illustrated in FIG. 30L. Accordingly, the patterned circuit layers 812 and 821, the polymer layer 98 and the metal bumps 89 can be formed over the passivation layer 5 at the active side of the thinned silicon substrate 1.

Figure 35D:
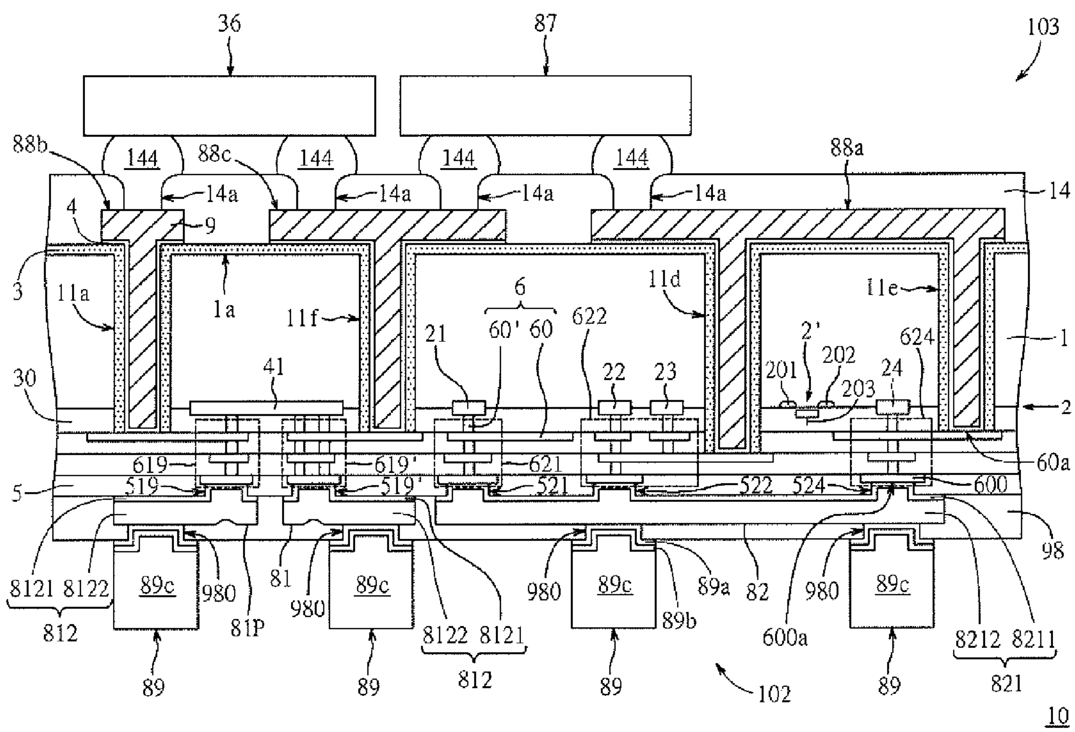

Referring to FIG. 35D, the discrete inductor 36 and the discrete capacitor 87 can be connected to the bulk metal layer 9 exposed by the openings 14*a* through multiple metal bumps 144, such as solder balls or bumps, gold bumps, copper bumps, silver bumps, aluminum bumps or nickel bumps, having a thickness larger than 1 micrometer, such as between 10 and 250 micrometers. Accordingly, a bottom scheme 103 at the backside 1*a* of the thinned silicon substrate 1 is formed with the insulating layer 3, the metal traces 88*a*, 88*b* and 88*c* provided by the metal layers 4 and 9, the discrete inductor 36, the discrete capacitor 87, the metal bumps 144, and the polymer layer 14, and the openings 14*a* in the polymer layer 14 are over the bulk metal layer 9. An over-passivation scheme 102 is formed with the patterned circuit layers 812 and 821, the polymer layer 98 and the metal bumps 89, at the active side of the thinned silicon substrate 1, and the openings 980 in the polymer layer 98 are under the patterned circuit layers 812 and 821. After forming the structure shown in FIG. 35D, the semiconductor wafer 10 can be cut into a plurality of individual semiconductor chip by a die-sawing process. After the die-sawing process, the semiconductor chip cut from the semiconductor wafer 10 can be packaged for a chip package.

In the chip package, the discrete inductor 36 at the backside 1*a* of the thinned silicon substrate 1 of the semiconductor chip can be connected to the voltage regulator or converter circuit 41 of the semiconductor chip through the metal traces 88*b* and 88*c*, through the bulk metal layer 9 in the through-silicon vias 11*f* and 11*a* and through the fine-line metal traces 619 and 619'. The discrete capacitor 87 at the backside 1*a* of the thinned silicon substrate 1 of the semiconductor chip can be connected to the voltage regulator or converter circuit 41 of the semiconductor chip through the metal trace 88*c*, through the bulk metal layer 9 in the through-silicon via 11*f* and through the fine-line metal trace 619', to the discrete inductor 36 through the metal trace 88*c*, to the internal circuit 21 through the metal trace 88*a* and through the fine-line metal trace 621, to the internal circuits 22 and 23 through the metal trace 88*a*, through the bulk metal layer 9 in the through-silicon via 11*d* and through the fine-line metal trace 622, and to the internal circuit 24 through the metal trace 88*a*, through the bulk metal layer 9 in the through-silicon via 11*e* and through the fine-line metal trace 624. One of the metal bumps 89 can connect the metal trace 81P at the active side of the thinned silicon substrate 1 of the semiconductor chip to an external circuit, such as printed circuit board, semiconductor chip, ball-grid-array (BGA) substrate, metal substrate, glass substrate or ceramic substrate, to receive an external power voltage Vdd from the external circuit, and can be connected to the metal trace 88*b* and the discrete inductor 36 at the backside 1*a* of the thinned silicon substrate 1 of the semiconductor chip and the voltage regulator or converter circuit 41 of the semiconductor chip through the metal trace 81P at the active side of the thinned silicon substrate 1 of the semiconductor chip and through the fine-line metal trace 619 of the semiconductor chip. Another one of the metal bumps 89 can connect the metal trace 81 at the active side of the thinned silicon substrate 1 of the semiconductor chip to the external circuit to output a regulated or converted power voltage Vcc to the external circuit, and can be connected to the metal trace 88*c* and the discrete inductor 36 at the backside 1*a* of the thinned silicon substrate 1 of the semiconductor chip and the voltage regulator or converter circuit 41 of the semiconductor chip through the metal trace 81 at the active side of the thinned silicon substrate 1 of the semiconductor chip and through the fine-line metal trace 619' of the semiconductor chip. The other two of the metal bumps 89 can connect the ground plane, bus or trace 82 at the active side of the thinned silicon substrate 1 of the semiconductor chip to a ground bus or plane of the external circuit, and can be connected to the metal trace 88*a* at the backside 1*a* of the thinned silicon substrate 1 of the semiconductor chip and the ground nodes Ts, Us, Vs and Ws of the internal circuits 21, 22, 23 and 24 of the semiconductor chip through the ground plane, bus or trace 82 at the active side of the thinned silicon substrate 1.

Figure 36A:
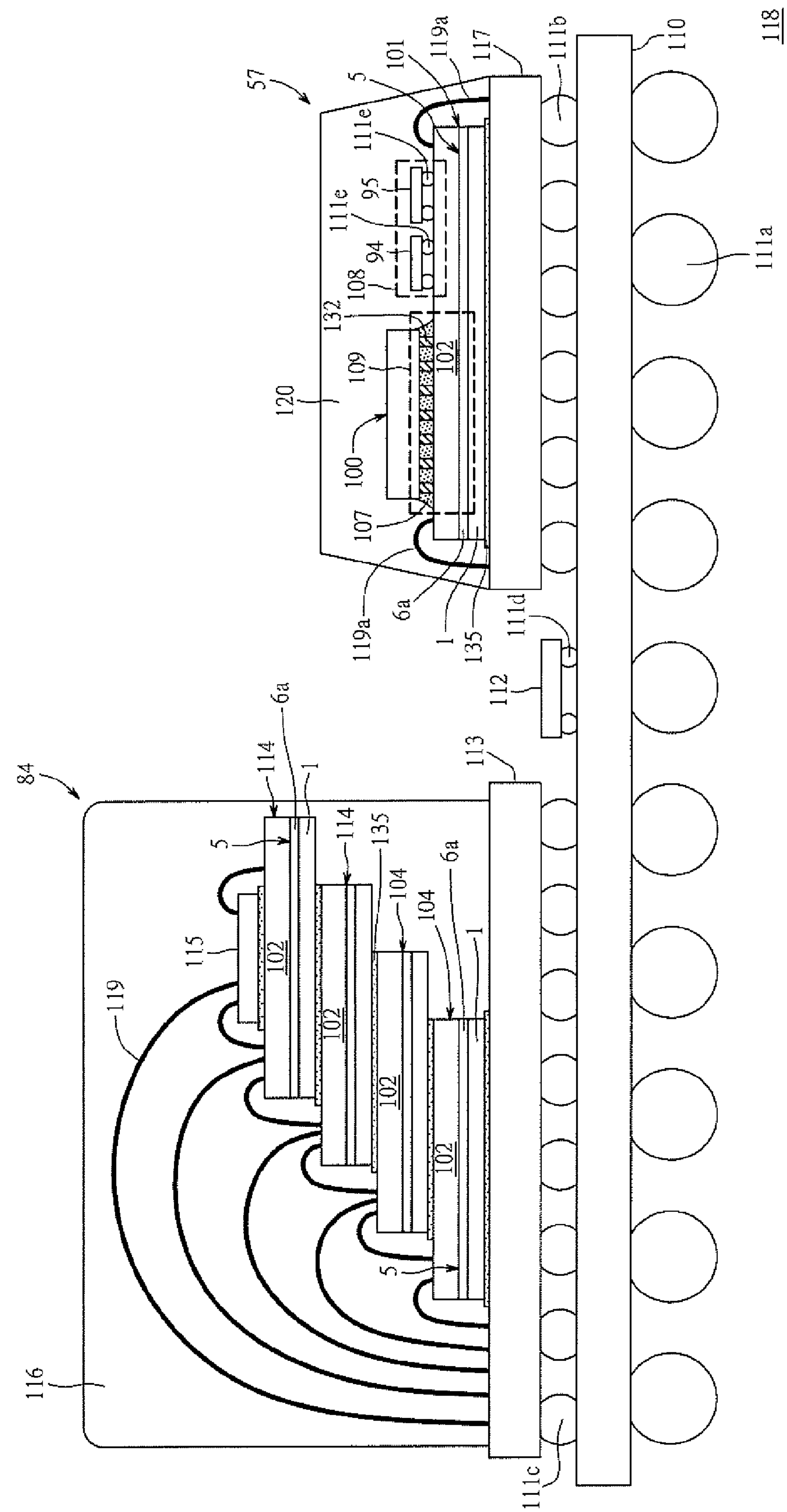

Referring to FIG. 36A, a chip-package module 118 contains a ball-grid-array (BGA) substrate 110, two chip packages 57 and 84 on the top side of the BGA substrate 110, a discrete capacitor 112 over the top side of the BGA substrate 110, and multiple solder balls 111*a* on the bottom side of the BGA substrate 110. The discrete capacitor 112 can be provided on and connected to the BGA substrate 110 through multiple solder balls 111*d*. The BGA substrate 110 of the chip-package module 118 can be provided on and connected to a substrate, such as printed circuit board, metal substrate, glass substrate or ceramic substrate, through the solder balls 111*a*. The solder balls 111*a* and 111*d* may include bismuth, indium, a tin-lead alloy, a tin-silver alloy or a tin-silver-copper alloy.

The chip package 84 contains a ball-grid-array (BGA) substrate 113, two dynamic-random-access-memory (DRAM) chips 104 over the top side of the BGA substrate 113, two flash memory chips 114 over the DRAM chips 104 and over the BGA substrate 113, an application-specific-integrated-circuit (ASIC) chip 115 on the top one of the flash memory chips 114, over the DRAM chips 104 and over the BGA substrate 113, multiple solder balls 111*c* containing bismuth, indium, a tin-lead alloy, a tin-silver alloy or a tin-silver-copper alloy on the bottom side of the BGA substrate 113, multiple wirebonded wires 119, such as gold wires, copper wires or aluminum wires, connecting one of the chips 104, 114 and 115 to the other one of the chips 104, 114 and 115 or to the BGA substrate 113, and a molding compound 116, such as a polymer or an epoxy-based material, on the top side of the BGA substrate 113, on the wirebonded wires 119 and on the chips 104, 114 and 115, encapsulating the chips 104, 114 and 115 and the wirebonded wires 119. The BGA substrate 113 of the chip package 84 can be provided on and connected to the BGA substrate 110 through the solder balls 111*c*.

The line 5 shown in FIG. 36A indicates the previously described passivation layer. The DRAM chips 104 and the flash memory chips 114 each contain a combination of the previously described silicon substrate 1, an IC structure 6*a*, the previously described passivation layer 5 and the previously described over-passivation scheme 102, and the combination can be referred to one of FIGS. 1B-1D, 3B-3D, 5B, 5K, 5S, 5U-5Z, 7B-7D, 8A-8F, 10A-10I, 12B-12D, 14B-14D, 15H, 15K-15M, 16L, 16M, 17J, 18I, 19H, 20 and 23K, and, as shown in these figures, the IC structure 6*a* that is over the silicon substrate 1 and under the passivation layer 5 may include the previously described internal circuits 21, 22, 23 and 24, the previously described voltage regulator or converter circuit 41, the previously described off-chip buffer 42, the previously described ESD circuits 43 and 44, the previously described dielectric layers 30, the previously described vias 30', the previously described fine-line scheme 6 including the fine-line metal layers 60 and the fine-line via plugs 60', and etc. Regarding the chips 104 and 114, the patterned circuit layer of the over-passivation scheme 102 can be connect to the fine-line scheme 6 of the IC structure 6*a* through openings in the passivation layer 5.

The bottom one of the DRAM chips 104 can be mounted onto the BGA substrate 113 by adhering the silicon substrate 1 of the bottom one of the DRAM chips 104 to the top side of the BGA substrate 113 using a film 135 of a glue material, such as a polymer or an epoxy-based material, with a thickness between 1 and 50 micrometers. The top one of the DRAM chips 104 can be mounted onto the bottom one of the DRAM chips 104 by adhering the silicon substrate 1 of the top one of the DRAM chips 104 to the over-passivation scheme 102 of the bottom one of the DRAM chips 104 using another film 135 of the glue material. The bottom one of the flash memory chips 114 can be mounted onto the top one of the DRAM chips 104 by adhering the silicon substrate 1 of the bottom one of the flash memory chips 114 to the over-passivation scheme 102 of the top one of the DRAM chips 104 using another film 135 of the glue material. The top one of the flash memory chips 114 can be mounted onto the bottom one of the flash memory chips 114 by adhering the silicon substrate 1 of the top one of the flash memory chips 114 to the over-passivation scheme 102 of the bottom one of the flash memory chips 114 using another film 135 of the glue material. The ASIC chip 115 can be mounted onto the top one of the flash memory chips 114 by adhering the ASIC chip 115 to the over-passivation scheme 102 of the top one of the flash memory chips 114 using another film 135 of the glue material.

The top one of the DRAM chips 104 has a right portion overhanging the bottom one of the DRAM chips 104, and the bottom one of the DRAM chips 104 has a left portion not vertically under the top one of the DRAM chips 104. The top one of the DRAM chips 104 has a left sidewall recessed from that of the bottom one of the DRAM chips 104. The bottom one of the flash memory chips 114 has a right portion overhanging the top one of the DRAM chips 104, and the top one of the DRAM chips 104 has a left portion not vertically under the bottom one of the flash memory chips 114. The bottom one of the flash memory chips 114 has a left sidewall recessed from that of the top one of the DRAM chips 104. The top one of the flash memory chips 114 has a right portion overhanging the bottom one of the flash memory chips 114, and the bottom one of the flash memory chips 114 has a left portion not vertically under the top one of the flash memory chips 114. The top one of the flash memory chips 114 has a left sidewall recessed from that of the bottom one of the flash memory chips 114.

One of the wirebonded wires 119, for example, can be bonded on the bulk metal layer 8012 of the patterned circuit layer 801 in the over-passivation scheme 102, on the bulk metal layer 8022 of the patterned circuit layer 802 in the over-passivation scheme 102, on the bulk metal layer 8032 of the patterned circuit layer 803 in the over-passivation scheme 102, on the metal trace 81 in the over-passivation scheme 102, on the metal trace 81P in the over-passivation scheme 102, on the metal trace 82 in the over-passivation scheme 102, on the metal trace 83 in the over-passivation scheme 102, on the metal trace 83' in the over-passivation scheme 102, on the metal trace 83*r* in the over-passivation scheme 102, or on the metal trace 85 in the over-passivation scheme 102, to connect one of the chips 104 and 114 to the other one of the chips 104 and 114, to the chip 115 or to the BGA substrate 113.

The chip package 57 contains a ball-grid-array (BGA) substrate 117, a chip 101 on the top side of the BGA substrate 117, a memory chip 100, such as dynamic-random-access-memory (DRAM) chip or statistic-random-access-memory (SRAM) chip, over the chip 101 and over the BGA substrate 117, multiple solder balls 111*b* containing bismuth, indium, a tin-lead alloy, a tin-silver alloy or a tin-silver-copper alloy on the bottom side of the BGA substrate 117, a super discrete capacitor 94 over the chip 101 and over the BGA substrate 117, a super discrete inductor 95 over the chip 101 and over the BGA substrate 117, multiple wirebonded wires 119*a*, such as gold wires, copper wires or aluminum wires, connecting the chip 101 to the BGA substrate 117, and a molding compound 120, such as a polymer or an epoxy-based material, on the top side of the BGA substrate 117, on the wirebonded wires 119*a*, on the chips 100 and 101, on the super discrete capacitor 94 and on the super discrete inductor 95, encapsulating the chips 100 and 101, the wirebonded wires 119*a*, the super discrete capacitor 94 and the super discrete inductor 95. The BGA substrate 117 of the chip package 57 can be provided on and connected to the BGA substrate 110 through the solder balls 111*b*.

The chip 101 can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a global-positioning-system (GPS) chip, a bluetooth chip, a wireless local area network (WLAN) chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processingunit (CPU) circuit block, a system-on chip (SOC) including a graphics-processing-unit (GPU) circuit block and a wireless local area network (WLAN) circuit block, but not including any baseband circuit block and any central-processing-unit (CPU) circuit block, or a system-on chip (SOC) including a graphics-processing-unit (GPU) circuit block, a baseband circuit block, a digital-signal-processing (DSP) circuit block, a wireless local area network (WLAN) circuit block and a central-processing-unit (CPU) circuit block designed by x86 architecture or by non x86 architectures. Alternatively, the chip 101 can be a chip including a central-processing-unit (CPU) circuit block, a graphics-processing-unit (GPU) circuit block, a baseband circuit block, a digital-signal-processing (DSP) circuit block, a bluetooth circuit block, a global-positioning-system (GPS) circuit block, and/or a wireless local area network (WLAN) circuit block. The chip 101, graphics-processing-unit (GPU) chip, or the graphics-processing-unit (GPU) circuit block in the chip 101 can be designed for 2D or 3D video display, and can be connected to a 3D video display, such as 3D television (3D TV), or a 3D video game player through the wirebonded wires 119*a*, the BGA substrates 117 and 110 and the solder balls 111*a* and 111*b*.

The chip 101 contains a combination of the previously described silicon substrate 1, an IC structure 6*a*, the previously described passivation layer 5 and the previously described over-passivation scheme 102, and the combination can be referred to one of FIGS. 1B-1D, 3B-3D, 5B, 5K, 5S, 5U-5Z, 7B-7D, 8A-8F, 10A-10I, 12B-12D, 14B-14D, 15H, 15K-15M, 16L, 16M, 17J, 18I, 19H, 20 and 23K, and, as shown in these figures, the IC structure 6*a* that is over the silicon substrate 1 and under the passivation layer 5 may include the previously described internal circuits 21, 22, 23 and 24, the previously described voltage regulator or converter circuit 41, the previously described off-chip buffer 42, the previously described ESD circuits 43 and 44, the previously described dielectric layers 30, the previously described vias 30', the previously described fine-line scheme 6 including the fine-line metal layers 60 and the fine-line via plugs 60', and etc. Regarding the chip 101, the patterned circuit layer of the over-passivation scheme 102 can be connect to the fine-line scheme 6 of the IC structure 6*a* through openings in the passivation layer 5.

The super discrete capacitor 94 and the super discrete inductor 95 can be provided on and connected to the previously described patterned circuit layer of the over-passivation scheme 102 of the chip 101 through multiple solder balls 111*e* including bismuth, indium, a tin-lead alloy, a tin-silver alloy or a tin-silver-copper alloy. For example, the process for mounting the discrete capacitor 94 and the discrete inductor 95 on the over-passivation scheme 102 of the chip 101 may be performed by screen printing a solder paste, containing a tin-lead alloy, a tin-silver alloy or a tin-silver-copper alloy, on multiple contact points, optionally exposed by openings in the topmost polymer layer, of the patterned circuit layer 801, 802 or 803 or the metal trace 81, 81P, 82, 83, 83', 83*r* or 85 in the over-passivation scheme 102 of the chip 101, then mounting the discrete capacitor 94 and the discrete inductor 95 onto the solder paste, and then reflowing or heating the solder paste to form the solid solder balls 111*e* bonding the discrete capacitor 94 and the discrete inductor 95 to the chip 101.

The chip 101 can be mounted onto the BGA substrate 117 by adhering the silicon substrate 1 of the chip 101 to the top side of the BGA substrate 117 using another film 135 of the glue material. The memory chip 100 can be provided on and connected to the patterned circuit layer in the over-passivation scheme 102 of the chip 101 through multiple metal balls, bumps or posts 132, such as copper bumps or posts, solder balls or bumps, nickel bumps or posts or gold bumps or posts, with a thickness larger than 5 micrometers, such as between 10 and 100 micrometers or between 50 and 200 micrometers, and the pitch between the neighboring metal balls, bumps or posts 132 can be larger than 10 micrometers, such as between 10 and 100 micrometers. An underfill 107, such as a polymer, is filled into the gap between the chip 101 and the memory chip 100, and encloses the metal balls, bumps or posts 132.

For the process to mounting the memory chip 100 onto the chip 101, the metal balls, bumps or posts 132 can be originally formed on the memory chip 100, and then the metal balls, bumps or posts 132 can be bonded with multiple contact points, optionally exposed by openings in the topmost polymer layer, of the patterned circuit layer 801, 802 or 803 or the metal trace 81, 81P, 82, 83, 83', 83*r* or 85 in the over-passivation scheme 102 of the chip 101. For example, the process for mounting the memory chip 100 onto the chip 101 may be performed by screen printing a solder paste, containing a tin-lead alloy, a tin-silver alloy or a tin-silver-copper alloy, on the contact points, optionally exposed by openings in the topmost polymer layer, of the patterned circuit layer 801, 802 or 803 or the metal trace 81, 81P, 82, 83, 83', 83*r* or 85 in the over-passivation scheme 102 of the chip 101, then mounting the metal balls, bumps or posts 132 preformed on the memory chip 100 onto the solder paste, and then reflowing or heating the solder paste to form a solid solder bonding the metal balls, bumps or posts 132 to the chip 101. Alternatively, the metal balls, bumps or posts 132 can be originally provided by the previously described metal bumps 89 of the over-passivation scheme 102 of the chip 101, as shown in FIGS. 8A-8F, 10A-10E, 15L, 15M, 16M and 20, and then the metal balls, bumps or posts 132 can be bonded with the memory chip 100.

One of the wirebonded wires 119*a*, for example, can be bonded on the bulk metal layer 8012 of the patterned circuit layer 801 in the over-passivation scheme 102, on the bulk metal layer 8022 of the patterned circuit layer 802 in the over-passivation scheme 102, on the bulk metal layer 8032 of the patterned circuit layer 803 in the over-passivation scheme 102, on the metal trace 81 in the over-passivation scheme 102, on the metal trace 81P in the over-passivation scheme 102, on the metal trace 82 in the over-passivation scheme 102, on the metal trace 83 in the over-passivation scheme 102, on the metal trace 83' in the over-passivation scheme 102, on the metal trace 83*r* in the over-passivation scheme 102, or on the metal trace 85 in the over-passivation scheme 102, to connect the chip 101 to the BGA substrate 117.

For low power consumption design, a wide-bit and small driver interface circuit 109 can be provided between the memory chip 100 and the chip 101. The chip 101 has multiple input/output (I/O) pads connected to the memory chip 100, and each of the I/O pads is connected to no ESD protection circuit or a smaller ESD protection circuit and a driver or receiver in the chip 101, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The memory chip 100 has multiple I/O pads connected to the chip 101, and each of the I/O pads is connected to no ESD protection circuit or a smaller ESD protection circuit, and a driver or receiver in the memory chip 100, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The data width between the chip 101 and the memory chip 100 can be larger than $2^7$, such as $2^7$, $2^8$, $2^9$, $2^{10}$ or $2^{11}$.

Furthermore, for low power consumption design, there can be provided with a green power supply circuit 108, such as regulator, with the super discrete capacitor 94 and the super discrete inductor 95 provided on the chip 101 using the solder balls 111*e*.

The chip package 57, for example, can be formed by a suitable process or processes, e.g., by bonding the metal balls, bumps or posts 132 originally formed on a plurality of the memory chip 100 onto multiple contact points, optionally exposed by openings in the topmost polymer layer, of the patterned circuit layer 801, 802 or 803 in the over-passivation scheme 102 of the wafer 10 finalized to be cut into a plurality of the chip 101, for example, shown in FIG. 15H, 15K, 16L, 17J, 18I or 19H, next flowing the underfill 107 into gaps between the wafer 10 and the plurality of the memory chip 100, enclosing the metal balls, bumps or posts 132, next bonding a plurality of the discrete capacitor 94 and a plurality of the discrete inductor 95 onto the contact points, optionally exposed by the openings in the topmost polymer layer, of the patterned circuit layer 801, 802 or 803 in the over-passivation scheme 102 of the wafer 10, for example, shown in FIG. 15H, 15K, 16L, 17J, 18I or 19H through the solder balls 111*e* using a surface-mount technology (SMT), next cutting the wafer 10 to singularize a plurality of stacked unit including the chips 100 and 101, the discrete capacitor 94 and the discrete inductor 95, next mounting the stacked unit onto the top side of the BGA substrate 117 by adhering the chip 101 to the top side of the BGA substrate 117 using the film 135 of the glue material, next bonding the wires 119*a* to the chip 101 and to the BGA substrate 117 by a wirebonding process, next forming the molding compound 120 on the top side of the BGA substrate 117, on the wires 119*a*, on the chips 100 and 101, on the discrete capacitor 94 and on the discrete inductor 95, encapsulating the chips 100 and 101, the wires 119*a*, the discrete capacitor 94 and the discrete inductor 95, and then forming the solder balls 111*b* on the bottom side of the BGA substrate 117 by a ball planting process.

Figure 36B:
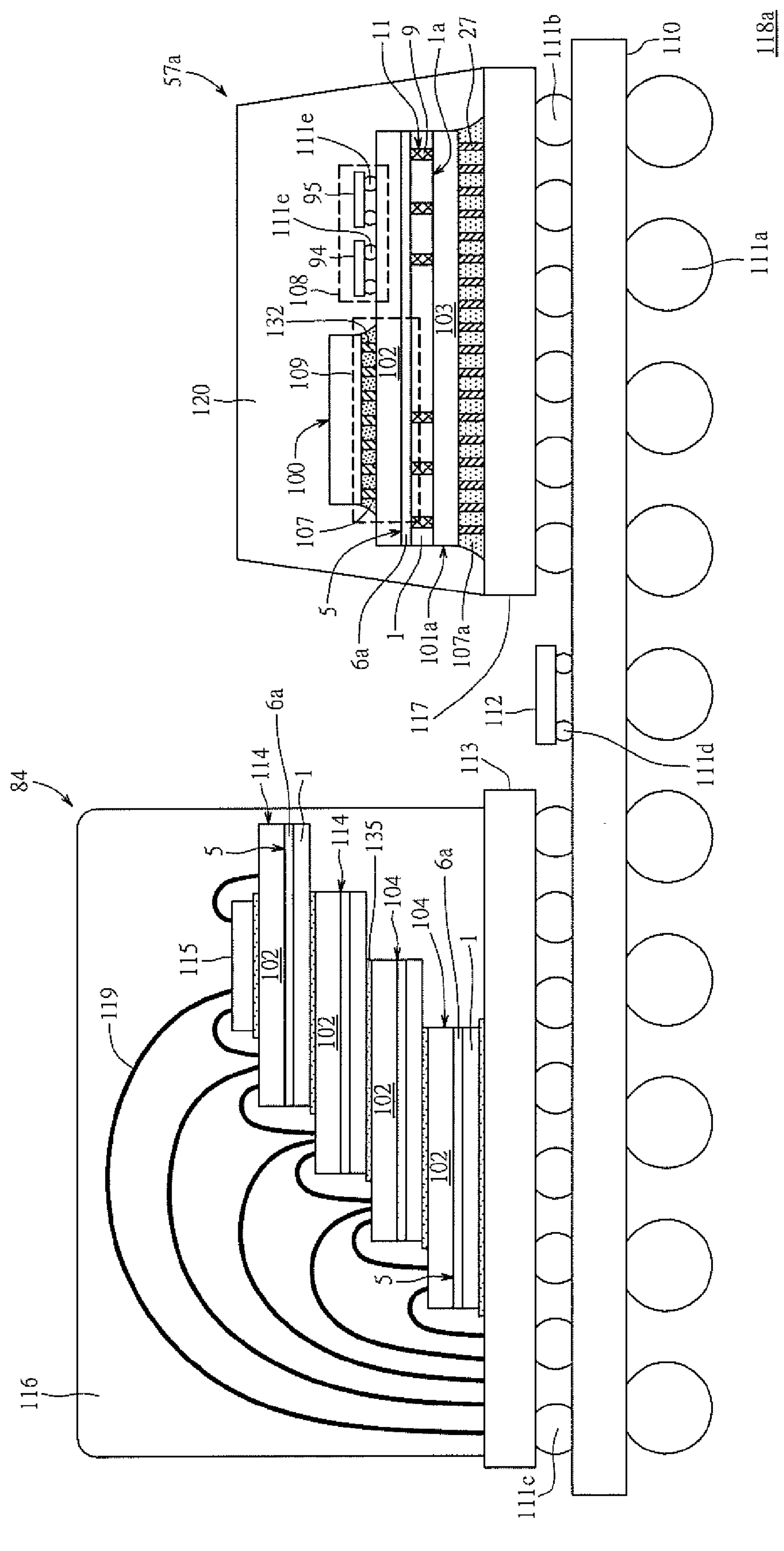

Referring to FIG. 36B, a chip-package module 118*a* contains a ball-grid-array (BGA) substrate 110, a chip package 57*a* on the top side of the BGA substrate 110, the chip package 84 illustrated in FIG. 36A on the top side of the BGA substrate 110, a discrete capacitor 112 over the top side of the BGA substrate 110, and multiple solder balls 111*a* on the bottom side of the BGA substrate 110. The discrete capacitor 112 can be provided on and connected to the BGA substrate 110 through multiple solder balls 111*d*. The BGA substrate 110 of the chip-package module 118*a* can be provided on and connected to a substrate, such as printed circuit board, metal substrate, glass substrate or ceramic substrate, through the solder balls 111*a*. The solder balls 111*a* and 111*d* may include bismuth, indium, a tin-lead alloy, a tin-silver alloy or a tin-silver-copper alloy. The specification of the chip package 84 illustrated in FIG. 36B can be referred to as the specification of the chip package 84 as illustrated in FIG. 36A, and the process of forming the chip package 84 as shown in FIG. 36B can be referred to as the process of forming the chip package 84 as illustrated in FIG. 36A. The line 5 shown in FIG. 36B indicates the previously described passivation layer, and the line 1*a* shown in FIG. 36B indicates the previously described backside of the thinned silicon substrate 1.

The chip package 57*a* contains a ball-grid-array (BGA) substrate 117, a chip 101*a* on the top side of the BGA substrate 117, a memory chip 100, such as dynamic-random-access-memory (DRAM) chip or statistic-random-access-memory (SRAM) chip, over the chip 101*a* and over the BGA substrate 117, multiple solder balls 111*b* containing bismuth, indium, a tin-lead alloy, a tin-silver alloy or a tin-silver-copper alloy on the bottom side of the BGA substrate 117, a super discrete capacitor 94 over the chip 101*a* and over the BGA substrate 117, a super discrete inductor 95 over the chip 101*a* and over the BGA substrate 117, and a molding compound 120, such as a polymer or an epoxy-based material, on the top side of the BGA substrate 117, on the chips 100 and 101*a*, on the discrete capacitor 94 and on the discrete inductor 95, encapsulating the chips 100 and 101*a* the discrete capacitor 94 and the discrete inductor 95. The BGA substrate 117 of the chip package 57*a* can be provided on and connected to the BGA substrate 110 through the solder balls 111*b*.

The chip 101*a* can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a global-positioning-system (GPS) chip, a bluetooth chip, a wireless local area network (WLAN) chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, a system-on chip (SOC) including a graphics-processing-unit (GPU) circuit block and a wireless local area network (WLAN) circuit block, but not including any baseband circuit block and any central-processing-unit (CPU) circuit block, or a system-on chip (SOC) including a graphics-processing-unit (GPU) circuit block, a baseband circuit block, a digital-signal-processing (DSP) circuit block, a wireless local area network (WLAN) circuit block and a central-processing-unit (CPU) circuit block designed by x86 architecture or by non x86 architectures. Alternatively, the chip 101*a* can be a chip including a central-processing-unit (CPU) circuit block, a graphics-processing-unit (GPU) circuit block, a baseband circuit block, a digital-signal-processing (DSP) circuit block, a bluetooth circuit block, a global-positioning-system (GPS) circuit block, and/or a wireless local area network (WLAN) circuit block. The chip 101*a*, graphics-processing-unit (GPU) chip, or the graphics-processing-unit (GPU) circuit block in the chip 101*a* can be designed for 2D or 3D video display, and can be connected to a 3D video display, such as 3D television (3D TV), or a 3D video game player through the BGA substrates 117 and 110 and the solder balls 111*a* and 111*b*.

The chip 101*a* contains a combination of the previously described thinned silicon substrate 1, an IC structure 6*a*, the previously described passivation layer 5, the previously described over-passivation scheme 102, multiple through-silicon vias 11 and the previously described bottom scheme 103 including the metal bumps or pillars 27, and the combination can be referred to one of FIGS. 25S, 25T, 26J, 26K, 27T, 28I, 30L, 31I, 32T, 33W, 33Y and 34G, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. In FIG. 36B, regarding the chip 101*a*, the over-passivation scheme 102 is formed on the passivation layer 5 at the active side of the thinned silicon substrate 1, and the bottom scheme 103 is formed at the backside 1*a* of the thinned silicon substrate 1. Regarding the chip 101*a*, the through-silicon vias 11 providing for the previously described vias 11*a*, 11*b*, 11*c*, 11*d*, 11*e* and/or 11*f* in FIG. 25S, 25T, 26J, 26K, 27T, 28I, 30L, 31I, 32T, 33W, 33Y or 34G are formed in the thinned silicon substrate 1, and the specification of the through-silicon vias 11 illustrated in FIG. 36B can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 36B can be referred to as the process of forming the through-silicon vias 11*a*, 11*b*, 11*c*, 11*d* and 11*e* as illustrated in FIGS. 24B-24N. Regarding the chip 101*a*, the metal layer of the bottom scheme 103 can be connected to the fine-line scheme 6 of the IC structure 6*a* through the bulk metal layer 9 in the through-silicon vias 11 and to the BGA substrate 117 through the metal bumps or pillars 27, and the patterned circuit layer of the over-passivation scheme 102 can be connected to the fine-line scheme 6 of the IC structure 6*a* through openings in the passivation layer 5.

The chip 101*a* can be provided on and connected to the BGA substrate 117 through the metal bumps or pillars 27 of the bottom scheme 103 of the chip 101*a*. An underfill 107*a*, such as a polymer, is filled into the gap between the chip 101*a* and the top side of the BGA substrate 117, and encloses the metal bumps or pillars 27. The super discrete capacitor 94 and the super discrete inductor 95 can be connected to the previously described patterned circuit layer in the over-passivation scheme 102 of the chip 101*a* through multiple solder balls 111*e* including bismuth, indium, a tin-silver alloy, a tin-silver-copper alloy or a tin-lead alloy. The memory chip 100 can be connected to the patterned circuit layer in the over-passivation scheme 102 of the chip 101*a* through multiple metal balls, bumps or posts 132, such as copper bumps or posts, solder balls or bumps, nickel bumps or posts or gold bumps or posts, with a thickness larger than 5 micrometers, such as between 10 and 100 micrometers or between 50 and 200 micrometers, and the pitch between the neighboring metal balls, bumps or posts 132 can be larger than 10 micrometers, such as between 10 and 100 micrometers. The metal balls, bumps or posts 132 can be originally formed on the memory chip 100, and then the metal balls, bumps or posts 132 can be bonded with the chip 101*a*. Alternatively, the metal balls, bumps or posts 132 can be originally provided by the previously described metal bumps 89 of the over-passivation scheme 102 of the chip 101*a*, as shown in FIGS. 25T, 26K, 27T, 28I, 30L, 31I, 32T, 33W, 33Y and 34G, and then the metal balls, bumps or posts 132 can be bonded with the memory chip 100. An underfill 107, such as a polymer, is filled into the gap between the chip 101*a* and the memory chip 100, and encloses the metal balls, bumps or posts 132.

For low power consumption design, a wide-bit and small driver interface circuit 109 can be provided between the memory chip 100 and the chip 101*a*. The chip 101*a* has multiple input/output (I/O) pads connected to the memory chip 100, and each of the I/O pads is connected to no ESD protection circuit or a smaller ESD protection circuit and a driver or receiver in the chip 101*a*, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The memory chip 100 has multiple I/O pads connected to the chip 101*a*, and each of the I/O pads is connected to no ESD protection circuit or a smaller ESD protection circuit, and a driver or receiver in the memory chip 100, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The data width between the chip 101*a* and the memory chip 100 can be larger than $2^7$, such as $2^7$, $2^8$, $2^9$, $2^{10}$ or $2^{11}$.

Furthermore, for low power consumption design, there can be provided with a green power supply circuit 108, such as regulator, with the super discrete capacitor 94 and the super discrete inductor 95 provided on the chip 101*a* using the solder balls 111*e*.

The chip package 57*a*, for example, can be formed by a suitable process or processes, e.g., by bonding the metal balls, bumps or posts 132 originally formed on a plurality of the memory chip 100 onto multiple contact points, exposed by the openings 980 in the polymer layer 98, of the patterned circuit layer 801 in the over-passivation scheme 102 of the wafer 10 finalized to be cut into a plurality of the chip 101*a*, for example, shown in FIG. 25S or 26J, next flowing the underfill 107 into gaps between the wafer 10 and the plurality of the memory chip 100, enclosing the metal balls, bumps or posts 132, next bonding a plurality of the discrete capacitor 94 and a plurality of the discrete inductor 95 onto the contact points, exposed by the openings 980 in the polymer layer 98, of the patterned circuit layer 801 in the over-passivation scheme 102 of the wafer 10, for example, shown in FIG. 25S or 26J through the solder balls 111*e* using a surface-mount technology (SMT), next cutting the wafer 10 to singularize a plurality of stacked unit including the chips 100 and 101*a*, the discrete capacitor 94 and the discrete inductor 95, next mounting the stacked unit onto the top side of the BGA substrate 117 by bonding the metal bumps or pillars 27 of the bottom scheme 103 of the chip 101*a* onto the top side of the BGA substrate 117, next flowing the underfill 107*a* into a gap between the chip 101*a* and the BGA substrate 117, enclosing the metal bumps or pillars 27, next forming the molding compound 120 on the top side of the BGA substrate 117, on the chips 100 and 101*a*, on the discrete capacitor 94 and on the discrete inductor 95, encapsulating the chips 100 and 101*a*, the discrete capacitor 94 and the discrete inductor 95, and then forming the solder balls ill b on the bottom side of the BGA substrate 117 by a ball planting process.

Figure 36C:
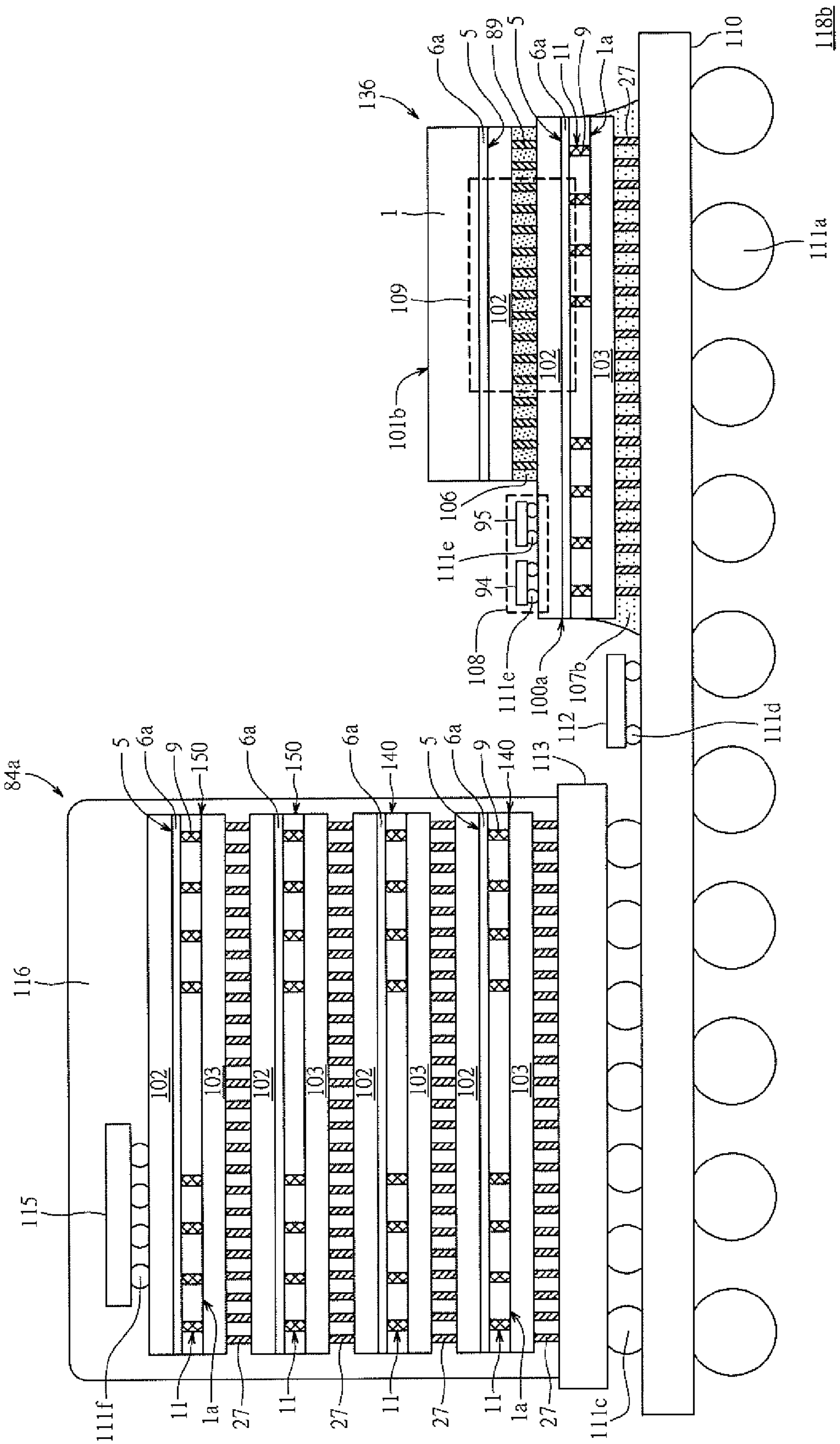

Referring to FIG. 36C, a chip-package module 118*b* contains a ball-grid-array (BGA) substrate 110, a stacked unit 136 on the top side of the BGA substrate 110, a chip package 84*a* on the top side of the BGA substrate 110, a discrete capacitor 112 over the top side of the BGA substrate 110, and multiple solder balls 111*a* on the bottom side of the BGA substrate 110. The discrete capacitor 112 can be provided on and connected to the BGA substrate 110 through multiple solder balls 111*d*. The BGA substrate 110 of the chip-package module 118*b* can be provided on and connected to a substrate, such as printed circuit board, metal substrate, glass substrate or ceramic substrate, through the solder balls 111*a*. The solder balls 111*a* and 111*d* may include bismuth, indium, a tin-lead alloy, a tin-silver alloy or a tin-silver-copper alloy.

The chip package 84*a* contains a ball-grid-array (BGA) substrate 113, two dynamic-random-access-memory (DRAM) chips 140 over the top side of the BGA substrate 113, two flash memory chips 150 over the DRAM chips 140 and over the BGA substrate 113, an application-specific-integrated-circuit (ASIC) chip 115 on the top one of the flash memory chips 150, over the DRAM chips 140 and over the BGA substrate 113, multiple solder balls 111*c* containing bismuth, indium, a tin-lead alloy, a tin-silver alloy or a tin-silver-copper alloy on the bottom side of the BGA substrate 113, and a molding compound 116, such as a polymer or an epoxy-based material, on the top side of the BGA substrate 113, encapsulating the chips 140, 150 and 115. The BGA substrate 113 of the chip package 84*a* can be provided on and connected to the BGA substrate 110 through the solder balls 111*c*.

The line 5 shown in FIG. 36C indicates the previously described passivation layer, and the line 1*a* shown in FIG. 36C indicates the previously described backside of the thinned silicon substrate 1. The DRAM chips 140 and the flash memory chips 150 each contain a combination of the previously described thinned silicon substrate 1, an IC structure 6*a*, the previously described passivation layer 5, the previously described over-passivation scheme 102, multiple through-silicon vias 11 and the previously described bottom scheme 103 including the metal bumps or pillars 27, and the combination can be referred to one of FIGS. 25S, 25T, 26J, 26K, 27T, 28I, 30L, 31I, 32T, 33W, 33Y and 34G, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. In FIG. 36C, regarding the chips 140 and 150, the over-passivation scheme 102 is formed on the passivation layer 5 at the active side of the thinned silicon substrate 1, and the bottom scheme 103 is formed at the backside 1*a* of the thinned silicon substrate 1. Regarding the chips 140 and 150, the through-silicon vias 11 providing for the previously described vias 11*a*, 11*b*, 11*c*, 11*d*, 11*e* and/or 11*f* in FIG. 25S, 25T, 26J, 26K, 27T, 28I, 30L, 31I, 32T, 33W, 33Y or 34G are formed in the thinned silicon substrate 1, and the specification of the through-silicon vias 11 illustrated in FIG. 36C can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 36C can be referred to as the process of forming the through-silicon vias 11*a*, 11*b*, 11*c*, 11*d* and 11*e* as illustrated in FIGS. 24B-24N. Regarding the chips 140 and 150, the pitch between neighboring two of the metal bumps or pillars 27 can be larger than 10 micrometers, such as between 10 and 100 micrometers. Regarding the chips 140 and 150, the metal layer of the bottom scheme 103 can be connected to the fine-line scheme 6 of the IC structure 6*a* through the bulk metal layer 9 in the through-silicon vias 11, and the patterned circuit layer of the over-passivation scheme 102 can be connected to the fine-line scheme 6 of the IC structure 6*a* through openings in the passivation layer 5.

The chip package 84*a*, for example, can be formed by a suitable process or processes, e.g., by the following steps. First, the metal bumps or pillars 27 originally formed on the DRAM chip 140 (the top one) can be bonded onto multiple contact points of the over-passivation scheme 102 or a wafer, finalized to be cut into a plurality of the DRAM chip 140 (the bottom one), which, for example, can be a plurality of the contact point 801*a* of the patterned circuit layer 801 exposed by the openings 980 in the polymer layer 98, as shown in FIG. 25S or 26J. Next, the metal bumps or pillars 27 originally formed on the flash memory chip 150 (the bottom one) can be bonded onto multiple contact points of the over-passivation scheme 102 of the DRAM chip 140 (the top one), which, for example, can be a plurality of the contact point 801*a* of the patterned circuit layer 801 exposed by the openings 980 in the polymer layer 98, as shown in FIG. 25S or 26J. Next, the metal bumps or pillars 27 originally formed on the flash memory chip 150 (the top one) can be bonded onto multiple contact points of the over-passivation scheme 102 of the flash memory chip 150 (the bottom one), which, for example, can be a plurality of the contact point 801*a* of the patterned circuit layer 801 exposed by the openings 980 in the polymer layer 98, in, as shown in FIG. 25S or 26J. Next, the ASIC chip 115 can be bonded onto multiple contact points of the over-passivation scheme 102 of the flash memory chip 150 (the top one), which, for example, can be a plurality of the contact point 801*a* of the patterned circuit layer 801 exposed by the openings 980 in the polymer layer 98, as shown in FIG. 25S or 26J, through multiple solder balls 111*f* containing bismuth, indium, a tin-lead alloy, a tin-silver alloy or a tin-silver-copper alloy by screen printing a solder paste, containing a tin-lead alloy, a tin-silver alloy, or a tin-silver-copper alloy, on the contact points of the over-passivation scheme 102 of the flash memory chip 150 (the top one), next mounting multiple metal bumps, such as a tin-containing bump, such as a tin-lead alloy, tin-silver alloy or a tin-silver-copper alloy, having a thickness between 10 and 300 micrometers or copper posts having a thickness between 10 and 100 micrometers, preformed on the ASIC chip 115 onto the solder paste, and then reflowing or heating the solder paste to form solid solder balls 111*f* bonding the ASIC chip 115 to the contact points of the top flash memory chip 150. Next, the wafer can be cut to singularize a plurality of a stacked unit including the two DRAM chips 140, the two flash memory chips 150 and the ASIC chip 115. Next, the metal bumps or pillars 27 originally formed on the DRAM chip 140 (the bottom one) in one of the singularized stacked units can be provided on the BGA substrate 113. Next, the molding compound 116 can be formed on the top side of the BGA substrate 113, encapsulating the two DRAM chips 140, the two flash memory chips 150 and the ASIC chip 115 and flowing into a gap between the bottom DRAM chip 140 and the BGA substrate 113, into a gap between the top DRAM chip 140 and the bottom DRAM chip 140, into a gap the bottom flash memory chip 150 and the top DRAM chip 140, into a gap between the top flash memory chip 150 and the bottom flash memory chip 150, and into a gap between the ASIC chip 115 and the top flash memory chip 150, enclosing the metal bumps or pillars 27 and the solder balls 111*f*. Next, the solder balls 111*c* can be formed on the bottom side of the BGA substrate 113.

The stacked unit 136 contains a memory chip 100*a*, such as dynamic-random-access-memory (DRAM) chip or statistic-random-access-memory (SRAM) chip, a chip 101*b* on the memory chip 100*a*, a super discrete capacitor 94 on the memory chip 100*a*, and a super discrete inductor 95 on the memory chip 100*a*.

The chip 101*b* can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a global-positioning-system (GPS) chip, a bluetooth chip, a wireless local area network (WLAN) chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, a system-on chip (SOC) including a graphics-processing-unit (GPU) circuit block and a wireless local area network (WLAN) circuit block, but not including any baseband circuit block and any central-processing-unit (CPU) circuit block, or a system-on chip (SOC) including a graphics-processing-unit (GPU) circuit block, a baseband circuit block, a digital-signal-processing (DSP) circuit block, a wireless local area network (WLAN) circuit block and a central-processing-unit (CPU) circuit block designed by x86 architecture or by non x86 architectures. Alternatively, the chip 101*b* can be a chip including a central-processing-unit (CPU) circuit block, a graphics-processing-unit (GPU) circuit block, a baseband circuit block, a digital-signal-processing (DSP) circuit block, a bluetooth circuit block, a global-positioning-system (GPS) circuit block, and/or a wireless local area network (WLAN) circuit block. The chip 101*b*, graphics-processing-unit (GPU) chip, or the graphics-processing-unit (GPU) circuit block in the chip 101*b* can be designed for 2D or 3D video display, and can be connected to a 3D video display, such as 3D television (3D TV), or a 3D video game player through the BGA substrate 110 and the solder balls 111*a*.

The memory chip 100*a* contains a combination of the previously described thinned silicon substrate 1, an IC structure 6*a*, the previously described passivation layer 5, the previously described over-passivation scheme 102, multiple through-silicon vias 11 and the previously described bottom scheme 103 including the metal bumps or pillars 27, and the combination can be referred to one of FIGS. 25S, 25T, 26J, 26K, 27T, 28I, 30L, 31I, 32T, 33W, 33Y and 34G, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. In FIG. 36C, regarding the memory chip 100*a*, the over-passivation scheme 102 is formed on the passivation layer 5 at the active side of the thinned silicon substrate 1, and the bottom scheme 103 is formed at the backside 1*a* of the thinned silicon substrate 1. Regarding the memory chip 100*a*, the through-silicon vias 11 providing for the previously described vias 11*a*, 11*b*, 11*c*, 11*d*, 11*e* and/or 11*f* in FIG. 25S, 25T, 26J, 26K, 27T, 28I, 30L, 31I, 32T, 33W, 33Y or 34G are formed in the thinned silicon substrate 1, and the specification of the through-silicon vias 11 illustrated in FIG. 36C can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 36C can be referred to as the process of forming the through-silicon vias 11*a*, 11*b*, 11*c*, 11*d* and 11*e* as illustrated in FIGS. 24B-24N. Regarding the memory chip 100*a*, the pitch between neighboring two of the metal bumps or pillars 27 can be larger than 10 micrometers, such as between 10 and 100 micrometers. Regarding the memory chip 100*a*, the metal layer of the bottom scheme 103 can be connected to the fine-line scheme 6 of the IC structure 6*a* through the bulk metal layer 9 in the through-silicon vias 11 and to the BGA substrate 110 through the metal bumps or pillars 27, and the metal layer of the over-passivation scheme 102 can be connected to the fine-line scheme 6 of the IC structure 6*a* through openings in the passivation layer 5.

The stacked unit 136 can be provided on the BGA substrate 110 through the metal bumps or pillars 27 of the bottom scheme 103 of the memory chip 100*a*, and the memory chip 100*a* of the stacked unit 136 can be provided on and connected to the BGA substrate 110 through the metal bumps or pillars 27. For example, the process for mounting the memory chip 100*a* of the stacked unit 136 onto the top side of the BGA substrate 110 may be performed by screen printing a solder paste, containing a tin-lead alloy, a tin-silver alloy or a tin-silver-copper alloy, on multiple contact points of the BGA substrate 110, next mounting the metal bumps or pillars 27 preformed on the memory chip 100*a* onto the solder paste, and then reflowing or heating the solder paste to form a solid solder bonding the metal bumps or pillars 27 to the contact points of the BGA substrate 110. An underfill 107*b*, such as a polymer, is filled into the gap between the memory chip 100*a* and the top side of the BGA substrate 110, and encloses the metal bumps or pillars 27.

The super discrete capacitor 94 and the super discrete inductor 95 can be provided on and connected to the previously described patterned circuit layer in the over-passivation scheme 102 of the memory chip 100*a* through multiple solder balls 111*e* including bismuth, indium, a tin-silver alloy, a tin-silver-copper alloy or a tin-lead alloy. For example, the process for mounting the discrete capacitor 94 and the discrete inductor 95 on the over-passivation scheme 102 of the memory chip 100*a* can be performed by screen printing a solder paste, containing a tin-lead alloy, a tin-silver alloy or a tin-silver-copper alloy, on multiple contact points, exposed by the openings 980 in the polymer layer 98, of the patterned circuit layer 801 in the over-passivation scheme 102, for example, shown in FIG. 25S or 26J, of the memory chip 100*a*, then mounting the discrete capacitor 94 and the discrete inductor 95 onto the solder paste, and then reflowing or heating the solder paste to form the solid solder balls 111*e* bonding the discrete capacitor 94 and the discrete inductor 95 to the memory chip 100*a*.

The chip 101*b* contains a combination of the previously described silicon substrate 1, an IC structure 6*a*, the previously described passivation layer 5 and the previously described over-passivation scheme 102, and the combination can be referred to one of FIGS. 1B-1D, 3B-3D, 5B, 5K, 5S, 5U-5Z, 7B-7D, 8A-8F, 10A-10I, 12B-12D, 14B-14D, 15H, 15K-15M, 16L, 16M, 17J, 18I, 19H, 20 and 23K, and, as shown in these figures, the IC structure 6*a* between the silicon substrate 1 and the passivation layer 5 may include the previously described internal circuits 21, 22, 23 and 24, the previously described voltage regulator or converter circuit 41, the previously described off-chip buffer 42, the previously described ESD circuits 43 and 44, the previously described dielectric layers 30, the previously described vias 30', the previously described fine-line scheme 6 including the fine-line metal layers 60 and the fine-line via plugs 60', and etc. Regarding the chip 101*b*, the patterned circuit layer of the over-passivation scheme 102 can be connect to the fine-line scheme 6 of the IC structure 6*a* through openings in the passivation layer 5, and to the patterned circuit layer of the over-passivation scheme 102 of the memory chip 100*a* through the metal bumps 89 performed on the memory chip 100*a* or the chip 101*b*.

The chip 101*b* can be provided on and connected to the memory chip 100*a* through the metal bumps 89 performed on the chip 101*b* or the memory chip 100*a*. For example, the process for mounting the chip 101*b* on the memory chip 100*a* can be performed by screen printing a solder paste, containing a tin-lead alloy, a tin-silver alloy or a tin-silver-copper alloy, on multiple contact points, exposed by the openings 980 in the polymer layer 98, of the patterned circuit layer 801 in the over-passivation scheme 102, for example, shown in FIG. 25S or 26J, of the memory chip 100*a*, then mounting the metal bumps 89, for example, shown in FIG. 10A, 10B, 10C, 10D, 10E or 15M, performed on the chip 101*b* onto the solder paste, and then reflowing or heating the solder paste to form a solid solder balls bonding the chip 101*b* to the memory chip 100*a*. Alternatively, the process for mounting the chip 101*b* on the memory chip 100*a* can be performed by screen printing a solder paste, containing a tin-lead alloy, a tin-silver alloy or a tin-silver-copper alloy, on multiple contact points, optionally exposed by openings in the topmost polymer layer, of the patterned circuit layer 801, 802 or 803 or the metal trace 81, 81P, 82, 83, 83', 83*r* or 85 in the over-passivation scheme 102 of the chip 101*b*, then mounting the metal bumps 89, for example, shown in FIG. 25T, 26K, 27T, 28I, 30L, 31I, 32T, 33W, 33Y or 34G, performed on the memory chip 100*a* onto the solder paste, and then reflowing or heating the solder paste to form a solid solder balls bonding the chip 101*b* to the memory chip 100*a*. An underfill 106, such as a polymer, can be filled into the gap between the memory chip 100*a* and the chip 101*b*, encapsulating the metal bumps 89 performed on the memory chip 100*a* or the chip 101*b*.

Furthermore, for low power consumption design, a wide-bit and small driver interface circuit 109 can be provided between the memory chip 100*a* and the chip 101*b*. The chip 101*b* has multiple I/O pads connected to the memory chip 100*a*, and each of the I/O pads is connected to no ESD protection circuit or a smaller ESD protection circuit and a driver or receiver in the chip 101*b*, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The memory chip 100*a* has multiple I/O pads connected to the chip 101*b*, and each of the I/O pads is connected to no ESD protection circuit or a smaller ESD protection circuit, and a driver or receiver in the memory chip 100*a*, and the driver has output capacitance between 0.01 and 10 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF, and the receiver has input capacitance between 0.01 and 20 pF, preferably between 0.1 and 10 pF, preferably between 0.1 and 5 pF, preferably between 0.1 and 3 pF, preferably between 0.1 and 2 pF, preferably between 0.1 and 1 pF, and preferably between 0.01 and 1 pF. The data width between the chip 101*b* and the memory chip 100*a* can be larger than $2^7$, such as $2^7$, $2^8$, 2, $2^{10}$ or $2^{11}$.

Furthermore, for low power consumption design, there can be provided with a green power supply circuit, such as regulator, with the super discrete capacitor 94 and the super discrete inductor 95 provided on the memory chip 100*a* using the solder balls 111*e*.

The stacked unit 136, for example, can be formed by a suitable process or processes, e.g., by bonding the metal bumps 89 originally formed on a plurality of the chip 101*b* onto multiple contact points, optionally exposed by the openings 980 in the polymer layer 98, of the patterned circuit layer 801 in the over-passivation scheme 102 of the wafer 10 finalized to be cut into a plurality of the memory chip 100*a*, for example, shown in FIG. 25S or 26J, next flowing the underfill 106 into gaps between the wafer 10 and the plurality of the chip 101*b*, enclosing the metal bumps 89, next bonding a plurality of the discrete capacitor 94 and a plurality of the discrete inductor 95 onto the contact points, exposed by the openings 980 in the polymer layer 98, of the patterned circuit layer 801 in the over-passivation scheme 102 of the wafer 10, for example, shown in FIG. 25S or 26J, through the solder balls 111*e* using a surface-mount technology (SMT), and then cutting the wafer 10 to singularize a plurality of the stacked unit 136 including the chips 100*a* and 101*b*, the discrete capacitor 94 and the discrete inductor 95.

Figure 36D:
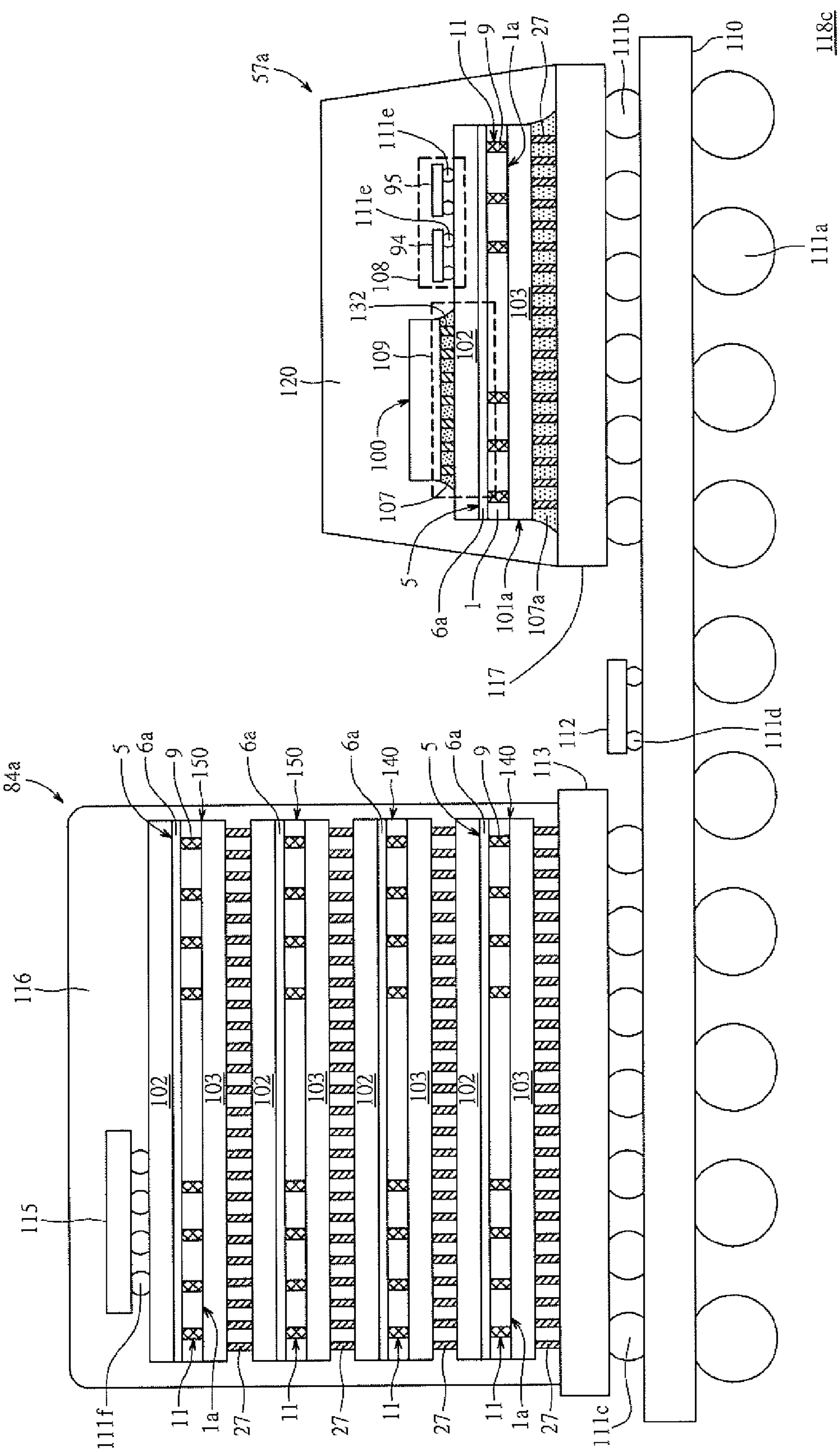

Referring to FIG. 36D, a chip-package module 118*c* contains a ball-grid-array (BGA) substrate 110, the chip package 57*a* illustrated in FIG. 36B on the top side of the BGA substrate 110, the chip package 84*a* illustrated in FIG. 36C on the top side of the BGA substrate 110, a discrete capacitor 112 over the top side of the BGA substrate 110, and multiple solder balls 111*a* on the bottom side of the BGA substrate 110. The discrete capacitor 112 can be provided on and connected to the BGA substrate 110 through multiple solder balls 111*d*. The BGA substrate 110 of the chip-package module 118*c* can be provided on and connected to a substrate, such as printed circuit board, metal substrate, glass substrate or ceramic substrate, through the solder balls 111*a*. The specification of the chip package 57*a* illustrated in FIG. 36D can be referred to as the specification of the chip package 57*a* as illustrated in FIG. 36B, and the process of forming the chip package 57*a* as shown in FIG. 36D can be referred to as the process of forming the chip package 57*a* as illustrated in FIG. 36B. The specification of the chip package 84*a* illustrated in FIG. 36D can be referred to as the specification of the chip package 84*a* as illustrated in FIG. 36C, and the process of forming the chip package 84*a* as shown in FIG. 36D can be referred to as the process of forming the chip package 84*a* as illustrated in FIG. 36C. The BGA substrate 117 of the chip package 57*a* can be provided on and connected to the BGA substrate 110 through the solder balls 111*b*. The BGA substrate 113 of the chip package 84*a* can be provided on and connected to the BGA substrate 110 through the solder balls 111*c*. The solder balls 111*a*, 111*b*, 111*c* and 111*d* may include bismuth, indium, a tin-lead alloy, a tin-silver alloy or a tin-silver-copper alloy. The line 5 shown in FIG. 36D indicates the previously described passivation layer at the thinned silicon substrate 1, and the line 1*a* shown in FIG. 36D indicates the previously described backside of the thinned silicon substrate 1.

Figure 37A:
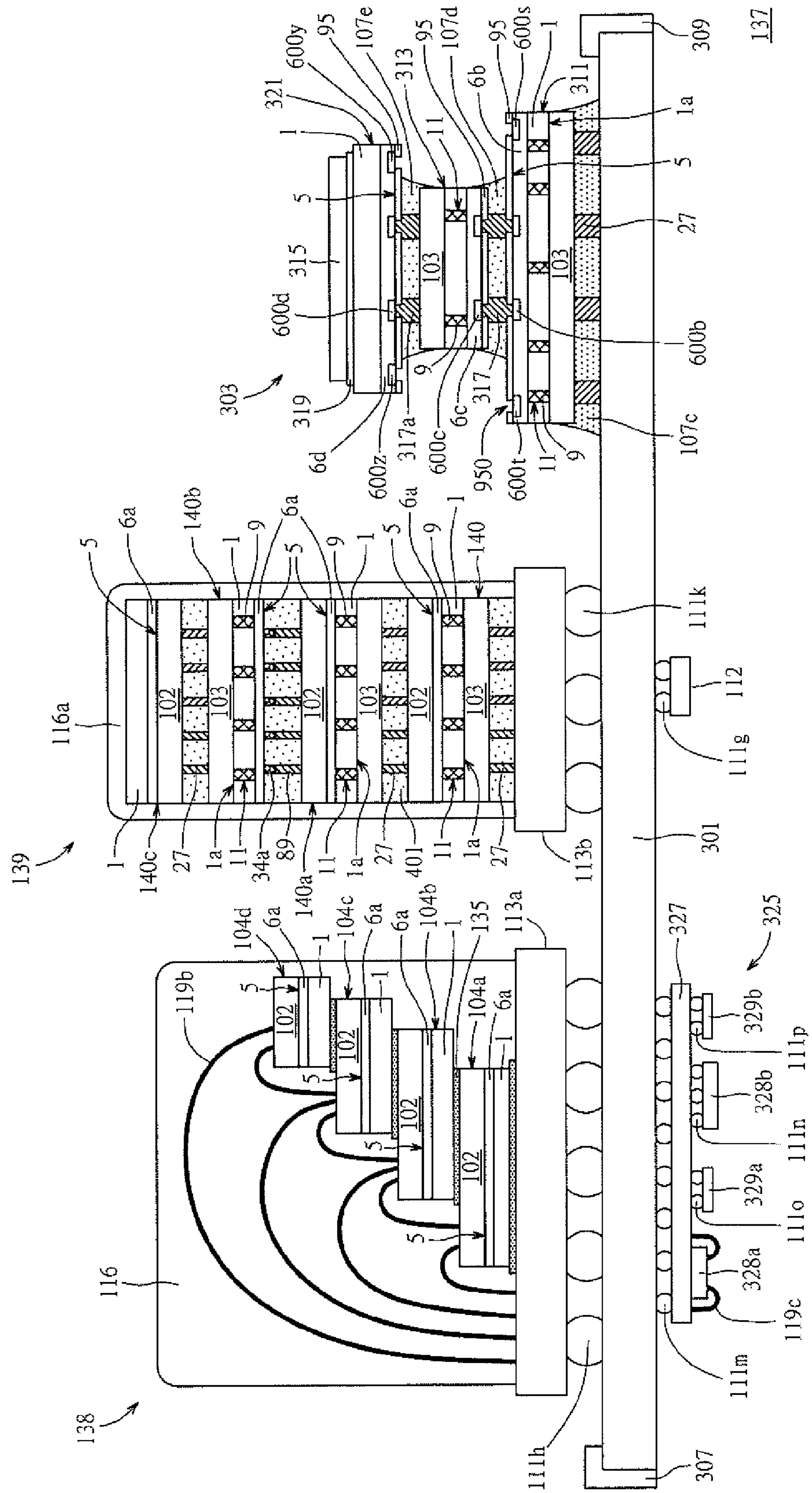

Referring to FIG. 37A, a module 137 contains a substrate 301, a wirebonded stacked memory ball-grid-array (BGA) package 138 provided on the top side of the substrate 301, a stacked dynamic-random-access-memory (DRAM) ball-grid-array (BGA) package 139 provided on the top side of the substrate 301, a processor unit 303 provided on the top side of the substrate 301, a discrete device 305 provided on the back side of the substrate 301 through solder balls 111*g* containing bismuth, indium, a tin-lead alloy, a tin-silver alloy or a tin-silver-copper alloy, two connectors 307 and 309 connected to the substrate 301, a radio frequency (RF) module 325 provided on the back side of the substrate 301 through solder balls 111*m* containing bismuth, indium, a tin-lead alloy, a tin-silver alloy or a tin-silver-copper alloy, multiple peripheral or communication devices (not shown), such as Bluetooth chips or wireless communication devices, provided on the top side and/or back side of the substrate 301 through solder balls containing bismuth, indium, a tin-lead alloy, a tin-silver alloy or a tin-silver-copper alloy, and multiple power supply devices (not shown), such as power management chips, provided on the top side and/or back side of the substrate 301 through solder balls containing bismuth, indium, a tin-lead alloy, a tin-silver alloy or a tin-silver-copper alloy.

The substrate 301 may contain an epoxy-based polymer, such as BT epoxy. The discrete device 305 can be a discrete capacitor or a discrete inductor, and can be connected to the substrate 301 through the solder balls 111*g*. Alternatively, the discrete device 305 can be provided on the top side of the substrate 301 through the solder balls 111*g*. The wirebonded stacked memory BGA package 138 is used as a mass storage, and the stacked DRAM BGA package 139 is used as a main memory.

The RF module 325 can be connected to the substrate 301 through the solder balls 111*m*. The RF module 325, in side by side multi-chip modules (MCM) format, may include a ball-grid-array (BGA) substrate 327 provided on the back side of the substrate 301 through the solder balls 111*m*, a radio frequency (RF) chip 328*a* provided on the BGA substrate 327 by using a glue material, a radio frequency (RF) chip 328*b* provided on the BGA substrate 327 through multiple solder balls 111*n* containing bismuth, indium, a tin-lead alloy, a tin-silver alloy or a tin-silver-copper alloy, and two discrete components 329*a* and 329*b* provided on the BGA substrate 327 through solder balls 1110 containing bismuth, indium, a tin-lead alloy, a tin-silver alloy or a tin-silver-copper alloy. The RF chip 328*a* can be connected to the BGA substrate 327 by bonding multiple wirebonding wires 119*c*, such as gold wires or copper wires, to the RF chip 328*a* and to the BGA substrate 327. The RF chip 328*b* can be connected to the BGA substrate 327 through the solder balls 111*n*. The discrete component 329*a*, such as discrete capacitor, discrete inductor or discrete resistor, can be connected to the BGA substrate 327 through the solder balls 111*o*. The discrete component 329*b*, such as discrete capacitor, discrete inductor or discrete resistor, can be connected to the BGA substrate 327 through the solder balls 111*o*. Both of the RF chips 328*a* and 328*b* may include a radio frequency (RF) power amplifier, a radio frequency (RF) transceiver, a radio frequency (RF) driver amplifier, a balun circuit, a surface acoustic wave (SAW) filter, a filter, a coupler, and/or an isolator.

The RF module 325 is used for transmitting or receiving RF (voice and/or data) signals for Wireless LAN (WLAN) communication and/or mobile phone communication, such as 3G CDMA (Code Division Multiple Access) or TDMA GSM (Time Division Multiple Access Global System for Mobile communication).

The connector 307 can be connected to external circuits of elements on a substrate, such as printed circuit board (PCB), for power supply or for external signals. The connector 307 can be universal serial bus (USB), such as USB 2.0 or USB 3.0, high-definition multimedia interface (HDMI), DisplayPort or IEEE 1394. Alternatively, the connector 307 can be an optical connector, such as Light Peak. The connector 307 can be connected to a charger, a 3D video game player, or a 3D video display, such as 3D television (3D TV). The connector 309 can be connected to a display, such as flat panel display, liquid crystal display (LCD) or 3D display.

The wirebonded stacked memory BGA package 138 contains a ball-grid-array (BGA) substrate 113*a*, multiple memory chips 104*a*, 104*b*, 104*c* and 104*d* over the top side of the BGA substrate 113*a*, multiple solder balls 111*h* containing bismuth, indium, a tin-lead alloy, a tin-silver alloy or a tin-silver-copper alloy on the bottom side of the BGA substrate 113*a*, multiple wirebonded wires 119*b*, such as gold wires, copper wires or aluminum wires, connecting one of the memory chips 104*a*, 104*b*, 104*c* and 104*d* to the other one of the memory chips 104*a*, 104*b*, 104*c* and 104*d* or to the BGA substrate 113*a*, and a molding compound 116, such as a polymer or an epoxy-based material, on the top side of the BGA substrate 113*a*, on the wirebonded wires 119*b* and on the memory chips 104*a*, 104*b*, 104*c* and 104*d*, encapsulating the wirebonded wires 119*b* and the memory chips 104*a*, 104*b*, 104*c* and 104*d*. The wirebonded stacked memory BGA package 138 can be provided on and connected to the substrate 301 through the solder balls 111*h* formed on the bottom side of the BGA substrate 113*a*. The BGA substrate 113*a* may contain an epoxy-based polymer, such as BT epoxy. Each of the memory chips 104*a*, 104*b*, 104*c* and 104*d* can be a flash memory chip or a dynamic-random-access-memory (DRAM) chip. Each of the memory chips 104*a*, 104*b*, 104*c* and 104*d* may have a memory size larger than 512K bits, such as between 512K bits and 256 G bits.

The memory chips 104*a*, 104*b*, 104*c* and 104*d* each contain a combination of the previously described silicon substrate 1, an IC structure 6*a*, the previously described passivation layer 5 and the previously described over-passivation scheme 102, and the combination can be referred to one of FIGS. 1B-1D, 3B-3D, 5B, 5K, 5S, 5U-5Z, 7B-7D, 8A-8F, 10A-10I, 12B-12D, 14B-14D, 15H, 15K-15M, 16L, 16M, 17J, 18I, 19H, 20 and 23K, and, as shown in these figures, the IC structure 6*a* that is over the silicon substrate 1 and under the passivation layer 5 may include the previously described internal circuits 21, 22, 23 and 24, the previously described voltage regulator or converter circuit 41, the previously described off-chip buffer 42, the previously described ESD circuits 43 and 44, the previously described dielectric layers 30, the previously described vias 30', the previously described fine-line scheme 6 including the fine-line metal layers 60 and the fine-line via plugs 60', and etc. Regarding the memory chips 104*a*, 104*b*, 104*c* and 104*d*, the patterned circuit layer of the over-passivation scheme 102 can be connect to the fine-line scheme 6 of the IC structure 6*a* through openings in the passivation layer 5. The line 5 shown in FIG. 37A indicates the previously described passivation layer.

The memory chip 104*a* can be mounted onto the BGA substrate 113*a* by adhering the silicon substrate 1 of the memory chip 104*a* to the top side of the BGA substrate 113*a* using a film 135 of a glue material, such as a polymer or an epoxy-based material, with a thickness between 1 and 50 micrometers. The memory chip 104*b* can be mounted onto the memory chip 104*a* by adhering the silicon substrate 1 of the memory chip 104*b* to the over-passivation scheme 102 of the memory chip 104*a* using another film 135 of the glue material. The memory chip 104*c* can be mounted onto the memory chip 104*b* by adhering the silicon substrate 1 of the memory chip 104*c* to the over-passivation scheme 102 of the memory chip 104*b* using another film 135 of the glue material. The memory chip 104*d* can be mounted onto the memory chip 104*c* by adhering the silicon substrate 1 of the memory chip 104*d* to the over-passivation scheme 102 of the memory chip 104*c* using another film 135 of the glue material.

The memory chip 104*b* has a right portion overhanging the memory chip 104*a*, and the memory chip 104*a* has a left portion not vertically under the memory chip 104*b*. The memory chip 104*b* has a left sidewall recessed from that of the memory chip 104*a*. The memory chip 104*c* has a right portion overhanging the memory chip 104*b*, and the memory chip 104*b* has a left portion not vertically under the memory chip 104*c*. The memory chip 104*c* has a left sidewall recessed from that of the memory chip 104*b*. The memory chip 104*d* has a right portion overhanging the memory chip 104*c*, and the memory chip 104*c* has a left portion not vertically under the memory chip 104*d*. The memory chip 104*d* has a left sidewall recessed from that of the memory chip 104*c*.

The memory chips 104*a*, 104*b*, 104*c* and 104*d* can be connected to the BGA substrate 113*a* through the wirebonded wires 119*b*, and to the substrate 301 through the wirebonded wires 119*b*, the BGA substrate 113*a* and the solder balls 111*h*.

The wirebonded stacked memory BGA package 138 contains four memory chips 104*a*, 104*b*, 104*c* and 104*d*. Alternatively, the wirebonded stacked memory BGA package 138 may contain more than four memory chips. For example, other four memory chips can be stacked over the four memory chips 104*a*, 104*b*, 104*c* and 104*d*, and the other four memory chips can be connected to each other, to the four memory chips 104*a*, 104*b*, 104*c* and 104*d* and/or to the BGA substrate 113*a* through wirebonded wires, like the wirebonded wires 119*b*. Accordingly, eight stacked memory chips can be provided on the BGA substrate 113*a*. Alternatively, other eight memory chips can be stacked over the eight stacked memory chips, and the other eight memory chips can be connected to each other, to the eight memory chips or to the BGA substrate 113*a* through wirebonded wires, like the wirebonded wires 119*b*. Accordingly, sixteen stacked memory chips can be provided on the BGA substrate 113*a*. As mentioned above, multiple stacked memory chips, such as ranging 4 to 16 stacked memory chips, can be provided over the BGA substrate 113*a*.

One of the wirebonded wires 119*b*, for example, can be bonded on the bulk metal layer 8012 of the patterned circuit layer 801 in the over-passivation scheme 102, on the bulk metal layer 8022 of the patterned circuit layer 802 in the over-passivation scheme 102, on the bulk metal layer 8032 of the patterned circuit layer 803 in the over-passivation scheme 102, on the metal trace 81 in the over-passivation scheme 102, on the metal trace 81P in the over-passivation scheme 102, on the metal trace 82 in the over-passivation scheme 102, on the metal trace 83 in the over-passivation scheme 102, on the metal trace 83' in the over-passivation scheme 102, on the metal trace 83*r* in the over-passivation scheme 102, or on the metal trace 85 in the over-passivation scheme 102, to connect one of the memory chips 104*a*, 104*b*, 104*c* and 104*d* to the other one of the memory chips 104*a*, 104*b*, 104*c* and 104*d* or to the BGA substrate 113*a*.

The stacked DRAM BGA package 139 contains a ball-grid-array (BGA) substrate 113*b*, multiple dynamic-random-access-memory (DRAM) chips 140, 140*a*, 140*b* and 140*c* over the top side of the BGA substrate 113*b*, multiple solder balls 111*k* containing bismuth, indium, a tin-lead alloy, a tin-silver alloy or a tin-silver-copper alloy on the bottom side of the BGA substrate 113*b*, and a molding compound 116*a*, such as a polymer or an epoxy-based material, on the top side of the BGA substrate 113*b* and on the DRAM chip 140*c*, encapsulating the DRAM chips 140, 140*a*, 140*b* and 140*c*. The stacked DRAM BGA package 139 can be provided on and connected to the substrate 301 through the solder balls 111*k*. The BGA substrate 113*b* may contain an epoxy-based polymer, such as BT epoxy. Each of the DRAM chips 140, 140*a*, 140*b* and 140*c* may have a memory size larger than 512K bits, such as between 512K bits and 256 G bits.

The DRAM chip 140 contains a combination of the previously described thinned silicon substrate 1, an IC structure 6*a*, the previously described passivation layer 5, the previously described over-passivation scheme 102, multiple through-silicon vias 11 and the previously described bottom scheme 103 including the metal bumps or pillars 27, and the combination can be referred to one of FIGS. 25S, 25T, 26J, 26K, 27T, 28I, 30L, 31I, 32T, 33W, 33Y and 34G, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. In FIG. 37A, regarding the DRAM chip 140, the over-passivation scheme 102 is formed on the passivation layer 5 at the active side of the thinned silicon substrate 1, and the bottom scheme 103 is formed at the backside 1*a* of the thinned silicon substrate 1. Regarding the DRAM chip 140, the through-silicon vias 11 providing for the previously described vias 11*a*, 11*b*, 11*c*, 11*d*, 11*e* and/or 11*f* in FIG. 25S, 25T, 26J, 26K, 27T, 28I, 30L, 31I, 32T, 33W, 33Y or 34G are formed in the thinned silicon substrate 1, and the specification of the through-silicon vias 11 illustrated in FIG. 37A can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 37A can be referred to as the process of forming the through-silicon vias 11*a*, 11*b*, 11*c*, 11*d* and 11*e* as illustrated in FIGS. 24B-24N. Regarding the DRAM chip 140, the metal layer of the bottom scheme 103 can be connected to the fine-line scheme 6 of the IC structure 6*a* through the bulk metal layer 9 in the through-silicon vias 11, and the patterned circuit layer of the over-passivation scheme 102 can be connected to the fine-line scheme 6 of the IC structure 6*a* through openings in the passivation layer 5.

The DRAM chip 140 can be provided on and connected to the BGA substrate 113*b* through the metal bumps or pillars 27 of the DRAM chip 140, and a layer 401 of a dielectric, such as a polymer, polyimide, benzocyclobutene, polybenzoxazole, an underfill or silicon oxide, can be optionally formed in a gap between the DRAM chip 140 and the BGA substrate 113*b*, encapsulating the metal bumps or pillars 27. For example, the process for mounting the DRAM chip 140 onto the BGA substrate 113*b* may be performed by screen printing a solder paste, containing bismuth, indium, a tin-lead alloy, a tin-silver alloy or a tin-silver-copper alloy, on multiple contact points of the BGA substrate 113*b*, then mounting the metal bumps or pillars 27 preformed on the DRAM chip 140 onto the solder paste, and then reflowing or heating the solder paste to form solid solder balls, containing bismuth, indium, a tin-lead alloy, a tin-silver alloy or a tin-silver-copper alloy, bonding the metal bumps or pillars 27 to the contact points of the BGA substrate 113*b*.

The DRAM chip 140*a* contains a combination of the previously described thinned silicon substrate 1, an IC structure 6*a*, the previously described passivation layer 5, the previously described over-passivation scheme 102 including the metal bumps 89, multiple through-silicon vias 11 and the previously described bottom scheme 103 including the metal bumps or pillars 27, and the combination can be referred to one of FIGS. 25T, 26K, 27T, 28I, 30L, 31I, 32T, 33W, 33Y and 34G, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. In FIG. 37A, regarding the DRAM chip 140*a*, the over-passivation scheme 102 is formed on the passivation layer 5 at the active side of the thinned silicon substrate 1, and the bottom scheme 103 is formed at the backside 1*a* of the thinned silicon substrate 1. Regarding the DRAM chip 140*a*, the through-silicon vias 11 providing for the previously described vias 11*a*, 11*b*, 11*c*, 11*d*, 11*e* and/or 11*f* in FIG. 25T, 26K, 27T, 28I, 30L, 31I, 32T, 33W, 33Y or 34G are formed in the thinned silicon substrate 1, and the specification of the through-silicon vias 11 illustrated in FIG. 37A can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 37A can be referred to as the process of forming the through-silicon vias 11*a*, 11*b*, 11*c*, 11*d* and 11*e* as illustrated in FIGS. 24B-24N. Regarding the DRAM chip 140*a*, the metal layer of the bottom scheme 103 can be connected to the fine-line scheme 6 of the IC structure 6*a* through the bulk metal layer 9 in the through-silicon vias 11, and the patterned circuit layer of the over-passivation scheme 102 can be connected to the fine-line scheme 6 of the IC structure 6*a* through openings in the passivation layer 5.

The DRAM chip 140*a* can be provided on and connected to the DRAM chip 140 through the metal bumps or pillars 27 of the DRAM chip 140*a*, and another layer 401 of the dielectric can be optionally formed in a gap between the DRAM chips 140 and 140*a*, encapsulating the metal bumps or pillars 27. For example, the process for mounting the DRAM chip 140*a* onto the DRAM chip 140 may be performed by screen printing a solder paste, containing bismuth, indium, a tin-lead alloy, a tin-silver alloy or a tin-silver-copper alloy, on multiple contact points, optionally exposed by openings in the topmost polymer layer, of the patterned circuit layer 801 in the over-passivation scheme 102 of the DRAM chip 140, then mounting the metal bumps or pillars 27 preformed on the DRAM chip 140*a* onto the solder paste, and then reflowing or heating the solder paste to form solid solder balls, containing bismuth, indium, a tin-lead alloy, a tin-silver alloy or a tin-silver-copper alloy, bonding the metal bumps or pillars 27 to the contact points of the patterned circuit layer in the over-passivation scheme 102 of the DRAM chip 140. Alternatively, the process for mounting the DRAM chip 140*a* onto the DRAM chip 140 may be performed by bonding the metal bumps or pillars 27 performed on the DRAM chip 140*a* with the metal bumps 89, for example, shown in FIGS. 25T, 26K, 27T, 28I, 30L, 31I, 32T, 33W, 33Y and 34G, performed on the DRAM chip 140.

The DRAM chip 140*b* contains a combination of the previously described thinned silicon substrate 1, an IC structure 6*a*, the previously described passivation layer 5, the previously described metal pads, bumps or traces 34*a*, multiple through-silicon vias 11 and the previously described bottom scheme 103 including the metal bumps or pillars 27, and the combination can be referred to one of FIGS. 25N, 25R, 26I, 27S, 28H, 30N, 31J, 32U and 33U, and, as shown in these figures, the IC structure 6*a* between the thinned silicon substrate 1 and the passivation layer 5 may include the previously described internal circuits 21, 22, 23 and 24, the previously described voltage regulator or converter circuit 41, the previously described off-chip buffer 42, the previously described ESD circuit 43, the previously described dielectric layers 30, the previously described vias 30', the previously described fine-line scheme 6 including the fine-line metal layers 60 and the fine-line via plugs 60', and etc. Regarding the DRAM chip 140*b*, the metal pads, bumps or traces 34*a* are formed at the active side of the thinned silicon substrate 1, and the bottom scheme 103 is formed at the backside 1*a* of the thinned silicon substrate 1. Regarding the DRAM chip 140*b*, the through-silicon vias 11 providing for the previously described vias 11*a*, 11*b*, 11*c*, 11*d*, 11*e* and/or 11*f* in FIG. 25N, 25R, 26I, 27S, 28H, 30N, 31J, 32U or 33U are formed in the thinned silicon substrate 1, and the specification of the through-silicon vias 11 illustrated in FIG. 37A can be referred to as the specification of the through-silicon vias 11*a*, 11*b*, 11*c*, 11*d* and 11*e* as illustrated in FIGS. 24B-24N, and the process of forming the through-silicon vias 11 as shown in FIG. 37A can be referred to as the process of forming the through-silicon vias 11*a*, 11*b*, 11*c*, 11*d* and 11*e* as illustrated in FIGS. 24B-24N. Regarding the DRAM chip 140*b*, the metal layer of the bottom scheme 103 can be connected to the fine-line scheme 6 of the IC structure 6*a* through the bulk metal layer 9 in the through-silicon vias 11, and the metal pads, bumps or traces 34*a* can be connected to the fine-line scheme 6 of the IC structure 6*a* through openings in the passivation layer 5.

The DRAM chip 140*b* can be mounted onto and connected to the DRAM chip 140*a* through the metal bumps or pillars 27 of the DRAM chip 140*a* and through the metal pads, bumps or traces 34*a* of the DRAM chip 140*b* by bonding the metal pads, bumps or traces 34*a* onto the metal bumps or pillars 27. Another layer 401 of the dielectric can be optionally formed in a gap between the DRAM chips 140*a* and 140*b*, encapsulating the metal bumps or pillars 27 and the metal pads, bumps or traces 34*a*.

The DRAM chip 140*c* contains a combination of the previously described silicon substrate 1, an IC structure 6*a*, the previously described passivation layer 5 and the previously described over-passivation scheme 102, and the combination can be referred to one of FIGS. 1B-1D, 3B-3D, 5B, 5K, 5S, 5U-5Z, 7B-7D, 8A-8F, 10A-10I, 12B-12D, 14B-14D, 15H, 15K-15M, 16L, 16M, 17J, 18I, 19H, 20 and 23K, and, as shown in these figures, the IC structure 6*a* between the silicon substrate 1 and the passivation layer 5 may include the previously described internal circuits 21, 22, 23 and 24, the previously described voltage regulator or converter circuit 41, the previously described off-chip buffer 42, the previously described ESD circuits 43 and 44, the previously described dielectric layers 30, the previously described vias 30', the previously described fine-line scheme 6 including the fine-line metal layers 60 and the fine-line via plugs 60', and etc. In FIG. 37A, regarding the DRAM chip 140*c*, the over-passivation scheme 102 is formed under the passivation layer 5 at the active side of the silicon substrate 1. Regarding the DRAM chip 140*c*, the patterned circuit layer of the over-passivation scheme 102 can be connect to the fine-line scheme 6 of the IC structure 6*a* through openings in the passivation layer 5.

The DRAM chip 140*c* can be provided on and connected to the DRAM chip 140*b* through the metal bumps or pillars 27 of the DRAM chip 140*b*, and another layer 401 of the dielectric can be optionally formed in a gap between the DRAM chips 140*b* and 140*c*, encapsulating the metal bumps or pillars 27. For example, the process for mounting the DRAM chip 140*c* onto the DRAM chip 140*b* may be performed by screen printing a solder paste, containing bismuth, indium, a tin-lead alloy, a tin-silver alloy or a tin-silver-copper alloy, on multiple contact points in the over-passivation scheme 102 of the DRAM chip 140*c*, then bonding the metal bumps or pillars 27 preformed on the DRAM chip 140*b* with the solder paste, and then reflowing or heating the solder paste to form solid solder balls, containing bismuth, indium, a tin-lead alloy, a tin-silver alloy or a tin-silver-copper alloy, bonding the metal bumps or pillars 27 to the contact points of the DRAM chip 140*c*. Alternatively, the process for mounting the DRAM chip 140*c* onto the DRAM chip 140*b* may be performed by bonding the metal bumps 89, which can be referred to FIGS. 8A-8F, 10A-10E, 15L, 15M, 16M and 20, provided by the over-passivation scheme 102 of the DRAM chip 140*c* onto the metal bumps or pillars 27 of the DRAM chip 140*b*.

The DRAM chip 140*c* can be connected to the BGA substrate 113*b* through the bulk metal layer 9 in the through-silicon vias 11 provided by the DRAM chips 140*b*, 140*a* and 140 and through the metal bumps or pillars 27 provided by the DRAM chips 140*b*, 140*a* and 140. The DRAM chip 140*b* can be connected to the BGA substrate 113*b* through the bulk metal layer 9 in the through-silicon vias 11 provided by the DRAM chips 140*a* and 140 and through the metal bumps or pillars 27 provided by the DRAM chips 140*a* and 140. The DRAM chip 140*a* can be connected to the BGA substrate 113*b* through the bulk metal layer 9 in the through-silicon vias 11 provided by the DRAM chip 140 and through the metal bumps or pillars 27 provided by the DRAM chip 140.

The stacked DRAM BGA package 139 contains four DRAM chips 140, 140*a*, 140*b* and 140*c*. Alternatively, the stacked DRAM BGA package 139 may contain more than four DRAM chips. For example, other four DRAM chips can be stacked over the four DRAM chips 140, 140*a*, 140*b* and 140*c*, and the other four DRAM chips can be connected to each other, to the four DRAM chips 140, 140*a*, 140*b* and 140*c* and to the BGA substrate 113*b* through metal interconnects, such as the previously described metal bumps or pillars 27, the previously described metal bumps 89, copper bumps having a thickness between 5 and 50 micrometers or between 10 and 100 micrometers, nickel bumps having a thickness between 5 and 50 micrometers or between 10 and 100 micrometers, gold bumps having a thickness between 5 and 30 micrometers or between 10 and 100 micrometers, solder bumps having a thickness between 5 and 50 micrometers or between 10 and 200 micrometers, or the below-mentioned microbumps 317, between the neighboring two DRAM chips. Accordingly, eight stacked DRAM chips can be provided on the BGA substrate 113*b*. Alternatively, other eight DRAM chips can be stacked over the eight stacked DRAM chips, and the other eight DRAM chips can be connected to each other, to the eight DRAM chips and to the BGA substrate 113*b* through metal interconnects, such as the previously described metal bumps or pillars 27, the previously described metal bumps 89, copper bumps having a thickness between 5 and 50 micrometers or between 10 and 100 micrometers, nickel bumps having a thickness between 5 and 50 micrometers or between 10 and 100 micrometers, gold bumps having a thickness between 5 and 30 micrometers or between 10 and 100 micrometers, solder bumps having a thickness between 5 and 50 micrometers or between 10 and 200 micrometers, or the below-mentioned microbumps 317, between the neighboring two DRAM chips. Accordingly, sixteen stacked DRAM chips can be provided on the BGA substrate 113*b*. As mentioned above, multiple stacked DRAM chips, such as ranging 4 to 16 stacked DRAM chips, can be provided over the BGA substrate 113*b*.

The BGA substrate 113*b* can be replaced with a silicon substrate with through-silicon vias, and the DRAM chip 140 can be provided on and connected to the silicon substrate through the metal bumps or pillars 27 of the DRAM chip 140. Alternatively, the BGA substrate 113*b* can be replaced with a glass substrate with through vias, and the DRAM chip 140 can be provided on and connected to the glass substrate through the metal bumps or pillars 27 of the DRAM chip 140. Alternatively, the BGA substrate 113*b* can be replaced with a metal substrate with an insulating material, and the DRAM chip 140 can be provided on and connected to the metal substrate through the metal bumps or pillars 27 of the DRAM chip 140. Alternatively, the BGA substrate 113*b* can be replaced with a ceramic substrate, and the DRAM chip 140 can be provided on and connected to the ceramic substrate through the metal bumps or pillars 27 of the DRAM chip 140. The previously described silicon substrate, glass substrate, metal substrate or ceramic substrate can be provided on and connected to the substrate 301 through the solder balls 111*k*.

The processor unit 303 may contain a cache memory chip 311, a chip 313 on the cache memory chip 311, a cache memory chip 321 on the chip 313, and a heat spreader or heat sink 315 on the cache memory chip 321. The cache memory chip 311 may include a bottom scheme 103 with multiple metal bumps or pillars 27, and the cache memory chip 311 can be provided on and connected to the substrate 301 through the bumps or pillars 27. An underfill 107*c*, such as a polymer, can be filled into a gap between the cache memory chip 311 and the substrate 301, and encloses the metal bumps or pillars 27.

The chip 313 can be provided on and connected to the cache memory chip 311 through multiple microbumps 317 with a thickness larger than 5 micrometers, such as between 5 and 100 micrometers, and preferably between 10 and 60 micrometers. A pitch between neighboring two microbumps 317 can be smaller than 60 micrometers, and preferably smaller than 40 micrometers, such as between 5 and 40 micrometers, and preferably between 10 and 30 micrometers. The microbumps 317 can be between metal pads 600*b* of the cache memory chip 311 and metal pads 600*c* of the chip 313, and the metal pads 600*b* of the cache memory chip 311 can be connected to the metal pads 600*c* of the chip 313 through the microbumps 317. For example, each of the microbumps 317 may include two nickel layers each having a thickness larger than 2 micrometers, such as between 2 and 20 micrometers, and a solder including antimony, bismuth, indium, a tin-lead alloy, a tin-silver alloy or a tin-silver-copper alloy with a thickness larger than 1 micrometer, such as between 1 and 30 micrometers, between the two nickel layers. Alternatively, each of the microbumps 317 may include two copper layers each having a thickness larger than 2 micrometers, such as between 2 and 20 micrometers, and a solder including antimony, bismuth, indium, a tin-lead alloy, a tin-silver alloy or a tin-silver-copper alloy with a thickness larger than 1 micrometer, such as between 1 and 30 micrometers, between the two copper layers. Alternatively, each of the microbumps 317 may include two copper layers each having a thickness larger than 2 micrometers, such as between 2 and 20 micrometers, two nickel layers each having a thickness larger than 2 micrometers, such as between 2 and 20 micrometers, between the two copper layers, and a solder including antimony, bismuth, indium, a tin-lead alloy, a tin-silver alloy or a tin-silver-copper alloy with a thickness larger than 1 micrometer, such as between 1 and 30 micrometers, between the two nickel layers. An underfill 107*d* without fillers, such as a polymer, is filled into a gap between the cache memory chip 311 and the chip 313, and encloses the microbumps 317.

The cache memory chip 321 can be provided on and connected to the chip 313 through multiple microbumps 317*a* with a thickness larger than 5 micrometers, such as between 5 and 100 micrometers, and preferably between 10 and 60 micrometers. A pitch between neighboring two microbumps 317*a* can be smaller than 60 micrometers, and preferably smaller than 40 micrometers, such as between 5 and 40 micrometers, and preferably between 10 and 30 micrometers. Each of the microbumps 317*a* can be between a metal pad 600*d* of the cache memory chip 321 and a contact point of a bottom scheme 103 of the chip 313, and the metal pad 600*d* of the cache memory chip 321 can be connected to the contact point of the bottom scheme 103 of the chip 313 through the microbump 317*a*. For example, each of the microbumps 317*a* may include two nickel layers each having a thickness larger than 2 micrometers, such as between 2 and 20 micrometers, and a solder including antimony, bismuth, indium, a tin-lead alloy, a tin-silver alloy or a tin-silver-copper alloy with a thickness larger than 1 micrometer, such as between 1 and 30 micrometers, between the two nickel layers. Alternatively, each of the microbumps 317*a* may include two copper layers each having a thickness larger than 2 micrometers, such as between 2 and 20 micrometers, and a solder including antimony, bismuth, indium, a tin-lead alloy, a tin-silver alloy or a tin-silver-copper alloy with a thickness larger than 1 micrometer, such as between 1 and 30 micrometers, between the two copper layers. Alternatively, each of the microbumps 317*a* may include two copper layers each having a thickness larger than 2 micrometers, such as between 2 and 20 micrometers, two nickel layers each having a thickness larger than 2 micrometers, such as between 2 and 20 micrometers, between the two copper layers, and a solder including antimony, bismuth, indium, a tin-lead alloy, a tin-silver alloy or a tin-silver-copper alloy with a thickness larger than 1 micrometer, such as between 1 and 30 micrometers, between the two nickel layers. An underfill 107*e* without fillers, such as a polymer, is filled into a gap between the chip 313 and the cache memory chip 321, and encloses the microbumps 317*a*.

The heat spreader or heat sink 315 can be mounted onto the cache memory chip 321 by adhering the heat spreader or heat sink 315 to the cache memory chip 321 using a film 319 of a glue material, such as a polymer or an epoxy-based material, with a thickness between 1 and 50 micrometers.

Figure 38A:
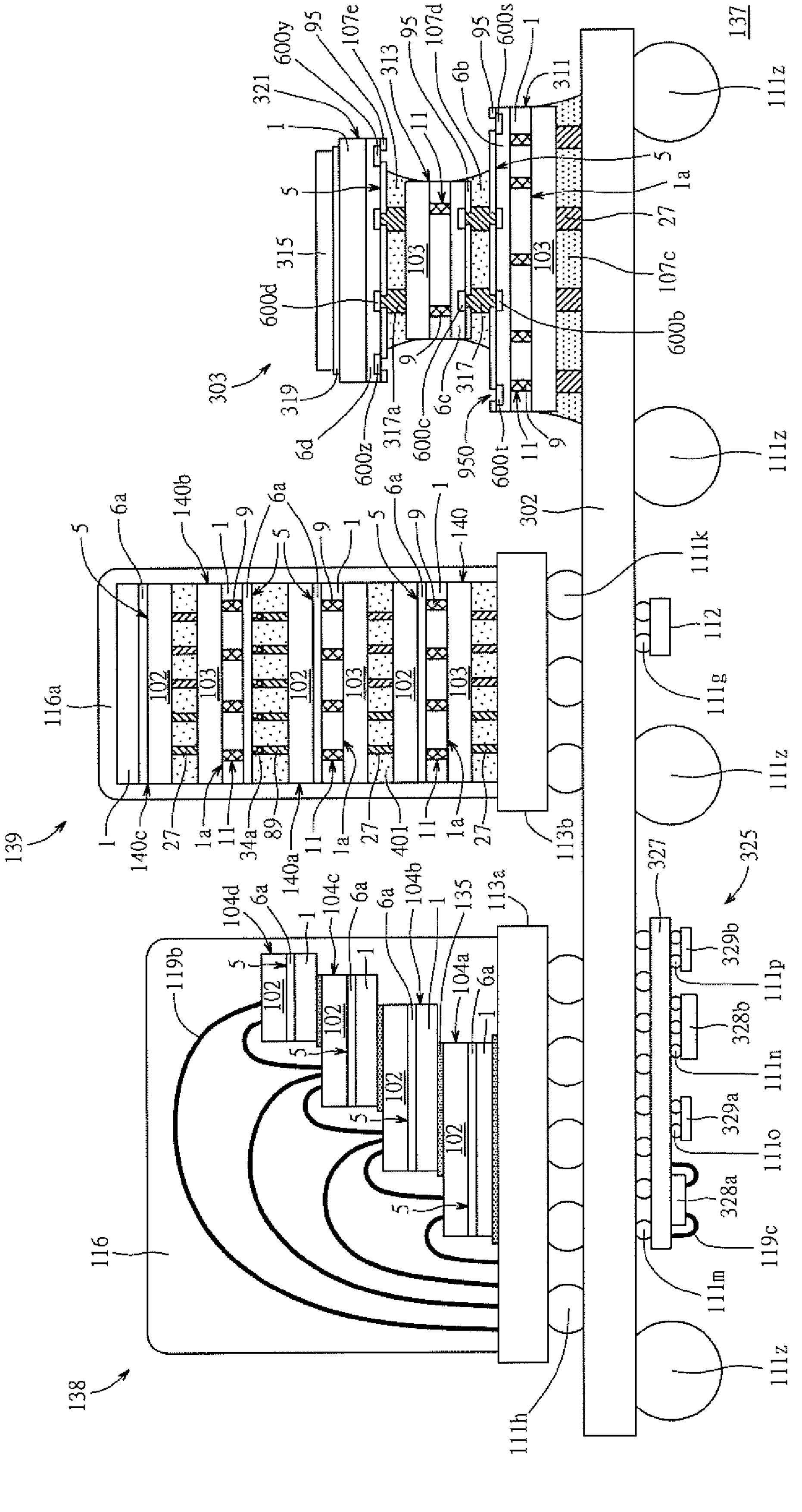

Alternatively, referring to FIG. 38A, the substrate 301 shown in FIG. 37A can be replaced with a ball-grid-array (BGA) substrate 302. Multiple solder balls 111*z* containing bismuth, indium, a tin-lead alloy, a tin-silver alloy or a tin-silver-copper alloy can be provided on the back side of the BGA substrate 302. Each of the solder balls 111*z* has a width larger than that of each of the solder balls 111*h* and 111*k*. The module 137 shown in FIG. 38A is designed with the solder balls 111*z* to connect with external circuits instead of the connectors 307 and 309 shown in FIG. 37A, that is, the module 137 shown in FIG. 38A can be connected to a charger, a 3D video game player, a 3D video display, such as 3D television (3D TV), or a display, such as flat panel display, liquid crystal display (LCD) or 3D display, through the solder balls 111*z*. The element in FIG. 38A indicated by a same reference number as indicates the element in FIG. 37A has a same material and spec as the element illustrated in FIG. 37A.

Figure 37B:
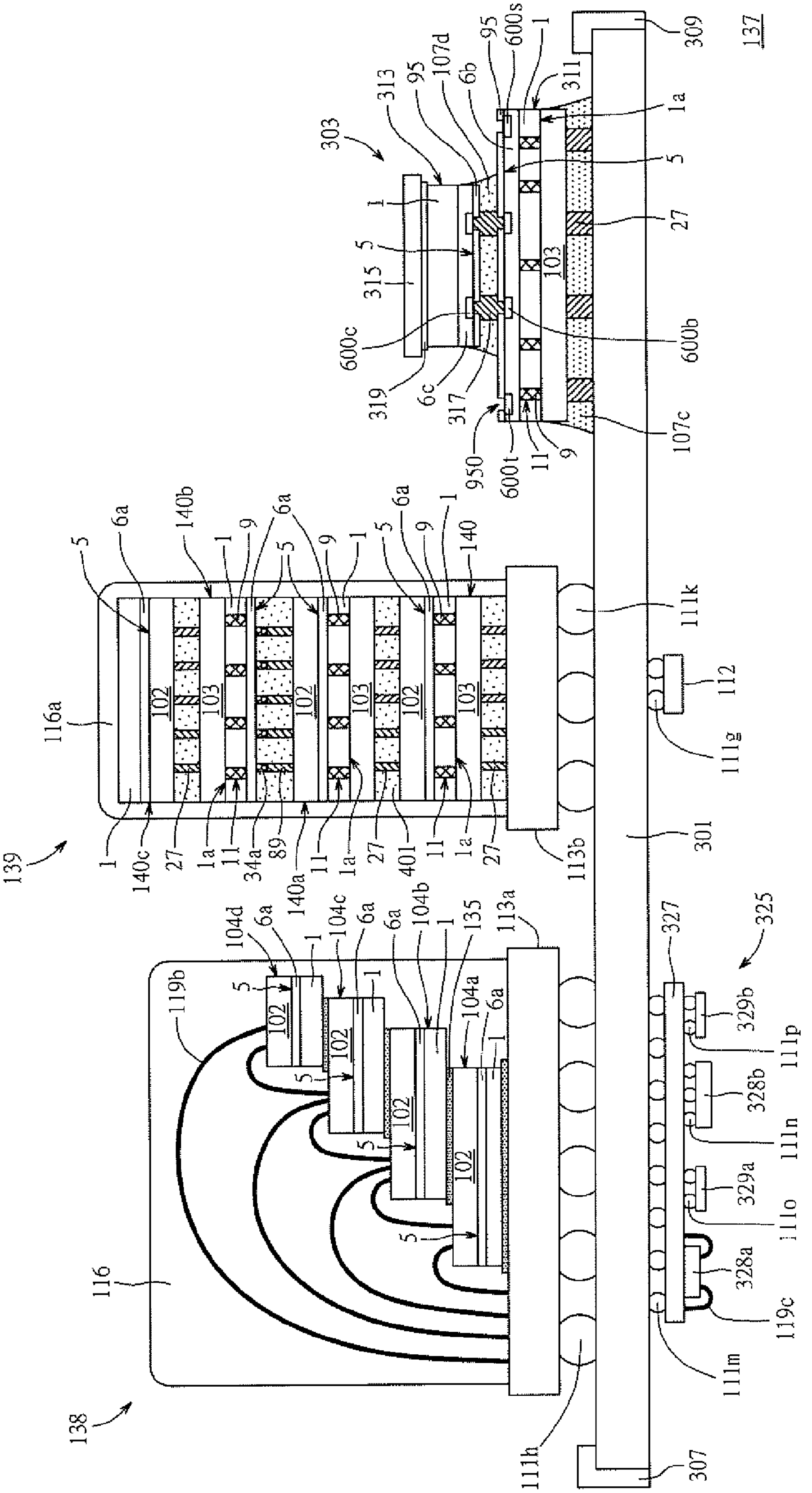

FIG. 37B shows another example of the module 137. The module 137 shown in FIG. 37B is similar to that shown in FIG. 37A except that there is no cache memory chip 321 provided on the chip 313, and the heat spreader or heat sink 315 is mounted onto the chip 313 using the film 319 of the glue material. The element in FIG. 37B indicated by a same reference number as indicates the element in FIG. 37A has a same material and spec as the element illustrated in FIG. 37A.

Figure 38B:
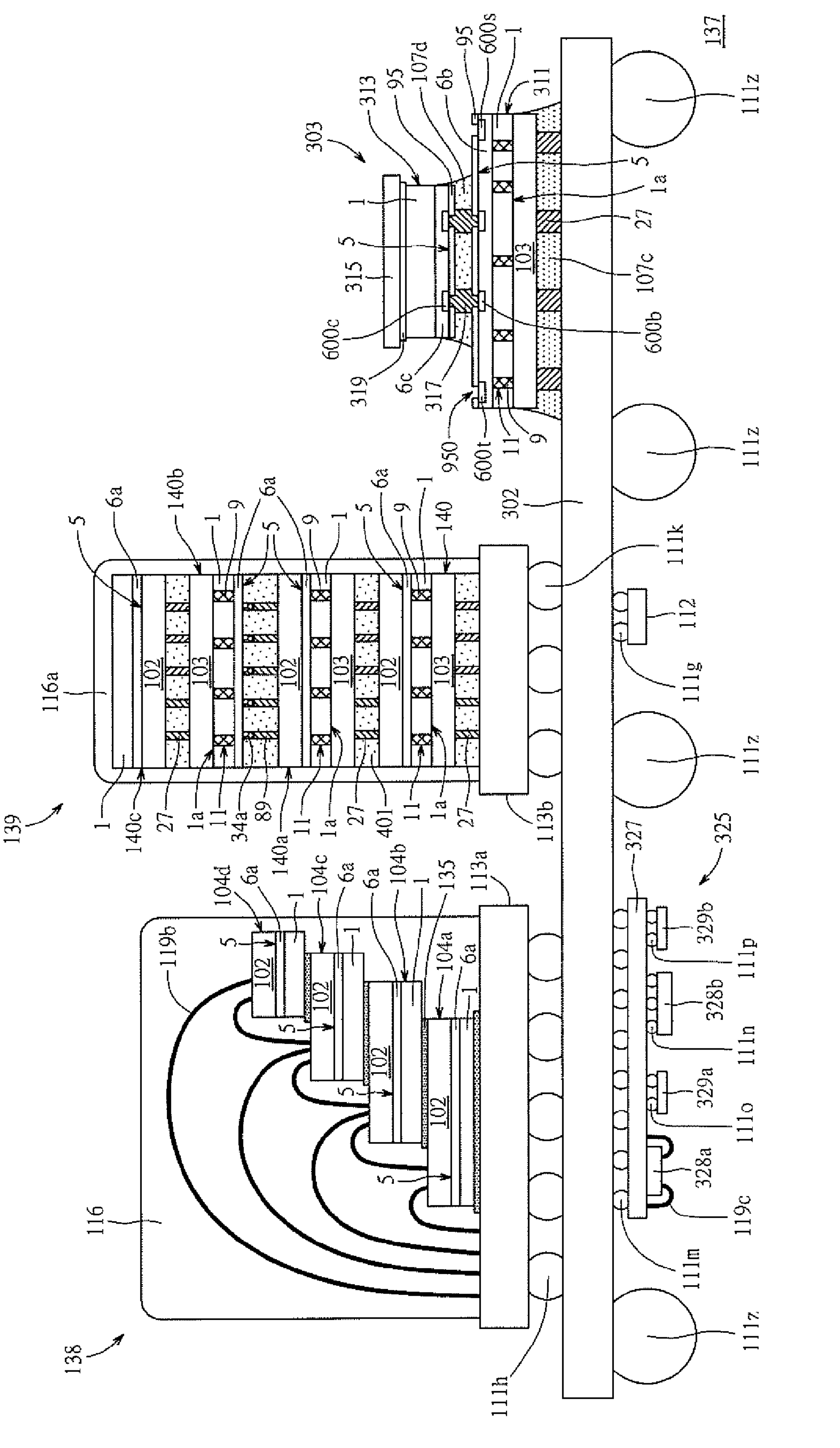

Alternatively, referring to FIG. 38B, the substrate 301 shown in FIG. 37B can be replaced with a ball-grid-array (BGA) substrate 302. Multiple solder balls 111*z* containing bismuth, indium, a tin-lead alloy, a tin-silver alloy or a tin-silver-copper alloy can be provided on the back side of the BGA substrate 302. Each of the solder balls 111*z* has a width larger than that of each of the solder balls 111*h* and 111*k*. The module 137 shown in FIG. 38B is designed with the solder balls 111*z* to connect with external circuits instead of the connectors 307 and 309 shown in FIG. 37B, that is, the module 137 shown in FIG. 38B can be connected to a charger, a 3D video game player, a 3D video display, such as 3D television (3D TV), or a display, such as flat panel display, liquid crystal display (LCD) or 3D display, through the solder balls 111Z. The element in FIG. 38B indicated by a same reference number as indicates the element in FIGS. 37A and 37B has a same material and spec as the element illustrated in FIGS. 37A and 37B.

Figure 37C:
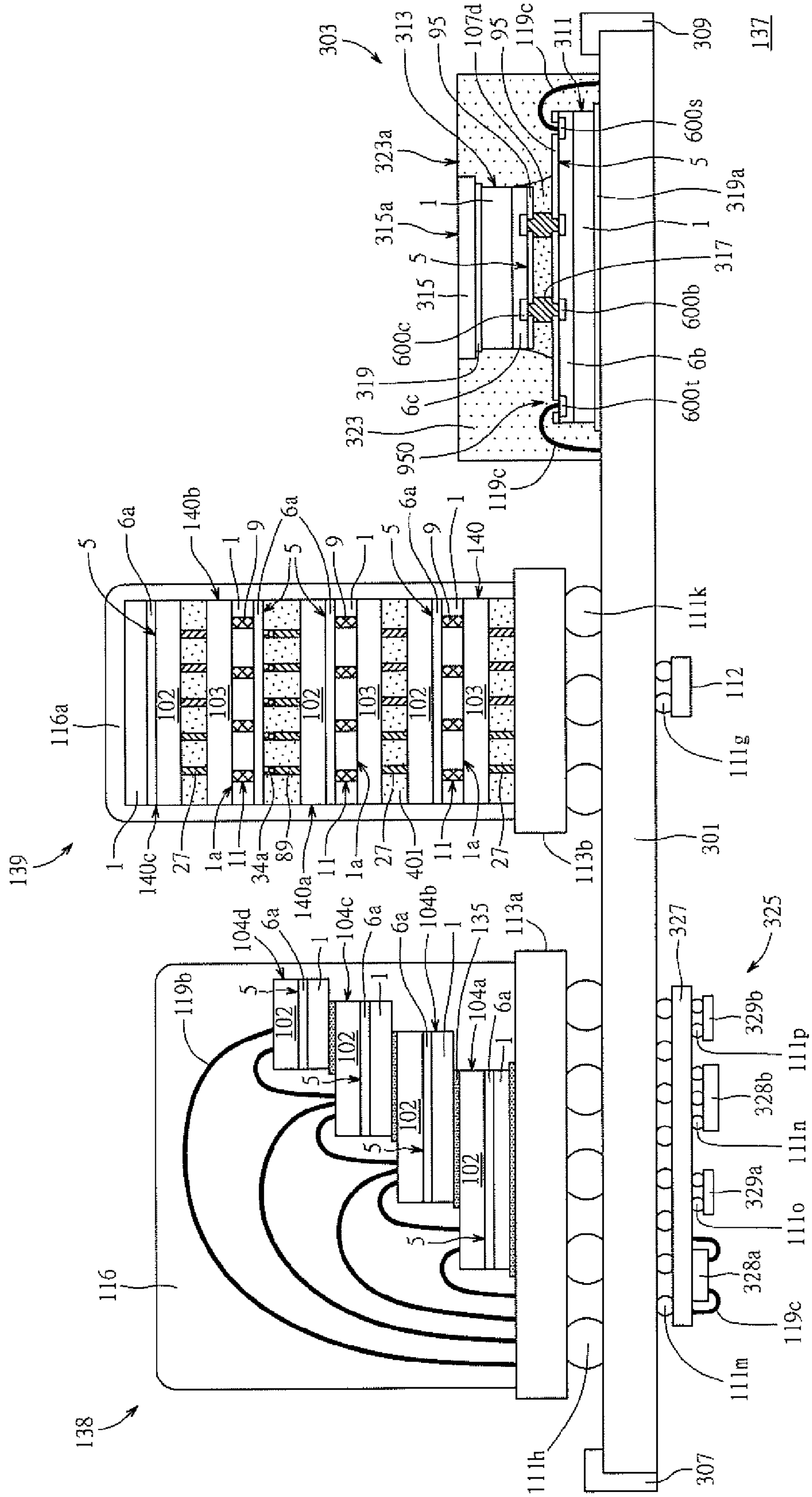

FIG. 37C shows another example of the module 137. The module 137 shown in FIG. 37C is similar to that shown in FIG. 37B except that the cache memory chip 311 is mounted onto the substrate 301 by adhering the cache memory chip 311 to the top side of the substrate 301 using a glue material 319*a*, the cache memory chip 311 is connected to the substrate 301 by wirebonding two wires 119*c*, such as gold wires or copper wires, to the testing metal pads 600*s* and 600*t* of the cache memory chip 311 and to the substrate 301, and a molding compound 323 is formed on the substrate 301, encapsulating the wirebonded wires 119*c* and the chips 311, 313 and 321. The heat spreader or heat sink 315 has a surface 315*a* uncovered by the molding compound 323 and substantially coplanar with a top surface 323*a* of the molding compound 323. The glue material 319*a* can be a polymer or an epoxy-based material with a thickness between 1 and 50 micrometers. The molding compound 323 can be a polymer or an epoxy-based material. The element in FIG. 37C indicated by a same reference number as indicates the element in FIGS. 37A and 37B has a same material and spec as the element illustrated in FIGS. 37A and 37B.

Figure 38C:
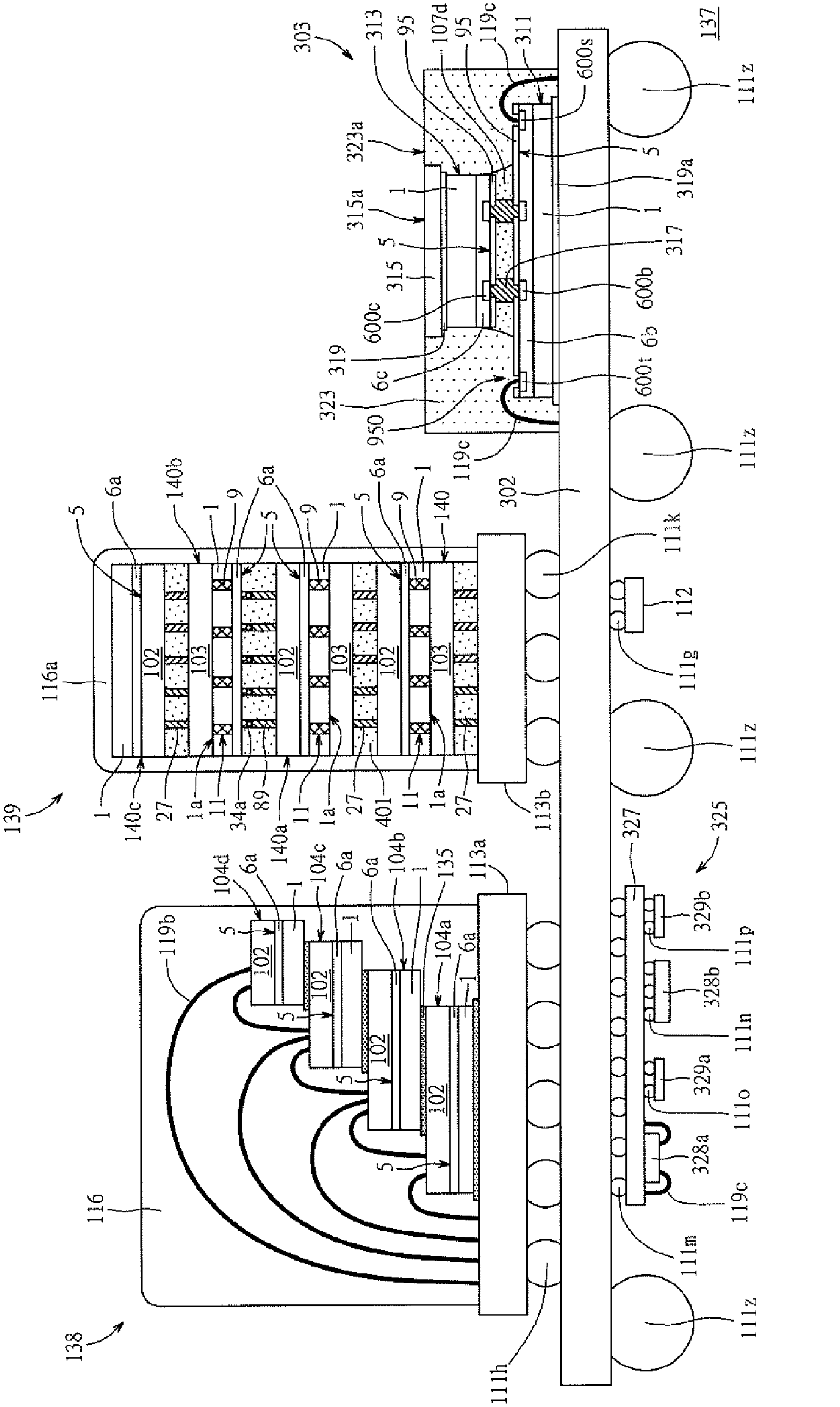

Alternatively, referring to FIG. 38C, the substrate 301 shown in FIG. 37C can be replaced with a ball-grid-array (BGA) substrate 302. Multiple solder balls 111*z* containing bismuth, indium, a tin-lead alloy, a tin-silver alloy or a tin-silver-copper alloy can be provided on the back side of the BGA substrate 302. Each of the solder balls 111*z* has a width larger than that of each of the solder balls 111*h* and 111*k*. The module 137 shown in FIG. 38C is designed with the solder balls 111*z* to connect with external circuits instead of the connectors 307 and 309 shown in FIG. 37C, that is, the module 137 shown in FIG. 38C can be connected to a charger, a 3D video game player, a 3D video display, such as 3D television (3D TV), or a display, such as flat panel display, liquid crystal display (LCD) or 3D display, through the solder balls 111Z. The element in FIG. 38C indicated by a same reference number as indicates the element in FIGS. 37A, 37B and 37C has a same material and spec as the element illustrated in FIGS. 37A, 37B and 37C.

Figure 37D:
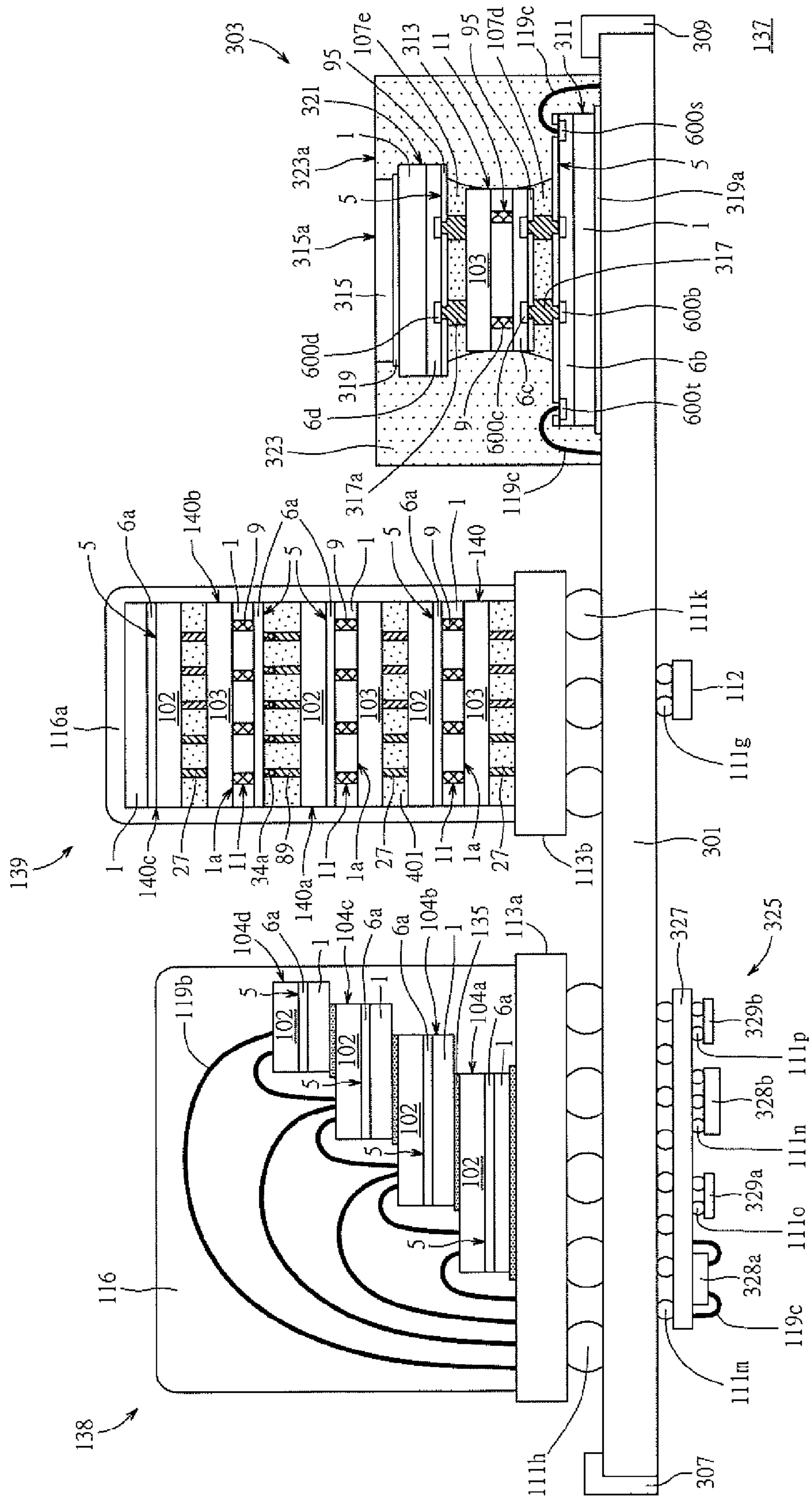

FIG. 37D shows another example of the module 137. The module 137 shown in FIG. 37D is similar to that shown in FIG. 37A except that the cache memory chip 311 is mounted onto the substrate 301 by adhering the cache memory chip 311 to the top side of the substrate 301 using a glue material 319*a*, the cache memory chip 311 is connected to the substrate 301 by wirebonding two wires 119*c*, such as gold wires or copper wires, to the testing metal pads 600*s* and 600*t* of the cache memory chip 311 and to the substrate 301, and a molding compound 323 is formed on the substrate 301, encapsulating the wirebonded wires 119*c* and the chips 311, 313 and 321. The heat spreader or heat sink 315 has a surface 315*a* uncovered by the molding compound 323 and substantially coplanar with a top surface 323*a* of the molding compound 323. The glue material 319*a* can be a polymer or an epoxy-based material with a thickness between 1 and 50 micrometers. The molding compound 323 can be a polymer or an epoxy-based material. The element in FIG. 37D indicated by a same reference number as indicates the element in FIG. 37A has a same material and spec as the element illustrated in FIG. 37A.

Figure 38D:
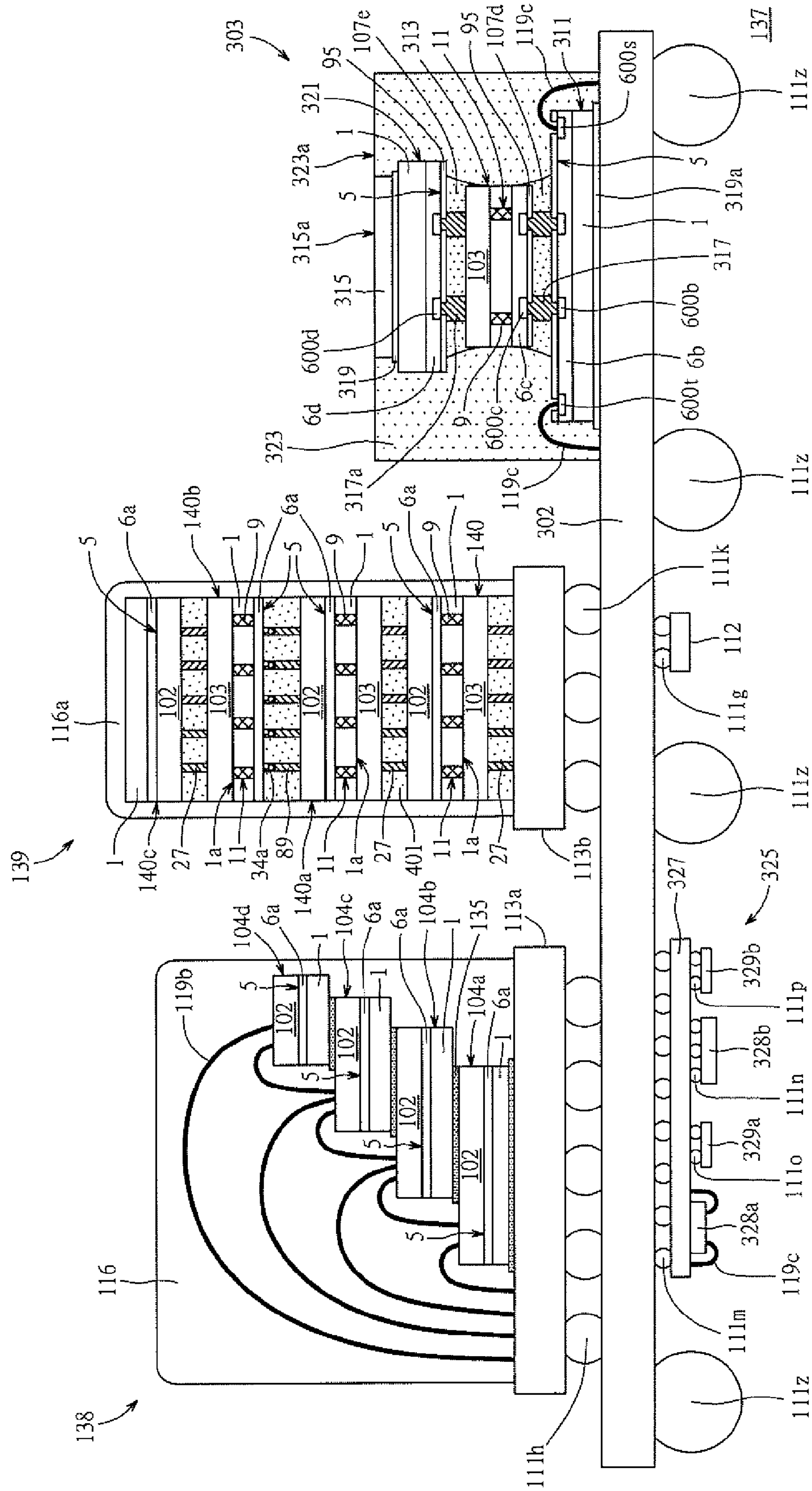

Alternatively, referring to FIG. 38D, the substrate 301 shown in FIG. 37D can be replaced with a ball-grid-array (BGA) substrate 302. Multiple solder balls 111*z* containing bismuth, indium, a tin-lead alloy, a tin-silver alloy or a tin-silver-copper alloy can be provided on the back side of the BGA substrate 302. Each of the solder balls 111*z* has a width larger than that of each of the solder balls 111*h* and 111*k*. The module 137 shown in FIG. 38D is designed with the solder balls 111*z* to connect with external circuits instead of the connectors 307 and 309 shown in FIG. 37D, that is, the module 137 shown in FIG. 38D can be connected to a charger, a 3D video game player, a 3D video display, such as 3D television (3D TV), or a display, such as flat panel display, liquid crystal display (LCD) or 3D display, through the solder balls 111Z. The element in FIG. 38D indicated by a same reference number as indicates the element in FIGS. 37A and 37D has a same material and spec as the element illustrated in FIGS. 37A and 37D.

The chip 313 shown in FIG. 37A, 37B, 37C, 37D, 38A, 38B, 38C or 38D can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a global-positioning-system (GPS) chip, a bluetooth chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, a system-on chip (SOC) including a graphics-processing-unit (GPU) circuit block and a wireless local area network (WLAN) circuit block, but not including any baseband circuit block and any central-processing-unit (CPU) circuit block, or a system-on chip (SOC) including a graphics-processing-unit (GPU) circuit block, a baseband circuit block, a digital-signal-processing (DSP) circuit block, a wireless local area network (WLAN) circuit block and a central-processing-unit (CPU) circuit block designed by x86 architecture or by non x86 architectures. Alternatively, the chip 313 shown in FIG. 37A, 37B, 37C, 37D, 38A, 38B, 38C or 38D can be a chip including a central-processing-unit (CPU) circuit block, a bluetooth circuit block, a global-positioning-system (GPS) circuit block, a graphics-processing-unit (GPU) circuit block, a baseband circuit block, a digital-signal-processing (DSP) circuit block, and/or a wireless local area network (WLAN) circuit block. The chip 313, graphics-processing-unit (GPU) chip, or the graphics-processing-unit (GPU) circuit block in the chip 313 can be designed for 2D or 3D video display, and can be connected to a 3D video display, such as 3D television (3D TV), or a 3D video game player through the microbumps 317, the cache memory chip 311, metal traces of the substrate 301 and the connector 307, as shown in FIG. 37A, 37B, 37C or 37D, or through the microbumps 317, the cache memory chip 311, metal traces of the BGA substrate 302 and the solder balls 111*z*, as shown in FIG. 38A, 38B, 38C or 38D.

Referring to FIG. 41, the RF module 325 shown in FIG. 37A, 37B, 37C, 37D, 38A, 38B, 38C or 38D can be replaced with a radio frequency (RF) module 325 shown in FIG. 41. The RF module 325 is designed as a quad flat no-lead (QFN) package, and includes a lead frame with a die paddle 580*a* and leads 580*b*, a radio frequency (RF) chip 328*a* attached to the die paddle 580*a* by an adhesive material 581*a* of silver epoxy, polyimide or acrylic, a radio frequency (RF) chip 328*b* attached to the RF chip 328*a* by an adhesive material 581*b* of silver epoxy, polyimide or acrylic, multiple wirebonded wires 119*c*, such as gold wires or copper wires, connecting the RF chips 328*a* and 328*b* to the leads 580*b*, and an encapsulation material 582 of epoxy or polyimide containing carbon or glass filler formed on the lead frame and at sidewalls of the RF chips 328*a* and 328*b*, encapsulating the wirebonded wires 119*c*. The leads 580*b* are arranged around the periphery of the die paddle 580*a*. Both of the RF chips 328*a* and 328*b* may include a radio frequency (RF) power amplifier, a radio frequency (RF) transceiver, a radio frequency (RF) driver amplifier, a balun circuit, a surface acoustic wave (SAW) filter, a filter, a coupler, and/or an isolator. The RF module 325 can be provided on and connected to the back side of the substrate 301 or 302 through multiple solder balls 111*m* containing bismuth, indium, a tin-lead alloy, a tin-silver alloy or a tin-silver-copper alloy. Alternatively, the RF module 325 can be provided on and connected to the top side of the substrate 301 or 302 through the solder balls 111*m*. The solder balls 111*m* are formed between the leads 580*b* and the substrate 301 or 302. The RF module 325 is used for transmitting or receiving RF (voice and/or data) signals for Wireless LAN (WLAN)

communication and/or mobile phone communication, such as 3G CDMA (Code Division Multiple Access) or TDMA GSM (Time Division Multiple Access Global System for Mobile communication).

FIG. 39A is an example of a circuit diagram showing interface circuits of the cache memory chip 311 and the chip 313 shown in FIG. 37A, 37B, 38A or 38B. The cache memory chip 311 includes two inter-chip circuits 20*a* and 20*b*, two internal circuits 20*c* and 20*d*, two off-chip circuits 40*a* and 40*b*, and two testing interface circuits 333*a* and 333*b*. The chip 313 includes two inter-chip circuits 20*e* and 20*f*, two internal circuits 20*g* and 20*h*, two off-chip circuits 40*c* and 40*d*, and two testing interface circuits 333*c* and 333*d*. The cache memory chip 311 is connected to the chip 313 through the microbumps 317 and to the substrate 301 or the BGA substrate 302 through the metal bumps or pillars 27.

Referring to FIG. 39A, the inter-chip circuit 20*a* of the cache memory chip 311 includes an inter-chip buffer 701*a* and an inter-chip ESD (electro static discharge) circuit 701*b*. The inter-chip buffer 701*a* has a first node FN1 and a second node SN1, and the inter-chip ESD circuit 701*b* has a node En connected to the first node FN1. The inter-chip buffer 701*a* can be an inter-chip receiver which can be an inverter composed of an NMOS transistor 751*a* and a PMOS transistor 751*b*, and the gates of the NMOS transistor 751*a* and the PMOS transistor 751*b* serve as an input node that is the first node FN1 of the inter-chip buffer 701*a*, and the drains of the NMOS transistor 751*a* and the PMOS transistor 751*b* serve as an output node that is the second node SN1 of the inter-chip buffer 701*a*.

Alternatively, the inter-chip buffer 701*a* can be a multi-stage cascade inter-chip receiver including several stages of inverters. For example, referring to FIG. 39B, the inter-chip buffer 701*a* can be a two-stage cascade inter-chip receiver. The first stage 424*a* of the two-stage cascade inter-chip receiver is an inverter composed of the NMOS transistor 751*a* and the PMOS transistor 751*b*, and the second stage 424*b* (the last stage) of the two-stage cascade inter-chip receiver is also an inverter except that it is formed by a suitable process or processes, e.g., by a larger size of an NMOS transistor 751*c* and a PMOS transistor 751*d*. The gates of the NMOS transistor 751*a* and the PMOS transistor 751*b* serve as an input node that is the first node FN1 of the inter-chip buffer 701*a*. The drains of the NMOS transistor 751*c* and the PMOS transistor 751*d* serve as an output node that is the second node SN1 of the inter-chip buffer 701*a*. The drains of the NMOS transistor 751*a* and the PMOS transistor 751*b* are connected to the gates of the NMOS transistor 751*c* and the PMOS transistor 751*d*.

Referring to FIG. 39A, the inter-chip circuit 20*b* of the cache memory chip 311 includes an inter-chip buffer 702*a* and an inter-chip ESD (electro static discharge) circuit 702*b*. The inter-chip buffer 702*a* has a first node FN2 and a second node SN2, and the inter-chip ESD circuit 702*b* has a node En connected to the second node SN2. The inter-chip buffer 702*a* can be an inter-chip driver which can be an inverter composed of an NMOS transistor 752*a* and a PMOS transistor 752*b*, and the gates of the NMOS transistor 752*a* and the PMOS transistor 752*b* serve as an input node that is the first node FN2 of the inter-chip buffer 702*a*, and the drains of the NMOS transistor 752*a* and the PMOS transistor 752*b* serve as an output node that is the second node SN2 of the inter-chip buffer 702*a*.

Alternatively, the inter-chip buffer 702*a* can be a multi-stage cascade inter-chip driver including several stages of inverters. For example, referring to FIG. 39C, the inter-chip buffer 702*a* can be a two-stage cascade inter-chip driver. The first stage 425*a* of the two-stage cascade inter-chip driver is an inverter composed of an NMOS transistor 752*c* and a PMOS transistor 752*d*, and the second stage 425*b* (the last stage) of the two-stage cascade inter-chip driver is an inverter composed of the NMOS transistor 752*a* and the PMOS transistor 752*b*. The gates of the NMOS transistor 752*c* and the PMOS transistor 752*d* serve as an input node that is the first node FN2 of the inter-chip buffer 702*a*. The drains of the NMOS transistor 752*a* and the PMOS transistor 752*b* serve as an output node that is the second node SN2 of the inter-chip buffer 702*a*. The drains of the NMOS transistor 752*c* and the PMOS transistor 752*d* are connected to the gates of the NMOS transistor 752*a* and the PMOS transistor 752*b*.

Referring to FIG. 39A, the inter-chip circuit 20*e* of the chip 313 includes an inter-chip buffer 703*a* and an inter-chip ESD (electro static discharge) circuit 703*b*. The inter-chip buffer 703*a* has a first node FN3 and a second node SN3, and the inter-chip ESD circuit 703*b* has a node En connected to the second node SN3. The inter-chip buffer 703*a* can be an inter-chip driver which can be an inverter composed of an NMOS transistor 753*a* and a PMOS transistor 753*b*, and the gates of the NMOS transistor 753*a* and the PMOS transistor 753*b* serve as an input node that is the first node FN3 of the inter-chip buffer 703*a*, and the drains of the NMOS transistor 753*a* and the PMOS transistor 753*b* serve as an output node that is the second node SN3 of the inter-chip buffer 703*a*.

Alternatively, the inter-chip buffer 703*a* can be a multi-stage cascade inter-chip driver including several stages of inverters. For example, referring to FIG. 39D, the inter-chip buffer 703*a* can be a two-stage cascade inter-chip driver. The first stage 426*a* of the two-stage cascade inter-chip driver is an inverter composed of an NMOS transistor 753*c* and a PMOS transistor 753*d*, and the second stage 426*b* (the last stage) of the two-stage cascade inter-chip driver is an inverter composed of the NMOS transistor 753*a* and the PMOS transistor 753*b*. The gates of the NMOS transistor 753*c* and the PMOS transistor 753*d* serve as an input node that is the first node FN3 of the inter-chip buffer 703*a*. The drains of the NMOS transistor 753*a* and the PMOS transistor 753*b* serve as an output node that is the second node SN3 of the inter-chip buffer 703*a*. The drains of the NMOS transistor 753*c* and the PMOS transistor 753*d* are connected to the gates of the NMOS transistor 753*a* and the PMOS transistor 753*b*.

Referring to FIG. 39A, the inter-chip circuit 20*f* of the chip 313 includes an inter-chip buffer 704*a* and an inter-chip ESD (electro static discharge) circuit 704*b*. The inter-chip buffer 704*a* has a first node FN4 and a second node SN4, and the inter-chip ESD circuit 704*b* has a node En connected to the first node FN4. The inter-chip buffer 704*a* can be an inter-chip receiver which can be an inverter composed of an NMOS transistor 754*a* and a PMOS transistor 754*b*, and the gates of the NMOS transistor 754*a* and the PMOS transistor 754*b* serve as an input node that is the first node FN4 of the inter-chip buffer 704*a*, and the drains of the NMOS transistor 754*a* and the PMOS transistor 754*b* serve as an output node that is the second node SN4 of the inter-chip buffer 704*a*.

Alternatively, the inter-chip buffer 704*a* can be a multi-stage cascade inter-chip receiver including several stages of inverters. For example, referring to FIG. 39E, the inter-chip buffer 704*a* can be a two-stage cascade inter-chip receiver. The first stage 427*a* of the two-stage cascade inter-chip receiver is an inverter composed of the NMOS transistor 754*a* and the PMOS transistor 754*b*, and the second stage 427*b* (the last stage) of the two-stage cascade inter-chip receiver is an inverter composed of an NMOS transistor 754*c* and a PMOS transistor 754*d*. The gates of the NMOS transistor 754*a* and the PMOS transistor 754*b* serve as an input node that is the first node FN4 of the inter-chip buffer 704*a*. The drains of the NMOS transistor 754*c* and the PMOS transistor 754*d* serve as an output node that is the second node SN4 of the inter-chip buffer 704*a*. The drains of the NMOS transistor 754*a* and the PMOS transistor 754*b* are connected to the gates of the NMOS transistor 754*c* and the PMOS transistor 754*d*.

Referring to FIG. 39A, the off-chip circuit 40*a* of the cache memory chip 311 includes an off-chip buffer 42*a* and an off-chip ESD (electro static discharge) circuit 43*a*. The off-chip buffer 42*a* has a first node FN5 and a second node SN5, and the off-chip ESD circuit 43*a* has a node En connected to the first node FN5. The off-chip buffer 42*a* can be an off-chip receiver which can be an inverter composed of an NMOS transistor 4205 and a PMOS transistor 4206, and the gates of the NMOS transistor 4205 and the PMOS transistor 4206 serve as an input node that is the first node FN5 of the off-chip buffer 42*a*, and the drains of the NMOS transistor 4205 and the PMOS transistor 4206 serve as an output node that is the second node SN5 of the off-chip buffer 42*a*.

Alternatively, the off-chip buffer 42*a* can be a multi-stage cascade off-chip receiver including several stages of inverters. For example, the off-chip buffer 42*a* can be a two-stage cascade off-chip receiver 422 shown in FIG. 11B. The first stage 422' of the two-stage cascade off-chip receiver 422 shown in FIG. 11B is an inverter composed of the NMOS transistor 4205 and the PMOS transistor 4206, and the second stage 422" (the last stage) of the two-stage cascade off-chip receiver 422 shown in FIG. 11B is also an inverter except that it is formed by a suitable process or processes, e.g., by a larger size of the NMOS transistor 4207 and the PMOS transistor 4208. In FIG. 11B, the input node E, served by the gates of the NMOS transistor 4205 and the PMOS transistor 4206, can be the first node FN5 of the off-chip buffer 42*a* shown in FIG. 39A, and the output node F, served by the drains of the NMOS transistor 4207 and the PMOS transistor 4208, can be the second node SN5 of the off-chip buffer 42*a* shown in FIG. 39A.

Referring to FIG. 39A, the off-chip circuit 40*b* of the cache memory chip 311 includes an off-chip buffer 42*b* and an off-chip ESD (electro static discharge) circuit 43*b*. The off-chip buffer 42*b* has a first node FN6 and a second node SN6, and the off-chip ESD circuit 43*b* has a node En connected to the second node SN6. The off-chip buffer 42*b* can be an off-chip driver which can be an inverter composed of an NMOS transistor 4203 and a PMOS transistor 4204, and the gates of the NMOS transistor 4203 and the PMOS transistor 4204 serve as an input node that is the first node FN6 of the off-chip buffer 42*b*, and the drains of the NMOS transistor 4203 and the PMOS transistor 4204 serve as an output node that is the second node SN6 of the off-chip buffer 42*b*.

Alternatively, the off-chip buffer 42*b* can be a multi-stage cascade off-chip driver including several stages of inverters. For example, the off-chip buffer 42*b* can be a two-stage cascade off-chip driver 421 shown in FIG. 11A. The first stage 421' of the two-stage cascade inter-chip driver 421 shown in FIG. 11A is an inverter composed of the NMOS transistor 4201 and the PMOS transistor 4202, and the second stage 421" (the last stage) of the two-stage cascade inter-chip driver 421 shown in FIG. 11A is also an inverter except that it is formed by a suitable process or processes, e.g., by a larger size of the NMOS transistor 4203 and the PMOS transistor 4204. In FIG. 11A, the input node F, served by the gates of the NMOS transistor 4201 and the PMOS transistor 4202, can be the first node FN6 of the off-chip buffer 42*b* shown in FIG. 39A, and the output node E, served by the drains of the NMOS transistor 4203 and the PMOS transistor 4204, can be the second node SN6 of the off-chip buffer 42*b* shown in FIG. 39A.

Referring to FIG. 39A, the off-chip circuit 40*c* of the chip 313 includes an off-chip buffer 42*c* and an off-chip ESD (electro static discharge) circuit 43*c*. The off-chip buffer 42*c* has a first node FN7 and a second node SN7, and the off-chip ESD circuit 43*c* has a node En connected to the second node SN7. The off-chip buffer 42*c* can be an off-chip driver which can be an inverter composed of an NMOS transistor 4203*a* and a PMOS transistor 4204*a*, and the gates of the NMOS transistor 4203*a* and the PMOS transistor 4204*a* serve as an input node that is the first node FN7 of the off-chip buffer 42*c*, and the drains of the NMOS transistor 4203*a* and the PMOS transistor 4204*a* serve as an output node that is the second node SN7 of the off-chip buffer 42*c*.

Alternatively, the off-chip buffer 42*c* can be a multi-stage cascade off-chip driver including several stages of inverters. For example, referring to FIG. 39F, the off-chip buffer 42*c* can be a two-stage cascade off-chip driver. The first stage 427*a* of the two-stage cascade off-chip driver is an inverter composed of an NMOS transistor 4201*a* and a PMOS transistor 4202*a*, and the second stage 427*b* (the last stage) of the two-stage cascade off-chip driver is also an inverter except that it is formed by a suitable process or processes, e.g., by a larger size of the NMOS transistor 4203*a* and the PMOS transistor 4204*a*. The gates of the NMOS transistor 4201*a* and the PMOS transistor 4202*a* serve as an input node that is the first node FN7 of the off-chip buffer 42*c*. The drains of the NMOS transistor 4203*a* and the PMOS transistor 4204*a* serve as an output node that is the second node SN7 of the off-chip buffer 42*c*. The drains of the NMOS transistor 4201*a* and the PMOS transistor 4202*a* are connected to the gates of the NMOS transistor 4203*a* and the PMOS transistor 4204*a*.

Referring to FIG. 39A, the off-chip circuit 40*d* of the chip 313 includes an off-chip buffer 42*d* and an off-chip ESD (electro static discharge) circuit 43*d*. The off-chip buffer 42*d* has a first node FN8 and a second node SN8, and the off-chip ESD circuit 43*d* has a node En connected to the first node FN8. The off-chip buffer 42*d* can be an off-chip receiver which can be an inverter composed of an NMOS transistor 4205*a* and a PMOS transistor 4206*a*, and the gates of the NMOS transistor 4205*a* and the PMOS transistor 4206*a* serve as an input node that is the first node FN8 of the off-chip buffer 42*d*, and the drains of the NMOS transistor 4205*a* and the PMOS transistor 4206*a* serve as an output node that is the second node SN8 of the off-chip buffer 42*d*.

Alternatively, the off-chip buffer 42*d* can be a multi-stage cascade off-chip receiver including several stages of inverters. For example, referring to FIG. 39G, the off-chip buffer 42*d* can be a two-stage cascade off-chip receiver. The first stage 428*a* of the two-stage cascade off-chip receiver is an inverter composed of the NMOS transistor 4205*a* and the PMOS transistor 4206*a*, and the second stage 428*b* (the last stage) of the two-stage cascade off-chip receiver is also an inverter except that it is formed by a suitable process or processes, e.g., by a larger size of the NMOS transistor 4207*a* and the PMOS transistor 4208*a*. The gates of the NMOS transistor 4205*a* and the PMOS transistor 4206*a* serve as an input node that is the first node FN8 of the off-chip buffer 42*d*. The drains of the NMOS transistor 4207*a* and the PMOS transistor 4208*a* serve as an output node that is the second node SN8 of the off-chip buffer 42*d*. The drains of the NMOS transistor 4205*a* and the PMOS transistor 4206*a* are connected to the gates of the NMOS transistor 4207*a* and the PMOS transistor 4208*a*.

Figure 39H:
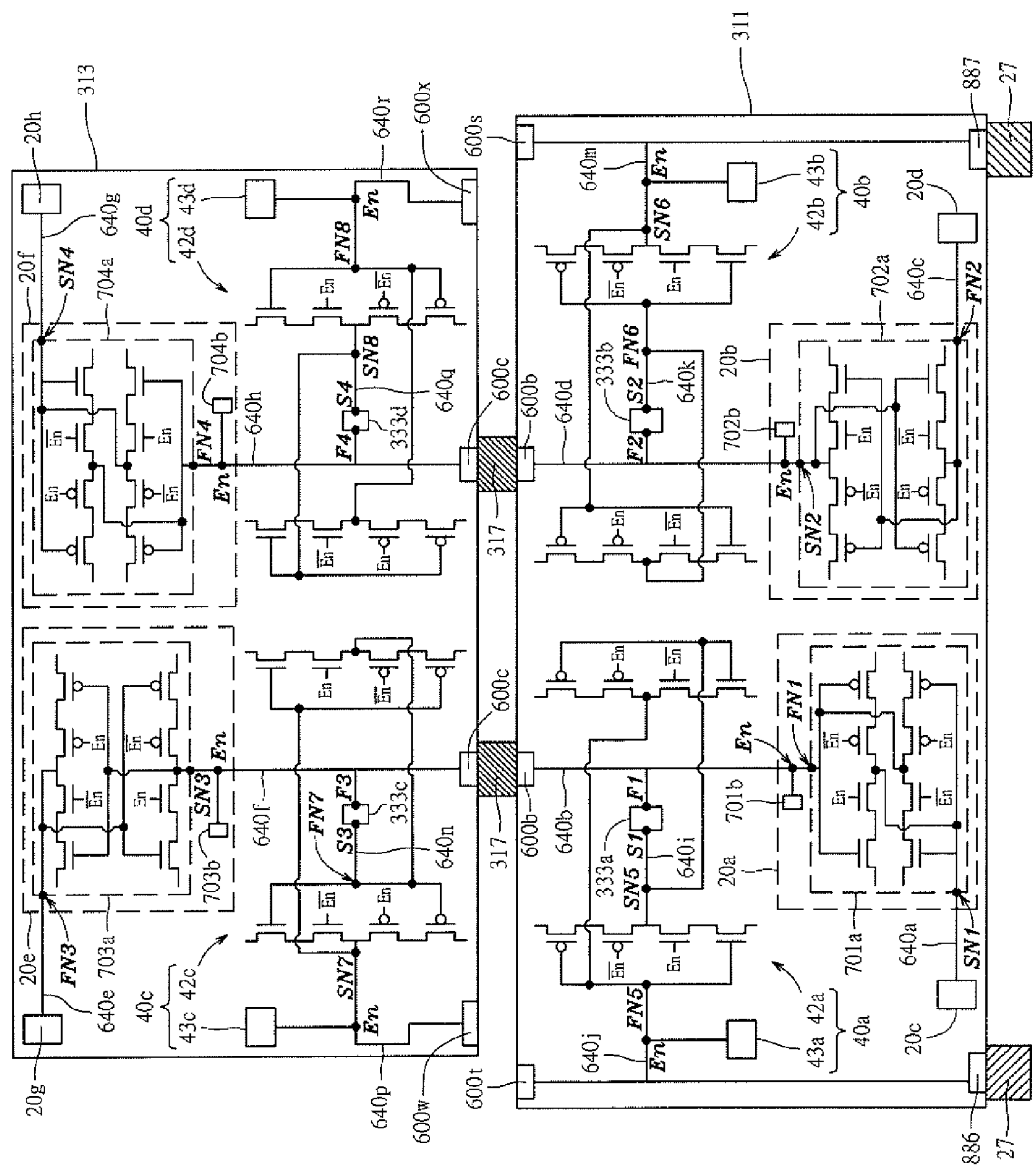

FIG. 39H is another example of the circuit diagram showing interface circuits of the cache memory chip 311 and the chip 313 shown in FIG. 37A, 37B, 38A or 38B. The circuit diagram shown in FIG. 39H is similar to that shown in FIG. 39A except that the inter-chip buffers 701*a*, 702*a*, 703*a* and 704*a* are designed with inter-chip tri-state buffers each including a tri-state driver and a tri-state receiver, instead of the inter-chip receivers and drivers, and the off-chip buffers 42*a*, 42*b*, 42*c* and 42*d* are designed with off-chip tri-state buffers each including a tri-state driver and a tri-state receiver, instead of the off-chip receivers and drivers. In FIG. 39H, the inter-chip buffer 701*a* of the cache memory chip 311 can be an inter-chip tri-state buffer having a first I/O (input/output) node serving as the first node FN1 of the inter-chip buffer 701*a*, and having a second I/O node serving as the second node SN1 of the inter-chip buffer 701*a*. The inter-chip buffer 702*a* of the cache memory chip 311 can be an inter-chip tri-state buffer having a first I/O node serving as the first node FN2 of the inter-chip buffer 702*a*, and having a second I/O node serving as the second node SN2 of the inter-chip buffer 702*a*. The inter-chip buffer 703*a* of the chip 313 can be an inter-chip tri-state buffer having a first I/O node serving as the first node FN3 of the inter-chip buffer 703*a*, and having a second I/O node serving as the second node SN3 of the inter-chip buffer 703*a*. The inter-chip buffer 704*a* of the chip 313 can be an inter-chip tri-state buffer having a first I/O node serving as the first node FN4 of the inter-chip buffer 704*a*, and having a second I/O node serving as the second node SN4 of the inter-chip buffer 704*a*. The off-chip buffer 42*a* of the cache memory chip 311 can be an off-chip tri-state buffer having a first I/O node serving as the first node FN5 of the off-chip buffer 42*a*, and having a second I/O node serving as the second node SN5 of the off-chip buffer 42*a*. The off-chip buffer 42*b* of the cache memory chip 311 can be an off-chip tri-state buffer having a first I/O node serving as the first node FN6 of the off-chip buffer 42*b*, and having a second I/O node serving as the second node SN6 of the off-chip buffer 42*b*. The off-chip buffer 42*c* of the chip 313 can be an off-chip tri-state buffer having a first I/O node serving as the first node FN7 of the off-chip buffer 42*c*, and having a second I/O node serving as the second node SN7 of the off-chip buffer 42*c*. The off-chip buffer 42*d* of the chip 313 can be an off-chip tri-state buffer having a first I/O node serving as the first node FN8 of the off-chip buffer 42*d*, and having a second I/O node serving as the second node SN8 of the off-chip buffer 42*d*.

Referring to FIGS. 39A and 39H, each of the internal circuits 20*c*, 20*d*, 20*g* and 20*h* can be a NOR gate, a NAND gate, an AND gate, an OR gate, an operational amplifier, a flash memory cell, a static-random-access-memory (SRAM) cell, a dynamic-random-access-memory (DRAM) cell, a non-volatile memory cell, an erasable programmable read-only memory (EPROM) cell, a read-only memory (ROM) cell, a magnetic random access memory (MRAM) cell, a sense amplifier, an analog-to-digital (A/D) converter, a digital-to-analog (D/A) converter, an inverter, an adder, a multiplexer, a diplexer, a multiplier, a complementary-metal-oxide-semiconductor (CMOS) device, a bi-polar CMOS device, a bipolar circuit or an analog circuit. Each of the internal circuits 20*c*, 20*d*, 20*g* and 20*h* may include a NMOS transistor having a ratio of a physical channel width thereof to a physical channel length thereof ranging from, e.g., about 0.1 and 20, ranging from, e.g., about 0.1 and 10 or ranging from, e.g., about 0.2 and 2. Alternatively, each of the internal circuits 20*c*, 20*d*, 20*g* and 20*h* may include a PMOS transistor having a ratio of a physical channel width thereof to a physical channel length thereof ranging from, e.g., about 0.2 and 40, ranging from, e.g., about 0.2 and 40 or ranging from, e.g., about 0.4 and 4. Each of the inter-chip ESD circuits 701*b*, 702*b*, 703*b* and 704*b* and each of the off-chip ESD circuits 43*a*, 43*b*, 43*c* and 43*d* may include one or more ESD (electro static discharge) units each composed of two reverse-biased diodes or of a PMOS transistor and an NMOS transistor.

The first node FN1 of the inter-chip buffer 701*a* can be connected to the node En of the inter-chip ESD circuit 701*b*, to a first terminal F1 of the testing interface circuit 333*a* through a metal interconnect line 640*b* of the cache memory chip 311, to the left metal pad 600*b*, including aluminum or electroplated copper, of the cache memory chip 311 through the metal interconnect line 640*b*, and to the left microbump 317 through the metal interconnect line 640*b* and the left metal pad 600*b*. The second node SN1 of the inter-chip buffer 701*a* can be connected to the internal circuit 20*c* through a metal interconnect line 640*a* of the cache memory chip 311.

The first node FN2 of the inter-chip buffer 702*a* can be connected to the internal circuit 20*d* through a metal interconnect line 640*c* of the cache memory chip 311. The second node SN2 of the inter-chip buffer 702*a* can be connected to the node En of the inter-chip ESD circuit 702*b*, to a first terminal F2 of the testing interface circuit 333*b* through a metal interconnect line 640*d* of the cache memory chip 311, to the right metal pad 600*b*, including aluminum or electroplated copper, of the cache memory chip 311 through the metal interconnect line 640*d*, and to the right microbump 317 through the metal interconnect line 640*d* and the right metal pad 600*b*.

The first node FN3 of the inter-chip buffer 703*a* can be connected to the internal circuit 20*g* through a metal interconnect line 640*e* of the chip 313. The second node SN3 of the inter-chip buffer 703*a* can be connected to the node En of the inter-chip ESD circuit 703*b*, to a first terminal F3 of the testing interface circuit 333*c* through a metal interconnect line 640*f* of the chip 313, to the left metal pad 600*c*, including aluminum or electroplated copper, of the chip 313 through the metal interconnect line 640*f*, to the left microbump 317 through the metal interconnect line 640*f* and the left metal pad 600*c*, and to the first node FN1 of the inter-chip buffer 701*a* of the cache memory chip 311 through the metal interconnect line 640*f* of the chip 313, the left metal pad 600*c* of the chip 313, the left microbump 317, the left metal pad 600*b* of the cache memory chip 311, and the metal interconnect line 640*b* of the cache memory chip 311.

The first node FN4 of the inter-chip buffer 704*a* can be connected to the node En of the inter-chip ESD circuit 704*b*, to a first terminal F4 of the testing interface circuit 333*d* through a metal interconnect line 640*h* of the chip 313, to the right metal pad 600*c*, including aluminum or electroplated copper, of the chip 313 through the metal interconnect line 640*h*, to the right microbump 317 through the metal interconnect line 640*h* and the right metal pad 600*c*, and to the second node SN2 of the inter-chip buffer 7024 of the cache memory chip 311 through the metal interconnect line 640*h* of the chip 313, the right metal pad 600*c* of the chip 313, the right microbump 317, the right metal pad 600*b* of the cache memory chip 311, and the metal interconnect line 640*d* of the cache memory chip 311. The second node SN4 of the inter-chip buffer 704*a* can be connected to the internal circuit 20*h* through a metal interconnect line 640*g* of the chip 313.

The first node FN5 of the off-chip buffer 42*a* can be connected to the node En of the off-chip ESD circuit 43*a*, to the testing metal pad 600*t*, including aluminum or electroplated copper, of the cache memory chip 311 through a metal interconnect line 640*j* of the cache memory chip 311, to a metal pad 886 of the cache memory chip 311 through the metal interconnect line 640*j*, and to the left metal bump or pillar 27 through the metal interconnect line 640*j* and the metal pad 886. The left metal bump or pillar 27 can be provided on and connected to the substrate 301 shown in FIG. 37A or 37B or to the BGA substrate 302 shown in FIG. 38A or 38B, and the first node FN5 of the off-chip buffer 42*a* can be connected to the substrate 301 or the BGA substrate 302 through the metal interconnect line 640*j*, the metal pad 886 and the left metal bump or pillar 27. The second node SN5 of the off-chip buffer 42*a* can be connected to a second terminal S1 of the testing interface circuit 333*a* through a metal interconnect line 640*i* of the cache memory chip 311.

The first node FN6 of the off-chip buffer 42*b* can be connected to a second terminal S2 of the testing interface circuit 333*b* through a metal interconnect line 640*k* of the cache memory chip 311. The second node SN6 of the off-chip buffer 42*b* can be connected to the off-chip ESD circuit 43*b*, to the testing metal pad 600*s*, including aluminum or electroplated copper, of the cache memory chip 311 through a metal interconnect line 640*m* of the cache memory chip 311, to a metal pad 887 of the cache memory chip 311 through the metal interconnect line 640*m*, and to the right metal bump or pillar 27 through the metal interconnect line 640*m* and the metal pad 887. The right metal bump or pillar 27 can be provided on and connected to the substrate 301 shown in FIG. 37A or 37B or to the BGA substrate 302 shown in FIG. 38A or 38B, and the second node SN6 of the off-chip buffer 42*b* can be connected to the substrate 301 or the BGA substrate 302 through the metal interconnect line 640*m*, the metal pad 887 and the right metal bump or pillar 27.

The first node FN7 of the off-chip buffer 42*c* can be connected to a second terminal S3 of the testing interface circuit 333*c* through a metal interconnect line 640*n* of the chip 313. The second node SN7 of the off-chip buffer 42*c* can be connected to the off-chip ESD circuit 43*c*, and to the testing metal pad 600*w*, including aluminum or electroplated copper, of the chip 313 through a metal interconnect line 640*p* of the chip 313.

The first node FN8 of the off-chip buffer 42*d* can be connected to the off-chip ESD circuit 43*d*, and to the testing metal pad 600*x*, including aluminum or electroplated copper, of the chip 313 through a metal interconnect line 640*r* of the chip 313. The second node SN8 of the off-chip buffer 42*d* can be connected to a second terminal S4 of the testing interface circuit 333*d* through a metal interconnect line 640*q* of the chip 313.

Figure 39I:
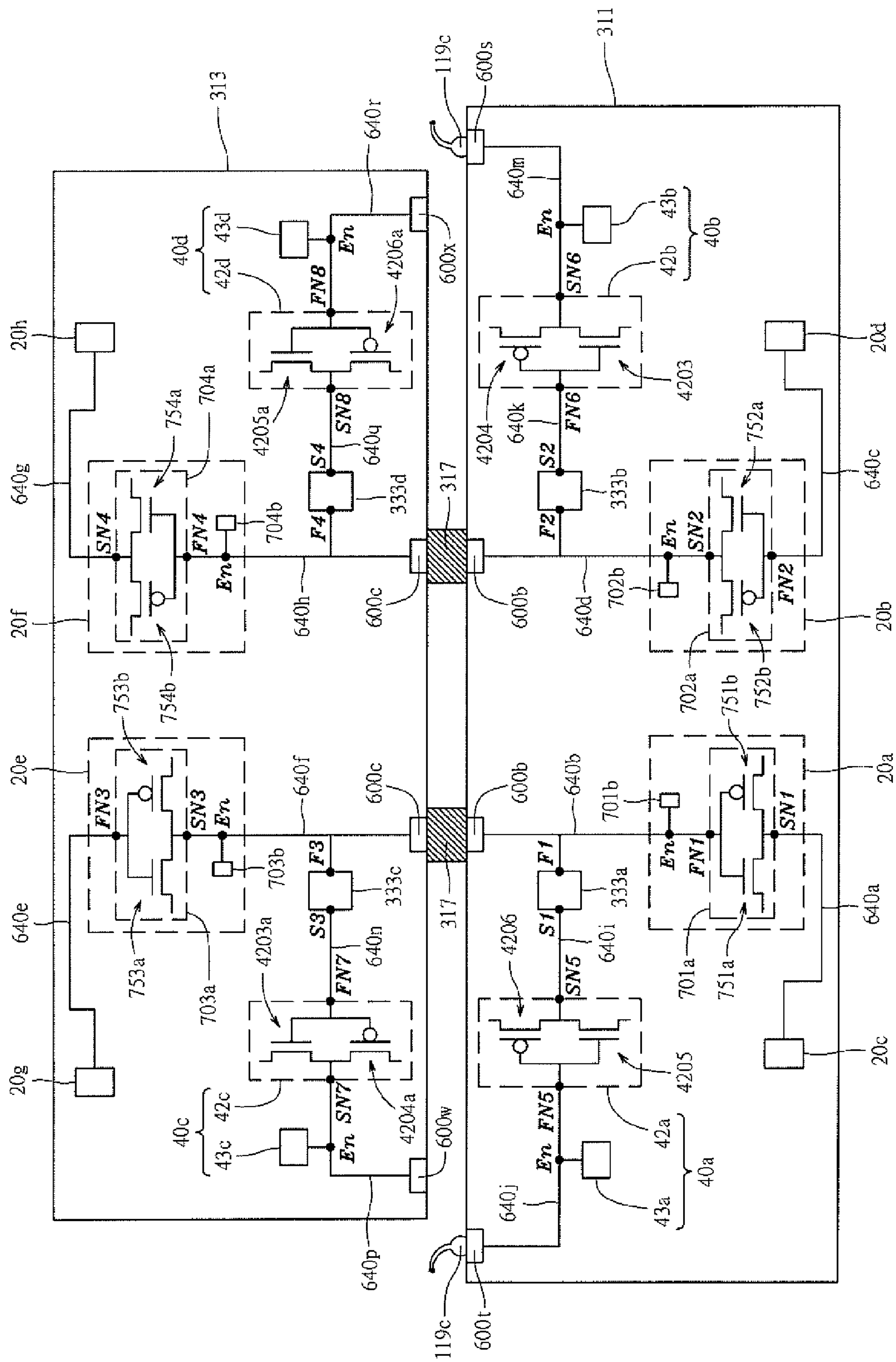

FIG. 39I is an example of a circuit diagram showing interface circuits of the cache memory chip 311 and the chip 313 shown in FIG. 37C, 37D, 38C or 38D. The circuit diagram shown in FIG. 39I is similar to that shown in FIG. 39A except that the cache memory chip 311 is connected to the substrate 301 or the BGA substrate 302 through the wirebonded wires 119*c* instead of the metal bumps or pillars 27. The element in FIG. 39I indicated by a same reference number as indicates the element in FIG. 39A has a same material and spec as the element illustrated in FIG. 39A.

Figure 39J:
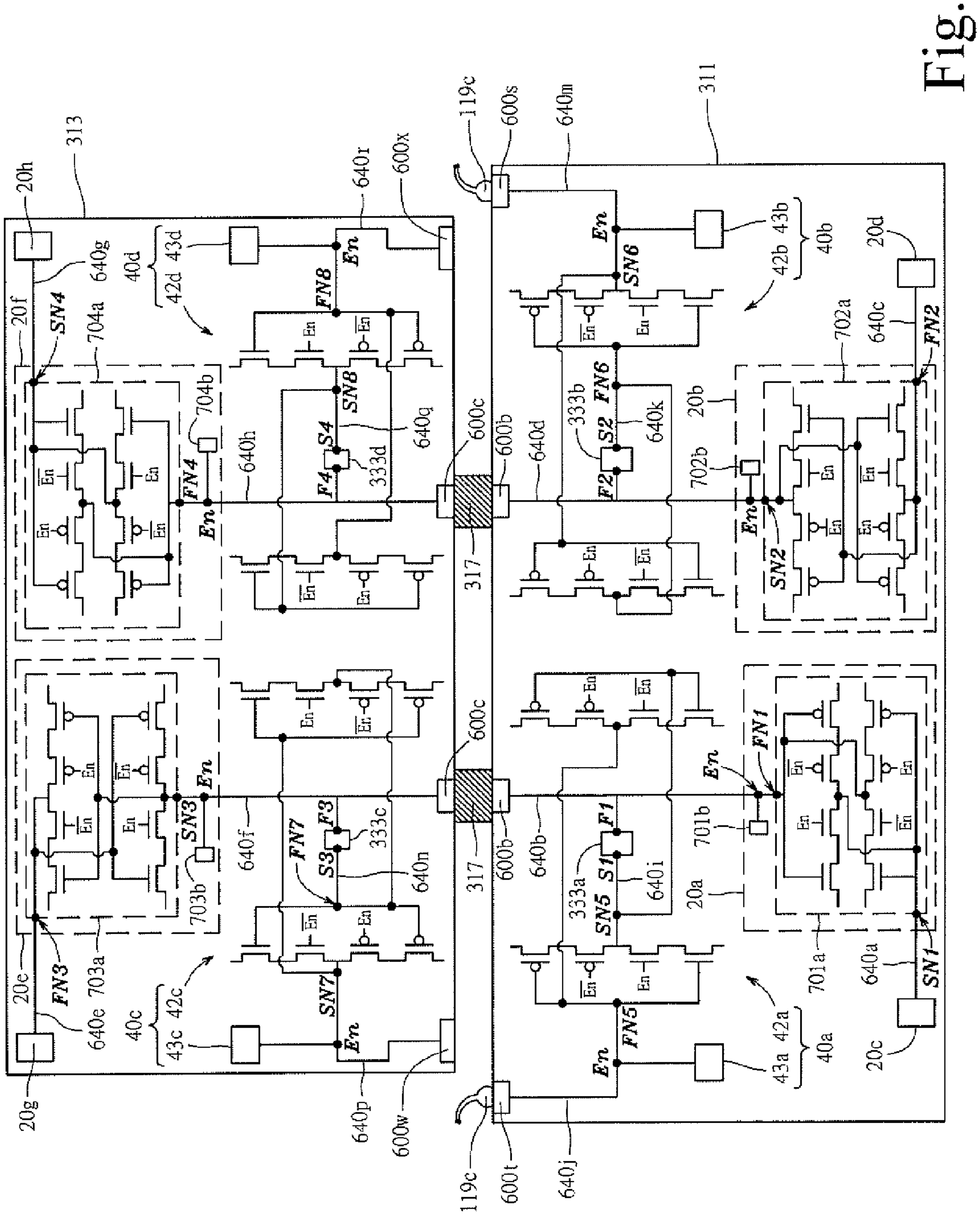

FIG. 39J is another example of the circuit diagram showing interface circuits of the cache memory chip 311 and the chip 313 shown in FIG. 37C, 37D, 38C or 38D. The circuit diagram shown in FIG. 39J is similar to that shown in FIG. 39H except that the cache memory chip 311 is connected to the substrate 301 or the BGA substrate 302 through the wirebonded wires 119*c* instead of the metal bumps or pillars 27. The element in FIG. 39J indicated by a same reference number as indicates the element in FIG. 39H has a same material and spec as the element illustrated in FIG. 39H.

In FIGS. 37A-37D, 38A-38D, 39A, and 39H-39J, the cache memory chip 311 may have a memory size larger than 10 megabytes, such as between 10 megabytes and 32 gigabytes, and preferably between 100 megabytes and 4 gigabytes. For example, the cache memory chip 311 can be a dynamic-random-access-memory (DRAM) chip, a static-random-access-memory (SRAM) chip or a synchronous-dynamic-random-access-memory (SDRAM) chip with a memory size larger than 10 megabytes, such as between 10 megabytes and 32 gigabytes, and preferably between 100 megabytes and 4 gigabytes. Very parallel communication is used between the chip 313 and the cache memory chip 311. The data bit width between the chip 313 and the cache memory chip 311 is equal to or more than 512, and preferably equal to or more than 1024. The cache memory chip 311 has the testing metal pads 600*s* and 600*t* used for testing the cache memory chip 311.

In FIGS. 37A, 37D, 38A and 38D, since two cache memory chips 311 and 321 provided on two opposite sides of the chip 313 respectively, the processor unit 303 has double bit width between the chip 313 and a cache memory provided by the cache memory chips 311 and 321. The cache memory chip 321 may have a memory size larger than 10 megabytes, such as between 10 megabytes and 32 gigabytes, and preferably between 100 megabytes and 4 gigabytes. For example, the cache memory chip 321 can be a dynamic-random-access-memory (DRAM) chip, a static-random-access-memory (SRAM) chip or a synchronous-dynamic-random-access-memory (SDRAM) chip with a memory size larger than 10 megabytes, such as between 10 megabytes and 32 gigabytes, and preferably between 100 megabytes and 4 gigabytes. Very parallel communication is used between the chip 313 and the cache memory chip 321. The data bit width between the chip 313 and the cache memory chip 321 is equal to or more than 512, and preferably equal to or more than 1024. The cache memory chip 321 has two testing metal pads 600*y* and 600*z* used for testing the cache memory chip 321.

Referring to FIG. 39A and FIGS. 39H-39J, very small load is between the chip 313 and the cache memory chip 311. The small inter-chip buffer 701*a* or 702*a*, such as inter-chip driver, inter-chip receiver or inter-chip tri-state buffer, is designed just like an internal buffer, such as internal driver, internal receiver or internal tri-state buffer, respectively, used for long interconnection within the cache memory chip 311, that is, the long interconnection connects multiple transistors in long distance within the cache memory chip 311. The small inter-chip buffer 703*a* or 704*a*, such as inter-chip driver, inter-chip receiver or inter-chip tri-state buffer, is designed just like an internal buffer, such as internal driver, internal receiver or internal tri-state buffer, respectively, used for long interconnection within the chip 313, that is, the long interconnection connects multiple transistors in long distance within the chip 313. The small inter-chip buffers 701*a*, 702*a*, 703*a* and 704*a* are designed on both the chip 313 and the cache memory chip 311 for a signal, clock, power or ground connection between the chip 313 and the cache memory chip 311. The number of inter-chip buffers including the inter-chip buffers 701*a* and 702*a* on the cache memory chip 311 is equal to or more than 512, and preferably equal to or more than 1024. The number of inter-chip buffers including the inter-chip buffers 703*a* and 704*a* on the chip 313 is equal to or more than 512, and preferably equal to or more than 1024.

The large off-chip buffers 42*a*, 42*b*, 42*c* and 42*d*, such as off-chip drivers, off-chip receivers or off-chip tri-sate buffers, are designed on both the chip 313 and the cache memory chip 311 for circuit testing and/or for signal, clock, power or ground connection to external circuits, such as the substrate 301 or the BGA substrate 302, and the external circuits are circuits not on the chip 313 or the cache memory chip 311, and the circuit testing is either (i) the wafer level testing performed before the chip 311 or 313 is sawed or diced apart from a wafer, or (ii) the package level testing (the final testing) after the chips 311 and 313 are joined with each other.

The testing interface circuits 333*a*, 333*b*, 333*c* and 333*d* are designed on both the chip 313 and the cache memory chip 311. The output capacitance at the first terminal F1 or F4 of the testing interface circuit 333*a* or 333*d* shown in FIG. 39A or 39I as seen from the inter-chip buffer 701*a* or 704*a* is smaller than 2 pF, exemplary smaller than 1 pF or smaller than 0.2 pF. The output loading capacitance of the first terminal F1 or F4 of the testing interface circuit 333*a* or 333*d* shown in FIG. 39A or 39I is smaller than 2 pF, exemplary smaller than 1 pF or smaller than 0.2 pF. The input capacitance at the first terminal F2 or F3 of the testing interface circuit 333*b* or 333*c* shown in FIG. 39A or 39I as seen from the inter-chip buffer 702*a* or 703*a* is smaller than 2 pF, exemplary smaller than 1 pF or smaller than 0.2 pF. The input loading capacitance of the first terminal F2 or F3 of the testing interface circuit 333*b* or 333*c* shown in FIG. 39A or 39I is smaller than 2 pF, exemplary smaller than 1 pF or smaller than 0.2 pF. The input or output capacitance at the first terminal F1, F2, F3 or F4 of the testing interface circuit 333*a*, 333*b*, 333*c* or 333*d* shown in FIG. 39H or 39J as seen from the inter-chip buffer 701*a*, 702*a*, 703*a* or 704*a* is smaller than 2 pF, exemplary smaller than 1 pF or smaller than 0.2 pF. The input or output loading capacitance of the first terminal F1, F2, F3 or F4 of the testing interface circuit 333*a*, 333*b*, 333*c* or 333*d* shown in FIG. 39H or 39J is smaller than 2 pF, exemplary smaller than 1 pF or smaller than 0.2 pF. Each of the test interface circuits 333*a*, 333*b*, 333*c* and 333*d* can be a scan test circuit, and the scan test circuit can be performed at the wafer level testing before the chip 311 or 313 is sawed or diced apart from a wafer or at the package level testing (the final testing) after the chips 311 and 313 are joined with each other, and the scan test circuit is used to test flip flops by input the scan-in signal or output the scan-out signal.

The small inter-chip ESD circuits 701*b*, 702*b*, 703*b* and 704*b* are used for the small inter-chip buffers 701*a*, 702*a*, 703*a* and 704*a* between the chip 313 and the cache memory chip 311 for electrostatic charge protection during the chip packaging or assembly manufacturing process. Alternatively, no ESD circuit can be required for the small inter-chip buffers 701*a*, 702*a*, 703*a* and 704*a* between the chip 313 and the cache memory chip 311, that is, the inter-chip ESD circuits 701*b*, 702*b*, 703*b* and 704*b* can be omitted. In other words, there is no ESD circuit connected to the metal interconnect lines 640*b*, 640*d*, 640*f* and 640*h*.

The large off-chip ESD circuits 43*a*, 43*b*, 43*c* and 43*d* required for the large off-chip buffers 42*a*, 42*b*, 42*c*, and 42*d* are designed on both the chip 313 and the cache memory chip 311 for the circuit testing and/or for signal, clock, power or ground connection to external circuits, such as the substrate 301 or the BGA substrate 302, and the external circuits are circuits not on the chip 313 and the cache memory chip 311, and the circuit testing is either (i) the wafer level testing performed before the chip 311 or 313 is sawed or diced apart from a wafer, or (ii) the package level testing (the final testing) after the chips 311 and 313 are joined with each other. The large off-chip ESD circuits 43*a*, 43*b*, 43*c* and 43*d* are used for electrostatic charge protection during the circuit testing, such as the wafer level testing or the package level testing (the final testing).

The size of the inter-chip ESD circuit 701*b*, 702*b*, 703*b* or 704*b* can be defined as the loading or capacitance of the inter-chip ESD circuit 701*b*, 702*b*, 703*b* or 704*b*, and the size of the off-chip ESD circuit 43*a*, 43*b*, 43*c* or 43*d* can be defined as the loading or capacitance of the off-chip ESD circuit 43*a*, 43*b*, 43*c* or 43*d*. In a case, each of the small inter-chip ESD circuits 701*b*, 702*b*, 703*b* and 704*b* has a size (loading or capacitance) smaller than 2 pF (pico Farads), such as between 0.01 and 2 pF, exemplary smaller than 0.5 pF, such as between 0.01 and 0.5 pF, and each of the large off-chip ESD circuits 43*a*, 43*b*, 43*c* and 43*d* has a size (loading or capacitance) larger than 2 pF, such as between 2 and 100 pF, exemplary larger than 5 pF, such as between 5 and 100 pF. In another case, each of the small inter-chip ESD circuits 701*b*, 702*b*, 703*b* and 704*b* has a size (loading or capacitance) smaller than 1 pF, such as between 0.01 and 1 pF, and each of the large off-chip ESD circuits 43*a*, 43*b*, 43*c* and 43*d* has a size (loading or capacitance) larger than 1 pF, such as between 1 and 100 pF.

Figure 40A:
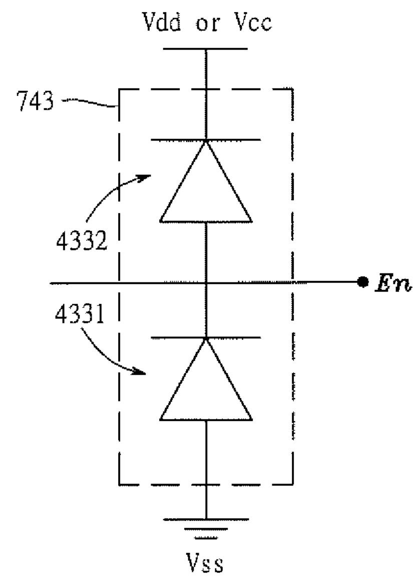

Alternatively, the size of the small inter-chip ESD circuit 701*b*, 702*b*, 703*b* or 704*b* or the size of the large off-chip ESD circuit 43*a*, 43*b*, 43*c* or 43*d* can be defined as below. An ESD (electro static discharge) circuit, such as the inter-chip ESD circuit 701*b*, 702*b*, 703*b* or 704*b* or the off-chip ESD circuit 43*a*, 43*b*, 43*c* or 43*d*, may include one or more ESD units, and each of the ESD units may include a $P^+$ active region and an $N^+$ active region connected to the $P^+$ active region and connected to an I/O (input/output) metal pad or testing metal pad of a chip, such as the metal pad 600*b*, 600*c*, 600*t*, 600*s*, 600*w* or 600*x* shown in FIG. 39A, 39H, 39I or 39J, and the area of the $P^+$ active region plus the area of the $N^+$ active region equals the active area of each of the ESD units. The total of the active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel. The active area of the ESD circuit can be used to define the size of the ESD circuit. FIGS. 40A-40F show how to calculate the active area of an ESD unit of a chip and define the size of an ESD circuit composed of one or more the ESD units. Referring to FIG. 40A, an electro static discharge (ESD) unit 743 of a chip can be composed of two reverse-biased diodes 4331 and 4332. FIG. 40C shows a cross-sectional view of the ESD unit 743 shown in FIG. 40A, and FIG. 40D is a top perspective view showing the topography of the ESD unit 743 derived from the top surface Z-Z' of a p-type silicon substrate 1 shown in FIG. 40C. Referring to FIGS. 40C and 40D, the ESD unit 743 includes two $P^+$ active regions 757*a* and 757*b* and two $N^+$ active regions 758*a* and 758*b*. The $P^+$ active region 757*a* is in an N-well 755 in the p-type silicon substrate 1, and the $N^+$ active region 758*a* is in the p-type silicon substrate 1. The $P^+$ active region 757*a* is connected to an I/O metal pad or testing metal pad of the chip, such as the metal pad 600*b*, 600*t* or 600*s* of the cache memory chip 311 or metal pad 600*c*, 600*w* or 600*x* of the chip 313 shown in FIG. 39A, 39H, 39I or 39J, through a metal interconnect line 753*a* of the chip. The $N^+$ active region 758*a* is connected to the $P^+$ active region 757*a* and to the I/O metal pad or the testing metal pad of the chip through the metal interconnect line 753*a*. The metal interconnect line 753*a* includes a portion provided by multiple fine-line metal layers 60 over the p-type silicon substrate 1, a first via plug 60' formed on a contact region 754*a* of the $P^+$ active region 757*a*, and a second via plug 60' formed on a contact region 754*b* of the $N^+$ active region 758*a*. The $P^+$ active region 757*b* is in the p-type silicon substrate 1, and the $N^+$ active region 758*b* is in the N-well 755 in the p-type silicon substrate 1. The $P^+$ active region 757*b* is connected to a ground bus through a metal interconnect line 753*b*, and the $N^+$ active region 758*b* is connected to a power bus through a metal interconnect line 735*c*. The metal interconnect line 753*b* contains a portion provided by the fine-line metal layers 60 over the p-type silicon substrate 1 and a via plug 60' formed on a contact region 754*c* of the $P^+$ active region 757*b*. The metal interconnect line 753*c* contains a portion provided by the fine-line metal layers 60 over the p-type silicon substrate 1 and a via plug 60' formed on a contact region 754*d* of the $N^+$ active region 758*b*.

Referring to FIG. 40D, the $P^+$ active region 757*a*, connected to the I/O metal pad or testing metal pad of the chip, has an area AR1, from a top view, enclosed by a field oxide 752 in the p-type silicon substrate 1. The $N^+$ active region 758*a*, connected to the I/O metal pad or testing metal pad of the chip, has an area AR2, from a top view, enclosed by the field oxide 752 in the p-type silicon substrate 1. The active area of the ESD unit 743 equals the area AR1 plus the area AR2.

Figure 40B:
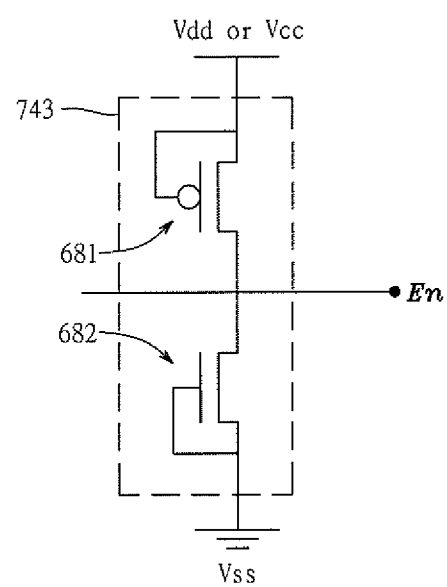
Figure 40C:
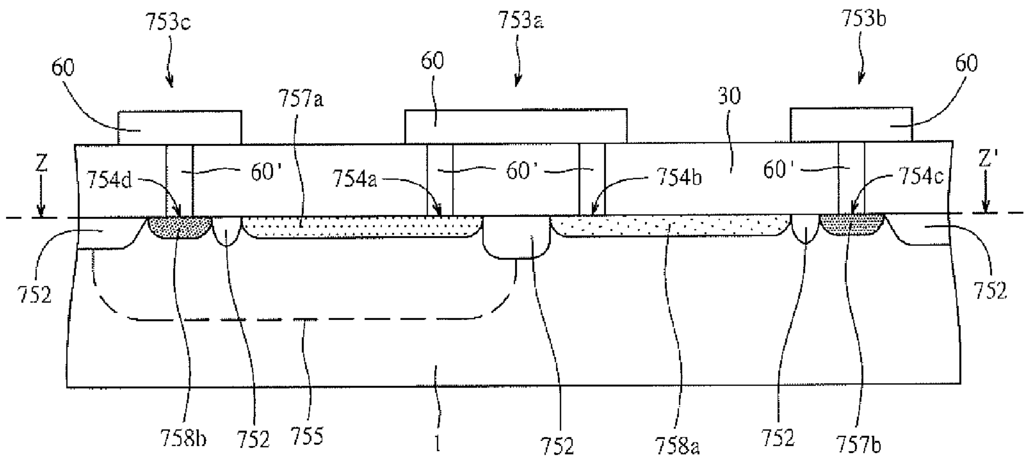
Figure 40D:
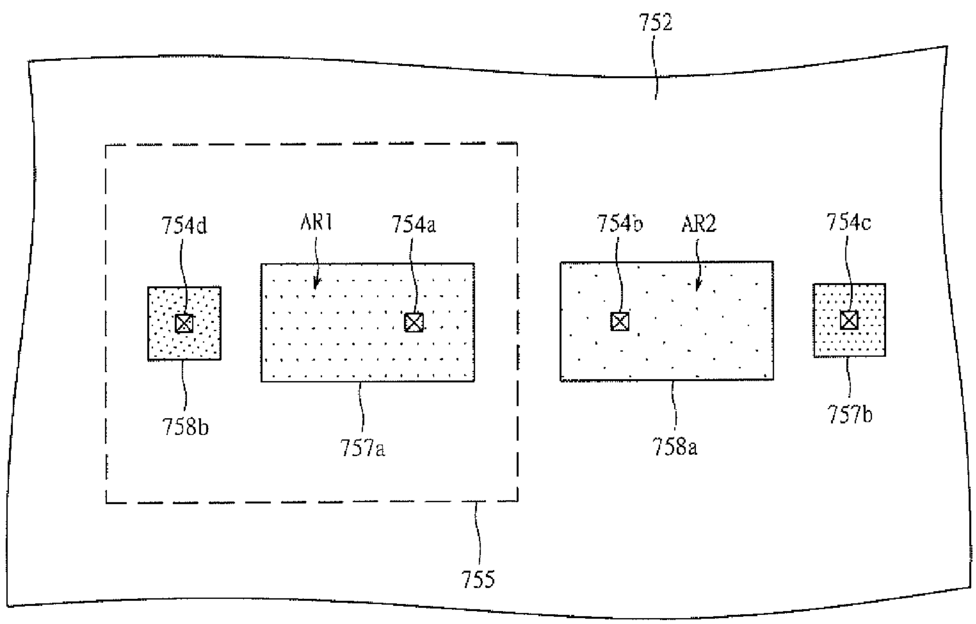
Figure 40E:
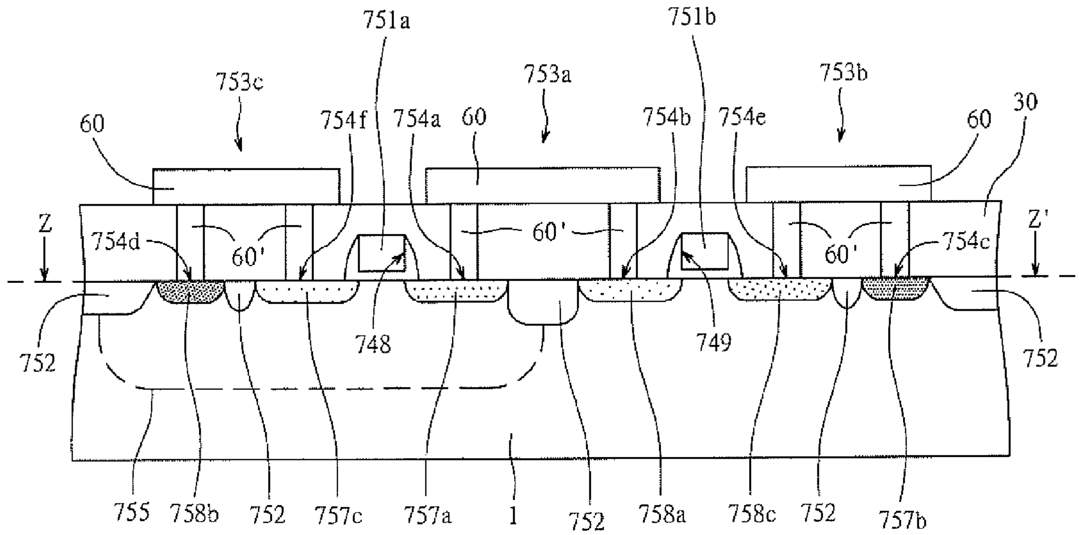
Figure 40F:
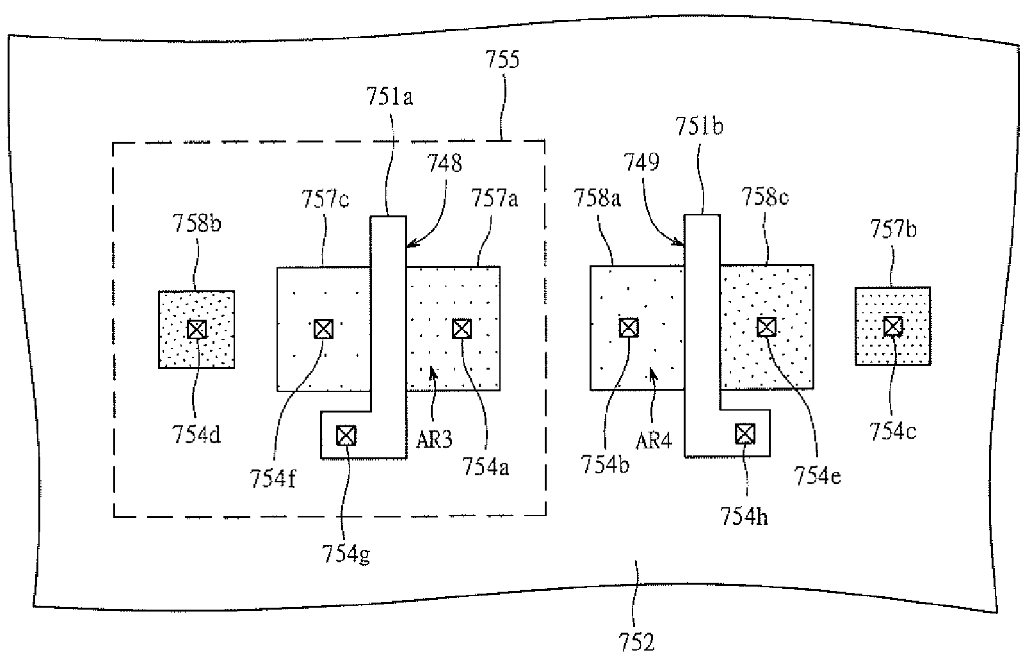

Alternatively, referring to FIG. 40B, the ESD unit 743 of the chip can be composed of a PMOS transistor 681 and an NMOS transistor 682. FIG. 40E shows a cross-sectional view of the ESD unit 743 shown in FIG. 40B, and FIG. 40F is a top perspective view showing the topography of the ESD unit 743 derived from the top surface Z-Z' of the p-type silicon substrate 1 shown in FIG. 40E. Referring to FIGS. 40B, 40E and 40F, the PMOS transistor 681 of the ESD unit 743 includes a gate 751*a* and two $P^+$ active regions 757*a* and 757*c* at two opposite sides of the gate 751*a*, and the NMOS transistor 682 of the ESD unit 743 includes a gate 751*b* and two $N^+$ active regions 758*a* and 758*c* at two opposite sides of the gate 751*b*. The $P^+$ active region 757*a* is in an N-well 755 in the p-type silicon substrate 1, and the $N^+$ active region 758*a* is in the p-type silicon substrate 1. The $P^+$ active region 757*a* is connected to an I/O metal pad or testing metal pad of the chip, such as the metal pad 600*b*, 600*t* or 600*s* of the cache memory chip 311 or metal pad 600*c*, 600*w* or 600*x* of the chip 313 shown in FIG. 39A, 39H, 39I or 39J, through a metal interconnect line 753*a* of the chip, and the $N^+$ active region 758*a* is connected to the $P^+$ active region 757*a* and to the I/O metal pad or the testing metal pad of the chip through the metal interconnect line 753*a*. The metal interconnect line 753*a* contains a portion provided by multiple fine-line metal layers 60 over the p-type silicon substrate 1, a first via plug 60' formed on a contact region 754*a* of the $P^+$ active region 757*a*, and a second via plug 60' formed on a contact region 754*b* of the $N^+$ active region 758*a*. The $P^+$ active region 757*b* is in the p-type silicon substrate 1, and the $N^+$ active region 758*b* is in the N-well 755 in the p-type silicon substrate 1. The $P^+$ active region 757*c* is in the N-well 755 in the p-type silicon substrate 1, and the $N^+$ active region 758*c* is in the p-type silicon substrate 1. The $N^+$ active region 758*c* is connected to a ground bus of the chip through a metal interconnect line 753*b* of the chip and to the $P^+$ active region 757*b* through the interconnect line 753*b*, and the $P^+$ active region 757*b* is connected to the ground bus through the metal interconnect line 753*b*. The $P^+$ active region 757*c* is connected to a power bus of the chip through a metal interconnect line 735*c* of the chip and to the $N^+$ active region 758*b* through the metal interconnect line 735*c*, and the $N^+$ active region 758*b* is connected to the power bus through the metal interconnect line 735*c*. The metal interconnect line 753*b* contains a portion provided by the fine-line metal layers 60 over the p-type silicon substrate 1, a first via plug 60' formed on a contact region 754*c* of the $P^+$ active region 757*b*, and a second via plug 60' formed on a contact region 754*e* of the $N^+$ active region 758*c*. The metal interconnect line 753*c* contains a portion provided by the fine-line metal layers 60 over the p-type silicon substrate 1, a first via plug 60' formed on a contact region 754*d* of the $N^+$ active region 758*b*, and a second via plug 60' formed on a contact region 754*f* of the $P^+$ active region 757*c*. The gate 751*a* has a contact region 754*g* connected to the power bus of the chip and to the contact regions 754*d* and 754*f* through the metal interconnect line 753*c*. The gate 751*b* has a contact region 754*h* connected to the ground bus of the chip and to the contact regions 754*c* and 754*e* through the metal interconnect line 753*b*.

Referring to FIG. 40F, the $P^+$ active region 757*a*, connected to the I/O metal pad or testing metal pad of the chip, has an area AR3, from a top view, enclosed by the boundary defined by a sidewall 748 of the gate 751*a* and the border between a field oxide 752 and the $P^+$ active region 757*a*. The $N^+$ active region 758*a*, connected to the I/O metal pad or testing metal pad of the chip, has an area AR4, from a top view, enclosed by the boundary defined by a sidewall 749 of the gate 751*b* and the border between the field oxide 752 and the $N^+$ active region 758*a*. The active area of the ESD unit 743 equals the area AR3 plus the area AR4.

Based on the previously described definition or calculation illustrated in FIGS. 40A-40F, the active area of each of ESD units of an ESD circuit can be calculated, and the total of active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel.

Accordingly, the active area of each of the inter-chip ESD circuits 701*b*, 702*b*, 703*b* and 704*b* and the active area of each of the off-chip ESD circuits 43*a*, 43*b*, 43*c* and 43*d* can be calculated. For example, the small inter-chip ESD circuit 701*b*, 702*b*, 703*b* or 704*b* may have an active area smaller than 1300 square millimeters, such as between 6.5 and 1300 square millimeters, exemplary smaller than 325 square millimeters, such as between 6.5 and 325 square millimeters, and the large off-chip ESD circuit 43*a*, 43*b*, 43*c* or 43*d* may have an active area larger than 1300 square millimeters, such as between 1300 and 65000 square millimeters, exemplary larger than 3250 square millimeters, such as between 3250 and 65000 square millimeters. Alternatively, the small inter-chip ESD circuit 701*b*, 702*b*, 703*b* or 704*b* may have an active area smaller than 650 square millimeters, and the large off-chip ESD circuit 43*a*, 43*b*, 43*c* or 43*d* may have an active area larger than 650 square millimeters.

The size of the large off-chip ESD circuit 43*a* of the cache memory chip 311, defined as the total of the active areas of the one or more ESD units in the large off-chip ESD circuit 43*a* or the loading or capacitance of the large off-chip ESD circuit 43*a*, can be larger than the size of the small inter-chip ESD circuit 701*b* of the cache memory chip 311, defined as the total of the active areas of the one or more ESD units in the small inter-chip ESD circuit 701*b* or the loading or capacitance of the small inter-chip ESD circuit 701*b*, by more than 3 times, 10 times, 25 times or 50 times, such as between 3 and 50 times.

The size of the large off-chip ESD circuit 43*b* of the cache memory chip 311, defined as the total of the active regions of the one or more ESD units in the large off-chip ESD circuit 43*b* or the loading or capacitance of the large off-chip ESD circuit 43*b*, can be larger than the size of the small inter-chip ESD circuit 702*b* of the cache memory chip 311, defined as the total of the active regions of the one or more ESD units in the small inter-chip ESD circuit 702*b* or the loading or capacitance of the small inter-chip ESD circuit 702*b*, by more than 3 times, 10 times, 25 times or 50 times, such as between 3 and 50 times.

The size of the large off-chip ESD circuit 43$c$ of the chip 313 defined as the total of the active regions of the one or more ESD units in the large off-chip ESD circuit 43$c$ or the loading or capacitance of the large off-chip ESD circuit 43$c$, can be larger than the size of the small inter-chip ESD circuit 703$b$ of the chip 313, defined as the total of the active regions of the one or more ESD units in the small inter-chip ESD circuit 703$b$ or the loading or capacitance of the small inter-chip ESD circuit 703$b$, by more than 3 times, 10 times, 25 times or 50 times, such as between 3 and 50 times.

The size of the large off-chip ESD circuit 43$d$ of the chip 313 defined as the total of the active regions of the one or more ESD units in the large off-chip ESD circuit 43$d$ or the loading or capacitance of the large off-chip ESD circuit 43$d$, can be larger than the size of the small inter-chip ESD circuit 704$b$ of the chip 313, defined as the total of the active regions of the one or more ESD units in the small inter-chip ESD circuit 704$b$ or the loading or capacitance of the small inter-chip ESD circuit 704$b$, by more than 3 times, 10 times, 25 times or 50 times, such as between 3 and 50 times.

The size of the inter-chip buffer 702$a$ or 703$a$ shown in FIG. 39A or 39I can be characterized by the load or loading of the inter-chip buffer 702$a$ or 703$a$. Referring to FIG. 39A or 39I, the load or loading of the inter-chip buffer 702$a$ or 703$a$ is total equivalent capacitance load of the inter-chip buffer 702$a$ or 703$a$, and the inter-chip buffer 702$a$ or 703$a$ is designed with a certain size for driving the load or loading that equals a capacitance $C_{a1}$ plus a capacitance $C_{a2}$ plus a capacitance $C_{a3}$ plus a capacitance $C_{g1}$ plus a capacitance $C_{g2}$ plus a capacitance $C_{b1}$ plus a capacitance $C_{b2}$ plus a capacitance $C_{b3}$. The capacitance $C_{a1}$ is a capacitance of the metal interconnect line 640$d$ or 640$f$ between the inter-chip buffer 702$a$ or 703$a$ and the metal pad 600$b$ or 600$c$ on the chip 311 or 313. The capacitance $C_{a2}$ is a capacitance of the metal pad 600$b$ or 600$c$ corresponding to the inter-chip buffer 702$a$ or 703$a$ on the chip 311 or 313. The capacitance $C_{a3}$ is a parasitic capacitance correspondent to the inter-chip 702$a$ or 703$a$ on the chip 311 or 313. The capacitance $C_{g1}$ is a capacitance of the microbump 317. The capacitance $C_{g2}$ is a parasitic capacitance in the gap between the cache memory chip 311 and the chip 313. The capacitance $C_{b1}$ is a capacitance of the metal interconnect line 640$h$ or 640$b$ between the inter-chip buffer 704$a$ or 701$a$ and the metal pad 600$c$ or 600$b$ on the chip 313 or 311. The capacitance $C_{b2}$ is a capacitance of the metal pad 600$c$ or 600$b$ corresponding to the inter-chip buffer 704$a$ or 701$a$ on the chip 313 or 311. The capacitance $C_{b3}$ is a parasitic capacitance correspondent to the inter-chip buffer 704$a$ or 701$a$ on the chip 313 or 311.

Accordingly, the load or loading of the inter-chip buffer 702$a$ or 703$a$ shown in FIG. 39A or 39I can be defined. The load or loading of the inter-chip buffer 702$a$ or 703$a$, such as the load or loading of the last stage inverter 425$b$ or 426$b$, with drains of the NMOS transistor 752$a$ or 753$a$ and the PMOS transistor 752$b$ or 753$b$ connected to the metal pad 600$b$ or 600$c$, of the two-stage cascade inter-chip driver shown in FIG. 39C or 39D, can be smaller than 2 pF, such as between 2 pF and 0.001 pF, exemplary smaller than 1 pF or smaller than 0.3 pF. For clock rate or signal frequency larger 1 G Hz, the load or loading or the size of the inter-chip buffer 702$a$ or 703$a$ shown in FIG. 39A or 39I can be smaller than 0.1 pF, such as between 0.1 pF and 0.001 pF.

The size of the inter-chip buffer 701$a$, 702$a$, 703$a$ or 704$a$ shown in FIG. 39H or 39J can be characterized by the load or loading of the inter-chip buffer 701$a$, 702$a$, 703$a$ or 704$a$. Referring to FIG. 39H or 39J, the load or loading of the inter-chip buffer 701$a$, 702$a$, 703$a$ or 704$a$ is total equivalent capacitance load of the inter-chip buffer 701$a$, 702$a$, 703$a$ or 704$a$, and the inter-chip buffer 701$a$, 702$a$, 703$a$ or 704$a$ is designed with a certain size for driving the load or loading that equals a capacitance $C_{a1}$ plus a capacitance $C_{a2}$ plus a capacitance $C_{a3}$ plus a capacitance $C_{g1}$ plus a capacitance $C_{g2}$ plus a capacitance $C_{b1}$ plus a capacitance $C_{b2}$ plus a capacitance $C_{b3}$. The capacitance $C_{a1}$ is a capacitance of the metal interconnect line 640$b$, 640$d$, 640$f$ or 640$h$ between the inter-chip buffer 701$a$, 702$a$, 703$a$ or 704$a$ and the metal pad 600$b$ or 600$c$ on the chip 311 or 313. The capacitance $C_{a2}$ is a capacitance of the metal pad 600$b$ or 600$c$ corresponding to the inter-chip buffer 701$a$, 702$a$, 703$a$ or 704$a$ on the chip 311 or 313. The capacitance $C_{a3}$ is a parasitic capacitance correspondent to the inter-chip 701$a$, 702$a$, 703$a$ or 704$a$ on the chip 311 or 313. The capacitance $C_{g1}$ is a capacitance of the microbump 317. The capacitance $C_{g2}$ is a parasitic capacitance in the gap between the cache memory chip 311 and the chip 313. The capacitance $C_{b1}$ is a capacitance of the metal interconnect line 640$f$, 640$h$, 640$b$ or 640$d$ between the inter-chip buffer 703$a$, 704$a$, 701$a$ or 702$a$ and the metal pad 600$c$ or 600$b$ on the chip 313 or 311. The capacitance $C_{b2}$ is a capacitance of the metal pad 600$c$ or 600$b$ corresponding to the inter-chip buffer 703$a$, 704$a$, 701$a$ or 702$a$ on the chip 313 or 311. The capacitance $C_{b3}$ is a parasitic capacitance correspondent to the inter-chip buffer 703$a$, 704$a$, 701$a$ or 702$a$ on the chip 313 or 311.

Accordingly, the load or loading of the inter-chip buffer 701$a$, 702$a$, 703$a$ or 704$a$ shown in FIG. 39H or 39J can be defined. The load or loading of the inter-chip buffer 701$a$, 702$a$, 703$a$ or 704$a$, such as the load or loading of a last stage tri-state driver, with drains of an NMOS transistor and a PMOS transistor connected to the metal pad 600$b$ or 600$c$, of a multi-stage cascade tri-state buffer, can be smaller than 2 pF, such as between 2 pF and 0.001 pF, exemplary smaller than 1 pF or smaller than 0.3 pF. For clock rate or signal frequency larger 1 G Hz, the load or loading or the size of the inter-chip buffer 701$a$, 702$a$, 703$a$ or 704$a$ shown in FIG. 39H or 39J can be smaller than 0.1 pF, such as between 0.1 pF and 0.001 pF.

The size of the off-chip buffer 42$b$ shown in FIG. 39A or 39H can be characterized by the load or loading of the off-chip buffer 42$b$. Referring to FIG. 39A or 39H, the load or loading of the off-chip buffer 42$b$ is total equivalent capacitance load of the off-chip buffer 42$b$, and the off-chip buffer 42$b$ is designed with a certain size for driving the load or loading that equals a capacitance $C_{a1}$ plus a capacitance $C_{a2}$ plus a capacitance $C_{a3}$ plus a capacitance $C_{a4}$ plus a capacitance $C_{a5}$ plus a capacitance $C_{xz}$. The capacitance $C_{a1}$ is a capacitance of the metal interconnect line 640$m$ between the off-chip buffer 42$b$ and the metal pad 600$s$ on the cache memory chip 311 and between the off-chip buffer 42$b$ and the metal pad 887 on the cache memory chip 311. The capacitance $C_{a2}$ is a capacitance of the metal pad 600$s$ corresponding to the off-chip buffer 42$b$ on the cache memory chip 311. The capacitance $C_{a3}$ is a capacitance of the metal pad 887 corresponding to the off-chip buffer 42$b$ on the cache memory chip 311. The capacitance $C_{a4}$ is a parasitic capacitance correspondent to the off-chip buffer 42$b$ on the cache memory chip 311. The capacitance $C_{a5}$ is a parasitic capacitance from the off-chip buffer 42$b$ to the metal pad 600$s$ and from the off-chip buffer 42$b$ to the metal pad 887. The capacitance $C_{xz}$ can be a capacitance of a testing device and a parasitic capacitance in the testing device during wafer-level testing process, but after bonding with an external circuit, such as substrate 301 or 302, the capacitance $C_{xz}$ can include a capacitance of the metal bump or pillar 27, plus a parasitic capacitance in the interconnection from the metal bump or pillar 27 to another chip or a passive device on the substrate 301 or 302, plus a capacitance of metal interconnect lines in the substrate 301 or 302, plus a capacitance of the another chip or the passive device on the substrate 301 or 302, plus a parasitic capacitance correspondent to the another chip or the passive device on the substrate 301 or 302.

Accordingly, the load or loading of the off-chip buffer 42*b* shown in FIG. 39A or 39H can be defined. The load or loading of the off-chip buffer 42*b*, such as the load or loading of a last stage driver, with drains of an NMOS transistor and a PMOS transistor connected to the metal pads 600*s* and 887, of a multi-stage cascade inter-chip driver, can be larger than 2 pF, such as between 2 and 100 pF, exemplary larger than 5 pF or larger than 10 pF. The load or loading of the off-chip buffer 42*b* shown in FIG. 39A or 39H is larger than the load or loading of the inter-chip buffer 702*a* shown in FIG. 39A or 39H by more than 3 times, 10 times, 25 times or 50 times, such as between 3 and 100 times.

The size of the off-chip buffer 42*b* shown in FIG. 39I or 39J can be characterized by the load or loading of the off-chip buffer 42*b*. Referring to FIG. 39I or 39J, the load or loading of the off-chip buffer 42*b* is total equivalent capacitance load of the off-chip buffer 42*b*, and the off-chip buffer 42*b* is designed with a certain size for driving the load or loading that equals a capacitance $C_{a1}$ plus a capacitance $C_{a2}$ plus a capacitance $C_{a3}$ plus a capacitance $C_{a4}$ plus a capacitance $C_{xz}$. The capacitance $C_{a1}$ is a capacitance of the metal interconnect line 640*m* between the off-chip buffer 42*b* and the metal pad 600*s* on the cache memory chip 311. The capacitance $C_{a2}$ is a capacitance of the metal pad 600*s* corresponding to the off-chip buffer 42*b* on the cache memory chip 311. The capacitance $C_{a3}$ is a parasitic capacitance correspondent to the off-chip buffer 42*b* on the cache memory chip 311. The capacitance $C_{a4}$ is a parasitic capacitance from the off-chip buffer 42*b* to the metal pad 600*s*. The capacitance $C_{xz}$ can be a capacitance of a testing device and a parasitic capacitance in the testing device during wafer-level testing process, but after bonding with an external circuit, such as substrate 301 or 302, the capacitance $C_{xz}$ can include a capacitance of the wirebonded wire 119*c*, plus a parasitic capacitance in the interconnection from the wirebonded wire 119*c* to another chip or a passive device on the substrate 301 or 302, plus a capacitance of metal interconnect lines in the substrate 301 or 302, plus a capacitance of the another chip or the passive device on the substrate 301 or 302, plus a parasitic capacitance correspondent to the another chip or the passive device on the substrate 301 or 302.

Accordingly, the load or loading of the off-chip buffer 42*b* shown in FIG. 39I or 39J can be defined. The load or loading of the off-chip buffer 42*b*, such as the load or loading of a last stage driver, with drains of an NMOS transistor and a PMOS transistor connected to the metal pad 600*s*, of a multi-stage cascade inter-chip driver, can be larger than 2 pF, such as between 2 and 100 pF, exemplary larger than 5 pF or larger than 10 pF. The load or loading of the off-chip buffer 42*b* shown in FIG. 39I or 39J is larger than the load or loading of the inter-chip buffer 702*a* shown in FIG. 39I or 39J by more than 3 times, 10 times, 25 times or 50 times, such as between 3 and 100 times.

The size of the off-chip buffer 42*c* shown in FIG. 39A, 39H, 39I or 39J can be characterized by the load or loading of the off-chip buffer 42*c*. Referring to FIG. 39A, 39H, 39I or 39J, the load or loading of the off-chip buffer 42*c* is total equivalent capacitance load of the off-chip buffer 42*c*, and the off-chip buffer 42*c* is designed with a certain size for driving the load or loading that equals a capacitance $C_{a1}$ plus a capacitance $C_{a2}$ plus a capacitance $C_{a3}$ plus a capacitance $C_{a4}$ plus a capacitance $C_{xz}$. The capacitance $C_{a1}$ is a capacitance of the metal interconnect line 640*p* between the off-chip buffer 42*c* and the metal pad 600*w* on the chip 313. The capacitance $C_{a2}$ is a capacitance of the metal pad 600*w* corresponding to the off-chip buffer 42*c* on the chip 313. The capacitance $C_{a3}$ is a parasitic capacitance correspondent to the off-chip buffer 42*c* on the chip 313. The capacitance $C_{a4}$ is a parasitic capacitance from the off-chip buffer 42*c* to the metal pad 600*w*. The capacitance $C_{xz}$ can be a capacitance of a testing device and a parasitic capacitance in the testing device during wafer-level testing process.

Accordingly, the load or loading of the off-chip buffer 42*c* shown in FIG. 39A, 39H, 39I or 39J can be defined. The load or loading of the off-chip buffer 42*c*, such as the load or loading of a last stage driver, with drains of an NMOS transistor and a PMOS transistor connected to the metal pad 600*w*, of a multi-stage cascade inter-chip driver, can be larger than 2 pF, such as between 2 and 100 pF, exemplary larger than 5 pF or larger than 10 pF. The load or loading of the off-chip buffer 42*c* shown in FIG. 39A, 39H, 39I or 39J is larger than the load or loading of the inter-chip buffer 703*a* shown in FIG. 39A, 39H, 39I or 39J by more than 3 times, 10 times, 25 times or 50 times, such as between 3 and 100 times.

The size of the inter-chip buffer 702*a* or 703*a* shown in FIG. 39A, 39H, 39I or 39J can be characterized by a peak drive current of the inter-chip buffer 702*a* or 703*a*, and the size of the off-chip buffer 42*b* or 42*c* shown in FIG. 39A, 39H, 39I or 39J can be characterized by a peak drive current of the off-chip buffer 42*b* or 42*c*. The peak drive current of the off-chip buffer 42*b* or 42*c* is larger than the peak drive current of the inter-chip buffer 702*a* or 703*a* by more than 3 times, 10 times, 25 times or 50 times, such as between 3 and 100 times.

For example, regarding to the inter-chip buffer 702*a* shown in FIG. 39A or 39I, when the PMOS transistor 752*b* is on and the NMOS transistor 752*a* is off, the previously described load or loading driven by the inter-chip buffer 702*a* is charged with a charging current. When the NMOS transistor 752*a* is on and the PMOS transistor 752*b* is off, the load or loading the previously described load or loading driven by the inter-chip buffer 702*a* is discharged with a discharging current. The peak charging or discharging current (a function of bias-voltages) of the NMOS transistor 752*a* or PMOS transistor 752*b* can be used to define the peak drive current of the inter-chip buffer 702*a*. Regarding to the off-chip buffer 42*b* shown in FIG. 39A or 39I, when the PMOS transistor 4204 is on and the NMOS transistor 4203 is off, the previously described load or loading driven by the off-chip buffer 42*b* is charged with a charging current. When the NMOS transistor 4203 is on and the PMOS transistor 4204 is off, the previously described load or loading driven by the off-chip buffer 42*b* is discharged with a discharging current. The peak charging or discharging current (a function of bias-voltages) of the NMOS transistor 4203 or PMOS transistor 4204 can be used to define the peak drive current of the off-chip buffer 42*b*. The peak drive current of the off-chip buffer 42*b* is larger than the peak drive current of the inter-chip buffer 702*a* by more than 3 times, 10 times, 25 times or 50 times, such as between 3 and 100 times.

The size of the inter-chip buffer 702*a* or 703*a* shown in FIG. 39A, 39H, 39I or 39J can be characterized by an on-resistance of a transistor in the last stage driver of the inter-chip buffer 702*a* or 703*a*, and the size of the off-chip buffer 42*b* or 42*c* shown in FIG. 39A, 39H, 39I or 39J can be characterized by an on-resistance of a transistor in the last stage driver of the off-chip buffer 42*b* or 42*c*. The on-resistance of the off-chip buffer 42*b* or 42*c* is larger than the on-resistance of the inter-chip buffer 702*a* or 703*a* by more than 3 times, 10 times, 25 times or 50 times, such as between 3 and 100 times.

For example, regarding to the inter-chip buffer 702*a* shown in FIG. 39A or 39I, when the PMOS transistor 752*b* is on and the NMOS transistor 752*a* is off, the previously described load or loading driven by the inter-chip buffer 702*a* is charged, and the PMOS transistor 752*b* is equivalent to a resister with an on-resistance. When the NMOS transistor 752*a* is on and the PMOS transistor 752*b* is off, the previously described load or loading driven by the inter-chip buffer 702*a* is discharged, and the NMOS transistor 752*a* is equivalent to a resister with resistance of an on-resistance. The on-resistance (a function of bias-voltages) of the NMOS transistor 752*a* or PMOS transistor 752*b* can be used to characterize the size of the inter-chip buffer 702*a*. Regarding to the off-chip buffer 42*b* shown in FIG. 39A or 39I, when the PMOS transistor 4204 is on and the NMOS transistor 4203 is off, the previously described load or loading driven by the off-chip buffer 42*b* is charged, and the PMOS transistor 4204 is equivalent to a resister with an on-resistance. When the NMOS transistor 4203 is on and the PMOS transistor 4204 is off, the previously described load or loading driven by the off-chip buffer 42*b* is discharged, and the NMOS transistor 4203 is equivalent to a resister with an on-resistance. The on-resistance (a function of bias-voltages) of the NMOS transistor 4203 or PMOS transistor 4204 can be used to characterize the size of the off-chip buffer 42*b*.

The size of the inter-chip buffer 702*a* shown in FIG. 39A or 39I can be characterized by a ratio of a physical channel width to a physical channel length of the NMOS transistor 752*a* or PMOS transistor 752*b*, and the drains of the NMOS transistor 752*a* and the PMOS transistor 752*b* are connected to the metal pad 600*b* of the cache memory chip 311 through the metal interconnect line 640*d*. If the inter-chip buffer 702*a* is the two-stage cascade inter-chip driver shown in FIG. 39C, the size of the inter-chip buffer 702*a* can be characterized by the ratio of the physical channel width to the physical channel length of the NMOS transistor 752*a* or PMOS transistor 752*b* in the last stage driver 425*b*, and the drains of the NMOS transistor 752*a* and the PMOS transistor 752*b* are connected to the metal pad 600*b* of the cache memory chip 311 through the metal interconnect line 640*d*. The definition of the physical channel width and physical channel length of the NMOS transistor 752*a* or PMOS transistor 752*b* can be referred to as the illustration in FIGS. 21 and 22. The ratio of the physical channel width to the physical channel length of the NMOS transistor 752*a* can be between 1 and 50, exemplary between 1 and 20, and the ratio of the physical channel width to the physical channel length of the PMOS transistor 752*b* can be between 1 and 100, exemplary between 1 and 40.

The size of the inter-chip buffer 703*a* shown in FIG. 39A or 39I can be characterized by a ratio of a physical channel width to a physical channel length of the NMOS transistor 753*a* or PMOS transistor 753*b*, and the drains of the NMOS transistor 753*a* and the PMOS transistor 753*b* are connected to the metal pad 600*c* of the chip 313 through the metal interconnect line 640*f*. If the inter-chip buffer 703*a* is the two-stage cascade inter-chip driver shown in FIG. 39D, the size of the inter-chip buffer 703*a* can be characterized by the ratio of the physical channel width to the physical channel length of the NMOS transistor 753*a* or PMOS transistor 753*b* in the last stage driver 426*b*, and the drains of the NMOS transistor 753*a* and the PMOS transistor 753*b* are connected to the metal pad 600*c* of the chip 313 through the metal interconnect line 640*f*. The definition of the physical channel width and physical channel length of the NMOS transistor 753*a* or PMOS transistor 753*b* can be referred to as the illustration in FIGS. 21 and 22. The ratio of the physical channel width to the physical channel length of the NMOS transistor 753*a* is between 1 and 50, exemplary between 1 and 20, and the ratio of the physical channel width to the physical channel length of the PMOS transistor 753*b* is between 1 and 100, exemplary between 1 and 40.

The size of the off-chip buffer 42*b* shown in FIG. 39A or 39I can be characterized by a ratio of a physical channel width to a physical channel length of the NMOS transistor 4203 or PMOS transistor 4204, and the drains of the NMOS transistor 4203 and the PMOS transistor 4204 are connected to the metal pad 600*s* or 887 of the cache memory chip 311 through the metal interconnect line 640*m*. If the off-chip buffer 42*b* is the two-stage cascade off-chip driver 421 shown in FIG. 11A, the size of the off-chip buffer 42*b* can be characterized by the ratio of the physical channel width to the physical channel length of the NMOS transistor 4203 or PMOS transistor 4204 in the last stage driver 421", and the drains of the NMOS transistor 4203 and the PMOS transistor 4204 are connected to the metal pad 600*s* or 887 of the cache memory chip 311 through the metal interconnect line 640*m*. The definition of the physical channel width and physical channel length of the NMOS transistor 4203 or PMOS transistor 4204 can be referred to as the illustration in FIGS. 21 and 22. The ratio of the physical channel width to the physical channel length of the NMOS transistor 4203 can be larger than 30, such as between 30 and 20000, exemplary larger than 50, such as between 50 and 300. The ratio of the physical channel width to the physical channel length of the PMOS transistor 4204 can be larger than 60, such as between 60 and 40000, exemplary larger than 100, such as between 100 and 600. The ratio of the physical channel width to the physical channel length of the NMOS transistor 4203 may be larger than the ratio of the physical channel width to the physical channel length of the NMOS transistor 752*a* by more than 3 times, 10 times, 25 times or 50 times, such as between 3 and 100 times. The ratio of the physical channel width to the physical channel length of the PMOS transistor 4204 may be larger than the ratio of the physical channel width to the physical channel length of the PMOS transistor 752*b* by more than 3 times, 10 times, 25 times or 50 times, such as between 3 and 100 times.

The size of the off-chip buffer 42*c* shown in FIG. 39A or 39I can be characterized by a ratio of a physical channel width to a physical channel length of the NMOS transistor 4203*a* or PMOS transistor 4204*a*, and the drains of the NMOS transistor 4203*a* and the PMOS transistor 4204*a* are connected to the metal pad 600*w* of the chip 313 through the metal interconnect line 640*p*. If the off-chip buffer 42*c* is the two-stage cascade off-chip driver shown in FIG. 39F, the size of the off-chip buffer 42*c* can be characterized by the ratio of the physical channel width to the physical channel length of the NMOS transistor 4203*a* or PMOS transistor 4204*a* in the last stage driver 427*b*, and the drains of the NMOS transistor 4203*a* and the PMOS transistor 4204*a* are connected to the metal pad 600*w* of the chip 313 through the metal interconnect line 640*p*. The definition of the physical channel width and physical channel length of the NMOS transistor 4203*a* or PMOS transistor 4204*a* can be referred to as the illustration in FIGS. 21 and 22. The ratio of the physical channel width to the physical channel length of the NMOS transistor 4203*a* is larger than 30, such as between 30 and 20000, exemplary larger than 50, such as between 50 and 300. The ratio of the physical channel width to the physical channel length of the PMOS transistor 4204*a* is larger than 60, such as between 60 and 40000, exemplary larger than 100, such as between 100 and 600. The ratio of the physical channel width to the physical channel length of the NMOS transistor 4203*a* may be larger than the ratio of the physical channel width to the physical channel length of the NMOS transistor 753*a* by more than 3 times, 10 times, 25 times or 50 times, such as between 3 and 100 times. The ratio of the physical channel width to the physical channel length of the PMOS transistor 4204*a* may be larger than the ratio of the physical channel width to the physical channel length of the PMOS transistor 753*b* by more than 3 times, 10 times, 25 times or 50 times, such as between 3 and 100 times.

The size of the inter-chip buffer 701*a* or 702*a* shown in FIG. 39H or 39J can be characterized by a ratio of a physical channel width to a physical channel length of an NMOS transistor or PMOS transistor of the tri-state driver of the inter-chip tri-state buffer, and the tri-state driver is connected to the metal pad 600*b* of the cache memory chip 311 through the metal interconnect line 640*b* or 640*d*, and the ratio of the physical channel width to the physical channel length of the NMOS transistor of the tri-state driver is between 1 and 50, exemplary between 1 and 20, and the ratio of the physical channel width to the physical channel length of the PMOS transistor of the tri-state driver is between 1 and 100, exemplary between 1 and 40. If the inter-chip buffer 701*a* or 702*a* is a multi-stage tri-state buffer, the size of the inter-chip buffer 701*a* or 702*a* can be characterized by a ratio of a physical channel width to a physical channel length of an NMOS transistor or PMOS transistor in the last stage tri-state driver of the multi-stage tri-state buffer, and the last stage tri-state driver is connected to the metal pad 600*b* of the cache memory chip 311 through the metal interconnect line 640*b* or 640*d*, and the ratio of the physical channel width to the physical channel length of the NMOS transistor of the last stage tri-state driver is between 1 and 50, exemplary between 1 and 20, and the ratio of the physical channel width to the physical channel length of the PMOS transistor of the last stage tri-state driver is between 1 and 100, exemplary between 1 and 40. The definition of the physical channel width and physical channel length of the NMOS transistor or PMOS transistor can be referred to as the illustration in FIGS. 21 and 22.

The size of the inter-chip buffer 703*a* or 704*a* shown in FIG. 39H or 39J can be characterized by a ratio of a physical channel width to a physical channel length of an NMOS transistor or PMOS transistor of the tri-state driver of the inter-chip tri-state buffer, and the tri-state driver is connected to the metal pad 600*c* of the chip 313 through the metal interconnect line 640*f* or 640*h*, and the ratio of the physical channel width to the physical channel length of the NMOS transistor of the tri-state driver is between 1 and 50, exemplary between 1 and 20, and the ratio of the physical channel width to the physical channel length of the PMOS transistor of the tri-state driver is between 1 and 100, exemplary between 1 and 40. If the inter-chip buffer 703*a* or 704*a* is a multi-stage tri-state buffer, the size of the inter-chip buffer 703*a* or 704*a* can be characterized by a ratio of a physical channel width to a physical channel length of an NMOS transistor or PMOS transistor in the last stage tri-state driver of the multi-stage tri-state buffer, and the last stage tri-state driver is connected to the metal pad 600*c* of the chip 313 through the metal interconnect line 640*f* or 640*h*, and the ratio of the physical channel width to the physical channel length of the NMOS transistor of the last stage tri-state driver is between 1 and 50, exemplary between 1 and 20, and the ratio of the physical channel width to the physical channel length of the PMOS transistor of the last stage tri-state driver is between 1 and 100, exemplary between 1 and 40. The definition of the physical channel width and physical channel length of the NMOS transistor or PMOS transistor can be referred to as the illustration in FIGS. 21 and 22.

The size of the off-chip buffer 42*a* or 42*b* shown in FIG. 39H or 39J can be characterized by a ratio of a physical channel width to a physical channel length of an NMOS transistor or PMOS transistor of a tri-state driver of the off-chip tri-state buffer, and the tri-state driver is connected to the metal pad 600*t* or 600*s* of the cache memory chip 311 through the metal interconnect line 640*j* or 640*m*, and the ratio of the physical channel width to the physical channel length of the NMOS transistor of the tri-state driver is larger than 30, such as between 30 and 20000, exemplary larger than 50, such as between 50 and 300, and the ratio of the physical channel width to the physical channel length of the PMOS transistor of the tri-state driver is larger than 60 such as between 60 and 40000, exemplary larger than 100, such as between 100 and 600. If the off-chip buffer 42*a* or 42*b* is a multi-stage tri-state buffer, the size of the off-chip buffer 42*a* or 42*b* can be characterized by a ratio of a physical channel width to a physical channel length of an NMOS transistor or PMOS transistor in the last stage tri-state driver of the multi-stage tri-state buffer, and the last stage tri-state driver is connected to the metal pad 600*t* or 600*s* of the cache memory chip 311 through the metal interconnect line 640*j* or 640*m*, and the ratio of the physical channel width to the physical channel length of the NMOS transistor of the last stage tri-state driver is larger than 30, such as between 30 and 20000, exemplary larger than 50, such as between 50 and 300, and the ratio of the physical channel width to the physical channel length of the PMOS transistor of the last stage tri-state driver is larger than 60, such as between 60 and 40000, exemplary larger than 100, such as between 100 and 600. The definition of the physical channel width and physical channel length of the NMOS transistor or PMOS transistor can be referred to as the illustration in FIGS. 21 and 22. The ratio of the physical channel width to the physical channel length of the NMOS transistor of the tri-state driver of the off-chip tri-state buffer 42*a* or 42*b* shown in FIG. 39H or 39J may be larger than the ratio of the physical channel width to the physical channel length of the NMOS transistor of the tri-state driver of the inter-chip tri-state buffer 701*a* or 702*a* shown in FIG. 39H or 39J by more than 3 times, 10 times, 25 times or 50 times, such as between 3 and 100 times. The ratio of the physical channel width to the physical channel length of the PMOS transistor of the tri-state driver of the off-chip tri-state buffer 42*a* or 42*b* shown in FIG. 39H or 39J may be larger than the ratio of the physical channel width to the physical channel length of the PMOS transistor of the tri-state driver of the inter-chip tri-state buffer 701*a* or 702*a* shown in FIG. 39H or 39J by more than 3 times, 10 times, 25 times or 50 times, such as between 3 and 100 times.

The size of the off-chip buffer 42*c* or 42*d* shown in FIG. 39H or 39J can be characterized by a ratio of a physical channel width to a physical channel length of an NMOS transistor or PMOS transistor of a tri-state driver of the off-chip tri-state buffer, and the tri-state driver is connected to the metal pad 600*w* or 600*x* of the chip 313 through the metal interconnect line 640*p* or 640*r*, and the ratio of the physical channel width to the physical channel length of the NMOS transistor of the tri-state driver is larger than 30, such as between 30 and 20000, exemplary larger than 50, such as between 50 and 300, and the ratio of the physical channel width to the physical channel length of the PMOS transistor of the tri-state driver is larger than 60, such as between 60 and 40000, exemplary larger than 100, such as between 100 and 600. If the off-chip buffer 42*c* or 42*d* is a multi-stage tri-state buffer, the size of the off-chip buffer 42*c* or 42*d* can be characterized by a ratio of a physical channel width to a physical channel length of an NMOS transistor or PMOS transistor in the last stage tri-state driver of the multi-stage tri-state buffer, and the last stage tri-state driver is connected to the metal pad 600*w* or 600*x* of the chip 313 through the metal interconnect line 640*p* or 640*r*, and the ratio of the physical channel width to the physical channel length of the NMOS transistor of the last stage tri-state driver is larger than 30, such as between 30 and 20000, exemplary larger than 50, such as between 50 and 300, and the ratio of the physical channel width to the physical channel length of the PMOS transistor of the last stage tri-state driver is larger than 60, such as between 60 and 40000, exemplary larger than 100, such as between 100 and 600. The definition of the physical channel width and physical channel length of the NMOS transistor or PMOS transistor can be referred to as the illustration in FIGS. 21 and 22. The ratio of the physical channel width to the physical channel length of the NMOS transistor of the tri-state driver of the off-chip tri-state buffer 42*c* or 42*d* shown in FIG. 39H or 39J may be larger than the ratio of the physical channel width to the physical channel length of the NMOS transistor of the tri-state driver of the inter-chip tri-state buffer 703*a* or 704*a* shown in FIG. 39H or 39J by more than 3 times, 10 times, 25 times or 50 times, such as between 3 and 100 times. The ratio of the physical channel width to the physical channel length of the PMOS transistor of the tri-state driver of the off-chip tri-state buffer 42*c* or 42*d* shown in FIG. 39H or 39J may be larger than the ratio of the physical channel width to the physical channel length of the PMOS transistor of the tri-state driver of the inter-chip tri-state buffer 703*a* or 704*a* shown in FIG. 39H or 39J by more than 3 times, 10 times, 25 times or 50 times, such as between 3 and 100 times.

FIGS. 42A-42O are cross-sectional views showing a process for forming the chip 313 shown in FIG. 37A, 37D, 38A, 38D, 39A, 39H, 39I or 39J. Referring to FIG. 42A, a semiconductor wafer 10*a*, such as silicon wafer, is provided with a silicon substrate 1, the previously described off-chip circuit 40*c* including the previously described off-chip buffer 42*c* and the previously described off-chip ESD circuit 43*c* in and/or over the silicon substrate 1, the previously described off-chip circuit 40*d* including the previously described off-chip buffer 42*d* and the previously described off-chip ESD circuit 43*d* in and/or over the silicon substrate 1, the previously described inter-chip circuits 20*e* and 20*f* in and/or over the silicon substrate 1, the previously described internal circuits 20*g* and 20*h* in and/or over the silicon substrate 1, multiple dielectric layers 30 over the silicon substrate 1, multiple fine-line metal layers 60 over the silicon substrate 1, multiple via plugs 60' in vias 30' of the dielectric layers 30, and an insulating layer 5, that is, passivation layer, over the fine-line metal layers 60, over the dielectric layers 30, over the off-chip circuits 40*c* and 40*d*, over the inter-chip circuits 20*e* and 20*f*, and over the internal circuits 20*g* and 20*h*.

The semiconductor wafer 10*a* has the previously described metal pads 600*c*, 600*w* and 600*x*. The metal pads 600*c*, 600*w* and 600*x* are provided by the topmost fine-line metal layer 60 under the passivation layer 5, and include aluminum, aluminum-copper-alloy or electroplated copper. Each of the metal pads 600*c*, 600*w* and 600*x* may have a thickness between 0.5 and 3 micrometers or between 20 nanometers and 1.5 micrometers, and a width smaller than 1 micrometer, such as between 0.2 and 0.95 micrometers. Multiple openings 50 in the passivation layer 5 are over the metal pads 600*c*, 600*w* and 600*x* and expose them, and the metal pads 600*c*, 600*w* and 600*x* are at bottoms of the openings 50. Each of the openings 50 may have a width between 10 and 100 micrometers, and preferably between 20 and 60 micrometers.

The silicon substrate 1 has a thickness t1 between 600 and 1000 micrometers, between 50 micrometers and 1 millimeter or between 75 and 250 micrometers. Alternatively, the silicon substrate 1 can be replaced with other semiconductor substrate, such as silicon-germanium (SiGe) substrate or gallium arsenide (GaAs) substrate. The dielectric layers 30 are interposed respectively between the neighboring fine-line metal layers 60, and the neighboring fine-line metal layers 60 are interconnected through the via plugs 60' inside the dielectric layer 30. The dielectric layers 30 can be formed by a suitable process or processes, e.g., by a CVD (Chemical Vapor Deposition) process, a PECVD (Plasma-Enhanced CVD) process, a High-Density-Plasma (HDP) CVD process or a spin-on coating method. The material of the dielectric layers 30 may include silicon oxide, silicon nitride, silicon oxynitride, silicon oxycarbide (SiOC) or silicon carbon nitride (SiCN). Each of the dielectric layers 30 can be composed of one or more inorganic layers, and may have a thickness between 0.1 and 1.5 micrometers. For example, each of the dielectric layers 30 may include a layer of silicon oxynitride or silicon carbon nitride and a layer of silicon oxide or silicon oxycarbide on the layer of silicon oxynitride or silicon carbon nitride. Alternatively, each of the dielectric layers 30 may include an oxide layer, such as silicon-oxide layer, having a thickness between 0.02 and 1.2 micrometers, and a nitride layer, such as silicon-nitride layer, having a thickness between 0.02 and 1.2 micrometers on the oxide layer.

Each of the fine-line metal layers 60 has a thickness between 20 nanometers and 1.5 micrometers, and preferably between 100 nanometers and 1 micrometer. Each of the fine-line metal layers 60 may include a metal trace having a width smaller than 1 micrometer, such as between 0.05 and 0.95 micrometers. The material of the fine-line metal layers 60 may include electroplated copper, aluminum, aluminum-copper alloy or a composite of the previously described materials.

For example, each of the fine-line metal layers 60 may include an electroplated copper layer having a thickness between 20 nanometers and 1.5 micrometers, and preferably between 100 nanometers and 1 micrometer, in one of the dielectric layers 30, an adhesion/barrier layer, such as titanium-nitride layer, titanium-tungsten-alloy layer, tantalum-nitride layer, titanium layer or tantalum layer, at a bottom surface and sidewalls of the electroplated copper layer, and a seed layer of copper between the electroplated copper layer and the adhesion/barrier layer. The seed layer of copper is at the bottom surface and sidewalls of the electroplated copper layer and contacts with the bottom surface and sidewalls of the electroplated copper layer. The electroplated copper layer, the seed layer of copper and the adhesion/barrier layer can be formed by a suitable process or processes, e.g., by a damascene or double-damascene process including an electroplating process, a sputtering process and a chemical mechanical polishing (CMP) process.

Alternatively, each of the fine-line metal layers 60 may include an adhesion/barrier layer on a top surface of one of the dielectric layers 30, a sputtered aluminum or aluminum-copper-alloy layer having a thickness between 20 nanometers and 1.5 micrometers, and preferably between 100 nanometers and 1 micrometer, on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a suitable process or processes, e.g., by a process including a sputtering process and an etching process. Sidewalls of the sputtered aluminum or aluminum-copper-alloy layer are not covered by the adhesion/barrier layer and the anti-reflection layer. The adhesion/barrier layer and the anti-reflection layer can be a titanium layer, a titanium-nitride layer or a titanium-tungsten layer.

The semiconductor wafer 10*a* has the previously described metal interconnect lines 640*e*, 640*f*, 640*g*, 640*h*, 640*n*, 640*p*, 640*q* and 640*r* each including a portion provided by the fine-line metal layers 60 and the via plugs 60', but the metal interconnect lines 640*e* and 640*g* are not shown in FIGS. 42A-42O. The semiconductor wafer 10*a* also includes the previously described testing interface circuits 333*c* and 333*d* (not shown in FIGS. 42A-42O). The metal interconnect line 640*e* can connect the inter-chip circuit 20*e* and the internal circuit 20*g*, and the metal interconnect line 640*g* can connect the inter-chip circuit 20*f* and the internal circuit 20*h*. The inter-chip circuit 20*e* can be connected to one of the metal pads 600*c* and to the testing interface circuit 333*c* through the metal interconnect line 640*f*. The inter-chip circuit 20*f* can be connected to another one of the metal pads 600*c* and to the testing interface circuit 333*d* through the metal interconnect line 640*h*. The metal interconnect line 640*n* can connect the off-chip buffer 42*c* and the testing interface circuit 333*c*, and the metal interconnect line 640*q* can connect the off-chip buffer 42*d* and the testing interface circuit 333*d*. The off-chip buffer 42*c* can be connected to the off-chip ESD circuit 43*c* and to the testing metal pad 600*w* through the metal interconnect line 640*p*. The off-chip buffer 42*d* can be connected to the off-chip ESD circuit 43*d* and to the testing metal pad 600*x* through the metal interconnect line 640*r*.

The passivation layer 5 can protect the inter-chip circuits 20*e* and 20*f*, the internal circuits 20*g* and 20*h*, the off-chip circuits 40*c* and 40*d* and the fine-line metal layers 60 from being damaged by moisture and foreign ion contamination. In other words, mobile ions (such as sodium ion), transition metals (such as gold, silver and copper) and impurities can be prevented from penetrating through the passivation layer 5 to the inter-chip circuits 20*e* and 20*f*, the internal circuits 20*g* and 20*h*, the off-chip circuits 40*c* and 40*d* and the fine-line metal layers 60.

The passivation layer 5 can be formed by a suitable process or processes, e.g., by a chemical vapor deposition (CVD) method, and typically has a thickness larger than 0.2 micrometers, such as between 0.3 and 1.5 micrometers. The passivation layer 5 is commonly made of silicon oxide (such as $SiO_2$), silicon nitride (such as $Si_3N_4$), silicon oxynitride (such as SiON), silicon oxycarbide (SiOC), PSG (phosphosilicate glass), silicon carbon nitride (such as SiCN) or a composite of the previously described materials.

The passivation layer 5 can be composed of one or more inorganic layers. For example, the passivation layer 5 can be a composite layer of an oxide layer, such as silicon oxide or silicon oxycarbide (SiOC), having a thickness between 0.2 and 1.2 micrometers and a nitride layer, such as silicon nitride, silicon oxynitride or silicon carbon nitride (SiCN), having a thickness between 0.2 and 1.2 micrometers on the oxide layer. Alternatively, the passivation layer 5 can be a single layer of silicon nitride, silicon oxynitride or silicon carbon nitride (SiCN) having a thickness between 0.2 and 1.2 micrometers. In a exemplary case, the passivation layer 5 includes a topmost inorganic layer of the semiconductor wafer 10*a*, and the topmost inorganic layer of the semiconductor wafer 10*a* can be a silicon nitride layer having a thickness larger than 0.2 micrometers, such as between 0.2 and 1.5 micrometers.

Referring to FIG. 42B, after providing the semiconductor wafer 10*a* shown in FIG. 42A, a flux or insulating material 33 can be formed in the openings 50 and on the metal pads 600*c*, 600*w* and 600*x* exposed by the openings 50. Next, referring to FIG. 42C, with the step being illustrated with a reverse figure for simple explanation, the silicon substrate 1 of the semiconductor wafer 10*a* is thinned to a thickness t2 between 1 and 10 micrometers, between 3 and 50 micrometers or between 10 and 150 micrometers by mechanically grinding or chemically mechanically polishing (CMP) a backside 1*a* of the silicon substrate 1.

Next, referring to FIG. 42D, with the steps being illustrated with a reverse figure for simple explanation, multiple through-silicon vias 11 (only two of them are shown in FIGS. 42D-42N) are formed in the thinned silicon substrate 1 and in at least one dielectric layer 30, exposing regions 60*a* of the fine-line metal layers 60, and an insulating layer 3 is formed on the backside 1*a* of the thinned silicon substrate 1 and on sidewalls of the through-silicon vias 11. The through-silicon vias 11 penetrate completely through the thinned silicon substrate 1 and the dielectric layer(s) 30. Each of the through-silicon vias 11 may have a diameter or width W1 between 5 and 100 micrometers or between 3 and 50 micrometers, and a depth between 1 and 10 micrometers, between 3 and 50 micrometers or between 10 and 150 micrometers. The insulating layer 3, for example, may include a nitride layer, such as silicon-nitride layer, a polymer layer, such as polyimide layer, benzocyclobutene layer or polybenzoxazole layer, a silicon-oxynitride layer, a silicon-carbon-nitride (SiCN) layer, a silicon-oxycarbide (SiOC) layer or a silicon-oxide layer. The process of forming the through-silicon vias 11 and the insulating layer 3 as shown in FIG. 42D can be referred to as the process of forming the through-silicon vias 11*a*, 11*b*, 11*c*, 11*d* and 11*e* and the insulating layer 3 as illustrated in FIGS. 24D-24H or FIGS. 241-24N. The specification of the insulating layer 3 shown in FIG. 42D can be referred to as the specification of the insulating layer 3 as illustrated in FIGS. 24D-24H or FIGS. 24I-24N.

Next, referring to FIG. 42E, with the step being illustrated with a reverse figure for simple explanation, an interconnecting structure 88 provided by two metal layers 4 and 9 can be formed in the through-silicon vias 11, on the insulating layer 3, on the regions 60*a* of the fine-line metal layers 60 and at the backside 1*a* of the thinned silicon substrate 1, and the metal layer 4 is composed of an adhesion/barrier layer 4*a* on the insulating layer 3, in the through-silicon vias 11 and on the regions 60*a* of the fine-line metal layers 60 exposed by the through-silicon vias 11, and a seed layer 4*b* on the adhesion/barrier layer 4*a*. Sidewalls of the metal layer 9 are not covered by the metal layer 4. The process of forming the interconnecting structure 88 as shown in FIG. 42E can be referred to as the process of forming the interconnecting structures 88 as illustrated in FIGS. 25A-25F. The specification of the metal layer 4 including the adhesion/barrier layer 4*a* and the seed layer 4*b* as shown in FIG. 42E can be referred to as the specification of the metal layer 4 including the adhesion/barrier layer 4*a* and the seed layer 4*b* as illustrated in FIG. 25A. The specification of the metal layer 9 shown in FIG. 42E can be referred to as the specification of the metal layer 9 as illustrated in FIG. 25D.

Next, referring to FIG. 42F, with the step being illustrated with a reverse figure for simple explanation, a polymer layer 14 is formed on the metal layer 9, on the insulating layer 3 and at sidewalls of the interconnecting structure 88 using a process including a spin-on coating process, a lamination process, a screen-printing process or a spraying process and including a curing process. Two openings 14*a* in the polymer layer 14 are over two regions of the metal layer 9 and expose them. The polymer layer 14 has a thickness larger than 2 micrometers, such as between 3 and 25 micrometers, and preferably between 5 and 15 micrometers, larger than that of each of the dielectric layers 30, and larger than that of the passivation layer 5. The material of the polymer layer 14 may include benzocyclobutane (BCB), polyimide (PI), polybenzoxazole (PBO) or epoxy resin.

Next, referring to FIG. 42G, with the steps being illustrated with a reverse figure for simple explanation, an adhesion/barrier layer 16*z* having a thickness smaller than 1 micrometer, such as between 1 and 300 nanometers, and preferably between 1.5 and 100 nanometers, can be formed on the polymer layer 14 and on the regions of the metal layer 9 exposed by the openings 14*a* by using a physical vapor deposition (PVD) process, such as sputtering process or evaporation process, and then a seed layer 18*z* having a thickness smaller than 1 micrometer, such as between 20 and 500 nanometers, and preferably between 35 and 300 nanometers, can be formed on the adhesion/barrier layer 16*z* by using a physical vapor deposition (PVD) process, such as sputtering process or evaporation process. The material of the adhesion/barrier layer 16*z* may include titanium, a titanium-tungsten alloy, titanium nitride, chromium, tantalum, tantalum nitride or a composite of the previously described materials, and the material of the seed layer 18*z* may include copper, nickel, aluminum, gold, silver, platinum or palladium.

For example, when the adhesion/barrier layer 16*z* is formed by a suitable process or processes, e.g., by sputtering a titanium-containing layer, such as a single layer of titanium-tungsten alloy, titanium or titanium nitride, having a thickness smaller than 1 micrometer, such as between 1 and 300 nanometers, and preferably between 1.5 and 100 nanometers, on the polymer layer 14 and on the regions of the metal layer 9 exposed by the openings 14*a*, the seed layer 18*z* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the titanium-containing layer.

Alternatively, when the adhesion/barrier layer 16*z* is formed by a suitable process or processes, e.g., by sputtering a tantalum-containing layer, such as a single layer of tantalum or tantalum nitride, having a thickness smaller than 1 micrometer, such as between 1 and 300 nanometers, and preferably between 1.5 and 100 nanometers, on the polymer layer 14 and on the regions of the metal layer 9 exposed by the openings 14*a*, the seed layer 18*z* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the tantalum-containing layer.

After forming the seed layer 18*z*, a photoresist layer 31, such as positive-type photoresist layer or negative-type photoresist layer, having a thickness larger than 1 micrometer, such as between 1 and 60 micrometers, is formed on the seed layer 18*z* by a spin-on coating process, a lamination process, a screen-printing process or a spraying process. Next, the photoresist layer 31 is patterned with the processes of exposure and development to form multiple openings 31*a* in the photoresist layer 31 exposing the seed layer 18*z*. A 1× stepper or 1× contact aligner can be used to expose the photoresist layer 31 during the process of exposure.

Next, a metal layer 27*y* is formed on the seed layer 18*z* of any previously described material exposed by the openings 31*a* and in the openings 31*a* by using an electroplating process, and then a solder layer 27*z* is formed on the metal layer 27*y* in the openings 31*a* by using an electroplating process. Each of the metal layer 27*y* and the solder layer 27*z* has a thickness larger than 1 micrometer, such as between 1 and 30 micrometers, and preferably between 2 and 20 micrometers or between 5 and 25 micrometers, larger than that of the seed layer 18*z*, and larger than that of the adhesion/barrier layer 16*z*. The material of the metal layer 27*y* includes copper and/or nickel, and the material of the solder layer 27*z* includes bismuth, indium, antimony, tin, a tin-lead alloy, a tin-silver alloy or a tin-silver-copper alloy. The solder layer 27*z* can be used to be bonded with the cache memory chip 321.

For example, the metal layer 27*y* can be formed by a suitable process or processes, e.g., by electroplating a single metal layer of copper with a thickness larger than 1 micrometer, such as between 1 and 30 micrometers, and preferably between 2 and 20 micrometers or between 5 and 25 micrometers, on the seed layer 18*z*, preferably the previously described copper layer 18*z*, exposed by the openings 31*a*, and the solder layer 27*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of copper by using an electroplating process.

Alternatively, the metal layer 27*y* can be formed by a suitable process or processes, e.g., by electroplating a single metal layer of nickel with a thickness larger than 1 micrometer, such as between 1 and 30 micrometers, and preferably between 2 and 20 micrometers or between 5 and 25 micrometers, on the seed layer 18*z*, preferably the previously described copper or nickel layer 18*z*, exposed by the openings 31*a*, and the solder layer 27*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of nickel by using an electroplating process.

Alternatively, the metal layer 27*y* can be formed by a suitable process or processes, e.g., by electroplating a copper layer with a thickness larger than 1 micrometer, such as between 1 and 30 micrometers, and preferably between 2 and 20 micrometers or between 5 and 25 micrometers, on the seed layer 18*z*, preferably the previously described copper layer 18*z*, exposed by the openings 31*a*, and then electroplating a nickel layer with a thickness larger than 0.2 micrometers, such as between 0.3 and 6 micrometers, and preferably between 1 and 3 micrometers, on the electroplated copper layer. The solder layer 27*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the electroplated nickel layer of the metal layer 27*y* by using an electroplating process.

Next, referring to FIG. 42H, with the steps being illustrated with a reverse figure for simple explanation, the photoresist layer 31 is removed using an inorganic solution or using an organic solution with amide. Some residuals from the photoresist layer 31 could remain on the seed layer 18*z* not under the metal layer 27*y*. Thereafter, the residuals can be removed from the seed layer 18*z* with a plasma, such as an $O_2$ plasma or a plasma containing fluorine of below 200 PPM and oxygen. Next, the seed layer 18*z* not under the metal layer 27*y* is removed, and then the adhesion/barrier layer 16*z* not under the metal layer 27*y* is removed.

For example, the seed layer 18*z* not under the metal layer 27*y* and the adhesion/barrier layer 16*z* not under the metal layer 27*y* can be removed by a dry etching process, such as Ar sputtering etching process, reactive ion etching (RIE) process or ion milling process.

Alternatively, the seed layer 18*z* not under the metal layer 27*y* and the adhesion/barrier layer 16*z* not under the metal layer 27*y* can be removed by a wet etching process. When the seed layer 18*z* is a copper layer, it can be etched with a solution containing $NH_4OH$ or with a solution containing $H_2SO_4$. When the adhesion/barrier layer 16*z* is a titanium-tungsten-alloy layer, it can be etched with a solution containing hydrogen peroxide or with a solution containing $NH_4OH$ and hydrogen peroxide. When the adhesion/barrier layer 16*z* is a titanium layer, it can be etched with a solution containing hydrogen fluoride or with a solution containing $NH_4OH$ and hydrogen peroxide.

In case the seed layer 18*z* not under the metal layer 27*y* is removed using a wet etching process, an undercut is formed under the metal layer 27*y* overhanging the seed layer 18*z*. The seed layer 18*z* under the metal layer 27*y* has a first sidewall recessed from a second sidewall of the metal layer 27*y*, and a distance between the first sidewall and the second sidewall is between 0.1 and 2 micrometers.

Accordingly, as shown in FIG. 42H, a bottom scheme 103 at the backside 1*a* of the thinned silicon substrate 1 is formed with the insulating layer 3, the polymer layer 14, the interconnecting structure 88 provided by the metal layers 4 and 9, and multiple microbumps 317*c*, that is, metal bumps, provided by the adhesion/barrier layer 16*z*, the seed layer 18*z*, the metal layer 27*y* and the solder layer 27*z*. Each of the microbumps 317*c* has a height larger than 2 micrometers, such as between 2 and 70 micrometers, and preferably between 5 and 50 micrometers, and a width or diameter larger than 3 micrometers, such as between 3 and 30 micrometers. A pitch P2 between neighboring two microbumps 317*c* can be smaller than 60 micrometers, and preferably smaller than 40 micrometers, such as between 5 and 40 micrometers, and preferably between 10 and 30 micrometers. One of the microbumps 317*c* can be connected to another one of the microbumps 317*c* through the interconnecting structure 88. The microbumps 317*c* are used to be bonded with the cache memory chip 321. The inter-chip circuit 20*e* can be connected to the interconnecting structure 88 through the metal interconnect line 640*f*, to the microbumps 317*c* through the metal interconnect line 640*f* and the interconnecting structure 88, and to the inter-chip circuit 20*f* through the metal interconnect line 640*f*, the interconnecting structure 88 and the metal interconnect line 640*h*. The inter-chip circuit 20*f* can be connected to the interconnecting structure 88 through the metal interconnect line 640*h*, and to the microbumps 317*c* through the metal interconnect line 640*h* and the interconnecting structure 88.

Alternatively, the interconnecting structure 88 can be used for a power interconnect, such as power plane, power bus, power trace or power line, to connect with a power node of the inter-chip circuit 20*e*, a power node of the internal circuit 20*g*, a power node of the off-chip buffer 42*c*, a node of the off-chip ESD circuit 43*c*, a power node of the testing interface circuit 333*c*, a power node of the inter-chip circuit 20*f*, a power node of the internal circuit 20*h*, a power node of the off-chip buffer 42*d*, a node of the off-chip ESD circuit 43*d*, and a power node of the testing interface circuit 333*d* through the through-silicon vias 11. The power nodes of the inter-chip circuit 20*e*, the internal circuit 20*g*, the off-chip buffer 42*c* and the testing interface circuit 333*c* can be connected to the power nodes of the inter-chip circuit 20*f*, the internal circuit 20*h*, the off-chip buffer 42*d* and the testing interface circuit 333*d* through the interconnecting structure 88. The node of the off-chip ESD circuit 43*c* can be connected to the node of the off-chip ESD circuit 43*d* through the interconnecting structure 88.

Alternatively, the interconnecting structure 88 can be used for a ground interconnect, such as ground plane, ground bus, ground trace or ground line, to connect with a ground node of the inter-chip circuit 20*e*, a ground node of the internal circuit 20*g*, a ground node of the off-chip buffer 42*c*, a node of the off-chip ESD circuit 43*c*, a ground node of the testing interface circuit 333*c*, a ground node of the inter-chip circuit 20*f*, a ground node of the internal circuit 20*h*, a ground node of the off-chip buffer 42*d*, a node of the off-chip ESD circuit 43*d*, and a ground node of the testing interface circuit 333*d* through the through-silicon vias 11. The ground nodes of the inter-chip circuit 20*e*, the internal circuit 20*g*, the off-chip buffer 42*c* and the testing interface circuit 333*c* can be connected to the ground nodes of the inter-chip circuit 20*f*, the internal circuit 20*h*, the off-chip buffer 42*d* and the testing interface circuit 333*d* through the interconnecting structure 88. The node of the off-chip ESD circuit 43*c* can be connected to the node of the off-chip ESD circuit 43*d* through the interconnecting structure 88.

Referring to FIG. 42I, after forming the microbumps 317*c* shown in FIG. 42H, the flux or insulating material 33 can be removed to expose the metal pads 600*c*, 600*w* and 600*x* exposed by the openings 50 in the passivation layer 5. Next, referring to FIG. 42J, a polymer layer 95 can be optionally formed on the passivation layer 5 of the semiconductor wafer 10*a*. Multiple openings 950 in the polymer layer 95 are over the metal pads 600*c*, 600*w* and 600*x* exposed by the openings 50 and expose them. The polymer layer 95 may have a thickness larger than 2 micrometers, such as between 3 and 50 micrometers, and preferably between 2 and 30 micrometers, larger than that of the passivation layer 5, and larger than that of each of the dielectric layers 30. The material of the polymer layer 95 may include benzocyclobutane (BCB), polyimide (PI), polybenzoxazole (PBO) or epoxy resin.

Next, referring to FIG. 42K, an adhesion/barrier layer 32*y* having a thickness smaller than 1 micrometer, such as between 1 and 300 nanometers, and preferably between 1.5 and 100 nanometers, can be formed on the polymer layer 95 and on the metal pads 600*c*, 600*w* and 600*x* exposed by the openings 950 by using a physical vapor deposition (PVD) process, such as sputtering process or evaporation process, and then a seed layer 32*z* having a thickness smaller than 1 micrometer, such as between 20 and 500 nanometers, and preferably between 35 and 300 nanometers, can be formed on the adhesion/barrier layer 32*y* by using a physical vapor deposition (PVD) process, such as sputtering process or evaporation process. The material of the adhesion/barrier layer 32*y* may include titanium, a titanium-tungsten alloy, titanium nitride, chromium, tantalum, tantalum nitride or a composite of the previously described materials, and the material of the seed layer 32*z* may include copper, nickel, aluminum, gold, silver, platinum or palladium.

When the adhesion/barrier layer 32*y* is formed by a suitable process or processes, e.g., by sputtering a titanium-containing layer, such as a single layer of titanium-tungsten alloy, titanium or titanium nitride, having a thickness smaller than 1 micrometer, such as between 1 and 300 nanometers, and preferably between 1.5 and 100 nanometers, on the polymer layer 95 and on the metal pads 600*c*, 600*w* and 600*x* exposed by the openings 950, the seed layer 32*z* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the titanium-containing layer.

Alternatively, when the adhesion/barrier layer 32*y* is formed by a suitable process or processes, e.g., by sputtering a tantalum-containing layer, such as a single layer of tantalum or tantalum nitride, having a thickness smaller than 1 micrometer, such as between 1 and 300 nanometers, and preferably between 1.5 and 100 nanometers, on the polymer layer 95 and on the metal pads 600*c*, 600*w* and 600*x* exposed by the openings 950, the seed layer 32*z* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the tantalum-containing layer.

After forming the seed layer 32*z*, a photoresist layer 71, such as positive-type photoresist layer or negative-type photoresist layer, having a thickness larger than 1 micrometer, such as between 1 and 60 micrometers, is formed on the seed layer 32*z* by a spin-on coating process, a lamination process, a screen-printing process or a spraying process. Next, the photoresist layer 71 is patterned with the processes of exposure and development to form multiple openings 710 in the photoresist layer 71 exposing the seed layer 32*z*, and the openings 710 are over the metal pads 600*c*, but over the metal pads 600*w* and 600*x* for testing is no opening in the photoresist layer 71. A 1× stepper or 1× contact aligner can be used to expose the photoresist layer 71 during the process of exposure.

Next, a metal layer 34*y* is formed on the seed layer 32*z* of any previously described material exposed by the openings 710 and in the openings 710 by using an electroplating process, and then a solder layer 34*z* is formed on the metal layer 34*y* in the openings 710 by using an electroplating process. Both of the metal layer 34*y* and the solder layer 34*z* have a thickness larger than 1 micrometer, such as between 1 and 30 micrometers, and preferably between 2 and 20 micrometers or between 5 and 25 micrometers, larger than that of the seed layer 32*z* and larger than that of the adhesion/barrier layer 32*y*. The material of the metal layer 34*y* includes copper and/or nickel, and the material of the solder layer 34*z* includes bismuth, indium, antimony, tin, a tin-lead alloy, a tin-silver alloy or a tin-silver-copper alloy. The solder layer 34*z* can be used to be bonded with the cache memory chip 311.

For example, the metal layer 34*y* can be formed by a suitable process or processes, e.g., by electroplating a single metal layer of copper with a thickness larger than 1 micrometer, such as between 1 and 30 micrometers, and preferably between 2 and 20 micrometers or between 5 and 25 micrometers, on the seed layer 32*z*, preferably the previously described copper layer 32*z*, exposed by the openings 710, and the solder layer 34*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of copper by using an electroplating process.

Alternatively, the metal layer 34*y* can be formed by a suitable process or processes, e.g., by electroplating a single metal layer of nickel with a thickness larger than 1 micrometer, such as between 1 and 30 micrometers, and preferably between 2 and 20 micrometers or between 5 and 25 micrometers, on the seed layer 32*z*, preferably the previously described copper or nickel layer 32*z*, exposed by the openings 710, and the solder layer 34*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of nickel by using an electroplating process.

Alternatively, the metal layer 34*y* can be formed by a suitable process or processes, e.g., by electroplating a copper layer with a thickness larger than 1 micrometer, such as between 1 and 30 micrometers, and preferably between 2 and 20 micrometers or between 5 and 25 micrometers, on the seed layer 32*z*, preferably the previously described copper layer 32*z*, exposed by the openings 710, and then electroplating a nickel layer with a thickness larger than 0.2 micrometers, such as between 0.3 and 6 micrometers, and preferably between 1 and 3 micrometers, on the electroplated copper layer. The solder layer 34*z* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the electroplated nickel layer of the metal layer 34*y* by using an electroplating process.

Next, referring to FIG. 42L, the photoresist layer 71 is removed using an inorganic solution or using an organic solution with amide. Some residuals from the photoresist layer 71 could remain on the seed layer 32*z* not under the metal layer 34*y*. Thereafter, the residuals can be removed from the seed layer 32*z* with a plasma, such as an $O_2$ plasma or a plasma containing fluorine of below 200 PPM and oxygen. Next, the seed layer 32*z* not under the metal layer 34*y* is removed, and then the adhesion/barrier layer 32*y* not under the metal layer 34*y* is removed.

For example, the seed layer 32*z* not under the metal layer 34*y* and the adhesion/barrier layer 32*y* not under the metal layer 34*y* can be removed by a dry etching process, such as Ar sputtering etching process, reactive ion etching (RIE) process or ion milling process.

Alternatively, the seed layer 32*z* not under the metal layer 34*y* and the adhesion/barrier layer 32*y* not under the metal layer 34*y* can be removed by a wet etching process. When the seed layer 32*z* is a copper layer, it can be etched with a solution containing $NH_4OH$ or with a solution containing $H_2SO_4$. When the adhesion/barrier layer 32*y* is a titanium-tungsten-alloy layer, it can be etched with a solution containing hydrogen peroxide or with a solution containing $NH_4OH$ and hydrogen peroxide. When the adhesion/barrier layer 32*y* is a titanium layer, it can be etched with a solution containing hydrogen fluoride or with a solution containing $NH_4OH$ and hydrogen peroxide.

In case the seed layer 32*z* not under the metal layer 34*y* is removed using a wet etching process, an undercut is formed under the metal layer 34*y* overhanging the seed layer 32*z*. The seed layer 32*z* under the metal layer 34*y* has a first sidewall recessed from a second sidewall of the metal layer 34*y*, and a distance between the first sidewall and the second sidewall is between 0.1 and 2 micrometers.

Accordingly, as shown in FIG. 42L, multiple microbumps 317*d*, that is, metal bumps, provided by the adhesion/barrier layer 32*y*, the seed layer 32*z*, the metal layer 34*y* and the solder layer 34*z* are formed on the metal pads 600*c* exposed by the openings 50 and 950, on the polymer layer 95, and at the active side of the thinned silicon substrate 1, and are used to be bonded with the cache memory chip 311. Each of the microbumps 317*d* has a height larger than 2 micrometers, such as between 2 and 70 micrometers, and preferably between 5 and 50 micrometers, and a width or diameter larger than 3 micrometers, such as between 3 and 30 micrometers. A pitch P3 between neighboring two microbumps 317*d* can be smaller than 60 micrometers, and preferably smaller than 40 micrometers, such as between 5 and 40 micrometers, and preferably between 10 and 30 micrometers. The metal interconnect lines 640*f* and 640*h* connect with the microbumps 317*d* through the openings 50 and 950. The inter-chip circuit 20*e* can be connected to one of the microbumps 317*d* through the metal interconnect line 640*f*, and the inter-chip circuit 20*f* can be connected to another one of the microbumps 317*d* through the metal interconnect line 640*h*. There are no microbumps formed on the metal pads 600*w* and 600*x* exposed by the openings 50 and 950, that is, the metal pads 600*w* and 600*x* are exposed by the openings 50 and 950 for testing.

Alternatively, referring to FIG. 42M, the polymer layer 95 can be omitted, that is, the adhesion/barrier layer 32*y* can be formed on the passivation layer 5 and on the metal pads 600*c* exposed by the openings 50 in the passivation layer 5. Accordingly, the microbumps 317*d* provided by the adhesion/barrier layer 32*y*, the seed layer 32*z*, the metal layer 34*y* and the solder layer 34*z* can be formed on the metal pads 600*c* exposed by the openings 50, on the passivation layer 5, and at the active side of the thinned silicon substrate 1.

Referring to FIG. 42N, after forming the microbumps 317*d*, the semiconductor wafer 10*a* can be cut into a plurality of the chip 313 shown in FIG. 37A, 37D, 38A, 38D, 39A, 39H, 39I or 39J by a die-sawing process. Alternatively, referring to FIG. 42O, the steps shown in FIGS. 42B-42I can be omitted, that is, after providing the semiconductor wafer 10*a* shown in FIG. 42A, the steps shown in FIGS. 42J-42L can be performed to form the polymer layer 95 and the microbumps 317*d*, and then the semiconductor wafer 10*a* can be cut into a plurality of the chip 313 shown in FIG. 37B, 37C, 38B, 38C, 39A, 39H, 39I or 39J by a die-sawing process.

An IC structure 6*c* of the chip 313 shown in FIG. 37A, 37B, 37C, 37D, 38A, 38B, 38C or 38D contains the inter-chip circuits 20*e* and 20*f*, the internal circuits 20*g* and 20*h*, the off-chip circuit 40*c* including the off-chip buffer 42*c* and the off-chip ESD circuit 43*c*, the off-chip circuit 40*d* including the off-chip buffer 42*d* and the off-chip ESD circuit 43*d*, the dielectric layers 30, the vias 30', the fine-line metal layers 60, the via plugs 60', the testing interface circuits 333*c* and 333*d*, and the metal interconnect lines 640*e*, 640*f*, 640*g*, 640*h*, 640*n*, 640*p*, 640*q* and 640*r* as illustrated in FIG. 42N or 42O.

FIGS. 43A-43E are cross-sectional views showing a process for forming a semiconductor wafer finalized to be cut into a plurality of the cache memory chip 321 shown in FIG. 37A, 37D, 38A or 38D. Referring to FIG. 43A, a semiconductor wafer 10*b*, such as silicon wafer, is provided with a silicon substrate 1, multiple inter-chip circuits 20*j* and 20*k* in and/or over the silicon substrate 1, multiple internal circuits 20*m* and 20*n* in and/or over the silicon substrate 1, an off-chip circuit 40*e* including an off-chip buffer 42*e* and an off-chip ESD circuit 43*e* in and/or over the silicon substrate 1, an off-chip circuit 40*f* including an off-chip buffer 42*f* and an off-chip ESD circuit 43*f* in and/or over the silicon substrate 1, multiple dielectric layers 30 over the silicon substrate 1, multiple fine-line metal layers 60 over the silicon substrate 1, multiple via plugs 60' in vias 30' of the dielectric layers 30, and an insulating layer 5, that is, passivation layer, over the fine-line metal layers 60, over the dielectric layers 30, over the inter-chip circuits 20*j* and 20*k*, over the off-chip circuits 40*e* and 40*f*, and over the internal circuits 20*m* and 20*n*.

The semiconductor wafer 10*b* has the previously described metal pads 600*d*, 600*y* and 600*z*. The metal pads 600*d*, 600*y* and 600*z* are provided by the topmost fine-line metal layer 60 under the passivation layer 5, and include aluminum, aluminum-copper-alloy or electroplated copper. Each of the metal pads 600*d*, 600*y* and 600*z* may have a thickness between 0.5 and 3 micrometers or between 20 nanometers and 1.5 micrometers, and a width smaller than 1 micrometer, such as between 0.2 and 0.95 micrometers. Multiple openings 50 in the passivation layer 5 are over the metal pads 600*d*, 600*y* and 600*z* and expose them, and the metal pads 600*d*, 600*y* and 600*z* are at bottoms of the openings 50. Each of the openings 50 may have a width between 10 and 100 micrometers, and preferably between 20 and 60 micrometers.

The semiconductor wafer 10*b* has multiple metal interconnect lines 640*s*, 640*t*, 640*u*, 640*v*, 640*w*, 640*x*, 640*y* and 640*z* each including a portion provided by the fine-line metal layers 60 and the via plugs 60'. The off-chip buffer 42*e* can be connected to the off-chip ESD circuit 43*e* and to the testing metal pad 600*z* through the metal interconnect line 640*s*. The off-chip buffer 42*f* can be connected to the off-chip ESD circuit 43*f* and to the testing metal pad 600*y* through the metal interconnect line 640*t*. The internal circuit 20*m* can be connected to the inter-chip circuit 20*j* through the metal interconnect line 640*y*, and the internal circuit 20*n* can be connected to the inter-chip circuit 20*k* through the metal interconnect line 640*z*.

The semiconductor wafer 10*b* also includes two testing interface circuits 333*e* and 333*f* (not shown). The testing interface circuit 333*e* can be connected to the off-chip buffer 42*e* through the metal interconnect line 640*u*, and the testing interface circuit 333*f* can be connected to the off-chip buffer 42*f* through the metal interconnect line 640*v*. The inter-chip circuit 20*j* can be connected to the testing interface circuit 333*e* and to one of the metal pads 600*d* through the metal interconnect line 640*w*. The inter-chip circuit 20*k* can be connected to the testing interface circuit 333*f* and to another one of the metal pads 600*d* through the metal interconnect line 640*x*.

The passivation layer 5 can protect the inter-chip circuits 20*j* and 20*k*, the internal circuits 20*m* and 20*n*, the off-chip circuits 40*e* and 40*f*, the testing interface circuits 333*e* and 333*f* and the fine-line metal layers 60 from being damaged by moisture and foreign ion contamination. In other words, mobile ions (such as sodium ion), transition metals (such as gold, silver and copper) and impurities can be prevented from penetrating through the passivation layer 5 to the inter-chip circuits 20*j* and 20*k*, the internal circuits 20*m* and 20*n*, the off-chip circuits 40*e* and 40*f*, the testing interface circuits 333*e* and 333*f* and the fine-line metal layers 60. The specification of the silicon substrate 1, the dielectric layers 30, the fine-line metal layers 60 and the passivation layer 5 as shown in FIG. 43A can be referred to as the specification of the silicon substrate 1, the dielectric layers 30, the fine-line metal layers 60 and the passivation layer 5 as illustrated in FIG. 42A, respectively.

Next, referring to FIG. 43B, a polymer layer 95 can be optionally formed on the passivation layer 5 of the semiconductor wafer 10*b*. Multiple openings 950 in the polymer layer 95 are over the metal pads 600*d*, 600*y* and 600*z* exposed by the openings 50 and expose them. The specification of the polymer layer 95 as shown in FIG. 43B can be referred to as the specification of the polymer layer 95 as illustrated in FIG. 42J.

Next, referring to FIG. 43C, an adhesion/barrier layer 32*w* having a thickness smaller than 1 micrometer, such as between 1 and 300 nanometers, and preferably between 1.5 and 100 nanometers, can be formed on the polymer layer 95 and on the metal pads 600*d*, 600*y* and 600*z* exposed by the openings 950 by using a physical vapor deposition (PVD) process, such as sputtering process or evaporation process, and then a seed layer 32*x* having a thickness smaller than 1 micrometer, such as between 20 and 500 nanometers, and preferably between 35 and 300 nanometers, can be formed on the adhesion/barrier layer 32_w_ by using a physical vapor deposition (PVD) process, such as sputtering process or evaporation process. The material of the adhesion/barrier layer 32_w_ may include titanium, a titanium-tungsten alloy, titanium nitride, chromium, tantalum, tantalum nitride or a composite of the previously described materials, and the material of the seed layer 32_x_ may include copper, nickel, aluminum, gold, silver, platinum or palladium.

When the adhesion/barrier layer 32_w_ is formed by a suitable process or processes, e.g., by sputtering a titanium-containing layer, such as a single layer of titanium-tungsten alloy, titanium or titanium nitride, having a thickness smaller than 1 micrometer, such as between 1 and 300 nanometers, and preferably between 1.5 and 100 nanometers, on the polymer layer 95 and on the metal pads 600_d_, 600_y_ and 600_z_ exposed by the openings 950, the seed layer 32_x_ can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the titanium-containing layer.

Alternatively, when the adhesion/barrier layer 32_w_ is formed by a suitable process or processes, e.g., by sputtering a tantalum-containing layer, such as a single layer of tantalum or tantalum nitride, having a thickness smaller than 1 micrometer, such as between 1 and 300 nanometers, and preferably between 1.5 and 100 nanometers, on the polymer layer 95 and on the metal pads 600_d_, 600_y_ and 600_z_ exposed by the openings 950, the seed layer 32_x_ can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the tantalum-containing layer.

After forming the seed layer 32_x_, a photoresist layer 71, such as positive-type photoresist layer or negative-type photoresist layer, having a thickness larger than 1 micrometer, such as between 1 and 60 micrometers, is formed on the seed layer 32_x_ by a spin-on coating process, a lamination process, a screen-printing process or a spraying process. Next, the photoresist layer 71 is patterned with the processes of exposure and development to form multiple openings 710 in the photoresist layer 71 exposing the seed layer 32_x_, and the openings 710 are over the metal pads 600_d_, but over the metal pads 600_y_ and 600_z_ for testing is no opening in the photoresist layer 71. A 1× stepper or 1× contact aligner can be used to expose the photoresist layer 71 during the process of exposure.

Next, a metal layer 34_w_ is formed on the seed layer 32_x_ of any previously described material exposed by the openings 710 and in the openings 710 by using an electroplating process, and then a solder layer 34_x_ is formed in the openings 710 and on the metal layer 34_w_ in the openings 710 by using an electroplating process. Both of the metal layer 34_w_ and the solder layer 34_x_ have a thickness larger than 1 micrometer, such as between 1 and 30 micrometers, and preferably between 2 and 20 micrometers or between 5 and 25 micrometers, larger than that of the seed layer 32_x_ and larger than that of the adhesion/barrier layer 32_w_. The material of the metal layer 34_w_ includes copper and/or nickel, and the material of the solder layer 34_x_ includes bismuth, indium, antimony, tin, a tin-lead alloy, a tin-silver alloy or a tin-silver-copper alloy. The solder layer 34_x_ can be used to be bonded with the chip 313.

For example, the metal layer 34_w_ can be formed by a suitable process or processes, e.g., by electroplating a single metal layer of copper with a thickness larger than 1 micrometer, such as between 1 and 30 micrometers, and preferably between 2 and 20 micrometers or between 5 and 25 micrometers, on the seed layer 32_x_, preferably the previously described copper layer 32_x_, exposed by the openings 710, and the solder layer 34_x_ including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of copper by using an electroplating process.

Alternatively, the metal layer 34_w_ can be formed by a suitable process or processes, e.g., by electroplating a single metal layer of nickel with a thickness larger than 1 micrometer, such as between 1 and 30 micrometers, and preferably between 2 and 20 micrometers or between 5 and 25 micrometers, on the seed layer 32_x_, preferably the previously described copper or nickel layer 32_x_, exposed by the openings 710, and the solder layer 34_x_ including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of nickel by using an electroplating process.

Alternatively, the metal layer 34_w_ can be formed by a suitable process or processes, e.g., by electroplating a copper layer with a thickness larger than 1 micrometer, such as between 1 and 30 micrometers, and preferably between 2 and 20 micrometers or between 5 and 25 micrometers, on the seed layer 32_x_, preferably the previously described copper layer 32_x_, exposed by the openings 710, and then electroplating a nickel layer with a thickness larger than 0.2 micrometers, such as between 0.3 and 6 micrometers, and preferably between 1 and 3 micrometers, on the electroplated copper layer. The solder layer 34_x_ including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the electroplated nickel layer of the metal layer 34_w_ by using an electroplating process.

Next, referring to FIG. 43D, the photoresist layer 71 is removed using an inorganic solution or using an organic solution with amide. Some residuals from the photoresist layer 71 could remain on the seed layer 32_x_ not under the metal layer 34_w_. Thereafter, the residuals can be removed from the seed layer 32_x_ with a plasma, such as an $O_2$ plasma or a plasma containing fluorine of below 200 PPM and oxygen. Next, the seed layer 32_x_ not under the metal layer 34_w_ is removed, and then the adhesion/barrier layer 32_w_ not under the metal layer 34_w_ is removed.

For example, the seed layer 32_x_ not under the metal layer 34_w_ and the adhesion/barrier layer 32_w_ not under the metal layer 34_w_ can be removed by a dry etching process, such as Ar sputtering etching process, reactive ion etching (RIE) process or ion milling process.

Alternatively, the seed layer 32_x_ not under the metal layer 34_w_ and the adhesion/barrier layer 32_w_ not under the metal layer 34_w_ can be removed by a wet etching process. When the seed layer 32_x_ is a copper layer, it can be etched with a solution containing $NH_4OH$ or with a solution containing $H_2SO_4$. When the adhesion/barrier layer 32_w_ is a titaniumtungsten-alloy layer, it can be etched with a solution containing hydrogen peroxide or with a solution containing $NH_4OH$ and hydrogen peroxide. When the adhesion/barrier layer 32*w* is a titanium layer, it can be etched with a solution containing hydrogen fluoride or with a solution containing $NH_4OH$ and hydrogen peroxide.

In case the seed layer 32*x* not under the metal layer 34*w* is removed using a wet etching process, an undercut is formed under the metal layer 34*w* overhanging the seed layer 32*x*. The seed layer 32*x* under the metal layer 34*w* has a first sidewall recessed from a second sidewall of the metal layer 34*w*, and a distance between the first sidewall and the second sidewall is between 0.1 and 2 micrometers.

Accordingly, as shown in FIG. 43D, multiple microbumps 317*e*, that is, metal bumps, provided by the adhesion/barrier layer 32*w*, the seed layer 32*x*, the metal layer 34*w* and the solder layer 34*x* are formed on the metal pads 600*d* exposed by the openings 50 and 950, on the polymer layer 95, and at the active side of the thinned silicon substrate 1. Each of the microbumps 317*e* has a height larger than 2 micrometers, such as between 2 and 70 micrometers, and preferably between 5 and 50 micrometers, and a width or diameter larger than 3 micrometers, such as between 3 and 30 micrometers. A pitch P2 between neighboring two microbumps 317*e* can be smaller than 60 micrometers, and preferably smaller than 40 micrometers, such as between 5 and 40 micrometers, and preferably between 10 and 30 micrometers. There are no microbumps formed on the metal pads 600*y* and 600*z* exposed by the openings 50 and 950, that is, the metal pads 600*y* and 600*z* are exposed by the openings 50 and 950 for testing.

The inter-chip circuit 20*j* and the testing interface circuit 333*e* can be connected to one of the microbumps 317*e* through the metal interconnect line 640*w* and through one of the openings 50, and the inter-chip circuit 20*k* and the testing interface circuit 333*f* can be connected to another one of the microbumps 317*e* through the metal interconnect line 640*x* and through another one of the openings 50. In a case, one of the microbumps 317*e* can be connected to signal nodes of the inter-chip circuit 20*j* and the testing interface circuit 333*e* through the metal interconnect line 640*w*, and another one of the microbumps 317*e* can be connected to signal nodes of the inter-chip circuit 20*k* and the testing interface circuit 333*d* through the metal interconnect line 640*x*. In another case, one of the microbumps 317*e* can be connected to power or ground nodes of the inter-chip circuit 20*j* and the testing interface circuit 333*e* through the metal interconnect line 640*w*, and another one of the microbumps 317*e* can be connected to power or ground nodes of the inter-chip circuit 20*k* and the testing interface circuit 333*d* through the metal interconnect line 640*x*.

Figure 43E:
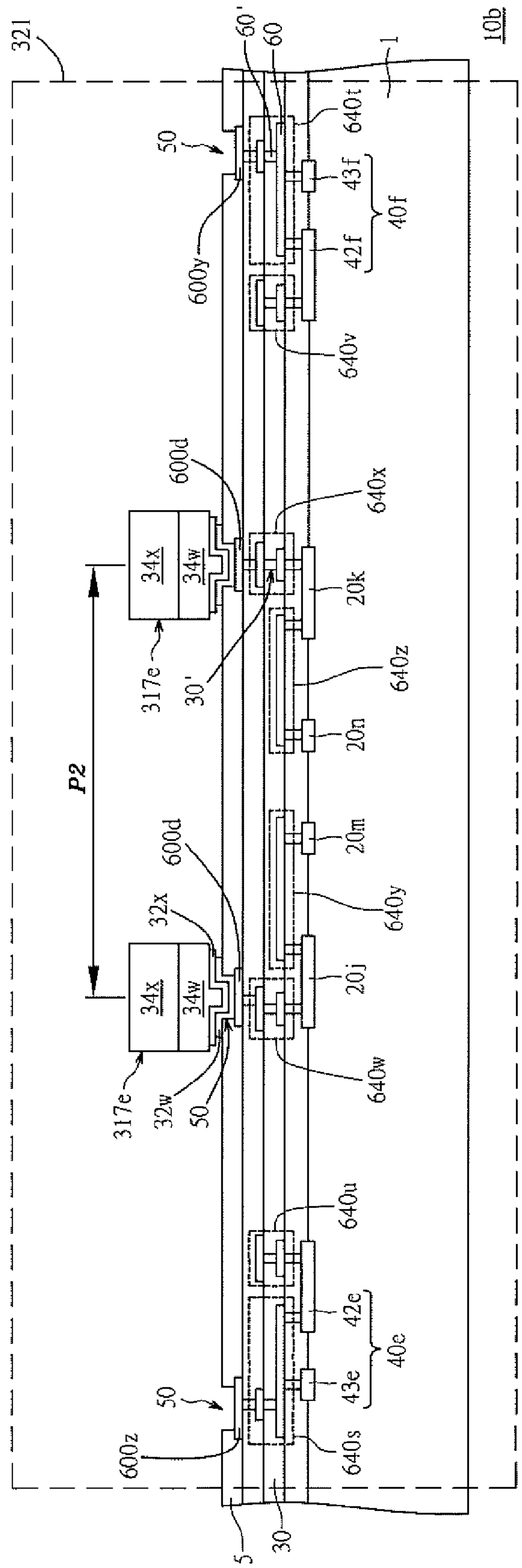

Alternatively, referring to FIG. 43E, the polymer layer 95 can be omitted, that is, the adhesion/barrier layer 32*w* can be formed on the passivation layer 5 and on the metal pads 600*d* exposed by the openings 50 in the passivation layer 5. Accordingly, the microbumps 317*e* provided by the adhesion/barrier layer 32*w*, the seed layer 32*x*, the metal layer 34*w* and the solder layer 34*x* can be formed on the metal pads 600*d* exposed by the openings 50, on the passivation layer 5, and at the active side of the thinned silicon substrate 1.

The semiconductor wafer 10*b* shown in FIG. 43D or 43E can be finalized to be cut into a plurality of the cache memory chip 321.

FIGS. 44A-44C are cross-sectional views showing a process for bonding the chip 313 with the semiconductor wafer 10*b* finalized to be cut into a plurality of the cache memory chip 321 as shown in FIG. 37A, 37D, 38A or 38D.

Referring to FIG. 44A, the chip 313 shown in FIG. 42N can be bonded with the semiconductor wafer 10*b* shown in FIG. 43D by joining the solder layer 27*z* of the microbumps 317*c* with the solder layer 34*x* of the microbumps 317*e* using a reflow or heating process. During the reflow or heating process, the solder layer 27*z* and the solder layer 34*x* are melted into a solder layer 35 including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, between the metal layers 27*y* and 34*w*. Accordingly, the previously described microbumps 317*a* provided by the adhesion/barrier layers 16*z* and 32*w*, the seed layers 18*z* and 32*x*, the metal layers 27*y* and 34*w* and the solder layer 35 can be formed between the metal pads 600*d* of the semiconductor wafer 10*b* and multiple contact points of the interconnecting structure 88 of the bottom scheme 103 of the chip 313. Each of the microbumps 317*a* has a thickness larger than 5 micrometers, such as between 5 and 100 micrometers, and preferably between 10 and 60 micrometers, and contacts with one of the metal pads 600*d* and with one of the contact points of the interconnecting structure 88. The pitch between neighboring two microbumps 317*a* can be smaller than 60 micrometers, and preferably smaller than 40 micrometers, such as between 5 and 40 micrometers, and preferably between 10 and 30 micrometers. The metal pads 600*d* can be connected to the interconnecting structure 88 through the microbumps 317*a*.

Next, referring to FIG. 44B, the previously described underfill 107*e* without fillers, such as a polymer, is filled into a gap between the chip 313 and the cache memory chip 321, and encloses the microbumps 317*a*. Next, referring to FIG. 44C, the semiconductor wafer 10*b* can be cut to singularize a plurality of stacked unit including the chips 313 and 321 connected to each other through the microbumps 317*a*. An IC structure 6*d* of the cache memory chip 321 shown in FIG. 37A, 37D, 38A or 38D contains the inter-chip circuits 20*j* and 20*k*, the internal circuits 20*m* and 20*n*, the off-chip circuit 40*e* including the off-chip buffer 42*e* and the off-chip ESD circuit 43*e*, the off-chip circuit 40*f* including the off-chip buffer 42*f* and the off-chip ESD circuit 43*f*, the test interface circuits 333*e* and 333*f*, the dielectric layers 30, the vias 30', the fine-line metal layers 60, the via plugs 60', and the metal interconnect lines 640*s*, 640*t*, 640*u*, 640*v*, 640*w*, 640*x*, 640*y* and 640*z*.

FIG. 45A is an example of a circuit diagram showing interface circuits of the chip 313 and the cache memory chip 321 shown in FIG. 37A, 37D, 38A, 38D or 44C. For detailed description about the circuit diagram of the chip 313 shown in FIG. 45A, please refer to the illustration in FIGS. 39A, 39D-39J and 40A-40F. FIG. 45B is another example of the circuit diagram showing interface circuits of the chip 313 and the cache memory chip 321 shown in FIG. 37A, 37D, 38A, 38D or 44C. The circuit diagram shown in FIG. 45B is similar to that shown in FIG. 45A except that the inter-chip buffers 701*a*, 702*a*, 703*a* and 704*a* are designed with inter-chip tri-state buffers each including a tri-state driver and a tri-state receiver, and the off-chip buffers 42*c*, 42*d*, 42*e* and 42*f* are designed with off-chip tri-state buffers each including a tri-state driver and a tri-state receiver. For detailed description about the circuit diagram of the chip 313 shown in FIG. 45B, please refer to the illustration in FIGS. 39H and 40A-40F.

Referring to FIGS. 45A and 45B, the cache memory chip 321 shown in FIG. 45A or 45B includes the inter-chip circuits 20*j* and 20*k*, the internal circuits 20*m* and 20*n*, the off-chip circuit 40*e* including the off-chip buffer 42*e* and the off-chip ESD circuit 43*e*, the off-chip circuit 40*f* including the off-chip buffer 42f and the off-chip ESD circuit 43f, and the testing interface circuits 333e and 333f.

The inter-chip circuit 20j includes an inter-chip buffer 701a and an inter-chip ESD circuit 701b. The inter-chip buffer 701a of the inter-chip circuit 20j has a first node FN1 and a second node SN1, and the inter-chip ESD circuit 701b has a node En connected to the first node FN1. The first node FN1 of the inter-chip buffer 701a can be connected to the node En of the inter-chip ESD circuit, 701b, to a first terminal F5 of the testing interface circuit 333e through the metal interconnect line 640w of the cache memory chip 321, to the left one of the metal pads 600d, including aluminum or electroplated copper, of the cache memory chip 321 through the metal interconnect line 640w, to the left one of the microbumps 317a through the metal interconnect line 640w and the left one of the metal pads 600d, and to the second node SN3 of the inter-chip buffer 703a of the chip 313 through the metal interconnect line 640w, the left one of the metal pads 600d, the left one of the microbumps 317a and the metal interconnect line 640f of the chip 313. The second node SN1 of the inter-chip buffer 701a can be connected to the internal circuit 20m through the metal interconnect line 640y of the cache memory chip 321. The specification of the inter-chip buffer 701a as shown in FIG. 45A or 45B can be referred to as the specification of the inter-chip buffer 701a as illustrated in FIG. 39A, 39B or 39H, and the specification of the inter-chip ESD circuit 701b as shown in FIG. 45A or 45B can be referred to as the specification of the inter-chip ESD circuit 701b as illustrated in FIG. 39A or 39H.

The inter-chip circuit 20k includes an inter-chip buffer 702a and an inter-chip ESD circuit 702b. The inter-chip buffer 702a of the inter-chip circuit 20k has a first node FN2 and a second node SN2, and the inter-chip ESD circuit 702b has a node En connected to the second node SN2. The first node FN2 of the inter-chip buffer 702a can be connected to the internal circuit 20n through the metal interconnect line 640z of the cache memory chip 321. The second node SN2 of the inter-chip buffer 702a can be connected to the node En of the inter-chip ESD circuit 702b, to a first terminal F6 of the testing interface circuit 333f through the metal interconnect line 640x of the cache memory chip 321, to the right one of the metal pads 600d, including aluminum or electroplated copper, of the cache memory chip 321 through the metal interconnect line 640x, to the right one of the microbumps 317a through the metal interconnect line 640x and the right one of the metal pads 600d, and to the first node FN4 of the inter-chip buffer 704a of the chip 313 through the metal interconnect line 640x, the right one of the metal pads 600d, the right one of the microbumps 317a and the metal interconnect line 640h of the chip 313. The specification of the inter-chip buffer 702a as shown in FIG. 45A or 45B can be referred to as the specification of the inter-chip buffer 702a as illustrated in FIG. 39A, 39C or 39H, and the specification of the inter-chip ESD circuit 702b as shown in FIG. 45A or 45B can be referred to as the specification of the inter-chip ESD circuit 702b as illustrated in FIG. 39A or 39H.

The inter-chip ESD circuits 701b and 702b are used for the inter-chip buffers 20j and 20k between the chip 313 and the cache memory chip 321 for electrostatic charge protection during the chip packaging or assembly manufacturing process. Alternatively, no ESD circuit can be required for the inter-chip buffers 20j and 20k between the chip 313 and the cache memory chip 321, that is, the inter-chip ESD circuits 701b and 702b can be omitted. In other words, there is no ESD circuit connected to the metal interconnect lines 640w and 640x.

The off-chip buffer 42e has a first node FN5 and a second node SN5, and the off-chip ESD circuit 43e has a node En connected to the first node FN5 and to the testing metal pad 600z. The first node FN5 of the off-chip buffer 42e can be connected to the node En of the off-chip ESD circuit 43e, and to the testing metal pad 600z, including aluminum or electroplated copper, of the cache memory chip 321 through the metal interconnect line 640s. The second node SN5 of the off-chip buffer 42e can be connected to a second terminal S5 of the testing interface circuit 333e through the metal interconnect line 640u of the cache memory chip 321. The specification of the off-chip buffer 42e as shown in FIG. 45A or 45B can be referred to as the specification of the off-chip buffer 42a as illustrated in FIG. 39A or 39H, and the specification of the off-chip ESD circuit 43e as shown in FIG. 45A or 45B can be referred to as the specification of the off-chip ESD circuit 43a as illustrated in FIG. 39A or 39H.

The off-chip buffer 42f has a first node FN6 and a second node SN6, and the off-chip ESD circuit 43f has a node En connected to the second node SN6 and to the testing metal pad 600y. The first node FN6 of the off-chip buffer 42f can be connected to a second terminal S6 of the testing interface circuit 333f through the metal interconnect line 640v of the cache memory chip 321. The second node SN6 of the off-chip buffer 42f can be connected to the node En of the off-chip ESD circuit 43f, and to the testing metal pad 600y, including aluminum or electroplated copper, of the cache memory chip 321 through the metal interconnect line 640t. The specification of the off-chip buffer 42f as shown in FIG. 45A or 45B can be referred to as the specification of the off-chip buffer 42a as illustrated in FIG. 39A or 39H, and the specification of the off-chip ESD circuit 43e as shown in FIG. 45A or 45B can be referred to as the specification of the off-chip ESD circuit 43a as illustrated in FIG. 39A or 39H.

Each of the internal circuits 20m and 20n shown in FIG. 45A or 45B can be a NOR gate, a NAND gate, an AND gate, an OR gate, a flash memory cell, a dynamic-random-access-memory (DRAM) cell, a static-random-access-memory (SRAM) cell, a non-volatile memory cell, an erasable programmable read-only memory (EPROM) cell, a read-only memory (ROM) cell, a magnetic random access memory (MRAM) cell, an analog-to-digital (A/D) converter, a digital-to-analog (D/A) converter, an operational amplifier, a sense amplifier, an inverter, an adder, a multiplexer, a diplexer, a multiplier, a complementary-metal-oxide-semiconductor (CMOS) device, a bi-polar CMOS device, a bipolar circuit or an analog circuit. Each of the internal circuits 20m and 20n shown in FIG. 45A or 45B may include a NMOS transistor having a ratio of a physical channel width thereof to a physical channel length thereof ranging from, e.g., about 0.1 and 20, ranging from, e.g., about 0.1 and 10 or ranging from, e.g., about 0.2 and 2. Alternatively, each of the internal circuits 20m and 20n shown in FIG. 45A or 45B may include a PMOS transistor having a ratio of a physical channel width thereof to a physical channel length thereof ranging from, e.g., about 0.2 and 40, ranging from, e.g., about 0.2 and 40 or ranging from, e.g., about 0.4 and 4.

Both of the test interface circuits 333e and 333f shown in FIG. 45A or 45B can be a scan test circuit, and the scan test circuit can be performed at the wafer level testing before the cache memory chip 321 is sawed or diced apart from a wafer or at the package level testing after the chips 321 and 313 are joined with each other, and the scan test circuit is used to test flip flops by input the scan-in signal or output the scan-out signal.

The size of the inter-chip buffer 702a shown in FIG. 45A can be characterized by a ratio of a physical channel width to a physical channel length of the NMOS transistor 752*a* or PMOS transistor 752*b*, and the drains of the NMOS transistor 752*a* and the PMOS transistor 752*b* are connected to the metal pad 600*d* of the cache memory chip 321 through the metal interconnect line 640*x*. If the inter-chip buffer 702*a* is the two-stage cascade inter-chip driver shown in FIG. 39C, the size of the inter-chip buffer 702*a* can be characterized by the ratio of the physical channel width to the physical channel length of the NMOS transistor 752*a* or PMOS transistor 752*b* in the last stage driver 425*b*, and the drains of the NMOS transistor 752*a* and the PMOS transistor 752*b* are connected to the metal pad 600*d* of the cache memory chip 321 through the metal interconnect line 640*x*. The definition of the physical channel width and physical channel length of the NMOS transistor 752*a* or PMOS transistor 752*b* can be referred to as the illustration in FIGS. 21 and 22. The ratio of the physical channel width to the physical channel length of the NMOS transistor 752*a* can be between 1 and 50, exemplary between 1 and 20, and the ratio of the physical channel width to the physical channel length of the PMOS transistor 752*b* can be between 1 and 100, exemplary between 1 and 40.

The size of the off-chip buffer 42*f* shown in FIG. 45A can be characterized by a ratio of a physical channel width to a physical channel length of the NMOS transistor 4203 or PMOS transistor 4204, and the drains of the NMOS transistor 4203 and the PMOS transistor 4204 are connected to the testing metal pad 600*y* of the cache memory chip 321 through the metal interconnect line 640*t*. If the off-chip buffer 42*f* is the two-stage cascade off-chip driver 421 shown in FIG. 11A, the size of the off-chip buffer 42*f* can be characterized by the ratio of the physical channel width to the physical channel length of the NMOS transistor 4203 or PMOS transistor 4204 in the last stage driver 421", and the drains of the NMOS transistor 4203 and the PMOS transistor 4204 are connected to the testing metal pad 600*y* of the cache memory chip 321 through the metal interconnect line 640*t*. The definition of the physical channel width and physical channel length of the NMOS transistor 4203 or PMOS transistor 4204 can be referred to as the illustration in FIGS. 21 and 22. The ratio of the physical channel width to the physical channel length of the NMOS transistor 4203 can be larger than 30, such as between 30 and 20000, exemplary larger than 50, such as between 50 and 300. The ratio of the physical channel width to the physical channel length of the PMOS transistor 4204 can be larger than 60, such as between 60 and 40000, exemplary larger than 100, such as between 100 and 600. The ratio of the physical channel width to the physical channel length of the NMOS transistor 4203 of the off-chip buffer 42*f* may be larger than the ratio of the physical channel width to the physical channel length of the NMOS transistor 752*a* of the inter-chip buffer 702*a* by more than 3 times, 10 times, 25 times or 50 times, such as between 3 and 100 times. The ratio of the physical channel width to the physical channel length of the PMOS transistor 4204 of the off-chip buffer 42*f* may be larger than the ratio of the physical channel width to the physical channel length of the PMOS transistor 752*b* of the inter-chip buffer 702*a* by more than 3 times, 10 times, 25 times or 50 times, such as between 3 and 100 times.

The size of the inter-chip buffer 701*a* or 702*a* shown in FIG. 45B can be characterized by a ratio of a physical channel width to a physical channel length of an NMOS transistor or PMOS transistor of the tri-state driver of the inter-chip tri-state buffer, and the tri-state driver is connected to one of the metal pad 600*d* of the cache memory chip 321 through the metal interconnect line 640*w* or 640*x*, and the ratio of the physical channel width to the physical channel length of the NMOS transistor of the tri-state driver is between 1 and 50, exemplary between 1 and 20, and the ratio of the physical channel width to the physical channel length of the PMOS transistor of the tri-state driver is between 1 and 100, exemplary between 1 and 40. If the inter-chip buffer 701*a* or 702*a* is a multi-stage tri-state buffer, the size of the inter-chip buffer 701*a* or 702*a* can be characterized by a ratio of a physical channel width to a physical channel length of an NMOS transistor or PMOS transistor in the last stage tri-state driver of the multi-stage tri-state buffer, and the last stage tri-state driver is connected to one of the metal pad 600*d* of the cache memory chip 321 through the metal interconnect line 640*w* or 640*x*, and the ratio of the physical channel width to the physical channel length of the NMOS transistor of the last stage tri-state driver is between 1 and 50, exemplary between 1 and 20, and the ratio of the physical channel width to the physical channel length of the PMOS transistor of the last stage tri-state driver is between 1 and 100, exemplary between 1 and 40. The definition of the physical channel width and physical channel length of the NMOS transistor or PMOS transistor can be referred to as the illustration in FIGS. 21 and 22.

The size of the off-chip buffer 42*e* or 42*f* shown in FIG. 45B can be characterized by a ratio of a physical channel width to a physical channel length of an NMOS transistor or PMOS transistor of a tri-state driver of the off-chip tri-state buffer, and the tri-state driver is connected to the metal pad 600*z* or 600*y* of the cache memory chip 321 through the metal interconnect line 640*s* or 640*t*, and the ratio of the physical channel width to the physical channel length of the NMOS transistor of the tri-state driver is larger than 30, such as between 30 and 20000, exemplary larger than 50, such as between 50 and 300, and the ratio of the physical channel width to the physical channel length of the PMOS transistor of the tri-state driver is larger than 60, such as between 60 and 40000, exemplary larger than 100, such as between 100 and 600. If the off-chip buffer 42*e* or 42*f* is a multi-stage tri-state buffer, the size of the off-chip buffer 42*e* or 42*f* can be characterized by a ratio of a physical channel width to a physical channel length of an NMOS transistor or PMOS transistor in the last stage tri-state driver of the multi-stage tri-state buffer, and the last stage tri-state driver is connected to the metal pad 600*z* or 600*y* of the cache memory chip 321 through the metal interconnect line 640*s* or 640*t*, and the ratio of the physical channel width to the physical channel length of the NMOS transistor of the last stage tri-state driver is larger than 30, such as between 30 and 20000, exemplary larger than 50, such as between 50 and 300, and the ratio of the physical channel width to the physical channel length of the PMOS transistor of the last stage tri-state driver is larger than 60, such as between 60 and 40000, exemplary larger than 100, such as between 100 and 600. The definition of the physical channel width and physical channel length of the NMOS transistor or PMOS transistor can be referred to as the illustration in FIGS. 21 and 22. The ratio of the physical channel width to the physical channel length of the NMOS transistor of the tri-state driver of the off-chip tri-state buffer 42*e* or 42*f* shown in FIG. 45B may be larger than the ratio of the physical channel width to the physical channel length of the NMOS transistor of the tri-state driver of the inter-chip tri-state buffer 701*a* or 702*a* shown in FIG. 45B by more than 3 times, 10 times, 25 times or 50 times, such as between 3 and 100 times. The ratio of the physical channel width to the physical channel length of the PMOS transistor of the tri-state driver of the off-chip tri-state buffer 42*e* or 42*f* shown in FIG. 45B may be larger than the ratio of the physical channel width to the physical channel length of the PMOS transistor of the tri-state driver of the inter-chip tri-state buffer 701*a* or 702*a* shown in FIG. 45B by more than 3 times, 10 times, 25 times or 50 times, such as between 3 and 100 times.

Each of the inter-chip ESD circuits 701*b* and 702*b* and each of the off-chip ESD circuits 43*e* and 43*f* may include one or more ESD (electro static discharge) units each composed of two reverse-biased diodes or of a PMOS transistor and an NMOS transistor.

The size of the inter-chip ESD circuit 701*b* or 702*b* of the cache memory chip 321 can be defined as a loading or capacitance of the inter-chip ESD circuit 701*b* or 702*b*, and the size of the off-chip ESD circuit 43*e* or 43*f* of the cache memory chip 321 can be defined as a loading or capacitance of the off-chip ESD circuit 43*e* or 43*f*. In a case, each of the inter-chip ESD circuits 701*b* and 702*b* of the cache memory chip 321 has a loading or capacitance smaller than 2 pF (pico Farads), such as between 0.01 and 2 pF, exemplary smaller than 0.5 pF, such as between 0.01 and 0.5 pF, and each of the large off-chip ESD circuits 43*e* and 43*f* of the cache memory chip 321 has a loading or capacitance larger than 2 pF, such as between 2 and 100 pF, exemplary larger than 5 pF, such as between 5 and 100 pF. In another case, each of the inter-chip ESD circuits 701*b* and 702*b* of the cache memory chip 321 has a loading or capacitance smaller than 1 pF, such as between 0.01 and 1 pF, and each of the large off-chip ESD circuits 43*e* and 43*f* of the cache memory chip 321 has a loading or capacitance larger than 1 pF, such as between 1 and 100 pF.

Alternatively, the size of the inter-chip ESD circuit 701*b* or 702*b* of the cache memory chip 321 can be defined as an active area of the inter-chip ESD circuit 701*b* or 702*b*, and the size of the large off-chip ESD circuit 43*e* or 43*f* of the cache memory chip 321 can be defined as an active area of the large off-chip ESD circuit 43*e* or 43*f*. Calculating or defining the active area of each of the inter-chip ESD circuits 701*b* and 702*b* and the active area of each of the off-chip ESD circuits 43*e* and 43*f* can be referred to as the step illustrated in FIGS. 40A-40*f*.

For example, each of the inter-chip ESD circuits 701*b* and 702*b* of the cache memory chip 321 may have an active area smaller than 1300 square millimeters, such as between 6.5 and 1300 square millimeters, exemplary smaller than 325 square millimeters, such as between 6.5 and 325 square millimeters, and each of the off-chip ESD circuits 43*e* and 43*f* of the cache memory chip 321 may have an active area larger than 1300 square millimeters, such as between 1300 and 65000 square millimeters, exemplary larger than 3250 square millimeters, such as between 3250 and 65000 square millimeters. Alternatively, each of the inter-chip ESD circuits 701*b* and 702*b* of the cache memory chip 321 may have an active area smaller than 650 square millimeters, and each of the off-chip ESD circuits 43*e* and 43*f* of the cache memory chip 321 may have an active area larger than 650 square millimeters.

The size of the off-chip ESD circuit 43*e* of the cache memory chip 321, defined as the active area of the off-chip ESD circuit 43*e* or the loading or capacitance of the off-chip ESD circuit 43*e*, can be larger than the size of the inter-chip ESD circuit 701*b* of the cache memory chip 321, defined as the active area of the inter-chip ESD circuit 701*b* or the loading or capacitance of the inter-chip ESD circuit 701*b*, by more than 3 times, 10 times, 25 times or 50 times, such as between 3 and 50 times.

The size of the off-chip ESD circuit 43*f* of the cache memory chip 321, defined as the active area of the off-chip ESD circuit 43*f* or the loading or capacitance of the off-chip ESD circuit 43*f*, can be larger than the size of the inter-chip ESD circuit 702*b* of the cache memory chip 321, defined as the active area of the inter-chip. ESD circuit 702*b* or the loading or capacitance of the inter-chip ESD circuit 702*b*, by more than 3 times, 10 times, 25 times or 50 times, such as between 3 and 50 times.

FIGS. 46A-46M are cross-sectional views showing a process for forming a semiconductor wafer finalized to be cut into a plurality of the cache memory chip 311 shown in FIG. 37A, 37B, 38A or 38B. Referring to FIG. 46A, a semiconductor wafer 10*c*, such as silicon wafer, is provided with a silicon substrate 1, the previously described off-chip circuit 40*a* including the off-chip buffer 42*a* and the off-chip ESD circuit 43*a* in and/or over the silicon substrate 1, the off-chip circuit 40*b* including the off-chip buffer 42*b* and the off-chip ESD circuit 43*b* in and/or over the silicon substrate 1, the inter-chip circuits 20*a* and 20*b* in and/or over the silicon substrate 1, the internal circuits 20*c* and 20*d* in and/or over the silicon substrate 1, multiple dielectric layers 30 over the silicon substrate 1, multiple fine-line metal layers 60 over the silicon substrate 1, multiple via plugs 60' in vias 30' of the dielectric layers 30, and an insulating layer 5, that is, passivation layer, over the fine-line metal layers 60, over the dielectric layers 30, over the off-chip circuits 40*a* and 40*b*, over the inter-chip circuits 20*a* and 20*b*, and over the internal circuits 20*c* and 20*d*.

The semiconductor wafer 10*c* has the previously described metal pads 600*b*, 600*s* and 600*t*. The metal pads 600*b*, 600*s* and 600*t* are provided by the topmost fine-line metal layer 60 under the passivation layer 5, and include aluminum, aluminum-copper-alloy or electroplated copper. Each of the metal pads 600*b*, 600*s* and 600*t* may have a thickness between 0.5 and 3 micrometers or between 20 nanometers and 1.5 micrometers, and a width smaller than 1 micrometer, such as between 0.2 and 0.95 micrometers. Multiple openings 50 in the passivation layer 5 are over the metal pads 600*b*, 600*s* and 600*t* and expose them, and the metal pads 600*b*, 600*s* and 600*t* are at bottoms of the openings 50. Each of the openings 50 may have a width between 10 and 100 micrometers, and preferably between 20 and 60 micrometers.

The semiconductor wafer 10*c* has the previously described metal interconnect lines 640*a*, 640*b*, 640*c*, 640*d*, 640*i*, 640*j*, 640*k* and 640*m* each including a portion provided by the fine-line metal layers 60 and the via plugs 60'. The semiconductor wafer 10*c* also includes the previously described testing interface circuits 333*a* and 333*b* (not shown in FIGS. 46A-46N). The internal circuit 20*c* can be connected to the inter-chip circuit 20*a* through the metal interconnect line 640*a*, and the internal circuit 20*d* can be connected to the inter-chip circuit 20*b* through the metal interconnect line 640*c*. The inter-chip circuit 20*a* can be connected to one of the metal pads 600*b* and to the testing interface circuit 333*a* through the metal interconnect line 640*b*. The inter-chip circuit 20*b* can be connected to another one of the metal pads 600*b* and to the testing interface circuit 333*b* through the metal interconnect line 640*d*. The testing interface circuit 333*a* can be connected to the off-chip buffer 42*a* through the metal interconnect line 640*i*, and the testing interface circuit 333*b* can be connected to the off-chip buffer 42*b* through the metal interconnect line 640*k*. The off-chip buffer 42*a* can be connected to the off-chip ESD circuit 43*a* and to the testing metal pad 600*t* through the metal interconnect line 640*j*. The off-chip buffer 42*b* can be connected to the off-chip ESD circuit 43*b* and to the testing metal pad 600*s* through the metal interconnect line 640*m*.

The passivation layer 5 can protect the inter-chip circuits 20*a* and 20*b*, the internal circuits 20*c* and 20*d*, the off-chip circuits 40*a* and 40*b*, the testing interface circuits 333*a* and 333*b* and the fine-line metal layers 60 from being damaged by moisture and foreign ion contamination. In other words, mobile ions (such as sodium ion), transition metals (such as gold, silver and copper) and impurities can be prevented from penetrating through the passivation layer 5 to the inter-chip circuits 20*a* and 20*b*, the internal circuits 20*c* and 20*d*, the off-chip circuits 40*a* and 40*b*, the testing interface circuits 333*a* and 333*b* and the fine-line metal layers 60. The specification of the silicon substrate 1, the dielectric layers 30, the fine-line metal layers 60 and the passivation layer 5 as shown in FIG. 46A can be referred to as the specification of the silicon substrate 1, the dielectric layers 30, the fine-line metal layers 60 and the passivation layer 5 as illustrated in FIG. 42A, respectively.

Referring to FIG. 46B, after providing the semiconductor wafer 10*c* shown in FIG. 46A, a flux or insulating material 33 can be formed in the openings 50 and on the metal pads 600*b*, 600*s* and 600*t* exposed by the openings 50. Next, referring to FIG. 46C, with the step being illustrated with a reverse figure for simple explanation, the silicon substrate 1 of the semiconductor wafer 10*c* is thinned to a thickness t2 between 1 and 10 micrometers, between 3 and 50 micrometers or between 10 and 150 micrometers by mechanically grinding or chemically mechanically polishing (CMP) a backside 1*a* of the silicon substrate 1.

Next, referring to FIG. 46D, with the steps being illustrated with a reverse figure for simple explanation, multiple through-silicon vias 11 (only two of them are shown in FIGS. 46A-46N) are formed in the thinned silicon substrate 1 and in at least one dielectric layer 30, exposing regions 60*a* of the fine-line metal layers 60, and an insulating layer 3 is formed on the backside 1*a* of the thinned silicon substrate 1 and on sidewalls of the through-silicon vias 11. The through-silicon vias 11 penetrate completely through the thinned silicon substrate 1 and the dielectric layer(s) 30. Each of the through-silicon vias 11 may have a diameter or width W1 between 5 and 100 micrometers or between 3 and 50 micrometers, and a depth between 1 and 10 micrometers, between 3 and 50 micrometers or between 10 and 150 micrometers. The insulating layer 3, for example, may include a nitride layer, such as silicon-nitride layer, a polymer layer, such as polyimide layer, benzocyclobutene layer or polybenzoxazole layer, a silicon-oxynitride layer, a silicon-carbon-nitride (SiCN) layer, a silicon-oxycarbide (SiOC) layer or a silicon-oxide layer. The process of forming the through-silicon vias 11 and the insulating layer 3 as shown in FIG. 46D can be referred to as the process of forming the through-silicon vias 11*a*, 11*b*, 11*c*, 11*d* and 11*e* and the insulating layer 3 as illustrated in FIGS. 24D-24H or FIGS. 241-24N. The specification of the insulating layer 3 shown in FIG. 46D can be referred to as the specification of the insulating layer 3 as illustrated in FIGS. 24D-24H or FIGS. 24I-24N.

Next, referring to FIG. 46E, with the step being illustrated with a reverse figure for simple explanation, multiple interconnecting structures 88 provided by two metal layers 4 and 9 can be formed in the through-silicon vias 11, on the insulating layer 3, on the regions 60*a* of the fine-line metal layers 60 and at the backside 1*a* of the thinned silicon substrate 1, and the metal layer 4 is composed of an adhesion/barrier layer 4*a* on the insulating layer 3, in the through-silicon vias 11 and on the regions 60*a* of the fine-line metal layers 60 exposed by the through-silicon vias 11, and a seed layer 4*b* on the adhesion/barrier layer 4*a*. Sidewalls of the metal layer 9 are not covered by the metal layer 4. The process of forming the interconnecting structures 88 as shown in FIG. 46E can be referred to as the process of forming the interconnecting structures 88 as illustrated in FIGS. 25A-25F. The specification of the metal layer 4 including the adhesion/barrier layer 4*a* and the seed layer 4*b* as shown in FIG. 46E can be referred to as the specification of the metal layer 4 including the adhesion/barrier layer 4*a* and the seed layer 4*b* as illustrated in FIG. 25A. The specification of the metal layer 9 shown in FIG. 46E can be referred to as the specification of the metal layer 9 as illustrated in FIG. 25D.

The left one of the interconnecting structures 88 can be connected to the off-chip buffer 42*a*, to the off-chip ESD circuit 43*a*, and to the testing metal pad 600*t* through one or more of the through-silicon vias 11 and through the metal interconnect line 640*j*. The right one of the interconnecting structures 88 can be connected to the off-chip buffer 42*b*, to the off-chip ESD circuit 43*b*, and to the testing metal pad 600*s* through one or more of the through-silicon vias 11 and through the metal interconnect line 640*m*.

The middle one of the interconnecting structures 88 can be used for a power interconnect, such as power plane, power bus, power trace or power line, to connect with a power node of the inter-chip circuit 20*a*, a power node of the internal circuit 20*c*, a power node of the off-chip buffer 42*a*, a node of the off-chip ESD circuit 43*a*, a power node of the testing interface circuit 333*a*, a power node of the inter-chip circuit 20*b*, a power node of the internal circuit 20*d*, a power node of the off-chip buffer 42*b*, a node of the off-chip ESD circuit 43*b*, and a power node of the testing interface circuit 333*b* through the through-silicon vias 11. The power nodes of the inter-chip circuit 20*a*, the internal circuit 20*c*, the off-chip buffer 42*a* and the testing interface circuit 333*a* can be connected to the power nodes of the inter-chip circuit 20*b*, the internal circuit 20*d*, the off-chip buffer 42*b* and the testing interface circuit 333*b* through the middle one of the interconnecting structures 88. The node of the off-chip ESD circuit 43*a* can be connected to the node of the off-chip ESD circuit 43*b* through the middle one of the interconnecting structures 88.

Alternatively, the middle one of the interconnecting structures 88 can be used for a ground interconnect, such as ground plane, ground bus, ground trace or ground line, to connect with a ground node of the inter-chip circuit 20*a*, a ground node of the internal circuit 20*c*, a ground node of the off-chip buffer 42*a*, a node of the off-chip ESD circuit 43*a*, a ground node of the testing interface circuit 333*a*, a ground node of the inter-chip circuit 20*b*, a ground node of the internal circuit 20*d*, a ground node of the off-chip buffer 42*b*, a node of the off-chip ESD circuit 43*b*, and a ground node of the testing interface circuit 333*b* through the through-silicon vias 11. The ground nodes of the inter-chip circuit 20*a*, the internal circuit 20*c*, the off-chip buffer 42*a* and the testing interface circuit 333*a* can be connected to the ground nodes of the inter-chip circuit 20*b*, the internal circuit 20*d*, the off-chip buffer 42*b* and the testing interface circuit 333*b* through the middle one of the interconnecting structures 88. The node of the off-chip ESD circuit 43*a* can be connected to the node of the off-chip ESD circuit 43*b* through the middle one of the interconnecting structures 88.

Next, referring to FIG. 46F, with the step being illustrated with a reverse figure for simple explanation, a polymer layer 14 is formed on the metal layer 9, on the insulating layer 3 and at sidewalls of the interconnecting structures 88 using a process including a spin-on coating process, a lamination process, a screen-printing process or a spraying process and including a curing process. Multiple openings 14*a* in the polymer layer 14 are over multiple regions of the metal layer 9 and expose them. The polymer layer 14 has a thickness larger than 2 micrometers, such as between 3 and 25 micrometers, and preferably between 5 and 15 micrometers, larger than that of each of the dielectric layers 30, and larger than that of the passivation layer 5. The material of the polymer layer 14 may include benzocyclobutane (BCB), polyimide (PI), polybenzoxazole (PBO) or epoxy resin.

Next, referring to FIG. 46G, with the steps being illustrated with a reverse figure for simple explanation, an adhesion/barrier layer 16 having a thickness smaller than 1 micrometer, such as between 0.02 and 0.5 micrometers, and preferably between 0.1 and 0.2 micrometers, can be formed on the polymer layer 14 and on the regions of the metal layer 9 exposed by the openings 14*a* by using a physical vapor deposition (PVD) process, such as sputtering process or evaporation process, and then a seed layer 18 having a thickness smaller than 1 micrometer, such as between 0.05 and 0.5 micrometers, and preferably between 0.08 and 0.15 micrometers, can be formed on the adhesion/barrier layer 16 by using a physical vapor deposition (PVD) process, such as sputtering process or evaporation process. The specification of the adhesion/barrier layer 16 and the seed layer 18 as shown in FIG. 46G can be referred to as the specification of the adhesion/barrier layer 16 and the seed layer 18 as illustrated in FIG. 25H, respectively. The process of forming the adhesion/barrier layer 16 and the seed layer 18 as shown in FIG. 46G can be referred to as the process of forming the adhesion/barrier layer 16 and the seed layer 18 as illustrated in FIG. 25H, respectively.

After forming the seed layer 18, a photoresist layer 31, such as positive-type photoresist layer or negative-type photoresist layer, having a thickness larger than 1 micrometer, such as between 1 and 60 micrometers, is formed on the seed layer 18 by a spin-on coating process, a lamination process, a screen-printing process or a spraying process. Next, the photoresist layer 31 is patterned with the processes of exposure and development to form multiple openings 31*a* in the photoresist layer 31 exposing the seed layer 18. A 1× stepper or 1× contact aligner can be used to expose the photoresist layer 31 during the process of exposure.

Next, multiple metal bumps or pillars 27 are formed over the interconnecting structures 88, on the seed layer 18 of any previously described material exposed by the openings 31*a*, and in the openings 31*a*. The metal bumps or pillars 27 may have a thickness larger than 5 micrometers, such as between 5 and 150 micrometers, and preferably between 10 and 100 micrometers, larger than that of the seed layer 18, larger than that of the adhesion/barrier layer 16 and larger than that of each of the fine-line Metal layers 60. The metal bumps or pillars 27 may have a width larger than 1 micrometer, such as between 5 and 150 micrometers, and preferably between 5 and 50 micrometers, and larger than that of each of the fine-line metal layers 60. The material of the metal bumps or pillars 27 may include copper, gold, nickel, aluminum, silver, solder, platinum or a composite of the previously described materials. The specification of the metal bumps or pillars 27 as shown in FIG. 46G can be referred to as the specification of the metal bump or pillar 27 as illustrated in FIG. 25J. The process of forming the metal bumps or pillars 27 as shown in FIG. 46G can be referred to as the process of forming the metal bump or pillar 27 as illustrated in FIG. 25J.

Next, referring to FIG. 46H, with the steps being illustrated with a reverse figure for simple explanation, the photoresist layer 31 is removed using an inorganic solution or using an organic solution with amide. Some residuals from the photoresist layer 31 could remain on the seed layer 18 not under the metal bumps or pillars 27. Thereafter, the residuals can be removed from the seed layer 18 with a plasma, such as an $O_2$ plasma or a plasma containing fluorine of below 200 PPM and oxygen. Next, the seed layer 18 not under the metal bumps or pillars 27 is removed, and then the adhesion/barrier layer 16 not under the metal bumps or pillars 27 is removed. The process of removing the seed layer 18 not under the metal bumps or pillars 27 as shown in FIG. 46H can be referred to as the process of removing the seed layer 18 not under the metal bumps or pillars 27 as illustrated in FIG. 25L, and the process of removing the adhesion/barrier layer 16 not under the metal bumps or pillars 27 as shown in FIG. 46H can be referred to as the process of removing the adhesion/barrier layer 16 not under the metal bumps or pillars 27 as illustrated in FIG. 25L.

In case the adhesion/barrier layer 16 not under the metal bumps or pillars 27 is removed using a wet etching process, multiple undercuts are formed under the metal bumps or pillars 27 overhanging the adhesion/barrier layer 16. The adhesion/barrier layer 16 under the metal bump or pillar 27 has a first sidewall recessed from a second sidewall of the metal bump or pillar 27, and a distance d1 between the first sidewall and the second sidewall is between 0.1 and 2 micrometers.

Accordingly, as shown in FIG. 46H, a bottom scheme 103 at the backside 1*a* of the thinned silicon substrate 1 of the semiconductor wafer 10*c* can be formed with the insulating layer 3, the polymer layer 14, the adhesion/barrier layer 16, the seed layer 18, the metal bumps or pillars 27, and the interconnecting structures 88 provided by the metal layers 4 and. The metal bumps or pillars 27 can be connected to the interconnecting structures 88 through the seed layer 18 and the adhesion/barrier layer 1, and can be used to be bonded with the previously described substrate 301 or BGA substrate 302. A pitch between neighboring two metal bumps or pillars 27 may be smaller than 60 micrometers, and preferably smaller than 40 micrometers, such as between 5 and 40 micrometers, and preferably between 10 and 30 micrometers.

Referring to FIG. 46I, after forming the metal bumps or pillars 27 shown in FIG. 46H, the flux or insulating material 33 can be removed to expose the metal pads 600*b*, 600*s* and 600*t* exposed by the openings 50 in the passivation layer 5. Next, referring to FIG. 46J, a polymer layer 95 can be optionally formed on the passivation layer 5 of the semiconductor wafer 10*c*. Multiple openings 950 in the polymer layer 95 are over the metal pads 600*b*, 600*s* and 600*t* exposed by the openings 50 and expose them. The polymer layer 95 may have a thickness larger than 2 micrometers, such as between 3 and 50 micrometers, and preferably between 2 and 30 micrometers, larger than that of the passivation layer 5, and larger than that of each of the dielectric layers 30. The material of the polymer layer 95 may include benzocyclobutane (BCB), polyimide (PI), polybenzoxazole (PBO) or epoxy resin.

Next, referring to FIG. 46K, an adhesion/barrier layer 32*s* having a thickness smaller than 1 micrometer, such as between 1 and 300 nanometers, and preferably between 1.5 and 100 nanometers, can be formed on the polymer layer 95 and on the metal pads 600*b*, 600*s* and 600*t* exposed by the openings 950 by using a physical vapor deposition (PVD) process, such as sputtering process or evaporation process, and then a seed layer 32*t* having a thickness smaller than 1 micrometer, such as between 20 and 500 nanometers, and preferably between 35 and 300 nanometers, can be formed on the adhesion/barrier layer 32*s* by using a physical vapor deposition (PVD) process, such as sputtering process or evaporation process. The material of the adhesion/barrier layer 32*s* may include titanium, a titanium-tungsten alloy, titanium nitride, chromium, tantalum, tantalum nitride or a composite of the previously described materials, and the material of the seed layer 32*t* may include copper, nickel, aluminum, gold, silver, platinum or palladium.

When the adhesion/barrier layer 32*s* is formed by a suitable process or processes, e.g., by sputtering a titanium-containing layer, such as a single layer of titanium-tungsten alloy, titanium or titanium nitride, having a thickness smaller than 1 micrometer, such as between 1 and 300 nanometers, and preferably between 1.5 and 100 nanometers, on the polymer layer 95 and on the metal pads 600*b*, 600*s* and 600*t* exposed by the openings 950, the seed layer 32*t* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the titanium-containing layer.

Alternatively, when the adhesion/barrier layer 32*s* is formed by a suitable process or processes, e.g., by sputtering a tantalum-containing layer, such as a single layer of tantalum or tantalum nitride, having a thickness smaller than 1 micrometer, such as between 1 and 300 nanometers, and preferably between 1.5 and 100 nanometers, on the polymer layer 95 and on the metal pads 600*b*, 600*s* and 600*t* exposed by the openings 950, the seed layer 32*t* can be formed by a suitable process or processes, e.g., by sputtering a copper layer, a nickel layer, an aluminum layer, a gold layer, a silver layer, a platinum layer or a palladium layer with a thickness smaller than 1 micrometer, such as between 20 and 500 nanometers, and preferably between 35 and 300 nanometers, on the tantalum-containing layer.

After forming the seed layer 32*t*, a photoresist layer 71, such as positive-type photoresist layer or negative-type photoresist layer, having a thickness larger than 1 micrometer, such as between 1 and 60 micrometers, is formed on the seed layer 32*t* by a spin-on coating process, a lamination process, a screen-printing process or a spraying process. Next, the photoresist layer 71 is patterned with the processes of exposure and development to form multiple openings 710 in the photoresist layer 71 exposing the seed layer 32*t*, and the openings 710 are over the metal pads 600*b*, but over the metal pads 600*s* and 600*t* for testing is no opening in the photoresist layer 71. A 1× stepper or 1× contact aligner can be used to expose the photoresist layer 71 during the process of exposure.

Next, a metal layer 34*s* is formed on the seed layer 32*t* of any previously described material exposed by the openings 710 and in the openings 710 by using an electroplating process, and then a solder layer 34*t* is formed on the metal layer 34*s* in the openings 710 by using an electroplating process. Both of the metal layer 34*s* and the solder layer 34*t* have a thickness larger than 1 micrometer, such as between 1 and 30 micrometers, and preferably between 2 and 20 micrometers or between 5 and 25 micrometers, larger than that of the seed layer 32*t* and larger than that of the adhesion/barrier layer 32*s*. The material of the metal layer 34*s* includes copper and/or nickel, and the material of the solder layer 34*t* includes bismuth, indium, antimony, tin, a tin-lead alloy, a tin-silver alloy or a tin-silver-copper alloy. The solder layer 34*t* can be used to be bonded with the chip 313.

For example, the metal layer 34*s* can be formed by a suitable process or processes, e.g., by electroplating a single metal layer of copper with a thickness larger than 1 micrometer, such as between 1 and 30 micrometers, and preferably between 2 and 20 micrometers or between 5 and 25 micrometers, on the seed layer 32*t*, preferably the previously described copper layer 32*t*, exposed by the openings 710, and the solder layer 34*t* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of copper by using an electroplating process.

Alternatively, the metal layer 34*s* can be formed by a suitable process or processes, e.g., by electroplating a single metal layer of nickel with a thickness larger than 1 micrometer, such as between 1 and 30 micrometers, and preferably between 2 and 20 micrometers or between 5 and 25 micrometers, on the seed layer 32*t*, preferably the previously described copper or nickel layer 32*t*, exposed by the openings 710, and the solder layer 34*t* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the single metal layer of nickel by using an electroplating process.

Alternatively, the metal layer 34*s* can be formed by a suitable process or processes, e.g., by electroplating a copper layer with a thickness larger than 1 micrometer, such as between 1 and 30 micrometers, and preferably between 2 and 20 micrometers or between 5 and 25 micrometers, on the seed layer 32*t*, preferably the previously described copper layer 32*t*, exposed by the openings 710, and then electroplating a nickel layer with a thickness larger than 0.2 micrometers, such as between 0.3 and 6 micrometers, and preferably between 1 and 3 micrometers, on the electroplated copper layer. The solder layer 34*t* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, can be formed on the electroplated nickel layer of the metal layer 34*s* by using an electroplating process.

Next, referring to FIG. 46L, the photoresist layer 71 is removed using an inorganic solution or using an organic solution with amide. Some residuals from the photoresist layer 71 could remain on the seed layer 32*t* not under the metal layer 34*s*. Thereafter, the residuals can be removed from the seed layer 32*t* with a plasma, such as an $O_2$ plasma or a plasma containing fluorine of below 200 PPM and oxygen. Next, the seed layer 32*t* not under the metal layer 34*s* is removed, and then the adhesion/barrier layer 32*s* not under the metal layer 34*s* is removed.

For example, the seed layer 32*t* not under the metal layer 34*s* and the adhesion/barrier layer 32*s* not under the metal layer 34*s* can be removed by a dry etching process, such as Ar sputtering etching process, reactive ion etching (RIE) process or ion milling process.

Alternatively, the seed layer 32*t* not under the metal layer 34*s* and the adhesion/barrier layer 32*s* not under the metal layer 34*s* can be removed by a wet etching process. When the seed layer 32*t* is a copper layer, it can be etched with a solution containing $NH_4OH$ or with a solution containing $H_2SO_4$. When the adhesion/barrier layer 32*s* is a titanium-tungsten-alloy layer, it can be etched with a solution containing hydrogen peroxide or with a solution containing $NH_4OH$ and hydrogen peroxide. When the adhesion/barrier layer 32*s* is a titanium layer, it can be etched with a solution containing hydrogen fluoride or with a solution containing $NH_4OH$ and hydrogen peroxide.

In case the seed layer 32*t* not under the metal layer 34*s* is removed using a wet etching process, an undercut is formed under the metal layer 34*s* overhanging the seed layer 32*t*. The seed layer 32*t* under the metal layer 34*s* has a first sidewall recessed from a second sidewall of the metal layer 34*s*, and a distance between the first sidewall and the second sidewall is between 0.1 and 2 micrometers.

Accordingly, as shown in FIG. 46L, multiple microbumps 317*f*, that is, metal bumps, provided by the adhesion/barrier layer 32*s*, the seed layer 32*t*, the metal layer 34*s* and the solder layer 34*t* are formed on the metal pads 600*b* exposed by the openings 50 and 950, on the polymer layer 95, and at the active side of the thinned silicon substrate 1, and are used to be bonded with the chip 313. Each of the microbumps 317*f* has a height larger than 2 micrometers, such as between 2 and 70 micrometers, and preferably between 5 and 50 micrometers, and a width or diameter larger than 3 micrometers, such as between 3 and 30 micrometers. A pitch P3 between neighboring two microbumps 317*f* can be smaller than 60 micrometers, and preferably smaller than 40 micrometers, such as between 5 and 40 micrometers, and preferably between 10 and 30 micrometers. The inter-chip circuit 20*a* can be connected to one of the microbumps 317*f* through the metal interconnect line 640*b* and one of the openings 50, and the inter-chip circuit 20*b* can be connected to another one of the microbumps 317*f* through the metal interconnect line 640*d* and another one of the openings 50. There are no microbumps formed on the metal pads 600*s* and 600*t* exposed by the openings 50 and 950, that is, the metal pads 600*s* and 600*t* are exposed by the openings 50 and 950 for testing the cache memory chip 311.

Alternatively, referring to FIG. 46M, the polymer layer 95 can be omitted, that is, the adhesion/barrier layer 32*s* can be formed on the passivation layer 5 and on the metal pads 600*b* exposed by the openings 50 in the passivation layer 5. Accordingly, the microbumps 317*f* provided by the adhesion/barrier layer 32*s*, the seed layer 32*t*, the metal layer 34*s* and the solder layer 34*t* can be formed on the metal pads 600*b* exposed by the openings 50, on the passivation layer 5, and at the active side of the thinned silicon substrate 1.

Alternatively, referring to FIG. 46N, the steps shown in FIGS. 46B-46I can be omitted, that is, after providing the semiconductor wafer 10*c* shown in FIG. 46A, the steps shown in FIGS. 46J-46L can be performed to form the polymer layer 95 and the microbumps 317*f*.

An IC structure 6*b* of the cache memory chip 311 shown in FIG. 37A, 37B, 37C, 37D, 38A, 38B, 38C or 38D contains the inter-chip circuits 20*a* and 20*b*, the internal circuits 20*c* and 20*d*, the off-chip circuit 40*a* including the off-chip buffer 42*a* and the off-chip ESD circuit 43*a*, the off-chip circuit 40*b* including the off-chip buffer 42*b* and the off-chip ESD circuit 43*b*, the dielectric layers 30, the vias 30', the fine-line metal layers 60, the via plugs 60', the testing interface circuits 333*a* and 333*b*, and the metal interconnect lines 640*a*, 640*b*, 640*c*, 640*d*, 640*i*, 640*j*, 640*k* and 640*m* as illustrated in FIG. 46M or 46N.

The processor unit 303 shown in FIG. 37A or 38A can be formed using a process illustrated in FIGS. 47A-47C. FIGS. 47A-47C are cross-sectional views showing a process for bonding the chip 313, bonded with the cache memory chip 321, with the semiconductor wafer 10*c* finalized to be cut into a plurality of the cache memory chip 311. Referring to FIG. 47A, the chip 313 of the stacked unit shown in FIG. 44C is bonded with the semiconductor wafer 10*c* shown in FIG. 46L by joining the solder layer 34*z* of the microbumps 317*d* of the chip 313 with the solder layer 34*t* of the microbumps 317*f* of the semiconductor wafer 10*c* using a reflow or heating process. During the reflow or heating process, the solder layer 34*z* and the solder layer 34*t* are melted into a solder layer 35*a* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, between the metal layers 34*y* and 34*s*. Accordingly, the previously described microbumps 317 provided by the adhesion/barrier layers 32*s* and 32*y*, the seed layers 32*t* and 32*z*, the metal layers 34*s* and 34*y* and the solder layer 35*a* can be formed between the metal pads 600*b* of the semiconductor wafer 10*c* and the metal pads 600*c* of the chip 313. Each of the microbumps 317 has a thickness larger than 5 micrometers, such as between 5 and 100 micrometers, and preferably between 10 and 60 micrometers. The microbumps 317 contact with the metal pads 600*b* and 600*c*, and the metal pads 600*b* can be connected to the metal pads 600*c* through the microbumps 317. The pitch between neighboring two microbumps 317 can be smaller than 60 micrometers, and preferably smaller than 40 micrometers, such as between 5 and 40 micrometers, and preferably between 10 and 30 micrometers.

Next, referring to FIG. 47B, the previously described underfill 107*d* without fillers, such as a polymer, is filled into a gap between the semiconductor wafer 10*c* and the chip 313, and encloses the microbumps 317. Next, the previously described heat spreader or heat sink 315 (not shown in FIGS. 47B and 47C) can be mounted onto the silicon substrate 1 of the cache memory chip 321 by adhering the heat spreader or heat sink 315 to the silicon substrate 1 of the cache memory chip 321 using the previously described film 319 of the glue material (not shown in FIGS. 47B and 47C).

Next, referring to FIG. 47C, the semiconductor wafer 10*c* can be cut to singularize a plurality of the processor unit 303 including the cache memory chips 311 and 321, the chip 313 and the heat spreader or heat sink 315, and the chips 313 and 321 are connected to each other through the microbumps 317*a*, and the chips 311 and 313 are connected to each other thorough the microbumps 317. Next, referring to FIG. 37A or 38A, the processor unit 303 shown in FIG. 47C can be bonded with the substrate 301 or BGA substrate 302 by joining the metal bumps or pillars 27 of the cache memory chip 311 with multiple contact points of the substrate 301 or BGA substrate 302, and then the previously described underfill 107*c* without fillers, such as a polymer, is filled into a gap between the cache memory chip 311 and the substrate 301 or BGA substrate 302, and encloses the metal bumps or pillars 27.

Accordingly, the off-chip buffer 42*a* and off-chip ESD circuit 43*a*, shown in FIG. 47C, of the cache memory chip 311 can be connected to a signal interconnect, such as signal bus, signal trace, signal line or signal pad, of the substrate 301 or BGA substrate 302 through the left one of the interconnecting structures 88, shown in FIG. 47C, of the cache memory chip 311 and through the left one of the metal bumps or pillars 27, also shown in FIG. 47C, of the cache memory chip 311. The off-chip buffer 42*b* and off-chip ESD circuit 43*b*, shown in FIG. 47C, of the cache memory chip 311 can be connected to another signal interconnect, such as signal bus, signal trace, signal line or signal pad, of the substrate 301 or BGA substrate 302 through the right one of the interconnecting structures 88, shown in FIG. 47C, of the cache memory chip 311 and through the right one of the metal bumps or pillars 27, also shown in FIG. 47C, of the cache memory chip 311.

The middle two of the metal bumps or pillars 27, also shown in FIG. 47C, of the cache memory chip 311 can be connected to a power interconnect, such as power plane, power bus, power trace or power line, of the substrate 301 or BGA substrate 302, and the middle one of the interconnecting structures 88, shown in FIG. 47C, of the cache memory chip 311 can be connected to the power interconnect of the substrate 301 or BGA substrate 302 through the middle two of the metal bumps or pillars 27.

Alternatively, the middle two of the metal bumps or pillars 27, also shown in FIG. 47C, of the cache memory chip 311 can be connected to a ground interconnect, such as ground plane, ground bus, ground trace or ground line, of the substrate 301 or BGA substrate 302, and the middle one of the interconnecting structures 88, shown in FIG. 47C, of the cache memory chip 311 can be connected to the ground interconnect of the substrate 301 or BGA substrate 302 through the middle two of the metal bumps or pillars 27.

The processor unit 303 shown in FIG. 37B or 38B can be formed using a process illustrated in FIGS. 47D-47F. FIGS. 47D-47F are cross-sectional views showing a process for bonding the chip 313 with the semiconductor wafer 10c finalized to be cut into a plurality of the cache memory chip 311. Referring to FIG. 47D, the chip 313 shown in FIG. 42O is bonded with the semiconductor wafer 10c shown in FIG. 46L by joining the solder layer 34z of the microbumps 317d of the chip 313 with the solder layer 34t of the microbumps 317f of the semiconductor wafer 10c using a reflow or heating process. During the reflow or heating process, the solder layer 34z and the solder layer 34t are melted into a solder layer 35a including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, between the metal layers 34y and 34s. Accordingly, the previously described microbumps 317 provided by the adhesion/barrier layers 32s and 32y, the seed layers 32t and 32z, the metal layers 34s and 34y and the solder layer 35a can be formed between the metal pads 600b of the semiconductor wafer 10c and the metal pads 600c of the chip 313. Each of the microbumps 317 has a thickness larger than 5 micrometers, such as between 5 and 100 micrometers, and preferably between 10 and 60 micrometers. The microbumps 317 contact with the metal pads 600b and 600c, and the metal pads 600b can be connected to the metal pads 600c through the microbumps 317. The pitch between neighboring two microbumps 317 can be smaller than 60 micrometers, and preferably smaller than 40 micrometers, such as between 5 and 40 micrometers, and preferably between 10 and 30 micrometers.

Next, referring to FIG. 47E, the previously described underfill 107d without fillers, such as a polymer, is filled into a gap between the semiconductor wafer 10c and the chip 313, and encloses the microbumps 317, and then the previously described heat spreader or heat sink 315 is mounted onto the silicon substrate 1 of the chip 313 by adhering the heat spreader or heat sink 315 to the silicon substrate 1 of the chip 313 using the previously described film 319 of the glue material.

Next, referring to FIG. 47F, the semiconductor wafer 10c can be cut to singularize a plurality of the processor unit 303 including the cache memory chip 311, the chip 313 and the heat spreader or heat sink 315, and the chips 311 and 313 are connected to each other thorough the microbumps 317. Next, referring to FIG. 37B or 38B, the processor unit 303 shown in FIG. 47F can be bonded with the substrate 301 or BGA substrate 302 by joining the metal bumps or pillars 27 of the cache memory chip 311 with multiple contact points of the substrate 301 or BGA substrate 302, and then the previously described underfill 107c without fillers, such as a polymer, is filled into a gap between the cache memory chip 311 and the substrate 301 or BGA substrate 302, and encloses the metal bumps or pillars 27.

Accordingly, the off-chip buffer 42a and off-chip ESD circuit 43a, shown in FIG. 47F, of the cache memory chip 311 can be connected to a signal interconnect, such as signal bus, signal trace, signal line or signal pad, of the substrate 301 or BGA substrate 302 through the left one of the interconnecting structures 88, shown in FIG. 47F, of the cache memory chip 311 and through the left one of the metal bumps or pillars 27, also shown in FIG. 47F, of the cache memory chip 311. The off-chip buffer 42b and off-chip ESD circuit 43b, shown in FIG. 47F, of the cache memory chip 311 can be connected to another signal interconnect, such as signal bus, signal trace, signal line or signal pad, of the substrate 301 or BGA substrate 302 through the right one of the interconnecting structures 88, shown in FIG. 47F, of the cache memory chip 311 and through the right one of the metal bumps or pillars 27, also shown in FIG. 47F, of the cache memory chip 311.

The middle two of the metal bumps or pillars 27, also shown in FIG. 47F, of the cache memory chip 311 can be connected to a power interconnect, such as power plane, power bus, power trace or power line, of the substrate 301 or BGA substrate 302, and the middle one of the interconnecting structures 88, shown in FIG. 47F, of the cache memory chip 311 can be connected to the power interconnect of the substrate 301 or BGA substrate 302 through the middle two of the metal bumps or pillars 27.

Alternatively, the middle two of the metal bumps or pillars 27, also shown in FIG. 47F, of the cache memory chip 311 can be connected to a ground interconnect, such as ground plane, ground bus, ground trace or ground line, of the substrate 301 or BGA substrate 302, and the middle one of the interconnecting structures 88, shown in FIG. 47F, of the cache memory chip 311 can be connected to the ground interconnect of the substrate 301 or BGA substrate 302 through the middle two of the metal bumps or pillars 27.

FIGS. 47G-47I are cross-sectional views showing a process for bonding the chip 313 with the semiconductor wafer 10c finalized to be cut into a plurality of the cache memory chip 311 as shown in FIG. 37C or 38C.

The processor unit 303 shown in FIG. 37C or 38C can be formed using a process illustrated in FIGS. 47G-47I. FIGS. 47G-47I are cross-sectional views showing a process for bonding the chip 313 with the semiconductor wafer 10c finalized to be cut into a plurality of the cache memory chip 311. Referring to FIG. 47G, the chip 313 shown in FIG. 42O is bonded with the semiconductor wafer 10c shown in FIG. 46N by joining the solder layer 34z of the microbumps 317d of the chip 313 with the solder layer 34t of the microbumps 317f of the semiconductor wafer 10c using a reflow or heating process. During the reflow or heating process, the solder layer 34z and the solder layer 34t are melted into a solder layer 35a including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, between the metal layers 34y and 34s. Accordingly, the previously described microbumps 317 provided by the adhesion/barrier layers 32s and 32y, the seed layers 32t and 32z, the metal layers 34s and 34y and the solder layer 35a can be formed between the metal pads 600b of the semiconductor wafer 10c and the metal pads 600c of the chip 313. Each of the microbumps 317 has a thickness larger than 5 micrometers, such as between 5 and 100 micrometers, and preferably between 10 and 60 micrometers. The microbumps 317 contact with the metal pads 600b and 600c, and the metal pads 600b can be connected to the metal pads 600c through the microbumps 317. The pitch between neighboring two microbumps 317 can be smaller than 60 micrometers, and preferably smaller than 40 micrometers, such as between 5 and 40 micrometers, and preferably between 10 and 30 micrometers.

Next, referring to FIG. 47H, the previously described underfill 107*d* without fillers, such as a polymer, is filled into a gap between the semiconductor wafer 10*c* and the chip 313, and encloses the microbumps 317, and then the previously described heat spreader or heat sink 315 is mounted onto the silicon substrate 1 of the chip 313 by adhering the heat spreader or heat sink 315 to the silicon substrate 1 of the chip 313 using the previously described film 319 of the glue material.

Next, referring to FIG. 47I, the semiconductor wafer 10*c* can be cut to singularize a plurality of the processor unit 303 including the cache memory chip 311, the chip 313 and the heat spreader or heat sink 315, and the chips 311 and 313 are connected to each other thorough the microbumps 317.

Referring to FIG. 37C or 38C, after the step illustrated in FIG. 47I, the processor unit 303 shown in FIG. 47I can be mounted onto the substrate 301 or BGA substrate 302 by adhering the silicon substrate 1 of the cache memory chip 311 to the top side of the substrate 301 or BGA substrate 302 using the previously described glue material 319*a*. Next, the previously described wires 119*c*, such as gold wires or copper wires, can be bonded with the testing metal pads 600*t* and 600*s* of the cache memory chip 311 and with multiple contact points of the substrate 301 or BGA substrate 302 by using a wirebonding process. The testing metal pads 600*t* and 600*s* of the cache memory chip 311 can be connected to the contact points of the top side of the substrate 301 or BGA substrate 302 through the wirebonded wires 119*c*. Next, the previously described molding compound 323 is formed on the substrate 301 or BGA substrate 302, encapsulating the wirebonded wires 119*c* and the chips 311 and 313, and the heat spreader or heat sink 315 has the surface 315*a* uncovered by the molding compound 323 and substantially coplanar with the top surface 323*a* of the molding compound 323.

Accordingly, the off-chip buffer 42*a* and off-chip ESD circuit 43*a*, shown in FIG. 47I, of the cache memory chip 311 can be connected to a signal interconnect, such as signal bus, signal trace, signal line or signal pad, of the substrate 301 or BGA substrate 302 through one of the wirebonded wires 119*c*. The off-chip buffer 42*b* and off-chip ESD circuit 43*b*, shown in FIG. 47I, of the cache memory chip 311 can be connected to another signal interconnect, such as signal bus, signal trace, signal line or signal pad, of the substrate 301 or BGA substrate 302 through another one of the wirebonded wires 119*c*.

The processor unit 303 shown in FIG. 37D or 38D can be formed using a process illustrated in FIGS. 47J-47L. FIGS. 47J-47L are cross-sectional views showing a process for bonding the chip 313, bonded with the cache memory chip 321, with the semiconductor wafer 10*c* finalized to be cut into a plurality of the cache memory chip 311. Referring to FIG. 47J, the chip 313 of the stacked unit shown in FIG. 44C is bonded with the semiconductor wafer 10*c* shown in FIG. 46N by joining the solder layer 34*z* of the microbumps 317*d* of the chip 313 with the solder layer 34*t* of the microbumps 317*f* of the semiconductor wafer 10*c* using a reflow or heating process. During the reflow or heating process, the solder layer 34*z* and the solder layer 34*t* are melted into a solder layer 35*a* including bismuth, indium, antimony, tin, a tin-lead alloy, a tin-silver alloy or a tin-silver-copper alloy with a thickness larger than 1 micrometer, such as between 1 and 30 micrometers, and preferably between 5 and 25 micrometers, between the metal layers 34*y* and 34*s*. Accordingly, the previously described microbumps 317 provided by the adhesion/barrier layers 32*s* and 32*y*, the seed layers 32*t* and 32*z*, the metal layers 34*s* and 34*y* and the solder layer 35*a* can be formed between the metal pads 600*b* of the semiconductor wafer 10*c* and the metal pads 600*c* of the chip 313. Each of the microbumps 317 has a thickness larger than 5 micrometers, such as between 5 and 100 micrometers, and preferably between 10 and 60 micrometers. The microbumps 317 contact with the metal pads 600*b* and 600*c*, and the metal pads 600*b* can be connected to the metal pads 600*c* through the microbumps 317. The pitch between neighboring two microbumps 317 can be smaller than 60 micrometers, and preferably smaller than 40 micrometers, such as between 5 and 40 micrometers, and preferably between 10 and 30 micrometers.

Next, referring to FIG. 47K, the previously described underfill 107*d* without fillers, such as a polymer, is filled into a gap between the semiconductor wafer 10*c* and the chip 313, and encloses the microbumps 317, and then the previously described heat spreader or heat sink 315 (not shown in FIGS. 47K and 47L) is mounted onto the silicon substrate 1 of the cache memory chip 321 by adhering the heat spreader or heat sink 315 to the silicon substrate 1 of the cache memory chip 321 using the previously described film 319 of the glue material (not shown in FIGS. 47K and 47L).

Next, referring to FIG. 47L, the semiconductor wafer 10*c* can be cut to singularize a plurality of the processor unit 303 including the cache memory chips 311 and 321, the chip 313 and the heat spreader or heat sink 315, and the chips 313 and 321 are connected to each other through the microbumps 317*a*, and the chips 311 and 313 are connected to each other through the microbumps 317.

Referring to FIG. 37D or 38D, after the step illustrated in FIG. 47L, the processor unit 303 shown in FIG. 47L can be mounted onto the substrate 301 or BGA substrate 302 by adhering the silicon substrate 1 of the cache memory chip 311 to the top side of the substrate 301 or BGA substrate 302 using the previously described glue material 319*a*. Next, the previously described wires 119*c*, such as gold wires or copper wires, can be bonded with the testing metal pads 600*t* and 600*s* of the cache memory chip 311 and with multiple contact points of the substrate 301 or BGA substrate 302 by using a wirebonding process. The testing metal pads 600*t* and 600*s* of the cache memory chip 311 can be connected to the contact points of the top side of the substrate 301 or BGA substrate 302 through the wirebonded wires 119*c*. Next, the previously described molding compound 323 is formed on the substrate 301 or BGA substrate 302, encapsulating the wirebonded wires 119*c* and the chips 311, 313 and 321, and the heat spreader or heat sink 315 has the surface 315*a* uncovered by the molding compound 323 and substantially coplanar with the top surface 323*a* of the molding compound 323.

Accordingly, the off-chip buffer 42*a* and off-chip ESD circuit 43*a*, shown in FIG. 47L, of the cache memory chip 311 can be connected to a signal interconnect, such as signal bus, signal trace, signal line or signal pad, of the substrate 301 or BGA substrate 302 through one of the wirebonded wires 119*c*. The off-chip buffer 42*b* and off-chip ESD circuit 43*b*, shown in FIG. 47L, of the cache memory chip 311 can be connected to another signal interconnect, such as signal bus, signal trace, signal line or signal pad, of the substrate 301 or BGA substrate 302 through another one of the wirebonded wires 119*c*.

Alternatively, the stacked DRAM BGA package 139 can be replaced with another stacked DRAM package 1390 as shown in FIG. 48A. The stacked DRAM package 1390 includes a ball-grid-array (BGA) substrate 1391, multiple stacked DRAM chips 1392 over a top side of the BGA substrate 1391, a control chip 1996 on the stacked DRAM chips 1392, and the control chip 1996 can be used to determine which DRAM chip 1392 is activated to read or write date therefrom or therein, multiple solder balls 1393 containing bismuth, indium, a tin-lead alloy, a tin-silver alloy or a tin-silver-copper alloy on a bottom side of the BGA substrate 1391, multiple wirebonded wires 1394, such as gold wires, copper wires or aluminum wires, connecting one of the DRAM chips 1392 to another one of the DRAM chips 1392 or to the BGA substrate 1391, and a molding compound 1395, such as a polymer or an epoxy-based material, on the top side of the BGA substrate 1391 and on the DRAM chips 1392, encapsulating the wirebonded wires 1394 and the DRAM chips 1392. The stacked DRAM package 1390 can be provided on the substrate 301 shown in FIGS. 37A, 37B, 37C and 37D or on the BGA substrate 302 shown in FIGS. 38A, 38B, 38C and 38D, that is, the solder balls 1393 each have a top end bonded with the bottom side of the BGA substrate 1391 and a bottom end bonded with a top side of the substrate 301 shown in FIGS. 37A, 37B, 37C and 37D or with a top side of the BGA substrate 302 shown in FIGS. 38A, 38B, 38C and 38D, and accordingly the BGA substrate 1391 can be connected to the substrate 301 shown in FIGS. 37A, 37B, 37C and 37D through the solder balls 1393, or to the BGA substrate 302 shown in FIGS. 38A, 38B, 38C and 38D through the solder balls 1393. The BGA substrate 1391 may contain an epoxy-based polymer, such as BT epoxy.

FIGS. 48C and 48D show cross-sectional views of various types of a DRAM chip 1392 assembled or incorporated in the stacked DRAM BGA package 1390 shown in FIG. 48A along a cut line of F-F' of FIG. 48B, and the redistribution circuit layer 1411 is made mainly of sputtered aluminum. FIGS. 48E and 48F shows cross-sectional views of various types of a DRAM chip 1392 assembled in the stacked DRAM BGA package 1390 shown in FIG. 48A along a cut line of F-F' of FIG. 48B, and the redistribution circuit layer 1411 is made mainly of electroplated copper or gold. FIG. 48G shows a top view of a DRAM chip 1392 assembled in the stacked DRAM BGA package 1390 shown in FIG. 48A according to another embodiment. FIGS. 48H and 48I show cross-sectional views of various types of a DRAM chip 1392 assembled in the stacked DRAM BGA package 1390 shown in FIG. 48A along a cut line of G-G' of FIG. 48G, and the redistribution circuit layer 1411 is made mainly of sputtered aluminum. FIGS. 48J and 48K shows cross-sectional views of various types of a DRAM chip 1392 assembled in the stacked DRAM BGA package 1390 shown in FIG. 48A along a cut line of G-G' of FIG. 48G, and the redistribution circuit layer 1411 is made mainly of electroplated copper or gold. Referring to FIGS. 48C-48F and 48H-48K showing cross-sectional views of the DRAM chip 1392, each of the DRAM chips 1392 may contain a silicon semiconductor substrate 1, multiple off-chip drivers or receivers 42 each composed of multiple MOS devices 1397 each having diffusion portions, such as source 201 and drain 202 of the MOS devices, in the silicon semiconductor substrate 1 and a gate 203, such as metal gate or poly gate, having a thickness between 0.002 and 0.2 micrometers on the silicon semiconductor substrate 1, eight memory banks 1404 each including multiple memory cells and sense amplifiers connected to the memory cells, multiple metal layers 6 over the silicon semiconductor substrate 1, and either one of the metal layers 6 can be sputtered aluminum having a thickness between 0.01 and 3 micrometers for one metal layer or damascene copper formed with electroplated copper, having a thickness between 0.01 and 3 micrometers for one metal layer, and a titanium, titanium-nitride, tantalum, or tantalum-nitride layer at a bottom and a sidewall of the electroplated copper, multiple dielectric or insulating layers 30 between the metal layers 6, and each of the dielectric or insulating layers 30 can be silicon oxide having a thickness between 0.01 and 3 micrometers for the metal layers 6 made of sputtered aluminum or can be a composite containing a thin silicon-nitride or silicon oxynitride layer optionally containing carbon and having a thickness between 0.005 and 0.1 micrometers on the underlying damascene copper and a silicon-oxide layer optionally containing carbon and having a thickness between 0.05 and 3 micrometers on the thin silicon-nitride or silicon oxynitride layer for the metal layers 6 made of damascene copper, and a passivation layer 5 over the metal layers 6 and the dielectric or insulating layers 30, and the passivation layer 5 can be a silicon-nitride or silicon-oxynitride layer having a thickness between 0.3 and 2 micrometers on the damascene copper of the top metal layer 6 or can be a composite containing a silicon-oxide layer having a thickness between 0.3 and 2 micrometers on the sputtered aluminum of the top metal layer 6 and a silicon-nitride or silicon-oxynitride layer having a thickness between 0.3 and 2 micrometers on the silicon-oxide layer. Openings 1407 in the passivation layer 5 are over multiple contact points 1408 of the top metal layer 6, and the contact points 1408 are at bottoms of the openings 1407. In case the contact point 1408 is connected to an off-chip driver 42, the connect point 1408 is connected to drains of MOS devices 1397 of the off-chip driver 42; in case the contact point 1408 is connected to an off-chip receiver 42, the connect point 1408 is connected to gates of MOS devices 1397 of the off-chip receiver 42. Except the above description, an element indicated by a same reference number as that indicating the element in other embodiments can be referenced to as the element other embodiments.

Referring to FIGS. 48C, 48D, 48H and 48I, each of the DRAM chips 1392 further contains a redistribution circuit layer 1411 on the passivation layer 5, and the redistribution circuit layer 1411 contains an adhesion layer 1401, such as titanium, titanium-tungsten alloy, titanium nitride, tantalum or tantalum nitride having a thickness between 0.002 and 0.05 micrometers, and a sputtered aluminum layer 1402 having a thickness between 0.7 and 5 micrometers, on the adhesion layer 1401, and another passivation layer 1400 on the redistribution circuit layer 1411 and on the passivation layer 5, and the passivation layer 1400 can be a composite containing a silicon-oxide layer having a thickness between 0.3 and 2 micrometers on the sputtered aluminum layer 1402 of the redistribution circuit layer 1411 and on the passivation layer 5 and a silicon-nitride or silicon-oxynitride layer having a thickness between 0.3 and 2 micrometers on the silicon-oxide layer. Multiple openings 1431 in the passivation layer 1400 are over contact points 1418, configured for wirebonding, of the redistribution circuit layer 1411, and the contact points 1418 are at bottoms of the openings 1431.

Alternatively, referring to FIGS. 48E, 48F, 48J and 48K, each of the DRAM chips 1392 contains a polymer layer 1409, such as polyimide or benzocyclobutene (BCB) having a thickness between 2 and 30 micrometers, on the passivation layer 5, and openings 1410 in the polymer layer 1409 are over the contact points 1408 of the top metal layer 6. The redistribution circuit layer 1411 can be formed on the polymer layer 1409. In this case, the redistribution circuit layer 1411 contains an adhesion layer 1412, such as titanium, titanium-tungsten alloy or titanium nitride having a thickness between 0.002 and 0.05 micrometers, a copper or gold seed layer 1413 having a thickness between 0.002 and 0.1 micrometers on the adhesion layer 1412, and an electroplated copper or gold layer 1405 on the copper or gold seed layer 1413. If the layer 1405 is electroplated copper, an optional nickel layer 1414 formed by a suitable process or processes, e.g., by an electroplating or electroless plating process can be provided on the electroplated copper layer 1405, and an optional gold layer 1415 formed by a suitable process or processes, e.g., by an electroplating or electroless plating process can be provided on the nickel layer 1414. Optionally, each of the DRAM chips 1392 may contain another polymer 1416, such as polyimide or benzocyclobutene (BCB) having a thickness between 2 and 30 micrometers, on the redistribution circuit layer 1411 and on the polymer layer 1409, and openings 1417 in the polymer layer 1416 are over the contact points 1418, configured for wirebonding, of the redistribution circuit layer 1411, and the contact points 1418 are at bottoms of the openings 1417. Alternatively, the polymer layer 1409 can be omitted. The redistribution circuit layer 1411 can be provided directly on the passivation layer 5 and there is no polymer layer between the passivation layer 5 and the redistribution circuit layer 1411. Alternatively, the polymer layer 1416 can be omitted and there is no polymer layer over the redistribution circuit layer 1411.

FIGS. 48B and 48G show top perspective views of the DRAM chip 1392 according to two embodiments. Referring to FIG. 48G, the contact points 1408 are arranged in a center line 1403 of the DRAM chip 1392 parallel with two opposite edges 1392*a* and 1392*b* of the DRAM chip. Alternatively, referring to FIG. 48B, the contact points 1408 are arranged in two center lines 1421 and 1422 left and right away from the center line 1403 of the DRAM chip 1392, respectively, and parallel with the two opposite edges 1392*a* and 1392*b* of the DRAM chip. The region 1419 shown in FIGS. 48B and 48G enclosed by dot lines indicates a region of a top surface of the silicon semiconductor substrate 1, in which the off-chip drivers or receivers 42 are provided, that is, there can be off-chip drivers or receivers 42 at a horizontal plane lower than that of the contact points 1408, and each of the off-chip drivers or receivers 42 is connected to and positioned close to one of the contact points 1408, as shown in FIGS. 48C-48F and 48H-48K. In a case, there is no off-chip driver or receiver vertically under the contact points 1408, as shown in FIGS. 48C, 48E, 48H and 48J. For example, the off-chip driver or receiver 42, as shown in FIGS. 48C and 48E, is at a horizontal plane lower than that of the contact point 1408 connected to the off-chip driver or receiver 42 and has a horizontal offset p from the center of the contact point 1408 by a range from 30 to 250 micrometers, with the contact points 1408 shown in FIG. 48B arranged in two center lines 1421 and 1422 left and right away from the center line 1403 of the DRAM chip 1392, respectively. Also, when the contact points 1408, as shown in FIG. 48G, are arranged in a center line 1403 of the DRAM chip 1392 parallel with two opposite edges 1392*a* and 1392*b* of the DRAM chip, the off-chip driver or receiver 42 at a horizontal plane lower than that of the contact point 1408 connected to the off-chip driver or receiver 42 may have a horizontal offset p from the center of the contact point 1408 by a range from 30 to 250 micrometers, as shown in FIGS. 48H and 48J.

In another case, there can be off-chip drivers or receivers 42 vertically under the contact points 1408. As shown in FIGS. 48D and 48F, the contact points 1408 can be vertically over and connected to the off-chip driver or receiver 42, with the contact points 1408 shown in FIG. 48B arranged in two center lines 1421 and 1422 left and right away from the center line 1403 of the DRAM chip 1392, respectively, and a width or diameter D of the opening 1407 in the passivation layer 5 can be as small as possible, and, for example, can be between 0.2 and 20 micrometers, and preferably between 0.5 and 5 micrometers. Also, when the contact points 1408, as shown in FIG. 48G, are arranged in a center line 1403 of the DRAM chip 1392 parallel with two opposite edges 1392*a* and 1392*b* of the DRAM chip, the contact points 1408, as shown in FIGS. 48I and 48K, can be vertically over and connected to the off-chip driver or receiver 42, and a width or diameter D of the opening 1407 in the passivation layer 5 can be as small as possible, and, for example, can be between 0.2 and 20 micrometers, and preferably between 0.5 and 5 micrometers.

Referring to FIGS. 48B and 48G, the distance s between the left or right edge and the center line 1403 of the DRAM chip 1392 may range from 150 and 500 micrometers. Four of the eight memory banks 1404 are at the left side of the region 1419 and the other four of the eight memory banks 1404 are at the right side of the region 1419. Referring to FIG. 48G, the redistribution circuit layer 1411 can be patterned with multiple redistributed traces 1411*a* each connecting one of the contact points 1408 to one of the contact points 1418, configured for wirebonding, arranged in a line close to the edge 1392*a*. Alternatively, referring to FIG. 48B, the redistribution circuit layer 1411 can be patterned with multiple redistributed traces 1411*a* each connecting one of the contact points 1408 to one of the contact points 1418, configured for wirebonding, arranged in two lines close to the edge 1392*a*.

A plurality of the previously described DRAM chip 1392 as illustrated in FIGS. 48B-48K can be stacked. For example, there could be four, eight, sixteen or thirty two of DRAM chips 1392 are stacked, as described below:

Referring to FIG. 48A, the bottommost DRAM chip 1392 can be mounted onto the BGA substrate 1391 by adhering the silicon semiconductor substrate 1 of the bottommost DRAM chip 1392 to the top side of the BGA substrate 1391 using a film 1420 of a glue material, such as a polymer or an epoxy-based material, with a thickness between 1 and 50 micrometers. The upper DRAM chip 1392 can be mounted onto the lower DRAM chip 1392 by adhering the silicon substrate 1 of the upper DRAM chip 1392 to the top side of the lower chip 1392 using another film 1420 of the glue material. The control chip 1996 can be mounted onto the topmost DRAM chip 1392 by adhering the control chip 1996 to the top side of the topmost DRAM chip 1392 using another film 1420 of the glue material. The upper DRAM chip 1392 has a right portion overhanging the lower DRAM chip 1392, and the lower DRAM chip 1392 has a left portion not vertically under the upper DRAM chip 1392. The upper DRAM chip 1392 has a left sidewall recessed from that of the lower DRAM chip 1392. The wirebonded wires 1394 each may have an end bonded with the contact point 1418 of the upper DRAM chip 1392 or the contact point 1433 of the control chip 1996 and another end bonded with the contact point 1418 of the lower DRAM chip 1392 or with a metal pad 1399 of the BGA substrate 1391. Particularly, in case the wirebonded wires 1394 are copper wires, the wirebonded wires 1394 each may have an end bonded with the electroplated copper layer 1405 of the upper DRAM chip 1392 or with copper of the contact point 1433 of the control chip 1996 and another end bonded with the electroplated copper layer 1405 of the lower DRAM chip 1392 or with copper of the metal pad 1399 of the BGA substrate 1391. In case the wirebonded wires 1394 are gold wires, the wirebonded wires 1394 each may have an end bonded with the sputtered aluminum layer 1402, the electroplated gold layer 1405 or the gold layer 1415 of the upper DRAM chip 1392 or with gold or aluminum of the contact point 1433 of the control chip 1996 and another end bonded with the sputtered aluminum layer 1402, the electroplated gold layer 1405 or the gold layer 1415 of the lower DRAM chip 1392 or with gold of the metal pad 1399 of the BGA substrate 1391.

The previously described module 137 shown in FIG. 37A, 37B, 37C, 37D, 38A, 38B, 38C or 38D may include only one processor unit 303 on the substrate 301 or BGA substrate 302. Alternatively, the module 137 may include a plurality of the processor unit 303 on the substrate 301 or BGA substrate 302, and the way to assembly either one of the processor units 303 and to design the circuit of either one of the processor units 303 can be referenced to as either one of the ways to assembly the processor unit 303 shown in FIG. 37A, 37B, 37C, 37D, 38A, 38B, 38C or 38D and to design the circuit of the processor unit 303 shown in FIG. 39A, 39H, 39I or 39J.

For example, the module 137 may include three processor units 303 on the substrate 301 or BGA substrate 302. The chip 313 in one of the processor units 303 can be a central-processing-unit (CPU) chip designed by x86 architecture or designed by non x86 architectures, the chip 313 in another one of the processor units 303 can be a graphics-processing-unit (GPU) chip, and the chip 313 in the other one of the processor units 303 can be a baseband chip.

Alternatively, the module 137 may include two processor units 303 on the substrate 301 or BGA substrate 302. The chip 313 in one of the processor units 303 can be a system-on chip (SOC) including a graphics-processing-unit (GPU) circuit block, a wireless local area network (WLAN) circuit block and a central-processing-unit (CPU) circuit block designed by x86 architecture or by non x86 architectures, and the chip 313 in the other one of the processor units 303 can be a baseband chip.

Alternatively, the module 137 may include two processor units 303 on the substrate 301 or BGA substrate 302. The chip 313 in one of the processor units 303 can be a system-on chip (SOC) including a baseband circuit block, a wireless local area network (WLAN) circuit block and a central-processing-unit (CPU) circuit block designed by x86 architecture or by non x86 architectures, and the chip 313 in the other one of the processor units 303 can be a graphics-processing-unit (GPU) chip.

The previously described module 137 shown in FIG. 37A, 37B, 37C, 37D, 38A, 38B, 38C or 38D, the previously described chip-package module 118 shown in FIG. 36A, the previously described chip-package module 118*a* shown in FIG. 36B, the previously described chip-package module 118*b* shown in FIG. 36C, the previously described chip-package module 118*c* shown in FIG. 36D, the previously described semiconductor chips shown in FIGS. 29A-29T, the previously described semiconductor chip cut from the previously described semiconductor wafer 10, and the previously described chip package including the previously described semiconductor chip cut from the previously described semiconductor wafer 10 can be used for a telephone, a cordless phone, a mobile phone, a smart phone, a netbook computer, a notebook computer, a digital camera, a digital video camera, a digital picture frame, a personal digital assistant (PDA), a pocket personal computer, a portable personal computer, an electronic book, a digital book, a desktop computer, a tablet or slate computer, an automobile electronic product, a mobile internet device (MID), a mobile television, a projector, a mobile projector, a pico projector, a smart projector, a 3D video display, a 3D television (3D TV), a 3D video game player, a mobile computer device, a mobile compuphone (also called mobile phoneputer or mobile personal computer phone) which is a device or a system combining and providing functions of computers and phones, or a high performance and/or low power computer or server, for example, used for cloud computing.

When the module 137 shown in FIG. 37A, 37B, 37C, 37D, 38A, 38B, 38C or 38D is used for the mobile compuphone, the memory size of the mass storage provided by the wirebonded stacked memory BGA package 138 is larger than 4 gigabytes, such as between 4 gigabytes and 1 trillion bytes, and the memory size of the main memory provided by the stacked DRAM BGA package 139 is larger than 100 megabytes, such as between 100 megabytes and 256 gigabytes, and preferably between 256 megabytes and 64 gigabytes.

When the module 137 shown in FIG. 37A, 37B, 37C, 37D, 38A, 38B, 38C or 38D is used for the high performance and/or low power computer or server, the 3D video display, such as 3D television (3D TV), or the 3D video game player, and the high performance and/or low power computer or server, for example, can be used for cloud computing, the memory size of the mass storage provided by the wirebonded stacked memory BGA package 138 is larger than 4 gigabytes, such as between 4 gigabytes and 128 trillion bytes, and preferably between 64 gigabytes and 1 trillion bytes, and the memory size of the main memory provided by the stacked DRAM BGA package 139 is larger than 256 megabytes, such as between 256 megabytes and 1 trillion bytes, and preferably between 1 and 256 gigabytes.

When the module 137 shown in FIG. 37A, 37B, 37C, 37D, 38A, 38B, 38C or 38D is used for the mobile compuphone, the cache memory chip 311 can be a dynamic-random-access-memory (DRAM) chip, a synchronous-dynamic-random-access-memory (SDRAM) chip or a statistic-random-access-memory (SRAM) chip, and the memory size of the cache memory chip 311 is between 10 megabytes and 32 gigabytes, and preferably between 100 megabytes and 4 gigabytes.

When the module 137 shown in FIG. 37A, 37B, 37C, 37D, 38A, 38B, 38C or 38D is used for the high performance and/or low power computer or server, the 3D video display or the 3D video game player, the cache memory chip 311 can be a dynamic-random-access-memory (DRAM) chip, a statistic-random-access-memory (SRAM) chip or a synchronous-dynamic-random-access-memory (SDRAM) chip, and the memory size of the cache memory chip 311 is between 10 megabytes and 32 gigabytes, and preferably between 100 megabytes and 4 gigabytes.

The module 137 shown in FIG. 37A, 37B, 37C, 37D, 38A, 38B, 38C or 38D, for example, can be provide for a high performance video display, especially for 3D video display, and can be connected to an in-situ (built-in) video display or in-situ (built-in) 3D video display, or can be connected to an external 3D video display, such as 3D TV or 3D video game player.

Alternatively, in FIG. 37A, 37B, 37C, 37D, 38A, 38B, 38C or 38D, the chip 313 may be a memory chip, such as synchronous-dynamic-random-access-memory (SDRAM) chip, statistic-random-access-memory (SRAM) chip or dynamic-random-access-memory (DRAM) chip, while the chip 311 may be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a global-positioning-system (GPS) chip, a bluetooth chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, a system-on chip (SOC) including a graphics-processing-unit (GPU) circuit block and a wireless local area network (WLAN) circuit block, but not including any baseband circuit block and any central-processing-unit (CPU) circuit block, a system-on chip (SOC) including a graphics-processing-unit (GPU) circuit block, a baseband circuit block, a digital-signal-processing (DSP) circuit block, a wireless local area network (WLAN) circuit block and a central-processing-unit (CPU) circuit block designed by x86 architecture or by non x86 architectures, or a chip including a central-processing-unit (CPU) circuit block, a bluetooth circuit block, a global-positioning-system (GPS) circuit block, a graphics-processing-unit (GPU) circuit block, a baseband circuit block, a digital-signal-processing (DSP) circuit block, and/or a wireless local area network (WLAN) circuit block. It is noted that this architecture can be also designed with the circuits illustrated in FIG. 39A, 39H, 39I or 39J.

Accordingly, aspects and embodiments of the present disclosure can provide benefits and advantages over previous techniques The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in or facilitated by computer hardware, software, firmware, or any combinations of such, and over one or more networks. Suitable software can include computer-readable or machine-readable instructions for performing methods and techniques (and portions thereof) of designing and/or controlling the fabrication of chip structures in accordance with the present disclosure. Any suitable software language (machine-dependent or machine-independent) may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate or of a nominal value, and not necessarily exact; they are intended to have a reasonable range that is consistent with the functions to which they relate and with what is customary in the art to which they pertain.

All articles, patents, patent applications, and other publications which have been cited in this disclosure are hereby incorporated herein by reference.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims. That scope is intended and should be interpreted to be as broad as is consistent with the ordinary meaning of the language that is used in the claims when interpreted in light of this specification and the prosecution history that follows and to encompass all structural and functional equivalents.

What is claimed is:

1. A module comprising:

a substrate;

a processor unit on said substrate, wherein said processor unit comprises a first cache memory chip over said substrate and a processor chip over said first cache memory chip, wherein said first cache memory chip is connected to said processor chip through a plurality of microbumps between said first cache memory chip and said processor chip, wherein a pitch between a neighboring two of said plurality of microbumps is smaller than 60 micrometers;

a mass storage on said substrate, wherein said mass storage comprises a first memory chip over said substrate and a second memory chip over said first memory chip, wherein said first memory chip is connected to said second memory chip through at least one first wirebonded wire;

a main memory on said substrate, wherein said main memory comprises a first dynamic-random-access-memory chip over said substrate and a second dynamic-random-access-memory chip over said first dynamic-random-access-memory chip; and a connector connected to said substrate.

2. The module of claim 1, wherein the module is implemented in a computer, a mobile phone, a mobile compuphone, a camera, an electronic book, a digital picture frame, an automobile electronic product, a 3D video display, a 3D television, a 3D video game player, a projector, or a server used for cloud computing.

3. The module of claim 1, wherein said processor chip comprises a central-processing-unit (CPU) circuit block designed by x86 architecture or by non x86 architectures, a graphics-processing-unit (GPU) circuit block, a baseband circuit block, a digital-signal-processing (DSP) circuit block, or a wireless local area network (WLAN) circuit block.

4. The module of claim 1, wherein said processor chip comprises a central-processing-unit (CPU) chip designed by x86 architecture or by non x86 architectures.

5. The module of claim 1, wherein said processor chip comprises a system-on chip (SOC) comprising a baseband circuit block, a wireless local area network (WLAN) circuit block and a central-processing-unit (CPU) circuit block designed by x86 architecture or by non x86 architectures, but not comprising any graphics-processing-unit (GPU) circuit block.

6. The module of claim 1, wherein said first cache memory chip comprises a dynamic-random-access-memory (DRAM) chip, a synchronous-dynamic-random-access-memory (SDRAM) chip, or a static-random-access-memory (SRAM) chip.

7. The module of claim 1, wherein said first cache memory chip has a memory size between 10 megabytes and 32 gigabytes.

8. The module of claim 1, wherein said first cache memory chip is connected to said substrate through at least one second wirebonded wire.

9. The module of claim 1, wherein said first cache memory chip comprises a silicon substrate, a plurality of through-silicon vias in said silicon substrate, a bottom scheme at a backside of said silicon substrate and in said plurality of through-silicon vias, a first dielectric layer over a top side of said silicon substrate, a first metal layer over said first dielectric layer, a second dielectric layer over said first metal layer, a second metal layer over said second dielectric layer, and a passivation layer over said top side of said silicon substrate, over said first and second dielectric layers and over said first and second metal layers, wherein each of a plurality of openings in said passivation layer is over a respective one of a plurality of contact points of said second metal layer, and said plurality of contact points is at bottoms of said plurality of openings, wherein said plurality of microbumps is connected to said plurality of contact points through said plurality of openings, wherein said bottom scheme comprises a metal bump between said silicon substrate and said substrate, wherein said first cache memory chip is connected to said substrate through said metal bump.

10. The module of claim 1, wherein said first memory chip comprises a flash memory chip or a dynamic-random-access-memory (DRAM) chip.

11. The module of claim 1, wherein said processor unit further comprises a second cache memory chip over said processor chip, wherein said second cache memory chip is connected to said processor chip.

12. The module of claim 1, wherein said second memory chip has a right portion overhanging said first memory chip, and said first memory chip has a left portion not vertically under said second memory chip, wherein said second memory chip has a left sidewall recessed from that of said first memory chip.

13. The module of claim 1 further comprising a radio frequency (RF) module on said substrate.

14. The module of claim 1, wherein said first dynamic-random-access-memory chip comprises a first silicon substrate, a first dielectric layer over said first silicon substrate, a first metal layer over said first dielectric layer, a second dielectric layer over said first metal layer, a second metal layer over said second dielectric layer, and a first passivation layer over said first silicon substrate, over said first and second dielectric layers and over said first and second metal layers, wherein each of a plurality of openings in said first passivation layer is over a respective one of a plurality of contact points of said second metal layer, and said plurality of contact points is at bottoms of said plurality of openings, wherein said second dynamic-random-access-memory chip comprises a second silicon substrate, a plurality of through-silicon vias in said second silicon substrate, a bottom scheme at a backside of said second silicon substrate and in said plurality of through-silicon vias, a third dielectric layer over a top side of said second silicon substrate, a third metal layer over said third dielectric layer, a fourth dielectric layer over said third metal layer, a fourth metal layer over said fourth dielectric layer, and a second passivation layer over said top side of said second silicon substrate, over said third and fourth dielectric layers and over said third and fourth metal layers, wherein said bottom scheme comprises a metal bump between said second silicon substrate and said first dynamic-random-access-memory chip, wherein said metal bump is connected to one of said plurality of contact points through one of said plurality of openings, wherein said second dynamic-random-access-memory chip is connected to said first dynamic-random-access-memory chip through said metal bump.

15. The module of claim 1, wherein said connector is used for connecting to a charger, a game player, a display, or a television.

16. The module of claim 1, wherein said connector comprises a universal serial bus (USB), a high-definition multimedia interface (HDMI), a DisplayPort, an IEEE 1394, or an optical connector.

17. The module of claim 1, wherein said first cache memory chip comprises a first metal pad, a second metal pad, a testing interface circuit having a first node connected to said first metal pad, a first inter-chip buffer connected to said first metal pad and to said first node of said testing interface circuit, an off-chip buffer having a first node connected to a second node of said testing interface circuit and a second node connected to said second metal pad, and an off-chip electro static discharge (ESD) circuit connected to said second node of said off-chip buffer and to said second metal pad, wherein one of said plurality of microbumps is on said first metal pad, wherein said one of said plurality of microbumps is connected to said first inter-chip buffer and to said first node of said testing interface circuit through said first metal pad, wherein said second metal pad is not connected upwards to said processor chip through any microbump between said first cache memory chip and said processor chip.

18. The module of claim 17, wherein said off-chip buffer comprises a first NMOS transistor, and said first inter-chip buffer comprises a second NMOS transistor, wherein a ratio of a physical channel width to a physical channel length of said first NMOS transistor is greater than a ratio of a physical channel width to a physical channel length of said second NMOS transistor by more than 3 times.

19. The module of claim 17, wherein said processor chip comprises a third metal pad and a second inter-chip buffer connected to said third metal pad, wherein said one of said plurality of microbumps is between said first and third metal pads, wherein said one of said plurality of microbumps is connected to said second inter-chip buffer through said third metal pad, wherein said first inter-chip buffer is connected to said second inter-chip buffer through, in sequence, said first metal pad, said one of said plurality of microbumps, and said third metal pad.

20. The module of claim 19, wherein there is no electro static discharge (ESD) circuit connected to a path between said first inter-chip buffer and said second inter-chip buffer.

* * * * *